United States Patent [19]

Hull et al.

[11] Patent Number: 4,999,143

[45] Date of Patent: Mar. 12, 1991

[54] METHODS AND APPARATUS FOR PRODUCTION OF THREE-DIMENSIONAL OBJECTS BY STEREOLITHOGRAPHY

[75] Inventors: Charles W. Hull, Arcadia; Charles W. Lewis, Van Nuys, both of Calif.

[73] Assignee: 3D Systems, Inc., Valencia, Calif.

[21] Appl. No.: 182,801

[22] Filed: Apr. 18, 1988

[51] Int. Cl.[5] .............................................. B29C 35/08

[52] U.S. Cl. ...................................... 264/22; 264/308; 425/174.4; 427/54.1; 156/273.3

[58] Field of Search .................. 264/22, 25, 40.1, 250, 264/255, 308, 298; 425/174.4; 427/43.1, 54.1; 365/106, 107, 119, 120, 127; 156/58, 273.3, 273.5, 275.5

[56] References Cited

U.S. PATENT DOCUMENTS

| | | | |
|---|---|---|---|
| 2,775,758 | 12/1956 | Munz | 156/58 |
| 4,575,330 | 3/1986 | Hull | 425/174.4 |
| 4,752,498 | 6/1988 | Fudim | 427/54.1 |
| 4,801,477 | 1/1989 | Fudim | 427/54.1 |

FOREIGN PATENT DOCUMENTS 0250121 2/1987 European Pat. Off. .

OTHER PUBLICATIONS

Kodama, "Automatic Method for Fabricating a Three-Dimensional Plastic Model with Photohardening Polymer", Rev. Sci. Instrum. 52(11), Nov. 1981, pp. 1770–1773.

*Primary Examiner*—Mary Lynn Theisen
*Attorney, Agent, or Firm*—Lyon & Lyon

[57] ABSTRACT

An improved stereolithography system for generating a three-dimensional object by creating a cross-sectional pattern of the object to be formed at a selected surface of a fluid medium capable of altering its physical state in response to appropriate synergistic stimulation by impinging radiation, particle bombardment or chemical reaction, information defining the object being specially tailored to provide built-in supports for the object, reduce curl and distortion, and increase resolution, strength, accuracy, speed and economy of reproduction, the successive adjacent laminae, representing corresponding successive adjacent cross-sections of the object, being automatically formed and integrated together to provide a step-wise laminar buildup of the desired object, whereby a three-dimensional object is formed and drawn from a substantially planar surface of the fluid medium during the forming process.

46 Claims, 6 Drawing Sheets

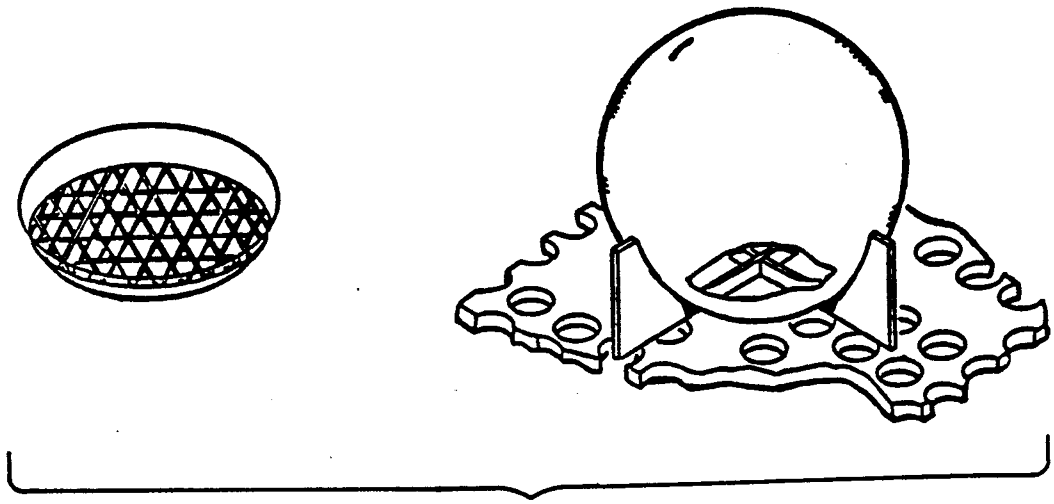
FIG. 7.
FIG. 8.
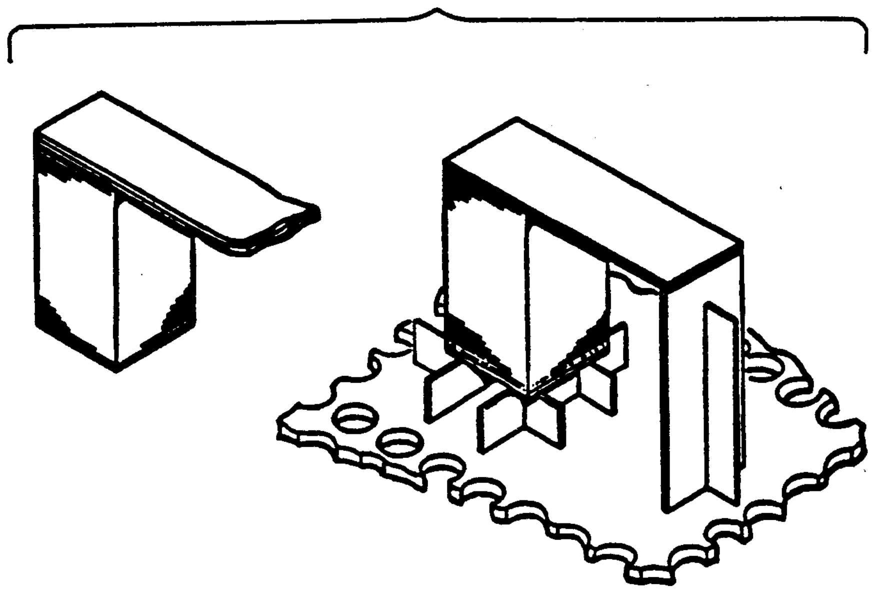

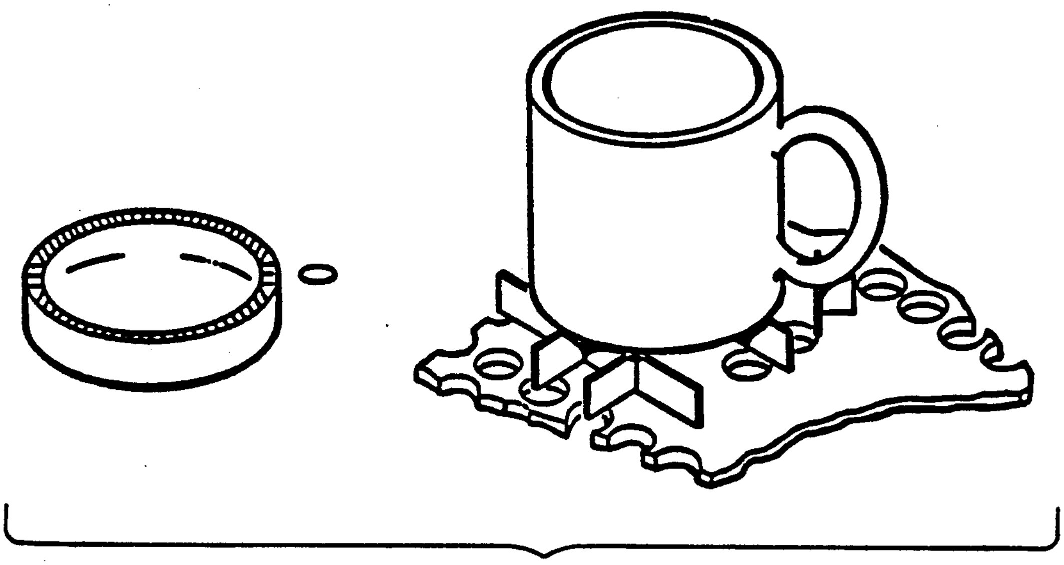
FIG. 9.
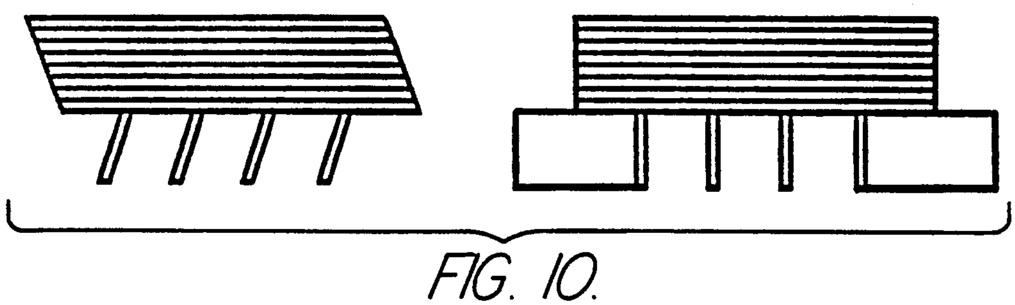
FIG. 10.
FIG. 11.
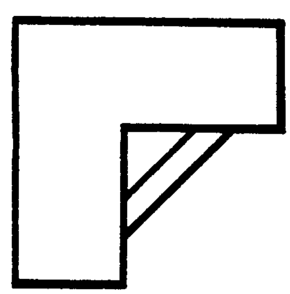

METHODS AND APPARATUS FOR PRODUCTION OF THREE-DIMENSIONAL OBJECTS BY STEREOLITHOGRAPHY

CROSS-REFERENCE TO RELATED PATENT APPLICATIONS

This application is related by subject matter to each of the following patent applications filed concurrently herewith:

| Title | Inventors | U.S. Pat. application Ser. No. |
|---|---|---|
| METHODS AND APPARATUS FOR PRODUCTION OF THREE-DIMENSIONAL OBJECTS BY STEREO-LITHOGRAPHY | Charles W. Hull<br>Stuart T. Spence<br>Charles W. Lewis<br>Wayne A. Vinson<br>Raymond S. Freed | 182,823 |
| METHODS AND APPARATUS FOR PRODUCTION OF THREE-DIMENSIONAL OBJECTS BY STEREO-LITHOGRAPHY | Charles W. Hull<br>Stuart T. Spence<br>David J. Albert<br>Dennis R. Smalley<br>Richard A. Harlow<br>Phil Steinbaugh<br>Harry L. Tarnoff<br>Hop D. Nguyen<br>Charles W. Lewis<br>Tom J. Vorgitch<br>David Z. Remba | 182,830 |
| METHODS AND APPARATUS FOR PRODUCTION OF THREE-DIMENSIONAL OBJECTS BY STEREO-LITHOGRAPHY | Dennis R. Smalley | 183,015 |
| METHODS AND APPARATUS FOR PRODUCTION OF THREE-DIMENSIONAL OBJECTS BY STEREO-LITHOGRAPHY | Borzo Modrek | 183,016 |
| METHODS AND APPARATUS FOR PRODUCTION OF THREE-DIMENSIONAL OBJECTS BY STEREO-LITHOGRAPHY | Charles W. Hull | 183,014 |
| METHODS AND APPARATUS FOR PRODUCTION OF THREE-DIMENSIONAL OBJECTS BY STEREO-LITHOGRAPHY | Raymond S. Freed | 183,012 |

All of these applications are assigned to a common assignee, 3D Systems, Inc., 26081 Avenue Hall, Calif. 91355, and the entire subject matter of each of these related applications is specifically incorporated by reference, as though attached hereto, in the present application as part of the disclosure of the present application. Authorization for making copies of these applications, as originally filed in the Patent and Trademark Office, for transfer to the present case, is specifically granted to the Examiner, if the Examiner determines such copies are necessary or desirable. However, the disclosure for the invention specifically claimed in the present application is considered completely adequate, as presented in the present application, to enable one of ordinary skill in the art to which the invention pertains to make and practice the invention.

BACKGROUND OF THE INVENTION

This invention relates generally to improvements in methods and apparatus for forming three-dimensional objects from a fluid medium and, more particularly, to new and improved stereolithography system involving the application of enhanced data manipulation and lithographic techniques to production of three-dimensional objects, whereby such objects can be formed more rapidly, reliably, accurately and economically.

It is common practice in the production of plastic parts and the like to first design such a part and then painstakingly produce a prototype of the part, all involving considerable time, effort and expense. The design is then reviewed and, oftentimes, the laborious process is again and again repeated until the design has been optimized. After design optimatization, the next step is production. Most production plastic parts are injection molded. Since the design time and tooling costs are very high, plastic parts are usually only practical in high volume production. While other processes are available for the production of plastic parts, including direct machine work, vacuum-forming and direct forming, such methods are typically only cost effective for short run production, and the parts produced are usually inferior in quality to molded parts.

Very sophisticated techniques have been developed in the past for generating three-dimensional objects within a fluid medium which is selectively cured by beams of radiation brought to selective focus at prescribed intersection points within the three-dimensional volume of the fluid medium. Typical of such three-dimensional systems are those described in U.S. Pat. Nos. 4,041,476; 4,078,229; 4,238,840 and 4,288,861. All of these systems rely upon the buildup of synergistic energization at selected points deep within the fluid volume, to the exclusion of all other points in the fluid volume. Unfortunately, however, such three-dimensional forming systems face a number of problems with regard to resolution and exposure control. The loss of radiation intensity and image forming resolution of the focused spots as the intersections move deeper into the fluid medium create rather obvious complex control situations. Absorption, diffusion, dispersion and diffraction all contribute to the difficulties of working deep within the fluid medium on an economical and reliable basis.

In recent years, "stereolithography" systems, such as those described in U.S. Pat. No. 4,575,330 entitled "Apparatus For Production Of Three-Dimensional Objects By Stereolithography" have come into use. Basically, stereolithography is a method for automatically building complex plastic parts by successively printing cross-sections of photopolymer (such as liquid plastic) on top of each other until all of the thin layers are joined together to form a whole part. With this technology, the parts are literally grown in a vat of liquid plastic. This method of fabrication is extremely powerful for quickly reducing design ideas to physical form and for making prototypes.

Photocurable polymers change from liquid to solid in the presence of light and their photospeed with ultraviolet light is fast enough to make them practical model building materials. The material that is not polymerized when a part is made is still usable and remains in the vat as successive parts are made. An ultraviolet laser generates a small intense spot of UV. This spot is moved across the liquid surface with a galvanometer mirror X-Y scanner. The scanner is driven by computer generated vectors or the like. Precise complex patterns can be rapidly produced with this technique.

The laser scanner, the photopolymer vat and the elevator, along with a controlling computer, combine together to form a stereolithography apparatus, referred to as "SLA". An SLA is programmed to automatically make a plastic part by drawing one cross section at a time, and building it up layer by layer.

Stereolithography represents an unprecedented way to quickly make complex or simple parts without tooling. Since this technology depends on using a computer to generate its cross sectional patterns, there is a natural data link to CAD/CAM. However, such systems have encountered difficulties relating to shrinkage, curl and other distortions, as well as resolution, accuracy and difficulties in producing certain object shapes.

Supports are shown in the figures in U.S. Pat. No. 4,575,330, and these supports attach the object to the platform.

The original type of posts/supports used were actually formed by curing single points. These points were cured for specific lengths of time to give appropriate cure depths, with a corresponding cure width. This type of post is limited by its strength, and the associated cure time required to achieve this strength level (if possible to obtain the desired strength).

Another type of post/support structure is based on the need to increase the adhesion strength between layers. The adhesion strength is proportional to area of contact between layers. When curing a point the cure width quickly reaches a limit where additional cure width is unpractical; therefore, another method of increasing contact area was implemented. Instead of curing supports that are point vectors in cross-section this next phase uses supports that are polygons in cross-section. These polygons can be triangles, rectangles, octagons, etc. These structures give us much greater contact area between layers (much greater adhesion strength), along with much greater structural strength against horizontal translation. These supports worked reasonably well but they still encountered some difficulties in that: (1) they were hard to remove from the object, (2) they offered support to only a limited number of object vectors, and (3) this type of support structure required the use of a base to support the polygons to insure attachment of the perforated platform.

Hence, there continues to be a long existing need in the design and production arts for the capability of rapidly and reliably moving from the design stage to the prototype stage and to ultimate production, particularly moving directly from the computer designs for such plastic parts to virtually immediate prototypes and the facility for large scale production on an economical and automatic basis.

Accordingly, those concerned with the development and production of three-dimensional plastic objects and the like have long recognized the desirability for further improvement in more rapid, reliable, economical and automatic means which would facilitate quickly moving from a design stage to the prototype stage and to production, while avoiding the support problems of the previous three-dimensional production systems. The present invention clearly fulfills all of these needs.

SUMMARY OF THE INVENTION

Basically, the present invention provides a new and improved stereolithography system for generating a three-dimensional object by forming successive, adjacent, cross-sectional laminae of that object at the face of a fluid medium capable of altering its physical state in response to appropriate synergistic stimulation, information defining the object being specially processed to provide necessary object supports, the successive laminae being automatically integrated as they are formed to define the desired three-dimensional object.

In a presently preferred embodiment, by way of example and not necessarily by way of limitation, the present invention harnesses the principles of computer generated graphics in combination with stereolithography, i.e., the application of lithographic techniques to the production of three-dimensional objects, to simultaneously execute computer aided design (CAD) and computer aided manufacturing (CAM) in producing three-dimensional objects directly from computer instructions. The invention can be applied for the purposes of sculpturing models and prototypes in a design phase of product development, or as a manufacturing system, or even as a pure art form.

Briefly and in general terms, the present invention provides an object support system which solves several problems. It supplies a method of attaching an object to the platform. It allows easy removal of a cured part from the platform. It allows better control of the thickness of the first layer of the part. It improves liquid flow in and around the part. It decreases required dip time. It allows the part to drain faster and better. It anchors free floating boundaries (insures borders are held in place until cross-hatch is drawn). It prevents deformation due to curl, due to forces associated with dipping, and due to the weight of the part. It anchors part sections that otherwise would not attach to anything (until future layers are drawn).

"Stereolithography" is a method and apparatus for making solid objects by successively "printing" thin layers of a curable material, e.g., a UV curable material, one on top of the other. A programmed movable spot beam of UV light shining on a surface or layer of UV curable liquid is used to form a solid cross-section of the object at the surface of the liquid. The object is then moved, in a programmed manner, away from the liquid surface by the thickness of one layer, and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

Of course, it will be appreciated that other forms of appropriate synergistic stimulation for a curable fluid medium, such as particle bombardment (electron beams and the like), chemical reactions by spraying materials through a mask or by ink jets, or impinging radiation other than ultraviolet light, may be used in the practice of the invention without departing from the spirit and scope of the invention.

By way of example, in the practice of the present invention, a body of a fluid medium capable of solidification in response to prescribed stimulation is first appropriately contained in any suitable vessel to define a designated working surface of the fluid medium at which successive cross-sectional laminae can be generated. Thereafter, an appropriate form of synergistic stimulation, such as a spot of UV light or the like, is applied as a graphic pattern at the specified working surface of the fluid medium to form thin, solid, individual layers at the surface, each layer representing an adjacent cross-section of the three-dimensional object to be produced. In accordance with the invention, information defining the object is specially processed to reduce curl and distortion, and increase resolution, strength, accuracy, speed and economy of reproduction.

Superposition of successive adjacent layers on each other is automatically accomplished, as they are formed, to integrate the layers and define the desired three-dimensional object. In this regard, as the fluid medium cures and solid material forms as a thin lamina at the working surface, a suitable platform to which the first lamina is secured is moved away from the working surface in a programmed manner by any appropriate actuator, typically all under the control of a micro-computer of the like. In this way, the solid material that was initially formed at the working surface is moved away from that surface and new liquid flows into the working surface position. A portion of this new liquid is, in turn, converted to solid material by the programmed UV light spot to define a new lamina, and this new lamina adhesively connects to the material adjacent to it, i.e., the immediately preceding lamina. This process continues until the entire three-dimensional object has been formed. The formed object is then removed from the container and the apparatus is ready to produce another object, either identical to the first object or an entirely new object generated by a computer or the like.

The data base of a CAD system can take several forms. One form consists of representing the surface of an object as a mesh of polygons, typically triangles. These triangles completely form the inner and outer surfaces of the object This CAD representation also includes a unit length normal vector for each triangle. The normal points away from the solid which the triangle is bounding and indicates slope. Means are provided for processing CAD data, which may be in the form of "PHIGS" or the like, into layer-by-layer vector data that can be used for forming models through stereolithography. Such information may ultimately be converted to raster scan output data or the like.

As previously indicated, stereolithography is a three-dimensional printing process which uses a moving laser beam to build parts by solidifying successive layers of liquid plastic. This method enables a designer to create a design on a CAD system, applying the concepts of the invention to reduce curl, stress, and provide suitable supports and build an accurate plastic model in a few hours. By way of example, a stereolithography may include the following steps.

First, the solid model is designed in the normal way on the CAD system, without specific reference to the stereolithographic process.

Model preparation for stereolithography involves selecting the optimum orientation, adding supports, building in appropriate stess relief, and selecting the operating parameters of the stereolithography system. The optimum orientation will (1) enable the object to drain, (2) have the least number of unsupported surfaces, (3) optimize important surfaces, and (4) enable the object to fit in the resin vat. Supports must be added to secure unattached sections and for other purposes, and a CAD library of supports can be prepared for this purpose. The stereolithography operating parameters include selection of the model scale and layer (slice) thickness.

The surface of the solid model is then divided into triangles, typically "PHIGS". A triangle is the least complex polygon for vector calculations. The more triangles formed, the better the surface resolution and hence, the more accurate the formed object with respect to the CAD design.

Data points representing the triangle coordinates and normals thereto are then transmitted typically as PHIGS, to the stereolithographic system via appropriate network communication such as ETHERNET. The software of the stereolithographic system then slices the triangular sections horizontally (X-Y plane) at the selected layer thickness.

The stereolithographic unit (SLA) next calculates the section boundry, hatch, and horizontal surface (skin) vectors. Hatch vectors consist of cross-hatching between the boundary vectors. Several "styles" or slicing formats are available. Skin vectors, which are traced at high speed and with a large overlap, form the outside horizontal surfaces of the object. Interior horizontal areas, those within top and bottom skins, are not filled in other than by cross-hatch vectors.

The SLA then forms the object one horizontal layer at a time by moving the ultraviolet beam of a helium-cadmium laser or the like across the surface of a photocurable resin and solidifying the liquid where it strikes. Absorption in the resin prevents the laser light from penetrating deeply and allows a thin layer to be formed. Each layer is comprised of vectors which are typically drawn in the following order: border, hatch, and surface.

The first layer that is drawn by the SLA adheres to a horizontal platform located just below the liquid surface. This platform is attached to an elevator which then lowers the platform under computer control. After drawing a layer, the platform dips a short distance, such as several millimeters into the liquid to coat the previous cured layer with fresh liquid, then rises up a smaller distance leaving a thin film of liquid from which the second layer will be formed. After a pause to allow the liquid surface to flatten out, the next layer is drawn. Since the resin has adhesive properties, the second layer becomes firmly attached to the first. This process is repeated until all the layers have been drawn and the entire three-dimensional object is formed. Normally, the bottom 0.25 inch or so of the object is a support structure on which the desired part is built. Resin that has not been exposed to light remains in the vat to be used for the next part. There is very little waste of material.

Post processing typically involves draining the formed object to remove excess resin, ultraviolet or heat curing to complete polymerization, and removing supports. Additional processing, including sanding and assembly into working models, may also be performed.

In accordance with the invention, supports are provided in the form of "WEBS". Webs, in cross-section are long slender rectangular structures. The width of a web is designed thin enough to be easy to remove from the part after post curing. The length of a web is designed to meet two requirements: (1) long enough to give good adhesion to the elevator platform (without need of a base), and (2) long enough to span the cross-section of the object (to give support to cross-hatch and the boundaries enclosing it).

All of these types of supports are used to attach objects to platforms (elevators), but they are also used to give critical areas of the object extra support. These critical areas may include upper edges of windows, cantilevers, etc. Webs may start at the elevator platform and work their way up to the section that requires support or they may actually start on one section of the part and work their way up to another section that needs support.

The new and improved stereolithographic system of the present invention has many advantages over currently used apparatus for producing plastic objects. The methods and apparatus of the present invention avoid the need of producing design layouts and drawings, and of producing tooling drawings and tooling. The designer can work directly with the computer and a stereolithographic device, and when h®is satisfied with the design as displayed on the output screen of the computer, he can fabricate a part for direct examination. If the design has to be modified, it can be easily done through the computer, and then another part can be made to verify that the change was correct. If the design calls for several parts with interacting design parameters, the method of the invention becomes even more useful because all of the part designs can be quickly changed and made again so that the total assembly can be made and examined, repeatedly if necessary. Moreover, the data manipulation techniques of the present invention enable production of objects with reduced stress, curl and distortion, and increased resolution, strength accuracy, speed and economy of production, even for difficult and complex object shapes.

After the design is complete, part production can begin immediately, so that the weeks and months between design and production are avoided. Stereolithography is particularly useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

Hence, the new and improved stereolithographic methods and apparatus of the present invention satisfy a long existing need for an improved CAD and CAM system capable of rapidly, reliably, accurately and economically designing and fabricating three-dimensional parts and the like with reduced stress and curl and with adequate supports.

The above and other objects and advantages of this invention will be apparent from the following more detailed description when taken in conjunction with the accompanying drawings of illustrative embodiments.

BRIEF DESCRIPTION OF THE DRAWINGS

FIG. 7 illustrates how supports anchor layer borders in place until cross-hatch vectors are drawn;

FIG. 8 illustrates how supports prevent deformation and curl of cantilevered beams and similar structures;

FIG. 9 illustrates how supports attach layer sections that would otherwise be temporarily unattached while the part is being built;

FIG. 10 illustrates how perpendicular web supports prevent layer skewing; and FIG. 11 illustrates use of diagonal supports.

DESCRIPTION OF THE PREFERRED EMBODIMENT

Stereolithography parts are preferably built on structures known as supports, rather than directly on the elevator platform. One reason for using supports is to separate the part from the platform. A part cured directly to the platform would be difficult to remove, especially if the adhering surface is large. Furthermore, the thickness of the first layer formed on the platform cannot be accurately controlled and may even vary if the platform is warped or improperly installed. This could result in lines which are not cured deeply enough to adhere to the platform, a condition that could promote curl. Even without these potential problems, the holes in the platform would create matching bumps on the bottom surface of any part made directly on it. Displacement of liquid as the platform is submerged can change the thickness of the first few layers, and these effects would be undesirable within the part itself.

Another reason for using supports is to improve liquid flow around the part. This enables use of a shorter dip time, since the surface of the liquid will settle faster with improved flow. Additionally, excess resin will drain faster from the completed part to reduce post processing time.

Supports are also used to anchor sections of a part which would otherwise have a tendency to move and to strengthen areas susceptible to curl or damage during dipping.

Figure 1:
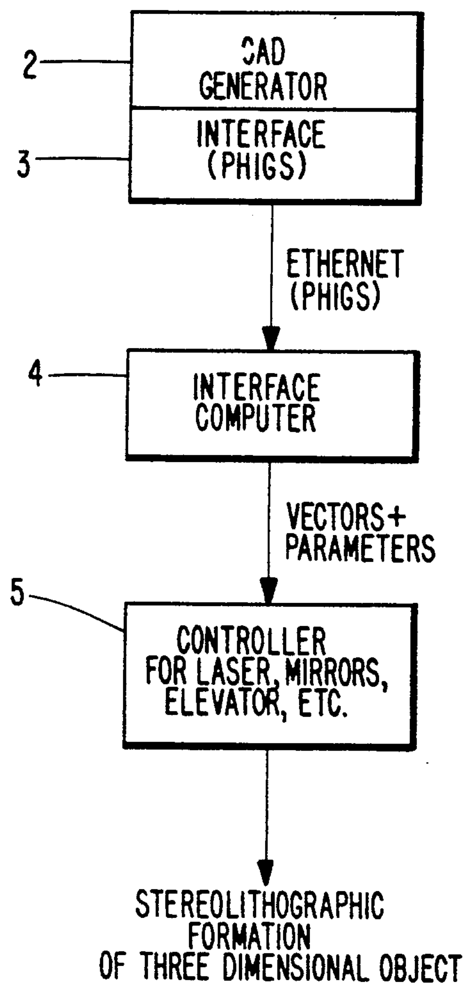
FIG. 1 is a overall block diagram of a stereolithography system for the practice of the present invention.

Referring now to the drawings, and particularly to FIG. 1 thereof, there is shown a block diagram of an overall stereolithography system suitable for practicing the present invention. A CAD generator 2 and appropriate interface 3 provide a data description of the object to be formed, typically in PHIGS format, via network communication such as ETHERNET or the like to an interface computer 4 where the object data is manipulated to optimize the data and provide output vectors which reduce stress, curl and distortion, and increase resolution, strength, accuracy, speed and economy of reproduction, even for rather difficult and complex object shapes. The interface computer 4 generates layer data by slicing, varying layer thickness, rounding polygon vertices, filling, generating flat skins, near-flat skins, up-facing and down-facing skins, scaling, cross-hatching, offsetting vectors and ordering of vectors.

The vector data and parameters from the computer 4 are directed to a controller subsystem 5 for operating the system stereolithography laser, mirrors, elevator and the like.

Figure 2:
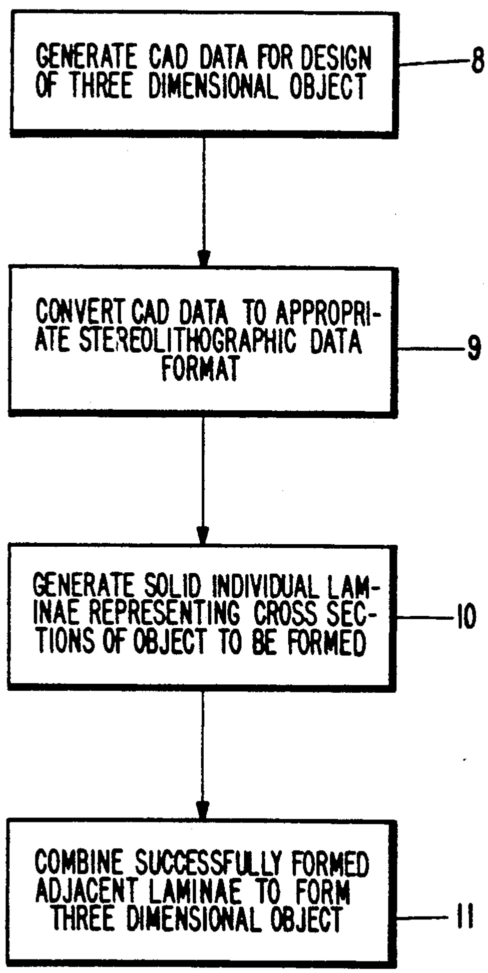
FIGS. 2 and 3 are flow charts illustrating the basic concepts employed in practicing the method of stereolithography of the present invention.
Figure 3:
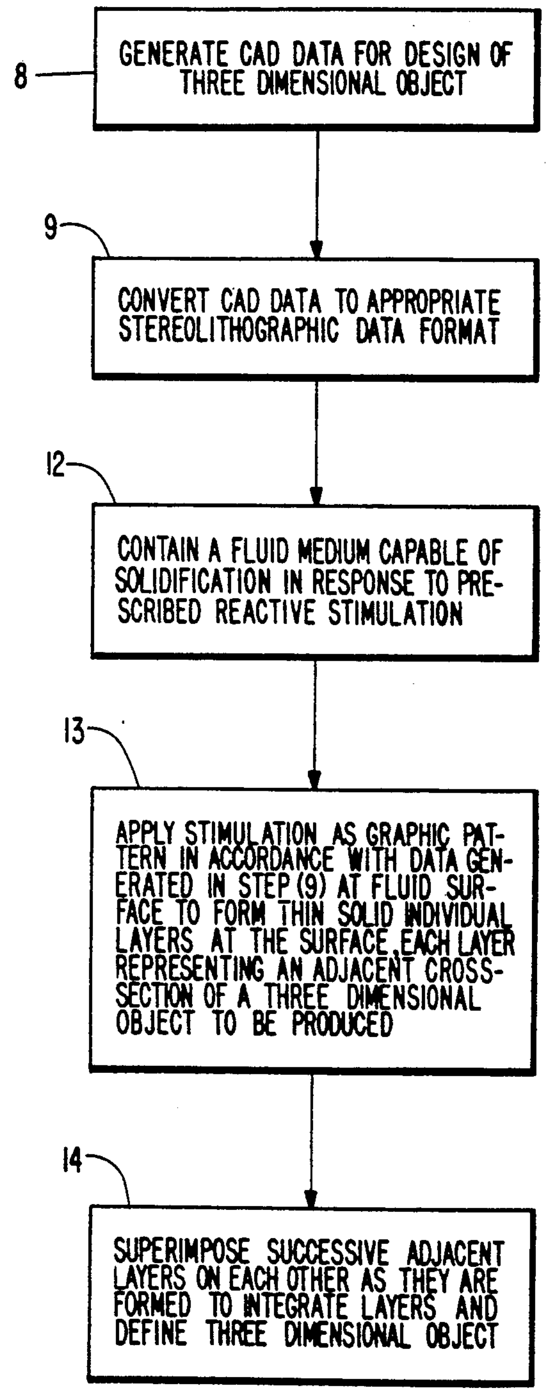

FIGS. 2 and 3 are flow charts illustrating the basic system of the present invention for generating three-dimensional objects by means of stereolithography.

Many liquid state chemicals are known which can be induced to change to solid state polymer plastic by irradiation with ultraviolet light (UV) or other forms of synergistic stimulation such as electron beams, visible or invisible light, reactive chemicals applied by ink jet or via a suitable mask. UV curable chemicals are currently used as ink for high speed printing, in processes of coating of paper and other materials, such as adhesives, and in other specialty areas.

Lithography is the art of reproducing graphic objects, using various techniques. Modern examples include photographic reproduction, xerography, and microlithography, as is used in the production of microelectronics. Computer generated graphics displayed on a plotter or a cathode ray tube are also forms of lithography, where the image is a picture of a computer coded object.

Computer aided design (CAD) and computer aided manufacturing (CAM) are techniques that apply the abilities of computers to the processes of designing and manufacturing. A typical example of CAD is in the area of electronic printed circuit design, where a computer and plotter draw the design of a printed circuit board, given the design parameters as computer data input. A typical example of CAM is a numerically controlled milling machine, where a computer and a milling machine produce metal parts, given the proper programming instructions. Both CAD and CAM are important and are rapidly growing technologies.

A prime object of the present invention is to harness the principles of computer generated graphics, combined with UV curable plastic and the like, to simultaneously execute CAD and CAM, and to produce three-dimensional objects directly from computer instructions. This invention, referred to as stereolithography, can be used to sculpture models and prototypes in a design phase of product development, or as a manufacturing device, or even as an art form. The present invention enhances the developments in stereolithography set forth in U.S. Pat. No. 4,575,330, issued Mar. 11, 1986, to Charles W. Hull, one of the inventors herein.

Referring now more specifically to FIG. 2 of the drawing, the stereolithographic method is broadly outlined. Step 8 calls for generation of CAD or other data, typically in digital form, representing a three-dimensional object to be formed by the system. This CAD data usually defines surfaces in polygon format, triangles and normals perpendicular to the planes of those triangles, e.g., for slope indications, being presently preferred, and in a presently preferred embodiment of the invention conforms to the Programmer's Hierarchial Interactive Graphics System (PHIGS) now adapted as an ANSI standard. This standard is described, by way of example in the publication "Understanding PHIGS", published by Template, Megatek Corp., San Diego, Calif.

In Step 9, the PHIGS data or its equivalent is converted, in accordance with the invention, by a unique conversion system to a modified data base for driving the stereolithography output system in forming three-dimensional objects. In this regard, information defining the object is specially processed to reduce stress, curl and distortion, and increase resolution, strength and accuracy of reproduction Step 10 in FIG. 2 calls for the generation of individual solid laminae representing cross-sections of a three-dimensional object to be formed. Step 11 combines the successively formed adjacent lamine to form the desired three-dimensional object which has been programmed into the system for selective curing.

Hence, the stereolithographic system of the present invention generates three-dimensional objects by creating a cross-sectional pattern of the object to be formed at a selected surface of a fluid medium, e.g., a UV curable liquid or the like, capable of altering its physical state in response to appropriate synergistic stimulation such as impinging radiation, electron beam or other particle bombardment, or applied chemicals (as by ink jet or spraying over a mask adjacent the fluid surface), successive adjacent laminae, representing corresponding successive adjacent cross-sections of the object, being automatically formed and integrated together to provide a step-wise laminar or thin layer buildup of the object, whereby a three-dimensional object is formed and drawn from a substantially planar or sheet-like surface of the fluid medium during the forming process.

The aforedescribed technique illustrated in FIG. 2 is more specifically outlined in the flowchart of FIG. 3, where again Step 8 calls for generation of CAD or other data, typically in digital form, representing a three-dimensional object to be formed by the system. Again, in Step 9, the PHIGS data is converted by a unique conversion system to a modified data base for driving the stereolithography output system in forming three-dimensional objects. Step 12 calls for containing a fluid medium capable of solidification in response to prescribed reactive stimulation. Step 13 calls for application of that stimulation as a graphic pattern, in response to data output from the computer 4 in FIG. 1, at a designated fluid surface to form thin, solid, individual layers at that surface, each layer representing an adjacent cross-section of a three-dimensional object to be produced. In the practical application of the invention, each lamina will be a tin lamina, but thick enough to be adequately cohesive in forming the cross-section and adhering to the adjacent laminae defining other cross-sections of the object being formed.

Step 14 in FIG. 3 calls for superimposing successive adjacent layers or laminae on each other as they are formed, to integrate the various layers and define the desired three-dimensional object. In the normal practice of the invention, as the fluid medium cures and solid material forms to define one lamina, that lamina is moved away from the working surface of the fluid medium and the next lamina is formed in the new liquid which replaces the previously formed lamina, so that each successive lamina is superimposed and integral with (by virtue of the natural adhesive properties of the cured fluid medium) all of the other cross-sectional laminae. Of course, as previously indicated, the present invention also deals with the problems posed in transitioning between vertical and horizontal.

The process of producing such cross-sectional laminae is repeated over and over again until the entire three-dimensional object has been formed. The object is then removed and the system is ready to produce another object which may be identical to the previous object or may be an entirely new object formed by changing the program controlling the stereolithographic system.

Figure 4:
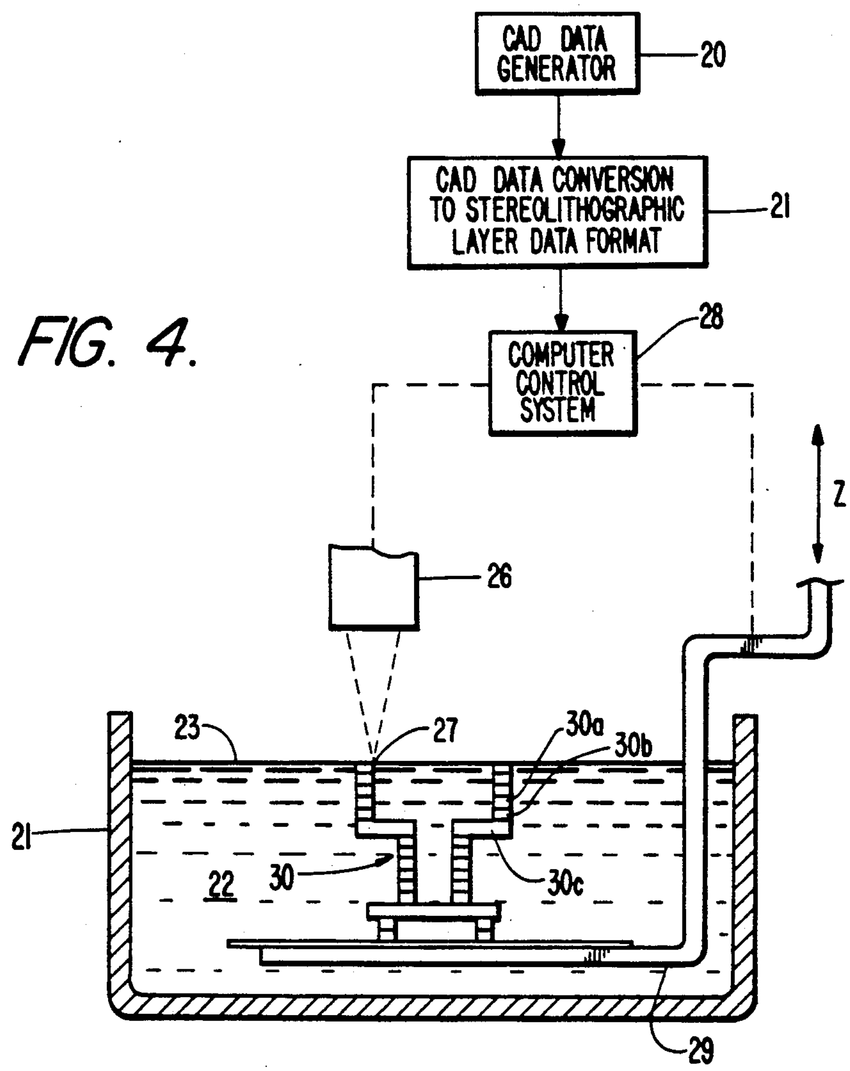
FIG. 4 is a combined block diagram, schematic and elevational sectional view of a system suitable for practicing the invention.
Figure 5:
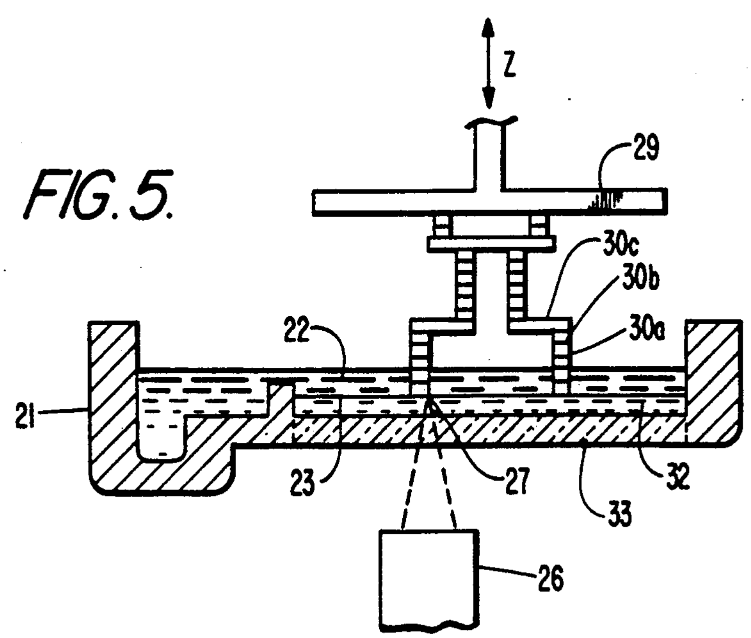
FIG. 5 is an elevational sectional view of a second embodiment of a stereolithography system for the practice of the invention.

FIGS. 4–5 of the drawings illustrate various apparatus suitable for implementing the stereolithographic methods illustrated and described by the systems and flow charts of FIGS. 1–3.

As previously indicated, "Stereolithography" is a method and apparatus for making solid objects by successively "printing" thin layers of a curable material, e.g., a UV curable material, one on top of the other. A programmable movable spot beam of UV light shining on a surface or layer of UV curable liquid is used to form a solid cross-section of the object at the surface of the liquid. The object is then moved, in a programmed manner, away from the liquid surface by the thickness of one layer and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

The data base of a CAD system can take several forms. One form, as previously indicated, consists of representing the surface of an object as a mesh of triangles (PHIGS). These triangles completely form the inner and outer surfaces of the object. This CAD representation also includes a unit length normal vector for each triangle. The normal points away from the solid which the triangle is bounding. This invention provides a means of processing such CAD data into the layer-by-layer vector data that is necessary for forming objects through stereolithography.

For stereolithography to successfully work, there must be good adhesion from one layer to the next. Hence, plastic from one layer must overlay plastic that was formed when the previous layer was built. In building models that are made of vertical segments, plastic that is formed on one layer will fall exactly on previously formed plastic from the preceding layer, and thereby provide good adhesion. As one starts to make a transition from vertical to horizontal features, using finite jumps in layer thickness, a point will eventually be reached where the plastic formed on one layer does not make contact with the plastic formed on the previous layer, this causes severe adhesion problems. Horizontal surfaces themselves do not present adhesion problems because by being horizontal the whole section is built on one layer with side-to-side adhesion maintaining structural integrity. Therefore, means are provided for insuring adhesion between layers when making transitions from vertical to horizontal or horizontal to vertical sections, as well as providing a way to completely bound a surface, and ways to reduce or eliminate stress and strain in formed parts.

A presently preferred embodiment of a new and improved stereolithographic system is shown in elevational cross-section in FIG. 4. A container 21 is filled with a UV curable liquid 22 or the like, to provide a designated working surface 23. A programmable source of ultraviolet light 26 or the like produces a spot of ultraviolet light 27 in the plane of surface 23. The spot 27 is movable across the surface 23 by the motion of mirrors or other optical or mechanical elements (not shown in FIG. 4) used with the light source 26. The position of the spot 27 on surface 23 is controlled by a computer control system 28. As previously indicated, the system 28 may be under control of CAD data produced by a generator 20 in a CAD design system or the like and directed in PHIGS format or its equivalent to a computerized conversion system 25 where information defining the object is specially processed to reduce stress, curl and distortion, and increase resolution, strength and accuracy of reproduction.

A movable elevator platform 29 inside container 21 can be moved up and down selectively, the position of the platform being controlled by the system 28. As the device operates, it produces a three-dimensional object 30 by step-wise buildup of integrated laminae such as 30*a*, 30*b*, 30*c*.

The surface of the UV curable liquid 22 is maintained at a constant level in the container 21, and the spot of UV light 27, or other suitable form of reactive stimulation, of sufficient intensity to cure the liquid and convert it to a solid material is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 and new liquid 22 flows across the surface 23. A portion of this new liquid is, in turn, converted to solid material by the programmed UV light spot 27, and the new material adhesively connects to the material below it. This process is continued until the entire three-dimensional object 30 is formed. The object 30 is then removed from the container 21, and the apparatus is ready to produce another object. Another object can then be produced, or some new object can be made by changing the program in the computer 28.

The curable liquid 22, e.g., UV curable liquid, must have several important properties. (A) It must cure fast enough with the available UV light source to allow practical object formation times. (B) It must be adhesive, so that successive layers will adhere to each other. (C) Its viscosity must be low enough so that fresh liquid material will quickly flow across the surface when the elevator moves the object. (D) It should absorb UV so that the film formed will be reasonably thin. (E) It must be reasonably soluble in some solvent in the liquid state, and reasonably insoluble in that same solvent in the solid state, so that the object can be washed free of the UV cure liquid and partially cured liquid after the object has been formed. (F) It should be as non-toxic and non-irritating as possible.

The cured material must also have desirable properties once it is in the solid state. These properties depend on the application involved, as in the conventional use of other plastic materials. Such parameters as color, texture, strength, electrical properties, flammability, and flexibility are among the properties to be considered. In addition, the cost of the material will be important in many cases.

The UV curable material used in the presently preferred embodiment of a working stereolithograph (e.g., FIG. 3) is DeSoto SLR 800 stereolithography resin, made by DeSoto, Inc. of Des Plains, Ill.

The light source 26 produces the spot 27 of UV light small enough to allow the desired object detail to be formed, and intense enough to cure the UV curable liquid being used quickly enough to be practical. The source 26 is arranged so it can be programmed to be turned off and on, and to move, such that the focused spot 27 moves across the surface 23 of the liquid 22. Thus, as the spot 27 moves, it cures the liquid 22 into a solid, and "draws" a solid pattern on the surface in much the same way a chart recorder or plotter uses a pen to draw a pattern on paper.

The light source 26 for the presently preferred embodiment of a stereolithography is typically a helium-cadmium ultraviolet laser such as the Model 424 N HeCd Multimode Laser, made by Liconix of Sunnyvale, Calif.

In the system of FIG. 4, means may be provided to keep the surface 23 at a constant level and to replenish this material after an object has been removed, so that the focus spot 27 will remain sharply in focus on a fixed focus plane, thus insuring maximum resolution in forming a layer along the working surface. In this regard, it is desired to shape the focal point to provide a region of high intensity right at the working surface 23, rapidly diverging to low intensity and thereby limiting the depth of the curing process to provide the thinnest appropriate cross-sectional laminae for the object being formed.

The elevator platform 29 is used to support and hold the object 30 being formed, and to move it up and down as required. Typically, after a layer is formed, the object 30 is moved beyond the level of the next layer to allow the liquid 22 to flow into the momentary void at surface 23 left where the solid was formed, and then it is moved back to the correct level for the next layer. The requirements for the elevator platform 29 are that it can be moved in a programmed fashion at appropriate speeds, with adequate precision, and that it is powerful enough to handle the weight of the object 30 being formed. In addition, a manual fine adjustment of the elevator platform position is useful during the set-up phase and when the object is being removed.

The elevator platform 29 can be mechanical, pneumatic, hydraulic, or electrical and may also use optical or electronic feedback to precisely control its position. The elevator platform 29 is typically fabricated of either glass or aluminum, but any material to which the cured plastic material will adhere is suitable.

A computer controlled pump (not shown) may be used to maintain a constant level of the liquid 22 at the working surface 23. Appropriate level detection system and feedback networks, well known in the art, can be used to drive a fluid pump or a liquid displacement device, such as a solid rod (not shown) which is moved out of the fluid medium as the elevator platform is moved further into the fluid medium, to offset changes in fluid volume and maintain constant fluid level at the surface 23. Alternatively, the source 26 can be moved relative to the sensed level 23 and automatically maintain sharp focus at the working surface 23. All of these alternatives can be readily achieved by appropriate data operating in conjunction with the computer control system 28.

Figure 6:
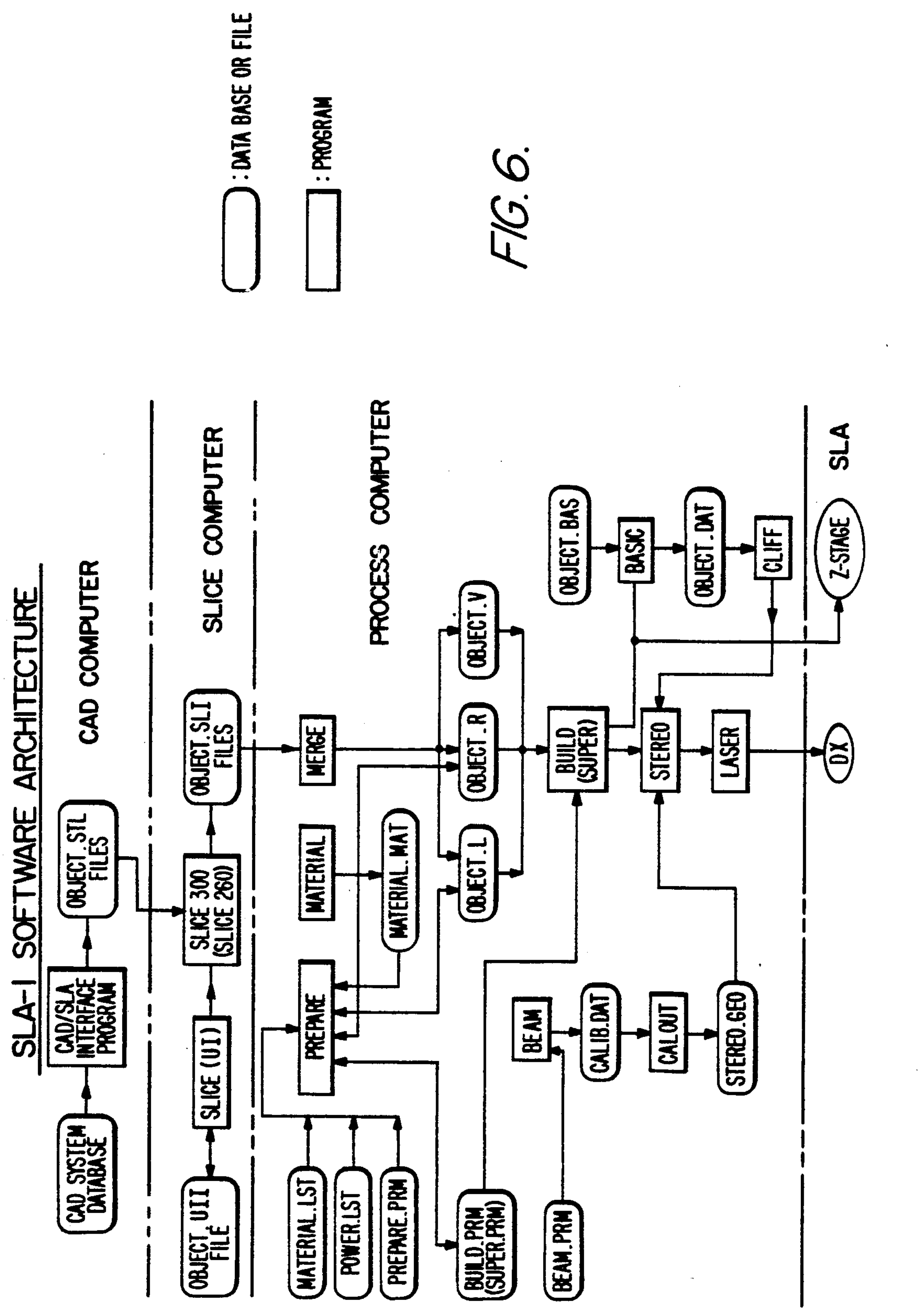
FIG. 6 is a software architecture flow chart depicting in greater detail the overall data flow, data manipulation and data management in a stereolithography system.

FIG. 6 of the drawings illustrates the overall software architecture of a stereolithography system in which the present invention may be practiced.

As an overview, the portion of our processing referred to as "SLICE" takes in the object that you want to build, together with any scaffolding or supports that are necessary to make it more buildable. These supports are typically generated by the user's CAD. The first thing SLICE does is to find the outlines of the object and its supports.

SLICE defines each microsection or layer one at a time under certain specified controlling styles. SLICE produces a boundary to the solid portion of the object. If, for instance, the object is hollow, there will be an outside surface and an inside one. This outline then is the primary information. The SLICE program then takes that outline or series of outlines and says, but if you build an outside skin and an inside skin they won't join to one another, you'll have liquid between them. It will collapse. So let us turn this into a real product, a real part by putting in cross-hatching between the surfaces or solidifying everything inbetween or adding skins where there is so gentle a slope that one layer wouldn't join on top of the next, remembering past history or slope of the triangles (PHIGS) whichever way you look at it. SLICE does all those things and may use some lookup tables of the chemical characteristics of the photopolymer, how powerful the laser is, and related parameter to indicate how long to expose each of the output vectors used to operate the system. That output consists of identifiable groups. One group consists of the boundaries or outlines. Another group consists of cross-hatches. There are various subgroups of these types further described in Ser. No. 182,830. A third group consists of skins and there are subgroups of those, upward facing skins, and downward facing skins which have to be treated slightly differently. These subgroups are all tracked differently because they may get slightly different treatment, in the process the output data is then appropriately managed to form the desired object and supports.

After the three-dimensional object 30 has been formed, the elevator platform 29 is raised and the object is removed from the platform for post processing.

In addition, there may be several containers 21 used in the practice of the invention, each container having a different type of curable material that can be automatically selected by the stereolithographic system. In this regard, the various materials might provide plastics of different colors, or have both insulating and conducting material available for the various layers of electronic products.

As will be apparent from FIG. 5 of the drawings, there is shown an alternate configuration of a stereolithograph wherein the UV curable liquid 22 or the like floats on a heavier UV transparent liquid 32 which is non-miscible and non-wetting with the curable liquid 22. By way of example, ethylene glycol or heavy water are suitable for the intermediate liquid layer 32. In the system of FIG. 4, the three-dimensional object 30 is pulled up from the liquid 22, rather than down and further into the liquid medium, as shown in the system of FIG. 3.

The UV light source 26 in FIG. 5 focuses the spot 27 at the interface between the liquid 22 and the non-miscible intermediate liquid layer 32, the UV radiation passing through a suitable UV transparent window 33, of quartz or the like, supported at the bottom of the container 21. The curable liquid 22 is provided in a very thin layer over the non-miscible layer 32 and thereby has the advantage of limiting layer thickness directly rather than relying solely upon absorption and the like to limit the depth of curing since ideally an ultrathin lamina is to be provided. Hence, the region of formation will be more sharply defined and some surfaces will be formed smoother with the system of FIG. 5 than with that of FIG. 4. In addition a smaller volume of UV curable liquid 22 is required, and the substitution of one curable material for another is easier.

A commercial stereolithography system will have additional components and subsystems besides those previously shown in connection with the schematically depicted systems of FIGS. 1–5. For example, the commercial system would also have a frame and housing, and a control panel. It should have means to shield the operator from excess UV and visible light, and it may also have means to allow viewing of the object 30 while it is being formed. Commercial units will provide safety means for controlling ozone and noxious fumes, as well as conventional high voltage safety protection and interlocks . Such commercial units will also have means to effectively shield the sensitive electronics from electronic noise sources.

In accordance with the invention, part supports are provided by the user during CAD design.

THE NEED FOR PART SUPPORTS

A. To Separate Parts from Platform
1. Easier to remove cured part
2. Better control of thickness of first layer
3. Holes in platform cause matching pattern on part
B. To Improve Liquid Flow In and Around Part
1. Liquid settles faster
 a. Minimizes dip time
2. Part drains faster and better
C. To Anchor Freely Floating Layer Borders
1. For a sphere, below equator layer border diameters increase rapidly
2. Layer borders will drift until hatch vectors are drawn
 a. Air currents
 b. Convection currents in liquid
3. Outside supports not needed above equator, inside maybe FIG. 7 illustrates how supports anchor layer borders in place until cross-hatch vectors are drawn.

D. To Strengthen Otherwise Unsupported Layer Sections
1. Prevents deformation
 a. During dipping
 b. Due to increasing weight of part
2. Prevents curl
 a. Layer section cannot withstand stress
 b. Can use smalleys or supports FIG. 8 illustrates how supports inhibit deformation and curl of cantilevered beams and similar structures.

E. To Anchor Unattached Layer Sections
1. Such layer sections will drift during dipping
2. Support is base on which part is built
3. Support must at least exist one layer below first unconnected section FIG. 9 illustrates how supports attach layer sections that would otherwise drift during dipping.

WEB SUPPORTS

In a presently preferred embodiment of the invention, "web" supports are preferred.

A. Most Practical Shape
1. Easy to remove
2. Will not fall through platform
3. Does not take long to draw
 a. Two back-to-back layer borders
 b. No cross-hatches necessary
 c. No skins necessary.
B. Can Make CAD Library of Commonly Used Support Styles.
1. Use similar supports for many different parts
2. Faster to modify existing supports than create new ones Example A: Near the bottom of the solid sphere shown in FIG. 7, the layer border vectors consist of circles whose diameters increase rapidly with each successive layer. Until the cross-hatch vectors are drawn, many of the layer borders would float free on the surface of the liquid. Air currents or convection currents in the liquid could cause them to drift out of position.

Adding supports which extend to the equator of the sphere, as shown in FIG. 7 solves this problem. Note that above the equator, the layer borders are formed directly on the cross-hatch vectors of the previous layer, and as such are firmly anchored without the need for further support.

Example B: The first layer of the cantilevered beam shown in FIG. 8 (or any unsupported layer border) may be permanently deformed by the static resistance of the liquid when the part is dipped. In addition, the layer could curl upward when the next layer is formed. Both of these problems are solved by adding supports.

Example C: The first layer of the teacup handle shown in FIG. 9 would be completely unattached when formed and would drift when the part is dipped. The support provides a surface, anchored to the elevator platform or to the body of the teacup, on which the handle can be built.

DESIGNING SUPPORTS

The most practical type of support is the thin, vertical web shown in the previous illustrations. Web supports are easy to remove during post processing and, if they are designed properly, will not fall through the holes in the elevator platform. Other shapes could provide the necessary support, but would take longer to draw.

Generally, supports are designed together as a single CAD file separate from the part file. They are positioned relative to the solid model after the part is designed and oriented for Stereolithography. The object and support files are merged and drawn as a single file later in the stereolithography process. A library of supports resident in the CAD is recommended, rather than designing unique supports for each application. In either case, supports should be designed and attached to the part in accordance with the following guidelines.

Placement: Supports should be located as needed to provide a rigid foundation on which the part may be built. Supports should also be added to anchor or strengthen other surfaces, as discussed in the preceding examples.

After the part is post-cured and the supports are removed, ridges will normally remain on the surface of the part. (The ridges can be cut and sanded or ground away.) Thus, if possible, avoid placing supports on surfaces that for aesthetic or functional reasons need to be smooth. Supports need not be attached to the elevator platform, but can instead be anchored to a strong section of the part.

Spacing: In general, supports should be spaced at sufficiently close intervals so that no appreciable sag or curl occurs; however, drawing too many supports will slow the part building process. Web supports should typically be spaced 0.1 to 0.8 inch apart.

Orientation: If all web supports for a part are aligned parallel to one another, as shown in FIG. 10, the weight of the part could cause the webs to sag sideways while the part is being built. Subsequently layers would then be offset slightly (skewed) with respect to the previous layers. The addition of web supports more or less perpendicular to the parallel webs will prevent layer skewing.

Height: To inhibit bending or sagging and to minimize drawing time, web supports should be no taller than required; however, the part must be suspended at least 0.25 inch above the elevator platform to ensure optimum liquid draining and settling (relaxing). If a tall web is needed, a second web perpendicular to the first should be added for additional support. In cross-section, the combined support would look like a plus sign, as shown in FIG. 10.

Width: To minimize drawing time, supports should be only as wide as necessary. However, web supports built on the platform must be at least 0.65 inch wide where they contact the platform or they may droop or fall through the holes. Diagonal supports beginning and ending on the part should be designed as buttresses, as shown in FIG. 11, and should not extend into the corner of the part where they will be hard to remove.

Thickness: Web supports should be designed as slabs of 1-mil CAD thickness. Since the width of the lines drawn with the laser is usually 10 to 20 mils, the actual support will be considerably thicker than the CAD design. Supports designed as single surfaces with no CAD volume will confuse the software which creates cross-hatching, and should be avoided.

Attachment: To ensure that the part is securely attached to the supports, design the web supports to overlap the part vertically by two or three layer thicknesses (typically 40 to 60 mils).

BUILDING SUPPORTS

As mentioned earlier, supports are designed together in a single CAD file separate from the part file. These stereolithography (.STL) files are the sliced, or cross-sectioned, before being merged into one file. The features of the slicing software (SLICE) and merging software (MERGE) applicable to supports are described below.

Slicing Support Files: Slice has several options which are usually set to zero when slicing support files. Since web supports are thin, cross-hatching is unnecessary, so the X, Y and 60/120 hatch spacing values sho ıld be set to zero. For the same reason, supports do not need skins, so the X and Y skin fill values may also be zeroed. Minimum surface angle for scanned facets (MSA) and minimum hatch intersect angle (MIA) should be set to zero because web supports do not need near-flat skins and have no cross-hatching.

The slice scale and Z spacing values selected for the support file must be compatible with the values chosen for the part file; that is, the support slice thickness must be evenly divisible by or identical to the slice thickness of the part file (in the overlap region). Otherwise, it will be impossible to draw lines for the supports and the part in the same layer.

Selecting The Step Period: In forming the walls of the web support (one mil apart), the layer border exposed while drawing the first wall will again be exposed while the second is drawn, because of the relatively broad laser line width. This effectively doubles the step period. For this reason, the step period obtained from the working curve may be divided by two before it is entered.

Editing The Layer Control File: The final operator action required to build supports is to use Preparer menu options to increase the default step period value for the layer border vectors forming the first layer of the supports. Doing so increases the thickness (cure depth) of the layer. Normally, tripling the default support step period ensures adequate adhesion of the first layer of the supports to the platform.

An example of one embodiment of a commercial system, provided by 3D Systems, Inc. of Sylmar, Calif., embodying the present invention, is illustrated and described by the enclosed appendices, wherein Appendix A is a manual describing the overall system for an early Model SLA-1 Beta Site Stereolithography System, including installation and operation, Appendix B is the first draft of the SLA-1 Software Manual together with a manual addendum for use with this earlier system, Appendix C is source code listings for software Version 2.62 for running an earlier stereolithography system, Appendix D is a Training Manual for the most recent version of the Model SLA-1 Stereolithography System, Appendix E is a parts list of the major components for the latest version of the Model SLA-1 Stereolithography System, Appendix F is source code listings for software Version 3.03 for running the latest stereolithography system, Appendix G is a "Slice" Flow Chart Implementing Style 1, Appendix H is a "Slice" Flow Chart Implementing Style 2, and Appendix I is a Stereolithography Interface Specification for enabling provision of suitable interface between CAD equipment and the Model SLA-1 Stereolithography System.

The new and improved stereolithographic method and apparatus has many advantages over currently used methods for producing plastic objects. The method avoids the need of producing tooling drawings and tooling. The designer can work directly with the computer and a stereolithographic device, and when he is satisfied with the design as displayed on the output screen of the computer, he can fabricate a part for direct examination information defining the object being tailored to provide supports reduce curl and distortion, and increase resolution, strength and accuracy of reproduction. If the design has to be modified, it can be easily done through the computer, and then another part can be made to verify that the change was correct. If the design calls for several parts with interacting design parameters, the method becomes even more useful because all of the part designs can be quickly changed and made again so that the total assembly can be made and examined, repeatedly if necessary.

After the design is complete, part production can begin immediately, so that the weeks and months between design and production are avoided. Ultimate production rates and parts costs should be similar to current injection molding costs for short run production, with even lower labor costs than those associated with injection molding. Injection molding is economical only when large numbers of identical parts are required. Stereolithography is particularly useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided prior to the decision to make more expensive metal or other material parts.

The present invention satisfies a long existing need in the art for a CAD and CAM system capable of rapidly, reliably, accurately and economically designing and fabricating three-dimensional plastic parts and the like.

It will be apparent from the foregoing that, while particular forms of the invention have been illustrated and described, various modifications can be made without departing from the spirit and scope of the invention. Accordingly, it is not intended that the invention be limited, except as by the appended claims.

APPENDIX A

~~Docket No. 30385~~

Serial No. 182,801 systems, inc.

SLA-1

BETA SITE

STEREOLITHOGRAPHY

SYSTEM

CONFIDENTIAL LEGENDS ON THIS
APPENDIX ARE TO BE CONSIDERED DELETED.

3D Systems Incorporated
12847 Arroyo Street
Sylmar, California 91342
(818) 898-1533 • FAX (818) 361-5484

NOVEMBER 1987 systems, inc.

NOT TO BE DISCLOSED

THIS DOCUMENT CONTAINS CONFIDENTIAL INFORMATION RELATING TO STEREOLITHOGRAPHY PROCESSES AND EQUIPMENT WHICH ARE THE EXCLUSIVE PROPERTY OF 3D SYSTEMS, INC. THIS INFORMATION SHALL NOT BE DUPLICATED, USED OR DISCLOSED -- IN WHOLE OR IN PART -- FOR ANY PURPOSE OTHER THAN TRAINING AS AUTHORIZED IN WRITING BY 3D SYSTEMS, INC. ALL REASONABLE PRECAUTIONS SHALL BE TAKEN TO ENSURE COMPLIANCE WITH THESE CONDITIONS.

THE POSSESSION OF THIS DOCUMENT CONVEYS NO PROPERTY RIGHT OR LICENSE IN THE INFORMATION NOR IN ANY MATTER DISCLOSED THEREIN.

SLA-1

BETA SITE

STEREOLITHOGRAPHY

SYSTEM

USER'S MANUAL

TABLE OF CONTENTS

INTRODUCTION

DESCRIPTION AND GENERAL INFORMATION

CONTROLS AND INDICATORS

OPERATING INSTRUCTIONS

TROUBLESHOOTING

OPERATOR MAINTENANCE INSTRUCTIONS

3D Systems Incorporated
12847 Arroyo Street
Sylmar, California 91342
(818) 898-1533 • FAX (818) 361-5484

NOVEMBER 1987 systems, inc. COMPANY CONFIDENTAL

Safety Precautions

WARNING
INVISIBLE LASER RADIATION

UV LASER RADIATION MAY DAMAGE EYE TISSUE. AVOID DIRECT EXPOSURE TO LASER BEAM. WEAR UV BLOCKING SAFETY GLASSES.

WARNING
HIGH VOLTAGE

HAZARDOUS VOLTAGES ARE ACCESSIBLE WITH MAINTENANCE PANELS REMOVED. FOLLOW SAFE WORK PRACTICES.

WARNING
CHEMICAL HAZARDS

UV CURABLE RESINS MAY CAUSE EYE AND SKIN BURNS. REPEATED OR PROLONGED SKIN CONTACT MAY CAUSE SENSITIZATION. VAPOR MAY BE HARMFUL.

systems, inc. COMPANY CONFIDENTAL

Observe the following safety precautions when cleaning spilled resin or handling resin containers.

- Keep away from heat, sparks and flame. Protect from sunlight and fluorescent light. Closed containers may rupture/explode when exposed to extreme heat. Use National Fire Protection Association Class B extinguishers (carbon dioxide, dry chemical or foam).
- Use only with adequate ventilation. Avoid breathing vapors or spray mist.
- Wear safety glasses.
- Wear chemically resistant gloves and protective clothing. Wash thoroughly after handling and before eating, smoking or using toilet facilities.
- Wear an NIOSH/MSHA approved respirator or ensure adequate ventilation when sanding or cutting cured objects.

FIRST AID FOR CHEMICAL ACCIDENTS

Skin Contact. Wash thoroughly with soap and water. Remove contaminated clothing and shoes immediately. If skin is irritated, get medical attention. Wash clothing before reuse and discard contaminated shoes.

Eye Contact. Flush immediately with large amounts of water for 15 minutes and avoid sunlight, fluorescent light, or other ultraviolet light. Get medical attention.

Inhalation. Remove victim to fresh air. Give artificial respiration or cardio-pulminary resuscitation if required. If breathing is difficult, give oxygen. Get medical attention.

3D systems, inc. COMPANY CONFIDENTAL

TABLE OF CONTENTS

| Section/Paragraph | Title | Page |
|---|---|---|
| | INTRODUCTION . . . . . . . . . . . . . . | vi |
| I | DESCRIPTION AND OPERATION . . . . . . | 1-1 |
| 1.1 | Purpose . . . . . . . . . . . . . . . . | 1-1 |
| 1.2 | Description . . . . . . . . . . . . . . | 1-1 |
| 1.2.1 | Stereolithography Process . . . . . . | 1-1 |
| 1.2.2 | Stereolithography System . . . . . . . | 1-4 |
| 1.2.2.1 | Electronic Cabinet Assembly . . . . . | 1-8 |
| 1.2.2.2 | Optics Assembly . . . . . . . . . . . | 1-8 |
| 1.2.2.3 | Chamber Assembly . . . . . . . . . . . | 1-9 |
| 1.2.3 | Software . . . . . . . . . . . . . . . | 1-10 |
| 1.3 | Performance Specification . . . . . . | 1-12 |
| II | CONTROLS AND INDICATORS . . . . . . . | 2-1 |
| 2.1 | Introduction . . . . . . . . . . . . . | 2-1 |
| 2.2 | Control Panel . . . . . . . . . . . . | 2-1 |
| III | OPERATING INSTRUCTIONS . . . . . . . . | 3-1 |
| 3.1 | Introduction . . . . . . . . . . . . . | 3-1 |
| 3.2 | Materials and Equipment . . . . . . . | 3-1 |
| 3.3 | CAD Design to SLA-1 Parts . . . . . . | 3-2 |
| 3.3.1 | How to Design CAD Parts for SLA-1 . . | 3-2 |
| 3.3.2 | Rules for Design of Parts . . . . . . | 3-2 |
| 3.3.3 | How to Design Support Files for SLA-1 | 3-3 |
| 3.3.4 | Rules for Design of Supports . . . . . | 3-3 |
| 3.4 | Slice Operation . . . . . . . . . . . | 3-3 |
| 3.4.1 | How to Slice Files . . . . . . . . . . | 3-3 |
| 3.4.2 | Rules for Slicing . . . . . . . . . . | 3-4 |
| 3.4.3 | How to Run User Interface . . . . . . | 3-4 |
| 3.5 | SLA-1 Operation . . . . . . . . . . . | 3-7 |
| 3.5.1 | Turn-On Procedure . . . . . . . . . . | 3-7 |
| 3.5.2 | How to Transfer Files form Slice Computer to Process Computer . . . . | 3-7 |
| 3.5.3 | How to Insert Critical Volumes . . . . | 3-8 |
| 3.5.4 | How to Merge Sliced Files . . . . . . | 3-10 |
| 3.5.5 | How to Operate SLA-1 to Build Parts . | 3-10 |
| 3.5.5.1 | Rules for Building SLA-1 Parts . . . . | 3-10 |
| 3.5.5.2 | How to Edit Part Control Files . . . . | 3-11 |
| 3.5.5.3 | How to Prepare Default Parameter Files . | 3-13 |
| 3.5.5.4 | Operator's Checklist Before Starting a Part . . . . . . . . . . | 3-14 |
| 3.5.5.5 | How to Run Supervisor to Make a Part . | 3-16 |

systems, inc. COMPANY CONFIDENTAL

TABLE OF CONTENTS - CONT

| Section/Paragraph | Title | Page |
|---|---|---|
| 3.5.5.6 | Post Processing of SLA-1 Parts | 3-17 |
| 3.5.5.7 | Shutdown Procedures | 3-20 |
| 3.5.5.8 | How to Create and Use Working Curves | 3-20 |
| IV | TROUBLESHOOTING | 4-1 |
| 4.1 | Introduction | 4-1 |
| 4.2 | Troubleshooting Procedures | 4-1 |
| V | OPERATOR MAINTENANCE INSTRUCTIONS | 5-1 |
| 5.1 | Introduction | 5-1 |
| 5.2 | Materials and Equipment | 5-1 |
| 5.3 | Resin Cleaning/Replenishment Procedures | 5-2 |
| 5.3.1 | Cleanup of Small Resin Spills | 5-2 |
| 5.3.2 | Cleanup of Large Resin Spills | 5-3 |
| 5.3.3 | Vat Replenishment | 5-4 |
| 5.4 | Optics Cleaning | 5-4 |
| 5.4.1 | Equipment Required | 5-4 |
| 5.4.2 | Care and Handling of Optics | 5-7 |
| 5.4.3 | Laser Brewster Windows | 5-7 |
| 5.4.4 | Laser Resinator Windows | 5-7 |
| 5.4.5 | 90 Degree Beam-Turning Mirrors | 5-7 |
| 5.4.6 | Beam Expander Lenses | 5-8 |
| 5.4.7 | Galvanometer-Driven Dynamic Mirrors | 5-10 |
| 5.4.8 | Laser Chamber Window | 5-11 |
| 5.5 | Replacement Procedures | 5-13 |
| 5.5.1 | Air Filter Replacement | 5-13 |
| 5.5.2 | Chamber Lamp | 5-13 |
| 5.5.3 | Control Panel Lamps | 5-15 |
| | GLOSSARY | G-1 |

systems, inc. COMPANY CONFIDENTAL

LIST OF FIGURES

| Figure | Title | Page |
|---|---|---|
| 1-1 | Key Steps in the Stereolithography Process . . . . . . . . . . . . . . . . | 1-2 |
| 1-2 | Major Components of the Stereolithography System . . . . . . . . . . . . . . . . | 1-5 |
| 1-3 | Block Diagram of the Stereolithography System . . . . . . . . . . . . . . . . | 1-7 |
| 1-4 | Software Diagram of the Stereolithography System . . . . . . . . . . . . . . . . | 1-11 |
| 2-1 | Control Panel Switches and Indicators | 2-2 |
| 3-1 | Sample Part Log . . . . . . . . . . . . | 3-12 |
| 3-1 | Sample Working Curve . . . . . . . . . . | 3-22 |
| 5-1 | Recommended Optics Cleaning Technique | 5-5 |
| 5-2 | Air Filter Replacement . . . . . . . . . | 5-14 |

LIST OF TABLES

| Figure | Title | Page |
|---|---|---|
| 1-1 | Beta SLA-1 Performance Specifications | 1-12 |
| 4-1 | Troubleshooting Procedures . . . . . . . | 4-2 |
| 5-1 | Maintenance Materials and Equipment . | 5-1 |

3D systems, inc.

COMPANY CONFIDENTAL

INTRODUCTION

SCOPE

This manual contains operation and maintenance procedures and information for the SLA-1 Beta Site Stereolithography System. The maintenance procedures are limited in scope to routine maintenance to be performed by the SLA-1 operator, such as filter replacement. Service and repairs not covered in this manual shall be performed by qualified technicians in accordance with the SLA-1 Service Manual.

ORGANIZATION

This manual is divided into five sections, as follows:

| | |
|---|---|
| SECTION I. | DESCRIPTION AND GENERAL INFORMATION - Physical and functional descriptions of the SLA-1 and a list of performance specifications. |
| SECTION II. | CONTROLS AND INDICATORS - Description of each operator control and indicator. |
| SECTION III. | OPERATING INSTRUCTIONS - Operating procedures and information. |
| SECTION IV. | TROUBLESHOOTING - Diagnostic and correction procedures. |
| SECTION V. | OPERATOR MAINTENANCE INSTRUCTIONS - Procedures for routine maintenance. |

OTHER FEATURES OF INTEREST

Title Page Index. On the right side of the title page you will find a section index. The black markers printed to the right of the text are keyed to similar markers on the first page of each referenced section. To locate a section, flip through the manual until you find a marker printed in the same location as the title page marker.

systems, inc.

COMPANY CONFIDENTAL

Warning Pages. Following the title page you will find a summary of critical warnings. You may be seriously injured if these warnings are not explicitly followed. Carefully read all warnings and first aid instructions prior to operation or maintenance of the SLA-1.

REPORTING ERRORS AND RECOMMENDING IMPROVEMENTS

This manual was prepared for use by Beta Site users and maintenance personnel. It will be revised to incorporate recommended content and format changes. If you find any mistakes or if you have any recommendations for improving the procedures, please let us know by sending a copy of the marked-up page(s) to:

Attn: Chick Lewis
3D Systems Inc.
12847 Arroyo St.
Sylmar, California 91342
(818) 898-1533 • FAX (818) 361-5484

SECTION I
DESCRIPTION AND GENERAL INFORMATION

1.1 PURPOSE

The SLA-1 Stereolithography System produces three-dimensional parts directly from a CAD system. The formed objects, up to nine inches in any dimension, are made of photocurable plastic. They can be used in a wide variety of applications, including:

- Industrial Engineering
- Design Engineering
- Architectural Design
- Medical
- Scientific

1.2 DESCRIPTION 1.2.1 Stereolithography Process. Stereolithography is a three-dimensional printing process which uses a moving laser beam to build parts by solidifying successive layers of liquid plastic. This method enables a designer to create a design on a CAD system and build an accurate plastic model in a few hours. The stereolithographic process is composed of the following eight steps, as shown in Figure 1-1.

- Design solid model
- Prepare model for stereolithography
- Section model into triangles and reduce data for transmission
- Transmit data file to SLA-1 slice computer
- Slice triangle files horizontally
- Calculate vectors and add hatch and fill
- Form object
- Post processing

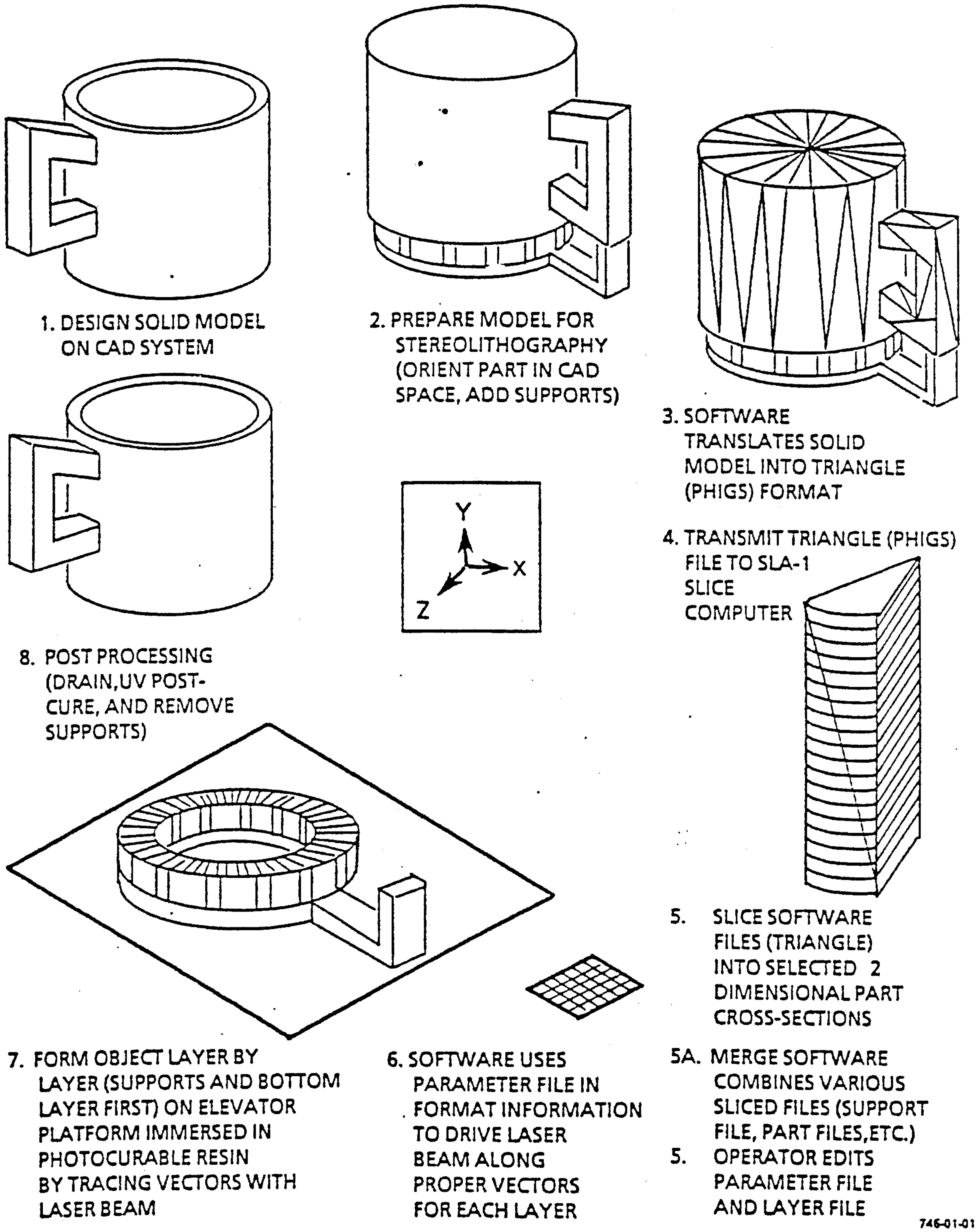
*Figure 1-1. Key Steps in the Stereolithography Process*

1. The solid model is designed in the normal way on the CAD system, without specific reference to the stereolithographic process. A copy of the model is made for stereolithographic processing.

2. Model preparation for stereolithography involves selecting the optimum orientation, adding supports, and selecting SLA-1 operating parameters. The optimum orientation will (1) enable the object to drain, (2) have the least number of unsupported surfaces, (3) optimize important surfaces, and (4) enable the object to fit in the resin vat. Supports must be added to secure unattached sections and for other purposes; a CAD library of supports can be prepared for this purpose. SLA-1 operating parameters include selection of the model scale and layer (slice) thickness.

3. The surface of the solid model is then divided into triangles. A triangle is the least complex polygon for vector calculations. The Beta SLA-1 capability is approaching 200,000 triangles, with further improvements planned for the production SLA-1. The more triangles formed, the better the surface resolution and hence the more accurate the formed object with repect to the CAD design.

4. Data points representing the triangle coordinates are then transmitted to the SLA-1 via Ethernet communication. The SLA-1 software slices the triangular sections horizontally (X-Y plane) at the selected layer thickness.

5. The SLA-1 next calculates the section boundary, hatch, and horizontal surface (skin) vectors. Hatch vectors consist of cross-hatching between the boundary vectors. Several styles are available. Skin vectors, which are traced at high speed and with a large overlap, form the outside horizontal surfaces of the object. Interior horizontal areas, those within top and bottom skins, are not filled in other than by cross-hatch vectors.

6. The SLA-1 forms the object one horizontal layer at a time by moving the ultraviolet beam of a helium-cadmium laser across the surface of a photocurable resin and solidifying the liquid where it strikes. Absorption in the resin prevents the laser light from penetrating deeply and allows a thin layer to be formed. Each layer is comprised of vectors which are drawn in the following order: border, hatch, and surface.

7. The first layer that is drawn adheres to a horizontal platform located just below the liquid surface. This platform is attached to an elevator which then lowers it vertically under computer control. After drawing a layer, the platform dips several millimeters into the liquid to coat the previous cured layer with fresh liquid, then rises up a smaller distance leaving a thin film of liquid from which the second layer will be formed. After a pause to allow the liquid surface to flatten out, the next layer is drawn. Since the resin has adhesive properties, the second layer becomes firmly attached to the first. This process is repeated until all the layers have been drawn and the entire three-dimensional object is formed. Normally, the bottom 0.25 inch or so of the object is a support structure on which the desired part is built. Resin that has not been exposed to light remains in the vat to be used for the next part. There is very little waste of material.

8. Post processing involves heating the formed object to remove excess resin, ultraviolet or heat curing to complete polymerization, and removing supports. Additional processing, including sanding and assembly into working models, may also be performed.

1.2.2 Stereolithography System. The SLA-1 is a self-contained system that interfaces directly with the user's CAD system. The SLA-1, as shown in Figure 1-2, consists of four major component groups: the slice computer terminal, the electronic cabinet assembly, the optics assembly, and the chamber assembly. A block diagram of the SLA-1 is shown in Figure 1-3.

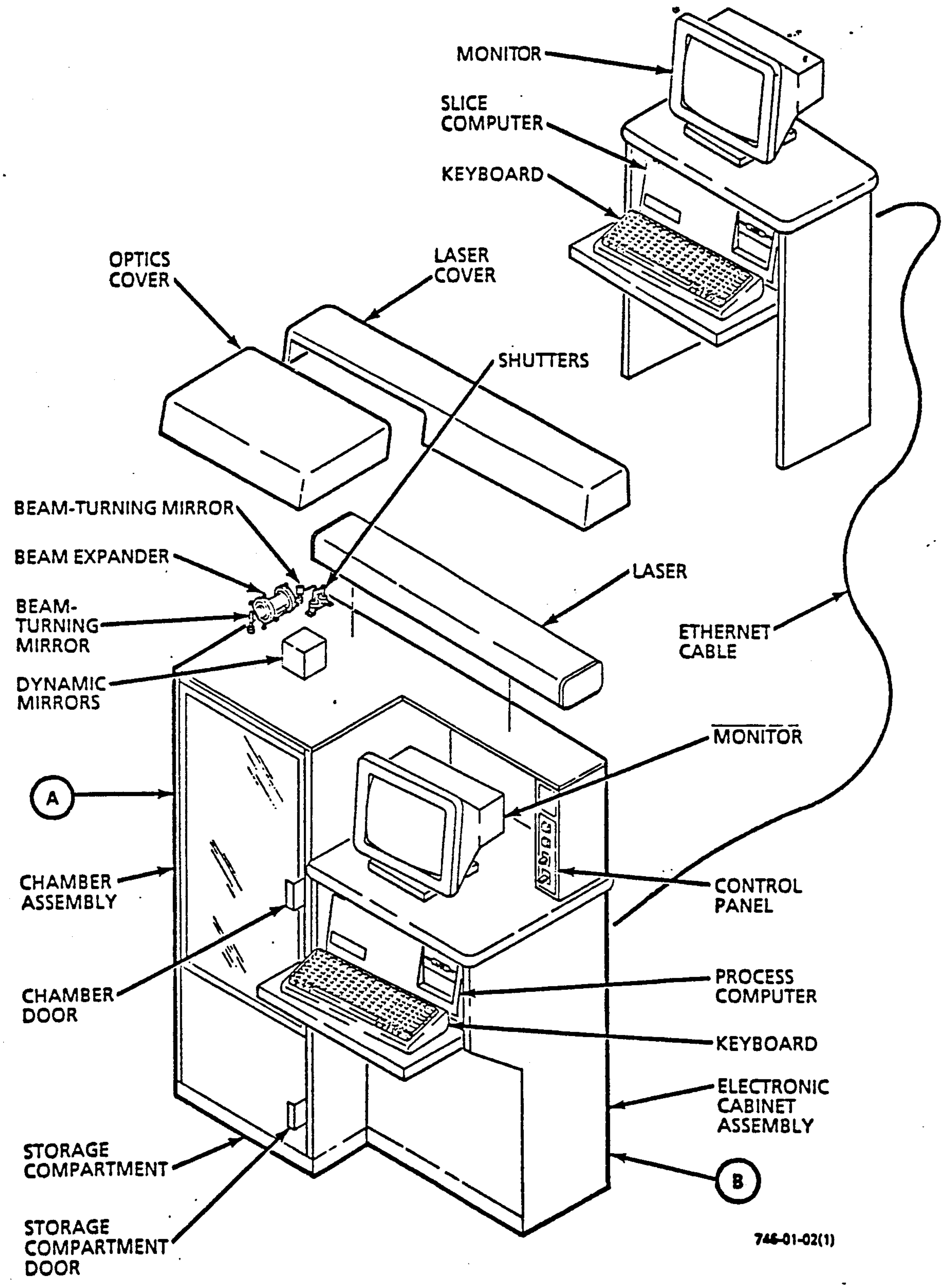
*Figure 1-2. Major Components of the Stereolithography System (Sheet 1 of 2)*

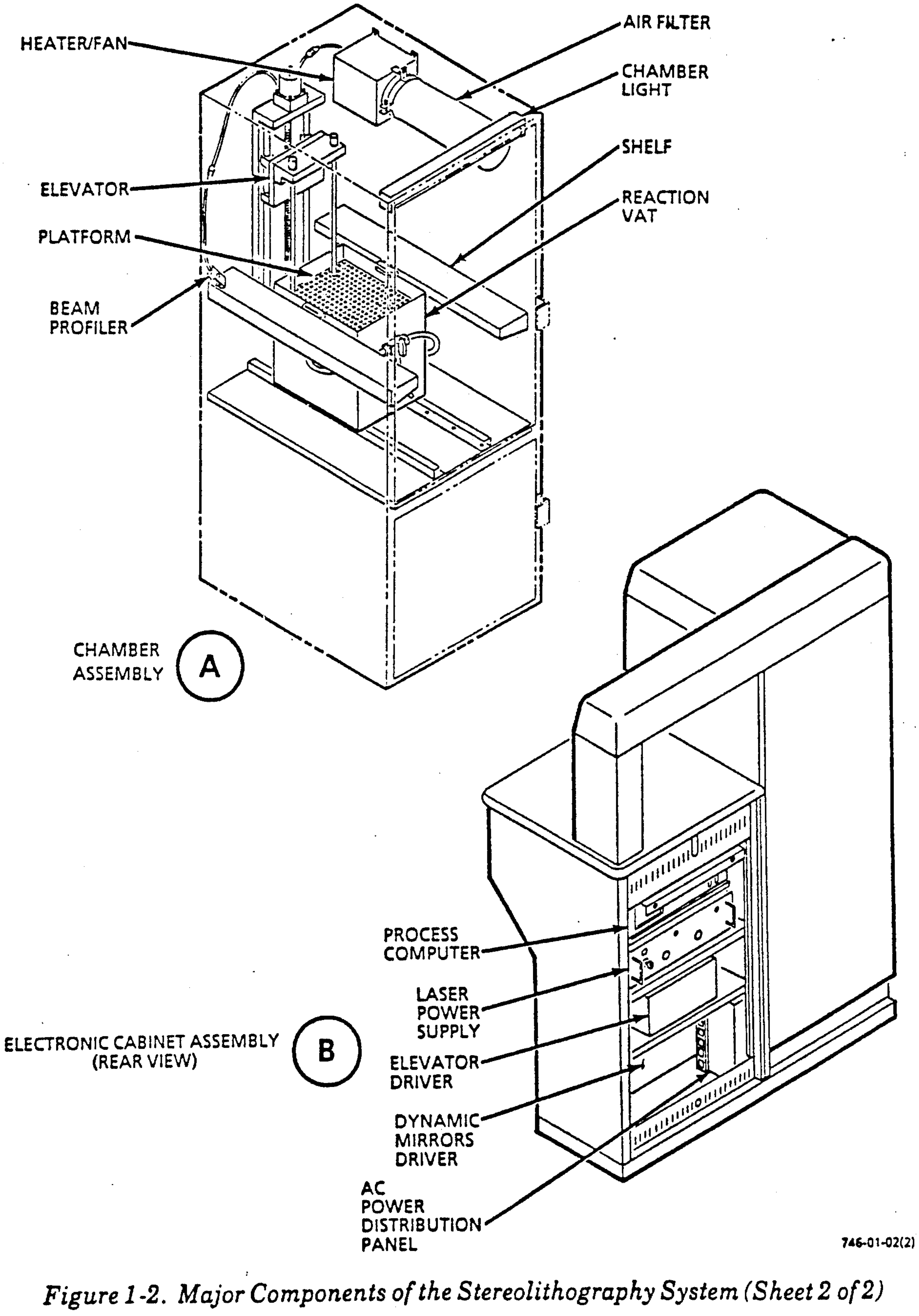
*Figure 1-2. Major Components of the Stereolithography System (Sheet 2 of 2)*

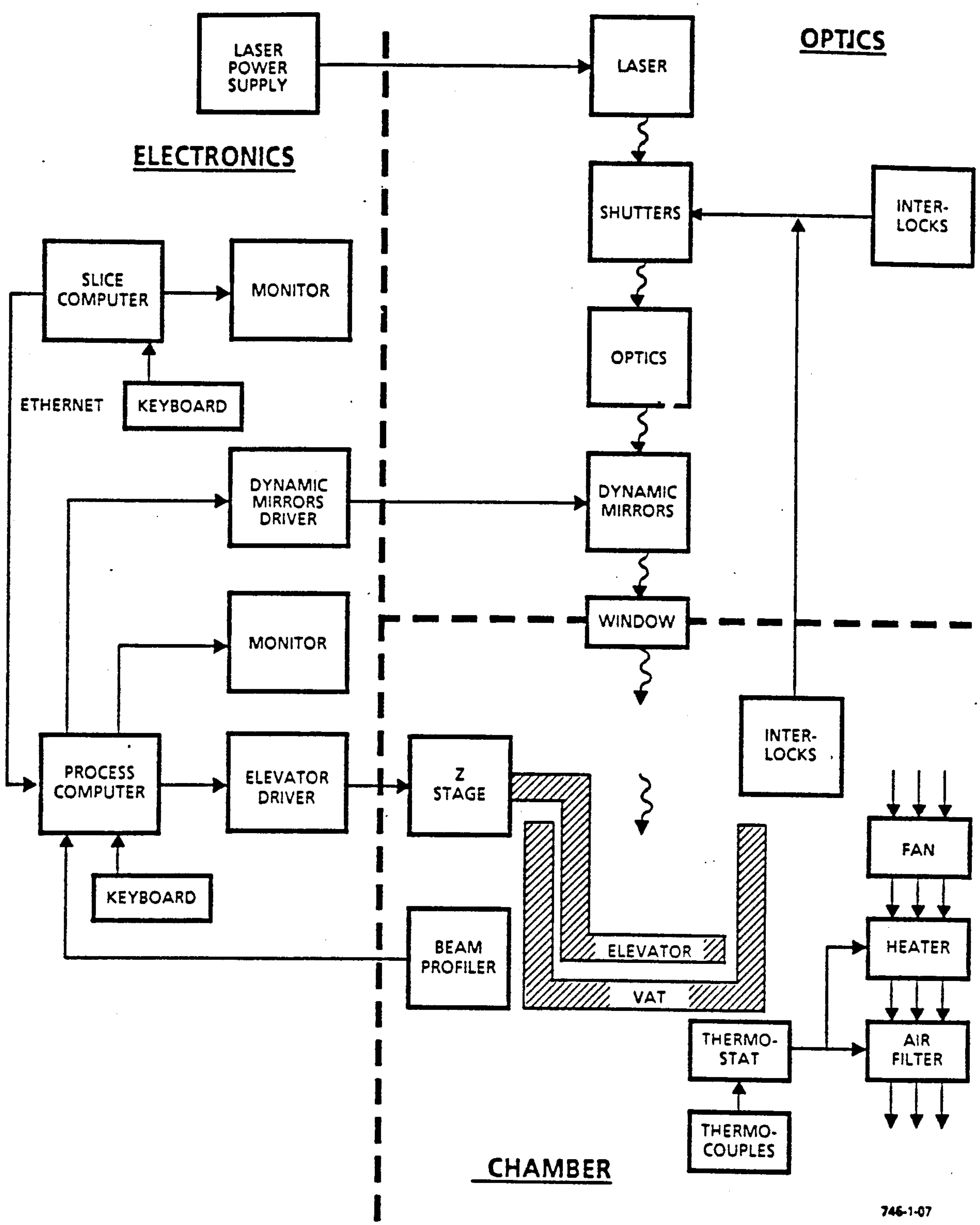
*Figure 1-3. Block Diagram of the Stereolithography System*

1.2.2.1 Electronic Cabinet Assembly. The electronic cabinet assembly includes the process computer (disc drive), keyboard, monitor, power supplies, ac power distribution panel, and control panel. The computer assembly includes plug-in circuit boards for control of the terminal, high-speed scanner mirrors, and vertical (Z-stage) elevator. Power supplies for the laser, dynamic mirrors, and elevator motor are mounted in the lower portion of the cabinet.

The control panel includes a power on switch/indicator, a chamber light switch/indicator, a laser on indicator, and a shutter open indicator.

Operation and maintenance parameters, including fault diagnostics and laser performance information, are displayed on the monitor. Operation is controlled by keyboard entries. Work surfaces around the key-board and disc drive are covered with formica for easy cleaning and long wear.

1.2.2.2 Optics Assembly. The helium cadmium (HeCd) laser and optical components are mounted on top of the electronic cabinet and chamber assembly. The laser and optics plate may be accessed for service by removing separate covers. For safety reasons, a special tool is required to unlock the cover fasteners and interlock switches are activated when the covers are removed. The interlocks activate a solenoid-controlled shutter to block the laser beam when either cover is removed.

An optics cleaning kit and interlock shorting tool are located under the optics cover. The cleaning kit includes cotton swabs, special cleaning tissues, and materials for cleaning the beam-turning mirrors and beam expander lenses. The interlock shorting tool is used to defeat the interlocks during servicing. This is necessary to enable optics alignment and servicing procedures which require operation of the laser with the optics and laser covers removed.

The shutter assembly, two 90° beam-turning mirrors, beam expander, scanning mirror assembly, and optical window are mounted on the optics plate. The rotary solenoid-actuated shutters are installed at the laser output and rotate to block the beam when a safety interlock is opened. The 90° beam-turning mirrors reflect the laser beam to the next optical component. The beam expander enlarges and focuses the laser beam on the liquid surface. The high speed scanning mirrors direct the laser beam to trace vectors on the resin surface. A quartz window between the optics enclosure and reaction chamber allows the laser beam to pass into the reaction chamber, but otherwise isolates the two regions.

1.2.2.3 Chamber Assembly. The chamber assembly contains an environmentally-controlled chamber, which houses a platform, reaction vat, elevator, and beam profiler.

The chamber in which the object is formed is designed for operator safety and to ensure uniform operating conditions. The chamber may be heated to approximately 40°C (104°F) and the air is circulated and filtered. An overhead light illuminates the reaction vat and work surfaces. An interlock on the glass access door activates a shutter to block the laser beam when opened.

The reaction vat is designed to minimize handling of the resin. It is installed in the chamber on guides which align it with the elevator and platform.

The part is formed on a platform attached to the vertical axis elevator, or Z-stage. The platform is immersed in the resin vat and is adjusted incrementally downward while the object is being formed. To remove the formed part, it is raised to a position above the vat. The platform is then disconnected from the elevator and removed from the chamber for post processing. Handling trays are provided to catch dripping resin.

The beam profiler is mounted to one side of the reaction vat at the focal length of the laser. The scanning mirror is periodically commanded to direct the laser beam onto the beam profiler, which measures the beam intensity profile. The data may be displayed on the terminal either as a profile with intensity contour lines or as a single number representing the overall (integrated) beam intensity. This information is used to determine whether the mirrors should be cleaned and aligned, whether the laser should be serviced, and what parameter values will yield vectors of the desired thickness and width.

1.2.3 Software. A software diagram of the SLA-1 is shown in Figure 1-4. There are three computers needed to control the stereolithographic apparatus, a CAD system, a slice computer, and a process computer. Any CAD system can be used to design a part in three-dimensional space. This is identified as the object file. In order to generate the part, supports must be added to prevent distortion. This is accomplished by adding the necessary supports to the CAD part design and creating a CAD support file. The resultant two or more CAD generated files are then physically inserted into the slice computer through Ethernet.

The stereolithography apparatus builds the part one layer at a time starting with the bottom layer. The slice computer breaks down the CAD part into individual horizontal slices. The slice computer also calculates where hatch vectors will be created. This is done to achieve maximum strength as each layer is constructed. The slice computer at the Beta Sites is a separate computer with its own keyboard and monitor. It is anticipated that in production models, the slice computer will be in the SLA-1 electronic cabinet and will share a common keyboard and monitor with the process computer. The operator can vary the thickness of each slice and change other parameters of each slice with the User Interface program. The slice computer uses the Xenix machine language and is connected to the SLA-1 process computer by an Ethernet data bus.

The sliced files are then transferred to the process computer through Ethernet. The process computer merges the sliced object and support files into a layer control file and a vector file. The operator then inserts the necessary controls needed to drive the stereolithography apparatus in the layer and parameter file. (The vector file is not usually edited.) The operator can strengthen a particular volume of the part by inserting rivets. This is accomplished by inserting the necessary parameters to the critical volume file prior to merging of the sliced files. The merge program integrates the object, support, and critical volume files and inserts the resultant data in the layer control file. The operator can edit the layer control file and change the default parameter file. The default parameter file contains the controls needed to operate the stereolithography apparatus to build the part. The process computer uses the MSDOS machine language and is directly connected to he stereolithography apparatus.

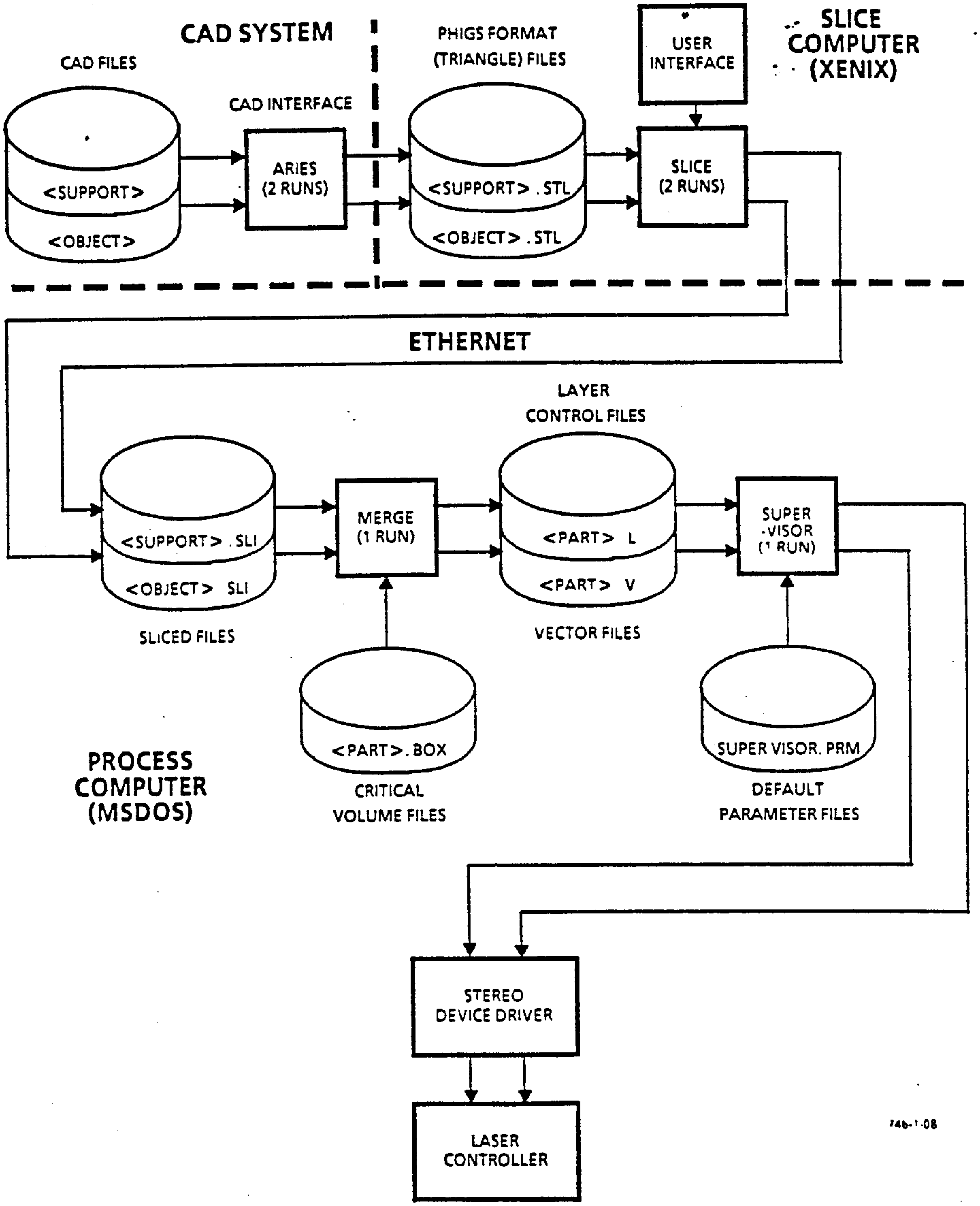
*Figure 1-4. Software Diagram of Stereolithography System*

1.3 PERFORMANCE SPECIFICATIONS

Beta SLA-1 performance specifications are listed in Table 1-1 for quick reference.

*Table 1-1. Beta SLA-1 Performance Specifications*

| Characteristic | Specification |
|---|---|
| Input Power | |
| Voltage and Frequency | 115 Vac, 60 Hz |
| Current Drain | 15 amperes |
| Functional Characteristics | |
| Laser Source | |
| Type | Helium Cadmium |
| Nominal Power | 10 mW at 325 nm |
| Warmup Time (to 90 percent power) | 15 minutes |
| Expected Tube Lifetime | 4000 hours (with 1000 hour service intervals) |
| Dielectric Beam-Turning Mirrors | |
| Nominal Reflectivity | >99 percent at 325 nm |
| Incident Angle Range | 0 to 45 degrees |
| Beam Expander | |
| Expansion Coefficient | 4 |
| Adjustable Axes | Y,Z (pitch and yaw) |
| Scanning Mirror | |
| Speed | |
| Minimum | 0.001 inch/sec (0.025 mm/sec) |
| Maximum | 20 inches/sec (51 cm/sec) |
| Drawing Area | |
| Width (X-axis) | 9 inches (23 cm) |
| Length (Y-axis) | 9 inches (23 cm) |
| Elevator (Z-stage) | |
| Maximum Travel | 14 inches (36 cm) |
| Minimum Step Size | 0.001 inch (0.025 mm) |
| Load Capacity | 110 lbs (___ kg) |
| CAD Interface | Ethernet |
| Resin Characteristics | |
| Appearance and Odor | Clear amber liquid, mild odor |
| Vapor Density | Heavier than air |
| Specific Gravity ($H_2O$=1) | 1.18 |
| Flash Point | >200°F (93°C) |
| Extinguishing Media | National Fire Protection Association Class B Extinguishers (carbon dioxide, dry chemical or foam) |
| Storage Temperature | +60°F to +80°F (+15°C to +26°C) |

*Table 1-1. Beta SLA-1 Performance Specifications - CONT*

| Characteristic | Specification |
|---|---|
| Physical Characteristics | |
| SLA-1 | |
| Dimensions (maximum) | |
| Height | 64 inches (163 cm) |
| Width | 49 inches (124 cm) |
| Depth | 27.5 inches (70 cm) |
| Shipping Weight | 600 lbs (___ kg) |
| Resin Vat | |
| Dimensions | |
| Height | 10 inches (25 cm) |
| Width | 9 inches (23 cm) |
| Depth | 9 inches (23 cm) |
| Operating Conditions | |
| Temperature | 50°F to 104°F (10°C to 40°C) |
| Relative Humidity | 0 to 90 percent |

SECTION II
CONTROLS AND INDICATORS

2.1 INTRODUCTION

This section describes the function of each SLA-1 operating control and indicator.

2.2 CONTROL PANEL

Control panel switches and status indicators are illustrated and described in Figure 2-1.

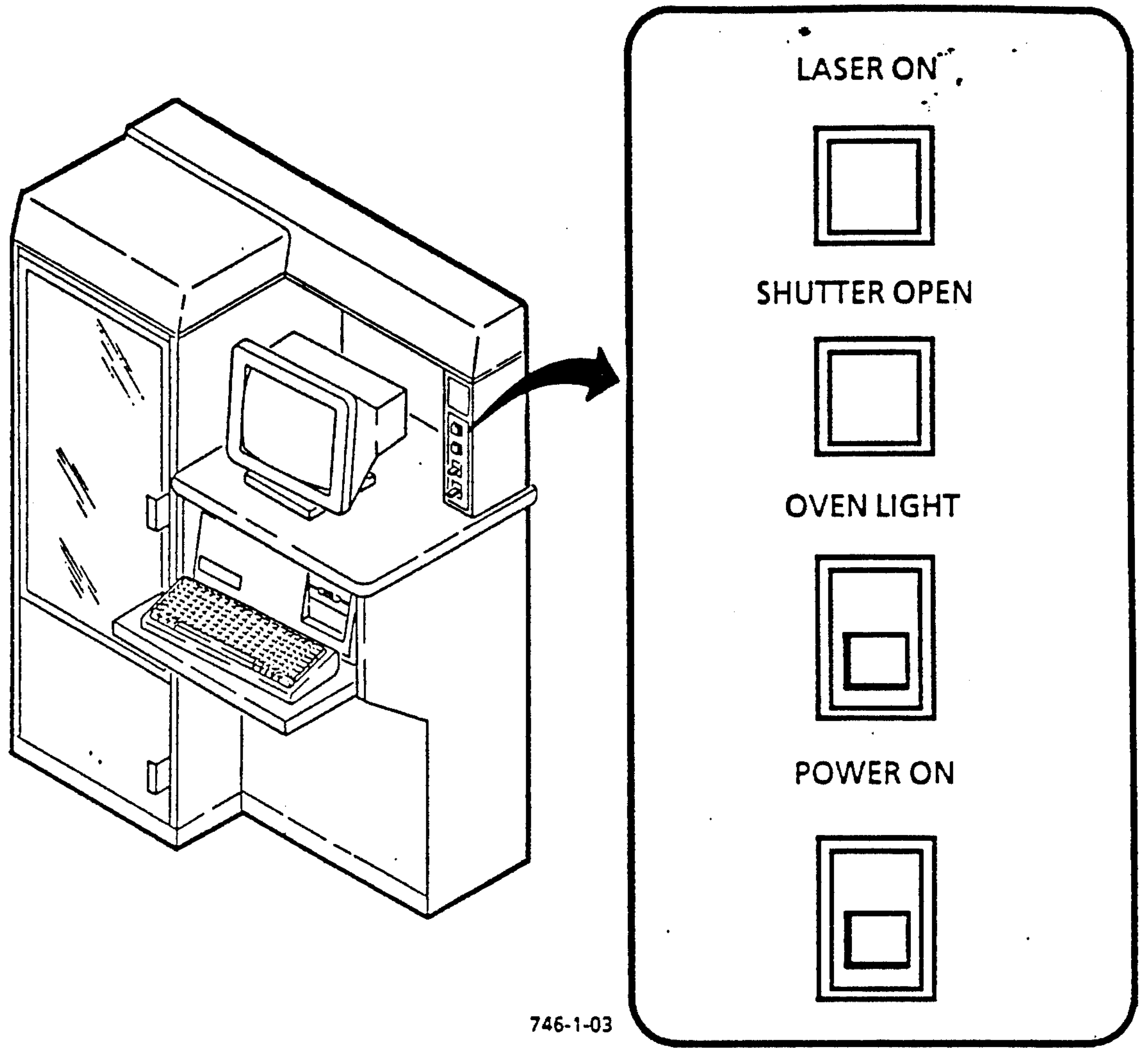

| Nomenclature | Function |
|---|---|
| LASER ON indicator | Blue lamp indicates that the laser is operating when illuminated. |
| SHUTTER OPEN indicator | Green lamp indicates that the laser shutter is open when illuminated. |
| OVEN LIGHT toggle switch/indicator | Turns the overhead reaction chamber light on and off. |
| POWER ON toggle switch/indicator | Controls primary power application to the laser, power supplies, reaction chamber, filter/heater, and process computer. |

*Figure 2-1. Control Panel Switches and Indicators*

SECTION III
OPERATING INSTRUCTIONS

3.1 INTRODUCTION

This section contains complete operating instructions for design and construction of model parts. Included are instructions for design of parts and supports on the CAD system, slicing of parts on the slice computer, and operation and control of the SLA-1 system to build parts. Also included are instructions for file transfer, insertion of critical volumes, merging of sliced files, editing of part control files, preparing default parameter files, running supervisor to build parts, post processing of parts, and use of working curves.

3.2 MATERIALS AND EQUIPMENT

Materials and equipment that would enhance the operation of the SLA-1 system are listed in Table 3-1. Equivalent items may be used.

Table 3-1. Operation Materials and Equipment

| Nomenclature | Model/Part No. | Use |
|---|---|---|
| Printer, Computer | | Print out computer data permanent record file. |
| Microscope | | Make working curve measurements. |
| Oven, Heat | | Post cure green parts. |
| Oven, UV Flood | | Post cure green parts. |

3.3 CAD DESIGN FOR SLA-1 PARTS 3.3.1 How to Design CAD Parts for SLA-1. A part must initially be designed on a CAD system before it can be built on the SLA-1 system. This manual assumes that the operator knows how to design parts using a CAD system. In order to make the CAD design compatible with the SLA-1 system, the operator usually prepares two or more files on the CAD system; object files and support files. The object file is simply the CAD part. The support file is needed to add supporting structures to enable the part to keep its shape during construction on the SLA-1 system.

3.3.2 Rules for Design of Parts. In order to prepare the CAD design for the SLA-1 system, the operator should modify the CAD object file as follows:

a. Wall thicknesses should ideally be 0.020 to 0.150 inch.

b. Rotate CAD parts into an orientation which will:

1. Minimize trapped volumes as the part builds.

2. Take advantage of nice up-facing skin surfaces.

3. Minimize visibility of down-facing skin surfaces.

4. Make support design easy and optimum.

5. Make parts stable and strong as they are created.

c. Design parts so that horizontal gaps and holes are larger than desired by one laser linewidth.

d. All solid parts must completely enclose a volume. Single surfaces will confuse the crosshatch algorithms.

3.3.3 How to Design Support Files for SLA-1. Supporting structures consist of bases, posts, and webs which are needed to properly support the part and prevent the part from being distorted during construction on the SLA-1 system. The supports should be designed on the CAD system in a separate support file.

3.3.4 Rules for Design of Supports. The operator should create the CAD support file as follows:

a. Design a structure at the bottom of the CAD part which will rest on the elevator panel. This platform must have several horizontal legs which are at least 0.65 inch long (more than twice the diameter of the 1/4 inch holes in the platform).

b. Design supports to intersect every outside corner of a part, as these are major stress areas.

c. Arrange supports so that every unsupported down-facing border falls on a previously created support.

d. Space supports at a minimum distance apart for best stress resistance.

e. Design supports to have at least two layers of vertical overlap into the part for a strong attachment.

3.4 SLICE OPERATION 3.4.1 How to Slice Files. The slice computer (Wyse PC 386) automatically breaks down the object and support files into individual slices under user control. The user must choose the thickness of each slice and determine the shape and method of cross-hatching.

3.4.2 Rules for Slicing. The operator should slice the CAD object and support files as follows:

a. Up-facing skin surfaces should only be in one dimension (X or Y) and should have a 0.002 inch offset (high overlap). Exposure must be low.

b. Cross hatch should usually be as nearly perpendicular to part border as possible. Cross hatches parallel to part borders increase production time and may increase stress.

c. Slice support files without creating skin.

3.4.3 How to Run User Interface. This procedure shows how to operate the slice computer to use the User Interface program to insert slice parameters and run the Slice program. This procedure assumes that the CAD file has been installed in the slice computer. An asterisk (*) in front of a step indicates that this is an optional step that only needs to be performed if a common keyboard is being used to operate the slice computer and process computer.

a. Press ENTER - MAIN MENU is displayed.

*b. Select Data Transfer (Slice) and press ENTER - Data Transfer menu is displayed.

*c. Select TELNET, Terminal Utility and press ENTER.

d. In response to $ prompt, type UI (user interface) and press ENTER - SLICE USER INTERFACE Menu is displayed.

e. Select option 1 (DATABASE File Name).

f. In response to Enter Data File Name: prompt, type data file name followed by .stl (example - test.stl) and press ENTER.

g. In response to Type File Binary or ASCII (B,A): prompt, type b (binary) or a (ASCII) as applicable and press ENTER.

h. Select option 2 (Scale).

i. In response to Enter Scale Value: prompt, type (scale value per CAD dimension unit) and press ENTER. (If 1000 is selected, 1000.000 is inserted in the Value column, which is 1/1000 of one CAD dimension unit.) (Example - for a part CAD designed in inches, a scale of 1000 makes each slice scale unit 1 mil.)

j. Select option 3 (Z Spacing).

k. In response to Enter Fixed or Variable Spacing (F, V, or Q) value: prompt, type F (fixed) and press ENTER. Then type thickness in slice scale units (from option 2) (example - 20) and press ENTER. (To select variable thicknesses, refer to software manual.)

l. Select option 4 (X hatch spacing).

m. In response to Enter Hatch Spacing (hx) value: prompt, type X hatch spacing in slice scale units (example - 200 (5 hatches/inch)) and press ENTER.

NOTE

> Do not use option 5 (Y hatch spacing) if option 6 (60/120 degree hatch spacing) is to be used.

n. Select option 5 (Y hatch spacing).

o. In response to Enter Hatch Spacing (hy) value: prompt, type Y hatch spacing in slice scale units (example - 200) and press ENTER.

p. Select option 6 (60/120 degree hatch spacing).

q. In response to Enter Hatch Spacing (60/120) value: prompt, type 60/120 hatch spacing in slice scale units (example - 20) and press ENTER.

r. Select option 7 (X Skin fill for near flat surfaces).

s. In response to Enter Skin fill for near flat surfaces (hfx) value: prompt, type X skin fill offset in slice scale units (example - 2) and press ENTER.

t. SELECT option 8 (Y Skin fill for near flat surfaces).

NOTE

If X skin fill is used, Y should not be used, and vice versa.

u In response to Enter Skin fill for near flat surfaces (hfy) value: prompt, type Y skin fill in mils (example - 2) and press ENTER.

v. Select option 9 (minimum Surface Angle for scanned facets).

w. In response to Enter a Minimum Surface Angle prompt, type desired angle in degrees from vertical (example - 60) and press ENTER.

x. Select option 10 (Minimum Hatch Intersect Angle).

y. In response to Enter a Minimum Intersect Angle value: prompt, type intersect angle in degrees (example - 20) and press ENTER.

z. Select option 11 (Segment Output File Name).

aa. In response to Enter Segment File Name: prompt, type desired output file name followed by .sli (slice) (example - test.sli) and press ENTER.

ab. After all slice parameters have been selected, select s (Save) and press ENTER. (This will save the parameters for future use and reference.)

ac. In response to "Press (Enter) to Continue" prompt, press ENTER. Then select d (DoSlice) and press ENTER.

ad. In response to Slice Version to use (Default XY)? prompt, press ENTER. (The program now slices the files using the inserted slice parameters.)

ae. After slicing is completed, DATA TRANSFER MENU is displayed.

af. Press Q (Quit) and ENTER. (The sliced files are now ready to be transferred to the process computer.)

3.5 SLA-1 OPERATION

3.5.1 Turn-On Procedure.

a. Set POWER ON switch to on (up). Verify that POWER ON indicator illuminates.

b. Set OVEN LIGHT switch to on (up). Verify that OVEN LIGHT indicator illuminates and that overhead light in reaction chamber illuminates.

NOTE

The SHUTTER OPEN and LASER ON indicators will illuminate during operation. The SHUTTER OPEN indicator will illuminate when the laser shutter is open and the LASER ON indicator will illuminate when the laser is operating.

c. The MAIN MENU will be displayed on the monitor as the process computer boots up. Select "Power on sequence" and press ENTER.

d. The POWER SEQUENCE menu will be displayed. Sequentially press function keys 1, 2, and 3 to power up the laser, mirror, and elevator drivers, and to open the laser shutters.

e. Wait at least 15 minutes for the laser to stabilize in power before beginning to create a part. Other functions (file preparation, data transfer, etc.) can be performed during laser warm-up.

3.5.2 How to Transfer Files from Slice Computer to Process Computer. This procedure shows how to transfer the sliced object and support files from the slice computer to the process computer (Wyse PC 286) in the SLA-1.

a. Press ENTER - MAIN MENU is displayed.

b. Select option 1 (Data Transfer).

c. In response to (data transfer) prompt, type 2 (FTP) (file transfer program) and press ENTER.

d. In response to (ftp) prompt, type OPEN and press ENTER.

e. In response to (to) prompt, type address of slice computer and press ENTER.

f. In response to Remote user prompt, type the name of your directory and press ENTER.

g. In response to Password prompt, type your password and press ENTER.

h. In response to (ftp) prompt, type GET and press ENTER.

i. In response to (remote-file) prompt, type name of desired file usually followed by .sli (example - test.sli) and press ENTER.

j. In response to (local-file test.sli is default) prompt, press ENTER (unless you want to change name). (The FTP routine will now transfer the file to the process computer. It will prompt when the transfer is complete.)

k. To exit from FTP, in response to ftp) prompt, type BYE and press ENTER. (The sliced files have now been transferred to the SLA-1 process computer.)

l. MAIN MENU is displayed after transfer is completed.

3.5.3 How to Insert Critical Volumes. This procedure shows how to set up critical volumes. These critical volumes can be used to insert rivets, which are multiple passes of the laser beam over crosshatch vectors to increase strength, or for other special treatment (This procedure can be skipped if the CAD part contains no critical volumes.)

a. On CAD computer, call up CAD display of the part.

b. Identify X, Y, and Z coordinates in CAD space for the four bottom corners of the rectangular solid (critical volume).

c. On process computer, select option 5 (Edit System Files) and press ENTER.

d. Select option to create a new file - Turbo Basic is displayed.

e. Use arrow keys to select Write to and press ENTER.

f. In response to New Name prompt, enter name of critical volume followed by .box (example - test.box) and press ENTER.

g. Use arrow keys to select Edit and press ENTER.

h. In response to C: Test .Box enter: prompt, insert the following:

<type>, <base>, <height>, <x1>, <y1>, <x2>, <y2>, <x3>, <y3>, <x4>, <y4> (Be sure to insert commas between each item. Proper syntax is critical.)

where:

<type> is "XV" to rivet cross-hatches in the enclosed area or "XI" to ignore cross-hatches <base> is the base of the box relative to the slice scale
<height> is the height of the box
<x1, y1> is the first coordinate of the box
<x2, y2> is the second coordiante
<x3, y3> is the third coordinate
<x4, y4> is the fourth coordinate i. Press Esc (escape) key.

j. Use arrow key to select File and press ENTER.

k. Use arrow key to select Save and press ENTER.

l. Use arrow key to select Quit and press ENTER. (The new <part> .box file has now been created to identify a critical volume.)

3.3.4 How to Merge Sliced Files. This procedure shows how to combine (merge) the object and support files into vector and layer control files.

a. Press ENTER - MAIN MENU is displayed.

b. Select option 2 (MERGE) and press ENTER.

c. In response to Slice File Names prompt, type names of files to be merged (include .SLI as part of the names) and press ENTER. (Be sure to include critical volume file, if applicable.)

d. In response to Output File Name prompt, type desired name of output file and press ENTER. (No ".XXX" ending is necessary.)

e. Press ENTER and wait for process computer to merge files (one slice at a time). (The program will prompt when it has completed the merge.)

3.5.5 How to Operate SLA-1 to Build Parts. These procedures show how to use the process computer to actually build a part in the reaction vat. Included are procedures for setting up the reaction vat, modifying the merged vector and control files, preparing the default parameter files, and running the part making (supervisor) program.

3.5.5.1. Rules for Building SLA-1 Parts. In order to prepare the SLA-1 to build a part, the operator must perform the operator's checklist, edit the layer control (.L) file (SUPER .PRM), prepare the default parameter files, and run the supervisor programs as follows:

a. Set speed of first support layer three times slower than normal layer drawing speed. This overcures first layer to enable it to adhere firmly to elevator platform.

b. Set dip speeds low to avoid undue stresses to part in progress.

c. Use longer dip delays for:

1. Fragile layers.

2. Lowest layers of supports near platform.

3. After layers with large area skins.

4. In areas with large trapped volumes of resin.

5. For shallow dip depths (thin layer thicknesses).

d. Use single passes and choose exposure speeds from working curves which provide a 0.006 to 0.008 inch overcure into previously created layers.

e. Record important parameters and comments in a Part Log (example in figure 3-1). (The user is encouraged to create his own custom Part Log to his special requirements.) If a printer is available, print out important parameters for a permanent record.

3.5.5.2 How to Prepare Default Parameter Files. This procedure shows how to prepare the default parameter (.PRM) files to control the part building access:

a. Press ENTER - MAIN MENU is displayed.

b. Select option 5 (Edit System Files) and press ENTER.

c. In response to Load File Name prompt, enter file names (insert SUPER.PRM only) and press ENTER.

d. Move arrow to Edit block and press ENTER. Values can now be inserted in default parameter (SUPER.PRM) files. (Refer to software manual for definitions of codes.)

SAMPLE PART LOG

| Part No. | Date | Matl. | Temp. | Pgm Name | Relat Speed | Layer Thick | Laser Power | Expnd Setng | Line Width | Comments |
|---|---|---|---|---|---|---|---|---|---|---|
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |
| | | | | | | | | | | |

*Figure 3-1. Sample Part Log* e. To quit editing files:

1. Press Esc key.

2. Use arrow key to select File and press ENTER.

3. Use arrow key to select Save and press ENTER.

4. Press Q key - MAIN MENU is displayed.

3.5.5.3 How to Edit Layer Control Files. This procedure shows how to modify the layer (.L) files to fine tune the part building process:

a. Press ENTER - MAIN MENU is displayed.

b. Select option 5 (Edit System Files) and press ENTER.

c. In response to Load File Name prompt, enter file names (insert .L files only; .V files are not usually edited) and press ENTER.

d. Move arrow to Edit block and press ENTER. Values can now be changed on layer (.L) files. (Refer to software manual for definition of codes.)

e. To quit editing files:

1. Press Esc key.

2. Use arrow key to select File and press ENTER.

3. Use arrow key to select Save and press ENTER.

4. Press Q key - MAIN MENU is displayed.

3.5.5.4 Operator's Checklist Before Starting a Part. This procedure shows how to set up the reaction vat, laser, and elevator, and how to monitor the part during construction.

a. Is correct resin in the vat? If not, insert proper resin in vat:

1. Open chamber door.

2. Drain out resin.

3. Clean vat thoroughtly.

4. Fill vat with correct resin.

5. Close chamber door.

6. Wait 1/2 hour for resin level to stabilize.

b. Is resin level adequate? If not, add resin in vat:

1. Open vat door.

2. Add resin as required.

3. Close vat door.

4. Wait 1/2 hour for resin level to stabilize.

c. Is elevator level correct? If not, set level as follows:

1. On process computer, press ENTER - main menu is displayed.

2. Select Utilities menu and press ENTER.

3. Select Z-Stage Mover and press ENTER.

4. To move elevator up, press ↑ (up) arrow and press any key to stop movement.

5. To move elevator down, press ↓ (down) arrow and press any key to stop movement.

CAUTION

Do not allow elevator to hit top bracket or side of vat. Mechanical damage can result.

6. Toggle up ↑ arrow until liquid resin level is just below holes in the elevator platform.

7. Toggle ↓ arrow until liquid resin is level with holes (dimples in surface visible).

d. (Optional) Is laser power properly adjusted? Check laser power as follows:

1. On process computer, press ENTER - main menu is displayed.

2. Select Utilities menu and press ENTER.

3. Select Beam/Profiler option and press ENTER.

4. The prompt Compute the Beam Profile and Measure its Intensity will be displayed while the laser is being focused on the beam profiler in the chamber.

5. The prompt Display Power will be displayed when the laser beam power has been computed and the laser is returned to its normal position.

e. Are all necessary files in the active directory? Check directory for correctly named vector, layer, and default parameter files as follows:

1. Type DIR, space, part name, and .*, and press ENTER to display vector (.V) and layer (.L) files.

2. Type DIR, space, *.prm, and press ENTER to display default parameter (.PRM) files.

f. Are all the values inserted in the vector, layer, and default parameter files correct and with proper syntax? Refer to software manual for definitions of codes and syntax.

g. Is the elevator driving subroutine initialized? Initialize elevator drive subroutine as follows:

1. On process computer, press ENTER - main menu is displayed.

2. Select Utilities menu and press ENTER.

3. Select Power On Sequence and press ENTER.

4. Function keys 1, 2, and 3 can be used to power the laser, driving electronics, and open the shutters.

3.5.5.5 How to Run Supervisor to Make a Part. Now that all of the preparatory work has been done, this procedure shows how to actually build a part.

a. On process computer, press ENTER - MAIN MENU is displayed.

b. Select option 4 (Supervisor) and press ENTER.

c. In response to Part Prefix prompt:, type name of part files and press ENTER. This causes on the laser to start tracing the first layer. Verify that SHUTTER OPEN and LASER ON indicators on operator control panel are illuminated.

d. Watch the first layers form.

1. Is the part centered on the elevator platform?

2. Do the first layers stick to the platform?

3. If not, abort the run and correct the problem.

3.5.5.6 Post Processing of SLA-1 Parts. This procedure shows how to remove the finished part from the vat, drain the part, cure and dry the part, and remove supports.

a. Updip and Preliminary Draining.

1. On process computer, press ENTER - main menu is displayed.

2. Select Utilities menu and press ENTER.

3. Select Z-Stage Mover and press ENTER.

4. Very slowly toggle ↑ arrow until elevator is raised to 1 inch above edge of reaction vat level. Do not raise part quickly or distortion could occur.

5. Wait approximately 15 minutes to allow excess resin to drip from part.

b. Part/Platform Removal.

1. Place a pad of absorptive material on the special drain tray.

2. Slip the drain tray under the elevator platform and rest it on the shelves on either side of the vat.

3. Toggle ↓ arrow on keyboard to lower the elevator platform until it is about 1/4 inch above the absorptive pad.

4. Twist one of the elevator shaft knobs one turn ccw. This will unscrew a threaded rod inside the elevator shaft from a threaded hole in one side of the elevator platform and partially release the platform.

5. Repeat step (d) with the opposite elevator shaft knob.

6. Repeat steps (d) and (e) alternately until the platform drops free from the shafts and falls a fraction of an inch to rest on the absorptive pad.

7. Raise the elevator shafts, if necessary, with the ↑ arrow on keyboard.

8. Remove the drain tray, platform, and attached part from the vat chamber. Keep the platform horizontal if possible to avoid putting side stresses on the green (uncured) part.

c. Oven Draining.

1. Place elevator platform and part in an oven.

2. Set temperature to 80 to 90°C and wait 1 hour.

3. Carefully wipe off excess liquid resin which adheres to up and down-facing surfaces with cotton swabs.

d. Post Curing.

1. Place elevator platform and part in an ultraviolet flood oven.

2. Flood the part with ultraviolet light until it is dry and no longer tacky.

3. Use a fine-tooth saw and remove the part from the elevator platform by sawing through the bottom supports that attach the part to the platform. Protect the part from streses and inertial shocks during this procedure.

4. Clean all "sawdust" and fragments of support from the part before continuing.

5. Turn part upside down (or rest part on its side if this is not possible) and repeat steps 1 and 2.

e. Platform Replacement.

1. Scrape away any dry resin that is still sticking to elevator platform after removal of part. If may be necessary to tap out the treaded holes in the platform with a #10-32 tap.

2. Place the empty platform on the drain tray.

3. Place the drain tray in the SLA-1 vat chamber resting on the shelves and centered as well as possible over the vat.

4. Very slowly toggle ↓ arrow on keyboard to lower the elevator shafts until the threaded rods are very close to the platform. Avoid running the shafts into the platform or tray as this can ruin the threads on the shaft.

5. Adjust the tray and platform so that the threaded holes in the platform are exactly aligned beneath the threaded rods.

6. Slowly toggle ↓ arrow on keyboard until the threaded rods contact the threaded holes gently.

7. Twist one of the elevator shaft knobs one turn cw. This will rotate the threaded rod inside the elevator shaft and cause it to engage the threaded hole in the panel.

8. Repeat step 7 with the opposite elevator shaft knob.

9. Repeats steps 7 and 8 alternately until the platform is lifted off of the drain tray and is in firm contact with the bottom of the elevator shafts.

10. Snug up the elevator shaft knobs to secure the panel to the shafts. Do not overtighten as this can fracture the interior threaded rod.

11. Toggle the ↑ arrow on keyboard to raise the elevator.

12. Remove the drain tray.

f. Removing Supports and Finishing.

1. Carefully cut away supports with side cutting pliers.

2. Carefully smooth off rough surfaces with appropriate files.

3. Surface finish as required.

3.5.5.7 <u>Shutdown Procedures</u>.

a. Set OVEN LIGHT switch to off (down). Verify that OVEN LIGHT indicator extinguishes.

b. Set POWER ON switch to off (down). Verify that POWER ON and other indicators extinguish.

3.5.5.8 <u>How to Create and Use Working Curves</u>. The degree to which liquid plastic can be solidified is determined by three factors: (1) the type of resin used, (2) laser power, and (3) degree of laser focus. By creating a working curve, the operator can adjust the laser drawing speed to compensate for variations in these three factors. Therefore, a new working curve must be prepare each time a new batch of resin is used or there is a significant loss of laser power as shown on the Part Log. The working curve is then used to change the step period (laser drawing speed) and step size in the default parameter and layer control files.

a. Toggle ↓ arrow on keyboard to lower elevator platform to 1 inch below resin surface. The <u>banjo</u> part used to create working curves will be prepared free floating on the resin surface.

b. On process computer, press ENTER - main menu is displayed.

c. Select Utilities menu an press ENTER.

d. Select Banjo and press ENTER. Follow the menu to input the largest step period (SP) to be used. The SLA-1 will prepare the banjo part in the vat.

e. After banjo part is completed, drain and cure it (subparagraph 3.5.5.6).

f. Use a microscope and measure horizontal width of each string.

g. Cut banjo part sideways and use microscope to measure thickness (depth) of each string.

h. Plot height and width values on a working curve (sample in Figure 3-2) at the step periods chosen (example - 40, 80, 160, 320, and 640). The lowest step period will create the thinnest banjo string and the highest step period will create the thickest banjo string.

i. Another banjo can be created with different step periods to extend the range of the working curve.

j. Connect the five or more points to form both working curves.

k. The working curve can now be used to select the step period and step size for each slice.

l. Insert the chosen step period and step size into the default parameter files (paragraph 3.5.5.2).

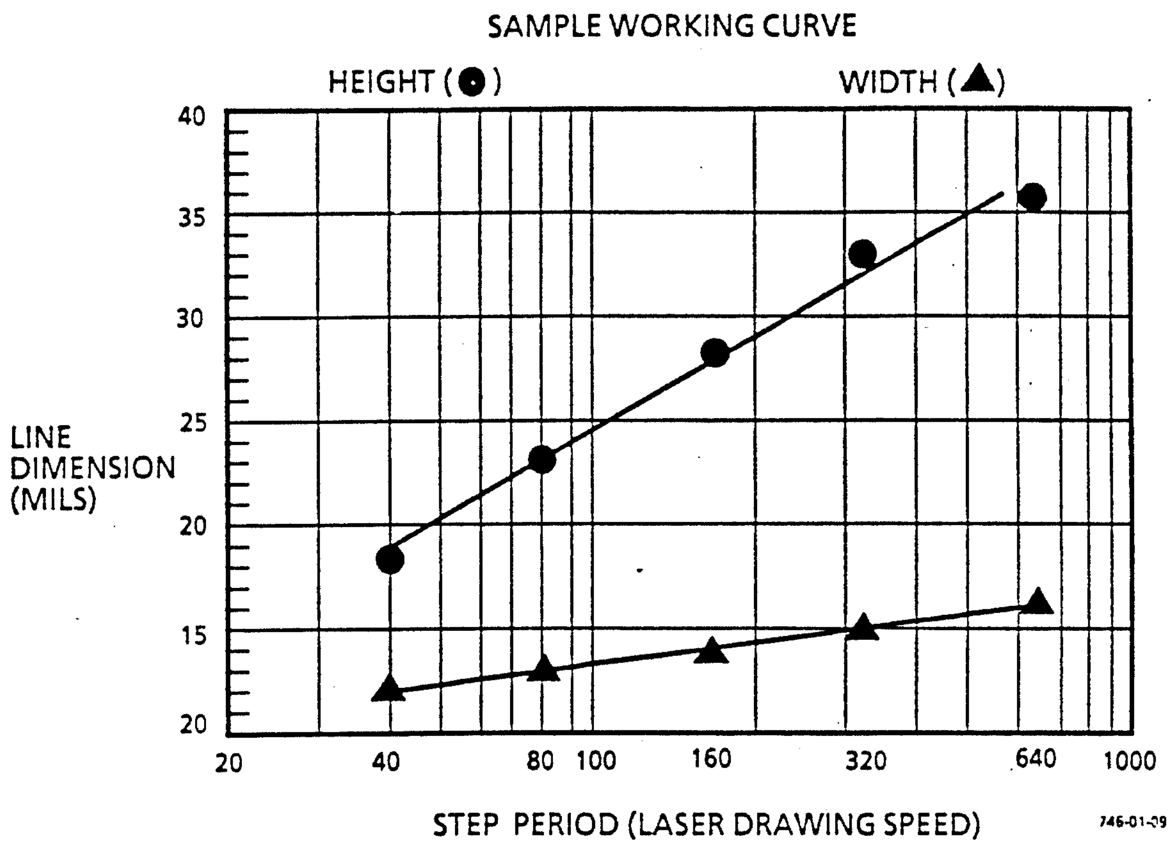
*Figure 3-2. Sample Working Curve*

SECTION IV

TROUBLESHOOTING

4.1 INTRODUCTION

This section contains troubleshooting procedures to identify and correct operation errors and selected hardware failures. Fault conditions not covered in this section shall be corrected by qualified maintenance technicians using the SLA-1 Service Manual.

4.2 TROUBLESHOOTING PROCEDURES

Beta SLA-1 troubleshooting procedures are listed in Table 4-1.

*Table 4-1. Troubleshooting Procedures*

| Problem | Probable Cause | Remedy |
|---|---|---|
| | | |

SECTION V

OPERATOR MAINTENANCE INSTRUCTIONS

5.1 INTRODUCTION

This section contains procedures for routine maintenance to be performed by the SLA-1 operator. Included are procedures to clean up resin spills, add resin to vat, replace vat, replace air filter, and clean optical components. Maintenance requirements not covered in this section shall be performed by qualified technicians in accordance with SLA-1 Service Manual.

5.2 MATERIALS AND EQUIPMENT

Recommended maintenance materials and equipment are listed in Table 5-1. Equivalent items may be used.

*Table 5-1. Maintenance Materials and Equipment*

| Nomenclature | Model/Part No. | Source |
|---|---|---|
| Gloves, chemical resistant | | Commercially available |
| Glasses, safety | | Commercially available |
| Towels, disposable | | Commercially available |
| Container, hazardous materials disposal | | Commercially available |
| Isopropanol | | Commercially available |
| Clothing, protective | | Commercially available |
| Respiratory equipment, NIOSH/MSHA approved | | Commercially available |
| Absorbing material (sawdust, clay, diatomaceous earth, or activated charcoal) | | Commercially available |
| Resin, UV curable | | Commercially available |
| Compressed air | | Commercially available |
| Methanol, reagent-grade | | Commercially available |
| Glass | | Commercially available |
| Lens tissue | | Commercially available |
| Hemostat (or clamping tweezers) | | Commercially available |
| Cotton swabs | | Commercially available |
| Filter, air | | Commercially available |
| Lamp, chamber | | Commercially available |
| Lamp, indicator | | Commercially available |

5.3 RESIN CLEANING/REPLENISHMENT PROCEDURES

5.3.1 Cleanup of Small Resin Spills.

WARNING

UV CURABLE RESINS MAY CAUSE EYE AND SKIN BURNS. REPEATED OR PROLONGED SKIN CONTACT MAY CAUSE SENSITIZATION. VAPOR MAY BE HARMFUL.

a. Read the safety precautions and first aid instructions at the front of this manual.

b. Put on chemically resistant gloves and safety glasses.

c. Remove the spilled resin using disposable towels.

d. Seal contaminated towels and other contaminated articles in a marked container suitable for the disposal of hazardous materials.

NOTE

Fully cured resins present no safety or health related hazards. An alter-native means of disposing lightly contaminated articles is to ultraviolet or heat-cure the affected areas and dispose of as nonhazardous waste.

e. Clean the spill area with isopropanol followed by a thorough washing with soap and water.

f. Remove gloves and seal in disposal container. Dispose of container in accordance with applicable hazardous waste laws and regulations.

g. Wash hands thoroughly with soap and water.

5.3.2 Cleanup of Large Resin Spills.

WARNING

UV CURABLE RESINS MAY CAUSE EYE AND SKIN BURNS. REPEATED OR PROLONGED SKIN CONTACT MAY CAUSE SENSITIZATION. VAPOR MAY BE HARMFUL.

a. Immediately isolate the spill area.

b. Read the safety precautions and first aid instructions at the front of this manual.

c. Put on protective clothing, chemically resistant gloves and safety glasses. If the spill area is not well ventilated, wear NIOSH/MSHA approved respiratory equipment.

d. Cover the spill with absorbing material such as sawdust, clay, diatomaceous earth, or activated charcoal.

e. When the absorbant is saturated, seal it in a marked container suitable for the disposal of hazardous materials.

f. Clean the spill area with isopropanol followed by a thorough washing with soap and water.

g. Wipe resin off protective clothing with clean disposable towels.

i. Remove protective clothing in the following order: boots, gloves and suit. After removing gloves, use disposable cloths to protect hands.

j. Place contaminated articles in the disposal container. Dispose of container in accordance with applicable hazardous waste laws and regulations.

k. Shower with soap and cool water.

5.3.3 Vat Replenishment. The reaction vat contains spillways on both sides to handle resin overflow. The overflowed resin then flows through the overflow tubes, through the drain valve, and settles in the collection bottle. Do not reuse resin after an overflow. If resin level in vat is low, replenish as follows:

a. Open chamber door.

b. Slowly pour new resin into vat. Make sure that new resin is the same type as the resin in the vat. The part will not build properly if different resins are mixed in the vat.

c. Wait 1/2 hour for resin level to settle before resuming operation.

d. Close chamber door.

5.4 OPTICS CLEANING (Figure 5-1)

The SLA-1 optics must be cleaned when there is obvious contamination (fingerprints, dust, haze) of the optical surfaces, or when the laser power measured at the resin surface is less than the power measured at the laser by more than a few milliwatts. If laser power loss is present, the optical alignment should be checked. If the system is aligned as well as possible and still there is a significant difference in power from the laser to the resin surface, optics cleaning is required.

5.4.1 Equipment Required.

a. A source of clean, compressed air designed for optics cleaning.

b. A small amount of clean reagent-grade methanol in a glass (not plastic) bottle.

c. A supply of clean lens tissue. (Conventional face tissues leave lint on optical surfaces and are not recommended. Industrial wiping tissues are designed to be abrasive, and should be strictly avoided.)

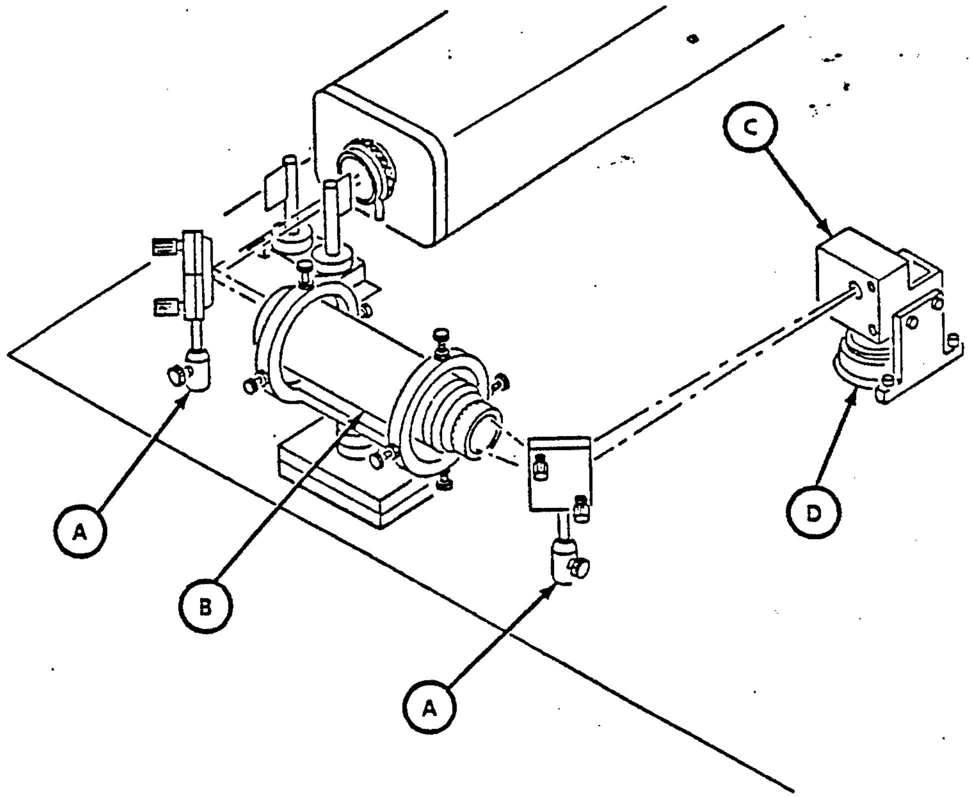
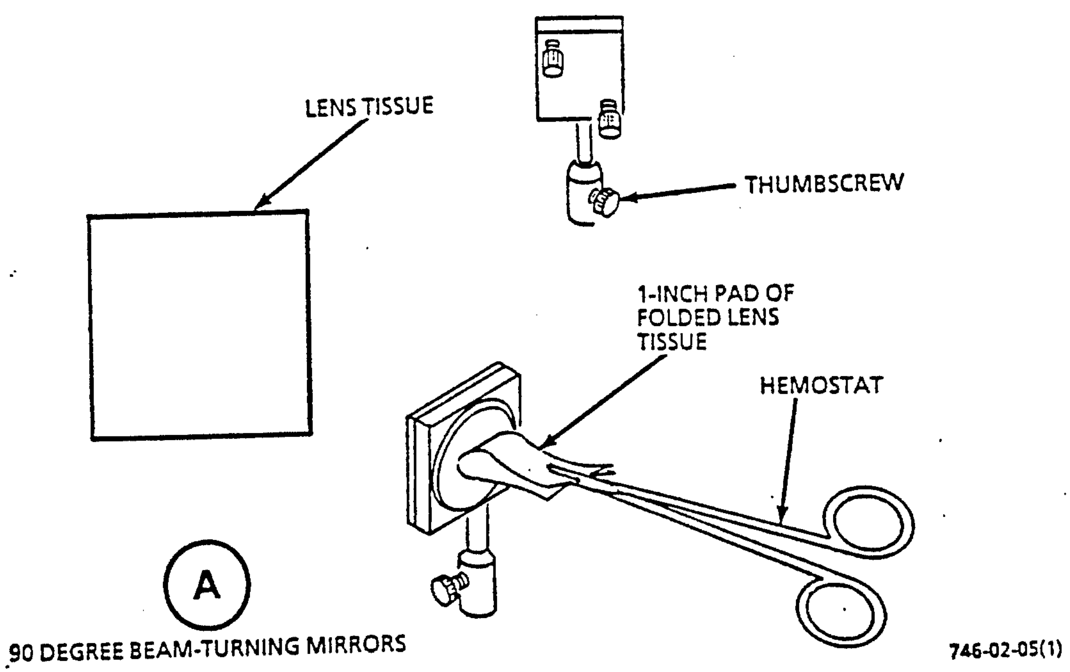
*Figure 5-1. Recommended Optics Cleaning Technique (Sheet 1 of 2)*

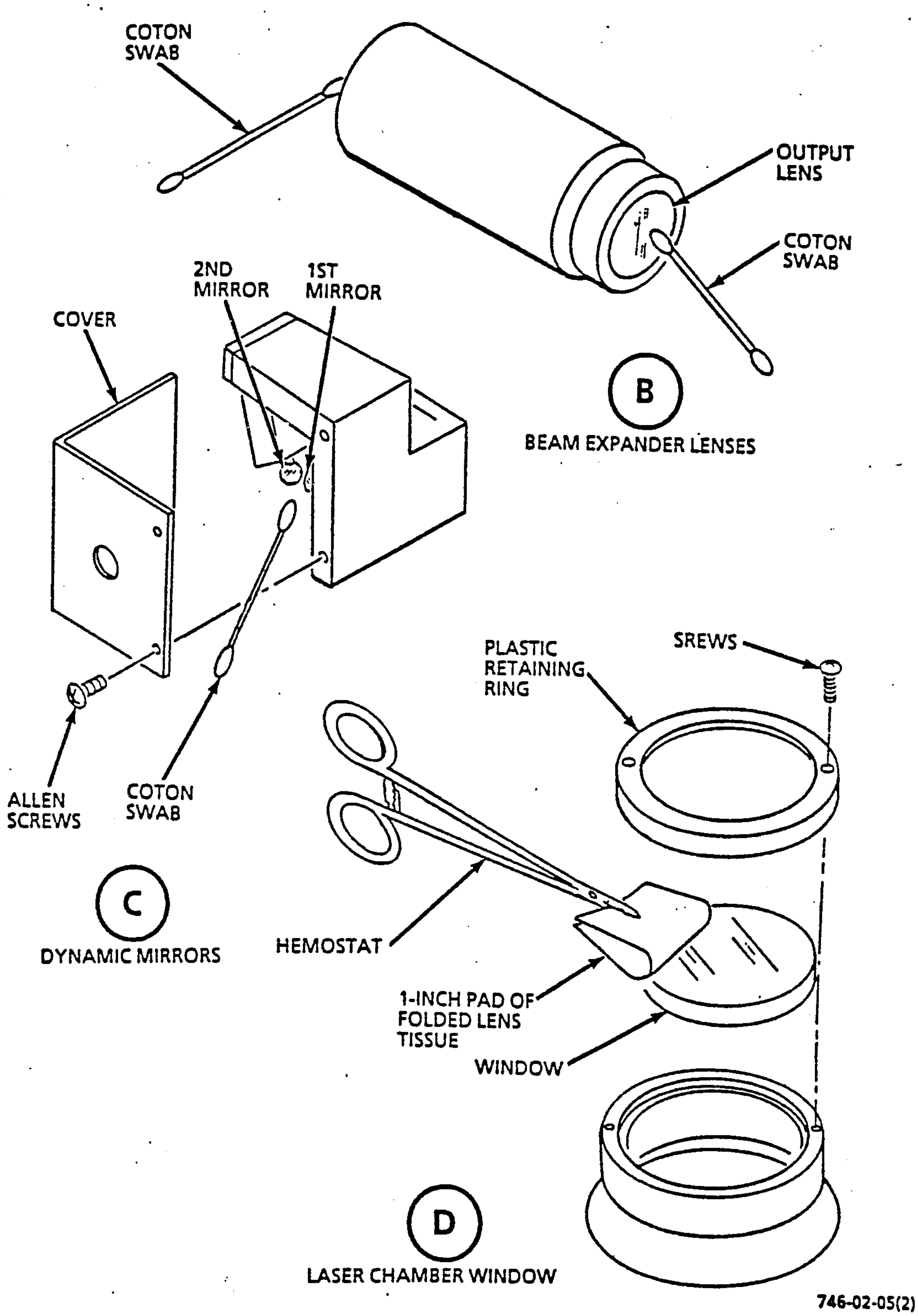
*Figure 5-1. Recommended Optics Cleaning Technique (Sheet 2 of 2)* d. A hemostat or pair of clamping tweezers.

e. A supply of special cotton swabs designed for optics cleaning. (These have a wooden stick with the cotton heads attached without glue. Plastic "sticks" and glue can be dissolved by the methanol and their residue contaminates the optical surfaces.)

f. Freshly scrubbed, clean, dry hands.

5.4.2 Care and Handling of Optics. All of the optics in the SLA-1 are coated with precise dielectric coatings, either to avoid unwanted reflections from the surfaces of the transmissive optics or to achieve efficient reflections from the mirrors. These coatings are fragile and easy to damage. Even faint fingerprints will damage the coatings, so extreme care must be taken to never touch the optical surfaces with fingers or with anything except carefully handled lens tissue or special cotton swabs. The optics must be handled only by the edges of any of the optics, or by the uncoated backs of the reflective optics.

5.4.3 Laser Brewster Windows. Refer to HeCd Laser Service Manual to clean laser brewster windows.

5.4.4 Laser Resinator Mirrors. Refer to HeCd Laser Service Manual to clean laser resinator mirrors.

5.4.5 90 Degree Beam-Turning Mirrors. (Figure 5-1A) The beam-turning mirrors can be removed and cleaned after their protective covers/shields have been removed. Turn the thumbscrew locking the mirror mount post into the post-holder ccw and gently lift the post and mirror mount of the post-holder. If desired, the mirrors and their immediate black-anodized holders can be separated from the mount by loosening the thumbscrew which retains the mirror holder to the mirror mount.

a. Carefully remove dust and lint from the mirror surface using clean compressed air. If using an aerosol "duster", be certain that the can is always held upright or aerosol propellant will be sprayed onto and contaminate the optical surface.

b. Wash hands thoroughly and fold a new sheet of lens tissue in halves repeatedly to achieve a "pad" of lens tissue about 1-inch square, and several thicknesses of tissue thick. Grasp this pad along one edge with a hemostat or locking tweezers.

c. Apply a few drops of reagent-grade methanol to the pad and shake off any excess.

d. Apply the side of the pad to one edge of the surface of the mirror. Carefully draw the pad across the surface one time only using some pressure on the hemostat. Allow the "tail" of the pad to follow the leading edge of the pad and drag across the optical surface. Immediately discard this piece of lens tissue.

e. Allow the small film of methanol remaining on the optic to evaporate naturally. Do not wipe or blow on the optic to assist evaporation.

f. Carefully examine the optic by looking at a glancing reflection of a bright area. If the optic still is not clean, choose a new sheet of lens tissue and repeat steps b through f until satisfactory results are achieved.

g. If it is desired to clean the beam expander lenses as well, do not replace the 90 degree beam-turning mirrors and mounts until the lenses have been cleaned as explained below.

5.4.6 Beam Expander Lenses. (Figure 5-1B) Do not remove the lenses from the beam expander mount. The mount is difficult to realign and should not be removed.

a. In order to clean the beam expander optics in place, the 90 degree beam-turning mirrors and mounts should be removed as explained above and carefully set aside.

b. Apply a few drops of reagent grade methanol to an unused special cotton swab and shake or flick off any excess.

c. To clean the input expanding (small) lens:

1. Carefully insert the soft tip of the swab into the input aperture until the surface of the lens is encountered. Use slight pressure and rotate the swab as it contacts the lens. Remove the swab and immediately discard it.

2. Repeat steps b and c.1 with a new, much "drier" swab from which almost all of the methanol has been shaken out.

3. Repeat step c.1 with a new, completely dry cotton swab.

d. To clean the output converging (large) lens:

1. Apply a few drops of reagent grade methanol to an unused special cotton swab and shake or flick off any excess.

2. Use soft pressure with the soft tip of the swab and begin in the center of the lens. Wipe the lens with an expanding spiral pattern until the outer edge is wiped once. Immediately discard the swab.

3. Repeat step d.2 with a new, much "drier" swab from which almost all of the methanol has been shaken out.

4. Repeat step d.1 with a new, completely dry cotton swab.

5. Now carefully examine the lens by looking at a reflection of a bright area. If the lens still is not clean, choose a new special cotton swab and repeat steps d.1 through d.5 until satisfactory results are achieved.

e. Check the cleaning job by viewing the expanded beam.

1. Replace the input 90 degree beam-turning mirror.

2. Put on UV blocking glasses or goggles.

3. Defeat the interlock shutter by using the interlock-defeat jumper and realign the turning mirror so that the laser beam passes directly through the center of the beam expander.

4. Place a flucrescing piece of paper in front of the output lens and watch the expanded beam image carefully while adjusting the input turning mirror slightly to move the beam around through the beam expander. Any discontinuties in the beam pattern which do not move <u>with</u> the beam as it moves are likely to be caused by blemishes on the beam expander optics. If any are observed, repeat paragraph 5.3.5.6 entirely.

f. Replace the output beam-turning mirror and mount it in the post holder.

5.4.7 <u>Galvanometer-Driven Dynamic Mirrors</u>. (Figure 5-1C)

<u>CAUTION</u>

The galvanometer-driven dynamic mirrors are very light, thin, carefully balanced, and fragile. Breaking a dynamic mirror is easy to do and will involve a major replacement of the dynamic mirror system, and realignment of the SLA-1 optics. Therefore, be especially careful and gentle when cleaning the dynamic mirrors.

a. Remove the protective cover from the dynamic mirrors by loosening the two machine screws which attach it to the dynamic mirror bracket. Be certain not to confuse them with the machine screws which mount the entire dynamic mirror bracket. Do not remove the dynamic mirror bracket from its mount, nor the mount from the optical plate. Detaching and remounting the dynamic mirrors could necessitate a major optical realignment, and is not recommended.

b. Apply a few drops of reagent grade methanol to an unused special cotton swab and shake or flick off any excess.

c. Hold the stick of the swab between the fingers and carefully bring the side of the swab into contact with one end of the front surface of one of the dynamic mirrors.

d. Use gentle pressure and wipe the swab along the long axis of the mirror once while rotating the swab in the opposite direction. Immediately discard the swab.

e. Allow the small film of methanol remaining on the optic to evaporate naturally. Do not wipe or blow on the optic to assist evaporation.

f. Repeat steps c through e for the other dynamic mirror.

g. Now carefully examine the optics by looking at a glancing reflection of a bright area. If the optics still are not clean, choose a new cotton swab, and repeat steps c through g until satisfactory results are achieved.

5.4.8 Laser Chamber Window. (Figure 5-1D)

a. Open chamber door.

b. Remove two screws from inside chamber and remove window mount.

c. Remove two screws and remove plastic retaining ring from window mount.

d. Wash hands thoroughly, touch only the edges of the window, and remove the window from the mount.

e. Carefully remove dust and lint from the surface using clean compressed air. If using an aerosol "duster", be certain that the can is always held upright or aerosol propellant will be sprayed onto and contaminate the optical surface.

f. Fold a new sheet of lens tissue in halves repeatedly to achieve a "pad" of lens tissue about 1-inch square, and several thicknesses of tissue thick. Grasp this pad along one edge with the hemostat or locking tweezers.

g. Apply a few drops of reagent grade methanol to the pad and shake off any excess.

h. Now apply the side of the pad to new edge of the surface of the window as shown in. Carefully draw the pad across the surface one time only using some pressure on the thermostat. Allow the "tail" of the pad to follow the leading edge of the pad and drag across the optical surface. This will clean one section of the surface of the large window. Immediately discard this piece of lens tissue.

i. Use a new pile of lens tissue each time and repeat steps d through f until the entire surface has been cleaned.

j. Allow the small film of methanol remaining on the window to evaporate naturally. Do not wipe or blow on the window to assist evaporation.

k. Carefully examine the window by looking at a glancing reflection of a bright area. If the window still is not clean, choose a new sheet of lens tissue and repeat steps d through i until satisfactory results are achieved.

l. Repeat steps d through i to clean the other side of the window.

m. Carefully replace the window in the mount.

n. Install plastic retaining ring on window mount and secure with two screws.

o. Install window mount in chamber window aperture and secure with two screws.

p. Close chamber door.

5.5 REPLACEMENT PROCEDURES 5.5.1 Air Filter Replacement. (Figure 5-2) Replace the air filter every 6 months.

a. Open chamber door.

b. Place lit on vat.

c. Remove two screws and pull air filter with clamp attached straight out from chamber.

d. Install new air filter in chamber and secure with two screws.

e. Remove lid from vat.

f. Close chamber.

5.5.2 Chamber Lamp.

a. Set OVEN LAMP switch to off.

b. Open chamber door.

c. Grasp chamber lamp at both ends and pull straight down to disengage lamp.

d. Install new lamp by pushing both ends to engage the prongs.

e. Close chamber door.

f. Set OVEN LAMP switch to on. Verity that chamber lamp is illuminated.

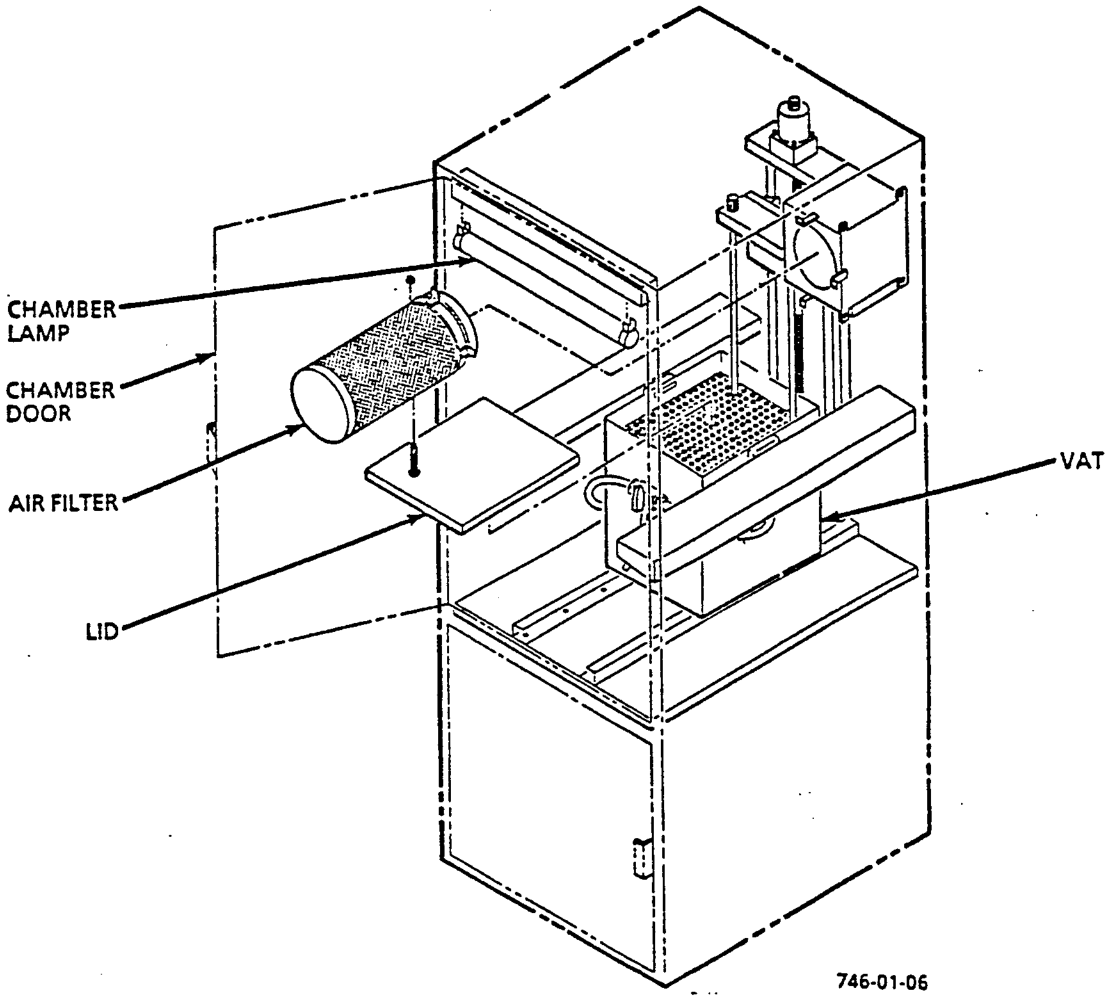
*Figure 5-2. Air Filter Replacement*

5.5.3 Control Panel Lamps.

a. Place a small flat blade screwdriver on bottom of plastic lens and push up to disengage lens.

b. Grasp plastic tab with screwdriver and pry lamp forward to remove.

c. Install new lamp in plastic tab.

d. Install plastic lens. Verify that lamp illuminates during normal operating sequence.

GLOSSARY

The following terms are used in the stereolithography process:

| | |
|---|---|
| 60/120 ANGLE HATCH | This is a type of crosshatching pattern which supplements the standard X and Y hatching. See software manual. |
| BANJO | This is a part which when built and measured provides line height and line width data for the working curve. |
| BASES (SUPPORTS) | These are the structures generated by the CAD which provide structural support to the actual part when being built. (See webs). |
| BEAM PROFILE | This is the spatial distribution of laser beam energy. |
| BORDER (BOUNDARY) | The border is a block of vectors defining the walls of a sliced layer of a part. |
| CAD | Computer aided design. |
| CENTERING | This is a SLICE routine which automatically centers the part in space. This can only be done if the part is defined by only one STL file. See software manual. |
| CLIFF | This is a software program which is used primarily in BASIC programming. It can also be used to move mirrors using direct commands from the DOS shell by transmitting data to STEREO. |
| CRITICAL AREA | This is an area within the part which has coordinates defined in a text file prior to merging. The area can have special attributes such as riveting. See software manual. |

| | |
|---|---|
| CROSSHATCH | This is a general interior vector type providing structural integrity to walls. The pattern used is defined during slicing. See software manual. |
| CURL | This is an effect sometimes encountered during part creation which can cause part inaccuracy. |
| DIP ACCELERATION | This is a part-building variable which defines the speed. of elevator dipping. It can be modified on a layer by layer basis if needed. |
| DIP DELAY | This is a part-building variable defining the delay between the start of a dip routine and the start of next layer calculations (and laser movement). It can be modified on a layer by layer basis. |
| DIP DEPTH | This a part-building variable which defines the distance the elevator moves downward during a dipping sequence. |
| DIP SPEED | This is a part-building variable which defines the maximum speed that the elevator attains. |
| DRAWING SPEED | Laser drawing speed is defined by the Supervisor variables Step Period and Step Size. It is varied depending on layer thickness, type of resin, and laser power. The drawing speed to be used is typically generated by use of the working curve. |
| DYNAMIC MIRRORS | These are the galvanometer vector scanning mirrors which are controlled by SLA-1 software. Laser beam movement is defined by the rotation of these mirrors. |
| ELEVATOR | The elevator is the vertically moving device to which the elevator platform and part are attached. |

| | |
|---|---|
| ETHERNET | This is file transfer software system. It allows for easy movement of large files. |
| FOOTPRINT | This is the bottom of the supports which adheres directly to the elevator platform. |
| GREEN PART | This is the laser cured part which has not undergone final post curing. |
| HATCH SPACING | This is the distance between crosshatching which is defined during slicing (see crosshatch). |
| HeCd | Helium Cadmium. |
| L FILE | This is a merge generated control file which contains all the layer by layer vector block identification information. Individual layer parameters can be modified in the L file. |
| LASER | This is the laser controller software. If is also a device which provides the light energy required to polymerize the liquid photopolymer. |
| LAYER THICKNESS | This is the layer to layer dipping distance. It can be either one value for the whole part or changed many times throughout the part (see variable layer thickness). |
| LEVELING | This is the time and temperature-dependent process where the resin settles to a flat surface after being distributed by dipping. The time allowed for leveling is defined by the dip delay variable. |
| LINE HEIGHT | This the vertical thickness of a laser cured plastic line. It is variable depending on drawing speed and laser power/focus. |

| | |
|---|---|
| LINE WIDTH | This is the width of a laser cured plastic line. It is variable depending on drawing speed and laser power/focus. |
| MERGE | This is a software program which takes the individual sliced files for a part and combines them. It generates the L and V files which Supervisor uses to make the part. |
| MIA | This is the minimum intersect angle and is used during slicing to delete hatch vectors which run parallel to layer boundaries. See software manual. |
| MODULUS | This is a physical attribute of a material which defines it's overall toughness. |
| MONOMER | This is a chemical species which is generally low in molecular weight and is used as a building block for preparing polymers. |
| MSA | This is the minimum surface angle and is used during slicing. See software manual. |
| MSHA | Mine Safety and Health Administration. |
| NIOSH | National Institute for Occuptational Safety and Health. |
| PHIGS FORMAT | This is the software program that defines the CAD surfaces by using triangles. |
| PHOTOINITIATOR | This is a chemical which transforms the laser energy into chemical energy and initiates the polymerization process. |
| PHOTOPOLYMER | This is a polymer which is formed using light as the energy source. |

| | |
|---|---|
| POST CURE | This is the process used to cure a green part. The post cure can be either ultraviolet light induced or thermal induced. |
| POT LIFE | This is the useful life expectancy of a pot of chemical and depends on the chemical stability and other factors. |
| PRIMARY RADICAL | This is the initial radical species formed when laser light is absorbed by the photoinitiator. The primary radicals initiate the polymerization process. |
| RADIAL CROSSHATCH | This is a specific type of crosshatch which generally provides the best overall strength and support (see crosshatch). |
| RADIOMETER | This is a device which allows for the measurement of the laser output power. |
| RESIN | This is the liquid photopolymer. |
| RIVET | This is a part making process which can be used in critical areas which may be prone to stress related inaccuracies. |
| SCALE FACTOR | This is a Supervisor variable which can be used to scale the XY space either larger or smaller. It does not affect the vertical dimension. |
| SENSITIZATION | This is an allergic response that some individual may obtain after repeated skin contract with a given chemical. |
| SKIN (SKIN FILL) | This is the coating of a horizontal (flat) or near horizontal (flat) area of the part. |
| SLA | Stereo-lithography Apparatus |

| | |
|---|---|
| SLICE | This is the software that transforms the three-dimensional CAD designed part into a series of two-dimensional layers (slices). |
| SMALLEY | This is a stress relieving (decoupling) structure designed on the CAD. |
| STEP PERIOD | This is a Supervisor variable which helps to define the laser drawing speed. Increasing the step period slows the speed (increases the plastic line height and width). |
| STEREO | This is a memory resident portion of the laser controller software. |
| STL FILE | This is the PHIGS format CAD file used as input for slicing. |
| SUPERVISOR | This is the software which supervises all the passing of variables and data to drive the mirrors and move the Z stage up and down during part building. |
| TENSILE STRENGTH | This is an attribute of a material which defines the energy required to stretch it. |
| TRAPPED VOLUMES | These are areas of the part from which resin cannot drain during dipping. |
| USER INTERFACE | This is the menu driven software which is used to control and run slicing programs. |
| .V FILE | This is a merge generated file which contains all the layer by layer vector information. See software manual. |

VARIABLE LAYER THICKNESS — This is the process tool which allows use of differing dipping depths and layer thicknesses in order to achieve improved strength or accuracy. It is controlled within Slice.

WEB — This is a type of support structure designed by the CAD designer which can provide additional strength or support as needed.

WORKING CURVE — This is the plotted line height and line width data provided from Banjotop. It is used in with laser power to obtain drawing speed information.

systems, inc.

NOT TO BE DISCLOSED

THIS DOCUMENT CONTAINS CONFIDENTIAL INFORMATION RELATING TO STEREOLITHOGRAPHY PROCESSES AND EQUIPMENT WHICH ARE THE EXCLUSIVE PROPERTY OF 3D SYSTEMS, INC. THIS INFORMATION SHALL NOT BE DUPLICATED, USED OR DISCLOSED -- IN WHOLE OR IN PART -- FOR ANY PURPOSE OTHER THAN TRAINING AS AUTHORIZED IN WRITING BY 3D SYSTEMS, INC. ALL REASONABLE PRECAUTIONS SHALL BE TAKEN TO ENSURE COMPLIANCE WITH THESE CONDITIONS.

THE POSSESSION OF THIS DOCUMENT CONVEYS NO PROPERTY RIGHT OR LICENSE IN THE INFORMATION NOR IN ANY MATTER DISCLOSED THEREIN.

SLA-1
BETA SITE
STEREOLITHOGRAPHY
SYSTEM

SERVICE MANUAL

TABLE OF CONTENTS
INTRODUCTION
TROUBLESHOOTING
COMPONENT REPLACEMENT
ALIGNMENT
SPARE PARTS LISTS
WIRING DIAGRAM

3D Systems Incorporated
12847 Arroyo Street
Sylmar, California 91342
(818) 898-1533 • FAX (818) 361-5484

NOVEMBER 1987

Safety Precautions

WARNING
INVISIBLE LASER RADIATION

UV LASER RADIATION MAY DAMAGE EYE TISSUE. AVOID DIRECT EXPOSURE TO LASER BEAM. WEAR UV BLOCKING SAFETY GLASSES.

WARNING
HIGH VOLTAGE

HAZARDOUS VOLTAGES ARE ACCESSIBLE WITH MAINTENANCE PANELS REMOVED. FOLLOW SAFE WORK PRACTICES.

WARNING
CHEMICAL HAZARDS

UV CURABLE RESINS MAY CAUSE EYE AND SKIN BURNS. REPEATED OR PROLONGED SKIN CONTACT MAY CAUSE SENSITIZATION. VAPOR MAY BE HARMFUL.

Observe the following safety precautions when cleaning spilled resin or handling resin containers.

- Keep away from heat, sparks and flame. Protect from sunlight and fluorescent light. Closed containers may rupture/explode when exposed to extreme heat. Use National Fire Protection Association Class B extinguisners (carbon dioxide, dry chemical or foam).
- Use only with adequate ventilation. Avoid breathing vapors or spray mist.
- Wear safety glasses.
- Wear chemically resistant gloves and protective clothing. Wash thoroughly after handling and before eating, smoking or using toilet facilities.
- Wear an NIOSH/MSHA approved respirator or ensure adequate ventilation when sanding or cutting cured objects.

FIRST AID FOR CHEMICAL ACCIDENTS

Skin Contact. Wash thoroughly with soap and water. Remove contaminated clothing and shoes immediately. If skin is irritated, get medical attention. Wash clothing before reuse and discard contaminated shoes.

Eye Contact. Flush immediately with large amounts of water for 15 minutes and avoid sunlight, flourescent light, or other ultraviolet light. Get medical attention.

Inhalation. Remove victim to fresh air. Give artificial respiration or cardio-pulminary resuscitation if required. If breathing is difficult, give oxygen. Get medical attention.

TABLE OF CONTENTS

| Section/Paragraph | Title | Page |
|---|---|---|
| | INTRODUCTION . . . . . . . . . . . . . . | v |
| I | TROUBLESHOOTING . . . . . . . . . . . . | 1-1 |
| 1.1 | Introduction . . . . . . . . . . . . . . | 1-1 |
| 1.2 | How to Use this Section . . . . . . . . | 1-1 |
| 1.3 | Test Points . . . . . . . . . . . . . . | 1-3 |
| II | COMPONENT REPLACEMENT . . . . . . . . . | 2-1 |
| 2.1 | Introduction . . . . . . . . . . . . . . | 2-1 |
| 2.2 | Tools . . . . . . . . . . . . . . . . . | 2-1 |
| 2.3 | Sice Computer . . . . . . . . . . . . . | 2-2 |
| 2.3.1 | Monitor . . . . . . . . . . . . . . . . | 2-2 |
| 2.3.2 | Keyboard . . . . . . . . . . . . . . . . | 2-2 |
| 2.3.3 | Slice Computer . . . . . . . . . . . . . | 2-4 |
| 2.4 | Electronic Cabinet Assembly . . . . . | 2-4 |
| 2.4.1 | Monitor . . . . . . . . . . . . . . . . | 2-4 |
| 2.4.2 | Keyboard . . . . . . . . . . . . . . . . | 2-7 |
| 2.4.3 | Process Computer . . . . . . . . . . . | 2-7 |
| 2.4.4 | Laser Power Supply . . . . . . . . . . | 2-8 |
| 2.4.5 | Elevator Driver . . . . . . . . . . . . | 2-9 |
| 2.4.6 | AC Power Distribution Panel . . . . . | 2-10 |
| 2.4.7 | Dynamic Mirrors Driver . . . . . . . . | 2-11 |
| 2.5 | Optics Assembly . . . . . . . . . . . . | 2-12 |
| 2.5.1 | Laser . . . . . . . . . . . . . . . . . | 2-12 |
| 2.5.2 | Shutters . . . . . . . . . . . . . . . . | 2-15 |
| 2.5.3 | Beam-Turning Mirrors . . . . . . . . . | 2-15 |
| 2.5.4 | Beam Expander . . . . . . . . . . . . . | 2-16 |
| 2.5.5 | Dynamic Mirrors . . . . . . . . . . . . | 2-16 |
| 2.5.6 | Interlock Switches . . . . . . . . . . | 2-17 |
| 2.5.6.1 | Laser Cover . . . . . . . . . . . . . . | 2-17 |
| 2.5.6.2 | Optics Cover . . . . . . . . . . . . . | 2-18 |
| 2.6 | Chamber Assembly . . . . . . . . . . . | 2-18 |
| 2.6.1 | Heater/Fan . . . . . . . . . . . . . . . | 2-18 |
| 2.6.2 | Reaction Vat . . . . . . . . . . . . . | 2-20 |
| 2.6.3 | Elevator . . . . . . . . . . . . . . . . | 2-21 |
| 2.6.4 | Platform . . . . . . . . . . . . . . . . | 2-21 |
| 2.6.5 | Beam Profiler . . . . . . . . . . . . . | 2-22 |
| II | ALIGNMENT . . . . . . . . . . . . . . . | 3-1 |
| 3.1 | Introduction . . . . . . . . . . . . . . | 3-1 |
| 3.2 | Tools and Equipment . . . . . . . . . . | 3-1 |
| 3.3 | Laser Resonator . . . . . . . . . . . . | 3-2 |
| 3.4 | Optics . . . . . . . . . . . . . . . . . | 3-4 |
| 3.5 | Chamber . . . . . . . . . . . . . . . . | 3-7 |

TABLE OF CONTENTS - CONT

| Section/Paragraph | Title | Page |
|---|---|---|
| 3.5.1 | Vertical Alignment of Elevator . . . . | 3-7 |
| 3.5.2 | Horizontal Alignment of Optics Plate . . | 3-9 |
| IV | SPARE PARTS LIST . . . . . . . . . . . . | 4-1 |
| 4.1 | Introduction . . . . . . . . . . . . . . | 4-1 |
| 4.2 | To to Use this Section . . . . . . . . | 4-1 |
| 4.3 | Manufacturer's Names and Addresses . . | 4-2 |
| V | WIRE LIST AND DIAGRAM . . . . . . . . . | 5-1 |
| 5.1 | Introduction . . . . . . . . . . . . . . | 5-1 |
| 5.2 | Wire List and Diagram Diagram . . . . | 5-1 |

LIST OF FIGURES

| Figure | Title | Page |
|---|---|---|
| 2-1 | Slice Computer Components . . . . . . | 2-3 |
| 2-2 | Electronic Cabinet Components . . . . | 2-5 |
| 2-3 | Optics Components . . . . . . . . . . | 2-13 |
| 2-4 | Chamber Components . . . . . . . . . . | 2-19 |
| 3-1 | Laser Resonator Alignment . . . . . . | 3-3 |
| 3-2 | Optics Alignment . . . . . . . . . . . | 3-5 |
| 3-3 | Chamber Alignment . . . . . . . . . . | 3-8 |
| 4-1 | SLA-1 Stereolithrography System . . . | 4-3 |
| 4-2 | Electronic Cabinet Assembly . . . . . | 4-5 |
| 4-3 | Optics Assembly . . . . . . . . . . . | 4-7 |
| 4-4 | Chamber Assembly . . . . . . . . . . . | 4-9 |
| 5-1 | SLA-1 Wiring Diagram . . . . . . . . . | 5-2 |

LIST OF TABLES

| Figure | Title | Page |
|---|---|---|
| 1-1 | Fault Indication Chart . . . . . . . . | 1-1 |
| 2-1 | Replacement Tools . . . . . . . . . . | 2-1 |
| 3-1 | Alignment Tooools and Equipment . . . . | 3-1 |
| 4-1 | Vendor Names and Addresses . . . . . . | 4-2 |

INTRODUCTION

SCOPE

This manual contains service and corrective maintenance procedures for the SLA-1 Beta Site Stereolithography System. This manual is to be used by qualified maintenance technicians to identify and replace defective components. Refer to the SLA-1 User's Manual for operation and routine maintenance procedures.

ORGANIZATION

This manual is divided into five sections, as follows:

SECTION I. TROUBLESHOOTING - Diagnostic and corrective procedures.

SECTION II. COMPONENT REPLACEMENT - Component removal and installation procedures.

SECTION III. ALIGNMENT - Alignment of laser, optics, and chamber.

SECTION IV. SPARE PARTS LISTS - Exploded view illustrations and lists of authorized spare parts.

SECTION V. WIRING DIAGRAM - Wiring diagram to aid in troubleshooting and continuity tests.

OTHER FEATURES OF INTEREST

Title Page Index. On the right side of the title page you will find a section index. The black markers printed to the right of the text are keyed to similar markers on the first page of each referenced section. To locate a section, flip through the manual until you find a marker printed in the same location as the title page marker.

Warning Pages. Following the title page you will find a summary of critical warnings. You may be seriously injured if these warnings are not explicitly followed. Carefully read all warnings and first aid instructions prior to performance of operation or maintenance instructions.

REPORTING ERRORS AND RECOMMENDING IMPROVEMENTS

This manual was prepared for use by Beta Site maintenance personnel. It will be revised to incorporate recommended content and format changes. If you find any mistakes, or if you have any recommendations for improving the procedures, please let us know by sending a copy of the marked-up page(s) to:

Atten: Chick Lewis
3D Systems Inc.
12847 Arroyo St.
Sylmar, California 91342
(818) 898-1533 • FAX (818) 361-5484

SECTION I

TROUBLESHOOTING

1.1 INTRODUCTION

This section contains troubleshooting procedures to identify and correct selected hardware failures. Troubleshooting procedures for operation errors are covered in the SLA-1 User's Manual.

1.2 HOW TO USE THIS SECTION a. Perform the appropriate troubleshooting procedure referenced in Table 1-1 in accordance with the following special instructions.

WARNING

HAZARDOUS VOLTAGES ARE ACCESSIBLE WITH MAINTENANCE PANELS REMOVED. FOLLOW SAFE WORK PRACTICES.

1. The troubleshooting procedures are presented in flow diagram format. Use of the diagrams is described in Figure 1-1.

2. Test point illustrations are provided following the flow diagrams (paragraph 1.3).

b. Repeat the test portion of the flow diagrams after any part is replaced.

*Table 1-1. Fault Indication Chart*

| Fault Indication | Troubleshooting Procedure (Figure No.) |
|---|---|
| | |

SECTION II
COMPONENT REPLACEMENT

2.1 INTRODUCTION

This section contains procedures to replace defective components. Each procedure is self-contained and is supported by an illustration keyed to the procedure in sequence of disassembly. Use the troubleshooting procedures in Section I to determine which components are defective.

WARNING

HAZARDOUS VOLTAGES ARE ACCESSIBLE WITH MAINTENANCE PANELS REMOVED. FOLLOW SAFE WORK PRACTICES.

2.2 TOOLS

Recommended replacement tools are listed in Table 2-1. Equivalent items may be used.

Table 2-1. Replacement Tools

| Nomenclature | Part No. | Source |
|---|---|---|
| Screwdriver, flat blade, small | | Commercialy available |
| Wrench set, allen | | Commercialy available |
| Soldering iron, small | | Commercialy available |

2.3 SLICE COMPUTER (Figure 2-1)

2.3.1 Monitor.

a. Set power switch (1) on rear of monitor (2) to off.

b. Disconnect power cable (3) from monitor.

c. Use a small flat blade screwdriver to remove two connector screws and disconnect signal cable (4) from monitor.

d. Remove monitor.

e. Install new monitor.

f. Connect signal cable (4) to monitor and use a small flat blade screwdriver and install two connector screws.

g. Connect power cable (3) to monitor.

h. Set power switch (1) on rear of monitor to on.

2.3.2 Keyboard.

a. Set keyboard lockout keylock switch (5) on slice computer (6) to off.

b. Disconnect signal cable (7) from keyboard (8). The cable is terminated with a telephone jack.

c. Remove keyboard.

d. Install new keyboard.

e. Connect signal cable (7) to keyboard.

f. Set keyboard lockout keylock switch (5) on slice computer (6) to on.

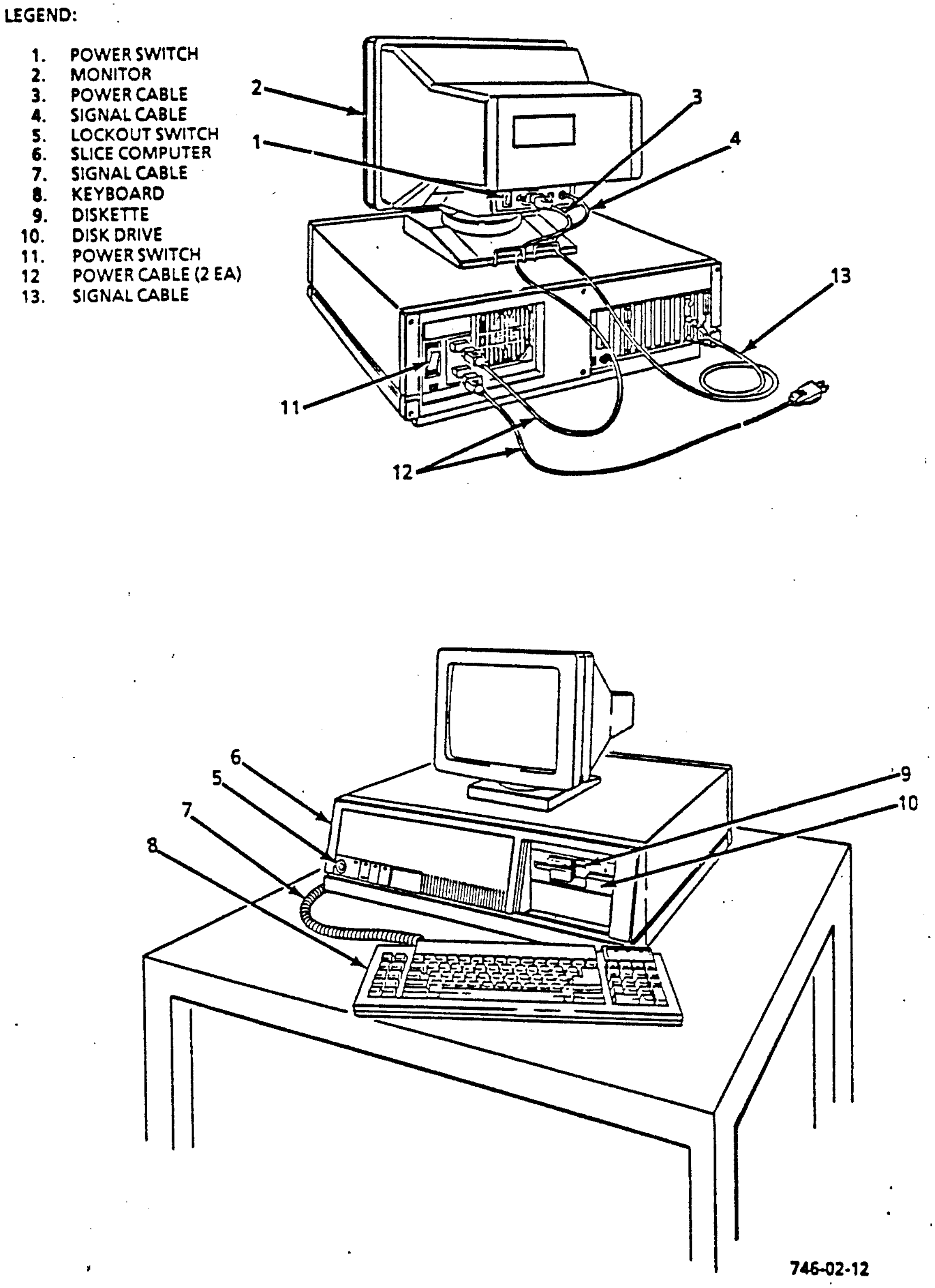
*Figure 2-1. Slice Computer Components*

2.3.3 Slice Computer.

CAUTION

Store the diskette in a safe place for protection.

a. Remove diskette (9) (if present) from disk drive (10).

b. Set keyboard lockout keylock switch (5) to off.

c. Set power switch (11) on rear panel to off.

d. Disconnect two power cables (12) (monitor power and ac input power) from rear panel.

e. Disconnect signal cable (7) (keyboard) from front panel.

f. Disconnect one signal cable (13) (monitor) and one coaxial cable (14) (Ethernet) from rear panel.

g. Remove slice computer (6).

h. Install new slice computer.

i. Connect signal cable (7) to front panel.

j. Connect one signal cable (13) and one coaxial cable (14) to rear panel.

k. Connect two power cables (12) to rear panel.

l. Set power switch (11) on rear panel to on.

m. Set keyboard lockout keylock switch (5) to on.

n. Install diskette (9) (if required) into disk drive (10).

2.4 ELECTRONIC CABINET ASSEMBLY (Figure 2-2)

2.4.1 Monitor.

a. Remove two screws (1) and remove cable access panel (2).

b. Set power switch (3) on rear of monitor (4) to off.

LEGEND:

1. SCREW (2 EA)
2. CABLE ACCESS PANEL
3. POWER SWITCH
4. MONITOR
5. POWER CABLE
6. SIGNAL CABLE
7. LOCKOUT SWITCH
8. PROCESS COMPUTER
9. SIGNAL CABLE
10. KEYBOARD
11. SCREW (4 EA)
12. ACCESS PANEL
13. POWER SWITCH
14. POWER CABLE (2 EA)
15. SIGNAL CABLE (3 EA)
16. COAXIAL CABLE
17. POWER SWITCH
18. LASER POWER SUPPLY
19. CABLE (3 EA)
20. CABLE (2 EA)
21. POWER SWITCH
22. ELEVATOR DRIVER
23. CABLE (2 EA)
24. CABLE
25. CIRCUIT BREAKER
26. POWER CABLE (4-6 EA)
27. AC POWER DISTRIBUTION PANEL
28. CABLE (4 EA)
29. SCREW (4 EA)
30. COVER
31. TERMINAL STRIP
32. SCREW (4 EA)
33. SCREW (6 EA)
34. DYNAMIC MIRRORS DRIVER
35. CABLE (4 EA)
36. POWER SWITCH

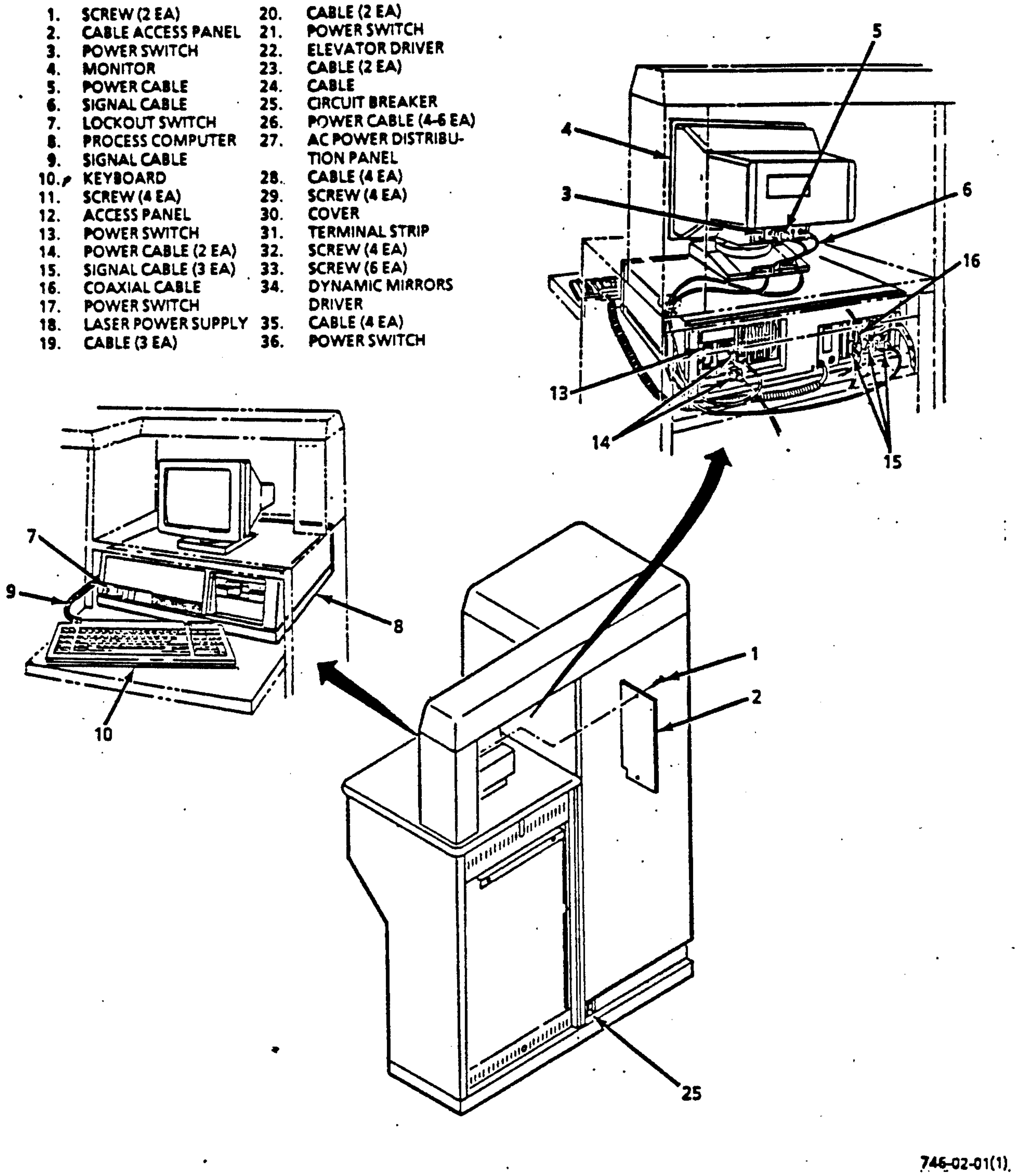

*Figure 2-2. Electronic Cabinet Components (Sheet 1 of 2)*

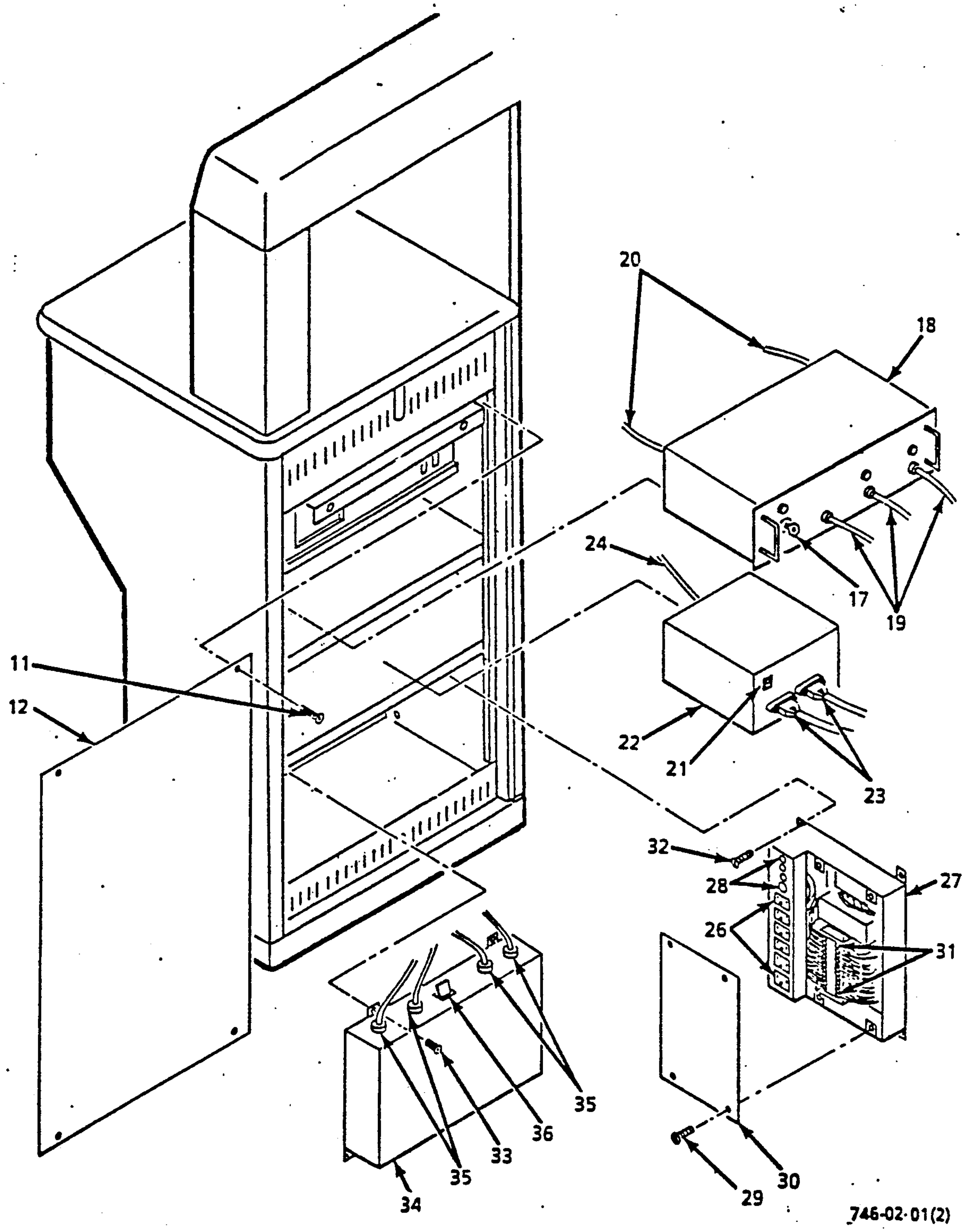
*Figure 2-2. Electronic Cabinet Components (Sheet 2 of 2)* c. Disconnect power cable (5) from monitor.

d. Use a small flat blade screwdriver to remove two connector screws and disconnect signal cable (6) from monitor.

e. Remove monitor.

f. Install new monitor.

g. Connect signal cable (6) to monitor and use a small flat blade screwdriver to install two connector screws.

h. Connect power cable (5) to monitor.

i. Set power switch (3) on rear of monitor to on.

j. Install cable access panel (2) and secure with two screws (1).

2.4.2 <u>Keyboard</u>.

a. Set keyboard lockout keylock switch (7) on process computer (8) to off.

b. Disconnect signal cable (9) from keyboard (10). The cable is terminated with a telephone jack.

c. Remove keyboard.

d. Install new keyboard.

e. Connect signal cable (9) to keyboard.

f. Set keyboard lockout keylock switch (7) on process computer (8) to on.

2.4.3 <u>Process Computer</u>.

a. Remove four screws (11) and remove access panel (12) from rear of electronic cabinet assembly.

b. Set keyboard lockout keylock switch (7) to off.

c. Set power switch (13) on rear panel to off.

d. Disconnect two power cables (14) (monitor power and ac input power) from rear panel.

e. Disconnect three signal cables (15) (keyboard, elevator driver, and dynamic mirrors driver) and one coaxial cable (16) (Ethernet) from rear panel.

f. Push process computer (8) out through front panel and remove.

g. Push new process computer through front panel.

h. Connect three signal cables (15) and one coaxial cable (16) to rear panel.

i. Connect two power cables (14) to rear panel.

j. Set power switch (12) on rear panel to on.

k. Set keyboard lockout keylock switch (7) to on.

l. Install access panel (12) on rear of cabinet and secure with two screws (11).

2.4.4 <u>Laser Power Supply</u>.

WARNING

IF THE HIGH VOLTAGE CONNECTORS ARE DISCONNECTED BEFORE POWER SWITCH IS TURNED OFF, HIGH-VOLTAGE ARCING WILL RESULT.

a. Remove four screws (11) and remove access panel (12) from rear of electronic cabinet assembly.

b. Set keylock POWER switch (17) on laser power supply (18) to off. Verify that POWER ON and two DISCHARGE ON indicators are extinguished.

c. Disconnect three cables (19) from unit.

d. Grasp laser power supply by two handles and slide out of cabinet just enough to gain access to two cables (20) on rear of unit.

e. Disconnect two cables (20) from rear of unit.

f. Remove laser power supply from cabinet.

g. Install new laser power supply (18) into cabinet just far enough to connect cables.

h. Connect two cables (20) to rear of unit.

i. Push laser power supply completely into cabinet.

j. Connect three cables (19) to unit.

k. Set keylock POWER switch (17) to on. Verify that POWER ON and two DISCHARGE ON indicators are illuminated.

l. Install access panel (12) on rear of cabinet and secure with four screws (11).

2.4.5 Elevator Driver.

a. Remove four screws (11) and remove access panel (12) from rear of electronic cabinet assembly.

b. Set power switch (21) on elevator driver (22) to OFF.

c. Loosen two screws from each connector and disconnect two cables (23) from unit.

d. Slide elevator driver out of cabinet just enough to gain access to cable (24) on rear of unit.

e. Disconnect cable (24) from rear of unit.

f. Remove elevator driver from cabinet.

g. Install new elevator driver (22) into cabinet just enough to connect cable.

h. Connect cable (24) to rear of unit.

i. Push elevator driver completely into cabinet.

j. Connect two cables (23) to unit and secure with two screws at each connector.

k. Set power switch (21) to on.

l. Install access panel (12) on rear of cabinet and secure with four screws (11).

2.4.6 <u>AC Power Distribution Panel</u>.

a. Turn off main circuit breaker (25) on bottom rear of electronic cabinet assembly.

b. Remove four screws (11) and remove access panel (12) from rear of electronic cabinet assembly.

c. Disconnect power cables (26) from connectors J1 through J6 on ac power distribution panel (27). Four to six cables will be present.

d. Disconnect cables (28) from Molex connectors J7 through J10 on unit.

e. Remove four screws (29) and remove terminal board access cover (30).

f. Disconnect wires from terminal strip (31) nearest rear of cabinet. Wires are marked and must be disconnected from terminals 1, 2, 3, 6, 9, 10, 11, and 12.

g. Remove four screws (32) (two top and two bottom) and remove ac power distribution panel from cabinet.

h. Install new ac power distribution panel (27) in cabinet and secure with four screws (32).

i. Remove four screws (29) and remove terminal board access cover (30).

j. Connect wires to terminal strip (31) nearest rear of cabinet. Connect wires to terminals 1, 2, 3, 6, 9, 10, 11, and 12 as marked.

k. Install terminal board access cover (30) and secure with four screws (29).

l. Connect cables (28) to Molex connectors J7 through J10.

m. Connect power cables (26) to connectors J1 through J6 as required.

n. Install access panel (12) on rear of cabinet and secure with four screws (11).

o. Turn on main circuit breaker (25).

2.4.7 Dynamic Mirrors Driver.

a. Remove ac power distribution panel (paragraph 2.4.6, steps a through g).

b. Remove six screws (33) (two top and four bottom) from dynamic mirrors driver (34) and tilt unit down to gain access to cables.

c. Remove four cables (35).

d. Remove dynamic mirrors driver from cabinet.

e. Install new dynamic mirrors driver (34) in cabinet.

f. Tilt unit downward and install four cables (35).

g. Place unit flush against cabinet and install six screws (33) (two top and four bottom).

h. Set power switch (36) to on.

i. Install ac power distribution panel (paragraph 2.4.6, steps h through o).

2.5 OPTICS ASSEMBLY (Figure 2-3)

2.5.1 Laser.

a. Set keylock POWER switch (17) on laser power supply (18) to off. Verify that POWER ON and two DISCHARGE ON indicators are extinguished.

b. Turn two allen screws (1) ccw to release (one on each end) and remove laser cover (2).

c. Remove four screws (11, Fig. 2-2) and remove access panel (12) from rear of electronic cabinet assembly.

d. Disconnect three cables (19) from laser power supply.

e. Remove two screws (1) and remove cable access panel (2).

f. Pull three cables up through cable access hole.

g. Remove four cap screws (3, Fig. 2-3) from laser (4) (two front and two back).

h. Loosen allen screw (5) and remove interlock switch (6) from rear of laser.

i. Lift laser and remove from cabinet.

j. Install new laser (4) on cabinet and secure with four cap screws (3).

k. Install interlock switch (6) on rear of laser and tighten allen screw (5).

l. Push three cables (19, Fig. 2-2) through cable access hole to laser power supply (18).

m. Install cable access panel (2) on cabinet and secure with two screws (1).

LEGEND:
1. SCREW (2 EA)
2. LASER COVER
3. SCREW (4 EA)
4. LASER
5. SCREW
6. INTERLOCK SWITCH
7. SCREW (2 EA)
8. OPTICS COVER
9. SHUTTERS
10. SCREW (2 EA)
11 THUMBSCREW
12. BEAM-TURNING MIRROR
13. SCREW (4 EA)
14. BEAM EXPANDER
15. SCREW (2 EA)
16. DYNAMIC MIRRORS
17. SCREW (2 EA)
18. INTERLOCK SWITCH
19. SCREW (2 EA)
20. INTERLOCK SWITCH (2 EA)
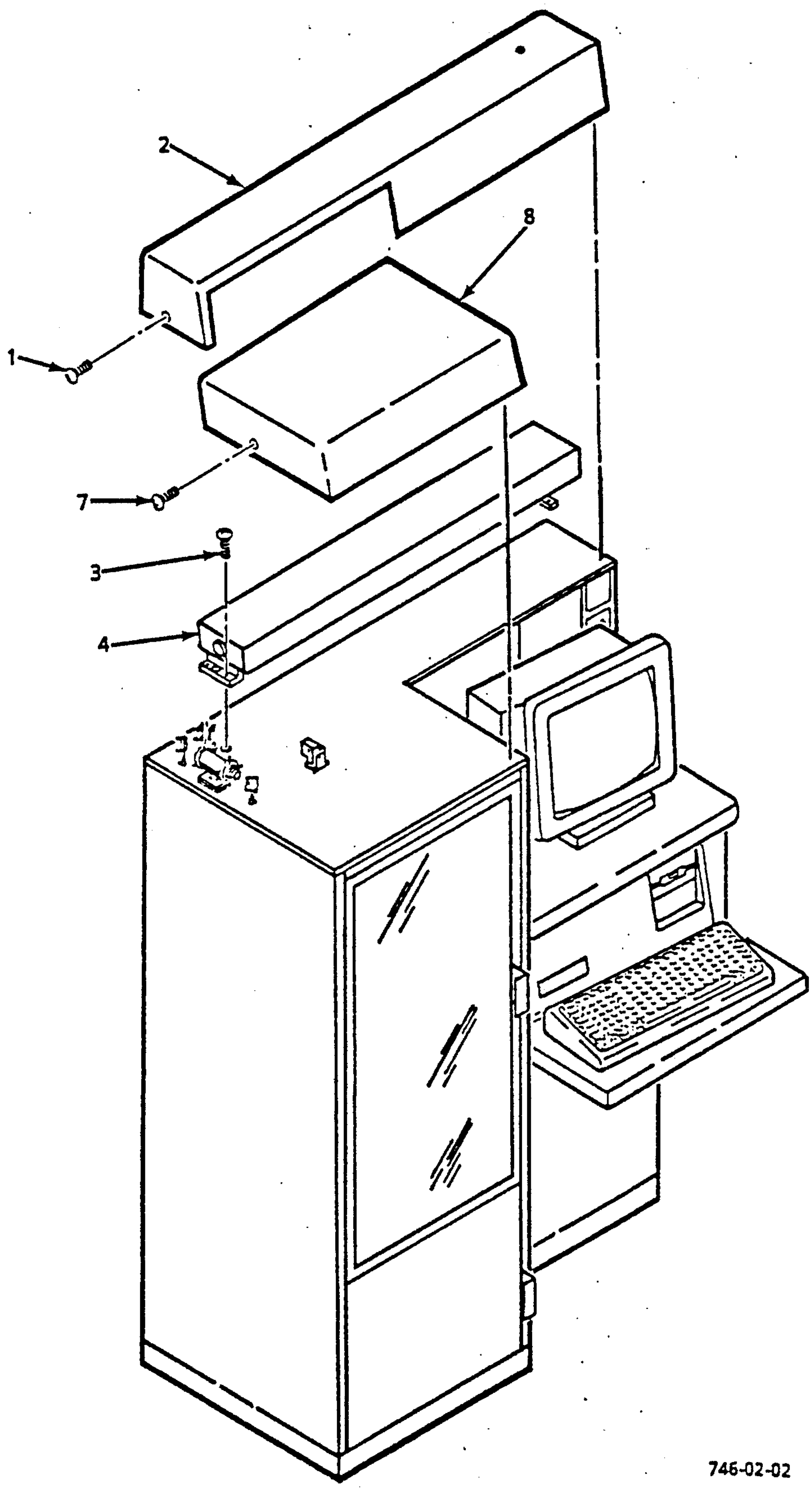
*Figure 2-3. Optics Components (Sheet 1 of 2)*

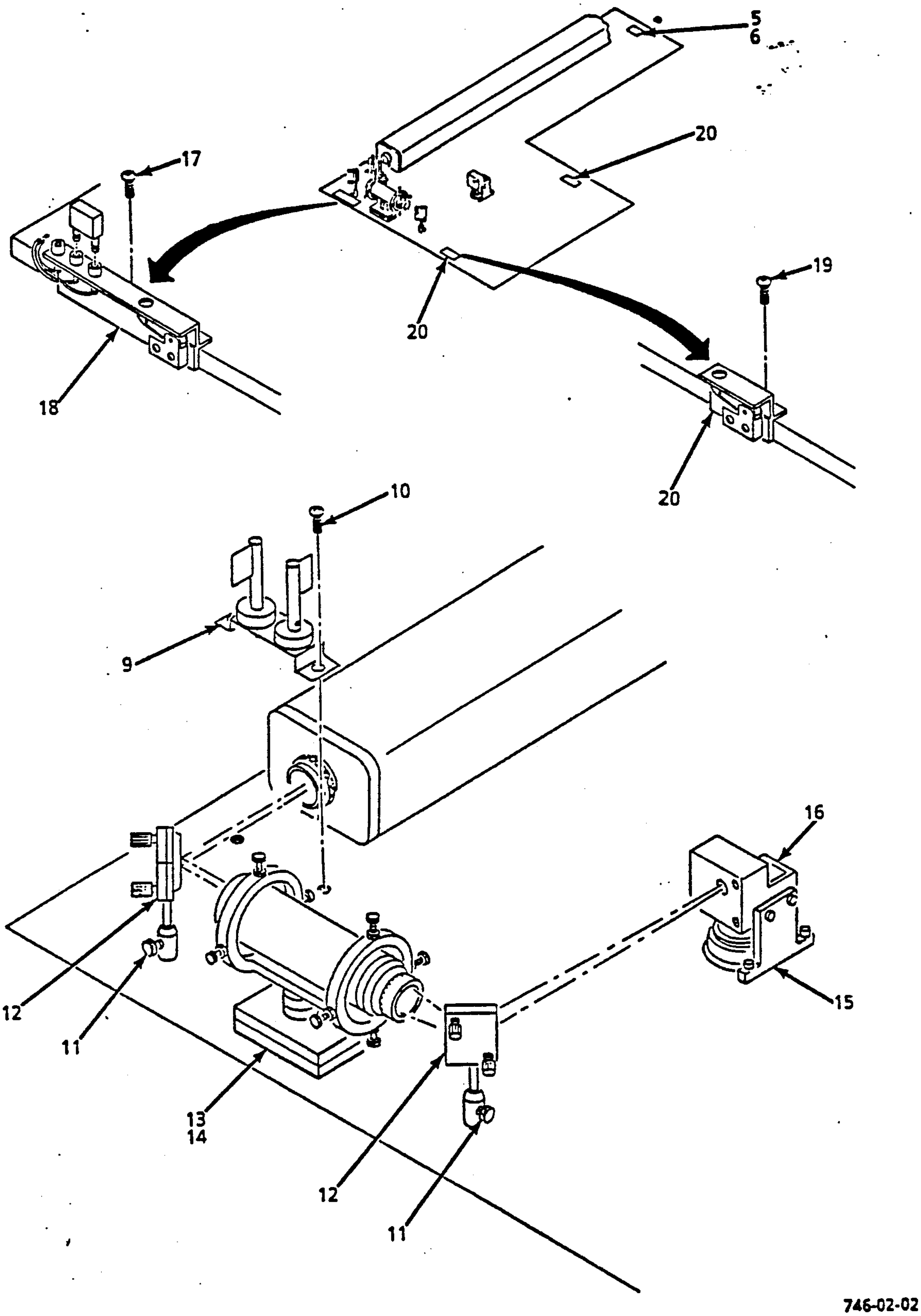
*Figure 2-3. Optics Components (Sheet 2 of 2)* n. Connect three cables (19) to laser power supply.

o. Set keylock POWER switch (17) on laser power supply to on. verify that POWER ON and two DISCHARGE ON indicators are illuminated.

p Install access panel (12) on rear of cabinet and secure with four screws (11).

q. Align laser mirrors (paragraph 3.3).

r. Install laser cover (2, Fig. 2-3) and turn two allen screws (1) cw to latch.

2.5.2 Shutters.

a. Turn two allen screws (7) ccw to release (one on each end) and remove optics cover (8).

c. Tag and unsolder wires from shutters (9).

d. Remove two allen screws (10) and remove shutters.

e. Solder wires to new shutters (9).

f. Install shutters and secure with two allen screws (10).

g. Install optics cover (8) and turn two allen screws (7) cw to latch.

2.5.3 Beam-Turning Mirrors.

a. Turn two allen screws (7) ccw to release (one on each end) and remove optics cover (8).

b. Loosen thumbscrew (11) and lift beam-turning mirror (12) straight up.

c. Install new beam-turning mirror (12) and tighten thumbscrew (11).

d. Align beam-turning mirrors (paragraph 3.4).

e. Install optics cover (8) and turn two allen screws (7) cw to latch.

2.5.4 Beam-Expander.

a. Turn two allen screws (7) ccw to release (one on each end) and remove optics cover (8).

b. Remove four allen screws (13) and lift beam expander (14) straight up.

c. Install new beam expander (14) and secure with four allen screws (13).

d. Install optics cover (8) and turn two allen screws (7) cw to latch.

2.5.5 Dynamic Mirrors.

a. Turn two allen screws (7) ccw to release (one at each end) and remove optics cover (8).

b. Remove four screws (11, Fig. 2-2) and remove access panel (12) from rear of electronic cabinet assembly.

c. Set power switch (35) on dynamic mirrors driver (33) to off.

d. Disconnect two outer cables (34) from dynamic mirrors driver.

e. Remove two screws (1) and remove cable access panel (2).

f. Pull two cables (34) up through cable access hole.

g. Remove two allen screws (15, Fig. 2-3) and lift dynamic mirrors (16) straight up from cabinet.

h. Install new dynamic mirrors (16) on cabinet and secure with two allen screws (15).

i. Push two cables (34, Fig. 2-2) through cable access hole to dynamic mirrors driver (33).

j. Install cable access panel (2) on cabinet and secure with two screws (1).

k. Connect two cables to dynamic mirrors driver.

l. Set power switch (35) on dynamic mirrors driver to on.

m. Install access panel (12) on rear of cabinet and secure with four screws (11).

n. Align beam-turning mirrors (paragraph 3.4).

o. Install optics cover (8, Fig. 2-3) and turn two allen screws (7) cw to latch.

2.5.6 Interlock Switches.

2.5.6.1 Laser Cover.

a. Turn two allen screws (1) ccw to release (one at each end) and remove laser cover (2).

b. Loosen one allen screw (5) and lift interlock switch (6) from rear of laser (4).

c. Tag and unsolder wires from switch.

d. Loosen two allen screws (17) and lift dual interlock switch (18) from cabinet.

e. Tag and unsolder wires from switch.

f. Solder wires to new interlock switch (6).

g. Install switch on rear of laser (4) and tighten one allen screw (5).

h. Solder wires to new dual interlock switch (18).

i. Install switch on cabinet and tighten two allen screws (17).

j. Install laser cover (2) and turn two allen screws (1) cw to latch.

2.5.6.2 Optics Cover.

a. Turn two allen screws (7) ccw to release (one at each end) and remove optics cover (8).

b. Loosen two allen screws (19) (one for each switch) and lift interlock switch (20) from cabinet.

c. Tag and unsolder wires from switches.

d. Solder wires to new interlock switches (20).

e. Install switches on cabinet and tighten two allen screws (19) (one for each switch).

f. Install optics cover (8) and turn two allen screws (7) cw to latch.

2.6 CHAMBER ASSEMBLY (Figure 2-4)

2.6.1 Heater/Fan.

a. Open chamber door (1).

b. Remove air filter (paragraph 2.6.1, steps a and b).

c. Set main circuit breaker on bottom rear of electronic cabinet assembly to off.

LEGEND:
1. CHAMBER DOOR
2. SCREW (2 EA)
3. BOTTOM COVER
4. HEATER/FAN
5. TERMINAL STRIP
6. SCREW (4 EA)
7. SIDE SHELF (2 EA)
8. KNOB (2 EA)
9. PLATFORM ROD (2 EA)
10. REACTION VAT
11. LID
12. LATCH (4 EA)
13. DRAIN VALVE
14. COLLECTION BOTTLE
15. SIDE HANDLE (2 EA)
16. SCREW (2 EA)
17. PLATFORM
18. CABLE
19. SCREW
20. CABLE CLAMP
21. SCREW (4 EA)
22. ELEVATOR
23. CHAMBER CABLE
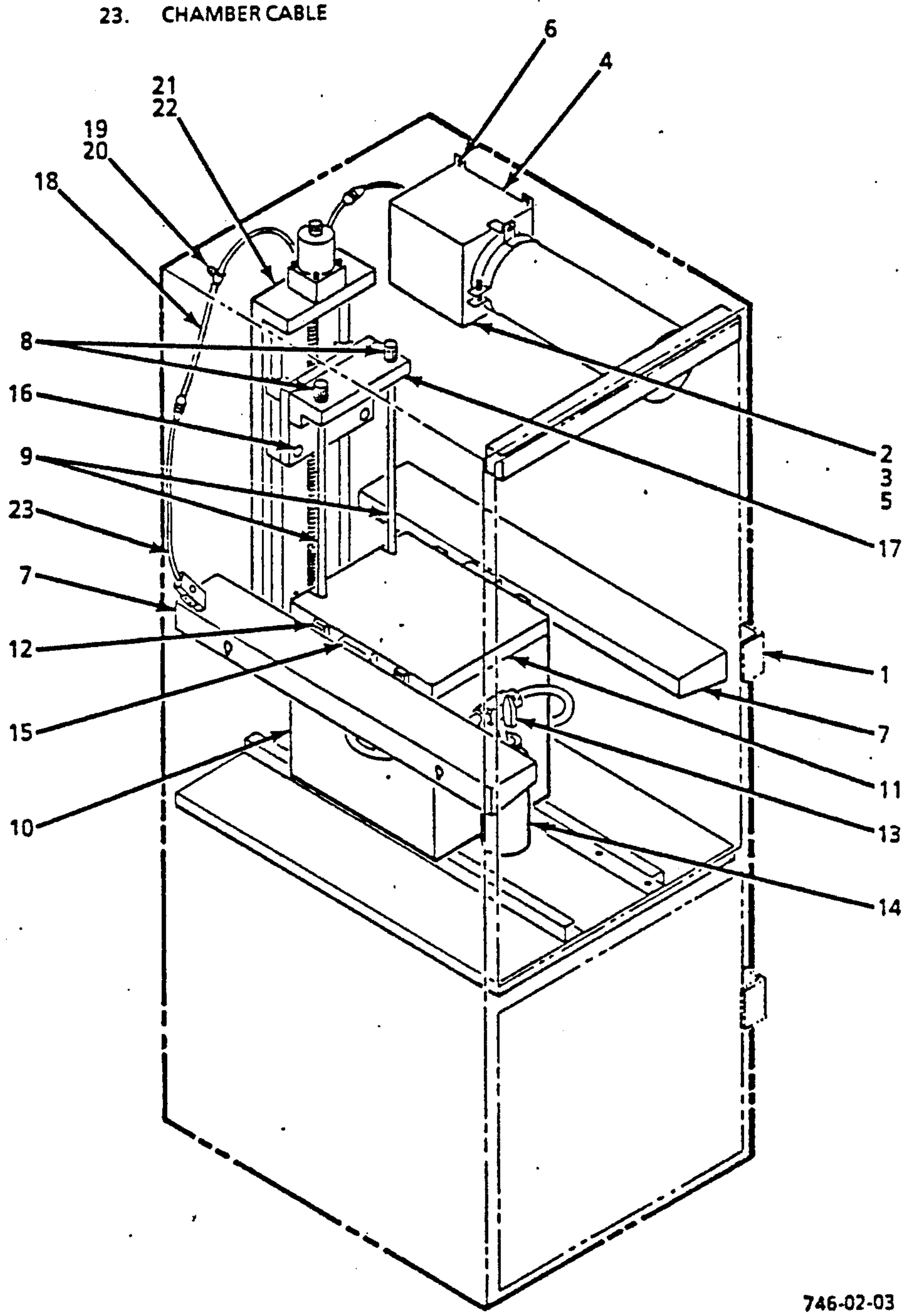
*Figure 2-4. Chamber Components* d. Remove four screws (2) and remove bottom cover (3) on heater/fan (4).

e. Disconnect three wires from terminal strip (5). The wires are marked.

f. Remove four screws (6) and remove heater/fan (4) from chamber.

h. Install new heater/fan (4) in chamber and secure with four screws (6).

g. Remove four screws (2) and remove bottom cover (3) from new heater/fan.

i. Connect three wires as marked to terminal strip (5).

j. Install bottom cover (3) on heater/fan and secure with four screws (2).

k. Set main circuit breaker on electronic cabinet assembly to on.

l. Install air filter (paragraph 2.6.1, steps c and d).

m. Close chamber door (1). Verify that fan is turning.

2.6.2 Reaction Vat.

a. Open chamber door (1).

b. Remove two side shelves (7) by lifting shelves to disengage from attaching screws.

c. Unscrew two knobs (8) to disengage platform rods (9) from vat (10).

d. Install lid (11) on vat and secure four latches (12).

e. Turn off drain valve (13) and remove collection bottle (14).

f. Grasp vat by two side handles (15) and slide out of chamber.

g. Clean resin from platform rods (9) (refer to User's Manual).

h. Slide new vat (10) into chamber.

i. Remove lid (11) from vat by releasing four snap fasteners.

j. Screw two knobs (8) to engage platform rods (9) to vat.

k. Place collection bottle (14) under valve (13) and turn on drain valve.

l. Fill vat with resin (refer to User's Manual).

m. Installl two side shelves (7).

n. Close chamber door (1).

2.5.3 Platform.

a. Open chamber door (1).

b. Remove two screws (16).

c. Unscrew two knobs (8) to disengage platform rods (9) from vat (10) and lift platform (17) straight out of chamber.

d. Install new platform (17) in chamber and screw two knobs (8) to engage platform rods (9) to vat (10).

e. Install two screws (16).

f. Close chamber door (2).

2.6.4 Elevator.

a. Open chamber door (1).

b. Disconnect cable (18) from left side of chamber.

c. Remove one screw (19) and remove cable clamp (20).

d. Remove platform (paragraph 2.6.3, steps a through c).

e. Remove four allen screws (21) and pull elevator (22) and cable straight out of chamber.

f. Install new elevator (22) in chamber and secure with four allen screws (21).

g. Install platform (paragraph 2.6.3, steps d through f).

h. Install cable clamp (20) on cable (18) and secure to cable and clamp to chamber with one screw (19).

i. Connect elevator cable (18) to chamber cable (23).

j. Close chamber door (1).

2.6.6 Beam Profiler. It is extremely difficult to remove the beam profiler in the Beta Site systems. Therefore, it is recommended that this unit not be removed. The SLA-1 can still operate even though the beam profiler is defective.

SECTION III
ALIGNMENT

3.1 INTRODUCTION

This section contains procedures to align the laser, optics, and chamber. These procedures must be performed when the optics or laser is replaced, or when these items become misaligned through normal wear.

3.2 TOOLS AND EQUIPMENT

Recommended alignment tools and equipment are listed in Table 3-1. Equivalent items may be used.

Table 3-1. Alignment Tools and Equipment

| Nomenclature | Model/Part No. | Source |
|---|---|---|
| Ball driver, allen (2 ea) | | Commercialy available |
| Power meter, laser | | Liconix |
| T-square | | Commercialy available |
| Caliper | | Commercialy available |
| Tape, scotch | | Commercialy available |
| Plumb bob | | Commercialy available |
| Alignment tool, vertical | | 3D Systems |
| Level, precision | | Commercialy available |
| Wrench set, allen | | Commercialy available |

3.3 LASER RESONATOR (Figure 3-1)

This is a very touchy alignment which should only be performed when laser power or beam shape has deteriorated. Two allen ball drivers (5/64 inch) and a laser power meter are required to perform this procedure.

a. Remove optics cover and laser cover.

b. Remove two screws and remove shutter assembly.

c. Place laser power meter to interrupt laser beam.

d. Insert one ball driver in upper rear laser adjustment hole and second ball driver in upper front laser adjustment hole.

e. Observe laser power meter and detune (turn 1/10 turn ccw) rear laser mirror adjustment.

f. Tune front laser mirror adjustment to maximize power. Adjust in small increments only.

g. Detune rear laser mirror (turn 1/10 turn cw) adjustment and repeat step f.

h. Repeat steps e and f several times until maximum power is obtained.

i. Place a card in front of the laser power meter and note shape of laser beam. The beam should be relatively round. If not, repeat steps e through h several times for a round beam shape at maximum power.

j. Carefully remove both ball drivers and remove card.

k. Insert one ball driver in lower rear laser adjustment hole and second ball driver in lower front laser adjustment hole.

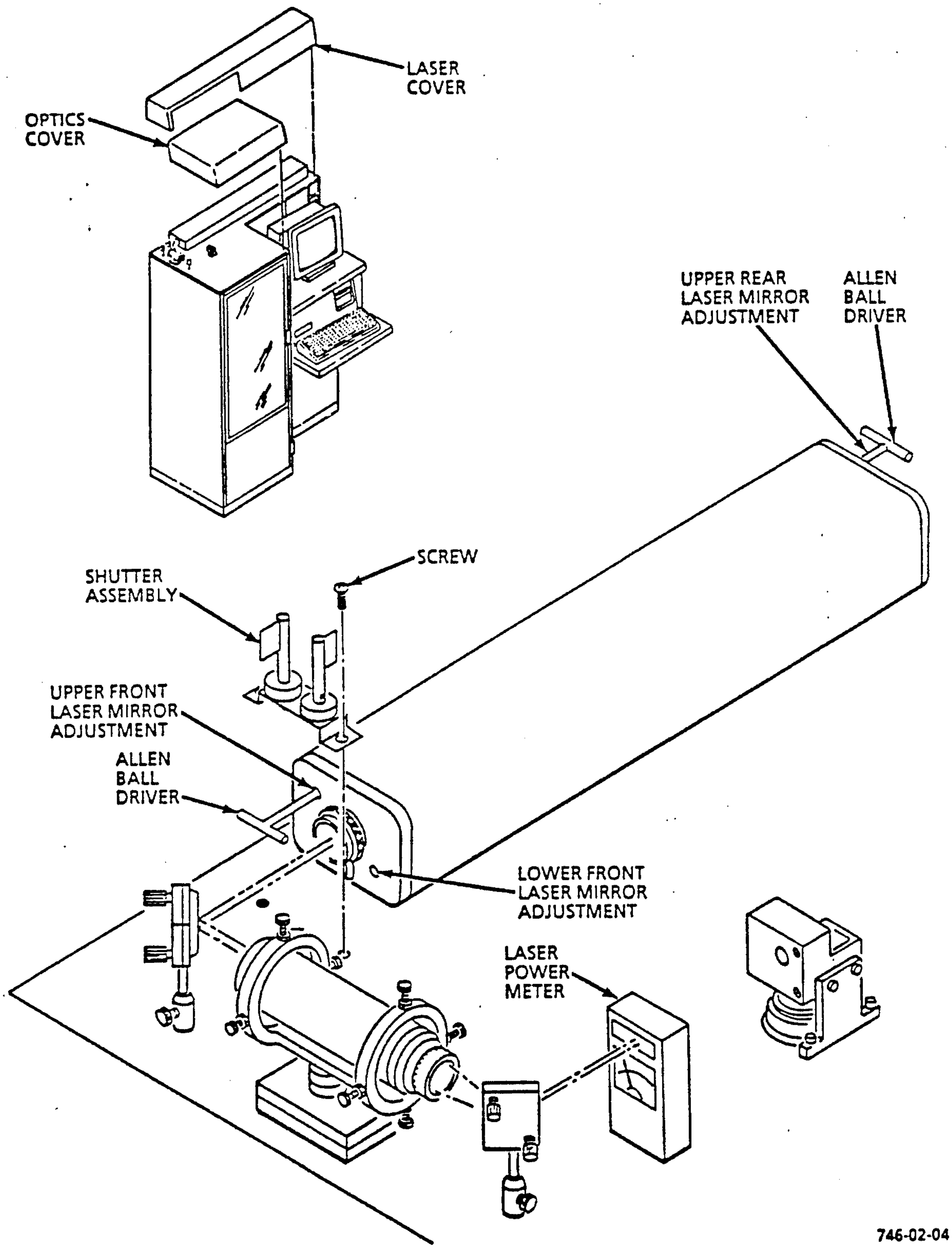
*Figure 3-1. Laser Resonator Alignment* l. Repeat steps e through i several times until a round beam shape at maximum power is obtained.

m. Repeat upper and lower laser mirror adjustment several times to optimize laser power and beam shape.

n. Carefully remove both ball drivers and remove card.

o. Remove laser power meter.

p. Install shutter assembly and secure with two screws.

q. Install optics cover and laser cover.

3.4 OPTICS (Figure 3-2)

WARNING

UV LASER RADIATION MAY DAMAGE EYE TISSUE. AVOID DIRECT EXPOSURE TO LASER BEAM. WEAR SAFETY GLASSES.

CAUTION

Fingerprints may damage optics coatings. Clean hands thoroughly and strictly avoid touching optical surfaces.

a. Remove optics cover.

b. Loosen two adjustment screws (front and rear) and slide beam expander out and remove.

c. Adjust two each adjustment screws on two beam-turning mirrors and adjust mirrors so that laser beam strikes center of both mirrors and center window of dynamic window.

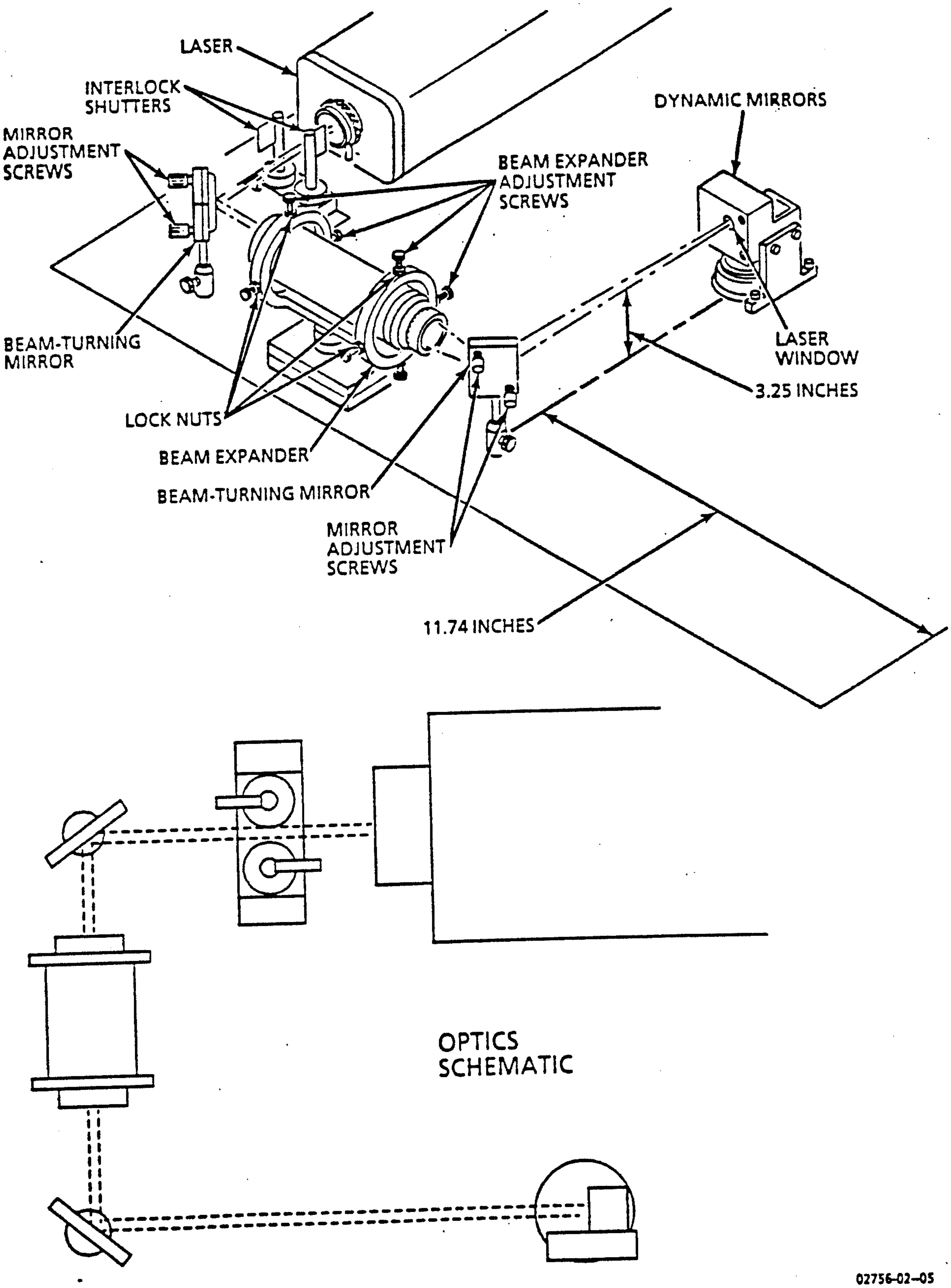
*Figure 3-2. Optics Alignment* d. Use a T-square to check that beam path between second beam turning mirror and dynamic mirror is exactly 3.25 inch above optic plate along entire beam path. Use a set of calipers to take measurements.

e. Adjust two adjustment screws on second beam-turning mirror to achieve correct value.

f. Use a 12-inch set of calipers to check that beam path between second beam-turning mirror and dynamic mirror is exactly 11.74 inch from beam path to front edge of optic plate along entire beam path.

g. Adjust two adjustment screws on second beam-turning mirror to achieve correct value.

h. Repeat steps d through g several times for optimim vertical and horizontal alignment.

i. Put transparent scotch tape over input and exit apertures of beam expander. Make sure that tape does not contact lenses.

j. Install beam expander.

k. Adjust beam expander adjustment screws so that laser beam is centered as close as possible at input and exit apertures. Do not adjust any mirrors, only the beam expander. The position of the beam as it strikes the second beam-turning mirror and dynamic mirror should not change after installation of beam expander.

l. Tighten lock nuts on beam expender adjustment screws.

m. Remove scotch tape from beam expander apertures.

n. Install optics cover.

3.5 CHAMBER (Figure 3-3)

3.5.1 Vertical Alignment of Elevator. The perfect alignment of the elevator axis with the Vertical is critical for building of accurate stereolithographic parts. Any off-vertical alignment of components will result in a vertical skew of every part built with the SLA-1.

a. Remove reaction vat and platform (Section II).

b. On bottom of cabinet, raise up floor adjustment foot number 4 to balance cabinet on three feet.

c. Remove two allen screws and remove optic cover.

d. Open chamber door.

e. Remove two inside screws and lower optic window mount from inside chamber.

f. Suspend a plumb bob from center of optic window aperture.

g. Adjust height of string until top of plumb bob exactly touches floor of chamber.

h. Place a sheet of paper on bottom of chamber and mark plumb bob position exactly.

i. Install vertical alignment tool and place string against vertical string groove.

j. Run elevator up and down while observing plumb bob for lateral movement.

k. If plumb bob moves off from spot marked in step g, adjust chamber floor adjustment cabinet feet (1, 2, and 3) for best vertical alignment.

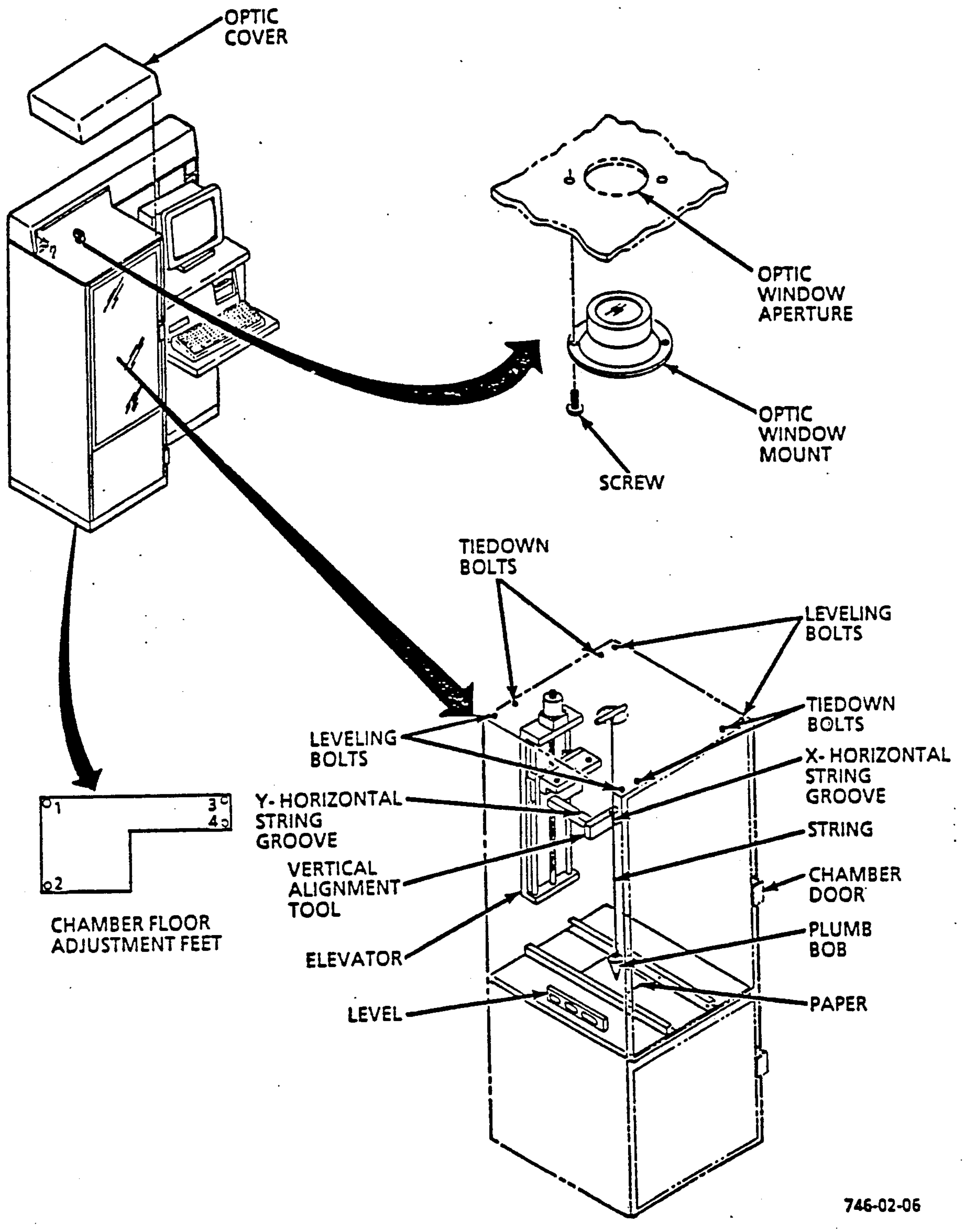
*Figure 3-3. Chamber Alignment* l. Place string against horizontal string groove and mark plumb bob position.

m. Repeat steps j and k.

n. Repeat steps i through m several times until optimum leveling is achieved.

o. Lower foot number 4 to floor level. (Be careful not to upset leveling.)

p. Remove vertical alignment tool and plumb bob.

q. Install optic window mount by installing two screws inside chamber.

r. Close chamber door.

s. Install platform and reaction vat (Section II).

3.5.2 Horizontal Alignment of Optics Plate. Do not use the adjustable feet of the SLA-1 for horizontal alignment. This will upset the vertical alignment of the elevator.

a. Loosen four tiedown bolts on optic plate.

b. Place a precision level on optics plate.

c. Adjust four levelling bolts for optimum horizontal level at all points of the optics plate.

d. Tighten tiedown bolts.

SECTION IV
SPARE PARTS LISTS

4.1 INTRODUCTION

This section contains an exploded view illustration and listing of each authorized spare part.

4.2 HOW TO USE THIS SECTION a. Locate the defective part or assembly in which the part is located in Figure 4-1. Note the index number.

NOTE

The SLA-1 is arranged into three major assemblies or component groups: the electronic cabinet assembly, the optics assembly, and the chamber assembly. These assemblies and components are illustrated and listed in Figure 4-1. Subassemblies and detail parts are listed in parts lists 4-2 through 4-4.

b. Locate the index number in the parts list for Figure 4-1 and note the part number, nomenclature and source for replaceable parts, or the figure number in which the replaceable parts are listed. Assemblies containing replaceable parts are listed for reference purposes only and are identified by the abbreviation REF in the Units Per Assy column.

c. Repeat steps a and b to locate subassemblies and detail parts in the referenced parts list.

d. Order replacement parts from the listed manufacturer in accordance with the instructions in paragraph 4.3.

4.3 MANUFACTURER'S NAMES AND ADDRESSES

SLA component manufacturers are listed in Table 4-1. When ordering spare parts, specify the part number, nomenclature, and quantity required. Always inform your 3-D Systems project engineer first if problems arise. He will usually be able to arrange to acquire the necessary parts. The manufacturers of SLA-1 components and subassemblies are listed for convenience.

Table 4-1. Vendor Names and Addresses

| Manufacturer | Address and Telephone |
|---|---|
| 3D Systems, Inc. | 12847 Arroyo St.<br>Sylmar, CA 91342<br>(818) 898-1533<br>FAX (818) 361-5484 |
| General Scanning, Inc. | 500 Arsenal St.<br>Watertown, MA 02272<br>(617) 924-1010 |
| Liconix | 1390 Borregas Ave.<br>Sunnyvale, CA 94089<br>(408) 734-4331<br>TWX 910-379-6475 |
| Newport Corp. | 18235 Mount Baldy Circle<br>Fountain Valley, CA 92728-8020<br>(714) 963-9811 |
| Wyse Technology | 3571 North First St.<br>San Jose, CA 95134<br>(408) 433-1026 |

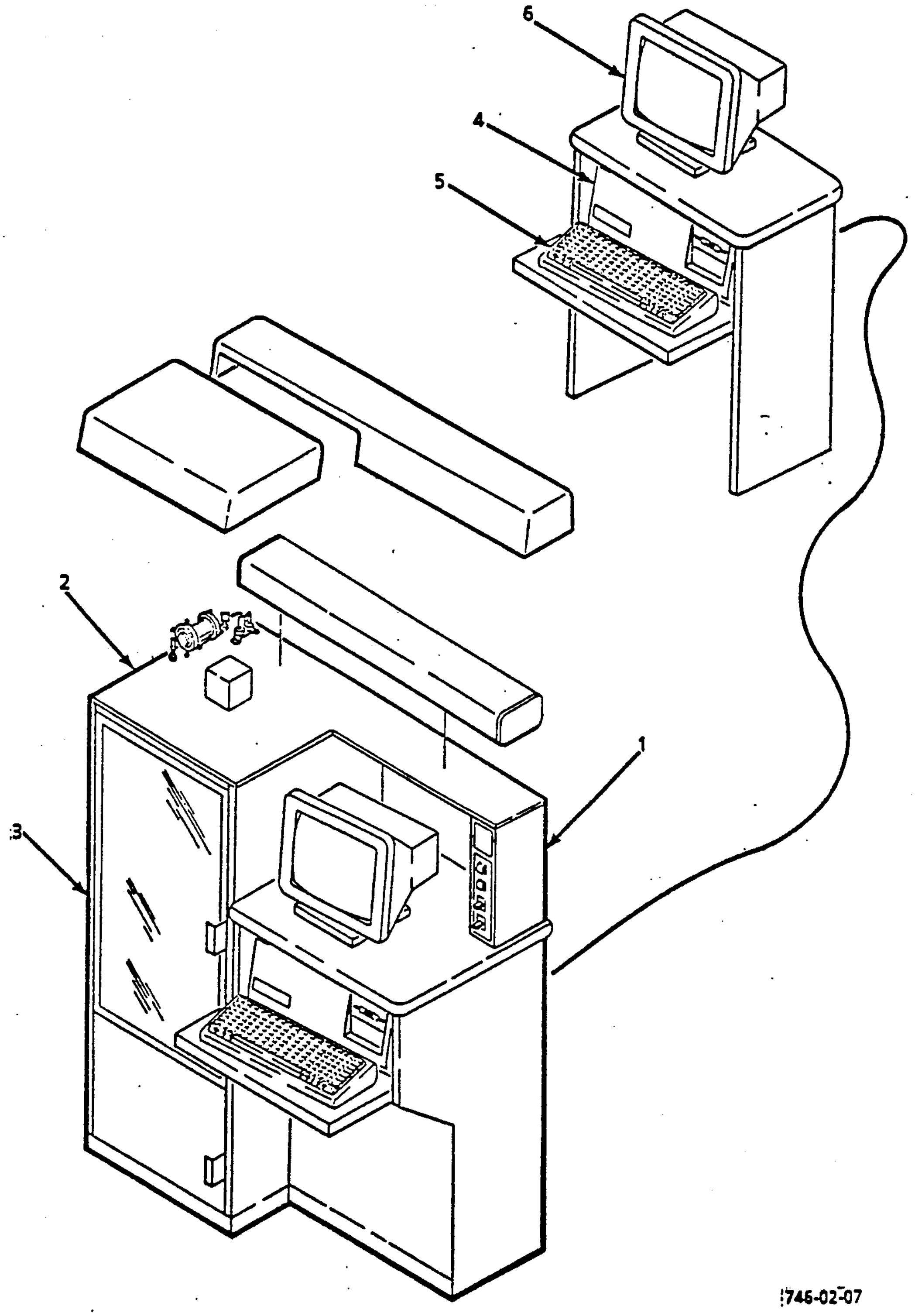
*Figure 4-1. SLA-1 Stereolithography System*

| Figure & Index Number | Part Number | Description 1 2 3 | Units Per Assy | Manufacturer |
|---|---|---|---|---|
| 4-1 | | SLA-1 STEREOLITHOGRAPHY SYSTEM, Beta Site | | |
| 1 | 16135 | • CABINET ASSY, Electronic (See Figure 4-2 for detail parts) | 1 | 3D Systems |
| 2 | 4240NB | • OPTICS ASSY (See Figure 4-3 for detail parts) | 1 | 3D Systems |
| 3 | | • CHAMBER ASSY (See Figure 4-4 for detail parts) | 1 | 3D Systems |
| 4 | PC 386 | • COMPUTER ASSY, Slice | | Wyse |
| 5 | | • KEYBOARD | | Wyse |
| 6 | | • MONITOR | | Wyse |

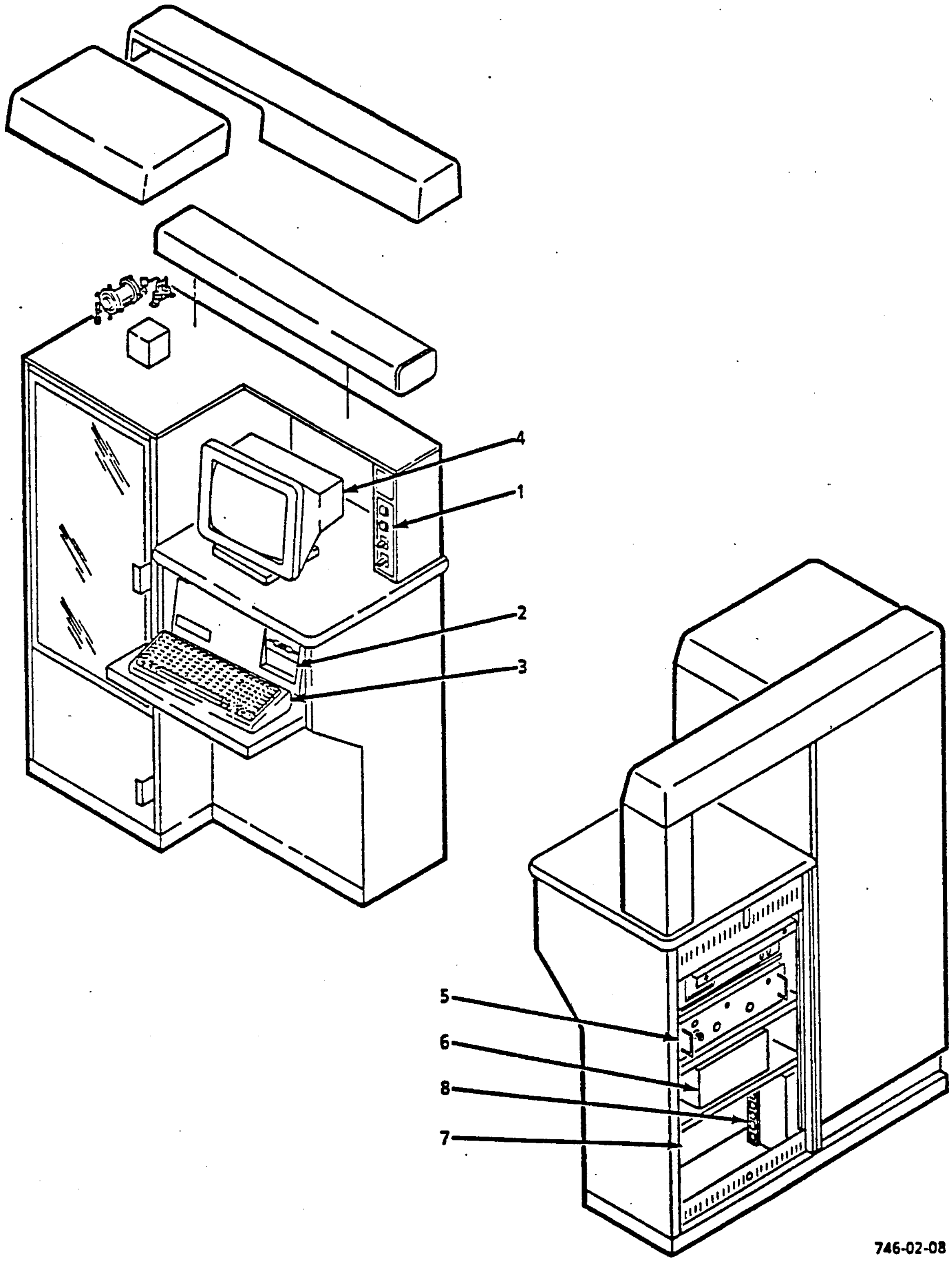
*Figure 4-2. Electronic Cabinet Assembly*

| Figure & Index Number | Part Number | Description 1 2 3 | Units Per Assy | Manufacturer |
|---|---|---|---|---|
| 4-2 | | CABINET ASSY, Electronic (See Figure 4-1 for next higher assembly) | REF | |
| 1 | 16180 | • PANEL ASSY, Control | 1 | 3D Systems |
| 2 | PC 286 | • COMPUTER ASSY, Process | 1 | Wyse |
| 3 | | • KEYBOARD | 1 | Wyse |
| 4 | | • MONITOR | 1 | Wyse |
| 5 | 16033 | • POWER SUPPLY, Laser | 1 | 3D Systems |
| 6 | 16032 | • DRIVER, Elevator | 1 | 3D Systems |
| 7 | | • DRIVER, Dynamic Mirrors | 1 | 3D Systems |
| 8 | 16130 | • PANEL, AC Power Distribution | 1 | 3D Systems |

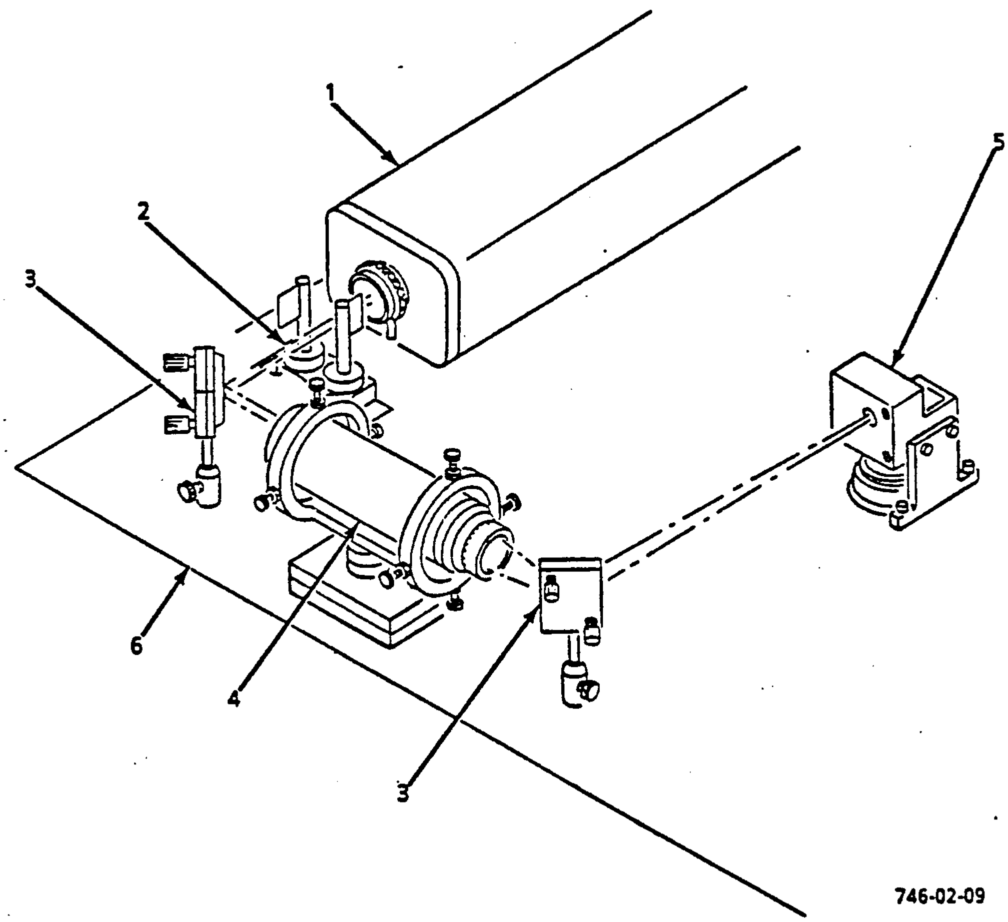
*Figure 4-3. Optics Assembly*

| Figure & Index Number | Part Number | Description 1 2 3 | Units Per Assy | Manufacturer |
|---|---|---|---|---|
| 4-3 | | OPTIC ASSY (See Figure 4-1 for next higher assembly) | REF | |
| 1 | | • LASER ASSY | 1 | Liconix |
| 2 | 16160 | • SHUTTER ASSY | 1 | 3D Systems |
| 3 | | • MIRROR ASSY, Beam Turning | 2 | Newport Corp. |
| 4 | D10493(4X) | • BEAM EXPANDER | 1 | 3D Systems |
| 5 | Z2173 | • MIRROR ASSY, Dynamic | 1 | General Scanning |
| 6 | 16175 | • PLATE ASSY, Optics | 1 | 3D Systems |

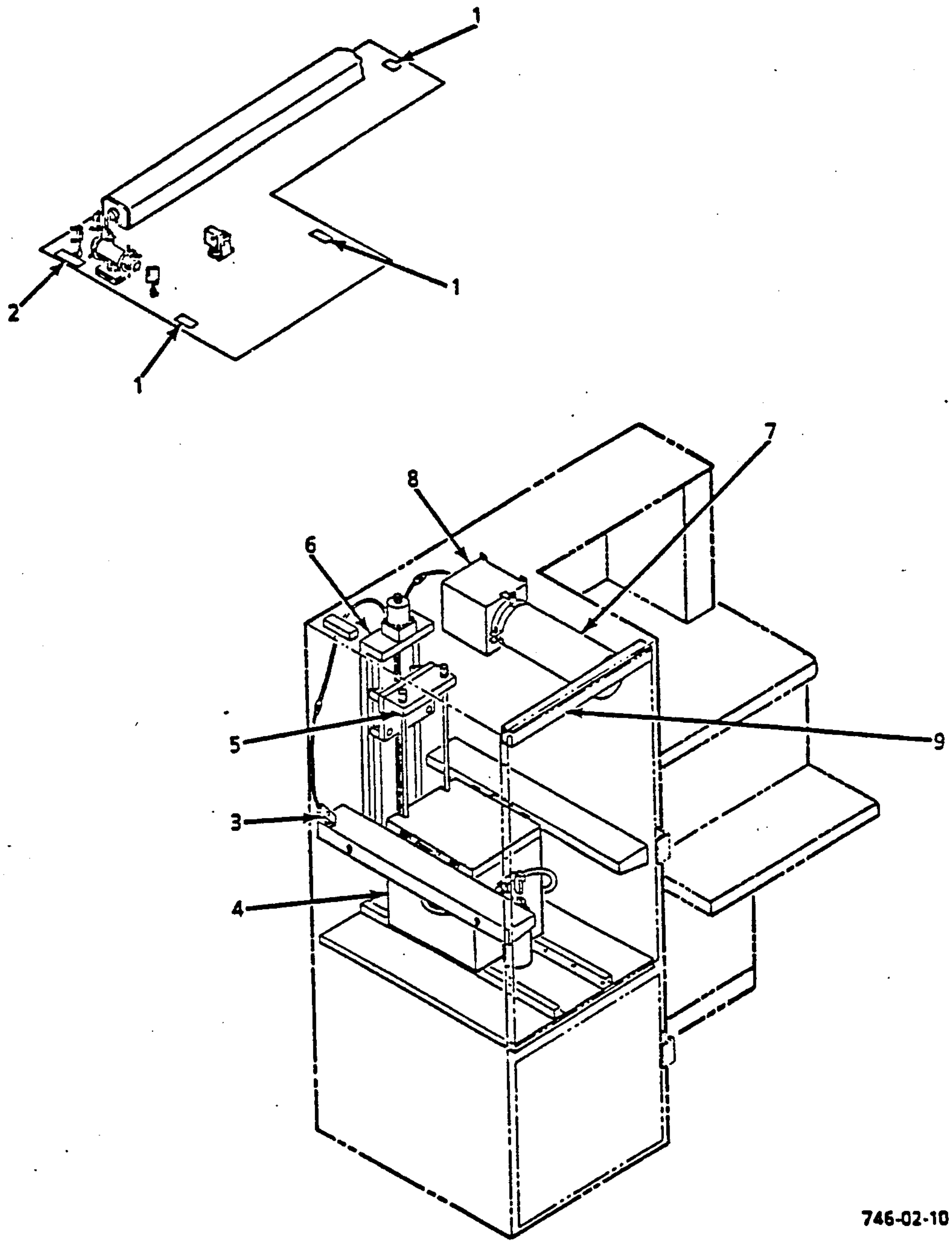
*Figure 4-4. Chamber Assembly*

| Figure & Index Number | Part Number | Description 1 2 3 | Units Per Assy | Manufacturer |
|---|---|---|---|---|
| 4-4 | | CHAMBER ASSY (See Figure 4-1 for next higher assembly) | REF | |
| 1 | 16175 | • SWITCH ASSY, Interlock | 3 | 3D Systems |
| 2 | 16170 | • DEFEAT ASSY, Interlock | 1 | 3D Systems |
| 3 | | • PROFILER ASSY, Beam | 1 | 3D Systems |
| 4 | 16115 | • VAT ASSY | 1 | 3D Systems |
| 5 | | • ELEVATOR ASSY, Z-Stage | 1 | 3D Systems |
| 6 | | • PLATFORM ASSY | 1 | 3D Systems |
| 7 | 16125 | • FILTER ASSY, Air | 1 | 3D Systems |
| 8 | | • HEATER/FAN ASSY | 1 | 3D Systems |
| 9 | | • LIGHT | 1 | 3D Systems |

SECTION V
WIRING DIAGRAM

5.1 INTRODUCTION

This section contains a wiring diagram to aid in troubleshooting and continuity tests.

5.2 WIRE LIST AND DIAGRAM

All SLA-1 cables and interconnections between components and subassemblies are shown in the wiring diagram (Figure 5-1).

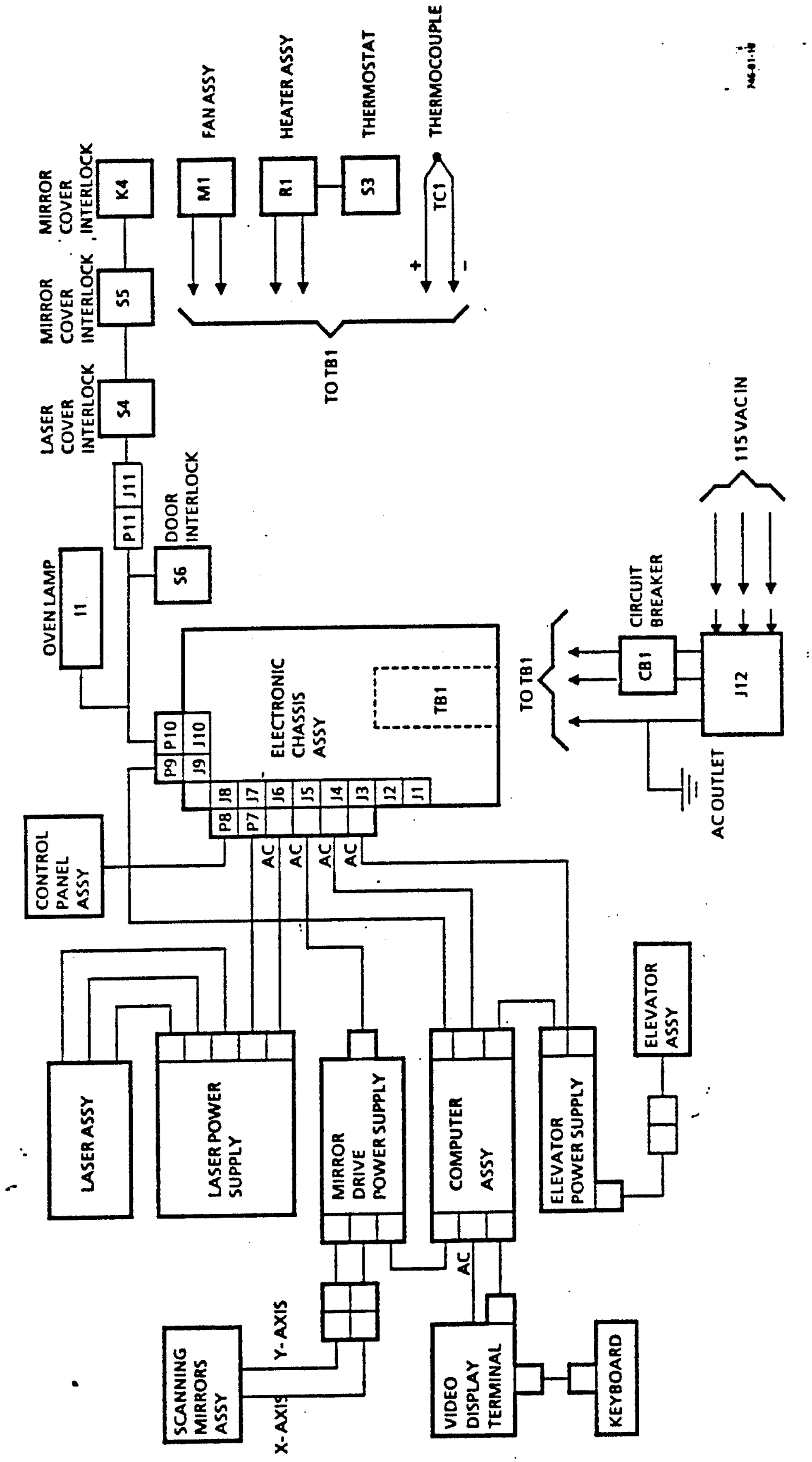
*Figure 5-1. SLA-1 Wiring Diagram*

APPENDIX B

~~Docket~~ Serial No. ~~30385~~ 182,801

3D Systems, Inc.

SLA-1 Software Manual

Beta Release, First Draft

October. 1987

3D Systems, Inc.
12847 Arroyo Street
Sylmar, CA 91342
(818) 898 - 1533
(818) 361 - 5484 FAX 3D Systems SLA-1 Software Manual
Beta Release, First Draft
October, 1987

TABLE OF CONTENTS 1.0 Introduction . . . . . . . . . . . . . . . . . . . . . . .3
1.1 System Overview. . . . . . . . . . . . . . . . . . . . . .3
1.2 Major Part-Making Components . . . . . . . . . . . . . . .5
1.3 Utilities. . . . . . . . . . . . . . . . . . . . . . . . .7

2.0 Getting Started. . . . . . . . . . . . . . . . . . . . . .8
2.1 Getting Around on the Slice Computer . . . . . . . . . . .8
2.1.1 Making a User Account. . . . . . . . . . . . . . . . . .8
2.1.2 Disk Usage Maintenance . . . . . . . . . . . . . . . . .9
2.2 Getting Around on the Process Computer . . . . . . . . . .10
2.2.1 Disk Usage Maintenance . . . . . . . . . . . . . . . . .10

3.0 SLICE and the User Interface . . . . . . . . . . . . . . .12
3.1 The TELNET Communications Program. . . . . . . . . . . . .12
3.2 SLICE Overview . . . . . . . . . . . . . . . . . . . . . .13
3.3 SLICE Features and Capabilities. . . . . . . . . . . . . .16
3.4 SLICE Command Line Parameters. . . . . . . . . . . . . . .18
3.5 The SLICE User Interface . . . . . . . . . . . . . . . . .20
3.5.1 UI Overview. . . . . . . . . . . . . . . . . . . . . . .20
3.5.2 UI Main Command Menu . . . . . . . . . . . . . . . . . .21
3.5.3 UI Alter Options Menu. . . . . . . . . . . . . . . . . .22
3.5.4 UI Extra Parameters Screen . . . . . . . . . . . . . . .24

4.0 The Parser . . . . . . . . . . . . . . . . . . . . . . . .25
4.1 The FTP File-Transfer Program. . . . . . . . . . . . . . .25
4.2 Operating The Parser . . . . . . . . . . . . . . . . . . .25
4.3 The Parser's Options . . . . . . . . . . . . . . . . . . .27
4.4 Critical Areas . . . . . . . . . . . . . . . . . . . . . .28

5.0 The Supervisor . . . . . . . . . . . . . . . . . . . . . .29
5.1 The Steps To Take Before Running the Supervisor. . . . . .29
5.1.1 Getting the Step Periods . . . . . . . . . . . . . . . .29
5.1.2 Editing the Supervisor's Default Parameters File . . . .30
5.1.3 Editing the Layer Control File . . . . . . . . . . . . .31
5.2 Operating the Supervisor . . . . . . . . . . . . . . . . .32
5.3 The Supervisor's Options . . . . . . . . . . . . . . . . .33
5.4 The Supervisor's Keyboard Commands . . . . . . . . . . . .34
5.5 Using Rivets . . . . . . . . . . . . . . . . . . . . . . .35

6.0 Other Programs . . . . . . . . . . . . . . . . . . . . . . . . .37
6.1 FRONT, Simple Front End to Laser Controller. . . . . . . .37
6.2 CLIFF, Control Laser Instrument From File. . . . . . . . .38
6.3 STEREO, The Stereolithography Device Driver . . . . . . .40
6.3.1 STEREO Command Set . . . . . . . . . . . . . . . . . . .40
6.3.2 STEREO Options . . . . . . . . . . . . . . . . . . . . .42

7.0 File Formats . . . . . . . . . . . . . . . . . . . . . . . . .45
7.1 SLICE's Input File (*.STL) Format. . . . . . . . . . . . .45
7.2 SLICE's Output File (*.SLI) Format . . . . . . . . . . . .48
7.3 The Parser's Output File (*.P and *.L) Format. . . . . . .49
7.4 Critical Area File (*.BOX) Format. . . . . . . . . . . . .51
7.5 Supervisor Default Parameters File (SUPER.PRM) Format. .52
7.6 The STEREO.DEF Driver Default File Format. . . . . . . . .54
7.7 The STEREO.GEO Geometric Correction File Format. . . . . .55

Appendix A - SLA-1 Software System Chart. . . . . . . . . . . .56

Appendix B - The STEREO Command Set . . . . . . . . . . . . . .57

Appendix C - Stereolithography Software Glossary. . . . . . . .58

Appendix D - Editor Commands. . . . . . . . . . . . . . . . . .61

1.0 Introduction

Welcome to the world of Stereolithography. By now, you know what Stereolithography is all about, and you have seen an SLA-1 machine. The job of this manual is to introduce you to the software that makes a SLA machine work.

First, let's quickly review the Stereolithography process. A three-dimensional part is designed on a CAD system, and transferred to a Slice Computer where the part is transformed into a series of two-dimensional layers. From that computer, the two-dimensional part is moved over to the Process Computer in the SLA machine. It is the job of that computer to make the part.

This manual follows the Stereolithography process. First, you will receive a brief introduction to all the important software programs. Then you will be shown how the Slice Computer works, how the Process Computer Works, and how to pass files to them.

1.1 System Overview

By System, we mean the Stereolithography Software System. And it is a system. It encompasses two operating systems - MSDOS and XENIX - and over a dozen programs, each important to some aspect of the Stereolithography process.

At last count, we figure there are nine levels of software. Each level can be viewed as a black box and having a unique task:

```
          +----------------------------------+
          ¦  Level 8   3-D PART CAD DESIGN   ¦
          +----------------------------------+
                            ¦
                            V
  +--------------------------------------------------+
  ¦  Level 7   TRANSFER 3-D FILE TO SLICE COMPUTER   ¦
  +--------------------------------------------------+
                            ¦
                            V
     +---------------------------------------------+
     ¦  Level 6   SLICE 3-D PART INTO 2-D LAYERS   ¦
     +---------------------------------------------+
                            ¦
                            V
 +----------------------------------------------------+
 ¦  Level 5   TRANSFER 2-D FILE TO PROCESS COMPUTER   ¦
 +----------------------------------------------------+
                            ¦
                            V
          +-----------------------------------+
          ¦  Level 4   COMBINE SLICED FILES   ¦
          +-----------------------------------+
```

```
                          |
                          V
     +-------------------------------------+
     |  Level 3   PART-MAKING SUPERVISOR * |
     +-------------------------------------+
                          |
                          V
      +-----------------------------------+
      |  Level 2   LASER DEVICE DRIVER    |
      +-----------------------------------+
                          |
                          V
   +-----------------------------------------+
   |  Level 1   LOW-LEVEL LASER CONTROLLER   |
   +-----------------------------------------+
```

The responsibilities of providing these services are spread out amongst three computers -- one that you already use for CAD work, our 80386-based Slice Computer, and our 80286-based Part-Making Computer:

```
+-------------- YOUR CAD SYTEM COMPUTER ------------+
|                                                   |
|  Level 8   3-D PART CAD DESIGN                    |
|                                                   |
+---------------------------------------------------+
+-----------------  SLICE COMPUTER  ----------------+
|                                                   |
|  Level 7   TRANSFER 3-D FILE TO SLICE COMPUTER    |
|                                                   |
|  Level 6   SLICE 3-D PART INTO 2-D LAYERS         |
|                                                   |
+---------------------------------------------------+
+---------------- PROCESS COMPUTER  ----------------+
|                                                   |
|  Level 5   TRANSFER 2-D FILE TO PROCESS COMPUTER  |
|                                                   |
|  Level 4   COMBINE SLICED FILES                   |
|                                                   |
|  Level 3   PART-MAKING SUPERVISOR                 |
|                                                   |
|  Level 2   LASER DEVICE DRIVER                    |
|                                                   |
|  Level 1   LOW-LEVEL LASER CONTROLLER             |
|                                                   |
+---------------------------------------------------+
```

1.2 Major Part-Making Components

The Slice Computer

The 80386-based Slice Computer contains XENIX, a full-bore multi-tasking Operating System which allows many users to simultaneously sign-on, transfer CAD files, and slice them. On this computer you will be introduced to some system management programs and some Stereolithography software.

The Slice Computer contains the Slice Program (SLICE) and its convenient User Interface Program (UI). SLICE is the program that takes a 3-D database and transforms it into a 2-D one suitable for part-making. Since SLICE conforms to the Unix philosophy of how programs work (which by the way is not so intuitive), we have developed UI which is an convenient menu-driven front-end to SLICE.

You will use UI to input the parameters you want SLICE to see and then run SLICE through UI. Generally, unless you need to do some disk or system maintenance, you will not need to leave UI until you sign-off.

```
+----------------- SLICE COMPUTER ----------------+
|                                                 |
|  Level 7   TRANSFER 3-D FILE TO SLICE COMPUTER  |
|                                                 |
|  Level 6   SLICE 3-D PART INTO 2-D LAYERS       |
|            - UI      User-Interface Program     |
|            - SLICE   Part Slicing Program       |
|                                                 |
+-------------------------------------------------+
```

The Process Computer

The Process Computer has many programs. Rather than instruct you how to call up each program from DOS, we instead have developed a menu program which you can use instead. The menu program leads you to each of the major part-making programs, the utility programs, and provides some disk management functions.

The SLA machine operator will tap into the Slice Computer and pull out the 2-dimensional database of the part he next wishes to make. This is accomplished using Ethernet software programs TELNET and FTP. TELNET temporarily makes the Process Computer into a computer terminal so that you can sign-into the Slice computer and run the User Interface program. You can then use FTP to transfer the 2-D databases (okay, we'll start calling them sliced files) files over to the Process Computer.

Once a sliced file is on the Process Computer, it may need to be combined with other sliced files, such as those containing a base for the part. The Parser, PARSE, does this job and also makes a special layer control file which you can edit to fine-tune the part-making process.

After running the Parser, you will proceed to the Supervisor, SUPER, which is the one program in charge of making a part. The Supervisor controls the motion of the laser beam and the Z-stage elevator, dipping and pausing for each layer.

Actually, The Supervisor's job is to "pass along" laser movement information to some rather sophisticated memory-resident software. The Supervisor talks to STEREO, a special Stereolithography Device Driver we created that knows about such SLA-specific things as special ways to draw and geometric correction which causes the laser beam to map linearly onto the vat's surface. STEREO, in turn, talks to LASER, the low-level laser controller, which is constantly running, moving the laser beam one discrete step every so often.

We told you a bit more than you probably needed to know, but we want you to get a good understanding of the system. The STEREO Device Driver has a set of commands that control how the laser moves on any given layer. Sometimes you want the laser to behave differently at some point during the part-making process. So, we gave the Supervisor the capability of passing along to STEREO commands that you have placed in certain files.

We want you to be aware that you are learning the commands of a common device driver, a driver that many different programs can use. Once you learn the STEREO Command Set, you will be in pretty good shape to quickly adapt to other programs.

```
+---------------- PROCESS COMPUTER ---------------+
|                                                 |
|  Level 5   TRANSFER 2-D FILE TO PROCESS COMPUTER |
|            - TELNET   Terminal Emulation Program |
|            - FTP      File Transfer Utility      |
|                                                 |
|  Level 4   PARSE SLICED FILES                    |
|            - PARSE    The Parser                 |
|                                                 |
|  Level 3   PART-MAKING SUPERVISOR                |
|            - SUPER    The Supervisor             |
|                                                 |
|  Level 2   LASER DEVICE DRIVER                   |
|            - STEREO   System Resource            |
|                                                 |
|  Level 1   LOW-LEVEL LASER CONTROLLER            |
|            - LASER    System Resource            |
|                                                 |
+-------------------------------------------------+
```

1.3 Utilities

In addition to the major components, there are a variety of utility programs that aid the part-making process.

There is the power on-off sequencer (POWER) that enables you to safely turn on and off various elements of the SLA machine with appropriate directions.

And there is the Calibrator (CALIB) that is run not-so-often to calibrate the Vat Surface (the "Field") to make the SLA machine geometrically correct. Special hardware is necessary in order to use this program.

The Profiler (PROFILE) that analyzes the laser beam, and it is run often, perhaps once a day. It makes note of the current shape and intensity of the beam. The results of its analysis is retained in a special file that other programs can read.

The Get Step Periods program (GETSP) is one such program. It eliminates the need for you to be a chemist by reading the Profiler's data and enabling you to determine an appropriate Step Period (laser speed) for making a particular part. It knows the working curves for different materials, and it will select an appropriate Step Period for your forthcoming part-making sessions.

ZSTAGE gives you control over the Z-Stage, the vertical elevator that the part sits on. ZSTAGE is used to set the elevator just before a part is make, and it is also used to bring a part up out of the vat.

| | |
|---|---|
| POWER | Power On/Off Sequencer |
| CALIB | Field Calibrator |
| PROFILE | Beam Profiler |
| GETSP | Determine Step Periods |
| ZSTAGE | Z-Stage Controller |

Utility Programs

2.0 Getting Started

In this chapter, we assume you have installed your Slice and Process Computer Systems according the Installation Manual and have verified their proper operation. This chapter takes you at that point to help you get started using these two computer for the part-making process.

2.1 Getting Around on the Slice Computer

Each person performing slicing should have his or her own XENIX account on the Slice Computer. Once an account has been created, the owner can sign on.

2.1.1 Making a User Account

Sign onto the sysadm account by typing 'sysadm' at the login prompt and press Enter. Enter the password, which is '3dsys'. Note that the password isn't displayed as its typed in. And the case of the letters is important; type them in lower case.

The sysadm account is a special Xenix account that automatically takes you to a menu-driven system administration program. From this menu you can create and remove user accounts, and perform a varietry of other system tasks. If you want to know more information about the sysadm function than what is presented here, please refer to the appropriate Xenix documentation.

Take a few moments to look over the screen. Select the User Maintenance options by pressing 'U'. Do not press Enter.

Select MakeUser by pressing 'M'. Do not press Enter. Answer 'y' (and Enter) to 'detailed instructions?'. Next time you can answer 'n' because you will be familiar with the make-user process.

Enter the new user's login name. This should be short and in all lower case letters. We simply use people's first names and an occasional first letter of their last name. Make up your own rule, but be consistent. It will make system management easier.

Answer 'y' to 'Do you wish to use the next available user id?' query. Let the system assign the id number. You will rarely have to refer to it.

Answer 'y' to 'Do you want to use the default group? ' query. This will assign the standard group 'group'.

Assign a password that is at least 5 characters in length. You will have to enter it again as a safety precaution against typos. If you don't care about security, just make the password the same for all users. This way, you can hop around the various user accounts and pick up the sliced file.

Select the Standard (Bourne) Shell, item 1. Enter a comment if you want. Generally, you will enter the user's full name (with upper and lower case letters) here.

Review the account infomation. If you are satisfied, answer 'n' to 'Do you want to change anything? ' prompt. The computer will take a few moments to create the user.

You have finished adding a user to the Slice Computer. That user can now sign-in and do slicing.

If you want to remove a user, you can select the Remove User option. You will have to delete all of the user's files before you can delete him from the computer system.

Play around with the sysadm menu system. Don't do anything that looks irreversible or serious until you have read up on it.

2.1.2 Disk Usage Maintenance

Depending on the size of your part files, you will need to take time to make periodic maintenance. This means you should erase or archive old part files to make way for new ones.

When you sign-in, the computer will tell you how much disk space is taken up by your files. The number shown is the number of 512 byte blocks (1/2 K). Check this number to make sure you aren't taking up more disk space than you thought. Make sure your disk usage doesn't get out of hand.

If you are in the User Interface, use option Q to quit and return to Xenix. There you can use the rm command to remove files:

```
rm sli0045.stl   will erase the single file sli0045.stl
rm gbox03*       will erase all files whose name begin with 'gbox03'
```

You can also use cp to copy and mv to move files around. Refer to the Xenix Documentation for more information.

If you feel you need more information about the Xenix Operating System, we recommend the following books:

* Understanding XENIX: A Conceptual Guide
  Que Corporation

* Working with XENIX Systems
  Scott, Foresman, and Company

* XENIX at Work
  Microsoft Press

* Inside XENIX
  The Waite Group

* XENIX Tutor
  XENIX Training on DOS PCs

SCO, our Xenix supplier sell these books to end-users. Contact them at (408) 425 - 7222.

2.2 Getting Around on the Process Computer

The Process Computer is your typical AT-compatible MSDOS Computer System. If you don't know the first thing about MSDOS, don't worry. All you have to do is turn the computer on; it does the rest. You will enter a Menu Program from which you can get to all the essential part-making programs.

2.2.1 Disk Usage Maintenance

As with the Slice Computer, you will need to watch your disk usage on the Process Computer. The Process Computer contains 40 Megabytes, of which about 2 Megabytes are taken up by MSDOS and the Stereolithography Software.

Unless you have created your own directories for the sliced files, you will be in the \WORK directory. Periodically, go to the DOS Menu and select item 1 to get the disk usage stats. You will see something like:

```
 21344256 bytes total disk space
    49152 bytes in 2 hidden files
    45056 bytes in 22 directories
  6254592 bytes in 391 user files
    20480 bytes in bad sectors
 14974976 bytes available on disk

   655360 bytes total memory
   598128 bytes free
```

Watch the 'bytes available on disk'. This system has more than 14 Megabytes (14,000,000) left so there is no immediate danger of running our of disk space. Depending on the sizes of the part files, you should get concerned when this number drops below a few Megabytes.

Once you realize that you need to some housecleaning, or "diskcleaning" in this case, select item 3 in the DOS Menu. This will take you to a program called QuickDos II (QD2) where you can do such disk-related things as copying files, moving files, and deleting files.

To delete files, use the arrow keys to move up and down the directory listing shown. Press the Space Bar to tag a file. A white arrow should appear at the left of the file name. Keep doing this until all the files you want to delete have been tagged. To untag a file, move back to the file and press the Space Bar again. The white arrow should disappear.

Press 'E' (no Enter) to erase. QuickDos will show you the file you have selected on a different screen. Press Alt-E (hold the Alt key down while pressing 'E') to begin the erase procedure. If you see something you don't like, press Esc to abort.

QD2 performs a variety of other useful disk management tasks. Refer to its documentation for more information.

3.0 SLICE and the User Interface

To use SLICE and the User Interface, you can sign-on to the Slice Computer either directly via its keyboard, or from the Process Computer over the Ethernet communications link. Section 3.1 describes how to use the Ethernet TELNET terminal program.

Once you are signed-in, there are two ways to tell SLICE what you want done. One is to work directly from the Xenix Operating System where you must specify all the options on one line. The other is to use UI, the Slice User Interface Program, where you can specify the options through a set of menus. Both techniwues are described below. We have found most people prefer using the User Interface.

3.1 The TELNET Communications Program

The TELNET Program allows you to connect up to the Slice Computer from the Process Computer and run the User Interface and SLICE programs.

From the Process Computer Main Menu, select item 1, Data Transfer. You will be placed in the XFER program are presented with the following options:

1. TELNET, Terminal Utility
2. FTP, File Transfer Program

Q. Quit

If you don't what to communicate just yet, press Q to quit and return to the main menu. Otherwise, select item 1, TELNET.

TELNET should run and connect the computer you are currently on (the Process Computer) up to the Slice Computer. If both computers are functioning and are properly linked together, you should see the Xenix Login message appear. At this point the Process Computer is like the Slice Computer's main console. You can now sign-in and run SLICE or the User Interface.

Eventually, you will have to sign-off. Get out of whatever program you may be in (the DEL key may do that) and type:

exit

You should then be logged off the Slice Computer and returned to the Process Computer's main menu.

3.2 SLICE Overview

This quick overview will give you a brief description of SLICE methodology.

SLICE's mission is to read in a solid model whose surfaces were tessellated into triangular facets, and then to calculate output that is suitable for the laser control system to polymerize the model in layers, working from the bottom up.

While we are discussing SLICE ,it is important to realize that these next questions touch upon deep topics. The areas of numerical analysis, analytical geometry, computer graphics, and computer architecture, are among those that are relevant to SLICE. The discussion below is by no means a thorough treatment of these topics, but rather a starting point to provoke thought.

Why use layers?

The UV catalyzed polymerization process usually takes place at or near the monomer-substrate surface, so an approach akin to assembling a loaf of bread by gluing the slices back together is taken by the laser process. SLICE "slices" the original model mathemtically which the laser then puts back together.

The laser must trace the outline of each slice and sweep across ("hatching") the interior of each slice. In addition, the end-slices of the bread loaf, and the near flat ones are traced more finely, called "filling" in SLICE parlance.

Therefore the object to be produced must be reduced to cross-sections. This is the heart of the problem--to do the cross-sectioning and hatching/filling efficiently and correctly.

Why use triangles?

There are many ways to represent solids, such as constructive-solid-geometry, parametric representation (based upon a variety of fundamental curves such as bicubic patches), and boundary representation (called b-rep in the literature). B-rep is the most popular and often the most efficient for a general class of objects (e.g. not wings or boat hulls).

The boundary representation method generally involves describing a solid model in terms of its surfaces which are approximated by polygons. The smaller the polygons the better the b-rep model represents the actual object. Some solid model analysis problems (such as tolerance checking) originate right here-because we stray away from reality once we take the first step of interpolating polygons. We can discuss this further in a future section.

How the model is actually produced, whether by volumes of revolution, extrusion, projection, cross-sectioning (in reverse of SLICE), etc., does not (at present) concern us here. But the end result is a model that must have integrity. Polygons must be planar, and adjacent polygons must indeed abut one another, for example.

The triangle is a very nice surface b-rep polygon to work with for several reasons: non-degenerate triangles always define a single plane in 3-space, (as two points define a line in 2-space, and 4 points define a hypercube in 4-space, etc.). A degenerate triangle is one in which one or more of the points have the same coordinates. Triangles are also the simplest entity with which to perform computations, as compared to trapezoids, hence they proliferate in many popular CAD and solid modelling systems.

Why have variable z-spacing?

Let us use our food example again. If we are slicing a loaf of bread that is geometrically uninteresting, say a loaf of Roman Meal, it is wasteful to slice at every millimeter; centimeters will do. If we are slicing a dome shaped French Bagette, for example, but want a reasonably accurate model, some slices should be thinner than others.

Those slices that have more detail and that have smaller slope should be smaller. This is a little like the resultion problem above, but now we will vary the grid size DYNAMICALLY as we move through the model. Secondly, this approximation corrects for limitations in the laser process, not for a mathematical loss of accuracy as in the integer problem.

The limitation in the laser process is caused by the fact that beam shoots at approximately a normal angle to the substrate surface. Angled surfaces are therefore built up in a stair-stepping method. The side of each step is a slice, and its angle is given by the angle of the laser beam relative to the substrate liquid surface.

The second limitation is that areas that are nearly flat must be treated as if they were completely flat. Completely flat regions are skin-filled, which is essentially a very fine cross-hatching. Near flat regions must be skin-filled lest gaps and/or warpage occur in the completed part. Additional structural features may have to be built in order to compensate for properties inherent in the polymer.

There are other effects relevant to the part-making process, but they are not covered here. There is for example, a correction necessary for the spherical projection of the laser beam onto the flat surface of the substrate liquid, which is done in a post-SLICE laser output phase.

The thickness of slices must vary then to: 1) obtain a sufficient level of detail, and 2) provide sufficient polymerization / structural strength in areas that have small slope.

Why are triangles classified?

Recall that the input consists only of triangles. Each slice will intersect some of the triangles.

Triangles are classified by their slope relative to the x-y plane in SLICE: flat (slope=0), near-flat (slope<human-determined subjective criteria), and "scan" triangles (slope is large).

The line segments that are calculated by slicing through triangles are treated differently depending on the triangle they came from. These resulting intersections of slices with triangles form outlines of slices, called "borders", and provide information needed to do the cross-hatching and skin-filling.

Why have output blocks?

Output blocks in Slice's output files identify the type of two-point vectors which follow. Special action can then be taken by the Supervisor on some of these blocks to strengthen the part and prevent warpage.

3.3 SLICE Blocks

SLICE takes the 3-D object database and classifies the facets as flat, near-flat, or scanned. When SLICE gets around to producing 2-D output, it organizes the layer vectors into various block.

SLICE block identifiers follow the following mnemonic rule. Not all combinations are valid.

```
        L           + B
        F   + U  +  H
        NF  + D  +  F
        |     |      \
        |     |       boundary/border
       /      |       hatch
    layer     |       fill
    flat       \
    near-flat   up skin
                down skin
```

| New Block Mnemonic | Description |
|---|---|
| LB | Layer Border |
| LH | Layer Hatch |
| FUF | Flat Up skin Fill |
| NFUB | Near-Flat Up skin Border |
| NFUF | Near-Flat Up skin Fill |
| FDF | Flat Down skin Fill |
| NFDB | Near-Flat Down skin Border |
| NFDH | Near-Flat Down skin Hatch |
| NFDF | Near-Flat Down skin Fill |

The above list is shown in kind of a triangle-type order which is different fromt the order SLICE outputs the data. SLICE outputs the way the part is to be built:

* borders first
* then hatches
* then down fills
* then up fills

SLICE outputs the blocks in the following order:

| | | |
|---|---|---|
| 1. | L | Layer identifier, no vectors |
| 2. | LB | Layer Border |
| 3. | LH | Layer Hatch |
| 4. | NFDB | Near-Flat Down skin Border |
| 5. | NFDH | Near-Flat Down skin Hatch |
| 6. | NFUB | Near-Flat Up skin Border |
| 7. | FDF | Flat Down skin Fill |
| 8. | NFDF | Near-Flat Down skin Fill |

| | | |
|---|---|---|
| 9. | NFUF | Near-Flat Up skin Fill |
| 10. | FUF | Flat Up skin Fill |

The L block isn't one really. It is followed by the interal Z-layer number, must like the old Z block. However, unlike the old Z which has the complete boundary for that layer, the L has no vectors.

3.4 SLICE Command Line Parameters

To activate SLICE the hard way, you will need to type out a XENIX command line with the form:

SLICE < input_file <options> where SLICE is the current SLICE program (e.g. 'slice20b')
input_file is the name of the STL input file <options> represent any combination of the following SLICE program options:

-scale <scale_value>
Used to specify a real number scale value that will be used to scale the input file coordinates. The default scale value is 1.

-sf <segment output file>
Used to specify an output file for z plane intersection segments. The default is to not generate a segment output file.

-zs <z spacing value>
Used to indicate the constant z spacing of the output cross-sections.

-hy <hatch spacing value>
Used to set spacing of hatch lines parallel to the Y-axis.

-hx <hatch spacing value>
Used to set spacing of hatch lines parallel to the X-axis.

-ha <hatch spacing value>
Used to set spacing of 60 degree angle hatch lines.

-hfy <hatch spacing value>
Sets spacing of hatch lines parallel to the Y-axis on flat surfaces.

-hfx <hatch spacing value>
Sets spacing of hatch lines parallel to the X-axis on flat surfaces.

-zsf <z spacing control file>
Used to specify the file containing variable Z-spacing information.

-c Centering option.
Centers object coordinates around 32768, 32768.

-nsc No section codes option.
Suppresses section codes in the output file.

-msa Minimum surface angle option.
Indicates minimum surface angle for scanned facets. Legal values are between 0 and 90 degrees.

-mia Minimum intersect angle option.
Indicates minimum intersect angle for hatch lines. Legal values are between 0 and 90 degrees.

-b Binary input option.
Indicates that the input file is in binary format.

-d Display option.
Causes the program to display cross-sections on the screen as they are generated.

-h Help option.
Causes the program to print a help similar to this list of options and then stop.

-b Binary input option.
Indicates that the input file is in binary attributed format.

-aries ARIES attributed binary input option.
Use when binary file is ARIES and attributed.

-disk Disk option.
Causes the program save intermediate information on disk rather than in memory.

-x or -y Slice Axis option.
Use the x-axis or y-axis as the slice axis, not the standard z-axis.

SLICE can be executed directly as a standard Xenix program. However, we have a developed a special User-Interface program for SLICE, described below.

3.5 The SLICE User Interface

We have developed a special User Interface program to SLICE that runs under XENIX. It is a much easier way to run SLICE compared to typing command lines. UI, as the User Interface is called, can be run remotely through Ethernet.

UI, the SLICE User Interface, presents menus and allows the user to easily select and define the various SLICE options for a particular STL Slice Input File. The options for different STL files are remembered in special setup files with the same file name prefix, but with the extension ".UII" (UI Information).

UI also allows the user to define a special variable Z-spacing file (with the extension ".UIZ") that is used by SLICE to generate different-spaced layers for different sections of a part.

3.5.1 UI Overview

The complex nature of using SLICE especially on a Unix-based system prompted the development of the User Interface (UI) program. It is a simple easy-to-use front end for the Stereolithographer where, by selecting items off a menu, he can enter the Slice options for his latest part. A key feature of UI it that it supports variable Z-spacing, a difficult feature of SLICE to use outside of UI.

UI allows a SLICE user to change options and invoke the SLICE program. SLICE then slices the specified 3D object into 2D layers using the UI options.

UI can be invoked from any process Unix or Xenix account. It is assumed that such a system has already been created with the necessary software. It is recommended that each individual needing to use UI and SLICE be given their own account.

The command syntax for the UI command is:

ui <option_file_name> where <option_file_name> is the name you wish to refer to the new set of options. If you wish, it can be related somehow to the part name. If <option_file_name> is omitted, the last option file name will be used and its option file loaded.

3.5.2 UI Main Command Menu

The User Interface's Main Command Menu is shown below:

```
-----------------------------------------------------------------
                    - SLICE USER INTERFACE -
                          Version 2.10


    Current Object:  test
Database File Name:  test.stl
  Extra Parameters:  -aries -x

 Alter   - Alter standard options
 Extra   - Set extra parameters

 Load    - Load a different object's options
 Save    - Save current object's options
 Write   - Save current option's under different object name
 Copy    - Copy another object's options into current object

 DoSlice - Do slicing with current options
 Quit    - Exit UI (Use SAVE to save options first)

Which Command? _
-----------------------------------------------------------------
```

The UI commands behave as follows:

Alter - Go to the Options Menu so that the Slice Options can be changed.

Extra - Go to the Extra Parameters Screen so that non-standard Slice options can be specified.

Load - Loads a different set of options into UI. The previous objects options (if any) are not automatically saved. Using Load is equivalent to quitting UI and rerunning it with the new object's name.

Save - Saves the current option data into the current object file. Stays in the main menu.

Write - Same as Save, but allows you to specify a different file in which to store the option data. The new name becomes your current object file name.

Copy - Copies the options of a different object into the current object's options. The Copy command saves having to reenter options where options for a new object are being defined but the options are similar to those for some past object. By Copying those old options in and making minor adjustments, you are off and running SLICE quickly.

DoSlice - Go Do Slicing with the current options. DoSlice allows you to specify what version of Slice you wish to use.

Quit - quits UI. Does not Save. Returns to back to the Unix or Xenix command level.

3.5.3 UI Alter Options Menu

All the numbered options in the UI program are parameters to the SLICE program. All the lettered options are used for UI control. Most of the SLICE options are self-explanatory.

```
-------------------------------------------------------------------
                  - SLICE USER INTERFACE -
                        Version 2.10


    Current Object: test

Option  Description                                   Value
------  -----------                                   -----
 (1)    DATABASE File Name                            test.stl
 (2)    Scale                                         1.000
 (3)    Z Spacing                                     10.000 Fixed
 (4)    X hatch spacing                               0
 (5)    Y hatch spacing                               0
 (6)    60/120 degree hatch spacing                   0
 (7)    X Skin fill for near flat surfaces            0
 (8)    Y Skin fill for near flat surfaces            0
 (9)    Minimum Surface Angle for scanned facets      0
 (10)   Minimum Hatch Intersect Angle                 0
 (11)   Segment Output File Name                      test.sli
 (12)   Centering                                     Off
 (Q)    Quit, return to Main Menu

Alter which Option? _
-------------------------------------------------------------------
```

(1) DATABASE File name sets the name of the file that contains the three-dimensional CAD database for the object. An extension of ".stl" is assumed.

(11) Segment Output File Name is the name of the file that SLICE will output to. An extension of ".sli" is assumed.

(3) Z Spacing is one of two types, Variable or Fixed. Fixed is where just one value for all spacing, while Variable allows many. When Fixed is selected, UI just asks for the one Z spacing value. When Variable is selected, UI displays a new screen and allows you to edit the Variable Z-Spacing Table.

While adding and deleting values to and from the variable Z-spacing table, you will use the following commands:

| | |
|---|---|
| A level setting | Add new level and spacing value to table |
| D level | Delete level from table |
| S | Save table, return to main menu |
| Q | Quit, return to main menu, don't save table |
| H | print a Help message similar to this |

A adds a new level and spacing value. Both of these numbers will be multiplied by scale as they are sent out to SLICE. In other words, they are in the original CAD units -- inches, feet, whatever. Also, the indicated spacing begins at the indicated level. The first entry goes from that level to just before the level indicated by the second entry, and so on. The new spacing and hence the new dip depth will be used after the vectors for the indicated layer are drawn.

D deletes a level. S saves the table and returns you back to UI's main menu. Q skips the save, just returning you to the main menu. Any entries you made will be lost. H prints out a convenient help message.

If after you create a Variable Z-spacing table, you go back to Fixed spacing, then return to Variable spacing, the original Z-Spacing Table is restored.

The Save command in the Variable Z-spacing section does not save the table to disk. You must also use the Save or Write command in the main menu to make any changes permanent.

3.5.4 UI Extra Parameters Screen

Supplying Extra Parameters is a convenient way for us to support non-standard Slice commands without having to create confusing menus. You may never need to enter any extra parameters. This is a just-in-case feature.

Below is a copy of the Extra Parameters screen:

---

Extra Parameters allows you to specify non-standard slice options for inclusion in the slice command line. What parameters are valid is based on the version of Slice you will use.

The following parameters have been known to exist:

```
-x        part's height is in the x-axis
-y        part's height is in the y-axis
-aries    use the non-standard Aries CAD System input file format
```

Current Extra Parameters are:
-aries -x

Enter new Extra Parameters or just press Enter to keep old:

---

4.0 The Parser

The Parser takes sliced files and prepares them for the Supervisor. PARSE's name comes from the fact that it parses out the slice block identifiers and stores them is a special layer control file. This file you can later edit to fine tune the part-making process.

PARSE also combines multiple slice files together, such as a part and an appropriate base, and generates just one large vector file for the Supervisor.

4.1 The FTP File-Transfer Program

You can use the FTP File Transfer Program to move a sliced file over from the Slice Computer to the Process Computer. Go to the XFER program by selecting item 1 in the Main Menu. There, select item 2, for FTP.

FTP will prompt you for the Remote User Name. Type in the name of your user account. Then it will prompt you for your password. Type than it. If FTP can sign onto the Slice Computer, i will display the prompt:

```
FTP>
```

At this point, there are a variety of commands you can use. We will focus on just five of them here -- mdir, ldir, get, put, and bye.

You can use 'mdir' to get a directory listing of the Slice Computer, and 'ldir' to get a directory listing of the Process Computer.

Use 'mdir' to see the contents of your Slice Computer directory. Is the file you want to send over there? If it is, make sure you are going to store it in the right place on the Process Computer by using 'ldir'.

If everything looks right, use 'get' to move over the file:

```
get <filename>
```

where <filename> is the name of the file you want to copy over. The original file on the Slice Computer will not be disturbed. Use 'ldir' again to make sure the file came over.

In a similar manner, you can use 'put' to copy a file from the Process Computer over to the Slice Computer.

That's it. Use 'bye' to end FTP. FTP will sign-on the Slice Computer and return you back to the Process Computer's main menu.

4.2 Operating The Parser

When PARSE is brought up, it display the following heading:

```
--------------------------------------------------
  PARSE, Slice Files Combine and Parse Program
  3D Systems Laser Stereolithography System
  Version 2.30  by 3D Systems  October 1987
--------------------------------------------------

 Slice File Names: _
```

At this point, type in all the names of the SLICE files (no more than 10 at a time), separated by spaces, to combine into a single part. The output files generated will be used by SUPER, the Supervisor, to build a part on the Stereolithography apparatus.

After pressing Enter, PARSE will prompt with:

```
 Output File Name: _
```

Here, just give the prefix; do not add any extensions (like *.DAT). PARSE will make two output files <part>.L and <part>.P, where <part> is the name you input here. <part>.L will be a short file contain layer information, and <part>.P will be the combined vector file of all the SLICE input files.

Then, PARSE will ask for three numbers:

```
 Slice scale factor? _
 Slice -zs layer spacing? _
 Layer thickness in mm (20 mil = 0.508mm)? _
```

In the near future, PARSE will obtain this information directly from SLICE, but for now, you have to repeat it. Please do not delight too much in being able to "fudge" the part by inputting different numbers from what SLICE was told as this capability will soon vanish. PARSE will pass this information along to SUPER.

PARSE then begins it run:

```
 Starting parsing ... Hit Ctrl-Break to abort.

 7800: L1 LB1 LH1 NFDB1 NFDH1 FDF1 NFDF1 L2 LB2
 7810: L1 LB1 LH1 L2 LB2 NFUB2 NFUF2 FUF2
   :    :    :
```

If you press Ctrl-Break at any point before PARSE has finished, you will abort the parse procedure. Incomplete <part>.L and <part>.P files will be left on your disk so that you can look at the intermediate results. If you don't want these files, delete them to conserve disk space.

The '7800', '7810' numbers shown above are references to the L blocks being read in from the SLI file. The number itself is from after the line in the SLI file that begins with an L. The letter-number combinations that follow show the block-type and input file number that PARSE is currently working on -- NFUB2 means that PARSE is working on the Near-Flat Up-Facing Skin Border for the indicated layer from the second input file.

When PARSE is done, it returns control back to Menu program, at which point you can either edit its files or run the Supervisor.

PARSE maintains increasing layer numbers. It will automatically resolve the condition where the input files may start and stop on different layers by juggling the input from the various input files. PARSE can handle up to 10 input files per run.

For a given input file name in the 'Slice File Names' prompt, one can add one or more of the following options:

```
/Z<offset>                     - offset Z-layer numbers
/N<set of ZXYISABJHVCFGKCD>    - no, don't use blocks indicated
/O<set of ZXYISABJHVCFGKCD>    - only use blocks indicated
```

/Z allows you to offset the Z-layer values for that input file. This is useful when you need to align two previously non-aligned CAD objects such as posts and the major part. /Z-100 will reduce the apparent Z-layer values for that file by 100. The actual physical shift is related to the SLICE scale factor.

/N and /O allow you to select which blocks to exclude or include, respectively. /N LH,NFDH will eliminate all section cross hatching, and /O LB,NFDB,NFUB will only allow the border blocks through. "N" stands for "No" and "O" stands for "Only". By the way, it isn't wise to use both /N and /O together since they are mutually exclusive. No matter what you type, PARSE will always include the L-block.

4.3 The Parser's Options

PARSE accepts a command line whose format mimics the input queries discussed above. This allows PARSE to be run from a *.BAT batch file without user intervention. The format is:

```
PARSE <file1> <file2> ... /OUTFILE<output file prefix>
  /SCALE<scale>/ZSPC<Z-spacing>/THICK<thickness>
```

/OUTFILE specifies the output file prefix, /SCALE and /ZSPC the SLICE scale and Z-layer spacing, and /THICK the layer thickness. You cannot use these options from the Menu program.

As indicated before, specifying the scale, Z-spacing, and the thickness is temporary and will soon be eliminated. If the Command Line is incomplete, PARSE will prompt for the missing information.

4.4 Critical Areas

PARSE supports critical areas, where the Supervisor can be instructed to perform or not to perform something within the confines of a box. For a given part with a file name prefix of <part>, PARSE attempts to read the <part>.BOX file. If it doesn't see the file, it simply prints out a warning message and continues. Otherwise, it reads in the file and analyzes it while parsing.

Two types of critical areas are supported: Cross-Hatching with Rivets (XV) and Ignore Cross-Hatcning (XI). That is, all the cross-hatch vectors within the critical area confines will either become rivets (multi-pass draws for strength) or be ignored.

See Section 7.4 for the format of the *.BOX file. See Section 5.5 for a discussion on rivets.

5.0 The Supervisor

The Supervisor supervises the part-making process. It reads the vectors from a file, sending them to the laser controller, modifying them according to the layer control file.

The Supervisor runs for as long as it taskes to make a part. It sends the packets of vectors to the STEREO driver, and it controls the Z-Stage, moving it down and back up for a dip after each layer.

The Supervisor reads three files. SUPER.PRM contains the default laser controller parameters for each block. The <filename>.L part layer control file contains your override laser controller parameters. The <filename>.P part file contains all the vectors from all the files combined together by the Parser.

The Supervisor knows about each type of block and which number PARSE File it came from. For any block from any file, you can tell the Supervisor to alter certain laser controller parameters such as step size, and step period.

5.1 The Steps To Take Before Running the Supervisor

Run the Beam Profiler and the GetSP programs if necessary.
Adjust the Z-Stage using the Z-Stage Controller program.

(More)

5.1.1 Getting the Step Periods

You should run the GETSP program each time you use a new material or after you have run the Beam Profiler. GETSP will ask you for the desired lineheight (in mils) and make an estimate of what Step Period you should use for your next part.

GETSP will ask you if it should update the SUPER.PRM Default Paamters File for you. If you answer 'y', then the next part will be made with the calculated step period. You can still override the new step period in the *.L Layer Control File for certain block if you desire.

5.1.2 Editing the Supervisor's Default Parameters File

Here's an example of the new SUPER.PRM file:

```
!
!  Supervisor Parameter File
!  Version 2.21
!
!  last altered: 9/28/87
!        reason: to test new SUPER Default Option line in this file
!


!
!  Default SUPER Options
!
!  place options together inside of quotes;  use "" if no options
!  /NEGZ required for some prototype units
!
"/NEGZ"

!
!  General Parameters
!
800     Elevator board base address
50      Elevator pitch parm, 100 for alphas, 50 for betas
1.0     XY-only scale factor; does not affect Z-axis
0       X-coordinate offset
0       Y-coordinate offset
750     Max number of vectors to send to Stereo

!
!  - Block defaults -
!
!  Each time the Supervisor starts a block, the respective default
!  string below is sent to the Stereo driver.  Z,X... are the block
!  types (Z-Boundary, X-Cross-Hatch, etc.) and they are followed
!  by the parse input file number (e.g. 1 may be for post vectors
!  and 2 for object vectors).  Although only defaults for 2 Slice
!  files are set for here, up to 10 files are supported.
!
#TOP,"BX 8500;BY 34300"        ! laser beam begin (home) position

LB1,"RD 1;RS 300;RC 1;         ! redraw delay, size, count
       SP 25;                  ! step period
       JD 0;                   ! jump delay
       SS 2"                   ! step size
NFDB1,"RD 1;RS 300;RC 1;SP 25;JD 0;SS 2"
LH1,"RC 1;SP 25;JD 0;SS 2;
       VC 5;                   ! rivet count
       VR 99;                  ! rivet reduction amount
       VP 11,12,13,14,15"      ! rivet step periods
NFDH1,"RC 1;SP 25;JD 0; SS 2;VC 5;VR 99;VP 11,12,13,14,15"
FDF1,"RC 1;SP 25;JD 0;SS 16"
```

```
NFDF1,"RC 1;SP 25;JD 0;SS 16"
NFUF1,"RC 1;SP 50;JD 0;SS 16"
FUF1,"RC 1;SP 10;JD 0;SS 16"

LB2,"RD 1;RS 300;RC 1;SP 25;JD 0;SS 2"
NFDB2,"RD 1;RS 300;RC 1;SP 25;JD 0;SS 2"
LH2,"RC 1;SP 25;JD 0;SS 2;VC 5;VR 99;VP 11,12,13,14,15"
NFDH2,"RC 1;SP 25;JD 0; SS 2;VC 5;VR 99;VP 11,12,13,14,15"
FDF2,"RC 1;SP 25;JD 0;SS 16"
NFDF2,"RC 1;SP 25;JD 0;SS 16"
NFUF2,"RC 1;SP 50;JD 0;SS 16"
FUF2,"RC 1;SP 10;JD 0;SS 16"

#BTM,"ZW 10;                   ! Z-axis wait time in seconds
      ZD 5;                    ! Z-axis dip depth in mm
      ZV 0.8;                  ! Z-axis velocity parameter
      ZA 0.1"                  ! Z-axis acceleration parameter
```

Blank lines and lines starting with ! are ignored. Text after a ! is also ignored. The first few lines contain fixed Supervisor parameters that can only be affected by changing the numbers here. The rest of the file contains the default settings for the various blocks.

The L1 line contains the default laser control commands sent to STEREO laser driver whenever a L block from (PARSE input) file 1 is encountered.

These default command strings are by no-means fixed. Feel free to change them any way you like, even just to experiment. You can even eliminate all the defaults if they confuse you and start defining them over again.

5.1.3 Editing the Layer Control File

To edit a file, select item 5 from the Main Menu and tell the Editor what file you want to edit. Layer Control Files always have a ".L" extension.

The *.L file (* means any set of file name characters) can contain overrides for any block. Say that we have a FDF1 (Flat Down-Skin Fill from file 1) block. The Supervisor first sends the FDF1 line from its SUPER.PRM file to STEREO:

RC 1;SP 25;JD 0;SS 2

Then, the FDF1 override line from the *.L is sent to STEREO:

SP 10;JD 10

Because the later commands override the earlier ones, the combined effect is:

RC1;SS 2;SP 10;JD 10

SUPER gives you two levels of control, one in SUPER.PRM, and one in the part's control file. You may want to make special directories for different classes of parts that use different SUPER.PRM files.

NOTE: Future releases of the Supervisor may require alterations to the SUPER.PRM files. Whenever possible, a SUPER.PRM convert file will be supplied.

We recommend modifying only the *.L Layer Control files and leaving the *.P vector files alone. Use the PARSE /Z, /N and /O options to shift layers and exclude certain blocks.

Since both PARSE and SUPER ignore lines that begin with an exclamation point, you can insert comments in the data files:

```
! temporarily reduce step period to test material XQ45
7800,FUF1,"SP5"
```

5.2 Operating the Supervisor

SUPER is the name of the Version 2 Part-Making Supervisor. Version 1's Supervisor was called SUPV and should no longer be used.

When SUPER is brought up, it displays the title:

```
-----------------------------------------------
  SUPER, Part Making Supervisor
  3D Systems Laser Stereolithography System
  Version 2.30  by 3D Systems  October 1987
-----------------------------------------------

Part Prefix: _
```

Enter the prefix of the part's file name. SUPER will automatically assume the Layer Control File is the prefix plus ".L" and the vector file is the prefix plus ".P".

SUPER runs much like PARSE in that it display the current Z-layer number and the block name as it runs:

```
7800: L1 LB1 LH1 NFDB1 NFDH1 FDF1 NFDF1 L2 LB2
Waiting... Dipping... Relaxing...0
7810: L1 LB1 LH1 L2 LB2 NFUB2 NFUF2 FUF2
Waiting... Dipping... Relaxing...19
  :    :    :
```

SUPER tells you when its waiting for the laser controller to idle, when its dipping the elevator, and when its relaxing (delaying). The time to the next layer is displayed after "Relaxing".

Z-stage control

Through the Layer Control File (*.L) and its own SUPER.PRM file, SUPER allows the Stereolithographer to pass along commands to STEREO to control such items as laser beam home position, draw speed, and step size. SUPER has the most flexibility because it doesn't look at the STEREO commands. It just passes the "strings" along to STEREO at the appropriate time.

That control over the XY-laser motion has now been extended to the Z-stage. Four new commands have been added that allow the Stereolithographer to vary various Z-stage parameters:

```
ZW delay     set the Z-stage wait time (after dipping)
ZD depth     set the Z-stage dip depth (in mm)
ZV velocity  set the Z-stage velocity parameter
ZA accel     set the Z-stage acceleration parameter
```

These commands can be intermixed with STEREO commands in any way, as in:

```
1800,FUF,"SP 10,10;RC 2;ZW 10;ZD 5;RV 250"
```

This Control Layer File entry sets a new Z-stage wait time and dip depth in the midst of setting new Redraw parameters. The SP and RC commands are passed to STEREO, SUPER analyzes itself the ZW and ZD commands, then the RV command is passed to STEREO. Note that quotes are still required around the whole command string.

5.3 The Supervisor's Options

Like PARSE, SUPER has run-time options that can be appended to the part file name:

```
/S     - show stuff
/LOFF  - laser off
/ZOFF  - Z-table off
```

Running SUPER with the /S option will show all the commands SUPER sends to both the Laser Controller (STEREO) and the Z-Table Controller.

/LOFF supresses laser control and /ZOFF supresses Z-table elevator control. Neither /LOFF or /ZOFF affects the output of commands caused by /S. /LOFF and /ZOFF should be used when running the Supervisor without the appropriate control boards installed in the computer.

Negative Z-stage control has also been added to SUPER. "Negative Z-Stage" refers to when the Z-stage works backwards from the default. All the old Beta will require Negative Z-stage control, since positive Z-stage control is defined as proper operation for the new Production Betas. Following "SUPER" or the input file name with "/NEGZ" will cause the Supervisor the use Negative Z-stage control.

Two more Z-stage related options have been added to SUPER. /START defines at what layer to begin processing, and /STOP defines at what layer to end processing. SUPER will skip past all the beginning layers to the one indicated by /START and end processing just after the layer indicated by /STOP. The layer numbers that follow /START and /STOP are the internal SLICE Z-layer numbers. The following set of options will cause the Supervisor to only process layers 1200 to 1450:

```
box0035/START 1200/STOP 1450
```

The following set of options will cause the Supervisor to start processing layers beginning at 2000:

```
SUPER box0038/START 2000
```

The spaces after /START and /STOP are not necessary, nor is the case of the letters significant.

5.4 The Supervisor's Keyboard Commands

While the Supervisor is relaxing and counting down the wait period, you can now take one of four actions.

1. You can wait for the wait period to expire, at which point SUPER will begin processing the next layer.

2. You can press P to pause. When the wait period expires, SUPER will wait for a keystroke before continuing. The countdown continues, but the time left is followed by "-P". You can press P again to cancel the pause.

3. You can press C to continue. The rest of the current wait period is skipped, and SUPER begins processing the next layer immediately.

4. You can press S to skip. SUPER aborts the current wait period and asks you what layer you which to skip to. Enter the internal Z layer number and press Enter. SUPER will scan for and resume processing on that layer. If it doesn't find that layer, SUPER will end.

5.5 Using Rivets

The laser controller supports the "rivets", where the middle section of certain vectors are redrawn to help strengthen the plastic part being made. Rivets are a special implementation utilizing the laser controller's redraw mode.

Rivets work as follows:

The redraw pass count is set to 1 using the RC command. The number of redraw passes for the rivets is set with the VC command, and the rivet reduction amount (the amount to chop off of both ends of the rivet vector) is set with the VR command. Then the various step periods for the passes are set using the SP command.

The STEREO Driver processes JX,JY and NX,NY commands as before. (Section 6.3 discusses the STEREO Command Set.) When it encounters a VX,VY sequence, it constructs a rivet on this vector. Internally, this works as follows:

1. STEREO sets the step periods to the VP0 (riVet Period #0) value.
2. STEREO sets up the full vector to be drawn.
3. STEREO sets the redraw pass count to the VC value, the multi-pass step period to VP1, VP2, etc., then sets the reduced vector to be drawn and redrawn.
4. STEREO then restores the original redraw count and the orginal step periods.
5. STEREO continues processing...

The most consistent laser motion occurs with the standard redraw pass count set to 1. The standard redraw mode could be on while rivets are being processed; the standard redraw pass count could be, say, 2, while the rivet redraw pass count could be, say, 6. However, the rivet redraw will truncate the distance of redraw sections just before the rivet, and that may have an effect on rivet performance.

Rivet Implementation

Several STEREO commands support rivets. These commands all begin with 'V' (not 'R', as it is already used for "Redraw"). The code that is responsible for "making rivets" uses a combination of vector moves, jumps, and vector redraws.

| | | |
|---|---|---|
| VC 1-10 | riVet pass Count | (# passes) |
| VP 5-6553,.. | riVet step Periods | (10 us) |
| VR 0-65535 | riVet Reduction amount | (distance) |
| VX 0-65535 | riVet end X position | (position) |
| VY 0-65535 | riVet end Y position | (position) |

where:

| | |
|---|---|
| 10 us | is the # of 10s of microseconds<br>resolution = 0.84 us (from 1.19 MHz clock) |
| position | is the absolute position in the field |
| distance | is the absolute distance in step size units |
| # passes | is the number of redraw passes |

Like the SP command, the VP command has multiple arguments. Each of up to ten passes of rivet redraw can have its own step period. The VP command can have 1 to 10 arguments, each a step period for a pass:

```
VP vp0,vp1,vp2,vp3...
```

where vp0 is the step period for rivet redraw pass 0 (the full vector draw), vp1 is the step period for redraw pass 1 (the first pass of the rivet), and so on. The VP command is stuffed into the Background Command Queue FOR EACH RIVET, so try to limit the number of rivet redraw passes.

6.0 Other Programs

This chapter discusses some ancillary programs that you may never use. We feel that we should document them anyway just-in-case.

FRONT, CLIFF, and STEREO are documented in this chapter. FRONT is a FRONT end interface to the low-level laser controller, CLIFF is a program that reads STEREO commands from either the keyboard or a file and sends them to STEREO. STEREO is the Stereolithography Device Driver mentioned many times before; its full command set is documented here.

6.1 FRONT, Simple Front End to Laser Controller

FRONT is primarily a debugging tool used in developing the low-level laser controller.

To run FRONT, just type "FRONT" at a DOS prompt. FRONT doesn't care if the laser controller has been loaded or not.

FRONT displays a menu screen that looks like this:

```
            3D Systems Laser Controller Simple Front End
        Version 2.30  by Tarnz Technologies  October, 1987

 A. Laser Installed Check              50. Get Software Interrupt Number
 0. Open Laser Channel                 51. Get Background Interval Time
 1. Close Laser Channel                52. Get Laser Control Word
20. Add Vector to Command Queue        61. Set Background Interval Time
21. Add Open Shutter Command           62. Set Laser Control Word
22. Add Close Shutter Command          70. Execute
23. Add Change Time Base Command       71. Execute and Clear
24. Add Pause Command                  72. Clear
 3. Reset Command Queue                 X. Exit
 4. Get Command Queue Size
```

For the most part, FRONT is self-explanatory. You simple enter the number of the option that interests you at the "FRONT>" prompt and press Enter. FRONT will then ask you for any arguments the option might have. In the case of status options, FRONT will print out the status in a suitable format. If any errors are returned by the low-level laser controller, FRONT will print them out.

6.2 CLIFF, Control Laser Instrument From File

CLIFF stands for "Control Laser Instrument From File" and that is exactly what it does. It reads commands from a text file or optionally from the keyboard and sends them to STEREO Driver.

3D Systems personnel have found it useful to write simple BASIC programs and use CLIFF from the middle of them using the SHELL statement. Their approach to developing laser controlling programs is similar to this procedure:

1. Understand what it is to be accomplished
2. Develop the Basic algorithms and write the code, temporarily displaying intermediate results to the screen for debugging purposes
3. Make a text file filled with STEREO commands
4. Invoke CLIFF by using Basic's SHELL statement
5. See if an error was generated - if the file CLIFF.ERR exists, it contains the error description
6. Dip object being built and process next layer Somewhere in the BASIC program, the Basic statement

```
SHELL "CLIFF <data file with commands>/T/W"
```

can be found. This is the statement that temporarily suspends execution of the Basic program, executes the string as though it were an MSDOS command, then returns control back to the Basic program at the next statement.

Ordinarily when CLIFF is run, it will display a title, identifying itself and informing you about its version number. The /T option makes CLIFF transparent and forces CLIFF to not output anything to the video screen. This allows the controlling Basic program to assume complete control over the screen.

Ordinarily, CLIFF will end when it translate the last command from the data file. The /W option forces CLIFF, after reading and translating the commands in the text file, to wait until the background task idles before quitting and returning to the BASIC program.

The DOS command line syntax for CLIFF is:

```
CLIFF <datafile>/options
```

where <datafile> is the name of the data file containing the laser control information, and /options are any number of user-selectable options:

```
/S  -  show laser control information
/W  -  wait for laser idle at end
/T  -  transparency mode (no CLIFF text)
```

CLIFF can perform the wait-for-idle function (/W option) without having any data file or commands to execute. CLIFF /W and CLIFF /W/T (transparent) will make CLIFF wait for the background task to idle.

<datafile> can be replaced by a sequence of direct commands by preceding the commands with a ', ", or @ character. A semicolon can be used to separate commands. As many commands as will fit on one line can be specified. In the following example, the block mode is turned on and the laser beam moved:

CLIFF 'MD BL +; JX 1000; JY 2000; NX 4000; NY 5000; EC

If CLIFF is called up with no arguments, it will prompt with

Enter file name: _ at which point the operator should enter the name of the data file containing CLIFF-compatible commands. Direct commands can be entered here if preceded by a special character as described above.

When CLIFF is executed, it erases the CLIFF.ERR file in the currently directory if it exists. Any errors encountered during the processing of the data file will be stored in the CLIFF.ERR file as well as displayed on the screen. This feature allows for the operator to review more that a screenful of error messages, and it allows programs that called CLIFF to see what errors occured.

CLIFF reads a file, line by line, and sends the output to the STEREO device driver. Any errors indicated by STEREO are reported.

6.3 The Stereolithography Device Driver

STEREO is a memory-resident driver specially designed for Sterolithography. Its command set is intended to be somewhat compatible with General Scanning's DG Series Electronic Packages for Laser Control.

STEREO installs itself in the computer's memory when the Process Computer powers up and stays there. Any program can come along and call on STEREO to provide laser controller services.

6.3.1 STEREO Commands

STEREO understands the following commands:

| | | | |
|---|---|---|---|
| BX | 0-65535 | Beginning X position | (position) |
| BY | 0-65535 | Beginning Y position | (position) |
| JX | 0-65535 | Jump to new X position | (position) |
| JY | 0-65535 | Jump to new Y position | (position) |
| NX | 0-65535 | Next X position | (position) |
| NY | 0-65535 | Next Y position | (position) |
| SS | 1-65535 | Step Size | (rel incr) |
| SP | 5-6553,.. | multi-pass Step Periods | (10 us) |
| SD | 0-65535 | Scanning Delay | (step periods) |
| JS | 1-65535 | Jump Size | (rel incr) |
| JD | 0-65535 | Jump Delay | (step periods) |
| LO | 0-65535 | Laser On delay | (10 us) |
| LF | 0-65535 | Laser Off delay | (10 us) |
| NS | | eNter Sequence mode | - |
| AB | | Enter Absolute mode | - |
| EX | | Execute | - |
| EC | | Execute and Clear | - |
| CL | | Clear table | - |
| MD | AS -/+ | set Auto-Shutter mode | (off/on) |
| MD | BL -/+ | set BLock mode | (off/on) |
| MD | PA -/+ | set Pos Ack mode | (off/on) |
| SR | | Soft Reset | |
| HR | | Hard Reset | |
| RC | 1-10 | Redraw pass Count | (# passes) |
| RD | 0-65535 | Redraw Delay | (step periods) |
| RS | 0-65535 | Redraw Size | (distance) |
| VC | 1-10 | riVet pass Count | (# passes) |
| VP | 5-6553,.. | riVet step Periods | (10 us) |
| VR | 0-65535 | riVet Reduction amount | (distance) |
| VX | 0-65535 | riVet end X position | (position) |
| VY | 0-65535 | riVet end Y position | (position) |
| WI | 0-32767 | Wait for Idle | (delay) |

where:

10 us — is the # of 10s of microseconds
resolution = 0.84 us (from 1.19 MHz clock)

| | |
|---|---|
| position | is the absolute position in the field range in 0 to 65535 |
| distance | is the absolute distance in step size units |
| rel incr | is the relative # of position increments |
| # passes | is the number of redraw passes |
| step periods | is the time to cover that # of steps programmed by SP command (= tick counts) |
| delay | delay value in milliseconds (may be faster on faster computers) |

In the above list, following each two-character command is the range of numbers allowed as arguments to the command. All numbers are in unsigned decimal.

BX and BY set the laser beam's home position. This is the position in the field that the laser beam will be place at when there is no part-making activity.

JX and JY move the laser beam to a new location quickly. No polymerization takes place.

The Jump is conditioned by JS and LD. JS defines the Jump Size, the number of field units to jump at one time. This is usually a large number, like 10000. JD sets the number of step period delays once the jump movement have been completed. This lets the mechanical mirrors settle.

NX and NY move the laser beam to a new location slowly. Polymerization does take place.

The slow laser beam movement is controlled by SS, SP, and SD. SP defines the Step Period, the time for each discrete laser step. SS defines the Step Size, the number of units in the field to move each step period. SD is the delay once the laser beam reaches its destination.

LO and LF set the Laser On and Laser Off delays going into and out of the idle mode. These are delays for the homing and unhomeing of the laser beam.

NS and AB are accepted but not acted upon. They are provided simply for General Scanning compatibility.

On the SLA-1, we usually use MD AS -, MD BL +, and MD PA -. MD BL + turns on the block mode, where laser controller commands are queue up and then let go with the EX or EC command. This technique prevents unnecessary idle times.

EX causes then lase set of commands to be executed. Another EX will cause the same set of commands to be executed again. EC executes, but then clears out the commands. CL clears out the command without executing. With the block mode on, nNo commands will be interpreted unless EX or EC is used.

SR and HR reset the low-level laser controller. HR is the most useful since it stops all current activity and empties out all the previous commands. HR can be used at the beginning of programs.

RC, RD, and RS control the Redraw parameters. Redraw is where the laser controller makes multiple passes over the same vectors. RC defines the pass count, RD the delay before starting a pass, and RS the size of the redraw. Every RS potion of the vectors will be redrawn if RC is greater than 1.

VC, VP, VR, VX, and VY control the Rivet feature. Discussed in more detail in Section 5.5, rivets are where the interiors of a vectors are redrawn. VC defines the number of redraw passes, VP the multiple step periods, one for each pass, and VR the amount to chop off of both end of the vector. Zero and negative length vectors are not redrawn. To tell STEREO a vector is a rivet, use VX and VY instead of NX and NY.

WI waits for idle. WI's parameter is some delay so that the low-level laser controller will have time to synchronize with STEREO. Typically, WI 1000 will work just fine.

The SP (and VP) command has multiple arguments. Each of up to ten passes of redraw can have its own step period. The SP command can have 1 to 10 arguments, each a step period for a pass:

```
SP sp0,sp1,sp2,sp3...
```

where sp0 is the step period for redraw pass 0 (the original vector move), sp1 is the step period for redraw pass 1, and so on.

The command line with invokes STEREO and causes it to be installed in memory takes the form:

```
STEREO [/options]
```

where /options are any number of user-selectable options:

```
/NV  -  no constant vector velocity
/NG  -  no geometric correction
/NC  -  no version check at install time
```

STEREO can only be installed once after the computer has been powered up. If different options are required, the computer system will have to be completely rebooted.

Geometric correction is automatically invoked. If geometric correction is not desired, the option /NG should be specified in the command line. Geometric correction occurs on the endpoints of any vector STEREO passes to the low-level laser controller.

6.3.2 STEREO Options

LASER and STEREO are installed automatically when the Process Computer starts up. LASER contains the low-level laser controller and has no options. STEREO, on the other hand, has options. For the most part, these options are of little interest, but are documented for the sake of completeness.

Axes Control

Because we have SLA units with axes going in different dirrections, we installed Axes Control into the STEREO driver. When STEREO is brought up, either by the user typing or from an AUTOEXEC.BAT file, the following options can be use to set the axes:

/X+ X-axis is positive. This is the current default.
/X- X-axis is negative. Using this flips the direction of the X-axis.

/Y+ Y-axis is positive. This is the current default.
/Y- Y-axis is negative. Using this flips the direction of the Y-axis.

/SWAPXY swaps the X and Y coordinates BEFORE any other axis or geometric correction operation. Swapping is not ordinarily done.

Here's a sample DOS command line that installs STEREO with the X-axis direction changed. Note that STEREO must not have already been installed.

STEREO/X-

STEREO reports to you the axes orientation it is going to use when it installs itself. Check this and make sure you got what you asked for.

Geometric Correction

Geometric Correction has been installed in STEREO. Geometric Correction now not only corrects for the pincushion distortion, but also for the imprecisions of each individual SLA unit.

We call the current correction technique Table-Interpolation Geometric Correction because the correction is done after performing look-ups in a special table. This table maps the linear XY coordinate system in a distored one that ends up cancelling the real SLA unit's distortion. The look-up table is stored in a file generated by CALIB, the SLA machine calibration program. STEREO's /NG option will cancel Geometric Correction.

The look-up table has 65 by 65 entries, one entry for each 1024 steps across the X and Y axes plus the end. Remember each axis has a resolution of 65536 steps. The table is stored in the ASCII file STEREO.GEO (see Section 6.7), which is read when STEREO installs itself. If STEREO can't find STEREO.GEO or if it detects some problem with it, it will display an appropriate message.

Each SLA machine will have a different STEREO.GEO based on the results of its calibration. One machine's Geometric Correction will not be the same as that for any other in maintaing the desired mil-accuracy. (The other machine will still run; the parts it makes may seem strange, however.) Think about recalibrating if you move around STEREO.GEO files.

7.0 File Formats

This chapter describes the various Stereolithography file formats. Of these, the ones you will become the most familar with are the Layer Control File (*.L) and the SUPER.PRM Default Parameters File.

7.1 SLICE's Input File (*.STL) Format

A CAD program must be able to produce a file with the specific format described below. Usually this file is quite large is size (several hundred thousand bytes) and is transferred over a high-speed data link such as Ethernet to the 386-based Stereolithography Computer. Transfers of smaller-size files using RS-232 and floppy diskettes are also possible but not recommended.

The SLICE Input Format loosely follows a graphics standard called PHIGS (Programmers Hierarchical Interactive Graphics Standard), and improves on it in several ways. First, all the numeric data can be compressed into binary form, greatly reducing the size of storage files and reducing the data transfer time to the Stereolithography Computer. Second, support of special part-building attributes allow certain features to be "attached" to facets and passed all the way down the pike to the Part-Making Supervisor.

Files being submitted to SLICE should has the extension ".STL", that is, the names of the files should end in ".STL". When SLICE is run and no extension is supplied, SLICE will automatically assumes a ".STL" extension. Older files that has a ".DAT" extension in their file name should either be renamed or have their file names specified completely in SLICE's command line (see Section 2.1).

The files can be stored in either ASCII or Binary. We recommend using the ASCII format while developing STL-file-making software and then switching to the binary format for release. Older versions of SLICE, pre-SLICE17 do not support the binary format.

An example of an ASCII STL file follows. It defines a simple tetrahedron.

```
solid Solid_Tetra.2
  facet normal -1 0 0
    outer loop
      vertex 0 0 0
      vertex 0 0 1
      vertex 0 1 0
    endloop
  endfacet
  facet normal 0 -1 0
    outer loop
      vertex 0 0 0
      vertex 1 0 0
      vertex 0 1 0
      attribute 16
    endloop
  endfacet
  facet normal 0 0 -1
    outer loop
      vertex 0 0 0
      vertex 0 1 0
      vertex 1 1 0
      attribute 16
      attribute 9
      attribute 22
    endloop
  endfacet
    :       :
endsolid Solid_Tetra.2
```

The important structure for an ASCII STL file is its use of words to identify the type of numeric data. The facet normal and vertex information can be in floating point - numbers like 43.332382912 and 1.3045E+3 are acceptable.

The vertices should follow the right-hand rule. The normal vector should have a magnitude of 1.

We assume a word is 16 bits and is equal to two bytes. The precise format for a Binary STL file is:

```
  (top of file)
  80 bytes - general information
             contains part names, comments, etc.

   2 words - number of facet records
             each facet record defines one triangle

  First facet record:
   6 words - Normal Vector
              2 words - i coordinate
              2 words - j
              2 words - k
  18 words - Triangle Vertices
              2 words - x1 )
              2 words - y1 )-first vertex
              2 words - z1 )
              2 words - x2    )
              2 words - y2    )-second vertex
              2 words - z2    )
              2 words - x3       )
              2 words - y3       )-third vertex
              2 words - z3       )
   1 word  - Number of Attributes
              < special attribute formats >
              This word should be set to zero
      :       :       :
```

The STL Binary Format is similar in structure to the ASCII format. One facet record follows another, and each facet record defines a normal, three triangle vertices, and optionally some attributes. Since we don't as yet support attributes, the attribute count word should be set to zero.

The binary format for the number of facet records and for each number of attributes is just an unsigned integer. The normal and triangle vertices are in four-byte 8087 real format, with a 3 byte mantissa and a 1 byte exponent.

7.2 SLICE's Output File (*.SLI) Format

SLICE produces one output file for each input file. By default, each output file has the extension ".SLI". The current format for the output file is as follows:

```
!
!  optional comments
!
L <layer1>                      L-block (mandatory)
LB                              non-L blocks are only present when
 <X1> <Y1> <X2> <Y2>              they have vectors
 <X1> <Y1> <X2> <Y2>
 <X1> <Y1> <X2> <Y2>              LB   - Layer Border
 <X1> <Y1> <X2> <Y2>
   :    :
LH                                LH   - Layer Hatch
 <X1> <Y1> <X2> <Y2>
   :    :
NFDB                              NFDB - Near-Flat Down-skin Border
 <X1> <Y1> <X2> <Y2>
   :    :
NFDH                              NFDH - Near-Flat Down-skin Hatch
 <X1> <Y1> <X2> <Y2>
   :    :
NFUB                              NFUB - Near-Flat Up-skin Border
 <X1> <Y1> <X2> <Y2>
   :    :
FDF                               FUF  - Flat Down-skin Fill
 <X1> <Y1> <X2> <Y2>
   :    :
NFDF                              NFDF - Near-Flat Down-skin Fill
 <X1> <Y1> <X2> <Y2>
   :    :
NFUF                              NFUF - Near-Flat Up-skin Fill
 <X1> <Y1> <X2> <Y2>
   :    :
FUF                               FUF  - Flat Up-skin Fill
 <X1> <Y1> <X2> <Y2>
   :    :
L <layer2>                       second Z-layer of file
   :    :                          (format repeats)
   :    :
```

where <X1> <Y1> <X2> <Y2> are the two coorinates of a vector in X-Y space, four ASCII numbers
<X1> <Y1> is the start of the vector
<X2> <Y2> is the end of the vector 7.3 The Parser's Output File (*.P and *.L) Format For a given set of input files, PARSE will produce one *.L file (* represents any set of DOS filename characters) and one *.P file. The *.L file is small and contains layer information, and the *.P file contains the combined vectors.

The *.P file is similar in appearance to the original *.SLI files but differs in three ways.

First, the *.P file is the result of combining all the input files together to form a single vector file for the Supervisor. PARSE had juggled the input files so that all the layers are in ascending order - just the way the Supervisor expects them.

Second, if told to do so, PARSE has selectively included or excluded certain types of blocks, so the vectors for the excluded blocks will not appear in the *.P file.

Third, PARSE has tacked on a file and layer identifier to each block header in the *.P file. Whereas the input line was just:

```
LH
```

PARSE may output to the *.P file:

```
LH2,7800
```

indicating that the block came from the second input file and belongs on layer 7800.

The *.P files can get quite long, so editing them might require a editor that can go beyond 64K of characters. Smaller files of course can be easily edited by virtually any editor.

The *.L files are the most interesting. For each block output to the *.P file, a corresponding single-line entry was made to the *.L file. In addition, a #TOP and a #BTM line-entry wad made for each layer - the #TOP just above and the #BTM just below the layer's other block entries. Here's a sample:

```
7800: L1 LB1 LH1 NFDB1 NFDH1 FDF1 NFDF1 L2 LB2
Waiting... Dipping... Relaxing...0
7810: L1 LB1 LH1 L2 LB2 NFUB2 NFUF2 FUF2

* 1000,50,.508
7800,#TOP
7800,L1
7800,LB1
7800,LH1
7800,NFDB1,"SP 3;RC 1"
7800,NFDH1
7800,FDF1
```

```
7800,NFDF1
7800,L2
7800,LB2
7800,#BTM
7810,#TOP
7810,L1
7810,LB1
7810,LH1
7810,L2
7810,LB2
7810,NFUB2
7810,NFUF2
7810,FUF2
7810,#BTM
   :
```

The first line contains the scale, Z-spacing, and layer thickness as told to PARSE. These values are picked up later by the Supervisor.

Note that each line starts with the layer number, followed by the block type. Any line can be followed by:

,"<override commands>"

which contains override commands. The override command is the last STEREO command string sent to the STEREO device driver before drawing the block's vectors, and it can override previously set laser control defaults. Line 7800,NFDB1 above contains such a line. PARSE does not ever make any override commands - only the operator can do that. The override feature is discussed in more detail in Section 5.1.

7.4 Critical Area File (*.BOX) Format

Version 2.04 supports critical areas, where the Supervisor can be instructed to perform or not to perform something within the confines of a box. For a given part with a file name prefix of <part>, PARSE attempts to read the <part>.BOX file. If it doesn't see the file, it simply prints out a warning message and continues. Otherwise, it reads in the file and analyzes it while parsing.

The Format for the *.BOX file is:

```
<type>,<base>,<height>,<x1>,<y1>,<x2>,<y2>,<x3>,<y3>,<x4>,<y4>
   :     :      :     :
```

where:

<type> is 'XV' to rivet cross-hatches in the enclosed area
or 'XI' to ignore cross-hatches <base> is the base of the box relative to the scale
<height> is the height of the box
<x1>,<y1> is the first coordinate of the box
<x2>,<y2> is the second coordinate
<x3>,<y3> is the third coordinate
<x4>,<y4> is the fourth coordinate If the CAD image was drawn in mils (1000ths of inches) and the scale factor is 1000, then:

```
XV,8.0,0.3,1,1,1,-1,-1,-1,-1,1
XI,7.90,0.2,2,2,2,-0.5,-3,-2,-1,3.1
```

defines two boxes, one 3/10 and one 2/10 inches high. The first box tells where cross-hatching with rivets will occur, and the second box tells where no cross-hatching will occur. All the coordinates are expressed in inches.

The current box algorithm supports only lines on the X and Y-axes. Only rectangles can be specified. Don't specify diamonds or near-triangles. If you need to isolate a precise area, use a set of rectangles that nearly approximate it.

7.5 Supervisor Default Parameters File (SUPER.PRM) Format

Blank lines and lines starting with ! are ignored. The first few lines contain fixed Supervisor parameters that can only be affected by changing the numbers there. The rest of the file contains the default settings for the various blocks.

```
!
!  Supervisor Parameter File
!  Version 2.30
!
!  last altered: 9/28/87
!        reason: to test new SUPER Default Option line in this file
!


!
!  Default SUPER Options
!
!  place options together inside of quotes;  use "" if no options
!  /NEGZ required for some prototype units
!
""


!
!  General Parameters
!
800     Elevator board base address
50      Elevator pitch parm, 100 for alphas, 50 for betas
1.0     XY-only scale factor; does not affect Z-axis
0       X-coordinate offset
0       Y-coordinate offset
750     Max number of vectors to send to Stereo

!
!  - Block defaults -
!
!  Each time the Supervisor starts a block, the respective default
!  string below is sent to the Stereo driver.  Z,X... are the block
!  types (Z-Boundary, X-Cross-Hatch, etc.) and they are followed
!  by the parse input file number (e.g. 1 may be for post vectors
!  and 2 for object vectors).  Although only defaults for 2 Slice
!  files are set for here, up to 10 files are supported.
!
#TOP,"BX 8500;BY 34300"          ! laser beam begin (home) position

LB1,"RD 1;RS 300;RC 1;           ! redraw delay, size, count
        SP 25;                   ! step period
        JD 0;                    ! jump delay
        SS 2"                    ! step size
NFDB1,"RD 1;RS 300;RC 1;SP 25;JD 0;SS 2"
LH1,"RC 1;SP 25;JD 0;SS 2;
        VC 5;                    ! rivet count
        VR 99;                   ! rivet reduction amount
```

```
      VP 11,12,13,14,15"       ! rivet step periods
NFDH1,"RC 1;SP 25;JD 0; SS 2;VC 5;VR 99;VP 11,12,13,14,15"
FDF1,"RC 1;SP 25;JD 0;SS 16"
NFDF1,"RC 1;SP 25;JD 0;SS 16"
NFUF1,"RC 1;SP 50;JD 0;SS 16"
FUF1,"RC 1;SP 10;JD 0;SS 16"

LB2,"RD 1;RS 300;RC 1;SP 25;JD 0;SS 2"
NFDB2,"RD 1;RS 300;RC 1;SP 25;JD 0;SS 2"
LH2,"RC 1;SP 25;JD 0;SS 2;VC 5;VR 99;VP 11,12,13,14,15"
NFDH2,"RC 1;SP 25;JD 0; SS 2;VC 5:VR 99;VP 11,12,13,14,15"
FDF2,"RC 1;SP 25;JD 0;SS 16"
NFDF2,"RC 1;SP 25;JD 0;SS 16"
NFUF2,"RC 1;SP 50;JD 0;SS 16"
FUF2,"RC 1;SP 10;JD 0;SS 16"

#BTM,"ZW 10;                   ! Z-axis wait time in seconds
      ZD 5;                    ! Z-axis dip depth in mm
      ZV 0.8;                  ! Z-axis velocity parameter
      ZA 0.1"                  ! Z-axis acceleration parameter
```

The file lets the STEREO commands be intermixed with the special Supervisor Z-stage commands. Command strings can be broken up into several lines, and comments (beginning with an !) can be at the end of any line.

7.6 The STEREO.DEF Driver Default File Format

Below is a copy of the STEREO.DEF file supplied with the system. These are the default values loaded by STEREO when it is installed. You may never need to change any of these values in this file. In fact, the Supervisor always resets these parameters using the appropriate lines from the SUPER.PRM and *.L files.

```
!
!  STEREO Device Driver Initial Set-up
!
2      [SS] Step Size
1190   [SP] Step Periods
64     [SD] Scan Delay
65535  [JS] Jump Size
100    [JD] Jump Delay
0      [LO] Laser On Delay
0      [LF] Laser Off Delay
1      [RC] Redraw Pass Count
0      [RD] Redraw Delay
200    [RS] Redraw Size
2      [VC] Rivet Pass Count
1190   [VP] Rivet Step Periods
100    [VR] Rivet Reduction Amount
```

7.7 The STEREO.GEO Geometric Correction File Format

The geometric correction look-up table has 65 by 65 entries, one entry for each 1024 steps across the X and Y axes plus the end. Remember each axis has a resolution of 65536 steps. The table is stored in the ASCII file STEREO.GEO in the \3DSYS directory, which is read when STEREO installs itself. If STEREO can't find STEREO.GEO or if it detects some problem with it, it will display an appropriate message.

So, the format for the look-up table is as follows:

```
!
!  Comment Lines (optional)
!

65,65,2            ! 65 by 65 by 2 coordinates
102.34,134.56      ! correction for (0,0)
101.23,123.45      ! correction for (0,1024)
   :       :        :
102.41,144.33      ! correction for (0,65536)
98.767,102.22      ! correction for (1024,0)
96.352,100.034     ! correction for (1024,1024)
   :       :        :
```

Note that even though we are mapping onto an integer-system, the correction table can have floating-point numbers. The first non-coment line must contain "65,65,2" as that is the only geometric correction format currently supported by STEREO.

Each SLA machine will have a different STEREO.GEO based on the results of its calibration. One machine's Geometric Correction will not be the same as that for any other in maintaing the desired mil-accuracy. DO NOT COPY STEREO.GEO FILES FROM ONE SLA MACHINE TO ANOTHER.

Appendix A - SLA-1 Software System Chart

| - Process Computer - | | - Slice Computer - |
|---|---|---|
| | Start-Up Installation | |
| MSDOS<br>TCP<br>LASER<br>STEREO | | XENIX<br>TCP |
| | Menu Programs | |
| MENU | | |
| | System Functions | |
| CHKDSK<br>DIR<br>DOS<br>QD2 | | SYSADM |
| | Slicing Programs | |
| | | UI<br>SLICE |
| | Part-Making Programs | |
| PARSE<br>SUPER<br>GRAPH | | |
| | Utility Programs | |
| POWER<br>GETSP<br>ZSTAGE<br>CALIB<br>PROFILE | | |
| | Communication Programs | |
| TELNET<br>FTP | | TELNET<br>FTP |

Appendix B - The STEREO Command Set

STEREO Command Set is intended to be somewhat compatible with General Scanning's DG Series Electronic Packages for Laser Control.

STEREO understands the following commands:

| | | |
|---|---|---|
| BX 0-65535 | Beginning X position | (position) |
| BY 0-65535 | Beginning Y position | (position) |
| JX 0-65535 | Jump to new X position | (position) |
| JY 0-65535 | Jump to new Y position | (position) |
| NX 0-65535 | Next X position | (position) |
| NY 0-65535 | Next Y position | (position) |
| SS 1-65535 | Step Size | (rel incr) |
| SP 5-6553,.. | multi-pass Step Periods | (10 us) |
| SD 0-65535 | Scanning Delay | (step periods) |
| JS 1-65535 | Jump Size | (rel incr) |
| JD 0-65535 | Jump Delay | (step periods) |
| LO 0-65535 | Laser On delay | (10 us) |
| LF 0-65535 | Laser Off delay | (10 us) |
| NS | eNter Sequence mode | - |
| AB | Enter Absolute mode | - |
| EX | Execute | - |
| EC | Execute and Clear | - |
| CL | Clear table | - |
| MD AS -/+ | set Auto-Shutter mode | (off/on) |
| MD BL -/+ | set BLock mode | (off/on) |
| MD PA -/+ | set Pos Ack mode | (off/on) |
| SR | Soft Reset | |
| HR | Hard Reset | |
| RC 1-10 | Redraw pass Count | (# passes) |
| RD 0-65535 | Redraw Delay | (step periods) |
| RS 0-65535 | Redraw Size | (distance) |
| VC 1-10 | riVet pass Count | (# passes) |
| VP 5-6553,.. | riVet step Periods | (10 us) |
| VR 0-65535 | riVet Reduction amount | (distance) |
| VX 0-65535 | riVet end X position | (position) |
| VY 0-65535 | riVet end Y position | (position) |
| WI 0-32767 | Wait for Idle | (delay) |

where:

| | |
|---|---|
| 10 us | is the # of 10s of microseconds<br>resolution = 0.84 us (from 1.19 MHz clock) |
| position | is the absolute position in the field<br>range in 0 to 65535 |
| distance | is the absolute distance in step size units |
| rel incr | is the relative # of position increments |
| # passes | is the number of redraw passes |
| step periods | is the time to cover that # of steps<br>programmed by SP command (= tick counts) |

delay delay value in milliseconds (may be faster on faster computers)

Section 6.3.1 discusses these commands in more detail.

Appendix C - Stereolithography Software Glossary

Below, we present a sofware glossary of terms you may have encountered in this documentation or may hear in the future. Please take a few minutes to review these terms.

80286 - the 16-bit microprocessor in the Process Computer.

80386 - the 32-bit microprocessor in the Slice Computer.

block - a set of vectors in a file critical area - an area where vectors will be treated special cross-hatching - supporting cross-vectors between the inside and outside walls of a part Ethernet - a high-speed intra-computer communications system jointly developed by Digital, Intel and Xerox field - the surface of the vat that the laser beam can reach filling - the process by which part surfaces are made geometric correction - adjusting the laser beam for the pincushion effect home position - the field location that the beam jumps to when there is no part-making activity laser controller - the software "underneath" the Supervisor that controls the laser's motion jump - the quick, non-polymerization moving of the laser beam jump delay - the delay after a jump allowing the mirrors to settle mirrors - those which rotate to position the laser beam anywhere in the field MSDOS - the standard Disk Operating System for the Process Computer multi-tasking - where many people can use the same computer simultaneously pincushion effect - the inherent distortion of a pin-point source being directed onto a flat surface process - the act of making a part Process Computer - the computer in the SLA machine that is used to make parts; MSDOS-based redrawing - making multiple passes of the laser beam over the same vector to induce strength rivets - an intelligent method of redrawing where the extra passes are made over a smaller area segment - two-coordinate, four-point describing a line shutters - barriers of the laser beam slicing - the act of preparing a 3D part for Stereolithography by transforming it into 2D layers Slice Computer - the computer away from the SLA machine that is use to slice parts; XENIX-based step - a discrete movement of the laser beam step period - the period during which one step is made step size - the number of field units for a step unix - an advanced multi-tasking operating system developed at Bell Labs in the 70's XENIX - a unix-like Operating System provided on the Slice Computer Z-stage - the vectical elevator parts rest on

Appendix D - Editor Commands

The Editor Commands are similar to those of Word-Star, a popular Word Processing System, and to those found in the Borland International family of products.

Basic Cursor Movement Commands

| | |
|---|---|
| character left | Ctrl-S or Left |
| character right | Ctrl-D or Right |
| word left | Ctrl-A |
| word right | Ctrl-F |
| line up | Ctrl-E or Up |
| line down | Ctrl-X or Down |
| scroll up | Ctrl-W |
| scroll down | Ctrl-Z |
| page up | Ctrl-R or PgUp |
| page down | Ctrl-C or PgDn |

Quick Cursor Movement Commands

| | |
|---|---|
| beginnning of line | Ctrl-Q S or Home |
| end of line | Ctrl-Q D or End |
| top of window | Ctrl-Q E |
| bottom of window | Ctrl-Q X |
| top of file | Ctrl-Q R |
| bottom of file | Ctrl-Q C |
| beginning of block | Ctrl-Q B |
| end of block | Ctrl-Q K |
| last cursor position | Ctrl-Q P |

Insert and Delete Commands

| | |
|---|---|
| insert mode on/off | Ctrl-V or Ins |
| insert line | Ctrl-N |
| delete line | Ctrl-Y |
| delete to end of line | Ctrl-Q Y |
| delete character to left of cursor | Ctrl-H or Backspace |
| delete character under cursor | Ctrl-G or Del |
| delete word right of cursor | Ctrl-T |

Block Commands

| | |
|---|---|
| mark block-begin | Ctrl-K B |
| mark block-end | Ctrl-K K |
| mark single word | Ctrl-K T |
| copy block | Ctrl-K C |
| delete block | Ctrl-K Y |
| hide/display block | Ctrl-K H |
| move block | Ctrl-K V |
| read block from disk | Ctrl-K R |
| write block to disk | Ctrl-K W |

Miscellaneous Commands

| | |
|---|---|
| find | Ctrl-Q F |
| find and replace | Ctrl-Q A |
| repeat last find | Ctrl-L |
| abort operation | Ctrl-U |
| restore line | Ctrl-Q L |
| quit edit | Ctrl-K D |

3D Systems Software Manual Addendum #1
SLICE REVEALED TO EVERYBODY
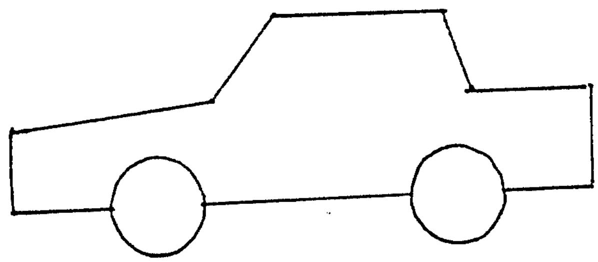
GENERIC
AMERICAN
AUTOMOBILE,
CIRCA 1973
SIDE VIEW (NO DETAIL)
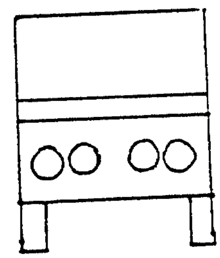
FRONT VIEW. (NO DETAIL)
THE GEOMETRIC MODEL SLICE WOULD GET AS INPUT: (NO TIRES)
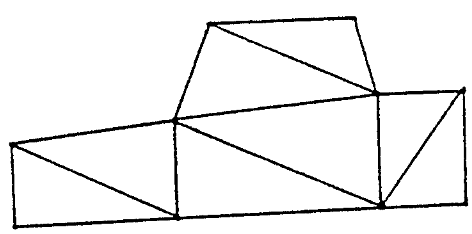
SIDE
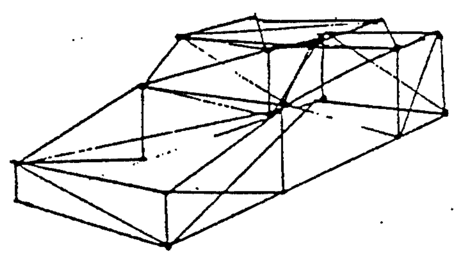
(IT'S ALL TRIANGES)
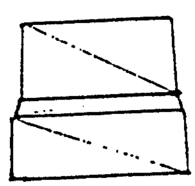
FRONT (NO TIRES)
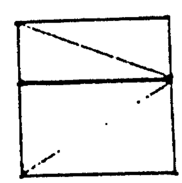
BACK EXPLODED VIEW
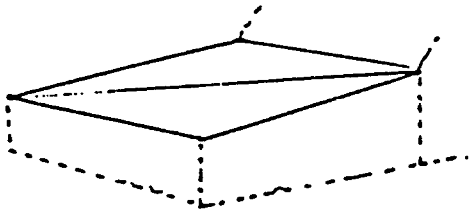
THE HOOD
(2 TRIANGES —
THEY ARE "NEAR FLAT")
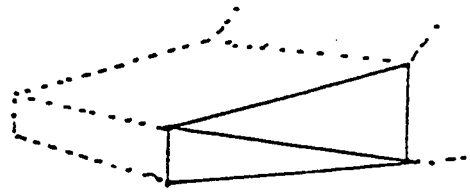
THE FENDER
(2 TRIANGES —
THEY ARE "SCAN"
TRIANGLES)
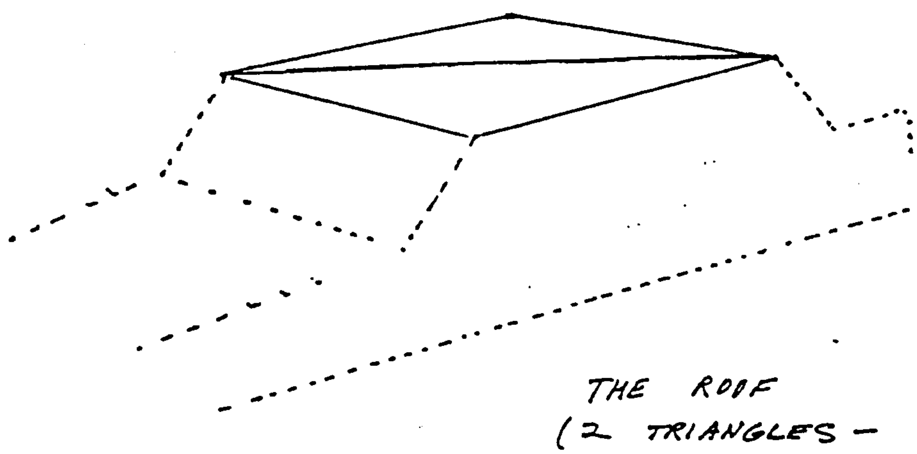
THE ROOF
(2 TRIANGLES —
THEY ARE "FLAT")
ALL THE OTHER TRIANGLES THAT COMPRISE THE CAR MODEL MUST BELONG TO ONE OF THESE TYPES, FLAT, NEAR-FLAT, OR SCAN.

SLICE ORDERS THE TRIANGLES
BY TYPE AND HEIGHT
THE <u>FLAT</u> TRIANGLES
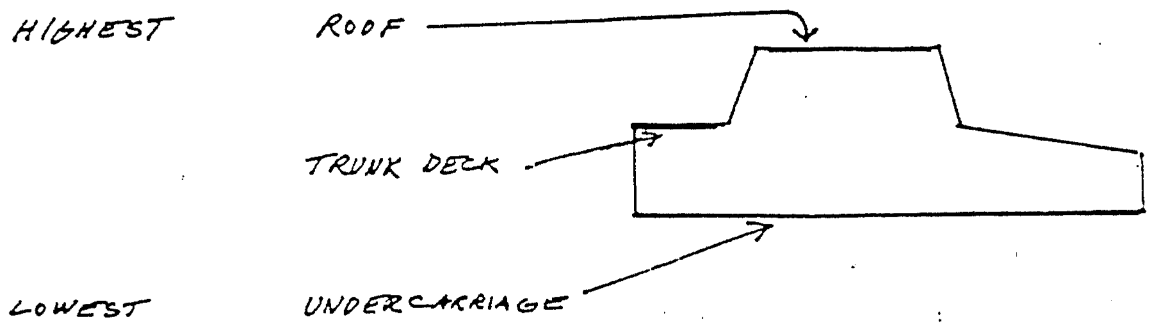
THE <u>NEAR-FLAT</u> TRIANGLES
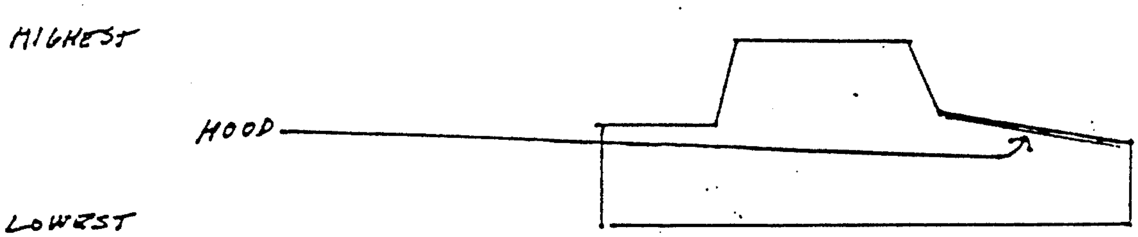

. . . AND THE SCAN TRIANGLES ARE ORDERED BY THEIR LOWEST CORNER
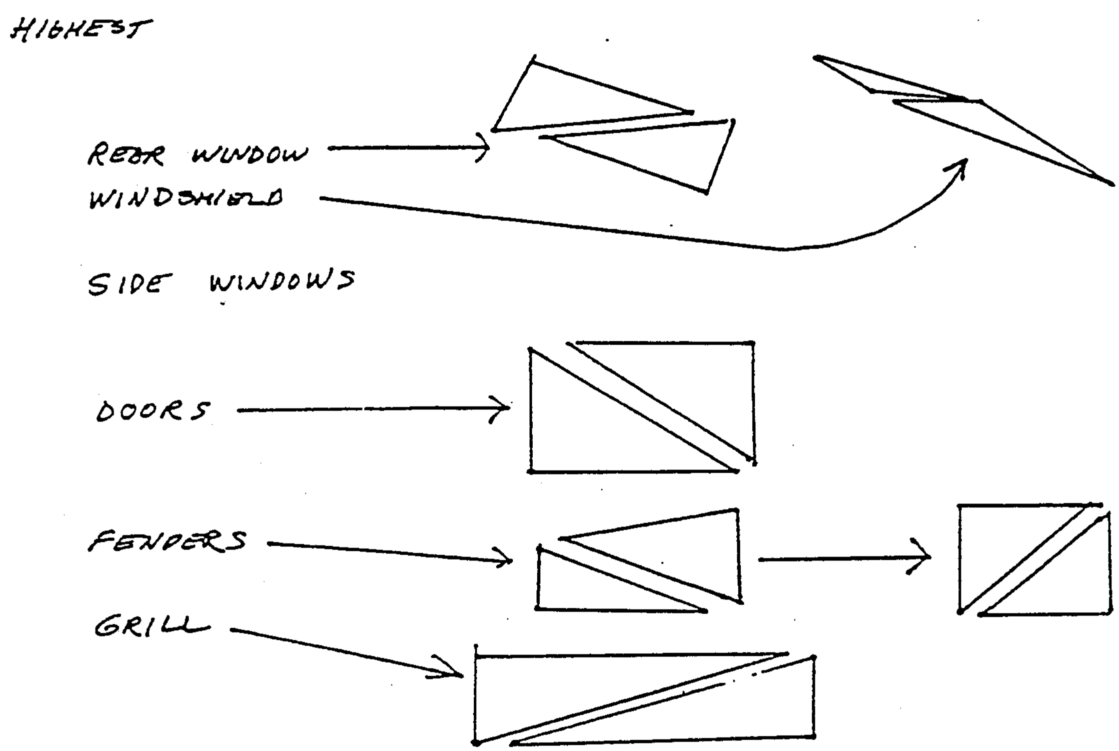
(ACTUALLY, DOORS, FENDERS, AND GRILL TRIANGLES COULD HAVE THE SAME LOWEST CORNER, BUT WE SHOW THEM HERE FOR CLARITY).
LOWEST NOW, WE WANT TO PROVIDE THE LASER CONTROLLER SO IT CAN MAKE AN OBJECT LIKE THIS . . .
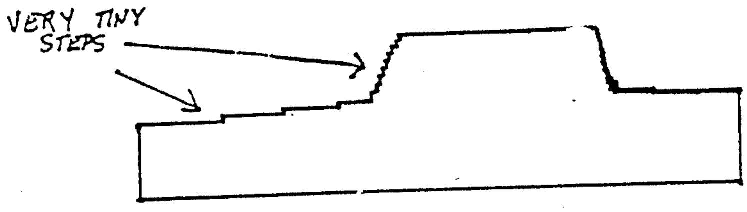
AS IF WE HAD TO SLICE THE CAR AND STACK THE SLICES.
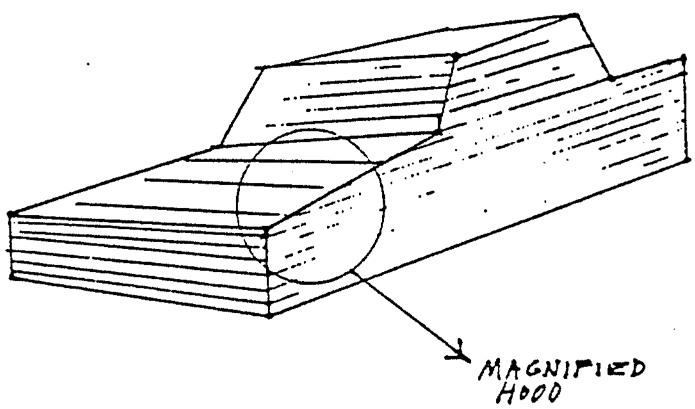
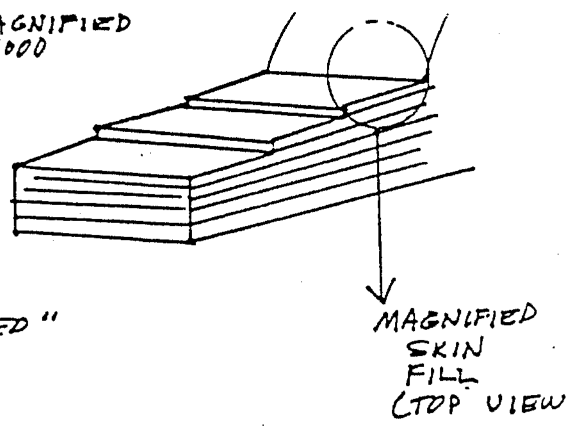
THE NEAR-FLAT TRIANGLES AND FLAT TRIANGLE CAN BE "SKIN-FILLED"
FILLING IS A VERY FINE CROSS HATCHING BY THE LASER TO MAKE THE SURFACE SMOOTH
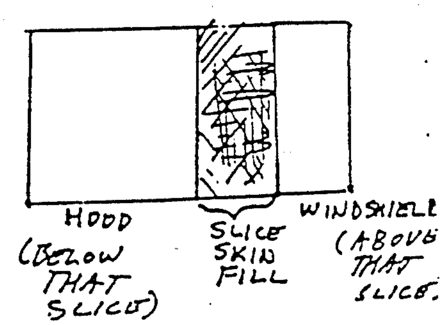

HOW IS A SLICE FORMED?
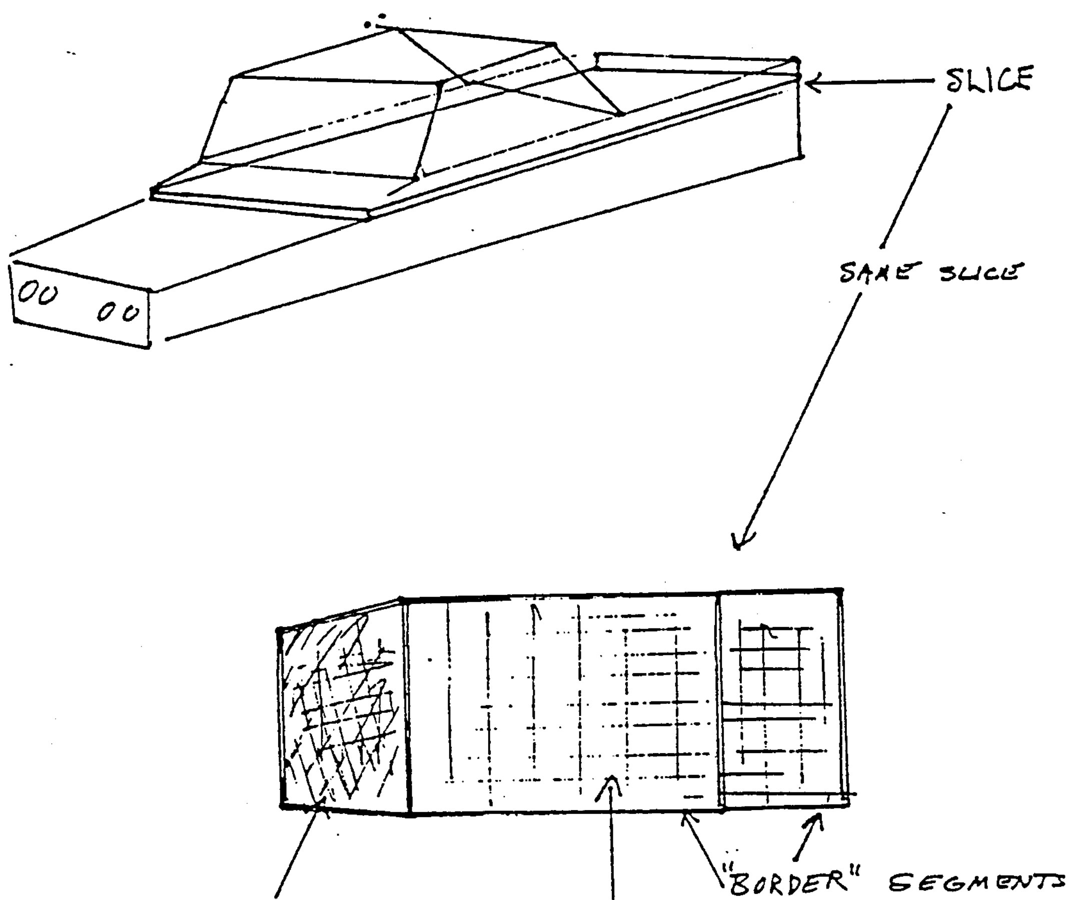
THIS PART GETS SKIN FILLED BECAUSE IT IS "NEAR-FLAT"
"BORDER" SEGMENTS ENCLOSE THE PERIMETER OF THE SLICE
THE SLICE CROSS SECTION IS RECTANGULAR ONLY BECAUSE OUR CAR WAS A BOXY DESIGN.
INTERIOR BETWEEN BORDERS GETS CROSS HATCHED SO THE SLICE HAS SOME STRENGTH FOR THE NEAR-FLAT TRIANGLES SLICE MAKES TRAPEZOIDS:
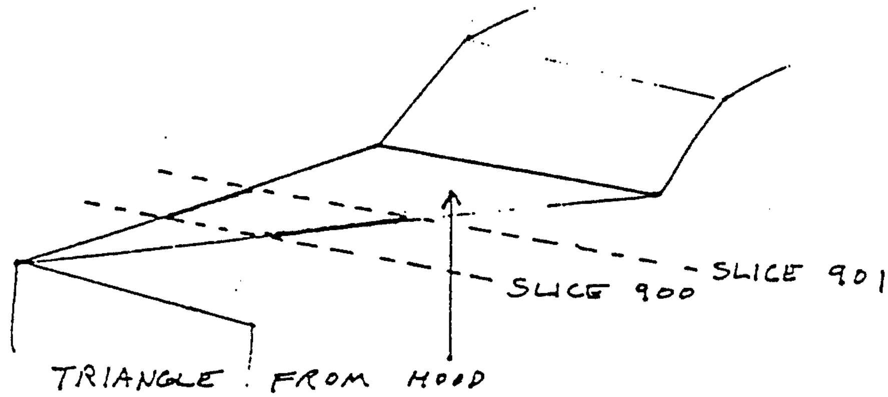
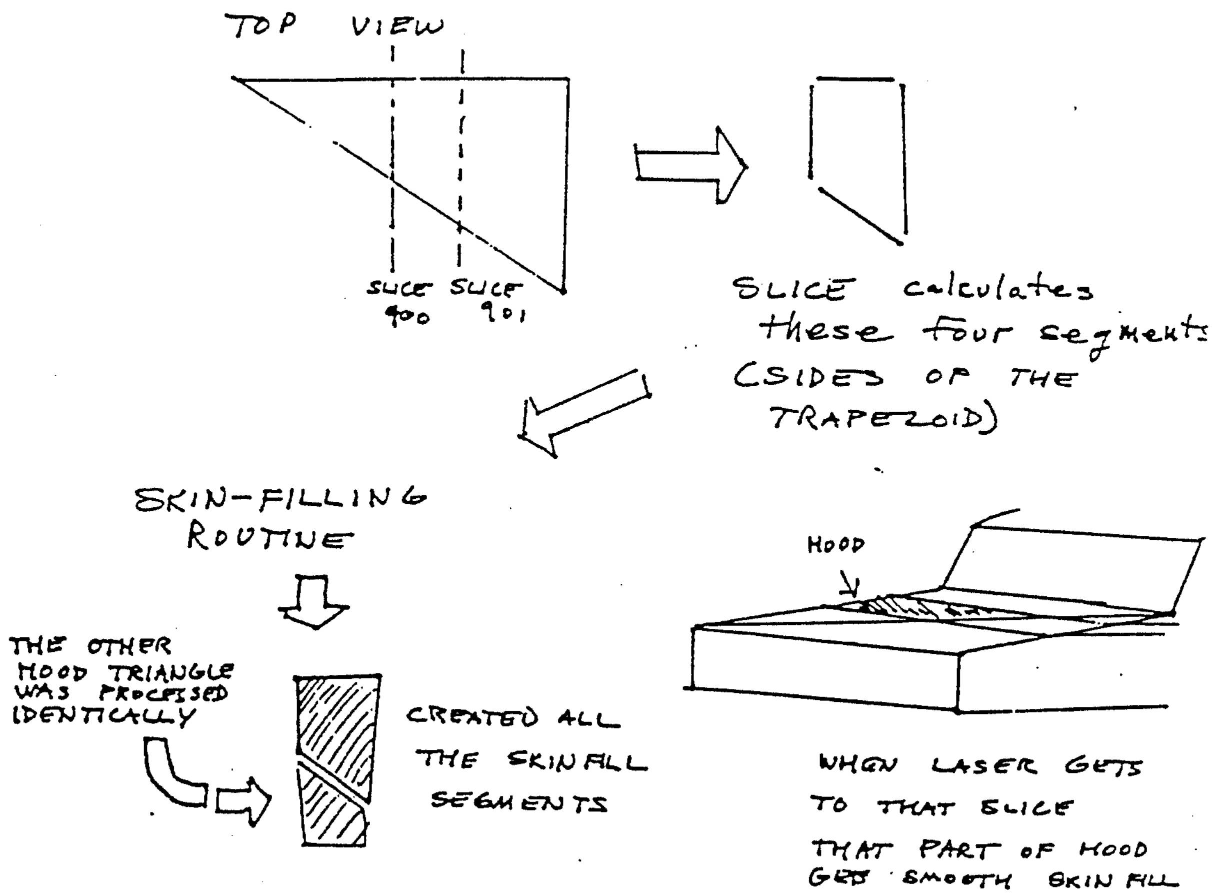

FLAT TRIANGLES ARE CROSS HATCHED AND SKIN FILLED TOO — BUT THERE IS NO NEED TO MAKE TRAPEZOIDS BETWEEN SLICES:
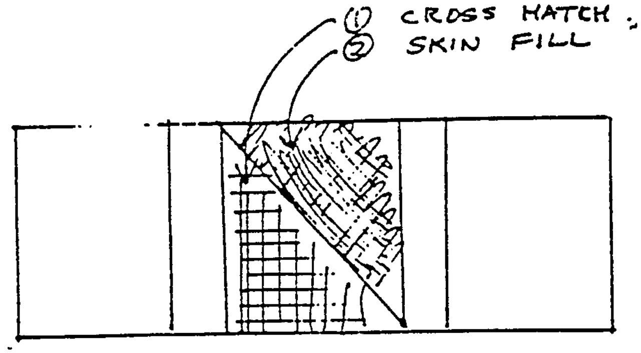
TOP VIEW OF CAR
SCAN TRIANGLES ONLY GENERATE BORDERS: (WHICH ARE THEN CROSS HATCHED)
BORDERS ENCLOSE AN AREA THAT IS CROSS HATCHED.
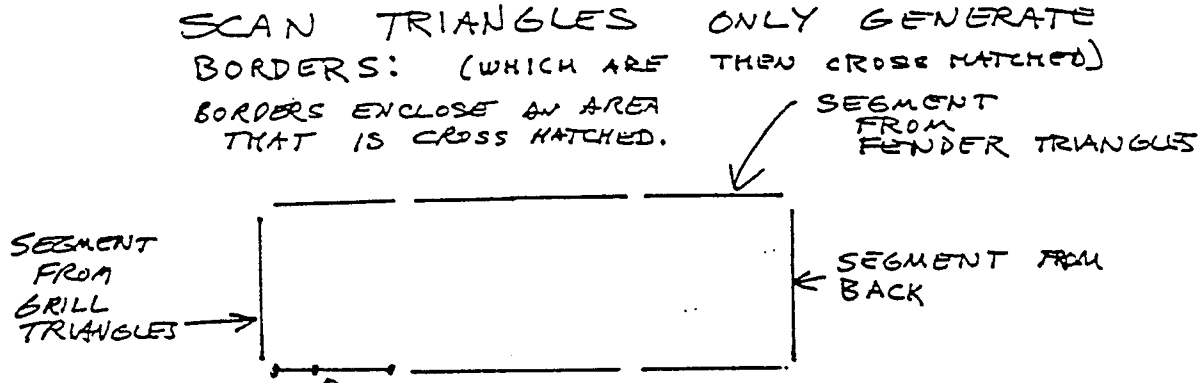
TOP VIEW OF SLICE
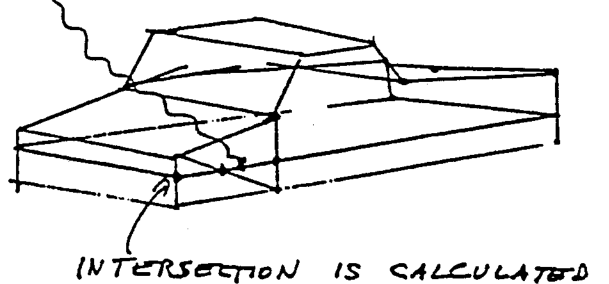
INTERSECTION IS CALCULATED TO GET SEGMENT

APPENDIX C

~~Docket No. 30385~~

Serial No. 182,801

VERSION 2.62

```
=============================================================================
                3D Systems Stereolithography System Software
=============================================================================

                              BEAM.BAS
              SLA-1 Beam Profile and Calibration Software

-----------------------------------------------------------------------------
 Warning: Compile with TB (Unmodified), not TBM if SoundOn% = 1 (uses Sound)
-----------------------------------------------------------------------------
```

©1988 3D SYSTEMS, INC.
ALL RIGHTS RESERVED

```
'  Rationalize the TotalWeight/TW/XYweight variables usage
'  Use a ShortDelay(us) function for us delays using usec. ?LongDelay(ms)
'  Read usec
'
'
'-------------------------------------------------------------------------------

  Version$ = "2.62"
  FALSE = 0
  TRUE = -1

'Global Vars:
'   XRest#,YRest#                   - Rest Position of laser from PRM file
'   Power#(s)                       - Last power in mW for sensor s
'   XSensorPos#(s),YSensorPos#(s)   - Sensor position from PRM file
'   XSP#(s),YSP(s)                  - Actual position from FindHoles

'Resources:
'
' Files:
'   #1=Disk File (in calibr8)? same for parameter file?
'   #2=LPT1 - Used by option in Position Check
'
  DIM Beam%(30,30),OldBeam%(30,30)
  DIM RowWeight#(30),OldRowWt#(30),ColWeight#(30),OldColWt#(30)
  DIM Resist#(100),Temp#(100),LastField%(4)
'
' Initalize Vars and Screen
'
  SoundOn% = 0
  ParamFile$ = "BEAM.PRM"
  Blank$ = String$(79," ")
  timeout& = 30000
  ColMax%=22    'I%=X=across screen:
  RowMax%=ColMax%        'ColMax%/RowMax% can differ IF we redraw row/col screen
  usec = 1/4    '4 usec per loop of 2-byte integers
  calib$(1)="  1   " 'change to "1 - 3" when calibrating
  calib$(2)="1 or 2"
  calib$(3)="1 - 3 "
  NumSensors% = 3
  DiscreteBeam% = 10
  lamda# = 5.9
  OPTION BASE 0
  SCREEN 0,0,0,0
  GOTO DisplayTitle

'
'   check for BEAM Program Options
'
CheckForOptions:
  CmdLine$ = UCASE$(CmdLine$)
  I% = INSTR(CmdLine$,"/TEXT")
  IF I%>0 THEN                          ' check for /TEXT text operation flag
    TextDisplay% = TRUE
    CmdLine$ = LEFT$(CmdLine$,I%-1)+MID$(CmdLine$,I%+2)
  END IF
  RETURN


'
' Display Title while Initializing
'
DisplayTitle:
  GOSUB PrintTitle
```

```
 Open and Read Parameters File

  CALL Center("--- Reading Parameters File ---",25)
  FileName$ = ParamFile$
  ON ERROR GOTO TryHome
  OPEN ParamFile$ FOR INPUT AS #1
  GOTO ReadParams
TryHome:
  ON ERROR GOTO CantOpen
  OPEN "C:\3DSYS\"+ParamFile$ FOR INPUT AS #1
  RESUME ReadParams
ReadParams:
  ON ERROR GOTO BadFormat
  A$ = FN GetFileLine$(1)
  IF LEFT$(A$,1)=CHR$(34) THEN     ' handle quoted options line
    I% = INSTR(2,A$,CHR$(34))
    IF I% > 0 THEN A$=LEFT$(A$,I%)
    CmdLine$ = FN NoQuotes$(A$)
    GOSUB CheckForOptions
    A$ = FN GetFileLine$(1)
  END IF
  XRest# = VAL(A$)
  YRest# = VAL(MID$(A$,INSTR(A$,",")+1))
  SensorNum% = VAL(FN GetFileLine$(1))
  FOR Sensor%=1 TO SensorNum%
    SensorChannel%(Sensor%) = VAL(FN GetFileLine$(1))
    A$ = FN GetFileLine$(1)
    XSensorPos#(Sensor%) = VAL(A$)
    YSensorPos#(Sensor%) = VAL(MID$(A$,INSTR(A$,",")+1))
    FOR Pinhole%=1 TO 4
      SensorCalib#(Sensor%,Pinhole%) = VAL(FN GetFileLine$(1))
    NEXT Pinhole%
  NEXT Sensor%
  TempChannel% = VAL(FN GetFileLine$(1))    'assume only one thermometer at first
  TempCalPts% = VAL(FN GetFileLine$(1))
  FOR I%=1 TO TempCalPts%      'Resist#(i%),Temp#(i%) may not be integers
    A$ = FN GetFileLine$(1)
    Resist#(I%) = VAL(A$)
    Temp#(I%) = VAL(MID$(A$,INSTR(A$,",")+1)) + 273.15  'abs temp
  NEXT I%
  CLOSE #1
  Resist#(0) = 2*Resist#(1) - Resist#(2)
  Temp#(0) = 2*Temp#(1) - Temp#(2)
  ON ERROR GOTO 0

'
'  handle command line options
'
  CmdLine$ = COMMAND$
  GOSUB CheckForOptions

'
' Reset JB Board and Z-table/s
'
  GOSUB IOSetup
'
' Find Sensors 1 and 2
'
  GOSUB Search7

'
' Set Initial Sensor #3
'
XSP#(3) = XSensorPos#(3)
YSP#(3) = YSensorPos#(3)
```

```
' Main Program Loop
'
Menu:
  X#=XRest#                 'Move beam to rest position
  Y#=YRest#
  GOSUB MoveBeam

  GOSUB SetMenu             'Display Menu
  GOSUB Selection           'Get Selection

  '
  CLS
  IF Selection%=9 THEN END
  ON Selection% GOSUB Display1,History2,_
                      Position3,Power4,_
                      Focus5.Move6,_
                      Search7,Calibr8
  GOTO Menu

'
' Display Main Menu
'
SetMenu:              '---------------------------------------------
  KEY OFF
  GOSUB PrintTitle
  Indent$ = STRING$(25," ")
  LOCATE 6.1.0
  PRINT Indent$;"1. Display Profile"
  PRINT Indent$;"2. Beam Power/Profile History"
  PRINT Indent$:"3. Position Check"
  PRINT Indent$:"4. Beam Power"
  PRINT Indent$:"5. Beam Focus"
  PRINT Indent$:"6. Move Beam"
  PRINT Indent$:"7. Find Pinholes"
  PRINT Indent$:"8. Calibrate System"
  PRINT Indent$;"T. Toggle between Screen Modes"
  PRINT Indent$:"X. Exit - Return to Main Menu"
  LOCATE 18,29,0
  IF TextDisplay% THEN
    PRINT "  Text Display Mode  "
  ELSE
    PRINT "Graphics Display Mode"
  END IF
  LOCATE 20,14,0
  PRINT "Sensor #  Default Location      Current     Power(mW)"
  FOR i% = 1 TO 3
    LOCATE 20+i%,17,0
    PRINT i%;
    LOCATE 20+i%,25,0
    CALL PrintXY(XSensorPos#(i%),YSensorPos#(i%))
    LOCATE 20+i%,43,0
    CALL PrintXY(XSP#(i%),YSP#(i%))
    LOCATE 20+i%,59,0
    PRINT USING "###.#";Power#(i%);
  NEXT i%
  RETURN

'
'Print Option line and get Selection
'
Selection:
  GOSUB ReadTemp
  LOCATE 25,1,0
  PRINT "MENU: SELECT OPTION      ";
  LOCATE 25,66,0
  PRINT "Temp:";
```

```
  PRINT USING "###.#";Temp#;
  PRINT " C";
GetMainKey:
  K$=UCASE$(INKEY$)
  IF K$="" THEN GetMainKey
  IF K$="T" THEN TextDisplay% = NOT TextDisplay%
  IF K$="X" THEN Selection% = 9 ELSE Selection% = VAL(K$)
  RETURN


'****************************
'* Option 1: Display Profile *
'****************************
Display1:
  Sensor% = 1
  Display%=1    'numbers, graphic characters, contours
  st%=4                   '1.4 mil
  Mn%=1                   '>1 for averaging
Display1a:
  IF TextDisplay% THEN
    SCREEN 0,0,0,0    ' stay in text mode
  ELSE
    SCREEN 10,0,0     ' enter graphics mode
  END IF
  CLS
  LOCATE 25,1,0
  PRINT "(1) DISPLAY PROFILE: Press ":calib$(NumSensors%):" to select sensor #. Q t
Display1b:
  GOSUB GoodRead
  IF TotWtAvg#=0 THEN
    t$ =" ERROR: Sensor #"+Str$(Sensor%)+" was not found: Try (6) Move or (7) Searc
    CALL Center(t$,24)
    CALL WaitKey
    RETURN
  END IF
  XSP#(Sensor%)= Xaverage#
  YSP#(Sensor%)= Yaverage#
  GOSUB PrintInfo
'*** bring in contours later?
'     and log(beam-slice) contours
  k$=InKey$
  IF (Val(k$)>0) AND (Val(k$)<=NumSensors%) THEN
    sensor%=Val(k$)
    GOTO Display1a
  ELSE
    IF k$<>"" THEN RETURN
  END IF
  GOTO Display1b


'*********************
'* Option 2: History *
'*********************
History2:         '-----------------------------------------------
  LOCATE 24,1,0
  PRINT "(2) History of Beam Power & Profile";
  CALL Center("History File Not Yet Installed",4)
  CALL Center("will track beam power vs. time",5)
  CALL Center("also compare profiles, XY gain & drift",6)
  CALL WaitKey
  RETURN


'****************************
'* Option 3: Position Check *
'****************************
```

```
Position3:      '-------------------------------------------
  FOR i% = 1 TO 4         'Set up initial Fields for Ranger
    LastField%(i%) = 32767
  NEXT i%
  st%=4                   '1.4 mil
  Mn%=1                   'for averaging
  display%=0              'don't display
  '& have XSP#(sensor%), Y-,
Position3a:
  LOCATE 25,1             'Scroll Screen
  PRINT .
  LOCATE 21,1,0
  PRINT Blank$;
  PRINT "      X Offset         X Gain                  Y Offset              Y Gain";
  PRINT Blank$;
  PRINT Blank$;
  FOR sensor% = 1 TO 2
    LOCATE 22+sensor%,20,0
    PRINT "Sensor #";sensor%;
    PRINT USING"###.#";Power#(sensor%);
    PRINT" mW, ";                                    ' or for other pinholes
    PRINT "Center:";  ;
    CALL PrintXY(XSP#(Sensor%),YSP#(Sensor%))
  NEXT sensor%
  CALL Center("(3) POSITION CHECK: Press P for printout, Q to Quit",25)

  FOR sensor% = 1 TO 2
    GOSUB GoodRead
    XSP#(sensor%)= Xaverage#    'update centers
    YSP#(sensor%)= Yaverage#
  NEXT sensor%
  Xoffs#=( XSP#(1)+XSP#(2)-XSensorPos#(1)-XSensorPos#(2) )/( 2*3.556 )'mils
  Yoffs#=( YSP#(1)+YSP#(2)-YSensorPos#(1)-YSensorPos#(2) )/( 2*3.556 )
  Xgain#=((XSP#(1)-XSP#(2))/(XSensorPos#(1)-XSensorPos#(2))-1)*10000'mils per 10"
  Ygain#=((YSP#(1)-YSP#(2))/(YSensorPos#(1)-YSensorPos#(2))-1)*10000

  CALL Ranger(1,Xoffs#,"X")
  CALL Ranger(2,Xgain#,"x")
  CALL Ranger(3,Yoffs#,"Y")
  CALL Ranger(4,Ygain#,"y")

  sensor%=1               'leave it set

  k$=UCase$(InKey$)
  IF k$="" THEN Position3a
  IF k$="P" then
    LOCATE 1,1,0
    CALL Center("Do you want a printout (y/n) ?",25)
waitprint:
    DO
      k$=UCase$(InKey$)
    LOOP UNTIL (k$ = "Y") or (k$ = "N")
    IF k$="Y" AND printout% = 0 THEN
      printout%=1
      OPEN "O",#2,"LPT1"
      WIDTH "LPT1:",255        'no end of line CR/LF added automatically
      PRINT#2,"X is offset, x is length change of 10";_
              chr$(34);" part, both .3 mils / div
      PRINT#2,SPC(85);time$
      PRINT#2,CHR$(27);"A";CHR$(1);CHR$(15)  '1/180 LPI,17 pitch
    ELSE
      IF k$ = "N" THEN GOSUB PrinterOff
    END IF
    GOTO Position3a
  END IF
PrinterOff:
```

```
  IF printout% = 1 THEN
    PRINT #2,time$
' restore 1/6 line spacing, non-condensed
    PRINT #2,CHR$(27);"A";CHR$(12);CHR$(18);
    PRINT #2,chr$(12);
    CLOSE #2
    printout%=0
  END IF
  RETURN

SUB Ranger(ffield%,position#,character$)        'field 1-4
   LOCAL  PPos%,ch$,CurrField%
   SHARED printout%,LastField%()
   CurrField% = Int(3*position#/19)    '3 character positions per .001"
   PPos% = Int(3*position#)-19*CurrField%
   ch$ = character$
   IF LastField%(ffield%) < 32767 THEN              ' Always display first one
     IF CurrField% < LastField%(ffield%) THEN  'See if in new field
      ch$ = "/"
     ELSE
       IF CurrField% > LastField%(ffield%) THEN ch$ = "\"
     END IF
   END IF
   LastField%(ffield%) = CurrField%
   PPos%=PPos%+1+20*(Ffield%-1)
   LOCATE 21,PPos%,0
   PRINT ch$;
   LOCATE 21,20*Ffield%,0
   PRINT "|";
   IF printout% THEN
      PRINT#2,SPC(PPos%);ch$;chr$(13);SPC(20*Ffield%);"|";chr$(13);
      IF Ffield%=4 THEN PRINT#2,""
   END IF
END SUB


'************************
'* Option 4: Beam Power *
'************************
Power4:              '---------------------------------------------
                     'as fast as possible, sound output
                     'have dropped tests for 65535.0 on X#,Y#
                     'rework sounds, can speed with pre-calculation
  LOCATE 25,1,0
  PRINT "(4) POWER: Press ";calib$(NumSensors%);" to select sensor #, Q to Quit";
  Sensor%=1
Power4a:
  Repeats%=0
  PowerAvg#(sensor%)=0
  SC%=SensorChannel%(Sensor%)
  st%=4                       '1.4 mil = matches that used for calib
  st#=st%
  xcorner#=XSP#(Sensor%)-((ColMax%+1)/2.0)*st%
  ycorner#=YSP#(Sensor%)-((RowMax%+1)/2.0)*st%
  CALL ClearLine(24)
Power4b:
  TotalWeight%=0
  FOR I%=1 TO ColMax%
    X#= xcorner# + I%*st%
    Y#= ycorner#                    'extra delay on first
    GOSUB MoveBeam
    FOR J%=1 TO RowMax% 'scream . . .
      Y#= Y#+st#
   ' hi%=int(y#/256.0)
      OUT &H301,hi%
      OUT &H300  ,int(y#-256.0*hi%)
```

```
    OUT &H302,inp(&H302) and not &H02       '2 for strobe y
    OUT &H302,inp(&H302) or  &H02

'**************** ReadJBBoard MACROed ***********************
count& = timeout&
OUT &H30C.9C%
FOR qq% = 1 TO 15*usec
                          'must wait 10us for EOS to go LO (286 @ 4us/next%)
NEXT qq%
                          'then apox 110us for conversion with signal D7 HI
DO
  DECR count&
LOOP UNTIL (INP(&H310)>127)  or (count&=0)
qi%=INP(&H30C)
IF count& = 0 THEN JBError

     IF 0.0 + TotalWeight% + qi% > 32768 THEN
       Call Center("Sensor #"+Str$(sensor%)+" Saturation",24)
       GOTO Power4c
     END IF
     TotalWeight%  = TotalWeight%  + qi%        'only overflow @ 22*22*60
   NEXT J%
   X#=xcorner#
   GOSUB MoveBeam
   Y#=ycorner#
   GOSUB MoveBeam          'scan around the corners ....
 NEXT I%
 TotalWeight%=TotalWeight%-Background#(sensor%)
 LOCATE 24.26,0
 Repeats%=Repeats%+1
 IF Repeats% >100 THEN Repeats%= 100
 PowerAvg#(sensor%)=(PowerAvg#(sensor%)*(Repeats%-1)+TotalWeight%)/Repeats%
 LOCATE 20+sensor%,5,0
 PRINT "Sensor #";sensor%:
 PRINT USING "###.##";PowerAvg#(sensor%)*SensorCalib#(sensor%,3):
 ?" mW Averaged Reading: (";
 PRINT USING "###.##";Totalweight%*SensorCalib#(sensor%,3);
 ?" mW Unfiltered Reading)"
 IF TotalWeight%<1 THEN TotalWeight%=1 'protect log function
 IF SoundOn% THEN
   SOUND 1000,0
   SOUND int(30*log(TotalWeight%)+37),.5
 END IF
'
' If 10 * round then recheck centers with goodread & XSF#()=XAvg#
'   range, duration, need time
'
Power4c:
  k$=inkey$
  IF k$="" THEN Power4b
  IF (Val(k$) > 0) AND (Val(k$) <= NumSensors%) THEN sensor%=val(k$): goto Power4a
  RETURN


'*************************
'* Option 5: Beam Focus *
'*************************
Focus5:            '---------------------------------------------
  sensor%=1        'starting
                   ' assumes 22x22 array (for now)
                   '1/e^2 but acting on area-integrated power
  IF TextDisplay% THEN
    SCREEN 0,0,0,0
  ELSE
    SCREEN 10,0,0,0
  END IF
Focus5a:
```

```
LOCATE 25,1,0
PRINT "(5) Focus Parameters:  Press "calibs(NumSensors%)"for sensor #. S to sear
Xaverage#=0
Yaverage#=0
st%=4                    '1.4 mil
st#=st%
Mn%=1                    'for averaging
HiPoints%=0
FOR i% = 1 TO ColMax%:ColWeight#(i%)=0:NEXT i%
FOR j% = 1 TO RowMax%:RowWeight#(j%)=0:NEXT j%

bk#=Bk#(sensor%)
FOR Try% = 1 TO Mn%   'smoothing
  TotalWeight#=0
  Xweight#=0.0
  Yweight#=0.0
  xcorner#=XSP#(Sensor%)-((ColMax%+1)/2.0)*st%
  ycorner#=YSP#(Sensor%)-((RowMax%+1)/2.0)*st%
  FOR I%=1 TO ColMax% ' not step 2
                     ' and not zig-zag until we study timing
    X# = xcorner# + I%*st%
    Y# = ycorner#              'only needed 1st time
    GOSUB MoveBeam
    FOR J%=1 TO RowMax%
      Y#= Y# + st#
      GOSUB YAxisOnly 'indistinguishable from when 4ms added pre-read
      TotalWeight#  = TotalWeight#  + gi%    'do not remove background
      If gi%>bk# THEN HiPoints%=HiPoints%+1
      Xweight# = Xweight# + X#*gi%
      Yweight# = Yweight# + Y#*gi%
      ColWeight#(i%) = ColWeight#(i%) + gi%
      RowWeight#(j%) = RowWeight#(j%) + gi%
    NEXT J%
    X#=Xcorner#
    GOSUB MoveBeam
    Y#=Ycorner#
    GOSUB MoveBeam    'scan around the corners ....
  NEXT I%             'need re-centering. not just speed
  IF TotalWeight# <> 0 THEN
    Xaverage# = Xaverage# + Xweight#/TotalWeight#
    Yaverage# = Yaverage# + Yweight#/TotalWeight#
  END IF
NEXT Try%
Xaverage# = Xaverage#/Mn%
Yaverage# = Yaverage#/Mn%
XSP#(Sensor%)=Xaverage#
YSP#(Sensor%)=Yaverage#
'
' Now assume only ColMax%=RowMax%(=22)
'
tw#=totalWeight#-Background#(sensor%)
IF tw#<=0 then
  tw#=1
  CALL Center("BEAM NOT FOUND",24)
  CALL WaitKey
  GOSUB FindHoles              'scans for 2-mil hole for that sensor
  IF terminate% = 1 THEN GOTO FocusCleanUp
end if

CLS
LocRowMax%=ColMax%:if RowMax%>ColMax% THEN LocRowMax%=RowMax%
cwmax#=0
IF TextDisplay% THEN stp%=2 else stp%=1
LOCATE 1,79
PRINT "X";
FOR i% = 1 TO LocRowMax% STEP stp%    'larger of the i,j: display zeros for smal
```

```
  cw#=colweight#(i%)
  cw#=cw#-Background#(sensor%)/ColMax%
  IF cw#<1 THEN cw# = .5
  cw#=6*(log(cw#/tw#)+8)                'from 2 to 39 .5/(22*22*220) to 1
  IF cwmax#<cw# THEN cwmax#=cw#
  colweioht#(i%)=cw#
  [illegible]
  IF cw%<1 THEN cw%=1
  IF cw%>79*8 THEN cw%=79*8
  rw%=rw%+40*8
  [illegible]
  IF rw%>79*8 THEN rw%=79*8
  i2% = i%*7
  IF TextDisplay% THEN
    LOCATE int(i%/stp%)+1,1
    PRINT STRING$(cw%/8+1,"-");"*";
  ELSE
    CIRCLE (3+cw%,i2%),2
    LINE (0,i2%)-(cw%,i2%),3,,&HCCCC
  END IF
NEXT i%

cwmax#=cwmax#-6                   'to find 1/e^2 of beam
x% = Int(cwmax#*16)
IF x% < 1 THEN x% = 1
IF x% > 79*8 THEN x% = 79*8
IF TextDisplay% THEN
  LOCATE 12,x%/8
  PRINT "^";
ELSE
  LINE (x%,0)-(x%,160)
END IF

LOCATE 13,79
PRINT "Y";
rwmax#=0
FOR i% = 1 TO LocRowMax% step stp%    'larger of the i,j: display zeros for small
  rw#=RowWeight#(i%)
  rw#=rw#-Background#(sensor%)/RowMax%
  IF rw#<1 THEN rw# = .5
  rw#=6*(log(rw#/tw#)+8)    ' tw# really not wanted here, want absolute
  IF rwmax#<rw# THEN rwmax#=rw#
  RowWeight#(i%)=rw#
  rw%=rw#*16   ' *1.02*lamda# ?
  IF rw%<1 then rw%=1
  IF rw%>79*8 THEN rw%=79*8
  i2% = 155+i%*7+7
  IF TextDisplay% THEN
    LOCATE 12+int(i%/stp%),1
    PRINT STRING$(rw%/8+1,"-");"*";
  ELSE
    CIRCLE (3+rw%,i2%),2
    LINE (0,i2%)-(rw%,i2%),3,,&HCCCC
  END IF
NEXT i%
rwmax#=rwmax#-6
x% = Int(rwmax#*16)
IF x% < 1 THEN x% = 1
IF x% > 79*8 THEN x% = 79*8
IF TextDisplay% THEN
  LOCATE 23,x%/8
  PRINT "^";
ELSE
  LINE (x%,165)-(x%,320)
END IF
```

```
FOR i%=1 TO LocRowMax%-1
  IF colweight#(i%+1) > cwmax# and colweight#(i%) < cwmax# then_
    cplo=i%+(cwmax#-colweight#(i%))/(colweight#(i%+1)-colweight#(i%))
  IF colweight#(i%+1) < cwmax# and colweight#(i%) > cwmax# then_
    cphi=i%+(cwmax#-colweight#(i%))/(colweight#(i%+1)-colweight#(i%))
  IF rowweight#(i%+1) > rwmax# and rowweight#(i%) < rwmax# then_
    rplo=i%+(rwmax#-rowweight#(i%))/(rowweight#(i%+1)-rowweight#(i%))
  IF rowweight#(i%+1) < rwmax# and rowweight#(i%) > rwmax# then_
    rphi=i%+(rwmax#-rowweight#(i%))/(rowweight#(i%+1)-rowweight#(i%))
NEXT i%
LOCATE 24,1,0
PRINT blank$;
LOCATE 24,15,0
PRINT "Sensor #"Sensor%" Average Width";
PRINT INT((cphi-cplo+rphi-rplo)*4/(2*3.556)*10)/10;
PRINT "mils   X/Y =";int((cphi-cplo)/(rphi-rplo)*100)/100;

k$=UCase$(InKey$)
IF k$="S" then
  XSP#(Sensor%)= X#
  YSP#(Sensor%)= Y#
  GOSUB FindHoles2            'searches around new center
ELSEIF (Val(k$) > 0) AND (Val(k$) <= NumSensors%) THEN
  sensor%=val(k$)
ELSEIF k$<>"" THEN
  GOTO FocusCleanUp
END IF
GOTO Focus5a

FocusCleanUp:
  SCREEN 0,0,0,0
  RETURN



'***********************
'* Option 6: Move Beam *
'***********************
Move6:               '---------------------------------------------
  X# = XRest#
  Y# = YRest#
  sensor%=1
Move6a:
  SCREEN 0,0,0,0
  CLS
  LOCATE 25,1,0
  PRINT "(6) MOVE BEAM:";
  indent$ = String$(23," ")
  LOCATE 1,1
  PRINT indent$;"Sensor    Default       Last Found"
  PRINT indent$;"          Position       Position"
  PRINT indent$;"------- ------------- -------------"
  LOCATE 5+NumSensors%,1
  PRINT indent$;"Beam Rest Position: ";
  CALL PrintXY(XRest#,YRest#)
  CALL Center("KeyPress   Action                                                ",17)
  CALL Center("--------   ------                                                ",18)
  CALL Center(" "+calib$(NumSensors%)+"    Change sensor #
  CALL Center("   X       Reposition X coord. of beam                           ",20)
  CALL Center("   Y       Reposition Y coord. of beam                           ",21)
  CALL Center("   S       Search for hole of sensor from current position",22)
  CALL Center("   Q       Quit Move Beam function                               ",23)
  CALL Center("****************************************",11)
  CALL Center("*                                      *",12)
  CALL Center("*                                      *",13)
  CALL Center("****************************************",14)
```

```
  FOR i% = 1 TO NumSensors%
    LOCATE 3+i%,26
    PRINT i%;"    ";
    CALL PrintXY(XSensorPos#(i%),YSensorPos#(i%))
    PRINT " ";
    CALL PrintXY(XSP#(i%),YSP#(i%))
  NEXT i%
Move6b:
  CALL ClearLine(15)
  GOSUB MoveBeam
Move6c:
  CALL Pause
  CALL ReadJBBoard(SensorChannel%(Sensor%))
  LOCATE 12,29
  PRINT "Sensor #";Sensor%;" Power:";
  PRINT USING "###";qi%;
  LOCATE 13,22
  PRINT "Current Beam Position: ";
  CALL PrintXY(X#,Y#)
  IF SoundOn% AND (qi%>bk#(sensor%)) THEN
    SOUND 1000,0
    SOUND int(30*qi%+37),.1
  END IF
  SELECT CASE (ch$)
    CASE ""
      GOTO Move6c          ' ch$ from Pause Command
    CASE "X"
      LOCATE 15,30,0
      PRINT "New X Position =";
      INPUT a$
      IF a$<>"" THEN X#=Val(a$)
      GOTO Move6b
    CASE "Y"
      LOCATE 15,30,0
      PRINT "New Y Position =";
      INPUT a$
      IF a$<>"" THEN Y#=Val(a$)
      GOTO Move6b
    CASE "S"
      XSP#(Sensor%)= X#
      YSP#(Sensor%)= Y#
      CLS
      GOSUB FindHoles2                    'start again at this new center
      X# = XSP#(Sensor%)
      Y# = YSP#(Sensor%)
      if terminate% = 0 THEN CALL WaitKey
      GOTO Move6a
    CASE ELSE
      IF (Val(ch$) > 0) AND (Val(ch$) <= NumSensors%) THEN
        sensor%=val(ch$)
        GOTO Move6b
      END IF
  END SELECT
  IF SoundOn% THEN SOUND 1000,0
  RETURN


'****************************
'* Option 7: Find Pinholes *
'****************************
Search7:          '---------------------------------------------
  CLS
  sensor%=1
  GOSUB FindHoles       'scans for 2-mil hole around original center
  IF terminate% = 0 THEN CALL Pause
```

```
CLS
sensor%=2
GOSUB FindHoles
IF terminate% = 0 THEN CALL Pause
RETURN


'*****************************
'* Option 8: Calibrate System *
'*****************************
Calibr8: •       '------------------------------------------

'                'start with  2nd menu
'
'       WARNING :changing laser, focus etc
'                will invalidate geometric calibration
'
'               1 calibrate power readings (& update file)
'                       sensor 1/2
'               2 calibrate temperature readings (& update file)
'               3 update sensor location file
'                       sensor 1/2
'               4 update beam rest position (& update file)
'
'               5 Calibrate geometric corrections
'                       warning : requires calibrator
'                               a) X-Y precision table
'                               b) 3D Systems precision grid
'                                       (set flag to use either)
'               ? here restart history file
'               even calibrate usec delay for file
'remind of need to center table, align etc
  NumSensors% = 3  'from now on, use 3 sensors ... may revise
  CALL Center("Beam Calibration Function",1)
  LOCATE 12,1,0
  PRINT "WARNING: Beam Calibration requires that the X-Y Calibration System with"
  PRINT "            the 3rd Sensor is setup.  If calibration is attempted without"
  PRINT "            the system in place, Z Table damage may result"
  CALL Center("Is the X-Y Calibration System in place (Y or N)?",25)
  DO
    k$ = UCase$(InKey$)
  LOOP UNTIL (k$ = "Y") or (k$ = "N")
  IF k$="N" THEN
    CALL Center("**** Aborting Beam Calibration ****",24)
    CALL WaitKey
    RETURN
  END IF
  CLS
  CALL Center("Beam Calibration Function",1)
  XTablePosOld#=0
  YTablePosOld#=0
  XTablePos#=0
  YTablePos#=0
  GOSUB MoveTable

'  GOSUB BacktoCenter        'eliminates backlash by - & + .025"

  Sensor%=3
  X#=32767
  Y#=32767
  GOSUB movebeam
  CALL Center("Press a key when Sensor #3 is centered",13)
  LOCATE 12,28,0
  PRINT "Sensor #3 reading is ";
 adjust:
```

```
CALL ReadJBBoard(SensorChannel%(Sensor%))
LOCATE 12,48,0
PRINT qi%:
IF SoundOn% AND (qi%>7) THEN
    SOUND 1000,0
    SOUND INT(30*qi%+37),.1
END IF
FOR i%=1 TO 30
  FOR ii% =.1 TO 10000*usec
  NEXT ii%
NEXT i%
IF InKey$="" THEN adjust
CALL ClearLine(12)
CALL ClearLine(13)

GOSUB FindHoles
IF terminate% = 1 THEN AbortCalib

'   FOR sensor% = 1 TO 2        'could also use Position3 routine
'      GOSUB CalibFind          'have the background readings
'      IF terminate% = 1 THEN AbortCalib
'   NEXT sensor%

CALL Center("Do you want to run a Full or Partial Calibration (F/P)?",24)
DO
  k$ = UCase$(InKey$)
LOOP UNTIL (k$="F") OR (k$="P")
IF k$="F" THEN FullPart# = .25 ELSE FullPart#=10
FOR sensor% = 1 TO 2
  GOSUB SlowCalibFind
  IF terminate%=1 THEN AbortCalib
NEXT sensor%

FOR tableX#=5 TO -5 step -FullPart#  'convert the axes here
  sensor%=3
  XSP#(Sensor%)=32767.0-(.9539)*3556.0*TableX#
  YSP#(Sensor%)=32767.0+(.9760)*3556.0*(-5)'   TableY#
  'here adjust for geometry = or we'll miss holes
  'must set parameters before findholes
  X#=XSP#(sensor%)            'best guess, improve with pre-calib
  Y#=YSP#(sensor%)
  GOSUB MoveBeam
  FOR ii = 1 to 10000         'allow mirror coil temperature to stabilize
  NEXT ii
  FOR tableY#=-5 TO 5 step FullPart#     '.25 or .5
    sensor%=3
    XSP#(Sensor%)=32767.0-(.9539)*3556.0*TableX#
    YSP#(Sensor%)=32767.0+(.9760)*3556.0*TableY#
    '
    'Adjust for Geometry
    XTablePos#=100000.0*TableX#
    YTablePos#=100000.0*TableY#
    GOSUB MoveTable
    CALL Center("X Table ="+Str$(tableX#)+"  Y Table ="+Str$(TableY#),23)
    GOSUB CalibFind
    IF terminate% = 1 THEN AbortCalib    '** needs revision
  NEXT TableY#
  FOR sensor% = 1 TO 2      'could also use Position3 routine
    GOSUB SlowCalibFind
    IF terminate% = 1 THEN AbortCalib    '** needs revision
  NEXT sensor%
NEXT TableX#
CALL Center("Beam Calibration complete at "+date$+" "+time$,24)

BackToCenter:
  XTablePos#=0
```

```
  YTablePos#=0
  GOSUB MoveTable
  CALL WaitKey
RETURN

AbortCalib:
  CALL Center("**** Aborting Beam Calibration ****",24)
  GOTO BackToCenter    ' Later, may want to stop table instead of centering



'******************************************************************************
'                                 UTILITIES
'******************************************************************************

'------------------------------------------------------------------------------
'                                 Z-Table(s)
'------------------------------------------------------------------------------

'                               *************
'                               * MoveTable *
'                               *************
MoveTable:
  cmd$=" 01 "
  GOSUB SendTableText
  XMove&= XTablePos#-XtablePosOld#
  Sign$=""
  IF XMove&<0 THEN Sign$="-"              '????? need to wait after 00,1?
  Move$=str$(xmove&)
  cmd$=" D"+sign$+right$(move$,len(move$)-1)+" G "      'a,v already set
  GOSUB SendTableText
  XtablePosOld# = XTablePos#

  cmd$=" 00 "
  GOSUB SendTableText
  Ymove& = YTablePos#-YtablePosOld#
  Sign$=""
  IF YMove&<0 THEN Sign$="-"
  Move$=str$(Ymove&)
  cmd$=" D"+sign$+right$(move$,len(move$)-1)+" G "      'a,v already set
  GOSUB SendTableText
  YtablePosOld# = YTablePos#

  cmd$=" 01 "
  GOSUB SendTableText
  cmd$=" D-2500 G "        'Backlash routine moves -0.025" THEN +0.025" X,Y
  GOSUB SendTableText
  cmd$=" D2500 G "         'Backlash routine moves -0.025" THEN +0.025" X,Y
  GOSUB SendTableText
  cmd$=" 00 "
  GOSUB SendTableText
  cmd$=" D-2500 G "        'Backlash routine moves -0.025" THEN +0.025" X,Y
  GOSUB SendTableText
  cmd$=" D2500 G "         'Backlash routine moves -0.025" THEN +0.025" X,Y
  GOSUB SendTableText
RETURN

                             *****************
                             * SendTableText *
                             *****************

  ' The following is a handshake subroutine allowing data to be
    transferred from the IBM BUS to the PC21.  Command string data
    is sent to the PC21 one character at a time.
```

```
SendTableText:
'
' RAH: Do we need delay?
'
  FOR qq = 1 TO 10
    FOR qq% = 1 TO 1000*usec
    NEXT qq%
  NEXT qq
  FOR IO = 1 TO LEN( CMD$ )
    CHAR$ = MID$( CMD$, IO, 1 )
    GOSUB SendTableByte
  NEXT IO
  CHAR$ = CHR$(13):GOSUB SendTableByte
  GOSUB InputTableByte          'wait for completion
  RETURN

SendTableByte:
  count& = timeout&
  DO
    BYTE = INP( TableAddr%+1 )
    DECR count&
  LOOP WHILE (IDBREADY AND NOT BYTE) AND (count&>0)
  IF count& = 0 THEN JBError
  OUT TableAddr%, ASC( CHAR$ )
  OUT TableAddr%+1, ( CONTROL OR IDBREADY )
  count& = timeout&
  DO
    BYTE = INP( TableAddr%+1 )
    DECR count&
  LOOP WHILE (IDBREADY AND BYTE) AND (count&>0)
  IF count& = 0 THEN JBError
  OUT TableAddr%+1, ( CONTROL AND NOT IDBREADY )
  RETURN

'
'    The following is a handshake subroutine allowing data to be
'    transferred from the PC21 to the IBM BUS. This data is sent
'    one character at a time.
'
InputTableByte:
  count& = timeout&
  DO
    BYTE = INP( TableAddr%+1 )
    DECR count&
  LOOP UNTIL (BYTE = 22) OR (count&=0)
  IF count& = 0 THEN JBError
 RETURN


'-------------------------------------------------------------------------------
'                                   SCANNING ROUTINES
'-------------------------------------------------------------------------------

'                                   *************
'                                   * FindHoles *
'                                   *************
' Updates hole position
' Needs to confirm that we have 2 mil hole.
'
FindHoles:
   CALL FlushKey
   CALL Center("Searching for Sensor #"+Str$(sensor%)+": press any key to abort",25
   X#=XRest#             'first get background reading ------------------
   Y#=YRest#
```

```
   GOSUB MoveBeam         'make sure to move beam awav
   Bk#=0
   FOR i%=1 TO ColMax%
      FOR j%=1 TO RowMax%

  '**************** ReadJBBoard MACROed *********************
  count& = timeout&
  OUT &H30C,SensorChannel%(Sensor%)
  FOR qq% = 1 TO 15*usec
  NEXT qq%                 'must wait 10us for EOS to go LO (286 @ 4us/next%)
  DO                       'then appx 110us for conversion with signal D7 HI
    DECR count&
  LOOP UNTIL (INP(&H310)>127)  or (count&=0)
  qi%=INP(&H30C)
  IF count& = 0 THEN JBError

         Bk#=Bk#+qi%
      NEXT j%
   NEXT i%
   Background#(sensor%)=bk#
   bk#(sensor%)=3+2*Background#(sensor%)/(ColMax%*RowMax%)'remove noise for center'
   XSP#(Sensor%) = XSensorPos#(Sensor%)  'will be best starting point
   YSP#(Sensor%) = YSensorPos#(Sensor%)  '******* ? or not check ******

FindHoles2:
'
' When we want to use new starting point
'  updates hole position
'
   display%=1
   calibrate%=0
   ExtraTries%=0          'repeats of finest centering routine
   GOSUB FastFind         '------ background, spiral, zero_in
'** here need to search for other 3 pinholes: radius known, try angles
'       or know approx position from assembly details (sensor 3 different).
'       must modify IF 2 mil hole saturates, or is too small..
  RETURN


SlowCalitFind:
   X# = XSP#(Sensor%)
   Y# = YSP#(Sensor%)
   GOSUB MoveBeam
   FOR ii%=1 TO 15       ' 15 sec
     CALL Center("Waiting ..."+Str$(16-ii%)+" ",24)
     FOR jj% = 1 TO 20000*usec
     NEXT jj%
   NEXT ii%
   CALL ClearLine(24)
CalibFind:
   Display%=1
   ExtraTries%=3          'repeats of finest centering routine
   Calibrate%=1
FastFind:
   terminate%=0           'looks for requests to terminate
   CantFind%=0
Spiral:
   SpiralSideMax%=100          '100*4.5 mil to start search
   st#=16           '.0045" per step is fine for seeing our beams
   bk#=bk#(sensor%)
Spiral2:
   X# = XSP#(Sensor%)
   Y# = YSP#(Sensor%)
   GOSUB MoveBeam       'gets us to best starting position
   FOR qq%=1 TO 2000*usec
   NEXT qq%
```

```
CALL FlushKey
CALL Center("Searching for Sensor #"+Str$(sensor%)+": press any key to abort",2
'
' Now spiral to search for 2 mil holes  -----------------
'
FOR spiralside% = -5 TO SpiralSideMax%
   FOR i%= 1 TO spiralside%
      GOSUB MoveBeam
      IF gi% > bk# THEN foundit        'found IF 2 * background +3
      X# = X# + st#
   NEXT i%
   FOR j%= 1 TO spiralside%
      GOSUB MoveBeam
      IF gi% > bk# THEN foundit        'found IF 2 * background +3
      Y# = Y# + st#
   NEXT j%
   st# = -st#                     'reverse directions after each 2 sides
   IF inkey$<>"" THEN
      CALL Abort
      IF terminate% = 1 THEN RETURN
   END IF
NEXT spiralside%
CALL Center("Cannot find Sensor #"+Str$(Sensor%)+": is beam blocked?",24)
st#=st#/1.5
SpiralSideMax%=SpiralSideMax%*3
bk#=bk#-.5
CantFind%= CantFind% +1
IF CantFind% < 5 THEN spiral2
CALL Center("Could not find Sensor #"+Strs(Sensor%),24)
CALL WaitKey
RETURN          'couldn't find it

FoundIt:
IF TextDisplay% THEN
  SCREEN 0,0,0,0
ELSE
  SCREEN 10,0,0,0
END IF
IF display% THEN
  LOCATE 1,70,0
  PRINT "Sensor #"Sensor%;
  CALL Center("Found Sensor #"+Str$(Sensor%),25)
END IF
XSP#(Sensor%) = X#          'new best starting point
YSP#(Sensor%) = Y#
st#=4
st%=st#                     'scan step in bits
XSPav#=0
YSPav#=0
FOR retry%= 1 TO 1 + ExtraTries%      'discard the first
   IF display% THEN CALL ClearCol(22)
   XYweight#=0
   Xweight#=0
   Yweight#=0
   TW#=0      ' for power, not removing noise till end
   SaturationCount%=0
   xcorner#=XSP#(Sensor%)-((ColMax%+1)/2.0)*st%
   ycorner#=YSP#(Sensor%)-((RowMax%+1)/2.0)*st%
   MaxVal% = 0
   FOR I%=1 TO ColMax%              'prefer to return around edges after line .
      IF display% THEN CALL ClearCol(ColMax%-I%)
      X#= xcorner# + I%*st%
      Y#= ycorner#
      GOSUB MoveBeam
      FOR J%=1 TO RowMax%
         Y#= Y# + st#
```

```
        GOSUB YaxisOnly

'**************** ReadJBBoard MACROed *********************
count& = timeout&
OUT &H30C,SensorChannel%(Sensor%)
FOR qq% = 1 TO 15*usec
NEXT qq%                'must wait 10us for EOS to go LO (286 @ 4us/next%)
DO                      'then appx 110us for conversion with signal D7 HI
  DECR count&
LOOP UNTIL (INP(&H310)>127)  or (count&=0)
qi%=INP(&H30C)
IF MaxVal% < qi% THEN MaxVal% = qi%
IF count& = 0 THEN JBError

        TW#=TW#+qi%
        IF qi%<bk#(sensor%) THEN Qi% = 0            'note this affects totalwe
        IF qi%>210 THEN SaturationCount% = SaturationCount% + 1
        XYweight# = XYweight# + qi%
        IF display% THEN
          gx% = (3*(ColMax%-I%)+1)*8
          gy% = (RowMax%-J%+1)*14
          q% = qi%/DiscreteBeam%+1
          IF q% > 20 THEN q% = 20
          IF TextDisplay% THEN
            LOCATE RowMax%-J%+1,3*(ColMax%-I%)+1
            IF NOT qi% THEN PRINT "  +"; ELSE PRINT USING "###";qi%;
          ELSE
            FOR cc%=1 TO q%
              CIRCLE (gx%,gy%),cc%
            NEXT cc%
          END IF
        END IF
        if inkey$<>"" then return
        Xweight# = Xweight# + X#*qi%     'want floating point numbers here
        Yweight# = Yweight# + Y#*qi%
      NEXT J%
      X#= xcorner#
      GOSUB MoveBeam
      Y#= ycorner#
      GOSUB MoveBeam
    NEXT I%
    IF XYweight#=0 THEN
      CantFind%= CantFind% +1
      IF CantFind% < 5 THEN spiral
      t$ ="ERROR: Sensor #"+Str$(sensor%)+" not found: Try (6) Move "
      CALL Center(t$,24)
      CALL WaitKey
      RETURN          'couldn't find it
    END IF
    IF SaturationCount% > 0 THEN
      LOCATE 24,1,0
      t$ = "WARNING: "+Str$(SaturationCount%)+" sensor readings near saturation'
      CALL Center(t$,24)
      FOR I=1 TO 25000  ' delay
      NEXT I
    END IF
'
' Later select sensor hole size automatically
'
    XSP#(Sensor%) = Xweight#/(XYweight#)      'protected against missing beams
    YSP#(Sensor%) = Yweight#/(XYweight#)
    Power#(sensor%)=(TW#-Background#(sensor%))*(SensorCalib#(Sensor%,3))
    IF retry% > 1 THEN
      display% = 0                 'faster without
      XSPav#=XSPav#+XSP#(sensor%)
      YSPav#=YSPav#+YSP#(sensor%)
```

```
      END IF
   NEXT retry%      'use average outside subroutine, or terminate to here
   XSPav#=XSPav#/(ExtraTries%+(ExtraTries%=0))
   YSPav#=YSPav#/(ExtraTries%+(ExtraTries%=0))
   IF calibrate% THEN
       OPEN "A",#1,"calibr8.dat"      '?use spaces or comma delimiters?
       PRINT #1.USING"######.##";XSPav#;.SPav#;Power#(sensor%);Temp#;
       PRINT #1. time$
       CLOSE #1
   END IF

   GOSUB PrintInfo
   RETURN

ReadTemp:
' SUBROUTINE: READ voltage of thermistor on JB Board
' use 1/T, LOG(R) function TO linearize the interpolation
   CALL ReadJBBoard(TempChannel%)
   resist#=20000.0*(255-qi%)/(255+qi%)  'from 20K resistor on JB Board
   IF qi%>214 THEN
      PRINT "Temperature > 70 C"
      Temp#=71
      BEEP
      RETURN
   END IF
calctemp:
   FOR It%=1 TO TempCalPts%
   IF Resist#(It%)>Resist# THEN NEXT It%
   IF Resist#(It%)=Resist# THEN
      Temp#=Temp#(It%)
   ELSE
   ' B# = (1/Temp#(It%-1)-1/Temp#(It%)) / (LOG(Resist#(It%-1))-LOG(Resist#(It%)))
     Temp# = 1/(1/Temp#(It%-1) - B# * (     LOG(Resist#(It%-1))-LOG(Resist#     )))
   END IF
   Temp#=Temp#-273.15
RETURN

'-----------------------------------------------------------------------------------
'                              BEAM CONTROL
'-----------------------------------------------------------------------------------

'                              ************
'                              * MoveBeam *
'                              ************
'
' Routine to move mirrors to X,Y directly
' Note: X,Y can be any kind of variable, we change to integers
'        and get qi% (for speed: later fixed addrs routines for each)
MoveBeam:
  IF x#>65534 THEN
    x#=65534
  ELSEIF x#<0 THEN
    x#=0              'faster than math expression x#=x#+(x#-65534)*(x#>65534)+(
  END IF
  hi%=int(x#/256.0)
  OUT &H301,hi%
  OUT &H300,INT(x#-256.0*hi%)
  OUT &H302,INP(&H302) AND NOT &H01     '1 for strobe  x
  OUT &H302,INP(&H302) OR  &H01

  IF y#>65534 THEN
    y#=65534
  ELSEIF y#<0 THEN
    y#=0
  END IF
YAxisOnly:        '---------------------------------
```

```
hi%=int(y#/256.0)
OUT &H301,hi%
OUT &H300,INT(y#-256.0*hi%)
OUT &H302,INP(&H302) AND NOT &H02      '2 for strobe y
OUT &H302,INP(&H302) OR  &H02

'***************** ReadJBBoard MACROed **********************
count& = timeout&
OUT &H30C,SensorChannel%(Sensor%)
FOR qq% = 1 TO 15*usec
NEXT qq%                    'must wait 10us for EOS to go LO (286 @ 4us/next%)
DO                          'then appx 110us for conversion with signal D7 HI
  DECR count&
LOOP UNTIL (INP(&H310)>127)  or (count&=0)
qi%=INP(&H30C)
IF count& = 0 THEN JBError

RETURN

'                                    ************
'                                    * GoodRead *
'                                    ************
'
' Enter with ColMax%,j-,sensor%,XSF#(),Y-,Bk#(), Backgr..,Mn%,St%
'
GoodRead:
  IF display% THEN
    LOCATE 1,70
    PRINT "Sensor #"Sensor%;
  END IF
  FOR i% = 1 TO ColMax%
    ColWeight#(i%)=0
  NEXT i%
  FOR j% = 1 TO RowMax%
    RowWeight#(j%)=0
  NEXT j%
  Xaverage# = 0
  Yaverage# = 0
  TotWtAvg# = 0
  FOR Try% = 1 TO Mn%
    IF display% THEN CALL ClearCol(22)
    TotalWeight#=0
    XYweight#=0
    Xweight#=0
    Yweight#=0
    xcorner#=XSF#(Sensor%)-((ColMax%+1)/2.0)*st%
    ycorner#=YSF#(Sensor%)-((RowMax%+1)/2.0)*st%
    MaxVal% = 0
    FOR I%=1 TO ColMax%
      IF display% THEN CALL ClearCol(ColMax%-I%)
      X#= xcorner# + I%*st%
      Y#= ycorner#
      GOSUB MoveBeam
      FOR J%=1 TO RowMax%
        Y#= Y# + st%
        GOSUB YAxisOnly

   '***************** ReadJBBoard MACROed **********************
   count& = timeout&
   OUT &H30C,SensorChannel%(Sensor%)
   FOR qq% = 1 TO 15*usec
   NEXT qq%                    'must wait 10us for EOS to go LO (286 @ 4us/next%)
   DO                          'then appx 110us for conversion with signal D7 HI
     DECR count&
   LOOP UNTIL (INP(&H310)>127)  or (count&=0)
   qi%=INP(&H30C)
```

```
IF MaxVal% < qi% THEN MaxVal% = qi%
IF count& = 0 THEN JBError

      Beam%(i%,j%) = qi%                      'full array
      TotalWeight#  = TotalWeight#  + qi%     'true totals
      ColWeight#(i%) = ColWeight#(i%) + qi%
      RowWeight#(j%) = RowWeight#(j%) + qi%

      IF display% THEN
        gx% = (3*(ColMax%-I%)+1)*8
        gy% = (RowMax%-J%+1)*14
        q% = (qi%-(bk#(sensor%)-3)/2)/DiscreteBeam%+1
        IF q% > 20 THEN q% = 20
        IF TextDisplay% THEN
            LOCATE RowMax%-J%+1,3*(ColMax%-I%)+1
            IF Int(qi%)=0 THEN PRINT "  +"; ELSE PRINT USING "###";INT(qi%);
        ELSE
          FOR cc%=1 TO q%
            CIRCLE (gx%,gy%),cc%
          NEXT cc%
        END IF
      END IF
      IF qi% >= Bk#(sensor%) THEN      'no background for centering
        XYweight#= XYweight#+ qi%
        Xweight# = Xweight# + X#*qi%
        Yweight# = Yweight# + Y#*qi%
      END IF
      '        IF qi% = 0 THEN qi% = .5                   row/col?
      '        PRINT #1 ,mid$(" .io%O#@***********",int(2+log(qi%)),1);
      '       or contours
    NEXT J%
    X#=xcorner#
    GOSUB MoveBeam
    Y#=ycorner#
    GOSUB MoveBeam     'scan around the corners ....
  NEXT I%
  IF XYweight# <> 0 THEN
    Xaverage# = Xaverage# + Xweight#/XYweight#
    Yaverage# = Yaverage# + Yweight#/XYweight#
  END IF
  TotWtAvg# = TotWtAvg# + TotalWeight# - Background#(sensor%)

 NEXT Try%
 Xaverage# = Xaverage#/Mn%
 Yaverage# = Yaverage#/Mn%
 TotWtAvg# = TotWtAvg#/Mn%
 Power#(sensor%)=TotWtAvg#*SensorCalib#(Sensor%,3)
 RETURN


'*****************************************************************************
'                              MISCELLANEOUS FUNCTIONS
'*****************************************************************************

'-----------------------------------------------------------------------------
'                                HARDWARE ROUTINES
'-----------------------------------------------------------------------------

'                                  ***********
'                                  * IOSetup *
'                                  ***********
IOSetup:
  CALL Center("--- Resetting Hardware ---",25)
  OUT &H303,&H98          'control byte of XY JB Board; A,B out, C 1/2 in 1/2 out
                          '& Thermistor Board same
```

```
X#=XRest#
Y#=YRest#
GOSUB MoveBeam
GOSUB MoveBeam
TableAddr%=800
CONTROL =    96 '= 64+32 is the normal state of the Control Byte
CRASH =       4 'bit 2 mask for Control Byte
INTACK =      8 'bit 3 mask for Control Byte
IDBREADY =   16 'bit 4 mask for Control Byte
FAULT =      32 'bit 5 mask for Control Byte
ZINTERRUPT =64 'bit 6 mask for Control Byte
RECEIVED = 128 'bit 7 mask for Control Byte
STOPPED = 2     'mask for Status Bit 1
LOADRDY = 4     'mask for Status Bit 2
MESSAGE = 8     'mask for Status Bit 3

OUT TableAddr%+1, ( CONTROL OR CRASH )         'Control Bit 2 high
OUT TableAddr%+1, ( CONTROL AND NOT CRASH )    'Control Bit 2 low
'
' RAH: Do we need delay?
'
FOR qq = 1 TO 500
  FOR qq% = 1 TO 1000*usec    ' wait for BMA ?how long
  NEXT qq%
NEXT qq
OUT TableAddr%+1, ( CONTROL AND NOT FAULT )    'Control Bit 5 low
OUT TableAddr%+1, ( CONTROL OR FAULT )         'Control Bit 5 high

' RAH: Do we need delay?

FOR qq = 1 TO 500
  FOR qq% = 1 TO 1000*usec
  NEXT qq%
NEXT qq
cmd$="E 01 MN A.3 V1 "            'defines acceleration & velocity throughout
GOSUB SendTableText
cmd$="E 00 MN A.3 V1.5 "          'defines acceleration & velocity throughout
GOSUB SendTableText
RETURN

SUB ReadJBBoard(channel%)     '------and return value qi% of Intensity -------------
  SHARED usec,qi%
  count& = timeout&
  OUT &H30C,channel%          'automatic strobe ?
  FOR qq% = 1 TO 15*usec
  NEXT qq%                    'must wait 10us for EOS to go LO (286 @ 4us/next%)
  DO                          'then appx 110us for conversion with signal D7 HI
    DECR count&
  LOOP UNTIL (INP(&H310)>127)  or (count&=0)
  qi%=INP(&H30C)
  IF count& = 0 THEN JBError
END SUB


'--------------------------------------------------------------------------
'                           SCREEN AND KEYBOARD ROUTINES
'--------------------------------------------------------------------------

PrintPowerPos:
  CALL ClearLine(23)
  LOCATE 23,10,0
  PRINT "Sensor #";sensor%;"Power";
  PRINT USING"###.#";Power#(sensor%);
  PRINT" mW, ";                                 ' or for other pinholes
  PRINT "Center";
  CALL PrintXY(XSF#(Sensor%),YSF#(Sensor%))
```

```
RETURN

PrintInfo:
   LOCATE 3,71
   PRINT "Power";
   LOCATE 4,69
   PRINT USING "###.# mW";Power#(sensor%);
   LOCATE 6,71
   PRINT "Center";
   LOCATE 7,68
   CALL PrintXY(XSP#(Sensor%),YSP#(Sensor%))
   LOCATE 18,71
   PRINT "Maximum";
   LOCATE 19,72
   PRINT MaxVal%;
   RETURN

PrintTitle:
  SCREEN 0,0,0
  CLS
  CALL Center("BEAM, V"+Version$,1)
  CALL Center("3D SYSTEMS SLA-1 STEREOLITHOGRAPHY SOFTWARE",2)
  RETURN

SUB PrintXY(x#,y#)
  LOCAL s$,i$
  s$ = "("+Mid$(Str$(Int(x#)),2)+","+Mid$(Str$(Int(y#)),2)+")"
  IF Len(s$)<12 THEN i$ = String$(6-Int(Len(s$)/2)," ")
  PRINT Left$(i$+s$+"                ",13);
END SUB

SUB ClearLine(i%)
  SHARED blank$
  LOCATE i%,1
  PRINT blank$;
END SUB

SUB Center(t$,num%)
  SHARED Blank$
  LOCATE num%,1,0
  PRINT Blank$;
  LOCATE num%,40-Len(t$)/2
  PRINT t$;
END SUB

SUB WaitKey
  SHARED Blank$
  CALL Center("<Hit any key to continue>",25)
  DO
  LOOP UNTIL InKey$ <> ""
  LOCATE 25,1,0
  PRINT Blank$;
END SUB

SUB Pause
  SHARED usec,ch$
  LOCAL i&
  i& = 30000*usec
  DO
    Decr i&
    ch$ = UCase$(InKey$)
  LOOP UNTIL (i&=0) OR (ch$<>"")
END SUB

SUB FlushKey
  WHILE InKey$<>""
```

```
  WEND
END SUB

SUB ClearCol(col%)
  SHARED TextDisplay%
  IF (col% > 0) and (TextDisplay% = 0) THEN
    col2% = (col%-1)*24-4
    IF col2%<0 THEN col2% = 0
    LINE (col2%,0)-(col2%+23,330),0,BF
  END IF
END SUB

'-----------------------------------------------------------------------------
'                               FILE ROUTINES
'-----------------------------------------------------------------------------

DEF FN GetFileLine$(FileNum%)
  LOCAL Temp$
TryAnotherLine:
  IF EOF(FileNum%) THEN BadFormat
  LINE INPUT #FileNum%,Temp$
  IF LEN(Temp$)=0 OR LEFT$(Temp$,1)="!" THEN TryAnotherLine
  FN GetFileLine$=Temp$
END DEF

'-----------------------------------------------------------------------------
'                               ERROR ROUTINES
'-----------------------------------------------------------------------------

SUB Abort
  SHARED terminate%,Blank$
  LOCAL  ch$
  CALL Center("Do you really want to abort (Y or N)?",25)
  DO
    ch$ = UCase$(InKey$)
  LOOP UNTIL (ch$="Y") OR (ch$="N")
  IF ch$ = "Y" THEN terminate% = 1
  LOCATE 25,1,0
  PRINT Blank$;
END SUB

CantOpen:
  CALL SystemError("Can't open "+FileName$+" file!")
  END

BadFormat:
  CALL SystemError$("Invalid format for "+FileName$+" file!")
  END

JBError:
  CALL Center("JB Board I/O Timeout Error. Aborting Beam Program",24)
  CALL WaitKey
  CLS
  END

'
'  Remove excess quote marks around string
'
DEF FN NoQuotes$(Text$)
  LOCAL S,E
  S = 1
  IF LEFT$(Text$,1)=CHR$(34) THEN S=S+1
  E = LEN(Text$)+1
  IF RIGHT$(Text$,1)=CHR$(34) THEN E=E-1
  FN NoQuotes$ = MID$(Text$,S,E-S)
```

```
END DEF

SUB SystemError(Text$)
  PRINT Text$
  OPEN "C:\SYSTEM.ERR" FOR OUTPUT AS #9
  PRINT #9,"BEAM: ";Text$
  CLOSE #9
END SUB

'**************************************************************************************
'                                  END OF BEAM.BAS
'**************************************************************************************
```

```
{ ===========================================================================

  CLIFF, Control Laser Instrument From File

  for 3D Systems' Sterolithography System

  Version 2.60  by Tarnz Technologies

 ===========================================================================

  CLIFF reads simple (X,Y) laser position commands from a file and
  controls the laser mirrors using the LASER background process.  Please
  see the MRCLIFF program for details on the commands and their
  arguments.

  The command line for cliff takes the form:

    CLIFF <datafile> [/options]

  where <datafile> is the name of the data file containing the laser
  control information, and /options are any number of user-selectable
  options:

    /S    -  show laser control information
    /W    -  wait for laser idle at end
    /T    -  transparency mode (no CLIFF text)

  CLIFF can perform the wait-for-idle function (/W option) without
  having any data file or commands to execute.  CLIFF /W and
  CLIFF /W/T (transparent) will make CLIFF wait for the background
  task to idle.

  <datafile> can be replaced by a sequence of direct commands by
  preceding the commands with a ', ", or @ character.  A semicolon
  can be used to separate commands.  As many commands as will fit on
  one line can be specified.  In the following example, the block
  mode is turned on and the laser beam moved:

    CLIFF 'MD BL +; JX 1000; JY 2000; NX 4000; NY 5000; EC

  If CLIFF is called up with no arguments, it will prompt with

    Enter file name: _

  at which point the operator should enter the name of the data file
  containing  CLIFF-compatible commands.  Direct commands can be
  entered here if preceded by a special character as described above.

 =========================================================================== }

{

 Recent History:
  8/18/87  Ver 2.02  CLIFF Version 2.00 released
                     interfaces with memory resident STEREO device driver
  8/22/87  Ver 2.03  /NVC changed to /NC for no version check
  8/25/87  Ver 2.04  only updated version number
  9/23/87  Ver 2.12  added MinSystemVersion check
  9/30/87  Ver 2.25  only updated version number
 11/12/87  Ver 2.30  first Beta software release
```

```
 12/09/87  Ver 2.40  upgraded to Turbo Pascal Version 4.0
                     different STEREO-installed check.
  1/25/88  Ver 2.60  version update only


uses Dos,Crt;

type
  str16 = string[16];
  str80 = string[80];
  str255 = string[255];

var
  ch,key: Char;
  Line,temp,cmd: str255;
  StereoVersion: str16;
  count,i,remline,Er,OpNum,code: Integer;
  Format,LineCount,IOerr: Integer;
  ErrorFile,InputFile: text;
  VersionCheckFlag,TransparentFlag,WaitForIdleFlag: Boolean;
  ShowData,ErrorOpen,Abort: Boolean;
  regs: Registers;

const
  ThisCliffVersion = '2.60';
  MinSystemVersion = '2.40';
  CtrlC = #3;
  sp40 = '
  _LASERVECTOR  = $64;
  _STEREOVECTOR = $65;

label ExitProgram;

function upper(text: str255): str255;
  var
    i: Integer;
    temp: str255;
  begin
    temp := text;
    for i := 1 to length(temp) do temp[i] := upcase(temp[i]);
    upper := temp;
  end;

function many(Ch: Char;num: Integer): str255;
  var
    temp: str255;
    i: Integer;
  begin
    temp := '';
    for i:=1 to num do temp  := temp+Ch;
    many := temp;
  end;

procedure ReadCommandLine(var line: string);
var
  i: Integer;
begin
  line := ParamStr(1);
  for i:=2 to ParamCount do
    line := line + ' ' + ParamStr(i);
end;

procedure print(text: str255);
  begin
    if not TransparentFlag then write(text);
```

```
  end;

procedure println(text: str255);
  begin
    if not TransparentFlag then writeln(text);
  end;

function IntStr(num: Integer): str16;
  var
    temp: str16;
  begin
    if num>=0 then Str(num,temp) else Str(num+$8000,temp);
    IntStr := temp;
  end;

function __LaserOk: Boolean;
  type
    CopyType  = array[1..20] of char;
  var
    CopyPtr: ^CopyType;
    CopyStr: string[20];
  begin
    with regs do begin
      AX := ($35 shl 8) or _LASERVECTOR;
      Intr($21,regs);
      CopyPtr := Ptr(ES,BX-19);
    end;
    move(CopyPtr^[1],CopyStr[1],18);
    CopyStr[0] := #18;
    __LaserOk := (CopyStr = 'Tarnz Technologies');
  end;

function __LaserPresent: Boolean;
  begin
    if __LaserOk then __LaserPresent := true
    else begin
      __LaserPresent := false;
      writeln('LASER system not installed.');
    end;
  end;

function __StereoOk: Boolean;
  type
    CopyType  = array[1..20] of char;
  var
    CopyPtr: ^CopyType;
    CopyStr: string[20];
  begin
    with regs do begin
      AX := ($35 shl 8) or _STEREOVECTOR;
      Intr($21,regs);
      CopyPtr := Ptr(ES,57);
    end;
    move(CopyPtr^[1],CopyStr[1],18);
    CopyStr[0] := #18;
    if CopyStr = 'Tarnz Technologies' then begin
      __StereoOk := true;
      with regs do
        CopyPtr := Ptr(ES,30);
      move(CopyPtr^[1],StereoVersion[1],4);
      StereoVersion[0] := #4;
    end else begin
      __StereoOk := false;
      StereoVersion := '?.??';
    end;
  end;
```

```
function __StereoPresent: Boolean;
  begin
    if __StereoOk then __StereoPresent := true
    else begin
      __StereoPresent := false;
      writeln('STEREO driver not installed.');
    end;
  end;

procedure Error(text: str255);
  begin
    if whereX > 1 then println('');
    if LineCount=0 then println('*** '+text)
      else println('*** '+text+' in line '+IntStr(LineCount));
    if not ErrorOpen then begin
      rewrite(ErrorFile);
      ErrorOpen := true;
    end;
    writeln(ErrorFile,text);
  end;

procedure DescribeError(Er: Integer);
  begin
    case Er of
        0: ;
        1: Error('1. Laser interface card not found');
        2: Error('2. Laser channel not open');
        3: Error('3. Background Command Queue full timeout');
        4: Error('4. Invalid interrupt time');
        5: Error('5. Not in block mode');
        6: Error('6. Exec Queue limit timeout');
      127: Error('127. Bad SIH command parameter');
      128: Error('128. Unrecognized STEREO command');
      255: Error('255. Internal error (please report)');
      else Error(IntStr(Er)+'. Unrecognized SIH error');
    end;
  end;

{ - - - - - - - - - - - - - - - - - - - - - - - - - - - - - - - - - - - - -

    Pass Command on to Memory Resident Portion

  - - - - - - - - - - - - - - - - - - - - - - - - - - - - - - - - - - - - - }

procedure StereoCommand(line: str255);
  begin
    if (length(line)>0) and (line[1]<>'!') then with regs do begin
      line := line + chr(0);  { end-of-line }
      AX := $00;              { for future expansion }
      BX := Ofs(line)+1;  { pass pointer to string }
      ES := Seg(line);
      Intr(_STEREOVECTOR,regs);
    end;
    if regs.AL>0 then DescribeError(regs.AL);
  end;

procedure ProcessFile;
  begin
    if not ShowData then begin
      println('');
      print('0    lines');
    end;
    while not eof(InputFile) and not Abort do begin
```

```
      readln(InputFile,Line);
      if ShowData then println(Line);
      LineCount := LineCount+1;
      StereoCommand(Line);
      if not TransparentFlag then
        if not ShowData then if LineCount mod 25=0 then begin
          gotoxy(1,whereY);
          print(IntStr(LineCount));
        end;
      if keypressed then begin
        key := ReadKey;
        if key in [CtrlC,'A','a'] then Abort := true;
      end;
    end; {not eof}
    if not (TransparentFlag and ShowData) then begin
      gotoxy(1,whereY);
      println(IntStr(LineCount));
    end;
    if Abort then begin
      Error('Control Process Aborted');
      while keypressed do key := ReadKey;
    end; {if Abort}
  end;

procedure CheckForOptions(var str: str255);
  var
    i: Integer;
  begin
    while (length(str)>1) and (str[1]=' ') do delete(str,1,1);
    i := pos('/S',upper(str));  { show input file lines }
    if i>0 then begin
      ShowData := true;
      delete(str,i,2);
    end;
    i := pos('/W',upper(str));  { set wait for idle flag }
    if i>0 then begin
      WaitForIdleFlag := true;
      delete(str,i,2);
    end;
    i := pos('/T',upper(str));  { set transparency flag }
    if i>0 then begin
      TransparentFlag := true;
      delete(str,i,2);
    end;
    i := pos('/NC',upper(str));  { no version check }
    if i>0 then begin
      VersionCheckFlag := false;
      delete(str,i,3);
    end;
  end;

procedure CliffHeader;
  begin
    writeln;
    writeln(#213,many(#205,52),#184);
    writeln(#179,' CLIFF, Control Laser Instrument From File Program  ',#179);
    writeln(#179,' 3D Systems Laser Sterolithography System            ',#179);
    writeln(#179,' Version ',ThisCliffVersion,'  by Tarnz Technologies  November 19
    writeln(#212,many(#205,52),#190);
    writeln;
  end;

begin
  ReadCommandLine(cmd);
  LineCount          := 0;
  Abort              := false;
```

```
  WaitForIdleFlag   := false;
  TransparentFlag   := false;
  ErrorOpen         := false;
  ShowData          := false;
  VersionCheckFlag  := true;

{ ***** check for memory resident STEREO device driver }

  Assign(ErrorFile,'CLIFF.ERR');
  {$I-}  { erase error file if it exists }
  Erase(ErrorFile);
  {$I+}
  IOerr := IOresult;  { clear I/O result }
  CheckForOptions(cmd);

  if not TransparentFlag then CliffHeader;
  if not (__LaserPresent and __StereoPresent) then goto ExitProgram;
  if VersionCheckFlag then
    if StereoVersion < MinSystemVersion then begin
      writeln('Obsolete STEREO in use.');
      goto ExitProgram;
    end;
  if length(cmd)=0 then begin
    write('Enter file name: ');
    readln(cmd);
    CheckForOptions(cmd);
  end;
  if (length(cmd)>1) and (cmd[1] in ['@','"','''']) then begin
    { handle direct commands }
    cmd := copy(cmd,2,199);
    StereoCommand(cmd);
  end else begin
    { handle commands from a file }
    if length(cmd)>0 then begin
      if pos('.',cmd)=0 then cmd := cmd + '.DAT';
      assign(InputFile,cmd);
      {$I-}
      reset(InputFile);
      IOerr := IOresult;
      {$I+}
      if IOerr <> 0 then
        Error('I/O Error '+IntStr(IOerr)+' opening file '+cmd)
      else begin
        ProcessFile;
        close(InputFile);
      end;
    end;
  end;
  if WaitForIdleFlag then StereoCommand('WI 1000');

ExitProgram:
  {$I-}
  close(InputFile);
  close(ErrorFile);
  {$I+}

end.
```

```
{ ===========================================================================

  FRONT, Simple Front End Program

  for 3D Systems' Laser Controller Software

  Version 2.60  by Tarnz Technologies

 ===========================================================================

  This program, FRONT, is primarily a debugging tool used by Tarnz
  Technologies in developing the machine language laser controller
  and software interface.  Along with LASER.INC, the laser controller
  library, this program serves as an example for interfacing the laser
  control with a high-level language.  The machine language routines
  were written language-independent - BASIC and C programs can be
  written to perform the same tasks embodied here.  Turbo Pascal was
  chosen for development because of its compile speed.

  This program allows the user access to all the software interface
  routines.  Of course. any consumer-oriented program would only use
  those software interrupt routines it needs and would certainly work
  on a more general basis.

 =========================================================================== }

{

 History:
  8/18/87  Ver 2.02  FRONT released
                     very similar to versions 1.20 on
  8/22/87  Ver 2.03  version number updated only
  8/25/87  Ver 2.04  version number updated only
  9/23/87  Ver 2.12  added MinSystemVersion (nop)
  9/30/87  Ver 2.25  only updated version number
 11/12/87  Ver 2.30  first Beta software release
 12/09/87  Ver 2.40  upgraded to Turbo Pascal Version 4.0
 12/23/87  Ver 2.41  show control word fixed
  1/25/88  Ver 2.60  version update only

}

uses Dos,Crt;

{$i laser.inc}  { include laser interface library }

type
  str16 = string[16];
  str80 = string[80];
  BitArray = array[0..15] of Word;

var
  ch,key: Char;
  done: Boolean;
  Line,temp: str80;
  i,num,remline,Er,OpNum,code: Integer;

const
  ThisFrontVersion = '2.60';
  MinSystemVersion = '2.30';
```

```
  HexDigits: str16 = '0123456789ABCDEF';
  sp40 = '
  Indent1 = 4;
  Indent2 = 41;
  AllBits = $FFFF;
  BitValue: BitArray =
    ($0001, $0002, $0004, $0008, $0010, $0020, $0040, $0080,
     $0100, $0200, $0400, $0800, $1000, $2000, $4000, $8000);

function many(Ch: Char;num: Integer): String;
  var
    temp: String;
    i: Integer;
  begin
    temp := '';
    for i:=1 to num do temp  := temp+Ch;
    many := temp;
  end;

procedure beep;
  begin
    sound(1000);
    delay(500);
    NoSound;
  end;

procedure centerln(text: str80);
  begin
    gotoxy((80-length(text)) div 2,whereY);
    writeln(text);
  end;

procedure DrawBox(x1,y1,x2,y2: Integer);
  var
    i: Integer;
  begin
    gotoxy(x1,y1);
    write(#218);
    for i:=x1+1 to x2-1 do write(#196);
    write(#191);
    for i:=y1+1 to y2-1 do begin
      gotoxy(x1,i);
      write(#179);
      gotoxy(x2,i);
      write(#179);
    end;
    gotoxy(x1,y2);
    write(#192);
    for i:=x1+1 to x2-1 do write(#196);
    write(#217);
  end;

procedure LaserOk;
  begin
    if __LaserOk then writeln('Laser system installed.')
      else writeln('Laser system not installed.');
  end;

procedure OpenLaser;
  var
    Ticks: Word;
  begin
    write('Ticks: ');
    readln(Line);
    val(Line,Ticks,code);
    if code=0 then Er := __OpenLaser(Ticks);
```

```
  end;

procedure CloseLaser;
  begin
    Er := __CloseLaser;
  end;

procedure parse(var num: Real);
  begin
    val(temp,num,code);
    temp := copy(temp,code+1,99);
  end;

procedure DoBox;
  var
    iter,step: Word;
  begin
    write('Enter step rate: ');
    readln(temp);
    val(temp,step,code);
    iter := trunc(65536.0 / step - 1);
    step := step * 256;
    writeln(step,' ',iter);
{    Er := __AddVector(0,0,step,step,iter); }
    repeat
      Er := __AddVector(0,0,step,0,iter);
    until Er=0;
    repeat
      Er := __AddVector(65535,0,0,step,iter);
    until Er=0;
    repeat
      Er := __AddVector(65535,-step,-step,0,iter);
    until Er=0;
    repeat
      Er := __AddVector(0,65535,0,-step,iter);
    until Er=0;
  end;

procedure AddVector;
  var
    startX,startY,deltaX,deltaY,incr: Real;
  begin
    writeln('Enter startX, startY, deltaX, deltaY, # of steps:');
    readln(temp);
    if (length(temp)>0) and (upcase(temp[1])='B') then DoBox
    else begin
      parse(startX);
      parse(startY);
      parse(deltaX);
      parse(deltaY);
      parse(incr);
      Er := __AddVector(trunc(startX),trunc(startY),
                        trunc(deltaX*256),trunc(deltaY*256),
                        trunc(incr));
      writeln('(',trunc(startX),',',trunc(startY),') [',
              trunc(deltaX*256),',',trunc(deltaY*256),'] ',
              trunc(incr));
    end;
  end;

procedure AddOpenShutter;
  begin
    Er := __AddOpenShutter;
  end;

procedure AddCloseShutter;
```

```
  begin
    Er := __AddCloseShutter;
  end;

procedure AddChangeTimebase;
  begin
    write('Enter new Time Base: ');
    readln(Line);
    val(Line,num,code);
    if code=0 then Er := __AddChangeTimebase(num);
  end;

procedure AddPause;
  begin
    write('Enter # of ticks to pause: ');
    readln(Line);
    val(Line,num,code);
    if code=0 then Er := __AddPause(num);
  end;

procedure ResetCmdQueue;
  begin
    Er := __ResetCmdQueue;
  end;

procedure GetCmdQueueSize;
  var
    size: Word;
  begin
    Er := __GetCmdQueueSize(size);
    write('Command Queue Size = ',size,' bytes (',#126);
    size := size div _PACKET_SIZE;
    write(size,' ');
    if size<>1 then write('entries') else write('entry');
    writeln(')');
  end;

procedure GetIntNum;
  var
    num: Word;
  begin
    Er := __GetIntNum(num);
    writeln('Software Interrupt Number is ',num);
  end;

procedure GetBkgndTime;
  var
    time: Word;
  begin
    Er := __GetBkgndTime(time);
    writeln('Background Interval Time is ',time,' (',trunc(time/1.19),' us)');
  end;

procedure GetControlWord;
  var
    bit: Integer;
    ctrl: Word;
  begin
    Er := __GetControlWord(ctrl);
    write('Control word is ');
    bit := 15;
    repeat
      if (ctrl and BitValue[bit])=0 then write('0') else write('1');
      if bit=8 then write(' ');
      bit := bit-1;
    until bit<0;
```

```
    writeln;
  end;

procedure SetIntNum;
  begin
    write('Enter new Software Interrupt Number: ');
    readln(Line);
    val(Line,num,code);
    if code=0 then Er := __SetIntNum(num);
  end;

procedure SetBkgndTime;
  begin
    write('Enter new Background Interval ti~e: ');
    readln(Line);
    val(Line,num,code);
    if code=0 then Er := __SetBkgndTime(num);
  end;

procedure SetControlWord;
  var
    bit: Word;
  begin
    write('Set/Clear which bit? ');
    readln(Line);
    if length(Line)>0 then begin
      val(copy(Line,2,99),bit,code);
      Er := __AlterControlWordBit(Line[1],bit);
    end;
  end;

procedure Execute;
  begin
    Er := __Execute;
  end;

procedure ExecuteClear;
  begin
    Er := __ExecuteClear;
  end;

procedure Clear;
  begin
    Er := __Clear;
  end;

procedure AskExit;
  begin
    write('Are you sure (Y/N)? ');
    readln(Line);
    if upcase(Line[1])='Y' then done := true;
  end;

procedure Command;
  begin
    ClrScr;
    done := false;
    repeat
      Er := 0;
      if __LaserOk then
        if __GetBkgndIdleStatus then write('-')
          else write('*');
      write('FRONT>');
      readln(Line);
      if length(Line)>0 then case upcase(Line[1]) of
        'A': LaserOk;
```

```
      'E','Q','X': AskExit;
      else begin
        val(Line,OpNum,code);
        case OpNum of
           0: OpenLaser;
           1: CloseLaser;
          20: AddVector;
          21: AddOpenShutter;
          22: AddCloseShutter;
          23: AddChangeTimebase;
          24: AddPause;
           3: ResetCmdQueue;
           4: GetCmdQueueSize;
          50: GetIntNum;
          51: GetBkgndTime;
          52: GetControlWord;
          60: SetIntNum;
          61: SetBkgndTime;
          62: SetControlWord;
          70: Execute;
          71: ExecuteClear;
          72: Clear;
        end: {case OpNum}
      end; {begin}
    end; {case Line[1]}
    if Er>0 then begin
      beep;
      writeln('Error - ',Er);
    end;
  until done;
end;

procedure menuln(indent: Integer;text: str80);
begin
  gotoxy(indent,whereY);
  writeln(text);
end;

begin
  ClrScr;
  centerln('3D Systems Laser Controller Simple Front End');
  centerln('Version '+ThisFrontVersion+'  by Tarnz Technologies  December 1987');
  writeln;
  centerln(many(#196,12));
  writeln;
  remline := whereY;
  menuln(Indent1,' A. Laser Installed Check');
  menuln(Indent1,' 0. Open Laser Channel');
  menuln(Indent1,' 1. Close Laser Channel');
  menuln(Indent1,'20. Add Vector to Command Queue');
  menuln(Indent1,'21. Add Open Shutter Command');
  menuln(Indent1,'22. Add Close Shutter Command');
  menuln(Indent1,'23. Add Change Time Base Command');
  menuln(Indent1,'24. Add Pause Command');
  menuln(Indent1,' 3. Reset Command Queue');
  menuln(Indent1,' 4. Get Command Queue Size');
  gotoxy(Indent2,remline);
  menuln(Indent2,'50. Get Software Interrupt Number');
  menuln(Indent2,'51. Get Background Interval Time');
  menuln(Indent2,'52. Get Laser Control Word');
  menuln(Indent2,'61. Set Background Interval Time');
  menuln(Indent2,'62. Set Laser Control Word');
  menuln(Indent2,'70. Execute');
  menuln(Indent2,'71. Execute and Clear');
  menuln(Indent2,'72. Clear');
  menuln(Indent2,' X. Exit');
```

```
  writeln;
  DrawBox(1,18,80,24);
  window(3,19,78,23);
  Command;
  window(1,1,80,25);
  ClrScr;
end.
```

```
{ ==========================================================================
  LASER.INC

  StereoLithography Laser Controller Software Interrupt Interface Routines

  for 3D Systems, Inc.

  Version 2.60  by Tarnz Technologies

 ==========================================================================

  The purpose of these routines is to interface general-purpose Turbo
  Pascal programs with the memory resident laser controller software.
  The machine language-based laser controller software the routines
  below interface to can be used with other languages like Basic, C,
  and 8086 Assembly Language.

  Turbo Pascal was chosen because of its development environment and
  low source-to-executable-object code turnaround time.  As development
  progresses and there is no longer a great need for a fast development
  evironment, these routines should be adapted to C to maintain project
  software consistency.  Turbo C and Microsoft C are the leading choices
  for C languages.

  Below is a list of the routines in this include file.  Most of the
  functions relate directly to specific software interrupt calls.  The
  Code is the related interrupt's AX (AH,AL) value.  Some of the
  interrupt functions require arguments to be passed in other registers,
  and some will return results.  See the actual routines for more
  details on the interface protocol.


  Pascal Function       Code   Description
  -------------------   -----  -------------------------------------------
  __LaserOk                    see if laser software is installed
  __LaserPresent               tell if laser software not installed
  __OpenLaser           00 --  open laser DAC channel and initialize
  __CloseLaser          01 --  close laser DAC channel and restore system
                        02 xx  add command to background command queue
  __AddVector           02 00    add vector command
  __AddOpenShutter      02 01    add open shutter command
  __AddCloseShutter     02 02    add close shutter command
  __AddChangeTimebase   02 03    add change time base command
  __AddPause            02 04    add pause command
  __ResetCmdQueue       03 --  reset background command queue
  __GetCmdQueueSize     04 --  get background command queue size

                        05 xx  get option
  __GetIntNum           05 00    get software interrupt vector number
  __GetBkgndTime        05 01    get background task interval time
  __GetControlWord      05 02    get laser control word
  __AutoShutterModeOn   05 02      get status of auto shutter mode
  __PosAckModeOn        05 02      get status of position acknowledge mode
  __BlockModeOn         05 02      get status of block mode
  __GetStatus           05 03    get laser status
  __GetOpenStatus       05 03      get laser channel open status
  __GetBkgndIdleStatus  05 03      get background idle status
  __GetTurnOffDelay     05 04    get laser turn-off delay
  __GetTurnOnDelay      05 05    get laser turn-on delay
  __GetHomePosition     05 06    get laser home position

                        06 xx  set option
```

```
  __SetIntNum           06 00    set software interrupt vector number
  __SetBkgndTime        06 01    set background task interval time
  __SetControlWord      06 02    set laser control word (general)
  __SetAutoShutMode     06 02      set laser control word, bit 0
  __SetPosAckMode       06 02      set laser control word, bit 1
  __SetBlockMode        06 02      set laser control word, bit 2
                        06 03    -
  __SetTurnOffDelay     06 04    set laser turn-off delay
  __SetTurnOnDelay      06 05    set laser turn-on delay
  __SetHomePosition     06 06    set laser home position

                        07 xx  background task execution control
  __Execute             07 00    execute command queue to current point and stop
  __ExecuteClear        07 01    execute command queue to current point, stop, an
  __Clear               07 02    clear command queue (reset queue's start pointer

                        08 xx  background task redraw control
  __SetStepPeriods      08 00  set multi-pass step periods
  __SetRedrawCount      08 01  set redraw pass count
  __SetRedrawDelay      08 02  set redraw delay
  __Mark                08 03  mark redraw start position
  __Redraw              08 04  perform multi-pass redraw

 ====================================================================== }

const
  _LASERVECTOR       =   $64;          { Interrupt vector alternative  }
                                       { values: $60 through $67.      }
  _PACKET_SIZE       =    13;          { length of vector packet       }

  _OK                =     0;          { Errors returned by Level Zero }
  _INTERNAL_ERROR    =   255;
  _MINIMUM_TICKS     =    59;          { don't go below 50 us          }
  _LASER_QUEUE_MAX   = 60000.0;        { Laser Queue size              }

  __ALLBITS = $FFFF;
  __BITVALUE: array[0..15] of Word =
    ($0001, $0002, $0004, $0008, $0010, $0020, $0040, $0080,
     $0100, $0200, $0400, $0800, $1000, $2000, $4000, $8000);

type
  _Str16  = string[16];
  _Str255 = string[255];
  _VectorType = record
      fractX: Byte;     { start coordinates                               }
      startX: Word;
      fractY: Byte;     { fractional portion - 1 byte, should be set to 0 }
      startY: Word;     { integer portion    - 2 bytes                    }
      deltaX: Integer;  { +/- change values in 1/256 units                }
      deltaY: Integer;
        incr: Word;     { # of increments within vector count             }
      end;
  _StepPeriodsType = record
      num     : Byte;
      periods: array[0..9] of Word;
    end;

var
  __IntReq: Registers;
  LaserVersion: _Str16;

{ ---------------------------------------------------------------------

    __LaserOk function
     check to see if laser controller code has been installed.
```

```
    returns:
    false if code not installed
    true  if code is installed
    LaserVersion contains laser controller version number

  ---------------------------------------------------------------------------- }

function __LaserOk: Boolean;
  type
    CopyType  = array[1..20] of char;
  var
    CopyPtr: ^CopyType;
    CopyStr: string[20];
  begin
    with __IntReg do begin
      AX := ($35 shl 8) or _LASERVECTOR;
      Intr($21,__IntReg);
      CopyPtr := Ptr(Es,BX-19);
    end;
    move(CopyPtr^[1],CopyStr[1],18);
    CopyStr[0] := #18;
    if CopyStr = 'Tarnz Technologies' then begin
      __LaserOk := true;
      with __IntReg do
        CopyPtr := Ptr(Es,BX-46);
      move(CopyPtr^[1],LaserVersion[1],18);
      LaserVersion[0] := #4;
    end else begin
      __LaserOk := false;
      LaserVersion := '?.??';
    end;
  end;

{ ----------------------------------------------------------------------------

    __LaserPresent function
      same as LaserOk but also prints a message if laser system is not
      installed.

    returns:
    false if code not installed
    true  if code is installed

  ---------------------------------------------------------------------------- }

function __LaserPresent: Boolean;
  begin
    if __LaserOk then __LaserPresent := true
    else begin
      __LaserPresent := false;
      writeln('LASER system not installed.');
    end;
  end;

{ ----------------------------------------------------------------------------

    __OpenLaser(Ticks) function
      open up laser DAC channel with the background server interrupting
      every Ticks timer 0 ticks.  Input for timer 0 is a 1.19 MHz clock
      signal, so if Ticks = 119, the background task would activate once
      per 100 us;  with Ticks = 1190, once per ms;  etc.

    returns error code

  ----------------------------------------------------------------------------
```

```
function __OpenLaser(ticks: Word): Integer;
  begin
{ Min Time CHeck bypassed -- BE CAREFUL!!!!! }
{    if ticks<119 then ticks := 119; }
    with __IntReg do begin
      AX := $0000;
      BX := ticks ;    (* trunc(Period*1.19 {MHz}); *)
      Intr(_LASERVECTOR,__IntReg);
      __OpenLaser := AL;
    end;
  end;

{ ---------------------------------------------------------------------------

    __CloseLaser function
      close off laser DAC channel after the background command queue
      empties.  If laser needs to be stopped immediately, __ResetVectorPool
      should be called before this routine.

    returns error code

  --------------------------------------------------------------------------- }

function __CloseLaser: Integer;
  begin
    with __IntReg do begin
      AX := $0100;
      Intr(_LASERVECTOR,__IntReg);
      __CloseLaser := AL;
    end;
  end;

{ ---------------------------------------------------------------------------

    __AddVector(startX,startY,deltaX,deltaY,incr) function
      add the vector to the background command queue.  Vector start
      coordinates are (startX,startY) and their change value is
      (deltaX,deltaY).  The number of incremental steps in the vector
      is incr.  deltaX and deltaY are in a special format (high byte
      is +/- integer portion; low byte is 1/256 units) conducive to
      high-speed DAC updating.  See the 3DPC protocol specification
      for more information.

    returns error code

  --------------------------------------------------------------------------- }

function __AddVector(startX,startY: Word;deltaX,deltaY: Integer;
                     incr: Word): Integer;
  var
    VectorPacket: _VectorType;
  begin
    if incr>0 then begin
      VectorPacket.fractX := 0;       { set up vector packet }
      VectorPacket.startX := startX;
      VectorPacket.fractY := 0;
      VectorPacket.startY := startY;
      VectorPacket.deltaX := deltaX;
      VectorPacket.deltaY := deltaY;
      VectorPacket.incr   := incr;
      with __IntReg do begin
        AX := $0200;
        ES := Seg(VectorPacket);     { point ES:BX to vector packet }
        BX := Ofs(VectorPacket);
        Intr(_LASERVECTOR,__IntReg);
```

```
      __AddVector := AL;
    end;
  end else __AddVector := 0;
end;

{ ----------------------------------------------------------------------------

   __AddOpenShutter function
     add the open shutter command to the background command queue.  The
     shutter will be opened by the background task when it gets to this
     command in the command queue.

   returns error code

 ---------------------------------------------------------------------------- }

function  __AddOpenShutter: Integer;
  begin
    with __IntReg do begin
      AX := $0201;
      Intr(_LASERVECTOR,__IntReg);
      __AddOpenShutter := AL;
    end;
  end;

{ ----------------------------------------------------------------------------

   __AddCloseShutter function
     add the close shutter command to the background command queue.  The
     shutter will be closed by the background task when it gets to this
     command in the command queue.

   returns error code

 ---------------------------------------------------------------------------- }

function __AddCloseShutter: Integer;
  begin
    with __IntReg do begin
      AX := $0202;
      Intr(_LASERVECTOR,__IntReg);
      __AddCloseShutter := AL;
    end;
  end;

{ ----------------------------------------------------------------------------

   __AddChangeTimebase(NewTicks) function
     add the change time base command to the background command queue.
     The timer that awakens the badckground task will be reloaded with
     the count of NewTicks by the background task when it gets to this
     command in the command queue.

   returns error code

 ---------------------------------------------------------------------------- }

function __AddChangeTimebase(NewTicks: Word): Integer;
  begin
    with __IntReg do begin
      AX := $0203;
      BX := NewTicks;
      Intr(_LASERVECTOR,__IntReg);
      __AddChangeTimebase := AL;
    end;
  end;
```

```
------------------------------------------------------------------------

  __AddPause(DelayTicks) function
    add the pause command to the background command queue.  When the
    background task gets to this command, it will pause for DelayTicks
    number of timer ticks.  If the Background Interrupt Time is 119
    (100 us), then a pause of 1 ms will ensue if DelayTicks is 10.
    Afterwards, background activity resumes.

  returns error code

------------------------------------------------------------------------ }

function __AddPause(DelayTicks: Word): Integer;
  begin
    with __IntReg do begin
      AX := $0204;
      BX := DelayTicks;
      Intr(_LASERVECTOR,__IntReg);
      __AddPause := AL;
    end;
  end;

{ ------------------------------------------------------------------------

  __ResetCmdQueue function
    clear out the background command queue.  Usually used as part of
    an abort procedure.  Best when used just before a __CloseLaser call.

  returns error code

------------------------------------------------------------------------ }

function __ResetCmdQueue: Integer;
  begin
    with __IntReg do begin
      AX := $0300;
      Intr(_LASERVECTOR,__IntReg);
      __ResetCmdQueue := AL;
    end;
  end;

{ ------------------------------------------------------------------------

  __GetCmdQueueSize function
    get the background command queue's size in actual number of bytes.
    Number of vectors is variable but can be estimated by the number
    returned by this routine / 13.

  returns error code

------------------------------------------------------------------------ }

function __GetCmdQueueSize(var size: Word): Integer;
  begin
    with __IntReg do begin
      AX := $0400;
      Intr(_LASERVECTOR,__IntReg);
      size := BX;
      if size<0 then size := size + 65536;
      __GetCmdQueueSize := AL;
    end;
  end;

------------------------------------------------------------------------
```

```
  __GetIntNum(num) function
    place in num the software interrupt number.  Not really important
    unless we have a software interrupt conflict.

  returns error code

 ------------------------------------------------------------------------------ }

function __GetIntNum(var num: Word): Integer;
  begin
    with __IntReg do begin
      AX := $0500;
      Intr(_LASERVECTOR,__IntReg);
      num := BL;
      __GetIntNum := AL;
    end;
  end;

{ ------------------------------------------------------------------------------

  __GetBkgndTime(ticks) function
    place in time the background task interrupt interval time in actual
    1.19 MHz tick counts.  (119 is 100 us, 1190 is 1 ms, etc.)

  returns error code

 ------------------------------------------------------------------------------ }

function __GetBkgndTime(var ticks: Word): Integer;
  begin
    with __IntReg do begin
      AX := $0501;
      Intr(_LASERVECTOR,__IntReg);
      ticks := BX;
      __GetBkgndTime := AL;
    end;
  end;

{ ------------------------------------------------------------------------------

  __GetControlWord(ctrl) function
    place in ctrl the Laser Control Word showing the status of various
    hardware and software mechanisms.

    word bit  description
    --------  -----------------------------------
        0     Auto-Shutter Mode
        1     Position-Acknowledge Mode
        2     Block Mode
        3     -
        0     shutter control, 0=open/1=closed

  returns error code

 ------------------------------------------------------------------------------ }

function __GetControlWord(var ctrl: Word): Integer;
  begin
    with __IntReg do begin
      AX := $0502;
      Intr(_LASERVECTOR,__IntReg);
      ctrl := BX;
      __GetControlWord := AL;
    end;
  end;
```

```
{ ---------------------------------------------------------------------------

   __AutoShutterModeOn function
    returns the status of the Auto Shutter Mode (true for on).

  --------------------------------------------------------------------------- }

function __AutoShutterModeOn: Boolean;
  var
    Er: Integer;
    ctrl: Word;
  begin
    Er := __GetControlWord(ctrl);
    __AutoShutterModeOn := (ctrl and __BITVALUE[0]) > 0;
  end;

{ ---------------------------------------------------------------------------

   __PosAckModeOn function
    returns the status of the Position Acknowledge Mode (true for on).

  --------------------------------------------------------------------------- }

function __PosAckModeOn: Boolean;
  var
    Er: Integer;
    ctrl: Word;
  begin
    Er := __GetControlWord(ctrl);
    __PosAckModeOn := (ctrl and __BITVALUE[1]) > 0;
  end;

{ ---------------------------------------------------------------------------

   __BlockModeOn function
    returns the status of the Block Mode (true for on).

  --------------------------------------------------------------------------- }

function __BlockModeOn: Boolean:
  var
    Er: Integer;
    ctrl: Word;
  begin
    Er := __GetControlWord(ctrl);
    __BlockModeOn := (ctrl and __BITVALUE[2]) > 0;
  end;

{ ---------------------------------------------------------------------------

   __GetStatus(status1,status2) function
    place in status1 and status2 the Laser system's stati of various
    non-programmable hardware and software mechanisms.

    word bit       description
    --------       ----------------------------------------------
    status1.0      laser system channel open status
    status1.1      laser system software interrupt established (sic)
    status1.2      laser system background task in idle state
    status1.3-15   -
    status2.0      bit 0 of Port C1, X and Y-axis position acknowledge
    status2.1      bit 1 of Port C1, Z-axis position acknowledge
    status2.2      bit 2 of Port C1
    status2.3      bit 3 of Port C1
    status2.4-15   -
```

```
  returns error code

 ----------------------------------------------------------------------------- }

function __GetStatus(var status1,status2: Word): Integer;
  begin
    with __IntReq do begin
      AX := $0503;
      Intr(_LASERVECTOR,__IntReq);
      status1 := BX;
      status2 := CX;
      __GetStatus := AL;
    end;
  end;

{ -----------------------------------------------------------------------------

    __GetOpenStatus function
      tells whether or not the laser system communications channel has
      been opened and the timer tick trap installed.  The function returns
      a boolean value of TRUE if the channel is open.

    returns boolean value

 ----------------------------------------------------------------------------- }

function __GetOpenStatus: Boolean;
  var
    Er: Integer;
    stat1,stat2: Word;
  begin
    Er := __GetStatus(stat1,stat2);
    if Er=0 then __GetOpenStatus := (stat1 and __BITVALUE[0]) > 0
      else __GetOpenStatus := false;
  end;

{ -----------------------------------------------------------------------------

    __GetBkgndIdleStatus function
      tells whether or not the laser system background task is currently
      in the idle state where no more laser activity can be performed
      without some more foreground-sourced commands.  The function returns
      a boolean value of TRUE if the background task is idle.

    returns boolean value

 ----------------------------------------------------------------------------- }

function __GetBkgndIdleStatus: Boolean;
  var
    Er: Integer;
    stat1,stat2: Word;
  begin
    Er := __GetStatus(stat1,stat2);
    if Er=0 then __GetBkgndIdleStatus := (stat1 and __BITVALUE[2]) > 0
      else __GetBkgndIdleStatus := false;
  end;

{ -----------------------------------------------------------------------------

    __GetTurnOffDelay(ticks) function
      get the idle state's laser turn-off delay in interrupt tick counts.

    returns error code
```

```
-------------------------------------------------------------------------- }

function __GetTurnOffDelay(var ticks: Word): Integer;
  begin
    with __IntReg do begin
      AX := $0504;
      Intr(_LASERVECTOR,__IntReg);
      ticks := BX;
      __GetTurnOffDelay := AL;
    end;
  end;

{ --------------------------------------------------------------------------

    __GetTurnOnDelay(ticks) function
      get the idle state's laser turn-on delay in interrupt tick counts.

    returns error code
  -------------------------------------------------------------------------- }

function __GetTurnOnDelay(var ticks: Word): Integer;
  begin
    with __IntReg do begin
      AX := $0505;
      Intr(_LASERVECTOR,__IntReg);
      ticks := BX;
      __GetTurnOnDelay := AL;
    end;
  end;

{ --------------------------------------------------------------------------

    __GetHomePosition(X,Y) function
      get the idle state's laser home position.

    returns error code
  -------------------------------------------------------------------------- }

function __GetHomePosition(var X,Y: Word): Integer;
  begin
    with __IntReg do begin
      AX := $0506;
      Intr(_LASERVECTOR,__IntReg);
      X := BX;
      Y := CX;
      __GetHomePosition := AL;
    end;
  end;

{ --------------------------------------------------------------------------

    __SetIntNum(num) function
      set the software interrupt number to num.  All software interrupt
      call after this point must use this new interrupt number.  The
      interrupt vector for the old number is restored.

    returns error code
  -------------------------------------------------------------------------- }

function __SetIntNum(num: Word): Integer;
  begin
    with __IntReg do begin
```

```
      AX := $0600;
      BL := num;
      Intr(_LASERVECTOR,__IntReg);
      __SetIntNum := AL;
    end;
  end;

{ ---------------------------------------------------------------------------

    __SetBkgndTime(ticks) function
      set the background task interrupt interval to ticks which has the
      actual number of 1.19 MHz tick counts.  (119 is 100 us, etc.)

    returns error code
  --------------------------------------------------------------------------- }

function __SetBkgndTime(ticks: Word): Integer;
  begin
    if ticks<_MINIMUM_TICKS then ticks := _MINIMUM_TICKS;
    with __IntReg do begin
      AX := $0601;
      BX := ticks;
      Intr(_LASERVECTOR,__IntReg);
      __SetBkgndTime := AL;
    end;
  end;

{ ---------------------------------------------------------------------------

    __SetControlWord(ctrl) function
      set the Laser Control Word to ctrl.  It is recommended that most
      software programs use the __AlterControlWordBit and the specific
      mode set routines which follow.

      word bit  description
      --------  ---------------------------------
          0     Auto-Shutter Mode
          1     Position-Acknowledge Mode
          2     Block Mode
          3     -
          4     shutter control, 0=open/1=closed

    returns error code
  --------------------------------------------------------------------------- }

function __SetControlWord(ctrl: Word): Integer;
  begin
    with __IntReg do begin
      AX := $0602;
      BX := ctrl;
      Intr(_LASERVECTOR,__IntReg);
      __SetControlWord := AL;
    end;
  end;

{ ---------------------------------------------------------------------------

    __AlterControlWordBit(op,bit) function
      alter the state of the indicated Control Word bit.  If op is 'S' or
      '+', the bit is set;  if op is 'C' or '-', the bit is cleared.

    returns error code
  ---------------------------------------------------------------------------
```

```
function __AlterControlWordBit(op: Char;bit: Word): Integer;
  var
    Er: Integer;
    ctrl: Word;
  begin
    Er := __GetControlWord(ctrl);
    if Er=0 then begin
      if upcase(op) in ['S','+'] then ctrl := ctrl or __BITVALUE[bit]
        else if upcase(op) in ['C','-'] then
          ctrl := ctrl and (__ALLBITS-__BITVALUE[bit]);
      Er := __SetControlWord(ctrl);
    end;
    __AlterControlWordBit := Er;
  end;

{ -------------------------------------------------------------------------

    __SetAutoShutterMode(state) function
      set the state ('S'or '+' to set, 'C' or '-' to clear) of the
      Auto-Shutter Mode.

    returns error code

  ------------------------------------------------------------------------- }

function __SetAutoShutterMode(op: Char): Integer;
  begin
    __SetAutoShutterMode := __AlterControlWordBit(op,0);
  end;

{ -------------------------------------------------------------------------

    __SetPosAckMode(state) function
      set the state ('S' or '+' to set, 'C' or '-' to clear) of the
      Position-Acknowledge Mode.

    returns error code

  ------------------------------------------------------------------------- }

function __SetPosAckMode(op: Char): Integer;
  begin
    __SetPosAckMode := __AlterControlWordBit(op,1);
  end;

{ -------------------------------------------------------------------------

    __SetBlockMode(state) function
      set the state ('S' or '+' to set, 'C' or '-' to clear) of the
      Block Mode where the 07 commands (below) are active.

    returns error code

  ------------------------------------------------------------------------- }

function __SetBlockMode(op: Char): Integer;
  begin
    __SetBlockMode := __AlterControlWordBit(op,2);
  end;

{ -------------------------------------------------------------------------

    __SetTurnOffDelay(ticks) function
      sets the idle state's laser turn-off delay to ticks interrupt counts.
```

```
    returns error code

  ------------------------------------------------------------------------- }

function __SetTurnOffDelay(ticks: Word): Integer;
  begin
    with __IntReg do begin
      AX := $0604;
      BX := ticks;
      Intr(_LASERVECTOR,__IntReg);
      __SetTurnOffDelay := AL;
    end;
  end;

{ -------------------------------------------------------------------------

    __SetTurnOnDelay(ticks) function
      sets the idle state's laser turn-on delay to ticks interrupt counts.

    returns error code

  ------------------------------------------------------------------------- }

function __SetTurnOnDelay(ticks: Word): Integer;
  begin
    with __IntReg do begin
      AX := $0605;
      BX := ticks;
      Intr(_LASERVECTOR,__IntReg);
      __SetTurnOnDelay := AL;
    end;
  end;

{ -------------------------------------------------------------------------

    __SetHomePosition(X,Y) function
      sets the idle state's laser home position.

    returns error code

  ------------------------------------------------------------------------- }

function __SetHomePosition(X,Y: Word): Integer;
  begin
    with __IntReg do begin
      AX := $0606;
      BX := X;
      CX := Y;
      Intr(_LASERVECTOR,__IntReg);
      __SetHomePosition := AL;
    end;
  end;

{ -------------------------------------------------------------------------

    __Execute function
      set the background task running.  The background task will process
      those commands added to the command queue from the last Clear
      Operation up to this __Execute call.   For the first __Execute,
      then background task will start at the beginning of the queue.  New
      commands can be added to the command queue while the background task
      is running.

      When the background task is finished processing the current command
      block, it will automatically shut down, placing the laser beam at
      the preset home position.
```

```
    To make programs written for earlier versions (where the background
    task free-ran) compatible, __Execute, __ExecuteClear, and __Clear
    calls (see below) should be used wherever appropriate.

  returns error code

  ------------------------------------------------------------------------ }

function __Execute: Integer;
  begin
    with __IntReg do begin
      AX := $0700;
      Intr(_LASERVECTOR,__IntReg);
      __Execute := AL;
    end;
  end;

{ ------------------------------------------------------------------------

  __ExecuteClear function
    perform the equivalent of the __Execute function (see above) and a
    __Clear function (see below) function.  The __ExecuteClear function
    provides a convenient shorthand for:

      Er := __Execute;
      Er := __Clear;

  returns error code

  ------------------------------------------------------------------------ }

function __ExecuteClear: Integer;
  begin
    with __IntReg do begin
      AX := $0701;
      Intr(_LASERVECTOR,__IntReg);
      __ExecuteClear := AL;
    end;
  end;

{ ------------------------------------------------------------------------

  __Clear function
    clear the command queue.  Future __Execute and __ExecuteClear calls
    will start the background task processing command queue entries
    added after the call to this routine.  An Execute Operation
    asked for immediately after a Clear Operation has no effect.

    If __Clear is not called between consecutive Execute Operations,
    then background task will reprocess the command queue entries for
    the first Execute Operation.  Sometimes this is desired, and
    sometimes it isn't.

  returns error code

  ------------------------------------------------------------------------ }

function __Clear: Integer;
  begin
    with __IntReg do begin
      AX := $0702;
      Intr(_LASERVECTOR,__IntReg);
      __Clear := AL;
    end;
  end;
```

```
{ ------------------------------------------------------------------------------

    __SetStepPeriods function
      set the step periods for the multiple passes.  array contains
      number of step periods to define (1 to 10) and the step period
      values in 0.82 us (1.19 Mhz) units.

    returns error code

  ------------------------------------------------------------------------------ }

function __SetStepPeriods(var sp_array: _StepPeriodsType): Integer;
  begin
    with __IntReg do begin
      AX := $0800;
      ES := Seg(sp_array);      { point ES:BX to step periods array }
      BX := Ofs(sp_array);
      Intr(_LASERVECTOR,__IntReg);
      __SetStepPeriods := AL;
    end;
  end;

{ ------------------------------------------------------------------------------

    __SetRedrawCount function
      set the number of passes for the background task's redraw (1-8).

    returns error code

  ------------------------------------------------------------------------------ }

function __SetRedrawCount(count: Word): Integer;
  begin
    with __IntReg do begin
      AX := $0801;
      if count<1 then count := 1
        else if count>10 then count := 10;
      BX := count;
      Intr(_LASERVECTOR,__IntReg);
      __SetRedrawCount := AL;
    end;
  end;

{ ------------------------------------------------------------------------------

    __SetRedrawDelay function
      set the number of timer ticks the background task should delay
      before starting a redraw pass.

    returns error code

  ------------------------------------------------------------------------------ }

function __SetRedrawDelay(delay: Word): Integer;
  begin
    with __IntReg do begin
      AX := $0802;
      BX := delay;
      Intr(_LASERVECTOR,__IntReg);
      __SetRedrawDelay := AL;
    end;
  end;

{ ------------------------------------------------------------------------------
```

```
  __Mark function
    marks the current position as the start of the next redraw.
    Usually only necessary at the beginning of a block.

  returns error code
- ---------------------------------------------------------------------------- }

function __Mark: Integer;
  begin
    with __IntReg do begin
      AX := $0803;
      Intr(_LASERVECTOR,__IntReg);
      __Mark := AL;
    end;
  end;

{ ----------------------------------------------------------------------------

  __Redraw function
    causes the background task to perform a multi-pass redraw
    operation when it is encountered in the Background Command
    Queue.  __Redraw also marks so as to minimize use of commands.

  returns error code
  ---------------------------------------------------------------------------- }

function __Redraw: Integer;
  begin
    with __IntReg do begin
      AX := $0804;
      Intr(_LASERVECTOR,__IntReg);
      __Redraw := AL;
    end;
  end;

{ end of LASER.INC }
```

```
Program SLAGRAPH;
{
                        3D Systems SLA Graphics Software


  Change Log:
    2/16/88 - Original Release

}
{$V-}
  uses
    Crt,Dos,Graph;

  const
    VERSION : String = 'Test260a';
    MAX_WORD : Word = 65535;
    MAX_REAL : Real = 1.7E37;
    MIN_REAL : Real = -1.7E37;
    ZERO_DEF = 1E-5;
    ESC  : Char = #27;
    CR   : Char = #13;
    LF   : Char = #10;
    BUF_SIZE = 4095;
    Spaces : String =
    MAX_PTR_ARRAY = 16382;

    { Slice Constants }
    MAX_LAYERS     = 16382;
    LAYER_SIZE     = 16;
    MAX_SECTIONS   = 5;
    SliceBlocks : Array [0..4] of String[3] = ('L','FU','FD','NFU','NFD');
    L_SECTIONS     = $0007;
    L_SECTION      = $8000;
    LB_SECTION     = $0001;
    LH_SECTION     = $0002;
    FU_SECTIONS    = $0038;
    FD_SECTIONS    = $01C0;
    NFU_SECTIONS   = $0E00;
    NFD_SECTIONS   = $7000;
    F_SECTIONS     = $01F8;
    NF_SECTIONS    = $7E00;

    { Triangle Constants }
    MAX_TRIANGLES   = 10921;
    TRIANGLE_SIZE   = 10;
    ASC_FILE        = 1;        { File Type Constants }
    BINARY_FILE     = 2;
    ARIES_FILE      = 3;
    COOR_CHAR : Array [1..3] of Char = ('X','Y','Z');

  type
    DynamicSLWordArray      = Array [0..16382] of Word;
    DynamicSLLongIntArray   = Array [0..16382] of LongInt;
    DynamicTRILongIntArray  = Array [0..10921] of LongInt;
    DynamicTRIRealArray     = Array [0..6552] of Real;
    PointerStruct           = Array [0..255] of Byte;
    PointerType             = ^PointerStruct;

  var
    ExitSave                        : Pointer;
    HeapTop                         : Pointer;
    InBuffer                        : Array [0..BUF_SIZE] of Char;
    InBufStr                        : String;
```

```
procedure OutTextLn(aline:String);
  { "writeln" for graphics }
  begin
    OutText(aline);
    MoveTo(1,GetY+TextHeight(' ')+2);
  end;

procedure GrTextXY(aline:String;x,y : Byte);
  { writes text at XY char on graphic screen }
  begin
    OutTextXY((x-1)*(TextWidth(' ')+2),(y-1)*(TextHeight(' ')+2),aline);
  end;

procedure ConvertStoR(s,r : PointerType);
  { Converts a Single type (4 byte) number to a Real (6 byte) }
begin
  r^[0]:=(((s^[3] shl 8) + s^[2]) shr 7) and $FF;
  r^[1]:=0;
  r^[2]:=0;
  r^[3]:=s^[0];
  r^[4]:=s^[1];
  r^[5]:=(s^[3] and $80) or (s^[2] and $7F);
  if r^[0]<>0 then Inc(r^[0],2); { e offset }
end;

procedure ConvertRtoS(r,s : PointerType);
  { Converts a Real type (6 byte) number to a Single (4 byte) }
var
  e : Byte;
begin
  e:=r^[0];
  if e<>0 then Dec(e,2); { e offset }
  s^[3]:=(r^[5] and $80) or ((e shr 1) and $7F);
  s^[2]:=((e shl 7) or (r^[5] and $7F)) and $FF;
  s^[1]:=r^[4];
  s^[0]:=r^[3];
end;

procedure ToUpper(var aline : String);
  { Converts a string to upper case }
  var
    i : Integer;
  begin
    for i:=1 to Length(aline) do aline[i] := UpCase(aline[i]);
  end;

procedure Center(str : String;linenum : Byte);
  { Centers text on screen line }
  begin
    GotoXY(1,linenum);
    ClrEol;
    if Length(str)>79 then GotoXY(1,linenum)
    else GotoXY(40-(Length(str) div 2),linenum);
    write(str);
  end;

procedure WaitKey;
  { Waits for a key press while prompting }
  var
    ch : Char;
  begin
    Center('<Press any key to continue>',25);
    ch:=ReadKey;
  end;

procedure SelectTxtColor(select : Integer);
```

```
  { Sets text color requested or White for non-color displays }
  begin
    if MonoDisplay then TextColor(White)
    else TextColor(select);
  end;

procedure SelectGraphColor(select : Integer);
  { Sets graphic color.  If black and white, uses dashed lines, etc. }
  var
    LineType : Integer;
  begin
    if MonoDisplay then begin
      SetColor(White);
      case select of
         1 : LineType:=SolidLn;
         2 : LineType:=CenterLn;
         4 : begin
               LineType:=CenterLn;
               SetColor(LightGray);
             end;
         9 : begin
               LineType:=SolidLn;
               SetColor(LightGray);
             end;
        10 : LineType:=DashedLn;
        12 : begin
               LineType:=DashedLn;
               SetColor(LightGray);
             end;
        ELSE LineType:=CenterLn;
      end;
      SetLineStyle(LineType,0,NormWidth);
    end else SetColor(select);
  end;

procedure PrintHeader;
  { Prints general 3D header at top of screen }
  begin
    TextColor(White);
    if Not MonoDisplay then TextBackground(Blue)
    else TextBackground(Black);
    ClrScr;
    Center('3D Systems Graphis Display Program (Version '+VERSION+')',1);
    Center('Copyright (C) 1988 3D Systems Inc',2);
    SelectTxtColor(LightGreen);
  end;

procedure PrintSliceHeader;
  { Print Slice Screens header }
  begin
    PrintHeader;
    SelectTxtColor(LightRed);
    Center('Slice File Control Functions',3);
    TextColor(White);
  end;

procedure PrintTriHeader;
  { Print Triangle Screens header }
  begin
    PrintHeader;
    SelectTxtColor(LightRed);
    Center('Triangle File Control Functions',3);
    TextColor(White);
  end;

function GetFilename(var FileName : String; sel : Integer) : Boolean;
```

```
{ Displays file with SLI or STL extentions and allows user to select
   a file to use. }
var
  DirRec          : SearchRec;
  CurrFileName    : String;
  Extn            : String;
  row,col         : Integer;
  count           : Integer;
begin
  if sel = 1 then begin
    Extn := '.STL';
    PrintTriHeader;
    GotoXY(1,6);
    write('Triangle');
  end else begin
    Extn := '.SLI';
    PrintSliceHeader;
    GotoXY(1,6);
    write('Slice');
  end;
  { Display the entries }
  write(' Files in current directory:');
  row := 0;
  col := 0;
  count := 0;
  FindFirst('*'+Extn,AnyFile,DirRec);
  while (DosError = 0) and (count < 75) do begin
    GotoXY(3+col*15,8+row);
    write(Copy(DirRec.name,1,Pos('.',DirRec.name)-1));
    col := col + 1;
    if col = 5 then begin
      col := 0;
      row := row + 1;
    end;
    FindNext(DirRec);
  end;
  { Read the filename }
  repeat
    GotoXY(1,24);
    ClrEol;
    write('Enter File Name: ');
    Readln(CurrFilename);
    ToUpper(CurrFilename);
    if CurrFilename <> '' then begin
      { Find in directory }
      if Pos('.',CurrFilename) = 0 then CurrFilename := CurrFilename + Extn;
      if Pos('*',CurrFilename)=0 then begin
        FindFirst(CurrFilename,AnyFile,DirRec);
        if DosError <> 0 then Center('**** "'+CurrFilename+'" File Not Found ***
      end else begin
        DosError:=1;
        Center('*** No Wild cards allowed ***',25);
      end;
    end;
  until (CurrFilename = '') or (DosError = 0);
  if CurrFilename = '' then GetFilename:=FALSE
  else begin
    FileName := CurrFilename;
    GetFilename:=TRUE;
  end;
 end;

procedure ASCError(FileName : String);
  { Prints ASC file error }
  begin
    Str(StartLinePos,TempStr);
```

```
    Center('Error found in Text file "'+FileName+'" at position '+TempStr,23);
    Center('Line: '+ErrLine,24);
    WaitKey;
  end;

procedure CheckBuffer(var InFile : File);
  { Makes sure the input buffer has enogh data in it.
     If not, it reads more in. }
  var
    NumRead : Word;
  begin
    if InBufPtr > InBufEnd-160 then begin
      { Reload Buffer }
      if InBufPtr > InBufEnd then InBufEnd := 0  { Buffer Empty }
      else begin
        { Buffer almost empty }
         InBufEnd := InBufEnd - InBufPtr + 1;
         Move(InBuffer[InBufPtr],InBuffer[0],InBufEnd);
      end;
      { Fill rest of buffer }
      if Not Eof(InFile) then BlockRead(InFile,InBuffer[InBufEnd],BUF_SIZE-InBufEn
      else NumRead:=0;
      { Set buffer pointers }
      if InBufEnd+NumRead=0 then EndOfFile:=TRUE
      else Inc(InBufEnd,NumRead - 1);
      InBufPtr := 0;
    end;
  end;

procedure ResetFile(var InFile : File);
  { Resets input file to top of file }
  begin
    Reset(InFile,1);
    Seek(InFile,0);
    CurrFilePos:=0;
    InBufPtr := BUF_SIZE+1;
    InBufEnd := BUF_SIZE;
    EndOfFile:=FALSE;
    FileError:=FALSE;
  end;

procedure PositionFile(var InFile : File;charnum : LongInt);
  { Positions input buffer to specific character of file.  If not in buffer
      reads from file }
  begin
    if (charnum>=CurrFilePos-InBufPtr) AND (charnum<=CurrFilePos-InBufPtr+InBufEnd
      InBufPtr:=InBufPtr+charnum-CurrFilePos
    else begin
      Seek(InFile,charnum);
      InBufPtr := BUF_SIZE+1;
      InBufEnd := BUF_SIZE;
      EndOfFile:=FALSE;
    end;
    CurrFilePos:=charnum;
    CheckBuffer(InFile);
  end;

procedure ReadLine(var InFile : File);
  { Reads a line from input file into a string }
  var
    CRPos,i         : Integer;
  begin
    InputLine:='';
    if (Not FileError) AND (Not EndOfFile) then repeat
      CheckBuffer(InFile);
      { Search for CR }
```

```
      if Not EndOfFile then begin
        i := InBufEnd-InBufPtr+1;
        if i > 255 then i := 255;
        InputLine[0] := Char (i);
        Move(InBuffer[InBufPtr],InputLine[1],i);
        CRPos := Pos(CR,InputLine)-1;
        if CRPos < 0 then CRPos := length(InputLine);
        InputLine[0] := Char (CRPos);
        StartLinePos:=CurrFilePos;
        PositionFile(InFile,CurrFilePos+CRPos+1);
        if InBuffer[InBufPtr] = LF then PositionFile(InFile,CurrFilePos+1);
      end else InputLine := '';
    until EndOfFile OR (InputLine <> '');
    ToUpper(InputLine);
    ErrLine:=InputLine;
  end;

function ParseLine(var aline : String) : String;
  { Parses first word from string and truncs off from original string }
  var
    parsed : String;
    i,j    : Integer;
  begin
    i:=1;
    while (i<=Length(aline)) AND (aline[i]=' ') do Inc(i);
    if i>Length(aline) then begin
      aline:='';
      parsed:='';
    end else begin
      j:=i;
      while (j<=Length(aline)) AND (aline[j]<>' ') do Inc(j);
      Move(aline[i],Parsed[1],j-i);
      parsed[0]:=Char (j-i);
      if j>=Length(aline) then aline:=''
      else begin
        Move(aline[j+1],aline[1],Length(aline)-j);
        aline[0]:=Char (Length(aline)-j);
      end;
    end;
    ParseLine:=parsed;
  end;


procedure SetMinMax(var num,min,max : Word);
  { Updates Min and Max values with given data }
  begin
    if num>max then max:=num;
    if num<min then min:=num;
  end;

procedure SetGraph;
  { Finds what type of video hardware is installed and picks best
      graphics screen.  Sets screen definition information. }
  var
    aspectx,aspecty : Word;
  begin
    DetectGraph(GraphDriver,GraphMode);
    if GraphDriver < 0 then ProgramError('Graphics - '+GraphErrorMsg(GraphDriver));
    GetModeRange(GraphDriver,TempInt,GraphMode);
    if GraphMode>3 then GraphMode:=3; { for CGA }
    InitGraph(GraphDriver, GraphMode, 'c:\tp');
    rc := GraphResult;
    if rc <> GrOk then ProgramError('Graphics - '+GraphErrorMsg(rc));
    if (GraphDriver<5) or (GraphDriver=8) then MonoDisplay:=FALSE
    else MonoDisplay:=TRUE;
    GetAspectRatio(aspectx,aspecty);
```

```
    AspectRatio := aspectx/aspecty;
    SizeX := GetMaxX + 1;
    SizeY := GetMaxY + 1;
    GraphCenterX:= Round(SizeX/2);
    GraphCenterY:= Round(SizeY/2);
  end;

procedure SetupGraphicW(MinX.MaxX,MinY.MaxY : Word);
  { Sets up graphic vars using Integer(Word) proposed ranges }
  var
    scalex : Real;
  begin
    GraphScale:=(SizeX-4)/((MaxX-MinX)/AspectRatio);
    if Integer (MaxY-MinY)*GraphScale>SizeY then GraphScale:=(SizeY-4)/Integer (Ma
    GrOffsetX:=MinX+Round((MaxX-MinX)/2);
    GrOffsetY:=MinY+Round((MaxY-MinY)/2);
    SetGraphMode(GraphMode);
    SetColor(White);
    SetBkColor(Black);
    SetLineStyle(SolidLn,0,NormWidth);
  end;

procedure SetupGraphicR(MinX.MaxX.MinY.MaxY,MinZ,MaxZ : Real):
  { Sets up graphic vars using Real values and assuming rotations }
  var
    RangeX.RangeY.RangeZ : Real;
  begin
    RangeX:=(MaxX-MinX)*1.42; { 1.42 = 1/Sin(45deg) = worst expansion diag }
    RangeY:=(MaxY-MinY)*1.42;
    RangeZ:=(MaxZ-MinZ)*1.42;
    GraphScale:=SizeY/RangeX;
    if RangeY*GraphScale>SizeY then GraphScale:=SizeY/RangeY;
    if RangeZ*GraphScale>SizeY then GraphScale:=SizeY/RangeZ;
    GrOffsetX:=MinX+(MaxX-MinX)/2:
    GrOffsetY:=MinY+(MaxY-MinY)/2;
    GrOffsetZ:=MinZ+(MaxZ-MinZ)/2:
    SetGraphMode(GraphMode);
    SetColor(White);
    SetBkColor(Black);
    SetLineStyle(SolidLn,0,NormWidth);
  end;

procedure DrawLine(x1,y1,x2.y2 : Word);
  { Draws a line on graphics screen (no rotation) }
  begin
    x1:=GraphCenterX+Round(Round(x1-GrOffsetX)*GraphScale/AspectRatio);
    x2:=GraphCenterX+Round(Round(x2-GrOffsetX)*GraphScale/AspectRatio);
    y1:=GraphCenterY-Round(Round(y1-GrOffsetY)*GraphScale);
    y2:=GraphCenterY-Round(Round(y2-GrOffsetY)*GraphScale);
    Line(x1,y1,x2,y2);
  end;

procedure Compute3D(x,y,z : Real;var new_x,new_z : Integer);
  { Maps a 3D point into 2D graphics screen }
  begin
    x:=x-GrOffsetX;
    y:=y-GrOffsetY;
    z:=z-GrOffsetZ;
    new_x := GraphCenterX + Round(GraphScale*(x*Gr3DMat[0,0]+y*Gr3DMat[1,0]+z*Gr3D
    {  Have Y mapping just for reference.
    new_y := GraphCenterY - Round(GraphScale*(x*Gr3DMat[0,1]+y*Gr3DMat[1,1]+z*Gr3D
    }
    new_z := GraphCenterY - Round(GraphScale*(x*Gr3DMat[0,2]+y*Gr3DMat[1,2]+z*Gr3D
  end;

procedure Draw3D(x1,y1.z1,x2,y2,z2 : Real);
```

```
 { Takes 2 3D points and draws line between them }
 var
   coorx1,coory1,coorx2,coory2 : Integer;
 begin
   Compute3D(x1,y1,z1,coorx1,coory1);
   Compute3D(x2,y2,z2,coorx2,coory2);
   Line(coorx1,coory1,coorx2,coory2);
 end;


procedure Init3D;
  { Sets up 3D transformation matrix for mapping 3D to 2D }
  var
    txy,txz,tyz : Real;
  begin
    txy := TriangleAngle[3]*0.0175; { Z Axis }
    txz := TriangleAngle[2]*0.0175; { Y Axis }
    tyz := TriangleAngle[1]*0.0175; { X Axis }

    Gr3DMat[0,0]:= Cos(txz)*Cos(txy);
    Gr3DMat[1,0]:= Cos(tyz)*Sin(txy)-Sin(tyz)*Sin(txz)*Cos(txy);
    Gr3DMat[2,0]:=-Sin(tyz)*Sin(txy)-Cos(tyz)*Sin(txz)*Cos(txy);
    Gr3DMat[0,1]:=-Cos(txz)*Sin(txy);
    Gr3DMat[1,1]:= Cos(tyz)*Cos(txy)+Sin(tyz)*Sin(txz)*Sin(txy);
    Gr3DMat[2,1]:=-Sin(tyz)*Cos(txy)+Cos(tyz)*Sin(txz)*Sin(txy);
    Gr3DMat[0,2]:= Sin(txz);
    Gr3DMat[1,2]:= Sin(tyz)*Cos(txz);
    Gr3DMat[2,2]:= Cos(tyz)*Cos(txz);
  end;


{ ---------------------------------------------------------------------------
  :                     Start of Main Triangle Routines                      :
  --------------------------------------------------------------------------- }

function FindTriangleLevel(value : Real;highlo : Byte) : Word;
  { Binary search for value and then file lowest or highest common index }
  var
    low,mid,high,index   :  Word;
  begin
    low:=0;
    high:=TriangleTotal;
    index:=MAX_WORD;
    repeat
      mid:=(low+high) div 2;
      if value<TriangleAxisValue^[mid] then high:=mid
      else if value>TriangleAxisValue^[mid] then low:=mid
           else index:=mid;
    until (high-low=1) or (index<MAX_WORD);
    if highlo=1 then begin
      if index=MAX_WORD then index:=high;
      while (index>0) and (TriangleAxisValue^[index-1]=TriangleAxisValue^[index]) d
    end else begin
      if index=MAX_WORD then index:=low;
      while (index<TriangleTotal) and (TriangleAxisValue^[index+1]=TriangleAxisValu
    end;
    FindTriangleLevel:=index;
  end;

 function ReadTriangle : Boolean;
   { Read in one triangles data from input files current location }
   var
     ParsingLine : String;
     i,j       : Word;
   begin
     if TriangleFiletype=ASC_FILE then begin
```

```
      TriangleAttrib:=0;
      ReadLine(TriangleFile); { FACET NORMAL i j k }
      TempStr:=ParseLine(InputLine);
      if TempStr='END' then begin
        if ParseLine(InputLine)<>'SOLID' then FileError:=TRUE;
        EndOfFile:=TRUE;
      end else begin
        if (TempStr<>'FACET') OR (ParseLine(InputLine)<>'NORMAL') then FileError:=
        if Not FileError then for i:= 1 to 3 do begin
          Val(ParseLine(InputLine),TriangleNormal[i],rc);
          if rc<>0 then FileError:=TRUE;
        end;
        ReadLine(TriangleFile); { OUTER LOOP }
        if (ParseLine(InputLine)<>'OUTER') OR  (ParseLine(InputLine)<>'LOOP') then
        if Not FileError then for i:= 1 to 3 do begin
          ReadLine(TriangleFile); { VERTEX }
          if ParseLine(InputLine)<>'VERTEX' then FileError:=TRUE
          else for j:= 1 to 3 do begin
            Val(ParseLine(InputLine),TriangleVertex[i,j],rc);
            if rc<>0 then FileError:=TRUE;
          end;
        end;
      end;
      ReadTriangle:=Not (FileError or EndOfFile);
    end else begin
      { A Binary File }
      for i:=0 to 2 do begin
       ConvertStoR(@InBuffer[InBufPtr+i*4],@TriangleNormal[i+1]);
      end;
      for i:=0 to 2 do
        for j:=0 to 2 do ConvertStoR(@InBuffer[InBufPtr+12+i*12+j*4],@TriangleVert
      ReadTriangle:=Not EndOfFile;
    end;
  end;

procedure GraphTriangles;
  { Graph the selected triangles to screen }
  var
    index : LongInt;
    min,max : Real;
  begin
    min:=MAX_REAL;
    max:=MIN_REAL;
    if TriangleWindowingFile then
      SetupGraphicR(TriangleFileMin[1],TriangleFileMax[1],
                    TriangleFileMin[2],TriangleFileMax[2],
                    TriangleFileMin[3],TriangleFileMax[3])
    else
      SetupGraphicR(TriangleSelectMin[1],TriangleSelectMax[1],
                    TriangleSelectMin[2],TriangleSelectMax[2],
                    TriangleSelectMin[3],TriangleSelectMax[3]);
    Init3D;
    GrTextXY('Triangle Filename   : '+TriangleFilename,1,1);
    Str(TriangleSelected,TempStr);
    GrTextXY('Triangles Displayed : '+TempStr,1,2);
    index:=0;
    repeat
      if (TriangleAxisValue^[index]>=TriangleSelectStart) and
         (TriangleAxisValue^[index]<=TriangleSelectEnd) then begin
        PositionFile(TriangleFile,TrianglePtr^[index]);
        TempBoolean:=ReadTriangle;
        if abs(TriangleNormal[TriangleAxis])>1-ZERO_DEF then
          if TriangleNormal[TriangleAxis]>0 then SelectGraphColor(LightGreen) {FU}
          else SelectGraphColor(LightBlue)                                    {FD}
        else if TriangleNormal[TriangleAxis]>0 then SelectGraphColor(Green)   {U}
             else SelectGraphColor(Blue);                                     {D}
```

```
        Draw3D(TriangleVertex[1,1],TriangleVertex[1,2],TriangleVertex[1,3],
               TriangleVertex[2,1],TriangleVertex[2,2],TriangleVertex[2,3]);
        Draw3D(TriangleVertex[2,1],TriangleVertex[2,2],TriangleVertex[2,3],
               TriangleVertex[3,1],TriangleVertex[3,2],TriangleVertex[3,3]);
        Draw3D(TriangleVertex[3,1],TriangleVertex[3,2],TriangleVertex[3,3],
               TriangleVertex[1,1],TriangleVertex[1,2],TriangleVertex[1,3]);
      end;
      if Not KeyPressed then Inc(Index)
      else Index:=TriangleTotal+1;
    until Index>TriangleTotal;
    SetColor(LightGray);
    if KeyPressed then begin
      TempChar:=ReadKey;
      GrTextXY('Drawing ABORTED',1,3);
    end else GrTextXY('Drawing Complete',1,3),
  end;

procedure PrintRealRange(Str1,Str2 : String;min,max : Real);
  { Prints Range values on line for parameters }
  begin
    GotoXY(3,WhereY);
    TextColor(LightGray);
    write(Copy(Str1+'                  ',1,12),': ');
    TextColor(White);
    write(min:16:8);
    GotoXY(42,WhereY);
    TextColor(LightGray);
    write(Copy(Str2+'                  ',1,12),': ');
    TextColor(White);
    write(max:16:8);
  end;

procedure PrintTriangleMenu;
  { Print out Triangle Main Menu }
  var
    i  : Word;
  begin
    PrintTriHeader;
    GotoXY(3,5);
    TextColor(LightGray);
    write('Triangle Filename : ');
    TextColor(White);
    write(TriangleFilename);
    GotoXY(3,WhereY+1);
    TextColor(LightGray);
    write('Total Triangles: ');
    TextColor(White);
    writeln(TriangleTotal+1);
    for i:= 1 to 3 do begin
      GotoXY(1,WhereY+1);
      PrintRealRange('File '+COOR_CHAR[i]+' Min','File '+COOR_CHAR[i]+' Max',Trianc
    end;
    GotoXY(3,WhereY+2);
    TextColor(LightGray);
    write('Total Selected : ');
    TextColor(White);
    writeln(TriangleSelected);
    PrintRealRange('Selected Min','Selected Max',
      TriangleSelectStart,TriangleSelectEnd);
    for i:= 1 to 3 do begin
      GotoXY(1,WhereY+1);
      PrintRealRange('Sel. '+COOR_CHAR[i]+' Min','Sel. '+COOR_CHAR[i]+' Max',
        TriangleSelectMin[i],TriangleSelectMax[i]);
    end;
    TextColor(LightGray);
    GotoXY(3,WhereY+2);
```

```
    for i:=1 to 3 do write(COOR_CHAR[i],' ');
    write('Axis Rotation: ');
    TextColor(White);
    for i:= 1 to 3 do write(TriangleAngle[i],' ');
    GotoXY(60,WhereY);
    TextColor(LightGray);
    write('Windowing by ');
    TextColor(White);
    if TriangleWindowingFile then write('File')
    else write('Range');
    GotoXY(3,WhereY+2);
    TextColor(LightGray);
    write('Slice Axis is ');
    TextColor(White);
    write(COOR_CHAR[TriangleAxis]);
    GotoXY(1,24);
    TextColor(White);
    write('Commands: (New file, Select range, Windowing, Rotation, Axis, Graph):')
  end;

procedure Switch(var First : Word ; var Second : Word) ;
begin
  TempReal := TriangleAxisValue^[First];
  TriangleAxisValue^[First]:=TriangleAxisValue^[Second];
  TriangleAxisValue^[Second]:=TempReal;
  TempLong := TrianglePtr^[First];
  TrianglePtr^[First]:=TrianglePtr^[Second];
  TrianglePtr^[Second]:=TempLong;
end;

procedure QuickSort(Left,Right : Word);
  var
    LeftIndex.RightIndex : Word;
    KeyValue : Real;
begin
  if Left < Right then begin
    LeftIndex  := Left ;
    RightIndex := Right + 1 ;
    KeyValue := TriangleAxisValue^[Left] ;
    repeat
      repeat Inc(LeftIndex)
        until TriangleAxisValue^[LeftIndex]  >= KeyValue ;
      repeat Dec(RightIndex);
        until TriangleAxisValue^[RightIndex] <= KeyValue ;
      if LeftIndex < RightIndex then
        Switch(LeftIndex, RightIndex);
    until LeftIndex >= RightIndex ;
    Switch(Left, RightIndex);
    QuickSort(Left, RightIndex - 1 );
    QuickSort(RightIndex + 1 , Right);
  end;
end;


procedure GetTriangleInfo;
  { Read in Triangle Database }
  var
    FacetCount : LongInt;
    i,j        : Word;
  begin
    Center('<Scanning Triangle File>',25);
    { Open triangle file }
    Assign(TriangleFile,TriangleFilename);
    ResetFile(TriangleFile);
    TriangleTotal:=0;
    for i:= 1 to 3 do begin
```

```
      TriangleFileMin[i]:=MAX_REAL;
      TriangleFileMax[i]:=MIN_REAL;
      TriangleSelectMin[i]:=MAX_REAL;
      TriangleSelectMax[i]:=MIN_REAL;
    end;
    repeat
      { Skip over file header }
      if TriangleFiletype=ASC_FILE then begin
        ReadLine(TriangleFile);
        if ParseLine(InputLine)<>'SOLID' then FileError:=TRUE;
      end else PositionFile(TriangleFile,CurrFilePos+80);

      { Read in the triangles }
      if Not FileError then repeat
        TrianglePtr^[TriangleTotal]:=CurrFilePos; { Currently pointing to first tr
        if ReadTriangle then begin
          if (TriangleNormal[1]<>0) or (TriangleNormal[2]<>0) or (TriangleNormal[3
            TriangleAxisValue^[TriangleTotal]:=MAX_REAL; { Set Axis Value to small
            { Set Min and Max Values }
            for i:= 1 to 3 do begin
              if TriangleVertex[i,TriangleAxis]<TriangleAxisValue^[TriangleTotal]
                TriangleAxisValue^[TriangleTotal]:=TriangleVertex[i,TriangleAxis];
              for j:=1 to 3 do begin
                if TriangleVertex[i,j]<TriangleFileMin[j] then TriangleFileMin[j]:
                if TriangleVertex[i,j]>TriangleFileMax[j] then TriangleFileMax[j]:
                if TriangleVertex[i,j]<TriangleSelectMin[j] then TriangleSelectMin
                if TriangleVertex[i,j]>TriangleSelectMax[j] then TriangleSelectMax
              end;
            end;
            Inc(TriangleTotal);
          end;
          { Move to next triangle }
          if TriangleFiletype=ASC_FILE then begin
            ReadLine(TriangleFile);
            if ParseLine(InputLine)<>'ENDLOOP' then FileError:=TRUE;
            ReadLine(TriangleFIle);
            if ParseLine(InputLine)<>'ENDFACET' then FileError:=TRUE;
          end else begin
            Move(InBuffer[InBufPtr+48],TriangleAttrib,2);
            PositionFile(TriangleFile,CurrFilePos+TriangleAttrib+50);
          end;
        end;
      until (TriangleTotal>Total_Triangles) or FileError or EndOfFile;
    until (TriangleTotal>Total_Triangles) or FileError or EndOfFile;
    if TriangleTotal>Total_Triangles then begin
      Str(TriangleTotal,TempStr);
      Center('*** Warning: Maximum of '+TempStr+' triangles read in. Ignoring rest
      WaitKey;
      FileError:=False;
    end;
    if Not FileError then begin
      TriangleSelected:=TriangleTotal;
      Dec(TriangleTotal);
      { QuickSort(0,TriangleTotal); }
      TriangleSelectStart:=TriangleFileMin[TriangleAxis];
      TriangleSelectEnd:=TriangleFileMax[TriangleAxis];
    end;
  end;

procedure DoTriangle;
  { User selected Triangle option of Main Menu }
  var
    ch         : Char;
    TempReal1  : Real;
    i,j,k      : Word;
  begin
```

```
ch := ' ';
FileError:=FALSE;
repeat
  if TriangleFilename = '' then ch := 'N'
  else begin
    ResetFile(TriangleFile);
    PrintTriangleMenu;
    if ch=' ' then repeat
      ch:= UpCase(ReadKey);
    until (ch = ESC) or (Pos(ch,'NWSRAG') > 0);
    TextColor(White);
  end;
  case ch of
    'N' : begin
          if GetFilename(TriangleFilename,1) then begin
            GotoXY(1,24);
            write('File "',TriangleFilename,'" selected. File type ASCII, Bi
            repeat
              TriangleFiletype:=Pos(UpCase(ReadKey),'ABR');
            until TriangleFiletype>0;
            TriangleAxis:=2; { Assume Y }
            GetTriangleInfo;
            TriangleWindowingFile:=TRUE;
            for i:= 1 to 3 do TriangleAngle[i]:=0;
          end;
          ch:=' ';
        end;
    'W' : begin
          TriangleWindowingFile:=Not TriangleWindowingFile;
          ch:=' ';
        end;
    'S' : begin
          GotoXY(1,24);
          ClrEol;
          write('Select Range Start:');
          readln(TempStr);
          ToUpper(TempStr);
          if TempStr='RESET' then begin
            TriangleSelectStart:=TriangleFileMin[TriangleAxis];
            TriangleSelectEnd:=TriangleFileMax[TriangleAxis];
          end else begin
            Val(TempStr,TempReal,rc);
            if rc=0 then begin
              GotoXY(1,24);
              ClrEol;
              write('Select Range End:');
              readln(TempStr);
              Val(TempStr,TempReal1,rc);
              if rc=0 then begin
                if TempReal<TempReal1 then begin
                  TriangleSelectStart:=TempReal;
                  TriangleSelectEnd:=TempReal1;
                end else begin
                  TriangleSelectStart:=TempReal1;
                  TriangleSelectEnd:=TempReal;
                end;
              end;
            end;
            for i:=1 to 3 do begin
              TriangleSelectMin[i]:=MAX_REAL;
              TriangleSelectMax[i]:=MIN_REAL;
            end;
            TriangleSelected:=0;
            for i:=0 to TriangleTotal do begin
              if (TriangleAxisValue^[i]>=TriangleSelectStart) and
                 (TriangleAxisValue^[i]<=TriangleSelectEnd) then begin
```

```
                PositionFile(TriangleFile,TrianglePtr^[i]);
                TempBoolean:=ReadTriangle;
                TempBoolean:=FALSE;
                for j:=1 to 3 do
                  for k:= 1 to 3 do begin
                    if TriangleVertex[j,k]<TriangleSelectMin[k] then Triangl
                    if TriangleVertex[j,k]>TriangleSelectMax[k] then Triangl
                end;
                Inc(TriangleSelected);
              end;
            end;
          end;
          ch:=' ';
        end;
    'R' : begin
          GotoXY(1,24);
          ClrEol;
          for i:=1 to 3 do write(COOR_CHAR[i],' ');
          write('Axis Rotation: ');
          readln(TempStr);
          for i:=1 to 3 do begin
            Val(ParseLine(TempStr),TempReal,rc);
            if (rc<>0) or (TempReal<0) or (TempReal>180) then TriangleAngle[
            else TriangleAngle[i]:=Round(TempReal);
          end;
          ch:=' ';
        end;
    'A' : begin
          GotoXY(1,24);
          ClrEol;
          write('New Axis:');
          repeat
            TempByte:=Pos(UpCase(ReadKey),'XYZ');
          until TempByte>0;
          if TempByte<>TriangleAxis then begin
            TriangleAxis:=TempByte;
            Close(TriangleFile);
            GetTriangleInfo;
          end;
          ch:=' ';
        end;
    'G' : begin
          repeat
            GraphTriangles;
            ch:=UpCase(ReadKey);
          until ch<>'G';
          RestoreCrtMode;
        end;
    ELSE if ch<>ESC then ch:=' ';
   end;
  until FileError OR (ch = ESC) OR (TriangleFilename='');
  if FileError then begin
    ASCError(TriangleFilename);
    TriangleFilename:='';
  end;
end;


{ ---------------------------------------------------------------------------
  !                          Start of Main Slice Routines                      !
  --------------------------------------------------------------------------- }

function FindZLayer(value : Word) : Word;
  { Binary search for Z Value }
  var
```

```
    low,mid,high,index  :  Word;
  begin
    low:=0;
    high:=SliceLastLayer;
    index:=MAX_WORD;
    if (value>=SliceLayerValue^[low]) AND (value<=SliceLayerValue^[high]) then
    while (low<=high) AND (index=MAX_WORD) do begin
      mid:=(low+high) div 2;
      if value<SliceLayerValue^[mid] then high:=mid-1
      else if value>SliceLayerValue^[mid] then low:=mid+1
           else index:=mid;
    end;
    if index=MAX_WORD then FindZLayer:=high
    else FindZLayer:=index;
  end;


function BlockType(var line : String) : Word;
  { Returns Block Type of string in Word bits
               B         H         F
              ---       ---       ---
        L      0         1         2        (Bits Set)
        FU     3         4         5
        FD     6         7         8
        NFU    9        10        11
        NFD   12        13        14

        L(level)  = 15
        Not Found = None
  }
  var
    bitword : Word;
    i       : Word;
  begin
    if Copy(line,1,2)='L ' then bitword := L_SECTION
    else begin
      i:=0;
      while (i<MAX_SECTIONS) AND
            (Copy(line,1,Length(SliceBlocks[i]))<>SliceBlocks[i]) do Inc(i);
      if (i=MAX_SECTIONS) OR (Length(line)=Length(SliceBlocks[i])) then
        bitword := $0000
      else
        case (line[Length(SliceBlocks[i])+1]) of
          'B' : bitword:=1 shl (i*3);
          'H' : bitword:=1 shl (i*3+1);
          'F' : bitword:=1 shl (i*3+2);
          else  bitword:=$0000;
        end;
    end;
    BlockType:=bitword;
  end;

function BitOn(num : Word; bit : Byte) : Boolean;
  { Tells if a bit is on in number }
  begin
    if ((1 shl bit)and num)>0 then BitOn:=TRUE
    else BitOn:=FALSE;
  end;

procedure PrintWordRange(Str1,Str2 : String;min,max : Word;control : LongInt);
  { Prints Range values on line for parameters }
  begin
    GotoXY(3,WhereY);
    TextColor(LightGray);
    write(Copy(Str1+'                ',1,12),': ');
    TextColor(White);
```

```
    if control < 0 then write('Undetermined')
    else write(min);
    GotoXY(53,WhereY);
    TextColor(LightGray);
    write(Copy(Str2+'                  ',1,12),': ');
    TextColor(White);
    if control < 0 then write('Undetermined')
    else write(max);
  end;

procedure PrintBlockTable(section : Word);
  { Prints the Block table for menu from section value at current
     location }
  var
    XPos,YPos  : Byte;
    i,j        : Word;
  begin
    XPos:=WhereX;
    YPos:=WhereY;
    for i:= 0 to 4 do begin
      GotoXY(XPos,YPos+i);
      TextColor(LightGray);
      write(SliceBlocks[i]);
      GotoXY(XPos+4,WhereY);
      for j:= 0 to 2 do begin
        if BitOn(section,i*3+j) then TextColor(White)
        else if Not MonoDisplay then TextColor(Blue)
             else TextColor(Black);
        if ((i <> 0) or (j <> 2)) then case j of
          0 : write(' B');
          1 : write(' H');
          2 : write(' F');
        end;
      end;
    end;
    TextColor(White);
  end;

procedure PrintSliceMenu;
  { Prints Slice Menu Screen with all information }
  begin
    PrintSliceHeader;
    GotoXY(1,5);
    TextColor(LightGray);
    write('Slice Filename : ');
    TextColor(White);
    write(SliceFilename);
    GotoXY(1,6);
    PrintWordRange('Layer Start','Layer End',SliceLayerValue^[0],SliceLayerValue^[
    GotoXY(1,7);
    PrintWordRange('File X Min','File X Max',SliceFileXMin,SliceFileXMax,1);
    GotoXY(1,8);
    PrintWordRange('File Y Min','File Y Max',SliceFileYMin,SliceFileYMax,1);
    GotoXY(1,10);
    TextColor(LightGray);
    write('Selected Layer : ');
    TextColor(White);
    if SliceLayer=MAX_WORD then write('None')
    else begin
      write(SliceLayerValue^[SliceLayer]);
      GotoXY(1,11);
      PrintWordRange('Layer X Min','File X Max',SliceLayerXMin^[SliceLayer],SliceLa
      GotoXY(1,12);
      PrintWordRange('Layer Y Min','File Y Max',SliceLayerYMin^[SliceLayer],SliceLa
    end;
    GotoXY(1,14);
```

```
  TextColor(LightGray);
  write('Windowing by ');
  TextColor(White);
  if SliceWindowingFile then write('File')
  else write('Layer');
  TextColor(LightGray);
  GotoXY(1,16);
  write('Layer Blocks:');
  GotoXY(53,16);
  write('Display Blocks:');
  if SliceLayer<MAX_WORD then begin
    GotoXY(2,17);
    PrintBlockTable(SliceLayerBlocks^[SliceLayer]);
    GotoXY(54,17);
    PrintBlockTable(SliceOutputBlocks);
  end;
  GotoXY(1,24);
  TextColor(White);
  write('Commands: (New file, Layer select, Blocks, Windowing, Graph):');
end;

function ParseSegment(line : String;var x1.y1,x2,y2 : Word) : Boolean;
  { Parses out a line that should contain 4 segment coords. }
  var
    try            : Integer;
    num            : Word;
    good           : Boolean;
    code           : Word;
    oldlen         : Char;
    j              : Word;
  begin
    good:=TRUE;
    try:=1;
    repeat
      if line[0]=#0 then good:=FALSE
      else begin
        if line[1]=' ' then line[1]:='0';
        j:=Pos(' ',line);
        if j=0 then j:=Length(line)+1;
        oldlen := line[0];
        line[0] := Char (j-1);
        Val(line,num,code);
        line[0] := oldlen;
        if code>0 then good:=FALSE
        else case (try) of
          1 : x1:=num;
          2 : y1:=num;
          3 : x2:=num;
          4 : y2:=num;
        end;
        if j>=Length(line) then line:=''
        else begin
          line[0] := Char (Length(line)-j);
          Move(line[j+1],line[1],Integer (line[0]));
        end;
      end;
      Inc(try);
    until (Not good) OR (try>4);
    ParseSegment := good;
  end;

procedure GetSliceInfo;
  { Reads a Slice File and sets up Range and Layer information }
  var
    sectype                : Word;
    x1,y1,x2,y2            : Word;
```

```
begin
  SliceFileXMin  := MAX_WORD;
  SliceFileXMax  := 0;
  SliceFileYMin  := MAX_WORD;
  SliceFileYMax  := 0;
  SliceLayer     := MAX_WORD;
  SliceLastLayer := -1;
  Assign(SliceFile,SliceFilename);
  Reset(SliceFile,1);
  ResetFile(SliceFile);
  ReadLine(SliceFile);
  repeat
    if (Not EndOfFile) AND (InputLine[1]<>'!') then begin
      sectype := BlockType(InputLine);
      if sectype = 0 then
        if (Not ParseSegment(InputLine,x1,y1,x2,y2)) or (SliceLastLayer<0) the
        else begin
          { A Segment }
          SetMinMax(x1,SliceLayerXMin^[SliceLastLayer],SliceLayerXMax^[SliceLa
          SetMinMax(x2,SliceLayerXMin^[SliceLastLayer],SliceLayerXMax^[SliceLa
          SetMinMax(y1,SliceLayerYMin^[SliceLastLayer],SliceLayerYMax^[SliceLa
          SetMinMax(y2,SliceLayerYMin^[SliceLastLayer],SliceLayerYMax^[SliceLa
        end
      else
        { A Block line }
        if sectype=L_SECTION then begin
          if SliceLastLayer>=0 then begin
            if SliceLayerXMin^[SliceLastLayer]<SliceFileXMin then SliceFileXMi
            if SliceLayerXMax^[SliceLastLayer]>SliceFileXMax then SliceFileXMa
            if SliceLayerYMin^[SliceLastLayer]<SliceFileYMin then SliceFileYMi
            if SliceLayerYMax^[SliceLastLayer]>SliceFileYMax then SliceFileYMa
          end;
          Inc(SliceLastLayer);
          if SliceLastLayer>Total_Layers then begin
            Str(SliceLastLayer,TempStr);
            Center('Warning - Maximum number of '+TempStr+' Slice layers read'
            WaitKey;
          end else begin
            Val(Copy(InputLine,3,255),TempWord,rc);
            if rc<>0 then FileError:=TRUE
            else begin
              SliceLayerValue^[SliceLastLayer]:=TempWord;
              SliceLayerBlocks^[SliceLastLayer]:=$0000;
              SliceLayerPtr^[SliceLastLayer]:=CurrFilePos;
              SliceLayerXMin^[SliceLastLayer]:=MAX_WORD;
              SliceLayerXMax^[SliceLastLayer]:=0;
              SliceLayerYMin^[SliceLastLayer]:=MAX_WORD;
              SliceLayerYMax^[SliceLastLayer]:=0;
            end;
          end;
        end else SliceLayerBlocks^[SliceLastLayer]:=SliceLayerBlocks^[SliceLas
    end;
    ReadLine(SliceFile);
  until FileError OR EndOfFile OR (SliceLastLayer>Total_Layers);
  if Not FileError then begin
    if SliceLastLayer>Total_Layers then SliceLastLayer:=Total_Layers;
    if SliceLayerXMin^[SliceLastLayer]<SliceFileXMin then SliceFileXMin:=Slice
    if SliceLayerXMax^[SliceLastLayer]>SliceFileXMax then SliceFileXMax:=Slice
    if SliceLayerYMin^[SliceLastLayer]<SliceFileYMin then SliceFileYMin:=Slice
    if SliceLayerYMax^[SliceLastLayer]>SliceFileYMax then SliceFileYMax:=Slice
  end;
end;

procedure GraphSliceLayer;
var
  sectype,currentsection : Word;
```

```
  x1,y1,x2,y2              : Word;
begin
  if SliceWindowingFile then
    SetupGraphicW(SliceFileXMin,SliceFileXMax,SliceFileYMin,SliceFileYMax)
  else
    SetupGraphicW(SliceLayerXMin^[SliceLayer],SliceLayerXMax^[SliceLayer],
                  SliceLayerYMin^[SliceLayer],SliceLayerYMax^[SliceLayer]);
  OutTextLn('Filename: '+SliceFIlename);
  Str(SliceLayerValue^[SliceLayer],TempStr);
  OutTextLn('Layer    : '+TempStr);
  PositionFile(SliceFile,SliceLayerPtr^[SliceLayer]);
  repeat
    ReadLine(SliceFile);
    if (Not EndOfFile) AND (InputLine[1]<>'!') then begin
      sectype := BlockType(InputLine);
      if sectype=0 then begin
        { A Segment }
        if (currentsection>0) AND ParseSegment(InputLine,x1,y1,x2,y2) then DrawL
      end else begin
        { A Block line }
        currentsection:=sectype AND SliceOutputBlocks;
        if currentsection>0 then
          if currentsection=LB_SECTION then SelectGraphColor(Blue)
          else if currentsection=LH_SECTION then SelectGraphColor(LightBlue)
          else if (currentsection and NFD_SECTIONS)>0 then SelectGraphColor(Red)
          else if (currentsection and NFU_SECTIONS)>0 then SelectGraphColor(Gree
          else if (currentsection and FD_SECTIONS)>0  then SelectGraphColor(Ligh
          else if (currentsection and FU_SECTIONS)>0  then SelectGraphColor(Ligh
          else SelectGraphColor(White);
      end;
    end;
  until (sectype=L_SECTION) OR EndOfFile;
end;


procedure DoSlice;
  { User selected Slice option of Main Menu }
  var
    ch  : Char;
    i,j : Word;
    index : Integer;
  begin
    ch := ' ';
    repeat
      if SliceFilename = '' then ch := 'N'
      else begin
        ResetFile(SliceFile);
        PrintSliceMenu;
        if ch=' ' then repeat
          ch:= UpCase(ReadKey);
        until (ch = ESC) or (Pos(ch,'NLBWG') > 0);
        TextColor(White);
      end;
      case ch of
        'N' : begin
                if GetFilename(SliceFilename,2) then begin
                  Center('<Scanning Slice File>',25);
                  GetSliceInfo;
                  SliceWindowingFile:=TRUE;
                  SliceLayer:=0;
                  SliceOutputBlocks:=SliceLayerBlocks^[SliceLayer];
                end;
                ch:=' ';
              end;
         L' : begin
                index:=0;
```

```
        TempInt:=1;
        repeat
          if TempInt<>index then begin
            ClrScr;
            Center('Slice Layer Select',1);
            for j:=0 to 15 do if j+index<= SliceLastLayer then begin
              GotoXY(1+(j mod 4)*20,2+(j div 4)*5);
              write(SliceLayerValue^[j+index]:5,' ');
              PrintBlockTable(SliceLayerBlocks^[j+index]);
            end;
            GotoXY(1,24);
            write('+ or - to move forward or back. ENTER to select Level');
            TempInt:=index;
          end;
          ch:=ReadKey;
          if (ch='+') and (index+16<=SliceLastLayer) then Inc(index,16);
          if (ch='-') and (index-16>=0) then Dec(index,16);
        until ch=CR;
        GotoXY(1,24);
        ClrEol;
        write('Enter Layer Number: ');
        readln(TempStr);
        if TempStr<>'' then begin
          Val(TempStr,iw,rc);
          jw:=FindZLayer(iw);
          if (rc<>0) OR (jw=MAX_WORD) then begin
            Center('Layer "'+TempStr+'" Not Found',24);
            WaitKey;
          end else begin
            SliceLayer:=jw;
            SliceOutputBlocks:=SliceLayerBlocks^[SliceLayer];
          end;
        end;
        ch:=' ';
      end;
  'B' : begin
        GotoXY(1,24);
        ClrEol;
        write('Enter Block Type to Toggle: ');
        readln(TempStr);
        ToUpper(TempStr);
        SliceOutputBlocks:=SliceOutputBlocks xor BlockType(TempStr);
        ch:=' ';
      end;
  'W' : begin
        SliceWindowingFile := not SliceWindowingFile;
        ch:=' ';
      end;
  'G' : if SliceLayer<MAX_WORD then begin
        repeat
          GraphSliceLayer;
          ch:=UpCase(ReadKey);
        until ch<>'G';
        RestoreCRTMode;
      end else ch:=' ';
  ELSE if ch<>ESC then ch:=' ';
 end;
until (ch = ESC) OR (SliceFilename='');
end;


{ --------------------------------------------------------------------------
  !                         Start of Main Program                          !
  -------------------------------------------------------------------------- }
```

```
begin
  { Setup Exit routine }
  ExitSave:=ExitProc;
  ExitProc:=@MainExit;

  { Determine graphics screen to use }
  GraphDriver := Detect;
  SetGraph;
  RestoreCrtMode;

  { Use this heap location as top of heap for rest of program }
  Mark(HeapTop);

  { Allocate Memory for arrays }
  ReAllocate('S',16382);
  if Total_Triangles<5000 then ReAllocate('T',5000);

  repeat
    PrintHeader;
    GotoXY(31,WhereY+2);
    write('Graphic Card: ');
    Case GraphDriver of
      1 : write('CGA');
      2 : write('MCGA');
      3 : write('EGA');
      4 : write('EGA 64');
      5 : write('EGA Mono');
      6 : write('Reserved');
      7 : write('Hercules Mono');
      8 : write('ATT400');
      9 : write('VGA');
      10: write('PC3270');
      else write('Unknown Type ',GraphDriver);
    end;
    GotoXY(28,WhereY+1);
    write('Graphics Mode: ',GraphMode,' (',SizeX,',',SizeY,')');

    GotoXY(1,25);
    write('Maximum Triangles: ',Total_Triangles+1);
    GotoXY(57,25);
    write('Maximum Layers: ',Total_Layers+1);


    GotoXY(29,10);
    write('1. Triangle File Display');
    GotoXY(29,WhereY+2);
    write('2. Slice File Display');
    GotoXY(29,WhereY+2);
    write('3. Reallocate # Layers');
    GotoXY(29,WhereY+2);
    write('Q. Quit');

    GotoXY(28,WhereY+3);
    write('Enter Selection: ');
    repeat
      ch := UpCase(ReadKey);
    until Pos(ch,'123Q')>0;
    Case ch of
      '1' : if Total_Triangles>=0 then DoTriangle;
      '2' : if Total_Layers>=0 then DoSlice;
      '3' : begin
              ClrScr;
              GotoXY(1,24);
              write('Enter number of Slice Layers desired: ');
              readln(TempStr);
              if TempStr<>'' then begin
```

```
            Val(TempStr,TempReal,rc);
            TempLong:=Round(TempReal);
            if (rc=0) and (TempLong>=0) then ReAllocate('S',TempLong):
          end;
        end;
    end;
  until (ch = 'Q');
  TextBackground(Black);
  TextColor(White);
  ClrScr;
end.
```

```
Page 60,132
Title 3D Systems Laser Driver Package
;===============================================================================
;
;
;       LASER   3D Systems Laser Controller Driver Package
;               Version 2.60
;
;               This code constitutes levels 1 and 2, the lowest software
;               levels, of the Laser Controller System.
;
;               Copyright (C) Tarnz Technologies, 1987
;
;
;===============================================================================

;
;  History:
;
;   8/17/87  Ver 2.02  LASER released
;                      new identifcation schemes
;   8/22/87  Ver 2.03  version number updated only
;   8/25/87  Ver 2.04  version number updated only
;  11/12/87  Ver 2.30  first Beta software release, version update only
;   1/25/88  Ver 2.60  version update only
;


;
;       System Equates
;
current_version equ     0200h           ;current software version
debug           equ     0               ;debug flag


;===============================================================================
;
;       Public And External Declarations
;

;
;  public code references
;
        public  laser_entry             ;only callable entry point to this pkg
        public  enddata                 ;segment ends for residency size calc
        public  endqueue
        public  endbkgtask
        public  endcode

;
;  public variable references
;
        public  laser_int,old_tv,old_tv,current_status
        public  sys_int_count,sint_counter,bkgnd_intr_time

;
;  external references
;
        extrn   bkg_ins:far             ;install background task
        extrn   bkg_ins1:far            ;change timebase
        extrn   bkg_rmv:far             ;remove background task

subttl  Operating System Equates
page
```

```
;==========================================================================
;
;       IBM PC and Compatible Operating System Equates
;

;
;       Equates defining 8259 (Programmable Interrupt Controller) and 8253
;       (Programmable Interval Timer) ports and constants.
;
inta00          equ     20h                             ;8259 PORT
inta01          equ     21h                             ;YET ANOTHER 8259 PORT
tim_cmd_reg     equ     43h                             ;8253 command register
tim_ch2         equ     42h                             ;8253 channel two
ppi_port_A      equ     60h                             ;8255 port A
ppi_port_B      equ     61h                             ;8255 port B
ext_bkg         equ     4                               ;  ext background intr signal
ppi_port_C      equ     62h                             ;8255 port C

subttl  Laser I/O Card Equates
page
;==========================================================================
;
;       Laser I/O Card Equates
;

;
;       using John Bell Engineering Card
;       "Universal I/O"  83-064
;
laserIO         equ     300h
portA1          equ     laserIO         ;DAC value low byte
portB1          equ     laserIO+1       ;DAC value high byte
portC1          equ     laserIO+2
; outputs
strobeX         =       1               ;X-axis DAC strobe (falling edge)
strobeY         =       2               ;Y-axis DAC strobe (falling edge)
strobeZ         =       4               ;Z-axis DAC strobe (falling edge)
shutter_ctrl    =       8               ;laser shutter control (open/closed)
; inputs
posackXY        =       16              ;X and Y-axis position acknowledge
posackZ         =       32              ;Z-axis position acknowledge
ctrl1           equ     laserIO+3       ;control #1 byte (write only!)
portA2          equ     laserIO+4
portB2          equ     laserIO+5
portC2          equ     laserIO+6
ctrl2           equ     laserIO+7
portA3          equ     laserIO+8
portB3          equ     laserIO+9
portC3          equ     laserIO+10
ctrl3           equ     laserIO+11

;
;       Miscellaneous
;
ExtSigs         segment at 0F600h               ;for debugging
IntBeg          db      ?
IntEnd          db      ?
ExtSigs         ends

subttl  Miscelaneous Other Equates And Structures
page
;==========================================================================
;
;       Error codes
;
err_none        equ     0               ;no error
```

```
err_no_card       equ     1                   ;no laser interface card found
err_not_open      equ     2                   ;laser channel not open
err_queue_full    equ     3                   ;background command queue is full
err_bad_time      equ     4                   ;invalid interrupt time
err_not_block     equ     5                   ;not in block mode
err_exec_limit    equ     6                   ;exec limit (# EC & EX's) reached
err_bad_param     equ     127                 ;some other bad parameter
err_bad_code      equ     255                 ;internal code error

all               equ     0FFFFh              ;for turning flags off (all-flag)

subttl  Structures
page
;============================================================================
;
;       The stack frame defines the locations of the parameters on the stack
;
stack_frame       struc
p_bp              dw      0
p_dx              dw      0
p_cx              dw      0
p_bx              dw      0
p_ax              dw      0
p_ds              dw      0
p_si              dw      0
p_di              dw      0
p_es              dw      0
p_flags           dw      0
p_ip              dw      0
p_cs              dw      0
stack_frame       ends

subttl  LASER code segment
page

if1
%out    - Starting pass 1 -
endif
if2
%out    - Starting pass 2 -
endif

subttl  Data Segments
page
LaserData segment public 'DATA'

;
;  Block Variables
;
;  Execute Queue (must be first item in segment)
;  - 10 entries of StartPtr [2 bytes], EndPtr [2 bytes]
;
exec_queue_size         =       200     ;max # of blocks awaiting processing
exec_entry_len          =       4
exec_queue_limit        =       exec_queue_size*exec_entry_len
exec_queue              db      exec_queue_limit dup (?) ;queue space

exec_queue_start        dw      0
exec_queue_end          dw      0

;
;  Background Command Queue Variables
;
bcmd_queue_start        dw      0       ;command queue's "hard" limits
bcmd_queue_end          dw      0       ;  real start and end of queue
```

```
;
;  Execution Block Variables
;
queue_start             dw      0          ;command queue's "soft" limits
queue_end               dw      0          ;  start and end of current block

rem_queue_start         dw      0          ;redraw storage of the queue_start
rem_queue_end           dw      0          ;  and queue_end pointers

;
;  Background Task Variables
;
_static          =       0                 ;in static state
_off_delay       =       2                 ;in laser turn-off state
_idle            =       4                 ;in laser system fully idle state
_pos_ack         =       6                 ;in position acknowledge state
_on_delay        =       8                 ;in laser turn-on state
_moving          =       10                ;in moving state
_pausing         =       12                ;in pausing state
_redraw_pausing  =       14                ;redrawing pause state
bkgnd_mode       dw      _static           ;execution mode
bkgnd_intr_time  dw      1190              ;interrupt interval time
sys_int_count    dw      10                ;sys int routine tick count
sint_counter     dw      10                ;sys int down-counter
clear_pointer    dw      0                 ;start of command queue block
delay            dw      0                 ;general delay downcounter
off_delay_count  dw      0                 ;laser turn-off delay count value
on_delay_count   dw      0                 ;laser turn-on delay count value
HomeXpos         dw      0                 ;laser beam (X,Y) home position
HomeYpos         dw      0
RemXpos          dw      0                 ;remember beam (X,Y) position here
RemYpos          dw      0

XposFract        db      0                 ;current vector's variables
Xpos             dw      0
YposFract        db      0
Ypos             dw      0
deltaX           dw      0
deltaY           dw      0
steps            dw      0
signX            db      0                 ;sign-extends
signY            db      0
dummy            dw      0
ut_steps         dw      0                 ;utility downcounting steps

redraw_count     dw      1                 ;redraw pass count
redraw_delay     dw      0                 ;redraw delay
step_periods     dw      10 dup (1190)     ;multi-pass Step Periods array
mark_position    dw      0                 ;redraw mark position
pass             dw      0                 ;redraw pass number

;
;  Software Interrupt Variables
;
swi_int          dw      0                 ;interrupt vector number
swi_ofs          dw      0                 ;old SWI vector
swi_seg          dw      0

return_code      db      0                 ;function return code

ls_open          =       1                 ;laser system initialized
ls_interrupt     =       2                 ;software interrupt vector set
bkgnd_idle       =       4                 ;background in idle state flag
redrawing        =       8                 ;doing redraw operation
need_to_pause    =       16                ;need to pause flag (redraw)
current_status   dw      0                 ;general status register
```

```
autoshut_mode   =       1                    ;automatically open/close shutter on idle
posack_mode     =       2                    ;wait for X-Y mirrors position acknowledge
block_mode      =       4                    ;execution block mode (EX/EC/CL active)
shutter         =       16                   ;open/closed shutter flag
laser_control   dw      shutter              ;laser control word

enddata label far
LaserData ends

LaserQueue segment public 'DATA'
;
;  Background Command Queue
;  60K workspace can hold approximately 3750 move entries
;
bcmd_queue_size         =       60000   ;vector circular queue size
bcmd_queue_limit        =       bcmd_queue_size-32
bcmd_queue              db      bcmd_queue_size+16 dup (?)
move_size               =       13      ;background command sizes
open_shutter_size       =       1
close_shutter_size      =       1
change_timebase_size    =       3
pause_size              =       3
set_periods_size        =       2       ; + 2 * num
set_redraw_count_size   =       3
set_redraw_delay_size   =       3
mark_size               =       1
redraw_size             =       1

endqueue label far
LaserQueue ends

subttl  Laser Background Task
page
;===============================================================================
;
;       Laser Control Background Task
;
;       responsible for:
;
;       - updating x-axis & y-axis DACs every 100 us (typ.)
;       - moving of laser beam
;       - geometric correction
;       - shutter control
;       - idling system while command queue is empty
;
;===============================================================================
LaserGroup group LaserBackground,LaserCode

LaserBackground segment public 'CODE'
        assume  cs:LaserBackground,ds:LaserData

;
;  high-speed timer 0 interrupt
;
;  typically 100 us, settable via software interrupt
;
laser_int proc far
        assume  cs:LaserBackground,ds:LaserData,es:LaserData

        ;
        ;  set for interrupt service
        ;
        push    ax
;       in      al,ppi_port_B           ;signal start of background interrupt
;       and     al,all-ext_bkg
;       out     ppi_port_B,al
```

```
        push    ds
        push    bx
        push    cx
        push    dx
        push    es
        push    di
        push    si

        ;
        ;  background task interrupt service
        ;
        mov     ax,LaserData            ;point to laser system variables
        mov     ds,ax
        mov     ax,LaserQueue           ;point to laser command queue
        mov     es,ax
        cld                             ;for block moves
        mov     bx,bkgnd_mode
        jmp     word ptr cs:[bx + offset bkgnd_states]

        ;
        ;  Background State Address Table
        ;
bkgnd_states label word
        dw      static
        dw      off_delay
        dw      idle
        dw      pos_ack
        dw      on_delay
        dw      moving
        dw      pausing
        dw      redraw_pausing

        ;
        ;  old system timer interrupt vector
        ;  must be in CS for indirect intersegment jump to BIOS
        ;
old_tv  dd      ?                       ;called every sys_int_count ticks

        ;
        ;  static state - determine processing
        ;
static:
        test    laser_control,block_mode
        jnz     block

;
;  STREAM MODE
;  laser commands executed as they are added to table for best throughput
;  and easiest control
;

stream:
        mov     si,bcmd_queue_start     ;any entries in queue?
        cmp     si,bcmd_queue_end
        jz      prep_idle
        jmp     read_queue              ;yes, go execute command

;
;  BLOCK MODE
;  laser commands executed in blocks to prevent intermediate idles
;  multi-pass redraw of small sets of vectors supported

block:
        mov     ax,queue_start          ;finished processing block?
        cmp     ax,queue_end
        jz      block1
```

```
        jmp     read_queue
block1:
        test    current_status,redrawing         ;redrawing?
        jnz     go_redraw
        mov     si,exec_queue_start     ;no, something in exec queue?
        cmp     si,exec_queue_end
        jz      prep_idle               ;no, idle
        jmp     block_proc              ;yes, go process next block

go_redraw:
        jmp     redraw_pass             ;multiple passes

        ;
        ;  prepare to idle
        ;
prep_idle:
        test    laser_control,autoshut_mode  ;if autoshutter mode, close shutter
        jz      home
        or      laser_control,shutter
        call    set_ctrl_port
        jmp     laser_off
home:
        mov     ax,Xpos                 ;  else remember current position
        mov     RemXpos,ax
        mov     ax,Ypos
        mov     RemYpos,ax
        mov     ax,HomeXpos             ;    and home laser beam
        mov     Xpos,ax
        mov     ax,HomeYpos
        mov     Ypos,ax
        call    update_DACs

laser_off:
        mov     ax,off_delay_count      ;observe laser turn-off delay
        cmp     ax,0
        je      set_idle                ;if 0, don't delay at all
        mov     delay,ax
        mov     bkgnd_mode,_off_delay
sdone:  jmp     int_fini

        ;
        ;  laser turn-off delay state
        ;
off_delay:
        dec     delay
        jnz     sdone

set_idle:
        mov     bkgnd_mode,_idle                 ;set idle state

        ;
        ;  laser system fully idle state
        ;
idle:
        test    laser_control,block_mode
        jz      idle_stream

idle_block:
        mov     si,exec_queue_start     ;wait for something in exec queue
        cmp     si,exec_queue_end
        jnz     out_of_idle

idle_set:
        or      current_status,bkgnd_idle        ;make sure idle flag is on
        jmp     int_fini
```

```
idle_stream:
        mov     si,bcmd_queue_start      ;wait for something in command queue
        cmp     si,bcmd_queue_end
        jz      idle_set

out_of_idle:
        and     current_status,all-bkgnd_idle   ;turn off idle flag
        test    laser_control,autoshut_mode ;if autoshut mode, open shutter
        jz      repos
        and     laser_control,all-shutter
        call    set_ctrl_port
        jmp     laser_on
repos:
        mov     ax,RemXpos                  else reposition laser beam
        mov     Xpos,ax
        mov     ax,RemYpos
        mov     Ypos,ax
        call    update_DACs

        test    laser_control,posack_mode
        jz      laser_on
        mov     dx,portC1                ;wait for position acknowledgement
        in      al,dx
        and     dx,posackXY
        jz      laser_on
        mov     bkgnd_mode,_pos_ack

        ;
        ;  position acknowledge state
        ;
pos_ack:
        mov     dx,portC1
        in      al,dx
        and     dx,posackXY
        jnz     sdone
        mov     bkgnd_mode,_static

laser_on:
        mov     ax,on_delay_count        ;observe laser turn-on delay
        cmp     ax,0
        je      set_proc                 ;if 0, don't delay
        mov     delay,ax
        mov     bkgnd_mode,_on_delay
        jmp     int_fini

        ;
        ;  laser turn-on delay state
        ;
on_delay:
        dec     delay
        jz      set_proc
        jmp     int_fini

set_proc:
        mov     bkgnd_mode,_static       ;set for normal processing
        test    laser_control,block_mode
        jz      read_queue               ;start processing commands immediately

        ;
        ;  setup for block mode processing
        ;
block_proc:
        mov     si,exec_queue_start
        mov     ax,[si]                  ;get start index
        mov     bcmd_queue_start,ax      ;update command queue's hard start
        mov     queue_start,ax           ;set exec block start
```

```
        add     si,2
        mov     ax,[si]                 ;get end index
        mov     queue_end,ax            ;set exec block end
        add     si,2
        cmp     si,exec_queue_limit     ;next index
        jb      block_proc1
        mov     si,0
block_proc1:
        mov     exec_queue_start,si
        jmp     block                   ;catch 0-length blocks

        ;
        ;  begin processing background command from command queue
        ;
read_queue:
        test    laser_control,block_mode
        jz      read_stream
read_block:
        mov     si,queue_start          ;use right pointer
        jmp     read_queue1
read_stream:
        mov     si,bcmd_queue_start
read_queue1:
        mov     al,es:[si]              ;read next background command
        inc     si                      ;point to command parameters
        inc     al                      ;  + 1 so that FF becomes 0
        xor     ah,ah                   ;compute jump table offset
        shl     ax,1
        cmp     ax,bkgnd_ops_end        ;don't use to increase throughput
        jae     skip_bad_token
        mov     bx,ax
        jmp     word ptr cs:[bx + offset bkgnd_ops_tbl]

skip_bad_token:
        mov     bx,1                    ;skip past bad token
        jmp     end_read_queue          ;  hope we resync on next byte

bkgnd_ops_tbl label word
        dw      reset_queue             ;FF
        dw      move                    ;0
        dw      open_shutter            ;1
        dw      close_shutter           ;2
        dw      change_timebase         ;3
        dw      pause                   ;4
        dw      set_periods             ;5
        dw      set_redraw_count        ;6
        dw      set_redraw_delay        ;7
        dw      mark                    ;8
        dw      redraw                  ;9
bkgnd_ops_end equ $-bkgnd_ops_tbl

;  ----------------------------------------------
;
;    reset to beginning of command queue
;    Background Command FF (Internal)
;
;  ----------------------------------------------
reset_queue:
        mov     queue_start,0           ;zero start pointer
        jmp     static                  ;go process next command, if any

;  ----------------------------------------------
;
;    move/draw vector
;    Background Command 0
;
```

```
; ---------------------------------------------
move:
        mov     bx,ds                   ;swap DS & ES temporarily for movsw
        mov     ax,es
        mov     ds,ax
        mov     es,bx
        mov     di,offset XposFract
        mov     cx,(move_size+1)/2      ;copy packet from queue to workarea
        rep movsw
        mov     bx,ds                   ;swap segments back
        mov     ax,es
        mov     ds,ax
        mov     es,bx
        mov     al,byte ptr deltaX+1    ;compute sign-extends
        cbw
        mov     signX,ah
        mov     al,byte ptr deltaY+1
        cbw
        mov     signY,ah
        test    current_status,need_to_pause
        jz      move1
        jmp     redraw_pause
move1:
        mov     bkond_mode,_moving
        mov     bx,move_size

        ;
        ;  end of reading queue
        ;
end_read_queue:
        test    laser_control,block_mode
        jz      end_stream

end_block:
        mov     ax,queue_start
        add     ax,bx
        cmp     ax,bcmd_queue_size      ;next start index
        jb      end_read_queue1
        mov     ax,0                    ;wraparound command queue (soft)
end_read_queue1:
        mov     queue_start,ax
        jmp     set_DACs

end_stream:
        mov     ax,bcmd_queue_start
        add     ax,bx
        cmp     ax,bcmd_queue_size      ;next start index
        jb      end_read_queue2
        mov     ax,0                    ;wraparound command queue (hard)
end_read_queue2:
        mov     bcmd_queue_start,ax
        jmp     set_DACs

        ;
        ;  moving state - vector processing
        ;
moving:
        mov     ax,word ptr XposFract   ;compute new X position
        add     ax,deltaX               ;add fract & 1st byte of integer
        mov     word ptr XposFract,ax
        mov     al,byte ptr Xpos+1      ;add carry to 2nd byte of integer
        adc     al,signX
        mov     byte ptr Xpos+1,al

        mov     ax,word ptr YposFract   ;compute new Y position
        add     ax,deltaY
```

```
        mov     word ptr YposFract,ax
        mov     al,byte ptr Ypos+1
        adc     al,signY                ;0 for + deltas, FFh for - deltas
        mov     byte ptr Ypos+1,al

        dec     steps                   ;count down # steps
        jnz     set_DACs
        mov     bkgnd_mode,_static      ;static state next tick

        ;
        ;  set laser mirror DACs to approoriate values
        ;
set_DACs:
        call    update_DACs

        ;
        ;  return from interrupt
        ;
int_fini:
        dec     sint_counter            ;call system timer interrupt routine
        mov     ax,sint_counter         ;  every (sys_int_count) # ticks
        cmp     ax,0
        je      sys_fini
        pop     si                      ;normal, non-sys interrupt return
        pop     di
        pop     es
        pop     dx
        pop     cx
        pop     bx
        pop     ds
        mov     al,20h                  ;acknowledge interrupt
        out     020h,al
        sti
        pop     ax
        iret

sys_fini:
        mov     ax,sys_int_count        ;reload downcounter
        mov     sint_counter,ax
        pop     si
        pop     di
        pop     es
        pop     dx
        pop     cx
        pop     bx
        pop     ds
        mov     al,20h                  ;reset interrupt to allow laser
        out     020h,al                 ;interrupts during BIOS operation
        sti
        pop     ax
        jmp     old_tv                  ;continue timer interrupt in BIOS

bkgnd_local_sbrs proc near
page
;
;  Set Output Control Port
;    - shutter control
;
set_ctrl_port:
        mov     dx,portC1
        in      al,dx                   ;read existing port C1 bits
        test    laser_control,shutter   ;update for shutter
        jnz     shut_closed
shut_open:
        and     al,all-shutter_ctrl
        jmp     shut_str
```

```
shut_closed:                                   ;shutter closed if shutter not 0
        or      al,shutter_ctrl
shut_str:
        out     dx,al
        ret

;
;  Update laser beam X and Y Digital to Analog Converters
;
update_DACs:

set_XDAC:
        mov     ax,Xpos                        ;output X-pos to laser X-axis DAC
        mov     dx,portA1
        out     dx,al
        inc     dx
        mov     al,ah
        out     dx,al
        inc     dx                             ;port C1 has strobe lines
        in      al,dx
        and     al,all-strobeX                 ;falling edge
        out     dx,al
        or      al,strobeX
        out     dx,al

set_YDAC:
        mov     ax,Ypos                        ;output Y-pos to laser Y-axis DAC
        mov     dx,portA1
        out     dx,al
        inc     dx
        mov     al,ah
        out     dx,al
        inc     dx                             ;port C1 has strobe lines
        in      al,dx
        and     al,all-strobeY                 ;falling edge
        out     dx,al
        or      al,strobeY
        out     dx,al

        mov     ax,0FFh
        mov     dx,portA1
        out     dx,al
        inc     dx
        out     dx,al
        ret

bkgnd_local_sbrs endp
page
;  ------------------------------------------------
;
;    open laser beam shutter
;    Background Command 1
;
;  ------------------------------------------------
open_shutter:
        and     laser_control,all-shutter
        call    far ptr set_ctrl
        mov     bx,open_shutter_size
        jmp     end_read_queue

;  ------------------------------------------------
;
;    close laser beam shutter
;    Background Command 2
;
;  ------------------------------------------------
```

```
close_shutter:
        or      laser_control,shutter
        call    far ptr set_ctrl
        mov     bx,close_shutter_size
        jmp     end_read_queue

;  ---------------------------------------------
;
;    change interrupt time base
;    Background Command 3
;
;  ---------------------------------------------
change_timebase:
        mov     bx,es:[si]
        mov     step_periods,bx          ;just alter first step period
        call    bkg_ins1                 ;change time base now
        mov     bx,change_timebase_size
        jmp     end_read_queue

;  ---------------------------------------------
;
;    pause queue processing
;    Background Command 4
;
;  ---------------------------------------------
pause:
        mov     ax,es:[si]
        mov     ut_steps,ax
        mov     bkgnd_mode,_pausing      ;set for pausing state
        mov     bx,pause_size
        jmp     end_read_queue

pausing:
        dec     ut_steps                 ;count down # steps
        jnz     pausing1
        mov     bkgnd_mode,_static       ;static state next tick
pausing1:
        jmp     int_fini

;  ---------------------------------------------
;
;    set_periods
;    Background Command 5
;
;  ---------------------------------------------
set_periods:
        mov     cl,es:[si]               ;get sp count [1 byte]
        inc     si
        mov     ch,0                     ;set high byte to 0
        push    cx
        cmp     pass,0                   ;read sp only on redraw pass 0
        jnz     set_periods_skip
        mov     di,offset step_periods
        mov     bx,es:[si]               ;get sp0
        mov     [di],bx
        push    es
        call    bkg_ins1                 ;set new timer interrupt
        pop     es
        jmp     set_periods_next
set_periods_loop:
        mov     ax,es:[si]               ;copy sp1, sp2...
        mov     [di],ax                  ;  to step_periods array
set_periods_next:
        add     si,2
        add     di,2
        dec     cl
```

```
        jnz     set_periods_loop
set_periods_skip:
        pop     bx                          ;calc size of sp command
        shl     bx,1
        add     bx,set_periods_size
        jmp     end_read_queue

;  ------------------------------------------------
;
;   set_redraw_count
;   Background Command 6
;
;  ------------------------------------------------
set_redraw_count:
        mov     ax,es:[si]
        mov     redraw_count,ax
        mov     bx,set_redraw_count_size
        jmp     end_read_queue

;  ------------------------------------------------
;
;   set_redraw_delay
;   Background Command 7
;
;  ------------------------------------------------
set_redraw_delay:
        mov     ax,es:[si]
        mov     redraw_delay,ax
        mov     bx,set_redraw_delay_size
        jmp     end_read_queue

;  ------------------------------------------------
;
;   mark
;   Background Command 8
;
;  ------------------------------------------------
mark:
        mov     ax,queue_start              ;remember current queue position
        mov     mark_position,ax
        mov     bx,mark_size
        jmp     end_read_queue

;  ------------------------------------------------
;
;   redraw
;   Background Command 9
;
;  ------------------------------------------------

        ;
        ;  set up for redraw
        ;
redraw:
        test    laser_control,block_mode
        jz      no_redraw                   ;make sure task in block mode
        mov     ax,queue_start
        mov     rem_queue_start,ax          ;remember current queue start / end
        mov     ax,queue_end
        mov     rem_queue_end,ax
        or      current_status,redrawing        ;turn on redrawing flag

        ;
        ;  start a redraw pass
        ;
redraw_pass:
```

```
        inc     pass                    ;next pass number
        mov     di,pass
        cmp     di,redraw_count         ;all passes done?
        jae     finish_redraw
        shl     di,1                    ; x 2
        mov     bx,step_periods[di]     ;no, change step period (1..)
        call    bkg_ins1
        cmp     redraw_delay,0          ;if redraw_delay > 0,
        je      redraw_pass1
        or      current_status,need_to_pause    ;  pause on next vector pos
redraw_pass1:
        mov     ax,mark_position        ;set redraw start / end
        mov     queue_start,ax
        mov     ax,rem_queue_start
        mov     queue_end,ax
        mov     bx,mark_size            ;skip mark or last redraw instruction
        jmp     end_read_queue

        ;
        ;  finish up redraw
        ;
finish_redraw:
        mov     ax,rem_queue_start      ;restore queue start / end
        mov     queue_start,ax
        mov     mark_position,ax        ;update mark position
        mov     ax,rem_queue_end
        mov     queue_end,ax
        and     current_status,all-redrawing-need_to_pause      ;turn off flags
        mov     pass,0                  ;set redraw pass to 0
        mov     bx,step_periods         ;set step period 0
        call    bkg_ins1
no_redraw:
        mov     bx,redraw_size          ;skip redraw instruction
        jmp     end_read_queue

redraw_pause:
        mov     ax,redraw_delay         ;delay this number of timer ticks
        mov     ut_steps,ax
        mov     bkgnd_mode,_redraw_pausing
        jmp     set_DACs                ;update DACs with first move position

redraw_pausing:
        dec     ut_steps                ;count down # steps
        jz      redraw_pausing1
        jmp     int_fini
redraw_pausing1:
        and     current_status,all-need_to_pause  ;turn off need-to-pause flag
        jmp     move1                   ;now, go do vector move

laser_int endp

endbkgtask label far

LaserBackground ends

subttl  Copyright Notice
page
LaserCode segment public 'CODE'
        assume  cs:LaserCode,ds:LaserData

;=============================================================================
;
;       LASER SYSTEM INFORMATION AREA
;
        dw      current_version         ;current version number
        dw      LaserData               ;memory-resident segments
```

```
        dw      LaserQueue
        dw      LaserBackground
        dw      LaserCode
        db      16 dup (0)

;=============================================================================
;
;       COPYRIGHT NOTICE
;
        db      'LASER Controller Version 2.60 Copyright (C) 1988 by Tarnz Technol

subttl  Software Interrupt Service
page
;=============================================================================
;
;       Laser Software Interrupt Functions
;
;       These functions can be called from any high-level language having
;       software interrupt capability.
;
;       AH AL
;       00 --   open laser DAC channel and initialize
;       01 --   close laser DAC channel and restore system
;       02 xx   add command to background command queue
;       02 00     move/draw vector
;       02 01     shutter open
;       02 02     shutter closed
;       02 03     change time base
;       02 04     pause
;       03 --   reset background command queue
;       04 --   get background command queue size
;       05 xx   get_option
;       05 00     get software interrupt vector number
;       05 01     get background task interval time
;       05 02     get laser control word
;       05 03     get laser status
;       05 04     get laser turn-off (active to idle) delay
;       05 05     get laser turn-on (idle to active) delay
;       05 06     get laser home position
;       06 xx   set_option
;       06 00     set software interrupt vector number
;       06 01     set background task interval time
;       06 02     set laser control word
;       06 03     -
;       06 04     set laser turn-off delay
;       06 05     set laser turn-on delay
;       06 06     set lase home position
;       07 xx   background task execution control
;       07 00     execute command queue to current point and stop
;       07 01     execute command queue to current point, stop, and clear
;       07 02     clear command queue (reset queue's start pointer)
;       08 xx   background task redraw control
;       08 00     set multi-pass step periods
;       08 01     set redraw pass count
;       08 02     set redraw delay
;       08 03     mark position
;       08 04     perform multi-pass redraw
;
;=============================================================================
page
;=============================================================================
;
;       Laser Controller Software Interface
;       Interrupt Handler
;
;       All calls have the following format:
```

```
;
;               ah = function code
;               al = sub-function code if applicable
;
;               bx..dx are call dependent
;
;       On return, the following is always true:
;
;               al = error code:        0 - operation was successful
;                                     255 - internal error, please report
;
;==============================================================================

;
;       software interrupt entry point
;
laser_swi:
        call    far ptr laser_entry
        iret

laser_entry proc far
        ;
        ;  save the working registers on the user's stack for
        ;  the moment until we can switch to the internal stack
        ;
        pushf
        push    es
        push    di
        push    si
        push    ds
        push    ax
        push    bx
        push    cx
        push    dx
        push    bp
        mov     bp,sp

        mov     ax,LaserData            ;point to laser system variables
        mov     ds,ax
        mov     ax,LaserQueue           ;point to laser system queue
        mov     es,ax

        ;
        ;  decode the function call and dispatch it
        ;
        mov     ax,[bp].p_ax
        mov     return_code,err_none

        ;
        ;  convert AH into an index into the function table
        ;
        mov     al,ah                   ;compute jump table offset
        xor     ah,ah
        shl     ax,1
        cmp     ax,funct_tbl_end
        jc      entry_1
        mov     return_code,err_bad_param       ;invalid function code
        jmp     entry_2

        ;
        ;  call the appropriate procedure
        ;
entry_1:
        mov     bx,ax
        call    word ptr cs:[bx + offset funct_tbl]
```

```
        ;
        ;  return to caller with return code
        ;
entry_2:
        mov     ax,[bp].p_ax
        mov     al,return_code
        mov     [bp].p_ax,ax
        mov     sp,bp
        pop     bp
        pop     dx
        pop     cx
        pop     bx
        pop     ax
        pop     ds
        pop     si
        pop     di
        pop     es
        popf
        ret

laser_entry endp

funct_tbl label word
        dw      open_laser_and_init     ;0
        dw      close_laser_and_reset   ;1
        dw      add_to_bcmd_queue       ;2
        dw      reset_bcmd_queue        ;3
        dw      get_bcmd_queue_size     ;4
        dw      get_option              ;5
        dw      set_option              ;6
        dw      bkgnd_exec_ctrl         ;7
        dw      redraw_ctrl             ;8
funct_tbl_end equ $-funct_tbl

subttl  setinterrupt
page
;===============================================================================
;
;       Set an interrupt vector.  The register programming is:
;
;               BX:AX = CS:IP for the Interrupt Service Routine
;               DX    = interrupt type (number)
;       Upon return, BX:AX contains the previous interrupt vector
;
;===============================================================================
setinterrupt proc near
        push    ds
        push    es
        push    cx
        push    dx
        push    bx
        push    ax
        mov     ax,dx                   ;first return old vector
        mov     ah,35h                  ;it will be in ES:BX
        int     21h
        mov     cx,bx                   ;save BX
        mov     ax,dx                   ;now set the new vector
        mov     ah,25h
        pop     dx                      ;pop AX into DX and so that
        pop     bx                      ;  DS:DX is the desired value
        mov     ds,bx
        push    es                      ;save ES and CX
        push    cx
        int     21h
        pop     ax                      ;restore ES:CX as BX:AX and
        pop     bx                      ;  return
```

```
        pop     dx
        pop     cx
        pop     es
        pop     ds
        ret

setinterrupt endp

subttl  Software Interrupt Functions
page

soft_fns proc near

;-------------------------------------------------------------------------------
;
;       AH = 00:  open_laser_and_init
;
;       Install background task and initialize variables.
;
;       if BX > 0 then use BX to set new background interrupt interval
;         else use previously defined time interval value
;
;-------------------------------------------------------------------------------
open_laser_and_init:
        call    reset_bcmd_queue
        mov     bx,[bp].p_bx
        or      bx,bx
        jnz     open_1
        mov     bx.bkgnd_intr_time
open_1:
        call    set_ports
        call    set_ctrl
        call    set_bkgnd_time
        ret

;
;  set up 8255 ports on John Bell I/O Card
;
;  A1(0-7)  output  mode 0
;  B1(0-7)  output  mode 0
;  C1(0-3)  output  mode 0
;  C1(4-7)  input   mode 0
;
set_ports:
        mov     dx,ctrl1
        mov     al,10001000b            ;output control1 byte
        out     dx,al                   ;  doing so reset ports
;        mov     dx,portA1               ;init ports
;        mov     al,00h
;        out     dx,al                   ;port A1, DAC value of 0
;        inc     dx
;        out     dx,al                   ;port B1
        inc     dx
        mov     dx,portC1
        mov     al,0FFh
        out     dx,al                   ;port C1, strobes high
        ret
page

;-------------------------------------------------------------------------------
;
;       AH = 01:  close_laser_and_reset
;
;       Stop background task and clean-up system as much as possible.
;
;-------------------------------------------------------------------------------
```

```
close_laser_and_reset:
        call    bkg_rmv
        mov     bkgnd_mode,_static          ;static state
        ret
page

;-------------------------------------------------------------------------------
;
;       AH = 02:  add command to background task's queue
;
;         AL    COMMAND TYPE ADDED
;         00    vector move/draw
;         01    shutter open
;         02    shutter closed
;         03    change time base
;         04    pause
;
;-------------------------------------------------------------------------------
addbcmd_tbl label word
        dw      add_vector
        dw      add_shutter_open
        dw      add_shutter_close
        dw      add_change_timebase
        dw      add_pause
addbcmd_tbl_end equ $-addbcmd_tbl

add_to_bcmd_queue:
        test    current_status.ls_open  ;only add vector if channel open
        jnz     add_bcmd1
        mov     return_code,err_not_open
        ret
add_bcmd1:
        call    get_size                ;check for near-full background queue
        cmp     ax,bcmd_queue_limit
        jb      add_bcmd2
        mov     return_code,err_queue_full
        ret
add_bcmd2:
        mov     ax,[bp].p_ax
        mov     di,bcmd_queue_end
        mov     es:[di],al              ;store command type
        inc     di
        xor     ah,ah
        shl     ax,1
        cmp     ax,addbcmd_tbl_end
        jc      add_bcmd3
        mov     return_code,err_bad_param       ;invalid function
        ret
        ;
        ;  call appropriate function
        ;
add_bcmd3:
        mov     bx,ax
        call    word ptr cs:[bx + offset addbcmd_tbl]
        ret

;
;       AX = 0200:  add_vector
;
;       Add vector to background command queue.
;
;       ES:BX points to vector packet:
;       byte    0 - startX fractional  (start coordinates)
;             1,2 - startX integer
;               3 - startY fractional
;             4,5 - startY integer
```

```
;             6,7 - deltaX fract/int  (change coordinates)
;             8,9 - deltaY fract/int
;           10,11 - incr  (# of steps)
;
add_vector:
        push    ds
        mov     ds,[bp].p_es            ;ES:BX point to vector packet
        mov     si,[bp].p_bx
        cld
        mov     cx,(move_size+1)/2
        rep movsw
        pop     ds
        mov     bx,move_size
        jmp     end_store

;
;       AX = 0201:  background shutter open
;
;       Open laser beam shutter in-line with background sequencing.
;
add_shutter_open:
        mov     bx,open_shutter_size
        jmp     end_store

;
;       AX = 0202:  background shutter closed
;
;       Close laser beam shutter in-line with background sequencing.
;
add_shutter_close:
        mov     bx,close_shutter_size
        jmp     end_store

;
;       AX = 0203:  background change time base
;
;       Change interrupt time base in-line with background sequencing.
;
add_change_timebase:
        mov     bx,[bp].p_bx
        mov     es:[di],bx
        mov     bx,change_timebase_size
        jmp     end_store

;
;       AX = 0204:  temporarily pause background task
;
;       Pause background processing in-line with background sequencing.
;
add_pause:
        mov     bx,[bp].p_bx
        mov     es:[di],bx
        mov     bx,pause_size

;
;  finish off storing to background queue
;
end_store:
        mov     ax,bcmd_queue_end       ;next end index
        add     ax,bx
        cmp     ax,bcmd_queue_limit     ;next start index
        jb      end_store1
        mov     di,ax                   ;store queue max token
        mov     es:[di],byte ptr 0FFh
        mov     ax,0                    ;wraparound queue
end_store1:
```

```
        mov     bcmd_queue_end,ax
        ret
page

;-----------------------------------------------------------------------
;
;       AH = 03:  reset_bcmd_queue
;
;       Throw away all commands currently in background command queue.
;       Current background task operations are suspended.
;
;-----------------------------------------------------------------------
reset_bcmd_queue:
        pushf                           ;will stop current operation
        cli
        mov     ax,exec_queue_end
        mov     exec_queue_start,ax
        mov     ax,bcmd_queue_end       ;force queues to zero length
        mov     bcmd_queue_start,ax     ;  and make background routine idle
        mov     clear_pointer,ax
        mov     ax,queue_end
        mov     queue_start,ax
        and     current_status,all-redrawing-need_to_pause  ;no redraw
        mov     pass,0
        mov     bkgnd_mode,_static      ;will enter idle state
        popf
        ret
page

;-----------------------------------------------------------------------
;
;       AH = 04:  get_bcmd_queue_size
;
;       Return the number of bytes currently used by background command
;       queue in BX.
;
;-----------------------------------------------------------------------
get_bcmd_queue_size:
        call    get_size
        mov     [bp].p_bx,ax
        ret

get_size:
        pushf
        cli
        mov     ax,bcmd_queue_end       ;try end-start
        sub     ax,bcmd_queue_start
        jnc     get_size1
        ;
        ;  add in background command queue size for negative numbers
        ;    won't be perfectly accurate on queue wraparound
        ;
        add     ax,bcmd_queue_size
get_size1:
        popf
        ret
page

;-----------------------------------------------------------------------
;
;       AH = 05:  get_option
;
;       Return laser control option:
;
;         AL    OPTION RETURNED
;         00    software interrupt vector number
```

```
;           01    background task interval time
;           02    laser control word
;           03    laser status
;           04    laser turn-off delay tick count
;           05    laser turn-on delay tick count
;           06    laser beam home position
;
;--------------------------------------------------------------------------
goptn_tbl         label   word
                  dw      get_int_vector
                  dw      get_bkgnd_time
                  dw      get_laser_ctrl
                  dw      get_status
                  dw      get_off_count
                  dw      get_on_count
                  dw      get_home_pos
goptn_tbl_end     equ     $-goptn_tbl

get_option:
        mov     ax,[bp].p_ax
        xor     ah,ah
        shl     ax,1
        cmp     ax,goptn_tbl_end
        jc      go_1
        mov     return_code,err_bad_param        ;invalid function
        ret

go_1:   ;
        ;  call appropriate function
        ;
        mov     bx,ax
        call    word ptr cs:[bx + offset goptn_tbl]
        ret

;
;       AX = 0500:  get software interrupt vector number
;
;       BL gets interrupt vector number
;
get_int_vector:
        mov     ax,swi_int
        mov     bx,[bp].p_bx
        mov     bl,al
        mov     [bp].p_bx,bx
        ret

;
;       AX = 0501:  get background task interrupt interval time
;
;       BX gets timer parameter:
;         intr freq = BX / 1.19 MHz  (e.g. if BX = 119, freq is 100 us)
;
;
get_bkgnd_time:
        mov     bx,bkgnd_intr_time
        mov     [bp].p_bx,bx
        ret

;
;       AX = 0502:  get laser control word
;
get_laser_ctrl:
        mov     bx,laser_control
        mov     [bp].p_bx,bx
        ret
```

```
;
;       AX = 0503:  get laser status
;
get_status:
        mov     ax,current_status       ;return current_status in BX
        mov     [bp].p_bx,ax
        mov     dx,portC1               ;return Port C1 inputs in CX
        in      al,dx
        shl     al,1
        shl     al,1
        shl     al,1
        shl     al,1
        mov     ah,0
        mov     [bp].p_cx,ax
        ret

;
;       AX = 0504:  get laser turn-off delay count
;
get_off_count:
        mov     bx,off_delay_count      ;return off tick count
        mov     [bp].p_bx,bx
        ret

;
;       AX = 0505:  get laser turn-on delay count
;
get_on_count:
        mov     bx,on_delay_count       ;return on tick count
        mov     [bp].p_bx,bx
        ret

;
;       AX = 0506:  get laser home position
;
get_home_pos:
        mov     bx,HomeXpos
        mov     [bp].p_bx,bx            ;home X-position in BX
        mov     cx,HomeYpos
        mov     [bp].p_cx,cx            ;home Y-position in CX
        ret
page

;-----------------------------------------------------------------------------
;
;       AH = 06:  set_option
;
;       Change laser control option:
;
;         AL    OPTION CHANGED
;         00    software interrupt vector number
;         01    background task interval time
;         02    laser control word
;         03    -
;         04    laser turn-off delay tick count
;         05    laser turn-on delay tick count
;         06    laser beam home position
;
;-----------------------------------------------------------------------------
soptn_tbl label word
        dw      set_int_vector
        dw      set_bkgnd_time
        dw      set_laser_ctrl
        dw      no_so
        dw      set_off_count
        dw      set_on_count
```

```
        dw      set_home_pos
soptn_tbl_end equ $-soptn_tbl

set_option:
        mov     ax,[bp].p_ax
        xor     ah,ah
        shl     ax,1
        cmp     ax,soptn_tbl_end
        jc      so_1
        mov     return_code,err_bad_param       ;invalid function
        ret

so_1:   ;
        ;  call appropriate function
        ;
        mov     bx,ax
        call    word ptr cs:[bx + offset soptn_tbl]
no_so:
        ret

;
;       AX = 0600:  set/software interrupt vector number
;
;       if BL = 0,
;         then if vector previously set, then restore old vector
;         else do nothing
;       else use BL to set software interrupt vector number
;
set_int_vector:
        mov     bx,[bp].p_bx
        or      bl,bl
        jz      set_int_1
        xor     bh,bh
        mov     swi_int,bx
        mov     dx,bx
        mov     ax,offset laser_swi
        mov     bx,cs
        call    setinterrupt
        or      current_status,ls_interrupt
        mov     swi_seg,bx
        mov     swi_ofs,ax
        ret

set_int_1:
        ;
        ;  restore old interrupt vector
        ;
        test    current_status,ls_interrupt
        jnz     set_int_2
        ret

set_int_2:
        mov     bx,swi_seg
        mov     ax,swi_ofs
        mov     dx,swi_int
        call    setinterrupt
        and     current_status,all-ls_interrupt
        ret

;
;       AX = 0601:  set background task interrupt interval time
;                   activate background task if not already running
;
;       BX has timer parameter:
;         intr freq = BX / 1.19 MHz  (e.g. if BX = 119, freq is 100 us)
;
```

```
;
set_bkgnd_time:
        mov     bx,[bp].p_bx
        mov     step_periods,bx
        call    bkg_ins
        ret

;
;       AX = 0602:  set laser control word
;
set_laser_ctrl:
        mov     bx,[bp].p_bx
        mov     laser_control,bx

        ;
        ;  set control bits
        ;
set_ctrl:
        mov     dx,portC1
        in      al,dx                   ;read existing port C1 bits
        test    laser_control,shutter   ;update for shutter
        jnz     shutter_closed
shutter_open:
        and     al,all-shutter_ctrl
        jmp     shutter_str
shutter_closed:                         ;shutter closed if shutter not 0
        or      al,shutter_ctrl
shutter_str:
        out     dx,al
        ret

;
;       AX = 0604:  set laser turn-off delay count
;
set_off_count:
        mov     bx,[bp].p_bx            ;set off tick count
        mov     off_delay_count,bx
        ret

;
;       AX = 0605:  set laser turn-on delay count
;
set_on_count:
        mov     bx,[bp].p_bx            ;set on tick count
        mov     on_delay_count,bx
        ret

;
;       AX = 0606:  set laser home position
;
set_home_pos:
        mov     bx,[bp].p_bx            ;home X-position in BX
        mov     HomeXpos,bx
        mov     cx,[bp].p_cx            ;home Y-position in CX
        mov     HomeYpos,cx
        ret
page

;-------------------------------------------------------------------------
;
;       AH = 07:  control background task's execution
;
;  only functional when Block Mode is on (laser_control bit 2)
;
;         AL    EXECUTION CONTROL ESTABLISHED
;         00    execute command block
```

```
;         01    execute and clear command block
;         02    clear command block
;
;-------------------------------------------------------------------------------
exec_ctrl_tbl label word
        dw      exec
        dw      exec_clear
        dw      clear
exec_ctrl_tbl_end equ $-exec_ctrl_tbl

bkgnd_exec_ctrl:
        test    current_status,ls_open  ;continue only if channel open
        jnz     exec_ctrl1
        mov     return_code,err_not_open
        ret
exec_ctrl1:
        test    laser_control,block_mode        ;  and in block mode
        jnz     exec_ctrl2
        mov     return_code,err_not_block
exec_ctrl2:
        mov     ax,[bp].p_ax
        mov     di,bcmd_queue_end
        xor     ah,ah
        shl     ax,1
        cmp     ax,exec_ctrl_tbl_end
        jc      exec_call
        mov     return_code,err_bad_param       ;invalid function
        ret
        ;
        ;  call approrpriate function
        ;
exec_call:
        mov     bx,ax
        call    word ptr cs:[bx + offset exec_ctrl_tbl]
        ret

;
;       AX = 0700:  execute command block
;
;       Execute command queue entries from last Clear Operation to
;       the last command entered.
;
exec:
        mov     bx,exec_queue_end       ;check for full exec queue
        mov     si,bx
        add     bx,exec_entry_len
        cmp     bx,exec_queue_limit
        jb      exec1
        mov     bx,0                    ;wraparound
exec1:
        cmp     bx,exec_queue_start     ;full if indexes are equal
        jne     exec2
        mov     return_code,err_exec_limit
        ret
exec2:
        mov     ax,clear_pointer
        mov     [si],ax                 ;establish block to execute:
        add     si,2                    ;  from clear_pointer (set by clear
        mov     ax,bcmd_queue_end       ;  routine) to current end of
        mov     [si],ax                 ;  command queue
        mov     exec_queue_end,bx       ;
        ret

;
;       AX = 0701:  execute and clear command block
;
```

```
;       Execute command queue entries from last Clear Operation
;       and then Clear.
;
exec_clear:
        call    exec                    ;set up exec block
        cmp     return_code,0
        je      clear                   ;fall into clear if no error
        ret

;
;       AX = 0702:  clear command block
;
;       Reset the start of the command block for future Execute Operations.
;
clear:
        mov     ax,bcmd_queue_end       ;set clear pointer to current end
        mov     clear_pointer,ax        ;  of command queue
        ret
page

;-----------------------------------------------------------------------------
;
;       AH = 08:  background task's redraw control
;
;         AL    REDRAW CONTROL ESTABLISHED
;         00    set multi-pass step periods
;         01    set redraw count
;         02    set redraw delay
;         03    mark position
;         04    perform multi-pass redraw
;
;-----------------------------------------------------------------------------
redraw_ctrl_tbl label word
        dw      add_set_periods
        dw      add_set_redraw_count
        dw      add_set_redraw_delay
        dw      add_mark_position
        dw      add_redraw
redraw_ctrl_tbl_end equ $-redraw_ctrl_tbl

redraw_ctrl:
        test    current_status,ls_open  ;continue only if channel open
        jnz     redraw_ctrl1
        mov     return_code,err_not_open
        ret
redraw_ctrl1:
        test    laser_control,block_mode        ;  and in block mode
        jnz     redraw_ctrl2
        mov     return_code,err_not_block
redraw_ctrl2:
        call    get_size                ;check for near-full queue
        cmp     ax,bcmd_queue_limit
        jb      redraw_ctrl3
        mov     return_code,err_queue_full
        ret
redraw_ctrl3:
        mov     ax,[bp].p_ax
        add     al,5                    ;token val = subcmd # + 5
        mov     di,bcmd_queue_end
        mov     es:[di],al              ;store token
        inc     di
        mov     ax,[bp].p_ax
        xor     ah,ah
        shl     ax,1
        cmp     ax,redraw_ctrl_tbl_end
        jc      redraw_call
```

```
        mov     return_code,err_bad_param       ;invalid function
        ret
        ;
        ;  call appropriate function
        ;
redraw_call:
        mov     bx,ax
        call    word ptr cs:[bx + offset redraw_ctrl_tbl]
        ret

;
;       AX = 0800:  add set multi-pass step periods to command queue
;
;       Add the set multi-pass step periods token and the variable
;       size argument to the Background Command Queue
;
;       ES:BX points to step periods array:
;       byte   0 - number of step periods (byte)
;            1,2 - step period pass 0     (word)
;            3,4 - step period pass 1     (word)
;            etc.
;
add_set_periods:
        push    ds
        mov     ds,[bp].p_es            ;ES:BX points to step periods array
        mov     si,[bp].p_bx
        cld                             ;for movsw, DS:SI+ -> ES:DI+
        mov     cl,ds:[si]              ;get # step periods, word count
        mov     ch,0
        mov     es:[di],cl
        inc     si
        inc     di
        cmp     cx,10                   ;max of 10 passes
        jbe     add_set_periods1
        mov     cx,10
add_set_periods1:
        mov     bx,cx
        shl     bx,1                    ;compute laser command size
        add     bx,set_periods_size
        rep movsw
        pop     ds
        jmp     end_store

;
;       AX = 0801:  add set redraw count to command queue
;
;       Add the set redraw count token and argument to the
;       Background Command Queue
;
add_set_redraw_count:
        mov     bx,[bp].p_bx
        mov     es:[di],bx
        mov     bx,set_redraw_count_size
        jmp     end_store

;
;       AX = 0802:  add set redraw delay to command queue
;
;       Add the set redraw delay token and argument to the
;       Background Command Queue
;
add_set_redraw_delay:
        mov     bx,[bp].p_bx
        mov     es:[di],bx
        mov     bx,set_redraw_delay_size
        jmp     end_store
```

```
;
;       AX = 0803:  add mark position to command queue
;
;       Add the mark position token to the Background Command Queue
;
add_mark_position:
        mov     bx,mark_size
        jmp     end_store

;
;       AX = 0804:  add redraw to command queue
;
;       Add the redraw token to the Background Command Queue
;
add_redraw:
        mov     bx,redraw_size
        jmp     end_store

soft_fns endp

endcode label far

LaserCode ends

        end
```

```
DISKOFF.ASM    - Page 1 -                      4/15/1988   6:23 PM

Page 60,132
Title  DISKOFF  Turn Floppy Disk's Motor Off
;===========================================================================
;
;       DISKOFF Turn Floppy Disk's Motor Off
;
;               This program turns off the floppy disk drive's
;               motor which isn't automatically turned off by the
;               OS.  By installing the variable-speed sterolithography
;               laser controller code, we have trapped out the system
;               clock which would have automatically time-out the floppy
;               disk drive(s).
;
;       Version 1.00 (C) Copyright Tarnz Technologies, 1987
;
;===========================================================================
        name    diskoff

;
;  System Data
;
sysdata         segment at 40h
                org     03Fh
motor_status    db      ?
motor_count     db      ?
sysdata         ends

subttl  DiskOff Code
page
;===============================================================================
;
;       DiskOff Code
;
;===============================================================================

DiskOffCode segment public 'CODE'
        assume  cs:DiskOffCode,ds:sysdata,ss:stack

nomotor proc far
        mov     ax,sysdata
        mov     ds,ax
        mov     motor_count,0
        and     motor_status,0F0h       ;turn off motor running bits
        mov     al,0Ch
        mov     dx,03f2h                ;FDC control port
        out     dx,al                   ;turn off the motor

        mov     ax,4C00h                ;exit back to DOS
        int     21h
        ret
nomotor endp
DiskOffCode ends

stack   segment para stack 'STACK'
                dw 32 dup (0)
stack   ends

        end     nomotor
```

```
'==========================================================================
'  3D Systems Stereolithography System Software
'==========================================================================
'
'  MATERIAL.BAS
'  SLA-1 Material Manager Software
'
'--------------------------------------------------------------------------
'
'  History:
'  12/01/87  Ver 2.30  first release
'  12/14/87  Ver 2.40  handles line widths min and max, computes MSA
'  12/17/87  Ver 2.41  FN zero conditions handled (divide, LOG)
'   1/08/88  Ver 2.50  relabeled Calc MSA due to MSA concept problems
'   1/25/88  Ver 2.60  version update only
'
'--------------------------------------------------------------------------

  DIM SP[20],LH[20],WMIN[20],WMAX[20]

  VersionId$ = "2.60"
  TRUE = -1
  FALSE = 0
  ScanFlag% = FALSE

  SingleBar$ = STRING$(45,196)
  PowerFile$         = "POWER.LST"
  LastMaterialFile$  = "MATERIAL.LST"

  COLOR 15
MatAsk:
  CLS
  PRINT SingleBar$
  PRINT "  MATERIAL, Material Manager"
  PRINT "  3D Systems Laser Stereolithography System"
  PRINT "  Version "+VersionId$+"                3D Systems, Inc."
  PRINT SingleBar$
  PRINT
  IF LEN(MaterialFile$)>0 THEN PRINT "     Material File: ";MaterialFile$
  PRINT
  PRINT "     1. Load Material Data"
  PRINT "     2. View Material Data"
  PRINT "     3. Input New Material Data"
  PRINT "     4. Layer Thickness Information"
  PRINT "     Q. Quit"
  PRINT
  PRINT "     Option: ";
MatAskLoop:
  A$ = UCASE$(INKEY$)
  IF LEN(A$)=0 THEN MatAskLoop
  PRINT A$;
  IF A$="1" THEN LoadMaterial
  IF A$="2" THEN ViewMaterial
  IF A$="3" THEN InputMaterial
  IF A$="4" THEN LayerInfo
  IF A$="Q" THEN END

'--------------------------------------------------------------------------

LoadMaterial:
  CLS
  PRINT "Available Material Files:"
  PRINT
  ON ERROR GOTO NoMaterialFiles
```

```
  FILES "*.MAT"
  GOTO GetMaterialAsk
NoMaterialFiles:
  PRINT "- no material files in working directory -"
  RESUME GetMaterialAsk
GetMaterialAsk:
  PRINT
  INPUT "Name of data file to read: ",MaterialFile$
  IF LEN(MaterialFile$)=0 THEN MatAsk
  MaterialFile$ = UCASE$(MaterialFile$)
  IF INSTR(MaterialFile$,".")=0 THEN MaterialFile$ = MaterialFile$ + ".MAT"
  ON ERROR GOTO CantReadMaterialFile
  GOSUB GetMaterialFileData
  OPEN LastMaterialFile$ FOR OUTPUT AS #9
  PRINT #9,MaterialFile$
  CLOSE #9
  GOTO MatAsk

GetMaterialFileData:
  OPEN MaterialFile$ FOR INPUT AS #7
  ON ERROR GOTO 0
  INPUT #7,MaterialLaserPower
  INPUT #7,NumberOfPairs%
  FOR I% = 1 TO NumberOfPairs%
    INPUT #7,SP(I%)
    INPUT #7,LH(I%)
    INPUT #7,WMIN(I%)
    INPUT #7,WMAX(I%)
    SP(I%) = LOG(SP(I%))/LOG(10)
  NEXT I%
  CLOSE #7
  CALL Regression(LH(),LHSlope,LHYint,LHRval)
  CALL Regression(WMIN(),WMINSlope,WMINYint,WMINRval)
  CALL Regression(WMAX(),WMAXSlope,WMAXYint,WMAXRval)
  RETURN

CantReadMaterialFile:
  PRINT "Can't read material file ";MaterialFile$
  CLOSE #7
  RESUME GetMaterialAsk


'-------------------------------------------------------------------------------

InputMaterial:
  CLS
  PRINT "INPUT MATERIAL DATA"
  PRINT
  PRINT
  INPUT "Name of Material Data File: ",MaterialFile$
  MaterialFile$ = UCASE$(MaterialFile$)
  IF LEN(MaterialFile$)=0 THEN MatAsk
  IF INSTR(MaterialFile$,".")=0 THEN MaterialFile$ = MaterialFile$ + ".MAT"
  PRINT
  INPUT "Enter Material Test Laser Power Reading (mW): ",MaterialLaserPower
  INPUT "How many Step Period/Line Height data pairs? ",NumberOfPairs%
  PRINT
  ON ERROR GOTO 0
  FOR I% = 1 TO NumberOfPairs%
  PRINT "Data pair #";I%;":  ";
    INPUT "SP = ",SP(I%)
    LOCATE CSRLIN-1,30
    INPUT " LH = ",LH(I%)
    IF SP(I%)=0 OR LH(I%)=0 THEN MatAsk      ' abort
    SP(I%)=LOG(SP(I%))/LOG(10)               ' convert to log(sp)
    LOCATE CSRLIN-1,45
```

```
    INPUT "WMIN = ",WMIN(I%)
    LOCATE CSRLIN-1,60
    INPUT "WMAX = ",WMAX(I%)
  NEXT I%
  OPEN MaterialFile$ FOR OUTPUT AS #7
  PRINT #7,MaterialLaserPower
  PRINT #7,NumberOfPairs%
  FOR I% = 1 TO NumberOfPairs%
    PRINT #7,10^SP(I%)
    PRINT #7,LH(I%)
    PRINT #7,WMIN(I%)
    PRINT #7,WMAX(I%)
  NEXT I%
  CLOSE #7
  OPEN LastMaterialFile$ FOR OUTPUT AS #9
  PRINT #9,MaterialFile$
  CLOSE #9
  CALL Regression(LH(),LHSlope,LHYint,LHRval)
  CALL Regression(WMIN(),WMINSlope,WMINYint,WMINRval)
  CALL Regression(WMAX(),WMAXSlope,WMAXYint,WMAXRval)
  GOTO MatAsk
'------------------------------------------------------------------------------

ViewMaterial:
  CLS
  PRINT "Data from Material File: ";MaterialFile$
  PRINT
  PRINT
  PRINT "Material Test Laser Power Reading: ";
  PRINT USING "###.##";MaterialLaserPower
  PRINT
  PRINT NumberOfPairs%;"Material Data Pairs:"
  PRINT
  FOR I% = 1 TO NumberOfPairs%
    PRINT USING "##. ";I%;
    PRINT USING "  SP = ####.##";10^SP(I%);
    LOCATE ,20
    PRINT USING "  LH = ####.##";LH(I%);
    LOCATE ,35
    PRINT USING "  WMIN = ####.##";WMIN(I%);
    LOCATE ,52
    PRINT USING "  WMAX = ####.##";WMAX(I%)
  NEXT I%
  PRINT
  PRINT "  LH:  Slope =";
  PRINT USING "#####.##";INT(LHSlope*1000)/1000;
  PRINT "   Y-Intercept =";
  PRINT USING "#####.##";INT(LHYint*100)/100;
  PRINT "   R-Value =";
  PRINT USING "#####.##";INT(LHRval*1000)/1000
  PRINT "WMIN:  Slope =";
  PRINT USING "#####.##";INT(WMINSlope*1000)/1000;
  PRINT "   Y-Intercept =";
  PRINT USING "#####.##";INT(WMINYint*100)/100;
  PRINT "   R-Value =";
  PRINT USING "#####.##";INT(WMINRval*1000)/1000
  PRINT "WMAX:  Slope =";
  PRINT USING "#####.##";INT(WMAXSlope*1000)/1000;
  PRINT "   Y-Intercept =";
  PRINT USING "#####.##";INT(WMAXYint*100)/100;
  PRINT "   R-Value =";
  PRINT USING "#####.##";INT(WMAXRval*1000)/1000
  PRINT
  INPUT "Press Enter to continue... ",A$
  GOTO MatAsk
```

```
'-----------------------------------------------------------------------------

LayerInfo:
  CLS
  PRINT "LAYER THICKNESS INFORMATION"
  PRINT
  PRINT
  INPUT "Desired max layer thickness (mils): ",T$
  T = VAL(T$)    ' to simulate cure depth
  IF T=0 THEN GOTO MatAsk
  PRINT
  PRINT
  WMIN = FN GetLog(T+6,WMINSlope,WMINYint)
  WMAX = FN GetLog(T+6,WMINSlope,WMINYint)
'  MSA = 180/3.1415926535*(2*T/(WMIN+WMAX))    ' wrong
'  IF MSA<0 THEN MSA=0
'  IF MSA>89.999 THEN MSA=90
  PRINT USING "WMIN = ####.##";WMIN;
  PRINT USING "   WMAX = ####.##";WMAX
'  PRINT USING "   MSA = ###.##";MSA    don't show yet
  PRINT
  INPUT "Press Enter to continue... ",A$
  GOTO MatAsk

'-----------------------------------------------------------------------------

SUB Regression(Array(1),Slope,Yint,Rval)
  SHARED NumberOfPairs%,SP()
  XY        = 0
  SUMX      = 0
  SUMY      = 0
  SUMY2     = 0
  XSQUARED  = 0
  IF NumberOfPairs%<1 THEN
    Slope = 0
    Yint  = 0
    Rval  = 0
    GOTO EndRegSub
  END IF
  FOR I% = 1 TO NumberOfPairs%
    XY = XY + SP(I%) * Array(I%)
    SUMX = SUMX + SP(I%)
    SUMY = SUMY + Array(I%)
    SUMY2 = SUMY2 + Array(I%)^2
    XSQUARED = XSQUARED + SP(I%)^2
  NEXT I%
  Denom = XSQUARED - (SUMX^2) / NumberOfPairs%
  IF Denom < 1E-5 THEN Slope = 0_
  ELSE Slope = (XY - (SUMX*SUMY)/NumberOfPairs%) / Denom
  Yint = SUMY/NumberOfPairs% - Slope * SUMX/NumberOfPairs%
  Denom = SUMY2 - SUMY^2 / NumberOfPairs%
  IF Denom < 1E-5 THEN Rval = 0_
  ELSE Rval = SQR(((Yint * SUMY + Slope * XY) - SUMY^2/NumberOfPairs%) / Denom)
EndRegSub:
END SUB

DEF FN GetLog(DataPoint,Slope,Yint)
  IF DataPoint > 0 THEN
    FN GetLog = Slope * LOG10(DataPoint) + Yint
  ELSE
    FN GetLog = 0
  END IF
END DEF

'=========================================================================
```

```
'  UTILITY FUNCTIONS AND PROCEDURES
'
'--------------------------------------------------------------------------------

' Removes all double spaces in CmdLine$
'
RemoveDoubleSpaces:
  WHILE INSTR(CmdLine$,"  ")>0
    I = INSTR(CmdLine$,"  ")
    CmdLine$ = left$(CmdLine$,I) + mid$(CmdLine$,I+2,99)
  WEND
  RETURN

'
'  Find any char of Char$ in Main$ starting at index Start
'  Returns LEN(Main$)+1 if no character of Char$ in Main$
'
DEF FN FindStr(Start%,Main$,Char$)
  LOCAL I%,J%,MIN%
  MIN% = LEN(Main$) + 1
  FOR I%=1 to LEN(Char$)
    J% = INSTR(Start%,Main$,MID$(Char$,I%,1))
    IF (J% > 0) AND (J% < MIN%) THEN MIN% = J%
  NEXT I%
  FN FindStr = MIN%
END DEF

'
'  Make a string from a number without a leading space
'
DEF FN StrNoSp$(Num)
  LOCAL A$
  A$=STR$(Num)
  IF LEFT$(A$,1)=" " THEN A$=RIGHT$(A$,LEN(A$)-1)
  FN StrNoSp$ = A$
END DEF

'
'  Pick out a number from a string
'  starting at Index and going to the next space or comma or end-of-string
'
SUB UnitValInt(Storage&,Text$,Index%)
  Storage& = VAL(MID$(Text$,Index%))
  Index% = FN FindStr(Index%,Text$," ,") + 1
END SUB

SUB UnitVal(Storage,Text$,Index%)
  Storage = VAL(MID$(Text$,Index%))
  Index% = FN FindStr(Index%,Text$," ,") + 1
END SUB

'
'  Pick out text from a string
'  starting at Index and going to the next comma or end-of-string
'
SUB UnitStr(Storage$,Text$,Index%)
  LOCAL I%
  I% = FN FindStr(Index%,Text$," ,")
  Storage$ = MID$(Text$,Index%,I%-Index%)
  Index% = I% + 1
END SUB

'
'  Remove excess spaces around string
'
```

```
DEF FN NoSp$(Text$)
  LOCAL S%,E%
  IF LEN(Text$)>0 THEN
    S% = 1
    WHILE MID$(Text$,S%,1)=" "
      INCR S%
    WEND
    E% = LEN(Text$)
    WHILE E%>S%+1 AND MID$(Text$,E%,1)=" "
      DECR E%
    WEND
    FN NoSp$ = MID$(Text$,S%,E%-S%+1)
  ELSE
    FN NoSp$ = ""
  END IF
END DEF

'
'  Can't open file.  Report this to operator.
'
CantOpen:
  CALL SystemError("Can't open file "+FileName$)
  END

'-----------------------------------------------------------------------------
'
'  Show error and store it on disk
'
SUB SystemError(Text$)
  PRINT Text$
  OPEN "C:\SYSTEM.ERR" FOR OUTPUT AS #9
  PRINT #9,"PREPARE: ";Text$
  CLOSE #9
END SUB
```

```
{==============================================================================
  3D Systems Stereolithography System Software
 ==============================================================================

  MERGE.PAS
  SLA-1 Merge Sliced Files Software

 ------------------------------------------------------------------------------
  Compile with Turbo Pascal Version 4.0

  File name line syntax:

  <file name>/Z<offset>/N<blocks>/O<blocks> <file name>...
    /OUTFILE<outfile>/RES<resolution>/ZSPC<z-spacing>/THICK<thickness>

  where <file name> is a Slice input file
        <offset>    is a + or - Z-axis offset for that input file
        <blocks>    contains the identifiers for the blocks to skip
                    for that input file separated by commas
        <outfile>   follows all input file specs and is the name of
                    the part output file to store the parsed data

  Up to 10 Slice data files can be combined.
 ------------------------------------------------------------------------------

  Merge *.V vector output file format:    (file #2)

    L1,<layer A>
    <x1> <y1> <x2> <y2>
     :     :
    <another block,<layer A>
     :     :
   [L2,<layer A>
    <x1> <y1> <x2> <y2>
     :     :
    <another block>,<layer A>
     :     :  ]
    L1,<layer B>
     :     :
    (EOF)

 ------------------------------------------------------------------------------

  Critical Area Codes:

    XV = draw section cross-hatch vectors in box as rivets
    XI = ignore section cross-hatch vectors in box
    SV = draw up/down skin cross-hatch vectors in box as rivets
    SI = ignore up/down skin cross-hatch vectors in box

 ------------------------------------------------------------------------------

  Recent History:
   9/ 1/87  Ver 2.04  Version 2 released
   9/ 3/87  Ver 2.07  Compiled by TBM (Modified Turbo Basic)
   9/ 4/87  Ver 2.08  added SV, SI critical areas
   9/17/87  Ver 2.10  only updated version number
   9/25/87  Ver 2.20  new SLICE 19 block format supported
   9/28/87  Ver 2.21  added NFUB support
   9/30/87  Ver 2.25  only updated version number
  10/26/87  Ver 2.27  Parse name changed to Merge
                      *.P files now *.V files
                      error file support
  11/12/87  Ver 2.30  first Beta software release
```

```
   11/20/87  Ver 2.31  added directory listing of *.SLI files
             Ver 2.32  -
   12/04/87  Ver 2.33  slice20 FUB FDB blocks
                       BLOCK.ID file support
   12/14/87  Ver 2.40  input file names in *.L output file
                       pass along ! comment lines in slice files
   12/21/87  Ver 2.41  second !MERGE line contains start, end, # of layers
                       BOX file noted when found, not if not found
                       scans !SLICE comments for Res, ZSpacing, Thick
    1/11/88  Ver 2.50  BLOCK.ID looked for in \3DSYS too
    1/22/88  Ver 2.54  makes Range instead of Layer Control File as default
                       Layer Control File made if /LAYERCTRL option used
    1/25/88  Ver 2.60  generates both Layer and Range Files (.L and .R)
    1/27/88            thickness input is in mils, not millimeters
    1/27/88            thickness defaults to Z-Spacing value
    2/10/88            converted from Turbo Basic to Turbo Pascal 4.0
                       merge operation runs 2.5 times faster than before
                       merge status box with layer and range information
                       /O only and /N no block selections improved
    2/12/88  Ver 2.61  EndLayer variable now LongInt
                       layer numeric output is type word, not integer
                       /
 -----------------------------------------------------------------------------}

uses Crt,Dos;

const
  VersionId = '2.61';
  sp80 = '
  ErrorFileName = 'C:\SYSTEM.ERR';
  BlockIdFileName = 'BLOCK.ID';
  HomeDirectory = 'C:\3DSYS\';
  Cr = ^M;
  StatusBoxLeft   = 42;
  StatusBoxRight  = 79;
  StatusBoxTop    = 10;
  StatusBoxBottom = 22;

type
  str6  = string[6];
  str16 = string[16];

var
  FirstVar: Byte;  { must be first variable defined }
  X1,Y1,X2,Y2,X3,Y3,X4,Y4: array [1..100] of LongInt;
  ZBaseBox,ZHeightBox: array [1..100] of LongInt;
  BoxType: array [1..100] of str6;
  CurrentZ,ZOffset: array [1..10] of LongInt;
  OnlyBlocks,NoBlocks: array [1..10] of String;
  BlockMnemonics: array [1..32] of str6;
  Blocks: array [1..100] of str6;
  ErrorFile: Text;
  InputFiles: array[1..10] of Text;
  code,NumPartFiles,InFile,NumCritVols: Integer;
  BlockMnemonicsCount,ZSpace,BlockCount,Layers: Integer;
  CmdLine,MergeLine,FirstFileName,Line,OutFileName: String;
  SingleBar,LayerFileName,RangeFileName,VectorFileName: String;
  Resolution,ZSpacing,Thickness: Real;
  CurrentLayer,LastLayer,ZStart,ZEnd,ZVal: LongInt;
  StartLayer,EndLayer,MergeLayer: LongInt;
  LayerFile,RangeFile,VectorFile: Text;
  UpdateFile: File of Char;
  UpdateIndex: LongInt;
  HeaderType: Char;
  FileNum,Cmd,Blk: str6;
  FirstRange,NewRange,SkipBlock,NeedStep: Boolean;
```

```
  RangeLayerCount,RangeCount,UpdX,UpdY: Integer;
  LastVar: Byte;  { should be last variable defined }


{-----------------------------------------------------------------------------

                              Utility Routines

-----------------------------------------------------------------------------}

function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
var
  temp: string;
  i: Integer;
begin
  temp := '';
  for i:=1 to num do temp  := temp+Ch;
  many := temp;
end;

procedure centerln(text: String);
begin
  gotoxy((79-length(text)) div 2,whereY);
  writeln(text);
end;

function IntStr(num: Integer): str16;
var
  temp: str16;
begin
  if num>=0 then Str(num,temp) else Str(num+$8000,temp);
  IntStr := temp;
end;

function WordStr(num: Word): str16;
var
  temp: str16;
begin
  Str(num,temp);
  WordStr := temp;
end;

function LongStr(num: LongInt): str16;
var
  temp: str16;
begin
  Str(num,temp);
  LongStr := temp;
end;

function RealStr(num: Real;AfterDecimal: Integer): String;
var
  i: Integer;
  temp: String;
begin
```

```
  Str(num:10:AfterDecimal,temp);
  i := 1;
  while (i<length(temp)) and (temp[i]=' ') do inc(i);
  RealStr := copy(temp,i,99);
end;

function spc(len: Integer): string;
begin
  spc := copy(sp80+sp80,1,len);
end;

procedure ReadCommandLine(var line: string);
var
  i: Integer;
begin
  line := ParamStr(1);
  for i:=2 to ParamCount do
    line := line + ' ' + ParamStr(i);
end;

{
  Remove excess quote marks around string
}
function NoQuotes(Text: String): String;
const
  Quote = '"';
var
  s,e: Integer;
begin
  s := 1;
  if (length(Text)>1) and (Text[1]=Quote) then inc(s);
  e := length(Text);
  if Text[e]=Quote then dec(e);
  NoQuotes := copy(Text,s,e-s+1);
end;

{
  Removes all double spaces in text string
}
procedure RemoveDoubleSpaces(var text: string);
begin
  while pos('  ',text)>0 do
    delete(text,pos('  ',text),1);
end;

{
  Find any char of Chars in Main starting at index Start
  Returns length(Main)+1 if no character of Chars in Main
}
function FindStr(Start: Integer;Main: string;Chars: str16): Integer;
var
  i,j,min: Integer;
  temp: String;
begin
  min := length(Main)+1;
  temp := copy(Main,Start,199);
  for i:=1 to length(Chars) do begin
    j := Start + pos(Chars[i],temp) - 1;
    if (j >= Start) and (j < min) then min := j;
  end;
  FindStr := min;
end;

{
  better val routines
}
```

```
function IntVal(line: String;var code: Integer): Integer;
var
  code2: Integer;
  num: Integer;
begin
  val(line,num,code);
  if code<>0 then val(copy(line,1,code-1),num,code2);
  IntVal := num;
end;

function LongVal(line: String;var code: Integer): LongInt;
var
  code2: Integer;
  num: LongInt;
begin
  val(line,num,code);
  if code<>0 then val(copy(line,1,code-1),num,code2);
  LongVal := num;
end;

function RealVal(line: String;var code: Integer): Real;
var
  ofs,code2: Integer;
  num: Real;
begin
  ofs := 0;
  if line[1]='.' then begin
    line := '0' + line;
    ofs := -1;
  end;
  val(line,num,code);
  if code<>0 then val(copy(line,1,code-1),num,code2);
  if code<>0 then inc(code,ofs);
  RealVal := num;
end;

{
  Pick out a number from a string
  starting at Index and going to the next space or comma or end-of-string
}
procedure UnitValShortInt(var Storage: Integer;Text: String;var Index: Integer);
var
  i: Integer;
begin
  Storage := IntVal(copy(Text,Index,99),i);
  if i=0 then Index := length(Text)+1
    else inc(Index,i);
end;

procedure UnitValInt(var Storage: LongInt;Text: String;var Index: Integer);
var
  i: Integer;
begin
  Storage := LongVal(copy(Text,Index,99),i);
  if i=0 then Index := length(Text)+1
    else inc(Index,i);
end;

procedure UnitVal(var Storage: Real;Text: String;var Index: Integer);
var
  i: Integer;
begin
  Storage := RealVal(copy(Text,Index,99),i);
  if i=0 then Index := length(Text)+1
    else inc(Index,i);
end;
```

```
{
  Pick out text from a string
  starting at Index and going to the next comma or end-of-string
}
procedure UnitStr(var Storage,Text: String;var Index: Integer);
var
  i: Integer;
begin
  i := FindStr(Index,Text,',');
  Storage := copy(Text,Index,i-Index);
  Index := i + 1;
end;

{
  Show error and store it on disk
}
procedure QuietSystemError(TextLine: string);
begin
  assign(ErrorFile,ErrorFileName);
  rewrite(ErrorFile);
  writeln(ErrorFile,'MERGE: ',TextLine);
  close(ErrorFile);
end;

procedure SystemError(TextLine: string);
begin
  writeln(TextLine);
  QuietSystemError(TextLine);
end;

{
  Can't open file.  Report this to operator.
}
procedure CantOpen(FileName: string);
begin
  SystemError('Can''t open file '+FileName);
end;

{ Harry's ultimate Draw-A-Box on the text screen routine }
procedure DrawBox(x1,y1,x2,y2: integer;BoxType: integer);
type
  BoxMode = array[1..4] of Char;
{
    Box Types:
      1:  Single Line all around
      2:  Double Line all around
      3:  Single Line horizontal, Double Line vertical
      4:  Double Line horizontal, Single Line vertical
}
  const
                     {  Type        1    2    3    4     }
    UpperLeftCorner : BoxMode = (#218,#201,#214,#213);
    UpperRightCorner: BoxMode = (#191,#187,#183,#184);
    LowerLeftCorner : BoxMode = (#192,#200,#211,#212);
    LowerRightCorner: BoxMode = (#217,#188,#189,#190);
    HorzBar         : BoxMode = (#196,#205,#196,#205);
    VertBar         : BoxMode = (#179,#186,#186,#179);
var
  i: integer;
  FullHorzBar: String;
begin
  gotoxy(x1,y1);
  if x1<x2 then begin
    if y1=y2 then FullHorzBar := Many(HorzBar[BoxType],x2-x1+1)
      else FullHorzBar := Many(HorzBar[BoxType],x2-x1-1);
```

```
    end else FullHorzBar := '';
  if y1<>y2 then begin
    if x1<>x2 then write(UpperLeftCorner[BoxType]);
    write(FullHorzBar);
    if x1<>x2 then write(UpperRightCorner[BoxType]);
  end;
  for i:=y1+1 to y2-1 do begin
    gotoxy(x1,i);
    write(VertBar[BoxType]);
    gotoxy(x2,i);
    write(VertBar[BoxType]);
  end;
  gotoxy(x1,y2);
  if y1 = y2 then write(FullHorzBar)
  else begin
    if x1<>x2 then write(LowerLeftCorner[BoxType]);
    write(FullHorzBar);
    if x1<>x2 then write(LowerRightCorner[BoxType]);
  end;
end;

procedure SetUpStatusBox;
begin
  DrawBox(StatusBoxLeft,StatusBoxTop,StatusBoxRight,StatusBoxBottom,1);
  DrawBox(StatusBoxLeft+1,StatusBoxTop+2,StatusBoxRight-1,StatusBoxTop+2,1);
  DrawBox(StatusBoxLeft+1,StatusBoxBottom-2,StatusBoxRight-1,StatusBoxBottom-2,1);
end;

{$F+}
procedure ExitMerge;
{$F-}
begin
  window(1,1,80,25);
  gotoxy(1,22);
end;


{==========================================================================}


procedure ReadBoxFile;
var
  BoxFile: Text;
  BoxFileLine: String;
  index,BoxLineCount: Integer;
  TempBoxType: str6;
  TempZBaseBox,TempZHeightBox: Real;
  TempX1,TempY1,TempX2,TempY2,TempX3,TempY3,TempX4,TempY4: Real;
begin
  NumCritVols := 0;
  assign(BoxFile,OutFileName + '.BOX');
  {$I-}
  reset(BoxFile);
  {$I+}
  if IOresult = 0 then begin
  writeln;
    writeln('Critical Area box file found (',OutFileName,'.BOX)');
    BoxLineCount := 0;
    while not eof(BoxFile) do begin
      readln(BoxFile,BoxFileLine);
      inc(BoxLineCount);
      if (BoxFileLine<>'') and (BoxFileLine[1]<>'!') then begin
        index := 1;
        UnitStr(TempBoxType,BoxFileLine,index);
```

```
        UnitVal(TempZBaseBox,BoxFileLine,index);
        UnitVal(TempZHeightBox,BoxFileLine,index);
        UnitVal(TempX1,BoxFileLine,index);
        UnitVal(TempY1,BoxFileLine,index);
        UnitVal(TempX2,BoxFileLine,index);
        UnitVal(TempY2,BoxFileLine,index);
        UnitVal(TempX3,BoxFileLine,index);
        UnitVal(TempY3,BoxFileLine,index);
        UnitVal(TempX4,BoxFileLine,index);
        if index > length(BoxFileLine) then
          writeln('Box line ',BoxLineCount,' too short');
        UnitVal(TempY4,BoxFileLine,index);
        if index <= length(BoxFileLine) then
          writeln('Box line ',BoxLineCount,' too long');
        inc(NumCritVols);
        BoxType[NumCritVols] := upper(TempBoxType);
        ZBaseBox[NumCritVols] := round(TempZBaseBox * Resolution);
        ZHeightBox[NumCritVols] := round(TempZHeightBox * Resolution);
        X1[NumCritVols] := round(TempX1 * Resolution);
        Y1[NumCritVols] := round(TempY1 * Resolution);
        X2[NumCritVols] := round(TempX2 * Resolution);
        Y2[NumCritVols] := round(TempY2 * Resolution);
        X3[NumCritVols] := round(TempX3 * Resolution);
        Y3[NumCritVols] := round(TempY3 * Resolution);
        X4[NumCritVols] := round(TempX4 * Resolution);
        Y4[NumCritVols] := round(TempY4 * Resolution);
      end;
    end;
    close(BoxFile);
  end;
end;

procedure FindFirstLayers;
var
  i,dummy: Integer;
  GoodLine: Boolean;
begin
{ determine first layer number for each slice file }
  MergeLayer := 99999;
  for InFile := 1 to NumPartFiles do begin
    if not eof(InputFiles[InFile]) then begin
      GoodLine := false;
      repeat
        readln(InputFiles[InFile],Line);
        if (Line = '') or (Line[1] in ['!','*']) then begin
          writeln(LayerFile,Line);
          writeln(RangeFile,Line);
          if copy(Line,1,6) = '!SLICE' then begin
            i := pos('-RES ',Line);
            if (i>0) and (Resolution<=0) then
              Resolution := RealVal(copy(Line,i+5,99),dummy);
            i := pos('-ZS ',Line);
            if (i>0) and (ZSpacing<=0) then
              ZSpacing := RealVal(copy(Line,i+4,99),dummy);
            i := pos('-THICK ',Line);
            if (i>0) and (Thickness<=0) then
              Thickness := RealVal(copy(Line,i+7,99),dummy);
          end;
        end else GoodLine := true;
      until GoodLine or eof(InputFiles[InFile]);
      HeaderType := Line[1];
      Zval := LongVal(copy(Line,3,99),dummy) + ZOffset[InFile];
      CurrentZ[InFile] := Zval;
      if Zval < MergeLayer THEN MergeLayer := Zval;
    end;
  end;
```

```
  StartLayer := MergeLayer;
end;

procedure GetParameters;
var
  MmFlag: Boolean;
  dummy: Integer;
  DefaultThickness: Real;
  temp: String;
begin
  writeln;
  if Resolution <= 0 then begin
    write('Slice -res resolution value? ');
    readln(Line);
    Resolution := RealVal(Line,dummy);
  end;
  if ZSpacing <= 0 then begin
    write('Slice -zs layer spacing? ');
    readln(Line);
    ZSpacing := RealVal(Line,dummy);
  end;
  MmFlag := false;
  if Thickness  <= 0 then begin
    DefaultThickness := int(ZSpacing * 1000 / Resolution);
    write('Layer thickness in mils [',RealStr(DefaultThickness,0),']? ');
    readln(Line);
    if Line = '' then Thickness := DefaultThickness
    else begin
      if pos('MM',upper(Line))>0 then MmFlag := true;
      Thickness := RealVal(Line,dummy);
    end;
  end;
  if not MmFlag then Thickness := Thickness * 0.0254;  { convert to mm }
  temp := '* ' + RealStr(Resolution,3) + ',' + RealStr(ZSpacing,3) + ','
    + RealStr(Thickness,3);
  writeln(LayerFile,temp);
  writeln(RangeFile,temp);
end;
```

```
{-----------------------------------------------------------------------------}

procedure AddBlock;
var
  i: Integer;
begin
  i := 1;
  while (i <= BlockCount) and (Blocks[i] <> Blk) do inc(i);
  if i > BlockCount then begin
    inc(BlockCount);
    Blocks[BlockCount] := Blk;
  end;
end;

procedure OutputRange;
var
  i: Integer;
begin
  gotoxy(UpdX,UpdY);
  write(LastLayer:5,' ',RangeLayerCount:5);
  NewRange := true;
  writeln(RangeFile,ZStart,',',LastLayer,',',ZSpace,',',ZSpace);
  for i:=1 to BlockCount do
    writeln(RangeFile,Blocks[i]);
  inc(RangeCount);
end;
```

```
procedure StartNewRange;
begin
  ZStart := MergeLayer;
  BlockCount := 0;
  NeedStep := true;
end;

procedure MakeControl;
var
  LayerDiff: LongInt;
begin
  writeln(LayerFile,MergeLayer,',',Blk);
  if Layers=1 then begin
    ZStart := MergeLayer;
    CurrentLayer := MergeLayer;
    NeedStep := true;
    AddBlock;
  end else begin
    if CurrentLayer = MergeLayer then AddBlock
    else begin
      CurrentLayer := MergeLayer;
      if NeedStep then begin
        NeedStep := false;
        ZSpace := MergeLayer - LastLayer;
        AddBlock;
      end else begin
        LayerDiff := MergeLayer - LastLayer;
        if LayerDiff <> ZSpace then begin
          OutputRange;
          StartNewRange;
          AddBlock;
        end else AddBlock;
      end;
    end;
  end;
end;

{-----------------------------------------------------------------------------}

procedure NewLayer;
var
  i: Integer;
begin
  inc(Layers);
  EndLayer := MergeLayer;
  if NewRange then begin
    if FirstRange then begin
      LastLayer := MergeLayer;
      FirstRange := false;
    end;
    writeln;
    write(Cr,RangeCount+1:2,'. ',LastLayer:5,' - ');
    UpdX := whereX;
    UpdY := whereY;
    write(LastLayer:5,'     1 layers');
    NewRange := false;
    RangeLayerCount := 1;
  end else begin
    gotoxy(UpdX,UpdY);
    inc(RangeLayerCount);
    write(LastLayer:5,' ',RangeLayerCount:5);
  end;
  Blk := '#TOP';
  MakeControl;
  { write out critical areas for layer }
  for i := 1 to NumCritVols do
```

```
    if (ZBaseBox[i] <= MergeLayer) and
      (MergeLayer <= ZBaseBox[i] + ZHeightBox[i]) then
      writeln(LayerFile,MergeLayer,',#CA ',BoxType[i],',',X1[i],',',Y1[i],',',
        X2[i],',',Y2[i],',',X3[i],',',Y3[i],',',X4[i],',',Y4[i]);
end;

{---------------------------------------------------------------------------}

procedure PrintHeaders;
begin
(*   write(Cmd,FileNum,' '); *)
  { update vector file }
  writeln(VectorFile,Cmd,FileNum,',',MergeLayer);
  { update layer and range files }
  Blk := Cmd + FileNum;
  MakeControl;
end;

{---------------------------------------------------------------------------}

procedure ReadSlices;
var
  i,j,c: Integer;
  select,temp: String;
begin
  FirstRange := true;
  NewRange   := true;
  repeat
    NewLayer;
    for InFile := 1 to NumPartFiles do begin
      FileNum := IntStr(InFile);
      { process rest of Z block & other blocks }
      SkipBlock := false;
      if not(eof(InputFiles[InFile])) and (CurrentZ[InFile]=MergeLayer) then begin
        Cmd := HeaderType;
        PrintHeaders;
      end;
      while not(eof(InputFiles[InFile])) and (CurrentZ[InFile]=MergeLayer) do begi
        repeat
          readln(InputFiles[InFile],Line);
          Line[length(Line) + 1] := #0;
          if copy(Line,1,1) = '!' then begin
            writeln(LayerFile,Line);
            writeln(RangeFile,Line);
          end;
        until copy(Line,1,1)<>'!';
{
  process slice block
}
        i := 0;
        temp := copy(Line,1,2);
        if (temp = 'Z ') or (temp = 'L ') then i := 1
        else if length(temp)=1 then i := pos(temp,'ZXYISHVABJCDEFGK');
        if i=0 then begin
          i := 1;
          while (i <= BlockMnemonicsCount) and
            ((copy(Line,1,length(BlockMnemonics[i])) <> BlockMnemonics[i])
              or not (Line[length(BlockMnemonics[i])+1] in [#0,' ']))
                do inc(i);
          if i > BlockMnemonicsCount then i := 0;
        end;
        if i > 0 then begin
          SkipBlock := false;
          c := FindStr(1,Line,' ');
          Cmd := copy(Line,1,c-1);
          if i=1 then begin    { handle Z block special }
```

```
            Zval := LongVal(copy(Line,c+1,9),code) + ZOffset[InFile];
            CurrentZ[InFile] := Zval;
          end else begin
            select := ',' + cmd + ',';
            if (pos(select,NoBlocks[InFile]) > 0) or
              ((length(OnlyBlocks[InFile]) > 0) and
                (pos(select,OnlyBlocks[InFile])=0)) then begin
              SkipBlock := true;
            end else PrintHeaders;
          end;
        end else if not SkipBlock then writeln(VectorFile,Line);
      end;  {while}
    end;  {for}
    Blk := '#BTM';
    MakeControl;
    LastLayer := MergeLayer;
    MergeLayer := 99999;
    for InFile := 1 to NumPartFiles do
      if not eof(InputFiles[InFile]) then
        if CurrentZ[InFile] < MergeLayer then MergeLayer := CurrentZ[InFile];
  until MergeLayer = 99999;
end;

procedure Update(FileName: String);
var
  i: Integer;
  St: String;
begin
  assign(UpdateFile,FileName);
  reset(UpdateFile);
  Seek(UpdateFile,UpdateIndex);
  St := WordStr(StartLayer);
  St := St + spc(5-length(St));
  for i:=1 to 5 do write(UpdateFile,St[i]);
  Seek(UpdateFile,UpdateIndex + 16);
  St := WordStr(EndLayer);
  St := St + spc(5-length(St));
  for i:=1 to 5 do write(UpdateFile,St[i]);
  Seek(UpdateFile,UpdateIndex + 16 + 17);
  St := WordStr(Layers);
  St := St + spc(5-length(St));
  for i:=1 to 5 do write(UpdateFile,St[i]);
  close(UpdateFile);
end;

{-------------------------------------------------------------------------------}

procedure MergeFiles;
begin
{ determine output file prefix }
  if OutFileName = '' then begin
    write('Output File Name Prefix [',FirstFileName,']: ');
    readln(OutFileName);
    if OutFileName = '' then OutFileName := FirstFileName;
    OutFileName := upper(OutFileName);
  end;

{ open up output files, existing files are overwritten }
  LayerFileName  := OutFileName + '.L';
  RangeFileName  := OutFileName + '.R';
  VectorFileName := OutFileName + '.V';
  assign(LayerFile,LayerFileName);
  rewrite(LayerFile);
  writeln(LayerFile,'!MERGE: -FILES ',MergeLine);
  writeln(LayerFIle,'!MERGE: -STARTLAYER XXXXX -ENDLAYER XXXXX -NUMLAYERS XXXXX');
  UpdateIndex := length(MergeLine) + 17 + 20;   { points to StartLayer value }
```

```
  assign(RangeFile,RangeFileName);
  rewrite(RangeFile);
  writeln(RangeFile,'!MERGE: -FILES ',MergeLine);
  writeln(RangeFile,'!MERGE: -STARTLAYER XXXXX -ENDLAYER XXXXX -NUMLAYERS XXXXX');

  assign(VectorFile,VectorFileName);
  rewrite(VectorFile);
  Layers := 0;
  FindFirstLayers;
  GetParameters;
  ReadBoxFile;

  window(StatusBoxLeft+1,StatusBoxTop+1,StatusBoxRight-1,StatusBoxBottom-1);
  ClrScr;
  window(1,1,80,25);
  SetUpStatusBox;
  gotoxy(StatusBoxLeft+2,StatusBoxTop+1);
  write('Different Z-Spacing Ranges:');
  window(StatusBoxLeft+2,StatusBoxTop+3,StatusBoxRight-2,StatusBoxBottom-3);
  ReadSlices;

  close(VectorFile);
  OutputRange;
  close(LayerFile);
  close(RangeFile);
  Update(LayerFileName);
  Update(RangeFileName);
  window(1,1,80,25);
  gotoxy(StatusBoxLeft+2,StatusBoxBottom-1);
  write(RangeCount,' range');
  if RangeCount>1 then write('s');
  write(', ',Layers,' layer');
  if Layers>1 then write('s');
  write(' processed.');
end;

{----------------------------------------------------------------------------------}

procedure CheckForOptions;
var
  i,oi,j: Integer;
  FileName: String;
begin
  FirstFileName := '';
  CmdLine := upper(CmdLine);
  RemoveDoubleSpaces(CmdLine);
  i := pos ('/OUTFILE',CmdLine);
  if i>0 then begin
    oi := i;
    inc(i,8);
    while (i<length(CmdLine)) and (CmdLine[i]=' ') do inc(i);
    j := FindStr(i,CmdLine,' /');
    OutFileName := copy(CmdLine,i,j-i);
    delete(CmdLine,oi,j-oi);
  end;
  i := pos('/RES',CmdLine);
  if i>0 then begin
    oi := i;
    inc(i,4);
    while (i<length(CmdLine)) and (CmdLine[i]=' ') do inc(i);
    j := FindStr(i,CmdLine,' /');
    val(copy(CmdLine,i,j-i),Resolution,code);
    delete(CmdLine,oi,j-oi);
  end;
  i := pos('/ZSPC',CmdLine);
  if i>0 then begin
```

```
    oi := i;
    inc(i,5);
    while (i<length(CmdLine)) and (CmdLine[i]=' ') do inc(i);
    j := FindStr(i,CmdLine,' /');
    val(copy(CmdLine,i,j-i),ZSpacing,code);
    delete(CmdLine,oi,j-oi);
  end;
  i := pos('/THICK',CmdLine);
  if i>0 then begin
    oi := i;
    inc(i,6);
    while (i<length(CmdLine)) and (CmdLine[i]=' ') do inc(i);
    j := FindStr(i,CmdLine,' /');
    val(copy(CmdLine,i,j-i),Thickness,code);
    delete(CmdLine,oi,j-oi);
  end;
  RemoveDoubleSpaces(CmdLine);
  MergeLine := CmdLine;

{ pick out slice file names and open them up }
  while CmdLine<>'' do begin
    i := pos(' ',CmdLine);
    if i=0 then begin
      FileName := CmdLine;
      CmdLine := '';
    end else begin
      FileName := copy(CmdLine,1,i-1);
      CmdLine  := copy(CmdLine,i+1,255);
    end;
    inc(NumPartFiles);
    i := pos('/Z',FileName);
    if i=0 then i := pos('/L',FileName);
    if i>0 then begin
      oi := i;
      inc(i,2);
      while (i<length(FileName)) and (FileName[i]=' ') do inc(i);
      j := FindStr(i,FileName,' /');
      val(copy(FileName,i,j-i),ZOffset[NumPartFiles],code);
      delete(FileName,oi,j-oi);
    end;
    i := pos('/N',FileName);
    if i>0 then begin
      oi := i;
      inc(i,2);
      while (i<length(FileName)) and (FileName[i]=' ') do inc(i);
      j := FindStr(i,FileName,'/');
      NoBlocks[NumPartFiles] := ','+copy(FileName,i,j-i)+',';
      delete(FileName,oi,j-oi);
    end;
    i := pos('/O',FileName);
    if i>0 then begin
      oi := i;
      inc(i,2);
      while (i<length(FileName)) and (FileName[i]=' ') do inc(i);
      j := FindStr(i,FileName,'/');
      OnlyBlocks[NumPartFiles] := ','+copy(FileName,i,j-i)+',';
      delete(FileName,oi,j-oi);
    end;
    if FirstFileName = '' then FirstFileName := FileName;
    i := pos('.',FileName);
    if i=0 then FileName := FileName + '.SLI';
    assign(InputFiles[NumPartFiles],FileName);
    {$I-}
    reset(InputFiles[NumPartFiles]);
    if IOresult<>0 then begin
      writeln('Can''t open file ',FileName);
```

```
      halt(1);
    end;
  end; {while}
  if NumPartFiles = 0 then halt(0);
end;

procedure ShowFiles(FileSpec: String);
var
  FileCount: Integer;
  DirInfo: SearchRec;
begin
  FileCount := 0;
  FindFirst(FileSpec,AnyFile,DirInfo);
  if DosError<>0 then writeln('- none -')
  else begin
    while DosError=0 do begin
      if FileCount>0 then write(spc(11-((whereX-1) mod 10+1)));
      inc(FileCount);
      write(copy(DirInfo.Name,1,pos('.',DirInfo.Name)-1));
      FindNext(DirInfo);
    end;
    writeln;
  end;
end;

procedure ProcessCommandLine;
begin
  ReadCommandLine(CmdLine);
  if CmdLine = '' then begin
    writeln('Directory Listing of Sliced Files:');
    writeln;
    ShowFiles('*.SLI');
    writeln;
    write('Slice File Names: ');
    readln(CmdLine);
    writeln;
  end;
  NumPartFiles := 0;
  CheckForOptions;
end;

procedure ReadBlockIdFile;
var
  BlockIdFile: text;
  BlockIdLine: string;
  index,Group: Integer;
  Block: String;
begin
  BlockMnemonicsCount := 0;
  {$I-}
  assign(BlockIdFile,BlockIdFileName);
  reset(BlockIdFile);
  if IOresult<>0 then begin
    assign(BlockIdFile,HomeDirectory+'\'+BlockIdFileName);
    reset(BlockIdFile);
    if IOresult<>0 then begin
      writeln('Can''t find Block Id file.');
      halt(2);
    end;
  end;
  {$I+}
  while not eof(BlockIdFile) do begin
    readln(BlockIdFile,BlockIdLine);
    if (length(BlockIdLine)>0) and (BlockIdLine[1]<>'!') then begin
      index := 1;
      UnitValShortInt(Group,BlockIdLine,index);
```

```
      UnitStr(Block,BlockIdLine,index);
      if Group=0 then begin
        inc(BlockMnemonicsCount);
        BlockMnemonics[BlockMnemonicsCount] := upper(Block);
      end;
    end;
  end;
  close(BlockIdFile);
end;

{ ----------------------------- MAIN PROGRAM -------------------------------- }


begin
  ExitProc := @ExitMerge;
  CheckBreak := true;
  FillChar(FirstVar,ofs(LastVar)-Ofs(FirstVar),#0);   { clear variables }
  ClrScr;
  SingleBar := many(#196,26);
  centerln('MERGE, Sliced Files Merger');
  centerln('3D Systems Laser Stereolithography System');
  centerln('Version '+VersionId+'             3D Systems, Inc.');
  centerln(SingleBar);

  writeln;
  writeln;
  OutFileName := '';
  ReadBlockIdFile;
  ProcessCommandLine;
  MergeFiles;
  QuietSystemError('Success.');
end.
```

```
{=============================================================================
   3D Systems Stereolithography System Software
 =============================================================================

  MENU.PAS
  SLA-1 Menu Software

 -----------------------------------------------------------------------------

  History:
  11/12/87  Ver 2.30  first Beta software release
  11/20/87  Ver 2.31  ENTER for Exit option fix
  11/23/87  Ver 2.32  pauses for Turbo Basic error messages
  11/24/87  Ver 2.33  converted from Turbo Basic to Turbo Pascal
                      SHELL's no longer eat up 64K or main memory
                      Consolidated Profiler & Calibrator
                      Added Materials Manager to Utility Menu
                      Added Change Directory to Dos Menu
                      Alt-F9 View Option History added
  12/02/87  Ver 2.34  fixed date format
  12/06/87  Ver 2.35  Using BEAM instead of CALIB and PROFILE
  12/12/87  Ver 2.40  resets Text Mode when returning from Shell
  12/16/87  Ver 2.41  clearing of screen for pause fixed
                      prevent double pause (esp for directory)
  12/17/87  Ver 2.42  revitalize cursor before running Shells
  12/24/87  Ver 2.43  better cursor on/off routines
                      'X' input at ExitSystem verify ignored
   1/08/88  Ver 2.50  TESTPART program access added
   1/25/88  Ver 2.60  version update only
   2/12/88  Ver 2.61  1900 + year in resetting system date

 ----------------------------------------------------------------------------- }

{$R-,S+,I+,D+,T-,F-,V+,B-,N-,L+ }
{$M 4096,0,0 }

program MenuProgram;
uses Crt,Dos;

type
  str10  = string[10];
  str16  = string[16];
  str40  = string[40];
  str80  = string[80];
  str100 = string[100];
  str255 = string[255];
  HistoryType = record
    Menu,Option: Byte;
    mon,day,hour,min: Byte;
  end;

var
  Fnkey,CmdChr,key,key2: Char;
  IOerr,CmdVal,ordkey: Integer;
  Row,Menu,Indent,IntervalHour,IntervalMin: Integer;
  Mon,Day,Year,Hour,Minu,Sec,WeekDay: Integer;
  code,i: Integer;
  PausedFlag,IntervalLock,ErrorFlag,NoInterval: Boolean;
  Line,CurrentDate,CurrentTime: str80;
  SingleBar,DoubleBar: str100;
  CurrentDir: str40;
  cmd: str16;
  regs: Registers;
  SystemFile,ErrorFile: text;
```

```
  MenuPos: array[1..3] of Integer;
  h,m: str10;
  OptionHistory: array[1..19] of HistoryType;
  StartHistory,EndHistory: Integer;

const
  MSDOS = $21;
  VersionId = '2.61';
  ComSpec = 'C:\COMMAND.COM';
  SystemFileName = 'C:\SLA1.SYS';
  ErrorFileName = 'C:\SYSTEM.ERR';
  sp80 = '
  DayOfWeek: String[21] = 'SunMonTueWedThuFriSat';
  Zel: array[1..12] of Integer = (1,4,3,6,1,4,6,2,5,0,3,5);
  MainExecs: array[1..8] of str10 =
    ('XFER','MERGE','GRAPH','PREPARE','SUPER','','','');
  UtilityExecs: array[1..8] of str10 =
    ('POWER','GOBEAM','ZSTAGE','MATERIAL','EDIT','TESTPART','','');
  DosExecs: array[1..8] of str10 =
    ('CHKDSK','','DIR/W','QD2','','','','');
  MenuMax: array[1..3] of Integer = (8,7,6);
  MenuColor: array[1..3] of Integer = (12,11,10);
  MaxHistory = 19;
  Cr = ^M;

procedure CursorOff;
begin
  with regs do begin
    AH := 3;
    BH := 0;
    Intr($10,regs);
    AH := 1;
    CH := CH or $20;
    Intr($10,regs);
  end;
end;

procedure CursorOn;
begin
  with regs do begin
    AH := 3;
    BH := 0;
    Intr($10,regs);
    AH := 1;
    CH := CH and $DF;
    Intr($10,regs);
  end;
end;

procedure ResetScreen;
  begin
    TextMode(C80);
    CursorOff;
  end;

function upper(text: str255): str255;
var
  i: Integer;
  temp: str255;
begin
  temp := text;
  for i := 1 to length(temp) do temp[i] := upcase(temp[i]);
  upper := temp;
end;

function many(Ch: Char;num: Integer): str80;
```

```
var
  temp: str80;
  i: Integer;
begin
  temp := '';
  for i:=1 to num do temp  := temp+Ch;
  many := temp;
end;

function spc(len: Integer): str255;
begin
  spc := copy(sp80,1,len);
end;

procedure beep;
begin
  sound(1000);
  delay(100);
  NoSound;
end;

function IntStr(num: Integer): str10;
var
  temp: str10;
begin
  if num>=0 then Str(num,temp) else Str(num+$8000,temp);
  IntStr := temp;
end;

procedure ReadCommandLine(var line: str80);
var
  i: Integer;
begin
  line := ParamStr(1);
  for i:=2 to ParamCount do
    line := line + ' ' + ParamStr(i);
end;

{
  Pad time element with left space if necessary
}

function PadSp(num: Integer): str10;
var
  temp: str10;
begin
  temp := IntStr(num);
  if num<10 then PadSp := ' ' + temp
    else PadSp := temp;
end;

{
  Pad time element with left zero if necessary
}

function LZero(num: Integer): str10;
var
  temp: str10;
begin
  temp := IntStr(num);
  if num<10 then LZero := '0' + temp
    else LZero := temp;
end;

{
  Compute day-of-week using Harry's modified Zeller Algorithm
```

```
}
function Zeller(month,day,year: Integer): Integer;
begin
  if month<3 then dec(year);
  Zeller := (Zel[month] + day + year + (year shr 2)) mod 7;
end;

{
  Read time directly from clock chip
  works only on ATs, 286s, 386s; does not work on standard PCs, XTs
}
procedure GetTime;
var
  good: Boolean;
begin
  good := false;
  while not good do begin
    port[$70] := $0A;     { wait for update to finish (then there's 244 us) }
    if (port[$71] and $80)=0 then begin
      port[$70] := $00;     { get seconds }
      Sec := port[$71];
      port[$70] := $0A;
      if (port[$71] and $80)=0 then begin
        port[$70] := $02;    { get minutes }
        Minu := port[$71];
        port[$70] := $0A;
        if (port[$71] and $80)=0 then begin
          port[$70] := $04;     { get hours }
          Hour := port[$71];
          port[$70] := $0A;
          if (port[$71] and $80)=0 then begin
            port[$70] := $07;     { get day }
            Day := port[$71];
            port[$70] := $0A;
            if (port[$71] and $80)=0 then begin
              port[$70] := $08;     { get month }
              Mon := port[$71];
              port[$70] := $0A;
              if (port[$71] and $80)=0 then begin
                port[$70] := $09;     { get year }
                Year := port[$71];
                port[$70] := $0A;
                if (port[$71] and $80)=0 then good := true;
              end;
            end;
          end;
        end;
      end;
    end;
  end;
  Sec  := (Sec  shr 4) * 10 + (Sec  and $0F);  { convert from BCD }
  Minu := (Minu shr 4) * 10 + (Minu and $0F);
  Hour := (Hour shr 4) * 10 + (Hour and $0F);
  Day  := (Day  shr 4) * 10 + (Day  and $0F);
  Mon  := (Mon  shr 4) * 10 + (Mon  and $0F);
  Year := (Year shr 4) * 10 + (Year and $0F);
  WeekDay := Zeller(Mon,Day,Year);
end;

{
  Get a time stamp consisting of the relative day and the current time
}
procedure GetTimeStamp;
var
  tdow,tday,tmon,tyear,tsec,tminu,thour: str10;
  AmPm: Char;
```

```
begin
  GetTime;
  tmon  := PadSp(Mon);
  tday  := LZero(Day);
  tyear := LZero(Year);
  tdow  := copy(DayOfWeek,Zeller(Mon,Day,Year)*3+1,3);
  CurrentDate := tdow+' '+tmon+'/'+tday+'/'+tyear;
  tsec  := LZero(Sec);
  tminu := LZero(Minu);
  if Hour=0 then begin
    thour := '12';
    AmPm := 'A';
  end else if Hour<12 then begin
    thour := PadSp(Hour);
    AmPm := 'A';
  end else if Hour=12 then begin
    thour := '12';
    AmPm := 'P';
  end else begin
    thour := PadSp(Hour-12);
    AmPm := 'P'
  end;
  CurrentTime := thour+':'+tminu+' '+AmPm+'M';
end;

{
  Reset Computer System's Date and Time from Hardware Clock
}
procedure SetSystemDateTime;
begin
  GetTime;
  SetDate(1900+Year,Mon,Day);
  SetTime(Hour,Minu,Sec,0);
end;

{
  Remove excess quote marks around string
}
function NoQuotes(Text: str80): str80;
var
  s,e: Integer;
begin
  s := 1;
  if (length(Text)>1) and (Text[1]=chr(34)) then s:=s+1;
  e := length(Text);
  if (Text[e]=chr(34)) and (e>s) then e:=e-1;
  NoQuotes := copy(Text,s,e-s+1);
end;

function InChildProcess: Boolean;
begin
  InChildProcess := (Mem[0:99 shl 2] and $80)>0;
end;

procedure SetChildProcess;
begin
  Mem[0:99 shl 2] := $80;
end;

procedure ClearChildProcess;
begin
  Mem[0:99 shl 2] := $00;
end;

procedure CheckForOptions(var line: str80);
var
```

```
  i: Integer;
begin
  line := upper(line);
  i := pos('/NOINTERVAL',line);  { check for /NOINTERVAL }
  if i>0 then begin
    NoInterval := true;
    delete(line,i,11);
  end;
end;

procedure Pause;
begin
  if not PausedFlag then begin
    gotoxy(1,25);
    write('Press Enter to Continue... ');
    readln(Input);
    PausedFlag := true;
  end;
end;

function Desc(menu,line: Integer): str80;
var
  index: Integer;
begin
  index := menu * 10 + line;
  case index of
    11: Desc := 'Transfer Files Between this Computer and Another over Ethernet';
    12: Desc := 'Merge Separately-Sliced Object Files Together';
    13: Desc := 'Graph an Object in either Faceted or Sliced form';
    14: Desc := 'Prepare to Make a Part and Set Up Various Parameters';
    15: Desc := 'Run the Part-making Supervisor Program';
    16: Desc := 'Go to the Utility Menu';
    17: Desc := 'Go to the Disk Operating System Menu';
    18: Desc := 'Exit Stereolithography System Completely';
    21: Desc := 'Control the Power-Up or Down Sequence of Laser Equipment';
    22: Desc := 'Laser Beam Profile and Calibration Operations';
    23: Desc := 'Move the Z-Stage Elevator Up and Down';
    24: Desc := 'View, Alter, and Add Data for Vat Materials';
    25: Desc := 'Enter the Editor to Modify the Contents of a File';
    26: Desc := 'Run the Test Part Utility Program';
    27: Desc := 'Return to the Main Menu';
    31: Desc := 'Show Hard Disk Statistics, including Free Space Remaining';
    32: Desc := 'Change to a Different File Directory';
    33: Desc := 'Show the Directory for the Current Directory';
    34: Desc := 'Enter the Quick-DOS Utility to Move Files and Change Directories'
    35: Desc := 'Enter a DOS Shell, Allowing You to Run Other Programs';
    36: Desc := 'Return to the Main Menu';
    else Desc := '';
  end;
end;

{------------------------------------------------------------------------------}

procedure DrawMain;
begin
  writeln('                                   MAIN MENU');
  TextColor(White);
  writeln;
  gotoxy(20,whereY);
  writeln(copy(SingleBar,1,40));
  writeln;
  gotoxy(Indent,whereY);
  writeln('1. Data Transfer');
  gotoxy(Indent,whereY);
  writeln('2. Merger');
  gotoxy(Indent,whereY);
```

```
  writeln('3. Grapher');
  gotoxy(Indent,whereY);
  writeln('4. Preparer');
  gotoxy(Indent,whereY);
  writeln('5. Supervisor');
  gotoxy(Indent,whereY);
  writeln('6. Utility Menu');
  gotoxy(Indent,whereY);
  writeln('7. DOS Menu');
  gotoxy(Indent,whereY);
  writeln('X. Exit');
end;

procedure DrawUtility;
begin
  writeln('                                  UTILITY MENU');
  TextColor(White);
  writeln;
  gotoxy(20,whereY);
  writeln(copy(SingleBar,1,40));
  writeln;
  gotoxy(Indent,whereY);
  writeln('1. Power Sequencer');
  gotoxy(Indent,whereY);
  writeln('2. Beam Analysis');
  gotoxy(Indent,whereY);
  writeln('3. Z-Stage Mover');
  gotoxy(Indent,whereY);
  writeln('4. Material Manager');
  gotoxy(Indent,whereY);
  writeln('5. Edit a File');
  gotoxy(Indent,whereY);
  writeln('6. Make Test Parts');
  gotoxy(Indent,whereY);
  writeln('X. Return to Main Menu');
end;

procedure DrawDos;
begin
  writeln('                                   DOS MENU');
  TextColor(White);
  writeln;
  gotoxy(20,whereY);
  writeln(copy(SingleBar,1,40));
  writeln;
  gotoxy(Indent,whereY);
  writeln('1. Disk Usage Stats');
  gotoxy(Indent,whereY);
  writeln('2. Change Directory');
  gotoxy(Indent,whereY);
  writeln('3. Directory Listing');
  gotoxy(Indent,whereY);
  writeln('4. Quick DOS Utility');
  gotoxy(Indent,whereY);
  writeln('5. DOS Shell');
  gotoxy(Indent,whereY);
  writeln('X. Return to Main Menu');
end;

procedure DrawMenuScreen;
begin
  SetSystemDateTime;
  ClrScr;
  TextColor(White);
  writeln(DoubleBar);
  writeln('   SLA-1             3D SYSTEMS STEREOLITHOGRAPHY SYSTEM
```

```
    + VersionId);
  writeln(DoubleBar);
  writeln;
  TextColor(MenuColor[Menu]);
  case Menu of
    1: DrawMain;
    2: DrawUtility;
    3: DrawDos;
  end;
  writeln;
  gotoxy(20,whereY);
  writeln(copy(SingleBar,1,40));
  Row := whereY;
  writeln;
  writeln('        Select an Option either by Using the Arrows and Pressing Enter')
  write  ('                   or by Pressing the Corresponding Number');
end;

function ErrorOnScreen: Boolean;
var
  BaseAddr: Word;
  ScanError: Boolean;
  i: Integer;
begin
  if LastMode=7 then BaseAddr := $B000
    else BaseAddr := $B800;
  i := 0;
  ScanError := true;
  while (i<4000) and ScanError do begin
   if upcase(chr(Mem[BaseAddr:i]))='E' then
      if (upcase(chr(Mem[BaseAddr:i+2]))='R') and
        (upcase(chr(Mem[BaseAddr:i+4]))='R') then ScanError := false;
    inc(i,2);
  end;
  ErrorOnScreen := not ScanError;
end;

{
  SHELL program, check for existence of error
  If error, pause and wait for Enter before returning to menu
}
procedure Shell(Prog,Options: str80);
begin
  PausedFlag := false;
  SetSystemDateTime;
  CursorOn;
  Exec(Prog,Options);
  CursorOff;
  {$I-}
  assign(ErrorFile,ErrorFileName);
  reset(ErrorFile);
  {$I+}
  ErrorFlag := (IOresult=0);
  if ErrorFlag then begin
    close(ErrorFile);
    Pause;
    {$I-}
    erase(ErrorFile);
    {$I+}
  end else if ErrorOnScreen then Pause;
end;
{---------------------------------------------------------------------------}

{
  Option History routines
```

```
}
procedure AddHistory(text: str10);
begin
  OptionHistory[EndHistory].Menu := Menu;
  OptionHistory[EndHistory].Option := CmdVal;
  OptionHistory[EndHistory].mon := Mon;
  OptionHistory[EndHistory].day := Day;
  OptionHistory[EndHistory].hour := Hour;
  OptionHistory[EndHistory].min := Minu;
  inc(EndHistory);
  if EndHistory > MaxHistory then EndHistory := 1;
  if StartHistory = EndHistory then begin
    inc(StartHistory);
    if StartHistory > MaxHistory then StartHistory := 1;
  end;
end;

procedure ShowHistory;
begin
  ClrScr;
  writeln('Menu System Recent Option History:');
  writeln;
  writeln('Menu  Option  Name              Date   Time');
  writeln('----  ------  --------------    -----  -----');
  i := StartHistory;
  while i<>EndHistory do with OptionHistory[i] do begin
    write('  ',Menu,'      ',Option,'     ');
    case Menu of
      1: cmd := MainExecs[Option];
      2: cmd := UtilityExecs[Option];
      3: cmd := DosExecs[Option];
    end;
    write(cmd,spc(16-length(cmd)));
    writeln(PadSp(mon),'/',LZero(day),'  ',PadSp(hour),':',LZero(min));
    inc(i);
    if i > MaxHistory then i := 1;
  end;
  writeln;
  write('Press any key to continue... ');
  key := ReadKey;
  DrawMenuScreen;
end;

{
  Show Menu Item Description
}
procedure ShowDescription;
begin
  gotoxy(Indent-2,8+MenuPos[Menu]);
  TextColor(Yellow);
  write(chr(16));
  gotoxy(1,24);
  write(spc(79));
  gotoxy((78-length(Desc(Menu,MenuPos[Menu]))) div 2,24);
  TextColor(Black);
  TextBackground(MenuColor[Menu]);
  write(' ',Desc(Menu,MenuPos[Menu]),' ');
  TextColor(White);
  TextBackground(Black);
end;

{
  Execute INTERVAL Program
}
procedure DoInterval;
begin
```

```
  if IntervalLock = false then begin
    IntervalLock := true;
    Shell(ComSpec,'/C INTERVAL');
    DrawMenuScreen;
    ShowDescription;
  end;
end;

{
  Get Input for Menu, handle scrolling
}
procedure HelpAsk;
var
  LineChange,Leave: Boolean;
begin
  Leave := false;
  LineChange := true;
  repeat
    if LineChange then ShowDescription;
    repeat
      GetTimeStamp;
      GetDir(0,CurrentDir);
      gotoxy(2,4);
      write(CurrentDir);
      gotoxy(67,4);
      write(CurrentDate);
      gotoxy(71,5);
      write(CurrentTime);
      if IntervalHour = -1 then begin
        if IntervalMin = Minu then DoInterval     { handle xx:mm interval }
        else IntervalLock := false;               { free interval lock }
      end else begin
        if IntervalHour = Hour then begin         { handle hh:mm interval }
          if (IntervalMin = -1) or (IntervalMin = Minu) then DoInterval
          else IntervalLock := false;
        end;
      end;
    until keypressed;
    LineChange := false;
    CmdChr := upcase(ReadKey);
    if CmdChr = chr(0) then FnKey := ReadKey
      else FnKey := chr(0);
    if CmdChr in [#0,'1'..'9','X',Cr] then begin
      LineChange := true;
      gotoxy(Indent-2,8+MenuPos[Menu]);
      write(' ');
      if (CmdChr=Cr) and (MenuPos[Menu]<MenuMax[Menu]) then
        CmdChr := chr(ord('0')+MenuPos[Menu]);
      if (CmdChr='X') or ((CmdChr=Cr) and (MenuPos[Menu]=MenuMax[Menu])) then
        CmdChr := chr(ord('0')+MenuMax[Menu]);
      case FnKey of
        'P': if MenuPos[Menu] >= MenuMax[Menu] then MenuPos[Menu] := 1
               else inc(MenuPos[Menu]);
        'H': if MenuPos[Menu] <= 1 then MenuPos[Menu] := MenuMax[Menu]
               else dec(MenuPos[Menu]);
        'p': ShowHistory;
      end;
      val(CmdChr,CmdVal,code);
      if (CmdVal>0) and (CmdVal<=MenuMax[Menu]) then begin
        Leave := true;
        MenuPos[Menu] := CmdVal;
      end;
    end;
  until Leave;
  case Menu of
    1: cmd := MainExecs[CmdVal];
```

```
    2: cmd := UtilityExecs[CmdVal];
    3: cmd := DosExecs[CmdVal];
  end;
  if length(cmd)>0 then AddHistory(cmd);
end;

{-------------------------------- UTILITY STUFF ---------------------------------}

procedure UtilityMenu;
begin
  repeat
    Menu := 2;
    DrawMenuScreen;
    HelpAsk;
    ClrScr;
    if CmdVal<7 then begin
      Shell(ComSpec,'/C '+UtilityExecs[CmdVal]);
      ResetScreen;
    end;
  until CmdVal = MenuMax[2];
end;

{---------------------------------- DOS STUFF ---------------------------------}

procedure DiskUsage;
begin
  writeln('        DISK USAGE STATISTICS');
  writeln(copy(SingleBar,1,34));
  writeln;
  Shell(ComSpec,'/C '+DosExecs[1]);
  Pause;
end;

procedure DirList;
begin
  Shell(ComSpec,'/C '+DosExecs[3]);
  Pause;
end;

procedure ChangeDir;
var
  NewDir: str40;
begin
  CursorOn;
  ClrScr;
  writeln('Current directory is ',CurrentDir);
  writeln;
  writeln;
  writeln('You can specify a new directory using the following rules:');
  writeln;
  writeln('If you wish to move to a subdirectory, just type in the');
  writeln('subdirectory''s name.');
  writeln;
  writeln('If you want to move up a directory level, just enter .. (two periods).'
  writeln;
  writeln('If you are going to specify a completely new directory path, start');
  writeln('your entry with a \ (backslash).');
  writeln;
  writeln;
  write('Enter new directory specification: ');
  readln(NewDir);
  {$I-}
  ChDir(NewDir);
  if IOresult<>0 then begin
    writeln;
    writeln('Can''t find directory.');
```

```
    writeln;
    write('Press any key to continue... ');
    key := ReadKey;
  end;
  {$I+}
  CursorOff;
end;

procedure QDos;
begin
  Shell(ComSpec,'/C '+DosExecs[4]);
end;

procedure DosShell;
begin
  CursorOn;
  ClrScr;
  SetChildProcess;
  writeln('To return to the Dos Menu, use the EXIT command.');
  writeln(copy(SingleBar,1,48));
  Exec(ComSpec,'');
  ResetScreen;
  ClearChildProcess;
end;

procedure DosMenu;
begin
  repeat
    Menu := 3;
    DrawMenuScreen;
    HelpAsk;
    ClrScr;
    case CmdVal of
      1: DiskUsage;
      2: ChangeDir;
      3: DirList;
      4: QDos;
      5: DosShell;
    end;
  until CmdVal = MenuMax[3];
end;

{--------------------------------- MAIN STUFF ---------------------------------}

procedure ExitSystem;
begin
  CursorOn;
  ClrScr;
  writeln('Dos Menu Option 5 allows you to issue DOS commands and run other');
  writeln('programs, then return to the Menu System using the EXIT command.');
  writeln;
  writeln('This option will cause you to leave the Stereolithography System');
  write  ('completely.  Are you sure you want to do this? ');
  repeat
    key := upcase(ReadKey);
  until key<>'X';
  writeln(key);
  if key='Y' then begin
    SetSystemDateTime;
    Halt(0);
  end;
  CursorOff;
end;

procedure MainMenu;
begin
```

```
  ResetScreen;
  repeat
    Menu := 1;
    DrawMenuScreen;
    HelpAsk;
    ClrScr;
    if CmdVal=MenuMax[1] then ExitSystem
    else if CmdVal<6 then begin
      Shell(ComSpec,'/C '+MainExecs[CmdVal]);
      ResetScreen;
    end else if CmdVal=8 then UtilityMenu
    else if CmdVal=7 then DosMenu;
  until 0=1;  { forever }
end;

{ - - - - - - }

label
  NoMoreSystemFile;

begin
  CheckBreak := false;
  if InChildProcess then begin
    writeln('You are currently in a DOS Shell.');
    writeln('Please use EXIT to return to the Menu System.');
    halt(2);
  end;
  Indent := (80-20) div 2;
  NoInterval := false;
  IntervalHour := -1;
  IntervalMin  := -1;
  for i:=1 to 3 do
    MenuPos[i] := 1;
  StartHistory := 1;
  EndHistory := 1;

  SingleBar := many(#196,79);
  DoubleBar := many(#205,79);

  SetSystemDateTime;
  {$I-}
  assign(ErrorFile,ErrorFileName);
  erase(ErrorFile);
  IOerr := IOresult;
  {$I+}

{
  read SLA-1 System File
}

  {$I-}
  assign(SystemFile,SystemFileName);
  reset(SystemFile);
  {$I+}
  if IOresult<>0 then begin
    writeln('No system file.  Stopping.');
    halt(1);
  end;
  repeat
    readln(SystemFile,Line);
  until eof(SystemFile) or ((length(Line)>0) and (Line[1]<>'!'));
  if not eof(SystemFile) then begin
    Line := NoQuotes(Line);
    CheckForOptions(Line);
    i := 1;
    while (i<2) and not eof(SystemFile) do begin
```

```
      Line := '';
      while (length(Line)=0) or (Line[1]='!') do begin
        if eof(SystemFile) then goto NoMoreSystemFile;
        readln(SystemFile,Line);
      end;
      Line := upper(Line);
      writeln('line=',line);
      case i of
        1: begin
             h := copy(Line,1,2);
             m := copy(Line,4,2);
             if h[1]='X' then IntervalHour := -1
               else val(h,IntervalHour,code);
             if m[1]='X' then IntervalMin  := -1
               else val(m,IntervalMin,code);
           end;
      end;
      inc(i);
    end;
  end;
NoMoreSystemFile:
  close(SystemFile);
  ReadCommandLine(Line);
  CheckForOptions(Line);
  MainMenu;
end.
```

```
'=============================================================================
'  3D Systems Stereolithography System Software
'=============================================================================
'
'  PREPARE.BAS
'  SLA-1 Prepare for Part-Making Software
'
'-----------------------------------------------------------------------------
'
'  History:
'  11/12/87  Ver 2.30  first Beta software release
'  11/13/87  Ver 2.31  new material data input fix
'                      range manager and CalcSp fixes
'  12/02/87  Ver 2.32  removed Material Input capability
'  12/04/87  Ver 2.33  programmable block updating
'                      BLOCK.ID file support
'  12/14/87  Ver 2.40  Material linewidths (min & max) support
'  12/17/87  Ver 2.41  no last material file condition handled
'  12/22/87  Ver 2.43  no blanking scan before report
'   1/06/88  Ver 2.50  update depth when changing step period value
'                      no overflow on step period input
'   1/11/88  Ver 2.51  BLOCK.ID looked for in \3DSYS too
'   1/20/88  Ver 2.54  paging occurs for more than 10 blocks
'                      support of new *.R Range Control File
'                      added /SCAN option to force block scan
'   1/25/88  Ver 2.60  Calc SP placed under Range Manager
'                      new Vector Manager (old Layer Edit)
'                      Range File and Layer File command update separated out
'                      PREPARE.PRM support
'                      different SS (Step Size) support for skins
'                      part file statistics
'   2/03/88  -         old range files identified
'                      operator may proceed to build new range file
'   2/08/88  -         different layer block cmds bug removed
'   2/12/88  Ver 2.61  Comments array indexing starts at 1 not 0
'                      added Block Scan will wipe out commands warning query
'   2/26/88  Ver 2.62  default UpdateCmds group is not 1 instead of 0
'
'-----------------------------------------------------------------------------

  DIM ZStart&[100],ZEnd&[100],ZSpace%[100],CureDepth%[100]
  DIM BlockStart%[100],BlockEnd%[100]
  DIM BlockType$[3000],BlockCmd$[3000]
  DIM TBType$[30],TBCmd$[30]
  DIM SP[20],LH[20],WMIN[20],WMAX[20]
  DIM BlockGroupCount%[10],BlockGroupId$[10,40]
  DIM Comments$[100]

  MaxInt = 32768
  MaxUInt = 65535
  TRUE = -1
  FALSE = 0
  ScanFlag% = FALSE
  VersionId$ = "2.62"
  Title$ = "Prepare V" + VersionId$
  HomeDir$ = "C:\3DSYS\"
  ParamFile$ = "PREPARE.PRM"

  ON ERROR GOTO TryHome
  OPEN ParamFile$ FOR INPUT AS #1
  GOTO ReadParams
TryHome:
  RESUME TryHome2
TryHome2:
```

```
  ON ERROR GOTO NoParams
  OPEN HomeDir$ + ParamFile$ FOR INPUT AS #1
  GOTO ReadParams
NoParams:
  NormStepSize$ = "SS 2"
  FillStepSize$ = "SS 16"
  RESUME PrepareInit

'
' read PREPARE's parameter file
'
ReadParams:
  LINE INPUT #1,A$
  IF LEN(A$)=0 OR LEFT$(A$,1)="!" THEN ReadParams
  I% = INSTR(2,A$,CHR$(34))
  IF I% > 0 THEN A$ = LEFT$(A$,I%)
  CmdLine$ = FN NoQuotes$(A$)
  GOSUB CheckForOptions
  FOR I%=1 TO 2   ' change this when altering PREPARE.PRM format
ReadNextLine:
    LINE INPUT #1,A$
    IF LEN(A$)=0 OR LEFT$(A$,1)="!" THEN ReadNextLine
    V=VAL(A$)
    V$ = LEFT$(A$,1)
    IF V$=CHR$(34) THEN
      V% = INSTR(MID$(A$,2),CHR$(34)) + 1
      S$ = MID$(A$,2,V%-2)
    ELSE
      S$ = ""
    END IF
    IF       I%=1 THEN NormStepSize$ = S$
    ELSE IF I%=2 THEN FillStepSize$ = S$
  NEXT I%
  CLOSE #1

PrepareInit:
  SingleBar$ = STRING$(45,196)
  RangeBar$ = ""
  FOR I%=1 TO 8
    READ S%
    IF I%>1 THEN RangeBar$ = RangeBar$ + CHR$(249)
    RangeBar$ = RangeBar$ + STRING$(S%,196)
  NEXT I%
  DATA 7,9,7,9,11,11,11,7
  BlockBar$ = ""
  FOR I%=1 TO 3
    READ S%
    IF I%>1 THEN BlockBar$ = BlockBar$ + CHR$(249)
    BlockBar$ = BlockBar$ + STRING$(S%,196)
  NEXT I%
  DATA 8,10,50
  LayerBar$ = ""
  FOR I%=1 TO 5
    READ S%
    IF I%>1 THEN LayerBar$ = LayerBar$ + CHR$(249)
    LayerBar$ = LayerBar$ + STRING$(S%,196)
  NEXT I%
  DATA 7,9,7,9,7
  SpBar$ = "
  FOR I%=1 TO 8
    READ S%
    IF I%>1 THEN SpBar$ = SpBar$ + CHR$(249)
    SpBar$ = SpBar$ + STRING$(S%,196)
  NEXT I%
  DATA 7,9,7,9,7,8,7,7
  LayerTempFileName$ = "LAYER.TMP"
```

```
  PowerFile$              = "POWER.LST"
  LastMaterialFile$       = "MATERIAL.LST"
  BlockIdFileName$        = "BLOCK.ID"
  MinSp& = 8
  MaxSp& = 4000

  COLOR 15
Restart:
  CLS
  PRINT SingleBar$
  PRINT "  PREPARE, Part-Making Preparer"
  PRINT "  3D Systems Laser Stereolithography System"
  PRINT "  Version ";VersionId$;"                3D Systems, Inc."
  PRINT SingleBar$
  PRINT
  PRINT

  BlockGroups% = 0
  ON ERROR GOTO TryHome3
  OPEN BlockIdFileName$ FOR INPUT AS #1
  GOTO ReadBlockId
TryHome3:
  ON ERROR GOTO NoBlockIdFile
  OPEN "C:\3DSYS\"+BlockIdFileName$ FOR INPUT AS #1
  RESUME ReadBlockId
ReadBlockId:
  ON ERROR GOTO 0
  IF EOF(1) THEN ProcessCmdLine
  LINE INPUT #1,A$
  IF LEN(A$)=0 OR LEFT$(A$,1)="!" THEN ReadBlockId
  Index% = 1
  CALL UnitValShortInt(Group%,A$,Index%)
  CALL UnitStr(Block$,A$,Index%)
  IF Group%<0 OR Group%>10 THEN
    CALL SystemError("Invalid block group number in Block Id File "_
      +BlockIdFileName$)
    END
  END IF
  IF Group% > BlockGroups% THEN BlockGroups% = Group%
  BlockGroupId$[Group%,BlockGroupCount%[Group%]] = UCASE$(Block$)
  INCR BlockGroupCount%[Group%]
  GOTO ReadBlockId

ProcessCmdLine:
  CLOSE #1
  CmdLine$ = UCASE$(Command$)
  GOSUB CheckForOptions
  IF LEN(CmdLine$)=0 THEN
    PRINT "Part files in this directory:"
    ON ERROR GOTO NoPartFiles
    FILES "*.V"
    GOTO AskForPartFile
NoPartFiles:
    PRINT "- none -"
    RESUME AskForPartFile
AskForPartFile:
    PRINT
    INPUT "Part Prefix: ",CmdLine$
    PRINT
  END IF
  CmdLine$ = UCASE$(CmdLine$)
  GOSUB CheckForOptions
  I% = INSTR(CmdLine$,".")
  IF I%>0 THEN
    PartName$ = LEFT$(CmdLine$,I%-1)
  ELSE
```

```
    PartName$ = CmdLine$
  END IF
  IF LEN(PartName$)=0 THEN END
  GOTO StartPrepare

CheckForOptions:
  I% = INSTR(CmdLine$,"/SCAN")
  IF I%>0 THEN
    ForcedScan% = TRUE
    CmdLine$ = LEFT$(CmdLine$,I%-1)+MID$(CmdLine$,I%+5)
  END IF
  RETURN

'----------------------------------------------------------------------------

StartPrepare:
  PartRangeFileName$  = PartName$ + ".R"
  PartLayerFileName$  = PartName$ + ".L"
  PartVectorFileName$ = PartName$ + ".V"
  BackupFileName$ = PartName$ + ".BAK"
  ON ERROR GOTO NewPart
  OPEN PartRangeFileName$ FOR INPUT AS #10
  ON ERROR GOTO 0
  I% = 0
CheckOld:
  IF EOF(10) THEN HaveOldRangeFile
  LINE INPUT #10,L$
  L1$ = UCASE$(LEFT$(L$,1))
  IF L1$="" OR L1$="!" OR L1$="*" THEN CheckOld
  IF L1$ >= "A" AND L1$ <= "Z" THEN HaveNewRangeFile
  INCR I%
  IF I% < 30 THEN CheckOld

HaveOldRangeFile:
  PRINT
  PRINT "File ";PartRangeFileName$;" is an older Range File with a";
  PRINT " different format."
  PRINT "Do you wish to continue and build a new Range File from the Layer"
  PRINT "File ";PartLayerFileName$;"? ";
  INPUT "",Q$
  IF UCASE$(LEFT$(Q$,1))="Y" THEN
    PRINT
    GOTO BuildRangeTable
  ELSE
    STOP
  END IF

HaveNewRangeFile:
  CLOSE #10
  OPEN PartRangeFileName$ FOR INPUT AS #10
  I% = 0
  GotBlocksFromRangeFile% = FALSE
  CommentCount% = 0
RangeRead:
  ON ERROR GOTO 0
  LINE INPUT #10,L$
  R$=UCASE$(LEFT$(L$,1))
  IF R$="*" THEN
    Index% = 2
    WHILE MID$(L$,Index%,1)=" "
      Index% = Index% + 1
    WEND
    CALL UnitVal(SliceRes,L$,Index%)
    CALL UnitVal(ZSpacing,L$,Index%)
    CALL UnitVal(Thickness,L$,Index%)
    GOTO RangeRead
```

```
  END IF
  IF LEN(L$)=0 OR R$="!" THEN
    IF CommentCount% <= 100 THEN
      INCR CommentCount%
      Comments$[CommentCount%] = L$
    END IF
    GOTO RangeRead
  END IF
  RangeIndex% = 1
  IF R$>="0" AND R$<="9" THEN
    INCR I%
    CALL UnitValInt(ZStart&[I%],L$,RangeIndex%)
    CALL UnitValInt(ZEnd&  [I%],L$,RangeIndex%)
    CALL UnitValShortInt(ZSpace%[I%],   L$,RangeIndex%)
    CALL UnitValShortInt(CureDepth%[I%],L$,RangeIndex%)
    BlockStart%[I%] = BlockEnd%
  ELSE
    GotBlocksFromRangeFile% = TRUE
    CALL UnitStr(BlockType$[BlockEnd%],L$,RangeIndex%)
    T$ = FN NoSp$(MID$(L$,RangeIndex%))
    J%=INSTR(T$,"!")
    IF J%=0 THEN J%=LEN(T$)+1
    BlockCmd$[BlockEnd%] = FN NoSp$(LEFT$(T$,J%-1))
    BlockEnd%[I%] = BlockEnd%
    INCR BlockEnd%
  END IF
  IF NOT EOF(10) THEN RangeRead
  RangeCount% = I%
  CLOSE #10
'  backwards (pre V2.55) compatibility
  IF ForcedScan% OR NOT GotBlocksFromRangeFile% THEN GOSUB BlockScan
  GOTO MainMenu

NewPart:
  RESUME BuildRangeTable

BuildRangeTable:
  ON ERROR GOTO NoLayerFile
  OPEN PartLayerFileName$ FOR INPUT AS #3
  ON ERROR GOTO 0
  PRINT "Reading ";PartLayerFileName$;"..."

GetToControlTop:
  IF EOF(3) THEN
    CALL SystemError("Error:  "+PartLayerFileName$+" empty.")
    END
  END IF
  LINE INPUT #3,CONTROL$
  C$=LEFT$(CONTROL$,1)
  IF C$="!" THEN GetToControlTop
  IF C$="*" THEN
    Index% = 2
    WHILE MID$(CONTROL$,Index%,1)=" "
      Index% = Index% + 1
    WEND
    CALL UnitVal(SliceRes,CONTROL$,Index%)
    CALL UnitVal(ZSpacing,CONTROL$,Index%)
    CALL UnitVal(Thickness,CONTROL$,Index%)
    GOTO GetToControlTop
  END IF

  RangeCount% = 0
  BlockIndex% = 0
  TBIndex% = 0
  First% = TRUE
  Last%  = FALSE
```

```
  GOTO AlreadyHaveBlock

ReadBlocks:
  IF EOF(3) THEN
    Last% = TRUE
    GOTO CompareLayer
  END IF
  LINE INPUT #3,CONTROL$
AlreadyHaveBlock:
  IF LEN(CONTROL$)=0 OR LEFT$(CONTROL$,1)="!" THEN ReadBlocks
'
' parse out layer number, name, command, and comment
'
  ControlIndex% = 1
  CALL UnitValInt(ControlLayer&,CONTROL$,ControlIndex%)
  CALL UnitStr(ControlType$,CONTROL$,ControlIndex%)
  T$ = FN NoSp$(MID$(CONTROL$,ControlIndex%))
  I%=INSTR(T$,"!")
  IF I%=0 THEN I%=LEN(T$)+1
  ControlCmd$ = FN NoSp$(LEFT$(T$,I%-1))

'
'  store blocks in temporary array, loop until different layer
'
StoreBlocks:
  IF ControlType$="#CA" THEN ReadBlocks    ' skip critical areas
  IF First% THEN    ' handle first layer
    First% = FALSE
    RangeStep% = ZSpacing
    Layer& = ControlLayer&
    GOSUB StartNewRange
    GOTO StoreBlock
  END IF
  IF ControlLayer& <> Layer& THEN EvaluateLayer
StoreBlock:
  TBType$[TBIndex%] = ControlType$
  TBCmd$[TBIndex%] = ControlCmd$
  INCR TBIndex%
  GOTO ReadBlocks

'
'  start a new layer range if the Z-spacing changes
'
EvaluateLayer:
  IF NeedStep% THEN
    NeedStep% = FALSE
    RangeStep% = ControlLayer& - Layer&
    ZSpace%[RangeCount%] = RangeStep%
  END IF
  TwoLayersBack& = OldLayer&
  OldLayer& = Layer&
  Layer& = ControlLayer&
  CD% = ControlLayer& - OldLayer&
  IF CD%<>RangeStep% THEN
    GOSUB StartNewRange
    GOTO UpdateRange
  END IF
'
'  compare current layer's block commands against those of current range
'  if there are two different commands for a particular layer,
'    a new layer range must be started
'
CompareLayer:
  FOR I%=0 TO TBIndex%-1    ' check each block of current layer
    FOR J%=BlockStart%[RangeCount%] TO BlockEnd%[RangeCount%]
      IF TBType$[I%]=BlockType$[J%] THEN
```

```
        IF TBCmd$[I%]<>BlockCmd$[J%] THEN
          GOSUB StartNewRange
          ZEnd&  [RangeCount%-1] = TwoLayersBack&
          ZStart&[RangeCount%]   = OldLayer&
          ZEnd&  [RangeCount%]   = OldLayer&
          GOTO UpdateRange
        ELSE
          GOTO NextCurrentBlock
        END IF
      END IF
    NEXT J%
NextCurrentBlock:
  NEXT I%
'
'  layer checks out, add it to current range
'
UpdateRange:
  ZEnd&[RangeCount%] = ControlLayer&
'
'  add any new blocks to current range's block table
'
  FOR I%=0 TO TBIndex%-1  ' check each block of current layer
    FOR J%=BlockStart%[RangeCount%] TO BlockEnd%[RangeCount%]
      IF TBType$[I%]=BlockType$[J%] THEN NextCurrentBlock2
    NEXT J%
    BlockType$[BlockIndex%] = TBType$[I%]
    BlockCmd$[BlockIndex%] = TBCmd$[I%]
    INCR BlockIndex%
NextCurrentBlock2:
  NEXT I%
  BlockEnd%[RangeCount%] = BlockIndex%-1
'
'  set up the new layer
'
  TBIndex% = 0
  IF Last% THEN LayerCleanUp
  GOTO StoreBlock

'
'  start a new range of layers
'
StartNewRange:
  NeedStep% = TRUE
  INCR RangeCount%
  ZStart&    [RangeCount%] = ControlLayer&
  ZEnd&      [RangeCount%] = ControlLayer&
  RangeStep% = ControlLayer& - Layer&
  BlockStart%[RangeCount%] = BlockIndex%
  BlockEnd%  [RangeCount%] = BlockIndex%
  TBIndex% = 0
  RETURN

LayerCleanUp:
  CLOSE #3
  FOR I%=1 TO RangeCount%
    CureDepth%[I%] = ZSpace%[I%]
  NEXT I%
  GOTO MainMenu

NoBlockIdFile:
  CALL SystemError("Can't open Block Id File "+BlockIdFileName$)
  END

BadBlockIdFile:
  CALL SystemError("Bad format for Block Id File "+BlockIdFileName$)
  END
```

```
NoLayerFile:
  CALL SystemError("Can't open Layer Control File "+PartLayerFileName$)
  END

NoRangeFile:
  CALL SystemError("Can't open Range File "+PartRangeFileName$)
  END

RangeFileProb:
  CALL SystemError("Problem with Range File "+PartRangeFileName$)
  END

NoVectorFile:
  CALL SystemError("Can't open Vector File "+PartVectorFileName$)
  END

NoBackupFile:
  CALL SystemError("Can't open Backup File "+BackupFileName$)
  END

NoTempFile:
  CALL SystemError("Can't open Temporary File "+LayerTempFileName$)
  END

'-----------------------------------------------------------------------
'
'  show PREPARE's Main Menu
'

MainMenu:
  CLS
  I$ = STRING$(29," ")
  MainBar$=STRING$(25,CHR$(196))
  T$ = "MAIN MENU"
  GOSUB CenterLine
  T$ = Title$
  GOSUB CenterLine
  T$ = "working on part "+PartName$
  GOSUB CenterLine
  PRINT
  PRINT
  T$ = MainBar$
  GOSUB CenterLine
  PRINT
  PRINT
  PRINT I$;"1. Parameters Manager"
  PRINT I$;"2. Range Manager"
  PRINT I$;"3. Layer Manager"
  PRINT I$;"4. Vector Manager"
  PRINT I$;"5. Statistics"
  PRINT I$;"X. Exit"
  PRINT
  PRINT
  T$ = MainBar$
  GOSUB CenterLine
  PRINT
  PRINT
  PRINT I$;"Which option? ";
 LoopMain:
  C$ = UCASE$(INKEY$)
  IF LEN(C$)=0 THEN LoopMain
  IF C$="X" THEN END
  IF C$="1" THEN ParamsManager
  IF C$="2" THEN RangeManager
  IF C$="3" THEN LayerManager
  IF C$="4" THEN VectorManager
```

```
  IF C$="5" THEN Statistics
  GOTO LoopMain

'==========================================================================
'
'  Parameters Manager:
'
'
ParamsManager:
  CLS
  IF RangeCount% = 0 THEN
    PRINT "No layer ranges!"
  ELSE
    T$ = "PARAMETERS MANAGER"
    GOSUB CenterLine
    T$ = Title$
    GOSUB CenterLine
    T$ = "working on part "+PartName$
    GOSUB CenterLine
    PRINT
  END IF
  INPUT I$
  GOTO MainMenu

'==========================================================================
'
'  Range Manager:
'
'  show layer range table
'  a layer range is conditioned on the following:
'    all layers must have the same z-spacing from the last layer
'    they must have the same command strings for each type of block
'  allow comments (stored in first layer only)
'
RangeManager:
  CLS
  IF RangeCount% = 0 THEN
    PRINT "No layer ranges!"
  ELSE
    T$ = "RANGE MANAGER"
    GOSUB CenterLine
    T$ = Title$
    GOSUB CenterLine
    T$ = "working on file "+PartRangeFileName$
    GOSUB CenterLine
    PRINT
    PRINT RangeBar$
    PRINT " Range   Z-Start   Z-End   Z-Space   CAD-Start    CAD-End    CAD-Space
    PRINT RangeBar$
    FOR I%=1 TO RangeCount%
      PRINT USING " ### ";I%;
      PRINT USING "     ##### ";ZStart&[I%];
      PRINT USING "   #####";ZEnd&[I%];
      PRINT USING "    ##### ";ZSpace%[I%];
      PRINT USING "   #####.###";ZStart&[I%]/SliceRes;
      PRINT USING "   #####.###";ZEnd&[I%]/SliceRes;
      PRINT USING "   #####.###";ZSpace%[I%]/SliceRes;
      IF ZSpace%[I%]>0 THEN
        Z% = (ZEnd&[I%]-ZStart&[I%])/ZSpace%[I%]
      ELSE
        Z% = 0
      END IF
      PRINT USING "    #####";Z%+1
    NEXT I%
```

```
    PRINT RangeBar$
  END IF
  PRINT
  PRINT "   Press:"
  PRINT "    A to add range       D to delete range      E to edit range"
  PRINT "    S to scan blocks     R to make a report     C to calc SP's"
  PRINT "    X to exit            Q to quit program      U to update disk"
LoopRange:
  C$=UCASE$(INKEY$)
  IF LEN(C$)=0 THEN LoopRange
  IF C$="A" THEN AddRange
  IF C$="D" THEN DeleteRange
  IF C$="E" THEN EditRange
  IF C$="S" THEN ScanBlocks
  IF C$="R" THEN MakeReport
  IF C$="C" THEN CalcSp
  IF C$="U" THEN UpdateRangeFile
  IF C$="X" THEN MainMenu
  IF C$="Q" THEN END
  GOTO LoopRange

'-----------------------------------------------------------------------------

AddRange:
  PRINT
  PRINT
  PRINT "Adding Range"
  PRINT "Press Z to Enter Z-Layer or C to enter CAD Number: ";
LoopAdd:
  C$=UCASE$(INKEY$)
  IF LEN(C$)=0 THEN LoopAdd
  PRINT C$
  PRINT "Enter break point, in ";
  IF C$="C" THEN PRINT "CAD"; ELSE PRINT "Z-Layer";
  INPUT " units: ",RangeBreak
  IF LEN(C$)=0 THEN RangeManager
  IF C$="C" THEN
    RangeBreak& = RangeBreak*SliceRes
  ELSE
    RangeBreak& = RangeBreak
  END IF
  IF RangeBreak& <= ZStart&[1] OR RangeBreak& > ZEnd&[RangeCount%]_
    THEN RangeManager
  FOR I%=1 TO RangeCount%
    IF RangeBreak&=ZStart&[I%] THEN RangeManager
    IF RangeBreak&<ZStart&[I%] THEN StartFound
  NEXT I%
StartFound:
  DECR I%
  ZNew& = ZStart&[I%]
  DO                                ' calc new range end
    OldZNew& = ZNew&
    ZNew& = ZNew& + ZSpace%[I%]
  LOOP UNTIL ZNew&>=RangeBreak&
  IF ZNew&<>RangeBreak& THEN RangeManager   ' invalid layer
  FOR J%=RangeCount% TO I% STEP -1
    ZStart&     [J%+1] = ZStart&     [J%]
    ZEnd&       [J%+1] = ZEnd&       [J%]
    ZSpace%     [J%+1] = ZSpace%     [J%]
    CureDepth%  [J%+1] = CureDepth%  [J%]
    BlockStart%[J%+1] = BlockStart%[J%]
    BlockEnd%   [J%+1] = BlockEnd%   [J%]
  NEXT J%
  INCR RangeCount%
  ZStart&[I%+1] = RangeBreak&
  ZNew& = ZStart&[I%]
```

```
InBufEnd                                : Integer;
InBufPtr                                : Integer;
CurrFilePos                             : LongInt;
StartLinePos                            : LongInt;
EndOfFile                               : Boolean;
FileError                               : Boolean;
ErrLine                                 : String;
ch                                      : Char;
rc                                      : Integer;
iw,jw                                   : Word;
TempInt                                 : Integer;
TempByte                                : Byte;
TempWord                                : Word;
TempBoolean                             : Boolean;
TempReal                                : Real;
TempLong                                : LongInt;
TempStr                                 : String;
TempChar                                : Char;
InputLine                               : String;
MonoDisplay                             : Boolean;
GraphDriver, GraphMode                  : Integer;
SizeX,SizeY                             : Integer;
AspectRatio                             : Real;
GraphScale                              : Real;
GraphCenterX,GraphCenterY               : Word;
GrOffsetX,GrOffsetY,GrOffsetZ           : Real;

{ Triangle FIle Global Vars }
TriangleFile                            : File;
TriangleFilename                        : String;     { Filename of Triangle File  }
TriangleFiletype                        : Byte;       { File Type of Input File }
TrianglePtr                             : ^DynamicTRILongIntArray; { Pointers to Tri
TriangleAxisValue                       : ^DynamicTRIRealArray;    { Z Values of eac
TriangleNormal                          : Array [1..3] of Real;
TriangleVertex                          : Array [1..3,1..3] of Real;
TriangleAttrib                          : Word;
TriangleTotal                           : LongInt;
TriangleFileMin                         : Array [1..3] of Real;
TriangleFileMax                         : Array [1..3] of Real;
TriangleSelected                        : LongInt;
TriangleSelectStart                     : Real;
TriangleSelectEnd                       : Real;
TriangleSelectMin                       : Array [1..3] of Real;
TriangleSelectMax                       : Array [1..3] of Real;
TriangleWindowingFile                   : Boolean;
TriangleAngle                           : Array [1..3] of Byte;
TriangleAxis                            : Byte;
Gr3DMat                                 : Array [0..2,0..2] of Real;
Total_Triangles                         : LongInt;

{ Slice File Global Vars }
SliceFile                               : File;
SliceFilename                           : String;     { Filename of Slice File  }
SliceFileXMin,SliceFileXMax             : Word;       { File Max and Min valu   }
SliceFileYMin,SliceFileYMax             : Word;
SliceLastLayer                          : Integer;       { Pointer to last layer   }
SliceLayerValue                         : ^DynamicSLWordArray;     { Layer Values }
SliceLayerPtr                           : ^DynamicSLLongIntArray; { Pointer to Layer
SliceLayerBlocks                        : ^DynamicSLWordArray;     { Layer Blocks }
SliceLayerXMin,SliceLayerXMax           : ^DynamicSLWordArray;     { Layer Max and Mir
SliceLayerYMin,SliceLayerYMax           : ^DynamicSLWordArray;
SliceLayer                              : Word;       { Current Layer }
SliceWindowingFile                      : Boolean;
SliceOutputBlocks                       : Word;
Total_Layers                            : LongInt;
```

```
{$F+} procedure MainExit; {$F-}
  begin
    {$I-} Close(SliceFile); Close(TriangleFile); {$I+}
    RestoreCrtMode;
    TextBackground(Black);
    TextColor(White);
    ClrScr;
    ExitProc:=ExitSave;
  end;

procedure ProgramError(ErrorLine : String);
  { Print Program Error and exits program }
  begin
    RestoreCrtMode;
    TextBackground(Black);
    TextColor(White);
    ClrScr;
    writeln('*** SLAGRAPH ERROR: ',ErrorLine,' ***');
    ch:=ReadKey;
    Halt(1);
  end;

procedure ReAllocate(ch : Char;Alloc : LongInt);
  { Allocates the array space to sugessted number }
  var
    MemoryAvail : LongInt;
  begin
    { Free Heap }
    Release(HeapTop);
    SliceFilename   := '';
    TriangleFilename:= '';
    MemoryAvail := MemAvail - 32768;

    if ch='S' then begin
      { Don't allow more than machine can handle }
      if Alloc>MAX_LAYERS then Total_Layers:=MAX_LAYERS
      else Total_Layers:=Alloc;
      { Make sure you can allocate that many alone. If not, set maximum }
      if Total_Layers*LAYER_SIZE>MemoryAvail then Total_Layers:=Round(MemoryAvail/
      { Given number of Layers. fill rest of memory with Triangles }
      Total_Triangles:=Round((MemoryAvail-Total_Layers*LAYER_SIZE)/TRIANGLE_SIZE);
      if Total_Triangles>MAX_TRIANGLES then Total_Triangles:=MAX_TRIANGLES;
    end else begin
      { Don't allow more than machine can handle }
      if Alloc>MAX_TRIANGLES then Total_Triangles:=MAX_TRIANGLES
      else Total_Triangles:=Alloc;
      { Make sure you can allocate that many alone. If not, set maximum }
      if Total_Triangles*TRIANGLE_SIZE>MemoryAvail then Total_Triangles:=Round(Mem
      { Given number of Triangles, fill rest of memory with Layers }
      Total_Layers:=Round((MemoryAvail-Total_Triangles*TRIANGLE_SIZE)/LAYER_SIZE);
      if Total_Layers>MAX_LAYERS then Total_Layers:=MAX_LAYERS;
    end;
    GetMem(SliceLayerValue,Total_Layers*2);
    GetMem(SliceLayerPtr,Total_Layers*4);
    GetMem(SliceLayerBlocks,Total_Layers*2);
    GetMem(SliceLayerXMin,Total_Layers*2);
    GetMem(SliceLayerXMax,Total_Layers*2);
    GetMem(SliceLayerYMin,Total_Layers*2);
    GetMem(SliceLayerYMax,Total_Layers*2);
    GetMem(TrianglePtr,Total_Triangles*4);
    GetMem(TriangleAxisValue,Total_Triangles*6);
    Dec(Total_Triangles);
    Dec(Total_Layers);
  end;
```

```
  DO                                       ' calc new range end
    OldZNew& = ZNew&
    ZNew& = ZNew& + ZSpace%[I%]
  LOOP UNTIL ZNew&>=RangeBreak&
  ZEnd&[I%] = OldZNew&
  BlockStart%[I%] = BlockIndex%
  FOR J%=BlockStart%[I%+1] TO BlockEnd%[I%+1]
    BlockType$[BlockIndex%] = BlockType$[J%]
    BlockCmd$ [BlockIndex%] = BlockCmd$ [J%]
    INCR BlockIndex%
  NEXT J%

  BlockEnd%  [I%] = BlockIndex%-1
  GOTO RangeManager

'-----------------------------------------------------------------------------

DeleteRange:
  PRINT
  PRINT
  INPUT "Delete what range: ",Range%
  IF Range%<2 OR Range%>RangeCount%-1 THEN RangeManager
  IF ZSpace%[Range%] = ZSpace%[Range%-1] AND _
     ZSpace%[Range%] = ZSpace%[Range%+1] THEN
    PRINT "Consolidate with range #";FN NoSp$(STR$(Range%-1));
    PRINT " or #";FN NoSp$(STR$(Range%+1));": ";
    INPUT "",C$
    IF LEFT$(C$,1)="#" THEN C$=MID$(C$,2)
    C% = VAL(C$)
    IF C% = Range%-1 THEN C$="U"_
      ELSE IF C%=Range%+1 THEN C$="D"_
        ELSE RangeManager
  ELSE
    IF ZSpace%[Range%] = ZSpace%[Range%-1] THEN C$="U" ELSE C$="D"
  END IF
  I% = Range%
  OldStart& = ZStart&[I%]
  OldEnd& = ZEnd&[I%]
  FOR J%=BlockStart%[I%] TO BlockEnd%[I%]
    BlockType$[BlockIndex%] = "***"    ' deleted
  NEXT J%
  FOR J%=I% TO RangeCount%
    ZStart&     [J%] = ZStart&     [J%+1]
    ZEnd&       [J%] = ZEnd&       [J%+1]
    ZSpace%     [J%] = ZSpace%     [J%+1]
    CureDepth%  [J%] = CureDepth%  [J%+1]
    BlockStart%[J%] = BlockStart%[J%+1]
    BlockEnd%  [J%] = BlockEnd%  [J%+1]
  NEXT J%
  DECR RangeCount%
  IF C$="D" THEN
    ZStart&[I%] = OldStart&
  ELSE
    ZEnd&[I%-1] = OldEnd&
  END IF
  GOTO RangeManager

'-----------------------------------------------------------------------------

EditRange:
  PRINT
  PRINT
  INPUT "Edit what range? ",Range%
  IF Range%<1 OR Range%>RangeCount% THEN RangeManager
  BlockBase% = BlockStart%[Range%]
  BlockCount% = BlockEnd%[Range%] - BlockStart%[Range%] + 1
```

```
ShowBlocks:
  CLS
  T$ = "Layer Range Blocks"
  GOSUB CenterLine
  T$ = "working on file "+PartLayerFileName$
  GOSUB CenterLine
  PRINT
  PRINT "   Range #";Range%
  PRINT "   Z-Levels:   ";
  PRINT USING "FROM     ##### TO     ##### BY     #####";_
   ZStart&[Range%],ZEnd&[Range%],ZSpace%[Range%]
  PRINT "   CAD Units:  ";
  PRINT USING "FROM #####.### TO #####.### BY #####.###";_
   ZStart&[Range%]/SliceRes,ZEnd&[Range%]/SliceRes,_
   ZSpace%[Range%]/SliceRes
  PRINT
  PRINT "    Block#   Block Id    Block Command"
  PRINT "   ";BlockBar$
  IF BlockBase%+9 < BlockEnd%[Range%] THEN
    BlockTo% = BlockBase%+9
  ELSE
    BlockTo% = BlockEnd%[Range%]
  END IF
  FOR I%=BlockBase% TO BlockTo%
    PRINT USING "      ##    ";I%-BlockStart%[Range%]+1;
    PRINT "  ";BlockType$[I%];SPC(12-LEN(BlockType$[I%]));
    PRINT BlockCmd$[I%]
  NEXT I%
  PRINT "   ";BlockBar$
  IF BlockBase%+9 < BlockEnd%[Range%] THEN PRINT "   --- MORE BLOCKS ---"
  IF BlockBase% > BlockStart%[Range%] THEN PRINT "   Enter B to go back.";
  IF BlockBase%+9 < BlockEnd%[Range%] THEN PRINT "   Enter F to go forward.";
  PRINT
  PRINT "   Enter number of block to edit, just Return to stop: ";
  v% = CSRLIN
  h% = POS
BlockAsk:
  LOCATE v%,h%
  PRINT "                ";
  LOCATE v%,h%
  INPUT "",Block$
  B$ = UCASE$(LEFT$(Block$,1))
  IF B$="B" THEN
    DECR BlockBase%,10
    IF BlockBase% < BlockStart%[Range%] THEN BlockBase% = BlockStart%[Range%]
    GOTO ShowBlocks
  END IF
  IF B$="F" THEN
    IF BlockBase%+10 <= BlockEnd%[Range%] THEN INCR BlockBase%,10
    GOTO ShowBlocks
  END IF
  IF LEN(Block$)=0 THEN RangeManager
  Block% = VAL(Block$)
  IF Block%<1 OR Block%>BlockCount% THEN
    PRINT "   Invalid block number    ";
    GOTO BlockAsk
  END IF
  Index% = BlockStart%[Range%]+Block%-1
  PRINT "   Enter commands for ";BlockType$[Index%];
  LINE INPUT ": ",Cmd$
  IF LEN(FN NoSp$(Cmd$))=0 THEN
    Cmd$ = ""
  ELSE
    IF LEFT$ (Cmd$,1)<>CHR$(34) THEN Cmd$=CHR$(34)+Cmd$
    IF RIGHT$(Cmd$,1)<>CHR$(34) THEN Cmd$=CMD$+CHR$(34)
  END IF
```

```
  BlockCmd$[Index%] = UCASE$(Cmd$)
  GOTO ShowBlocks

'---------------------------------------------------------------------------------

ScanBlocks:
  PRINT
  PRINT
  PRINT "Rescanning will wipe out any existing commands.  Continue? ";
  INPUT "",A$
  IF UCASE$(LEFT$(A$,1))="Y" THEN GOSUB BlockScan
  GOTO RangeManager

BlockScan:
  ON ERROR GOTO NoLayerFile
  OPEN PartLayerFileName$ FOR INPUT AS #3
  ON ERROR GOTO 0
  PRINT "Scanning ";PartLayerFileName$;"..."
  BlockIndex% = 0
  IF RangeCount%>0 THEN
    R%=1
    BlockStart%[R%] = BlockIndex%
    BlockEnd%[R%] = BlockIndex%-1

ScanReadBlocks:
    IF EOF(3) THEN ScanStartNewRange
    LINE INPUT #3,CONTROL$
ScanAlreadyHaveBlock:
    T$ = LEFT$(CONTROL$,1)
    IF LEN(CONTROL$)=0 OR T$="!" OR T$="*" THEN ScanReadBlocks
'
'  parse out layer number, block name
'
    ControlIndex% = 1
    CALL UnitValInt(ControlLayer&,CONTROL$,ControlIndex%)
    CALL UnitStr(ControlType$,CONTROL$,ControlIndex%)
    T$ = FN NoSp$(MID$(CONTROL$,ControlIndex%))
    I% = INSTR(T$,"!")
    IF I%=0 THEN I%=LEN(T$)+1
    ControlCmd$ = FN NoSp$(LEFT$(T$,I%-1))

    IF ControlType$="#CA" THEN ScanReadBlocks    ' skip critical areas
    IF ControlLayer& < ZStart&[R%] THEN ScanReadBlocks
    IF ControlLayer& > ZEnd&[R%] THEN ScanStartNewRange
'
'  add unique blocks to current range's block table
'
    FOR J%=BlockStart%[R%] TO BlockEnd%[R%]
      IF ControlType$=BlockType$[J%] THEN ScanReadBlocks
    NEXT J%
    BlockType$[BlockIndex%] = ControlType$
    BlockCmd$[BlockIndex%] = ControlCmd$
    BlockEnd%[R%] = BlockIndex%
    INCR BlockIndex%
    GOTO ScanReadBlocks
'
'  set up the new layer
'
ScanStartNewRange:
    INCR R%
    IF R%<=RangeCount% THEN
      BlockStart%[R%] = BlockIndex%
      BlockEnd%[R%] = BlockIndex%-1
      GOTO ScanAlreadyHaveBlock
    END IF
  END IF
```

```
  CLOSE #3
  RETURN
'------------------------------------------------------------------------

MakeReport:
  PRINT
  PRINT
  PRINT "Press V to view report on screen, or P to print on printer: ";
LoopReport:
  C$=UCASE$(INKEY$)
  IF LEN(C$)=0 THEN LoopReport
  IF C$="V" THEN ViewReport
  IF C$="P" THEN PrintReport
  GOTO RangeManager

ViewReport:
  CLS
  T$ = " PREPARE Report for "+PartLayerFileName$
  T$ = T$ + STRING$(59-LEN(T$)," ") + DATE$+"  "+TIME$
  FOR I%=1% TO RangeCount%
    CLS
    PRINT T$
    PRINT
    PRINT " Range   Z-Start   Z-End   Z-Space   CAD-Start   CAD-End   CAD-Space
    PRINT USING " ### ";I%;
    PRINT USING "     ##### ";ZStart&[I%];
    PRINT USING "   #####";ZEnd&[I%];
    PRINT USING "    ##### ";ZSpace%[I%];
    PRINT USING "   #####.###";ZStart&[I%]/SliceRes;
    PRINT USING "   #####.###";ZEnd&[I%]/SliceRes;
    PRINT USING "   #####.###";ZSpace%[I%]/SliceRes;
    PRINT USING "   #####";(ZEnd&[I%]-ZStart&[I%])/ZSpace%[I%]+1
    PRINT "    ---------------------------------------------------------------
    BlockCount% = 1
    FOR J%=BlockStart%[I%] TO BlockEnd%[I%]
      PRINT "           Block";BlockCount%;
      PRINT "  Type ";BlockType$[J%];SPC(6-LEN(BlockType$[J%]));
      IF LEN(BlockCmd$[J%]) THEN PRINT "   Commands: ";BlockCmd$[J%];
      PRINT
      INCR BlockCount%
    NEXT J%
    PRINT "-----------------------------------------------------------------------
    PRINT
    INPUT "Press Enter to continue...",A$
  NEXT I%
  GOTO RangeManager

PrintReport:
  ON ERROR GOTO PrinterNotReady
  LPRINT
  LPRINT
  T$ = " PREPARE Report for "+PartLayerFileName$
  LPRINT T$ + STRING$(59-LEN(T$)," ") + DATE$;"  ";TIME$
  LPRINT
  LPRINT " Range   Z-Start   Z-End   Z-Space   CAD-Start   CAD-End   CAD-Space
  FOR I%=1% TO RangeCount%
    LPRINT USING " ### ";I%;
    LPRINT USING "     ##### ";ZStart&[I%];
    LPRINT USING "   #####";ZEnd&[I%];
    LPRINT USING "    ##### ";ZSpace%[I%];
    LPRINT USING "   #####.###";ZStart&[I%]/SliceRes;
    LPRINT USING "   #####.###";ZEnd&[I%]/SliceRes;
    LPRINT USING "   #####.###";ZSpace%[I%]/SliceRes;
    LPRINT USING "   #####";(ZEnd&[I%]-ZStart&[I%])/ZSpace%[I%]+1
    LPRINT "    -------------------------------------------------------
```

```
    BlockCount% = 1
    FOR J%=BlockStart%[I%] TO BlockEnd%[I%]
      LPRINT "            Block";BlockCount%;
      LPRINT "  Type ";BlockType$[J%];SPC(6-LEN(BlockType$[J%]));
      IF LEN(BlockCmd$[J%]) THEN LPRINT " Commands: ";BlockCmd$[J%];
      LPRINT
      INCR BlockCount%
    NEXT J%
    LPRINT "----------------------------------------------------------------------------"
  NEXT I%
  LPRINT CHR$(12);
  GOTO RangeManager

PrinterNotReady:
  PRINT
  PRINT "Printer not ready.  Press P to try again, or Q to quit: ";
PrintNRLoop:
  DO
    C$ = UCASE$(INKEY$)
  LOOP UNTIL LEN(C$)>0
  IF C$="P" THEN RESUME
  IF C$="Q" THEN RESUME RangeManager
  GOTO PrintNRLoop

'------------------------------------------------------------------------------

UpdateRangeFile:
  PRINT
  PRINT

  ON ERROR GOTO RangeFileProb
  OPEN PartRangeFileName$ FOR OUTPUT AS #10
  PRINT "Updating ";PartRangeFileName$;"..."
  FOR I%=1 TO CommentCount%
    PRINT #10,Comments$[I%]
  NEXT I%
  PRINT #10,"* ";
  WRITE #10,SliceRes,ZSpacing,Thickness
  FOR I%=1% TO RangeCount%
    WRITE #10,ZStart&[I%],ZEnd&[I%],ZSpace%[I%],CureDepth%[I%]
    FOR J%=BlockStart%[I%] TO BlockEnd%[I%]
      PRINT #10,BlockType$[J%];
      IF LEN(BlockCmd$[J%])>0 THEN PRINT #10,",";Quote$;BlockCmd$[J%];Quote$;
      PRINT #10,""
    NEXT J%
  NEXT I%
  CLOSE #10
  GOTO RangeManager


'==============================================================================
'
'  Layer Manager
'  - allows editing of individual layers
'           listing of layers having specified blocks
'
'

LayerManager:
  CLS
  IF RangeCount% = 0 THEN
    PRINT "No layer ranges!"
  ELSE
    T$ = "LAYER MANAGER"
    GOSUB CenterLine
    T$ = Title$
    GOSUB CenterLine
```

```
    T$ = "working on file "+PartLayerFileName$
    GOSUB CenterLine
    Indent$ = STRING$(18," ")
    PRINT
    PRINT Indent$;LayerBar$
    PRINT Indent$;" Range   Z-Start   Z-End   Z-Space   Count"
    PRINT Indent$;LayerBar$
    FOR I%=1 TO RangeCount%
      PRINT Indent$;
      PRINT USING " ### ";I%;
      PRINT USING "      ##### ";ZStart&[I%];
      PRINT USING "    #####";ZEnd&[I%];
      PRINT USING "     ##### ";ZSpace%[I%];
      IF ZSpace%[I%]>0 THEN
        Z% = (ZEnd&[I%]-ZStart&[I%])/ZSpace%[I%]
      ELSE
        Z% = 0
      END IF
      PRINT USING "    #####";Z%+1
    NEXT I%
    PRINT Indent$;LayerBar$
  END IF
  PRINT
  PRINT "   Press:"
  PRINT "    F to find blocks      E to edit Layer File     U to update disk"
  PRINT "    X to exit             Q to quit program"
LoopLayer:
  C$=UCASE$(INKEY$)
  IF LEN(C$)=0 THEN LoopLayer
  IF C$="F" THEN FindBlocks
  IF C$="E" THEN EditLayer
  IF C$="U" THEN UpdateLayerFile
  IF C$="X" THEN MainMenu
  IF C$="Q" THEN END
  GOTO LoopLayer

'------------------------------------------------------------------------

FindBlocks:
  PRINT
  PRINT
  INPUT "Find what blocks (separate by spaces)? ",B$
  IF LEN(B$)=0 THEN LayerManager
  TBIndex% = 0
  WHILE LEN(B$)>0
    I% = INSTR(B$," ")
    IF I%=0 THEN I%=LEN(B$)+1
    TBType$[TBIndex%] = UCASE$(LEFT$(B$,I%-1))
    INCR TBIndex%
    B$ = MID$(B$,I%+1)
  WEND
  PRINT "Look through what range of layers?  Enter ALL, or enter number of the sinc
  PRINT "range, or enter Z-Layer start,stop: ";
  LINE INPUT "",Z$
  IF LEN(Z$)=0 THEN LayerManager
  IF LEFT$(UCASE$(Z$),1)="A" THEN
    MinLayer& = 0
    MaxLayer& = 99999
  ELSE
    I% = INSTR(Z$,",")
    IF I% THEN
      MinLayer& = VAL(LEFT$(Z$,I%-1))
      MaxLayer& = VAL(MID$(Z$,I%+1))
    ELSE
      IF LEFT$(Z$,1)="#" THEN Z$=MID$(Z$,2)
      J% = VAL(Z$)
```

```
      MinLayer& = ZStart&[J%]
      MaxLayer& = ZEnd&[J%]
    END IF
  END IF

FindStart:
  ON ERROR GOTO NoLayerFile
  OPEN PartLayerFileName$ FOR INPUT AS #3
  ON ERROR GOTO 0
  PRINT "Searching ";PartLayerFileName$;"..."

FindLoop:
  IF EOF(3) THEN FindDone
  LINE INPUT #3,CONTROL$
  L$ = LEFT$(CONTROL$,1)
  IF LEN(CONTROL$)=0 OR L$="*" OR L$="!" THEN FindLoop
  ControlIndex% = 1
  CALL UnitValInt(ControlLayer&,CONTROL$,ControlIndex%)
  CALL UnitStr(ControlType$,CONTROL$,ControlIndex%)
  IF ControlLayer& < MinLayer& OR ControlLayer& > MaxLayer& THEN FindLoop
  FOR I%=0 TO TBIndex%-1
    IF ControlType$=TBType$[I%] THEN
      PRINT TBType$[I%];" block found on layer";ControlLayer&
      GOTO FindLoop
    END IF
  NEXT I%
  GOTO FindLoop

FindDone:
  CLOSE #3
  PRINT
  INPUT "Press Enter to continue... ",A$
  GOTO LayerManager

'-------------------------------------------------------------------------------

EditLayer:
  SHELL "EDIT "+PartLayerFileName$
  GOTO LayerManager

'-------------------------------------------------------------------------------

UpdateLayerFile:
  PRINT
  PRINT
  PRINT "About to update Layer File ";PartLayerFileName$;
  INPUT "  Okay? ",A$
  IF A$="" OR UCASE$(LEFT$(A$,1))<>"Y" THEN LayerManager
  ON ERROR GOTO NoBackup
  KILL BackupFileName$
  GOTO UpdateStart
NoBackup:
  RESUME UpdateStart

RenameError:
  PRINT "Error trying to rename ";PartLayerFileName$
  GotWarning% = TRUE
NoLayerControl:
  RESUME UpdateDone

UpdateStart:
  ON ERROR GOTO NoLayerControl
  NAME PartLayerFileName$ AS BackupFileName$
  ON ERROR GOTO NoBackupFile
  OPEN BackupFileName$ FOR INPUT AS #3
  ON ERROR GOTO NoLayerFile
```

```
  OPEN PartLayerFileName$ FOR OUTPUT AS #4
  ON ERROR GOTO 0
  PRINT "Updating ";PartLayerFileName$;"..."
  GotWarning% = FALSE

UpdateLoop:
  IF EOF(3) THEN UpdateDone
  LINE INPUT #3,CONTROL$
  L$ = LEFT$(CONTROL$,1)
  IF LEN(CONTROL$)=0 OR L$="*" OR L$="!" THEN
    PRINT #4,CONTROL$
    GOTO UpdateLoop
  END IF
  ControlIndex% = 1
  CALL UnitValInt(ControlLayer&,CONTROL$,ControlIndex%)
  CALL UnitStr(ControlType$,CONTROL$,ControlIndex%)
  T$ = FN NoSp$(MID$(CONTROL$,ControlIndex%))
  I%=INSTR(T$,"!")
  IF I%=0 THEN I%=LEN(T$)+1
  ControlCmd$ = FN NoSp$(LEFT$(T$,I%-1))
  ControlComment$ = MID$(T$,I%)

UpdateBlock:
  IF ControlType$="#CA" THEN
    PRINT #4,CONTROL$
    GOTO UpdateLoop
  END IF
  FOR I%=1 TO RangeCount%
    IF ControlLayer& < ZStart&[I%] THEN UpdLayer
  NEXT I%
  IF ControlLayer& <= ZEnd&[I%-1] THEN UpdLayer
  PRINT "Warning:  Layer";ControlLayer&;"not accounted for in table."
BadUpdate:
  GotWarning% = TRUE
  PRINT #4,CONTROL$
  GOTO UpdateLoop

UpdLayer:
  DECR I%
  FOR J%=BlockStart%[I%] TO BlockEnd%[I%]
    IF BlockType$[J%]=ControlType$ THEN UpdBlock
  NEXT J%
  PRINT "Warning:  Layer";ControlLayer&;"Block ";ControlType$;_
    " not accounted for in table."
  GOTO BadUpdate

UpdBlock:
  PRINT #4,FN NoSp$(STR$(ControlLayer&));",";ControlType$;
  IF LEN(BlockCmd$[J%])>0 THEN PRINT #4,",";BlockCmd$[J%];
  IF LEN(ControlComment$) THEN PRINT #4,"        ";ControlComment$;
  PRINT #4,""
  GOTO UpdateLoop

UpdateDone:
  ON ERROR GOTO 0
  CLOSE #3
  CLOSE #4
  IF GotWarning% THEN
    INPUT "Press Enter to continue... ",A$
  END IF
  GOTO LayerManager

'=============================================================================

  Vector Manager
```

```
'  - allows editing of individual vectors
'
'
VectorManager:
  CLS
  IF RangeCount% = 0 THEN
    PRINT "No layer ranges!"
  ELSE
    T$ = "VECTOR  MANAGER"
    GOSUB CenterLine
    T$ = Title$
    GOSUB CenterLine
    T$ = "working on file "+PartVectorFileName$
    GOSUB CenterLine
    Indent$ = STRING$(18," ")
    PRINT
    PRINT Indent$;LayerBar$
    PRINT Indent$;" Range   Z-Start   Z-End   Z-Space   Count"
    PRINT Indent$;LayerBar$
    FOR I%=1 TO RangeCount%
      PRINT Indent$;
      PRINT USING " ###,";I%;
      PRINT USING "     ##### ";ZStart&[I%];
      PRINT USING "   #####";ZEnd&[I%];
      PRINT USING "    ##### ";ZSpace%[I%];
      IF ZSpace%[I%]>0 THEN
        Z% = (ZEnd&[I%]-ZStart&[I%])/ZSpace%[I%]
      ELSE
        Z% = 0
      END IF
      PRINT USING "   #####";Z%+1
    NEXT I%
    PRINT Indent$;LayerBar$
  END IF
  PRINT
  PRINT "   Press:"
  PRINT "     E to edit Vector File"
  PRINT "     X to exit                    Q to quit program"
LoopVector:
  C$=UCASE$(INKEY$)
  IF LEN(C$)=0 THEN LoopVector
  IF C$="E" THEN EditVector
  IF C$="X" THEN MainMenu
  IF C$="Q" THEN END
  GOTO LoopVector

'-----------------------------------------------------------------------------

ditVector:
  PRINT
  PRINT
  INPUT "Edit starting at what Z-layer? ",L$
  L$ = FN NoSp$(L$)
  IF LEN(L$)=0 THEN VectorManager
  PRINT "Reading file, please wait...";
  ON ERROR GOTO NoVectorFile
  OPEN PartVectorFileName$ FOR INPUT AS #4
  ON ERROR GOTO NoBackupFile
  OPEN LayerTempFileName$ FOR OUTPUT AS #5
  StartLineCount& = 0
'
'  search for layer
'
EditVectorSearch:
  IF EOF(4) THEN EditVectorNotFound
  LINE INPUT #4,A$
```

```
  INCR StartLineCount&
  IF LEFT$(A$,1)="L" THEN
    T1$ = LEFT$(A$,1)
    T2$ = MID$(A$,2,1)
    T4ON$ = MID$(A$,4,9)
    IF T1$="L" AND (T2$>="0") AND (T2$<="9") THEN
      IF T4ON$=L$ THEN EditVectorSetup
      IF VAL(T4ON$)>VAL(L$) THEN EditVectorNotFound
    END IF
  END IF
  GOTO EditVectorSearch
'
'  setup for edit, max file size is 50K
'
EditVectorSetup:
  PRINT #5,A$
  CharCount& = LEN(A$)+2
  EndLineCount& = StartLineCount&
  WHILE CharCount&<50000 AND NOT EOF(4)
    LINE INPUT #4,A$
    INCR EndLineCount&
    PRINT #5,A$
    INCR CharCount&,LEN(A$)+2
  WEND
  CLOSE #4
  CLOSE #5
  SHELL "EDIT "+LayerTempFileName$
  CLS
  LOCATE 12,1
  PRINT "Update ";PartVectorFileName$;" file? ";
EditVectorLoop:
  C$ = UCASE$(INKEY$)
  IF LEN(C$)=0 THEN EditVectorLoop
  PRINT C$;
  IF C$<>"Y" THEN VectorManager

'
' begin vector file update
'
  ON ERROR GOTO NoBackup2                      ' remove backup file
  KILL BackupFileName$
  GOTO UpdateVectors
NoBackup2:
  RESUME UpdateVectors

UpdateVectors:
  ON ERROR GOTO RenameError
  NAME PartVectorFileName$ AS BackupFileName$  ' juggle file names around
  ON ERROR GOTO NoBackupFile
  OPEN BackupFileName$ FOR INPUT AS #4
  ON ERROR GOTO NoVectorFile
  OPEN PartVectorFileName$ FOR OUTPUT AS #6
  ON ERROR GOTO 0
  FOR I&=1 TO StartLineCount&-1                ' copy part prior
    LINE INPUT #4,A$
    PRINT #6,A$
  NEXT I&
  FOR I&=StartLineCount& TO EndLineCount&      ' throw away original
    LINE INPUT #4,A$
  NEXT I&
  ON ERROR GOTO NoTempFile
  OPEN LayerTempFileName$ FOR INPUT AS #5
  ON ERROR GOTO 0                              ' replace with edited
  WHILE NOT EOF(5)
    LINE INPUT #5,A$
    PRINT #6,A$
```

```
  WEND
  CLOSE #5
  WHILE NOT EOF(4)                              ' copy part after
    LINE INPUT #4,A$
    PRINT #6,A$
  WEND
  CLOSE #4
  CLOSE #6
  GOTO VectorManager

EditVectorNotFound:
  PRINT
  INPUT "Can't find indicated layer.  Press Enter to continue...",A$
  GOTO VectorManager


'==============================================================================
'
'  Calculate part's step period(s)
'
CalcSp:
  ON ERROR GOTO NoPowerFile
  OPEN PowerFile$ FOR INPUT AS #8
  INPUT #8,LaserPower
  CLOSE #8
  GOTO CalcReadMaterialData
NoPowerFile:
  LaserPower = 0
  RESUME CalcReadMaterialData

CalcReadMaterialData:
  ON ERROR GOTO NoLastMaterialFile
  OPEN LastMaterialFile$ FOR INPUT AS #9
  LINE INPUT #9,MaterialFile$
  CLOSE #9
  GOSUB GetMaterialFileData
  GOTO ShowSp
NoLastMaterialFile:
  MaterialFile$ = "- none -"
  FOR I%=1 TO RangeCount%
    EstSp&[I%] = 0
    SP(I%)     = 0   :   LH(I%)    = 0   :   WMIN(I%) = 0   :   WMAX(I%) = 0
    LHSlope    = 0   :   LHYInt    = 0   :   LHRval   = 0
    WMINSlope = 0    :   WMINYint = 0    :   WMINRval = 0
    WMAXSlope = 0    :   WMAXYint = 0    :   WMAXRval = 0
  NEXT I%
  RESUME ShowSp

ShowSp:
  CLS
  ON ERROR GOTO 0
  IF RangeCount% = 0 THEN
    PRINT "No layer ranges!"
  ELSE
    T$ = "RANGE - CALC SP"
    GOSUB CenterLine
    T$ = Title$
    GOSUB CenterLine
    T$ = "working on file "+PartRangeFileName$
    GOSUB CenterLine
    Indent$ = STRING$(6," ")
    PRINT
    T$ = "Laser Power Reading: "+STR$(INT(LaserPower*100)/100)+" mW"
    GOSUB CenterLine
    T$ = "using working curve data from material file: "+MaterialFile$
    GOSUB CenterLine
```

```
    PRINT Indent$;SpBar$
    PRINT Indent$;" Range   Z-Start   Z-End   Z-Space   Depth   Est SP   W Min   W
    PRINT Indent$;SpBar$
    FOR I%=1 TO RangeCount%
      WMIN = FN GetLog(EstSp&[I%],WMINSlope,WMINYint)
      IF WMIN>999 THEN WMIN=999
      IF WMIN<0 THEN WMIN=0
      WMAX = FN GetLog(EstSp&[I%],WMAXSlope,WMAXYint)
      IF WMAX>999 THEN WMAX=999
      IF WMAX<0 THEN WMAX=0
      PRINT Indent$;
      PRINT USING " ### ";I%;
      PRINT USING "      ##### ";ZStart&[I%];
      PRINT USING "    #####";ZEnd&[I%];
      PRINT USING "    ##### ";ZSpace%[I%];
      PRINT USING "    #####";CureDepth%[I%];
      PRINT USING "    #####";EstSp&[I%];
      PRINT USING "      ###.#";WMIN;
      PRINT USING "    ###.#";WMAX
    NEXT I%
    PRINT Indent$;SpBar$
  END IF
  PRINT
  PRINT "   Press:"
  PRINT "    R to read material data    U to update range commands"
  PRINT "    C to change power rating   E to edit cure depth/step period"
  PRINT "    V to view material data"
  PRINT "    X to exit                  Q to quit program"
LoopSp:
  C$=UCASE$(INKEY$)
  IF LEN(C$)=0 THEN LoopSp
  IF C$="R" THEN ReadMaterial
  IF C$="C" THEN ChangeSp
  IF C$="U" THEN UpdateCmds
  IF C$="V" THEN ViewMaterial
  IF C$="E" THEN EditSpParams
  IF C$="X" THEN RangeManager
  IF C$="Q" THEN END
  GOTO LoopSp

'-----------------------------------------------------------------------------

ReadMaterial:
  CLS
  PRINT "Available Material Files:"
  PRINT
  ON ERROR GOTO NoMaterialFiles
  FILES "*.MAT"
  GOTO GetMaterialAsk
NoMaterialFiles:
  PRINT "- no material files in working directory -"
  RESUME GetMaterialAsk
GetMaterialAsk:
  PRINT
  INPUT "Name of data file to read: ",MaterialFile$
  IF LEN(MaterialFile$)=0 THEN ShowSp
  MaterialFile$ = UCASE$(MaterialFile$)
  IF INSTR(MaterialFile$,".")=0 THEN MaterialFile$ = MaterialFile$ + ".MAT"
  ON ERROR GOTO CantReadMaterialFile
  GOSUB GetMaterialFileData
  OPEN LastMaterialFile$ FOR OUTPUT AS #9
  PRINT #9,MaterialFile$
  CLOSE #9
  GOTO ShowSp

GetMaterialFileData:
```

```
  OPEN MaterialFile$ FOR INPUT AS #7
  ON ERROR GOTO 0
  INPUT #7,MaterialLaserPower
  INPUT #7,NumberOfPairs%
  FOR I% = 1 TO NumberOfPairs%
    INPUT #7,SP(I%)
    INPUT #7,LH(I%)
    SP(I%) = LOG(SP(I%))/LOG(10)
    INPUT #7,WMIN(I%)
    INPUT #7,WMAX(I%)
  NEXT I%
  CLOSE #7
  CALL Regression(LH(),LHSlope,LHYint,LHRval)
  CALL Regression(WMIN(),WMINSlope,WMINYint,WMINRval)
  CALL Regression(WMAX(),WMAXSlope,WMAXYint,WMAXRval)
  GOSUB DoCalculation
  RETURN

CantReadMaterialFile:
  PRINT "Can't read material file ";MaterialFile$
  CLOSE #7
  RESUME GetMaterialAsk

'-----------------------------------------------------------------------------

ChangeSp:
  PRINT
  INPUT "Enter new laser power reading (mW): ",LaserPower
  OPEN PowerFile$ FOR OUTPUT AS #8
  PRINT #8,LaserPower
  CLOSE #8
  GOSUB DoCalculation
  GOTO ShowSp

'-----------------------------------------------------------------------------

UpdateCmds:
  CLS
  PRINT "Update Range Commands"
  PRINT
  PRINT "Block Groups:"
  PRINT
  FOR I%=0 TO BlockGroups%
    PRINT FN StrNoSp$(I%);".  ";
    FOR J%=0 TO BlockGroupCount%[I%]-1
      IF POS(0)>75 THEN
        PRINT
        PRINT "    ";
      END IF
      PRINT BlockGroupId$[I%,J%];SPC(6-LEN(BlockGroupId$[I%,J%]));
    NEXT J%
    PRINT
  NEXT I%
  PRINT
  INPUT "Use which block group [1]? ",A$
  IF LEN(A$)=0 THEN Group% = 1 ELSE Group% = VAL(A$)
  PRINT
  INPUT "Update which merge-sets [all]? ",Upd$
  Upd$ = UCASE$(Upd$)
  IF LEN(Upd$)=0 OR LEFT$(Upd$,1)="A" THEN Upd$="A"
  FOR I%=1 TO RangeCount%
    NewSp$ = "SP " + FN NoSp$(STR$(EstSp&[I%]))
    FOR J%=BlockStart%[I%] TO BlockEnd%[I%]
      B$ = BlockType$[J%]
      F$ = ""
      WHILE RIGHT$(B$,1)<"A"
```

```
        F$ = F$+RIGHT$(B$,1)
        B$ = LEFT$(B$,LEN(B$)-1)
      WEND
      IF B$="L" OR (Upd$<>"A" AND INSTR(Upd$,F$)=0) THEN NoUpdateCmdBlock
      K%=0
      WHILE K% < BlockGroupCount%[Group%]
        IF B$=BlockGroupId$[Group%,K%] THEN UpdateCmdBlock
        INCR K%
      WEND
      GOTO NoUpdateCmdBlock
JpdateCmdBlock:
      IF RIGHT$(B$,1)="F" THEN
        NewSs$ = FillStepSize$
      ELSE
        NewSs$ = NormStepSize$
      END IF
      IF NewSs$<>"" THEN CALL UpdateBlockCommands(J%,B$,NewSs$)
      IF NewSp$<>"" THEN CALL UpdateBlockCommands(J%,B$,NewSp$)

NoUpdateCmdBlock:
    NEXT J%
  NEXT I%
  PRINT
  PRINT "Range commands updated in memory.  Use Range Manager Update Disk Command"
  INPUT "to update the Range File out on disk...",A$
  GOTO ShowSp

SUB UpdateBlockCommands(Index%,Block$,NewItem$)
LOCAL T$,ItemId$,I%,J%,K%,CmdLeft$,CmdRight$
SHARED BlockCmd$[]
  I% = INSTR(NewItem$," ")    ' get text up to first space (or end)
  IF I%=0 THEN I%=LEN(NewItem$)+1
  ItemId$ = LEFT$(NewItem$,I%-1)
  T$ = FN NoQuotes$(BlockCmd$[Index%])
  IF LEN(T$)=0 THEN
    T$ = NewItem$
  ELSE
    J% = INSTR(T$,ItemId$)
    IF J% THEN
      K% = INSTR(J%,T$,";")
      IF K%=0 THEN K% = LEN(T$)
      CmdLeft$ = LEFT$(T$,J%-1)
      CmdRight$ = MID$(T$,K%+1,99)
      IF LEN(CmdRight$)=0 AND RIGHT$(CmdLeft$,1)=";" THEN_
        CmdLeft$ = LEFT$(CmdLeft$,LEN(CmdLeft$)-1)
      T$ = CmdLeft$+CmdRight$
    END IF
    IF LEN(T$) THEN
      T$ = NewItem$ + ";" + T$
    ELSE
      T$ = NewItem$
    END IF
  END IF
  IF LEN(T$) THEN T$ = CHR$(34) + T$ + CHR$(34)
  BlockCmd$[Index%] = T$
JpdateBlocksEnd:
END SUB

'-----------------------------------------------------------------------------

ViewMaterial:
  CLS
  PRINT "Data from Material File: ";MaterialFile$
  PRINT
  PRINT
  PRINT "Material Test Laser Power Reading: ";
```

```
PRINT USING "###.##";MaterialLaserPower
PRINT
PRINT NumberOfPairs%;"Material Data Pairs:"
PRINT
FOR I% = 1 TO NumberOfPairs%
  PRINT USING "##. ";I%;
  PRINT USING "  SP = ####.##";10^SP(I%);
  LOCATE ,20
  PRINT USING "  LH = ####.##";LH(I%);
  LOCATE ,35
  PRINT USING "  WMIN = ####.##";WMIN(I%);
  LOCATE ,52
  PRINT USING "  WMAX = ####.##";WMAX(I%)
NEXT I%
PRINT
PRINT "  LH:  Slope =";
PRINT USING "#####.##";INT(LHSlope*1000)/1000;
PRINT "   Y-Intercept =";
PRINT USING "#####.##";INT(LHYint*100)/100;
PRINT "   R-Value =";
PRINT USING "#####.##";INT(LHRval*1000)/1000
PRINT "WMIN:  Slope =";
PRINT USING "#####.##";INT(WMINSlope*1000)/1000;
PRINT "   Y-Intercept =";
PRINT USING "#####.##";INT(WMINYint*100)/100;
PRINT "   R-Value =";
PRINT USING "#####.##";INT(WMINRval*1000)/1000
PRINT "WMAX:  Slope =";
PRINT USING "#####.##";INT(WMAXSlope*1000)/1000;
PRINT "   Y-Intercept =";
PRINT USING "#####.##";INT(WMAXYint*100)/100;
PRINT "   R-Value =";
PRINT USING "#####.##";INT(WMAXRval*1000)/1000
PRINT
INPUT "Press Enter to continue... ",A$
GOTO ShowSp

'-------------------------------------------------------------------------------

EditSpParams:
  PRINT
  PRINT "Enter C followed by range #,new cure depth
  PRINT "   or S followed by range #,new step period: ";
  LINE INPUT "",A$
  C$ = UCASE$(LEFT$(A$,1))
  IF C$="S" THEN
    ModingSp% = TRUE
    GOTO EditCont
  ELSEIF C$="C" THEN
    ModingSp% = FALSE
    GOTO EditCont
  END IF
  GOTO ShowSp
EditCont:
  A$ = MID$(A$,2,99)
  IF INSTR(A$,",")=0 THEN ShowSp
  I% = INSTR(A$,",")
  Range% = VAL(LEFT$(A$,I%-1))
  IF Range%<1 OR Range%>RangeCount% THEN ShowSp
  Value# = VAL(MID$(A$,I%+1))
  IF Value# <= MaxInt THEN
    Value% = Value#
    IF ModingSp% THEN
      EstSp&[Range%] = Value%
      CureDepth%[Range%] = FN GetLog(Value%,LHSlope,LHYint)
    ELSE
```

```
      CureDepth%[Range%] = Value%
      EstSp&[Range%] = FN GetExp(Value%,LHSlope.LHYint)
    END IF
    IF EstSp&[Range%] < MinSp& THEN EstSp&[Range%] = MinSp&
    IF EstSP&[Range%] > MaxSp& THEN EstSp&[Range%] = MaxSp&
  END IF
  GOTO ShowSp

DoCalculation:
  FOR I%=1 TO RangeCount%
    IF LaserPower < 1 THEN EstSp&[I%] = MinSp&_
    ELSE EstSp&[I%] = FN GetExp(CureDepth%[I%],LHSlope,LHYint)
    IF EstSp&[I%] < MinSp& THEN EstSp&[I%] = MinSp&
    IF EstSP&[I%] > MaxSp& THEN EstSp&[I%] = MaxSp&
  NEXT I%
  RETURN

'-----------------------------------------------------------------------------

SUB Regression(Array(1),Slope,Yint,Rval)
  SHARED NumberOfPairs%,SP()
  XY       = 0
  SUMX     = 0
  SUMY     = 0
  SUMY2    = 0
  XSQUARED = 0
  IF NumberOfPairs%<1 THEN
    Slope = 0
    Yint  = 0
    Rval  = 0
    GOTO EndRegSub
  END IF
  FOR I% = 1 TO NumberOfPairs%
    XY = XY + SP(I%) * Array(I%)
    SUMX = SUMX + SP(I%)
    SUMY = SUMY + Array(I%)
    SUMY2 = SUMY2 + Array(I%)^2
    XSQUARED = XSQUARED + SP(I%)^2
  NEXT I%
  Denom = XSQUARED - (SUMX^2) / NumberOfPairs%
  IF Denom < 1E-5 THEN Slope = 0_
  ELSE Slope = (XY - (SUMX*SUMY)/NumberOfPairs%) / Denom
  Yint = SUMY/NumberOfPairs% - Slope * SUMX/NumberOfPairs%
  Denom = SUMY2 - SUMY^2 / NumberOfPairs%
  IF Denom < 1E-5 THEN Rval = 0_
  ELSE Rval = SQR(((Yint * SUMY + Slope * XY) - SUMY^2/NumberOfPairs%) / Denom)
EndRegSub:
END SUB

DEF FN GetExp(DataPoint,Slope,Yint)
  IF (LaserPower>0) AND (Slope>0) THEN
    temp# = 10 ^ ((DataPoint - Yint) / Slope) * MaterialLaserPower / LaserPower
    IF temp# <= MaxUInt THEN FN GetExp = temp# ELSE FN GetExp = MaxUInt
  ELSE
    FN GetExp = 0
  END IF
END DEF

DEF FN GetLog(DataPoint,Slope,Yint)
  IF (DataPoint>0) AND (MaterialLaserPower>0) AND (LaserPower>0) THEN
    FN GetLog = Slope * LOG10(DataPoint/(MaterialLaserPower / LaserPower)) + Yint
  ELSE
    FN GetLog = 0
  END IF
END DEF
```

```
'==============================================================================
'
'  Statistics:
'    show full directory of all files involved with part
'

Statistics:
  CLS
  PRINT "Statistics for part ";PartName$;":"
  SHELL "DIR "+PartName$+".*"
  LOCATE 23,1
  INPUT "Press Enter to continue: ",A$
  GOTO MainMenu


'==============================================================================
'
'  UTILITY FUNCTIONS AND PROCEDURES
'
'------------------------------------------------------------------------------
'
' Removes all double spaces in CmdLine$
'
RemoveDoubleSpaces:
  WHILE INSTR(CmdLine$,"  ")>0
    I = INSTR(CmdLine$,"  ")
    CmdLine$ = left$(CmdLine$,I) + mid$(CmdLine$,I+2,99)
  WEND
  RETURN

'
'  Find any char of Char$ in Main$ starting at index Start
'  Returns LEN(Main$)+1 if no character of Char$ in Main$
'
DEF FN FindStr(Start%,Main$,Char$)
  LOCAL I%,J%,MIN%
  MIN% = LEN(Main$) + 1
  FOR I%=1 to LEN(Char$)
    J% = INSTR(Start%,Main$,MID$(Char$,I%,1))
    IF (J% > 0) AND (J% < MIN%) THEN MIN% = J%
  NEXT I%
  FN FindStr = MIN%
END DEF

'
'  Make a string from a number without a leading space
'
DEF FN StrNoSp$(Num)
  LOCAL A$
  A$=STR$(Num)
  IF LEFT$(A$,1)=" " THEN A$=RIGHT$(A$,LEN(A$)-1)
  FN StrNoSp$ = A$
END DEF

'
'  Pick out a number from a string
'  starting at Index and going to the next space or comma or end-of-string
'
SUB UnitValShortInt(Storage%,Text$,Index%)
  Storage% = VAL(MID$(Text$,Index%))
  Index% = FN FindStr(Index%,Text$," ,") + 1
END SUB

SUB UnitValInt(Storage&,Text$,Index%)
  Storage& = VAL(MID$(Text$,Index%))
```

```
  Index% = FN FindStr(Index%,Text$," ,") + 1
END SUB

SUB UnitVal(Storage,Text$,Index%)
  Storage = VAL(MID$(Text$,Index%))
  Index% = FN FindStr(Index%,Text$," ,") + 1
END SUB

'
'  Pick out text from a string
'  starting at Index and going to the next comma or end-of-string
'
SUB UnitStr(Storage$,Text$,Index%)
  LOCAL I%
  I% = FN FindStr(Index%,Text$," ,")
  Storage$ = MID$(Text$,Index%,I%-Index%)
  Index% = I% + 1
END SUB

'
'  Remove excess quote marks around string
'
DEF FN NoQuotes$(Text$)
  LOCAL S%,E%
  S% = 1
  IF LEFT$(Text$,1)=CHR$(34) THEN INCR S%
  E% = LEN(Text$)+1
  IF RIGHT$(Text$,1)=CHR$(34) THEN DECR E%
  FN NoQuotes$ = MID$(Text$,S%,E%-S%)
END DEF

'
'  Remove excess spaces around string
'
DEF FN NoSp$(Text$)
  LOCAL S%,E%
  IF LEN(Text$)>0 THEN
    S% = 1
    WHILE MID$(Text$,S%,1)=" "
      INCR S%
    WEND
    E% = LEN(Text$)
    WHILE E%>S%+1 AND MID$(Text$,E%,1)=" "
      DECR E%
    WEND
    FN NoSp$ = MID$(Text$,S%,E%-S%+1)
  ELSE
    FN NoSp$ = ""
  END IF
END DEF

'
'  Can't open file.  Report this to operator.
'
CantOpen:
  CALL SystemError("Can't open file "+FileName$)
  END

'------------------------------------------------------------------------
'
'  Show error and store it on disk
'
SUB SystemError(Text$)
  PRINT Text$
  OPEN "C:\SYSTEM.ERR" FOR OUTPUT AS #9
  PRINT #9,"PREPARE: ";Text$

  CLOSE #9
END SUB

CenterLine:
  LOCATE ,(79-LEN(T$))/2
  PRINT T$
  RETURN
```

```
{=============================================================================
   3D Systems Stereolithography System Software
 =============================================================================

  POWER.PAS
   SLA-1 Power Control Program

 -----------------------------------------------------------------------------

   Recent History:
   11/12/87  Ver 2.30  first Beta software release
    1/08/88  Ver 2.50  retitled program
    1/25/88  Ver 2.60  better messages
    2/08/88  -         converted from Turbo Basic to Turbo Pascal Version 4.0
                       better Laser Board I/O
                       power status line display
                       support of toggling-Laser power
    2/26/88  Ver 2.62  fix for toggling Laser power

 -----------------------------------------------------------------------------}

uses Crt,Dos;

const
  VersionId = '2.62';
  LaserBoardAddress = $300;
  PowerPort     = $304;
  _INIT_OUT     = $01;  { outputs }
  _ZSTAGE_OUT   = $02;
  _SHUTTER_OUT  = $04;
  _LASER_OUT    = $08;
  _INIT_IN      = $10;  { inputs }
  _DOOR_IN      = $20;
  _SHUTTER_IN   = $40;
  _LASER_IN     = $80;
  Indent = 22;
  LASERVECTOR  = $64;
  STEREOVECTOR = $65;
  HomeDirectory = 'C:\3DSYS\';
  FixFileName   = 'FIX.DAT';
  ParamFileName = 'POWER.PRM';
  ErrorFileName = 'C:\SYSTEM.ERR';
  CtrlC = ^C;

type
  str4 = string[4];
  str16 = string[16];
  LaserPowerType = (_Unknown,_Level,_Toggle);
  OnOffType = (On,Off);

var
  key: Char;
  regs: Registers;
  LaserVersion,StereoVersion: str4;
  ParamFile,ErrorFile,FixFile: Text;
  temp,IndentStr,FixFileLine,ParamFileLine: String;
  LaserOff,ShowStuff: Boolean;
  QSize: LongInt;
  i,IOerr: Integer;
  LaserPower: LaserPowerType;

{
  Cursor on / off routines
```

```
procedure CursorOff;
begin
  with regs do begin
    AH := 3;
    BH := 0;
    Intr($10,regs);
    AH := 1;
    CH := CH or $20;
    Intr($10,regs);
  end;
end;

procedure CursorOn;
begin
  with regs do begin
    AH := 3;
    BH := 0;
    Intr($10,regs);
    AH := 1;
    CH := CH and $DF;
    Intr($10,regs);
  end;
end;

procedure beep;
begin
  sound(1000);
  delay(500);
  NoSound;
end;

{
  Show error and store it on disk
}
procedure SystemError(Text: string);
begin
  writeln('ERROR: '+Text);
  beep;
  assign(ErrorFile,ErrorFileName);
  rewrite(ErrorFile);
  writeln(ErrorFIle,'POWER: ',Text);
  close(ErrorFile);
end;

{
  Describe Error to Operator
}
procedure PrintError(Text: String);
begin
  if whereX>1 then writeln;
  writeln('*** ',Text);
end;

function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
var
  temp: string;
```

```
  i: Integer;
begin
  temp := '';
  for i:=1 to num do temp  := temp+Ch;
  many := temp;
end;

function IntStr(num: Integer): str16;
var
  temp: str16;
begin
  if num>=0 then Str(num,temp) else Str(num+$8000,temp);
  IntStr := temp;
end;

procedure Abort;
var
  key: Char;
begin
  while keypressed do key := ReadKey;
  CursorOn;
  halt(127);
end;

procedure HandleKeyboardRequest;
begin
  while keypressed do begin
    key := ReadKey;
    if key = CtrlC then Abort;
    if (key = #0) and keypressed then
      key := ReadKey;
  end;
end;

procedure DrawBox(x1,y1,x2,y2: integer;BoxType: integer);
type
  BoxMode = array[1..4] of Char;
{
    Box Types:
      1:  Single Line all around
      2:  Double Line all around
      3:  Single Line horizontal, Double Line vertical
      4:  Double Line horizontal, Single Line vertical
}
  const
                     {  Type        1    2    3    4     }
    UpperLeftCorner : BoxMode = (#218,#201,#214,#213);
    UpperRightCorner: BoxMode = (#191,#187,#183,#184);
    LowerLeftCorner : BoxMode = (#192,#200,#211,#212);
    LowerRightCorner: BoxMode = (#217,#188,#189,#190);
    HorzBar         : BoxMode = (#196,#205,#196,#205);
    VertBar         : BoxMode = (#179,#186,#186,#179);
var
  i: integer;
  FullHorzBar: String;
begin
  gotoxy(x1,y1);
  if x1<x2 then FullHorzBar := Many(HorzBar[BoxType],x2-x1-1)
    else FullHorzBar := '';
  if x1<>x2 then write(UpperLeftCorner[BoxType]);
  write(FullHorzBar);
  if x1<>x2 then write(UpperRightCorner[BoxType]);
  for i:=y1+1 to y2-1 do begin
    gotoxy(x1,i);
    write(VertBar[BoxType]);
    gotoxy(x2,i);
```

```
    write(VertBar[BoxType]);
  end;
  gotoxy(x1,y2);
  if x1<>x2 then write(LowerLeftCorner[BoxType]);
  write(FullHorzBar);
  if x1<>x2 then write(LowerRightCorner[BoxType]);
end;

{$i lctrl.inc}

procedure ShowPowerStatus;
begin
  gotoxy(12,24);
  case LaserPower of
    _Unknown: write('U');
    _Level  : write('L');
    _Toggle : write('T');
  end;
  write('-Laser ');
  if port[PowerPort + 2] and _LASER_IN   = 0 then write('On ')
    else write('Off');
  write('   Shutter ');
  if port[PowerPort + 2] and _SHUTTER_IN = 0 then write('Open  ')
    else write('Closed');
  write('   Door ');
  if port[PowerPort + 2] and _DOOR_IN    = 0 then write('Open  ')
    else write('Closed');
  write('   Z-Stage ');
  if port[PowerPort + 2] and _ZSTAGE_OUT = 0 then write('Off')
    else write('On ');
end;

procedure SendLaserCommand(cmd: String);
begin
  ShowError(STEREO(cmd));
end;

procedure PowerControl(bit: Integer;Op: OnOffType);
begin
  if Op = On then
    port[PowerPort + 2] := port[PowerPort + 2] or bit
  else
    port[PowerPort + 2] := port[PowerPort + 2] and ($FF-bit);
end;

procedure ToggleLaserPowerOn;
var
  loop1: LongInt;
begin
  PowerControl(_LASER_OUT,On);
  loop1 := 0;
  repeat
    inc(loop1);
  until (port[PowerPort + 2] and _LASER_IN = 0) or (loop1 > 100000);
  PowerControl(_LASER_OUT,Off);
  if (loop1 > 100000) then
    PrintError('Can''t detect laser toggle feedback.');
end;

procedure ToggleLaserPowerOff;
var
  loop1: LongInt;
begin
  PowerControl(_LASER_OUT,On);
  loop1 := 0;
  repeat
```

```
    inc(loop1);
  until (port[PowerPort + 2] and _LASER_IN > 0) or (loop1 > 100000);
  PowerControl(_LASER_OUT,Off);
  if (loop1 > 100000) then
    PrintError('Can''t detect laser toggle feedback.');
end;

procedure TurnOnLaser;
var
  loop: LongInt;
begin
  if LaserPower = _Toggle then begin
    if port[PowerPort + 2] and _LASER_IN > 0 then ToggleLaserPowerOn;
  end else PowerControl(_LASER_OUT,On);
  if LaserPresent and StereoPresent then begin
    SendLaserCommand('HR;CL;MD BL +');
    assign(FixFile,FixFileName);
    {$I-}
    reset(FixFile);
    IOerr := IOresult;
    if IOerr <> 0 then begin
      assign(FixFile,HomeDirectory + FixFileName);
      reset(FixFile);
      IOerr := IOresult;
    end;
    {$I+}
    if IOerr = 0 then begin
      while not eof(FixFile) do begin
        readln(FixFile,FixFileLine);
        if (FixFileLine <> '') and (FixFileLine[1] <> '!') then
          SendLaserCommand(FixFileLine);
      end;
      close(FixFile);
    end;
  end;
end;

procedure TurnOnElevator;
begin
  PowerControl(_ZSTAGE_OUT,On);
end;

procedure OpenShutter;
begin
  PowerControl(_SHUTTER_OUT,On);
end;

procedure TurnOffLaser;
begin
  gotoxy(18,17);
  write('--- WARNING ---');
  gotoxy(18,18);
  write('The laser may take half an hour to restart!');
  gotoxy(18,19);
  write('Are you sure you want to turn the laser off? ');
  repeat
    ShowPowerStatus;
  until keypressed;
  HandleKeyboardRequest;
  if upcase(key)='Y' then
    if LaserPower = _Toggle then begin
      if port[PowerPort + 2] and _LASER_IN = 0 then ToggleLaserPowerOff;
    end else PowerControl(_LASER_OUT,Off);
end;

procedure TurnOffElevator;
```

```
begin
  PowerControl(_ZSTAGE_OUT,Off);
end;

procedure CloseShutter;
begin
  PowerControl(_SHUTTER_OUT,Off);
end;

procedure GetSelection;
begin
  repeat
    repeat
      ShowPowerStatus;
    until keypressed;
    HandleKeyboardRequest;
    key := upcase(key);
    if key in ['1'..'6','X'] then exit;
  until false;
end;

procedure ShowPowerMenu;
begin
  window(1,1,80,21);
  ClrScr;
  writeln(IndentStr,'       SLA-1 POWER CONTROL');
  writeln(IndentStr,'          Version '+VersionId);
  for i:=1 to 5 do writeln;
  DrawBox(Indent-1,7,80-Indent,15,1);
  window(Indent,8,80-Indent-1,14);
  ClrScr;
  writeln(' 1. Turn Laser and Mirror Drive On');
  writeln(' 2. Turn Elevator On');
  writeln(' 3. Open Shutter');
  writeln(' 4. Turn Laser and Mirror Drive Off');
  writeln(' 5. Turn Elevator Off');
  writeln(' 6. Close Shutter');
  write(' X. Exit');
  window(1,1,80,25);
  gotoxy(28,19);
  write('Please make a selection.');
  DrawBox(10,23,69,25,1);
end;

procedure HardReset;
begin
  port[PowerPort + 3] := $98;   { init 8255 chip }
  port[PowerPort + 3] := $98;
end;

procedure InitPowerPort;
begin
  PowerControl(1,Off);
  if port[PowerPort + 2] and _INIT_IN > 0 then HardReset
  else begin
    PowerControl(1,On);
    if port[PowerPort + 2] and _INIT_IN = 0 then HardReset;
  end;
end;

procedure ReadParams;
begin
  assign(ParamFile,ParamFileName);
  {$I-}
  reset(ParamFile);
  IOerr := IOresult;
```

```
  if IOerr <> 0 then begin
    assign(ParamFile,HomeDirectory + ParamFileName);
    reset(ParamFile);
    IOerr := IOresult;
  end;
  {$I+}
  LaserPower := _Unknown;
  if IOerr = 0 then begin
    while not eof(ParamFile) do begin
      readln(ParamFile,ParamFileLine);
      ParamFileLine := upper(ParamFileLine);
      if (ParamFileLine <> '') and (ParamFileLine[1] <> '!') then begin
        if copy(ParamFileLine,1,15) = 'LASERPOWERTYPE=' then begin
          temp := copy(ParamFileLine,16,3);
          if temp = 'LEV' then LaserPower := _Level
          else if temp = 'TOG' then LaserPower := _Toggle;
        end;
      end;
    end;
    close(ParamFile);
  end;
end;

begin
  CheckBreak := false;
  ShowStuff := false;
  LaserOff := false;
  ClrScr;
  InitPowerPort;
  IndentStr := many(' ',Indent);
  ReadParams;
  CursorOff;
  repeat
    ShowPowerMenu;
    GetSelection;
    gotoxy(1,22);
    ClrEol;
    case key of
      '1': TurnOnLaser;
      '2': TurnOnElevator;
      '3': OpenShutter;
      '4': TurnOffLaser;
      '5': TurnOffElevator;
      '6': CloseShutter;
      'X': Abort;
    end;
  until false;
end.
```

```
{=============================================================================
   3D Systems Stereolithography System Software
 =============================================================================

   SERVICE.BAS
   SLA-1 Special Services Provider

 -----------------------------------------------------------------------------
   Compile with TBM - Modified Turbo Basic - not TB!
 -----------------------------------------------------------------------------

   Recent History:
   11/20/87  Ver 2.30  under development
   12/06/87  Ver 2.31  Error output shows SERVICE, not MERGE
                       /I in command line causes all errors to be ignored
                       /T in command line for transparent operation
    1/25/88  Ver 2.60  version update only
    2/24/88  Ver 2.61  converted to Turbo Pascal Version 4.0
                       added program title header
                       added invalid command error

 -----------------------------------------------------------------------------}

uses Dos;

const
  VersionId   = '2.61';
  MSDOS       = $21;   { interrupt vectors }
  LASERVECTOR = $64;
  ErrorFileName = 'C:\SYSTEM.ERR';

type
  str4 = string[4];
  str16 = string[16];

var
  i: Integer;
  ErrorFile: Text;
  regs: Registers;
  LaserVersion: str4;
  SingleBar,CmdLine,cmd: String;
  ShowErrors,NoText: Boolean;


function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
var
  temp: string;
  i: Integer;
begin
  temp := '';
  for i:=1 to num do temp  := temp+Ch;
  many := temp;
end;
```

```
unction CleanUpSpaces(Text: String): String;
'ar
  Temp: String;
  i: Integer;
  HaveSpace: Boolean;
)egin
  i := 1;
  while (i < length(Text)) and (copy(Text,1,1)=' ') do inc(i);
  HaveSpace := false;
  Temp := '';
  while i <= length(Text) do begin
    if Text[i]=' ' then HaveSpace := true
    else begin
      if HaveSpace then begin
        Temp := Temp + ' ' + Text[i];
        HaveSpace := false;
      end else Temp := Temp + Text[i];
    end;
    inc(i);
  end; {while i}
  CleanUpSpaces := Temp;
end;

{
   convert integer to a string
}
function IntStr(num: Integer): str16;
var
  temp: str16;
begin
  if num>=0 then Str(num,temp) else Str(num+$8000,temp);
  IntStr := temp;
end;

{
   Tell user if not transparent
}
procedure Tell(Text: String);
begin
  if not NoText then writeln(Text);
end;

{
   read DOS command line
}
procedure ReadCommandLine(var line: string);
var
  i: Integer;
begin
  line := ParamStr(1);
  for i:=2 to ParamCount do
    line := line + ' ' + ParamStr(i);
end;

{
  Show error and store it on disk
}
procedure SystemError(Text: string);
begin
  writeln(Text);
  assign(ErrorFile,ErrorFileName);
  rewrite(ErrorFile);
  writeln(ErrorFIle,'SERVICE: ',Text);
  close(ErrorFile);
end;
```

```
{-----------------------------------------------------------------------------

                        Laser Controller Routines

-----------------------------------------------------------------------------}

{
  Check for Memory-Resident Laser Controller System
}
function LaserOk: Boolean;
  type
    CopyType  = array[1..20] of char;
  var
    CopyPtr: ^CopyType;
    CopyStr: string[20];
  begin
    with regs do begin
      AX := ($35 shl 8) or LASERVECTOR;
      Intr($21,regs);
      CopyPtr := Ptr(ES,BX-19);
    end;
    move(CopyPtr^[1].CopyStr[1],18);
    CopyStr[0] := #18;
    if CopyStr = 'Tarnz Technologies' then begin
      LaserOk := true;
      with regs do
        CopyPtr := Ptr(ES,BX-46);
      move(CopyPtr^[1],LaserVersion[1],4);
      LaserVersion[0] := #4;
    end else begin
      LaserOk := false;
      LaserVersion := '?.??';
    end;
  end;

function LaserPresent: Boolean;
  begin
    if LaserOk then LaserPresent := true
    else begin
      LaserPresent := false;
      SystemError('LASER system not installed.');
    end;
  end;


{-----------------------------------------------------------------------------}


procedure TurnLaserControllerOff;
var
  Er: Integer;
begin
  with regs do begin
    AX := $0100;
    Intr(LASERVECTOR,regs);
    Er := AL;
    if ShowErrors then begin
      if Er=0 then Tell('Laser Controller turned off.')
      else Tell('Error'+IntStr(Er)+' attempting to turn laser off.');
    end;
  end;
end;

procedure TurnLaserControllerOn;
var
```

423

```
  Er: Integer;
begin
  with regs do begin
    AX := $0000;
    BX := 1190;   { 1 ms step period }
    Intr(LASERVECTOR,regs);
    Er := AL;
    if ShowErrors then begin
      if Er=0 then Tell('Laser Controller turned on.')
      else Tell('Error'+IntStr(Er)+' attempting to turn laser on.');
    end;
  end;
end;

procedure ShowHeader;
begin
  SingleBar := many(chr(196),45);
  writeln;
  writeln(SingleBar);
  writeln('  SERVICE, SLA Resource Utility');
  writeln('  3D Systems Laser Stereolithography System');
  writeln('  Version ',VersionId,'              3D Systems, Inc.');
  writeln(SingleBar);
  writeln;
end;

{ - - - - M A I N   P R O G R A M - - - - }


begin
  ShowErrors := true;
  NoText     := false;
  ReadCommandLine(CmdLine);
  cmd := CleanUpSpaces(upper(CmdLine));
  i := pos('/I',cmd);
  if i>0 then begin
    ShowErrors := false;
    delete(cmd,i,2);
  end;
  i := pos('/T',cmd);
  if i>0 then begin
    NoText := true;
    delete(cmd,i,2);
  end;
  if not NoText then ShowHeader;
  if not LaserPresent then halt(1);
  if length(cmd)>0 then begin
    if copy(cmd,1,5)='LASER' then begin
      if copy(cmd,7,2)='ON' then TurnLaserControllerOn
      else if copy(cmd,7,3)='OFF' then TurnLaserControllerOff
      else Tell('Invalid LASER request.');
    end else Tell('Unrecognized command.');
  end;
  halt(0);
end.
```

```
/*****************************************************************************/
/*                                                                           */
/* PFP.C                                                                     */
/*                                                                           */
/* PFP Main module                                                           */
/*                                                                           */
/*                              MODIFICATION LOG                             */
/*---------------------------------------------------------------------------*/
/* date        who                what                                       */
/*---------------------------------------------------------------------------*/
/*            |P. Stinebaugh    |original code             V18              */
/*                                                                           */
/*****************************************************************************/


#include <stdio.h>
#include <time.h>
#include "pfp.h"
#include "pfptri.h"
#include "pfphi.h"
#include "pfpseg.h"
#include "pfputl.h"



#define VERSION "2.60"

#define BANNER  "3D Systems Slice Program"
/*
   Version 18a - corrected border/skin alignment
           18b - implemented 120 degree hatching
           18c - corrected memory usage reporting
           18d - corrected up/down facets on binary input
                 slice 1 unit above level
           18e - modified Z spacing table logic for greater number
                   of slice levels
           18f - corrected skin border
           18g - filtered output segments (Point Segments. Duplicate Segments)
                 modified output of '.' to numbers (layer count)
           19  - implemented Style I processing
                 changed output block mnemonics
           19a - Style IA implemented, having the NFUB block
           19b - Implemented segment file post processing
                 Allowed Z to range up to 65535 with 16384 layers
                 Added Attributed binary input option
           19c - Added holding layer in memory.
                 Allow upper or lower case for ASCII files
           19d - Add -ARIES -X -Y -C options
                 Delete -NC option
                 Redo intra-layer vector processing
           20  - Implement Normal Code
                 new version number scheme - V20 also known as V2.30
           20a - Modify to work with Unix

           232 - Standardize Version number
                 Implement Style 1B
                 Correct Var Z Spacing Table Setup
                 Add check for Z table ranges
                 Correct Sorting of Hatch and Fill Segments
                 Correct ASCII input routines to handle '\r's
           233 - Allow broken parts in the slice axis
           234 - Optional internal triangle database output
                 Eliminate collapsed line triangles
                 Align border segments so they will be eliminated
```

```
240 - output slice command line to slice output file
      second major software release
250 - Implement Cross Hatch endpoint counting
      Recompute normal vectors of deformed triangles
      Eliminate triangle counting
251 - Experimental (No version released)
260 - Recognize Ctrl-Z as EOF in ASCII file input
      Change "resd" references (was "scaled")
      Error check output to SLI file (I/O, disk full ...)
      Only recompute X & Y normal information
*/


INPUT_TRI_STRUC *tri_bucket_array      [MAX_Z_INDEX];
OUT_SEG_STRUC   *FU_seg_bucket_array   [MAX_Z_INDEX];
OUT_SEG_STRUC   *FD_seg_bucket_array   [MAX_Z_INDEX];
OUT_SEG_STRUC   *NFU_seg_bucket_array  [MAX_Z_INDEX];
OUT_SEG_STRUC   *NFD_seg_bucket_array  [MAX_Z_INDEX];
OUT_SEG_STRUC   *post_LB_seg_list         = NULL_SEG;
OUT_SEG_STRUC   *post_LH_seg_list         = NULL_SEG;
OUT_SEG_STRUC   *post_NFDB_seg_list       = NULL_SEG;
OUT_SEG_STRUC   *post_NFDH_seg_list       = NULL_SEG;
OUT_SEG_STRUC   *post_NFDF_seg_list       = NULL_SEG;
OUT_SEG_STRUC   *post_NFUB_seg_list       = NULL_SEG;
OUT_SEG_STRUC   *post_NFUH_seg_list       = NULL_SEG;
OUT_SEG_STRUC   *post_NFUF_seg_list       = NULL_SEG;
OUT_SEG_STRUC   *post_FUB_seg_list        = NULL_SEG;
OUT_SEG_STRUC   *post_FUH_seg_list        = NULL_SEG;
OUT_SEG_STRUC   *post_FUF_seg_list        = NULL_SEG;
OUT_SEG_STRUC   *post_FDB_seg_list        = NULL_SEG;
OUT_SEG_STRUC   *post_FDH_seg_list        = NULL_SEG;
OUT_SEG_STRUC   *post_FDF_seg_list        = NULL_SEG;

UINT16          z_control_table[MAX_Z_INDEX];
unsigned long   post_z_level = 0;

UINT16          all_min_z, all_max_z, all_min_z_index, all_max_z_index;

UINT16          post_file_number;
FILE            *post_process_seg_file[2];
STRING          *post_process_filename[2];

long            max_mem_alloc = 0;
long            total_mem_alloc = 0;
long            curr_mem_alloc = 0;

unsigned long   temp_count = 0;

extern  INT16   slice_count;

/******************************************************************************
   local procedure

   print_user_info


******************************************************************************/


static void print_user_info (outfile, user_info)

   FILE            *outfile;
   USER_INFO_STRUC *user_info;
```

```
fprintf (outfile, "\n resolution value .................. %f",
                              user_info-> res_value);
fprintf (outfile, "\n x hatch spacing ................... %u",
                              user_info-> x_hatch_spacing);
fprintf (outfile, "\n y hatch spacing ................... %u",
                              user_info-> y_hatch_spacing);
fprintf (outfile, "\n flat x fill spacing ............... %u",
                              user_info-> x_flat_fill_spacing);
fprintf (outfile, "\n flat y fill spacing ............... %u",
                              user_info-> y_flat_fill_spacing);
fprintf (outfile, "\n 60/120 degree angle hatch spacing .. %u",
                              user_info-> angle_hatch_spacing);
fprintf (outfile, "\n min surface angle ................. %u",
                              user_info-> min_surface_angle);
fprintf (outfile, "\n min intersect angle ............... %u",
                              user_info-> min_intersect_angle);
fprintf (outfile, "\n input file format ................. %s",
                  user_info-> binary_input ? "binary" : "ascii");
fprintf (outfile, "\n centering ......................... %s",
                  user_info-> centering_off ? "off" : "on");
fprintf (outfile, "\n output file section codes .......... %s",
                  user_info-> section_codes_off ? "off" : "on");
fprintf (outfile, "\n segment output file ................ %s",
        ((*(user_info-> segfile_name) == '\0') ? "- not used -"
                                   : user_info-> segfile_name));
if (*(user_info-> internal_filename) > '\0')
   fprintf (outfile, "\n internal triangles output file ..... %s",
        user_info-> internal_filename);
if (*(user_info-> z_space_filename) == '\0')

   fprintf (outfile, "\n z spacing ......................... %u\n",
                           user_info-> z_spacing);
else

   fprintf (outfile, "\n z spacing control file ............. %s\n",
                           user_info-> z_space_filename);


} /* print_user_info */




/*****************************************************************************
   local procedure

   get_space_line


*****************************************************************************/


static void get_space_line (z_space_file, z_change, new_z_spacing, eof, z)

   FILE      *z_space_file;
   UINT16    *z_change;
   UINT16    *new_z_spacing;
   BOOLEAN   *eof;
   UINT16    z;

{
   short     read_status;
   short     read_count = 2;
```

```
   unsigned int temp1,temp2;

   read_status = fscanf (z_space_file, "%u %u", &temp1, &temp2);

   *z_change = (INT16) temp1;
   *new_z_spacing = (INT16) temp2;

   if (read_status != read_count)
      {
       if (read_status == EOF)
          *eof = TRUE;
       else
          {
           fprintf (stderr, "\n error - invalid format in z spacing file\n");
           exit (SYS_FAILURE);
          }
      }
   else if ((z != MAX_Z_VAL) && (*z_change <= z))
      {
       fprintf (stderr,
          "\n error - z value (%u) in spacing file is out of sequence \n",
             *z_change);
       exit (SYS_FAILURE);
      }
   else if ((*z_change < 0) || (*new_z_spacing < 0))
      {
       fprintf (stderr, "\n error - invalid value in z spacing file");
       exit (SYS_FAILURE);
      }

}  /* get_space_line */




/*****************************************************************************
   local procedure

   get_space_file_data


*****************************************************************************/

static void get_space_file_data (z_space_file)

   FILE          *z_space_file;

{
   UINT16          new_z_spacing, z_change, z_count = 0, z;
   BOOLEAN         eof = FALSE;
   unsigned long   zi;
   UINT16          last_z_change, last_new_z_spacing;

   get_space_line (z_space_file, &z_change, &new_z_spacing, &eof, MAX_Z_VAL);
   while ((!eof) && (z_count < MAX_Z_INDEX)) {
      last_z_change = z_change;
      last_new_z_spacing = new_z_spacing;
      z = z_change;
      get_space_line (z_space_file, &z_change, &new_z_spacing, &eof, z);
      zi = last_z_change;
      while (zi < z_change) {
```

```
        z_control_table [z_count++] = zi;
        zi += last_new_z_spacing;
      }
   }
   while ((zi < MAX_Z_VAL) && (z_count < MAX_Z_INDEX)) {
      z_control_table [z_count++] = zi;
      zi += last_new_z_spacing;
   }
   while (z_count < MAX_Z_INDEX)
      z_control_table [z_count++] = MAX_Z_VAL;

} /* get_space_file_data */


static build_constant_spacing(user_info)

   USER_INFO_STRUC  *user_info;

{
   UINT16         z_count=0;
   long           zi = 0;

   while ((zi < MAX_Z_VAL) && (z_count < MAX_Z_INDEX)) {
      z_control_table [z_count++] = zi;
      zi += user_info-> z_spacing;
   }
   while (z_count < MAX_Z_INDEX)
      z_control_table [z_count++] = MAX_Z_VAL;

} /* build_constant_spacing */

/*********************************************************************************
   local procedure

   set z spacing


*********************************************************************************/

static void set_z_spacing (user_info)

   USER_INFO_STRUC  *user_info;

{
   FILE  *z_space_file;

   if (*(user_info-> z_space_filename) != '\0')
      {
       openfile (user_info-> z_space_filename, &z_space_file, "r");
       get_space_file_data (z_space_file);
      }
   else {
      build_constant_spacing(user_info);
   }

} /* set_z_spacing */



/*********************************************************************************
   local procedure
```

```
  get_min_max_z

*****************************************************************************/
static void single_min_max_z (a_seg_bucket_array)
   OUT_SEG_STRUC *a_seg_bucket_array[];
{
   INT16 i,j;

   for (i = 0; i < MAX_Z_INDEX; i++) {
        j = z_control_table [i];
        if (a_seg_bucket_array [i] != NULL_SEG) {
             if (j > all_max_z) {
               all_max_z_index = i;
               all_max_z = j;
               };
             if (j < all_min_z) {
                all_min_z_index = i;
                all_min_z = j;
             }
        }
   }
} /* single_min_max_z */


static void get_min_max_z ()
{
   INT16 i,j;

   all_min_z_index = MAX_Z_INDEX-1;
   all_min_z = z_control_table [MAX_Z_INDEX-1];

   for (i = 0; i < MAX_Z_INDEX; i++) {
        j = z_control_table [i];
        if (tri_bucket_array [i] != NULL_INPUT_TRI) {
             all_max_z_index = i;
             all_max_z = j;
             if (j < all_min_z) {
                all_min_z_index = i;
                all_min_z = j;
             }
        }
   }
  single_min_max_z(FU_seg_bucket_array);
  single_min_max_z(FD_seg_bucket_array);
  single_min_max_z(NFU_seg_bucket_array);
  single_min_max_z(NFD_seg_bucket_array);
}

/*****************************************************************************
   procedure

   comb_list

   Combines segment list into one big list.  Save the type of list in
    segment structure for later extraction.  Does not add point or
    duplicate segments

*****************************************************************************/
void comb_list(main_list,new_list,list_code)
  OUT_SEG_STRUC **main_list;
  OUT_SEG_STRUC **new_list;
  UINT16        list_code;
```

```
  {
  OUT_SEG_STRUC *new_ptr,*scan_ptr,*end_ptr;
  BOOLEAN delete_seg;

  new_ptr = *new_list;
  *new_list = NULL_SEG;

  while (new_ptr != NULL_SEG) {
    if ((new_ptr-> x_1 == new_ptr-> x_2) &&
        (new_ptr-> y_1 == new_ptr-> y_2)) delete_seg = TRUE;
    else {
      scan_ptr = *main_list;
      end_ptr = NULL_SEG;
      while ((scan_ptr != NULL_SEG) &&
           !((new_ptr->x_1 == scan_ptr->x_1) &&
             (new_ptr->y_1 == scan_ptr->y_1) &&
             (new_ptr->x_2 == scan_ptr->x_2) &&
             (new_ptr->y_2 == scan_ptr->y_2)) &&
           !((new_ptr->x_1 == scan_ptr->x_2) &&
             (new_ptr->y_1 == scan_ptr->y_2) &&
             (new_ptr->x_2 == scan_ptr->x_1) &&
             (new_ptr->y_2 == scan_ptr->y_1))) {
        end_ptr = scan_ptr;
        scan_ptr = scan_ptr-> next_seg;
        }
      if (scan_ptr != NULL_SEG) delete_seg = TRUE;
      else delete_seg = FALSE;
      }
    scan_ptr = new_ptr-> next_seg;
    if (delete_seg) mem_free(new_ptr,sizeof(OUT_SEG_STRUC));
    else {
      if (*new_list == NULL_SEG) {
        *new_list = new_ptr;
        if (*main_list == NULL_SEG) *main_list = new_ptr;
        }
      if (end_ptr != NULL_SEG) end_ptr-> next_seg = new_ptr;
      /* Use "normal_info" to store list type */
      new_ptr-> normal_info = list_code;
      new_ptr-> next_seg = NULL_SEG;
      }
    new_ptr = scan_ptr;
    }
  };

/*******************************************************************************
   procedure

   write_post

   Writes a segment list to a temp file for disk processing.  Save type
     of list in Segment structure.

*******************************************************************************/
void write_post(seg_ptr,out_file,type_code)
  OUT_SEG_STRUC *seg_ptr;
  FILE          *out_file;
  UINT16        type_code;
  {
  OUT_SEG_STRUC *temp_ptr;

  while (seg_ptr != NULL_SEG) {
    /* Use "normal_info" to store list type */
    seg_ptr-> normal_info = type_code;
    fwrite(seg_ptr,sizeof(OUT_SEG_STRUC),1,out_file);
    temp_ptr = seg_ptr;
    seg_ptr = seg_ptr-> next_seg;
```

```
    mem_free(temp_ptr,sizeof(OUT_SEG_STRUC));
    };
  };

/**************************************************************************
   procedure

   read_post

   Read all segment list from prev. layer into post segment lists.

**************************************************************************/
void read_post(in_file)
  FILE *in_file;
  {
  OUT_SEG_STRUC *seg_ptr;
  OUT_SEG_STRUC *end_LB_seg_list         = NULL_SEG;
  OUT_SEG_STRUC *end_LH_seg_list         = NULL_SEG;
  OUT_SEG_STRUC *end_NFDB_seg_list       = NULL_SEG;
  OUT_SEG_STRUC *end_NFDH_seg_list       = NULL_SEG;
  OUT_SEG_STRUC *end_NFDF_seg_list       = NULL_SEG;
  OUT_SEG_STRUC *end_NFUB_seg_list       = NULL_SEG;
  OUT_SEG_STRUC *end_NFUH_seg_list       = NULL_SEG;
  OUT_SEG_STRUC *end_NFUF_seg_list       = NULL_SEG;
  OUT_SEG_STRUC *end_FDB_seg_list        = NULL_SEG;
  OUT_SEG_STRUC *end_FDH_seg_list        = NULL_SEG;
  OUT_SEG_STRUC *end_FDF_seg_list        = NULL_SEG;
  OUT_SEG_STRUC *end_FUB_seg_list        = NULL_SEG;
  OUT_SEG_STRUC *end_FUH_seg_list        = NULL_SEG;
  OUT_SEG_STRUC *end_FUF_seg_list        = NULL_SEG;

  post_LB_seg_list        = NULL_SEG;
  post_LH_seg_list        = NULL_SEG;
  post_NFDB_seg_list      = NULL_SEG;
  post_NFDH_seg_list      = NULL_SEG;
  post_NFDF_seg_list      = NULL_SEG;
  post_NFUB_seg_list      = NULL_SEG;
  post_NFUH_seg_list      = NULL_SEG;
  post_NFUF_seg_list      = NULL_SEG;
  post_FDB_seg_list       = NULL_SEG;
  post_FDH_seg_list       = NULL_SEG;
  post_FDF_seg_list       = NULL_SEG;
  post_FUB_seg_list       = NULL_SEG;
  post_FUH_seg_list       = NULL_SEG;
  post_FUF_seg_list       = NULL_SEG;

  if (in_file != (FILE *) NULL) {
    seg_ptr = (OUT_SEG_STRUC *) mem_alloc(sizeof(OUT_SEG_STRUC));
    while ((fread(seg_ptr,sizeof(OUT_SEG_STRUC),1,in_file) == 1) &&
           (feof(in_file) == 0)) {
      seg_ptr-> next_seg = NULL_SEG;
      switch (seg_ptr-> normal_info) { /* "normal_info" has list type */
        case LB_CODE :
          if (end_LB_seg_list != NULL_SEG)
            end_LB_seg_list-> next_seg = seg_ptr;
          else post_LB_seg_list = seg_ptr;
          end_LB_seg_list = seg_ptr;
          break;
        case LH_CODE :
          if (end_LH_seg_list != NULL_SEG)
            end_LH_seg_list-> next_seg = seg_ptr;
          else post_LH_seg_list = seg_ptr;
          end_LH_seg_list = seg_ptr;
          break;
        case NFDB_CODE :
          if (end_NFDB_seg_list != NULL_SEG)
```

```
    end_NFDB_seg_list-> next_seg = seg_ptr;
  else post_NFDB_seg_list = seg_ptr;
  end_NFDB_seg_list = seg_ptr;
  break;
case NFDH_CODE :
  if (end_NFDH_seg_list != NULL_SEG)
    end_NFDH_seg_list-> next_seg = seg_ptr;
  else post_NFDH seg_list = seg_ptr;
  end_NFDH_seg_list = seg_ptr;
  break;
case NFDF_CODE :
  if (end_NFDF_seg_list != NULL_SEG)
    end_NFDF_seg_list-> next_seg = seg_ptr;
  else post_NFDF_seg_list = seg_ptr;
  end_NFDF_seg_list = seg_ptr;
  break;
case NFUB_CODE :
  if (end_NFUB_seg_list != NULL_SEG)
    end_NFUB_seg_list-> next_seg = seg_ptr;
  else post_NFUB_seg_list = seg_ptr;
  end_NFUB_seg_list = seg_ptr;
  break;
case NFUH_CODE :
  if (end_NFUH_seg_list != NULL_SEG)
    end_NFUH_seg_list-> next_seg = seg_ptr;
  else post_NFUH_seg_list = seg_ptr;
  end_NFUH_seg_list = seg_ptr;
  break;
case NFUF_CODE :
  if (end_NFUF_seg_list != NULL_SEG)
    end_NFUF_seg_list-> next_seg = seg_ptr;
  else post_NFUF_seg_list = seg_ptr;
  end_NFUF_seg_list = seg_ptr;
  break;
case FDB_CODE :
  if (end_FDB_seg_list != NULL_SEG)
    end_FDB_seg_list-> next_seg = seg_ptr;
  else post_FDB_seg_list = seg_ptr;
  end_FDB_seg_list = seg_ptr;
  break;
case FDH_CODE :
  if (end_FDH_seg_list != NULL_SEG)
    end_FDH_seg_list-> next_seg = seg_ptr;
  else post_FDH_seg_list = seg_ptr;
  end_FDH_seg_list = seg_ptr;
  break;
case FDF_CODE :
  if (end_FDF_seg_list != NULL_SEG)
    end_FDF_seg_list-> next_seg = seg_ptr;
  else post_FDF_seg_list = seg_ptr;
  end_FDF_seg_list = seg_ptr;
  break;
case FUB_CODE :
  if (end_FUB_seg_list != NULL_SEG)
    end_FUB_seg_list-> next_seg = seg_ptr;
  else post_FUB_seg_list = seg_ptr;
  end_FUB_seg_list = seg_ptr;
  break;
case FUH_CODE :
  if (end_FUH_seg_list != NULL_SEG)
    end_FUH_seg_list-> next_seg = seg_ptr;
  else post_FUH_seg_list = seg_ptr;
  end_FUH_seg_list = seg_ptr;
  break;
case FUF_CODE :
  if (end_FUF_seg_list != NULL_SEG)
```

```
          end_FUF_seg_list-> next_seg = seg_ptr;
        else post_FUF_seg_list = seg_ptr;
        end_FUF_seg_list = seg_ptr;
        break;
      default :
        fprintf(stderr,"Unknow Section Code (read_post) %u\n",seg_ptr->normal_ir
        exit(1);
        break;
      };
    seg_ptr = (OUT_SEG_STRUC *) mem_alloc(sizeof(OUT_SEG_STRUC));
    };
  mem_free(seg_ptr,sizeof(OUT_SEG_STRUC));
  };
};

/*****************************************************************************
   local procedure

   process_output_section


*****************************************************************************/


static void process_output_section (LB_seg_list, z_index,
                                    z, user_info, main_seg_file)


   OUT_SEG_STRUC     **LB_seg_list;
   UINT16            z_index,z;
   USER_INFO_STRUC   *user_info;
   FILE              *main_seg file;

{
   OUT_SEG_STRUC *master_seg_list          = NULL_SEG;
   OUT_SEG_STRUC *LH_seg_list              = NULL_SEG;
   OUT_SEG_STRUC *NFUH_seg_list            = NULL_SEG;
   OUT_SEG_STRUC *NFUF_seg_list            = NULL_SEG;
   OUT_SEG_STRUC *NFDH_seg_list            = NULL_SEG;
   OUT_SEG_STRUC *NFDF_seg_list            = NULL_SEG;
   OUT_SEG_STRUC *FDH_seg_list             = NULL_SEG;
   OUT_SEG_STRUC *FDF_seg_list             = NULL_SEG;
   OUT_SEG_STRUC *FUH_seg_list             = NULL_SEG;
   OUT_SEG_STRUC *FUF_seg_list             = NULL_SEG;

   OUT_SEG_STRUC *temp_ptr;
   INT16         loop_count = 0;
   BOOLEAN       do_hatch_flag,do_fill_flag;
   UINT16        last_z_level;

  if (post_z_level > (unsigned long) MAX_Z_VAL) {
    pfp_delete_seg_list(LB_seg_list);
    pfp_delete_seg_list(&post_LB_seg_list);
    pfp_delete_seg_list(&post_LH_seg_list);
    pfp_delete_seg_list(&post_NFDB_seg_list);
    pfp_delete_seg_list(&post_NFDH_seg_list);
    pfp_delete_seg_list(&post_NFDF_seg_list);
    pfp_delete_seg_list(&post_NFUB_seg_list);
    pfp_delete_seg_list(&post_NFUH_seg_list);
    pfp_delete_seg_list(&post_NFUF_seg_list);
    pfp_delete_seg_list(&post_FDB_seg_list);
    pfp_delete_seg_list(&post_FDH_seg_list);
    pfp_delete_seg_list(&post_FDF_seg_list);
    pfp_delete_seg_list(&post_FUB_seg_list);
```

```
  pfp_delete_seg_list(&post_FUH_seg_list);
  pfp_delete_seg_list(&post_FUF_seg_list);
  }
else {
  last_z_level = (UINT16) post_z_level;
  do_hatch_flag = (user_info-> y_hatch_spacing) ||
                  (user_info-> x_hatch_spacing) ||
                  (user_info-> angle_hatch_spacing);

  do_fill_flag  = (user_info-> y_flat_fill_spacing) ||
                  (user_info-> x_flat_fill_spacing);

  if (!do_hatch_flag && !do_fill_flag) {
    pfp_delete_seg_list(&FU_seg_bucket_array[z_index]);
    pfp_delete_seg_list(&FD_seg_bucket_array[z_index]);
    pfp_delete_seg_list(&NFU_seg_bucket_array[z_index]);
    pfp_delete_seg_list(&NFD_seg_bucket_array[z_index]);
    }
  else {
    pfp_remove_duplicate_edges(&FU_seg_bucket_array[z_index]);
    pfp_remove_duplicate_edges(&FD_seg_bucket_array[z_index]);
    pfp_remove_duplicate_edges(&NFU_seg_bucket_array[z_index]);
    pfp_remove_duplicate_edges(&NFD_seg_bucket_array[z_index]);
    };
  pfp_remove_duplicate_edges(LB_seg_list);

  pfp_sort_seg_list (LB_seg_list, &loop_count);
  pfp_sort_seg_list (&FU_seg_bucket_array[z_index], &loop_count);
  pfp_sort_seg_list (&FD_seg_bucket_array[z_index], &loop_count);
  pfp_sort_seg_list (&NFU_seg_bucket_array[z_index], &loop_count);
  pfp_sort_seg_list (&NFD_seg_bucket_array[z_index], &loop_count);

/*
  if (user_info->cure) {
    cure_compensate(LB_seg_list);
    cure_compensate(&FU_seg_bucket_array[z_index]);
    cure_compensate(&FD_seg_bucket_array[z_index]);
    cure_compensate(&NFU_seg_bucket_array[z_index]);
    cure_compensate(&NFD_seg_bucket_array[z_index]);
    };
*/

  if (do_hatch_flag) {
    pfp_get_hatch_lines (*LB_seg_list, &LH_seg_list,
                         user_info-> x_hatch_spacing,
                         user_info-> y_hatch_spacing,
                         user_info-> angle_hatch_spacing,
                         user_info-> min_intersect_angle,FALSE);
    pfp_get_hatch_lines (NFD_seg_bucket_array[z_index], &NFDH_seg_list,
                         user_info-> x_hatch_spacing,
                         user_info-> y_hatch_spacing,
                         user_info-> angle_hatch_spacing,
                         user_info-> min_intersect_angle,TRUE);
    };
  if (do_fill_flag) {
    pfp_get_hatch_lines (FU_seg_bucket_array[z_index], &FUF_seg_list,
                         user_info-> x_flat_fill_spacing,
                         user_info-> y_flat_fill_spacing, 0, 0, TRUE);
    pfp_get_hatch_lines (FD_seg_bucket_array[z_index], &FDF_seg_list,
                         user_info-> x_flat_fill_spacing,
                         user_info-> y_flat_fill_spacing, 0, 0, TRUE);
    pfp_get_hatch_lines (NFU_seg_bucket_array[z_index], &NFUF_seg_list,
                         user_info-> x_flat_fill_spacing,
                         user_info-> y_flat_fill_spacing, 0, 0, TRUE);
    pfp_get_hatch_lines (NFD_seg_bucket_array[z_index], &NFDF_seg_list,
                         user_info-> x_flat_fill_spacing,
```

```
                    user_info-> y_flat_fill_spacing, 0, 0, TRUE);
  };

  if (main_seg_file != (FILE *) NULL) {
    if (!user_info-> in_mem) {
      post_process_seg_file[post_file_number] = fopen(post_process_filename[post_
      write_post(*LB_seg_list, post_process_seg_file[post_file_number],LB_CODE);
      write_post(LH_seg_list, post_process_seg_file[post_file_number],LH_CODE);
      write_post(NFD_seg_bucket_array[z_index], post_process_seg_file[post_file_n
      write_post(NFDH_seg_list, post_process_seg_file[post_file_number],NFDH_CODE
      write_post(NFDF_seg_list, post_process_seg_file[post_file_number],NFDF_CODE
      write_post(NFU_seg_bucket_array[z_index], post_process_seg_file[post_file_n
      write_post(NFUH_seg_list, post_process_seg_file[post_file_number],NFUH_CODE
      write_post(NFUF_seg_list, post_process_seg_file[post_file_number],NFUF_CODE
/*
      write_post(FD_seg_bucket_array[z_index], post_process_seg_file[post_file_nu
      write_post(FDH_seg_list, post_process_seg_file[post_file_number],FDH_CODE);
*/
      write_post(FDF_seg_list, post_process_seg_file[post_file_number],FDF_CODE);
/*
      write_post(FU_seg_bucket_array[z_index], post_process_seg_file[post_file_nu
      write_post(FUH_seg_list, post_process_seg_file[post_file_number],FUH_CODE);
      write_post(FUF_seg_list, post_process_seg_file[post_file_number],FUF_CODE);
*/
      fclose(post_process_seg_file[post_file_number]);

      post_file_number = (++post_file_number)%2;
      post_process_seg_file[post_file_number] = fopen(post_process_filename[post_
      read_post(post_process_seg_file[post_file_number]);
      fclose(post_process_seg_file[post_file_number]);
      }

    comb_list(&master_seg_list,&post_LB_seg_list,LB_CODE);
    comb_list(&master_seg_list,&post_LH_seg_list,LH_CODE);
    comb_list(&master_seg_list,&post_NFDB_seg_list,NFDB_CODE);
    comb_list(&master_seg_list,&post_NFDH_seg_list,NFDH_CODE);
    comb_list(&master_seg_list,&post_NFDF_seg_list,NFDF_CODE);
    comb_list(&master_seg_list,&post_NFUB_seg_list,NFUB_CODE);
    comb_list(&master_seg_list,&post_NFUF_seg_list,NFUF_CODE);
    comb_list(&master_seg_list,&post_FDB_seg_list,FDB_CODE);
    comb_list(&master_seg_list,&post_FDF_seg_list,FDF_CODE);
    comb_list(&master_seg_list,&FU_seg_bucket_array[z_index],FUB_CODE);
    comb_list(&master_seg_list,&FUF_seg_list,FUF_CODE);

    if (master_seg_list != NULL_SEG) {
      pfp_print_seg_list(&post_LB_seg_list,last_z_level,main_seg_file,LB_CODE,use
      pfp_print_seg_list(&post_LH_seg_list,last_z_level,main_seg_file,LH_CODE,use
      pfp_print_seg_list(&post_NFDB_seg_list,last_z_level,main_seg_file,NFDB_CODE
      pfp_print_seg_list(&post_NFDH_seg_list,last_z_level,main_seg_file,NFDH_CODE
      pfp_print_seg_list(&post_NFUB_seg_list,last_z_level,main_seg_file,NFUB_CODE
      pfp_print_seg_list(&post_FDB_seg_list,last_z_level,main_seg_file, FDB_CODE,
      pfp_print_seg_list(&post_FDF_seg_list,last_z_level,main_seg_file, FDF_CODE,
      pfp_print_seg_list(&post_NFDF_seg_list,last_z_level,main_seg_file,NFDF_CODE
      pfp_print_seg_list(&post_NFUF_seg_list,last_z_level,main_seg_file,NFUF_CODE
      pfp_print_seg_list(&FU_seg_bucket_array[z_index], last_z_level, main_seg_fi
      pfp_print_seg_list(&FUF_seg_list, last_z_level, main_seg_file, FUF_CODE, us
      fflush(main_seg_file);
      }

    post_z_level = (unsigned long) z;

    if (user_info-> in_mem) {
      post_LB_seg_list   = *LB_seg_list;
      post_LH_seg_list   = LH_seg_list;
      post_NFDB_seg_list = NFD_seg_bucket_array[z_index];
```

```
        post_NFDH_seg_list = NFDH_seg_list;
        post_NFUB_seg_list = NFU_seg_bucket_array[z_index];
        post_FDB_seg_list  = FD_seg_bucket_array[z_index];
        post_FDF_seg_list  = FDF_seg_list;
        post_NFDF_seg_list = NFDF_seg_list;
        post_NFUF_seg_list = NFUF_seg_list;
        }
      }
    FD_seg_bucket_array[z_index] = NULL_SEG;
    FU_seg_bucket_array[z_index] = NULL_SEG;
    NFD_seg_bucket_array[z_index] = NULL_SEG;
    NFU_seg_bucket_array[z_index] = NULL_SEG;
    };
} /* process_output_section */




/****************************************************************************
    local procedure

    generate_cross_sections


****************************************************************************/


static void generate_cross_sections (seg_file, user_info)

    FILE               *seg_file;
    USER_INFO_STRUC    *user_info;

{
    INPUT_TRI_STRUC **tri_bucket_ptr;
    OUT_SEG_STRUC   *border_seg_list;
    VECT_TRI_STRUC  *z_active_list;
    UINT16          zi, zon, section_count = 0;


    z_active_list = NULL_VECT_TRI;

    get_min_max_z ();  /* sets all_'s */
    zi = all_min_z_index;
    do {
       zon = z_control_table [zi];
       section_count++;
       if (!user_info-> display_on)
         fprintf(stderr," generating cross section %u level %u\r",section_count,zon);
       tri_bucket_ptr = &tri_bucket_array [zi];
       border_seg_list = NULL_SEG;
       pfp_update_z_active_list (tri_bucket_ptr, &border_seg_list, &z_active_list);
       pfp_process_z_active_list (&z_active_list, zon, &border_seg_list);

       process_output_section (&border_seg_list, zi, zon, user_info, seg_file);
       zi++;
    } while ((zi <= all_max_z_index) || (z_active_list != NULL_VECT_TRI));

  fprintf(stderr,"\n");

} /* generate_cross_sections */
```

```
/*****************************************************************************
   local procedure

   init_slice_output_file

*****************************************************************************/

static void init_slice_output_file (user_info, seg_file)

   USER_INFO_STRUC *user_info;
   FILE *seg_file;

{
   fprintf(seg_file,"!3DSYS SLA-1 SLICE FILE\n");
   fprintf(seg_file,"!SLICE= -VER %s",VERSION);
   fprintf(seg_file," %s %f",RES_OPTION,user_info-> res_value);
   fprintf(seg_file," %s %u",X_HATCH_SPACE_OPTION,user_info-> x_hatch_spacing);
   fprintf(seg_file," %s %u",Y_HATCH_SPACE_OPTION,user_info-> y_hatch_spacing);
   fprintf(seg_file," %s %u",XF_HATCH_SPACE_OPTION,user_info-> x_flat_fill_spacing)
   fprintf(seg_file," %s %u",YF_HATCH_SPACE_OPTION,user_info-> y_flat_fill_spacing)
   fprintf(seg_file," %s %u",ANGLE_HATCH_SPACE_OPTION,user_info-> angle_hatch_spaci
   fprintf(seg_file," %s %u",MIN_SURFACE_ANGLE_OPTION,user_info-> min_surface_angle
   fprintf(seg_file," %s %u",MIN_INTERSECT_ANGLE_OPTION,user_info-> min_intersect_a
   if (*(user_info-> z_space_filename) > '\0')
      fprintf(seg_file," %s %s",Z_SPACE_FILE_OPTION,user_info-> z_space_filename);
   else
      fprintf(seg_file," %s %u",Z_SPACE_OPTION,user_info-> z_spacing);
   if (*(user_info-> internal_filename) > '\0')
      fprintf(seg_file," %s %s",INTERNAL_OPTION,user_info-> internal_filename);
   if (user_info-> axis == 1)
      fprintf(seg_file," %s",X_AXIS_OPTION);
   if (user_info-> axis == 2)
      fprintf(seg_file," %s",Y_AXIS_OPTION);
   if (user_info-> binary_input)
      fprintf(seg_file," %s",BINARY_INPUT_OPTION);
   if (user_info-> centering_off == FALSE)
      fprintf(seg_file," %s",CENTER_OPTION);
   if (user_info-> section_codes_off == FALSE)
      fprintf(seg_file," %s",SECTION_CODES_OFF_OPTION);
   if (user_info-> in_mem == FALSE)
      fprintf(seg_file," %s",DISK_OPTION);
   if (user_info-> attrib == FALSE)
      fprintf(seg_file," %s",ARIES_OPTION);
   fprintf(seg_file,"\n");
} /* init_slice_output_file */



/*****************************************************************************

   Main procedure for PFP

*****************************************************************************/

main (argc, argv)

   INT16  argc;
   STRING *argv[];

{
```

```
USER_INFO_STRUC user_info;
FILE            *seg_file;
STRING          start_time [100],end_time[100];
STRING          line[80],file_str0[16],file_str1[16];
INT16           i;
OUT_SEG_STRUC   *dummy_seg;


get_timestamp (start_time);

fprintf (stderr, "\n %s      Version %s       %s",
                  BANNER, VERSION, start_time);

post_file_number = 0;
temp_count = 0;

pfp_get_user_info (argc, argv, &user_info);
print_user_info (stderr, &user_info);
set_z_spacing (&user_info);
if (*(user_info.segfile_name) != '\0')
  openfile (user_info .segfile_name, &seg_file, "w");
else seg_file = stdout;
init_slice_output_file (&user_info,seg_file);

pfp_get_input_database (stdin, &user_info);

if (user_info .display_on)
   init_graphics ();

post_process_filename[0] = file_str0;
post_process_filename[1] = file_str1;
if (!user_info.in_mem) for (i=0; i<2; i++) {
  strcpy(post_process_filename[i],"SLICEXXXXXX");
  mktemp(post_process_filename[i]);
  post_process_seg_file[i] = fopen(post_process_filename[i],"wb");
  fclose(post_process_seg_file[i]);
  }

generate_cross_sections (seg_file, &user_info);

if (user_info .display_on)
   end_graphics ();

post_z_level += ((unsigned long) MAX_Z_VAL + 1);
dummy_seg = NULL_SEG;
process_output_section(&dummy_seg,1,0,&user_info, seg_file);
if (!user_info.in_mem) for (i=0; i<2; i++) {
  strcpy(line,"rm ");
  strcat(line,post_process_filename[i]);
  system(line);
  };

fprintf (stderr, "\n max memory allocation : %ld bytes\n",
                  max_mem_alloc);
fprintf (stderr, " total memory allocation : %ld bytes\n",
                  total_mem_alloc);
if (curr_mem_alloc != 0)
  fprintf(stderr," warning: %ld bytes not freed\n",curr_mem_alloc);
get_timestamp (end_time);
fprintf (stderr, "\n");
fprintf (stderr, " Start Time: %s",start_time);
fprintf (stderr, "   End Time: %s",end_time);
exit(SYS_SUCCESS);
}
```

```
/*************************************************************************************/
/*                                                                                 */
/* FP.H                                                                            */
/*                                                                                 */
/*                                                                                 */
/*                              MODIFICATION LOG                                   */
/*---------------------------------------------------------------------------------*/
/* date        who                what                                             */
/*---------------------------------------------------------------------------------*/
/*           |P. Stinebaugh    | original code                                     */
/*           |                 |                                                   */
/*************************************************************************************/

typedef unsigned long        UINT32;
typedef unsigned short       UINT16;
typedef short                INT16;
typedef unsigned char        BOOLEAN;
typedef unsigned char        UINT8;
typedef char                 STRING;

#define SYS_SUCCESS          0
#define SYS_FAILURE          1

#define DISPLAY_OFF          0
#define DISPLAY_ON           1

#define LB_CODE              1
#define LH_CODE              2
#define NFUB_CODE            3
#define NFUH_CODE            4
#define NFUF_CODE            5
#define NFDB_CODE            6
#define NFDH_CODE            7
#define NFDF_CODE            8
#define FDB_CODE             9
#define FDH_CODE             10
#define FDF_CODE             11
#define FUB_CODE             12
#define FUH_CODE             13
#define FUF_CODE             14

#define TRUE                 1
#define FALSE                0

#define MAX_POINTER_INDEX    16383

#define MAX_Z_VAL            65535
#define MAX_Z_INDEX          16383
#define MAX_X_VAL            65535
#define MAX_Y_VAL            65535

#define MAX_DBL              1E+38
#define MAX_UINT             65535
#define ZERO_DEF             1E-5
#define RADIANS_PER_DEGREE   0.0174532926666666666
```

```
   local procedure

   locate_segment_points

   Returns two hatch line endpoints from hatch point table of a valid hatch
    line.  Looks for one "in" and one "out" point to make segment.  Uses
    in/out area count to evaluate critical points.

*****************************************************************************/
static void locate_segment_points (hatch_index,point1, point2)
  UINT16            hatch_index:
  HATCH_POINT_STRUC **point1;
  HATCH_POINT_STRUC **point2;
  {
  HATCH_POINT_STRUC *scan_ptr,*back_ptr;

  scan_ptr = hatch_point_table [hatch_index];

  /* Find first IN point */
  do
    *point1 = scan_x(&scan_ptr);
  while ((*point1 != NULL_HATCH_POINT) && (incount <= 0));

  /* Look for next X where only OUT points exist */
  if (*point1 != NULL_HATCH_POINT) {
    *point2 = NULL_HATCH_POINT;
    while ((scan_ptr != NULL_HATCH_POINT) && (*point2 == NULL_HATCH_POINT)) {
      *point2 = scan_x(&scan_ptr);
      if (incount >= 0) *point2 = NULL_HATCH_POINT;
      };
    };

  if ((*point1 == NULL_HATCH_POINT) || (*point2 == NULL_HATCH_POINT)) {
    *point1 = NULL_HATCH_POINT;
    *point2 = NULL_HATCH_POINT;
    while (hatch_point_table[hatch_index] != NULL_HATCH_POINT) {
      back_ptr = hatch_point_table[hatch_index];
      hatch_point_table[hatch_index] = back_ptr->next_point;
      mem_free (back_ptr,sizeof(HATCH_POINT_STRUC));
      };
    }
  else
    while (hatch_point_table[hatch_index] != (*point2)->next_point) {
      back_ptr = hatch_point_table[hatch_index];
      hatch_point_table[hatch_index] = back_ptr->next_point;
      if ((back_ptr != *point1) && (back_ptr != *point2))
        mem_free (back_ptr,sizeof(HATCH_POINT_STRUC));
      };

}; /* locate_segment_points */


/*****************************************************************************

    exchange_xy_normal_info

    Exchanges the X and Y normal information in a normal_info byte.
     Used for 90 degree rotation (swapping X & Y values)

*****************************************************************************/
static void exchange_xy_normal_info(normal_info)
  UINT8 *normal_info;
  {
  UINT8 new_norm;

  new_norm = *normal_info&(255 - NORMAL_X_NEGATIVE - NORMAL_X_POSITIVE
```

```
/***************************************************************************/
/*                                                                         */
/*  PFPCHL.C                                                               */
/*                                                                         */
/*  PFP Cross-Hatch Line Module                                            */
/*                                                                         */
/*                              MODIFICATION LOG                           */
/*-------------------------------------------------------------------------*/
/* date        who                what                                     */
/*-------------------------------------------------------------------------*/
/*           |P. Stinebaugh    | original code                             */
/*           |R. Harlow        | new code                                  */
/*           |                 |                                           */
/***************************************************************************/


#include <stdio.h>
#include <math.h>

#include "pfp.h"
#include "pfpseg.h"
#include "pfpchl.h"
#include "pfputl.h"


#define IN_FLAG          1
#define OUT_FLAG         2

double          hatch_angle;
double          hatch_m;
double          hatch_b_value;
double          hatch_b_spacing;
double          hatch_bottom;
UINT16          hatch_max_index;
BOOLEAN         elim_flat_tri;
INT16           incount;

static HATCH_POINT_STRUC *hatch_point_table [MAX_POINTER_INDEX];
static BOOLEAN hatch_clear = FALSE;

static HATCH_POINT_STRUC *scan_x(point)
  HATCH_POINT_STRUC **point;
  {
  HATCH_POINT_STRUC *back_ptr = NULL_HATCH_POINT;
  UINT16              min_angle,curr_x;
  UINT8               flag;

  if (*point != NULL_HATCH_POINT) {
    incount = 0;
    min_angle = MAX_UINT;
    curr_x = (*point)->x_val;
    do {
      if ((*point)->enter_flag&IN_FLAG) incount++;
      else incount--;
      if ((*point)->angle < min_angle) min_angle = (*point)->angle;
      back_ptr = *point;
      *point = (*point)->next_point;
    } while ((*point != NULL_HATCH_POINT) && (curr_x == (*point)->x_val));
    back_ptr->angle = min_angle;
    };
  return(back_ptr);
  };

/***************************************************************************
```

```
                                  - NORMAL_Y_NEGATIVE - NORMAL_Y_POSITIVE);
  if (*normal_info&NORMAL_X_POSITIVE) new_norm |= NORMAL_Y_POSITIVE;
  if (*normal_info&NORMAL_X_NEGATIVE) new_norm |= NORMAL_Y_NEGATIVE;
  if (*normal_info&NORMAL_Y_POSITIVE) new_norm |= NORMAL_X_POSITIVE;
  if (*normal_info&NORMAL_Y_NEGATIVE) new_norm |= NORMAL_X_NEGATIVE;
  *normal_info = new_norm;
  };



/*****************************************************************************

    compute_b_value

    Finds B intersect of hatch line on or below a point

*****************************************************************************/
static double compute_b_value(x,y)
  UINT16 x,y;
  {

  return((double) (y - hatch_m * x));
  };

/*****************************************************************************

    compute_b_index

    Returns the index value in the hatch point table for the hatch B value.

*****************************************************************************
static UINT16 compute_b_index(b)
  double b;
  {
  double round_dbl();

  return((UINT16) round_dbl((b-hatch_bottom)/hatch_b_spacing));
  };*/

/*****************************************************************************

    compute_low_b_index

    Returns the index value in the hatch point table on or below for the hatch
     B value.

*****************************************************************************
static UINT16 compute_low_b_index(b)
  double b;
  {
  double round_dbl();

  return((UINT16) floor((b-hatch_bottom)/hatch_b_spacing));
  };*/


/*****************************************************************************

    get_segment

    Goes threw hatch point list (locate_seg_points) and adds a hatch line to
     segment list if one is found.

*****************************************************************************/
static void get_segment (hatch_index, hatch_list, min_intersect_angle,
```

```
                        hatch_line_found)

  UINT16             hatch_index;
  OUT_SEG_STRUC      **hatch_list;
  UINT16             min_intersect_angle;
  BOOLEAN            *hatch_line_found;
  {
  OUT_SEG_STRUC      *seg_ptr;
  HATCH_POINT_STRUC *point1_ptr, *point2_ptr;

  *hatch_line_found = FALSE;

  locate_segment_points (hatch_index, &point1_ptr, &point2_ptr);

  if ((point1_ptr != NULL_HATCH_POINT) &&
      (point1_ptr-> angle >= min_intersect_angle) &&
      (point2_ptr-> angle >= min_intersect_angle)) {
    seg_ptr = (OUT_SEG_STRUC *) mem_alloc (sizeof (OUT_SEG_STRUC));
    seg_ptr-> x_1 = point1_ptr-> x_val;
    seg_ptr-> x_2 = point2_ptr-> x_val;
    seg_ptr-> y_1 = point1_ptr-> y_val;
    seg_ptr-> y_2 = point2_ptr-> y_val;
    seg_ptr-> next_seg = *hatch_list;
    *hatch_list = seg_ptr;
    *hatch_line_found = TRUE;
    }

  if (point1_ptr != NULL_HATCH_POINT) {
    mem_free (point1_ptr,sizeof(HATCH_POINT_STRUC));
    mem_free (point2_ptr,sizeof(HATCH_POINT_STRUC));
    };

} /* get_segment */



/*******************************************************************************
  local procedure

  add_point_to_table

  Adds a hatch point to hatch point table

*******************************************************************************/
static void add_point_to_table (x,y,new_angle,new_enter_flag)
 UINT16             x,y;
 INT16              new_angle;
 UINT8              new_enter_flag;
 {
 HATCH_POINT_STRUC *front_ptr, *back_ptr,*new_point_ptr;
 UINT16             hatch_index;
 BOOLEAN            add_flag;

 hatch_index = floor((hatch_b_value - hatch_bottom + hatch_b_spacing/2)
                    /hatch_b_spacing);

 if (hatch_index >= MAX_POINTER_INDEX) {
   fprintf (stderr, "\n error - number of hatch lines exceeds limit of %u\n",(UIN
   exit (SYS_FAILURE);
   };

 front_ptr = hatch_point_table [hatch_index];
 back_ptr  = NULL_HATCH_POINT;

/* Search List for X value */
```

```
while ((front_ptr != NULL_HATCH_POINT) &&
       (front_ptr-> x_val < x)) {
  back_ptr  = front_ptr;
  front_ptr = front_ptr-> next_point;
  };

new_point_ptr = (HATCH_POINT_STRUC *) mem_alloc(sizeof(HATCH_POINT_STRUC));
if (back_ptr == NULL_HATCH_POINT) {
  new_point_ptr->next_point = hatch_point_table[hatch_index];
  hatch_point_table[hatch_index] = new_point_ptr;
  }
else {
  new_point_ptr->next_point = front_ptr;
  back_ptr->next_point = new_point_ptr;
  };
new_point_ptr-> x_val = x;
new_point_ptr-> y_val = y;
new_point_ptr-> angle = new_angle;
new_point_ptr-> enter_flag = new_enter_flag;
if (hatch_index > hatch_max_index) hatch_max_index = hatch_index;

}; /* add_point_to_table */

/*************************************************************************************

   compute_line

   Compute M and B for line between two points

*************************************************************************************/
static void compute_line(x1,y1,x2,y2,m,b)
 UINT16       x1,y1;
 UINT16       x2,y2;
 double   *m;
 double   *b;
 {
 if (x1 == x2) {
   *m = (double) MAX_DBL;
   *b = (double) x1;
   }
 else {
   *m = ((double) y2 - y1)/((double) x2 - x1);
   *b = (double) y1 - (*m)*(double) x1;
   };
 };

/*************************************************************************************

    get_hatch_bottom

    Finds lowest b a segment point and a hatch line will generate
      so we know what to start point array at.

*************************************************************************************/
static get_hatch_bottom(seg_list,swap_xy)
 OUT_SEG_STRUC *seg_list;
 BOOLEAN        swap_xy;
 {
 double b;
```

```
  hatch_bottom = MAX_DBL;

  while (seg_list != NULL_SEG) {
    if (swap_xy) b = compute_b_value(seg_list->y_1,seg_list->x_1);
    else b = compute_b_value(seg_list->x_1,seg_list->y_1);
    if (b < hatch_bottom) hatch_bottom = b;
    if (swap_xy) b = compute_b_value(seg_list->y_2,seg_list->x_2);
    else b = compute_b_value(seg_list->x_2,seg_list->y_2);
    if (b < hatch_bottom) hatch_bottom = b;
    seg_list = seg_list-> next_seg;
    }
  hatch_bottom = ceil(hatch_bottom/hatch_b_spacing) * hatch_b_spacing;
  };



/*****************************************************************************

    compute_intersect

    Finds intersect point of hatch line and passed line.

*****************************************************************************/
static BOOLEAN compute_intersect(m,b,min_max_info,x,y)
  double          m,b;
  MIN_MAX_STRUC *min_max_info;
  UINT16          *x,*y;
  {
  double        dx,dy;
  double        round_dbl();

  if (m != hatch_m) {
    if (m == MAX_DBL)  dx = b;
    else dx = (b-hatch_b_value)/(hatch_m-m);
    dy = round_dbl(hatch_m*dx + hatch_b_value);
    dx = round_dbl(dx);
    if ((dx >= min_max_info->min_x) && (dx <= min_max_info->max_x) &&
        (dy >= min_max_info->min_y) && (dy <= min_max_info->max_y)) {
      *x = (UINT16) (dx);
      *y = (UINT16) (dy);
      return(TRUE);
      }
    };
  return(FALSE);
  };



/*****************************************************************************

    get_hatch_points

    Gets hatch intersect points for border segment and stores
      into hatch level

*****************************************************************************/
static void get_hatch_points(seg_ptr,swap_xy)
  OUT_SEG_STRUC *seg_ptr;
  BOOLEAN        swap_xy;
  {
  UINT16         x1,y1,x2,y2;
  UINT16         hatch_x,hatch_y;
  double         seg_m,seg_b;
```

```
INT16          angle;
UINT16         start_b_index,end_b_index;
double         b_val_1,b_val_2;
UINT8          enter_flag;
MIN_MAX_STRUC  min_max_info;
double         temp_dbl;

enter_flag = seg_ptr->normal_info;
if (!swap_xy) {
  x1 = seg_ptr->x_1;
  y1 = seg_ptr->y_1;
  x2 = seg_ptr->x_2;
  y2 = seg_ptr->y_2;
  }
else {
  x1 = seg_ptr->y_1;
  y1 = seg_ptr->x_1;
  x2 = seg_ptr->y_2;
  y2 = seg_ptr->x_2;
  exchange_xy_normal_info(&enter_flag);
  };

b_val_1 = compute_b_value(x1,y1);
b_val_2 = compute_b_value(x2,y2);
if (b_val_1 < b_val_2) {
  start_b_index = ceil ((b_val_1-hatch_bottom)/hatch_b_spacing);
  end_b_index   = floor((b_val_2-hatch_bottom)/hatch_b_spacing);
  }
else {
  start_b_index = ceil ((b_val_2-hatch_bottom)/hatch_b_spacing);
  end_b_index   = floor((b_val_1-hatch_bottom)/hatch_b_spacing);
  };
if (end_b_index > MAX_POINTER_INDEX) end_b_index = 0;

compute_line(x1,y1,x2,y2,&seg_m,&seg_b);
if (x1<x2) {
  min_max_info.min_x = x1;
  min_max_info.max_x = x2;
  }
else {
  min_max_info.min_x = x2;
  min_max_info.max_x = x1;
  };
if (y1<y2) {
  min_max_info.min_y = y1;
  min_max_info.max_y = y2;
  }
else {
  min_max_info.min_y = y2;
  min_max_info.max_y = y1;
  };

angle = fabs((hatch_angle - atan(seg_m))/RADIANS_PER_DEGREE);
if (angle > 90) angle = 180-angle;

if (seg_m == 0.0) {
  enter_flag &= NORMAL_Y_POSITIVE;
  if (hatch_m < 0.0) enter_flag ^= NORMAL_Y_POSITIVE;
  }
else {
  enter_flag &= NORMAL_X_POSITIVE;
  temp_dbl = fabs(hatch_m); /* For Microport Bug */
  if ((sign(hatch_m) == sign(seg_m)) && (temp_dbl > fabs(seg_m)))
    enter_flag ^= NORMAL_X_POSITIVE;
  };
if (enter_flag) enter_flag = OUT_FLAG;
```

```
  else enter_flag = IN_FLAG;
  enter_flag |= (seg_ptr->normal_info&(FLAT_TRI+NEAR_FLAT_TRI));

  while (start_b_index <= end_b_index) {
    hatch_b_value = start_b_index * hatch_b_spacing + hatch_bottom;
    if (((fabs(seg_m-hatch_m) > ZERO_DEF) ||
         (fabs(seg_b-hatch_b_value) > ZERO_DEF)) &&
        compute_intersect(seg_m,seg_b,&min_max_info,&hatch_x,&hatch_y))
        add_point_to_table(hatch_x,hatch_y,angle,enter_flag);
    start_b_index++;
    };
  };


/*****************************************************************************

    get_hatch_pattern

    Takes border list and generates hatch segments


*****************************************************************************/

static void get_hatch_pattern(border_seg_list,hatch_list,spacing,mia,rot_angle)
  OUT_SEG_STRUC *border_seg_list;
  OUT_SEG_STRUC **hatch_list;
  UINT16        spacing;
  UINT16        mia;
  UINT16        rot_angle;
  {
  UINT16        i,temp_uint;
  int           loop_start,loop_end,pointer,direction;
  BOOLEAN       hatch_found,swap_xy,reverse;
  OUT_SEG_STRUC *hatch_ptr;

  if (rot_angle == 90) {
    swap_xy = TRUE;
    rot_angle = 0;
    }
  else swap_xy = FALSE;

  hatch_angle = (double) rot_angle * RADIANS_PER_DEGREE;
  hatch_m = tan(hatch_angle);
  hatch_b_spacing = spacing/cos(hatch_angle);
  if (hatch_b_spacing < 0) hatch_b_spacing = -hatch_b_spacing;

  get_hatch_bottom(border_seg_list,swap_xy);
  hatch_max_index = 0;
  while (border_seg_list != NULL_SEG) {
    get_hatch_points(border_seg_list,swap_xy);
    border_seg_list = border_seg_list-> next_seg;
    };

  reverse = FALSE;
  loop_start = 0;
  loop_end = hatch_max_index;
  pointer = loop_start;
  direction = 1;
  do {
    do {
      get_segment(pointer,hatch_list,mia,&hatch_found);
      if (hatch_found) {
        hatch_ptr = *hatch_list;
        if (swap_xy) {
          temp_uint = hatch_ptr->x_1;
          hatch_ptr->x_1 = hatch_ptr->y_1;
```

```
        hatch_ptr->y_1 = temp_uint;
        temp_uint = hatch_ptr->x_2;
        hatch_ptr->x_2 = hatch_ptr->y_2;
        hatch_ptr->y_2 = temp_uint;
        };
      if (reverse) {
        temp_uint = hatch_ptr->x_1;
        hatch_ptr->x_1 = hatch_ptr->x_2;
        hatch_ptr->x_2 = temp_uint;
        temp_uint = hatch_ptr->y_1;
        hatch_ptr->y_1 = hatch_ptr->y_2;
        hatch_ptr->y_2 = temp_uint;
        };
      reverse = !reverse;
      };
    pointer += direction;
    } while ((pointer >= loop_start) && (pointer <= loop_end));

   while ((hatch_point_table[loop_start] == NULL_HATCH_POINT) &&
          (loop_start != loop_end))
     loop_start++;
   while ((hatch_point_table[loop_end] == NULL_HATCH_POINT) &&
          (loop_end != loop_start))
     loop_end--;

   if (pointer < loop_start) {
     pointer = loop_start;
     direction = 1;
     }
   else {
     pointer = loop_end;
     direction = -1;
     };
  } while (hatch_point_table[loop_start] != NULL_HATCH_POINT);

  };


/*****************************************************************************
   exported procedure

   pfp_get_hatch_lines

*****************************************************************************/
void pfp_get_hatch_lines (border_seg_list, hatch_list,
                          horiz_spacing, vert_spacing,
                          angle_spacing, min_intersect_angle,elim_flat_tri_flag)
  OUT_SEG_STRUC *border_seg_list;
  OUT_SEG_STRUC **hatch_list;
  UINT16        horiz_spacing;
  UINT16        vert_spacing;
  UINT16        angle_spacing;
  UINT16        min_intersect_angle;
  BOOLEAN       elim_flat_tri_flag;
  {
  UINT16        i;

  if (border_seg_list != NULL_SEG) {

    elim_flat_tri = elim_flat_tri_flag;

    if (!hatch_clear) {
      for (i=0; i < MAX_POINTER_INDEX;i++) hatch_point_table[i] = NULL_HATCH_POINT
      hatch_clear = TRUE;
```

```
    };

  if (horiz_spacing) {
    get_hatch_pattern (border_seg_list, hatch_list,
                       horiz_spacing, min_intersect_angle,0);
    }
  if (vert_spacing) {
    get_hatch_pattern (border_seg_list, hatch_list,
                       vert_spacing, min_intersect_angle,90);
    }
  if (angle_spacing) {
    get_hatch_pattern (border_seg_list, hatch_list,
                       angle_spacing, min_intersect_angle,60);
    get_hatch_pattern (border_seg_list, hatch_list,
                       angle_spacing, min_intersect_angle,120);
    }
  }
} /* pfp_get_hatch_lines */
```

```
/*******************************************************************************/
/*                                                                             */
/*  PFPCHL.H                                                                   */
/*                                                                             */
/*  PFP Cross-Hatch Line Header                                                */
/*                                                                             */
/*******************************************************************************/

struct hatch_point {
    UINT16              x_val;
    UINT16              y_val;
    UINT16              angle;
    UINT8               enter_flag;
    UINT16              triangle_number;
    struct hatch_point *next_point;
   };
typedef struct hatch_point HATCH_POINT_STRUC;

struct min_max_type {
  UINT16        min_x;
  UINT16        max_x;
  UINT16        min_y;
  UINT16        max_y;
  };

typedef struct min max_type MIN_MAX_STRUC;

#define NULL_HATCH_POINT (HATCH_POINT_STRUC *) NULL
```

```
/*****************************************************************************/
/*                                                                           */
/*    PFPGRAF.C                                                              */
/*                                                                           */
/*    PFP graphics module                                                    */
/*                                                                           */
/*                              MODIFICATION LOG                             */
/*---------------------------------------------------------------------------*/
/* date        who                what                                       */
/*---------------------------------------------------------------------------*/
/*            |P. Stinebaugh    | original code                              */
/*            |                 |                                            */
/*****************************************************************************/

#include "pfp.h"

#define Z_LABEL_Z_POSITION 5500
#define Z_LABEL_X_POSITION MAX_X_VAL + 3000

#define Z_VAL_Z_POSITION 50
#define Z_VAL_X_POSITION MAX_X_VAL + 2000

#define LOOP_VAL_Z_POSITION 50000
#define LOOP_VAL_X_POSITION MAX_X_VAL + 4000

#define HORIZ_MARGIN 17000
#define LEFT_EDGE_COORD  0.0 - HORIZ_MARGIN
#define RIGHT_EDGE_COORD MAX_X_VAL + HORIZ_MARGIN




void init_graphics ()

{
/*
   pBegin ("ibm_cga");
*/
/* ??
   pBegin ("hgc");
   pSetActivePage (0);
   pSetDisplayPage (0);
   pDefineWindow ((double) LEFT_EDGE_COORD, (double) 0,
                  (double) RIGHT_EDGE_COORD, (double) MAX_Y_VAL);
   pDefineViewPort ((double) 0, (double) 0, (double) 1.0, (double) 1.0);
   pAllowMappingDistortion (1);
   pEnableWindowClipping (0);
   pSetColor (1);
   pSetCharSize (1, 2);

?? */
} /* init_graphics */



void pfp_display_section_code (section_code)

   UINT8 section_code;
```

```
   STRING code_string [10];

   /* ??
   sprintf (code_string, "%c", section_code);

   pMove ((double) LOOP_VAL_X_POSITION, (double) LOOP_VAL_Z_POSITION);
   pString (code_string);
   ?? */
} /* pfp_display_section_code */


void setup_screen (z_val, loop_count)

  INT16 z_val;
  INT16 loop_count;

{
   STRING string_buf [100];

/*
   if (debug_mode)
      pPause (1);
*/
   /* ??
   pSetColor (1);
   pDrawRectangle ((double) 0.0, (double) 0.0, (double) MAX_X_VAL,
                   (double) MAX_Y_VAL);
   pMove ((double) Z_LABEL_X_POSITION, (double) Z_LABEL_Z_POSITION);
   pString ("Z");
   pMove ((double) Z_VAL_X_POSITION, (double) Z_VAL_Z_POSITION);
   sprintf (string_buf, "%d", z_val);
   pString (string_buf);

   pMove ((double) LOOP_VAL_X_POSITION, (double) LOOP_VAL_Z_POSITION);
   sprintf (string_buf, "%d", loop_count);
   pString (string_buf);
   ?? */
} /* setup_screen */


void draw_line (x1, z1, x2, z2)

   UINT16       x1, z1, x2, z2;

{
   /* ??
   pMove ((double) (UINT16) x1, (double) (UINT16) z1);
   pDrawLine ((double) (UINT16) x2, (double) (UINT16) z2);
   ??? */
} /* draw_line */



void set_display_mode (display_mode)

  INT16 display_mode;

{
   /* ?? pSetColor (display_mode);  ?? */

} /* set_display_mode */
```

```
void end_graphics ()
{
   /* ?? pEnd ();   ?? */
} /* end_graphics */
```

```
/*****************************************************************************/
/*                                                                           */
/*    PFPHI.C                                                                */
/*                                                                           */
/*    PFP human interface module                                             */
/*                                                                           */
/*                            MODIFICATION LOG                               */
/*---------------------------------------------------------------------------*/
/* date        who                what                                       */
/*---------------------------------------------------------------------------*/
/*          | F. Stinebaugh   | original code                                */
/*          |                 |                                              */
/*****************************************************************************/


/*****************************************************************************

   PFPHI.C contains the following routines:

   get_arg_code............ converts command line arg string to code
   not_a_number............ checks a string for a legal numeric value
   get_float_arg........... processes a command line arg float parameter
   get_int_arg............. processes a command line arg integer parameter
   get_filename_arg........ processes an arg that has a filename parameter
   get_user_info_cmd_line.. gets all user info from the command line
   init_user_info.......... initializes user_info structure to standard defaults
   print_cmd_line_help..... prints command line help text to the screen
   check_user_info......... retrieves and processes user option input
   get_user_info........... retrieves and processes user option input

*****************************************************************************/


#include <stdio.h>

#include "pfp.h"
#include "pfphi.h"



/*****************************************************************************
   local procedure

   get_arg_code

   Takes a command line arg and returns the code value of the arg or an unknown
   arg code value.

*****************************************************************************/


static void get_arg_code (input_arg, arg_code)

   STRING *input_arg;
   INT16  *arg_code;

{
   STRING arg[100];
   INT16  i;


   strcpy (arg, input_arg);
```

```
for (i = 0; i < strlen (arg); i++)
   arg [i] = toupper (arg [i]);

if (!strcmp (arg, RES_OPTION))
   *arg_code = RES_OPTION_CODE;

else if (!strcmp (arg, HELP_OPTION))
   *arg_code = HELP_OPTION_CODE;

else if (!strcmp (arg, SEGFILE_OPTION))
   *arg_code = SEGFILE_OPTION_CODE;

else if (!strcmp (arg, DISPLAY_OPTION))
   *arg_code = DISPLAY_OPTION_CODE;

else if (!strcmp (arg, Z_SPACE_OPTION))
   *arg_code = Z_SPACE_OPTION_CODE;

else if (!strcmp (arg, Z_SPACE_FILE_OPTION))
   *arg_code = Z_SPACE_FILE_OPTION_CODE;

else if (!strcmp (arg, XF_HATCH_SPACE_OPTION))
   *arg_code = XF_HATCH_SPACE_OPTION_CODE;

else if (!strcmp (arg, YF_HATCH_SPACE_OPTION))
   *arg_code = YF_HATCH_SPACE_OPTION_CODE;

else if (!strcmp (arg, Y_HATCH_SPACE_OPTION))
   *arg_code = Y_HATCH_SPACE_OPTION_CODE;

else if (!strcmp (arg, X_HATCH_SPACE_OPTION))
   *arg_code = X_HATCH_SPACE_OPTION_CODE;

else if (!strcmp (arg, ANGLE_HATCH_SPACE_OPTION))
   *arg_code = ANGLE_HATCH_SPACE_OPTION_CODE;

else if (!strcmp (arg, CENTER_OPTION))
   *arg_code = CENTER_OPTION_CODE;

else if (!strcmp (arg, SECTION_CODES_OFF_OPTION))
   *arg_code = SECTION_CODES_OFF_OPTION_CODE;

else if (!strcmp (arg, MIN_SURFACE_ANGLE_OPTION))
   *arg_code = MIN_SURFACE_ANGLE_OPTION_CODE;

else if (!strcmp (arg, MIN_INTERSECT_ANGLE_OPTION))
   *arg_code = MIN_INTERSECT_ANGLE_OPTION_CODE;

else if (!strcmp (arg, X_AXIS_OPTION))
   *arg_code = X_AXIS_OPTION_CODE;

else if (!strcmp (arg, Y_AXIS_OPTION))
   *arg_code = Y_AXIS_OPTION_CODE;

else if (!strcmp (arg, BINARY_INPUT_OPTION))
   *arg_code = BINARY_INPUT_OPTION_CODE;

else if (!strcmp (arg, DEBUG_OPTION))
   *arg_code = DEBUG_OPTION_CODE;

else if (!strcmp (arg, DISK_OPTION))
   *arg_code = DISK_OPTION_CODE;

else if (!strcmp (arg, ARIES_OPTION))
   *arg_code = ARIES_OPTION_CODE;
```

```
   else if (!strcmp (arg, INTERNAL_OPTION))
      *arg_code = INTERNAL_OPTION_CODE;

   else
      *arg_code = UNKNOWN_OPTION_CODE;

} /* get_arg_code */



/*****************************************************************************
   local function

   not_a_number

   Takes a character string and determines if it represents a legal integer or
   real value.  A legal number contains only the chars '0' through '9' with at
   most one decimal point and possibly a '-' sign at the beginning of the
   string.

*****************************************************************************/

static INT16 not_a_number (number_string)

   STRING  *number_string;

{
   BOOLEAN decimal_point_found = FALSE;
   BOOLEAN not_a_num = FALSE;

   short number_length;
   short i = 0;


   number_length = strlen (number_string);

   if (number_length == 0)
      not_a_num = TRUE;

   else if ((number_string[i] == '-') || (number_string[i] == '.'))
      {
       i++;
       not_a_num = (i == number_length);
      }

   while ((i < number_length) && !not_a_num)
      {
       if (number_string[i] == '.')
          {
           not_a_num = decimal_point_found;
           decimal_point_found = TRUE;
          }
       else
           not_a_num = ((number_string[i] < '0') || (number_string[i] > '9'));
       i++;
      }

   return ((short) not_a_num);

} /* not_a_number */
```

```
/*****************************************************************************
   local procedure

   get_float_arg

   Gets the float parameter of the command line option identified by
   option_name and arg_index.
   Checks for error. Increments arg_index if appropriate.

*****************************************************************************/

static void get_float_arg (float_val, argc, argv, arg_index, option_name,
                           error)

   float   *float_val;
   INT16   argc;
   STRING  *argv[];
   INT16   *arg_index:
   STRING  *option_name:
   BOOLEAN *error:

{
   short arg_code:


   if ((*arg_index + 1) == argc)
      {
       *error = TRUE:
       fprintf (stderr. "\n error - missing parameter for %s option \n".
               option_name);
      }
   else
      {
       if (not_a_number (argv [*arg_index + 1]))
          {
           *error = TRUE;
           get_arg_code (argv [*arg_index + 1], &arg_code);
           if (arg_code == UNKNOWN_OPTION_CODE)
              {
               fprintf (stderr, "\n error - invalid parameter for %s option \n",
                        option_name);
               (*arg_index)++ ;
              }
           else
              fprintf (stderr, "\n error - missing parameter for %s option \n",
                       option_name);
          }
       else
          {
           if (strlen (argv [*arg_index + 1]) > MAX_FLOAT_LENGTH)
              {
               *error = TRUE;
               fprintf (stderr. " \n error - real number length exceeds limit");
               fprintf (stderr. " for %s option \n", option_name);
              }
           else
              sscanf (argv [*arg_index + 1]. "%f". float_val);

           (*arg_index)++ :
          }
```

```
} /* get_float_arg */



/***************************************************************************
   local procedure

   get_int_arg

   Gets the int parameter of the command line option identified by
   option_name and arg_index.
   Checks for error. Increments arg_index if appropriate.

***************************************************************************/

static void get_int_arg (int_val, argc, argv, arg_index, option_name, error)

   INT16   *int_val;
   INT16   argc;
   STRING  *argv[];
   INT16   *arg_index;
   STRING  *option_name;
   BOOLEAN *error;

{
   short arg_code;


   if ((*arg_index + 1) == argc)
      {
       *error = TRUE;
       fprintf (stderr, "\n error - missing parameter for %s option \n",
                option_name);
      }
   else
      {
       if (not_a_number (argv [*arg_index + 1]))
          {
           *error = TRUE;
           get_arg_code (argv [*arg_index + 1], &arg_code);
           if (arg_code == UNKNOWN_OPTION_CODE)
              {
               fprintf (stderr, "\n error - invalid parameter for %s option \n",
                        option_name);
               (*arg_index)++ ;
              }
           else
              fprintf (stderr, "\n error - missing parameter for %s option \n",
                       option_name);
          }
       else
          {
           if (strlen (argv [*arg_index + 1]) > MAX_INT_LENGTH)
              {
               *error = TRUE;
               fprintf (stderr, " \n error - number length exceeds limit");
               fprintf (stderr, " for %s option \n", option_name);
              }
           else
              sscanf (argv [*arg_index + 1], "%d", int_val);
           (*arg_index)++ ;
```

```
} /* get_int_arg */


/*****************************************************************************
   local procedure

   get_filename_arg

   Gets the filename parameter of the command line option identified by
   option_name and arg_index and copies it to the filename parameter.
   Checks for error.
   Increments arg_index if appropriate.

*****************************************************************************/

static void get_filename_arg (filename, argc, argv, arg_index, option_name,
                              error)

   STRING  *filename;
   INT16   argc;
   STRING  *argv[];
   short   *arg_index;
   STRING  *option_name;
   BOOLEAN *error;

{
   short arg_code;

   if ((*arg_index + 1) == argc)
      {
       *error = TRUE;
       printf ("\n error - missing filename parameter for %s option \n",
                option_name);
      }
   else
      {
       get_arg_code (argv [*arg_index + 1], &arg_code);

       if (arg_code != UNKNOWN_OPTION_CODE)
          {
           *error = TRUE;
           printf ("\n error - missing filename parameter for %s option \n",
                    option_name);
          }

       else
          {
           strcpy (filename, argv [*arg_index + 1]);
           (*arg_index)++ ;
          }
      }

} /* get_filename_arg */


*****************************************************************************
```

```
                XF_HATCH_SPACE_OPTION, cmd_line_help_needed);
   user_info-> x_flat_fill_spacing = int_arg;
   break;

case Y_HATCH_SPACE_OPTION_CODE :
   get_int_arg (&int_arg, argc, argv, &arg_index,
                Y_HATCH_SPACE_OPTION, cmd_line_help_needed);
   user_info-> y_hatch_spacing = int_arg;
   break;

case X_HATCH_SPACE_OPTION_CODE :
   get_int_arg (&int_arg, argc, argv, &arg_index,
                X_HATCH_SPACE_OPTION, cmd_line_help_needed);
   user_info-> x_hatch_spacing = int_arg;
   break;

case ANGLE_HATCH_SPACE_OPTION_CODE :
   get_int_arg (&int_arg, argc, argv, &arg_index,
                ANGLE_HATCH_SPACE_OPTION, cmd_line_help_needed);
   user_info-> angle_hatch_spacing = int_arg;
   break;

case MIN_SURFACE_ANGLE_OPTION_CODE :
   get_int_arg (&int_arg, argc, argv, &arg_index,
                MIN_SURFACE_ANGLE_OPTION, cmd_line_help_needed);
   user_info-> min_surface_angle = int_arg;
   break;

case MIN_INTERSECT_ANGLE_OPTION_CODE :
   get_int_arg (&int_arg, argc, argv, &arg_index,
                MIN_INTERSECT_ANGLE_OPTION, cmd_line_help_needed);
   user_info-> min_intersect_angle = int_arg;
   break;

case X_AXIS_OPTION_CODE :
   user_info-> axis = 1;
   break;

case Y_AXIS_OPTION_CODE :
   user_info-> axis = 2;
   break;

case BINARY_INPUT_OPTION_CODE :
   user_info-> binary_input = TRUE;
   break;

case SEGFILE_OPTION_CODE :
   get_filename_arg (filename_arg, argc, argv, &arg_index,
                     SEGFILE_OPTION, cmd_line_help_needed);
   strcpy (user_info-> segfile_name, filename_arg);
   break;

case Z_SPACE_FILE_OPTION_CODE :
   get_filename_arg (filename_arg, argc, argv, &arg_index,
                     Z_SPACE_OPTION, cmd_line_help_needed);
   strcpy (user_info-> z_space_filename, filename_arg);
   break;

case HELP_OPTION_CODE :
   *cmd_line_help_requested = TRUE;
   break;

case DEBUG_OPTION_CODE :
   user_info-> debug_mode = TRUE;
   break;
```

```
local procedure

get_user_info_cmd_line

Reads the command line information and stores the data into the structure
user_info.
Checks for error.

*****************************************************************************/

static void get_user_info_cmd_line (user_info, argc, argv, cmd_line_help_needed.
                                    cmd_line_help_requested)

   USER_INFO_STRUC *user_info;
   INT16           argc;
   STRING          *argv[];
   BOOLEAN         *cmd_line_help_needed;
   BOOLEAN         *cmd_line_help_requested;

{
   float  float_arg;
   INT16  int_arg;
   STRING filename_arg [100];
   INT16  arg_index,arg_code;


   *cmd_line_help_needed = FALSE;
   *cmd_line_help_requested = FALSE;

   arg_index = 1;

   while (arg_index < argc)
     {
      get_arg_code (argv[arg_index], &arg_code);

      switch (arg_code)
         {
         case RES_OPTION_CODE :
            get_float_arg (&float_arg, argc, argv, &arg_index,
                           RES_OPTION, cmd_line_help_needed);
            user_info-> res_value = float_arg;
            if (user_info->res_value <= 0.0) {
              fprintf (stderr,"\n error - res value out of range - %-1.3f \n", u
              exit(SYS_FAILURE);
              }
            break;

         case Z_SPACE_OPTION_CODE :
            get_int_arg (&int_arg, argc, argv, &arg_index,
                         Z_SPACE_OPTION, cmd_line_help_needed);
            user_info->z_spacing = int_arg;
            if (user_info->z_spacing <= 0) {
              fprintf (stderr,"\n error - z spacing value out of range - %u \n",
              exit(SYS_FAILURE);
              }
            break;

         case YF_HATCH_SPACE_OPTION_CODE :
            get_int_arg (&int_arg, argc, argv, &arg_index,
                         YF_HATCH_SPACE_OPTION. cmd_line_help_needed);
            user_info-> y_flat_fill_spacing = int_arg;
            break;

         case XF_HATCH_SPACE_OPTION_CODE :
            get_int_arg (&int_arg, argc, argv, &arg_index,
```

```
            case CENTER_OPTION_CODE :
               user_info-> centering_off = FALSE;
               break;

            case SECTION_CODES_OFF_OPTION_CODE :
               user_info-> section_codes_off = TRUE;
               break;

            case DISPLAY_OPTION_CODE :
               user_info-> display_on = TRUE;
               break;

            case DISK_OPTION_CODE :
               user_info-> in_mem = FALSE;
               break;

            case ARIES_OPTION_CODE :
               user_info-> binary_input = TRUE;
               user_info-> attrib = FALSE;
               break;

            case INTERNAL_OPTION_CODE :
               get_filename_arg (filename_arg, argc, argv, &arg_index,
                                 INTERNAL_OPTION, cmd_line_help_needed);
               strcpy (user_info-> internal_filename, filename_arg);
               break;

            case UNKNOWN_OPTION_CODE :
               {
                *cmd_line_help_needed = TRUE;
                fprintf (stderr,
                      "\n error - unknown option - %s \n", argv [arg_index]);
               }
          }
       arg_index++ ;
      }

} /* get_user_info_cmd_line */




/*****************************************************************************
   local procedure

   init_user_info

   Initializes user_info structure to default values.

*****************************************************************************/

static void init_user_info (user_info)

   USER_INFO_STRUC *user_info;

{
   user_info-> res_value = DEFAULT_RES_VALUE;
   strcpy (user_info-> segfile_name, DEFAULT_SEGFILE_NAME);
   user_info-> debug_mode = FALSE;
   user_info-> display_on = FALSE;
   user_info-> centering_off = TRUE;
   user_info-> section_codes_off = FALSE;
   user_info-> axis = 0;
```

```
    user_info-> binary_input = FALSE;
    user_info-> attrib = TRUE;
    user_info-> in_mem = TRUE;
    user_info-> z_spacing = 1;
    user_info-> y_flat_fill_spacing = 0;
    user_info-> x_flat_fill_spacing = 0;
    user_info-> y_hatch_spacing = 0;
    user_info-> x_hatch_spacing = 0;
    user_info-> angle_hatch_spacing = 0;
    user_info-> min_surface_angle = 0;
    user_info-> min_intersect_angle = 0;
    *(user_info-> z_space_filename) = '\0';
    *(user_info-> internal_filename) ='\0';

} /* init_user_info */




/**************************************************************************
    local procedure

    print_cmd_line_help

    Prints command line help message explaining command line syntax.

**************************************************************************/


static void print_cmd_line_help ()

{
fprintf (stderr, "\n PFP Command Line Syntax: \n");
fprintf (stderr, "\n PFP < input_file     <options> \n");
fprintf (stderr, "\n   where <options> indicates any of the following:\n");
fprintf (stderr, "\n     -res <res_value>");
fprintf (stderr, "\n         Used to specify a real number resolution value that");
fprintf (stderr, "\n         will be used to scale the input file coordinates.");
fprintf (stderr, "\n         The default resolution value is %f\n",
                                                DEFAULT_RES_VALUE);
fprintf (stderr, "\n     -sf <segment output file>");
fprintf (stderr, "\n         Used to specify an output file for");
fprintf (stderr, " z plane intersection segments.");
fprintf (stderr, "\n         The default is to not generate a segment");
fprintf (stderr, " output file\n");
fprintf (stderr, "\n     -zs <z spacing value>");
fprintf (stderr, "\n         Used to indicate the constant z spacing of the");
fprintf (stderr, " output cross-sections.\n");
fprintf (stderr, "\n     -hy <hatch spacing value>");
fprintf (stderr, "\n         Used to set spacing of hatch lines parallel");
fprintf (stderr, " to the y axis.\n");
fprintf (stderr, "\n     -hx <hatch spacing value>");
fprintf (stderr, "\n         Used to set spacing of hatch lines parallel");
fprintf (stderr, " to the x axis.\n");
fprintf (stderr, "\n     -ha <hatch spacing value>");
fprintf (stderr, "\n         Used to set spacing of 60 degree angle");
fprintf (stderr, " hatch lines.\n");
fprintf (stderr, "\n     -hfy <hatch spacing value>");
fprintf (stderr, "\n         Sets spacing of hatch lines parallel");
fprintf (stderr, " to the y axis on flat surfaces.\n");
fprintf (stderr, "\n     -hfx <hatch spacing value>");
fprintf (stderr, "\n         Sets spacing of hatch lines parallel");
fprintf (stderr, " to the x axis on flat surfaces.\n");
fprintf (stderr, "\n     -zsf <z spacing control file>");
```

```
   BOOLEAN          *cmd_line_help_needed;

{
   if (!user_info-> display_on && (*(user_info-> segfile_name) == '\0'))

       user_info-> display_on = TRUE;

   if ((user_info-> min_surface_angle < 0) ||
       (user_info-> min_surface_angle > MAX_ANGLE))
      {
       fprintf (stderr,
       "\n error - minimum surface angle (%d) must be between 0 and %d \n",
                user_info-> min_surface_angle, MAX_ANGLE);
       *cmd_line_help_needed = TRUE;
      }
   if ((user_info-> min_intersect_angle < 0) ||
       (user_info-> min_intersect_angle > MAX_ANGLE))
      {
       fprintf (stderr,
       "\n error - minimum intersect angle (%d) must be between 0 and %d \n",
                user_info-> min_intersect_angle, MAX_ANGLE);
       *cmd_line_help_needed = TRUE;
      }

} /* check_user_info */




/*****************************************************************************
   exported procedure

   pfp_get_user_info

   Gets user input from the command line.
   Returns user input in the structure user_info.

*****************************************************************************/


void pfp_get_user_info (argc, argv, user_info)

   INT16            argc;
   STRING           *argv[];
   USER_INFO_STRUC *user_info;

{
   BOOLEAN cmd_line_help_needed, cmd_line_help_requested;


   init_user_info (user_info);

   get_user_info_cmd_line (user_info, argc, argv, &cmd_line_help_needed,
                           &cmd_line_help_requested);

   check_user_info (user_info, &cmd_line_help_needed);

   if (cmd_line_help_requested)
      {
       print_cmd_line_help ();
       exit (SYS_FAILURE);
      }
   else if (cmd_line_help_needed)
      {
```

```
fprintf (stderr, "\n        Used to specify the file containing variable");
fprintf (stderr, " z spacing information.\n");
fprintf (stderr, "\n     -c");
fprintf (stderr, "\n        Centering option.");
fprintf (stderr, "\n        Center object coordinates\n");
fprintf (stderr, "\n     -nsc");
fprintf (stderr, "\n        No section codes option.");
fprintf (stderr, "\n        Suppresses section codes in the output file\n");
fprintf (stderr, "\n     -msa");
fprintf (stderr, "\n        Minimum surface angle option.");
fprintf (stderr, "\n        Indicates minimum surface angle for scanned");
fprintf (stderr, "\n        facets.  Legal values are between 0 and 90"); fprintf
fprintf (stderr, "\n     -mia");
fprintf (stderr, "\n        Minimum intersect angle option.");
fprintf (stderr, "\n        Indicates minimum intersect angle for hatch");
fprintf (stderr, "\n        lines.  Legal values are between 0 and 90");
fprintf (stderr, " degrees.\n");
fprintf (stderr, "\n     -b");
fprintf (stderr, "\n        Binary input option.");
fprintf (stderr, "\n        Indicates that the input file is in binary");
fprintf (stderr, " attributed format.");
fprintf (stderr, "\n     -aries");
fprintf (stderr, "\n        ARIES attributed binary input option.");
fprintf (stderr, "\n        Used when binary file is ARIES and attributed.\n");
fprintf (stderr, "\n     -d");
fprintf (stderr, "\n        Display option.");
fprintf (stderr, "\n        Causes the program to display cross-sections");
fprintf (stderr, "\n        on the screen as they are generated.\n");
fprintf (stderr, "\n     -h");
fprintf (stderr, "\n        Help option.");
fprintf (stderr, "\n        Causes the program to print this help");
fprintf (stderr, " message and then stop.\n");
fprintf (stderr, "\n     -disk");
fprintf (stderr, "\n        Disk option.");
fprintf (stderr, "\n        Causes the program save layers on disk rather");
fprintf (stderr, "\n        than in memory.  Use for large files.\n");
fprintf (stderr, "\n     -x or -y");
fprintf (stderr, "\n        Slice Axis option.");
fprintf (stderr, "\n        Changes the Slice axis from the Z to X or Y\n");
fprintf (stderr, "\n     -internal <triangle analysis file>");
fprintf (stderr, "\n        Generates a special binary file consisting of");
fprintf (stderr, "\n        Slice's own internal representation of triangles,");
fprintf (stderr, "\n        useful for analysis purposes\n");
fprintf (stderr, "\n");

} /* print_cmd_line_help */



/*****************************************************************************
   local procedure

   check_user_info

   Checks user_info structure for legal values.
   Sets display_on option if not set and no segment file was specified.

*****************************************************************************/

static void check_user_info (user_info, cmd_line_help_needed)

   USER_INFO_STRUC *user_info;
```

```
        fprintf (stderr, "\n -- for command line help try the %s option \n",
                         HELP_OPTION);
        exit (SYS_FAILURE);
       }

} /* pfp_get_user_info */
```

```
/*****************************************************************************/
/*                                                                           */
/* PFPHI.H                                                                   */
/*                                                                           */
/* PFP Human Interface header file                                           */
/*                                                                           */
/*                          MODIFICATION LOG                                 */
/*---------------------------------------------------------------------------*/
/* date          who                what                                     */
/*---------------------------------------------------------------------------*/
/*              |P. Stinebaugh    | original code                            */
/*              |                 |                                          */
/*****************************************************************************/

#define FILE_NAME_LENGTH 100

typedef struct
   {
    float      res_value;
    UINT16     y_flat_fill_spacing;
    UINT16     x_flat_fill_spacing;
    UINT16     y_hatch_spacing;
    UINT16     x_hatch_spacing;
    UINT16     angle_hatch_spacing;
    UINT16     z_spacing;
    UINT16     min_surface_angle;
    UINT16     min_intersect_angle;
    UINT16     axis;
    STRING     z_space_filename [FILE_NAME_LENGTH];
    STRING     internal_filename[FILE_NAME_LENGTH];
    STRING     segfile_name     [FILE_NAME_LENGTH];
    BOOLEAN    binary_input;
    BOOLEAN    debug_mode;
    BOOLEAN    display_on;
    BOOLEAN    centering_off;
    BOOLEAN    section_codes_off;
    BOOLEAN    strict;
    BOOLEAN    in_mem;

   } USER_INFO_STRUC;


#define RES_OPTION                      "-RES"
#define SEGFILE_OPTION                  "-SF"
#define HATCH_FILE_OPTION               "-HF"
#define Y_HATCH_SPACE_OPTION            "-HY"
#define X_HATCH_SPACE_OPTION            "-HX"
#define ANGLE_HATCH_SPACE_OPTION        "-HA"
#define YF_HATCH_SPACE_OPTION           "-HFY"
#define XF_HATCH_SPACE_OPTION           "-HFX"
#define HELP_OPTION                     "-H"
#define DISPLAY_OPTION                  "-D"
#define Z_SPACE_OPTION                  "-ZS"
#define Z_SPACE_FILE_OPTION             "-ZSF"
#define CENTER_OPTION                   "-C"
#define SECTION_CODES_OFF_OPTION        "-NSC"
#define MIN_SURFACE_ANGLE_OPTION        "-MSA"
#define MIN_INTERSECT_ANGLE_OPTION      "-MIA"
#define X_AXIS_OPTION                   "-X"
#define Y_AXIS_OPTION                   "-Y"
#define BINARY_INPUT_OPTION             "-B"
#define DEBUG_OPTION                    "-DEBUG"
#define DISK_OPTION                     "-DISK"
```

```
#define ARIES_OPTION                        "-ARIES"
#define INTERNAL_OPTION                     "-INTERNAL"

#define RES_OPTION_CODE                     1
#define SEGFILE_OPTION_CODE                 2
#define Y_HATCH_SPACE_OPTION_CODE           3
#define X_HATCH_SPACE_OPTION_CODE           4
#define ANGLE_HATCH_SPACE_OPTION_CODE       5
#define YF_HATCH_SPACE_OPTION_CODE          6
#define XF_HATCH_SPACE_OPTION_CODE          7
#define HELP_OPTION_CODE                    8
#define DEBUG_OPTION_CODE                   9
#define DISPLAY_OPTION_CODE                 10
#define Z_SPACE_OPTION_CODE                 11
#define Z_SPACE_FILE_OPTION_CODE            12
#define CENTER_OPTION_CODE                  13
#define SECTION_CODES_OFF_OPTION_CODE       14
#define MIN_SURFACE_ANGLE_OPTION_CODE       15
#define MIN_INTERSECT_ANGLE_OPTION_CODE     16
#define X_AXIS_OPTION_CODE                  17
#define Y_AXIS_OPTION_CODE                  18
#define BINARY_INPUT_OPTION_CODE            19
#define DISK_OPTION_CODE                    20
#define ARIES_OPTION_CODE                   21
#define INTERNAL_OPTION_CODE                22
#define UNKNOWN_OPTION_CODE                 23

#define DEFAULT_RES_VALUE    1.0
#define DEFAULT_SEGFILE_NAME  ""

#define MAX_FLOAT_LENGTH 9
#define MAX_INT_LENGTH 5
#define MAX_ANGLE 90
```

```
/*****************************************************************************/
/*                                                                           */
/* PFPIDB.C                                                                  */
/*                                                                           */
/* PFP Input Database Module                                                 */
/*                                                                           */
/*                            MODIFICATION LOG                               */
/*---------------------------------------------------------------------------*/
/* date        who                  what                                     */
/*---------------------------------------------------------------------------*/
/*            |P. Stinebaugh      | original code                            */
/*            |                   |                                          */
/*****************************************************************************/

#include <stdio.h>
#include <math.h>
#include <malloc.h>

#include "pfp.h"
#include "pfphi.h"
#include "pfptri.h"
#include "pfpseg.h"
#include "pfputl.h"

extern INPUT_TRI_STRUC *tri_bucket_array[];
extern OUT_SEG_STRUC *FD_seg_bucket_array[];
extern OUT_SEG_STRUC *FU_seg_bucket_array[];
extern OUT_SEG_STRUC *NFU_seg_bucket_array[];
extern OUT_SEG_STRUC *NFD_seg_bucket_array[];
extern UINT16        z_control table[];
extern UINT16        all_min_z, all_max_z, all_min_z_index, all_max_z_index;

/****************************************************************************
   general procedure

   find_z_binarily - binary search of z_control_table for layer z


****************************************************************************/

UINT16 get_z_binarily(z)

   UINT16 z;

{
   UINT16 low = 0, mid, high = MAX_Z_INDEX-1;

   while (low <= high) {
      mid = (low + high) / 2;
      if (z < z_control_table [mid])
         high = mid - 1;
      else if (z > z_control_table [mid])
         low = mid + 1;
      else
         return(mid);
    }
    if (z_control_table [low] > z)
       return(low);
    else return(high);

   /* get_z_binarily */
```

```
/*****************************************************************************
   local procedure

   get_offsets


*****************************************************************************/


static void get_offsets (min_x, min_y, min_z, max_x, max_y, max_z,
                         res_value, x_offset, y_offset, z_offset)

   float min_x, min_y, min_z, max_x, max_y, max_z, res_value;
   float *x_offset, *y_offset, *z_offset;

{
   BOOLEAN res_error1,res_error2;
   float   x_range, y_range, z_range;
   float   round_flt();


   x_range = (max_x - min_x) * res_value;
   y_range = (max_y - min_y) * res_value;
   z_range = (max_z - min_z) * res_value;

   res_error1 = ((x_range > MAX_X_VAL) || (y_range > MAX_Y_VAL) ||
                 (z_range > MAX_Z_VAL));

   res_error2 = (z_range > z_control_table [MAX_Z_INDEX-1]);

   if (res_error1 || res_error2) {
      if (res_error1) {
         fprintf (stderr, "\n error - resolution value too large for this");
         fprintf (stderr, " part\n");
      }
      if (res_error2) {
         fprintf (stderr, "\n error - z-value would require more than");
         fprintf (stderr, " %u layers.\n",MAX_Z_INDEX);
      }
      fprintf (stderr,
      " min x = %f max x = %f min y = %f max y = %f min z = %f max z = %f\n",
        min_x, max_x, min_y, max_y, min_z, max_z);
      exit (SYS_FAILURE);
   }

   *x_offset = round_flt(((MAX_X_VAL - x_range) / 2.0) - (min_x * res_value));
   *y_offset = round_flt(((MAX_Y_VAL - y_range) / 2.0) - (min_y * res_value));
   *z_offset = round_flt(((z_control_table [MAX_Z_INDEX-1] - z_range) / 2.0) - (mi

} /* get_offsets */



/*****************************************************************************
   local procedure

   check_tri_dimensions

*****************************************************************************/
```

```
static void check_tri_dimensions (tri_ptr)

   INPUT_TRI_STRUC *tri_ptr;

{
   if ((tri_ptr-> x1 > MAX_X_VAL) || (tri_ptr-> x1 < 0.0) ||
       (tri_ptr-> x2 > MAX_X_VAL) || (tri_ptr-> x2 < 0.0) ||
       (tri_ptr-> x3 > MAX_X_VAL) || (tri_ptr-> x3 < 0.0) ||
       (tri_ptr-> y1 > MAX_Y_VAL) || (tri_ptr-> y1 < 0.0) ||
       (tri_ptr-> y2 > MAX_Y_VAL) || (tri_ptr-> y2 < 0.0) ||
       (tri_ptr-> y3 > MAX_Y_VAL) || (tri_ptr-> y3 < 0.0) ||
       (tri_ptr-> z1 > z_control_table [MAX_Z_INDEX-1]) || (tri_ptr-> z1 < 0.0) ||
       (tri_ptr-> z2 > z_control_table [MAX_Z_INDEX-1]) || (tri_ptr-> z2 < 0.0) ||
       (tri_ptr-> z3 > z_control_table [MAX_Z_INDEX-1]) || (tri_ptr-> z3 < 0.0))
      {
       fprintf (stderr, "\n error - dimensions of uncentered object");
       fprintf (stderr, " exceed limits.  Check Resolution value. \n");
       exit (SYS_FAILURE);
      }

} /* check_tri_dimensions */




/*****************************************************************************
   local procedure

   res_triangles

*****************************************************************************/

static void res_triangles (tri_list, x_offset, y_offset, z_offset,
                           res_value, centering_off)

   INPUT_TRI_STRUC *tri_list;
   float           x_offset, y_offset, z_offset, res_value;
   BOOLEAN         centering_off;

{
   INPUT_TRI_STRUC *tri_ptr;
   float           round_flt();


   tri_ptr = tri_list;

   if (centering_off)
      while (tri_ptr != NULL_INPUT_TRI)
         {
          tri_ptr-> x1 = round_flt(tri_ptr-> x1 * res_value);
          tri_ptr-> x2 = round_flt(tri_ptr-> x2 * res_value);
          tri_ptr-> x3 = round_flt(tri_ptr-> x3 * res_value);

          tri_ptr-> y1 = round_flt(tri_ptr-> y1 * res_value);
          tri_ptr-> y2 = round_flt(tri_ptr-> y2 * res_value);
          tri_ptr-> y3 = round_flt(tri_ptr-> y3 * res_value);

          tri_ptr-> z1 = round_flt(tri_ptr-> z1 * res_value);
          tri_ptr-> z2 = round_flt(tri_ptr-> z2 * res_value);
          tri_ptr-> z3 = round_flt(tri_ptr-> z3 * res_value);

          check_tri_dimensions (tri_ptr);
```

```
          tri_ptr = tri_ptr-> next_input_tri;
          }
   else
      while (tri_ptr != NULL_INPUT_TRI)
          {
          tri_ptr-> x1 = round_flt((tri_ptr-> x1 * res_value) + x_offset);
          tri_ptr-> x2 = round_flt((tri_ptr-> x2 * res_value) + x_offset);
          tri_ptr-> x3 = round_flt((tri_ptr-> x3 * res_value) + x_offset);

          tri_ptr-> y1 = round_flt((tri_ptr-> y1 * res_value) + y_offset);
          tri_ptr-> y2 = round_flt((tri_ptr-> y2 * res_value) + y_offset);
          tri_ptr-> y3 = round_flt((tri_ptr-> y3 * res_value) + y_offset);

          tri_ptr-> z1 = round_flt((tri_ptr-> z1 * res_value) + z_offset);
          tri_ptr-> z2 = round_flt((tri_ptr-> z2 * res_value) + z_offset);
          tri_ptr-> z3 = round_flt((tri_ptr-> z3 * res_value) + z_offset);
          tri_ptr = tri_ptr-> next_input_tri;
          }

}  /* res_triangles */


/*****************************************************************************
   local procedure

   remove collapsed_triangles


*****************************************************************************/

static void remove_collapsed_triangles (tri_list)

   INPUT_TRI_STRUC **tri_list;

{
   INPUT_TRI_STRUC *tri_ptr, *back_ptr;
   INPUT_TRI_STRUC head_rec;
   float           Ax,Ay,Az;
   float           Bx,By,Bz;
   float           Cx,Cy,Cz;
   unsigned long   point_count = 0,line_count = 0;
   BOOLEAN         delete_tri;


   tri_ptr = *tri_list;
   head_rec .next_input_tri = tri_ptr;
   back_ptr = &head_rec;

   while (tri_ptr != NULL_INPUT_TRI) {
     delete_tri = FALSE;
     if ((tri_ptr->x1 == tri_ptr->x2) && (tri_ptr->x2 == tri_ptr->x3) &&
         (tri_ptr->y1 == tri_ptr->y2) && (tri_ptr->y2 == tri_ptr->y3) &&
         (tri_ptr->z1 == tri_ptr->z2) && (tri_ptr->z2 == tri_ptr->z3)) {
       delete_tri = TRUE;
       point_count++;
       }
     else {
       Ax = tri_ptr-> x2 - tri_ptr-> x1;
       Ay = tri_ptr-> y2 - tri_ptr-> y1;
       Az = tri_ptr-> z2 - tri_ptr-> z1;
       Bx = tri_ptr-> x3 - tri_ptr-> x1;
       By = tri_ptr-> y3 - tri_ptr-> y1;
       Bz = tri_ptr-> z3 - tri_ptr-> z1;
```

```
        Cx = fabs(Ay*Bz-Az*By);
        Cy = fabs(Az*Bx-Ax*Bz);
        Cz = fabs(Ax*By-Ay*Bx);
        if ((Cx < ZERO_DEF) && (Cy < ZERO_DEF) && (Cz < ZERO_DEF)) {
          delete_tri = TRUE;
          line_count++;
          };
        };
      if (delete_tri) {
        back_ptr-> next_input_tri = tri_ptr-> next_input_tri;
        mem_free (tri_ptr,sizeof(INPUT_TRI_STRUC));
        tri_ptr = back_ptr-> next_input_tri;
        }
      else {
        tri_ptr = tri_ptr-> next_input_tri;
        back_ptr = back_ptr-> next_input_tri;
        };
      };

    *tri_list = head_rec .next_input_tri;

    if (point_count > 0)
       fprintf (stderr, "\n warning - %lu collapsed point triangles removed \n",
               point_count);
    if (line_count > 0)
       fprintf (stderr, "\n warning - %lu collapsed line triangles removed \n",
               line_count);

}  /* remove_collapsed_triangles */




/******************************************************************************
   local procedure

   get_z_output_coord


******************************************************************************/

static UINT16 get_z_output_coord (z)

   UINT16 z;

{
   UINT16 i, greater_z, lesser_z;

   i = get_z_binarily(z);
   greater_z = z_control_table [i];
   if (z == z_control_table [i])
      lesser_z = z_control_table [i];
   else
      lesser_z = z_control_table [i-1];
/* printf("get_z_output_coord:  z=%u i=%u lesser_z=%u greater_z=%u\n",z,i,lesser z

   if ((lesser_z == 0) || (((greater_z - z) <= (z - lesser_z)) &&
                             (greater_z != z_control_table [MAX_Z_INDEX-1])))
      return (greater_z);
   else
      return (lesser_z);

} /* get z_output_coord */
```

```
/*****************************************************************************
   local procedure

   adjust_z_coords


*****************************************************************************/

static void adjust_z_coords (tri_list, z_spacing)

   INPUT_TRI_STRUC *tri_list;
   UINT16          z_spacing;

{
   INPUT_TRI_STRUC *tri_ptr;
   float           round_flt();
   UINT16          get_z_coord();

   if (z_spacing != 1)
      {
       tri_ptr = tri_list;
       while (tri_ptr != NULL_INPUT_TRI)
          {
           tri_ptr-> z1 = round_flt((float) tri_ptr-> z1 / z_spacing) * z_spacing;
           tri_ptr-> z2 = round_flt((float) tri_ptr-> z2 / z_spacing) * z_spacing;
           tri_ptr-> z3 = round_flt((float) tri_ptr-> z3 / z_spacing) * z_spacing;
           tri_ptr = tri_ptr-> next_input_tri;
          }
      }
   else
      {
       tri_ptr = tri_list;
       while (tri_ptr != NULL_INPUT_TRI)
          {
           tri_ptr-> z1 = get_z_output_coord ((UINT16) tri_ptr-> z1);
           tri_ptr-> z2 = get_z_output_coord ((UINT16) tri_ptr-> z2);
           tri_ptr-> z3 = get_z_output_coord ((UINT16) tri_ptr-> z3);
           tri_ptr = tri_ptr-> next_input_tri;
          }
      }

} /* adjust_z_coords */



/*****************************************************************************
   local procedure

   output_internal_triangles


*****************************************************************************/

static void output_internal_triangles (user_info,tri_list)

USER_INFO_STRUC *user_info;
INPUT_TRI_STRUC **tri_list;
```

```
{
FILE *InternalFile;
INPUT_TRI_STRUC *tri_ptr;
UINT32 count,tri_count;
float zero,i,j,k;

   zero = 0;
   tri_ptr = *tri_list;
   tri_count = 0;
   while (tri_ptr != NULL_INPUT_TRI) {
      tri_count++;
      tri_ptr = tri_ptr-> next_input_tri;
   }
   if (tri_count>0) {
      fprintf(stderr, " writing internal triangles output file ...\n");
      InternalFile = fopen(user_info-> internal_filename,"wb");

      fprintf(InternalFile,"Slice Internal Triangle File");
      count = 28;
      while (count<80) {                 /* should write out copy of org header */
         fprintf(InternalFile," ");
         count++;
      }
      fwrite(&tri_count,4,1,InternalFile);  /* write out # of triangle facets */
      tri_ptr = *tri_list;
      while (tri_ptr != NULL_INPUT_TRI) {
         count = 3;
         if (tri_ptr->normal_info&NORMAL_X_POSITIVE) i = 1;
         else if (tri_ptr->normal_info&NORMAL_X_NEGATIVE) i = -1;
              else {
                i = 0;
                count--;
                };
         if (tri_ptr->normal_info&NORMAL_Y_POSITIVE) j = 1;
         else if (tri_ptr->normal_info&NORMAL_Y_NEGATIVE) j = -1;
              else {
                j = 0;
                count--;
                };
         if (tri_ptr->normal_info&NORMAL_Z_POSITIVE) k = 1;
         else if (tri_ptr->normal_info&NORMAL_Z_NEGATIVE) k = -1;
              else {
                k = 0;
                count--;
                };
         switch (count) {
           case 2 : i *= 0.707106781;
                    j *= 0.707106781;
                    k *= 0.707106781;
                    break;
           case 3 : i *= 0.577350269;
                    j *= 0.577350269;
                    k *= 0.577350269;
                    break;
           };
         fwrite(&i,4,1,InternalFile);
         fwrite(&j,4,1,InternalFile);
         fwrite(&k,4,1,InternalFile);

         fwrite(tri_ptr,36,1,InternalFile);   /* write out triangle vertices */
         fwrite(&zero,2,1,InternalFile);          /* attribute data (none) */
         tri_ptr = tri_ptr-> next_input_tri;
      }
      fclose(InternalFile);
```

```
/******************************************************************************
   local function

   flat_tri


******************************************************************************/

static flat_tri (tri_ptr)

   INPUT_TRI_STRUC *tri_ptr;

{
   return
     ((tri_ptr-> z1 == tri_ptr-> z2) && (tri_ptr-> z2 == tri_ptr-> z3));

} /* flat_tri */



/******************************************************************************
   local function

   near_flat_tri


******************************************************************************/

static near_flat_tri (tri_ptr, min_angle)

   INPUT_TRI_STRUC *tri_ptr;
   INT16            min_angle;

{
   double dx1, dy1, dz1, dx2, dy2, dz2, dx, dy, dz, d, angle;

   if (!min_angle)
      return (FALSE);
   else
      {
       dx1 = tri_ptr-> x1 - tri_ptr-> x2;
       dy1 = tri_ptr-> y1 - tri_ptr-> y2;
       dz1 = tri_ptr-> z1 - tri_ptr-> z2;

       dx2 = tri_ptr-> x1 - tri_ptr-> x3;
       dy2 = tri_ptr-> y1 - tri_ptr-> y3;
       dz2 = tri_ptr-> z1 - tri_ptr-> z3;

       dx = dy1 * dz2 - dz1 * dy2;
       dy = dz1 * dx2 - dx1 * dz2;
       dz = dx1 * dy2 - dy1 * dx2;

       d = sqrt (dx * dx + dy * dy);
```

```
      if (d == 0) angle = 0;
      else angle = 90.0 - fabs (atan (dz / d) / RADIANS_PER_DEGREE);

      return (angle < (double) min_angle);
     }

} /* near_flat_tri */


/******************************************************************************
   recompute_normals

   Recomputes the normals of the triangles after they have been deformed by
    adjusting the Z coords.

   Version 252 - Only recompute X and Y

******************************************************************************/

static recompute_normals(tri_list,axis)
  INPUT_TRI_STRUC *tri_list;
  INT16            axis;
  {
  UINT8  flag;
  double a1,a2,a3;
  double b1,b2,b3;
  double i,j,k;
  double temp;

  /*
    Vector A - Vertex 2 to Vertex 3 of input
    Vector B - Vertex 2 to Vertex 1 of input
    Normal i,j,k - AxB = (a2*b3 - a3*b2)i + (a3*b1 - a1*b3)j + (a1*b2 - a2*b1)k

    Note: Vectors change if axis is not inputs (-x -y). Must adjust for
          these cases.
  */
  fprintf(stderr," recomputing normals ...\n");
  while (tri_list != NULL_INPUT_TRI) {
    switch (axis) {
      case 0 : a1 = tri_list->x3 - tri_list->x2; /* No axis swap */
               a2 = tri_list->y3 - tri_list->y2;
               a3 = tri_list->z3 - tri_list->z2;
               b1 = tri_list->x1 - tri_list->x2;
               b2 = tri_list->y1 - tri_list->y2;
               b3 = tri_list->z1 - tri_list->z2;
               break;
      case 1 : a3 = tri_list->x3 - tri_list->x2; /* X and Z axis swapped */
               a2 = tri_list->y3 - tri_list->y2;
               a1 = tri_list->z3 - tri_list->z2;
               b3 = tri_list->x1 - tri_list->x2;
               b2 = tri_list->y1 - tri_list->y2;
               b1 = tri_list->z1 - tri_list->z2;
               break;
      case 2 : a1 = tri_list->x3 - tri_list->x2; /* Y and Z axis swapped */
               a3 = tri_list->y3 - tri_list->y2;
               a2 = tri_list->z3 - tri_list->z2;
               b1 = tri_list->x1 - tri_list->x2;
               b3 = tri_list->y1 - tri_list->y2;
               b2 = tri_list->z1 - tri_list->z2;
               break;
    };

   i = a2*b3 - a3*b2;
   j = a3*b1 - a1*b3;
```

```
   k = a1*b2 - a2*b1;

   switch (axis) {                                     /* reswap flag info */
     case 1: temp = k;
             k = i;
             i = temp;
             break;
     case 2: temp = k;
             k = j;
             j = temp;
             break;
     };

   flag = tri_list->normal_info & (NORMAL_Z_POSITIVE+NORMAL_Z_NEGATIVE);

   if (fabs(i) > ZERO_DEF) {
     if (i < 0) flag |= NORMAL_X_NEGATIVE;
     else flag |= NORMAL_X_POSITIVE;
     };

   if (fabs(j) > ZERO_DEF) {
     if (j < 0) flag |= NORMAL_Y_NEGATIVE;
     else flag |= NORMAL_Y_POSITIVE;
     };

/*
   if (fabs(k) > ZERO_DEF) {
     if (k < 0) flag |= NORMAL_Z_NEGATIVE;
     else flag |= NORMAL_Z_POSITIVE;
     };
*/

   tri_list->normal_info = flag;
   tri_list = tri_list->next_input_tri;
   };
 };

/*******************************************************************************
   local procedure

*******************************************************************************/

static void get_tri_lists (in_file, user_info, res_value, min_angle,
                           centering_off, z_spacing,
                           scan_tri_list, flat_tri_list, near_flat_tri_list)

   FILE              *in_file;
   USER_INFO_STRUC   *user_info;
   float             res_value;
   INT16             min_angle;
   BOOLEAN           centering_off;
   UINT16            z_spacing;
   INPUT_TRI_STRUC   **scan_tri_list;
   INPUT_TRI_STRUC   **flat_tri_list;
   INPUT_TRI_STRUC   **near_flat_tri_list;

{
   INPUT_TRI_STRUC   *input_tri_list, *tri_ptr, *temp_ptr;
   unsigned long     up_scan_tri_count = 0, dn_scan_tri_count = 0;
   unsigned long     up_flat_tri_count = 0, dn_flat_tri_count = 0;
   unsigned long     up_near_flat_tri_count = 0, dn_near_flat_tri_count = 0;
   float             min_x, min_y, min_z, max_x, max_y, max_z;
   float             x_offset, y_offset, z_offset;
   long              resoluted_min_z,resoluted_max_z;
```

```
   min_x = MAX_X_VAL:
   min_y = MAX_Y_VAL:
   min_z = z_control_table [MAX_Z_INDEX-1]:

   max_x = 0.0 - MAX_X_VAL;
   max_y = 0.0 - MAX_Y_VAL:
   max_z = 0.0 - z_control_table [MAX_Z_INDEX-1];

/*
printf ("\n get_tri_lists - begin \n");
*/
   fprintf (stderr, "\n loading input database ...\n"):

   if (user_info-> binary_input)
      pfp_get_input_tri_list_bin (in_file, &input_tri_list, &min_x, &min_y,
                                  &min_z, &max_x, &max_y, &max_z, user_info);
   else
      pfp_get_input_tri_list (in_file, &input_tri_list, &min_x, &min_y,
                              &min_z, &max_x, &max_y, &max_z,user_info):

   resoluted_min_z = round_flt(min_z * res_value):
   resoluted_max_z = round_flt(max_z * res_value):
   if (resoluted_min_z < z_control_table[0]) {
     if (*(user_info-> z_space_filename) != '\0')
       fprintf(stderr,"\nError - Part begins below Variable Z Spacing Table\n");
     else
       fprintf(stderr,"\nError - Part begins below minimum Z value\n"):
     fprintf(stderr," Z Spacing Table: %u Part: %ld\n",z_control_table[0],resolute
     exit (SYS_FAILURE):
     };
   if (resoluted_max_z > z_control_table[MAX_Z_INDEX-1]) {
     if (*(user_info-> z_space_filename) != '\0')
       fprintf(stderr,"\nError - Part extends past the Variable Z Spacing Table o-
     else
       fprintf(stderr,"\nError - Part extends past the maximum Z value of %u layer
     fprintf(stderr," Z Spacing Table: %u Part: %u\n",z_control_table[MAX_Z_INDEX-
     exit (SYS_FAILURE):
     };

  get_offsets (min_x, min_y, min_z, max_x, max_y, max_z, res_value,
               &x_offset, &y_offset, &z_offset);

  res_triangles (input_tri_list, x_offset, y_offset, z_offset,
                 res_value, centering_off);

  adjust_z_coords (input_tri_list, z_spacing);

  remove_collapsed_triangles (&input_tri_list);

  recompute_normals(input_tri_list,user_info->axis);

  if (*(user_info-> internal_filename) > '\0')
     output_internal_triangles (user_info,&input_tri_list);

  while (input_tri_list != NULL_INPUT_TRI)
     {
      tri_ptr = input_tri_list;
      input_tri_list = input_tri_list-> next_input_tri:

      if (flat_tri (tri_ptr))
         {
          tri_ptr->normal_info = (tri_ptr->normal_info
                                 &(255-NORMAL_X_NEGATIVE-NORMAL_X_POSITIVE
                                      -NORMAL_Y_NEGATIVE-NORMAL_Y_POSITIVE))
```

```
                                   ; FLAT_TRI;
        tri_ptr-> next_input_tri = *flat_tri_list;
        *flat_tri_list = tri_ptr;
        if (tri_ptr-> normal_info & NORMAL_Z_POSITIVE)
           up_flat_tri_count++;
        else
           dn_flat_tri_count++;
        }
     else if (near_flat_tri (tri_ptr. min_angle))
        {
        tri_ptr->normal_info != NEAR_FLAT_TRI;
        temp_ptr = (INPUT_TRI_STRUC *) mem_alloc (sizeof (INPUT_TRI_STRUC));
        copy (tri_ptr. temp_ptr. sizeof (INPUT_TRI_STRUC));
        temp_ptr-> next_input_tri = *scan_tri_list;
        *scan_tri_list = temp_ptr;
        tri_ptr-> next_input_tri = *near_flat_tri_list;
        *near_flat_tri_list = tri_ptr;
        if (tri_ptr-> normal_info & NORMAL_Z_POSITIVE)
           up_near_flat_tri_count++;
        else
           dn_near_flat_tri_count++;
        }
     else
        {
        tri_ptr-> next_input_tri = *scan_tri_list;
        *scan_tri_list = tri_ptr;
        if (tri_ptr-> normal_info & NORMAL_Z_POSITIVE)
           up_scan_tri_count++;
        else
           dn_scan_tri_count++;
        }
     }

  fprintf (stderr, "\n    %5lu scan triangles loaded      (%5lu up facing. %5lu
                   up_scan_tri_count + dn_scan_tri_count,
                   up_scan_tri_count. dn_scan_tri_count);
  fprintf (stderr. "    %5lu near flat triangles loaded (%5lu up facing. %5lu do
                   up_near_flat_tri_count + dn near_flat_tri_count.
                   up_near_flat_tri_count. dn_near_flat_tri_count);
  fprintf (stderr. "    %5lu flat triangles loaded      (%5lu up facing. %5lu do
                   up_flat_tri_count + dn_flat_tri_count,
                   up_flat_tri_count. dn_flat_tri_count);

/*
printf ("\n get_tri_lists - end \n");
*/

} /* get_tri_lists */


/***************************************************************************
  local procedure

  insert_tri


***************************************************************************/

static void insert_tri (input_tri, z_bucket_array)

  INPUT_TRI_STRUC *input_tri;
  INPUT_TRI_STRUC **z_bucket_array;
```

```
    float           min_z;
    UINT16          min_z_value;
    UINT16          i;

    pfp_get_min_z (input_tri, &min_z);
    min_z_value = (UINT16) min_z;
    i = get_z_binarily(min_z_value);

    input_tri-> next_input_tri = z_bucket_array [i];
    z_bucket_array [i] = input_tri;

} /* insert_tri */



void tri_bucket_sort (tri_list, a_tri_bucket_array)

    INPUT_TRI_STRUC **tri_list;
    INPUT_TRI_STRUC **a_tri_bucket_array;

{
    INPUT_TRI_STRUC *tri_ptr, **bucket_ptr;
    INT16            i;

/*
printf ("\n tri_bucket_sort - begin \n");
*/
    bucket_ptr = a_tri_bucket_array;

    for (i = 0; i < MAX_Z_INDEX; i++, bucket_ptr++)
       *bucket_ptr = NULL_INPUT_TRI;

    while (*tri_list != NULL_INPUT_TRI)
       {
        tri_ptr = (*tri_list)-> next_input_tri;
        insert_tri (*tri_list, a_tri_bucket_array);
        *tri_list = tri_ptr;
       }

    *tri_list = NULL_INPUT_TRI;

/*
printf ("\n tri_bucket_sort - end \n");
*/
} /* tri_bucket_sort */



void pfp_get_input_database (in_file, user_info)

   FILE             *in_file;
   USER_INFO_STRUC  *user_info;

{
   INPUT_TRI_STRUC *scan_tri_list;
   INPUT_TRI_STRUC *flat_tri_list;
   INPUT_TRI_STRUC *near_flat_tri_list;
   UINT16           z;

   scan_tri_list      = NULL_INPUT_TRI;
   flat_tri_list      = NULL_INPUT_TRI;
```

```
near_flat_tri_list = NULL_INPUT_TRI;

get_tri_lists (in_file, user_info,
               user_info-> res_value, user_info-> min_surface_angle,
               user_info-> centering_off, user_info-> z_spacing,
               &scan_tri_list, &flat_tri_list, &near_flat_tri_list);

for (z = 0; z < MAX_Z_INDEX; z++)
  {
   FU_seg_bucket_array[z] = NULL_SEG;
   FD_seg_bucket_array[z] = NULL_SEG;
   NFU_seg_bucket_array[z] = NULL_SEG;
   NFD_seg_bucket_array[z] = NULL_SEG;
   }

 if (scan_tri_list != NULL_INPUT_TRI)
    tri_bucket_sort (&scan_tri_list, tri_bucket_array);

 if (flat_tri_list != NULL_INPUT_TRI)
    process_flat_tri_list (flat_tri_list);

 if (near_flat_tri_list != NULL_INPUT_TRI)
    process_near_flat_tri_list (near_flat_tri_list);

} /* pfp_get_input_database */
```

```
/*****************************************************************************/
/*                                                                           */
/* PFPRIE.C                                                                  */
/*                                                                           */
/* PFP Remove Internal Edges Module                                          */
/*                                                                           */
/*                          MODIFICATION LOG                                 */
/*---------------------------------------------------------------------------*/
/* date        who               what                                        */
/*---------------------------------------------------------------------------*/
/*            |P. Stinebaugh    |original code                               */
/*            |                 |                                            */
/*****************************************************************************/

#include <stdio.h>
#include <math.h>
#include "pfp.h"
#include "pfpseg.h"
#include "pfputl.h"

#define MAX_HASH_INDEX 1501

static OUT_SEG_STRUC *hash_table     [MAX_HASH_INDEX];
static OUT_SEG_STRUC *end_hash_table [MAX_HASH_INDEX];
static BOOLEAN        hash_table_initialized = FALSE;

/****************************************************************************
   local procedure

   order_seg_points



****************************************************************************/

static void order_seg_points (seg_ptr)
  OUT_SEG_STRUC *seg_ptr;
  {
  UINT16         temp;


  if ((seg_ptr-> x_1 > seg_ptr-> x_2) || ((seg_ptr->x_1 == seg_ptr->x_2) &&
                                          (seg_ptr->y_1 >  seg_ptr->y_2))) {
    temp = seg_ptr-> x_1;
    seg_ptr-> x_1 = seg_ptr-> x_2;
    seg_ptr-> x_2 = temp;
    temp = seg_ptr-> y_1;
    seg_ptr-> y_1 = seg_ptr-> y_2;
    seg_ptr-> y_2 = temp;
    };

} /* order_seg_points */



/****************************************************************************
   local procedure

   insert segment
```

```
******************************************************************************/

static void insert_segment (seg_ptr)
  OUT_SEG_STRUC  *seg_ptr;
  {
  OUT_SEG_STRUC  *scan_ptr,*back_ptr;
  double         hash_key;
  UINT16         hash_index;

  hash_key = (double) MAX_Y_VAL * seg_ptr-> x_1 + seg_ptr-> y_1;

  hash_index = (UINT16) fmod(hash_key,(double) MAX_HASH_INDEX);

  scan_ptr = hash_table [hash_index];

  while ((scan_ptr != NULL_SEG) &&
         !((scan_ptr-> x_1 == seg_ptr-> x_1) &&
           (scan_ptr-> y_1 == seg_ptr-> y_1) &&
           (scan_ptr-> x_2 == seg_ptr-> x_2) &&
           (scan_ptr-> y_2 == seg_ptr-> y_2))) {
    back_ptr = scan_ptr;
    scan_ptr = scan_ptr-> next_seg;
    };

  if (scan_ptr == NULL_SEG) {
    if (hash_table[hash_index] == NULL) hash_table[hash_index] = seg_ptr;
    else end_hash_table[hash_index]->next_seg = seg_ptr;
    seg_ptr->next_seg = NULL_SEG;
    end_hash_table[hash_index] = seg_ptr;
    }
  else {
    if (!((seg_ptr->normal_info^scan_ptr->normal_info)&(FLAT_TRI+NEAR_FLAT_TRI)))
      if (hash_table[hash_index] == scan_ptr) hash_table[hash_index] = scan_ptr->n
      else {
        back_ptr->next_seg = scan_ptr->next_seg;
        if (end_hash_table[hash_index] == scan_ptr) end_hash_table[hash_index] = b
        };
      mem_free (scan_ptr,sizeof(OUT_SEG_STRUC));
      };
    mem_free (seg_ptr,sizeof(OUT_SEG_STRUC));
    };

  }; /* insert_segment */


/******************************************************************************
   exported procedure

   pfp_remove_duplicate_edges


******************************************************************************/

void pfp_remove_duplicate_edges (seg_list)
  OUT_SEG_STRUC **seg_list;
  {
  OUT_SEG_STRUC *seg_ptr;
  UINT16        i;
```

```
  if (!hash_table_initialized) {
    for (i = 0; i < MAX_HASH_INDEX; i++) hash_table [i] = NULL_SEG;
    hash_table_initialized = TRUE;
    };

  while (*seg_list != NULL_SEG) {
    seg_ptr = *seg_list;
    *seg_list = seg_ptr->next_seg;
    if ((seg_ptr->x_1 == seg_ptr->x_2) &&
        (seg_ptr->y_1 == seg_ptr->y_2)) {
      mem_free(seg_ptr,sizeof(OUT_SEG_STRUC));
      }
    else {
      order_seg_points (seg_ptr);
      insert_segment (seg_ptr);
      };
    };

   for (i = 0; i < MAX_HASH_INDEX; i++)
     if (hash_table[i] != NULL_SEG) {
       end_hash_table[i]->next_seg = *seg_list;
       *seg_list = hash_table[i];
       hash_table [i] = NULL_SEG;
       };

} /* pfp_remove_duplicate_edges */
```

```
/**************************************************************************************/
/*                                                                                  */
/* PFPRIF.C                                                                         */
/*                                                                                  */
/* PFP Read Input File Module                                                       */
/*                                                                                  */
/*                              MODIFICATION LOG                                    */
/*----------------------------------------------------------------------------------*/
/* date        who                 what                                             */
/*----------------------------------------------------------------------------------*/
/*            |P. Stinebaugh      | original code                                   */
/*            |                   |                                                 */
/**************************************************************************************/


#include <stdio.h>
#include "pfp.h"
#include "pfphi.h"
#include "pfptri.h"
#include "pfpseg.h"
#include "pfputl.h"


#define NORMAL_FLAG_CHAR '#'
#define NORMAL_MIN 1E-05

static UINT16        tri_count = 0;

/**************************************************************************************
   local function

   is_legal_char

   Returns a value that indicates if the char parameter is within the legal
   character set.

**************************************************************************************/


static BOOLEAN is_legal_char (ch)

   STRING ch;

{

   return ((ch >= ' ') && (ch <= '~'));
          /* the next line of code stops the '+' and '-' illegal char messages
             but causes other problems:
               run #1:  got memory parity error, system halted
               run #2:  got 'invalid input file format' after several minutes
                           and program stopped, no other information
               then commented out line and recompiled to make it like
                 it was before  */

} /* is_legal_char */



/**************************************************************************************
   local procedure
```

```
   get_line

   Reads characters from the input file into a line buffer up to the next
   newline char.  Checks for error. Indicates if the file is eof.

*******************************************************************************/


static void get_line (input_file, line_buf, error, eof)

   FILE    *input_file;
   STRING  *line_buf;
   BOOLEAN *error;
   BOOLEAN *eof;

{
   short   status;
   BOOLEAN eoln;
   BOOLEAN char_error = FALSE;
   BOOLEAN leading_blanks_skipped = FALSE;

   do {
       do {
            status = fscanf (input_file, "%c", line_buf);
           } while (!leading_blanks_skipped && (*line_buf == ' ') &&
                   (status == 1));
      leading_blanks_skipped = TRUE;
      *eof = (status != 1) || (*line_buf == 26);
      eoln = (*line_buf == '\n') || (*line_buf == '\r') || (*eof);
      if (!(eoln || *eof) && (!is_legal_char (*line_buf)))
         {
          char_error = TRUE;
          fprintf (stderr, " Error - Illegal char found in triangle %u: %02X (Hex)
         }
      line_buf++;
   } while (!*eof && !eoln);
   *--line_buf = '\0';
   *error = *error || char_error;
} /* get_line */


/*******************************************************************************
   local procedure

   swap_vert


*******************************************************************************/

void swap_vert(x,y,z,user_info)
  float *x;
  float *y;
  float *z;
  USER_INFO_STRUC *user_info;
  {
  float temp;

  if (user_info-> axis == 1) {
    temp = *z;
    *z = *x;
    *x = temp;
    }
  else if (user_info-> axis == 2) {
```

```
  temp = *z;
  *z = *y;
  *y = temp;
  }
 };

/*****************************************************************************
   local procedure

   get_input_tri_asc


*****************************************************************************/

static void get_input_tri_asc (in_file, tri_ptr, user_info, error)

   FILE              *in_file;
   INPUT_TRI_STRUC *tri_ptr;
   USER_INFO_STRUC *user_info;
   BOOLEAN           *error;

{
   UINT16 items_read;

   tri_ptr-> next_input_tri = NULL_INPUT_TRI;

   fscanf (in_file, "%*s %f %f %f", &tri_ptr->x1, &tri_ptr->y1, &tri_ptr->z1);
   swap_vert(&tri_ptr->x1,&tri_ptr->y1,&tri_ptr->z1,user_info);

   fscanf (in_file, "%*s %f %f %f", &tri_ptr->x2, &tri_ptr->y2, &tri_ptr->z2);
   swap_vert(&tri_ptr->x2,&tri_ptr->y2,&tri_ptr->z2,user_info);

   items_read = fscanf (in_file, "%*s %f %f %f", &tri_ptr->x3, &tri_ptr->y3, &tri_
   swap_vert(&tri_ptr->x3,&tri_ptr->y3,&tri_ptr->z3,user_info);

   *error = (items_read != 3);

   if (*error)
     if (!eof(in_file))
        fprintf (stderr, "\n Error - Premature end of input file at triangle %u\n"
     else fprintf (stderr, "\n Error -  I/O error in reading input file at triangl

} /* get_input_tri_asc */



/*****************************************************************************
   local procedure

   update_min_max_values


*****************************************************************************/

void update_min_max_values (tri_ptr, min_x, min_y, min_z,
                                          max_x, max_y, max_z)

   INPUT_TRI_STRUC *tri_ptr;
   float              *min_x, *min_y, *min_z, *max_x, *max_y, *max_z;
```

```
{
   if (tri_ptr-> x1 < *min_x)
      *min_x = tri_ptr-> x1;
   if (tri_ptr-> x2 < *min_x)
      *min_x = tri_ptr-> x2;
   if (tri_ptr-> x3 < *min_x)
      *min_x = tri_ptr-> x3;

   if (tri_ptr-> y1 < *min_y)
      *min_y = tri_ptr-> y1;
   if (tri_ptr-> y2 < *min_y)
      *min_y = tri_ptr-> y2;
   if (tri_ptr-> y3 < *min_y)
      *min_y = tri_ptr-> y3;

   if (tri_ptr-> z1 < *min_z)
      *min_z = tri_ptr-> z1;
   if (tri_ptr-> z2 < *min_z)
      *min_z = tri_ptr-> z2;
   if (tri_ptr-> z3 < *min_z)
      *min_z = tri_ptr-> z3;

   if (tri_ptr-> x1 > *max_x)
      *max_x = tri_ptr-> x1;
   if (tri_ptr-> x2 > *max_x)
      *max_x = tri_ptr-> x2;
   if (tri_ptr-> x3 > *max_x)
      *max_x = tri_ptr-> x3;

   if (tri_ptr-> y1 > *max_y)
      *max_y = tri_ptr-> y1;
   if (tri_ptr-> y2 > *max_y)
      *max_y = tri_ptr-> y2;
   if (tri_ptr-> y3 > *max_y)
      *max_y = tri_ptr-> y3;

   if (tri_ptr-> z1 > *max_z)
      *max_z = tri_ptr-> z1;
   if (tri_ptr-> z2 > *max_z)
      *max_z = tri_ptr-> z2;
   if (tri_ptr-> z3 > *max_z)
      *max_z = tri_ptr-> z3;

} /* update_min_max_values */

static void check_normal(i,j,k)
  float i,j,k;
  {
  float len;

  len = i*i+j*j+k*k;

  if ((len != 0) && ((len < .9) || (len > 1.1))) {
    fprintf(stderr,"\n Error reading normal for triangle %u.\n",tri_count);
    fprintf(stderr,"  Normal %g %g %g not a unit normal.\n",i,j,k);
    exit(SYS_FAILURE);
    };
  };


static void set_normal_info(i,j,k,normal_info)
  float i,j,k;
  UINT8 *normal_info;
  {
  if ((i > -NORMAL_MIN) && (i < NORMAL_MIN)) i = 0.0;
```

```
    if ((j > -NORMAL_MIN) && (j < NORMAL_MIN)) j = 0.0;
    if ((k > -NORMAL_MIN) && (k < NORMAL_MIN)) k = 0.0;

    *normal_info = 0;

    if (i > 0.0)         *normal_info |= NORMAL_X_POSITIVE;
    else if (i < 0.0)    *normal_info |= NORMAL_X_NEGATIVE;

    if (j > 0.0)         *normal_info |= NORMAL_Y_POSITIVE;
    else if (j < 0.0)    *normal_info |= NORMAL_Y_NEGATIVE;

    if (k > 0.0)         *normal_info |= NORMAL_Z_POSITIVE;
    else if (k < 0.0)    *normal_info |= NORMAL_Z_NEGATIVE;

    };


static void get_normal_asc(line_buff,normal_info,user_info)
   STRING           *line_buff;
   UINT8            *normal_info;
   USER_INFO_STRUC *user_info;
   {
   INT16 items_read;
   INT16 items_expected = 3;
   float normal_i,normal_j,normal_k;

   items_read = sscanf(line_buff,"%*s %*s %f %f %f",&normal_i,&normal_j,&normal_k);
   check_normal(normal_i,normal_j,normal_k);

   swap_vert(&normal_i,&normal_j,&normal_k,user_info);

   if (items_read != items_expected) {
     fprintf(stderr,"\n Error - I/O error trying to read normal in triangle %u\n",t
     exit(SYS_FAILURE);
     }

   set_normal_info(normal_i,normal_j,normal_k,normal_info);

   };


/*****************************************************************************
    exported procedure

    pfp_get_input_tri_list


*****************************************************************************/

void pfp_get_input_tri_list (in_file, tri_list,
                              min_x, min_y, min_z,
                              max_x, max_y, max_z, user_info)

    FILE              *in_file;
    INPUT_TRI_STRUC  **tri_list;
    float             *min_x, *min_y, *min_z, *max_x, *max_y, *max_z;
    USER_INFO_STRUC  *user_info;


    STRING            line_buf[200];
    BOOLEAN           error = FALSE;
    BOOLEAN           eof = FALSE;
    UINT8             normal_info;
```

```
    INPUT_TRI_STRUC *tri_ptr, *back_ptr;


    *tri_list = (INPUT_TRI_STRUC *) mem_alloc (sizeof (INPUT_TRI_STRUC));
    tri_ptr = *tri_list;
    get_line (in_file, line_buf, &error, &eof);
    while (!eof && !error)
        {
         while (!eof && !error && (tolower(*line_buf) != NORMAL_FLAG_CHAR))
              get_line (stdin, line_buf, &error, &eof);

         if (!eof && !error)
            {
             tri_count++;
             get_normal_asc(line_buf,&normal_info.user_info);
             get_line(stdin,line_buf,&error,&eof);
             get_input_tri_asc (stdin, tri_ptr, user_info, &error);
             tri_ptr-> normal_info = normal_info;
             if (!error)
                {
                 update_min_max_values (tri_ptr, min_x, min_y, min_z,
                                                 max_x, max_y, max_z);
                 tri_ptr-> next_input_tri = (INPUT_TRI_STRUC *) mem_alloc
                                                (sizeof (INPUT_TRI_STRUC));
                 back_ptr = tri_ptr;
                 tri_ptr = tri_ptr-> next_input_tri;
                 get_line (stdin, line_buf, &error, &eof);
                }
            }
        }

    if (error)
       exit (SYS_FAILURE);

    if (tri_count > 0)
       {
        back_ptr-> next_input_tri = NULL_INPUT_TRI;
        mem_free (tri_ptr,sizeof(INPUT_TRI_STRUC));
       }
    else
       {
        fprintf (stderr, "\n Error - No triangles found in input file");
        exit (SYS_FAILURE);
       }

} /* pfp_get_input_tri_list */




/*************************************************************************
   local procedure
   get_normal_bin

*************************************************************************/

get_normal_bin(in_file,tri_ptr,user_info)
  FILE            *in_file;
  INPUT_TRI_STRUC *tri_ptr;
  USER_INFO_STRUC *user_info;
  {
  float normal_i,normal_j,normal_k;

  fread (&normal_i, sizeof(float), 1, in_file);
  fread (&normal_j, sizeof(float), 1, in_file);
```

```
  fread (&normal_k, sizeof(float), 1, in_file);
  check_normal(normal_i,normal_j,normal_k);
  swap_vert(&normal_i,&normal_j,&normal_k.user_info);

  set_normal_info(normal_i,normal_j,normal_k,&tri_ptr->normal_info);

 return (normal_i != 0.0 || normal_j != 0.0 || normal_k != 0.0);

}/* get_normal_bin */

/*****************************************************************************
   local procedure

   get_input_tri_bin


*****************************************************************************/

void get_input_tri_bin (in_file, tri_ptr, user_info, error)

   FILE              *in_file;
   INPUT_TRI_STRUC   *tri_ptr;
   USER_INFO_STRUC   *user_info;
   BOOLEAN           *error;

{
   INT16 items_read;

   tri_ptr-> next_input_tri = NULL_INPUT_TRI;

   items_read = fread (tri_ptr, sizeof(float), 9,in_file);
   swap_vert(&tri_ptr->x1, &tri_ptr->y1, &tri_ptr->z1, user_info);
   swap_vert(&tri_ptr->x2, &tri_ptr->y2, &tri_ptr->z2, user_info);
   swap_vert(&tri_ptr->x3, &tri_ptr->y3, &tri_ptr->z3, user_info);

   *error = (items_read != 9);

   if (*error) {
     if (feof(in_file))
       fprintf (stderr, "\n Error - Premature end of input file at triangle %u\n",
     else
       fprintf (stderr, "\n Error - I/O error reading verticies in triangle %uinve
     exit (SYS_FAILURE);
     }

} /* get_input_tri_bin */



/*****************************************************************************
   exported procedure

   pfp_get_input_tri_list_bin


*****************************************************************************/
void pfp_get_input_tri_list_bin (in_file, tri_list,
                                 min_x, min_y, min_z,
                                 max_x, max_y, max_z,
                                 user_info)

   FILE              *in_file;
```

```
INPUT_TRI_STRUC **tri_list;
float           *min_x, *min_y, *min_z, *max_x, *max_y, *max_z;
USER_INFO_STRUC *user_info;

{
BOOLEAN         error = FALSE;
INPUT_TRI_STRUC *tri_ptr, *back_ptr;
STRING          record[81];
unsigned long   facet_records;
UINT16          attrib_size;

*tri_list = (INPUT_TRI_STRUC *) mem_alloc (sizeof (INPUT_TRI_STRUC));

tri_ptr = *tri_list;
record[80] = '\0';
while (!error && (fread(record,80,1,in_file) > 0)) if (user_info->attrib) {
  fread(&facet_records,4,1,in_file);
  while (!error && (facet_records != 0)) {
    tri_count++;
    facet_records--;
    get_normal_bin (in_file,tri_ptr,user_info);
    get_input_tri_bin (in_file, tri_ptr, user_info, &error);
    if (!error) {
      fread(&attrib_size,2,1,in_file);
      while (attrib_size != 0) {
        attrib_size--;
        fread(record,1,1,in_file);
        }
      update_min_max_values (tri_ptr, min_x, min_y, min_z, max_x, max_y, max_z)
      tri_ptr-> next_input_tri = (INPUT_TRI_STRUC *) mem_alloc (sizeof (INPUT_T
      back_ptr = tri_ptr;
      tri_ptr = tri_ptr-> next_input_tri;
      }
    }
  }
else while (!error && get_normal_bin (in_file,tri_ptr,user_info)) {
  tri_count++;
  get_input_tri_bin (in_file, tri_ptr, user_info, &error);
  if (!error) {
    fread(&attrib_size,2,1,in_file);
    while (attrib_size > 0) {
      fread(record,1,1,in_file);
      attrib_size--;
      }
    update_min_max_values (tri_ptr, min_x, min_y, min_z, max_x, max_y, max_z);
    tri_ptr-> next_input_tri = (INPUT_TRI_STRUC *) mem_alloc (sizeof (INPUT_TRI
    back_ptr = tri_ptr;
    tri_ptr = tri_ptr-> next_input_tri;
    }
  }
if (error)
  exit (SYS_FAILURE);

if (tri_count > 0) {
  back_ptr-> next_input_tri = NULL_INPUT_TRI;
  mem_free (tri_ptr,sizeof(INPUT_TRI_STRUC));
  }
else {
  fprintf (stderr, "\n Error - No triangles found in input file");
  exit (SYS_FAILURE);
  }
} /* pfp_get_input_tri_list_bin */
```

```
/******************************************************************************/
/*                                                                            */
/* PFPSEG.C                                                                   */
/*                                                                            */
/* PFP Segment utility module                                                 */
/*                                                                            */
/*                                                                            */
/*                            MODIFICATION LOG                                */
/*----------------------------------------------------------------------------*/
/* date       who                  what                                       */
/*----------------------------------------------------------------------------*/
/*          |P. Stinebaugh     | original code                                */
/*          |                  |                                              */
/******************************************************************************/

#include <stdio.h>
#include "pfp.h"
#include "pfphi.h"
#include "pfptri.h"
#include "pfpseg.h"



/******************************************************************************
   exported procedure

   Output_Error


******************************************************************************/
void Output_Error()
  {
  fprintf(stderr,"\n*** I/O Error in Slice output file ***\n");
  exit(SYS_FAILURE);
  };

/******************************************************************************
   exported procedure

   pfp_print_seg_list


******************************************************************************/
void pfp_print_seg_list (seg_list, z, seg_file, section_type,
                         user_info)

   OUT_SEG_STRUC    **seg_list;
   UINT16           z;
   FILE             *seg_file;
   UINT16           section_type;
   USER_INFO_STRUC  *user_info;

   OUT_SEG_STRUC *seg_ptr,*temp_ptr;
```

```
if (section_type == LB_CODE) {
   if (fprintf(seg_file, "%s %u\n", L_TEXT, z)!=0) Output_Error;
   if (*seg_list != NULL_SEG)
     if (fprintf(seg_file, "%s\n", LB_TEXT)!=0) Output_Error;
   }

if ((*seg_list != NULL_SEG) &&
     ((*seg_list)-> normal_info == section_type)) {
  if (!user_info-> section_codes_off)
     switch (section_type)
         {
         case (LH_CODE) :
            if (fprintf(seg_file, "%s\n", LH_TEXT)!=0) Output_Error;
            break;
         case (NFDB_CODE) :
            if (fprintf(seg_file, "%s\n", NFDB_TEXT)!=0) Output_Error;
            break;
         case (NFDH_CODE) :
            if (fprintf(seg_file, "%s\n", NFDH_TEXT)!=0) Output_Error;
            break;
         case (NFDF_CODE) :
            if (fprintf(seg_file, "%s\n", NFDF_TEXT)!=0) Output_Error;
            break;
         case (NFUB_CODE):
            if (fprintf(seg_file, "%s\n", NFUB_TEXT)!=0) Output_Error;
            break;
         case (NFUH_CODE):
            if (fprintf(seg_file, "%s\n", NFUH_TEXT)!=0) Output_Error;
            break;
         case (NFUF_CODE) :
            if (fprintf(seg_file, "%s\n", NFUF_TEXT)!=0) Output_Error;
            break;
         case (FUB_CODE):
            if (fprintf(seg_file, "%s\n", FUB_TEXT)!=0) Output_Error;
            break;
         case (FUH_CODE):
            if (fprintf(seg_file, "%s\n", FUH_TEXT)!=0) Output_Error;
            break;
         case (FUF_CODE):
            if (fprintf(seg_file, "%s\n", FUF_TEXT)!=0) Output_Error;
            break;
         case (FDB_CODE) :
            if (fprintf(seg_file, "%s\n", FDB_TEXT)!=0) Output_Error;
            break;
         case (FDH_CODE) :
            if (fprintf(seg_file, "%s\n", FDH_TEXT)!=0) Output_Error;
            break;
         case (FDF_CODE) :
            if (fprintf(seg_file, "%s\n", FDF_TEXT)!=0) Output_Error;
            break;
         }

  seg_ptr = *seg_list;

  while ((seg_ptr != NULL_SEG) &&
           (seg_ptr-> normal_info == section_type)) {
    if (fprintf(seg_file, " %u %u %u %u\n", seg_ptr-> x_1, seg_ptr-> y_1,
      seg_ptr-> x_2, seg_ptr-> y_2)!=0) Output_Error;
    temp_ptr = seg_ptr;
    seg_ptr = seg_ptr-> next_seg;
    mem_free(temp_ptr,sizeof(OUT_SEG_STRUC));
    }
  *seg_list = NULL_SEG;
  }

/* pfp print seg list */
```

```
/*******************************************************************************
   exported procedure

   pfp_display_seg_list



*******************************************************************************/

void pfp_display_seg_list (seg_list, display_mode)

   OUT_SEG_STRUC *seg_list;
   INT16          display_mode;

{
   OUT_SEG_STRUC *seg_ptr;

   set_display_mode (display_mode);

   seg_ptr = seg_list;

   while (seg_ptr != NULL_SEG)
      {
       draw_line (seg_ptr->x_1, seg_ptr->y_1, seg_ptr->x_2, seg_ptr->y_2);
       seg_ptr = seg_ptr->next_seg;
      }

} /* pfp_display_seg_list */




/*******************************************************************************
   exported procedure

   pfp_delete_seg_list



*******************************************************************************/

void pfp_delete_seg_list (seg_list)

   OUT_SEG_STRUC **seg_list;

{
   OUT_SEG_STRUC *next_ptr,*seg_ptr;

   seg_ptr = *seg_list;

   while (seg_ptr != NULL_SEG)
      {
       next_ptr = seg_ptr->next_seg;
        os_free (seg_ptr,sizeof(OUT_SEG_STRUC));
```

```
      seg_ptr = next_ptr;
     }

   *seg_list = seg_ptr;

} /* pfo_delete_seg_list */




/*****************************************************************************
   local procedure

   swap_points



*****************************************************************************/


static void swap_points (seg_ptr)

   OUT_SEG_STRUC *seg_ptr;

{
   UINT16        temp;

   temp = seg_ptr->x_1;
   seg_ptr->x_1 = seg_ptr->x_2;
   seg_ptr->x_2 = temp;

   temp = seg_ptr->y_1;
   seg_ptr->y_1 = seg_ptr->y_2;
   seg_ptr->y_2 = temp;

} /* swap_points */




/*****************************************************************************
   local procedure

   get_next_seg



*****************************************************************************/


static void get_next_seg (seg_ptr, seg_list, next_seg_ptr)

   OUT_SEG_STRUC *seg_ptr;
   OUT_SEG_STRUC **seg_list;
   OUT_SEG_STRUC **next_seg_ptr;


   OUT_SEG_STRUC *list_ptr, *back_ptr;
   OUT_SEG_STRUC head_rec;
   BOOLEAN       seg_found = FALSE;
```

```
    *next_seg_ptr = NULL_SEG;
    back_ptr = &head_rec;
    head_rec .next_seg = *seg_list;
    list_ptr = *seg_list;

    while ((list_ptr != NULL_SEG) && !seg_found)
       {
        seg_found = (((seg_ptr-> x_1 == list_ptr-> x_2) &&
                      (seg_ptr-> y_1 == list_ptr-> y_2)) ||
                     ((seg_ptr-> x_1 == list_ptr-> x_1) &&
                      (seg_ptr-> y_1 == list_ptr-> y_1)));

        if (!seg_found)
           {
            back_ptr = list_ptr;
            list_ptr = list_ptr-> next_seg;
           }
       }

    if (seg_found)
       {
        if (!((seg_ptr-> x_1 == list_ptr-> x_2) &&
              (seg_ptr-> y_1 == list_ptr-> y_2)))
           swap_points (list_ptr);

        back_ptr-> next_seg = list_ptr-> next_seg;
        *next_seg_ptr = list_ptr;
       }

    *seg_list = head_rec .next_seg;

} /* get_next_seg */




/***************************************************************************************
   exported procedure

   pfp_sort_seg_list


****************************************************************************************/

void pfp_sort_seg_list (list_1_ptr, loop_count)

   OUT_SEG_STRUC **list_1_ptr;
   INT16          *loop_count;

{
   OUT_SEG_STRUC *list_2_ptr, *seg_ptr, *next_seg_ptr;

   seg_ptr = NULL_SEG;
   next_seg_ptr = NULL_SEG;
   list_2_ptr = NULL_SEG;

   *loop_count = 0;

   while (*list_1_ptr != NULL_SEG)
      {
```

```
        (*loop_count)++;
        seg_ptr = *list_1_ptr;
        *list_1_ptr = (*list_1_ptr)-> next_seg;
        seg_ptr-> next_seg = list_2_ptr;
        list_2_ptr = seg_ptr;
        do
            {
            get_next_seg (seg_ptr, list_1_ptr, &next_seg_ptr);
            if (next_seg_ptr != NULL_SEG)
                {
                next_seg_ptr-> next_seg = list_2_ptr;
                list_2_ptr = next_seg_ptr;
                seg_ptr = next_seg_ptr;
                }
            } while (next_seg_ptr != NULL_SEG);
        }

    *list_1_ptr = list_2_ptr;

} /* pfp_sort_seg_list */


/*****************************************************************************************
    procedure

    append_seg_list


*****************************************************************************************/

void append_seg_list (list1, list2)

    OUT_SEG_STRUC **list1;
    OUT_SEG_STRUC **list2;

{
    OUT_SEG_STRUC *list1_ptr;


    if (*list1 == NULL_SEG)
        *list1 = *list2;
    else
        {
        list1_ptr = *list1;
        while (list1_ptr-> next_seg != NULL_SEG)
            list1_ptr = list1_ptr-> next_seg;
        list1_ptr-> next_seg = *list2;
        }
    *list2 = NULL_SEG;

} /* append_seg_list */
```

```
/*******************************************************************************/
/*                                                                             */
/* PFPSEG.C                                                                    */
/*                                                                             */
/* PFP Segment utility module                                                  */
/*                                                                             */
/*                                                                             */
/*                          MODIFICATION LOG                                   */
/*-----------------------------------------------------------------------------*/
/* date        who                 what                                        */
/*-----------------------------------------------------------------------------*/
/*           |P. Stinebaugh      | original code                               */
/*           |                   |                                             */
/*******************************************************************************/

#include <stdio.h>
#include "pfp.h"
#include "pfphi.h"
#include "pfptri.h"
#include "pfpseg.h"



/*******************************************************************************
   exported procedure

   Output_Error



*******************************************************************************/

void Output_Error()
  {
  fprintf(stderr,"\n*** I/O Error in Slice output file ***\n");
  exit(SYS_FAILURE);
  };

/*******************************************************************************
   exported procedure

   pfp_print_seg_list



*******************************************************************************/

void pfp_print_seg_list (seg_list, z, seg_file, section_type,
                         user_info)

   OUT_SEG_STRUC   **seg_list;
   UINT16          z;
   FILE            *seg_file;
   UINT16          section_type;
   USER_INFO_STRUC *user_info;


   OUT_SEG_STRUC *seg_ptr,*temp_ptr;
```

```
if (section_type == LB_CODE) {
   if (fprintf(seg_file, "%s %u\n", L_TEXT, z)!=0) Output_Error;
   if (*seg_list != NULL_SEG)
     if (fprintf(seg_file, "%s\n", LB_TEXT)!=0) Output_Error;
   }

if ((*seg_list != NULL_SEG) &&
    ((*seg_list)-> normal_info == section_type)) {
  if (!user_info-> section_codes_off)
     switch (section_type)
        {
         case (LH_CODE) :
            if (fprintf(seg_file, "%s\n", LH_TEXT)!=0) Output_Error;
            break;
         case (NFDB_CODE) :
            if (fprintf(seg_file, "%s\n", NFDB_TEXT)!=0) Output_Error;
            break;
         case (NFDH_CODE) :
            if (fprintf(seg_file, "%s\n", NFDH_TEXT)!=0) Output_Error;
            break;
         case (NFDF_CODE) :
            if (fprintf(seg_file, "%s\n", NFDF_TEXT)!=0) Output_Error;
            break;
         case (NFUB_CODE):
            if (fprintf(seg_file, "%s\n", NFUB_TEXT)!=0) Output_Error;
            break;
         case (NFUH_CODE):
            if (fprintf(seg_file, "%s\n", NFUH_TEXT)!=0) Output_Error;
            break;
         case (NFUF_CODE) :
            if (fprintf(seg_file, "%s\n", NFUF_TEXT)!=0) Output_Error;
            break;
         case (FUB_CODE):
            if (fprintf(seg_file, "%s\n", FUB_TEXT)!=0) Output_Error;
            break;
         case (FUH_CODE):
            if (fprintf(seg_file, "%s\n", FUH_TEXT)!=0) Output_Error;
            break;
         case (FUF_CODE):
            if (fprintf(seg_file, "%s\n", FUF_TEXT)!=0) Output_Error;
            break;
         case (FDB_CODE) :
            if (fprintf(seg_file, "%s\n", FDB_TEXT)!=0) Output_Error;
            break;
         case (FDH_CODE) :
            if (fprintf(seg_file, "%s\n", FDH_TEXT)!=0) Output_Error;
            break;
         case (FDF_CODE) :
            if (fprintf(seg_file, "%s\n", FDF_TEXT)!=0) Output_Error;
            break;
        }

  seg_ptr = *seg_list;

  while ((seg_ptr != NULL_SEG) &&
         (seg_ptr-> normal_info == section_type)) {
    if (fprintf(seg_file, " %u %u %u %u\n", seg_ptr-> x_1, seg_ptr-> y_1,
      seg_ptr-> x_2, seg_ptr-> y_2)!=0) Output_Error;
    temp_ptr = seg_ptr;
    seg_ptr = seg_ptr-> next_seg;
    mem_free(temp_ptr,sizeof(OUT_SEG_STRUC));
    }
  *seg_list = NULL_SEG;
  }

/* pfp_print_seg_list */
```

```
/*****************************************************************************
   exported procedure

   pfp_display_seg_list


*****************************************************************************/

void pfp_display_seg_list (seg_list. display_mode)

   OUT_SEG_STRUC *seg_list:
   INT16          display_mode:

{
   OUT_SEG_STRUC *seg_ptr:

   set_display_mode (display_mode):

   seg_ptr = seg_list:

   while (seg_ptr != NULL_SEG)
      {
       draw_line (seg_ptr-> x_1, seg_ptr-> y_1, seg_ptr-> x_2, seg_ptr-> y_2):
       seg_ptr = seg_ptr-> next_seg:
      }

} /* pfp_display_seg_list */



/*****************************************************************************
   exported procedure

   pfp_delete_seg_list


*****************************************************************************/

void pfp_delete_seg_list (seg_list)

   OUT_SEG_STRUC **seg_list:

{
   OUT_SEG_STRUC *next_ptr,*seg_ptr;

   seg_ptr = *seg_list:

   while (seg_ptr != NULL_SEG)
      {
       next_ptr = seg_ptr-> next_seg:
       mem_free (seg_ptr.sizeof(OUT_SEG_STRUC)):
```

```
        seg_ptr = next_ptr;
      }

   *seg_list = seg_ptr;

} /* pfp_delete_seg_list */




/******************************************************************************
   local procedure

   swap_points


******************************************************************************/

static void swap_points (seg_ptr)

   OUT_SEG_STRUC *seg_ptr;

{
   UINT16        temp;

   temp = seg_ptr->x_1;
   seg_ptr->x_1 = seg_ptr->x_2;
   seg_ptr->x_2 = temp;

   temp = seg_ptr->y_1;
   seg_ptr->y_1 = seg_ptr->y_2;
   seg_ptr->y_2 = temp;

} /* swap_points */




/******************************************************************************
   local procedure

   get_next_seg


******************************************************************************/

static void get_next_seg (seg_ptr, seg_list, next_seg_ptr)

   OUT_SEG_STRUC *seg_ptr;
   OUT_SEG_STRUC **seg_list;
   OUT_SEG_STRUC **next_seg_ptr;

{
   OUT_SEG_STRUC *list_ptr, *back_ptr;
   OUT_SEG_STRUC head_rec;
   BOOLEAN       seg_found = FALSE;
```

```
    *next_seg_ptr = NULL_SEG;
    back_ptr = &head_rec;
    head_rec .next_seg = *seg_list;
    list_ptr = *seg_list;

    while ((list_ptr != NULL_SEG) && !seg_found)
      {
       seg_found = (((seg_ptr-> x_1 == list_ptr-> x_2) &&
                     (seg_ptr-> y_1 == list_ptr-> y_2)) ||
                    ((seg_ptr-> x_1 == list_ptr-> x_1) &&
                     (seg_ptr-> y_1 == list_ptr-> y_1)));

       if (!seg_found)
          {
           back_ptr = list_ptr;
           list_ptr = list_ptr-> next_seg;
          }
      }

    if (seg_found)
      {
       if (!((seg_ptr-> x_1 == list_ptr-> x_2) &&
             (seg_ptr-> y_1 == list_ptr-> y_2)))
          swap_points (list_ptr);

       back_ptr-> next_seg = list_ptr-> next_seg;
       *next_seg_ptr = list_ptr;
      }

    *seg_list = head_rec .next_seg;

} /* get_next_seg */




/*****************************************************************************
   exported procedure

   pfp_sort_seg_list



*****************************************************************************/

void pfp_sort_seg_list (list_1_ptr, loop_count)

   OUT_SEG_STRUC **list_1_ptr;
   INT16          *loop_count;

{
   OUT_SEG_STRUC *list_2_ptr, *seg_ptr, *next_seg_ptr;

   seg_ptr = NULL_SEG;
   next_seg_ptr = NULL_SEG;
   list_2_ptr = NULL_SEG;

   *loop_count = 0;

   while (*list_1_ptr != NULL_SEG)
      {
```

```
        (*loop_count)++;
        seg_ptr = *list_1_ptr;
        *list_1_ptr = (*list_1_ptr)-> next_seg;
        seg_ptr-> next_seg = list_2_ptr;
        list_2_ptr = seg_ptr;
        do
            {
             get next_seg (seg_ptr, list_1_ptr, &next_seg_ptr);
             if (next_seg_ptr != NULL_SEG)
                {
                 next_seg_ptr-> next_seg = list_2_ptr;
                 list_2_ptr = next_seg_ptr;
                 seg_ptr = next_seg_ptr;
                }
            } while (next_seg_ptr != NULL_SEG);
       }

   *list_1_ptr = list_2_ptr;

} /* pfp_sort_seg_list */


/******************************************************************************
   procedure

   append_seg_list


******************************************************************************/


void append_seg_list (list1, list2)

   OUT_SEG_STRUC **list1;
   OUT_SEG_STRUC **list2;

{
   OUT_SEG_STRUC *list1_ptr;


   if (*list1 == NULL_SEG)
      *list1 = *list2;
   else
      {
       list1_ptr = *list1;
       while (list1_ptr-> next_seg != NULL_SEG)
          list1_ptr = list1_ptr-> next_seg;
       list1_ptr-> next_seg = *list2;
      }
   *list2 = NULL_SEG;

} /* append_seg_list */
```

```
/*************************************************************************************/
/*                                                                                  */
/* PFPSEG.H                                                                         */
/*                                                                                  */
/* PFP segment header file                                                          */
/*                                                                                  */
/*                              MODIFICATION LOG                                    */
/*----------------------------------------------------------------------------------*/
/* date        who                  what                                            */
/*----------------------------------------------------------------------------------*/
/*            |                    |                                                */
/*            |                    |                                                */
/*************************************************************************************/

#define NORMAL_X_POSITIVE  1
#define NORMAL_X_NEGATIVE  2
#define NORMAL_Y_POSITIVE  4
#define NORMAL_Y_NEGATIVE  8
#define NORMAL_Z_POSITIVE  16
#define NORMAL_Z_NEGATIVE  32
#define FLAT_TRI           64
#define NEAR_FLAT_TRI      128

struct out_seg
   {
    UINT16          x_1;
    UINT16          y_1;
    UINT16          x_2;
    UINT16          y_2;
    UINT8           normal_info;
    struct out_seg *next_seg;

   };

typedef struct out_seg OUT_SEG_STRUC;

#define NULL_SEG             (OUT_SEG_STRUC *) NULL

#define L_TEXT               "L"    /* Layer Header */
#define LB_TEXT              "LB"   /* border */
#define LH_TEXT              "LH"   /* border hatching */
#define NFDB_TEXT            "NFDB" /* Near-Flat Down skin Border */
#define NFDH_TEXT            "NFDH" /* Near-Flat Down skin Hatch */
#define NFDF_TEXT            "NFDF" /* Near-Flat Down skin Fill */
#define NFUB_TEXT            "NFUB" /* Near-Flat Up skin Border */
#define NFUH_TEXT            "NFUH" /* Near-Flat Up skin Border */
#define NFUF_TEXT            "NFUF" /* Near-Flat Up skin Fill */
#define FDB_TEXT             "FDB"  /* Flat Down skin Fill */
#define FDH_TEXT             "FDH"  /* Flat Down skin Fill */
#define FDF_TEXT             "FDF"  /* Flat Down skin Fill */
#define FUB_TEXT             "FUB"  /* Flat Down skin Fill */
#define FUH_TEXT             "FUH"  /* Flat Down skin Fill */
#define FUF_TEXT             "FUF"  /* Flat Down skin Fill */
```

```
/*****************************************************************************/
/*                                                                           */
/* PFPTRI.C                                                                  */
/*                                                                           */
/* PFP Process Triangles Section                                             */
/*                                                                           */
/*                         MODIFICATION LOG                                  */
/*---------------------------------------------------------------------------*/
/* date        who              what                                         */
/*---------------------------------------------------------------------------*/
/*          |                |                                               */
/*****************************************************************************/

#include <stdio.h>
#include <math.h>

#include "pfp.h"
#include "pfphi.h"
#include "pfptri.h"
#include "pfpsec.h"
#include "pfputl.h"

extern INPUT_TRI_STRUC *tri_bucket_array[];
extern OUT_SEG_STRUC *FD_seg_bucket_array[];
extern OUT_SEG_STRUC *FU_seg_bucket_array[];
extern OUT_SEG_STRUC *NFU_seg_bucket_array[];
extern OUT_SEG_STRUC *NFD_seg_bucket_array[];
extern UINT16        z_control_table[];

/****************************************************************************

    local procedure

    add_near_flat_segment

    Adds a segment list

****************************************************************************/

static void add_near_flat_segment(segment,zi)
  OUT_SEG_STRUC **segment;
  UINT16        zi;
  {
  OUT_SEG_STRUC *seg_ptr;

  seg_ptr = *segment;
  *segment = NULL_SEG;

  if (seg_ptr->normal_info&NORMAL_Z_POSITIVE) {
    seg_ptr->next_seg = NFU_seg_bucket_array[zi];
    NFU_seg_bucket_array[zi] = seg_ptr;
    }
  else {
    seg_ptr->next_seg = NFD_seg_bucket_array[zi];
    NFD_seg_bucket_array[zi] = seg_ptr;
    };
  };

 ***************************************************************************

    procedure
```

```
   process_flat_tri_list

   Takes each flat triangle and generates segments for z level
    and adds to FU or FD segment lists

************************************************************************/
void process_flat_tri_list(flat_tri_list)
  INPUT_TRI_STRUC *flat_tri_list;
  {
  OUT_SEG_STRUC   *seg_list;
  INPUT_TRI_STRUC *temp_tri_ptr;
  UINT16          flat_tri_count = 0;
  UINT16          zi;

  while (flat_tri_list != NULL_INPUT_TRI) {
    flat_tri_count++;
    if (flat_tri_count%10 == 0)
      fprintf(stderr," processing flat triangles (%u)\r",flat_tri_count);

    seg_list = NULL_SEG;
    pfp_convert_tri_to_segs(flat_tri_list,&seg_list);
    zi = get_z_binarily((UINT16) flat_tri_list->z1);

    if (flat_tri_list->normal_info&NORMAL_Z_POSITIVE) {
      append_seg_list(&seg_list,&FU_seg_bucket_array[zi]);
      FU_seg_bucket_array[zi] = seg_list;
      }
    else {
      append_seg_list(&seg_list,&FD_seg_bucket_array[zi]);
      FD_seg_bucket_array[zi] = seg_list;
      };

    temp_tri_ptr = flat_tri_list;
    flat_tri_list = flat_tri_list->next_input_tri;
    mem_free(temp_tri_ptr,sizeof(INPUT_TRI_STRUC));
    };
    fprintf(stderr," processing flat triangles (%u)\n",flat_tri_count);
  };


************************************************************************

   procedure

   process_near_flat_tri_list

   Takes each near flat triangle and breaks into polygon for each z level
    and adds to NFU or NFD segment lists

************************************************************************/
void process_near_flat_tri_list(near_flat_tri_list)
  INPUT_TRI_STRUC *near_flat_tri_list;
  {
  OUT_SEG_STRUC   *side1_seg,*side2_seg,*top_seg,*bot_seg;
  INPUT_TRI_STRUC *temp_tri_ptr;
  VECT_TRI_STRUC  vect_tri;
  UINT16          near_tri_count = 0;
  UINT16          zi;

  top_seg = NULL_SEG;
  bot_seg = NULL_SEG;

  while (near_flat_tri_list != NULL_INPUT_TRI) {
```

```
near_tri_count++;
if (near_tri_count%10 == 0)
  fprintf(stderr," processing near flat triangles (%u)\r",near_tri_count);

pfp_convert_tri_to_vect(near_flat_tri_list,&vect_tri);
zi = get_z_binarily((UINT16) vect_tri.vert1_z);

while (z_control_table[zi+1] <= vect_tri.vert3_z) {
  pfp_get_intersection_segment(&vect_tri,z_control_table[zi],  &bot_seg);
  pfp_get_intersection_segment(&vect_tri,z_control_table[zi+1],&top_seg);
  side1_seg = (OUT_SEG_STRUC *) mem_alloc(sizeof(OUT_SEG_STRUC));
  side1_seg->x_1 = bot_seg->x_1;
  side1_seg->y_1 = bot_seg->y_1;
  side1_seg->x_2 = top_seg->x_1;
  side1_seg->y_2 = top_seg->y_1;
  side2_seg = (OUT_SEG_STRUC *) mem_alloc(sizeof(OUT_SEG_STRUC));
  side2_seg->x_1 = bot_seg->x_2;
  side2_seg->y_1 = bot_seg->y_2;
  side2_seg->x_2 = top_seg->x_2;
  side2_seg->y_2 = top_seg->y_2;
  side1_seg->normal_info = bot_seg->normal_info;
  side2_seg->normal_info = bot_seg->normal_info;
  /* Check for point segments in Top and Bottom. If so, at a vertex */
  if ((bot_seg->x_1 == bot_seg->x_2) && (bot_seg->y_1 == bot_seg->y_2)) {
    pfp_get_xy_normal_info((float) side1_seg->x_1,(float) side1_seg->y_1,
                           (float) side1_seg->x_2,(float) side1_seg->y_2,
                           (float) top_seg->x_2,  (float) top_seg->y_2,
                           &side1_seg->normal_info);
    pfp_get_xy_normal_info((float) side2_seg->x_1,(float) side2_seg->y_1,
                           (float) side2_seg->x_2,(float) side2_seg->y_2,
                           (float) top_seg->x_1,  (float) top_seg->y_1,
                           &side2_seg->normal_info);
    pfp_get_xy_normal_info((float) top_seg->x_1,(float) top_seg->y_1,
                           (float) top_seg->x_2,(float) top_seg->y_2,
                           (float) bot_seg->x_1,(float) bot_seg->y_1,
                           &top_seg->normal_info);
    add_near_flat_segment(&top_seg,zi);
    }
  else {
    pfp_get_xy_normal_info((float) side1_seg->x_1,(float) side1_seg->y_1,
                           (float) side1_seg->x_2,(float) side1_seg->y_2,
                           (float) bot_seg->x_2,  (float) bot_seg->y_2,
                           &side1_seg->normal_info);
    pfp_get_xy_normal_info((float) side2_seg->x_1,(float) side2_seg->y_1,
                           (float) side2_seg->x_2,(float) side2_seg->y_2,
                           (float) bot_seg->x_1,  (float) bot_seg->y_1,
                           &side2_seg->normal_info);
    pfp_get_xy_normal_info((float) bot_seg->x_1,(float) bot_seg->y_1,
                           (float) bot_seg->x_2,(float) bot_seg->y_2,
                           (float) top_seg->x_1,(float) top_seg->y_1,
                           &bot_seg->normal_info);
    if ((top_seg->x_1 != top_seg->x_2) || (top_seg->y_1 != top_seg->y_2)) {
      pfp_get_xy_normal_info((float) top_seg->x_1,(float) top_seg->y_1,
                             (float) top_seg->x_2,(float) top_seg->y_2,
                             (float) bot_seg->x_1,(float) bot_seg->y_1,
                             &top_seg->normal_info);
      add_near_flat_segment(&top_seg,zi);
      };
    add_near_flat_segment(&bot_seg,zi);
    };
  add_near_flat_segment(&side1_seg,zi);
  add_near_flat_segment(&side2_seg,zi);
  zi++;
  };

 temp_tri_ptr = near_flat_tri_list;
```

```
  near_flat_tri_list = near_flat_tri_list->next_input_tri;
  mem_free(temp_tri_ptr,sizeof(INPUT_TRI_STRUC));
  };

if (top_seg != NULL_SEG)
  mem_free(top_seg,sizeof(OUT_SEG_STRUC));
if (bot_seg != NULL_SEG)
  mem_free(bot_seg,sizeof(OUT_SEG_STRUC));

fprintf(stderr," processing near flat triangles (%u)\n",near_tri_count);
};
```

```
/*******************************************************************************/
/*                                                                             */
/* PFPTUTL.C                                                                   */
/*                                                                             */
/* PFP Triangle Utilities module                                               */
/*                                                                             */
/*                              MODIFICATION LOG                               */
/*-----------------------------------------------------------------------------*/
/* date        who              what                                           */
/*-----------------------------------------------------------------------------*/
/*            |P. Stinebaugh   | original code                                 */
/*            |                |                                               */
/*******************************************************************************/

#include <stdio.h>
#include "pfp.h"
#include "pfptri.h"
#include "pfpseg.h"
#include "pfputl.h"

extern UINT16 z_control_table [];

/*******************************************************************************
   exported procedure

   pfp_get_min_z

*******************************************************************************/

void pfp_get_min_z (tri, min_z)

   INPUT_TRI_STRUC *tri;
   float            *min_z;

{
   *min_z = (float) (MAX_Z_VAL+1);

   if (tri-> z1 < *min_z)
      *min_z = tri-> z1;

   if (tri-> z2 < *min_z)
      *min_z = tri-> z2;

   if (tri-> z3 < *min_z)
      *min_z = tri-> z3;

} /* pfp_get_min_z */

/*******************************************************************************
   local procedure

   get_max_z
```

```
*****************************************************************************************/

void get_max_z (tri, max_z)

   INPUT_TRI_STRUC *tri;
   float            *max_z;

{
   *max_z = 0.0;

   if (tri-> z1 > *max_z)
      *max_z = tri-> z1;

   if (tri-> z2 > *max_z)
      *max_z = tri-> z2;

   if (tri-> z3 > *max_z)
      *max_z = tri-> z3;

} /* get max_z */



/*****************************************************************************************
   local procedure

   order_points


*****************************************************************************************/

void order_points (input_tri)

   INPUT_TRI_STRUC *input_tri;

{
   INPUT_TRI_STRUC *temp_tri;
   float            min_z;
   float            max_z;

   temp_tri = (INPUT_TRI_STRUC *) mem_alloc (sizeof (INPUT_TRI_STRUC));

   pfp_get_min_z (input_tri, &min_z);

   get_max_z (input_tri, &max_z);

   if ((input_tri-> z1 == max_z) && (input_tri-> z2 == min_z))
      {
       temp_tri-> x1 = input_tri-> x2;
       temp_tri-> y1 = input_tri-> y2;
       temp_tri-> z1 = input_tri-> z2;

       temp_tri-> x2 = input_tri-> x3;
       temp_tri-> y2 = input_tri-> y3;
       temp_tri-> z2 = input_tri-> z3;
```

```
        temp_tri-> x3 = input_tri-> x1;
        temp_tri-> y3 = input_tri-> y1;
        temp_tri-> z3 = input_tri-> z1;
      }

   else if ((input_tri-> z1 == max_z) && (input_tri-> z3 == min_z))
      {
        temp_tri-> x1 = input_tri-> x3;
        temp_tri-> y1 = input_tri-> y3;
        temp_tri-> z1 = input_tri-> z3;

        temp_tri-> x2 = input_tri-> x2;
        temp_tri-> y2 = input_tri-> y2;
        temp_tri-> z2 = input_tri-> z2;

        temp_tri-> x3 = input_tri-> x1;
        temp_tri-> y3 = input_tri-> y1;
        temp_tri-> z3 = input_tri-> z1;
      }

   else if ((input_tri-> z2 == max_z) && (input_tri-> z3 == min_z))
      {
        temp_tri-> x1 = input_tri-> x3;
        temp_tri-> y1 = input_tri-> y3;
        temp_tri-> z1 = input_tri-> z3;

        temp_tri-> x2 = input_tri-> x1;
        temp_tri-> y2 = input_tri-> y1;
        temp_tri-> z2 = input_tri-> z1;

        temp_tri-> x3 = input_tri-> x2;
        temp_tri-> y3 = input_tri-> y2;
        temp_tri-> z3 = input_tri-> z2;
      }

   else if ((input_tri-> z2 == max_z) && (input_tri-> z1 == min_z))
      {
        temp_tri-> x1 = input_tri-> x1;
        temp_tri-> y1 = input_tri-> y1;
        temp_tri-> z1 = input_tri-> z1;

        temp_tri-> x2 = input_tri-> x3;
        temp_tri-> y2 = input_tri-> y3;
        temp_tri-> z2 = input_tri-> z3;

        temp_tri-> x3 = input_tri-> x2;
        temp_tri-> y3 = input_tri-> y2;
        temp_tri-> z3 = input_tri-> z2;
      }

   else if ((input_tri-> z3 == max_z) && (input_tri-> z1 == min_z))
      {
        temp_tri-> x1 = input_tri-> x1;
        temp_tri-> y1 = input_tri-> y1;
        temp_tri-> z1 = input_tri-> z1;

        temp_tri-> x2 = input_tri-> x2;
        temp_tri-> y2 = input_tri-> y2;
        temp_tri-> z2 = input_tri-> z2;

        temp_tri-> x3 = input_tri-> x3;
        temp_tri-> y3 = input_tri-> y3;
        temp_tri-> z3 = input_tri-> z3;
      }
```

```
   else
      {
       temp_tri-> x1 = input_tri-> x2;
       temp_tri-> y1 = input_tri-> y2;
       temp_tri-> z1 = input_tri-> z2;

       temp_tri-> x2 = input_tri-> x1;
       temp_tri-> y2 = input_tri-> y1;
       temp_tri-> z2 = input_tri-> z1;

       temp_tri-> x3 = input_tri-> x3;
       temp_tri-> y3 = input_tri-> y3;
       temp_tri-> z3 = input_tri-> z3;
      }

   temp_tri-> normal_info = input_tri-> normal_info;
   temp_tri-> next_input_tri = input_tri-> next_input_tri;
   copy(temp_tri, input_tri, sizeof (INPUT_TRI_STRUC));
   mem_free(temp_tri,sizeof(INPUT_TRI_STRUC));

} /* order_points */



/*********************************************************************************
   local procedure

   get vector



*********************************************************************************/


void get_vector (vector_ptr, start_x, start_y, start_z,
                       end_x, end_y, end_z)

   struct vector *vector_ptr;
   float start_x;
   float start_y;
   float start_z;
   float end_x;
   float end_y;
   float end_z;

{
   double delta_x, delta_y, delta_z;


   vector_ptr-> x = start_x;
   vector_ptr-> y = start_y;

   delta_z = end_z - start_z;

   if (delta_z > 0.0)
      {
       delta_x = end_x - start_x;
       delta_y = end_y - start_y;
       vector_ptr-> x_incr = delta_x / delta_z;
       vector_ptr-> y_incr = delta_y / delta_z;
      }
   else
      {
       vector_ptr-> x_incr = 0;
```

```
      vector_ptr-> y_incr = 0;
      }

} /* get_vector */



/*****************************************************************************
   exported procedure

   pfp_get_intersection_segment



*****************************************************************************/
void pfp_get_intersection_segment (vect_ptr, z_value, seg_ptr)

   VECT_TRI_STRUC *vect_ptr;
   UINT16         z_value;
   OUT_SEG_STRUC  **seg_ptr;

{
   OUT_SEG_STRUC  *segment;

   if (*seg_ptr == NULL_SEG)
     *seg_ptr = (OUT_SEG_STRUC *) mem_alloc(sizeof(OUT_SEG_STRUC));
   segment = *seg_ptr;

   segment-> normal_info = vect_ptr-> normal_info;
   segment-> x_1 = round_flt(vect_ptr-> vector_1 .x
                   + vect_ptr-> vector_1.x_incr * (z_value - vect_ptr->vert1_z));
   segment-> y_1 = round_flt(vect_ptr-> vector_1 .y
                   + vect_ptr-> vector_1.y_incr * (z_value - vect_ptr->vert1_z));

   if (vect_ptr-> vert2_z > z_value)
      {
       segment-> x_2 = round_flt(vect_ptr-> vector_2 .x
                   + vect_ptr-> vector_2.x_incr * (z_value - vect_ptr->vert1_z));
       segment-> y_2 = round_flt(vect_ptr-> vector_2 .y
                   + vect_ptr-> vector_2.y_incr * (z_value - vect_ptr->vert1_z));
      }
   else
      {
       segment-> x_2 = round_flt(vect_ptr-> vector_3 .x
                   + vect_ptr-> vector_3.x_incr * (z_value - vect_ptr->vert2_z));
       segment-> y_2 = round_flt(vect_ptr-> vector_3 .y
                   + vect_ptr-> vector_3.y_incr * (z_value - vect_ptr->vert2_z));
      }

} /* pfp_get_intersection_segment */

/*****************************************************************************
   exported procedure



*****************************************************************************/

void pfp_convert_tri_to_vect(input_tri, vect_tri)
```

```
   INPUT_TRI_STRUC *input_tri;
   VECT_TRI_STRUC  *vect_tri;

{
   struct vector   *vector_ptr;


   order_points (input_tri);

   vector_ptr = (struct vector *) vect_tri;

   get_vector (vector_ptr++,
               input_tri-> x1, input_tri-> y1, input_tri-> z1,
               input_tri-> x3, input_tri-> y3, input_tri-> z3);

   get_vector (vector_ptr++,
               input_tri-> x1, input_tri-> y1, input_tri-> z1,
               input_tri-> x2, input_tri-> y2, input_tri-> z2);

   get_vartor (vector_ptr,
               input_tri-> x2, input_tri-> y2, input_tri-> z2,
               input_tri-> x3, input_tri-> y3, input_tri-> z3);

   vect_tri-> vert1_z  = input_tri->z1;
   vect_tri-> vert2_z  = input_tri->z2;
   vect_tri-> vert3_z  = input_tri->z3;
   vect_tri-> normal_info = input_tri-> normal_info;
   vect_tri-> next_tri = NULL_VECT_TRI;

} /* pfp_convert_tri_to_vect */

/********************************************************************************
   procedure



********************************************************************************/


void pfp_convert_tri_to_segs (tri_ptr, seg_list)

   INPUT_TRI_STRUC *tri_ptr;
   OUT_SEG_STRUC   **seg_list;

{
   OUT_SEG_STRUC   *seg_ptr;

   seg_ptr = (OUT_SEG_STRUC *) mem_alloc (sizeof (OUT_SEG_STRUC));
   seg_ptr-> x_1 = tri_ptr-> x1;
   seg_ptr-> y_1 = tri_ptr-> y1;
   seg_ptr-> x_2 = tri_ptr-> x2;
   seg_ptr-> y_2 = tri_ptr-> y2;
   seg_ptr->normal_info = tri_ptr->normal_info;
   pfp_get_xy_normal_info (tri_ptr-> x1, tri_ptr-> y1,
                           tri_ptr-> x2, tri_ptr-> y2,
                           tri_ptr-> x3, tri_ptr-> y3,&seg_ptr->normal_info);
   seg_ptr-> next_seg = *seg_list;
   *seg_list = seg_ptr;

   seg_ptr = (OUT_SEG_STRUC *) mem_alloc (sizeof (OUT_SEG_STRUC));
   seg_ptr-> x_1 = tri_ptr-> x2;
   seg_ptr-> y_1 = tri_ptr-> y2;
   seg_ptr-> x_2 = tri_ptr-> x3;
   seg_ptr-> y_2 = tri_ptr-> y3;
```

```
   seg_ptr->normal_info = tri_ptr->normal_info;
   pfp_get_xy_normal_info (tri_ptr-> x2, tri_ptr-> y2,
                           tri_ptr-> x3, tri_ptr-> y3,
                           tri_ptr-> x1, tri_ptr-> y1,&seg_ptr->normal_info);
   seg_ptr-> next_seg = *seg_list;
   *seg_list = seg_ptr;

   seg_ptr = (OUT_SEG_STRUC *) mem_alloc (sizeof (OUT_SEG_STRUC));
   seg_ptr-> x_1 = tri_ptr-> x3;
   seg_ptr-> y_1 = tri_ptr-> y3;
   seg_ptr-> x_2 = tri_ptr-> x1;
   seg_ptr-> y_2 = tri_ptr-> y1;
   seg_ptr->normal_info = tri_ptr->normal_info;
   pfp_get_xy_normal_info (tri_ptr-> x3, tri_ptr-> y3,
                           tri_ptr-> x1, tri_ptr-> y1,
                           tri_ptr-> x2, tri_ptr-> y2,&seg_ptr->normal_info);
   seg_ptr-> next_seg = *seg_list;
   *seg_list = seg_ptr;

} /* pfp_convert_tri_to_segs */
```

```
/****************************************************************************/
/*                                                                          */
/* PFPTRI.H                                                                 */
/*                                                                          */
/* PFP triangle definition header file                                      */
/*                                                                          */
/*                           MODIFICATION LOG                               */
/*--------------------------------------------------------------------------*/
/* date       who               what                                        */
/*--------------------------------------------------------------------------*/
/*           |P. Stinebaugh    | original code                              */
/*           |                 |                                            */
/****************************************************************************/

struct in_tri
   {
    float         x1;
    float         y1;
    float         z1;
    float         x2;
    float         y2;
    float         z2;
    float         x3;
    float         y3;
    float         z3;
    UINT8         normal_info;
    struct in_tri *next_input_tri;
   };

typedef struct in_tri INPUT_TRI_STRUC;


struct vector
   {
    float x;
    float y;
    float x_incr;
    float y_incr;
   };


struct vect_tri
   {
    struct vector   vector_1;
    struct vector   vector_2;
    struct vector   vector_3;
    float           vert1_z;
    float           vert2_z;
    float           vert3_z;
    UINT8           normal_info;
    struct vect_tri *next_tri;
   };

typedef struct vect_tri VECT_TRI_STRUC;

#define NULL_INPUT_TRI  (INPUT_TRI_STRUC *) NULL
#define NULL_VECT_TRI   (VECT_TRI_STRUC *) NULL
```

```
/*****************************************************************************
/*                    3D Systems Slice Program                              *
/*             Copyright (C) 1988 3D Systems Inc.                          *
/*                                                                          *
/* PFPTUTL.C                                                               *
/*                                                                          *
/* PFP Triangle Utilities module                                           *
/*                                                                          *
/*****************************************************************************


#include <stdio.h>
#include "pfp.h"
#include "pfptri.h"
#include "pfpseg.h"
#include "pfputl.h"


extern UINT16 z_control_table [];


/*****************************************************************************
   exported procedure

   pfp_get_min_z


*****************************************************************************


void pfp_get_min_z (tri, min_z)

   [illegible]
   float            *min_z;

{
   *min_z = (float) (MAX_Z_VAL+1);

   if (tri-> z1 < *min_z)
      *min_z = tri-> z1;

   if (tri-> z2 < *min_z)
      *min_z = tri-> z2;

   if (tri-> z3 < *min_z)
      *min_z = tri-> z3;

} /* pfp_get_min_z */



/*****************************************************************************
   local procedure

   get_max_z
```

```
*****************************************************************************************

void get_max_z (tri, max_z)

   INPUT_TRI_STRUC *tri;
   float           *max_z;

{
   *max_z = 0.0;

   if (tri-> z1 > *max_z)
      *max_z = tri-> z1;

   if (tri-> z2 > *max_z)
      *max_z = tri-> z2;

   if (tri-> z3 > *max_z)
      *max_z = tri-> z3;

} /* get_max_z */



/****************************************************************************************
   local procedure

   order points



*****************************************************************************************

void order_points (input_tri)

   INPUT_TRI_STRUC *input_tri;

{
   INPUT_TRI_STRUC *temp_tri;
   float           min_z;
   float           max_z;

   temp_tri = (INPUT_TRI_STRUC *) mem_alloc (sizeof (INPUT_TRI_STRUC));

   pfp_get_min_z (input_tri, &min_z);

   get_max_z (input_tri, &max_z);

   if ((input_tri-> z1 == max_z) && (input_tri-> z2 == min_z))
     {
      temp_tri-> x1 = input_tri-> x2;
```

```
      temp_tri-> y1 = input_tri-> y2;
      temp_tri-> z1 = input_tri-> z2;

      temp_tri-> x2 = input_tri-> x3;
      temp_tri-> y2 = input_tri-> y3;
      temp_tri-> z2 = input_tri-> z3;

      temp_tri-> x3 = input_tri-> x1;
      temp_tri-> y3 = input_tri-> y1;
      temp_tri-> z3 = input_tri-> z1;
     }

  else if ((input_tri-> z1 == max_z) && (input_tri-> z3 == min_z))
     {
      temp_tri-> x1 = input_tri-> x3;
      temp_tri-> y1 = input_tri-> y3;
      temp_tri-> z1 = input_tri-> z3;

      temp_tri-> x2 = input_tri-> x2;
      temp_tri-> y2 = input_tri-> y2;
      temp_tri-> z2 = input_tri-> z2;

      temp_tri-> x3 = input_tri-> x1;
      temp_tri-> y3 = input_tri-> y1;
      temp_tri-> z3 = input_tri-> z1;
     }

  else if ((input_tri-> z2 == max_z) && (input_tri-> z3 == min_z))
     {
      temp_tri-> x1 = input_tri-> x3;
      temp_tri-> y1 = input_tri-> y3;
      temp_tri-> z1 = input_tri-> z3;

      temp_tri-> x2 = input_tri-> x1;
      temp_tri-> y2 = input_tri-> y1;
      temp_tri-> z2 = input_tri-> z1;

      temp_tri-> x3 = input_tri-> x2;
      temp_tri-> y3 = input_tri-> y2;
      temp_tri-> z3 = input_tri-> z2;
     }

  else if ((input_tri-> z2 == max_z) && (input_tri-> z1 == min_z))
     {
      temp_tri-> x1 = input_tri-> x1;
      temp_tri-> y1 = input_tri-> y1;
      temp_tri-> z1 = input_tri-> z1;

      temp_tri-> x2 = input_tri-> x3;
      temp_tri-> y2 = input_tri-> y3;
      temp_tri-> z2 = input_tri-> z3;

      temp_tri-> x3 = input_tri-> x2;
      temp_tri-> y3 = input_tri-> y2;
      temp_tri-> z3 = input_tri-> z2;
     }

  else if ((input_tri-> z3 == max_z) && (input_tri-> z1 == min_z))
     {
      temp_tri-> x1 = input_tri-> x1;
```

```
        temp_tri-> y1 = input_tri-> y1;
        temp_tri-> z1 = input_tri-> z1;

        temp_tri-> x2 = input_tri-> x2;
        temp_tri-> y2 = input_tri-> y2;
        temp_tri-> z2 = input_tri-> z2;

        temp_tri-> x3 = input_tri-> x3;
        temp_tri-> y3 = input_tri-> y3;
        temp_tri-> z3 = input_tri-> z3;
      }

    else
      {
        temp_tri-> x1 = input_tri-> x2;
        temp_tri-> y1 = input_tri-> y2;
        temp_tri-> z1 = input_tri-> z2;

        temp_tri-> x2 = input_tri-> x1;
        temp_tri-> y2 = input_tri-> y1;
        temp_tri-> z2 = input_tri-> z1;

        temp_tri-> x3 = input_tri-> x3;
        temp_tri-> y3 = input_tri-> y3;
        temp_tri-> z3 = input_tri-> z3;
      }

    temp_tri-> normal_info = input_tri-> normal_info;
    temp_tri-> next_input_tri = input_tri-> next_input_tri;
    memcpy(temp_tri, input_tri, sizeof (INPUT_TRI_STRUCT));
    net_free(temp_tri,sizeof(INPUT_TRI_STRUCT));

  } /* ... */


/******************************************************************************
    [illegible]

    get_vector


*******************************************************************************/

void get_vector (vector_ptr, start_x, start_y, start_z,
                          end_x, end_y, end_z)

    struct vector *vector_ptr;
    float start_x;
    float start_y;
    float start_z;
    float end_x;
    float end_y;
    float end_z;

{
```

```
   double delta_x, delta_y, delta_z;

   vector_ptr-> x = start_x;
   vector_ptr-> y = start_y;

   delta_z = end_z - start_z;

   if (delta_z > 0.0)
      {
       delta_x = end_x - start_x;
       delta_y = end_y - start_y;
       vector_ptr-> x_incr = delta_x / delta_z;
       vector_ptr-> y_incr = delta_y / delta_z;
      }
   else
      {
       vector_ptr-> x_incr = 0;
       vector_ptr-> y_incr = 0;
      }

} /* set_vector */



/************************************************************************
   Sorted Procedure

   get_net_intersection_segment



************************************************************************/
void get_net_intersection_segment (vect_ptr, z_value, seg_ptr)

   VECTOR_STRUC *vect_ptr;
   UINT         z_value;
   OUT_SEG_STRUC **seg_ptr;

{
   OUT_SEG_STRUC  *segment;

   if (*seg_ptr == NULL_SEG)
     *seg_ptr = (OUT_SEG_STRUC *) mem_alloc(sizeof(OUT_SEG_STRUC));
   segment = *seg_ptr;

   segment-> normal_info = vect_ptr-> normal_info;
   segment-> x_1 = round_flt(vect_ptr-> vector_1 .x
                  + vect_ptr-> vector_1.x_incr * (z_value - vect_ptr->vert1_z
   segment-> y_1 = round_flt(vect_ptr-> vector_1 .y
                  + vect_ptr-> vector_1.y_incr * (z_value - vect_ptr->vert1_z

   if (vect_ptr-> vert2_z > z_value)

       segment-> x_2 = round_flt(vect_ptr-> vector_2 .x
                  + vect_ptr-> vector_2.x_incr * (z_value - vect_ptr->vert1_z
       segment-> y_2 = round_flt(vect_ptr-> vector_2 .y
```

```
                - vect ptr-> vector 3.y incr * (z value - vect ptr-> [illegible]
        }
    else
        {
        segment-> x 2 = round flt(vect ptr-> vector 3.x
                + vect ptr-> vector_3.x_incr * (z_value - vect_ptr-> vert2
        segment-> y 2 = round_flt(vect_ptr-> vector 3.y
                + vect_ptr-> vector_3.y_incr * (z value - vect_ptr-> vert2
        }

} /* pfc_get_intersection segment */

/***************************************************************************
    exported procedure




***************************************************************************/

void pfc_convert tri_to vect(input_tri, vect tri)

    [illegible]
    VECT TRI_STRUC  *vect_tri;

    [illegible]

    [illegible]

    [illegible]

    [illegible]
                [illegible]
                [illegible]

    get_vector (vector_ptr++,
                input_tri-> x1, input_tri-> y1, input_tri-> z1,
                input_tri-> x2, input_tri-> y2, input_tri-> z2);

    get_vector (vector_ptr,
                input_tri-> x2, input tri-> y2, input_tri-> z2,
                input_tri-> x3, input_tri-> y3, input_tri-> z3);

    vect_tri-> vert1_z  = input_tri->z1;
    vect_tri-> vert2_z  = input_tri->z2;
    vect_tri-> vert3_z  = input tri->z3;
    vect_tri-> normal info = input_tri-> normal info;
    vect tri-> next_tri = NULL VECT TRI;

} /* pfc convert_tri_to vect */

/***************************************************************************
    procedure
```

```
*****************************************************************************

void pfp_convert_tri_to_segs (tri_ptr, seg_list)

   INPUT_TRI_STRUC *tri_ptr;
   OUT_SEG_STRUC   **seg_list;
{
   OUT_SEG_STRUC   *seg_ptr;

   seg_ptr = (OUT_SEG_STRUC *) mem_alloc (sizeof (OUT_SEG_STRUC));
   seg_ptr-> x_1 = tri_ptr-> x1;
   seg_ptr-> y_1 = tri_ptr-> y1;
   seg_ptr-> x_2 = tri_ptr-> x2;
   seg_ptr-> y_2 = tri_ptr-> y2;
   seg_ptr->normal_info = tri_ptr->normal_info;
   [illegible]
                        tri_ptr-> [illegible] tri_ptr-> x3
                        tri_ptr-> x1, tri_ptr-> y1,&seg_ptr->normal_info);
   seg_ptr-> next_seg = *seg_list;
   *seg_list = seg_ptr;

   [illegible]
   seg_ptr-> [illegible] = tri_ptr-> [illegible]
   [illegible]
   [illegible]
   [illegible]
   [illegible]
   [illegible]
                        [illegible]
                        [illegible]
   seg_ptr-> next_seg = *seg_list;
   [illegible]

   [illegible]
   [illegible]
   [illegible]
   seg_ptr-> x_2 = tri_ptr-> x1;
   seg_ptr-> y_2 = tri_ptr-> y1;
   seg_ptr->normal_info = tri_ptr->normal_info;
   pfp_set_[illegible]_normal_info (tri_ptr-> x3, tri_ptr-> y3,
                        tri_ptr-> x1, tri_ptr-> y1,
                        tri_ptr-> x2, tri_ptr-> y2,&seg_ptr->normal_info);
   seg_ptr-> next_seg = *seg_list;
   *seg_list = seg_ptr;

} /* pfp_convert_tri_to_segs */
```

```
/*****************************************************************************/
/*                                                                           */
/* PFPUTL.C                                                                  */
/*                                                                           */
/* PFP Utilities module                                                      */
/*                                                                           */
/*                           MODIFICATION LOG                                */
/*---------------------------------------------------------------------------*/
/* date        who              what                                         */
/*---------------------------------------------------------------------------*/
/*          |P. Stinebaugh   | original code                                 */
/*          |                |                                               */
/*****************************************************************************/


#include <stdio.h>
#include <time.h>
#include <malloc.h>
#include <math.h>
#include "pfp.h"
#include "pfptri.h"
#include "pfpseq.h"
#include "pfputl.h"

static long   last_time:

extern long max_mem_alloc:
extern long total_mem_alloc:
extern long curr_mem_alloc:


float round_flt(float_val)
  float float_val:
  {
  long int_val:

  int_val = float_val:
  if (((float) int_val+0.5) <= float_val) int_val++;
  return (int_val):

} /* round float */

double round_dbl(dbl_val)
  double dbl_val;
  {
  if (dbl_val < 0.0) dbl_val = ceil(0.5+dbl_val);
  else dbl_val = floor(0.5+dbl_val);
  return (dbl_val);

} /* round_dbl */

INT16 sign(d)
  double d:
  {
  if (d < 0.0) return(-1);
  else return(1):
  };


STRING *mem_alloc (size)

   UINT16 size:
```

```
   STRING *ptr;

   ptr = (STRING *) malloc (size);

   curr_mem_alloc += size;
   total_mem_alloc += size;

   if (curr_mem_alloc > max_mem_alloc)
      max_mem_alloc = curr_mem_alloc;

   if (ptr == (STRING *) NULL)
      {
       fprintf (stderr, "\n error - memory allocation failed\n");
       fprintf (stderr, "\n current allocation = %ld\n", curr_mem_alloc);
       exit (SYS_FAILURE);
      }

   return (ptr);

} /* mem_alloc */


void mem_free (ptr,num_bytes)

   STRING  *ptr;
   UINT16  num_bytes;

{

   if (ptr != (STRING *) NULL)
      {
       curr_mem_alloc -= num_bytes;
       free (ptr);
      }
   else
      {
       fprintf (stderr, "\n error - null pointer freed \n");
       exit (SYS_FAILURE);
      }

} /* mem_free */


void get_timestamp (timestamp)

   STRING *timestamp;

{
   long time_buf;

   time (&time_buf);
   strcpy (timestamp, ctime (&time_buf));

} /* get_timestamp */


void openfile (filename, file_ptr, open_mode)

   STRING *filename;
   FILE   **file_ptr;
   STRING *open_mode;
```

```
   if (*filename == '\0')
      *file_ptr = (FILE *) NULL:
   else
      {
       *file_ptr = fopen (filename, open_mode):
       if (*file_ptr == (FILE *) NULL)
          {
           fprintf (stderr, "\n error - unable to open %s\n", filename):
           exit (SYS_FAILURE):
          }
      }

} /* openfile */



void copy (source_ptr, dest_ptr, byte_count)

   STRING *source_ptr;
   STRING *dest_ptr;
   INT16  byte_count:

{
   INT16 i:

   for (i = 0; i < byte_count: i++)
      {
       *dest_ptr = *source_ptr;
       dest_ptr++:
       source_ptr++;
      }

} /* copy */

void pfp_get_xy_normal_info (x1,y1,x2,y2,x3,y3,normal_info)
  float x1:
  float y1:
  float x2:
  float y2:
  float x3:
  float y3;
  UINT8 *normal_info:
  {
  double slope, offset;

  *normal_info &= (255-NORMAL_X_NEGATIVE-NORMAL_X_POSITIVE-
                         NORMAL_Y_NEGATIVE-NORMAL_Y_POSITIVE);

  if ((x2 - x1) != 0.0) slope = (y2 - y1) / (x2 - x1);
  else slope = 0.0;

  offset = y1 - slope*x1;

  if (slope == 0.0) {
    if (y1 == y2) {
      if (y3 < y2) *normal_info |= NORMAL_Y_POSITIVE:
      else *normal_info |= NORMAL_Y_NEGATIVE:
      }:
    if (x1 == x2) {
      if (x3 < x2) *normal_info |= NORMAL_X_POSITIVE:
      else *normal_info |= NORMAL_X_NEGATIVE;
      }:
```

```
  }
else {
  if (((y3 - offset)/slope) >= x3) *normal_info |= NORMAL_X_POSITIVE;
  else *normal_info |= NORMAL_X_NEGATIVE;
  if ((slope*x3 + offset) >= y3) *normal_info |= NORMAL_Y_POSITIVE;
  else *normal_info |= NORMAL_Y_NEGATIVE;
  }
};
```

```
/****************************************************************************/
/*                                                                          */
/*  FFPUTL.H                                                                */
/*                                                                          */
/*  FFP Utility Prototypes                                                  */
/*                                                                          */
/****************************************************************************/

double round_dbl();
float  round_flt();
STRING *mem_alloc();
INT16  sign();
```

```
/*****************************************************************************/
/*                                                                           */
/* PFPZACT.C                                                                 */
/*                                                                           */
/* PFP Z Active list module                                                  */
/*                                                                           */
/*                              MODIFICATION LOG                             */
/*---------------------------------------------------------------------------*/
/* date        who                what                                       */
/*---------------------------------------------------------------------------*/
/*           |P. Stinebaugh     | original code                              */
/*           |                  |                                            */
/*****************************************************************************/


#include <stdio.h>
#include "pfp.h"
#include "pfptri.h"
#include "pfpseg.h"
#include "pfputl.h"




/*****************************************************************************
   exported procedure

   pfp_update_z_active_list



*****************************************************************************/


void pfp_update_z_active_list (z_bucket_ptr, seg_list, z_active_list)

   INPUT_TRI_STRUC **z_bucket_ptr;
   OUT_SEG_STRUC   **seg_list;
   VECT_TRI_STRUC  **z_active_list;

{
   VECT_TRI_STRUC  *new_vect_tri;
   INPUT_TRI_STRUC *z_bucket_back_ptr, **list_head;


   list_head = z_bucket_ptr;
   while (*z_bucket_ptr != NULL_INPUT_TRI) {
     new_vect_tri = (VECT_TRI_STRUC *) mem_alloc (sizeof (VECT_TRI_STRUC));
     pfp_convert_tri_to_vect (*z_bucket_ptr, new_vect_tri);
     new_vect_tri-> next_tri = *z_active_list;
     *z_active_list = new_vect_tri;
     z_bucket_back_ptr = *z_bucket_ptr;
     *z_bucket_ptr = (*z_bucket_ptr)-> next_input_tri;
     mem_free (z_bucket_back_ptr,sizeof(INPUT_TRI_STRUC));
     };

   *list_head = NULL_INPUT_TRI;

} /* pfp_update_z_active_list */
```

```
/***********************************************************************************************
   exported procedure

   pfp_process_z_active_list



************************************************************************************************/

void pfp_process_z_active_list (z_active_list, z_value, seg_list)

   VECT_TRI_STRUC **z_active_list;
   UINT16         z_value;
   OUT_SEG_STRUC  **seg_list;

{
   VECT_TRI_STRUC *tri_back_ptr, *tri_list_ptr;
   OUT_SEG_STRUC  *seg_ptr;
   VECT_TRI_STRUC list_head;

   z_value++;

   list_head .next_tri = *z_active_list;
   tri_list_ptr = *z_active_list;
   tri_back_ptr = &list_head;

   while (tri_list_ptr != NULL_VECT_TRI)
      {
       if (tri_list_ptr-> vert3_z <= z_value)
          {
           tri_back_ptr-> next_tri = tri_list_ptr-> next_tri;
           mem_free (tri_list_ptr,sizeof(VECT_TRI_STRUC));
           tri_list_ptr = tri_back_ptr-> next_tri;
          }
       else
          {
           seg_ptr = (OUT_SEG_STRUC *) mem_alloc(sizeof(OUT_SEG_STRUC));
           pfp_get_intersection_segment (tri_list_ptr, z_value, &seg_ptr);
           seg_ptr->normal_info &= (255-FLAT_TRI-NEAR_FLAT_TRI);
           seg_ptr-> next_seg = *seg_list;
           *seg_list = seg_ptr;
           tri_list_ptr = tri_list_ptr-> next_tri;
           tri_back_ptr = tri_back_ptr-> next_tri;
          }
      }

   *z_active_list = list_head .next_tri;

} /* pfp_process_z_active_list */
```

```
/*****************************************************************************/
/*                                                                           */
/*   PRTUTL.C  -  Debugging Print Routines                                   */
/*                                                                           */
/*                              MODIFICATION LOG                             */
/*---------------------------------------------------------------------------*/
/* date         who               what                                       */
/*---------------------------------------------------------------------------*/
/*              |                 |                                          */
/*              |                 |                                          */
/*****************************************************************************/


#include <stdio.h>
#include "pfp.h"
#include "pfptri.h"
#include "pfpseg.h"
#include "pfpchl.h"



void print_hatch_point(out_file,point)
  FILE                *out_file;
  HATCH_POINT_STRUC *point;
  {
  if (point == NULL_HATCH_POINT) fprintf(out_file,"\nHatch Point NULL\n");
  else {
    fprintf(out_file,"\nHatch Point %u %u\n",point->x_val,point->y_val);
    fprintf(out_file,"  angle %d enter_flag %d triangle number %u\n",point->angle,
    fprintf(out_file,"  next point %lu\n",point->next_point);
    };
  };


void print_hatch_list(out_file,point_ptr)
  FILE                *out_file;
  HATCH_POINT_STRUC *point_ptr;
  {
  fprintf(out_file,"----------- BEGIN HATCH POINT LIST -----------\n");
  while (point_ptr != (HATCH_POINT_STRUC *) NULL) {
    print_hatch_point(out_file,point_ptr);
    point_ptr = point_ptr->next_point;
    };
  fprintf(out_file,"------------ END HATCH POINT LIST -----------\n");
  };

void print_normal_info(out_file,norm)
  FILE                *out_file;
  UINT8               norm;
  {
  fprintf(out_file,"Segment Triangle Type: ");
  if (norm&FLAT_TRI) fprintf(out_file,"FLAT");
  else if (norm&NEAR_FLAT_TRI) fprintf(out_file,"NEAR FLAT");
       else fprintf(out_file,"SCAN");
  fprintf (out_file, "\n");
  fprintf (out_file, "NORMAL_X_POSITIVE = %s      ",
           norm & NORMAL_X_POSITIVE ? "True " : "False");
  fprintf (out_file, "NORMAL_X_NEGATIVE = %s\n",
           norm & NORMAL_X_NEGATIVE ? "True " : "False");
  fprintf (out_file, "NORMAL_Y_POSITIVE = %s      ",
           norm & NORMAL_Y_POSITIVE ? "True " : "False");
  fprintf (out_file, "NORMAL_Y_NEGATIVE = %s\n",
           norm & NORMAL_Y_NEGATIVE ? "True " : "False");
  fprintf (out_file, "NORMAL_Z_POSITIVE = %s      ",
```

```
            norm & NORMAL_Z_POSITIVE ? "True " : "False");
  fprintf (out_file. "NORMAL_Z_NEGATIVE = %s\n",
            norm & NORMAL_Z_NEGATIVE ? "True " : "False");
  fprintf (out_file. "\n");
  };

void print_segment (out_file, seg)

   FILE           *out_file;
   OUT_SEG_STRUC *seg;

{
   fprintf (out_file. "\n Segment\n");
   fprintf (out_file. " x1 = %u  y1 = %u \n", seg-> x_1, seg-> y_1);
   fprintf (out_file. " x2 = %u  y2 = %u \n", seg-> x_2, seg-> y_2);
   print_normal_info(out_file.seg->normal_info);

   fprintf (out_file. " next ptr = %lu \n", seg-> next_seg);

} /* print_segment */


void print_seg_list (out_file. seg_list)

   FILE           *out_file;
   OUT_SEG_STRUC *seg_list;

{
   OUT_SEG_STRUC *seg_ptr;
   UINT16         list_length = 0;


   seg_ptr = seg_list;
   while (seg_ptr != NULL_SEG)
       {
        list_length++;
        seg_ptr = seg_ptr-> next_seg;
       }

   fprintf (out_file. "\nprinting segment list \n");
   fprintf (out_file. "list length = %u ". list_length);
   fprintf (out_file. "list =  \n");

   seg_ptr = seg_list;

   while (seg_ptr != NULL_SEG)
       {
        print_segment (out_file. seg_ptr);
        seg_ptr = seg_ptr-> next_seg;
       }
} /* print_seg_list */


void print_seg_bucket_array (out_file. seg_bucket_array)

   FILE           *out_file;
   OUT_SEG_STRUC **seg_bucket_array;

{
   OUT_SEG_STRUC *seg_ptr;
   UINT16         i;


   fprintf (out_file. "\n Z Segment Bucket Structure:\n");
```

```
    for (i = 0; i < MAX_Z_INDEX; i++) {
        seg_ptr = seg_bucket_array [i];
        if (seg_ptr != NULL_SEG)
           fprintf (out_file, "\n\n Z Bucket Index = %d \n", i);
        while (seg_ptr != NULL_SEG) {
            print_segment (out_file, seg_ptr);
            seg_ptr = seg_ptr-> next_seg;
            }
       }

} /* print_seg_bucket_array */




void print_input_tri (out_file, tri)

    FILE            *out_file;
    INPUT_TRI_STRUC *tri;

{
    fprintf (out_file, " (x,y,z) = %f %f %f \n", tri-> x1, tri-> y1, tr
    fprintf (out_file, " (x,y,z) = %f %f %f \n", tri-> x2, tri-> y2, tr
    fprintf (out_file, " (x,y,z) = %f %f %f \n", tri-> x3, tri-> y3, tr
    print_normal_info(out_file,tri->normal_info);

} /* print input tri */



in box (tri_ptr)

   INPUT TRI STRUC *tri ptr;


    if ((tri_ptr-> z1 <= 3000) || (tri_ptr-> z2 <= 3000) ||
                                  (tri_ptr-> z3 <= 3000))
     {
      if ((tri_ptr-> z1 >= 3000) || (tri_ptr-> z2 >= 3000) ||
                                    (tri_ptr-> z3 >= 3000))
       {
        if (
            ((tri_ptr-> x1 < 20000) && (tri_ptr-> x1 > 13000)) ||
            ((tri_ptr-> x2 < 20000) && (tri_ptr-> x2 > 13000)) ||
            ((tri_ptr-> x3 < 20000) && (tri_ptr-> x3 > 13000))
           )
         {
          if (
              ((tri_ptr-> y1 < 55000) && (tri_ptr-> y1 > 48000)) ||
              ((tri_ptr-> y2 < 55000) && (tri_ptr-> y2 > 48000)) ||
              ((tri_ptr-> y3 < 55000) && (tri_ptr-> y3 > 48000))
             )
            return (1);
         }
       }
     }
   return (0);

} /* in_box */



void print_tri_list (out_file,tri list)
```

```
  FILE              *out_file;
  INPUT_TRI_STRUC *tri_list;

{
   INPUT_TRI_STRUC *tri_ptr;
   UINT16           list_length = 0;


   tri_ptr = tri_list;
   while (tri_ptr != NULL_INPUT_TRI)
      {
       list_length++;
       tri_ptr = tri_ptr-> next_input_tri;
      }

    fprintf (out_file, "\n list length = %u ", list_length);
    fprintf (out_file, "\n list =  \n");

   tri_ptr = tri_list;
   while (tri_ptr != NULL_INPUT_TRI) {
/*if (in_box (tri_ptr)) */
     print_input_tri (out_file, tri_ptr);
     tri_ptr = tri_ptr-> next_input_tri;
     }

} /* print_tri_list */



void print_tri_bucket_array (out_file, z_bucket_array)

   FILE              *out_file;
   INPUT_TRI_STRUC **z_bucket_array;

{
   INPUT_TRI_STRUC *tri_ptr;
   INT16            i;


   fprintf (out_file, "\n Tri Bucket Structure:\n");

   for (i = 0; i < MAX_Z_INDEX; i++)
      {
       tri_ptr = z_bucket_array [i];
       if (tri_ptr != NULL_INPUT_TRI)
          fprintf (out_file, "\n\n Z Bucket Index = %d \n", i);
       while (tri_ptr != NULL_INPUT_TRI)
          {
           print_input_tri (out_file, tri_ptr);
           tri_ptr = tri_ptr-> next_input_tri;
          }
      }

} /* print_tri_bucket_array */



void print_vect_tri (out_file, vect_tri)

   FILE             *out_file;
   VECT_TRI_STRUC *vect_tri;
```

```
    fprintf (out_file, " vector 1:\n");
    fprintf (out_file, "     x = %f    y = %f    x_incr = %f    y_incr = %f\n",
                       vect_tri-> vector_1 .x,
                       vect_tri-> vector_1 .y,
                       vect_tri-> vector_1 .x_incr,
                       vect_tri-> vector_1 .y_incr);

    fprintf (out_file, " vector 2:\n");
    fprintf (out_file, "     x = %f    y = %f    x_incr = %f    y_incr = %f\n",
                       vect_tri-> vector_2 .x,
                       vect_tri-> vector_2 .y,
                       vect_tri-> vector_2 .x_incr,
                       vect_tri-> vector_2 .y_incr);

    fprintf (out_file, " vector 3:\n");
    fprintf (out_file, "     x = %f    y = %f    x_incr = %f    y_incr = %f\n",
                       vect_tri-> vector_3 .x,
                       vect_tri-> vector_3 .y,
                       vect_tri-> vector_3 .x_incr,
                       vect_tri-> vector_3 .y_incr);

    fprintf (out_file, "Vertex 1 Z = %f\n",vect_tri->vert1_z);
    fprintf (out_file, "Vertex 2 Z = %f\n",vect_tri->vert2_z);
    fprintf (out_file, "Vertex 3 Z = %f\n",vect_tri->vert3_z);
    print_normal_info(out_file,vect_tri->normal_info);

} /* print_vect_tri */



void print_z_active_list (out_file, z_active_list)

    FILE           *out_file;
    VECT_TRI_STRUC *z_active_list;

{
    while (z_active_list != NULL_VECT_TRI)
        {
         print_vect_tri (out_file, z_active_list);
         z_active_list = z_active_list-> next_tri;
        }
    fflush (out_file);

} /* print_z_active_list */
```

```
{$R-,S-,I-,D+,T-,F-,V-,B-,N-,L+}
{$M 4096,1,65536}

{ ==========================================================================

  STEREO, Sterolithography Device Driver

  for 3D Systems' Sterolithography System

  Version 2.60  by Tarnz Technologies

 ==========================================================================

  STEREO is a memory-resident laser controller device driver.  It
  interfaces between the Background Task's Software Interrupt
  Handler and a program wanting to control the laser apparatus
  using easy text-based commands.

  STEREO receives and processes simple (X,Y) laser position commands
  passed to it by some other program using a software interrupt vector.
  The CLIFF Turbo Pascal program is just such a program; it can read
  commands from either the computer's keyboard or from disk files and
  then pass them along to this program.

  STEREO, like an MSDOS driver, can be called by programs written
  in any language, including assembly and BASIC.  The interface will
  usually be a special subroutine that invokes the STERO software
  interrupt.  Unlike an MSDOS driver, STEREO cannot be referenced
  directly by a filename.

  STEREO's device driver format is simpler, faster, and more clean
  than an MSDOS device driver.  STEREO processed a complete text
  string (a line) at a time, as opposed to one character at a time
  for an MSDOS device driver.  If desired, an official MSDOS device
  driver (STL:, LSR: or whatever) could be added in later.

  STEREO understands the following commands:

       BX 0-65535    Beginning X position      (position)
       BY 0-65535    Beginning Y position      (position)
       JX 0-65535    Jump to new X position    (position)
       JY 0-65535    Jump to new Y position    (position)
       NX 0-65535    Next X position           (position)
       NY 0-65535    Next Y position           (position)
       SS 1-65535    Step Size                 (rel incr)
     ! SP 5-6553,... multi-pass Step Periods   (10 us)
       SD 0-65535    Scanning Delay            (step periods)
       JS 1-65535    Jump Size                 (rel incr)
       JD 0-65535    Jump Delay                (step periods)
       LO 0-65535    Laser On delay            (10 us)
       LF 0-65535    Laser Off delay           (10 us)
     + NS            eNter Sequence mode       -
     + AB            Enter Absolute mode       -
       EX            Execute                   -
       EC            Execute and Clear         -
       CL            Clear table               -
     ! MD AS -/+     set Auto-Shutter mode     (off/on)
     ! MD BL -/+     set BLock mode            (off/on)
     ! MD PA -/+     set Pos Ack mode          (off/on)
     ! SR            Soft Reset
     ! HR            Hard Reset
     ! RC 1-10       Redraw pass Count         (# passes)
```

```
! RD 0-65535   Redraw Delay             (step periods)
! RS 0-65535   Redraw Size              (distance)
! VC 1-10      riVet pass Count         (# passes)
! VP 5-6553,.. riVet step Periods       (10 us)
! VR 0-65535   riVet Reduction amount   (distance)
! VX 0-65535   riVet end X position     (position)
! VY 0-65535   riVet end Y position     (position)
! WI 0-32767   Wait for Idle            (delay)
```

where:

```
  10 us        is the # of 10s of microseconds
               resolution = 0.84 us (from 1.19 MHz clock)
  position     is the absolute position in the field
  distance     is the absolute distance in step size units
  rel incr     is the relative # of position increments
  # passes     is the number of redraw passes
  step periods is the time to cover that # of steps
               programmed by SP command (= tick counts)
  delay        delay value in milliseconds (may be faster
               on faster computers)
```

In the above list, following each two-character command is the range of numbers allowed as arguments to the command. Each command must be on a separate line, ending with a CR or CR/LF sequence. All spaces are ignored. All numbers are in unsigned decimal.

The Control Instruction Set is intended to be compatible with General Scanning's DG Series Electronic Packages for Laser Control. Only the Vector Mode is supported. The Raster Mode is not supported. The step and delta functions of the Vector Mode are also unsupported. No Z-axis control is supported yet. Commands marked with an '*' are not fully implemented as per the DG specification for functional reasons. Commands marked with '+' are included only for the sake of complete command compatibility. '!' denotes new commands not available on the DG devices.

DG Version 2.6 Vector Mode Commands not supported:

```
     ST          enter STep mode
     RE          REset to top of stack in step mode
     DL          enter DeLta mode
     Q1          Query IB 1
     Q2          Query IB 2
```

The command line with invokes STEREO and causes it to be installed in memory takes the form:

```
  STEREO [/options]
```

where /options are any number of user-selectable options:

```
  /D    -  debug mode, pass back strings describing actions
  /NV   -  no constant vector velocity
  /NG   -  no geometric correction
  /NC   - no version check at install time
```

STEREO can only be installed once after the computer has been powered up. If different options are required, the computer system will have to be completely rebooted.

The SP (and VP) command has multiple arguments. Each of up to ten passes of redraw can have its own step period. The SP command can have 1 to 10 arguments, each a step period for a pass:

```
SP sp0,sp1,sp2,sp3...
```

where sp0 is the step period for redraw pass 0 (the original vector move), sp1 is the step period for redraw pass 1, and so on. /V121 option is not longer supported.

Geometric correction is automatically invoked. If geometric correction is not desired, the option /NG or /GEO NO should be specified on the command line. Geometric correction occurs on the endpoints of any vector STEREO passes to the software interrupt handler.

STEREO code came from Version 1.40 of CLIFF, which originally performed the command translation. This memory-resident STEREO device driver was formed to speed up 3D Systems' supervisory programs, written in GWBASIC and Turbo BASIC. With the Geo Correct Table, STEREO takes up approximately 80K of memory, increasing to about 150K the amount of main memory used by the complete laser controller system and its data structures.

```
Axes Control Options:                              DEFAULT
  /X +/-          select X-axis direction            +
  /Y +/-          select Y-axis direction            +
  /SWAPXY         swap X and Y coordinates           no
  /GEO XY!YX!NO   select geo correct sequence        YX
                  (used for old style)
  /AXESBEGIN      to axes-control begin pos          no
```

```
========================================================================== }

{

Recent History:
 8/18/87  Ver 2.02  STEREO released
                    memory resident portion of Ver 1.x CLIFF process
                    WI Wait for Idle command added
 8/22/87  Ver 2.03  Stuart's new Geometric Correction
                    Y is the first, X is the second mirror
                    /NC no version check flag
                    jump vectors of 0 steps skipped
                    CvtInt now works for 32768 ($8000)
                    Step Periods supported for stream (non-block) mode
 8/25/87  Ver 2.04  Geometric Correction delta bugs fixed
 9/23/87  Ver 2.12  STEREO Axes Control added
                    new options /X, /Y, /SWAPXY, /GEO
 9/30/87  Ver 2.25  Table-Interpolation Geometric Correction installed
10/26/87  Ver 2.26  Wait for Idle argument is 100 minimum
                    /NG prevents loading of STEREO.GEO
10/28/87  Ver 2.27  improved Geometric Correction formula
11/12/87  Ver 2.30  first Beta software release
11/18/87  Ver 2.31  allow axes control independent of geo correction
                    /AXESBEGIN option added to axes-control BX,BY
                    GeoCorrectTable size made programmable (70 elements/axis)
                    added TableDivisor for GeoCorrectTable
12/11/87  Ver 2.40  STEREO upgraded to Turbo Pascal Version 4.0
                    STEREO always returns with Queue Size Change in CX
                    GeoCorrectTable storage allocated on heap dynamically
                    max GeoCorrectTable size increased to 90 by 90
                    Some variables changed to Word or LongInt type
12/16/87  Ver 2.41  GeoCorrect overwrite / memory alloc debugged
                    QueueCount substituted for QueueSize calculation
12/21/87  Ver 2.43  Check for Break turned off
                    improved keyboard and Ctrl-Break Abort service
 1/06/88  Ver 2.50  zero-length vectors ignored
```

```
                       Ctrl-Break check looks at scan code now
  1/27/88  Ver 2.60    better STEREO.GEO processing
                       blanks allowed around commas separating numbers
                       check for too few or too many entries in STEREO.GEO
                       no mark and redraw around executes when redraw count is 1
                       OkayForRedrawCommand flag added to limit redundant
                         mark and redraw commands

}

uses Dos,Crt;

type
  str16 = string[16];
  str80 = string[80];
  BitArray = array[0..15] of Word;
  GeoCorrectTableType = array[0..10000] of LongInt;
  GeoCorrectTablePtr = ^GeoCorrectTableType;

var
  FirstVar: Byte;   { must be first variable defined }
  ch,key: Char;
  temp,cmd,op: String;
  StereoVersion: str16;
  count,i,j,remline,Er,OpNum,code,code2: Integer;
  IOerr: Integer;
  GeoFile,DefaultFile: text;
  tempX,tempY,X1,Y1,X2,Y2,oldX2,oldY2: Real;
  arg,beginXpos,beginYpos,Xpos,Ypos,oldX,oldY: Real;
  FirstX,NegX,NegY,SwapXY,SwapBegin: Boolean;
  first,VelocityFlag,DebugMode,Redrawing,done: Boolean;
  OkayForRedrawCommand: Boolean;
  _Step_Size, _Step_Period,_Scan_Delay,_Jump_Delay: Word;
  _Jump_Size,_Rivet_Reduction: Real;
  _Laser_On_Delay,_Laser_Off_Delay: Word;
  _Redraw_Count,_Redraw_Delay,_Redraw_Size: Word;
  KeyAbort,VersionCheckFlag,GeoCorrectFlag,DoingRivet: Boolean;
  changeX,changeY,ChangeV,BrokenX,BrokenY: Real;
  deltaX,deltaY,steps,GeoDeltaX,GeoDeltaY: Real;
  Distance,IntDeltaX,IntDeltaY: Integer;
  IntSteps,TotalSteps,TempSteps: Word;
  RivetMainPeriod,CurrentRedrawCount,_Rivet_Count: Word;
  StoreCount,QueueCount: Word;
  angX,angY,tanX,GeoScale,GeoFact: Real;
  FieldX,FieldY,StartX,StartY,EndX,EndY,GeoEndX,GeoEndY,Xcoord,Ycoord: Real;
  DiscreteX,DiscreteY,DiscreteSteps: Word;
  regs: Registers;
  XC,YC,XCount,YCount,CoordCount,TableDivisor: Word;
  StereoSize: LongInt;
  StrOfs,StrSeg: Word;
  data,Return: Byte;
  XGeoCorrectTable,YGeoCorrectTable: GeoCorrectTablePtr;
  LastVar: Byte;   { must be last variable defined }

const
  ThisStereoVersion = '2.60';
  MinSystemVersion  = '2.30';
  CtrlBreak = #0;
  HexDigits: str16 = '0123456789ABCDEF';
  sp40 = '                                        ';
  Indent1 = 4;
  Indent2 = 41;
  AllBits = $FFFF;
  BitValue: BitArray =
    ($0001, $0002, $0004, $0008, $0010, $0020, $0040, $0080,
     $0100, $0200, $0400, $0800, $1000, $2000, $4000, $8000);
```

```
  Shutter = 0:  { control word bit 0 - shutter open/closed }
  _BIOSVECTOR   = $16;
  _STEREOVECTOR = $65;
  MaxGeo = 100;         { maximum GeoCorrectTable Index }
  GeoMult = 4096;       { GeoCorrectTable LongInt multiplier }
  StepRound = 0.02;     { rounding value for # of laser steps }

label ExitProgram;

function StartOfProgramCode: String;
begin
  StartOfProgramCode :=
    'STEREO Device Driver Version 2.60 Copyright (C) 1988 by Tarnz Technologies ';
end;

{$i laser.inc}  { include laser interface library }

var
  StepPeriodsArray,RivetPeriodsArray: _StepPeriodsType;

function __StereoOk: Boolean;
type
  CopyType  = array[1..20] of char;
var
  CopyPtr: ^CopyType;
  CopyStr: string[20];
begin
  with regs do begin
    AX := ($35 shl 8) or _STEREOVECTOR;
    MsDos(regs);
    CopyPtr := Ptr(ES,57);
  end;
  move(CopyPtr^[1],CopyStr[1],18);
  CopyStr[0] := #18;
  if CopyStr = 'Tarnz Technologies' then begin
    __StereoOk := true;
    with regs do
      CopyPtr := Ptr(ES,30);
    move(CopyPtr^[1],StereoVersion[1],4);
    StereoVersion[0] := #4;
  end else begin
    __StereoOk := false;
    StereoVersion := '?.??';
  end;
end;

function upper(text: String): String;
var
  i: Integer;
  temp: String;
begin
  temp := text;
  for i := 1 to length(temp) do temp[i] := upcase(temp[i]);
  upper := temp;
end;

function many(Ch: Char;num: Integer): String;
var
  temp: String;
  i: Integer;
begin
  temp := '';
  for i:=1 to num do temp  := temp+Ch;
  many := temp;
end;
```

```
procedure ReadCommandLine(var line: string);
var
  i: Integer;
begin
  line := ParamStr(1);
  for i:=2 to ParamCount do
    line := line + ' ' + ParamStr(i);
end;

function CvtDelta(num: Real): Word;
begin
  num := num * 256;
  if num < 32768.0 then CvtDelta := trunc(num)
    else if num > 32768.0 then CvtDelta := trunc(num)
      else CvtDelta := $8000;
end;

function sgn(num: Real): Integer;
begin
  if num<0 then sgn := -1
    else if num>0 then sgn := 1
      else sgn := 0;
end;

function CvtTicks(time: Real): Word;
begin
  CvtTicks := trunc(time * 119.0 / 10.0);
end;

procedure SkipToNum(var str: String);
var
  i: Integer;
begin
  i := 1;
  while (i <= length(str)) and not(str[i] in ['0'..'9','.']) do inc(i);
  if i>1 then str := copy(str,i,99);
end;

procedure RealParse(var RealNum: Real);
begin
  val(temp,RealNum,code);
  if code<>0 then val(copy(temp,1,code-1),RealNum,code2);
  temp := copy(temp,code+1,99);
end;

procedure IntParse(var IntNum: Word);
var
  num: Real;
begin
  if length(temp)=0 then IntNum := 0
  else begin
    val(temp,num,code);
    if code<>0 then val(copy(temp,1,code-1),num,code2);
    IntNum := trunc(num);
    if code=0 then temp := ''
      else temp := copy(temp,code+1,99);
  end;
end;

function IntStr(num: Integer): str16;
var
  temp: str16;
begin
  if num>=0 then Str(num,temp) else Str(num+$8000,temp);
  IntStr := temp;
end;
```

```
function RealStr(num: Real): str16;
var
  temp: str16:
begin
  if num<0 then Str(65536.0+num:6:0,temp)
    else Str(num:6:0,temp):
  while temp[1]=' ' do temp := copy(temp,2,6);
  RealStr := temp;
end;

function spc(len: Integer): str80;
begin
  spc := copy(sp40+sp40+sp40,1,len);
end;

procedure msg(text: String);
begin
(* return text to calling program *)
end;

procedure msgln(text: String);
begin
(* return text + Cr to calling program *)
end;

function MemAbs(pt: Pointer): LongInt:
begin
  MemAbs := LongInt(seg(pt^)) shl 4 + ofs(pt^):
end;

function PtrAdd(point: Pointer;offset: LongInt): Pointer;
var
  NewAddr: LongInt;
begin
  NewAddr := MemAbs(point)+offset:
  PtrAdd := Ptr(NewAddr div 16,NewAddr mod 16):
end;

function StatusKey: Char;
begin
  with regs do begin
    AX := $0100;
    Intr(_BIOSVECTOR,regs);
    StatusKey := chr(AH);  { return scan code }
  end;
end;

procedure SIHerror;
begin
  Return := Er;
end;

function TryCommand: Boolean;
begin
  if Er=3 {queue full} then TryCommand := true
    else TryCommand := false;
  if keypressed {abort} then begin
    if StatusKey = CtrlBreak then begin
      TryCommand := false:
      KeyAbort := true;
    end;
  end;
end;

function TryBlockCommand: Boolean;
```

```
begin
  if (Er=3) {command queue full} or (Er=6) {exec queue full}
    then TryBlockCommand := true
      else TryBlockCommand := false;
  if keypressed {abort} then begin
    if StatusKey = CtrlBreak then begin
      TryBlockCommand := false;
      KeyAbort := true;
    end;
  end;
end;

procedure newX(num: Real);
begin
  oldX := Xpos;
  Xpos := num;
end;

procedure newY(num: Real);
begin
  oldY := Ypos;
  Ypos := num;
end;

{
    AxesControl -- adjust axes
}
procedure AxesControl(oldX,oldY: Real;var retX,retY: Real);
begin
  if SwapXY then begin
    retY := oldX;
    retX := oldY;
  end else begin
    retX := oldX;
    retY := oldY;
  end;
  if NegX then retX := 65535.0 - retX;
  if NegY then retY := 65535.0 - retY;
end;


procedure SetRedrawCount(RedrawCount: Integer);
begin
  if RedrawCount<>CurrentRedrawCount then begin
   CurrentRedrawCount := RedrawCount;
    Er := 3;
    while TryCommand do
      Er := __SetRedrawCount(CurrentRedrawCount);
    inc(QueueCount,3);
    SIHerror;
  end;
end;

{
   Laser Motion Routines:

    * ResetRedraw   - just mark for beginning of block
    * PerformRedraw - redraw and mark last section
    * MoveLaser     - new move alg using redraw & vector slicing
    * JumpLaser     - controlled breakup of jump motion to limit overshoot
}

procedure ResetRedraw;
begin
  if OkayForRedrawCommand and __BlockModeOn then begin
    if DebugMode then msgln('Mark '+IntStr(_Redraw_Size));
```

```
    Er := 3;
    while TryCommand do
      Er := __Mark;
    inc(QueueCount);
    SIHerror;
  end;
  Distance := 0;
  Redrawing := false;
  OkayForRedrawCommand := false;
end;

procedure PerformRedraw;
begin
  if OkayForRedrawCommand and __BlockModeOn then begin
    if DebugMode then msgln('Redraw '+IntStr(_Redraw_Size));
    Er := 3;
    while TryCommand do
      Er := __Redraw;
    inc(QueueCount);
    SIHerror;
  end;
  Distance := 0;
  Redrawing := false;
  OkayForRedrawCommand := false;
end;

{
    GeoCorrect -- geometric correct coordinate pair
}
procedure GeoCorrect(oldX,oldY: Real;var newX,newY: Real);
var
  GX11,GX12,GX21,GX22,GY11,GY12,GY21,GY22: Real;
  Xf,Yf,XfYf: Real;
  XIndex,YIndex,Lookup: Word;
begin
  if GeoCorrectFlag then begin
    XIndex := trunc(oldX / TableDivisor);
    if XIndex >= XCount then XIndex := XCount-1;
    YIndex := trunc(oldY / TableDivisor);
    if YIndex >= YCount then YIndex := YCount-1;
    Lookup := XIndex * YCount + YIndex;
    GX11 := XGeoCorrectTable^[Lookup];
    GX12 := XGeoCorrectTable^[Lookup+1];
    GX21 := XGeoCorrectTable^[Lookup+YCount];
    GX22 := XGeoCorrectTable^[Lookup+YCount+1];
    GY11 := YGeoCorrectTable^[Lookup];
    GY12 := YGeoCorrectTable^[Lookup+1];
    GY21 := YGeoCorrectTable^[Lookup+YCount];
    GY22 := YGeoCorrectTable^[Lookup+YCount+1];
    Xf := (oldX - TableDivisor * 1.0 * XIndex) / TableDivisor;
    Yf := (oldY - TableDivisor * 1.0 * YIndex) / TableDivisor;
    XfYf := Xf * Yf;
    newX := (GX11 + Xf * (GX21 - GX11) + Yf * (GX12 - GX11)
      + XfYf * (GX22 + GX11 - GX12 - GX21)) / GeoMult;
    newY := (GY11 + Xf * (GY21 - GY11) + Yf * (GY12 - GY11)
      + XfYf * (GY22 + GY11 - GY12 - GY21)) / GeoMult;
  end else begin
    newX := oldX;
    newY := oldY;
  end;
  if DebugMode then begin
    writeln('GX11=',GX11/GeoMult:7:2,' GX12=',GX12/GeoMult:7:2,
      ' GX21=',GX21/GeoMult:7:2,' GX22=',GX22/GeoMult:7:2);
    writeln('GY11=',GY11/GeoMult:7:2,' GY12=',GY12/GeoMult:7:2,
      ' GY21=',GY21/GeoMult:7:2,' GY22=',GY22/GeoMult:7:2);
    writeln('oldX=',oldX:7:2,' oldY=',oldY:7:2,' newX=',newX:7:2,' newY=',newY:7:2
```

```
    writeln;
  end;
end;

procedure JumpLaser;
begin
  AxesControl(Xpos,Ypos,EndX,EndY);
  AxesControl(oldX,oldY,StartX,StartY);
  changeX := EndX-StartX;
  changeY := EndY-StartY;
  if VelocityFlag then changeV := sqrt(sqr(changeX)+sqr(changeY))
    else if abs(changeX) < abs(changeY) then ChangeV := abs(changeY)
        else ChangeV := abs(changeX);
  steps := ChangeV / _Jump_Size;
  if steps>0 then begin
    deltaX := changeX / steps;
    deltaY := changeY / steps;
    IntSteps  := trunc(steps+StepRound) + 1;
    TotalSteps := 1;
    repeat
      BrokenX := StartX + deltaX*TotalSteps;
      BrokenY := StartY + deltaY*TotalSteps;
      TotalSteps := TotalSteps + 1;
      if TotalSteps >= IntSteps then begin
        BrokenX := EndX;
        BrokenY := EndY;
      end;
      GeoCorrect(BrokenX,BrokenY,FieldX,FieldY);
      Er := 3;                          { add discrete jump }
      while TryCommand do begin
        Er := __AddVector(trunc(FieldX),trunc(FieldY),
                0,0,1);                 { incl a 1 tick pause }
        OkayForRedrawCommand := true;
      end;
      inc(QueueCount,13);
      SIHerror;
    until TotalSteps >= IntSteps;
  end;
end;

procedure MoveLaser;
begin
  AxesControl(Xpos,Ypos,EndX,EndY);
  AxesControl(oldX,oldY,StartX,StartY);
  changeX := EndX - StartX;
  changeY := EndY - StartY;
  if VelocityFlag then changeV := sqrt(sqr(changeX) + sqr(changeY))
    else if abs(changeX) < abs(changeY) then ChangeV := abs(changeY)
        else ChangeV := abs(changeX);
  steps := ChangeV / _Step_Size;
  if steps>=1 then begin
    deltaX := changeX / steps;
    deltaY := changeY / steps;
    IntSteps  := trunc(steps+StepRound);
    IntDeltaX := CvtDelta(deltaX);
    IntDeltaY := CvtDelta(deltaY);
    TotalSteps := 0;
    repeat
      BrokenX := StartX + deltaX * TotalSteps;
      BrokenY := StartY + deltaY * TotalSteps;
      TempSteps := IntSteps - TotalSteps;
      if TempSteps>256 then TempSteps := 256;
      if (CurrentRedrawCount > 1) and (_Redraw_Size>0) then
        if Distance+TempSteps >= _Redraw_Size then begin
          TempSteps := _Redraw_Size - Distance;
          Redrawing := true;
```

```
        end;
      TotalSteps := TotalSteps + TempSteps;
      Distance := Distance + TempSteps;
      GeoCorrect(BrokenX,BrokenY,FieldX,FieldY);

{ Geometric Correction addition }
      if GeoCorrectFlag then begin
        GeoCorrect(BrokenX+TempSteps*DeltaX,BrokenY+TempSteps*DeltaY,
           GeoEndX,GeoEndY);
        changeX := GeoEndX - FieldX;
        changeY := GeoEndY - FieldY;
        ChangeV := sqrt(sqr(changeX) + sqr(changeY));
        steps := ChangeV / _Step_Size;
        GeoDeltaX := ChangeX / steps;
        GeoDeltaY := ChangeY / steps;
        DiscreteX := CvtDelta(GeoDeltaX);
        DiscreteY := CvtDelta(GeoDeltaY);
        DiscreteSteps := trunc(steps+StepRound);
      end else begin
        DiscreteX := IntDeltaX;
        DiscreteY := IntDeltaY;
        DiscreteSteps := TempSteps;
      end;

      Er := 3;  { send out move command }
      while TryCommand do begin
        Er := __AddVector(trunc(FieldX),trunc(FieldY),
                DiscreteX,DiscreteY,DiscreteSteps);
        OkayForRedrawCommand := true;
      end;
      inc(QueueCount,13);
      SIHerror;
      if Redrawing then PerformRedraw;
    until TotalSteps = IntSteps;
  end;
end;

{
   - - - - -
}

procedure BeginX;
begin
  beginXpos := arg;
end;

procedure BeginY;
var
  X1,Y1,X2,Y2: Real;
begin
  beginYpos := arg;
  if SwapBegin then AxesControl(beginXpos,beginYpos,X1,Y1)
    else begin
      X1 := beginXpos;
      Y1 := beginYpos;
    end;
  GeoCorrect(X1,Y1,X2,Y2);
  Er := __SetHomePosition(trunc(X2),trunc(Y2));
  SIHerror;
end;

procedure JumpX;
begin
  newX(arg);
end;
```

```
procedure JumpY;
begin
  newY(arg);
  if _Jump_Delay<>0 then begin
    JumpLaser;
    Er := 3;
    while TryCommand do
      Er := __AddPause(_Jump_Delay);
    inc(QueueCount,3);
    SIHerror;
  end;
end;

procedure NextX;
begin
  newX(arg);
end;

procedure NextY;
begin
  newY(arg);
  MoveLaser;
end;

procedure StepSize;
begin
  _Step_Size := trunc(arg);
end;

procedure StepPeriods;
var
  i: Integer;
begin
  PerformRedraw;
  count := 0;
  while (length(temp)>0) and (count<10) do begin
    val(temp,arg,code);
    if code<>0 then val(copy(temp,1,code-1),arg,code2);
    if code=0 then temp := ''
      else temp := copy(temp,code+1,99);
    count := count + 1;
    StepPeriodsArray.periods[count-1] := CvtTicks(arg);
  end;
  StepPeriodsArray.num := count;
  if count>0 then begin
(*    if DebugMode then begin
      msg('New step periods array: ');
      for i:=0 to count-1 do msg(StepPeriodsArray.periods[i],' ');
      msgln('');
    end; *)
    Er := 3;
    if __BlockModeOn then begin
      while TryCommand do
        Er := __SetStepPeriods(StepPeriodsArray);
      inc(QueueCount,count*2+2);
    end else begin
      while TryCommand do
        Er := __AddChangeTimebase(StepPeriodsArray.periods[0]);
      inc(QueueCount,3);
    end;
    SIHerror;
  end;
  PerformRedraw;
end;

procedure ScanDelay;
```

```
begin
  _Scan_Delay := trunc(arg);
end;

procedure JumpSize;
begin
  _Jump_Size := arg;
  if _Jump_Size < 50 then _Jump_Size := 50;   { limit }
end;

procedure JumpDelay;
begin
  _Jump_Delay := trunc(arg);
end;

procedure LaserOn;
begin
  _Laser_On_Delay := CvtTicks(arg);
  Er := __SetTurnOnDelay(_Laser_On_Delay);
  SIHerror;
end;

procedure LaserOff;
begin
  _Laser_Off_Delay := CvtTicks(arg);
  Er := __SetTurnOffDelay(_Laser_Off_Delay);
  SIHerror;
end;

procedure SequenceMode;
begin
  { no-operation }
end;

procedure AbsoluteMode;
begin
  { no-operation }
end;

procedure Execute;
begin
  PerformRedraw;
  Er := 3;
  while TryBlockCommand do
    Er := __Execute;
  SIHerror;
  ResetRedraw;
end;

procedure ExecuteClear;
begin
  PerformRedraw;
  Er := 3;
  while TryBlockCommand do
    Er := __ExecuteClear;
  QueueCount := 0;
  SIHerror;
  ResetRedraw;
end;

procedure ClearTable;
begin
  Er := __Clear;
  QueueCount := 0;
  if Er<>5 then SIHerror;  { not in block mode okay }
  ResetRedraw;
```

```
end;

procedure SetMode;
begin
  if length(cmd)=5 then case cmd[3] of
    'A': Er := __SetAutoShutterMode(cmd[5]);
    'B': Er := __SetBlockMode(cmd[5]);
    'P': Er := __SetPosAckMode(cmd[5]);
  end;
  SIHerror;
end;

procedure SoftReset;
begin
  Er := __SetAutoShutterMode('-');  { off }
  SIHerror;
  Er := __SetBlockMode('-');        { off }
  SIHerror;
  Er := __SetPosAckMode('-');       { off }
  SIHerror;
  QueueCount := 0;
end;

procedure HardReset;
begin
  SoftReset;
  Er := __ResetCmdQueue;
  SIHerror;
end;

procedure RedrawCount;
begin
  _Redraw_Count := trunc(arg);
  if _Redraw_Count < 1 then _Redraw_Count := 1
    else if _Redraw_Count > 10 then _Redraw_Count := 10;
  SetRedrawCount(_Redraw_Count);
  PerformRedraw;
  Er := 3;
  while TryCommand do
    Er := __SetRedrawCount(_Redraw_Count);
  inc(QueueCount,3);
  SIHerror;
end;

procedure RedrawDelay;
begin
  _Redraw_Delay := trunc(arg);
  Er := 3;
  while TryCommand do
    Er := __SetRedrawDelay(_Redraw_Delay);
  inc(QueueCount,3);
  SIHerror;
end;

procedure RedrawSize;
begin
  _Redraw_Size := trunc(arg);
end;

procedure RivetCount;
begin
  _Rivet_Count := trunc(arg);
  if _Rivet_Count < 1 then _Rivet_Count := 1
    else if _Rivet_Count > 10 then _Rivet_Count := 10;
  _Rivet_Count := _Rivet_Count - 1;
end;
```

```
procedure RivetPeriods;
var
  i: Integer;
begin
  val(temp,arg,code);
  if code<>0 then val(copy(temp,1,code-1),arg,code2);
  RivetMainPeriod := CvtTicks(arg);
  if code=0 then temp := ''
    else temp := copy(temp,code+1,99);
  count := 0;
  while (length(temp)>0) and (count<10) do begin
    val(temp,arg,code);
    if code<>0 then val(copy(temp,1,code-1),arg,code2);
    if code=0 then temp := ''
      else temp := copy(temp,code+1,99);
    RivetPeriodsArray.periods[count] := CvtTicks(arg);
    count := count + 1;
  end;
  RivetPeriodsArray.num := count;
(*  if DebugMode then begin
    msg('New rivet periods array: ');
    msg(' Main=',RivetMainPeriod);
    for i:=0 to count-1 do msg(' ',RivetPeriodsArray.periods[i]);
    msgln('');
  end; *)
end;

procedure RivetReduction;
begin
  _Rivet_Reduction := arg;
end;

procedure ResetFromRivets;
begin
  if RivetPeriodsArray.num>0 then begin
    { set standard step periods }
    Er := 3;
    while TryCommand do
      Er := __SetStepPeriods(StepPeriodsArray);
    inc(QueueCount,StepPeriodsArray.num*2+2);
    SIHerror;
  end;
end;

procedure RivetX;
begin
  newX(arg);
end;

procedure RivetY;
var
  StartX,StartY,EndX,EndY: Real;
  ReducedStartX,ReducedStartY,ReducedEndX,ReducedEndY: Real;
  ReductionX,ReductionY: Real;
  DirX,DirY,ReducedDirX,ReducedDirY: Integer;
begin
  StartX := oldX;
  StartY := Ypos;
  EndX   := Xpos;
  EndY   := arg;
  { set rivet step periods }
  Er := 3;
  while TryCommand do
    Er := __AddChangeTimeBase(RivetMainPeriod);
  inc(QueueCount,3);
```

```
SIHerror;
{ draw complete vector }
NextY;
DirX := sgn(EndX - StartX);
DirY := sgn(EndY - StartY);
ReductionX := _Rivet_Reduction * deltaX;
ReductionY := _Rivet_Reduction * deltaY;
ReducedStartX := StartX + ReductionX;
ReducedStartY := StartY + ReductionY;
ReducedEndX   := EndX   - ReductionX;
ReducedEndY   := EndY   - ReductionY;
ReducedDirX := sgn(ReducedEndX - ReducedStartX);
ReducedDirY := sgn(ReducedEndY - ReducedStartY);
DoingRivet := true;
{ do rivet if reduced vector size is greater than 0 units }
if ((ReducedDirX = DirX) and (ReducedDirY = DirY))
  and (_Rivet_Count > 0) then begin
  { end standard redraw if any }
  PerformRedraw;
  if RivetPeriodsArray.num>0 then begin
    { set rivet step periods }
    Er := 3;
    while TryCommand do
      Er := __SetStepPeriods(RivetPeriodsArray);
    inc(QueueCount.RivetPeriodsArray.num*2+2);
    SIHerror;
  end;
  { set rivet pass count }
  SetRedrawCount(_Rivet_Count);
  { draw reduced vector - the rivet }
  arg := ReducedStartX;
  JumpX;
  arg := ReducedStartY;
  JumpY;
  arg := ReducedEndX;
  NextX;
  arg := ReducedEndY;
  NextY;
  { end rivet redraw }
  PerformRedraw;
  { restore original redraw pass count }
  SetRedrawCount(_Redraw_Count);
  { jump to end of full vector }
  arg := EndX;
  JumpX;
  arg := EndY;
  JumpY;
end;
{ reset standard step periods }
Er := 3;
while TryCommand do
  Er := __SetStepPeriods(StepPeriodsArray);
inc(QueueCount,StepPeriodsArray.num*2+2);
SIHerror;
DoingRivet := false;
end;

procedure WaitIdle;
var
  time: Integer;
begin
  time := trunc(arg);
  if time < 100 then time := 100;  { set minimum delay time }
  delay(time);  { delay long enough for background task to see EX }
  repeat
  until __GetBkgndIdleStatus or keypressed;
```

```
  if keypressed then if StatusKey = CtrlBreak then KeyAbort := true;
end;

{ - - - - - - - - - - - - - - - - - - - - - - - - - - - - - - - - - - - - -

    STEREO Command Parser

  - - - - - - - - - - - - - - - - - - - - - - - - - - - - - - - - - - - - - }

procedure ParseCommand;
begin
  temp := copy(cmd,3,99);
  val(temp,arg,code);
  if code<>0 then val(copy(temp,1,code-1),arg,code2);
  op := copy(cmd,1,2);
  i := pos(op,
        '*BX*BY*JX*JY*NX*NY*SS*SP*SD*JS*JD*LO*LF*NS*AB'
      + '*EX*EC*CL*MD*SR*HR*RC*RD*RS*VC*VP*VR*VX*VY*WI');
  if (length(op)>1) and (i>0) then case i div 3 of
     0: BeginX;            { BX }
     1: BeginY;            { BY }
     2: JumpX;             { JX }
     3: JumpY;             { JY }
     4: NextX;             { NX }
     5: NextY;             { NY }
     6: StepSize;          { SS }
     7: StepPeriods;       { SP }
     8: ScanDelay;         { SD }
     9: JumpSize;          { JS }
    10: JumpDelay;         { JD }
    11: LaserOn;           { LO }
    12: LaserOff;          { LF }
    13: SequenceMode;      { NS }
    14: AbsoluteMode;      { AB }
    15: Execute;           { EX }
    16: ExecuteClear;      { EC }
    17: ClearTable;        { CL }
    18: SetMode;           { MD }
    19: SoftReset;         { SR }
    20: HardReset;         { HR }
    21: RedrawCount;       { RC }
    22: RedrawDelay;       { RD }
    23: RedrawSize;        { RS }
    24: RivetCount;        { VC }
    25: RivetPeriods;      { VP }
    26: RivetReduction;    { VR }
    27: RivetX;            { VX }
    28: RivetY;            { VY }
    29: WaitIdle;          { WI }
   end else Return := 128;  { unrecognized command }
end;

{ - - - - - - - - - - - - - - - - - - - - - - - - - - - - - - - - - - - - -

    Process STEREO Commands coming through the Software Interrupt

    - Software Interrupt $65 (101) Handler -

    ES:BX points to first character of string.  String should end with
    a character value of 0, 10 (LF), or 13 (CR).  An error code will
    be returned in AL with 0 meaning no error occured.
```

```
- - - - - - - - - - - - - - - - - - - - - - - - - - - - - - - - - - - - -

procedure ReceiveCommand(Flags,CS,IP,AX,BX,CX,DX,SI,DI,DS,ES,BP: Word);
interrupt;
begin
  KeyAbort := false;
  StrOfs := BX;
  StrSeg := ES;
  INLINE ($FB);   { STI    ;allow interrupts }

  { build a compatible command string }
  cmd := '';
  done := false;
  Return := 0;
  QueueCount := 0;
  while (not KeyAbort) and (not done) and (Return=0) do begin
    Ch := chr(Mem[StrSeg:StrOfs]);
    done := Ch < ' ';
    if done or (Ch=';') then begin
      StrOfs := StrOfs + 1;
      ParseCommand;
      cmd := '';
    end else begin
      if Ch in ['!'..'~'] then cmd := cmd + upcase(Ch);
      StrOfs := StrOfs + 1;
    end;
  end;
{  write('Stereo Debug ',keypressed); }
  CX := QueueCount;
  AX := Return;
  BX := StrOfs;
end;

{ - - - - - - - - - - - - - - - - - - - - - - - - - - - - - - - - - - - -

    Memory Resident Routines

    After the following routines install the memory-resident routines
    above, they are thrown away and not used again.

  - - - - - - - - - - - - - - - - - - - - - - - - - - - - - - - - - - - - }

procedure ResidentTermination;
begin
  with regs do begin
    AH := $31;
    AL := 1;
    DX := trunc(StereoSize) shr 4;
    MsDos(regs);
  end;
end;

procedure InitMemoryResidency;
begin
  SetIntVec(_STEREOVECTOR,@ReceiveCommand);
end;

{  - - - - -  }
```

```
function WhiteSpace(var str: String;loc: Integer): Integer;
begin
  while (loc <= length(str)) and (str[loc] in [#9,' ']) do loc := loc + 1;
  WhiteSpace := loc;
end;

procedure CheckForOptions(var str: String);
var
  i: Integer;
begin
  str := upper(str);
  while (length(str)>1) and (str[1]=' ') do delete(str,1,1);
  i := pos('/D',str);   { set debug mode }
  if i>0 then begin
    DebugMode := true;
    delete(str,i,2);
  end;
  i := pos('/NV',str);  { not constant vector velocity }
  if i>0 then begin     { larger of X and Y axes }
    VelocityFlag := false;
    delete(str,i,3);
  end;
  i := pos('/NG',str);  { no geometric correction }
  if i>0 then begin
    GeoCorrectFlag := false;
    delete(str,i,3);
  end;
  i := pos('/NC',str);  { no version check }
  if i>0 then begin
    VersionCheckFlag := false;
    delete(str,i,3);
  end;
  i := pos('/SWAPXY',str);  { swap X & Y coordinates }
  if i>0 then begin
    SwapXY := true;
    delete(str,i,7);
  end;
  i := pos('/AXESBEGIN',str);  { axes-control begin (home) coordinates }
  if i>0 then begin
    SwapBegin := true;
    delete(str,i,10);
  end;
  i := pos('/GEO',str);  { geo-correct axes order }
  if i>0 then begin
    j := WhiteSpace(str,i+4);
    case str[j] of
      'X': FirstX := true;
      'Y': FirstX := false;
      'N': GeoCorrectFlag := false;
    end;
    delete(str,i,j+2-i);
  end;
  i := pos('/X',str);  { X-axis orientation }
  if i>0 then begin
    NegX := (str[i+2]='-');
    delete(str,i,3);
  end;
  i := pos('/Y',str);  { Y-axis orientation }
  if i>0 then begin
    NegY := (str[i+2]='-');
    delete(str,i,3);
  end;
end;

procedure ShowAxis(Neg: Boolean;AxCh: Char);
begin
```

```
  if Neg then write('-') else write('+');
  write(AxCh,' axis');
end;

procedure ShowGeometry;
begin
  write('Geometry is ');
  if SwapXY then write('XY Swapped, ');
  if SwapBegin then write('Begin Swapped, ');
  if FirstX then begin
    ShowAxis(NegX,'X');
    write(' first, then ');
    ShowAxis(NegY,'Y');
  end else begin
    ShowAxis(NegY,'Y');
    write(' first, then ');
    ShowAxis(NegX,'X');
  end;
  writeln('.');
  if GeoCorrectFlag then writeln('Geometric Correction active.');
end;


{ - - -  M A I N   P R O G R A M  - - - }


begin
  CheckBreak := false;
  FillChar(FirstVar,ofs(LastVar)-ofs(FirstVar),#0);   { clear variables }
  VelocityFlag      := true;    { default to constant vector velocity }
  GeoCorrectFlag    := true;    { default to geometric correction }
  VersionCheckFlag := true;
  writeln;
  writeln(#213,many(#205,53),#184);
  writeln(#179,'  STEREO, Stereolithography Device Driver            ',#179);
  writeln(#179,'  3D Systems Laser Stereolithography System          ',#179);
  writeln(#179,'  Version ',ThisStereoVersion,'  by Tarnz Technologies  January 19
  writeln(#212,many(#205,53),#190);
  writeln;
  cmd := StartOfProgramCode;
  ReadCommandLine(cmd);
  if not __LaserPresent then goto ExitProgram;
  if __StereoOk then begin
    writeln('STEREO Device Driver Version ',StereoVersion,
      ' already installed.');
    goto ExitProgram;
  end;
  CheckForOptions(cmd);
  if VersionCheckFlag then
    if LaserVersion < MinSystemVersion then begin
      writeln('Obsolete LASER system in use.');
      goto ExitProgram;
    end;
  Xpos       := 32767;
  Ypos       := 32767;
  DoingRivet := false;
  RivetMainPeriod        := 1190;
  StepPeriodsArray.num  := 0;
  RivetPeriodsArray.num := 0;

  { read and/or set defaults }
  Assign(DefaultFile,'STEREO.DEF');
  {$I-}
  reset(DefaultFile);
  {$I+}
  if IOresult<>0 then begin
```

```
    writeln('Can''t find STEREO.DEF default file!');
    _Step_Size        := 32;
    _Step_Period      := 119;
    _Scan_Delay       := 64;
    _Jump_Size        := 65535.0;
    _Jump_Delay       := 100;
    _Laser_On_Delay   := 0;
    _Laser_Off_Delay  := 0;
    _Redraw_Count     := 1;
    _Redraw_Delay     := 0;
    _Redraw_Size      := 200;
    _Rivet_Count      := 1;
    _Rivet_Reduction  := 100;
  end else begin  { read default file }
    i := 1;
    while (i<=14) and not eof(DefaultFile) do begin
      readln(DefaultFile,temp);
      if not ((length(temp)=0) or (temp[1]='!')) then begin
        case i of
          1: IntParse(_Step_Size);
          2: begin
               count := 0;
               while (length(temp)>0) and (count<10) do begin
                 IntParse(StepPeriodsArray.periods[count]);
                 count := count+1;
               end;
               StepPeriodsArray.num := count;
               _Step_Period := StepPeriodsArray.periods[0];
             end;
          3: IntParse(_Scan_Delay);
          4: RealParse(_Jump_Size);
          5: IntParse(_Jump_Delay);
          6: IntParse(_Laser_On_Delay);
          7: IntParse(_Laser_Off_Delay);
          8: IntParse(_Redraw_Count);
          9: IntParse(_Redraw_Delay);
         10: IntParse(_Redraw_Size);
         11: IntParse(_Rivet_Count);
         12: begin
               count := 0;
               while (length(temp)>0) and (count<10) do begin
                 IntParse(RivetPeriodsArray.periods[count]);
                 count := count+1;
               end;
               RivetPeriodsArray.num := count;
             end;
         13: RealParse(_Rivet_Reduction);
        end;
        i := i+1;
      end; {if not}
    end; {while i<}
    close(DefaultFile);
  end;
  CurrentRedrawCount := _Redraw_Count;

  XGeoCorrectTable := HeapPtr;
  if GeoCorrectFlag then begin
   { read Geometric Correction Table }
    Assign(GeoFile,'STEREO.GEO');
    {$I-}
    reset(GeoFile);
    {$I+}
    if IOresult<>0 then begin
      writeln('Can''t find STEREO.GEO Geometric Correction File!');
      GeoCorrectFlag := false;
    end else begin  { read geometric correction table from file }
```

```
      repeat
        readln(GeoFile,temp);
      until ((length(temp)>0) and (temp[1]<>'!')) or eof(GeoFile);
      SkipToNum(temp);
      IntParse(XCount);
      SkipToNum(temp);
      IntParse(YCount);
      YGeoCorrectTable := PtrAdd(XGeoCorrectTable,LongInt(XCount*YCount) shl 2);
      SkipToNum(temp);
      IntParse(CoordCount);
      SkipToNum(temp);
      IntParse(TableDivisor);
      If TableDivisor < 1 then TableDivisor := 1024;  { for V2.30 compatibility }
      if (XCount<>YCount) or (CoordCount<>2)
      or (XCount>MaxGeo) or (YCount>MaxGeo) then begin
        writeln('Illegal format for STEREO.GEO file.');
        halt(1);
      end;
      XC := 0;
      YC := 0;
      StoreCount := 0;
      while (XC<XCount) and not eof(GeoFile) do begin
        while (YC<YCount) and not eof(GeoFile) do begin
          repeat
            readln(GeoFile,temp);
          until ((length(temp)>0) and (temp[1]<>'!')) or eof(GeoFile);
          SkipToNum(temp);
          RealParse(Xcoord);
          SkipToNum(temp);
          RealParse(Ycoord);
          XGeoCorrectTable^[StoreCount] := trunc(Xcoord*GeoMult);
          YGeoCorrectTable^[StoreCount] := trunc(Ycoord*GeoMult);
          inc(StoreCount);
          inc(YC);
        end; {while YC}
        inc(XC);
        YC := 0;
      end; {while XC}
      if XC < XCount then begin
        writeln('Not enough entries in STEREO.GEO file.');
        halt(2);
      end;
      while not eof(GeoFile) do begin
        readln(GeoFile,temp);
        if (length(temp)>0) and (temp[1]<>'!') then begin
          SkipToNum(temp);
          if temp[1] in ['0'..'9','.'] then begin
            writeln('Too many entries in STEREO.GEO file.');
            halt(3);
          end;
        end;
      end;
      close(GeoFile);
    end;
  end;
  StereoSize := MemAbs(XGeoCorrectTable) + (LongInt(XCount*YCount) shl 3)
    - (LongInt(PrefixSeg) shl 4) + 1024;
  StereoSize := ((StereoSize shr 4)+1) shl 4;
(*
  writeln('MemAbs XGeo=',MemAbs(XGeoCorrectTable));
  writeln('MemAbs YGeo=',MemAbs(YGeoCorrectTable));
  writeln('X*Y shl 2=',LongInt(XCount*YCount) shl 2);
  writeln('PrefixSeg=',LongInt(PrefixSeg));
  writeln('StereoSize=',StereoSize);
*)
  writeln('STEREO Device Driver installed using ',
```

```
    RealStr(StereoSize/1024),'K bytes.');
  ShowGeometry;

  InitMemoryResidency:
  ResidentTermination;

ExitProgram:
end.
```

{ ==============================================================================

Stereolithography Laser Controller Software Interrupt Interface Routines for 3D Systems, Inc.

Version 2.60 by Tarnz Technologies

==============================================================================

The purpose of these routines is to interface general-purpose Turbo Pascal programs with the memory resident laser controller software. The machine language-based laser controller software the routines below interface to can be used with other languages like Basic, C, and 8086 Assembly Language.

Turbo Pascal was chosen because of its development environment and low source-to-executable-object code turnaround time. As development progresses and there is no longer a great need for a fast development environment, these routines should be adapted to C to maintain project software consistency. Turbo C and Microsoft C are the leading choices for C languages.

Below is a list of the routines in this include file. Most of the functions relate directly to specific software interrupt calls. The Code is the related interrupt's AX (AH,AL) value. Some of the interrupt functions require arguments to be passed in other registers, and some will return results. See the actual routines for more details on the interface protocol.

| Pascal Function | Code | Description |
|---|---|---|
| __LaserOk | | see if laser software is installed |
| __LaserPresent | | tell if laser software not installed |
| __OpenLaser | 00 -- | open laser DAC channel and initialize |
| __CloseLaser | 01 -- | close laser DAC channel and restore system |
| | 02 xx | add command to background command queue |
| __AddVector | 02 00 | add vector command |
| __AddOpenShutter | 02 01 | add open shutter command |
| __AddCloseShutter | 02 02 | add close shutter command |
| __AddChangeTimebase | 02 03 | add change time base command |
| __AddPause | 02 04 | add pause command |
| __ResetCmdQueue | 03 -- | reset background command queue |
| __GetCmdQueueSize | 04 -- | get background command queue size |
| | 05 xx | get option |
| __GetIntNum | 05 00 | get software interrupt vector number |
| __GetBkgndTime | 05 01 | get background task interval time |
| __GetControlWord | 05 02 | get laser control word |
| __AutoShutterModeOn | 05 02 | get status of auto shutter mode |
| __PosAckModeOn | 05 02 | get status of position acknowledge mode |
| __BlockModeOn | 05 02 | get status of block mode |
| __GetStatus | 05 03 | get laser status |
| __GetOpenStatus | 05 03 | get laser channel open status |
| __GetBkgndIdleStatus | 05 03 | get background idle status |
| __GetTurnOffDelay | 05 04 | get laser turn-off delay |

```
  __SetTurnOnDelay      05 05     get laser turn-on delay
  __SetHomePosition     05 06     get laser home position

                        06 xx  set option
  __SetIntNum           06 00     set software interrupt vector number
  __SetBkgndTime        06 01     set background task interval time
  __SetControlWord      06 02     set laser control word (general)
  __SetAutoShutMode     06 02       set laser control word, bit 0
  __SetPosAckMode       06 02       set laser control word, bit 1
  __SetBlockMode        06 02       set laser control word, bit 2
                        06 03     -
  __SetTurnOffDelay     06 04     set laser turn-off dolay
  __SetTurnOnDelay      06 05     set laser turn-on delay
  __SetHomePosition     06 06     set laser home position

                        07 xx  background task execution control
  __Execute             07 00     execute command queue to current point [illegible]
  __ExecuteClear        07 01     execute command queue to current point, stop.
  __Clear               07 02     clear command queue (reset queue's start [illegible]

                        08 xx  background task redraw control
  __SetStepPeriods      08 00  set multi-pass step periods
  __SetRedrawCount      08 01  set redraw pass count
  __SetRedrawDelay      08 02  set redraw delay
  __Mark                08 03  mark redraw start position
  __Redraw              08 04  perform multi-pass redraw

 ========================================================================== }

const
  _[illegible]           =   [illegible];        { Intr ... vector alternative  }
                                             { values: $60 through $67.      }
  _PACKET_SIZE          =    13;            { length of vector packet       }

  _OK                   =     0;            { Errors returned by Level Zero
  _INTERNAL_ERROR       =   255;
  _MINIMUM_TICKS        =    59;            { don't go below 5( us          }
  _LASER_QUEUE_MAX      = 60000.0;          { Laser Queue size              }

  __ALLBITS = $FFFF;
  __BITVALUE: array[0..15] of Word =
    ($0001, $0002, $0004, $0008, $0010, $0020, $0040, $0080,
     $0100, $0200, $0400, $0800, $1000, $2000, $4000, $8000);

type
  _Str16  = string[16];
  _Str255 = string[255];
  _VectorType = record
      fractX: Byte;       { start coordinates                                 }
      startX: Word;
      fractY: Byte;       { fractional portion - 1 byte, should be set to 0 }
      startY: Word;       { integer portion    - 2 bytes                     }
      deltaX: Integer;    { +/- change values in 1/256 units                  }
      deltaY: Integer;
        incr: Word;       { # of increments within vector count               }
      end;
  _StepPeriodsType = record
      num     : Byte;
      periods: array[0..9] of Word;
```

```
  end;

var
  __IntReg: Registers;
  LaserVersion: _Str4;

{ --------------------------------------------------------------------------------

    __LaserOk function
      check to see if laser controller code has been installed.

    returns:
    false if code not installed
    true  if code is installed
    LaserVersion contains laser controller version number

  -------------------------------------------------------------------------------- }

function __LaserOk: Boolean;
  type
    CopyType = array[1..11] of char;
  var
    CopyPtr: ^CopyType;
    CopyStr: string[20];
  begin
    with __IntReg do begin
      AX := ($3E shl 8) or __LASERVECTOR;
      Intr($21,__IntReg);
      CopyPtr := Ptr(Es,BX-19);
    end;
    move(CopyPtr^[1],CopyStr[1],11);
    CopyStr[0] := #11;
    if CopyStr = 'Tarnz Technologies' then begin
      __LaserOk := true;
      with __IntReg do
        CopyPtr := Ptr(Es,BX-46);
      move(CopyPtr^[1],LaserVersion[1],4);
      LaserVersion[0] := #4;
    end else begin
      __LaserOk := false;
      LaserVersion := '?.??';
    end;
  end;

{ --------------------------------------------------------------------------------

    __LaserPresent function
      same as LaserOk but also prints a message if laser system is not
      installed.

    returns:
    false if code not installed
    true  if code is installed

  -------------------------------------------------------------------------------- }

function __LaserPresent: Boolean;
  begin
    if __LaserOk then __LaserPresent := true
    else begin
```

```
      __LaserPresent := false;
      writeln('LASER system not installed. ');
    end;
  end;

{ --------------------------------------------------------------------------

    __OpenLaser(Ticks) function
      open up laser DAC channel with the background server interrupting
      every Ticks timer 0 ticks.  Input for timer 0 is a 1.19 MHz clock
      signal, so if Ticks = 119, the background task would activate once
      per 100 us;  with Ticks = 1190, once per ms;  etc.

    returns error code

  -------------------------------------------------------------------------- }

function __OpenLaser(ticks: Word): Integer;
  begin
{ [illegible] Check [illegible] }
{     if ticks<119 then ticks := 119; }
    with __IntReg do begin
      AX := $0[illegible];
      [illegible]
      Intr(__LASERVECTOR, __IntReg);
      __OpenLaser := AL;
    end;
  end;

{ --------------------------------------------------------------------------

    __CloseLaser function
      [illegible] command queue
      [illegible] __ResetVectorCall
      [illegible]

    returns error code

  -------------------------------------------------------------------------- }

function __CloseLaser: Integer;
  begin
    with __IntReg do begin
      AX := $0100;
      Intr(__LASERVECTOR,__IntReg);
      __CloseLaser := AL;
    end;
  end;

{ --------------------------------------------------------------------------

    __AddVector(startX,startY,deltaX,deltaY,incr) function
      add the vector to the background command queue.  Vector start
      coordinates are (startX,startY) and their change value is
      (deltaX,deltaY).  The number of incremental steps in the vector
      is incr.  deltaX and deltaY are in a special format (high byte
      is +/- integer portion; low byte is [illegible]) [illegible] to
      high-speed DAC updating.  See the 3DPC protocol specification
      for more information.
```

```
   returns error code

  --------------------------------------------------------------------------------

function __AddVector(startX,startY: Word;deltaX,deltaY: Integer;
                     incr: Word): Integer;
  var
    VectorPacket: _VectorType;
  begin
    if incr>0 then begin
      VectorPacket.fractX := 0;        { set up vector packet }
      VectorPacket.startX := startX;
      VectorPacket.fractY := 0;
      VectorPacket.startY := startY;
      VectorPacket.deltaX := deltaX;
      VectorPacket.deltaY := deltaY;
      VectorPacket.incr   := incr;
      with __IntReg do begin
        AX := $0[illegible];
        [illegible]                    [illegible] to vector packet }
        BX := Ofs(VectorPacket);
        Intr(_LASERVECTOR,__IntReg);
        __AddVector := AL;
      end;
    end else __AddVector := [illegible]
  end;

  --------------------------------------------------------------------------------

   __AddOpenShutter function
     [illegible] shutter command to the [illegible] command queue. The
     shutter will be opened by the background task when it gets to this
     command in the command queue.

   returns error code

  --------------------------------------------------------------------------------

function __AddOpenShutter: Integer;
  begin
    with __IntReg do begin
      AX := $0201;
      Intr(_LASER_VECTOR,__IntReg);
      __AddOpenShutter := AL;
    end;
  end;

  --------------------------------------------------------------------------------

   __AddCloseShutter function
     add the close shutter command to the background command queue.  The
     shutter will be closed by the background task when it gets to this
     command in the command queue.

   returns error code

  --------------------------------------------------------------------------------

function __AddCloseShutter: Integer;
  begin
```

```
    with __IntReg do begin
      AX := $0202;
      Intr(_LASERVECTOR,__IntReg);
      __AddCloseShutter := AL;
    end;
  end;

{ ---------------------------------------------------------------------------

    __AddChangeTimebase(NewTicks) function
      add the change time base command to the background command queue.
      The timer that awakens the background task will be reloaded with
      the count of NewTicks by the background task when it gets to this
      command in the command queue.

    returns error code

  ---------------------------------------------------------------------------

function __AddChangeTimebase(NewTicks: word): Integer;
  begin
    with __IntReg do begin
      AX := $0203;
      BX := NewTicks;
      Intr(_LASERVECTOR,__IntReg);
      __AddChangeTimebase := AL;
    end;
  end;

  ---------------------------------------------------------------------------

    __[illegible] function
      [illegible] the background command queue. [illegible]
      background task gets to this command, it will [illegible] for Delay[illegible]
      [illegible] Interrupt Time is [illegible]
      [illegible] a pause [illegible] will [illegible] if DelayTicks is [illegible]
      [illegible]

    returns error code

  ---------------------------------------------------------------------------

function __AddPause(DelayTicks: Word): Integer;
  begin
    with __IntReg do begin
      AX := $0204;
      BX := DelayTicks;
      Intr(_LASERVECTOR,__IntReg);
      __AddPause := AL;
    end;
  end;

{ ---------------------------------------------------------------------------

    __ResetCmdQueue function
      clear out the background command queue. Usually used as part of
      an abort procedure. Best when used just before a __CloseLaser call.

    returns error code
```

```
{ ---------------------------------------------------------------------------

function __ResetCmdQueue: Integer;
  begin
    with __IntReg do begin
      AX := $0300;
      Intr(_LASERVECTOR,__IntReg);
      __ResetCmdQueue := AL;
    end;
  end;

{ ---------------------------------------------------------------------------

    __GetCmdQueueSize function
      get the background command queue's size in actual number of bytes.
      Number of vectors is variable but can be estimated by the number
      returned by this routine / 13.

    returns error code

  --------------------------------------------------------------------------- }

function __GetCmdQueueSize(var size: Word): Integer;
  begin
    with __IntReg do begin
      AX := $0400;
      Intr(_LASERVECTOR,__IntReg);
      size := BX;
      if size<0 then size := size + [illegible]
      __GetCmdQueueSize := AL;
    end;
  end;

{ ---------------------------------------------------------------------------

    __GetIntNum(num) function
      place in num the software interrupt number.  Not really important
      unless we have a software interrupt conflict.

    returns error code

  --------------------------------------------------------------------------- }

function __GetIntNum(var num: Word): Integer;
  begin
    with __IntReg do begin
      AX := $0500;
      Intr(_LASERVECTOR,__IntReg);
      num := BL;
      __GetIntNum := AL;
    end;
  end;

{ ---------------------------------------------------------------------------

    __SetBkgndTime(ticks) function
      place in time the background task interrupt interval time in actual
      1.19 MHz tick counts.  (119 is 100 us, 1190 is 1 ms, etc.)

    returns error code
```

```
-------------------------------------------------------------------------- }

function __GetBkgndTime(var ticks: Word): Integer;
  begin
    with __IntReg do begin
      AX := $0301;
      Intr(_LASERVECTOR,__IntReg);
      ticks := BX;
      __GetBkgndTime := AL;
    end;
  end;

{ --------------------------------------------------------------------------

    __GetControlWord(ctrl) function
      place in ctrl the Laser Control Word showing the status of various
      hardware and software mechanisms.

      Word bit  Description
      --------  ----------------------------------
          0     Auto-Shutter Mode
          1     Position-Acknowledge Mode
          2     Block Mode
          3     -
          8     shutter control, 0=open/1=closed

    returns error code

-------------------------------------------------------------------------- }

function __GetControlWord(var ctrl: Word): Integer;
  begin
    with __IntReg do begin
      AX := $0502;
      Intr(_LASERVECTOR,__IntReg);
      ctrl := BX;
      __GetControlWord := AL;
    end;
  end;

{ --------------------------------------------------------------------------

    __AutoShutterModeOn function
      returns the status of the Auto Shutter Mode (true for on).

-------------------------------------------------------------------------- }

function __AutoShutterModeOn: Boolean;
  var
    Er: Integer;
    ctrl: Word;
  begin
    Er := __GetControlWord(ctrl);
    __AutoShutterModeOn := (ctrl and __BITVALUE[0]) > 0;
  end;

{ --------------------------------------------------------------------------

    __PosAckModeOn function
```

```
      returns the status of the Position Acknowledge Mode (true for on).

  ---------------------------------------------------------------------------- }

function __PosAckModeOn: Boolean;
  var
    Er: Integer;
    ctrl: Word;
  begin
    Er := __GetControlWord(ctrl);
    __PosAckModeOn := (ctrl and __BITVALUE[1]) > 0;
  end;

{ ----------------------------------------------------------------------------

    __BlockModeOn function
      returns the status of the Block Mode (true for on).

  ---------------------------------------------------------------------------- }

function __BlockModeOn: Boolean;
  var
    Er: Integer;
    ctrl: Word;
  begin
    Er := __GetControlWord(ctrl);
    __BlockModeOn := (ctrl and __BITVALUE[2]) > 0;
  end;

{ ----------------------------------------------------------------------------

    __GetStatus(status1,status2) function
      place in status1 and status2 the laser system's state of various
      non-programmable hardware and software mechanisms.

      word.bit       description
      --------       ------------------------------------------------------
      status1.0      laser system channel open status
      status1.1      laser system software interrupt established (sic)
      status1.2      laser system background task in idle state
      status1.3-15   -
      status2.0      bit 0 of Port C1, X and Y-axis position acknowledge
      status2.1      bit 1 of Port C1, Z-axis position acknowledge
      status2.2      bit 2 of Port C1
      status2.3      bit 3 of Port C1
      status2.4-15   -

    returns error code

  ---------------------------------------------------------------------------- }

function __GetStatus(var status1,status2: Word): Integer;
  begin
    with __IntReg do begin
      AX := $0503;
      Intr(_LASERVECTOR,__IntReg);
      status1 := BX;
      status2 := CX;
      __GetStatus := AL;
    end;
```

```
end;

{ ---------------------------------------------------------------------------

  __GetOpenStatus function
    tells whether or not the laser system communications channel has
    been opened and the timer tick trap installed.  The function returns
    a boolean value of TRUE if the channel is open.

  returns boolean value

 ---------------------------------------------------------------------------

function __GetOpenStatus: Boolean;
 var
   Er: Integer;
   stat1.stat2: Word;
 begin
   Er := __GetStatus(stat1,stat2);
   if Er=0 then __GetOpenStatus := (stat1 and __BITVALUE[0]) > 0
     else __GetOpenStatus := false;
 end;

{ ---------------------------------------------------------------------------

  __GetBkgndIdleStatus function
    tells whether or not the laser system background task is currently
    in the idle state where no more laser activity can be performed
    without some more foreground-instigated commands.  The function returns
    a boolean value of TRUE if the background task is idle.

  returns boolean value

 ---------------------------------------------------------------------------

function __GetBkgndIdleStatus: Boolean;
 var
   Er: Integer;
   stat1.stat2: Word;
 begin
   Er := __GetStatus(stat1.stat2);
   if Er=0 then __GetBkgndIdleStatus := (stat1 and __BITVALUE[2]) > 0
     else __GetBkgndIdleStatus := false;
 end;

{ ---------------------------------------------------------------------------

  __GetTurnOffDelay(ticks) function
    get the idle state's laser turn-off delay in interrupt tick counts.

  returns error code

 --------------------------------------------------------------------------- }

function __GetTurnOffDelay(var ticks: Word): Integer;
 begin
   with __IntReg do begin
     AX := $0504;
     Intr(_LASERVECTOR,__IntReg);
     ticks := BX;
```

```
      __GetTurnOffDelay := AL;
    end;
  end;

{ ------------------------------------------------------------------------------

    __GetTurnOnDelay(ticks) function
      get the idle state's laser turn-on delay in interrupt tick counts.

    returns error code

  ------------------------------------------------------------------------------ }

function __GetTurnOnDelay(var ticks: Word): Integer;
  begin
    with __IntReg do begin
      AX := $0505;
      Intr(_LASERVECTOR, __IntReg);
      ticks := BX;
      __GetTurnOnDelay := AL;
    end;
  end;

  ------------------------------------------------------------------------------

    __GetHomePosition(X,Y) function
      get the idle state's laser home position.

    returns error code

  ------------------------------------------------------------------------------

function __GetHomePosition(var X,Y: Word): Integer;
  begin
    with __IntReg do begin
      AX := $05[illegible];
      Intr(_LASERVECTOR, __IntReg);
      X := BX;
      [illegible]
      __GetHomePosition := AL;
    end;
  end;


  ------------------------------------------------------------------------------

    __SetIntNum(num) function
      set the software interrupt number to num.  All software interrupt
      call after this point must use this new interrupt number.  The
      interrupt vector for the old number is restored.

    returns error code

  ------------------------------------------------------------------------------ }

function __SetIntNum(num: Word): Integer;
  begin
    with __IntReg do begin
      AX := $0600;
      BL := num;
```

```
      Intr(_LASERVECTOR,__IntReg);
      __SetIntNum := AL;
    end;
  end;

{ ----------------------------------------------------------------------------

    __SetBkgndTime(ticks) function
      set the background task interrupt interval to ticks which has the
      actual number of 1.19 MHz tick counts.  (119 is 100 us, etc.)

    returns error code

  ---------------------------------------------------------------------------- }

function __SetBkgndTime(ticks: Word): Integer;
  begin
    if ticks<_MINIMUM_TICKS then ticks := _MINIMUM_TICKS;
    with __IntReg do begin
      AX := $0A01;
      BX := ticks;
      Intr(_LASERVECTOR,__IntReg);
      __SetBkgndTime := AL;
    end;
  end;

{ ----------------------------------------------------------------------------

    __SetControlWord(ctrl) function
      set the Laser Control Word to ctrl.  It is recommended that most
      or all programs use the __AlterControlWordBit and the specif
      [illegible]

      Word Bit  Description
      --------  ----------------------------------
         0      Auto-Shutter Mode
         1      Dual-... Acknowledge Mode
         2      Block Mode
         3      -
         4      shutter control, 1=open/0=closed

    returns error code

  ---------------------------------------------------------------------------- }

function __SetControlWord(ctrl: Word): Integer;
  begin
    with __IntReg do begin
      AX := $0A02;
      BX := ctrl;
      Intr(_LASERVECTOR,__IntReg);
      __SetControlWord := AL;
    end;
  end;

{ ----------------------------------------------------------------------------

    __AlterControlWordBit(op,bit) function
      alter the state of the indicated Control Word bit.  If op is 'S' ...
      ... the bit is set; if op is 'C' or '-', the bit is cleared.
```

```
    returns error code

  ---------------------------------------------------------------------------

function __AlterControlWordBit(op: Char;bit: Word): Integer;
  var
    Er: Integer;
    ctrl: Word;
  begin
    Er := __GetControlWord(ctrl);
    if Er=0 then begin
      if upcase(op) in ['S','+'] then ctrl := ctrl or __BITVALUE[bit]
        else if upcase(op) in ['C','-'] then
          ctrl := ctrl and (__ALLBITS-__BITVALUE[bit]);
      Er := __SetControlWord(ctrl);
    end;
    __AlterControlWordBit := Er;
  end;

  ---------------------------------------------------------------------------

    __SetAutoShutterMode(state) function
      set the state ('S' or '+' to set, 'C' or '-' to clear) of the
      Auto-Shutter Mode.

    returns error code

  ---------------------------------------------------------------------------

function __SetAutoShutterMode(op: Char): Integer;
  begin
    __SetAutoShutterMode := __AlterControlWordBit(op,0);
  end;

  ---------------------------------------------------------------------------

    __SetPosAckMode(state) function
      set the state ('S' or '+' to set, 'C' or '-' to clear) of the
      Position-Acknowledge Mode.

    returns error code

  ---------------------------------------------------------------------------

function __SetPosAckMode(op: Char): Integer;
  begin
    __SetPosAckMode := __AlterControlWordBit(op,1);
  end;

  ---------------------------------------------------------------------------

    __SetBlockMode(state) function
      set the state ('S' or '+' to set, 'C' or '-' to clear) of the
      Block Mode where the 07 commands (below) are active.

    returns error code

  ---------------------------------------------------------------------------
```

```
function __SetBlockMode(op: Char): Integer;
  begin
    __SetBlockMode := __AlterControlWordBit(op,2);
  end;

{ ---------------------------------------------------------------------------

    __SetTurnOffDelay(ticks) function
      sets the idle state's laser turn-off delay to ticks interrupt counts.

    returns error code

  --------------------------------------------------------------------------- }

function __SetTurnOffDelay(ticks: Word): Integer;
  begin
    with __IntReg do begin
      AX := $0604;
      BX := ticks;
      Intr(_LASERVECTOR,__IntReg);
      __SetTurnOffDelay := AL;
    end;
  end;

{ ---------------------------------------------------------------------------

    __SetTurnOnDelay(ticks) function
      sets the idle state's laser turn-on delay to ticks interrupt counts.

    returns error code

  --------------------------------------------------------------------------- }

function __SetTurnOnDelay(ticks: Word): Integer;
  begin
    with __IntReg do begin
      AX := $0605;
      BX := ticks;
      Intr(_LASERVECTOR,__IntReg);
      __SetTurnOnDelay := AL;
    end;
  end;

{ ---------------------------------------------------------------------------

    __SetHomePosition(X,Y) function
      sets the idle state's laser home position.

    returns error code

  --------------------------------------------------------------------------- }

function __SetHomePosition(X,Y: word): Integer;
  begin
    with __IntReg do begin
      AX := $0606;
      BX := X;
      CX := Y;
      Intr(_LASERVECTOR,__IntReg);
      __SetHomePosition := AL;
```

```
    end;
  end;
```

---

__Execute function

Set the background task running. The background task will process those commands added to the command queue from the last Clear Operation up to this __Execute call. For the first __Execute, then background task will start at the beginning of the queue. New commands can be added to the command queue while the background task is running.

When the background task is finished processing the current command block, it will automatically shut down, placing the laser beam at the preset home position.

To make programs written for earlier versions (where the background task free-ran) compatible, __Execute, __ExecuteClear, and __Clear calls (see below) should be used wherever appropriate.

returns error code

---

```
function __Execute: Integer;
  begin
    with __IntReg do begin
      AX := $0700;
      Intr(_LASERVECTOR,__IntReg);
      __Execute := AL;
    end;
  end;
```

---

__ExecuteClear function

Performs the equivalent of the __Execute function (see above) and a __Clear function (see below) function. The __ExecuteClear function provides a convenient shorthand for:

```
Er := __Execute;
Er := __Clear;
```

returns error code

---

```
function __ExecuteClear: Integer;
  begin
    with __IntReg do begin
      AX := $0701;
      Intr(_LASERVECTOR,__IntReg);
      __ExecuteClear := AL;
    end;
  end;
```

---

__Clear function

```
    clear the command queue.  Future __Execute and __ExecuteClear calls
    will start the background task processing command queue entries
    added after the call to this routine.  An Execute Operation
    saved for immediately after a Clear Operation has no effect.

    If __Clear is not called between consecutive Execute Operations,
    then background task will reprocess the command queue entries for
    the first Execute Operation.  Sometimes this is desired, and
    sometimes it isn't.

  returns error code

 -------------------------------------------------------------------------- }

function __Clear: Integer;
  begin
    with __IntReg do begin
      AX := $0702;
      Intr(_LASERVECTOR,__IntReg);
      __Clear := AL;
    end;
  end;

{ --------------------------------------------------------------------------

  __SetStepPeriods function
    set the step periods for the multiple passes.  array contains
    number of step periods to define (1 to 10) and the step period
    values in 0.02 us  (1.25 MHz) units.

  returns error code

 -------------------------------------------------------------------------- }

function __SetStepPeriods(var sp_array: _StepPeriodsType): Integer;
  begin
    with __IntReg do begin
      AX := $0800;
      ES := Seg(sp_array);        { point ES:BX to step periods array }
      BX := Ofs(sp_array);
      Intr(_LASERVECTOR,__IntReg);
      __SetStepPeriods := AL;
    end;
  end;

{ --------------------------------------------------------------------------

  __SetRedrawCount function
    set the number of passes for the background task's redraw (1-8).

  returns error code

 -------------------------------------------------------------------------- }

function __SetRedrawCount(count: Word): Integer;
  begin
    with __IntReg do begin
      AX := $0801;
      if count<1 then count := 1
        else if count>10 then count := 10;
```

```
      BX := count;
      Intr(_LASERVECTOR,__IntReg);
      __SetRedrawCount := AL;
    end;
  end;

  ------------------------------------------------------------------------------

    __SetRedrawDelay function
      set the number of timer ticks the background task should delay
      before starting a redraw pass.

    returns error code

  ------------------------------------------------------------------------------ }

function __SetRedrawDelay(delay: Word): Integer;
  begin
    with __IntReg do begin
      AX := $080C;
      DX := delay;
      Intr(_LASERVECTOR,__IntReg);
      __SetRedrawDelay := AL;
    end;
  end;

  ------------------------------------------------------------------------------

    __Mark function
      [illegible]
      [illegible]

    returns error code

  ------------------------------------------------------------------------------ }

function __Mark: Integer;
  begin
    with __IntReg do begin
      AX := $0803;
      Intr(_LASERVECTOR,__IntReg);
      __Mark := AL;
    end;
  end;

  ------------------------------------------------------------------------------

    __Redraw function
      causes the background task to perform a multi-pass redraw
      operation when it is encountered in the Background Command
      Queue.  __Redraw also marks so as to minimize use of commands.

    returns error code

  ------------------------------------------------------------------------------ }

function __Redraw: Integer;
  begin
    with __IntReg do begin
      AX := $0804;
```

```
    Intr(_LASERVECTOR,__IntReg);
    __Redraw := AL;
  end;
end;

{ end of LASER.INC }
```

```
{$R-,S+,I+,D+,T-,F-,V-,B-,N-,L+}
{$M 16384,0,655360}

{==============================================================================
   3D Systems Stereolithography System Software
 ==============================================================================

   SUPER.PAS
   SLA-1 Part-Making Graphics Supervisor

 ------------------------------------------------------------------------------

   SUPER-specific Commands:

     ZW secs       -  set Z-axis Wait time in seconds
     ZD distance   -  set Z-axis dip Depth in millimeters
     ZV velocity   -  set Z-axis Velocity parameter
     ZA accel      -  set Z-axis Acceleration parameter

 ------------------------------------------------------------------------------

   Recent History:
    9/ 1/87  Ver 2.04  Version 2 released
    9  2/87  Ver 2.06  variable dip logic corrected
    9/ 3/87  Ver 2.07  compiled by TBM (Modified Turbo Basic)
                       double parse of options
                       EX & CL before double EC to suppress glitch
    9/ 4/87  Ver 2.08  added SV, SI critical areas
    9/17/87  Ver 2.10  PRM numbers less than 0.1 supported
                       selectable range of Z layers with /START, /STOP options
                       keyboard pause / continue / skip to layer control
    9/22/87  Ver 2.11  fixed incorrect day of week read
    9/23/87  Ver 2.12  new SUPER commands ZW, ZD, ZV, and ZA
                       structural changes to SUPER.PRM
    9/25/87  Ver 2.20  new SLICE 19 block format supported
    9/28/87  Ver 2.21  /NEGZ Z-stage is negative flag
                       default option line in SUPER.PRM
                       added NFUB support
                       added lower-case SUPER command support
    9/30/87  Ver 2.25  no execute for empty blocks (primarily for L block)
   10/20/87  Ver 2.26  /DEMO out-of-vat-delay option for AutoFact '87
   10/26/87  Ver 2.27  *.P files now *.L file
                       error file support
   11/03/87  Ver 2.28  special demo screen read from file SUPER.DMO
   11/04/87  Ver 2.29  demo action descriptions with good timing
   11/12/87  Ver 2.30  first Beta software release
   11/15/87  Ver 2.31  added directory of *.L files
   11/20/87  Ver 2.32  multiple part-making capability added
   12/04/87  Ver 2.33  slice20 FUB FDB blocks
                       Menu System forced pause at end of part-making run
                       BLOCK.ID file supported
   12/16/87  Ver 2.40  SUPER converted from Turbo Basic to Turbo Pascal
                       faster file transveral, laser buffer filling
                       no special demo screen support
   12/18/87  Ver 2.41  fixed Z-Table dip routine (inf board output)
   12/21/87  Ver 2.50  graphics support added
                       start-up and part-making information displays
                       laser vectors shown on screen
   12/23/87  Ver 2.51  Block File read speed up
                       skipping to new layers sped up 150 times
   12/28/87  Ver 2.52  skip to new layer fixed
                       Layer Control File command processing fixed
                       added ability to flip between the two graphic screens
    1/06/88  Ver 2.53  break abort allowed during skip action
```

```
                      negative offsets shown as such
                      wait action F1/F2 support added
                      graphics display of error messages
                      axes orientation arrows for view window
                      better file directory display
  1/22/88  Ver 2.54   control of min/max vat viewport coords via SUPER.PRM
                      ShowFiles based on *.V instead of *.L
                      case no longer important on SUPER.PRM option line
                      better non-existent input files recovery
  1/25/88  Ver 2.60   Graphics Supervisor no longer classified as Experimental
                      support of *.R Range Control Files (as well as *.L)
                      correct layer count derived from Range Control File
  2/06/88  -          /DEMO option made functional
                      rivet processing made functional

 ----------------------------------------------------------------------------}

uses Dos,
     Crt,
     Graph,   { library of graphics routines }
     Drivers, { all the BGI drivers }
     Fonts;   { all the BGI fonts }

type
  str4  = string[4];
  str6  = string[6];
  str10 = string[10];
  str16 = string[16];
  str40 = string[40];
  str80 = string[80];
  OpModeType = (TextOp,GraphicsOp);

var
  FirstVar: Byte;  { must be first variable defined }
  Ch,key: Char;
  index,dummy,code,i,j,k: Integer;
  WeekDay,Hour,Minu,Sec,Mon,Day,Year: Integer;
  temp,cmd,SingleBar: str80;
  ShowStuff,ZTableOff,LaserOff,DipFlag,NegZStage,Demo: Boolean;
  FirstLayer,SameBlock,MoveOnFlag,SkipFlag,PauseFlag: Boolean;
  QSize,Layer,VPosition,StartZ,EndZ,NumLayers,LayersToBuild: LongInt;
  XYScale,ZPitch,PartHeight: Real;
  CurrentDate,CurrentTime: str16;
  ParamOptions,ControlLine,BlockLine,PartName: str80;
  StartTimeStamp,EndTimeStamp: str40;
  BlockMnemonicsCount,OutOfVatDelay,BoxCount,x1,y1,x2,y2: Word;
  BlockFileLoc,MaxBlockSize,BlockSize: LongInt;
  regs: Registers;
  ControlFile,ErrorFile: Text;
  BlockFile: file;  {untyped}
  XOffset,YOffset,ZAddress: LongInt;
  ParBlockType: array[0..100] of str10;
  ParStereoDef: array[0..100] of str80;
  BoxType: array[1..10] of str4;
  MinX,MaxX,MinY,MaxY: array[1..10] of Word;
  BoxX1,BoxY1,BoxX2,BoxY2,BoxX3,BoxY3,BoxX4,BoxY4: array[1..10] of Word;
  Member: array[1..4] of Word;
  BlockMnemonics: array[1..20] of str10;
  Offsets: array[0..50,1..2] of LongInt;
  LayerCount,NumXOffsets,NumYOffsets,NumOffsets: Word;
  ParCount,RelaxationTime: Word;
  LaserVersion,StereoVersion: str4;
  check1,check2: Boolean;
  BlockNumRead,BufIndex,ControlIndex,BlockIndex: Integer;
  SaveSec,NewSec,DeltaSecs,OldDeltaSecs,ControlLayer,BlockLayer: LongInt;
  GrDeltaX,GrDeltaY: LongInt;
```

```
  ControlType.BlockType: str10;
  DipDepth,ZTableVeloc,ZTableAccel: Real;
  SliceRes,ZSpacing,Thickness: Real;
  OnScreen,GraphDriver,GraphMode,Error: Integer;
  ViewPort: ViewPortType;
  OpMode: OpModeType;
  LayerCtrl,SwapXY,NegX,NegY: Boolean;
  GrMinX,GrMinY,GrMaxX,GrMaxY: LongInt;
  RangeCount,BlockCount: Integer;
  RangeZStart,RangeZEnd: LongInt;
  BoxIndex,RangeZSpace,RangeCureDepth: Integer;
  ZStart,ZEnd: array[1..100] of LongInt;         { all the ranges }
  ZSpace,CureDepth: array [1..100] of Integer;   {                }
  BlockTypes: array[1..100] of str6;             { just for one range }
  BlockCmds: array[1..100] of str80;             {                    }
  LastVar: Byte;  { must be last variable-to-be-zeroed defined }

  BlockBuf: array[1..4100] of Char;

const
  VersionId     = '2.60';
  MSDOS         = $21;
  LASERVECTOR   = $64;
  STEREOVECTOR = $65;
  BlockIdentifiers = 'ZXYISHVABJCDEFGK';
  ErrorFileName     = 'C:\SYSTEM.ERR';
  SystemFileName    = 'C:\SLA1.SYS';
  HomeDirectory     = 'C:\3DSYS';
  BlockIdFileName  = 'BLOCK.ID';
  ParamFileName     = 'SUPER.PRM';
  SuperCommandsCount = 4;
  SuperCommands: array[1..4] of str4 = ('ZW','ZD','ZV','ZA');
  CtrlC = ^C;
  Bs    = ^H;
  Tab   = ^I;
  Lf    = ^J;
  Cr    = ^M;
  CtrlS = ^S;
  F1    = 59;
  F2    = 60;
  sp80 = '
  DayOfWeek: String[21] = 'SunMonTueWedThuFriSat';
  Zel: array[1..12] of Integer = (1,4,3,6,1,4,6,2,5,0,3,5);
  BlockRecordSize = 4096;

{-----------------------------------------------------------------------------}

procedure OverText(Text: String;len: Integer); forward;

{
  Describe Error to Operator
}
procedure PrintError(Text: String);
begin
  if OpMode = TextOp then begin
    if whereX>1 then writeln;
    writeln('*** ',Text);
  end else begin
    MoveTo(3*8,24*14-2);
    OverText('*** '+Text,50);
  end;
end;

{-----------------------------------------------------------------------------}

{ include various files }
```

```
   {$i utility.inc}     { miscellaneous routines     }
   {$i keybrd.inc}      { keyboard routines          }
   {$i graph.inc}       { screen graphics routines   }
   {$i time.inc}        { date and time routines     }
   {$i zstage.inc}      { Z-stage elevator routines }
   {$i lctrl.inc}       { laser control routines     }

{-------------------------------------------------------------------------------}

function EofBlockFile: Boolean;
begin
  EofBlockFile := eof(BlockFile) and (BufIndex>=BlockNumRead);
end;

procedure OpenFiles;
label EasyLayer;
begin
  { look for either a .R or .L control file }
  if LayerCtrl then goto EasyLayer;
  assign(ControlFile,PartName+'.R');
  {$I-}
  reset(ControlFile);
  if IOresult=0 then begin
    if eof(ControlFile) then begin
      SystemError('Error: Control File '+PartName+'.R empty.');
      halt(6);
    end;
  end else begin
EasyLayer:
    assign(ControlFile,PartName+'.L');
    reset(ControlFile);
    if IOresult<>0 then begin
      SystemError('No Control File for part '+PartName);
      halt(5);
    end else begin
      if eof(ControlFile) then begin
        SystemError('Error: Control File '+PartName+'.L empty.');
        halt(7);
      end else LayerCtrl := true;
    end;
  end;
    { look for the vector file }
  assign(BlockFile,PartName+'.V');
  reset(BlockFile,1);
  if IOresult<>0 then begin
    CantOpen(PartName+'.V');
    halt(8);
  end;
  if EofBlockFile then begin
    SystemError('Error: '+PartName+'.V empty.');
    halt(9);
  end;
  {$I+}
end;

procedure ParseControlLineComments;
begin
  if (length(ControlLine)>0) and (copy(ControlLine,1,6)='!MERGE') then begin
    i := pos('-STARTLAYER ',ControlLine);
    if (i>0) and (StartZ=0)
      then StartZ := LongVal(copy(ControlLine,i+12,5),dummy);
    i := pos('-ENDLAYER ',ControlLine);
    if (i>0) and (EndZ=65535)
      then EndZ := LongVal(copy(ControlLine,i+10,5),dummy);
    i := pos('-NUMLAYERS ',ControlLine);
```

```
    if (i>0) and (NumLayers=65535)
      then NumLayers := LongVal(copy(ControlLine,i+11,5),dummy);
  end;
end;

procedure GetLayerControlLine;
begin
  repeat
    if eof(ControlFile) then begin
      ControlLine := '';
      SameBlock := false;
      exit;
    end;
    readln(ControlFile,ControlLine);
    ParseControlLineComments;
  until (length(ControlLine)>0) and (ControlLine[1]<>'!');
  ControlIndex := 1;
  UnitValInt(ControlLayer,ControlLine,ControlIndex);
  UnitStr(ControlType,ControlLine,ControlIndex);
  SameBlock := (BlockLayer = ControlLayer) and (BlockType = ControlType);
{  writeln(SameBlock,' CLayer=',ControlLayer,' CType=',ControlType,' CLine=',Contr
end;

procedure GetRangeControlLine;
begin
  repeat
    if eof(ControlFile) then begin
      ControlLine := '';
      exit;
    end;
    readln(ControlFile,ControlLine);
    ParseControlLineComments;
  until (length(ControlLine)>0) and (ControlLine[1]<>'!');
end;

procedure ReadRange;
var
  Index,p: Integer;
  AtEnd: Boolean;
begin
  Index := 1;
  UnitValInt      (RangeZStart,   ControlLine,Index);
  UnitValInt      (RangeZEnd,     ControlLine,Index);
  UnitValShortInt(RangeZSpace,   ControlLine,Index);
  UnitValShortInt(RangeCureDepth,ControlLine,Index);
  AtEnd := false;
  BlockCount := 0;
  repeat
    GetRangeControlLine;
    if (ControlLine='') or (ControlLine[1] in ['0'..'9']) then AtEnd := true
    else begin
      inc(BlockCount);
      p := pos(',',ControlLine);
      if p=0 then p := length(ControlLine)+1;
      BlockTypes[BlockCount] := copy(ControlLine,1,p-1);
      BlockCmds [BlockCount] := NoQuotes(copy(ControlLine,p+1,255));
    end;
  until AtEnd;
end;

procedure ReSeekBlockFile;
begin
  if BlockFileLoc > FileSize(BlockFile)
    then BlockFileLoc := FileSize(BlockFile);  { force eof condition }
  Seek(BlockFile,BlockFileLoc);
  BlockRead(BlockFile,BlockBuf,BlockRecordSize,BlockNumRead);
```

```
  BufIndex := 1;
end;

function GetBlockCh: Char;
begin
  if not EofBlockFile then begin
    GetBlockCh := BlockBuf[BufIndex];
    inc(BufIndex);
    inc(BlockFileLoc);
    if BufIndex>BlockNumRead then begin
      BufIndex := 1;
      BlockRead(BlockFile,BlockBuf,BlockRecordSize,BlockNumRead);
    end;
  end;
end;

procedure GetBlockLine;
var
  Ch: Char;
  store: Integer;
begin
  repeat
    BlockLine := '';
    if EofBlockFile then begin
      SameBlock := false;
      exit;
    end;
    Ch := GetBlockCh;
    BlockLine[1] := Ch;
    store := 2;
    while (not EofBlockFile) and (Ch<>Cr) do begin
      Ch := GetBlockCh;
      BlockLine[store] := Ch;
      inc(store);
    end;
    BlockLine[0] := chr(store);
    { throw away line-feed }
    if not EofBlockFile then Ch := GetBlockCh;
    if BlockLine[1] in ['A'..'Z'] then begin
      BlockIndex := 1;
      UnitStr(BlockType,BlockLine,BlockIndex);
      UnitValInt(BlockLayer,BlockLine,BlockIndex);
    end;
  until (length(BlockLine)>0) and (BlockLine[1]<>'!');
  SameBlock := (BlockLayer = ControlLayer) and (BlockType = ControlType);
{  writeln(SameBlock,' BLayer=',BlockLayer,' BType=',BlockType,' BLine=',BlockLine
end;

procedure BlockSkip;
var
  Ch: Char;
  i,NumRead: Integer;
  Match: str10;
  SkipBuf: String;
begin
  Match := Lf+'L';
  while (BlockLayer < StartZ) and not EofBlockFile do begin
    Seek(BlockFile,BlockFileLoc);
    BlockRead(BlockFile,SkipBuf[1],255,NumRead);
    i := pos(Match,SkipBuf);
    SkipBuf[0] := chr(255);
    while (i=0) and not(eof(BlockFile) or keypressed) do begin
      inc(BlockFileLoc,NumRead);
      move(SkipBuf[236],SkipBuf[1],20);
      BlockRead(BlockFile,SkipBuf[20],235,NumRead);
      if keypressed then HandleKeyboardRequest;
```

```
      i := pos(Match,SkipBuf);
      if i>0 then dec(i,19);
    end;
    if i>0 then inc(BlockFileLoc,i)
    else BlockFileLoc := FileSize(BlockFile);
    ReSeekBlockFile;
    GetBlockLine;
    if keypressed then HandleKeyboardRequest;
  end;
end;

{-------------------------------------------------------------------------------

  Send Supervisor execute command to the Stereo driver
}
procedure LaserExecute;
begin
  ShowError(STEREO('EX;CL;EC;EC'));
  BlockSize := 0;
end;

{-------------------------------------------------------------------------------

  Send Supervisor laser control command to the Stereo driver
}
procedure SendLaserCommand(cmd: String);
begin
  ShowError(STEREO(cmd));
  BlockSize := BlockSize + QSize;
  if BlockSize > MaxBlockSize then LaserExecute;
end;

{-------------------------------------------------------------------------------

  Pick Out and Execute SUPER-specific Command
}
procedure PickOutSuperCommand(var cmd: String);
var
  op: str4;
  k,index: Integer;
  arg: Real;
begin
  repeat
    op := upper(copy(cmd,1,2));
    index := 1;
    while (index<=SuperCommandsCount) and (pos(SuperCommands[index],op)=0)
      do inc(index);
    if index<=SuperCommandsCount then begin
      k := 3;
      while (k<length(cmd)) and (cmd[k]<>';') do inc(k);
      inc(k);
      arg := RealVal(copy(cmd,3,k-3),code);
      case index of
        1: {ZWait}  RelaxationTime := trunc(arg);
        2: {ZDepth} DipDepth       := arg;
        3: {ZVeloc} ZTableVeloc    := arg;
        4: {ZAccel} ZTableAccel    := arg;
      end;
      cmd := copy(cmd,k,199);
    end;
  until index > SuperCommandsCount;
end;

{-------------------------------------------------------------------------------

  Process both SUPER and STEREO commands
```

```
  SUPER and STEREO commands are broken apart and executed in the proper
  sequence, but by the two different programs.
}
procedure ProcessCommands(cmd: String);
var
  OrgCmd: String;
  i,j,SuperIndex: Integer;
begin
  cmd := upper(cmd);
  repeat
    OrgCmd := cmd;
    i := length(OrgCmd) + 1;
    for j:=1 to SuperCommandsCount do begin
      SuperIndex := pos(SuperCommands[j],OrgCmd);
      if (SuperIndex > 0) and (SuperIndex < i) then i := SuperIndex;
    end;
    cmd := copy(OrgCmd,1,i-1);
    if length(cmd)>0 then SendLaserCommand(cmd);
    cmd := copy(OrgCmd,i,255);
    if length(cmd)>0 then PickOutSuperCommand(cmd);
  until length(cmd)=0;
end;

{---------------------------------------------------------------------------

  Sort four numbers in Member array
  for ReadLayerBox, PointInBox routines
}
procedure QuadSort;
var
  temp: Word;
  QuadSortFlag: Boolean;
  QuadSortI: Integer;
begin
  QuadSortFlag := true;
  while QuadSortFlag do begin
    QuadSortFlag := false;
    for QuadSortI := 1 to 3 do begin   { quit if no swaps }
      if Member[QuadSortI] > Member[QuadSortI+1] then begin
        temp := Member[QuadSortI];    { swap two values }
        Member[QuadSortI] := Member[QuadSortI+1];
        Member[QuadSortI+1] := temp;
        QuadSortFlag := true;
      end;
    end;
  end;
end;

{---------------------------------------------------------------------------

  See if a point is in the critical area box
}
function PointInBox(index: Integer;XA,YA: Word): Boolean;
begin
  if (XA >= MinX[index]) and (XA <= MaxX[index])
    and (YA >= MinY[index]) AND (YA <= MaxY[index]) then PointInBox := true
  else PointInBox := false;
end;

{---------------------------------------------------------------------------

  See if both points are in a critical area box
}
function QualifyRivet: Boolean;
begin
```

```
  QualifyRivet := false;
  for BoxIndex:=1 to BoxCount do
    if PointInBox(BoxIndex,x1,y1) and PointInBox(BoxIndex,x2,y2) then begin
      QualifyRivet := true;
      exit;
    end;
end;

{
  Read critical area box for layer
}
procedure ReadLayerBox;
var
  i: Integer;
  Box_X1,Box_Y1,Box_X2,Box_Y2,Box_X3,Box_Y3,Box_X4,Box_Y4: Real;
begin
  inc(BoxCount);
  i := 4;
  if ControlType[i]=' ' then inc(i);
  UnitStr(BoxType[BoxCount],ControlLine,ControlIndex);
  UnitVal(Box_X1,ControlLine,ControlIndex);
  UnitVal(Box_Y1,ControlLine,ControlIndex);
  UnitVal(Box_X2,ControlLine,ControlIndex);
  UnitVal(Box_Y2,ControlLine,ControlIndex);
  UnitVal(Box_X3,ControlLine,ControlIndex);
  UnitVal(Box_Y3,ControlLine,ControlIndex);
  UnitVal(Box_X4,ControlLine,ControlIndex);
  UnitVal(Box_Y4,ControlLine,ControlIndex);
  i := BoxCount;
  if XYScale<>1.000 then begin
    BoxX1[i] := trunc(Box_X1 * XYScale);
    BoxY1[i] := trunc(Box_Y1 * XYScale);
    BoxX2[i] := trunc(Box_X2 * XYScale);
    BoxY2[i] := trunc(Box_Y2 * XYScale);
    BoxX3[i] := trunc(Box_X3 * XYScale);
    BoxY3[i] := trunc(Box_Y3 * XYScale);
    BoxX4[i] := trunc(Box_X4 * XYScale);
    BoxY4[i] := trunc(Box_Y4 * XYScale);
  end else begin
    BoxX1[i] := trunc(Box_X1);
    BoxY1[i] := trunc(Box_Y1);
    BoxX2[i] := trunc(Box_X2);
    BoxY2[i] := trunc(Box_Y2);
    BoxX3[i] := trunc(Box_X3);
    BoxY3[i] := trunc(Box_Y3);
    BoxX4[i] := trunc(Box_X4);
    BoxY4[i] := trunc(Box_Y4);
  end;

  Member[1] := BoxX1[i];   { need box X-axis min and max }
  Member[2] := BoxX2[i];
  Member[3] := BoxX3[i];
  Member[4] := BoxX4[i];
  QuadSort;
  MinX[i] := Member[1];
  MaxX[i] := Member[4];

  Member[1] := BoxY1[i];   { need box Y-axis min and max }
  Member[2] := BoxY2[i];
  Member[3] := BoxY3[i];
  Member[4] := BoxY4[i];
  QuadSort;
  MinY[i] := Member[1];
  MaxY[i] := Member[4];
end;
```

```
{---------------------------------------------------------------------------}

{
  Find Block Type in ParBlockType array.  If there, send the corresponding
  ParStereoDef default string to Stereo.
}
procedure SetBlockDefaults;
begin
  i := 1;
  while (ParBlockType[i]<>ControlType) and (i<=ParCount) do inc(i);
  if i<=ParCount then
    ProcessCommands(ParStereoDef[i]);
end;

{---------------------------------------------------------------------------}

procedure GraphVector;
var
  grx1,grx2,gry1,gry2,temp: Word;
begin
  if NegX then begin
    grx1 := round((65535-x1-XOffset-GrMinX)/GrDeltaX*(77-45)*8);
    grx2 := round((65535-x2-XOffset-GrMinX)/GrDeltaX*(77-45)*8);
  end else begin
    grx1 := round((x1+XOffset-GrMinX)/GrDeltaX*(77-45)*8);
    grx2 := round((x2+XOffset-GrMinX)/GrDeltaX*(77-45)*8);
  end;
  if NegY then begin
    gry1 := round((65535-y1-YOffset-GrMinY)/GrDeltaY*(22-9)*14);
    gry2 := round((65535-y2-YOffset-GrMinY)/GrDeltaY*(22-9)*14);
  end else begin
    gry1 := round((y1+YOffset-GrMinY)/GrDeltaY*(22-9)*14);
    gry2 := round((y2+YOffset-GrMinY)/GrDeltaY*(22-9)*14);
  end;
  if SwapXY then begin
    temp := grx1;
    grx1 := gry1;
    gry1 := temp;
    temp := grx2;
    grx2 := gry2;
    gry2 := temp;
  end;
  SetViewPort(45*8+4,9*14+4,77*8+4,22*14+4,true);
  Line(grx1,gry1,grx2,gry2);
  SetViewPort(0,0,GetMaxX,GetMaxY,true);
end;

procedure DrawVector;
begin
  SendLaserCommand('JX'+WordStr(x1+XOffset)+';JY'+WordStr(y1+YOffset)
    +';NX'+WordStr(x2+XOffset)+';NY'+WordStr(y2+YOffset));
  if OpMode=GraphicsOp then GraphVector;
end;

{---------------------------------------------------------------------------}

procedure DrawSectionRivet;
begin
  if QualifyRivet then begin
  { Box Type I skips }
    if BoxType[BoxIndex]='XI' then exit;   { Skip hatch }
    if BoxType[BoxIndex]='XV' then begin
      SendLaserCommand('JX'+WordStr(x1+XOffset)+';JY'+WordStr(y1+YOffset)
        +';VX'+WordStr(x2+XOffset)+';VY'+WordStr(y2+YOffset));
      if OpMode=GraphicsOp then GraphVector;
    end;
```

```
  end else DrawVector;
end;

{----------------------------------------------------------------------------}

procedure DrawSkinRivet;
begin
  if QualifyRivet then begin
  { Box Type I skips }
    if BoxType[i]='SI' then exit;   { Skip hatch }
    if BoxType[i]='SV' then begin
      SendLaserCommand('JX'+WordStr(x1+XOffset)+';JY'+WordStr(y1+YOffset)
        +';VX'+WordStr(x2+XOffset)+';VY'+WordStr(y2+YOffset));
      if OpMode=GraphicsOp then GraphVector;
    end;
  end else DrawVector;
end;

{============================================================================

  BLOCK PROCESSING ROUTINES:                    SLICE

  ZBlock:  Section Border                        V1
  XBlock:  Section X Hatching                    V1
  YBlock:  Section Y Hatching                    V1
  IBlock:  Section Angle Hatching                V18    8/26/87
  SBlock:  Up Facing Skin Border                 V17    8/25/87
  HBlock:  Up Facing Skin X Fill                 V17
  VBlock:  Up Facing Skin Y Fill                 V17
  ABlock:  Up Facing Skin X Hatch                V17
  BBlock:  Up Facing Skin Y Hatch                V17
  JBlock:  Up Facing Skin Angle Hatch            V18
  CBlock:  Down Facing Skin Border               V17
  DBlock:  Down Facing Skin X Fill               V17
  EBlock:  Down Facing Skin Y Fill               V17
  FBlock:  Down Facing Skin X Hatch              V17
  GBlock:  Down Facing Skin Y Hatch              V17
  KBlock:  Down Facing Skin Angle Hatch          V18

  - New Mnemonic Set -

  BlockL     -  Layer id (no vectors)            V19    9/25/87
  BlockLB    -  Layer Border                     V19
  BlockLH    -  Layer Hatch                      V19
  BlockFUF   -  Flat Up skin Fill                V19
  BlockNFUB  -  Near-Flat Up skin Border         V19a   9/28/87
  BlockNFUF  -  Near-Flat Up skin Fill           V19
  BlockFDF   -  Flat Down skin Fill              V19
  BlockNFDB  -  Near-Flat Down skin Border       V19
  BlockNFDH  -  Near-Flat Down skin Hatch        V19
  BlockNFDF  -  Near-Flat Down skin Fill         V19
  BlockFUB   -  Near-Flat Down skin Fill         V20    12/4/87
  BlockFDB   -  Near-Flat Down skin Fill         V20

----------------------------------------------------------------------------}

procedure HandleBlockVector(BlockType: Integer);
begin
  case BlockType of
     1: DrawVector;           {ZBlock}
     2: DrawSectionRivet;     {XBlock}
     3: DrawSectionRivet;     {YBlock}
     4: DrawSectionRivet;     {IBlock}
     5: DrawVector;           {SBlock}
     6: DrawVector;           {HBlock}
     7: DrawVector;           {VBlock}
```

```
    8: DrawSkinRivet;       {ABlock}
    9: DrawSkinRivet;       {BBlock}
   10: DrawSkinRivet;       {JBlock}
   11: DrawVector;          {CBlock}
   12: DrawVector;          {DBlock}
   13: DrawVector;          {EBlock}
   14: DrawSkinRivet;       {FBlock}
   15: DrawSkinRivet;       {GBlock}
   16: DrawSkinRivet;       {KBlock}
   20: ;                    {BlockL}
   21: DrawVector;          {BlockLB}
   22: DrawSectionRivet;    {BlockLH}
   23: DrawSkinRivet;       {BlockFUF}
   24: DrawVector;          {BlockNFUB}
   25: DrawSkinRivet;       {BlockNFUF}
   26: DrawSkinRivet;       {BlockFDF}
   27: DrawVector;          {BlockNFDB}
   28: DrawSkinRivet;       {BlockNFDH}
   29: DrawSkinRivet;       {BlockNFDF}
   30: DrawVector;          {BlockFUB}
   31: DrawVector;          {BlockFDB}
  end;
end;


{---------------------------------------------------------------------------}

{
  Break apart input line into two coordinates - (x1,y1) and (x2,y2)
}
procedure GetCoords;
var x_1,y_1,x_2,y_2: Real;
begin
  BlockIndex := 1;
  UnitVal(x_1,BlockLine,BlockIndex);
  UnitVal(y_1,BlockLine,BlockIndex);
  UnitVal(x_2,BlockLine,BlockIndex);
  UnitVal(y_2,BlockLine,BlockIndex);
  if XYScale<>1.000 then begin
    x1 := trunc(x_1 * XYScale);
    y1 := trunc(y_1 * XYScale);
    x2 := trunc(x_2 * XYScale);
    y2 := trunc(y_2 * XYScale);
  end else begin
    x1 := trunc(x_1);
    y1 := trunc(y_1);
    x2 := trunc(x_2);
    y2 := trunc(y_2);
  end;
end;

{
  Process block entries until a new layer block header appears
}
procedure ProcessBlockByLayer;
var
  n,ProcI,Ofs: Integer;
  Ctrl: str10;
  OrgSameBlock,BlockHadVectorsFlag: Boolean;
  OrgBlockLayer: Word;
  OrgBlockType: str10;
begin
  { will return at end of block }
  n := 2;
  while (n<length(ControlType)) and not(ControlType[n] in ['0'..'9'])
    do inc(n);
```

```
ProcI := 0;
if n=2 then ProcI:=pos(ControlType[1],BlockIdentifiers);
if ProcI=0 then begin
  Ctrl := copy(ControlType,1,n-1);
  for j:=1 to BlockMnemonicsCount do
    if Ctrl = BlockMnemonics[j] then ProcI := 19+j;   { start at 20 }
end;
if ProcI>0 then begin
  if OpMode=TextOp then write(ControlType,' ')
  else begin
    MoveTo(28*8,13*14);
    OverText(ControlType,5);
  end;
  SetBlockDefaults;
  ProcessCommands(NoQuotes(copy(ControlLine,ControlIndex,199)));
  VPosition := BlockFileLoc;
  OrgSameBlock := SameBlock;
  OrgBlockLayer := BlockLayer;
  OrgBlockType := BlockType;
  for Ofs:=1 to NumOffsets do begin
    if Ofs>1 then begin
      BlockFileLoc := VPosition;
      ReSeekBlockFile;
    end;
    XOffset := Offsets[Ofs-1,1];
    YOffset := Offsets[Ofs-1,2];
    SameBlock := OrgSameBlock;
    BlockLayer := OrgBlockLayer;
    BlockType := OrgBlockType;
    BlockHadVectorsFlag := false;
    while SameBlock do begin
      GetBlockLine;
      if SameBlock then begin
        BlockHadVectorsFlag := true;
        GetCoords;
        HandleBlockVector(ProcI);
      end;
    end;
    if BlockHadVectorsFlag then LaserExecute;
  end;
 end else
  Message('Unrecognized block type '+BlockType+' in layer '+WordStr(Layer));
end;

procedure ScanAndSendCommands(block: str6);
var
  i,len: Integer;
begin
  len := 0;
  i := 1;
  while (ParBlockType[i]<>block) and (i<=ParCount) do inc(i);
  if i<=ParCount then begin
    ProcessCommands(ParStereoDef[i]);
    inc(len,length(ParStereoDef[i]));
  end;
  i := 1;
  while (BlockTypes[i]<>block) and (i<=BlockCount) do inc(i);
  if i<=BlockCount then begin
    ProcessCommands(BlockCmds[i]);
    inc(len,length(BlockCmds[i]));
  end;
  if len > 0 then LaserExecute;
end;

{
  Process block entries until a new block entry appears
```

```
}
procedure ProcessBlockByRange;
var
  n,ProcI,Ofs: Integer;
  Ctrl: str10;
  OrgSameBlock,BlockHadVectorsFlag: Boolean;
  OrgBlockLayer: Word;
  OrgBlockType: str10;
begin
  { will return at end of vector block }
  n := 2;
  while (n<length(BlockType)) and not(BlockType[n] in ['0'..'9'])
    do inc(n);
  ProcI := 0;
  if n=2 then ProcI:=pos(BlockType[1],BlockIdentifiers);
  if ProcI=0 then begin
    Ctrl := copy(BlockType,1,n-1);
    for j:=1 to BlockMnemonicsCount do
      if Ctrl = BlockMnemonics[j] then ProcI := 19+j;   { start at 20 }
  end;
  if ProcI>0 then begin
    if OpMode=TextOp then write(BlockType,' ')
    else begin
      MoveTo(28*8.13*14);
      OverText(BlockType,5);
    end;
    ScanAndSendCommands(BlockType);
    VPosition := BlockFileLoc;
    ControlType := BlockType;
    OrgSameBlock := (BlockLayer = ControlLayer) and (BlockType = ControlType);
    OrgBlockLayer := BlockLayer;
    OrgBlockType := BlockType;
    for Ofs:=1 to NumOffsets do begin
      if Ofs>1 then begin
        BlockFileLoc := VPosition;
        ReSeekBlockFile;
      end;
      XOffset := Offsets[Ofs-1,1];
      YOffset := Offsets[Ofs-1,2];
      SameBlock := OrgSameBlock;
      BlockLayer := OrgBlockLayer;
      BlockType := OrgBlockType;
      BlockHadVectorsFlag := false;
      while SameBlock and not EofBlockFile do begin
        GetBlockLine;
        if SameBlock then begin
          BlockHadVectorsFlag := true;
          GetCoords;
          HandleBlockVector(ProcI);
        end;
      end;
      if BlockHadVectorsFlag then LaserExecute;
    end;
  end else
    Message('Unexpected block type '+BlockType+' in layer '+WordStr(Layer));
end;

{-----------------------------------------------------------------------------

  Supervisor dip Z-table routines

}
procedure DelayControl(DelayTime: Integer);
var
  key: Char;
  ScreenH: Integer;
```

```
  line: String;
  NewZ: Word;
begin
  ScreenH := whereX;
  DeltaSecs := 0;
  GetTime;
  SaveSec := Sec + 60*Minu + 3600*Hour;
  MoveOnFlag := false;
  SkipFlag   := false;
  PauseFlag  := false;
  while (DeltaSecs < DelayTime) and not MoveOnFlag do begin
    WaitTest;
    if keypressed then begin
      key := upcase(ReadKey);
      case key of
        #0: begin
              key := ReadKey;
              if OpMode = GraphicsOp then begin
                if ord(key) = F1 then SetVisualPage(0)
                else if ord(key) = F2 then SetVisualPage(1);
              end;
            end;
        CtrlS: key := ReadKey;
        CtrlC: Abort;
        'P': PauseFlag  := not PauseFlag;
        'C': begin
               MoveOnFlag := true;    { force exit }
               PauseFlag  := false;
             end;
        'S': begin
               MoveOnFlag := true;
               SkipFlag   := true;
               PauseFlag  := false;
             end;
      end;
    end;
    if DeltaSecs <> OldDeltaSecs then begin
      OldDeltaSecs := DeltaSecs;
      temp := IntStr(DelayTime-DeltaSecs);
      if PauseFlag then temp := temp + '-P '
      else temp := temp + '   ';
      if OpMode=TextOp then begin
        gotoxy(ScreenH,whereY);
        write(temp);
      end else begin
        MoveTo(73*8,7*14);
        OverText(temp,5);
      end;
    end;
  end;  {while}
  gotoxy(ScreenH,whereY);
  if PauseFlag then temp := '0-P  ' else temp := '0    ';
  if OpMode=TextOp then begin
    gotoxy(ScreenH,whereY);
    write(temp);
  end else begin
    MoveTo(73*8,7*14);
    OverText(temp,5);
  end;
  if PauseFlag then begin   { handle pause }
    Action('PAUSED');
    if OpMode=GraphicsOp then begin
      MoveTo(3*8,24*14-2);
      OutText('Supervisor paused.  Press any key to continue...');
    end;
    key := ReadKey;
```

```
    PauseFlag := false;
    if OpMode=GraphicsOp then begin
      MoveTo(3*8,24*14-2);
      OverText('',50);
    end;
  end;
  if (OpMode=TextOp) and (whereX>1) then writeln;
  if SkipFlag then begin   { handle layer skip }
    if OpMode=TextOp then begin
      write('Skip to what Z layer? ');
      readln(line);
    end else begin
      MoveTo(3*8,24*14-2);
      OutText('Skip to what Z layer? ');
      line := GetInput(8);
      MoveTo(3*7,24*14-2);
      OverText('',30);
      Action('SKIPPING');
    end;
    if length(line)>0 then begin
      NewZ := LongVal(line,code);
      if NewZ>0 then StartZ := NewZ;
    end;
  end;
end;

procedure DipAndWait;
var
  clean: Boolean;
begin
  if whereX>1 then writeln;
  Action('WAITING');
  clean := false;
{ Textmode(c80); }
  repeat
    SendLaserCommand('WI 1000');   { wait for background laser control to idle }
{    write(' kp=',keypressed); }
    if keypressed then HandleKeyboardRequest
      else clean := true;
{    write(' c=',clean); }
  until clean;
{ write(' exited...'); key := readkey; }
  ZMove('MN H+ V' + RealStr(int(ZTableVeloc*10000.0)/10000,3)
    + ' A' + RealStr(int(ZTableAccel*10000.0)/10000,3));

  if Demo then begin
    Action('SURFACING');
    FormatZCommand(-PartHeight);
    DelayControl(OutOfVatDelay);
    if SkipFlag then exit;
    FormatZCommand(PartHeight);
    delay(100);
    WaitForIdleZStage;   { wait for Z-stage to stop moving }
  end;
  Action('DIPPING');
  FormatZCommand(DipDepth);
  if Demo then FormatZCommand(-DipDepth)
  else begin
    if FirstLayer then begin
      FormatZCommand(Thickness-DipDepth);
      FirstLayer := false;
    end else if ZSpacing <> 0 then
      FormatZCommand((ControlLayer-Layer)/ZSpacing * Thickness - DipDepth);
  end;

  Action('RELAXING');
```

```
  if OpMode=GraphicsOp then begin
    MoveTo(67*8,7*14);
    OutText('TIME: '+WordStr(RelaxationTime));
    DelayControl(RelaxationTime);
    MoveTo(66*8,7*14);
    OverText('',10);
  end else DelayControl(RelaxationTime);
end;

{-----------------------------------------------------------------------------}

procedure HandleHeader(Line: String);
var
  Index: Integer;
begin
  Index := 2;
  while (Index<length(Line)) and (Line[Index]=' ')
    do inc(Index);
  UnitVal(SliceRes,Line,Index);
  UnitVal(ZSpacing,Line,Index);
  UnitVal(Thickness,Line,Index);
end;

procedure DetermineNumLayers;
var
  i: Integer;
  range: LongInt;
begin
  i := 1;
  range := ZStart[1];
  LayersToBuild := 0;
  while (i <= RangeCount) and (range <= EndZ) do begin
    if range >= StartZ then inc(LayersToBuild);
    if ZSpace[i]>0 then inc(range,ZSpace[i])
      else inc(range);
    if range > ZEnd[i] then begin
      inc(i);
      range := ZStart[i];
    end;
  end;
end;

procedure DriveByLayers;
begin
{
   determines the next block to execute
   can skip blocks on specific layers
   handles dipping, setting of critical areas, screen updates
}
  while (ControlLine <> '') and (ControlLayer <= EndZ) do begin
    if ControlLayer < StartZ then begin
      BlockSkip;
      GetLayerControlLine;
     end else if ControlType='#TOP' then begin
      if DipFlag then begin
        DipAndWait;
        DipFlag := false;
      end;
      if not SkipFlag then begin
        Layer := ControlLayer;
        if OpMode=TextOp then write(Layer,': ')
        else begin
          MoveTo(14*8,13*14);
          OverText(WordStr(Layer),5);
          SetViewPort(45*8+4,9*14+4,77*8+4,22*14+4,true);
          ClearViewPort;
```

```
          SetViewPort(0,0,GetMaxX,GetMaxY,true);
          MoveTo(7*8,7*14);
          inc(LayerCount);
          if LayersToBuild < 65535 then
            OverText(WordStr(LayerCount)+' OF '+WordStr(LayersToBuild),13)
              else OverText(WordStr(LayerCount),13);
        end;
        Action('DRAWING');
        SetBlockDefaults;
        cmd := NoQuotes(copy(ControlLine,ControlIndex,199));
        if length(cmd)>0 then begin
          ProcessCommands(cmd);
          LaserExecute;
        end;
        BoxCount := 0;   { no layer boxes }
      end;
      SkipFlag := false;
      GetLayerControlLine;
    end else if ControlType='#BTM' then begin
      SetBlockDefaults;
      cmd := NoQuotes(copy(ControlLine,ControlIndex,199));
      if length(cmd)>0 then begin
        ProcessCommands(cmd);
        LaserExecute;
      end;
      DipFlag := true;
      GetLayerControlLine;
    end else if copy(ControlType,1,3)='#CA' then begin
      ReadLayerBox;
      GetLayerControlLine;
{ will skip blocks for those *.L block entries edited out }
    end else begin
      if SameBlock then begin
        ProcessBlockByLayer;
        GetLayerControlLine;
      end else GetBlockLine;
    end;
  end;
end;

procedure DriveByRanges;
begin
{
   utilizes range information
   can't skip blocks on specific layers
   doesn't support critical areas
   handles dipping, screen updates
}
  while (not EofBlockFile) and (BlockLayer <= EndZ) do begin
    if BlockLayer > RangeZEnd then ReadRange;
    if BlockLayer < StartZ then begin
      BlockSkip;
      DetermineNumLayers;   { adjust layer m of n values }
      inc(LayersToBuild,LayerCount);
    end else begin
      ControlLayer := BlockLayer;  { dip based on ControlLayer - Layer }
      if DipFlag then begin
        DipAndWait;
        DipFlag := false;
      end;
      if BlockLayer >= StartZ then begin
        Layer := ControlLayer;
        if OpMode=TextOp then write(Layer,': ')
        else begin
          MoveTo(14*8,13*14);
          OverText(WordStr(Layer),5);
```

```
          SetViewPort(45*8+4,9*14+4,77*8+4,22*14+4,true);
          ClearViewPort;
          SetViewPort(0,0,GetMaxX,GetMaxY,true);
          MoveTo(7*8,7*14);
          inc(LayerCount);
          if LayersToBuild < 65535 then
            OverText(WordStr(LayerCount)+' OF '+WordStr(LayersToBuild),13)
              else OverText(WordStr(LayerCount),13);
        end;
        Action('DRAWING');
        ScanAndSendCommands('#TOP');
        while (ControlLayer = BlockLayer) and not EofBlockFile
          do ProcessBlockByRange;
        ScanAndSendCommands('#BTM');
        DipFlag := true;
      end;
    end;
  end;
end;

procedure PartMake;
var
  cmd: String;
begin
  if NumOffsets > 1 then
    writeln(IntStr(NumOffsets),' multiples being made at once.');
  writeln;
  SendLaserCommand('HR;MD BL +');
  FirstLayer := true;
  repeat
    LayerCount := 0;
    SendLaserCommand('CL;EC');
    BlockSize := 0;

{
   read table headers
}
    if LayerCtrl then begin
      repeat
        GetLayerControlLine;
        if ControlLine[1]='*' then HandleHeader(ControlLine);
      until ControlLine[1]<>'*';
      LayersToBuild := NumLayers;
    end else begin
      RangeCount := 0;
      ControlLine := 'BEGIN';
      while ControlLine<>'' do begin   { read all ranges in }
        GetRangeControlLine;
        if ControlLine[1]='*' then HandleHeader(ControlLine);
        if ControlLine[1] in ['0'..'9'] then begin
          inc(RangeCount);
          Index := 1;
          UnitValInt      (ZStart    [RangeCount],ControlLine,Index);
          UnitValInt      (ZEnd      [RangeCount],ControlLine,Index);
          UnitValShortInt(ZSpace    [RangeCount],ControlLine,Index);
          UnitValShortInt(CureDepth[RangeCount],ControlLine,Index);
        end;
      end;
      close(ControlFile);
      DetermineNumLayers;   { determine # of layers from range data }
      reset(ControlFile);
      repeat
        GetRangeControlLine;
      until (ControlLine='') or (ControlLine[1]<>'*');
      ReadRange;   { load in block data for first range }
      Layer := ZStart[1];
```

```
    end;

    BufIndex      := 1;
    BlockFileLoc  := 0;
    BlockRead(BlockFile,BlockBuf,BlockRecordSize,BlockNumRead);
    repeat
      GetBlockLine;
      if BlockLine[1]='*' then HandleHeader(BlockLine);
    until BlockLine[1]<>'*';
    Layer := -1;

{
  update Action Screen
}
    if OpMode=GraphicsOp then begin
      MoveTo(1*8,7*14);
      if LayersToBuild<65535 then OutText('LAYER 1 OF '+WordStr(LayersToBuild))
        else OutText('LAYER 1');
      MoveTo(14*8,12*14);
      OutText(WordStr(StartZ));
      MoveTo(14*8,14*14);
      OutText(WordStr(EndZ));
    end;

    if LayerCtrl then DriveByLayers   { decide on control routine }
      else DriveByRanges;

    close(ControlFile);
    close(BlockFile);
    if Demo then OpenFiles;
  until not Demo;
end;

{-----------------------------------------------------------------------------}

procedure CheckForOptions(var cmd: string);
var
  i,oi,j: Integer;
begin
  cmd := upper(cmd);
  i := pos('/TEXT',cmd);    { check for /TEXT text operation }
  if i>0 then begin
    OpMode := TextOp;
    delete(cmd,i,5);
  end;
  i := pos('/START',cmd);   { check for /START Z-layer start }
  if i>0 then begin
    oi := i;
    inc(i,6);
    while (i<length(cmd)) and (cmd[i]=' ') do inc(i);
    j := FindStr(i,cmd,' /');
    val(copy(cmd,i,j-i),StartZ,code);
    delete(cmd,oi,j-oi);
  end;
  i := pos('/STOP',cmd);   { check for /END Z-layer end }
  if i>0 then begin
    oi := i;
    inc(i,5);
    while (i<length(cmd)) and (cmd[i]=' ') do inc(i);
    j := FindStr(i,cmd,' /');
    val(copy(cmd,i,j-i),EndZ,code);
    delete(cmd,oi,j-oi);
  end;
  i := pos('/SWAPXY',cmd);  { swap X & Y coordinates }
  if i>0 then begin
    SwapXY := true;
```

```
    delete(cmd,i,7);
  end;
  i := pos('/X',cmd);  { X-axis orientation }
  if i>0 then begin
    NegX := (cmd[i+2]='-');
    delete(cmd,i,3);
  end;
  i := pos('/Y',cmd);  { Y-axis orientation }
  if i>0 then begin
    NegY := (cmd[i+2]='-');
    delete(cmd,i,3);
  end;
  i := pos('/S',cmd);
  if i>0 then begin   { check for /S Show Stuff flag }
    ShowStuff := true;
    delete(cmd,i,2);
  end;
  i := pos('/ZOFF',cmd);   { check for /ZOFF No Z-Control flag }
  if i>0 then begin
    ZTableOff := true;
    delete(cmd,i,5);
  end;
  i := pos('/LOFF',cmd);   { check for /LOFF No Laser flag }
  if i>0 then begin
    LaserOff := true;
    delete(cmd,i,5);
  end;
  i := pos('/NEGZ',cmd);   { check for /NEGZ Neg-Z Stage flag }
  if i>0 then begin
    NegZStage := true;
    delete(cmd,i,5);
  end;
  i := pos('/HEIGHT',cmd);   { check for /HEIGHT flag }
  if i>0 then begin
    oi := i;
    inc(i,7);
    while (i<length(cmd)) and (cmd[i]=' ') do inc(i);
    j := FindStr(i,cmd,' /');
    val(copy(cmd,i,j-i),PartHeight,code);
    delete(cmd,oi,j-oi);
  end;
  i := pos('/DEMO',cmd);   { check for /DEMO flag }
  if i>0 then begin
    Demo := true;
    oi := i;
    inc(i,5);
    while (i<length(cmd)) and (cmd[i]=' ') do inc(i);
    j := FindStr(i,cmd,' /');
    val(copy(cmd,i,j-i),OutOfVatDelay,code);
    delete(cmd,oi,j-oi);
  end;
  i := pos('/LC',cmd);   { check for Layer Control option }
  if i>0 then begin
    LayerCtrl := true;
    delete(cmd,i,10);
  end;
end;

procedure ReadBlockIdFile;
var
  BlockIdFile: text;
  BlockIdLine: string;
  Group: Integer;
  Block: String;
begin
  BlockMnemonicsCount := 0;
```

```
  {$I-}
  assign(BlockIdFile,BlockIdFileName);
  reset(BlockIdFile);
  if IOresult<>0 then begin
    assign(BlockIdFile,HomeDirectory+'\'+BlockIdFileName);
    reset(BlockIdFile);
    if IOresult<>0 then begin
      writeln('Can''t find Block Id file.');
      halt(2);
    end;
  end;
  {$I+}
  while not eof(BlockIdFile) do begin
    readln(BlockIdFile,BlockIdLine);
    if (length(BlockIdLine)>0) and (BlockIdLine[1]<>'!') then begin
      index := 1;
      UnitValShortInt(Group,BlockIdLine,index);
      UnitStr(Block,BlockIdLine,index);
      if Group=0 then begin
        inc(BlockMnemonicsCount);
        BlockMnemonics[BlockMnemonicsCount] := upper(Block);
      end;
    end;
  end;
  close(BlockIdFile);
end;

procedure GetXOffsets(line: string);
begin
  NumXOffsets := 0;
  repeat
    Offsets[NumXOffsets,1] := LongVal(line,code);
    inc(NumXOffsets);
    j := FindStr(1,line,', ');
    if (j=length(line)+1) or (line[j]=' ') then exit;
    line := copy(line,j+1,199);
  until NumXOffsets>50;
end;

procedure GetYOffsets(line: string);
begin
  NumYOffsets := 0;
  repeat
    Offsets[NumYOffsets,2] := LongVal(line,code);
    inc(NumYOffsets);
    j := FindStr(1,line,', ');
    if (j=length(line)+1) or (line[j]=' ') then exit;
    line := copy(line,j+1,199);
  until NumYOffsets>50;
end;

procedure GetXY(line: String;var Xvar,Yvar: LongInt);
begin
  Xvar := LongVal(line,code);
  Yvar := LongVal(copy(line,code+1,255),code);
end;

procedure ReadSuperParamsFile;
var
  ParamFile: text;
  count: Integer;
  cmd,ParamLine: String;
begin
  {$I-}
  assign(ParamFile,ParamFileName);
  reset(ParamFile);
```

```
  if IOresult<>0 then begin
    assign(ParamFile,'C:\3DSYS\'+ParamFileName);
    reset(ParamFile);
    if IOresult<>0 then begin
      writeln('Can''t find Supervisor Parameter file.');
      halt(3);
    end;
  end;
  {$I+}
  count := 0;
  while (not eof(ParamFile)) and (count<=8) do begin
    readln(ParamFile,ParamLine);
    if (length(ParamLine)>0) and (ParamLine[1]<>'!') then begin
      case count of
        0: begin
             ParamOptions := upper(NoQuotes(ParamLine));
             if length(ParamOptions)=0 then ParamOptions := 'NONE';
             CheckForOptions(ParamLine);
           end;
        1: ZAddress := IntVal(ParamLine,code);
        2: ZPitch := RealVal(ParamLine,code);
        3: XYScale := RealVal(ParamLine,code);
        4: GetXOffsets(ParamLine);
        5: GetYOffsets(ParamLine);
        6: MaxBlockSize := IntVal(ParamLine,code);
        7: GetXY(ParamLine,GrMinX,GrMinY);
        8: GetXY(ParamLine,GrMaxX,GrMaxY);
      end;
      inc(count);
    end;
  end;
  NumOffsets := NumXOffsets;
  if NumOffsets > NumYOffsets then NumOffsets := NumYOffsets;
  ParCount := 0;
  while not eof(ParamFile) do begin
    cmd := '';
    repeat
      repeat
        if eof(ParamFile) then begin
          SystemError('Error - Unexpected end of SUPER.PRM file!');
          halt(4);
        end;
        readln(ParamFile,ParamLine);
        i := 1;   { clean up input, zap some white space }
        while (i<length(ParamLine)) and (ParamLine[i] in [Tab,' ']) do inc(i);
        delete(ParamLine,1,i-1);
      until (length(ParamLine)>0) and (ParamLine[1]<>'!');
      j := pos('!',ParamLine);
      if j>0 then begin
        dec(j);
        while (j>0) and (ParamLine[j] in [Tab,' ']) do dec(j);
        delete(ParamLine,j+1,199);
      end;
      cmd := cmd + ParamLine;
    until cmd[length(cmd)]<>';';
    inc(ParCount);
    i := FindStr(1,cmd,',');
    ParBlockType[ParCount] := copy(cmd,1,i-1);
    ParStereoDef[ParCount] := NoQuotes(copy(cmd,i+1,199));
  end;
  close(ParamFile);
end;

procedure ShowFiles(FileSpec: string);
var
  FileCount: Integer;
```

```
  DirInfo: SearchRec;
begin
  FileCount := 0;
  FindFirst(FileSpec,AnyFile,DirInfo);
  if DosError<>0 then writeln('- none -')
  else begin
    while DosError=0 do begin
      if FileCount>0 then write(spc(11-((whereX-1) mod 10+1)));
      inc(FileCount);
      write(copy(DirInfo.Name,1,pos('.',DirInfo.Name)-1));
      FindNext(DirInfo);
    end;
    writeln;
  end;
end;

procedure GetPartFileNameText;
begin
  if length(PartName)=0 then begin
    writeln('Directory Listing of Part Files:');
    writeln;
    ShowFiles('*.V');
    writeln;
    write('Part Prefix: ');
    readln(PartName);
  end;
  PartName := upper(PartName);
  CheckForOptions(PartName);
end;

procedure GetPartFileNameGr;
var
  FileCount: Integer;
  DirInfo: SearchRec;
  name: str16;
begin
  if length(PartName)=0 then begin
    FileCount := 0;
    MoveTo(1*8,11*14);
    OutText('Parts Directory Listing:');
    FindFirst('*.V',AnyFile,DirInfo);
    MoveTo(1*8,12*14);
    if DosError<>0 then OutText('- NONE -')
    else begin
      while (DosError = 0) and (GetY < 23*14) do begin
        inc(FileCount);
        name := copy(DirInfo.Name,1,pos('.',DirInfo.Name)-1);
        name := name + spc(12-length(name));
        OutText(name);
        if GetX>8*60 then MoveTo(1*8,GetY+14);
        FindNext(DirInfo);
      end;
      writeln;
    end;
    MoveTo(1*8,22*14);
    SetColor(2);
    OutText('Part Filename: ');
    SetColor(3);
    PartName := upper(GetInput(50));
    CheckForOptions(PartName);
  end;
end;

procedure MakeTitle;
begin
  ClearViewPort;
```

```
  SetColor(3);
  DrawBorder;
  MoveTo(10,5);
  SetTextStyle(TriplexFont,HorizDir,4);
  OutText('3D Systems');
  MoveTo(13,40);
  SetTextStyle(SmallFont,HorizDir,6);
  OutText('Sylmar, California');
  MoveTo(250,15);
  SetTextStyle(SansSerifFont,HorizDir,4);
  OutText('SUPERVISOR');
  SetTextStyle(DefaultFont,HorizDir,1);
  MoveTo(64*8,1*14+7);
  OutText('SLA-1');
  MoveTo(64*8,2*14+7);
  OutText('Version '+VersionId);
  SetLineStyle(SolidLn,0,ThickWidth);
  Line(0,65,639,65);
  SetLineStyle(SolidLn,0,NormWidth);
end;

procedure MakeParamScreen;
var
  i: Integer;
begin
  MakeTitle;
  Line(0,6*14+4,639,6*14+4);
  SetTextStyle(DefaultFont,HorizDir,1);
  MoveTo(1*8,7*14);
  OutText('Options: '+ParamOptions);
  Line(0,8*14+4,639,8*14+4);
  MoveTo(1*8,9*14);
  OutText('XY-Scale: '+RealStr(XYScale,4));
  MoveTo(55*8,9*14);
  OutText('# Parts:        X      Y');
  Line(0,10*14+4,639,10*14+4);
  Line(68*8-4,8*14+4,68*8-4,23*14+4);
  Line(74*8-4,8*14+4,74*8-4,23*14+4);
  Line(54*8-4,8*14+4,54*8-4,10*14+4);
  Line(0,21*14+4,68*8-4,21*14+4);
  Line(0,23*14+4,639,23*14+4);
  MoveTo(64*8,9*14);
  OutText(WordStr(NumOffsets));
  i := 0;
  while (i<12) and (i<NumOffsets) do begin
    MoveTo(68*8,(11+i)*14);
    OutText(LongStr(Offsets[i,1]));
    MoveTo(74*8,(11+i)*14);
    OutText(LongStr(Offsets[i,2]));
    inc(i);
  end;
end;

procedure MakeActionScreen;
var
  H,V: Char;
  NegHorz,NegVert: Boolean;
begin
  MakeTitle;
  Line(0,6*14+4,639,6*14+4);
  SetTextStyle(DefaultFont,HorizDir,1);
  MoveTo(32*8,7*14);
  OutText('ACTION: ');
  SetColor(2);
  OutText('INITIALIZING');
  SetColor(3);
```

```
Line(0,8*14+4,639,8*14+4);
MoveTo(1*8,5*14+3);
OutText('PART '+PartName);
MoveTo(64*8,5*14+3);
OutText('CONTROL: ');
if LayerCtrl then OutText('LAYER')
  else OutText('RANGE');
MoveTo(1*8,9*14);
OutText('START TIME: '+StartTimeStamp);
MoveTo(3*8,10*14);
OutText('END TIME: '+EndTimeStamp);
Line(0,11*14+4,35*8+4,11*14+4);
MoveTo(1*8,12*14);
OutText('START LAYER:');
MoveTo(4*8,13*14);
OutText('ON LAYER:');
MoveTo(3*8,14*14);
OutText('END LAYER:');
Line(0,15*14+4,35*8+4,15*14+4);
MoveTo(28*8,12*14);
OutText('BLOCK');
Line(35*8+4,8*14+4,35*8+4,15*14+4);
Line(24*8+4,11*14+4,24*8+4,15*14+4);
Rectangle(45*8+4-1,9*14+4-1,77*8+4+1,22*14+4+1);
Line(0,23*14+4,639,23*14+4);
{ draw axes orientation arrows }
NegVert := NegY;
NegHorz := NegX;
V := 'Y';
H := 'X';
if SwapXY then begin
  NegVert := NegX;
  NegHorz := NegY;
  V := 'X';
  H := 'Y';
end;
case NegVert of
  false: case NegHorz of
           false: begin
                    Line(38*8+4,10*14+4,38*8+4,12*14+4);
                    Line(38*8+4,10*14+4,42*8+4,10*14+4);
                    MoveTo(43*8,10*14);
                    OutText(H);
                    MoveTo(38*8,13*14-4);
                    OutText(V);
                  end;
           true : begin
                    Line(42*8+4,10*14+4,42*8+4,12*14+4);
                    Line(38*8+4,10*14+4,42*8+4,10*14+4);
                    MoveTo(42*8,13*14-4);
                    OutText(V);
                    MoveTo(37*8,10*14);
                    OutText(H);
                  end;
         end;
  true : case NegHorz of
           false: begin
                    Line(38*8+4,10*14+4,38*8+4,12*14+4);
                    Line(38*8+4,12*14+4,42*8+4,12*14+4);
                    MoveTo(38*8,9*14+4);
                    OutText(V);
                    MoveTo(43*8,12*14);
                    OutText(H);
                  end;
           true : begin
                    Line(42*8+4,10*14+4,42*8+4,12*14+4);
```

```
                Line(38*8+4,12*14+4,42*8+4,12*14+4);
                MoveTo(37*8,12*14);
                OutText(H);
                MoveTo(42*8,9*14+4);
                OutText(V);
              end;
        end;
  end;
end;


{ - - - M A I N - - - }

begin
  CheckBreak := false;
  FillChar(FirstVar,ofs(LastVar)-Ofs(FirstVar),#0);   { clear variables }
  SingleBar := many(chr(196),45);
  writeln;
  writeln(SingleBar);
  writeln('  SUPER, Part-Making Supervisor');
  writeln('  3D Systems Laser Stereolithography System');
  writeln('  Version ',VersionId,'                3D Systems, Inc.');
  writeln(SingleBar);
  writeln;
  OpMode := TextOp;

  check1 := LaserPresent;
  check2 := StereoPresent;
  if not (check1 and check2) then halt(1);
  OpMode := GraphicsOp;
  StartZ     := 0;
  EndZ       := 65535;
  NumLayers  := 65535;
  ReadBlockIdFile;
  ReadSuperParamsFile;
  ReadCommandLine(cmd);   { process overriding command line }
  i := pos('/',cmd);
  if i=0 then i := length(cmd)+1;
  PartName := upper(copy(cmd,1,i-1));
  cmd := upper(copy(cmd,i,255));
  CheckForOptions(cmd);
  GrDeltaX := GrMaxX-GrMinX;
  if GrDeltaX < 10 then GrDeltaX := 10;
  GrDeltaY := GrMaxY-GrMinY;
  if GrDeltaY < 10 then GrDeltaY := 10;

  if OpMode=TextOp then begin
    GetPartFileNameText;
    if (NumOffsets<1) or (length(PartName)=0) then halt(0);
    writeln;
    OpenFiles;
    writeln('Starting part-making process...');
    GetTimeStamp;
    StartTimeStamp := CurrentDate+' '+CurrentTime;
    InitZTable;
    PartMake;
    writeln;
    SystemError('Part completed.');
    writeln;
    writeln('Start Time: ',StartTimeStamp);
    GetTimeStamp;
    writeln('  End Time: ',CurrentDate+' '+CurrentTime);
  end else begin
    InstallGraphics;
    BuildImage;
    MakeParamScreen;
```

```
    ShowImage;
    GetPartFileNameGr;
    if (NumOffsets<1) or (length(PartName)=0) then begin
      TextMode(C80);
      halt(0);
    end;
    OpenFiles;
    BuildImage;
    GetTimeStamp;
    StartTimeStamp := CurrentDate+'  '+CurrentTime;
    MakeActionScreen;
    ShowImage;
    InitZTable;
    PartMake;
    writeln;
    GetTimeStamp;
    EndTimeStamp := CurrentDate+'  '+CurrentTime;
    MoveTo(13*8,10*14);
    OutText(EndTimeStamp);
    Action('PART COMPLETED');
    repeat
      Ch := ReadKey;
      if (Ch = #0) and keypressed then begin
        key := ReadKey;   { don't overwrite Ch }
        if OpMode = GraphicsOp then begin
          if ord(key) = F1 then SetVisualPage(0)
          else if ord(key) = F2 then SetVisualPage(1);
        end;
      end;
    until Ch<>#0;
    CloseGraph;
  end;
  Quit;
end.
```

```
{------------------------------------------------------------------------------

                              Utility Routines

------------------------------------------------------------------------------}

function sgn(num: Real): Real;
begin
  if num<0 then sgn := -1
  else if num>0 then sgn := 1
  else sgn := 0;
end;

function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
var
  temp: string;
  i: Integer;
begin
  temp := '';
  for i:=1 to num do temp  := temp+Ch;
  many := temp;
end;

function min(int1,int2: Integer): Integer;
begin
  if int1<int2 then min := int1
    else min := int2;
end;

function max(int1,int2: Integer): Integer;
begin
  if int1>int2 then max := int1
    else max := int2;
end;

function IntStr(num: Integer): str16;
var
  temp: str16;
begin
  if num>=0 then Str(num,temp) else Str(num+$8000,temp);
  IntStr := temp;
end;

function WordStr(num: Word): str16;
var
  temp: str16;
begin
  Str(num,temp);
  WordStr := temp;
end;
```

```
function LongStr(num: LongInt): str16;
var
  temp: str16;
begin
  Str(num,temp);
  LongStr := temp;
end;

function RealStr(num: Real;AfterDecimal: Integer): str80;
var
  i: Integer;
  temp: str80;
begin
  Str(num:10:AfterDecimal,temp);
  i := 1;
  while (i<length(temp)) and (temp[i]=' ') do inc(i);
  RealStr := copy(temp,i,99);
end;

function spc(len: Integer): string;
begin
  spc := copy(sp80+sp80,1,len);
end;

procedure ReadCommandLine(var line: string);
var
  i: Integer;
begin
  line := ParamStr(1);
  for i:=2 to ParamCount do
    line := line + ' ' + ParamStr(i);
end;

{
  Remove excess quote marks around string
}
function NoQuotes(Text: str80): str80;
const
  Quote = '"';
var
  s,e: Integer;
begin
  s := 1;
  if (length(Text)>1) and (Text[1]=Quote) then inc(s);
  e := length(Text);
  if Text[e]=Quote then dec(e);
  NoQuotes := copy(Text,s,e-s+1);
end;

{
  Removes all double spaces in text string
}
procedure RemoveDoubleSpaces(var text: string);
begin
  while pos('  ',text)>0 do
    delete(text,pos('  ',text),1);
end;

{
  Find any char of Chars in Main starting at index Start
  Returns length(Main)+1 if no character of Chars in Main
}
function FindStr(Start: Integer;Main: string;Chars: str10): Integer;
var
  i,j,min: Integer;
  temp: String;
```

```
begin
  min := length(Main)+1;
  temp := copy(Main,Start,199);
  for i:=1 to length(Chars) do begin
    j := Start + pos(Chars[i],temp) - 1;
    if (j >= Start) and (j < min) then min := j;
  end;
  FindStr := min;
end;

{
  better val routines
}
function IntVal(line: String;var code: Integer): Integer;
var
  code2: Integer;
  num: Integer;
begin
  val(line,num,code);
  if code<>0 then val(copy(line,1,code-1),num,code2);
  IntVal := num;
end;

function LongVal(line: String;var code: Integer): LongInt;
var
  code2: Integer;
  num: LongInt;
begin
  val(line,num,code);
  if code<>0 then val(copy(line,1,code-1),num,code2);
  LongVal := num;
end;

function RealVal(line: String;var code: Integer): Real;
var
  code2: Integer;
  num: Real;
begin
  if line[1]='.' then line := '0' + line;
  val(line,num,code);
  if code<>0 then val(copy(line,1,code-1),num,code2);
  RealVal := num;
end;

{
  Pick out a number from a string
  starting at Index and going to the next space or comma or end-of-string
}
procedure UnitValShortInt(var Storage: Integer;Text: String;var Index: Integer);
var
  i: Integer;
begin
  Storage := IntVal(copy(Text,Index,99),i);
  if i=0 then Index := length(Text)+1
    else Index := Index + i;
end;

procedure UnitValInt(var Storage: LongInt;Text: String;var Index: Integer);
var
  i: Integer;
begin
  Storage := LongVal(copy(Text,Index,99),i);
  if i=0 then Index := length(Text)+1
    else Index := Index + i;
end;
```

```
procedure UnitVal(var Storage: Real;Text: String;var Index: Integer);
var
  i: Integer;
begin
  Storage := RealVal(copy(Text,Index,99),i);
  if i=0 then Index := length(Text)+1
    else Index := Index + i;
end;

{
  Pick out text from a string
  starting at Index and going to the next comma or end-of-string
}
procedure UnitStr(var Storage,Text: String;var Index: Integer);
var
  i: Integer;
begin
  i := FindStr(Index,Text,',');
  Storage := copy(Text,Index,i-Index);
  Index := i + 1;
end;

{
  Show error and store it on disk
}
procedure SystemError(Text: string);
begin
  if OpMode = TextOp then writeln(Text)
    else begin
      MoveTo(3*8,24*14-2);
      OverText(Text,50);
      Ch := ReadKey;
      TextMode(C80);
    end;
  assign(ErrorFile,ErrorFileName);
  rewrite(ErrorFile);
  writeln(ErrorFile,'SUPER: ',Text);
  close(ErrorFile);
end;

{
  Can't open file.  Report this to operator.
}
procedure CantOpen(FileName: string);
begin
  SystemError('Can''t open file '+FileName);
end;
{-------------------------------------------------------------------------------

                              Keyboard Routines

-------------------------------------------------------------------------------}

procedure Abort;
var
  key: Char;
begin
  if OpMode=GraphicsOp then TextMode(C80);
  while keypressed do key := ReadKey;
  halt(127);
end;

function STEREO(LaserCommand: String): Integer;  forward;
procedure ShowError(Error: Integer);             forward;

procedure Quit;
var
  key: Char;
begin
  ShowError(STEREO('SP 100:EC:EC'));
  if OpMode=GraphicsOp then TextMode(C80);
  halt(0);
end;

procedure HandleKeyboardRequest;
var
```

```
  key: Char;
begin
  while keypressed do begin
    key := ReadKey;
    if key = CtrlS then key := ReadKey;
    if key = CtrlC then Abort;
    if (key = #0) and keypressed then begin
      key := ReadKey;
      if OpMode = GraphicsOp then begin
        if ord(key) = F1 then SetVisualPage(0)
        else if ord(key) = F2 then SetVisualPage(1);
      end;
    end;
  end;
end;
{-----------------------------------------------------------------------------

                        General Graphics Routines

-----------------------------------------------------------------------------}

procedure DrawBorder;
{ Draw a border around the current view port }
begin
  SetLineStyle(SolidLn,0,ThickWidth);
  GetViewSettings(ViewPort);
  with ViewPort do
    Rectangle(0, 0, x2-x1, y2-y1);
end;

procedure BuildImage;
begin
  OnScreen := 1-OnScreen;
  SetActivePage(OnScreen);
end;

procedure OverText(Text: String;len: Integer);
var
  x,y,color: Integer;
begin
  x := GetX;
  y := GetY;
  color := GetColor;
  SetFillStyle(EmptyFill,0);
  Bar(x,y,x + len * TextWidth('A'),y + TextHeight(Text) + 1);
  SetColor(color);
  OutTextXY(x,y,Text);
end;

procedure ShowImage;
begin
  SetVisualPage(OnScreen);
end;

function GetInput(maxlen: Integer): String;
var
  key: Char;
  temp: String;
  input: Boolean;
  baseX,baseY,index: Integer;
begin
  temp := '';
  index := 0;
  baseX := getX;
  baseY := getY;
  key := chr(0);
  SetVisualPage(OnScreen);
  while key<>Cr do begin
    MoveTo(baseX+index*8,baseY);
    SetColor(3);
    OutText(chr(219));
    key := ReadKey;
    if key = CtrlC then Abort;
    MoveTo(baseX+index*8,baseY);
    SetColor(0);
    OutText(chr(219));
    MoveTo(baseX+index*8,baseY);
```

```
    SetColor(2);
    if key in [Bs,Cr,' '..'~'] then begin
      if key=Bs then begin
        if index>0 then dec(index);
      end else if key in[' '..'~'] then begin
        OutText(key);
        if index<maxlen then inc(index);
        temp[index] := key;
      end;
    end;
  end;
  temp[0] := chr(index);
  GetInput := temp;
  SetColor(3);
end;

procedure GrAbort(Msg: string);
begin
  Writeln(Msg,': ',GraphErrorMsg(GraphResult));
  Halt(1);
end;

procedure InstallGraphics;
begin
  { Register all the drivers }
  if RegisterBGIdriver(@CGADriverProc) < 0 then
    GrAbort('CGA');
  if RegisterBGIdriver(@EGAVGADriverProc) < 0 then
    GrAbort('EGA/VGA');

  { Register all the fonts }
  if RegisterBGIfont(@SansSerifFontProc) < 0 then
    GrAbort('SansSerif');
  if RegisterBGIfont(@SmallFontProc) < 0 then
    GrAbort('Small');
  if RegisterBGIfont(@TriplexFontProc) < 0 then
    GrAbort('Triplex');

  GraphDriver := Detect;                    { autodetect the hardware }
  InitGraph(GraphDriver,GraphMode,'');      { activate graphics }
  if GraphResult<>grOk then                 { any errors? }
  begin
    Writeln('Graphics init error: ', GraphErrorMsg(GraphDriver));
    Halt(1);
  end;
  SetVisualPage(1);
  ClearDevice;
  OnScreen := 1;  { start with Screen 0 }
end;

{
  Print action information
}
procedure Action(Text: String);
var
  i: Integer;
begin
  if OpMode=TextOp then write(Text,' ')
  else begin
    MoveTo(40*8,7*14);
    SetColor(2);
    OverText(Text,20);
    SetColor(3);
  end;
end;
```

```
procedure Message(Text: String);
begin
  MoveTo(3*8.24*14-2);
  OverText(Text,length(Text)+5);
end;
{-----------------------------------------------------------------------------

                               Time/Date Routines

-----------------------------------------------------------------------------}

{
  Pad time element with left space if necessary
}
function PadSp(num: Integer): str10;
var
  temp: str10;
begin
  temp := IntStr(num);
  if num<10 then PadSp := ' ' + temp
    else PadSp := temp;
end;

{
  Pad time element with left zero if necessary
}
function LZero(num: Integer): str10;
var
  temp: str10;
begin
  temp := IntStr(num);
  if num<10 then LZero := '0' + temp
    else LZero := temp;
end;

{
  Compute day-of-week using Harry's modified Zeller Algorithm
}
function Zeller(month,day,year: Integer): Integer;
begin
  if month<3 then dec(year);
  Zeller := (Zel[month] + day + year + (year shr 2)) mod 7;
end;

{
  Read time directly from clock chip
  works only on ATs, 286s, 386s; does not work on standard PCs, XTs
}
procedure GetTime;
var
  good: Boolean;
begin
  good := false;
  while not good do begin
    port[$70] := $0A;    { wait for update to finish (then there's 244 us) }
    if (port[$71] and $80)=0 then begin
      port[$70] := $00;     { get seconds }
      Sec := port[$71];
      port[$70] := $0A;
      if (port[$71] and $80)=0 then begin
        port[$70] := $02;    { get minutes }
        Minu := port[$71];
        port[$70] := $0A;
        if (port[$71] and $80)=0 then begin
          port[$70] := $04;     { get hours }
          Hour := port[$71];
```

```
          port[$70] := $0A;
          if (port[$71] and $80)=0 then begin
            port[$70] := $07;    { get day }
            Day := port[$71];
            port[$70] := $0A;
            if (port[$71] and $80)=0 then begin
              port[$70] := $08;    { get month }
              Mon := port[$71];
              port[$70] := $0A;
              if (port[$71] and $80)=0 then begin
                port[$70] := $09;    { get year }
                Year := port[$71];
                port[$70] := $0A;
                if (port[$71] and $80)=0 then good := true;
              end;
            end;
          end;
        end;
      end;
    end;
  end;
  Sec  := (Sec  shr 4) * 10 + (Sec  and $0F);  { convert from BCD }
  Minu := (Minu shr 4) * 10 + (Minu and $0F);
  Hour := (Hour shr 4) * 10 + (Hour and $0F);
  Day  := (Day  shr 4) * 10 + (Day  and $0F);
  Mon  := (Mon  shr 4) * 10 + (Mon  and $0F);
  Year := (Year shr 4) * 10 + (Year and $0F);
  WeekDay := Zeller(Mon.Day,Year);
end;

{
  Get a time stamp consisting of the relative day and the current time
}
procedure GetTimeStamp;
var
  tdow,tday.tmon.tyear,tsec,tminu.thour: str10;
  AmPm: Char;
begin
  GetTime;
  tmon  := PadSp(Mon);
  tday  := LZero(Day);
  tyear := LZero(Year);
  tdow  := copy(DayOfWeek.Zeller(Mon.Day,Year)*3+1,3);
  CurrentDate := tdow+' '+tmon+'/'+tday+'/'+tyear;
  tsec  := LZero(Sec);
  tminu := LZero(Minu);
  if Hour=0 then begin
    thour := '12';
    AmPm := 'A';
  end else if Hour<12 then begin
    thour := PadSp(Hour);
    AmPm := 'A';
  end else if Hour=12 then begin
    thour := '12';
    AmPm := 'P';
  end else begin
    thour := PadSp(Hour-12);
    AmPm := 'P'
  end;
  CurrentTime := thour+':'+tminu+' '+AmPm+'M';
end;

{
  Compute difference in seconds for a calling wait routine
}
procedure WaitTest;
begin
  GetTime;
  NewSec := Sec + 60*Minu + 3600*Hour;
  DeltaSecs := NewSec - SaveSec;
  if DeltaSecs < 0 then DeltaSecs := DeltaSecs + 86400;
end;
```

```
{------------------------------------------------------------------------------

                        Z-Stage Elevator Routines

------------------------------------------------------------------------------}

procedure InitZTable;
begin
  port[ZAddress+1] := $64;
  port[ZAddress+1] := $60;
  delay(100);
  port[ZAddress+1] := $40;
  port[ZAddress+1] := $60;
  delay(100);
end;

procedure ZTable(Ch: Char);
var
  b: Integer;
begin
  repeat
    b := port[ZAddress+1];
  until (b and $10)>0;
  port[ZAddress] := ord(Ch);
  port[ZAddress+1] := $70;
  repeat
    B:=port[ZAddress+1];
  until (b and $10)=0;
  port[ZAddress+1] := $60;
end;

{
  Send command to Z-axis stepper controller
}
procedure ZMove(Cmd: string);
begin
  if ShowStuff then begin
    if whereX>1 then writeln;
    writeln('    ZTable>',Cmd);
  end;
  if not ZTableOff then begin
    Cmd := Cmd + Cr;
    for i:=1 to length(Cmd) do ZTable(Cmd[i]);
  end;
end;

procedure FormatZCommand(Distance: Real);
begin
  Distance := sgn(Distance) * int(abs(Distance) * ZPitch * 1000 / 25.4);
  if NegZStage then Distance := -Distance;
  ZMove('D'+RealStr(Distance,0)+' G');
end;

procedure WaitForIdleZStage;
var
  b: Word;
begin
  repeat
    b := port[ZAddress+1];
  until keypressed or (b and 2>0);
end;
```

```
{-----------------------------------------------------------------------------

                        Laser Controller Routines

 ----------------------------------------------------------------------------}

{
  Check for Memory-Resident Laser Controller System
}
function LaserOk: Boolean;
  type
    CopyType  = array[1..20] of char;
  var
    CopyPtr: ^CopyType;
    CopyStr: string[20];
  begin
    with regs do begin
      AX := ($35 shl 8) or LASERVECTOR;
      Intr($21,regs);
      CopyPtr := Ptr(ES,BX-19);
    end;
    move(CopyPtr^[1],CopyStr[1],18);
    CopyStr[0] := #18;
    if CopyStr = 'Tarnz Technologies' then begin
      LaserOk := true;
      with regs do
        CopyPtr := Ptr(ES,BX-46);
      move(CopyPtr^[1],LaserVersion[1],4);
      LaserVersion[0] := #4;
    end else begin
      LaserOk := false;
      LaserVersion := '?.??';
    end;
  end;

function LaserPresent: Boolean;
  begin
    if LaserOk then LaserPresent := true
    else begin
      LaserPresent := false;
      SystemError('LASER system not installed.');
    end;
  end;

{
  Check for Memory-Resident STEREO Stereolithography Device Driver
}
function StereoOk: Boolean;
  type
    CopyType  = array[1..20] of char;
  var
    CopyPtr: ^CopyType;
    CopyStr: string[20];
  begin
    with regs do begin
      AX := ($35 shl 8) or STEREOVECTOR;
      Intr($21,regs);
      CopyPtr := Ptr(ES,57);
    end;
    move(CopyPtr^[1],CopyStr[1],18);
    CopyStr[0] := #18;
```

```
    if CopyStr = 'Tarnz Technologies' then begin
      StereoOk := true;
      with regs do
        CopyPtr := Ptr(ES,30);
      move(CopyPtr^[1],StereoVersion[1],4);
      StereoVersion[0] := #4;
    end else begin
      StereoOk := false;
      StereoVersion := '?.??';
    end;
  end;

function StereoPresent: Boolean;
  begin
    if StereoOk then StereoPresent := true
    else begin
      StereoPresent := false;
      SystemError('STEREO driver not installed.');
    end;
  end;

procedure ShowError(Error: Integer);
begin
  case Error of
    0: ;
    1: PrintError('1. Laser interface card not found');
    2: PrintError('2. Laser channel not open');
    3: PrintError('3. Background Command Queue full timeout');
    4: PrintError('4. Invalid interrupt time');
    5: PrintError('5. Not in block mode');
    6: PrintError('6. Exec Queue limit timeout');
    7: PrintError('127. Bad SIH command parameter');
    8: PrintError('128. Unrecognized STEREO command');
    255: PrintError('255. Internal error (please report)');
  else PrintError(IntStr(Error)+'. Unrecognized SIH error');
  end;
end;

{ - - - - - - - - - - - - - - - - - - - - - - - - - - - - - - - - - - - -

          Pass Command on to Memory Resident STEREO Device Driver

  - - - - - - - - - - - - - - - - - - - - - - - - - - - - - - - - - - - - }

function STEREO(LaserCommand: String): Integer;
begin
  STEREO := 0;
  if length(LaserCommand)>0 then begin
    if ShowStuff then begin
      if whereX>1 then writeln;
      writeln('   Laser>',LaserCommand);
    end;
    if not LaserOff then begin
      if LaserCommand[1]<>'!' then with regs do begin
        LaserCommand := LaserCommand + chr(0);
        AX := $00;
        BX := Ofs(LaserCommand)+1;   { pass pointer to string }
        ES := Seg(LaserCommand);
        Intr(STEREOVECTOR,regs);
        STEREO := AX and $FF;
        QSize := CX;
      end;
    end;
  end;
  if keypressed then HandleKeyboardRequest;
end;
```

```
'==============================================================================
'  3D Systems Stereolithography System Software
'==============================================================================
'
'  TESTPART.BAS
'  SLA-1 Test Part Utility Software
'
'------------------------------------------------------------------------------
'  Compile with TBM - Modified Turbo Basic - not TB!
'------------------------------------------------------------------------------
'
'  Recent History:
'   1/11/88  Ver 2.50  first release
'   1/25/88  Ver 2.60  version update only
'
'------------------------------------------------------------------------------

  VersionId$ = "2.60"

  SingleBar$ = STRING$(45,196)
  CLS
  PRINT SingleBar$
  PRINT "  TESTPART, Test Part Utility"
  PRINT "  3D Systems Laser Stereolithography System"
  PRINT "  Version "+VersionId$+"                  3D Systems, Inc."
  PRINT SingleBar$
  PRINT

  PRINT
  PRINT "    1. BanjoTop, Determine Working Curves"
  PRINT "    X. Exit Program"
  PRINT
  PRINT
KeyLoop:
  K$ = UCASE$(INKEY$)
  IF K$ = "1" THEN StartBanjo
  IF K$ = "X" THEN END
  GOTO KeyLoop

' *************************************************************************
'     BANJOTOP      turbobasic version     11/19/87    wav
' *************************************************************************

StartBanjo:
          CLS
          PRINT
          LOCATE 1,36
          PRINT "BANJOTOP"
          PRINT
          INPUT "INPUT BIGGEST SP VALUE OF 5 TO BE DRAWN (160 minimum) :",sp$
            t$ = ucase$(left$(sp$,1))
            if t$="Q" or t$="X" then end
            sp = VAL(sp$)
            IF sp/16 < 10 THEN
              PRINT
              PRINT
              PRINT " ERROR  ERROR  ERROR  ERROR"
              PRINT " THE SMALLEST SP MUST NOT BE LESS THAN 10"
              PRINT
              PRINT "THUS, USE SP 160 FOR FASTEST LASER DRAWING !"
              LOCATE 20,30
              PRINT "ANY KEY TO TRY AGAIN ...";
              GOSUB strobe
              GOTO StartBanjo
```

```
  END IF
PRINT "THE FOLLOWING STRING SP'S WILL BE GENERATED."
PRINT
  FOR I = 1 TO 5
       PRINT "SP ";sp
       sp = sp/2
  NEXT I
PRINT
PRINT "OK ? (Y/N)"
gosub strobe
IF ans$ <>"Y" AND ans$<> "y" THEN StartBanjo

CLS
SP = 32*SP
STRINGSP = SP

PRINT "PLEASE WAIT..."
SHELL "CLIFF 'HR/W/T"


mainprogram:

          GOSUB setup
          GOSUB mainmenu
          GOSUB openfile
          GOSUB writeparameters
          GOSUB writebase
          GOSUB writestrings
          LOCATE 18,27
          PRINT "making base and strings...";
          GOSUB movemirrors
          LOCATE 22,35
          PRINT " done !!";
          END

END


writebase:

        M$ = "J"
        X = xside/2
        Y = yside/2 + yinc
        GOSUB writexytofile
        M$ = "N"
        X =  xside/2
        Y = -yside/2
        GOSUB writexytofile
        X = -xside/2
        Y = -yside/2
        GOSUB writexytofile
        X = -xside/2
        Y =  yside/2
        GOSUB writexytofile
        X =  xside/2 + yinc
        Y =  yside/2
        GOSUB writexytofile
        RETURN

writestrings:


       sp = stringsp * 2
```

```
        FOR x = -3*xside/8 TO xside/8 STEP 6*xside/(12*4)
          sp = sp/2
          PRINT#2,"SP";sp
          M$="J"
          Y= -yside/2 - yinc
          GOSUB writexytofile
          M$="N"
          Y=  yside/2 + yinc
          GOSUB writexytofile
        NEXT X
      RETURN

writexytofile:

        PRINT#2, M$;"X";cx+x
        PRINT#2, M$;"Y";cy+y
        RETURN

writeparameters:

            PRINT#2."MD BL +"
            PRINT#2."CL"
            PRINT#2."SS2"
            PRINT#2,"SP";sp
            PRINT#2,"JDO"
            PRINT#2, "BX32000"
            PRINT#2. "BY62000"
            RETURN

movemirrors:


            PRINT#2."EX"
            CLOSE
            SHELL "CLIFF LASER.DAT/W/T"
            ON ERROR GOTO chkerror
            OPEN "CLIFF.ERR" FOR INPUT AS #3
            CLOSE #3
            PRINT "CLIFF process aborted."
            END

END


chkerror:
            CLOSE #3
            RESUME chkdone

chkdone:
            ON ERROR GOTO 0
            RETURN


openfile:

        OPEN "LASER.DAT" FOR OUTPUT AS #2
        RETURN


mainmenu:

        CLS
          FOR I=1 TO 79
```

626

```
        LOCATE 1,I,0
        PRINT "*";
      NEXT
    LOCATE 2,35,0
    PRINT "*    SLA1    *"
    LOCATE 3,33,0
    PRINT "PROGRAM: BANJOTOP"
      FOR I=1 TO 79
        LOCATE 4,I,0
        PRINT "*";
      NEXT
      FOR I = 1 TO 5
        LOCATE 10 + i,30
        PRINT "SP ";STRINGSP
        STRINGSP = STRINGSP / 2
      NEXT I
    STRINGSP = 32 * STRINGSP
    LOCATE 23,25
    PRINT "ANY KEY TO CONTINUE...";
    GOSUB strobe
      FOR I=25 TO 55
        LOCATE 23,I,0
        PRINT " ";
      NEXT
    RETURN


setup:

          cx = 32000                    ' approx center of pot
          cy = 32000
          scale = 140                   ' bits/mm
          xside = 25                    ' 1 x 1/2 inch
          xside = xside * scale
          yside = xside / 2
          sp = 500                      '  base step period
          yinc = yside / 4              '  overlap
          RETURN


strobe:
        ans$ = INKEY$
        IF LEN(ans$) = 0 then strobe
        return
```

```
/*****************************************************************************
*
*   3D System's Unix Slice User Interface Program
*
*============================================================================
*
*   Version 2.40  Second Beta Release
*
*****************************************************************************/



#include <stdio.h>
#include <string.h>
#include <math.h>

#include <sys/types.h>
#include <sys/times.h>
struct tms timestamp1,timestamp2;
unsigned long time_val1,time_val2;
unsigned long system_time;

#include "ui.h"

#define  UI_FILE_EXT        ".UII"
#define  Z_SPACE_EXT        ".UIZ"
#define  SLICE_INPUT_EXT    ".sti"
#define  SLICE_OUTPUT_EXT   ".sli"
#define  LAST_FILE          "LAST.UIN"

#define  PARA_NO        11
#define  FUNC_NO        24
#define  FLUSH_IN       fflush(stdin)
#define  CLFSCR         system("tput clear")

#define  SLICE_PGM      "slice"
#define  SLICE_VER      "260"

#define  VERSION        2.60

#define log_file_name "LOG.UI"
FILE *log_file_ptr;

/***************************************************************************/

typedef struct
{
  int    z_layer;
  int    z_value;
} z_record;

/***************************************************************************/

unsigned scaled(user_info,num)
  USER_INFO_STRUC *user_info;
  float            num;
  {
  return((unsigned) (user_info->resolution*num+0.5));
  };

/***************************************************************************/

char exact(user_info,num)
  USER_INFO_STRUC *user_info;
```

```
float           num;
{
if (fabs(user_info->resolution * num - scaled(user_info.num)) < 1E-3)
  return(' ');
else return('*');
};

/*****************************************************************************/

wait_key()
{
  char line[2];

  printf("\n--- Press <Enter> to continue ---");
  getline(line,1);
}

/*****************************************************************************/

unsigned read_int()
{
  char line[7];
  int i;
  float temp;

  do {
    getline(line,6);
    i=0;
    parse_number(line,&i,&temp);
    if (temp < 0.0) temp = -temp;
    if (temp > 65535.0) printf("Number Range Error (0-65535). Retype: ");
  } while (temp > 65535.0);
  return(temp);
}

/*****************************************************************************/

float read_float(check)
  BOOLEAN check;
{
  char line[13];
  int i;
  float temp;

  do {
    getline(line,12);
    i=0;
    parse_number(line,&i,&temp);
    if (temp < 0.0) temp = -temp;
    temp = (unsigned long) (temp*1000+0.0005) / (float) (1000);
    if (check && (temp > 65535.0)) printf("Number Range Error (0-65535). Retype: "
  } while (check && (temp > 65535.0));
  return(temp);
}

/*****************************************************************************/

openfile (filename,file_ptr,open_mode)
char   filename[];
FILE   **file_ptr;
char   *open_mode;

{
if ((*file_ptr = fopen (filename, open_mode)) == NULL)
  {
```

```
  fprintf (stderr, "\n ERROR - unable to open %s\n", filename);
  exit (1);
  }
}  /* openfile */

/*****************************************************************************/

get_object_name (argc,argv,object_name)
int     argc;
char    *argv[];
char    object_name[];

{
  FILE    *file_ptr;

  if (argc > 1)
  {
    strcpy (object_name, argv[1]);
    if (strchr(object_name,'.') != NULL)
    {
      fprintf (stderr, "\n*** Object name cannot contain periods.  ");
      fprintf (stderr, "Object name is not the file name ***\n");
      exit (1);
    }
  } else
  {
    if (!file_exist(LAST_FILE))
    {
      fprintf (stderr, "\n*** Cannot find %s.  Please use ",LAST_FILE);
      fprintf (stderr, "%s command with object name ***\n",argv[0]);
      exit (1);
    }
    openfile (LAST_FILE, &file_ptr, "r");
    fscanf   (file_ptr, "%s", object_name);
    fclose   (file_ptr);
  }
} /* get_object_name */

/*****************************************************************************/

file_exist (file_name)
char      file_name[];
{
  FILE  *file_ptr;

  if ((file_ptr = fopen (file_name, "r" )) != NULL)
  {
    fclose(file_ptr);
    return(TRUE);
  }
  else return(FALSE);
} /* file_exist */

/*****************************************************************************/

update_last_UI (object_name)
  char    object_name[];
{
  FILE   *file_ptr;

  openfile (LAST_FILE, &file_ptr, "w");
  fprintf  (file_ptr, "%s\n", object_name);
  fclose(file_ptr);
}; /* update_last_UI */

/*****************************************************************************/
```

```
void read_UI_file(filename, user_info)
  char filename[]:
  USER_INFO_STRUC *user_info:

  FILE          *file_ptr;
  char          option[STR_LEN],temp_str[STR_LEN]:
  unsigned int i;

  openfile (filename, &file_ptr, "r"):

  while (fscanf(file_ptr,"%s",option) == 1) {
    if (strcmp(option,VERSION_TXT) == 0)
      fscanf(file_ptr,"%f",&user_info->version):
    if (strcmp(option,IN_FILE_TXT) == 0)
      fscanf(file_ptr,"%s",user_info->input_filename);
    if (strcmp(option,EXTRA_PARAMS_TXT) == 0) {
      fgets(user_info->extra_parameters,STR_LEN,file_ptr);
      user_info->extra_parameters[strlen(user_info->extra_parameters)-1] = '\0';
    }
    if (strcmp(option,OUT_FILE_TXT) == 0)
      fscanf(file_ptr,"%s",user_info->segfile_name):
    if (strcmp(option,SCALE_TXT) == 0)
      fscanf(file_ptr,"%f",&user_info->resolution):
    if (strcmp(option,RES_TXT) == 0)
      fscanf(file_ptr,"%f",&user_info->resolution):
    if (strcmp(option,Z_SPACE_TXT) == 0)
      fscanf(file_ptr,"%f",&user_info->z_spacing);
    if (strcmp(option,X_FLAT_FILL_TXT) == 0)
      fscanf(file_ptr,"%f",&user_info->x_flat_fill_spacing):
    if (strcmp(option,Y_FLAT_FILL_TXT) == 0)
      fscanf(file_ptr,"%f",&user_info->y_flat_fill_spacing):
    if (strcmp(option,X_HATCH_TXT) == 0)
      fscanf(file_ptr,"%f",&user_info->x_hatch_spacing):
    if (strcmp(option,Y_HATCH_TXT) == 0)
      fscanf(file_ptr,"%f",&user_info->y_hatch_spacing):
    if (strcmp(option,ANGLE_HATCH_TXT) == 0)
      fscanf(file_ptr,"%f",&user_info->angle_hatch_spacing):
    if (strcmp(option,MSA_TXT) == 0)
      fscanf(file_ptr,"%u",&user_info->min_surface_angle):
    if (strcmp(option,MIA_TXT) == 0)
      fscanf(file_ptr,"%u",&user_info->min_intersect_angle):
    if (strcmp(option,FILETYPE_TXT) == 0)
      fscanf(file_ptr,"%u",&user_info->file_type):
    if (strcmp(option,CENTERING_TXT) == 0)
      fscanf(file_ptr,"%u",&user_info->centering);
    if (strcmp(option,VAR_Z_SPACE_TXT) == 0) {
      i = 0;
      fscanf(file_ptr,"%s",temp_str);
      while (temp_str[0] != '*') {
        fscanf(file_ptr,"%f %f %s",&user_info->z_level[i],
                                   &user_info->z_level_spacing[i],
                                   temp_str);
        i++;
      }
    }
  }
  fclose(file_ptr):
  if (user_info->version < 2.339) {
    user_info->z_spacing /= user_info->resolution:
    user_info->x_flat_fill_spacing /= user_info->resolution:
    user_info->y_flat_fill_spacing /= user_info->resolution:
    user_info->x_hatch_spacing /= user_info->resolution:
    user_info->y_hatch_spacing /= user_info->resolution:
    user_info->angle_hatch_spacing /= user_info->resolution:
    };
```

```
};

/****************************************************************************/

get_user_info_from_file (user_info,object_name)
  USER_INFO_STRUC   *user_info;
  char              object_name[];
{
  char  filename[STR_LEN];

  strcpy(filename,object_name);
  strcat(filename,UI_FILE_EXT);
  init_user_info(user_info,object_name);
  if (file_exist(filename)) read_UI_file(filename,user_info);
} /* get_user_info_from_file */

/****************************************************************************/

void save_UI_data_file(user_info,object_name)
  USER_INFO_STRUC      *user_info;
  char                 object_name[];
{
  FILE           *file_ptr;
  char           filename[STR_LEN];
  unsigned int   i;

  strcpy(filename,object_name);
  strcat(filename,UI_FILE_EXT);
  openfile (filename, &file_ptr, "w");

  fprintf(file_ptr,"%s %f\n",VERSION_TXT,VERSION);
  fprintf(file_ptr,"%s %s\n",IN_FILE_TXT,user_info->input_filename);
  fprintf(file_ptr,"%s %s\n",EXTRA_PARAMS_TXT,user_info->extra_parameters);
  fprintf(file_ptr,"%s %s\n",OUT_FILE_TXT,user_info->segfile_name);
  fprintf(file_ptr,"%s %f\n",RES_TXT,user_info->resolution);
  fprintf(file_ptr,"%s %f\n",Z_SPACE_TXT,user_info->z_spacing);
  fprintf(file_ptr,"%s %f\n",X_FLAT_FILL_TXT,user_info->x_flat_fill_spacing);
  fprintf(file_ptr,"%s %f\n",Y_FLAT_FILL_TXT,user_info->y_flat_fill_spacing);
  fprintf(file_ptr,"%s %f\n",X_HATCH_TXT,user_info->x_hatch_spacing);
  fprintf(file_ptr,"%s %f\n",Y_HATCH_TXT,user_info->y_hatch_spacing);
  fprintf(file_ptr,"%s %f\n",ANGLE_HATCH_TXT,user_info->angle_hatch_spacing);
  fprintf(file_ptr,"%s %u\n",MSA_TXT,user_info->min_surface_angle);
  fprintf(file_ptr,"%s %u\n",MIA_TXT,user_info->min_intersect_angle);
  fprintf(file_ptr,"%s %u\n",FILETYPE_TXT,user_info->file_type);
  fprintf(file_ptr,"%s %u\n",CENTERING_TXT,user_info->centering);
  fprintf(file_ptr,"%s\n",VAR_Z_SPACE_TXT);
  i = 0;
  while (user_info->z_level[i] >= 0) {
    fprintf(file_ptr," > %f %f\n",user_info->z_level[i],user_info->z_level_spacinc
    i++;
  }
  fprintf(file_ptr," *\n");
  fclose(file_ptr);
  printf("User Interface Options for %s Saved\n",object_name);
  wait_key();
}  /* save_UI_data_file */

/****************************************************************************/

show_main_menu(user_info,object_name)
  USER_INFO_STRUC  *user_info;
  char             object_name[];

{
  char  filename [STR_LEN];
  unsigned int i;
```

```
CLRSCR;
printf ("                                  - SLICE USER INTERFACE -\n");
printf ("                                      Version %-1.2f\n\n\n",VERSION);
printf ("     Current Object:  %s\n",object_name);
printf ("Database File Name:  %s",user_info->input_filename);
switch (user_info->file_type) {
  case 0:
    printf (", ASCII format");
    break;
  case 1:
    printf (", Binary format");
    break;
}
printf("\n");
printf("  Extra Parameters:  %s\n",user_info->extra_parameters);
printf("\n");
printf (" Alter    - Alter standard options\n");
printf (" Extra    - Set extra parameters\n");
printf ("\n");
printf (" Load     - Load a different object's options\n");
printf (" Save     - Save current object's options\n");
printf (" Write    - Save current option's under different object name\n");
printf (" Copy     - Copy another object's options into current object\n");
printf ("\n");
printf (" DoSlice - Do slicing with current options\n");
printf (" Quit     - Exit UI (Use SAVE to save options first)\n");
printf ("\n");
} /* show main menu */

/***********************************************************************/

process_UI_main (user_info,str_comm,object_name)
  USER_INFO_STRUC    *user_info;
  char               str_comm[];
  char               object_name[];
{
  unsigned int  option_val,temp;
  char option_str[3],option_chr;
  float tmp_float;

  do {
    show_main_menu(user_info,object_name);
    printf ("Which Command? ");
    getline(option_str,2);
    option_chr = toupper(option_str[0]);
    process_command (option_chr,user_info, str_comm,object_name);
  } while (option_chr != 'Q');
}  /* process_UI_main */

/***********************************************************************/

process_command (option_chr,user_info,str_comm,object_name)
  char               option_chr;
  USER_INFO_STRUC    *user_info;
  char               str_comm[];
  char               object_name[];
{
  char               temp_name[STR_LEN];

  switch (option_chr)
  {
    case 'A':  process_UI_option(user_info,str_comm,object_name);
               break;
    case 'E':  set_extra_parameters(user_info);
               break;
```

```
    case 'L':  load_UI_data_file(user_info.object_name);
               break;
    case 'S':  save_UI_data_file(user_info.object_name);
               break;
    case 'W':  printf("New object name to save under? ");
               getline(temp_name,STR_LEN);
               save_UI_data_file(user_info,temp_name);
               break;
    case 'C':  copy_UI_data_file(user_info);
               break;
    case 'D':  slice_UI data_file(user_info.str_comm.object_name);
               break;
  }
} /* process_command */

/**************************************************************************/

parse_number(line,ptr_passed,num)
  char line[];
  int  *ptr_passed;
  float *num;
{
  int sign,ptr;
  float base,fraction_base;
  BOOLEAN good_num;

  ptr = *ptr_passed;

  while (line[ptr] == ' ') ptr++;
  if (line[ptr] == '-') sign = -1;
  else sign = 1;
  if (strchr("+-",line[ptr]) != NULL) ptr++;

  base = 0;
  fraction_base = 0;
  good_num = FALSE;
  while ((line[ptr] == '.') || ((line[ptr] >= '0') && (line[ptr] <= '9')))
  {
    if (line[ptr] != '.') {
      good_num = TRUE;
      if (fraction_base == 0.0) {
        base = base * 10 + (line[ptr++] - '0');
      } else {
        base = base + ((float) (line[ptr++] - '0') * fraction_base);
        fraction_base = fraction_base / 10.0;
      }
    } else {
      fraction_base = 0.1;
      ptr++;
    }
  }

  *ptr_passed = ptr;
  *num = sign * base;
  if (((line[ptr] != ' ') && (line[ptr] != ',') && (line[ptr] != '\0')) || !good_r
  {
    *num = 0;
    return(FALSE);
  } else {
    *ptr_passed++;
    return(TRUE);
  }
}

/**************************************************************************.
```

```
getline(s,lim)
  char s[];
  unsigned int lim;
{
  int c,i;

  FLUSH_IN;
  i = 0;
  c = getchar();
  while ((i<lim) && (c != EOF) && (c!='\n') && (c!=LF))
  {
    s[i] = c;
    i++;
    c = getchar();
  }
  s[i] = '\0';
  FLUSH_IN;
  return(i);
}

/*****************************************************************************/

find_z_level(user_info,level,index)
  USER_INFO_STRUC  *user_info;
  float     level;
  unsigned *index;
{
  unsigned i;

  i=0;
  while ((user_info-> z_level[i] < level) &&
         (user_info-> z_level[i] >= 0) &&
         (i < MAX_Z_TABLE)) i++;
  *index = i;
}

/*****************************************************************************/

insert_z_table(user_info,level,spacing,message)
  USER_INFO_STRUC  *user_info;
  float level,spacing;
  char message[];
{
  unsigned i,j;

  if ((user_info-> z_level[MAX_Z_TABLE-1] >= 0.0) &&
      (user_info-> z_level[MAX_Z_TABLE-1] != level))
  {
    strcpy(message,"**** Table Full.  Cannot Add New Level ****");
  } else {
    find_z_level(user_info,level,&i);
    if ((user_info-> z_level[i] != level) && (user_info-> z_level[i] >= 0))
    {
      for (j=MAX_Z_TABLE-1; (j > i); j--)
      {
        user_info-> z_level[j] = user_info-> z_level[j-1];
        user_info-> z_level_spacing[j] = user_info-> z_level_spacing[j-1];
      }
    }
    user_info-> z_level[i] = level;
    user_info-> z_level_spacing[i] = spacing;
  }
}

/*****************************************************************************/
```

```
delete_z_level(user_info,level,message)
  USER_INFO_STRUC  *user_info;
  float level;
  char message[];
{
  unsigned i,j;

  find_z_level(user_info,level,&i);
  if ((user_info-> z_level[i] != level) || (i == MAX_Z_TABLE))
  {
    strcpy(message,"**** Level does not exist ****");
  } else {
    for (j=i; j<(MAX_Z_TABLE-1); j++)
    {
      user_info-> z_level[j] = user_info-> z_level[j+1];
      user_info-> z_level_spacing[j] = user_info-> z_level_spacing[j+1];
    }
    user_info-> z_level[MAX_Z_TABLE-1] = -1;
  }
}

/****************************************************************************/

show_z_table(user_info,linenum)
  USER_INFO_STRUC  *user_info;
  unsigned int *linenum;
{
  unsigned int i,next_line;

  CLRSCR;
  printf("          Z Level");
  printf("                                              ");
  printf("Spacing\n");
  printf("          -------");
  printf("                                              ");
  printf("-------\n");
  next_line = 3;
  for (i=0; (user_info->z_level[i] != 0) && (i < MAX_Z_TABLE); i++)
  {
    printf("       %9.3f ",user_info->z_level[i]);
    printf(". . . . . . . . . . . . . . . . . . .");
    printf(" %9.3f\n",user_info->z_level_spacing[i]);
    next_line++;
  }
  *linenum = next_line;
}

/****************************************************************************/

void input_z_spacing (user_info_perm)
  USER_INFO_STRUC  *user_info_perm;
{
  USER_INFO_STRUC  user_info;
  char cmd,line[STR_LEN],message[STR_LEN];
  unsigned int i,linenum;
  float float_value,float_value_2;

  CLRSCR;
  printf("\n\nZ-Spacing Input\n");
  printf("===============\n\n");
  do {
    printf("Fixed or Variable Z-Spacing (F, V or Q)? ");
    getline(line,1);
    cmd = toupper(line[0]);
  } while (strchr("FVQ",cmd) == NULL);
```

```
switch (cmd) {
  case 'F':
    do {
      printf("\nFixed Z-Spacing Value? ");
      getline(line,STR_LEN-1);
      i = 0;
      parse_number(line,&i,&float_value);
    } while ((float_value <= 0) || (float_value >= 65535.0));
    user_info_perm-> z_spacing = float_value;
    break;
  case 'V':
    strcpy(message," ");
    memcpy(&user_info,user_info_perm,sizeof(USER_INFO_STRUC));
    user_info.z_spacing = 0.0;
    do {
      do {
        show_z_table(&user_info,&linenum);
        while (linenum < 23)
        {
          printf("\n");
          linenum++;
        }
        printf("%s\n",message);
        printf("Command (A,D,S,Q,Help)? ");
        getline(line,STR_LEN-1);
        cmd = toupper(line[0]);
        if (cmd == '\0' || strchr("ADSQH",cmd) == NULL)
          strcpy(message,"**** Enter Valid Command ****");
      } while (cmd == '\0' || strchr("ADSQH",cmd) == NULL);
      strcpy(message," ");
      switch (cmd) {
        case 'H':
          printf("\nZ-Spacing Help Commands:\r\n");
          printf("  A level spacing     Add new level and spacing value to table\
          printf("  D level             Delete level from table\n");
          printf("  S                   Save table, return to options menu\n");
          printf("  Q                   Quit, return to options menu, don't save
          printf("  H                   print this Help message\n");
          printf("\n Note: All values are in CAD Units\n");
          wait_key();
          break;
        case 'A':
          i = 1;
          if (!parse_number(line,&i,&float_value))
            strcpy(message,"**** Invalid Numeric input for level ****");
          else {
            if (float_value < 0.0)
              strcpy(message,"**** Level must be a positive number ****");
            else {
              if (!parse_number(line,&i,&float_value_2))
                strcpy(message,"**** Invalid Numeric input for spacing ****");
              else {
                if (float_value_2 <= 0.0)
                  strcpy(message,"**** Spacing must be greater than zero ****");
                else {
                   insert_z_table(&user_info, float_value, float_value_2,message
                }
              }
            }
          }
          break;
        case 'D':
          i = 1;
          if (!parse_number(line,&i,&float_value))
            strcpy(message,"**** Invalid Numeric input for level ****");
          else {
```

```
              if (float_value < 0.0)
                strcpy(message,"**** Level must be a positive number ****");
              else {
                delete_z_level(&user_info, float_value,message);
              }
            }
            break;
          case 'S':
            memcpy(user_info_perm,&user_info,sizeof(USER_INFO_STRUC));
            printf("=== Variable Z-Spacing Information Saved ===\n");
            wait_key();
            break;
        } /* ADSQH */
      } while (strchr("SQ",cmd) == NULL);
      break; /* V */
  } /* VFQ */
} /* input_z_spacing */

/*********************************************************************/

copy_UI_data_file (user_info)
  USER_INFO_STRUC   *user_info;
{
  FILE  *file_ptr;
  char  object_name[STR_LEN],filename[STR_LEN],temp1[STR_LEN],temp2[STR_LEN];
  unsigned int file_type;

  printf ("Object name to copy? ");
  getline(object_name,STR_LEN);
  strcpy(filename,object_name);
  strcat (filename,UI_FILE_EXT);
  if (!file_exist(filename))
  {
    printf("**** Cannot find User Interface data file for %s ****\n",object_name);
  } else {
    strcpy(temp1,user_info-> input_filename);
    file_type = user_info->file_type;
    strcpy(temp2,user_info-> segfile_name);
    get_user_info_from_file(user_info,object_name);
    strcpy(user_info-> input_filename,temp1);
    user_info-> file_type = file_type;
    strcpy(user_info-> segfile_name,temp2);
    printf("User Interface Options for %s Copied\n",object_name);
  }
  wait_key();
} /* copy_UI_data_file */

/*********************************************************************/

set_extra_parameters (user_info)
  USER_INFO_STRUC   *user_info;
{
  char temp[STR_LEN];

  CLRSCR;
  printf("\n");
  printf("Extra Parameters allows you to specify non-standard slice options\n");
  printf("for inclusion in the slice command line.  What parameters are valid\n");
  printf("is based on the version of Slice you will use.\n\n");
  printf("The following parameters have been known to exist:\n\n");
  printf("  -x        part's height is in the x-axis\n");
  printf("  -y        part's height is in the y-axis\n");
  printf("  -aries    use the non-standard Aries CAD System input file format\n");
  printf("\n\n");
  printf("Current Extra Parameters are:\n");
  printf("%s\n\n",user_info->extra_parameters);
```

```
  printf("Enter new Extra Parameters or just press Enter to keep old:\n");
  getline(temp,STR_LEN-1);
  if (strlen(temp)>0) {
    if (strcmp(temp," ")==0) strcpy(user_info->extra_parameters,"");
    else strcpy(user_info->extra_parameters,temp);
  }
}

/***************************************************************************/

load_UI_data_file (user_info,object_name)
  USER_INFO_STRUC    *user_info;
  char               object_name[];
{
  FILE  *file_ptr;
  char  filename[STR_LEN];

  printf ("Object name to load? ");
  getline(object_name,STR_LEN);
  strcpy(filename,object_name);
  strcat (filename,UI_FILE_EXT);
  if (!file exist(filename))
  {
    printf("==== Cannot find User Interface data file for %s\n",object_name);
    printf("==== Setting options to User Interface defaults\n");
    init_user_info(user_info,object_name);
  } else {
    get_user_info_from_file(user_info,object_name);
    printf("User Interface Options for %s Loaded\n",object_name);
  }
  wait_key();
} /* load_UI_data_file */

/***************************************************************************/

slice_UI_data_file (user_info,str_comm,object_name)
  USER_INFO_STRUC    *user_info;
  char               str_comm[],
  char               object name[];
{
  char      z_space_file[STR_LEN],slice_version[5];

  strcpy(z_space_file,object_name);
  strcat(z_space_file,Z_SPACE_EXT);
  printf("Slice Version to use (Default %s)? ",SLICE_VER);
  getline(slice_version,4);
  if (slice_version[0] == '\0') strcpy(slice_version,SLICE_VER);
  set_command_line (user_info,object_name,str_comm,z_space_file,slice_version);
  run_slice (user_info, str_comm,z_space_file);
}  /* slice_UI_data_file */

/*******************************************************************************************/

show_option_menu(user_info,object_name)
  USER_INFO_STRUC  *user_info;
  char             object_name[];
{
  char           filename [STR_LEN];
  unsigned int   i;

  CLRSCR;
  printf ("                              - SLICE USER INTERFACE -\n");
  printf ("                                     Version %-1.2f\n\n\n",VERSION);
  printf ("    Current Object: %s\n\r",object_name);
  printf ("Option  Description                                            Value          Int
  printf ("------  -----------                                            -----          ---
```

```
  printf (" (1)    DATABASE File Name                                      %s ",user_info->inpu
  switch (user_info->file_type) {
    case 0:
      printf ("(ASCII)");
      break;
    case 1:
      printf ("(Binary)");
      break;
    }
  printf ("\n");

  printf (" (2)    Resolution                                              %-8.3f\n",user_info-

  printf (" (3)    Z-Spacing                                               ");
  if (user_info->z_spacing != 0.0)
  {
    printf ("%-8.3f Fixed   %c%u\n", user_info->z_spacing,exact(user_info,user_inf
            scaled(user_info,user_info->z_spacing));
  } else {
    printf ("Variable\n");
  }

  printf (" (4)    X hatch spacing                                         %-8.3f        %c%u\
    user_info->x_hatch_spacing,exact(user_info,user_info->x_hatch_spacing),
    scaled(user_info,user_info->x_hatch_spacing));
  printf (" (5)    Y hatch spacing                                         %-8.3f        %c%u\
    user_info->y_hatch_spacing,exact(user_info,user_info->y_hatch_spacing),
    scaled(user_info,user_info->y_hatch_spacing));
  printf (" (6)    60/120 degree hatch spacing                             %-8.3f        %c%u\
    user_info->angle_hatch_spacing,exact(user_info,user_info->angle_hatch_spacing)
    scaled(user_info,user_info->angle_hatch_spacing));
  printf (" (7)    X skin fill spacing                                     %-8.3f        %c%u\
    user_info->x_flat_fill_spacing,exact(user_info,user_info->x_flat_fill_spacing)
    scaled(user_info,user_info->x_flat_fill_spacing));
  printf (" (8)    Y skin fill spacing                                     %-8.3f        %c%u\
    user_info->y_flat_fill_spacing,exact(user_info,user_info->y_flat_fill_spacing)
    scaled(user_info,user_info->y_flat_fill_spacing));
  printf (" (9)    Minimum Surface Angle for scanned facets   %u\n",user_info->min
  printf (" (10)   Minimum Hatch Intersect Angle              %u\n",user_info->min
  printf (" (11)   Segment Output File Name                   %s\n",user_info->seg
  printf (" (Q)    Quit, return to Main Menu\n");
  printf ("\n");
}; /* show_option_menu */

/*************************************************************************/

process_UI_option (user_info,str_comm,object_name)
  USER_INFO_STRUC   *user_info;
  char              str_comm[];
  char              object_name[];
{
  unsigned int  option_val,temp;
  char option_str[3],option_chr;
  float temp_float;

  do {
    show_option_menu(user_info,object_name);
    printf ("Alter which Option? ");
    getline(option_str,2);
    option_chr = toupper(option_str[0]);
    option_val = 0;
    temp = 0;
    parse_number(option_str,&temp,&temp_float);
    option_val = temp_float;
    process_option (option_val,user_info);
  } while (option_chr != 'Q');
```

```
} /* process_UI_option */

/*****************************************************************************/

process_option (option_val,user_info)
  int              option_val;
  USER_INFO_STRUC  *user_info;
{
  int  temp;

  switch (option_val)
  {
    case  1 :  input_filename (user_info);
               break;
    case  2 :  printf ("Enter resolution value : ");
               user_info->resolution = read_float(FALSE);
               if (user_info->resolution == 0)
                 user_info-> resolution = 1.0;
               break;
    case  3 :  input_z_spacing (user_info);
               break;
    case  4 :  input_hx (user_info);
               break;
    case  5 :  input_hy (user_info);
               break;
    case  6 :  input_ahs (user_info);
               break;
    case  7 :  input_hfx (user_info);
               break;
    case  8 :  input_hfy (user_info);
               break;
    case  9 :  input_msa (user_info);
               break;
    case  10:  input_mia (user_info);
               break;
    case  11:  printf ("Enter segment file name : ");
               getline(user_info->segfile_name,STR_LEN-1);
               if (strchr(user_info->segfile_name,'.') == NULL)
                 strcat(user_info->segfile_name,SLICE_OUTPUT_EXT);
               break;
  }
} /* process_option */

/*****************************************************************************/

input_filename (user_info)
  USER_INFO_STRUC  *user_info;
{
  char line[2];

  printf ("Object Data File Name? ");
  getline(user_info->input_filename,STR_LEN-1);
  if (strchr(user_info->input_filename,'.') == NULL)
    strcat(user_info->input_filename,SLICE_INPUT_EXT);
  do {
    printf ("File Type Binary or ASCII (B,A)? ");
    getline(line,1);
    line[0] = toupper(line[0]);
  } while ((line[0] != 'A') && (line[0] != 'B'));
  if (line[0] == 'A') user_info->file_type = 0;
  else user_info->file_type = 1;
} /* input_filename */

/*****************************************************************************/

input_hfy (user_info)
```

```
  USER_INFO_STRUC  *user_info;
{
  printf ("Enter Y skin fill spacing value (hfy): ");
  user_info->y_flat_fill_spacing = read_float(TRUE);
}  /* input_hfy */

/**************************************************************************/

input_hfx (user_info)
  USER_INFO_STRUC  *user_info;
{
  printf ("Enter X skin fill spacing value (hfx): ");
  user_info->x_flat_fill_spacing = read_float(TRUE);
} /* input_hfx */

/**************************************************************************/

input_hy (user_info)
  USER_INFO_STRUC  *user_info;
{
  printf ("Enter Y hatch spacing value (hy):");
  user_info->y_hatch_spacing = read_float(TRUE);
} /* input_hy */

/**************************************************************************/

input_hx (user_info)
  USER_INFO_STRUC  *user_info;
{
  printf ("Enter X hatch spacing value (hx): ");
  user_info->x_hatch_spacing = read_float(TRUE);
}  /* input_hx */

/**************************************************************************/

input_ahs (user_info)
  USER_INFO_STRUC  *user_info;
{
  printf ("Enter a value for 60-120 angle hatch spacing : ");
  user_info->angle_hatch_spacing = read_float(TRUE);
}  /* input_ahs */

/**************************************************************************/

input_mia (user_info)
  USER_INFO_STRUC  *user_info;
{
  printf ("Enter Minimum Intersect Angle value (mia): ");
  user_info->min_intersect_angle = read_int();
}  /* input_mia */

/**************************************************************************/

input_msa (user_info)
  USER_INFO_STRUC  *user_info;
{
  printf ("Enter a Minimum Surface Angle value (msa): ");
  user_info->min_surface_angle = read_int();
} /* input_msa */

/**************************************************************************/

select_centering (user_info)
  USER_INFO_STRUC  *user_info;
{
  char  ans;
```

```
  printf ("Enter Y for centering. N for not centering : ");
  ans = getchar();
  if (toupper(ans) == 'Y') user_info->centering = TRUE;
  else user_info->centering = FALSE;
} /* select centering */

/*************************************************************************/

init_user_info (user_info,object_name)
  USER_INFO_STRUC  *user_info;
  char             object_name[];
{
  unsigned i;

  user_info-> version = VERSION;
  strcpy(user_info->input_filename,object_name);
  strcat(user_info->input_filename, SLICE_INPUT_EXT);
  user_info->file_type            = 2;
  user_info->resolution           = 1.0;
  user_info->z_spacing            = 10.0;
  user_info->y_flat_fill_spacing = 0.0;
  user_info->x_flat_fill_spacing = 0.0;
  user_info->y_hatch_spacing      = 0.0;
  user_info->x_hatch_spacing      = 0.0;
  user_info->angle_hatch_spacing = 0.0;
  user_info->min_surface_angle    = 0;
  user_info->min_intersect_angle = 0;

  strcpy(user_info->extra_parameters,"-ARIES -Y");
  strcpy (user_info->segfile_name,object_name);
  strcat (user_info->segfile_name, SLICE_OUTPUT_EXT);
  user_info->centering = FALSE;

  for (i=0; i < MAX_Z_TABLE; i++)
    user_info-> z_level[i] = -1;
} /* init user_info */

/*************************************************************************/

set_command_line (user_info,object_name,str_comm,z_space_file,slice_version)
  USER_INFO_STRUC   *user_info;
  char              object_name[];
  char              str_comm[];
  char              z_space_file[],slice_version[];
{
  char    ch[STR_LEN];
  int     i;
  FILE    *file_ptr;

  strcpy (str_comm, SLICE_PGM);
  strcat (str_comm, slice_version);
  strcat (str_comm, " <");
  strcat (str_comm, user_info->input_filename);
  strcat (str_comm, " ");

  switch (user_info->file_type) {
    case 1:
      strcat (str_comm, BINARY_TXT);
      strcat (str_comm, " ");
      break;
    }

  if (strcmp(slice_version,"240") < 0)
    strcat (str_comm, SCALE_TXT);
```

```
else strcat (str_comm, RES_TXT);
sprintf (ch, " %-1.3f ", user_info->resolution);
strcat  (str_comm,ch);

if (user_info->z_spacing != 0.0)
{
  strcat  (str_comm, Z_SPACE_TXT);
  sprintf (ch, " %u ", scaled(user_info,user_info->z_spacing));
  strcat  (str_comm, ch);
} else {
  strcat (str_comm, VAR_Z_SPACE_TXT);
  strcat (str_comm, " ");
  strcat (str_comm, z_space_file);
  strcat (str_comm, " ");

  openfile (z_space_file, &file_ptr, "w");
  for (i=0; ((i < MAX_Z_TABLE) && (user_info->z_level[i] >= 0)); i++)
    fprintf(file_ptr,"%u %u\n",
      scaled(user_info,user_info->z_level[i]),
      scaled(user_info,user_info->z_level_spacing[i]));
  fclose(file_ptr);
}

if (user_info->x_flat_fill_spacing != 0)
{
  strcat (str_comm, X_FLAT_FILL_TXT);
  sprintf(ch, " %u ", scaled(user_info,user_info->x_flat_fill_spacing));
  strcat (str_comm, ch);
}
if (user_info->y_flat_fill_spacing != 0)
{
  strcat (str_comm, Y_FLAT_FILL_TXT);
  sprintf(ch, " %u ", scaled(user_info,user_info->y_flat_fill_spacing))
  strcat (str_comm, ch);
}

if (user_info->x_hatch_spacing != 0)
{
  strcat (str_comm, X_HATCH_TXT);
  sprintf(ch, " %u ", scaled(user_info,user_info->x_hatch_spacing));
  strcat (str_comm, ch);
}
if (user_info->y_hatch_spacing != 0)
{
  strcat (str_comm, Y_HATCH_TXT);
  sprintf(ch, " %u ", scaled(user_info,user_info->y_hatch_spacing));
  strcat (str_comm, ch);
}
if (user_info->angle_hatch_spacing !=0)
{
  strcat (str_comm, ANGLE_HATCH_TXT);
  sprintf (ch, " %u ", scaled(user_info,user_info->angle_hatch_spacing));
  strcat  (str_comm, ch);
}

if (user_info->min_surface_angle != 0)
{
  strcat (str_comm, MSA_TXT);
  sprintf(ch, " %u ", user_info->min_surface_angle);
  strcat (str_comm, ch);
}
if (user_info->min_intersect_angle != 0)
{
  strcat (str_comm, MIA_TXT);
  sprintf(ch, " %u ", user_info->min_intersect_angle);
  strcat (str_comm, ch);
```

```
  }
  if (user_info->centering)
  {
    strcat (str_comm, CENTERING_TXT);
    strcat (str_comm, " ");
  }

  strcat (str_comm, CUT_FILE_TXT);
  strcat (str_comm, " ");
  strcat (str_comm, user_info->segfile_name);

  if (strlen(user_info->extra_parameters)>0) {
    strcat(str_comm, " ");
    strcat(str_comm, user_info->extra_parameters);
  }
} /* set_command_line */

/*******************************************************************************/

run_slice (user_info,str_comm,z_space_file)
  USER_INFO_STRUC    *user_info;
  char               str_comm[];
  char               z_space_file[];
{
  int  rc,i = 0,j = 0;
  char temp[STR_LEN];

  printf ("Slice Command Line:\n");
  while (str_comm[i] != '\0') {
    if ((j > 65) && (str_comm[i] == ' ')) {
      j = 0;
      printf("\n          ");
    }
    printf ("%c", str_comm[i++]);
    j++;
  }
  printf("\n\n");
  fflush(stdout);

/*
    timestamp and execute slice command
*/
  time(&system_time);
  time_val1 = times(&timestamp1);
  rc = system (str_comm);
  time_val2 = times(&timestamp2);

/*
    record slice activity in log file
*/
  openfile (log_file_name, &log_file_ptr, "a");
  fprintf(log_file_ptr,"%s\n",str_comm);
  fprintf(log_file_ptr,"%s CODE=%d REAL=%lu CPU=%lu\n",ctime(&system_time),rc,
    time_val2-time_val1,
    timestamp2.tms_cutime + timestamp2.tms_cstime
    - timestamp1.tms_cutime - timestamp1.tms_cstime);
  fclose(log_file_ptr);


  if (file_exist(z_space_file))
  {
    strcpy(temp,"rm ");
    strcat(temp,z_space_file);
    system(temp);
  }
  if ((rc != 0)
```

```
  {
    printf ("\n*\n");
    printf ("* WARNING:  SLICE ERROR DETECTED  RC = %d\n", rc);
    printf ("*\n");
  } else printf (" SLICE COMPLETED\n");

  wait_key();
} /* run_slice */

/*****************************************************************************/

main(argc,argv)
  int  argc;
  char *argv[];
{
  USER_INFO_STRUC   user_info;
  char              object_name[STR_LEN];
  char              str_comm[200], ans[STR_LEN],ans2[STR_LEN];

  strcpy  (ans, "     ");
  get_object_name (argc,argv,object_name);
  get_user_info_from_file (&user_info, object_name);

  process_UI_main (&user_info,str_comm,object_name);
  update_last_UI (object_name);
  printf("\n");
  exit(0);
}
```

UI.H

```
#define     LF                 10
#define     MAX_Z_TABLE        20
#define     STR_LEN            81
#define     BOOLEAN            short int
#define     TRUE               1
#define     FALSE              0

#define     VERSION_TXT         "version"
#define     IN_FILE_TXT         "datafile"
#define     FILETYPE_TXT        "filetype"
#define     EXTRA_PARAMS_TXT    "extra"

#define     OUT_FILE_TXT        "-sf"
#define     Z_SPACE_TXT         "-zs"
#define     SCALE_TXT           "-scale"
#define     RES_TXT             "-res"
#define     X_FLAT_FILL_TXT     "-hfx"
#define     Y_FLAT_FILL_TXT     "-hfy"
#define     X_HATCH_TXT         "-hx"
#define     Y_HATCH_TXT         "-hy"
#define     ANGLE_HATCH_TXT     "-ha"
#define     MSA_TXT             "-msa"
#define     MIA_TXT             "-mia"
#define     BINARY_TXT          "-b"
#define     CENTERING_TXT       "-c"
#define     VAR_Z_SPACE_TXT     "-zsf"

typedef struct    /* NOTE: Not the same as in SLICE */
{
   float        version;
   char         input_filename[STR_LEN];
   unsigned     file_type;
   char         segfile_name[STR_LEN];
   float        resolution;
   float        z_spacing;
   float        x_flat_fill_spacing;
   float        y_flat_fill_spacing;
   float        x_hatch_spacing;
   float        y_hatch_spacing;
   float        angle_hatch_spacing;
   unsigned     min_surface_angle;
   unsigned     min_intersect_angle;
   unsigned     centering;
   char         extra_parameters[STR_LEN];
   float        z_level[MAX_Z_TABLE],z_level_spacing[MAX_Z_TABLE];
} USER_INFO_STRUC;
```

```
{ ==============================================================================

  VIEW,  Pop-Up Laser Controller Status View Program

  for 3D Systems' Sterolithography System

  Version 2.60  by Tarnz Technologies

 ==============================================================================

  VIEW is a memory-resident pop-up utility that shows the status of
  the Tarnz Technologies' laser controller.  It can be called up from
  within any foreground program with just with a press of ALT-S.  The
  foreground program will be temporarily suspended until VIEW is
  cancelled.

  VIEW installs itself in the path of the keyboard key service routines
  and watches for an ALT-S.  When it see it, it "pops-up" with a status
  display of what the laser controller is doing, showing the size of
  both the Background Command and the Exec Command Queues and some other
  miscellaneous information.  When ALT-S is pressed again, VIEW "un-pops"
  and lets the previous foreground program continue.

  As long as VIEW is active, it shows the real-time status.  Any changes
  the laser controller background task makes will be immediately
  reflected in VIEW's display.

 ============================================================================== }

{

 Recent History:
  8/22/87  Ver 2.03  VIEW in development, not released
                     memory-resident laser controller status view program
                     nothing being reported
  8/25/87  Ver 2.04  version number updated only
  9/23/87  Ver 2.12  added MinSystemVersion check
  9/30/87  Ver 2.25  only updated version number
 11/12/87  Ver 2.30  first Beta software release
  1/25/88  Ver 2.60  version update only

}

{$C-,U-,K-}

type
  str16 = string[16];
  str80 = string[80];
  str255 = string[255];
  BitArray = array[0..15] of Integer;
  _Regpack = record
      case integer of
        1: (_AX,_BX,_CX,_DX,_BP,_SI,_DI,_DS,_ES,_Flags: Integer);
        2: (_AL,_AH,_BL,_BH,_CL,_CH,_DL,_DH: Byte);
      end;
  ScreenType = array[1..25,1..80,1..2] of char;
  XYType = record
    Xpos,Ypos: Byte;
  end;
  DisplayType = (Mono,CGA);
```

```
var
  ch,key,key2: Char;
  temp,cmd,op: str255;
  count,i,remline,Er,OpNum,code: Integer;
  ordkey,data,ViewSize,IOerr: Integer;
  LaserVersion,ViewVersion: str16;
  BiosRegs,regs: _RegPack;
  SaveScreen,PopUpScreen: ScreenType;
  done,reshow,VersionCheckFlag,LargeScreenChange: Boolean;
  SaveCursorPosition: XYType;
  CursorMode,ImageRow,ImageCol: Integer;
  Xstart,Ystart: Integer;
  LastVar: Byte;  { must be last variable defined }

  MonoVideoScreen: ScreenType absolute $B000:$0000;
  CGAVideoScreen:  ScreenType absolute $B800:$0000;

const
  ThisViewVersion  = '2.60';
  MinSystemVersion = '2.30';
  _LASERVECTOR = $64;
  _VIEWVECTOR  = $09;
  Display: DisplayType = Mono;
  Esc        = 27;
  AltS       = 27031;
  F1         = 27059;
  F2         = 27060;
  F3         = 27061;
  F4         = 27062;
  F5         = 27063;
  F6         = 27064;
  F7         = 27065;
  F8         = 27066;
  F9         = 27067;
  F10        = 27068;
  ShftF1     = 27084;
  ShftF2     = 27085;
  ShftF3     = 27086;
  ShftF4     = 27087;
  ShftF5     = 27088;
  ShftF6     = 27089;
  ShftF7     = 27090;
  ShftF8     = 27091;
  ShftF9     = 27092;
  ShftF10    = 27093;
  CtrlF1     = 27094;
  CtrlF2     = 27095;
  CtrlF3     = 27096;
  CtrlF4     = 27097;
  CtrlF5     = 27098;
  CtrlF6     = 27099;
  CtrlF7     = 27100;
  CtrlF8     = 27101;
  CtrlF9     = 27102;
  CtrlF10    = 27103;
  LeftArrow  = 27075;
  RightArrow = 27077;
  UpArrow    = 27072;
  DownArrow  = 27080;
  Home       = 27071;
  EndKey     = 27079;
  Ins        = 27082;
  Del        = 27083;
  CtrlC   = #3;
  HexDigits: str16 = '0123456789ABCDEF';
```

```
  sp40 = '                                                    ';
  AllBits = $FFFF;
  BitValue: BitArray =
    ($0001, $0002, $0004, $0008, $0010, $0020, $0040, $0080,
     $0100, $0200, $0400, $0800, $1000, $2000, $4000, $8000);
  Shutter = 0;  { control word bit 0 - shutter open/closed }
  SaveDSeg    : Integer = 0;
  Active      : Integer = 0;
  OrgKeyIntr  : Integer = 0;  { really a 2-word pointer }
  OrgKeyIntr2: Integer = 0;
  BIOS = $10;

label ExitProgram;

procedure ScreenRoutines: external 'SCREEN.EXE';
procedure FullScreenUpdate(var image: ScreenType); external ScreenRoutines[$200];
procedure ScreenUpdate(ch,Position: Integer);      external ScreenRoutines[$203];

function __LaserOk: Boolean;
  type
    CopyType  = array[1..20] of char;
  var
    CopyPtr: ^CopyType;
    CopyStr: string[20];
  begin
    with regs do begin
      _AX := ($35 shl 8) or _LASERVECTOR;
      Intr($21,regs);
      CopyPtr := Ptr(_Es,_BX-19);
    end;
    move(CopyPtr^[1],CopyStr[1],18);
    CopyStr[0] := #18;
    if CopyStr = 'Tarnz Technologies' then begin
      __LaserOk := true;
      with regs do
        CopyPtr := Ptr(_Es,_BX-46);
      move(CopyPtr^[1],LaserVersion[1],18);
      LaserVersion[0] := #4;
    end else begin
      __LaserOk := false;
      LaserVersion := '?.??';
    end;
  end;

function __LaserPresent: Boolean;
  begin
    if __LaserOk then __LaserPresent := true
    else begin
      __LaserPresent := false;
      writeln('LASER not installed.');
    end;
  end;

function __ViewOk: Boolean;
  type
    CopyType  = array[1..20] of char;
  var
    CopyPtr: ^CopyType;
    CopyStr: string[20];
  begin
    with regs do begin
      _AX := ($35 shl 8) or _VIEWVECTOR;
      Intr($21,regs);
      CopyPtr := Ptr(_Es,_BX-38);
    end;
    move(CopyPtr^[1],CopyStr[1],18);
```

```
    CopyStr[0] := #18;
    if CopyStr = 'Tarnz Technologies' then begin
      __ViewOk := true;
      with regs do
        CopyPtr := Ptr(_Es,_BX-65);
      move(CopyPtr^[1],ViewVersion[1],4);
      ViewVersion[0] := #4;
    end else begin
      __ViewOk := false;
      ViewVersion := '?.??';
    end;
  end;

function upper(text: str255): str255;
  var
    i: Integer;
    temp: str255;
  begin
    temp := text;
    for i := 1 to length(temp) do temp[i] := upcase(temp[i]);
    upper := temp;
  end;

function many(Ch: Char;num: Integer): str255;
  var
    temp: str255;
    i: Integer;
  begin
    temp := '';
    for i:=1 to num do temp  := temp+Ch;
    many := temp;
  end;

procedure ReadCommandLine(var line: str255);
  var CL: str80 absolute Cseg:$80;
  begin
    line := CL;
  end;

function CvtInt(num: Real): Integer;
  begin
    if num < 0 then CvtInt := 0
      else if num > 65535.0 then CvtInt := $FFFF
        else if num < 32768.0 then CvtInt := trunc(num)
          else if num > 32768.0 then CvtInt := trunc(num-65536.0)
            else num := $8000;
  end;

function sgn(num: Real): Integer;
  begin
    if num<0 then sgn := -1
      else if num>0 then sgn := 1
        else sgn := 0;
  end;

function CvtTicks(time: Real): Integer;
  begin
    CvtTicks := CvtInt(time * 119.0 / 10.0);
  end;

procedure RealParse(var RealNum: Real);
  begin
    val(temp,RealNum,code);
    temp := copy(temp,code+1,99);
  end;
```

```
procedure IntParse(var IntNum: Integer);
  var
    num: Real;
  begin
    val(temp,num,code);
    IntNum := CvtInt(num);
    temp := copy(temp,code+1,99);
  end;

function IntStr(num: Integer): str16;
  var
    temp: str16;
  begin
    if num>=0 then Str(num,temp) else Str(num+$8000,temp);
    IntStr := temp;
  end;

function RealStr(num: Real): str16;
  var
    temp: str16;
  begin
    if num<0 then Str(65536.0+num:6:0,temp)
      else Str(num:6:0,temp);
    while temp[1]=' ' do temp := copy(temp,2,6);
    RealStr := temp;
  end;

function rpt(ch: Char;len: Integer): str80;
  var
    i: Integer;
    temp: str80;
  begin
    temp := '';
    for i := 1 to len do temp := temp+ch;
    rpt := temp;
  end;

function spc(len: Integer): str80;
  begin
    spc := copy(sp40+sp40+sp40,1,len);
  end;

procedure beep;
  begin
    sound(1000);
    delay(250);
    NoSound;
  end;

procedure SetTextColor(atr: Byte);
  begin
    TextColor(atr and $0F);
    TextBackground(atr shr 4);
  end;

procedure ClearEol(atr: Byte);
  var
    oldX: Integer;
  begin
    SetTextColor(atr);
    ClrEol;
{     write(' ');
    while whereX>1 do write(' '); }
  end;

procedure ClearScreen(atr: Byte);
```

```
  var
    oldY: Integer;
  begin
    SetTextColor(atr);
    ClrScr;
{    gotoxy(1,1);
    oldY := 0;
    while oldY<>whereY do begin
      oldY := whereY;
      ClearEol(atr);
    end;
    gotoxy(1,1); }
  end;

procedure GetScreen(var image: ScreenType);
  begin
    port[$3D8] := 33;  { Video off }
    case Display of
      Mono: image := MonoVideoScreen;
      CGA : image := CGAVideoScreen;
    end;
    port[$3D8] := 41;  { Video back on }
  end;

procedure SetScreen(var image: ScreenType);
  begin
    if (Display=Mono) or LargeScreenChange then begin
      port[$3D8] := 33;
      case Display of
        Mono: MonoVideoScreen := image;
        CGA : CGAVideoScreen := image;
      end;
      port[$3D8] := 41;
      LargeScreenChange := false;
    end else FullScreenUpdate(image);
  end;

procedure ClearImage(var image: ScreenType);
  begin
    FillChar(Image,4000,0);
    ImageRow := 1;
    ImageCol := 1;
  end;

procedure ImageNewLine;
  begin
    ImageCol := 1;
    if ImageRow <25 then ImageRow := ImageRow + 1;
  end;

procedure GotoImage(col,row: Integer);
  begin
    ImageRow := row;
    ImageCol := col;
  end;

procedure ImageWriteCh(var image: ScreenType;ch: Char; atr: Byte);
  begin
    image[ImageRow,ImageCol,1] := ch;
    image[ImageRow,ImageCol,2] := chr(atr);
    ImageCol := ImageCol + 1;
  end;

procedure ImageWrite(var image: ScreenType;text: str80;atr: Byte);
  var
    i: Integer;
```

```
  begin
    for i := 1 to length(text) do ImageWriteCh(image,text[i],atr);
  end;

procedure ImageWriteln(var image: ScreenType;text: str80;atr: Byte);
  begin
    ImageWrite(image,text,atr);
    ImageNewLine;
  end;

procedure ImageLineWrite(var image: ScreenType;text: str80;atr: Byte;max: Integer
  begin
    ImageWrite(image,text,atr);
    while ImageCol<=max do
      ImageWrite(image,' ',atr);
    ImageNewLine;
  end;

procedure DrawBox(var image: ScreenType;x1,y1,x2,y2: Integer;BoxType: Integer;atr:
  type
    BoxMode = array[1..4] of Char;
{
    Box Types:
      1:  Single Line all around
      2:  Double Line all around
      3:  Single Line horizontal, Double Line vertical
      4:  Double Line horizontal, Single Line vertical
}
  const
                     {  Type          1     2     3     4     }
    UpperLeftCorner : BoxMode = (#218,#201,#214,#213);
    UpperRightCorner: BoxMode = (#191,#187,#183,#184);
    LowerLeftCorner : BoxMode = (#192,#200,#211,#212);
    LowerRightCorner: BoxMode = (#217,#188,#189,#190);
    HorzBar         : BoxMode = (#196,#205,#196,#205);
    VertBar         : BoxMode = (#179,#186,#186,#179);
  var
    i: Integer;
    FullHorzBar: str80;
  begin
    GotoImage(x1,y1);
    FullHorzBar := many(HorzBar[BoxType],x2-x1-1);
    ImageWriteCh(image,UpperLeftCorner[BoxType],atr);
    ImageWrite(image,FullHorzBar,atr);
    ImageWriteCh(image,UpperRightCorner[BoxType],atr);
    for i:=y1+1 to y2-1 do begin
      GotoImage(x1,i);
      ImageWriteCh(image,VertBar[BoxType],atr);
      GotoImage(x2,i);
      ImageWriteCh(image,VertBar[BoxType],atr);
    end;
    GotoImage(x1,y2);
    ImageWriteCh(image,LowerLeftCorner[BoxType],atr);
    ImageWrite(image,FullHorzBar,atr);
    ImageWriteCh(image,LowerRightCorner[BoxType],atr);
  end;

procedure BlankLine(var image: ScreenType;maxcol: Integer;atr: Byte);
  begin
    while ImageCol<=maxcol do ImageWriteCh(image,' ',atr);
    ImageNewLine;
  end;

procedure CursorOff;
  begin
    with BiosRegs do begin
```

```
      _AH := $03;
      Intr(BIOS,BiosRegs);
      if (_CX and $6000)<>$2000 then begin
        CursorMode := _CX;
        _AH := $01;
        _CH := $20;
        Intr(BIOS,BiosRegs);
      end;
    end;
  end;

procedure CursorOn;
  begin
    with BiosRegs do begin
      _AH := $01;
      _CX := CursorMode;
      Intr(BIOS,BiosRegs);
    end;
  end;

procedure RemXY(var XYvar: XYType);
  begin
    XYvar.Xpos := whereX;
    XYvar.Ypos := whereY;
  end;

procedure SetXY(XYvar: XYType);
  begin
    gotoxy(XYvar.Xpos,XYvar.Ypos);
  end;

procedure BuildPopUpScreen;
  var
    i: Integer;
  begin
    PopUpScreen := SaveScreen;
    DrawBox(PopUpScreen,Xstart,Ystart,Xstart+38,Ystart+13,2,$07);
    for i:=Ystart+1 to Ystart+12 do begin
      GotoImage(Xstart+1,i);
      BlankLine(PopUpScreen,Xstart+37,$20);
    end;
    GotoImage(Xstart+10,Ystart);
    ImageWrite(PopUpScreen,'  3D SYSTEMS VIEW  ',$17);
    GotoImage(Xstart+3,Ystart+2);
    ImageWrite(PopUpScreen,'                          MODES',$27);
    GotoImage(Xstart+3,Ystart+3);
    ImageWrite(PopUpScreen,'   Exec Queue Size: 0       BL+',$27);
    GotoImage(Xstart+3,Ystart+4);
    ImageWrite(PopUpScreen,'Command Queue Size: 0       FA-',$27);
    GotoImage(Xstart+3,Ystart+5);
    ImageWrite(PopUpScreen,'                            AS-',$27);
    GotoImage(Xstart+3,Ystart+6);
    ImageWrite(PopUpScreen,'Background State: IDLE',$27);
    GotoImage(Xstart+3,Ystart+7);
    ImageWrite(PopUpScreen,'  Timer Interval: 1190 us',$27);
    GotoImage(Xstart+3,Ystart+9);
    ImageWrite(PopUpScreen,'Trace: 4 2 2 3 2 6 2 2 2 1 2 2 2',$27);
    GotoImage(Xstart+3,Ystart+10);
    ImageWrite(PopUpScreen,'Error: . . . . . 5 . . . . . . . .',$27);
    GotoImage(Xstart+1,Ystart+12);
    ImageWrite(PopUpScreen,'         - Press ESC to exit -         ',$47);
  end;

procedure _readkey(var ch: Char);
  begin
    read(kbd,ch);
```

```
    ch := upper(ch);
  end;

procedure ReadKey;
  var
    gotkey: Boolean;
  begin
    gotkey := false;
    while not gotkey do begin
      _readkey(key);
      ordkey := ord(key);
      if (key=#27) and keypressed then begin
        _readkey(key2);
        ordkey := ord(key2)+27000;
      end;
      gotkey := true;
      reshow := false;
      case ordkey of
        LeftArrow : if Xstart > 1  then begin
            Xstart := Xstart - 1;
            reshow := true;
          end;
        RightArrow: if Xstart < 42 then begin
            Xstart := Xstart + 1;
            reshow := true;
          end;
        UpArrow   : if Ystart > 1  then begin
            Ystart := Ystart - 1;
            reshow := true;
          end;
        DownArrow : if Ystart < 12 then begin
            Ystart := Ystart + 1;
            reshow := true;
          end;
      end;
      if reshow then begin
        BuildPopUpScreen;
        SetScreen(PopUpScreen);
        gotkey := false;
      end;
      if (ordkey=AltS) or (ordkey=Esc) then done := true;
    end;
  end;

function ViewExternalIdentifier: str255;
  begin
    ViewExternalIdentifier :=
      'VIEW Utility Version 2.60 Copyright (C) 1988 by Tarnz Technologies ';
 end;


{ - - - - - - - - - - - - - - - - - - - - - - - - - - - - - - - - - - - - -


    Process VIEW Keyboard Interrupt

    - Interrupt 9 Handler -


  - - - - - - - - - - - - - - - - - - - - - - - - - - - - - - - - - - - - - }

procedure KeyboardHandler;
  begin
    INLINE (
      $5D/                     {        POP   BP          ;undo 2nd BP push     }
      $FB/                     {        STI               ;                     }
```

```
  $50/                        {          PUSH   AX           :                    }
  $E5/$60/                    {          IN     AX,60h       :                    }
  $3C/$1F/                    {          CMP    AL,31        :'S' scan code?      }
  $75/$25/                    {          JNE    KEY1         :                    }
  $B4/$02/                    {          MOV    AH,2         :                    }
  $CD/$16/                    {          INT    16H          :                    }
  $A8/$08/                    {          TEST   AL,8         ;Alt key?            }
  $74/$1D/                    {          JZ     KEY1         :                    }
  $E4/$61/                    {          IN     AL,61h       ;yes, reset keyboard }
  $8A/$E0/                    {          MOV    AH,AL        :                    }
  $0C/$80/                    {          OR     AL,80h       :                    }
  $E6/$61/                    {          OUT    61h,AL       :                    }
  $8A/$C4/                    {          MOV    AL,AH        :                    }
  $E6/$61/                    {          OUT    61h,AL       :                    }
  $FA/                        {          CLI                 ;enable interrupts   }
  $B0/$20/                    {          MOV    AL,20h       :                    }
  $E6/$20/                    {          OUT    20h,AL       :                    }
  $FB/                        {          STI                 ;enable interrupts   }
  $58/                        {          POP    AX           :                    }
  $2E/$80/$3E/Active/$00/     {          CMP    CS:[Active],0  :bring up VIEW     }
  $74/$09/                    {          JE     KINTR        :if not already active}
  $5D/                        {          POP    BP           :undo TURBO          }
  $CF/                        {          IRET                :                    }
                              {KEY1:                         :                    }
  $58/                        {          POP    AX           :handle ordinary key }
  $5D/                        {          POP    BP           :                    }
  $2E/$FF/$2E/OrgKeyIntr/     {          JMP    CS:[OrgKeyIntr]  :                }
                              {KINTR:                        :                    }
  $50/                        {          PUSH   AX           :save registers      }
  $53/                        {          PUSH   BX           :                    }
  $51/                        {          PUSH   CX           :                    }
  $52/                        {          PUSH   DX           :                    }
  $56/                        {          PUSH   SI           :                    }
  $57/                        {          PUSH   DI           :                    }
  $1E/                        {          PUSH   DS           :                    }
  $06/                        {          PUSH   ES           :                    }
  $2E/$8E/$1E/SaveDSeg);      {          MOV    DS,CS:[SaveDSeg] :set Data Seg    }

LargeScreenChange := true;
GetScreen(SaveScreen);
RemXY(SaveCursorPosition);
BuildPopUpScreen;
SetScreen(PopUpScreen);
Active := 1;
CursorOff;
done := false;
repeat
  ReadKey;
  write(key);
until done;
LargeScreenChange := true;
SetScreen(SaveScreen);
CursorOn;
SetXY(SaveCursorPosition);
Active := 0;

INLINE(
  $07/                        {          POP    ES           :restore registers   }
  $1F/                        {          POP    DS           :                    }
  $5F/                        {          POP    DI           :                    }
  $5E/                        {          POP    SI           :                    }
  $5A/                        {          POP    DX           :                    }
  $59/                        {          POP    CX           :                    }
  $5B/                        {          POP    BX           :                    }
  $58/                        {          POP    AX           :                    }
  $8B/$E5/                    {          MOV    SP,BP        :undo TURBO          }
```

```
        $5D/                    {       POP   BP          ;                      }
        $CF);                   {       IRET              ;                      }
     end;


{ - - - - - - - - - - - - - - - - - - - - - - - - - - - - - - - - - - - - - - -

     Memory Resident Routines

     After the following routines install the memory-resident routines
     above, they are thrown away and not used again.

  - - - - - - - - - - - - - - - - - - - - - - - - - - - - - - - - - - - - - - - }

procedure InstallVector;
  begin
    with regs do begin
      _AH := $35;                     { save old keyboard vector }
      _AL := _VIEWVECTOR;
      MsDos(regs);
      OrgKeyIntr  := _BX;
      OrgKeyIntr2 := _ES;

      _AH := $25;                     { install VIEW keyboard vector }
      _AL := _VIEWVECTOR;
      _DS := CSeg;
      _DX := Ofs(KeyboardHandler);
      MsDos(regs);
    end;
  end;

procedure ResidentTermination;
  begin
    with regs do begin
      _AH := $31;
      _AL := 1;
      _DX := ViewSize;
      MsDos(regs);
    end;
  end;

procedure InitMemoryResidency;
  begin
    SaveDSeg := Dseg;
    InstallVector;
  end;


{  - - - - -  }


procedure CheckForOptions(var str: str255);
  var
    i: Integer;
  begin
    while (length(str)>1) and (str[1]=' ') do delete(str,1,1);
    i := pos('/NC',str);  { no version check }
    if i>0 then begin
      VersionCheckFlag := false;
      delete(str,i,3);
    end;
  end;

{ - - -  M A I N   P R O G R A M  - - - }
```

```
begin
  writeln;
  writeln(#213,many(#205,54),#184);
  writeln(#179,'  VIEW, Pop-Up Laser Controller Status View Utility   ',#179);
  writeln(#179,'  3D Systems Laser Sterolithography System            ',#179);
  writeln(#179,'  Version '+ThisViewVersion+'  by Tarnz Technologies  November 198
  writeln(#212,many(#205,54),#190);
  writeln;
  ReadCommandLine(cmd);
  if not __LaserPresent then goto ExitProgram;
  if __ViewOk then begin
    writeln('VIEW Utility Version ',ViewVersion,' already installed.');
    goto ExitProgram;
  end;
  CheckForOptions(cmd);
  if VersionCheckFlag then
    if LaserVersion < MinSystemVersion then begin
      writeln('Wrong LASER version number.');
      goto ExitProgram;
    end;
  ViewSize := (ofs(InstallVector) + ofs(LastVar)) div 16 + $200;
  Xstart := 40;
  Ystart := 2;

  writeln('VIEW memory-resident utility installed using ',
    RealStr(ViewSize*16.0),' bytes.');

  InitMemoryResidency;
  ResidentTermination;

ExitProgram:
end.
```

```
{=============================================================================
   3D Systems Stereolithography System Software
 =============================================================================

  XFER.PAS
   SLA-1 File Transfer Utility Software

 -----------------------------------------------------------------------------

   History:
   11/12/87  Ver 2.30  first Beta software release
   12/02/87  Ver 2.31  reactivates tcp for Turbo Pascal V4.0 Menu
   12/17/87  Ver 2.40  telnet/ftp host is 'SliceComputer' (not 'process')
    1/11/88  Ver 2.50  support of different Ethernet types
                       based on SLA1.SYS file
    1/20/88  Ver 2.51  upper case X for exit
    1/25/88  Ver 2.60  version update only

 -----------------------------------------------------------------------------}

{$R-,S+,I+,D+,T-,F-,V-,B-,N-,L+ }
{$M 16384,0,16384 }

uses Crt,Dos;

type
  EthernetSupport = (_NoEthernet,_Excelan,_Micom,_Unknown);

var
  Ch: Char;
  Line,SingleBar: String;
  Ethernet: EthernetSupport;
  SystemFile,ErrorFile: Text;

const
  VersionId = '2.60';
  ComSpec = 'C:\COMMAND.COM';
  SystemFileName = 'C:\SLA1.SYS';
  ErrorFileName = 'C:\SYSTEM.ERR';

{
  Show error and store it on disk
}
procedure SystemError(Text: string);
begin
  writeln(Text);
  assign(ErrorFile,ErrorFileName);
  rewrite(ErrorFile);
  writeln(ErrorFIle,'XFER: ',Text);
  close(ErrorFile);
end;

function upper(text: string): string;
  var
    i: Integer;
    temp: string;
  begin
    temp := text;
    for i := 1 to length(temp) do temp[i] := upcase(temp[i]);
    upper := temp;
  end;

function many(Ch: Char;num: Integer): String;
  var
```

```
    temp: String;
    i: Integer;
  begin
    temp := '';
    for i:=1 to num do temp  := temp+Ch;
    many := temp;
  end;

procedure DetermineEthernetSupport;
begin
  Ethernet := _NoEthernet;
  assign(SystemFile,SystemFileName);
  {$I-}
  reset(SystemFile);
  {$I+}
  if IOresult=0 then begin
    while not eof(SystemFile) do begin
      readln(SystemFile,Line);
      Line := upper(Line);
      if copy(Line,1,9)='ETHERNET=' then begin
        case Line[10] of
          'N': Ethernet := _NoEthernet;
          'E': Ethernet := _Excelan;
          'M': Ethernet := _Micom;
          'U': Ethernet := _Unknown;
        end;
      end;
    end;
  end;
end;

begin
  DetermineEthernetSupport;
  SingleBar := many(#196,45);
  if Ethernet = _Excelan then Exec(ComSpec, '/C REX');
  repeat
    ClrScr;
    writeln(SingleBar);
    writeln('  XFER, Ethernet File Transfer');
    writeln('  3D Systems Laser Stereolithography System');
    writeln('  Version '+VersionId+'                3D Systems, Inc.');
    writeln(SingleBar);
    writeln;
    writeln;
    writeln;
    if Ethernet = _NoEthernet then begin
      SystemError('No Ethernet Communications Support');
      halt(1);
    end else begin
      case Ethernet of
        _Excelan: writeln('      using Excelan Ethernet support');
        _Micom  : writeln('      using Micom Interlan support');
        else writeln('      using unknown support');
      end;
      writeln;
      writeln;
      writeln('      1. TELNET, Terminal Utility');
      writeln('      2. FTP,    File Transfer Program');
      writeln('      X. Exit Program');
      writeln;
      writeln;
      write('      Which action? ');
      Ch := upcase(ReadKey);
      if Ch in ['1','2','X'] then begin
        writeln;
        writeln;
```

```
        case upcase(Ch) of
          '1': begin
                 Exec(ComSpec,'/C TELNET SliceComputer');
                 halt(0);
               end;
          '2': begin
                 Exec(ComSpec,'/C FTP SliceComputer');
                 halt(0);
               end;
          'X': halt(0);
        end;
      end;
    end;
  until 0=1;
end.
```

```
'==============================================================================
   3D Systems Stereolithography System Software
'==============================================================================
'
'  ZSTAGE.BAS
'  SLA-1 Z-Stage Control Program
'
'------------------------------------------------------------------------------
'
'  Recent History:
'  11/12/87  Ver 2.30  first Beta software release
'  11/15/87  Ver 2.31  fixed motor controller timing
'                      eliminated need for NUM LOCK
'   1/22/88  Ver 2.50  added motion status
'                      can move specified distances (inches)
'                      supports ZSTAGE.PRM file
'   1/25/88  Ver 2.60  version update only
'   2/24/88  Ver 2.61  Home Directory search for ZSTAGE.PRM fix
'                      displays source of ZSTAGE.PRM File
'
'------------------------------------------------------------------------------

  SCREEN 0,1
  CLS
  KEY OFF
  MOTION = 0
  VersionId$ = "2.61"
  ParamFileName$ = "ZSTAGE.PRM"
  HomeDir$ = "C:\3DSYS\"
  TIMEOUT = 0
  TRUE = -1
  FALSE = 0

  ON ERROR GOTO TryHome
  OpenedParamFileName$ = ""
  OPEN ParamFileName$ FOR INPUT AS #1
  OpenedParamFileName$ =ParamFileName$
  GOTO ReadParams
TryHome:
  RESUME TryHome2
TryHome2:
  ON ERROR GOTO CantReadParams
  OPEN HomeDir$ + ParamFileName$ FOR INPUT AS #1
  OpenedParamFileName$ = HomeDir$ + ParamFileName$
  GOTO ReadParams

CantReadParams:
  Address      = 800                ' assume these values
  Accel$       = ".5"
  Veloc$       = "1"
  BigDist$     = "2000000"
  MicroSteps   = 100000
  TimeoutValue = 2000
  RESUME PrepareMenu

CheckForOptions:
  I% = INSTR(CmdLine$,"/S")
  IF I%>0 THEN                            ' check for /S Show Stuff flag
    ShowStuff = TRUE
    CmdLine$ = LEFT$(CmdLine$,I%-1)+MID$(CmdLine$,I%+2)
  END IF
  I% = INSTR(CmdLine$,"/NEGZ")            ' check for /NEGZ Neg-Z Stage flag
  IF I%>0 THEN
    NegZStage = TRUE
```

```
    CmdLine$ = LEFT$(CmdLine$,I%-1)+MID$(CmdLine$,I%+5)
  END IF
  RETURN

ReadParams:
  ON ERROR GOTO 0
  LINE INPUT #1,A$
  IF LEN(A$)=0 OR LEFT$(A$,1)="!" THEN ReadParams
  I% = INSTR(2,A$,CHR$(34))
  IF I% > 0 THEN A$=LEFT$(A$,I%)
  CmdLine$ = FN NoQuotes$(A$)
  GOSUB CheckForOptions
  FOR I%=1 TO 6
ReadNextLine:
    LINE INPUT #1,A$
    IF LEN(A$)=0 OR LEFT$(A$,1)="!" THEN ReadNextLine
    V=VAL(A$)
    V$ = LEFT$(A$,INSTR(A$," ")-1)
    IF      I%=1 THEN Address      = V_
    ELSE IF I%=2 THEN Accel$       = V$_
    ELSE IF I%=3 THEN Veloc$       = V$_
    ELSE IF I%=4 THEN BigDist$     = V$_
    ELSE IF I%=5 THEN MicroSteps   = V_
    ELSE IF I%=6 THEN TimeoutValue = V
  NEXT I%
  CLOSE #1

PrepareMenu:
  CmdLine$ = COMMAND$
  GOSUB CheckForOptions

ShowMenu:
  ON ERROR GOTO 0
  CLS
  Indent$ = STRING$(22," ")
  PRINT Indent$;"ZSTAGE. Z-Stage Elevator Controller"
  PRINT Indent$;"3D Systems Stereolithography System"
  PRINT Indent$;"Version "+VersionId$+"       3D Systems, Inc."
  LOCATE 6,33
  IF TIMEOUT THEN PRINT "NO ELEVATOR"_
  ELSE PRINT "ELEVATOR STOP"
  Indent$ = STRING$(19," ")
  PRINT
  PRINT
  PRINT Indent$;"  UP ARROWS    for moving elevator up"
  PRINT
  PRINT Indent$;"DOWN ARROWS    for moving elevator down"
  PRINT
  PRINT Indent$;"  SPACE BAR    to stop elevator motion"
  PRINT
  PRINT Indent$;"          D    move a specified distance"
  PRINT
  PRINT Indent$;"     Q or X    to exit program"
  PRINT
  Row = CSRLIN
  LOCATE 21,1
  IF OpenedParamFileName$ = "" THEN
    L$ = "Not using any Parameter File:"
  ELSE
    L$ = "Using "+OpenedParamFileName$+" Parameter File:"
  END IF
  GOSUB CenterLine
  PRINT
  L$ = "Address ="+STR$(Address)+"  Accel = "+Accel$+"  Veloc = "+Veloc$
  IF NegZStage THEN L$ = L$ + "  /NEGZ"
  GOSUB CenterLine
```

```
  PRINT
  L$ = "Big Dist = "+BigDist$+"  Microsteps ="+STR$(MicroSteps)+_
    "  Timeout Value ="+STR$(TimeoutValue)
  GOSUB CenterLine
  LOCATE Row,1
  GOSUB Control
KeyLoop:
  A$=UCASE$(INKEY$):IF A$="" THEN KeyLoop
  IF A$="8" OR MID$(A$,2,1)="H" THEN EvelUp
  IF A$="2" OR MID$(A$,2,1)="P" THEN EvelDown
  IF A$="D" THEN MoveDistance
  IF A$="Q" OR A$="X" THEN Quit
  IF A$=" " THEN GOSUB Control
  GOTO KeyLoop

EvelUp:
  IF NegZStage THEN Dir$="+" ELSE Dir$ = "-"
  LOCATE 6,33
  PRINT "ELEVATOR UP  "
  GOTO MoveEvel

EvelDown:
  IF NegZStage THEN Dir$="-" ELSE Dir$ = "+"
  LOCATE 6,33
  PRINT "ELEVATOR DOWN"

MoveEvel:
  CMD$=" E MN A"+Accel$+" V"+Veloc$+" D"+Dir$+BigDist$+" G "
  GOSUB SendZStageCmd
  GOSUB RequestStatus
  GOTO ShowMenu

SendZStageCmd:
  IF ShowStuff THEN
    LOCATE 25,1
    PRINT SPC(79);
    LOCATE 25,1
    PRINT "ZSTAGE OUTPUT: ";CMD$;
  END IF
  IF RIGHT$(CMD$,1)<>CHR$(13) THEN CMD$=CMD$+CHR$(13)
  FOR I=1 TO LEN(CMD$)
    X$=MID$(CMD$,I,1)
    TIMEOUT = 0
    GOSUB SendChar
    IF TIMEOUT THEN RETURN
  NEXT I
  X$=CHR$(13)
  TIMEOUT = 0
  GOSUB SendChar
  IF TIMEOUT THEN RETURN

GetResponse:
  C$=""
GetResponse1:
  B=INP(Address+1)
  IF (B AND &H8)=0 THEN RETURN
  D=INP(Address)
  OUT Address+1,&HE0
  TC = 0
GetResponse2:
  TC = TC + 1
  IF TC > TimeoutValue THEN
    TIMEOUT = -1
    RETURN
  ELSE
    B=INP(Address+1)
```

```
    IF B AND &H8 THEN GetResponse2
  END IF
  OUT Address+1,&H60
  C$=C$+CHR$(D)
  IF D <> &HD THEN GetResponse1
  RETURN

SendChar:
  TC = 0
CharLoop1:
  TC = TC + 1
  IF TC > TimeoutValue THEN
    TIMEOUT = -1
    RETURN
  ELSE
    B=INP(Address+1)
    IF (B AND &H10)=0 THEN CharLoop1
  END IF
    OUT Address,ASC(X$)
    OUT Address+1,&H70
    TC = 0
CharLoop2:
  TC = TC + 1
  IF TC > TimeoutValue THEN
    TIMEOUT = -1
    RETURN
  ELSE
    B=INP(Address+1)
    IF B AND &H10 THEN CharLoop2
  END IF
  OUT Address+1,&H60
  RETURN

Control:
  OUT Address+1,&H64
  FOR Y = 1 TO 20 : NEXT        ' delays
  OUT Address+1,&H60
  FOR Y = 1 TO 1000 : NEXT
  OUT Address+1,&H40
  FOR Y = 1 TO 10 : NEXT
  OUT Address+1,&H60
  FOR I=1 TO 500 : NEXT
  RETURN

RequestStatus:
  CMD$="R"
  GOSUB SendZStageCmd
  IF TIMEOUT OR ((INSTR(C$,"*S")<>0)+(INSTR(C$,"*@")<>0)) THEN RETURN
  ZZ$=INKEY$
  IF ZZ$="" THEN RequestStatus
  CMD$="S"
  GOSUB SendZStageCmd
  RETURN

MoveDistance:
  LOCATE Row,1
  INPUT "Move how far (in inches)? ",F$
  IF F$="" THEN ShowMenu
  F = INT(VAL(F$) * MicroSteps)    ' convert to step units
  IF F < 0 THEN
    IF NegZStage THEN Dir$ = "+" ELSE Dir$ = "-"
    F = -F
  ELSE
    IF NegZStage THEN Dir$ = "-" ELSE Dir$ = "+"
  END IF
  Dist$ = STR$(F)
```

```
  IF LEFT$(Dist$,1) = " " THEN Dist$ = MID$(Dist$,2)
  CMD$=" E MN A"+Accel$+" V"+Veloc$+" D"+Dir$+Dist$+" G "
  GOSUB SendZStageCmd
  GOSUB RequestStatus
  GOTO ShowMenu

Quit:
  GOSUB Control
  CLS
  END

CenterLine:
  LOCATE ,(79-LEN(L$))/2
  PRINT L$;
  RETURN

'
'  Remove excess quote marks around string
'
DEF FN NoQuotes$(Text$)
  LOCAL S,E
  S = 1
  IF LEFT$(Text$,1)=CHR$(34) THEN S=S+1
  E = LEN(Text$)+1
  IF RIGHT$(Text$,1)=CHR$(34) THEN E=E-1
  FN NoQuotes$ = MID$(Text$,S,E-S)
END DEF
```

```
CALOUT.BAS      ver 2.60  2/12/88
 to convert sensor readings to calibration table
'specifies directory for STEREO.GEO. accepts .CAL input

'readings are every 889 bits = 0.2500"
'nearest above 65536 = 74 x 889  =  65786  =  65535 + 251
'therefore our table goes from 0 to 74
tlo%=0
thi%=74
DIM x3#(tlo%:thi%,tlo%:thi%),y3#(tlo%:thi%,tlo%:thi%)   'X & Y calibration tables
DIM x1#(tlo%:thi%+1),y1#(tlo%:thi%+1),x2#(tlo%:thi%+1),y2#(tlo%:thi%+1)  'sensors #

CLS
?
reread:

INPUT "Exact name of calibration file to be adjusted ";nm$
InputFile$= nm$                              '#1 - rename when saving
i%= INSTR(1,nm$,".")
IF i%>0 THEN nm$=LEFT$(nm$,i%-1)
OutputFile$=nm$+".GEO"                       '#2
DriftFile$= nm$+".DRF"                       '#2

'nearest to center is 37 x 889 = 32893  =  32767 + 126  (.0354")
'and our readings (-5" to + 5") are from array locations 17 to 57
'(NOTE X Axis is reversed: this was corrected by reading X from 5 to -5)

clo%=17
chi%=57
inc#=889

CLS
KEY OFF
LOCATE 5,1,1
?"Program to convert data from Beam Profiler Calibration Run"
?
INPUT "Customer name and/or SLA-1 Serial # ",nm$
?
INPUT "DX Serial # ",dx$
?
INPUT "Date of Calibration ",dt$

CLS
LOCATE 5,1,0
?"Filling Uncorrected Table"  '---------------------------------------------
FOR i% = tlo% TO thi%
   x3#=inc#*i%
   IF x3#<5 THEN x3#=5
   IF x3#>65530 THEN x3#=65530
   FOR j% = tlo% TO thi%
      x3#(i%,j%)=x3#
   NEXT j%
NEXT i%
FOR j% = tlo% TO thi%
   y3#=inc#*j%
   IF y3#<5 THEN y3#=5
   IF y3#>65530 THEN y3#=65530
   FOR i% = tlo% TO thi%
      y3#(i%,j%)=y3#
   NEXT i%
NEXT j%
```

```
Reading:
CLS
LOCATE 5,1,0
?"Reading Measured Values" '-------------------------------------------
  may later have text in .CAL file which should be saved

SUB ReadLine(x3#,y3#)     'later use temperature to check for drift
    LOCAL a$
   ReadLine:
    LINE INPUT #1,a$
    IF LEFT$(a$,1)="!" THEN ReadLine
    x3#=VAL(a$)
    y3#=VAL(MID$(a$,10,10))            'could parse to the commas?
END SUB

OPEN INPUTFILE$ FOR INPUT AS #1

'Should save the 32767.32767 readings at beginning & end
'to check for relative movement, or uncompensated drift.

FOR i% = clo% TO chi%
   CALL ReadLine(x1#(i%),y1#(i%))
   CALL ReadLine(x2#(i%),y2#(i%))
   FOR j% = clo% TO chi%
      CALL ReadLine(x3#(i%,j%),y3#(i%,j%))
      IF x3#(i%,j%)<10000 OR x3#(i%,j%)>55000
      OR y3#(i%,j%)<10000 OR y3#(i%,j%)>55000 THEN
         ?"WARNING: check files for possible wrong entries"
      END IF
   NEXT j%
NEXT I%
i%=chi%+1                         'just in case BASIC changes
CALL ReadLine(x1#(i%),y1#(i%))     extra reading bracketing calibration points
CALL ReadLine(x2#(i%),y2#(i%))
                                   ' may add 32767.32767 at beginning & end
CLOSE #1

CLS
LOCATE 5,1,0
?"Finding Mirror Drift"  '-----------------------------------------------

FOR I%=clo% TO chi%+1
   x1tot#=x1tot#+x1#(i%)/(chi%+1-clo%+1)     'could use arrays, but much easier to
   x2tot#=x2tot#+x2#(i%)/(chi%+1-clo%+1)
   y1tot#=y1tot#+y1#(i%)/(chi%+1-clo%+1)
   y2tot#=y2tot#+y2#(i%)/(chi%+1-clo%+1)
NEXT I%

FOR I%=clo% TO chi%+1
   xd#=x1tot#-x1#(i%)
    if xdmax#<xd# then xdmax#=xd#
    if xdmin#>xd# then xdmin#=xd#
    x1dev#=x1dev#+xd#*xd#/(chi%+1-clo%+1)
   xd#=x2tot#-x2#(i%)
    if xdmax#<xd# then xdmax#=xd#
    if xdmin#>xd# then xdmin#=xd#
    x2dev#=x2dev#+xd#*xd#/(chi%+1-clo%+1)
   yd#=y1tot#-y1#(i%)
    if ydmax#<yd# then ydmax#=yd#
    if ydmin#>yd# then ydmin#=yd#
    y1dev#=y1dev#+yd#*yd#/(chi%+1-clo%+1)
   yd#=y2tot#-y2#(i%)
    if ydmax#<yd# then ydmax#=yd#
    if ydmin#>yd# then ydmin#=yd#
    y2dev#=y2dev#+yd#*yd#/(chi%+1-clo%+1)
```

```
NEXT i%

OPEN DriftFile$ FOR OUTPUT AS #2

PRINT #2,"    x1tot#    x2tot#    y1tot#    y2tot# (bits)     "
PRINT #2, USING "######.##";x1tot#,x2tot#,y1tot#,y2tot#
PRINT #2,"    x1dev#    x2dev#    y1dev#    y2dev# (bits RMS)"
PRINT #2, USING "######.##";SQR(x1dev#),SQR(x2dev#),SQR(y1dev#),SQR(y2dev#)
PRINT #2,""
PRINT #2,"    x1#(i%)  x2#(i%)  y1#(i%)  y2#(i%)   (bits)    "
FOR i%=clo% TO chi%+1
   PRINT #2, USING "######.##";x1#(i%)-x1tot#;x2#(i%)-x2tot#;_
                                y1#(i%)-y1tot#;y2#(i%)-y2tot#
NEXT i%
CLOSE #2

FOR I%=clo% TO chi%+1        're-work the drift information -------------------
   xof#=((x1#(i%)+x2#(i%))-(x1tot#+x2tot#))/2  'bits
   yof#=((y1#(i%)+y2#(i%))-(y1tot#+y2tot#))/2  'bits
   xgn#=(x1#(i%)-x2#(i%))/(x1tot#-x2tot#)  'approximately = 1
   ygn#=(y1#(i%)-y2#(i%))/(y1tot#-y2tot#)  'approximately = 1
   're-use the x1#() etc. arrays
   x1#(i%)=xof#
   x2#(i%)=xgn#
   y1#(i%)=yof#
   y2#(i%)=ygn#
NEXT i%
OPEN DriftFile$ FOR APPEND AS #2
PRINT #2,""
PRINT #2,"    X offset X gain    Y offset Y gain (bits, bits/10":CHR$(34):")"
PRINT #2,""
FOR i%=clo% TO chi%+1
   PRINT #2, USING "#######.#";x1#(i%);(x2#(i%)-1)*35560_
                                y1#(i%);(y2#(i%)-1)*35560
NEXT i%
CLOSE #2

'needs to show temp. drift & ask whether to correct or use un-corrected * * *
    if ydmax#<yd# then ydmax#=yd#
    if ydmin#>yd# then ydmin#=yd#
   xd#=xdmax#-xdmin#     'both started from zero, must be + & -
   yd#=ydmax#-ydmin#
   IF xd#<yd# THEN xd#=yd#   'select larger
   PRINT
   PRINT "From measuring the apparent position of the beam profile sensors"
   PRINT "during calibration, we find total effective mirror drift"
   PRINT USING "####";xd#/3.556;
   PRINT " mils "
   PRINT
   FOR i = 1 to 10000
   NEXT i

   IF xd#>500 THEN
      PRINT "Program found wrong profiler pinholes, "
      PRINT ""
      PRINT "File will be written without attempting to correct for drift"
      GOTO writeout
   END IF
   IF xd#>35 THEN
      PRINT "Excessive drift, you may want to run again "
      PRINT "                    ?temperature drift
      PRINT "                    ?air conditioning direct air currents
      PRINT "                    ?insufficient warmup"
      PRINT
      IF xd#>100 THEN
      PRINT "File will be written without attempting to correct for drift"
```

```
         GOTO writeout
      END IF
      PRINT "DO YOU WANT TO USE THE TEMPERATURE CORRECTION OF CALIBRATION POINTS"
      PRINT "you may want to run this program again after studying the ";
      PRINT LEFT$(outputfile$,LEN(outputfile$)-4);".DRF file"
      DO
         K$=UCASE$(INKEY$)
      LOOP UNTIL K$="Y" OR K$="N"
      IF K$="N" THEN writeout
   END IF

'GOTO writeout ***** use when temperature drift file did not work
CLS
LOCATE 5,1,0
?"Adjusting Measured Values"  '-----------------------------------------------------

'NOTE: we will assume 32767 is at center of range, to 1st order
'       so we can use offset & gain (of & gn) independently
'
'       First calculate offset & gain for each set of readings,
'       then take proportionate part of the ones for beginning & end
'       of the Y Axis (j%) table movement:
'       --assume drift evenly distributed over time intervals between
'         readings. remember that profile measurements take time too.
'       Xnew = ( Xold - 32767 ) / Xgn  + 32767 - Xof
'       (how nice if numbers were centered on Zero!)

FOR i% = clo% TO chi%
'       need the range of corrections from beginning & end of Column
   xof#=x1#(i%)                                  'start
   xofd#=(x1#(i%+1)-x1#(i%))/(chi%-clo%+2)         'delta
   yof#=y1#(i%)                                  'start
   yofd#=(y1#(i%+1)-y1#(i%))/(chi%-clo%+2)         'delta
   xgn#=x2#(i%)                                  'start
   xgnd#=(x2#(i%+1)-x2#(i%))/(chi%-clo%+2)         'delta
   ygn#=y2#(i%)                                  'start
   ygnd#=(y2#(i%+1)-y2#(i%))/(chi%-clo%+2)         'delta

   FOR j% = clo% TO chi%
      x3#(i%,j%)=(x3#(i%,j%)-32767)/(xgn#+xgnd#*(j%-clo%+1))_
                                  +32767 - xof#-xofd#*(j%-clo%+1)
      y3#(i%,j%)=(y3#(i%,j%)-32767)/(ygn#+ygnd#*(j%-clo%+1))_
                                  +32767 - yof#-yofd#*(j%-clo%+1)
   NEXT j%
NEXT I%


'CLS
'LOCATE 5,1,0
'?"Adjusting Extrapolated Values"  '-------------------------------------------------
' do we really need to ?  - yes for 12" pot at same level . . .
'but should be calibrating 12" by then: SO - DON'T
'
CLS
LOCATE 5,1,0
?"Writing Corrected File"  '-----------------------------------------------------

writeout:

OPEN outputFile$ FOR OUTPUT AS #2

PRINT #2,"'SLA-1 ";nm$;", DX serial # ";dx$;" on ";dt$

PRINT #2,"!Position values used for calibration, & RMS deviations (bits)"
PRINT #2,"!Sensor1 ";
PRINT #2, USING "######.##";x1tot#,y1tot#,SQR(x1dev#),SQR(y1dev#)
```

```
PRINT #2,":Sensor2 ":
PRINT #2, USING "######.##":x2tot#,y2tot#,SQR(x2dev#),SQR(y2dev#)

WRITE #2,thi%+1,thi%+1,2,inc#

FOR i% = tlo% TO thi%
   FOR j% = tlo% TO thi%
      A$ = STR$(INT(x3#(i%,j%)*10+0.5)/10)
      PRINT #2,MID$(A$,2):
      PRINT #2,",";
      A$ = STR$(INT(y3#(i%,j%)*10+0.5)/10)
      PRINT #2,MID$(A$,2)
   NEXT j%
NEXT i%
CLOSE #2

CLS
?
?"Calibration correction complete
?
?"We have created two files, ";driftfile$;" and ";outputfile$
?
?driftfile$;" has the profiler positions measured after each column of the grid"
?
?outputfile$;" has the calibration data which will become STEREO.GEO"
?
?"Rename it C:\3DSYS\STEREO.GEO when loading in calibrated machine"
END

OutNoSp:
  A$ = STR$(INT(A*10+0.5)/10)
  PRINT #2,MID$(A$,2):
  RETURN
```

APPENDIX D

~~Docket~~ Serial No. ~~30385~~ 182,801 systems, inc.

TRAINING MANUAL

SLA-1

REVISION 3.0

APRIL 1988

TABLE OF CONTENTS

INTRODUCTION .................................... ii
TRAINING PROGRAM SCHEDULE .................................... iv 1.0 OVERVIEW
1.1 The StereoLithographic Process .................................... 1-2
1.2 StereoLithographic Systems .................................... 1-5

2.0 SAFETY
2.1 Laser Safety .................................... 2-1
2.2 Chemical Safety .................................... 2-5

3.0 STEREOLITHOGRAPHY -- FROM START TO FINISH
3.1 CAD Design .................................... 3.1-1
3.2 Orient & Support .................................... 3.2-1
3.3 CAD Interface .................................... 3.3-1
3.4 Slice Computer .................................... 3.4-1
3.5 Slice .................................... 3.5-1
3.6 Control Computer .................................... 3.6-1
3.7 Utilities .................................... 3.7-1
3.8 Network .................................... 3.8-1
3.9 Merge .................................... 3.9-1
3.10 View .................................... 3.10-1
3.11 Prepare .................................... 3.11-1
3.12 Build .................................... 3.12-1
3.13 Post Process .................................... 3.13-1
3.14 Checklist .................................... 3.14-1

4.0 PROBLEM SOLVING TECHNIQUES
4.1 Limitations of StereoLithography .................................... 4-1
4.2 Part Building Problems and Remedies .................................... 4-2

5.0 ADDITIONAL READING
5.1 Laser Theory .................................... 5.1-1
5.2 The Chemistry of StereoLithography .................................... 5.2-1
5.3 Bullets, Banjotops and Working Curves .................................... 5.3-1

Glossary .................................... G.1

INTRODUCTION

Purpose and Scope

This training manual presents information needed to build StereoLithographic parts. It is divided into five sections, each describing a different aspect of StereoLithography.

| | |
|---|---|
| *Section 1.0* | Provides an overview description of the StereoLithographic process and hardware and software systems. |
| *Section 2.0* | Discusses laser and chemical safety. |
| *Section 3.0* | Provides detailed part building information and procedures in thirteen subsections arranged in the same order that parts are built. The subsections are further divided into basic and intermediate chapters, where applicable. |
| *Section 4.0* | Discusses the limitations of StereoLithography and provides remedies for common part building problems. |
| *Section 5.0* | Provides background laser, chemistry and working curve information. |

A training schedule and glossary of StereoLithographic terms are also provided. These sections are printed on colored paper for quick reference.

The SLA-1 Training Program is a five day course. The first two days intersperse classroom discussion of basic part building procedures with operation of the SLA-1 to build a simple part. The next three days cover intermediate topics, including use of the SLA-1 to build progressively more complex parts. By the end of the week, you should be able to operate the SLA-1 to build a wide variety of parts directly from CAD data.

Abbreviations

| | |
|---|---|
| CAD | Computer Aided Design |
| CFM | Cubic Feet per Minute |
| DOS | Disk Operating System |
| MIA | Minimum hatch Intersect Angle |
| MSA | Minimum Surface Angle for scanned facets |
| MSDS | Material Safety Data Sheet |
| NIOSH | National Institute for Occupational Safety and Health |
| PCA | Post Curing Apparatus |
| RHR | Right-Hand Rule |
| SLA | StereoLithography Apparatus |
| UV | Ultraviolet |

Symbols

| | |
|---|---|
| ^ | space |
| ENTER ↵ | enter key |
| | control/break keys |

File Type Extensions

| | | | |
|---|---|---|---|
| .BAT | Batch File | .R | Range File |
| .EXE | Executable File | .SLI | Slice File |
| .L | Layer File | .STL | CAD StereoLithography File |
| .MAT | Material File | .UII | Slice Options File |
| .PRM | Parameter File | .V | Vector File |

Terms

| | |
|---|---|
| Part | combined object and supports |
| Object | CAD model (may be a group of detail parts) |
| Support | supporting structure on which the object is built |

TRAINING PROGRAM SCHEDULE

Day One

Class Introduction
Training Schedule
Overview
Safety
*Lab 1 - Building Part 1*
StereoLithography - - From Start to Finish
- CAD Design
- Orient & Support
- CAD Interface
- Slice Computer
- Slice - Basic
- *Lab 2 - Slice*

Day Two

StereoLithography - - From Start to Finish (Cont'd)
- Control Computer
- Utilities - Basic
- *Lab 2 - Utilities*
- Network - Basic
- *Lab 2 - Network*
- Merge
- *Lab 2 - Merge*
- Prepare - Basic
- *Lab 2 - Prepare*
- Build - Basic
- *Lab 2 - Build*
- Post Process
- *Lab 2 - Post Process*
- Checklist

Day Three StereoLithography - - From Start to Finish (Cont'd)

Slice - Intermediate
*Lab 3 - Slice*
Utilities - Intermediate
*Lab 3 - Utilities*
Network
*Lab 3 - Network*
View
*Lab 3 - View*
Prepare - Intermediate
*Lab 3 - Prepare*
Build - Intermediate
*Lab 3 - Build*

Day Four Bullets, Banjotops & Working Curves
Material Files
*Lab 4 - Building Part 4*
Group Discussion

Day Five Problem Solving Techniques
Part Building Problems & Remedies
Student Part Discussion
Installation
Customer Support
Class Evaluation
Closing Remarks

SECTION 1.0

OVERVIEW

StereoLithography is a three-dimensional printing process which produces accurate copies of CAD solid or surface models directly from CAD data. The process uses a moving laser beam, directed by computer, to print or draw cross-sections of the model onto the surface of photo-curable liquid plastic. A cross-section is drawn, lowered by an elevator one layer deep into a vat of the liquid plastic, and another cross-section is drawn directly on top of the first. Because of the nature of the liquid plastic, each layer adheres to the last. This process is repeated, layer by layer, to form the three-dimensional StereoLithographic part from the bottom up.

StereoLithography produces models in much less time than conventional tooling methods. Parts that take days, weeks or months to prototype with present methods can be made in a matter of hours with StereoLithography.

StereoLithography can be used in a wide variety of applications, including:

- Design Engineering
  - Automotive
  - Aerospace
  - Commercial
  - Medical
- Manufacturing Engineering
- Architectural Design
- Scientific Uses

1.1 THE STEREOLITHOGRAPHIC PROCESS
The StereoLithographic Process is composed of nine major steps performed on three hardware systems.
| CAD System → | SLA-1 → | Post Curing Apparatus |
|---|---|---|
| 1. CAD Design<br>2. Orient & Support<br>3. CAD Interface | 4. Slice<br>5. Network<br>6. Merge<br>7. Prepare<br>8. Build | 9. Post Process |
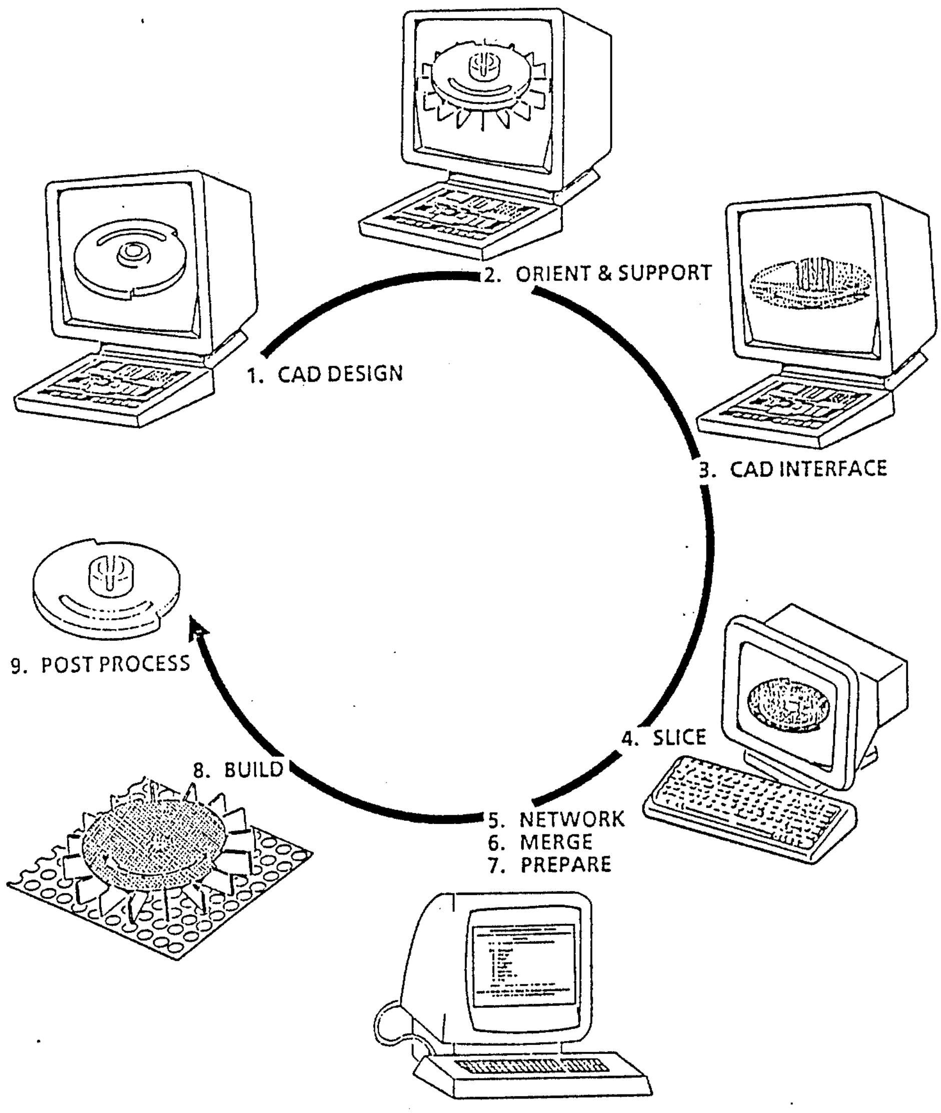
*The StereoLithographic Process*

CAD System

CAD Design (Step 1)

The part is designed as a solid or surface model on the CAD system without specific reference to StereoLithography.

Orient & Support (Step 2)

The CAD model is oriented in 3D space (within the CAD system) for StereoLithography. A base, or support, is designed to attach and support the part while it is being built.

CAD Interface (Step 3)

The CAD model is processed through an interface to generate files formatted for StereoLithography. These .STL files are generic representations of all surfaces in the CAD design. The interfaces are supplied by CAD vendors.

StereoLithography Apparatus

Slice (Step 4)

The StereoLithography (.STL) files representing three-dimensional objects are cross-sectioned on the Slice Computer to create layers of user defined thickness.

Network (Step 5)

The sliced files are transmitted from the Slice Computer to the Control Computer via Ethernet or floppy disk.

Merge (Step 6)

The sliced files for a part (i.e., all files for the supports and the part itself) are combined and reformatted to drive the SLA-1.

Prepare (Step 7)

Part-building parameters are specified by the user as required by the part's geometry and end use.

Build (Step 8)

The part is built one layer at a time by moving a focused laser beam across the surface of photo-curable resin, solidifying the liquid where it strikes.

The first (lowest) layer adheres to a horizontal platform located just below the surface of the resin. The platform is attached to an elevator which then lowers it under computer control. After drawing a layer, the platform dips into the liquid, leaving a thin film from which the second layer will be formed. The next layer is drawn after a pause to allow the liquid surface to level. Since the resin has adhesive properties, the second layer becomes firmly attached to the first.

This process is repeated until all layers have been drawn to form the three-dimensional object. Resin that has not been exposed to the laser beam remains in the vat to be used for the next part. There is very little waste of material.

Post Curing Apparatus

Post Process (Step 9)

The part is drained to remove excess resin, ultraviolet cured to complete the polymerization process, and supports are removed. Optional finishing, such as sanding, assembly into working models and painting, may also be performed.

1.2 STEREOLITHOGRAPHIC SYSTEMS
- StereoLithography Apparatus
- Post Curing Apparatus
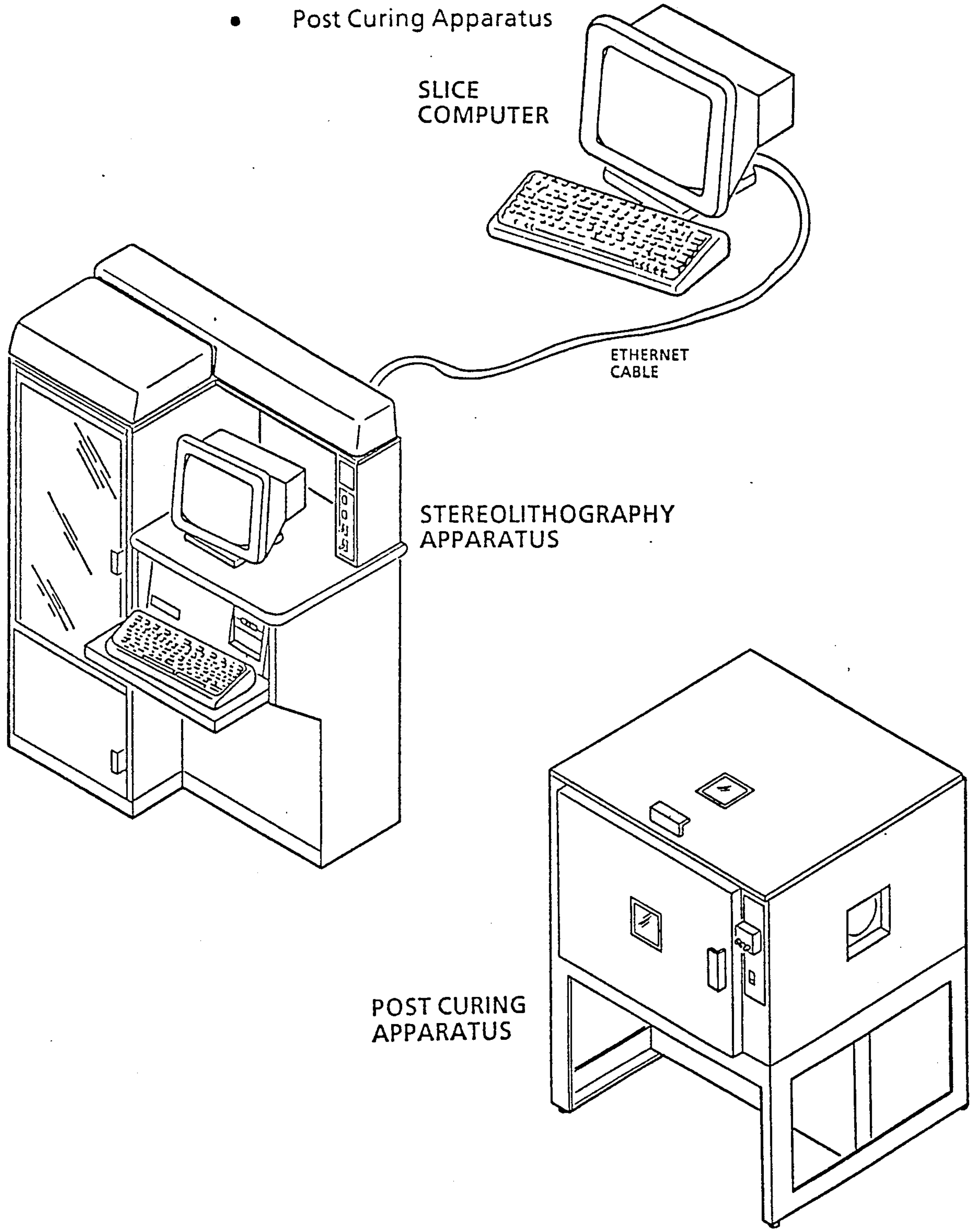
*The SLA-1 and Post Curing Apparatus*

StereoLithography Apparatus

The major components of the SLA-1 are:

- Control Computer
- Laser and Optical System
- Process Chamber
- Control Panel
- Slice Computer

*Control Computer*

All StereoLithography process steps from Network through Build are run on the Control Computer. Programs and operating parameters are selected from menus for ease of operation.

- MSDOS based 286 Computer (single-user, single task)
- Monochrome Terminal
- 40 Megabyte Hard Disk
- 36 to 38 Megabytes Available Disk Space
- Ethernet Interface 1285 1286
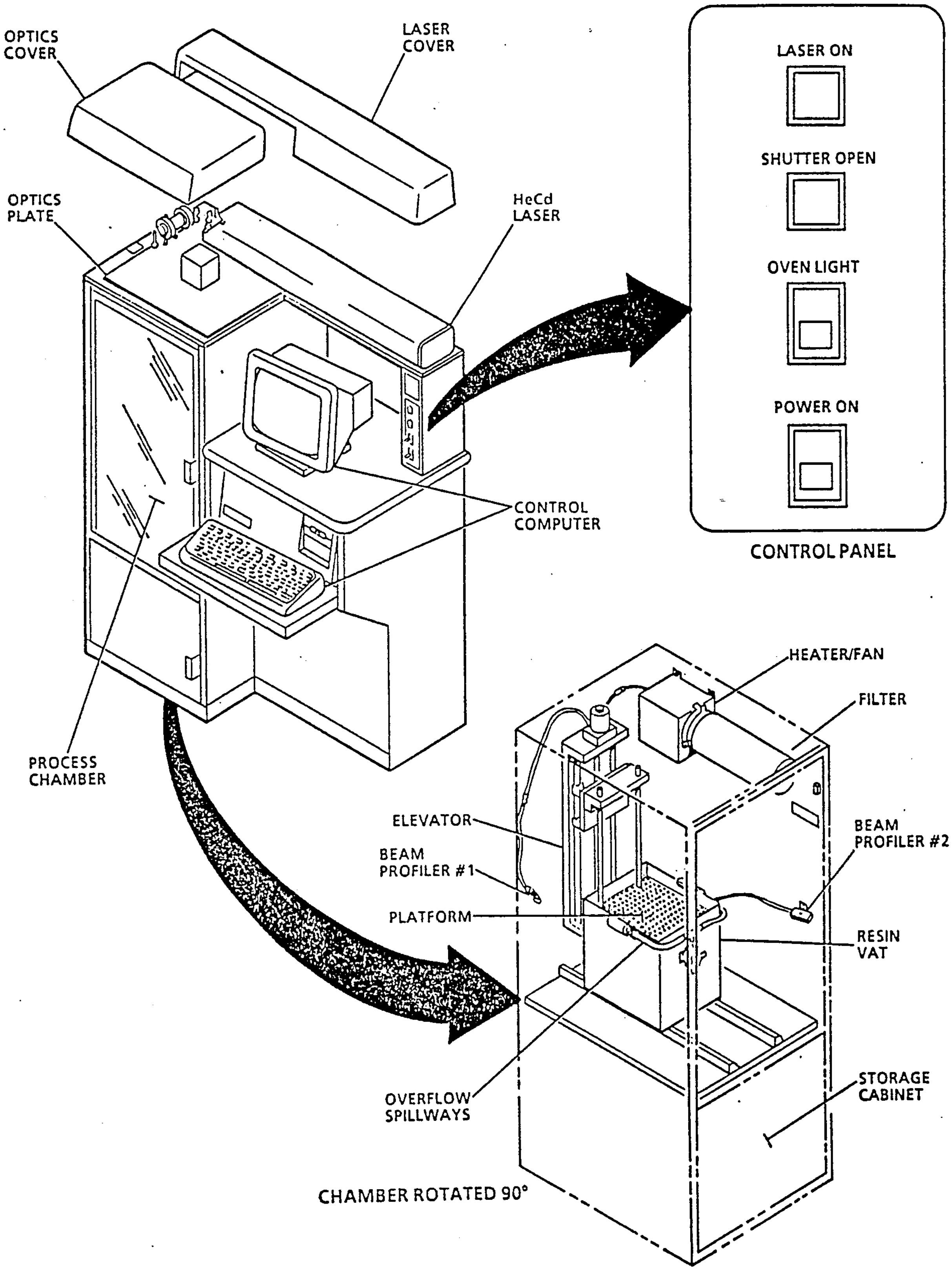
*Major Components of the SLA-1*

Laser and Optical System

The SLA-1 laser and optical system is mounted directly over the process chamber. These components generate and direct the laser beam under computer control onto the surface of the liquid resin.

The SLA-1 uses a helium-cadmium (HeCd), multimode ultraviolet laser. The laser beam power varies, and is nominally 15 milliwatts at a wavelength of 325 nanometers.

As shown below, the SLA-1 optical system is composed of a shutter assembly, two 90-degree beam-turning mirrors, a beam expander, and X-Y dynamic mirrors mounted on an optics plate. A 2-inch diameter precision optical window allows the laser beam to enter the process chamber while isolating optical components from the chamber environment.

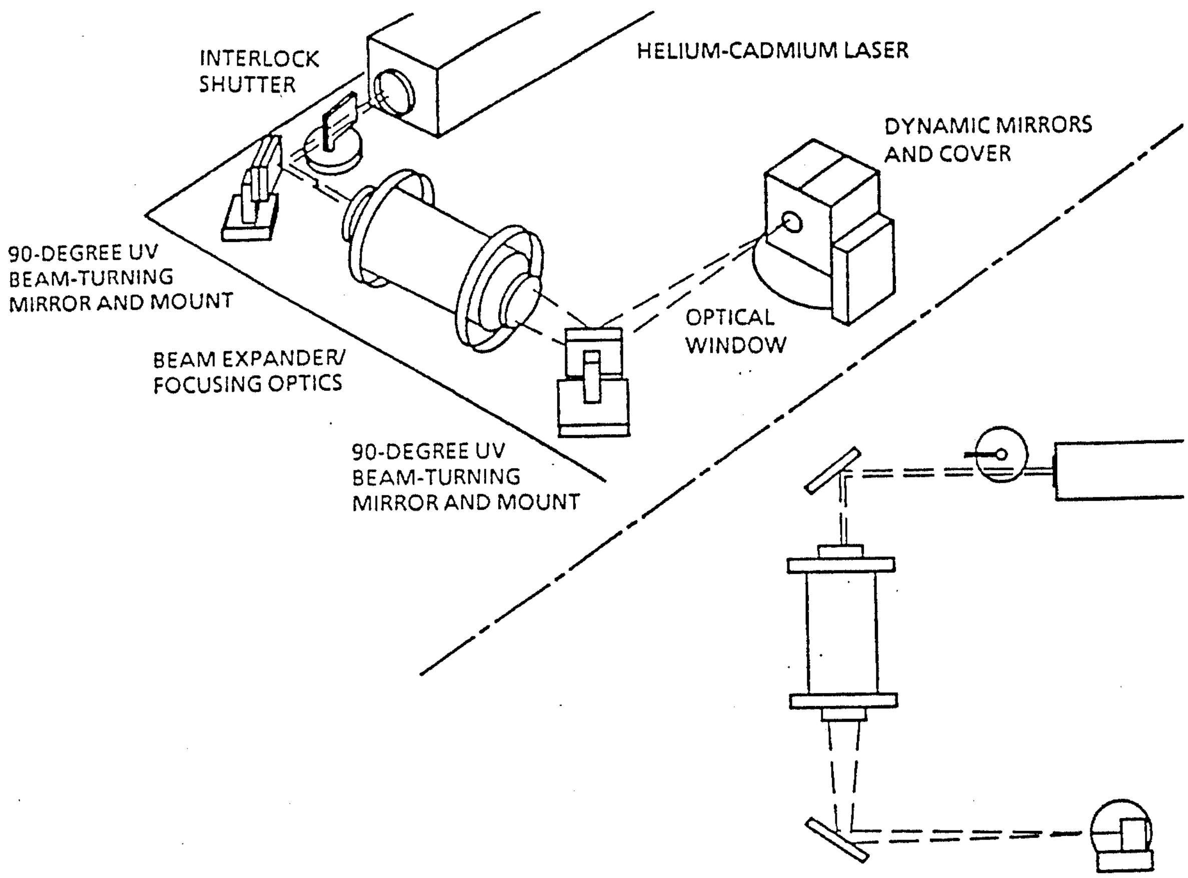

*The SLA-1 Laser and Optical System*

The solenoid-actuated shutter operates to block the laser beam when an interlock switch is activated. Interlock switches monitor removal of the laser and optics covers and opening of the process chamber door.

The 90-degree beam-turning mirrors are specially coated for high reflectivity at 325 nanometers while transmitting most other wavelengths. The first turning mirror reflects the beam from the laser to the inlet aperture of the beam expander. The second mirror reflects the laser beam from the outlet beam expander aperture to the dynamic mirrors.

Unmodified laser beams diverge slightly over distance. A highly focused beam is desired for StereoLithography because it has higher power density and can therefore cure plastic at a greater depth or at a faster rate. The beam expander expands the divergent laser beam to four times its inlet diameter, then focuses it so that the beam converges to a small spot on the surface of the resin.

The high-speed dynamic mirrors deflect the laser beam under computer control to trace vectors on the surface of the resin. Like the beam-turning mirrors, the dynamic mirrors are highly reflective at 325 nanometers and transmit most other wavelengths.

*Process Chamber*

The environmentally-controlled process chamber houses an elevator and platform, resin vat and beam profilers. This is where StereoLithographic parts are created.

The chamber is designed for operator safety and to ensure uniform operating conditions. Air is circulated and filtered through active charcoal. An overhead light illuminates the resin vat and work surfaces. An interlock on the access door activates a shutter to block the laser beam when the door is opened. The clear acrylic door blocks ultraviolet light for safe viewing by operators.

The elevator raises and lowers the part under computer control. The platform supports the part while it is being built.

The resin vat is 9 inches in every dimension. It is installed in the chamber on guides which align it with the elevator and platform. An overflow system channels excess resin to a removable container to maintain a constant liquid level.

Two beam profilers are mounted in the process chamber, one on either side of the resin vat. The beam profilers measure laser power and intensity under computer control.

*Control Panel*

The SLA-1 control panel includes:

| | |
|---|---|
| *POWER ON switch* | switches primary power to the laser, power supplies, process chamber and control computer. |
| *OVEN LIGHT switch* | turns the overhead light in the process chamber on and off. |
| *LASER ON indicator* | indicates that the laser is on when lit. |
| *SHUTTER ON indicator* | indicates that the shutter is open when lit. |

*Slice Computer*

The Slice Computer is used to cross-section .STL files to create .SLI files.

- UNIX based 386 Computer (multi-user, multi-task)
- Monochrome Terminal
- 70 Megabyte Hard Disk
- ____ Megabyte Available Disk Space
- Ethernet Interface

Post Curing Apparatus

The Post Curing Apparatus (PCA) is used to cure parts produced by the SLA-1. This is done by exposing parts to ultraviolet radiation in an enclosed, vented chamber. The PCA can hold parts measuring 12 inches in every dimension. Its major components include:

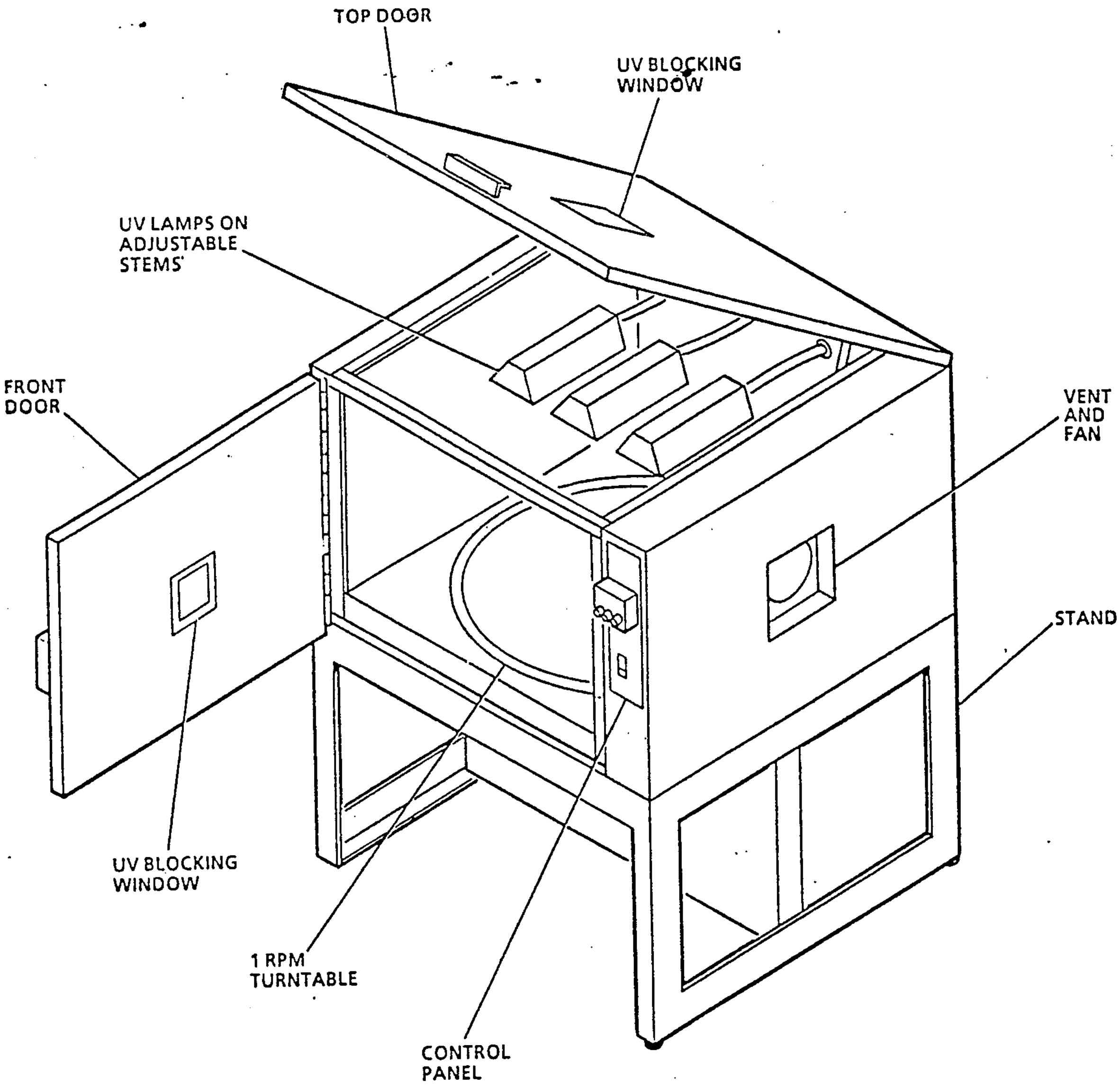

- three 400 Watt metal-halide UV lamps, with reflectors, which can be positioned in the chamber for optimum curing. The lamps have a rated service life of 750 hours.
- a one revolution per minute turntable which rotates the part for uniform curing.

- two doors, one at the front and one at the top, for loading and unloading parts. Both doors are interlocked to turn off the UV lamps and turntable when they are opened, and have UV blocking windows to allow safe viewing of the parts.
- a 240 CFM (Cubic Feet per Minute) cooling and vent fan.
- a control panel with power switch and timer.

SECTION 2.0

SAFETY

2.1 LASER SAFETY

Safety Features

The SLA-1 is designed as a Class 1 Laser Device, which means that in normal operation the laser beam is completely confined. Other SLA-1 laser safety features include:

- Interlocks on the laser and optics covers and process chamber door which actuate a shutter to block the laser beam when the interlock circuit is activated.

- Control panel lamps which indicate whether the laser is on and whether or not an interlock circuit is activated.

Warning and Safety Information Labels

The following laser safety labels are affixed to the SLA-1. Their locations are shown in the following figure.

*ID/Certification Labels*

| 3D systems, inc. | | SYLMAR, CA 91342 |
|---|---|---|
| MODEL NO. | SERIAL NO. | PATENTS<br>US 4575330 |
| VOLTS | AMPS | OTHER PATENTS<br>PENDING |

Manufactured December 1987

This product conforms to the applicable requirements of 21 CFR Subchapter J at the date of manufacture.

Two ID/certification labels certify conformance to CFR laser safety requirements and provide power and identification data.

1301 1302
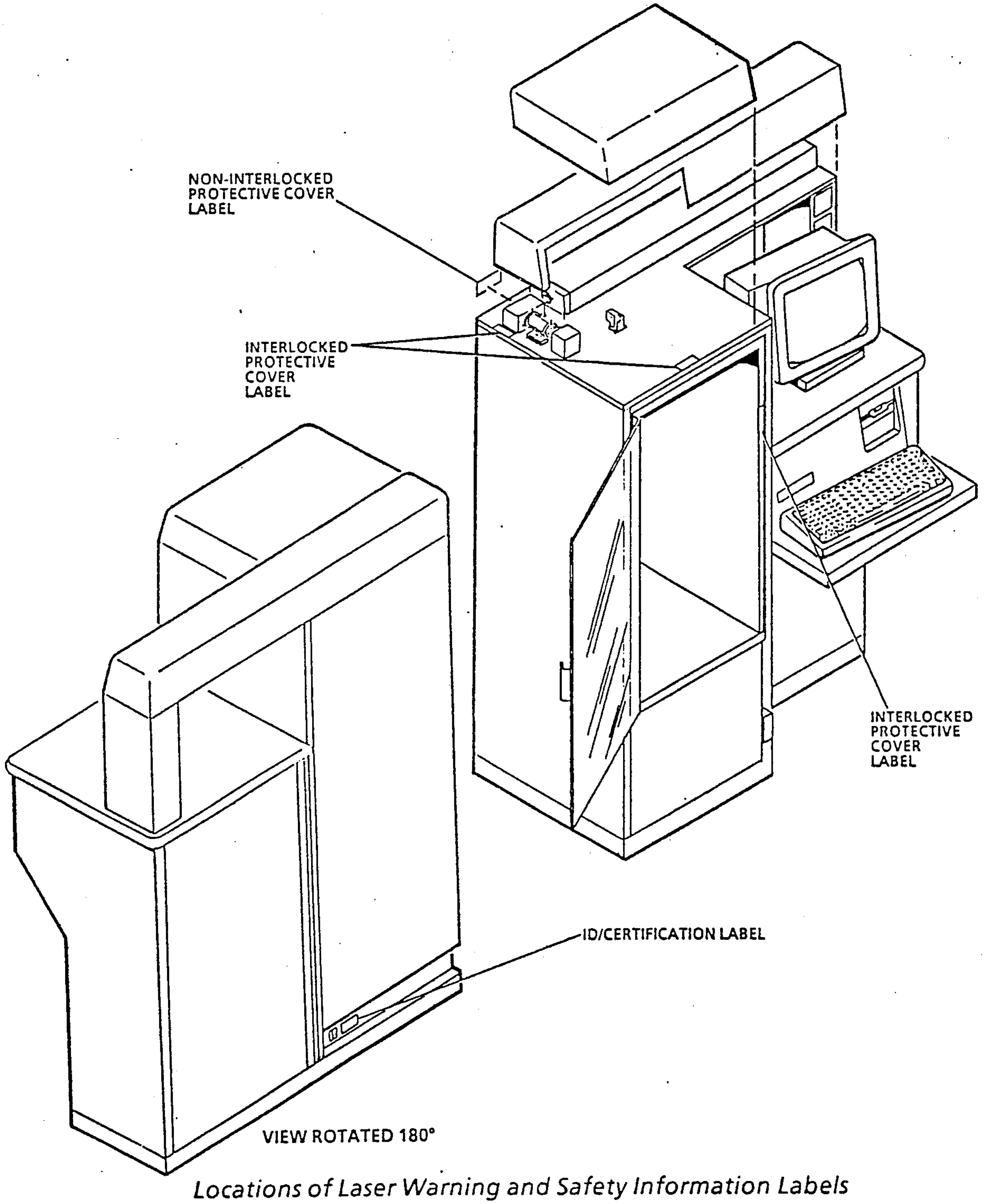
*Locations of Laser Warning and Safety Information Labels*

*Interlocked Protective Cover Labels*

| DANGER |
|---|
| Invisible laser radiation when open and interlock defeated. |
| AVOID DIRECT EXPOSURE TO BEAM |

Three interlocked protective cover labels are affixed near the three interlock switches. The labels conform to the requirements for Defeatable Interlocks, Class IIIb.

*Non-Interlocked Protective Cover Label*

| DANGER |
|---|
| Invisible laser radiation when open. |
| AVOID DIRECT EXPOSURE TO BEAM |

One non-interlocked protective cover label is affixed to the shutter protective housing so as to be visible when the laser cover is removed. The label conforms to the requirements for Non-Interlocked, Class IIIb.

Safety Precautions

WARNING

LASER SAFETY PRECAUTIONS

USE OF CONTROLS OR ADJUSTMENTS, OR PERFORMANCE OF PROCEDURES OTHER THAN THOSE SPECIFIED HEREIN, MAY RESULT IN HAZARDOUS INVISIBLE LASER RADIATION EXPOSURE.

DURING NORMAL USE AND MAINTENANCE OF THE SLA-1, NO LASER RADIATION IS ACCESSIBLE TO THE USER. HOWEVER, IF THE INTERLOCKS ARE DEFEATED FOR ANY REASON (INCLUDING PERFORMANCE OF SERVICE PROCEDURES COVERED IN THE SLA-1 SERVICE MANUAL), HELIUM CADMIUM LASER POWER UP TO 100 mW AT 325 nm COULD BE ACCESSIBLE.

IF THE INTERLOCKS ARE DEFEATED FOR PERFORMANCE OF SERVICE PROCEDURES EXPLAINED IN THE SLA-1 SERVICE MANUAL, WEAR UV BLOCKING SAFETY GLASSES AND AVOID DIRECT EXPOSURE TO THE LASER BEAM.

NEVER STARE DIRECTLY INTO THE LASER BEAM OR INTO A REFLECTION FROM A MIRROR-LIKE SURFACE.

2.2 CHEMICAL SAFETY

*Safety Guidelines*

The photopolymers used in StereoLithography may contain multi-functional acrylates which can be hazardous if handled improperly. Personnel working with chemicals should obtain and consult guidelines in the MSDS (Material Safety Data Sheet). Safety guidelines for the Desolite SLR 800 resin are summarized below.

WARNING

CHEMICAL HAZARDS

UV CURABLE RESINS MAY CAUSE EYE AND SKIN BURNS. REPEATED OR PROLONGED SKIN CONTACT MAY CAUSE SENSITIZATION. RESIN VAPOR MAY BE HARMFUL.

- Wear safety glasses with side shields when handling resins.
- Wear chemically resistant gloves and protective clothing when handling resins. Wash thoroughly after handling and before eating, smoking or using toilet facilities.
- Use only with adequate ventilation. Avoid breathing vapors or spray mist.
- Keep away from heat, sparks and flame. Protect from sunlight and fluorescent light. Closed containers may rupture or explode when exposed to extreme heat. Use National Fire Protection Association Class B Extinguishers (carbon dioxide, dry chemical or foam).
- Wear an NIOSH approved respirator or ensure adequate ventilation when sanding and cutting cured parts.
- Dispose of chemicals properly. Do not reuse empty containers.

First Aid Guidelines

*Skin Contact* Wash thoroughly with soap and water. Remove contaminated clothing and shoes immediately. If skin is irritated, get medical attention. Wash clothing before reuse. Discard contaminated leather shoes or other apparel.

*Eye Contact* Flush immediately with large amounts of water for 15 minutes and avoid sunlight, fluorescent light and other UV light. Get medical attention.

*Inhalation* Remove victim to fresh air. Give artificial respiration or CPR as required. If breathing is difficult, give oxygen. Get medical attention.

SECTION 3.0

STEREOLITHOGRAPHY -- FROM START TO FINISH

This section is divided into thirteen subsections covering in detail the process for making a StereoLithographic part. Each subsection includes a basic chapter introducing beginning commands and procedures and, in some subsections, an intermediate chapter with procedures for building more complex parts.

| | | | |
|---|---|---|---|
| 3.1 | CAD Design | 3.8 | Network |
| 3.2 | Orient & Support | 3.9 | Merge |
| 3.3 | CAD Interface | 3.10 | View |
| 3.4 | Slice Computer | 3.11 | Prepare |
| 3.5 | Slice | 3.12 | Build |
| 3.6 | Control Computer | 3.13 | Post Process |
| 3.7 | Utilities | | |

The same part is used as an example in the basic chapters of each subsection. Students will build this part, shown below, during the first two days of training, and then study the intermediate topics and build more complex parts. A checklist for making parts is provided at the back of this section.

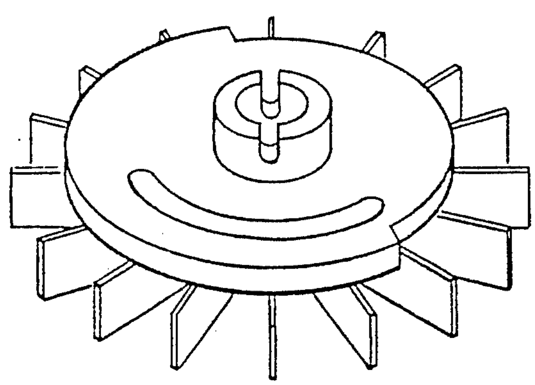

3.1 CAD DESIGN

*Surfaces*

The object must be represented as closed surfaces which unambiguously define an enclosed volume. That is, model data must specify what is inside the solid material of the object and what is not. This is required so that all horizontal cross-sections consist of closed curves which completely separate the inside and outside of the object.

*CAD Resolution*

When generating objects with curved surfaces (e.g., spheres, cylinders), keep in mind that curved surfaces are approximated by a large number of polygons or facets. The larger the number, the more closely the surface is approximated, resulting in a smoother curve on the finished part. However, a larger number of polygons or facets also increases the slicing time and resultant file size. As a rule, use the lowest acceptable resolution.

*Wall Thickness*

The minimum recommended wall thickness for curved objects is 0.020 inch. Walls thinner than 0.020 inch are achievable only under special circumstances. The absolute minimum wall thickness is twice the width of the laser beam.

3.2 ORIENT & SUPPORT

*Orienting CAD Models*

A CAD part must reside entirely in the positive X Y Z quadrant for Stereo-Lithography. It should then be oriented to:

- minimize the distance between the part and the CAD origin.
- minimize the height of the support structure. The part should be at least 0.25 inch above the platform for efficient draining. However, supports that are too tall take longer to build and may distort as the weight of the part increases while it is being built.
- minimize the height of the object. This reduces the number of layers to be built, thereby reducing the run time.
- optimize part draining.
- minimize the number of slanted or sloping surfaces. These surfaces are constructed of overlapping layers so that the surface has a "stair-step" appearance, with the thickness of each layer being the height of the step.
- ensure that smooth or aesthetically important surfaces are either oriented vertically or upward-facing and horizontal. (Vertical and upward-facing horizontal surfaces are smoother than downward-facing surfaces.)
- minimize the volume of liquid entrapped as the part is built. Entrapped liquid slows the part building process by requiring more time for the liquid resin to settle and level to a uniform height after the part is dipped.
- Ensure that important circular cross-sections are drawn in the X-Y plane. Higher resolution can be achieved in the X-Y plane.

- Ensure that the part fits in the resin vat. If the part is too large, it may be sectioned, built in several runs, then reassembled during post processing.

The importance of each of these factors is determined by your objectives in making the part.

*Supports*

StereoLithographic objects are built on supports rather than directly on the elevator platform. The main reasons for using supports are to:

- separate the object from the platform. This ensures that:
  - -- they are easily separated during post processing.
  - -- the first object layer is of uniform thickness, even if the platform is warped or improperly installed.
  - -- resin can drain quickly through the platform. This reduces the time required to build the part, since the surface of the resin levels faster after the part is dipped. Additionally, excess resin drains faster from the completed part to reduce post processing time.
- anchor the part firmly to the platform or other part sections.
- prevent curling or damage during dipping.

*Common Types of Supports*

*Straight Webs* are very thin rectangles or fins, generally less than 0.002 inch thick. Straight web supports must be defined by a volume, not single surfaces.

*Cross Webs* are made from two straight webs which intersect at right angles. Cross web supports are stronger than straight webs.

*Circular Webs* are hollow tubes strongly bonded to the object. Circular webs can support more weight than straight and cross web supports. However, they require more triangles, and thus use more memory.

*Triangular Webs* are composed of three straight webs to form a triangle. These supports may be used in conjunction with straight webs which intersect the vertices. Triangular web supports are stronger than all other types of web supports.

*Example 1*

Near the bottom of the solid sphere, layer border vectors consist of circles whose diameters increase rapidly with each successive layer. Until other vectors are drawn, many of the layer borders would float freely on the surface of the liquid. Air currents or convection currents in the liquid could cause them to drift out of position.

Adding supports which extend to the equator of the sphere, as shown, would solve this problem. Note that above the equator the layer borders are formed directly on the crosshatch vectors of the previous layer, and as such are firmly anchored without the need for further support.

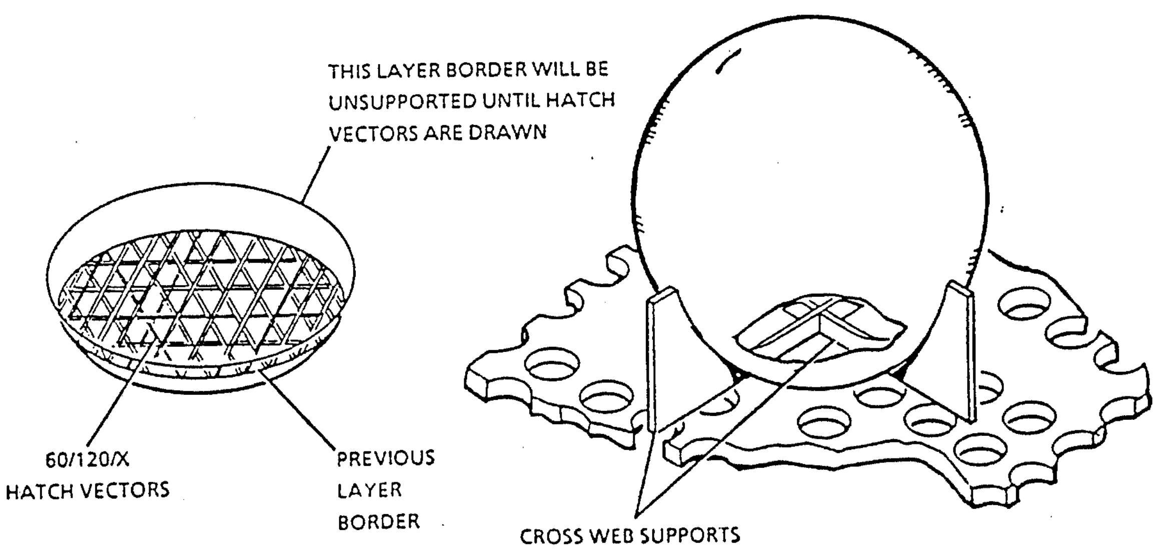

*Supports anchor layer borders in place until crosshatch vectors are drawn*

Example 2

The first layer of the cantilevered beam may be permanently deformed by static resistance of the liquid when the part is dipped. In addition, the layer could curl upward when the next layer is formed. Both of these problems are solved by adding supports.

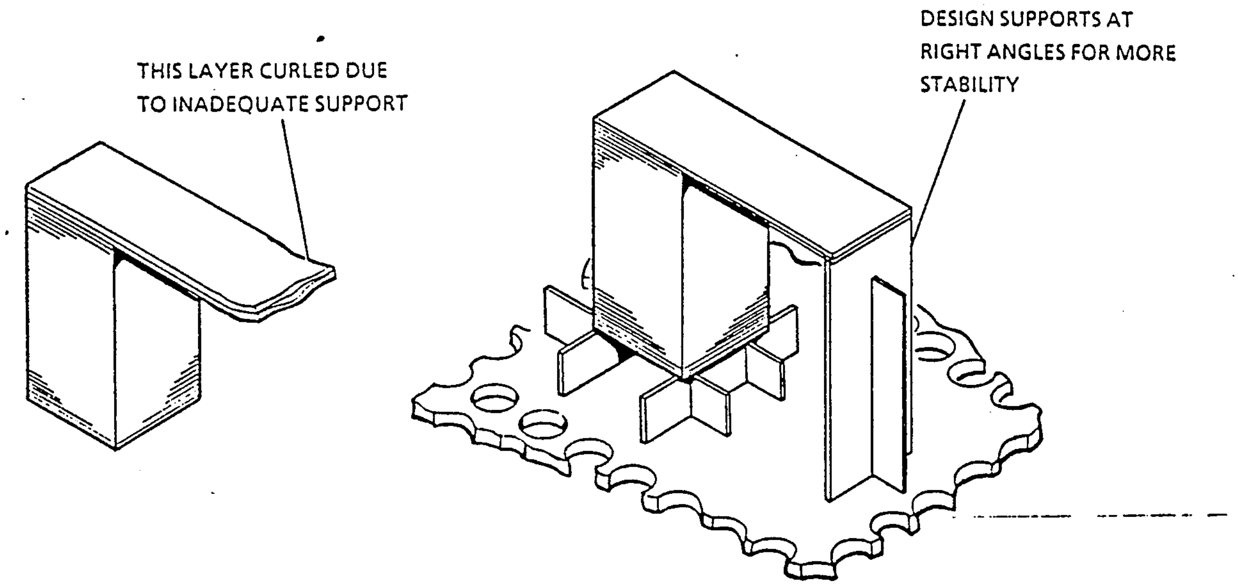

*Supports prevent deformation and curl of cantilevered beams and similar structures*

Example 3

The first layer of the teacup handle would be completely unattached when formed and would drift when the part is dipped. The support provides a surface, anchored to the elevator platform or to the body of the teacup, on which the handle can be built.

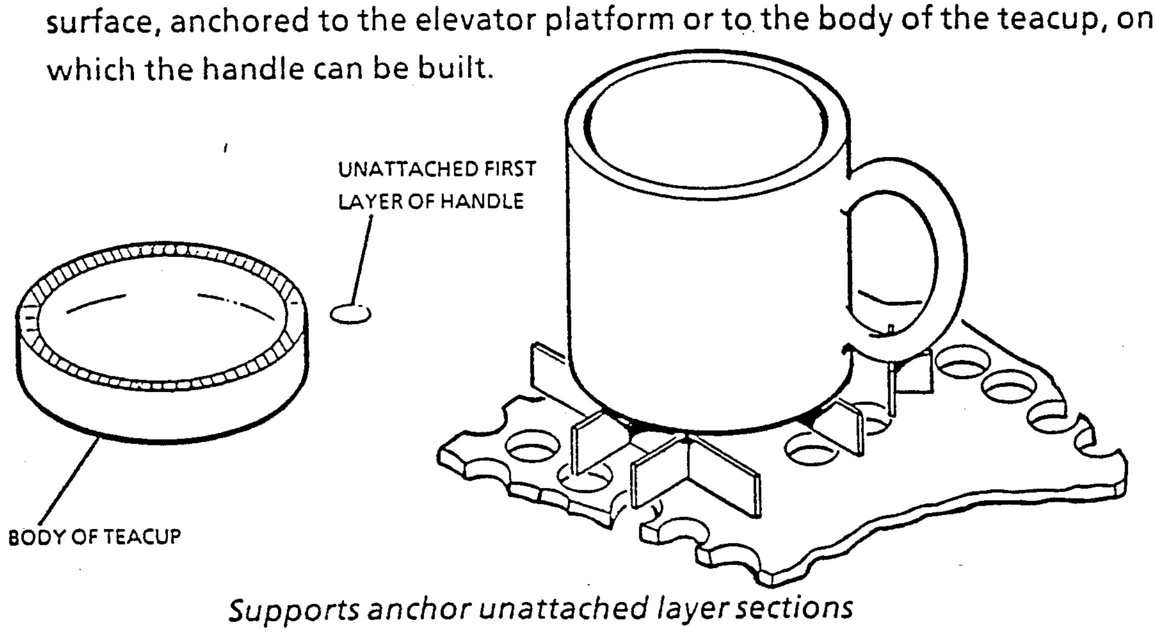

*Supports anchor unattached layer sections*

Building Supports

NOTES:

- Supports must be completely contained in positive CAD space.
- Bottom supports should overlap the bottom layers of the object by approximately 0.040 to 0.060 inch (typically 2 to 3 layers). This ensures a strong bond between the supports and object.
- Side supports should also overlap the object to provide a stronger support structure.

Generally, supports are designed together as a single CAD file separate from the object file. They are positioned relative to the object after it is designed and oriented for StereoLithography. (The object and support files are merged and drawn as a single file later in the StereoLithographic process.) A library of supports resident on the CAD system could reduce the need for designing unique supports for each object. In any case, supports should be designed and attached to the object in accordance with the following guidelines.

*Placement* Supports should be located as needed to provide a rigid foundation on which the object can be built. This includes supporting corners and edges. Supports should also be added to anchor or strengthen other surfaces, as discussed in the preceding examples.

If possible, avoid placing supports on surfaces that for aesthetic or functional reasons need to be smooth. After the part is post-cured and the supports are removed, ridges will normally remain on the surface of the part. (The ridges can, however, be cut and sanded or ground away.) Supports can be attached to a strong section of the object, as well as to the elevator platform.

*Spacing*

Supports typically are spaced 0.1 to 0.8 inch apart. In general terms, space supports at sufficiently close intervals so that no appreciable sag or curl occurs; however, drawing too many supports will slow the part building process.

*Orientation*

Use cross web supports to prevent layer skewing. If straight web supports for a part are aligned parallel to one another, as shown below, the weight of the part could cause the webs to sag sideways while the part is being built. Subsequent layers would then be offset slightly (skewed) with respect to the previous layers.

*Height*

Hold parts at least 0.25 inch above the elevator platform to ensure optimum liquid draining and leveling. To inhibit bending or sagging and to minimize drawing time, supports should be no taller than required. If a tall support is needed, a cross, circular or triangular web should be used for additional strength.

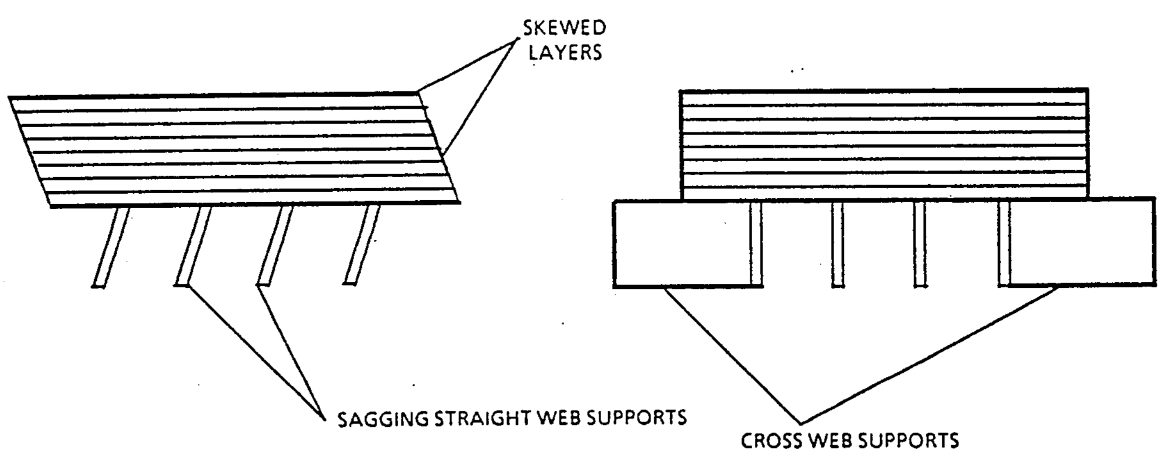

*Cross web supports prevent layer skewing*

*Width* Supports must be at least 0.65 inch wide where they contact the platform or they may droop or fall through the platform drain holes. However, to minimize drawing time, supports should be only as wide as necessary. Diagonal supports beginning and ending on the part should be designed as buttresses, as shown below, and should not extend into the corner of the part where they will be hard to remove.

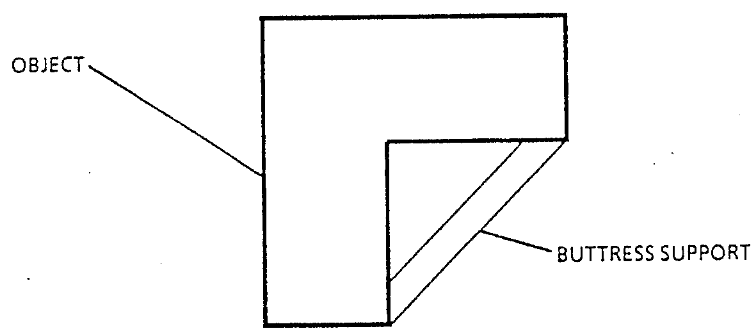

*Diagonal supports should not extend into interior corners from which they will be difficult to remove*

*Thickness* Supports should be designed with minimum thickness (web supports should be 1 mil thick). Since the thickness of lines drawn with the laser is usually 10 to 20 mils, the actual support will be considerably thicker than the CAD design. Supports designed as single surfaces with no CAD volume are not allowed.

*Attachment* To ensure that the object attaches securely to the supports, design supports to overlap the object vertically by 0.040 to 0.060 inch (typically 2 to 3 layers).

3.3 CAD INTERFACE

*Tessellation Theory*

Many CAD and solid modeling systems represent surfaces of parts as a set of triangles. Triangles are the simplest polygon for computations and, if enough are used, can closely approximate all surfaces.

The easiest geometric shape to represent, other than a triangle, is a rectangle. The most difficult is a curve. As shown below, a rectangle can be created by two back-to-back triangles. Curved surfaces, on the other hand, can be closely approximated only by a large number of triangles. The SLA-1 can process up to 14,000 triangles per StereoLithography (.STL) file to produce very accurate circles and other curved surfaces.

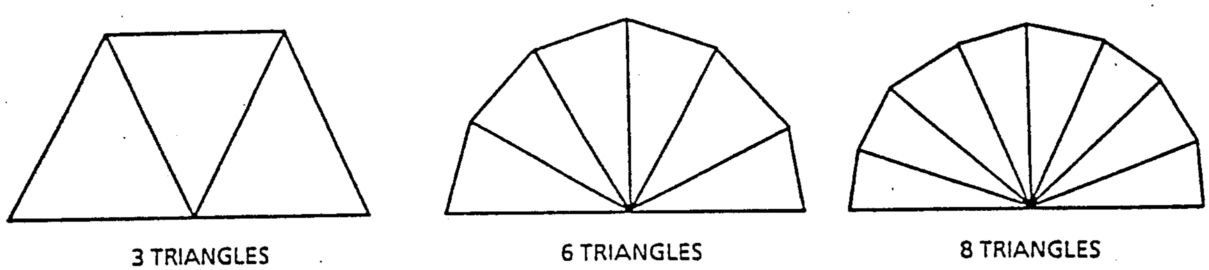

APPROXIMATING CURVED SURFACES

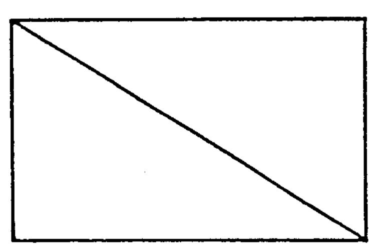

APPROXIMATING A RECTANGULAR SURFACE

*Curved surfaces require many triangles to approximate while rectangles are fully described by only two*

Classifying Triangles

As shown below, CAD triangles are classified for StereoLithography as flat (horizontal), near-flat and steep (vertical or near-vertical). The roof of the simplified automobile is composed of flat triangles. The hood and trunk are made up of near-flat triangles. The front, sides and back are steep triangles.

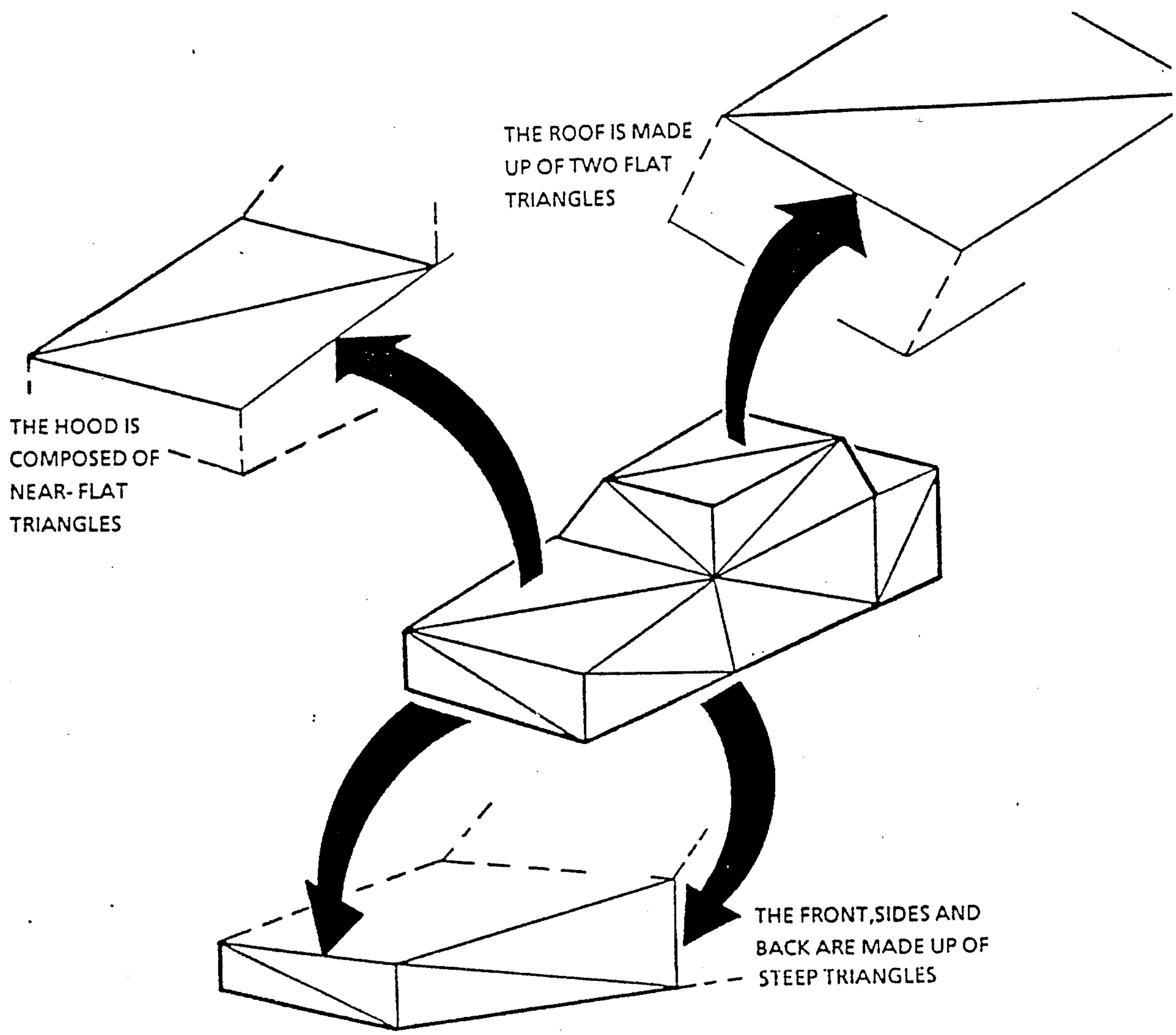

*Any CAD object can be completely described by flat, near-flat and steep triangles*

*The .STL Format File*

The .STL file required as input to SLICE is composed of triangular facets with outward facing (away from solid) unit normals. This format specifies the X, Y and Z coordinates of each vertex and the unit normal for each triangle. Interfaces used to generate .STL files are supplied by CAD vendors.

The .STL file can be in either ASCII or binary format. Binary is preferred for space and performance considerations. ASCII is used at times because it allows easy debugging of interfaces.

3.4 SLICE COMPUTER

*Overview*

StereoLithographic files are input to the Slice Computer and cross-sectioned using the program SLICE. The sliced files are then moved to the Control Computer for further processing. All files are transferred between the computers either via Ethernet or floppy disk.

*Using UNIX*

UNIX is a multi-task, multi-user operating system. All commands are entered in lowercase letters. The Slice Computer runs a Bourne shell.

*Getting Started*

*Login* — Enter your user ID at the login prompt.

login: train [ENTER ↵]

*Password* — Enter your password. It will not print on the screen.

Password: [ENTER ↵]

*UNIX Prompt* — At the UNIX prompt, enter UNIX commands or run SLICE.

Welcome to the UNIX Operating System
$

*dosget* — Use *dosget* to copy files from a DOS formatted floppy disk to the working directory. Specify -a for ASCII files or -b for binary files.

$dosget ^-a^a:filename^. [ENTER ↵]

NOTE: The Slice Computer does not prompt for file type (ASCII or binary). The default is ASCII.

*Copying Files and Logoff*

*dosput* Use *dosput* to copy files from the working directory to a DOS formatted floppy disk.

$dosput$_\wedge$-a$_\wedge$filename$_\wedge$a: [ENTER ↵]

*Logoff* Logoff UNIX $exit [ENTER ↵]

*Abort* Use the [ENTER ↵] or Del keys to abort SLICE.

*UNIX Commands*

UNIX is a powerful operating system with many commands and command options. However, most functions required in everyday operation can be accomplished using only the commands listed here. Consult your UNIX documentation for more information.

*cat* Use *cat* to print files to the screen. For example, to print a file *newfile.ext,* enter:

$cat$_\wedge$newfile.ext [ENTER ↵]

*cd* Use *cd* (change directory) to move from one directory to another. For example, to move from the home directory to another called *newdir,* enter:

$cd$_\wedge$newdir [ENTER ↵]

To return to the home directory:

$cd [ENTER ↵]

*cp* Use *cp* (copy) to make a copy of a file. For example, to create a file called *newfile* that is an exact duplicate of existing file *oldfile* in your current directory, enter:

$cp$_\wedge$oldfile$_\wedge$newfile [ENTER ↵]

*df* Displays the number of free disk blocks.

$df ENTER↵

*du* Summarizes disk usage.

$du ENTER↵

*ls* Use *ls* (list) to list in alphabetical order the files and subdirectories in a directory. If the directory is empty, UNIX will redisplay the $ prompt.

$ls ENTER↵

*ls* accepts a filename or directory name as an argument. If you use a filename, the file will be listed if it is in the directory.

$ls^filename ENTER↵

If you specify a directory, all files in the directory will be listed.

Several options are available for use with the *ls* command. The most useful is:

$ls^-l Lists the mode, number of links, owner, group, size and time of last modification for each file in the directory.

*mv* Use *mv* (move) when you would like to change the name of a file or directory without making a copy of its contents. For example, to rename *newfile* to *oldfile*, enter:

$mv^newfile^oldfile ENTER↵

*pwd* Use *pwd* to print the contents of the current working directory to the screen.

$pwd ENTER↵

*rm* Use *rm* (remove) to delete a file from a directory. For example, to remove *newfile* from the current directory, enter:

$rm∧newfile [ENTER ↵]

*who am i* Use *who am i* to list the current user's name.

$who∧am∧i [ENTER ↵]

3.5 SLICE

Overview

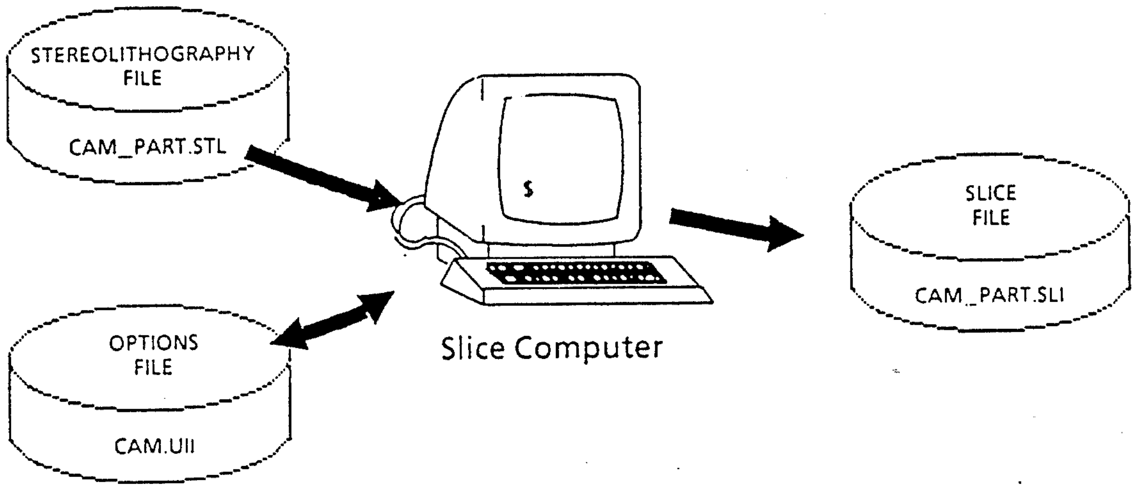

SLICE cross-sections three-dimensional StereoLithography (.STL) files and generates Slice (.SLI) files consisting of cross-sections in the X-Y plane layered one on top of another to create a three-dimensional object.

General Information

Logon UNIX directly at the Slice Computer or remotely at the Control Computer via REMOTE USER. Execute SLICE at the UNIX prompt ($).

The next step is to alter standard options and enter extra parameters, as needed. These options control slicing and have a strong impact on part building later in the StereoLithographic process. They can be saved to disk in an options file (.UII) to be used for later runs of the same or similar parts.

The final step is to slice the .STL file, in accordance with the Slice options, to create a Slice (.SLI) file.

Layer Borders, Crosshatches and Skin Fill

*Layer Borders* Layer border vectors define surface boundaries.

*Crosshatches* Crosshatch vectors are created internally by SLICE to partially solidify and strengthen the liquid area between layer borders (walls). The spacing between crosshatches and the type used are selected prior to running SLICE.

*Skin Fill* Horizontal (top and bottom) surfaces are covered with a series of closely spaced parallel vectors which form a type of skin. The layers between the skins are generally cross-hatched for added strength.

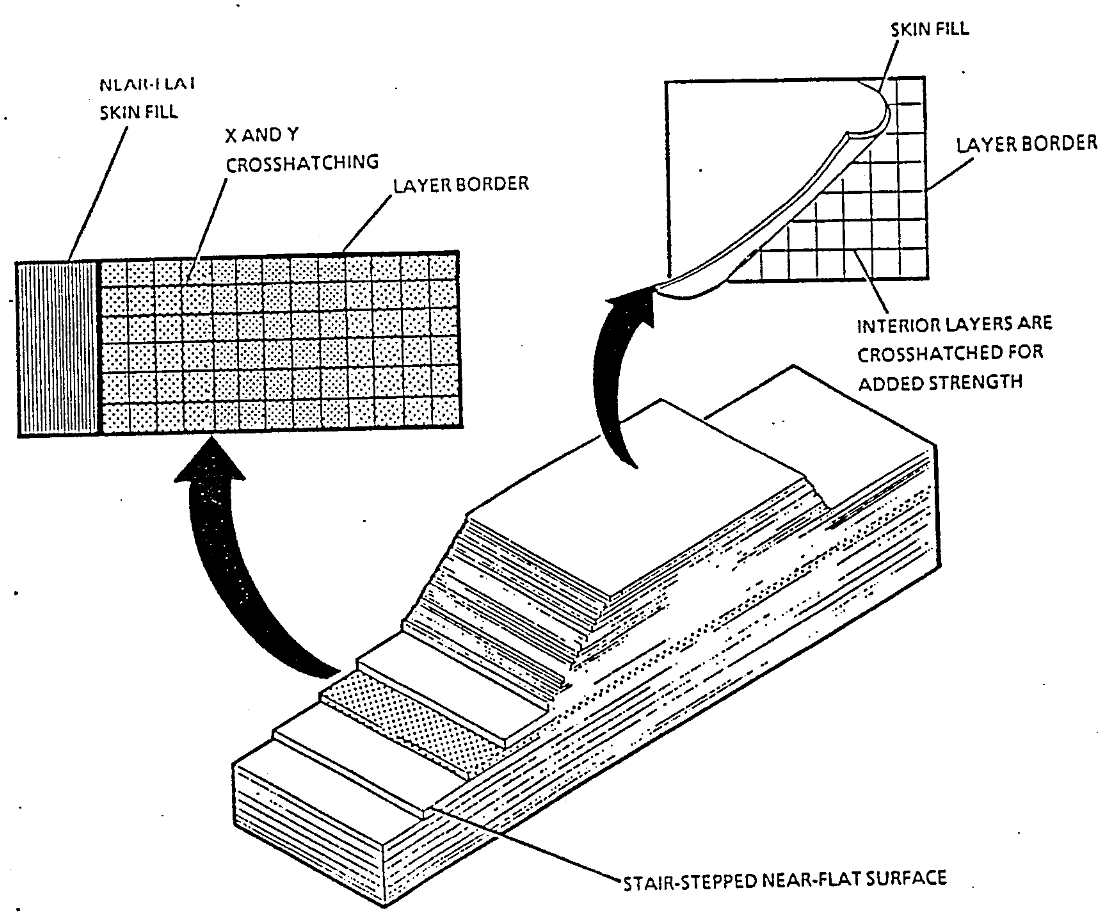

*The type of triangle sliced determines whether the area between the layer borders is crosshatched or skin filled*

Layer Thickness

Layer thickness is a SLICE parameter which allows users to choose and vary layer thicknesses, thus determining the vertical resolution of the part.

Use thinner layers is to improve accuracy and resolution in the vertical (Z) axis. Vertical dimension accuracy and resolution are limited to one layer thickness.

Sloping (near-flat) surfaces are approximated with smaller horizontal and vertical surfaces which appear as stair-steps. The chosen layer thickness determines the height of each step. Gaps between layer borders are skin filled. Other areas may be crosshatched, if necessary. Decreasing the layer thickness in near-flat regions results in smoother surfaces, since the height of each step is reduced.

Thicker layers can be used to strengthen parts and in some cases reduce the time required to build parts. However, the laser must trace at a slower rate over the resin surface to draw thicker layers, so the time saved by drawing thicker and thus fewer layers is partially offset by the reduced drawing speed.

Vector Blocks

SLICE creates vector blocks for a variety of two-point vectors. The block identifiers follow the mnemonic rule shown below.

```
          L            + B
          F    +  U    + H
          NF   +  D    + F
          |       |      |
          |       |      |
Layer     /   Up Skin    \  Border
Flat                        Hatch
Near-Flat     Down Skin     Fill
```

| Block Mnemonic | Description |
|---|---|
| LB | Layer Border |
| LH | Layer Hatch |
| FUB | Flat Up Border |
| FUF | Flat Up skin Fill |
| FDB | Flat Down Border |
| FDF | Flat Down skin Fill |
| NFUB | Near-Flat Up skin Border |
| NFUF | Near-Flat Up skin Fill |
| NFDB | Near-Flat Down skin Border |
| NFDH | Near-Flat Down skin Hatch |
| NFDF | Near-Flat Down skin Fill |

*Slice Resolution*

Slice resolution translates .STL files from CAD space to Slice space by specifying the number of slice units contained in each CAD unit.

Slice Resolution = # of slice units/CAD unit

Slice Main Menu

```
                    SLICE MAIN MENU

Current Object: cam_part
Database File Name: cam_part.stl, binary format
Extra Parameters:

Alter   -- Alter Standard Options
Extra   -- Set extra parameters

Load    -- Load a different object's options
Save    -- Save current object's options
Write   -- Save current object's options under different name
Copy    -- Copy another object's options into current object

DoSlice -- Do slicing with current options
Quit    -- Exit (use SAVE to save options first)

Which Command?
```

*Alter* Alters standard slicing parameters.

*Extra* Selects extra parameters not listed on the Alter Menu. These extra parameters currently specify the vertical axis for part building.

*(default)* slice part along Z-axis

*-X* slice part along X-axis

*-Y* slice part along Y-axis

*Save* Saves the options displayed on the screen, variable layer thickness table and extra parameters in the current options file.

*DoSlice* Runs SLICE using the current options.

*Quit* Quits SLICE. QUIT does not save the options file (use SAVE first).

Alter Menu

SLICE ALTER MENU

Current Object: CAM_PART

| Option | Description | CAD Units | Slice Units |
|---|---|---|---|
| (1) | DATABASE File Name | cam_part.stl (binary) | |
| (2) | Resolution | 1000.000 | |
| (3) | Layer thickness | 0.010 Fixed | 10 |
| (4) | X hatch spacing | 0.000 | 0 |
| (5) | Y hatch spacing | 0.000 | 0 |
| (6) | 60/120 degree hatch spacing | 0.050 | 50 |
| (7) | X skin fill spacing | 0.003 | 3 |
| (8) | Y skin fill spacing | 0.000 | 0 |
| (9) | Minimum Surface Angle for Scanned Facets | 50 | |
| (10) | Minimum Hatch Intersect Angle | 0 | |
| (11) | Segment Output File Name | cam_part.sli | |
| (Q) | Quit, return to Main Menu | | |

Alter Which Option?

*DATABASE File Name* Specifies the .STL file to be sliced and whether the file is ASCII or binary. Enter the filename only; the .SLI extension is assumed.

*Resolution* Divides the CAD unit into smaller slice units, in essence creating a three-dimensional grid. Thus, if the CAD model was designed in inches, and slice resolution was set to 1000, each inch of the part would be divided into 1000 slice units, each 0.001 inch long.

NOTES:

- Larger resolution values distort triangles less and reduce the possibility of crosshatching errors.
- All files comprising a single part (all support and object files) should be sliced with the same resolution.

- The largest X, Y or Z coordinate of the CAD model determines the maximum acceptable value for slice resolution.

(highest coordinate) * slice res. < 65,535

- Use round numbers (i.e., 1000, 2000, 5000 etc.).

*Layer Thickness* Defines the vertical slice thickness in CAD units. (Layer thickness is displayed later in both CAD units and slice units, but is entered in CAD units.)

Layer thickness may be fixed for an entire file (i.e., all layers assigned the same layer thickness) or varied (groups of layers having different layer thicknesses). Typical values range from 0.002 inch to 0.030 inch.

| Type | Thickness |
|---|---|
| Fine | 0.005 inch |
| Medium | 0.010 inch |
| Coarse | 0.020 inch |

For example, if you want a part designed in inches to be built of layers 0.01 inch thick, enter .01. The layer thickness in slice units will be displayed on the screen automatically under the SLICE UNITS heading.

The maximum number of layers which can be used is 16384 (this corresponds to 0.0005 inch thick layers on an 8.0 inch part).

*Hatch Spacing* Options (4), (5) and (6) specify the perpendicular distance, in CAD units, between adjacent hatch vectors drawn parallel to the X axis, parallel to the Y axis, or 60 and 120 degrees from the X axis, respectively.

NOTES:

- Typical hatch spacing values are 0.05 to 0.10 inch.
- Use zero for web supports. (Web supports are designed as two back-to-back vertical surfaces and thus do not need crosshatches.) A zero means no crosshatches are generated.
- X and Y crosshatches are commonly used together to form a grid of squares.
- X and 60/120 crosshatches are most often used since they produce a more rigid structure than X and Y crosshatches alone.

*Fill Spacing* Options (7) and (8) specify the perpendicular distance, in CAD units, between skin vectors drawn parallel to the X or Y axis, respectively.

NOTES:

- Typical fill spacing values are 0.001 to 0.004 inch.
- Never use both X and Y fill at the same time as this tends to stress and deform surfaces.
- Use zero for supports.

*Output Filename* Is the filename that will be assigned to the slice output file.

*Quit* Returns control to the Slice Main Menu.

Procedures (Lab 2 - Slice)

Before You Start

- Transfer .STL files to the Slice Computer
- Logon UNIX

*Step 1)* At the UNIX prompt, execute SLICE and enter the object filename.

$slice∧cam_part [ENTER ↵]

*Step 2)*

```
SLICE MAIN MENU

Current Object: cam  part
Database File Name: cam .part.stl, binary format
Extra Parameters:

Alter   -- Alter Standard Options
Extra   -- Set extra parameters

Load    -- Load a different object's options
Save    -- Save current object's options
Write   -- Save current option's options under different name
Copy    -- Copy another object's options into current object

DoSlice -- Do slicing with current options
Quit    -- Exit (use SAVE to save options first)

Which Command?
```

At the Slice Main Menu, press A to alter standard options.

*Step 3)*

SLICE ALTER MENU

Current Object: CAM_PART

| Option | Description | CAD Units | Slice Units |
|---|---|---|---|
| (1) | DATABASE File Name | cam part.stl (binary) | |
| (2) | Resolution | 1000.000 | |
| (3) | Layer thickness | 0.010 Fixed | 10 |
| (4) | X hatch spacing | 0.000 | 0 |
| (5) | Y hatch spacing | 0 000 | 0 |
| (6) | 60/120 degree hatch spacing | 0.050 | 50 |
| (7) | X skin fill spacing | 0 003 | 3 |
| (8) | Y skin fill spacing | 0 000 | 0 |
| (9) | Minimum Surface Angle for Scanned Facets | 50 | |
| (10) | Minimum Hatch Intersect Angle | 0 | |
| (11) | Segment Output File Name | cam_part.sli | |
| (Q) | Quit, return to Main Menu | | |

Alter Which Option?

At the Alter Menu, update or verify the following options.

| | | |
|---|---|---|
| (1) | DATABASE FIlename | cam_part ascii |
| (2) | Resolution | 5000 |
| (3) | Layer thickness | fixed .010 |
| (4) | X hatch spacing | .050 |
| (6) | 60/120 degree hatch spacing | .050 |
| (7) | X skin fill spacing | .003 |
| (9) | Minimum Surface Angle for scanned facets | 50 |

Press Q to return to Slice Main Menu.

*Step 4)* Press E to set extra parameters and enter -y.

*Step 5)* Press S to save options file as cam_part .UII.

*Step 6)*

```
SLICE MAIN MENU

Current Object: cam_ part
Database File Name: cam  part.stl, ascii format
Extra Parameters: -Y

Alter    -- Alter Standard Options
Extra    -- Set extra parameters

Load     -- Load a different object's options
Save     -- Save current object's options
Write*   -- Save current option's options under different name
Copy     -- Copy another object's options into current object

DoSlice  -- Do slicing with current options
Quit     -- Exit (use SAVE to save options first)

Which Command?
```

At the Slice Main Menu, press D to slice the cam__part file.

*Step 7)*

```
3D SYSTEMS SLICE PROGRAM

Resolution value ..................................... 5000.000
X hatch spacing ...................................... 250
Y hatch spacing ...................................... 0
Flat X fill spacing .................................. 15
Flat Y fill spacing .................................. 0
60/120 degree angle hatch spacing .................... 250
Min Surface Angle .................................... 50
Min Intersect Angle .................................. 0
Input file format .................................... ascii
centering ............................................ off
segment output file .................................. cam  part.sli
layer thickness ...................................... 50

Start Time: Tue Mar 22 07:59:59 1988
End Time: Tue Mar 22 08:01:26 1988
SLICE COMPLETED

Press <Enter> to continue ...
```

When SLICE is finished, press ENTER↵ to return to the Slice Main Menu.

*Step 8)* At the Slice Main Menu, press A to alter standard options for the supports file (cam_base).

*Step 9)* At the Alter Menu, update the following options.

| | | |
|---|---|---|
| (1) | DATABASE Filename | **cam_base, ascii** |
| (2) | Resolution | **5000** |
| (3) | Layer Thickness | **fixed, .010** |

Set hatch, skin fill and MSA values (options 4 thru 9) to zero.

*Step 10)* Press E and set extra parameters to -y.

*Step 11)* Press S to save options file as cam_base.UII.

*Step 12)* At the Slice Main Menu, press D to slice cam_base file.

*Step 13)* At the Slice Main Menu, press Q to quit SLICE. This will return you to the UNIX prompt.

INTERMEDIATE TOPICS

*Slice Main Menu*

```
                 SLICE MAIN MENU

Current Object: cam_part
Database File Name: cam_part.stl, ascii format
Extra Parameters:

Alter   -- Alter Standard Options
Extra   -- Set extra parameters

Load    -- Load a different object's options
Save    -- Save current object's options
Write   -- Save current option's options under different name
Copy    -- Copy another object's options into current object

DoSlice -- Do slicing with current options
Quit    -- Exit (use SAVE to save options first)

Which Command?
```

*Load* Loads another file. The options previously listed on the screen are not automatically saved (you must use the SAVE command). Using LOAD is equivalent to quitting SLICE and re-entering a new file to Slice.

*Write* Writes the options into another object's options file.

*Copy* Copies options from a previously saved object's options file into the current options file. COPY saves having to re-enter options which are similar to those entered during an earlier run.

Alter Menu

Variable Layer Thickness

SLICE ALTER MENU

Current Object: CAM__PART

| Option | Description | CAD Units | Slice Units |
|---|---|---|---|
| (1) | DATABASE File Name | cam_part.stl (ascii) | |
| (2) | Resolution | 5000.000 | |
| (3) | Layer thickness | 0.010 Fixed | 50 |
| (4) | X hatch spacing | 0.050 | 250 |
| (5) | Y hatch spacing | 0.000 | 0 |
| (6) | 60/120 degree hatch spacing | 0.050 | 250 |
| (7) | X skin fill spacing | 0.003 | 15 |
| (8) | Y skin fill spacing | 0.000 | 0 |
| (9) | Minimum Surface Angle for Scanned Facets | 50 | |
| (10) | Minimum Hatch Intersect Angle | 0 | |
| (11) | Segment Output File Name | cam__part.sli | |
| (Q) | Quit, return to Main Menu | | |

Alter Which Option?

Variable layer thickness allows sets of layers (ranges) in the file to be created in which layer thickness can be individually specified.

Thinner layers are commonly used to:

- minimize the stair-step appearance of sloping surfaces
- improve accuracy of critical vertical dimensions and details Thicker layers are occasionally used to strengthen unsupported regions or to produce stronger, rigid layers.

*Layer Thickness Commands*

```
Z Level                          Spacing




Command (A, D, S, Q, Help)?
```

*A* Adds a new Z Level to the table. The Z Level specifies the vertical dimension to begin slicing at the specified thickness. The starting dimension and thickness are both entered in CAD units. Slicing will continue at this spacing until another Z Level is defined. The first (lowest) Z level must start at or lower than the bottom of the object to be sliced.

*D* Deletes a Z Level from the table.

*S* Saves the table and returns control to the Alter Menu.

*Q* Returns to the Alter Menu without saving the table.

*H* Prints a help message similar to this listing.

*MSA*

SLICE parameter MSA (Minimum Surface Angle for scanned facets) defines the angle at which a triangle classification changes from near-flat to steep. As shown below, near-flat triangles are at an angle greater than zero (horizontal), but less than or equal to the MSA. Steep triangles are at an angle greater than the MSA, but less than or equal to 90 degrees.

| | |
|---|---|
| $\propto = 0^\circ$ | FLAT |
| $0^\circ < \propto \leq MSA$ | NEAR-FLAT |
| $MSA < \propto \leq 90^\circ$ | STEEP |

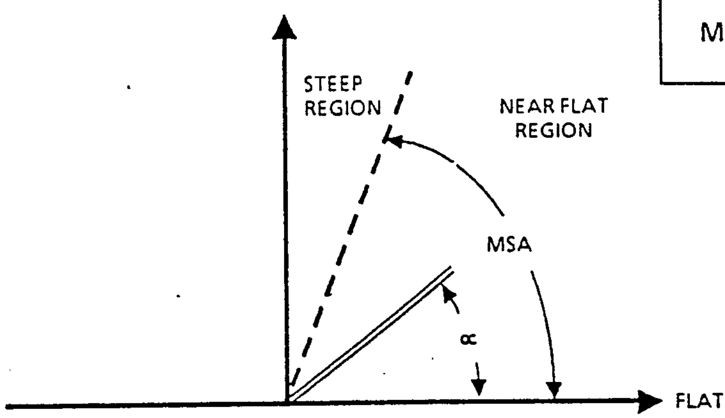

*The angle at which a triangle classification changes from near-flat to steep is defined by SLICE parameter MSA*

NOTES:

- Triangles inclined at less than the MSA are classified as near-flat. For these triangles, SLICE generates near-flat skin to fill gaps between layer borders on adjacent layers. Too large an MSA will cause SLICE to generate more skin vectors than necessary, increasing the run time and file size. Too small an MSA will cause gaps in the finished part resulting in liquid draining out of the object's walls.

- The correct MSA depends on the layer thickness used. Recommended values are:

| Layer Thickness | MSA |
|---|---|
| 0.005 | 40 |
| 0.010 | 50 |
| 0.015 | 55 |
| 0.020 | 60 |

- Use zero for web supports.

*MIA*

Allows removal of specific hatch vectors which may cause part building problems. This is an advanced option -- consult a 3D Systems Applications Engineer.

Procedures (Lab 3 -Slice)

Variable Layer Thickness

*Step 1)*

SLICE ALTER MENU

Current Object: SPIKE_P

| Option | Description | CAD Units | Slice Units |
|---|---|---|---|
| (1) | DATABASE File Name | cam_part.stl (binary) | |
| (2) | Resolution | 5000.000 | |
| (3) | Layer Thickness | 0.010 Fixed | 50 |
| (4) | X hatch spacing | 0.050 | 250 |
| (5) | Y hatch spacing | 0.000 | 0 |
| (6) | 60/120 degree hatch spacing | 0.050 | 250 |
| (7) | X skin fill spacing | 0.003 | 15 |
| (8) | Y skin fill spacing | 0.000 | 0 |
| (9) | Minimum Surface Angle for Scanned Facets | 50 | |
| (10) | Minimum Hatch Intersect Angle | 0 | |
| (11) | Segment Output File Name | cam_part.sli | |
| (Q) | Quit, return to Main Menu | | |

Alter Which Option?

At the Alter Menu, press 3 to select LAYER THICKNESS.

*Step 2)*

| Z Level | Spacing |
|---|---|

Command (A, D, S, Q, Help)?

Press V to select variable thickness.

*Step 3)* Add or delete Z Levels as needed.

Command? A^1.00^.010 ENTER↵

Command? A^2.60^.005 ENTER↵

NOTE: The first Z Level must start at or below the bottom of the part.

*Step 4)*

| Z Level | Spacing |
|---|---|
| 1.000 .................. | .010 |
| 2.600 .................. | .005 |

Command (A, D, S, Q, Help)?

Press S to save Layer Thickness table.

*Step 5)* Press Q to return to Alter Menu.

*Step 6)* Alter other standard options, as required.

| | | |
|---|---|---|
| (4) | X hatch spacing | .050 |
| (9) | MSA | 55 |

*Step 7)* Press E and set extra parameters to -y.

*Step 8)* Press S to save options file as spike_p.UII.

*Step 9)* At the Slice Main Menu, press D to slice spike_p file.

*Step 10)* Repeat to set parameters and slice spike_b file.

3.6 CONTROL COMPUTER

*Overview*

All StereoLithographic process steps from MERGE through BUILD are run on the Control Computer. This encompasses all functions from transmitting and merging slice files,through controlling the elevator and dynamic mirrors to build the part.

Programs and operating parameters are selected from menus for ease of operation. The top-down hierarchy begins at the Main Menu, and continues through submenus, data entry screens, and status/information screens. Select options from menus by pressing the option number on the keyboard, or use the up and down arrow keys on the numeric keypad to position the pointer, then press ENTER ↵

The SLA-1 menu hierarchy is illustrated in the following figures. Note that each menu includes an exit or quit option to return to a next-higher menu. The exit option from the Main Menu takes you out of the SLA-1 operating system and into MSDOS.

The SLA-1 Menu System
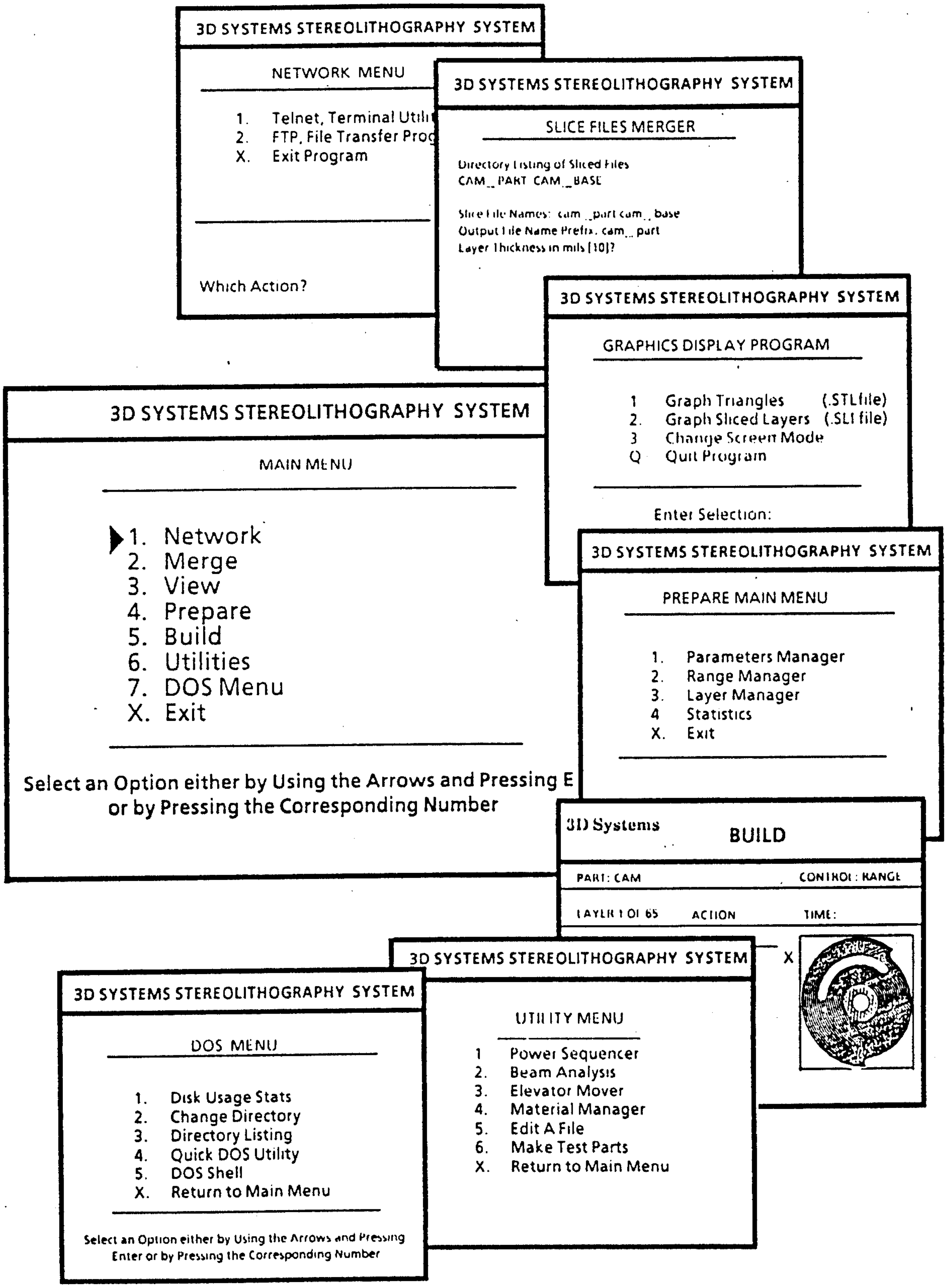

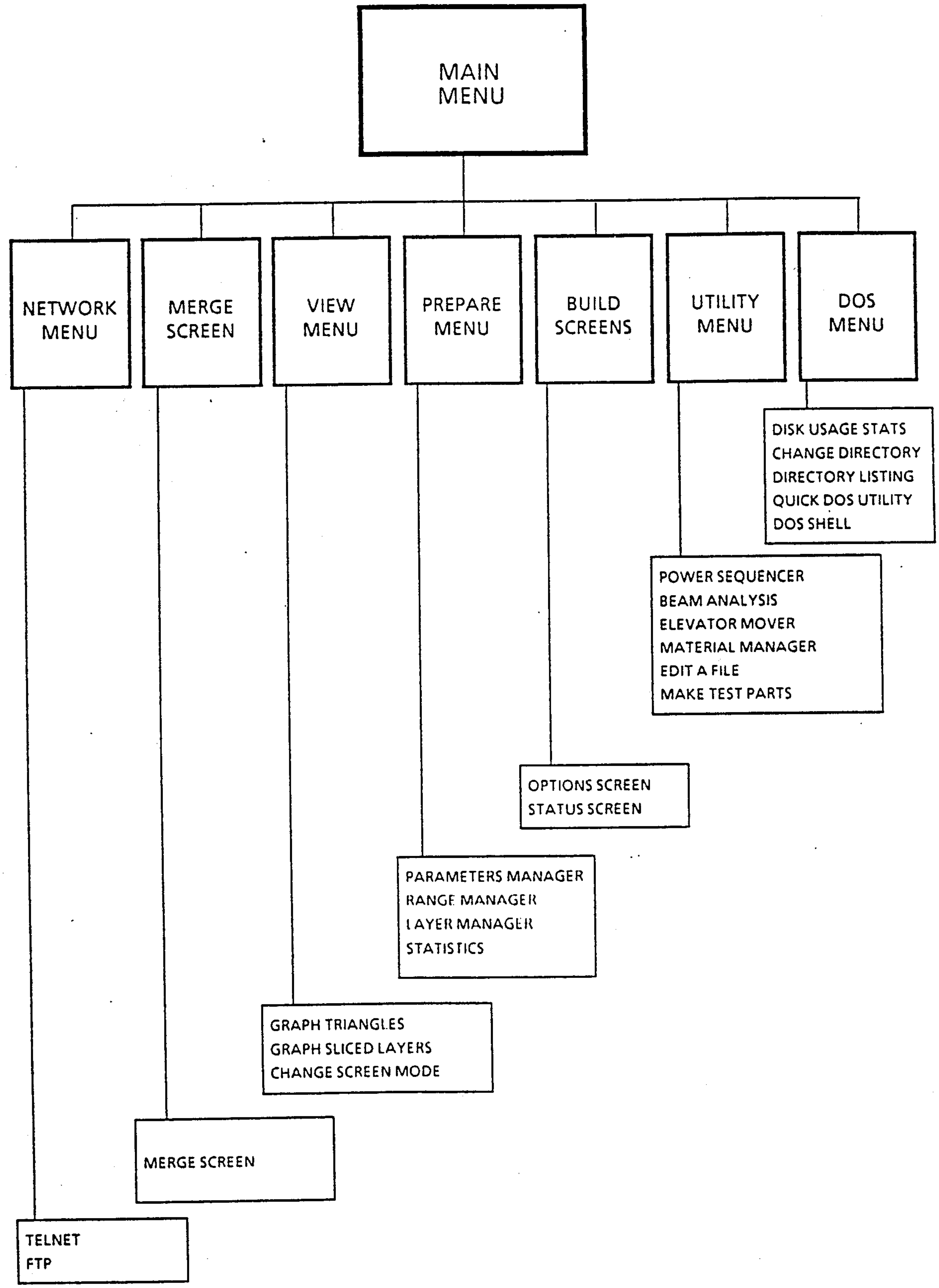
MAIN MENU
NETWORK MENU
MERGE SCREEN
VIEW MENU
PREPARE MENU
BUILD SCREENS
UTILITY MENU
DOS MENU
DISK USAGE STATS
CHANGE DIRECTORY
DIRECTORY LISTING
QUICK DOS UTILITY
DOS SHELL
POWER SEQUENCER
BEAM ANALYSIS
ELEVATOR MOVER
MATERIAL MANAGER
EDIT A FILE
MAKE TEST PARTS
OPTIONS SCREEN
STATUS SCREEN
PARAMETERS MANAGER
RANGE MANAGER
LAYER MANAGER
STATISTICS
GRAPH TRIANGLES
GRAPH SLICED LAYERS
CHANGE SCREEN MODE
MERGE SCREEN
TELNET
FTP

Commonly Used MSDOS Commands

The Control Computer operates under the single-user, single-task MSDOS operating system. The MSDOS prompt is based on the default disk drive. Filenames are limited to eight characters with a maximum of three characters for the extension (e.g., .SLI).

MSDOS is a powerful operating system, with many commands to choose from. However, most functions required in everyday operation of the SLA-1 can be accomplished using the few commands summarized below.

*Cd* changes directories cd^directory [ENTER ↵]

*Copy* copies files.

The following example copies one file to another file in the same directory on the same disk, but with a different filename. Both files then contain the same data, but have different names.

copy^test 1.ext^test2.ext [ENTER ↵]

You can also copy the file to a floppy disk. For example, to copy TEST1.EXT from the current directory to disk drive A:

copy^test1.ext^a: [ENTER ↵]

*Delete* deletes files.

The following example deletes file TEST1.EXT from the current directory.

del^test1.ext [ENTER ↵]

To delete several files with either a common filename or filename extension, type the command with an asterisk (*) for the common name. For example, the command del∧test 1.* [ENTER ↵]

deletes all files with the filename TEST1, followed by any extension, in the current directory. The command del∧*.ext [ENTER ↵]

deletes all files with the extension EXT. Use these *global* commands with care.

*Directory* lists files and subdirectories in a directory.

The following example lists all files in the current directory dir [ENTER ↵]

The next example lists all files named FILE1, regardless of extension, in the current directory.

dir∧file1.* [ENTER ↵]

The next example lists all files with extension .EXT, regardless of filename.

dir∧.ext [ENTER ↵]

*Help* displays a list of the available MSDOS commands, or the complete syntax and a short description of a specific command. This command may not be available on all systems.

To list all commands help [ENTER ↵]

To print the complete syntax and a short description of COPY to the screen.

help∧copy [ENTER ↵]

*Rename* Renames a file.

For example, the following command renames file TEST1 with the name TEST.

rename∧test1∧test [ENTER ↵]

After renaming, a file named TEST1 is no longer in the directory, but the same file exists under the name TEST.

3.7 UTILITIES

*Overview*

Utility menu options are used throughout the part-building process. Their functions include:

- Turning on and off SLA-1 hardware
- Measuring laser beam intensity and focus
- Moving the elevator platform before and after building a part
- Entering cure depth and linewidth data measured from banjotops
- Editing text files
- Making test parts

*Utility Menu*

```
3D SYSTEMS STEREOLITHOGRAPHY SYSTEM

UTILITY MENU
________________________

1. Power Sequencer
2. Beam Analysis
3. Elevator Mover
4. Material Manager
5. Edit A File
6. Make Test Parts
X. Return to Main Menu
```

*Power Sequencer*

POWER SEQUENCER MENU

1. Turn Laser and Mirror Driver On
2. Turn Elevator On
3. Open Shutter
4. Turn Laser and Mirror Driver Off
5. Turn Elevator Off
6. Close Shutter
X. Exit Please Make a Selection Laser On Shutter Open Door Closed Elevator On Turns on and off the laser, dynamic mirrors and elevator drivers, and opens and closes the laser shutter, directly from the Control Computer keyboard. The current status of each component is listed at the bottom of the screen.

*Beam Analysis*

BEAM ANALYSIS MENU

1. Display Profile
2. Beam Power/Profile History
3. Position Check
4. Beam Power
5. Beam Focus
6. Move Beam
7. Find Pinholes
8. Calibrate System
T. Toggle Between Screen Modes
X. Exit - Return to Main Menu Measures laser beam intensity and focus, and enables Field Engineers to maintain and calibrate the laser.

*Beam Power* points the laser beam at two beam profilers mounted in the Process Chamber and then calculates the average laser power. The current laser power is needed when Prepare Menu option MATERIAL MANAGER is run to calculate cure depths.

*Elevator Mover*

| ELEVATOR STOP | |
|---|---|
| UP ARROW | move elevator up |
| DOWN ARROW | move elevator down |
| SPACE BAR | stop elevator motion |
| D | move a specified distance |
| T | toggle parameter display |
| Q or X | exit to utility menu |

Elevator Mover enables positioning of the elevator platform using up and down arrow keys on the Control Computer numeric keypad. Press the space bar to stop elevator motion.

D moves the elevator platform a specified distance in inches. Positive values move the platform downward, negative up.

T toggles parameter information displayed at the bottom of the screen on and off.

Procedures (Lab 2 - Utilities)

Power Sequencer

Step 1)

UTILITY MENU

1. Power Sequencer
2. Beam Analysis
3. Elevator Mover
4. Material Manager
5. Edit A File
6. Make Test Parts
X. Return to Main Menu At the Utility Menu, press 1 to select POWER SEQUENCER.

Step 2)

POWER SEQUENCER MENU

1. Turn Laser and Mirror Driver On
2. Turn Elevator On
3. Open Shutter
4. Turn Laser and Mirror Driver Off
5. Turn Elevator Off
6. Close Shutter
X. Exit Please Make a Selection

Laser On  Shutter Open  Door Closed  Elevator On

At the Power Sequencer Menu, press the appropriate number key. The status display at the bottom of the screen will automatically update.

Beam Analysis

*Step 1)*

UTILITY MENU

1. Power Sequencer
2. Beam Analysis
3. Elevator Mover
4. Material Manager
5. Edit A File
6. Make Test Parts
X. Return to Main Menu At the Utility Menu, press 2 to select BEAM ANALYSIS.

*Step 2)*

BEAM ANALYSIS MENU

1. Display Profile
2. Beam Power/Profile History
3. Position Check
4. Beam Power
5. Beam Focus
6. Move Beam
7. Find Pinholes
8. Calibrate System
T. Toggle Between Screen Modes
X. Exit - Return to Main Menu At the Beam Analysis Menu, press 1 to select DISPLAY PROFILE or 4 to select BEAM POWER.

*Step 3)*

*Display Profile*

Review profile then press ENTER↵ to return to Beam Analysis Menu.

*Beam Power*

```
Sensor #1 8.08 mW Averaged Reading (7.99 mW Unfiltered)
Sensor #2 7.73 mW Averaged Reading (7.65 mW Unfiltered)
  Press 1 - 3 to select sensor #, Q to Quit
```

After power readings settle, write down average and press Q to return to Beam Analysis Menu.

*Elevator Mover*

*Step 1)*

```
UTILITY MENU
________________________________

1. Power Sequencer
2. Beam Analysis
3. Elevator Mover
4. Material Manager
5. Edit A File
6. Make Test Parts
X. Return to Main Menu
```

At the Utility Menu, press 3 to select ELEVATOR MOVER.

*Step 2)*

| | |
|---|---|
| ELEVATOR STOP | |
| UP ARROW | move elevator up |
| DOWN ARROW | move elevator down |
| SPACE BAR | stop elevator motion |
| D | move a specified distance |
| T | toggle parameter display |
| Q or X | exit to utility menu |

Press the up and down arrow keys on the numeric keypad to raise and lower the elevator platform

*and*

Press the space bar to stop elevator motion,

*or*

Press D to specify a distance (in inches) for the elevator to move (positive values lower the elevator).

INTERMEDIATE TOPICS

General Information

Edit a File

EDIT A FILE is used to edit text files.

Make Test Parts

MAKE TEST PARTS is used to build banjotops.

Material Manager

```
MATERIAL MANAGER
________________________________

1. Load Material Data
2. View Material Data
3. Input New Material Data
4. Layer Thickness Information
Q. Quit

Option:
```

*Load Material Data* lists material (.MAT) files and prompts for the file to be loaded.

*View Material Data* displays material data on the screen.

*Input New Material Data* inputs material data measured from banjotops. These data include:

- Step Period (SP) values
- The lineheight of each banjotop string
- The minimum and maximum linewidth measurement from each banjotop string INPUT NEW MATERIAL DATA then calculates a working curve and displays the slope and Y-intercept of the curve on the screen.

NOTE:
Refer to subsection 5.3 for further discussion of banjotops, working curves and related topics.

Procedures (Lab 3 - Utilities)

*Material Manager*

*Step 1)*

```
UTILITY MENU
______________________________

1.  Power Sequencer
2.  Beam Analysis
3.  Elevator Mover
4.  Material Manager
5.  Edit A File
6.  Make Test Parts
X.  Return to Main Menu
```

At the Utility Menu, press 4 to select MATERIAL MANAGER.

*Step 2)*

```
MATERIAL MANAGER
______________________________

1.  Load Material Data
2.  View Material Data
3.  Input New Material Data
4.  Layer Thickness Information
Q.  Quit

Option:
```

At the Material Manager Menu, press the appropriate option number.

*Step 3)*

*Load Material Data*

```
Available Material Files:

TEST.MAT
31498240 Bytes free

Name of data file to read:
```

Enter the material (.MAT) filename.

Name of data file to read: test.mat ENTER↵

```
Data from Material File: test.mat

Material Test Laser Power Reading: 10.50

    3 Material Data Pairs

      1   SP =     LH =     WMIN =      WMAX =
      2   SP =     LH =     WMIN =      WMAX =
      3   SP =     LH =     WMIN =      WMAX =

LH:     Slope =    Y-Intercept =    R-Value =
WMIN:   Slope =    Y-Intercept =    R-Value =
WMAX:   Slope =    Y-Intercept =    R-Value =

Press Enter to Continue . . .
```

Review material data then press ENTER↵

*Input New Material Data*

```
INPUT MATERIAL DATA

Name of Material Data File:
```

NOTE: Run Utility Menu option MAKE TEST PARTS to create banjotops, then measure the banjotop strings to generate data for the material file.

Enter material data filename. Include .MAT suffix.

Name of Material Data File: test.mat ENTER↵

```
INPUT MATERIAL DATA

Name of Material Data File: test.mat

Enter Material Test Laser Power Reading (mW):
```

Enter average laser power reading from BEAM POWER.

Enter Material Test Laser Power Reading (mW): ____ ENTER↵

```
INPUT MATERIAL DATA

Name of Material Data File: test.mat

Enter Material Test Laser Power Reading (mW): ____

How Many Step Period/Line Height Data Pairs?
```

Enter number of data pairs measured from banjotop.

How Many Step Period/Line Height Data Pairs? 3 ENTER ↵

```
INPUT MATERIAL DATA

Name of Material Data File: test.mat

Enter Material Test Laser Power Reading (mW): ____

How Many Step Period/Line Height Data Pairs? 3

Data Pair 1 SP =       LH =     WMIN =      WMAX =
Data Pair 2 SP =       LH =     WMIN =      WMAX =
Data Pair 3 SP =       LH =     WMIN =      WMAX =
```

Enter Step Period (SP), Line Height (LH) and minimum and maximum linewidth (WMIN, WMAX) data measured from banjotops. If WMIN and WMAX data were not measured, enter zeroes.

Data from Material File: TEST.MAT

Material Test Laser Power Reading: ____

3 Material Data Pairs

| | | | | |
|---|---|---|---|---|
| 1 | SP = | LH = | WMIN = | WMAX = |
| 2 | SP = | LH = | WMIN = | WMAX = |
| 3 | SP = | LH = | WMIN = | WMAX = |

| | | | |
|---|---|---|---|
| LH: | Slope = | Y-Intercept = | R-Value = |
| WMIN: | Slope = | Y-Intercept = | R-Value = |
| WMAX: | Slope = | Y-Intercept = | R-Value = |

Press Enter to Continue . . .

Review data for accuracy, then press ENTER ↵

3.8 NETWORK
Overview
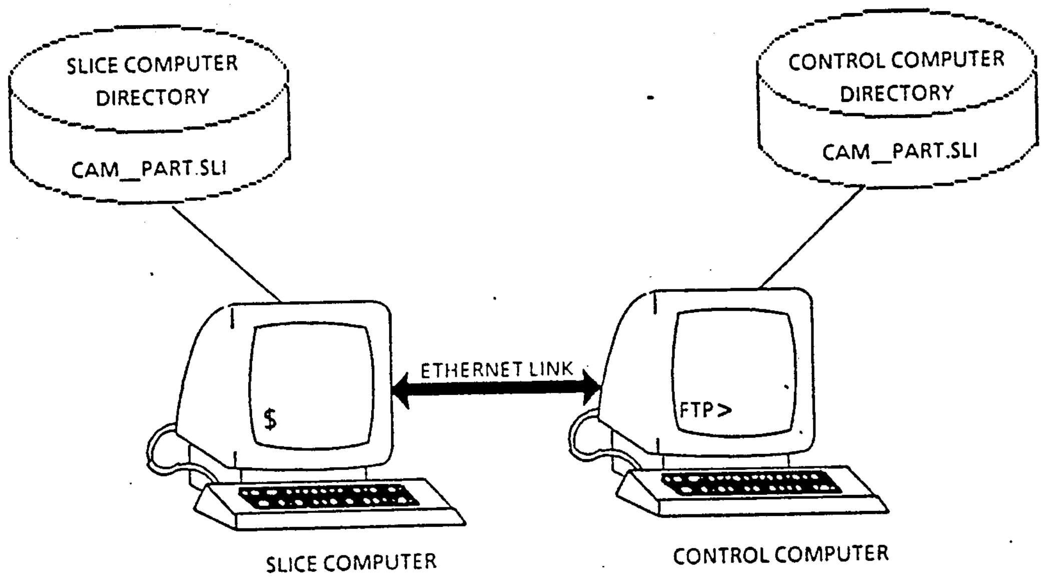
NETWORK transfers files via Ethernet between the Control and Slice Computers, and enables remote operation of the Slice Computer from the Control Computer keyboard.
Network Menu
3D SYSTEMS STEREOLITHOGRAPHY SYSTEM
NETWORK PROGRAM MENU
1. Telnet, Terminal Utility
2. FTP, File Transfer Program
X. Exit Program
Which Action?

File Transfer Program

Copies a file in the Slice Computer directory and moves it into the Control Computer working directory, or vice versa. FTP is generally used to transfer .SLI files to the Control Computer. Several commands are available. The prompt is:

FTP>

File Transfer Commands

*get* moves a copy of a file from the Slice Computer to the working directory in the Control Computer. The file is copied, and thus remains in the Slice Computer directory after the transfer is completed.

*mget* similar to *get*, except multiple files can be transferred at the same time.

*put* moves a copy of a file from the working directory in the Control Computer to the Slice Computer. The file is copied, and thus remains in the Control Computer directory after the transfer is completed.

*mput* similar to *put*, except multiple files can be transferred at the same time.

*dir* lists all files in the Slice Computer directory. Press CNTRL-S to pause the listing and CNTRL-Q to restart the listing.

*ldir* lists all files in the Control Computer working directory.

*bye* exits FTP and returns to the Main Menu.

*help* lists and describes all available commands.

Procedures (Lab 2 - Network)

*Step 1)*

3D SYSTEMS STEREOLITHOGRAPHY SYSTEM

MAIN MENU

1. Network
2. Merge
3. View
4. Prepare
5. Build
6. Utilities
7. DOS Menu
X. Exit Select an Option either by Using the Arrows and Pressing Enter or by Pressing the Corresponding Number At the Main Menu, select NETWORK.

1 *or* locate pointer ENTER ↵

*Step 2)*

3D SYSTEMS NETWORK PROGRAM

1. Telnet, Terminal Utility
2. FTP, File Transfer Program
X. Exit Program

Which Action?

At the Network Menu, press 2 to select FTP.

*Step 3)* At the prompt, enter your remote user name.

Remote User Name: train [ENTER↵]

*Step 4)* At the prompt, enter your password. It will not be displayed on the screen.

Remote Password: [ENTER↵]

*Step 5)* At the ftp> prompt, enter the appropriate command.

ftp>ascii [ENTER↵]
ftp>get^cam__part.sli [ENTER↵]
ftp>mget^cam__part.sli^cam__base.sli [ENTER↵]
ftp>dir [ENTER↵]
ftp>ldir [ENTER↵]
ftp>bye [ENTER↵]

NOTES:

- You must specify the format of file to be transferred (ASCII or binary). Slice files are in ASCII format, .STL files in ASCII or binary. The default is ASCII.
- Files transferred from UNIX (Slice Computer) to MSDOS (Control Computer) must comply with DOS filename rules. That is, the filename is limited in length to eight characters, and the extension is limited to three characters.

INTERMEDIATE TOPICS
*Terminal Utility*
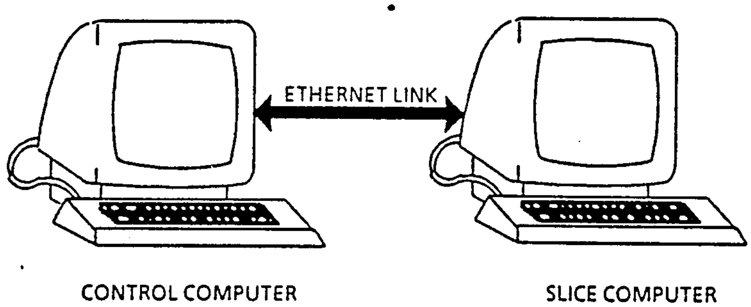
TERMINAL UTILITY enables users to logon the Slice Computer from the Control Computer keyboard and remotely operate SLICE and other programs. This option is infrequently used, since the Control Computer is generally being used to build parts.

Procedures (Lab 3 - Network)

*Step 1)*

```
3D SYSTEMS STEREOLITHOGRAPHY SYSTEM

MAIN MENU
________________________________

▶1. Network
 2. Merge
 3. View
 4. Prepare
 5. Build
 6. Utilities
 7. DOS Menu
 X. Exit
________________________________

Select an Option either by Using the Arrows and Pressing Enter
or by Pressing the Corresponding Number
```

At the Main Menu, select NETWORK.

1 *or* locate pointer [ENTER ↵]

*Step 2)*

```
________________________________
3D SYSTEMS NETWORK PROGRAM
________________________________
1. Telnet, Terminal Utility
2. FTP, File Transfer Program
X. Exit Program
________________________________
Which Action?
```

At the Network Menu, press 1 to select TELNET.

*Step 3)* At the prompt, enter your remote user name.

Login: train [ENTER ↵]

*Step 4)* At the prompt, enter your password. It will not be displayed on the screen.

Password: [ENTER ↵]

*Step 5)* At the UNIX prompt, enter commands as needed.

UNIX System V Release 1.0.4 80386

$

*Step 6)* When finished, exit TELNET.

$exit [ENTER ↵]

3.9 MERGE

*Overview*

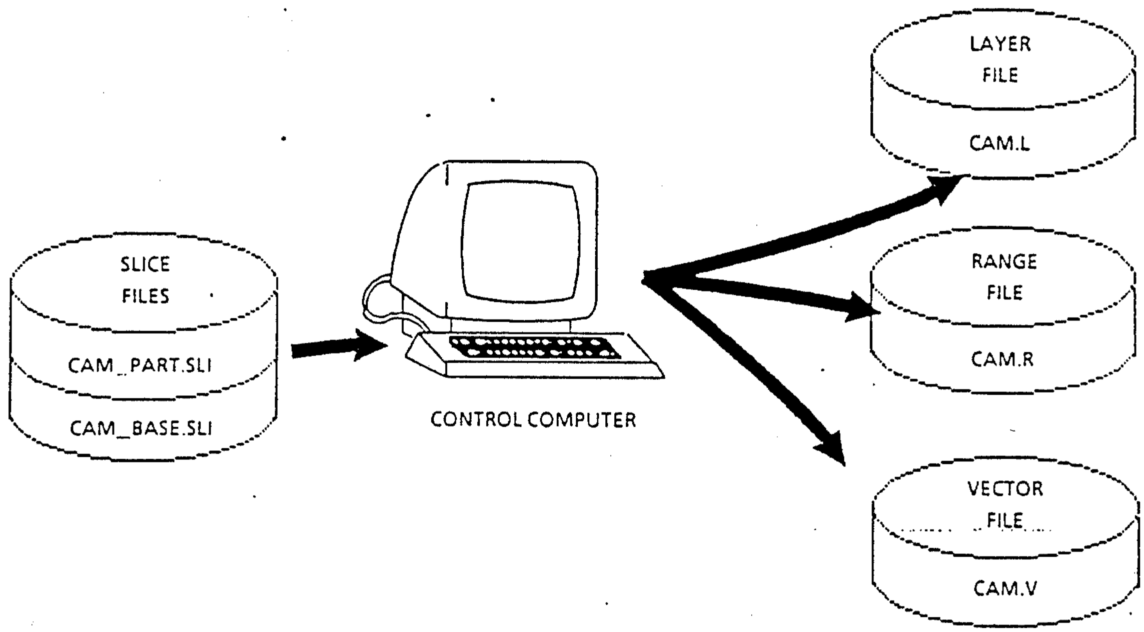

MERGE combines all Slice files for a part (support and object files) and generates Layer (.L), Vector (.V) and Range (.R) files.

| | |
|---|---|
| *Layer (file.L) File* | defines the types of vector blocks in each layer. |
| *Vector (file.V) File* | contains vector data used by BUILD to draw each layer. |
| *Range (file.R) File* | specifies ranges, drawing parameters and dipping parameters for BUILD. It is this file which may be modified using Prepare options to add part building parameters. |

Merge Information Screen

3D SYSTEMS STEREOLITHOGRAPHY SYSTEM

SLICED FILES MERGER

Directory Listing of Sliced Files:
CAM_PART CAM_BASE

Slice File Names: cam__part cam__base
Output File Name Prefix [CAM__PART]: cam
Layer Thickness in mils [10]?

| Different Z-Spacing Ranges: |
|---|
| 1. 3650 -- 6850 65 layers |
| 1 range, 65 layers processed |

The MERGE information screen is used to enter file information. It displays the following status information as MERGE is running.

- Starting and ending Z Level values for each layer thickness range.
- The Z Level currently being merged.
- At completion of the run, the total number of ranges processed and the number of merged layers in each range.

Procedures (Lab 2 - Merge)

*Before you Start*

Run Network Menu option FTP to transfer all required Slice files to the Control Computer working directory.

*Step 1)*

```
3D SYSTEMS STEREOLITHOGRAPHY SYSTEM

              MAIN MENU

     1. Network
   ▶2. Merge
     3. View
     4. Prepare
     5. Build
     6. Utilities
     7. DOS Menu
     X. Exit

Select an Option either by Using the Arrows and Pressing Enter
     or by Pressing the Corresponding Number
```

At the Main Menu, select MERGE.

2 *or* locate pointer [ENTER↵]

*Step 2)* Enter the files to be merged.

Slice File Names: cam_part ^ cam_base [ENTER↵]

*Step 3)* Enter a filename for the layer, vector and range files, or press [ENTER↵] to select the default filename.

Output File Name Prefix [CAM__PART]:cam [ENTER↵]

*Step 4* At the prompt, press [ENTER↵] to select the default layer thickness.

Layer thickness in mils [10]? [ENTER↵]

*Step 5)*

```
Directory Listing of Sliced Files:

     CAM_PART  CAM_BASE

Slice File Names:  cam_part  cam_base
Output File Name Prefix [CAM_PART]:cam
Layer Thickness in mils [10] ? _

                         Different Z-Spacing Ranges:
                         ------------------------------
                         1.  3650 -- 6850  65 layers
                         ------------------------------
                         1 range, 65 layers processed
```

Watch the screen to determine when MERGE is completed.

NOTE: Slice files with revisions earlier than 3.0 may prompt for Z-spacing.

INTERMEDIATE TOPICS

*Merge Options*

/Z adjusts the vertical position of one file relative to another. This option is used to align objects vertically. Enter the offset in slice units following the file to be adjusted.

Slice File Names: cam__part^cam__base /Z100

/X adjusts the X direction position of one file relative to another.

/Y adjusts the Y direction position of one file relative to another.

3.10 VIEW
*Overview*
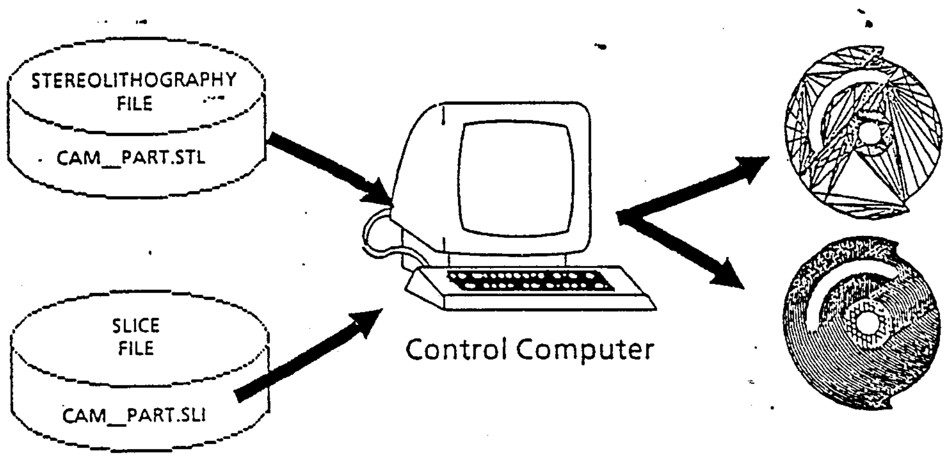
VIEW displays StereoLithography (.STL) and Slice (.SLI) files on the Control Computer screen. It is used primarily to:
- evaluate the need for variable layer thicknesses
- determine whether all vector blocks are needed
- study layers and part features
- check slice files

View Menu

| 3D SYSTEMS STEREOLITHOGRAPHY SYSTEM | |
|---|---|
| GRAPHICS DISPLAY PROGRAM | |
| 1. Graph Triangles | (.STL file) |
| 2. Graph Sliced Layers | (.SLI file) |
| 3. Change Screen Mode | |
| Q. Quit Program | |
| Enter Selection: | |
| Maximum Triangles:5341 | Maximum Layers:16382 |

Graph Triangles

*New File* specifies a new file to be graphed. The .STL files in the working directory are listed when the GRAPH TRIANGLES option is selected.

*Graph* graphs the file.

*Rotation* specifies the number of degrees rotation for the X, Y and Z axes following the Right-Hand Rule (RHR) convention. For example, to show an isometric view of the part, rotate the X axis 30 degrees, the Y axis 15 degrees, and the Z axis 0 degrees.

*Axis* specifies the axis to be oriented vertically when the file is graphed.

*ESC* (ESC key) escapes the GRAPH TRIANGLES function back to the View Menu.

*Window Mode* Advanced Topic.

*Select Range* Advanced Topic.

Graph Sliced Layers

| | |
|---|---|
| *New File* | specifies a new file to be graphed. The .SLI files in the working directory are listed when the GRAPH SLICED LAYERS option is selected. |
| *Layer Select* | lists the vector blocks in each layer in the file. This parameter is used to select slice layers which have vectors of interest. The minimum and maximum X and Y coordinates for the selected layer, in slice units, and the mnemonics for all vector blocks in the layer, are displayed when a layer is selected. |
| *Blocks* | specifies vector blocks to be displayed when the part is graphed. Using the toggle feature, selected blocks may be omitted from the next graph of the file. |
| *Graph* | graphs the file. |
| *ESC* | (ESC key) escapes the slice file display function back to the View Menu. |
| *Windowing* | Advanced Topic. |

Change Screen Mode

Allocates available disk space between StereoLithography and Slice Files. In most cases, the defaults will not have to be changed. However, if a very large .STL file is to be graphed, increase the triangles allocation (to a maximum of 10,921). If a very large .SLI file is to be graphed, increase the layers allocation (to a maximum of 16,382). If both types of files are being graphed, apportion disk space appropriately.

Procedures (Lab 3 - View)

Before You Start

To display an .STL file:

- Generate the file in either ASCII or binary format.
- Transfer the file to the Control Computer working directory using a floppy disk or DATA TRANSFER.

To display an .SLI file:

- Run SLICE if the file has not been generated.
- Transfer the .SLI file to the Control Computer working directory using a floppy disk or DATA TRANSFER.

Change Screen Mode

*Step 1)*

| 3D SYSTEMS STEREOLITHOGRAPHY SYSTEM |
|---|
| MAIN MENU<br><br>1. Network<br>2. Merge<br>▶3. View<br>4. Prepare<br>5. Build<br>6. Utilities<br>7. DOS Menu<br>X. Exit<br><br>Select an Option either by Using the Arrows and Pressing Enter<br>or by Pressing the Corresponding Number |

At the Main Menu, select VIEW.

3 *or* locate pointer [ENTER ↵]

*Step 2)*

```
3D SYSTEMS GRAPHICS DISPLAY PROGRAM

1. Graph Triangles       (.STL file)
2. Graph Sliced Layers   (.SLI file)
3. Change Screen Mode
Q. Quit Program

Enter selection:

Maximum Triangles: 5341     Maximum Layers: 16382
```

Review the disk space allocation shown at the bottom of the screen to determine if memory must be reallocated between the files. In most cases, the defaults will not have to be changed.

*Step 3)* If you need to change the allocation, press 3 to select CHANGE SCREEN MODE, then enter the appropriate number of slice layers at the prompt.

*Viewing StereoLithography Files*

*Step 1)* At the Main Menu, select VIEW.

3 *or* locate pointer [ENTER↵]

*Step 2)* At the View Menu, press 1 to select GRAPH TRIANGLES.

*Step 3)* At the prompt, enter the StereoLithography filename.

Enter File Name: cam_part [ENTER↵]

*Step 4)* At the prompt, enter the file type (ASCII or binary).

File "CAM.PART.STL"selected.
Type ASCII or Binary (A,B)?A [ENTER↵]

*Step 5)*

TRIANGLE FILE CONTROL FUNCTIONS

Triangle Filename: CAM.PART.STL  Triangle Filetype: ASCII
Total Triangles: 484

| | |
|---|---|
| File X Min: 3.61324143 | File X Max: 5.26136637 |
| File Y Min: 0.96399999 | File Y Max: 1.37500000 |
| File Z Min: 3.66136622 | File Z Max: 5.38452482 |

Total Selected: 484

| | |
|---|---|
| Selected Min: 3.66136622 | Selected Max: 5.38452482 |
| Sel. X Min: 3.61324143 | Sel. X Max: 5.26136637 |
| Sel. Y Min: 0.96399999 | Sel. Y Max: 1.37500000 |
| Sel. Z Min: 3.66136622 | Sel. Z Max: 5.38452482 |

X Y Z Axis Rotation: 0 0 0
Windowing by File

Slice Axis is Z

| Select: | | | | | | |
|---|---|---|---|---|---|---|
| | N | new file | W | windowing mode | S | select range |
| | A | slice axis | R | rotate | G | graph |

*Step 6)* To rotate the display axes, press R then enter the number of degrees rotation for the X, Y and Z axes at the prompt.

X Y Z Axis Rotation: 15∧10 ∧0 [ENTER↵]

The screen will automatically update to show the selected rotation of each axis.

*Step 7)* To toggle between display modes, press W.

*Step 8)* To change the display axis, press A then enter the display axis at the prompt.

New Axis: X ENTER↵

The screen will automatically rescan the file and update the screen to show the selected display axis.

*Step 9)* To specify a new file to be graphed, press N then enter the filename at the prompt.

Enter File Name: cam_base ENTER↵

*Step 10)* To graph the file, press G.

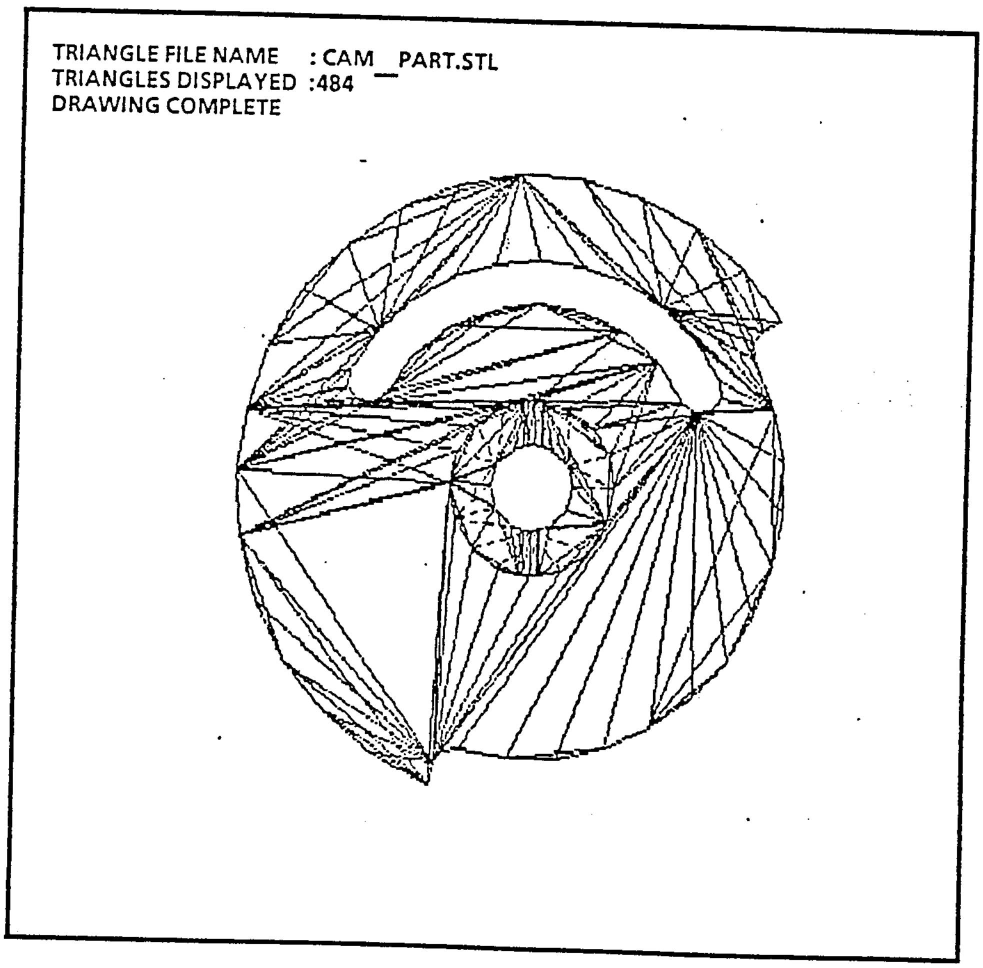

Viewing Sliced Files

*Step 1)* At the Main Menu, select VIEW.

3 *or* locate pointer [ENTER↵]

*Step 2)* At the View Menu, press 2 to select GRAPH SLICED FILES.

*Step 3)* At the prompt, enter the Slice filename.

Enter File Name: cam_part [ENTER↵]

*Step 4)*

```
SLICE FILE CONTROL FUNCTIONS

Slice Filename:  CAM_PART.SLI
Layer Start:  4800                    Layer End:  6850
File X Min:  18066                    File X Max:  26307
File Y Min:  18307                    File Y Max:  26923

Selected Layer:  4800
Layer X Min:  21250                   Layer X Max:  23750
Layer Y Min:  21250                   Layer Y Max:  23750

Windowing by File

Layer Blocks:                         Display Blocks:
L     B  H                            L    B   H
FU    B  H  F                         FU   B   H   F
FD    B  H  F                         FD   B   H   F
NFU   B  H  F                         NFU  B   H   F
NFD   B  H  F                         NFD  B   H   F

Select:  N  new file            L  layer select     G  graph
         W  Windowing mode      B  block select
```

*Step 5)* To select a specific layer to be graphed, press L and enter the layer number at the prompt. Press PgDn to move forward through the list and PgUp to move backward.

Enter Layer Number: 5000 ENTER↵

The screen will automatically update to show the vector block mnemonics and minimum and maximum dimensions of the layer in slice units.

*Step 6)* To select a vector block in the layer to be "toggled" on or off, press B then enter the block type at the prompt.

Enter Block Type to Toggle: fuh ENTER↵

The selected vector block will be toggled on and off until a new layer is selected or a new file is loaded.

*Step 7)* To toggle between display modes, press W.

*Step 8)* To graph the slice file, press G.

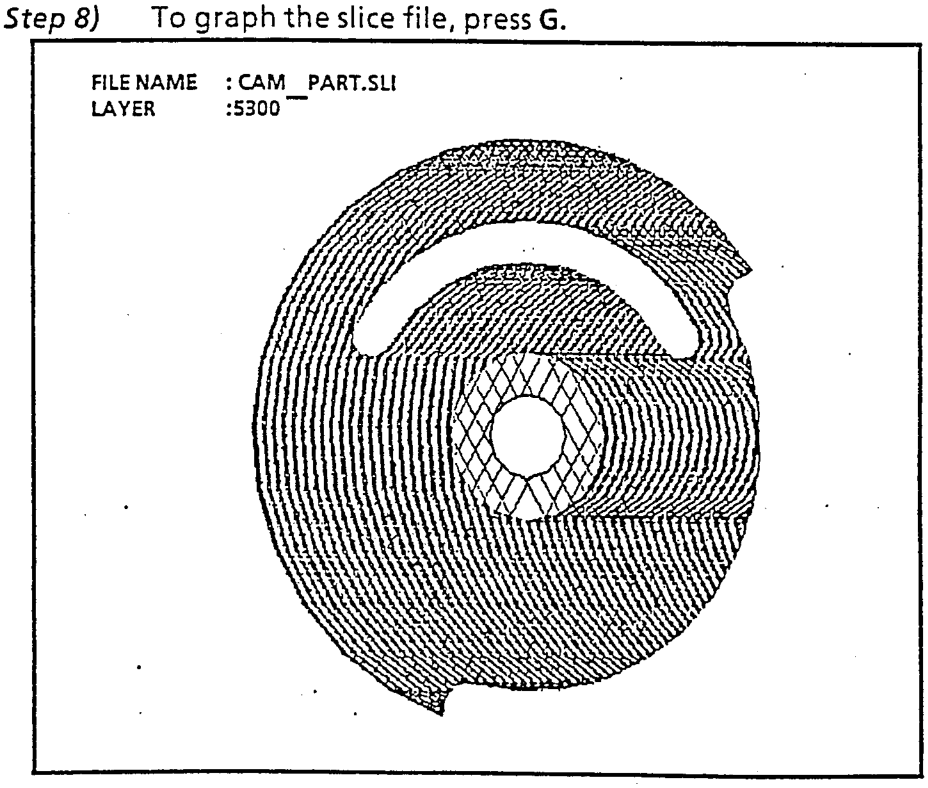

3.11 PREPARE

Overview

Prepare Menu options are used to specify part building parameters such as laser drawing speed and elevator dipping times, as well as to edit the Range (.R) file.

Part Building Guidelines

Layer Overlap

Good adhesion between layers is normally attained by giving each layer a 0.006 inch overcure (i.e., the cure depth used for 0.020 inch thick layers is 0.026 inch).

Dip Delay

The amount of time required for the surface of the resin to level and settle after a part is dipped is dependent on the geometry of the part and many other factors.

Common Part Building Parameters

*SS* (Step Size) The SLA-1 only appears to draw vectors in continuous motion. The dynamic mirrors actually move the beam in discrete steps followed by short delays. Step size is the size of the move in mirror bits.

In general, step size for borders and crosshatches is set to 2 (the minimum allowable). Step size for skin fill vectors is typically set to 16.

*SP* (Step Period) is the length of the delay following each laser step. The larger the SP, the slower the laser drawing speed, and thus the greater the depth of cured plastic.

*ZW* specifies the *leveling* time for the resin surface to settle and level after dipping. Generally, ZW is set to between 30 and 60 seconds for supports. Set ZW to 45 to 180 seconds for normal part building.

*Ranges*

A range is a group of one or more horizontal slice layers defined by lower and upper dimensions entered in CAD units or slice units. A range is created whenever a part building parameter value needs to be specified for a group of layers.

For example, if a dip delay of 30 seconds is required for support layers, and 60 seconds will be used for all remaining layers, two ranges have to be defined. The first would contain the layers of the part with a ZW of 30, the second all layers with a delay of 60.

Another example where ranges are often used is ~~in varying layer cure~~ depths. A range comprised of the first few support layers would be created with larger cure depths than those specified for the rest of the layers.

Prepare Menu options are used to create the necessary ranges:

*Prepare Main Menu*

```
3D SYSTEMS STEREOLITHOGRAPHY SYSTEM

PREPARE MAIN MENU
________________________
1. Parameters Manager
2. Range Manager
3. Layer Manager
4. Statistics
X. Exit
________________________
Which Option?
```

*Parameters Manager Menu*

Parameters Manager is used to add or modify part building parameters.

| | | |
|---|---|---|
| 1. | Z-Pitch .............................. | 100 |
| 2. | XY-only Scale ........................ | 3.556 |
| 3. | Maximum Vector Count................ | 5000 |
| 4. | Minimum Viewport Coordinates ........ | (15000,15000) |
| 5. | Maximum Viewport Coordinates........ | (45000, 45000) |
| 6. | Multiple Part Positioning ............... | (15520, 15000) |
| 7. | Build Options Line: /X-/Y- | |
| U. | Update BUILD parameters on disk | |
| X. | Exit | |

*Z-Pitch*

This parameter controls scaling of the part in the vertical dimension.

*XY-Only Scale Factor*

XY-only scale factor converts a distance in slice units into movement of the laser beam on the surface of the resin.

A characteristic of the dynamic mirrors is that the laser beam will move 1 inch on the resin surface for every 3556 mirror bits sent to the mirror drivers (or 140 bits for every mm). Since 3556 is an inconvenient number to use for slice resolution, a conversion factor is used.

For example, if you slice a CAD file designed in inches with a resolution of 1000, every inch of the object will be represented by 1000 slice units, instead of 3556. Therefore, every vector in the .V file will be too short, by a factor 1000/3556 = .3556, and if it were used without modification, the final part would be too small. BUILD multiplies all vector coordinates in the .V file by the XY-only scale factor. Therefore, this parameter should be set to 3556/1000 = 3.556 to rescale the vectors to their proper lengths. In general, the formula is:

XY-Only Scale = 3556 mirror bits/# slice units per inch

Note that you can also resize your part using XY-only scale factor. For example, to increase the horizontal dimensions of the part described above by 10 percent, use a scale factor of 3.556 * 1.10 = 3.912

To reduce the horizontal dimensions by 50 percent, use 3.556 * 0.50 = 1.778

*Maximum Vector Count*

This parameter specifies the maximum number of vectors to be loaded into the dynamic mirrors buffer before they begin moving to build the part.

*Minimum/Maximum Viewport Coordinates*

BUILD viewport coordinates specify the minimum and maximum coordinates (in mirror bits) of the window display of the vat shown on the BUILD status screen. The coordinate limits are (0,0) and (65535,65535).

For example, if you would like to view the cam while it is being built, use viewport coordinates:

NOTE: The cam is approximately 1 inch in diameter.

$(X_{min}, Y_{min})$ = vat center - 1/2 part width
= 32767 - 0.5 * 3556
= 30989

$(X_{max}, Y_{max})$ = vat center + 1/2 part width
= 32767 + 0.5 * 3556
= 34545

Note that since the coordinates calculated for the X-Y offsets are for the center of the part, you must subtract enough mirror bits from the offsets to display the entire part. You must add a similar number, at least equal to one-half the part width, to the maximum offsets.

To show the entire 9 inch by 9 inch working surface, enter:

$(X_{min}, Y_{min})$ = 32767 - 4.5 * 3556
= 16765

$(X_{max}, Y_{max})$ = 32767 + 4.5 * 3556
= 48769

*Multiple Part Positioning*

These parameters are used to both position the part on the elevator platform and to make multiple parts in the same BUILD run.

To calculate the coordinates needed to position a part in the center of the resin vat, you need to know:

- The coordinates of the center of the part in CAD space.
- The coordinates of the center of the vat, which are about (32767,32767). If necessary, exact coordinates can be obtained.

For example, if the part X-Y center is (2.3 inch, 4.1 inch), and the center of the vat is (32767, 32767), then X-offset = vat center - (CAD center * 3556)
= 32767 - (2.3 * 3556)
= 24588

Y-offset = vat center - (CAD center * 3556)
= 32767 - (4.1 * 3556)
= 18187

Multiple part positioning coordinates can also be used to make multiple copies of the part in the same run. For example, if you want to make four copies of the part used in the above example, you would calculate four sets of coordinates (X1/Y1, X2/Y2, X3/Y3 and X4/Y4) representing the center of each of the four parts.

If you want all four copies of the part clustered about the center of the resin vat and separated from each other by two inches in both the X and Y directions, calculate the coordinates for the vat center first, as in the previous example, then add and subtract mirror bits equal to half the distance desired between each part.

Separation = 2 inches /2 = 3556 bits $X1 = X_c + 3556 = 24588 + 3556 = 28144$
$Y1 = Y_c + 3556 = 18187 + 3556 = 21743$ $X2 = X_c - 3556 = 21032$
$Y2 = Y_c - 3556 = 14631$ $X3 = X_c + 3556 = 28144$
$Y3 = Y_c - 3556 = 14631$ $X4 = X_c - 3556 = 21032$
$Y4 = Y_c + 3556 = 21743$

*Build Options Line*

These parameters define the orientation of the BUILD viewport.

*Update Build Parameters On Disk*

This command saves all other PARAMETERS MANAGER entries to disk in the build.prm file.

*Range Manager Menu*

RANGE MANAGER
Prepare
working on file CAM.R

| Range | Z-Start | Z-End | Z-Space | CAD-Start | CAD-End | CAD-Space | Count |
|---|---|---|---|---|---|---|---|
| 1 | 3650 | 6850 | 50 | 0.730 | 1.370 | 0.010 | 65 |

Press:

| | | |
|---|---|---|
| A add range | D delete range | E edit range |
| V verify blocks | R make a report | C calc SPs |
| X exit | S save changes on disk | |

RANGE MANAGER is used to:

- add or delete ranges
- calculate step periods (laser drawing speed)
- edit ranges to modify dip delays
- save the Range (.R) file The RANGE MANAGER Menu lists:

- The Range (.R) filename
- Range numbers assigned when ranges are added.
- Starting and ending range dimensions in both CAD units and slice units. In the screen shown, the slice resolution is 5000, so CAD dimensions 0.73 inch (bottom of the part) and 1.37 inches (top of the part) correspond to slice units 3650 and 6850.

- Layer thickness in both CAD units and slice units.
- Total number of layers in each range.
- Commands used to modify and save the .R file.

*Range Manager Commands*

*A* adds a range to a temporary range file; the .R file is not changed until the SAVE command is used. The starting range layer can be entered in either slice units or CAD units. The break point is the first layer of the range.

*D* deletes a range from the screen. If there is more than one range left, the range will be combined into the next higher range if one exists (for example, data from deleted range 2 will be incorporated into range 3; if there is no range 3, the data will be incorporated into range 1).

*E* lists (for editing) each vector block in a specified range. This command is primarily used to add dipping parameters to ranges.

```
                     Layer Range Blocks
                   working on file CAM.R
RANGE #1
Z-LEVELS:  FROM  3650  TO  6850  BY  50
CAD Units: FROM  0.730 TO  1.370  BY  0.010

Block #  Block ID  Block Command
  1      #TOP
  2      L2
  3      LB2
  4      #BTM
  5      L1
_______________________________________________
--- MORE BLOCKS ---
Enter F to go forward.
Enter number of block to edit, just Return to stop:
```

*V* verifies through the Layer (.L) file that only the vector blocks contained in each range are listed for editing in the temporary .R file. It is these blocks which are edited to control step periods, step sizes and other part building parameters. The vector blocks and ranges are not written to the .R file on disk until the file is saved using the S command.

*R* displays the vector blocks in each range on the screen or prints a hard-copy via the optional printer port.

PREPARE Report for CAM.R

| Range | Z-Start | Z-End | Z-Space | CAD-Start | CAD-End | CAD-Space | Count |
|---|---|---|---|---|---|---|---|
| 1 | 3650 | 6850 | 50 | 0.730 | 1.370 | 0.010 | 65 |

| | | | |
|---|---|---|---|
| Block | 1 | Type | #TOP |
| Block | 2 | Type | L2 |
| Block | 3 | Type | LB2 |
| Block | 4 | Type | #BTM |
| Block | 5 | Type | L1 |
| Block | 6 | Type | LB1 |
| Block | 7 | Type | LH1 |
| Block | 8 | Type | FDB1 |
| Block | 9 | Type | FDF1 |

Press Enter to continue . . .

*X* exits RANGE MANAGER and returns to the Prepare Main Menu. The .R file is not saved using this command.

*S* saves the .R file permanently on disk, including all information entered using RANGE MANAGER.

C calculates step periods and enters cure depth/step period information into the temporary range file. CALC SP commands are:

RANGE -- CALC SP
Prepare
working on file CAM.R

Laser Power Reading: 12 mW
using working curve data from material file: TEST.MAT

| Range | Z-Start | Z-End | Z-Space | Depth | Est SP | W Min | W Max |
|---|---|---|---|---|---|---|---|
| 1 | 3650 | 6850 | 50 | 50 | 4000 | 0.0 | 0.0 |

Press:

R read material data
P change power rating
V view material data
X exit
S save new range commands
E edit cure depth/step period
Q quit program

*R* to read lineheight and width data from a material data (.MAT) file. The .MAT files in the working directory are listed on the screen for convenience.

*P* to change the laser power reading shown on the screen to the latest reading measured by utility BEAM ANALYSIS.

*E* to edit the cure depth and estimated step period values shown on the screen..

*V* to display material data from a material data (.MAT) file.

*Q* to quit the CALC SP function and return to the Main Menu. No changes entered using Prepare Menu options are saved.

*S* adds SP and SS laser drawing parameters to appropriate vector blocks in the temporary range file. The parameters can be added to all vector blocks in the file, to only border and hatch blocks, or only to fill blocks. In addition, you can choose to update only specific merge-sets. (A merge-set is comprised of vector blocks from only one of the Slice files input to MERGE. Merge-sets are delineated by the number appended to each vector block (i.e., LB2)). Note that this update command does not update the .R file, only the temporary range file. Use the Range Manager Menu SAVE command to save the .R file to disk.

```
Update Range Commands

Block Groups:

0. L  LB  LH  FUF  NFUB  NFUF  FDF  NFDB  NFDH  NFDF  FUB  FDB
1. LB  LH  NFDB  NFDH  NFUB  FUB   FDB
2. FUF  NFUF  FDF  NFDF

Use which block group [1]?

Update which merge-sets [all]?
```

*X* exits CALC SP to the Range Manager Menu.

Procedures (Lab 2 - Prepare)

*Parameters Manager*

*Step 1)* At the Main Menu, press 4 to select PREPARE.

*Step 2)* At the prompt, enter the part file name prefix.

Part Prefix: cam [ENTER ↵]

*Step 3)*

```
PREPARE MAIN MENU
________________________
1. Parameters Manager
2. Range Manager
3. Layer Manager
4. Statistics
X. Exit
________________________
Which Option?
```

At the Prepare Main Menu, press 1 to select PARAMETERS MANAGER.

*Step 4)* Set XY-only scale factor to .7112 (3556/5000).

*Step 5)* Set X offset to 17000 (32767 - (4.5*3556)).

*Step 6)* Set Y offset to 17000.

*Step 7)* (Optional) To make two parts, set
$(X_1, Y_1)$ to (15000, 15000) and
$(X_2, Y_2)$ to (15000, 25000).

*Step 8)* Set viewport coordinates to:
$X_{min}, Y_{min}$ = 5000, 5000
$X_{max}, Y_{max}$ = 35000, 35000.

*Step 9* Press U to update file to disk.

Range Manager

Before You Start

Run utility BEAM ANALYSIS to measure current laser power. Record average of sensor 1 and 2 readings.

*Step 1)*

```
PREPARE MAIN MENU
_____________________________

1. Parameters Manager
2. Range Manager
3. Layer Manager
4. Statistics
X. Exit
_____________________________

Which Option?
```

At the Prepare Main Menu, press 2 to select RANGE MANAGER.

Adding Ranges

*Step 1)*

```
                    RANGE MANAGER
                       Prepare
                working on file CAM.R

Range  Z-Start  Z-End  Z-Space  CAD-Start  CAD-End  CAD-Space  Count
  1     3650    6850     50       0.730     1.370     0.010      65

Press:

 A  add range      D  delete range            E  edit range
 V  verify blocks  R  make a report           C  calc SPs
 X  exit           S  save changes on disk
```

At the Range Manager Menu, press A to add range.

*Step 2)* Press Z to add range dimensions in slice units, or C to enter dimensions in CAD units.

Adding Range
Press Z to enter Z-Layer ... Number: Z [ENTER↵]

*Step 3)* Enter start of range in slice units.

Enter break point, in Z-Layer units: 3750 [ENTER↵]

*Step 4)*

RANGE MANAGER
Prepare
working on file CAM.R

| Range | Z-Start | Z End | Z Space | CAD-Start | CAD-End | CAD-Space | Count |
|---|---|---|---|---|---|---|---|
| 1 | 3650 | 3700 | 50 | 0.730 | 0.740 | 0.010 | 2 |
| 2 | 3750 | 6850 | 50 | 0.750 | 1.370 | 0.010 | 63 |

Press:

| | | |
|---|---|---|
| A add range | D delete range | E edit range |
| V verify blocks | R make a report | C calc SPs |
| X exit | S save changes on disk | |

Check screen to verify that range was added properly.

*Step 5)* Add another range starting at 4950.

*Step 6)* Add a fourth range starting at 6000.

*Deleting Ranges*

*Step 1)*

RANGE MANAGER
Prepare
working on file CAM.R

| Range | Z-Start | Z-End | Z-Space | CAD-Start | CAD-End | CAD-Space | Count |
|---|---|---|---|---|---|---|---|
| 1 | 3650 | 3700 | 50 | 0.730 | 0.740 | 0.010 | 2 |
| 2 | 3750 | 4900 | 50 | 0.750 | 0.980 | 0.010 | 24 |
| 3 | 4950 | 5950 | 50 | 0.990 | 1.190 | 0.010 | 21 |
| 4 | 6000 | 6850 | 50 | 1.200 | 1.370 | 0.010 | 18 |

Press:

A add range D delete range E edit range
V verify blocks R make a report C calc SPs
X exit S save changes on disk At the Range Manager Menu, press D to delete range.

*Step 2)* Enter the range number to be deleted.

Delete what range: 3 [ENTER ↵]

*Step 3)*

RANGE MANAGER
Prepare
working on file CAM.R

| Range | Z-Start | Z-End | Z-Space | CAD-Start | CAD-End | CAD-Space | Count |
|---|---|---|---|---|---|---|---|
| 1 | 3650 | 3700 | 50 | 0.730 | 0.740 | 0.010 | 2 |
| 2 | 3750 | 4900 | 50 | 0.750 | 0.980 | 0.010 | 24 |
| 3 | 4950 | 6850 | 50 | 0.990 | 1.370 | 0.010 | 39 |

Press:

A add range D delete range E edit range
V verify blocks R make a report C calc SPs
X exit S save changes on disk Check screen to ensure that range was deleted.

Verifying Ranges

*Step 1)*

RANGE MANAGER
Prepare
working on file CAM.R

| Range | Z-Start | Z-End | Z-Space | CAD-Start | CAD-End | CAD-Space | Count |
|---|---|---|---|---|---|---|---|
| 1 | 3650 | 3700 | 50 | 0.730 | 0.740 | 0.010 | 2 |
| 2 | 3750 | 4900 | 50 | 0.750 | 0.980 | 0.010 | 24 |
| 3 | 4950 | 6850 | 50 | 0.990 | 1.370 | 0.010 | 39 |

Press:

A add range D delete range E edit range
V verify blocks R make a report C calc SPs
X exit S save changes on disk At the Range Manager Menu, press V to verify blocks.

*Step 2)* Enter y at the caution message.

Verifying will . . . . commands. Continue? y ENTER↵

Reporting

*Step 1)*

RANGE MANAGER
Prepare
working on file CAM.R

| Range | Z-Start | Z-End | Z-Space | CAD-Start | CAD-End | CAD-Space | Count |
|---|---|---|---|---|---|---|---|
| 1 | 3650 | 3700 | 50 | 0.730 | 0.740 | 0.010 | 2 |
| 2 | 3750 | 4900 | 50 | 0.750 | 0.980 | 0.010 | 24 |
| 3 | 4950 | 6850 | 50 | 0.990 | 1.370 | 0.010 | 39 |

Press:

A add range D delete range E edit range
V verify blocks R make a report C calc SPs
X exit S save changes on disk At the Range Manager Menu, press R for report.

*Step 2)* Press V to view report on screen, or P to print report on printer. The report will not be shown on the screen if the printer option is selected.

*Step 3)*

PREPARE Report for CAM.R

| Range | Z-Start | Z-End | Z-Space | CAD-Start | CAD-End | CAD-Space | Count |
|---|---|---|---|---|---|---|---|
| 1 | 3650 | 3700 | 50 | 0.730 | 0.740 | 0.010 | 2 |

| | |
|---|---|
| Block 1 | Type #TOP |
| Block 2 | Type L2 |
| Block 3 | Type LB2 |
| Block 4 | Type #BTM |

Press Enter to continue . . .

Press ENTER ↵ to continue.

*Calculating Step Periods*

*Step 1)*

RANGE MANAGER
Prepare
working on file CAM.R

| Range | Z-Start | Z-End | Z-Space | CAD-Start | CAD-End | CAD-Space | Count |
|---|---|---|---|---|---|---|---|
| 1 | 3650 | 3700 | 50 | 0.730 | 0.740 | 0.010 | 2 |
| 2 | 3750 | 4900 | 50 | 0.750 | 0.980 | 0.010 | 24 |
| 3 | 4950 | 6850 | 50 | 0.990 | 1.370 | 0.010 | 39 |

Press:

| | | |
|---|---|---|
| A add range | D delete range | E edit range |
| V verify blocks | R make a report | C calc SPs |
| X exit | S save changes on disk | |

At the Range Manager Menu, press C to calculate step periods.

*Step 2)*

RANGE -- CALC SP
Prepare
working on file CAM.R

Laser Power Reading: 12 mW
using working curve data from material file: TEST.MAT

| Range | Z-Start | Z-End | Z-Space | Depth | Est SP | W Min | W Max |
|---|---|---|---|---|---|---|---|
| 1 | 3650 | 3700 | 50 | 50 | 4000 | 0.0 | 0.0 |
| 2 | 3750 | 4900 | 50 | 50 | 4000 | 0.0 | 0.0 |
| 3 | 4950 | 6850 | 50 | 50 | 4000 | 0.0 | 0.0 |

Press:

R read material data
P change power rating
V view material data
X exit
S save new range commands
E edit cure depth/step period
Q quit program At the CALC SP Menu, press P to change laser power reading.

*Step 3)* Enter average laser power from BEAM ANALYSIS.

Enter new laser power reading (mW): ____ ENTER↵

*Step 4)* At the CALC SP Menu, press E to edit cure depth/step period data.

*Step 5)* Enter the cure depth necessary to adhere "roast" the first range (containing the first two layers of the supports) to the platform by entering C followed by the range number and new cure depth.

c1,35 ENTER↵

NOTE: The cure depth selected should be at least 6 mils greater than the layer thickness for adequate bonding between layers. The cure depth for the first few layers of supports should be deeper for strong bonding to the platform. In this case, the required cure depth is 35 mils.

*Step 6)* Enter cure depths of 16 for all layer borders and hatches in ranges 2 and 3.

C2,16 ENTER↵

C3,16 ENTER↵

*Step 7)*

RANGE -- CALC SP
Prepare
working on file CAM.R

Laser Power Reading:
using working curve data from material file: TEST.MAT

| Range | Z-Start | Z-End | Z-Space | Depth | Est SP | W Min | W Max |
|---|---|---|---|---|---|---|---|
| 1 | 3650 | 3700 | 50 | 35 | 640 | 15.7 | 0.0 |
| 2 | 3750 | 4900 | 50 | 16 | 20 | 10.8 | 0.0 |
| 3 | 4950 | 6850 | 50 | 16 | 20 | 10.8 | 0.0 |

Press:

R read material data
C change power rating
V view material data
X exit
S save new range commands
E edit cure depth/step period
Q quit program At the CALC SP Menu, verify the changes.

*Step 8)* At the CALC SP Menu, press S to save ranges.

*Step 9)*

Update Range Commands

Block Groups:

0. L LB LH FUF NFUB NFUF FDF NFDB NFDH NFDF FUB FDB
1. LB LH NFDB NFDH NFUB FUB FDB
2. FUF NFUF FDF NFDF

Use which block group [1]?

Update which merge-sets [all]?

Specify which vector block group to update, or press ENTER↵ to select the default group shown in the brackets.

Use which block group [1]?

*Step 10)* Specify the merge set(s) to be updated, or press [ENTER ↵] to select the default shown in the brackets.

Update which merge-sets [all]? [ENTER ↵]

*Step 11)* Begin editing skin cure depths by pressing E then entering a cure depth of 26 mils (this is 6 mils greater than the selected 20 mil layer thickness).

C2,26 [ENTER ↵]

*Step 12)* Divide the resultant step period (90) in half, then press E and enter that value for the skin fill SP in ranges 2 and 3.

S2,45 [ENTER ↵]
S3,45 [ENTER ↵]

*Step 13)* Press S to save the file.

*Step 14)* At the prompt, specify update of skin fill blocks (block group 2).

Use which block group [1] ? 2 [ENTER ↵]

*Step 15)* At the prompt, press [ENTER ↵] to update all merge sets.

Update which merge sets [all] ? [ENTER ↵]

*Step 16)* At the CALC SP Menu, press X to exit the CALC SP function.

*Step 17)* At the Range Manager Menu, press E to edit a range to add dip delays.

*Step 18)* At the prompt, enter 1 to edit range 1.

Edit what range? 1 [ENTER ↵]

*Step 19)* At the prompt, add a dip delay of 30 seconds to the #BTM record.

Enter commands for #BTM: ZW^30 [ENTER↵]

*Step 20)* Edit range 2 to add a 30 second dip delay.

*Step 21)* Edit range 3 to add a 120 second dip delay.

*Step 22)*

RANGE MANAGER
Prepare
working on file CAM.R

| Range | Z-Start | Z-End | Z-Space | CAD-Start | CAD-End | CAD-Space | Count |
|---|---|---|---|---|---|---|---|
| 1 | 3650 | 3700 | 50 | 0.730 | 0.740 | 0.010 | 2 |
| 2 | 3750 | 4900 | 50 | 0.750 | 0.980 | 0.010 | 24 |
| 3 | 4950 | 6850 | 50 | 0.990 | 1.370 | 0.010 | 39 |

Press:

| | | |
|---|---|---|
| A add range | D delete range | E edit range |
| V verify blocks | R make a report | C calc SPs |
| X exit | S save changes on disk | |

At the Range Manager Menu, press S to save the .R file to disk.

INTERMEDIATE TOPICS

*Layer Manager Menu*

LAYER MANAGER
Prepare
working on file CAM.L

| Range | Z-Start | Z-End | Z-Space | Count |
|---|---|---|---|---|
| 1 | 3650 | 3700 | 50 | 2 |
| 2 | 3750 | 4900 | 50 | 24 |
| 3 | 4950 | 6850 | 50 | 39 |

Press:

F find blocks    E edit layer file    U update disk
X exit    Q quit program

LAYER MANAGER is used primarily to find specific vector blocks in the .L file. Its other capabilities, edit and update, are advanced features.

The LAYER MANAGER screen shown above lists:

- The .L filename
- The number of ranges specified in the .R file.
- Starting and ending range dimensions in slice units.
- Layer thickness in slice units.
- The total number of layers in the range.
- Operating commands.

Layer Manager Commands

*F* finds specific vector blocks in the .L file and lists the layer numbers.

For example, if you would like to determine where merge-set 3 starts in Z space, press F to find blocks then enter L3 and ALL at the prompts.

LAYER MANAGER will list all slice layers containing vector block L3 on the screen. This is fast and convenient, when compared to exiting the Prepare Menu and running VIEW to locate particular vector blocks.

Statistics

```
Statistics for part CAM:

Directory of C: \WORK

    CAM   L     5043    2-16-88    4:52P
    CAM   R      677    2-16-88    4:54P
    CAM   V   480980    2-16-88    4:52P

        3 FILES      8667136 bytes free



 Press Enter to Continue:
```

STATISTICS lists layer, range and vector file information, including:

- file sizes in bytes
- Date and time files were created
- free disk space

Procedures (Lab 3 - Prepare)

Statistics

*Step 1)*

```
PREPARE MAIN MENU
________________________

1.  Parameters Manager
2.  Range Manager
3.  Layer Manager
4.  Statistics
X.  Exit
________________________

Which Option?
```

At the Prepare Main Menu, press 4 to select STATISTICS.

*Step 2)*

```
Statistics for part CAM:

Directory of C: \WORK

    CAM   L     5043   2-16-88   4:52P
    CAM   R      677   2-16-88   4:54P
    CAM   V   480980   2-16-88   4:52P

        3 FILES     8667136 bytes free

Press Enter to Continue:
```

Press ENTER↵ to continue.

3.12 BUILD

Overview

BUILD supervises the part-making process by reading the Vector (.V) and Range (.R) files and sending appropriate commands and parameters to the dynamic mirrors and elevator driver. This includes:

- deflecting the laser beam to trace vectors on the surface of the resin vat
- controlling the speed of the laser pass to ensure appropriate cure depths
- controlling the dipping sequence between layers (dip, raise, and level)

BUILD Options Screen

| 3D Systems BUILD | | | |
|---|---|---|---|
| Options: | | | |
| XY - Scale: 0.7112 | # Parts: 1 | X | Y |
| Parts Directory Listing:<br>CAM | | 16000 | 16000 |
| Part Filename: cam | | | |

This screen is used to enter the part filename and to display part building information.

| | |
|---|---|
| Options | see Intermediate Topics or Prepare Menu option PARAMETERS MANAGER |
| XY-Scale | lists the XY-only scale factor |
| # Parts | shows the number of duplicate parts to be built |

| | |
|---|---|
| X,Y | lists the multiple part positioning coordinates |
| Parts Directory Listing | lists the files in the working directory |
| Part Filename | specifies the part to be built |

BUILD Status Screen

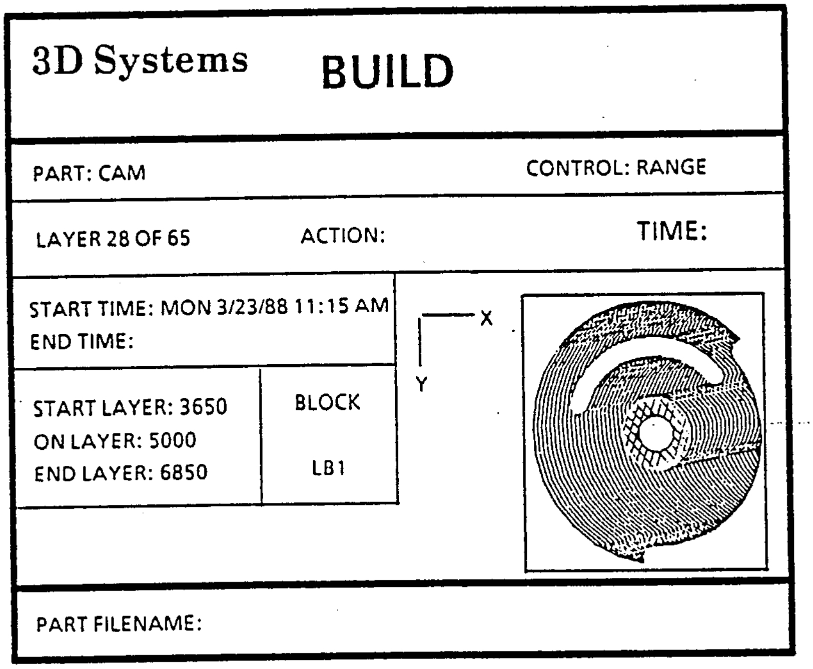

This screen displays current status information while the part is being built.

| | |
|---|---|
| Part | shows the name of the part being built |
| Control | specifies range control (default) |
| Action | lists the current BUILD action |
| | Loading if data for laser beam positioning are being loaded into the buffer. |
| | Leveling if BUILD is dipping or waiting for resin to settle and level following dipping. |
| | Drawing if vectors are being traced on the surface of the resin vat. |

| | |
|---|---|
| | Analysing if BUILD is analysing or correcting laser mirror drift. |
| Time | lists the number of seconds remaining in the dip delay. |
| Start/End Times | lists BUILD starting and ending times and dates. |
| Start/On/End Layer | lists starting and ending part layer numbers, and the layer currently being drawn. |
| Block | lists the mnemonic of the vector block currently being processed. |
| Viewport | shows a top view of the resin vat and part cross-section. Vectors are traced on the screen as they are drawn on the surface of the resin. |

Procedures (Lab 2 - Build)

Before You Start

- Position the elevator platform slightly below the surface of the resin using ELEVATOR MOVER.
- Open the resin spillway valve on the front of the vat to allow resin displaced by the platform support rods to flow into the overflow container.
- Raise the elevator until the top surface of the platform is slightly above the resin level.
- Close the door to the process chamber.
- Verify that the LASER ON and SHUTTER OPEN indicators are on. Use POWER SEQUENCER to turn on the laser or close the shutter, as required.

*Step 1)*

```
3D SYSTEMS STEREOLITHOGRAPHY SYSTEM

MAIN MENU

 1. Network
 2. Merge
 3. View
 4. Prepare
▶5. Build
 6. Utilities
 7. DOS Menu
 X. Exit

Select an Option either by Using the Arrows and Pressing Enter
or by Pressing the Corresponding Number
```

At the Main Menu, select BUILD.

5 *or* locate pointer [ENTER↵]

*Step 2)*
| 3D Systems BUILD | | | |
|---|---|---|---|
| Options: | | | |
| XY - Scale: 0.7112 | # Parts: 1 | X | Y |
| Parts Directory Listing:<br>CAM | | 16000 | 16000 |
| Part Filename: | | | |
Enter the part filename from the files listed.
Part Filename: cam ENTER↵
*Step 3)*
| 3D Systems BUILD | | |
|---|---|---|
| PART: CAM | | CONTROL: RANGE |
| LAYER 1 OF 65 | ACTION: DRAWING | TIME: |
| START TIME: MON 3/23/88 11:15 AM<br>END TIME: | | |
| START LAYER: 3650<br>ON LAYER: 3650<br>END LAYER: 6850 | BLOCK<br>LB2 | |
X
Y
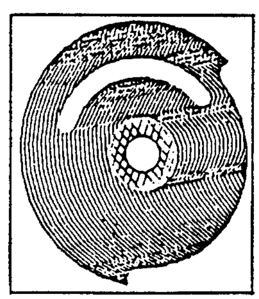

Check the status screen and part periodically to verify:

- That the first few layers adhere to the elevator platform
- That the part is centered in the resin vat
- That layers with different layer thickness values adhere to one another Abort BUILD, by pressing , if there are part making problems. This will return you to the Main Menu.

INTERMEDIATE TOPICS

*Keyboard Commands*

During the *leveling* action, BUILD accepts three keyboard commands.

P pauses BUILD until any other key is pressed. The leveling time will continue to count down to zero. A pause message is displayed in the command line at the bottom of the screen.

C continues the part building process by overriding the remaining leveling time period and immediately starting the next layer.

S skips to a specified Z level. The first layer at or above that Z level will be drawn. This command works only in the direction from lower to higher Z levels.

*Command Line Options*

/LOFF turns off the dynamic mirrors driver. This option is used in conjunction with /ZOFF to run BUILD without making a part.

/ZOFF turns off the elevator driver. This option is used in conjunction with /LOFF to run BUILD without making a part /START specifies a starting Z level for part building. All lower layers are skipped. Use /START to start building in the middle of a part.

For example, to start building the sample part at Z level 5000, enter:

Part Filename: cam/start∧5000 [ENTER ↵]

/STOP specifies an ending Z level for part building. All upper layers are skipped.

Use this option, in conjunction with /START, to build a cross-section of the part. For example, to build all layers between Z levels 5000 and 5500, enter:

Part Filename: cam/start∧5000/stop∧5500 ENTER↵

The elevator will not dip after the last layer is drawn.

The /LOFF and /ZOFF commands are commonly used with /START and /STOP to check if the part fits in the viewport.

For example, enter:

Part Filename: cam/zoff/loff/start∧5000/stop∧5050 ENTER↵

The mirrors will not draw the layer and the elevator will not move. If the part is displayed on the viewport properly, restart BUILD with no command line options to build the part. Otherwise, edit the viewport coordinates using PARAMETERS MANAGER.

3.13 POST PROCESS

*Overview*

Post process involves curing and finishing *green* StereoLithographic parts. Green parts are composed of semi-hard plastic and liquid with the exact composition dependent on several factors, including the resin being used and the type of crosshatching selected.

The major post process steps are:

- Draining excess resin into the resin vat.
- Wicking to remove resin from corners and other part details.
- UV Curing to solidify uncured portions of the part.
- Removing supports
- Optional finishing: sanding, sandblasting, painting.

General Information

*Draining*

Drains liquid resin from the part back into the resin vat. Draining times generally range from 30 minutes to 24 hours. Note, however, that longer exposure to air will weaken the part structure and may inhibit UV curing. Thermal ovens do speed up the process, but may adversely affect the dimensional accuracy of the part.

Use care when tilting and otherwise handling *green* parts. Layers can peel or deform readily before UV curing.

*Wicking*

Removes excess liquid trapped in corners and around small details of the part.

*UV Curing*

Finishes the polymerization process to produce a hard plastic part. Test for surface tackiness to ensure complete curing.

The general procedure is to cure all exposed surfaces while the part is attached to the platform, then remove the platform and cure all remaining surfaces.

*In Air*

This is the most common curing method. Cure parts within 12 hours of exposure to air to maintain structural soundness. The disadvantages to air curing are that parts may yellow and distort due to excess heating.

*In Water*

Curing times can be reduced dramatically by immersing parts in water, since water does not absorb UV light and acts as a "heat sink" to cool the part and minimize heat distortion. Remove all air bubbles, since they may cause blistering. Short, rapid curing sessions (i.e., 5 minutes) work best.

*Removing Supports*

Remove supports from the part by clipping or sanding.

Procedures (Lab 2 - Post Process)

Draining

*Step 1)*

3D SYSTEMS STEREOLITHOGRAPHY SYSTEM

MAIN MENU

1. Network
2. Merge
3. View
4. Prepare
5. Build
6. Utilities
7. DOS Menu
X. Exit Select an Option either by Using the Arrows and Pressing Enter
or by Pressing the Corresponding Number At the Main Menu, select Utilities option.

6 *or* locate pointer ENTER ↵

*Step 2)*

3D SYSTEMS STEREOLITHOGRAPHY SYSTEM

UTILITY MENU

1. Power Sequencer
2. Beam Analysis
3. Elevator Mover
4. Material Manager
5. Edit A File
6. Make Test Parts
X. Return to Main Menu At the Utility Menu, press 3 to select ELEVATOR MOVER.

| | |
|---|---|
| *Step 3)* | Using the up arrow key on the numeric keyboard, slowly raise the elevator 3 inches. (Go slow to avoid distorting the part.) |
| *Step 4)* | Wait about 30 minutes for excess resin to drain into resin vat. |

*Part and Platform Removal From Chamber*

| | |
|---|---|
| *Step 1)* | Place a drain pad in the drain tray. |
| *Step 2)* | Place the drain tray on top of the resin vat and below the elevator platform. |
| CAUTION: | DO NOT RUN THE ELEVATOR INTO THE DRAIN TRAY WHEN REMOVING THE PLATFORM FROM THE ELEVATOR RODS. THIS MAY DAMAGE THE ELEVATOR. |
| *Step 3)* | Toggle the down arrow key to lower the elevator platform until it is about $\frac{1}{4}$ inch above the drain pad. |
| *Step 4)* | Alternately turn the elevator shaft knobs one turn CCW. This will unscrew the threaded end of the shafts from the platform. Repeat this step until the platform drops free from the shafts onto the drain pad. |
| *Step 5)* | Toggle the up arrow key to raise the elevator shafts, as necessary for removal of the drain tray and platform. |
| *Step 6)* | Remove the drain tray and elevator platform with attached part from the process chamber. Hold the platform level to avoid damaging the part. |

Wicking

*Step 1)* Place the drain tray and elevator platform with attached part on a work surface.

*Step 2).* Using swabs, gently remove excess resin from corners, details and other areas that did not drain fully. Wait and repeat as necessary.

Post Curing

WARNING: Wear gloves at all times.

*Step 1)* Place the drain tray and elevator platform with attached part in the PCA.

WARNING: Do not put drain pads or any other flammable material in the PCA.

*Step 2)* Post cure the part until all surfaces exposed to the UV lamps are no longer tacky. Use short cure periods (5 to 10 minutes).

*Step 3)* Using a fine tooth saw, carefully cut the supports near where they attach to the platform.

*Step 4)* Clean the part to remove sawdust and fragments before continuing. Properly dispose of residue.

*Step 5)* Turn the part upside down (or rest it on its side) as needed to expose uncured surfaces to the UV lamps in the PCA.

*Step 6)* Post cure the part until all surfaces are no longer tacky. This may take several separate runs.

Platform Replacement

*Step 1)* Scrape resin residue from the platform. Tap out threaded holes in platform with a #10-32 tap.

*Step 2)* Hold the platform under the elevator rods so that threaded holes in the platform line up with the threaded ends of the rods.

*Step 3)* Alternately turn the shaft knobs CW one turn. Repeat this step until the platform is securely installed on the elevator shafts.

Removing Supports and Finishing

*Step 1)* Carefully cut away supports with files, grinding tools, side cutting pliers or other appropriate tools.

*Step 2)* Smooth surfaces using files.

*Step 3)* Sand, sandblast and paint part as required.

Operating the PCA

*Step 1)*

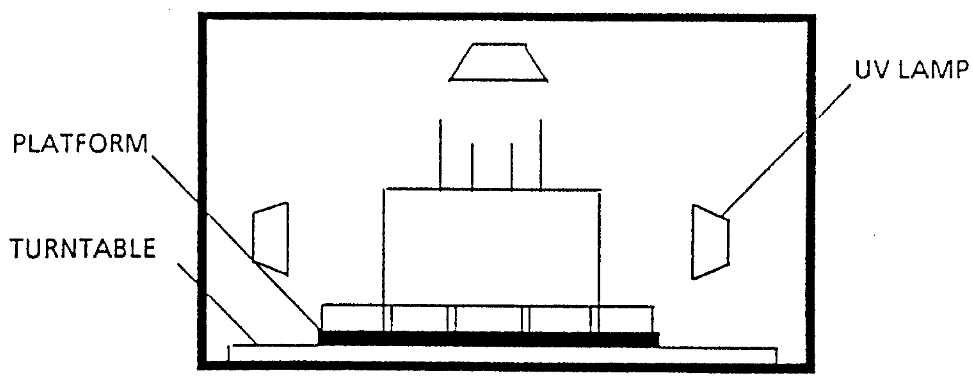

Place part, still attached to platform, in center of oven. Orient lamps for even exposure (as close to 90 degrees as possible) of the greatest number of surfaces.

*Step 2)* Set timer to 10 to 20 minutes.

*Step 3)* After time expires, set MAIN POWER switch to OFF.

*Step 4)* Remove part and platform from oven and separate part from platform. Use care to avoid distorting uncured surfaces.

*Step 5)*

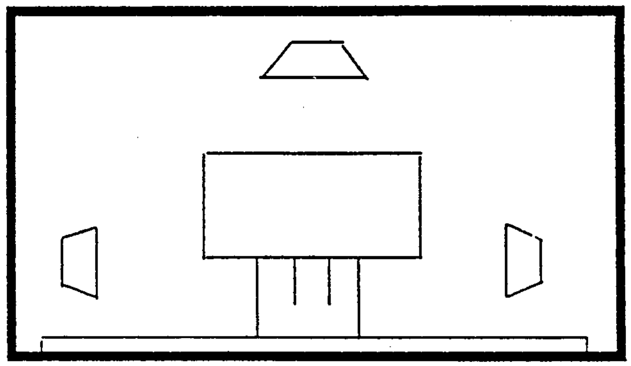

Reorient part on turntable to expose most of the remaining surfaces.

*Step 6)* Repeat steps 2 and 3.

*Step 7)*

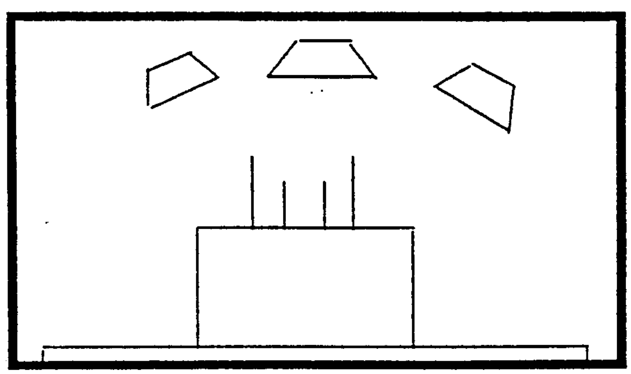

Reorient part and lamps to best position to cure all remaining surfaces. This may take several runs.

3.14 PART BUILDING CHECKLIST

*Scope*

This checklist is a step-by-step guide to building StereoLithographic parts. The starting point is a CAD design made without reference to StereoLithography. All required hardware and software systems are assumed to be installed and operational.

*Checklist*

1. CAD Design

_____ Verify that objects define enclosed volume

_____ Select required CAD resolution

2. Orient Part

_____ Position part entirely in positive CAD space, as close to origin as possible _____ Optimize orientation to:

Enable part to fit in resin vat

Minimize number of unsupported surfaces

Maximize vertical and up facing horizontal surfaces

Minimize slanted or sloping surfaces

Optimize draining

Minimize volume of entrapped liquid

3. Design and Orient Supports

_____ Design Supports

Placement

Spacing

Orientation

Height

Width

Thickness

_____ Overlap Supports 2 to 3 Layers into Object

4. CAD Interface

_____ Create StereoLithography files

_____ Transfer .STL files to Slice Computer

5. Slice

_____ Alter standard options

DATABASE Filename

Resolution

Layer Thickness

Hatch Spacing

Skin Fill Spacing

Minimum Surface Angle for Scanned Facets

Minimum Hatch Intersect Angle

Output File Name

- ____ Specify extra parameters
- ____ Save options file
- ____ DoSlice to slice file
- ____ Repeat to slice all object and support files

6. Transfer Slice Files to Control Computer

- ____ Select NETWORK From Main Menu
- ____ Run FTP
- ____ GET or MGET Files
- ____ Check Control Computer working directory to verify transfer

7. Merge

- ____ Select MERGE from Main Menu
- ____ Enter input and output filenames
- ____ Record filenames and sequence entered
- ____ Check MERGE screen to verify complete Run

8. Measure Laser Power

- ____ Select UTILITIES from Main Menu
- ____ Run BEAM ANALYSIS
- ____ Record average power from both sensor readings

9. Parameters Manager

- ____ Calculate and enter X-Y only scale factor
- ____ Calculate and enter minimum/maximum viewport coordinates
- ____ Calculate and enter multiple part positioning coordinates

10. Prepare Range File

- ____ Add ranges
- ____ Verify blocks
- ____ Edit cure depths to calculate step periods
- ____ Edit dipping parameters
- ____ Save range file

11. Check System

- ____ Top off vat with resin
- ____ Open overflow valve
- ____ Check indicators for laser and shutter status
- ____ Position elevator platform using ELEVATOR MOVER

12. Build Part

_____ Select BUILD from Main Menu

_____ Check first few layers for adherence to platform and proper location in vat

13. Post Process

_____ Raise part and drain excess resin into vat

_____ Remove remaining resin by wicking

_____ UV cure part on platform

_____ Finish curing and separate part from platform

_____ Remove supports from part

_____ (Optional) refinishing

_____ Clean and reinstall platform

14. (Optional) View StereoLithography and Slice Files

_____ If viewing .STL File, transfer file using FTP.

_____ Select VIEW from Main Menu

_____ Input filenames and specify viewing parameters

SECTION 4.0

PROBLEM SOLVING TECHNIQUES

4.1 LIMITATIONS OF STEREOLITHOGRAPHY

*File Size*

- The maximum StereoLithography (.STL) file size is limited to approximately 14,000 triangles.
- The total size for all MERGE input files is limited to about one-half the available space on the Control Computer hard disk. Use DOS Menu option DISK USAGE STATS to display available hard disk space.
- The maximum size of BUILD working files -- Vector (.V), Range (.R), Layer (.L) and BUILD.PRM -- is limited by available space on the Control Computer hard disk.

*Part Building Limitations*

- The formed part (object and supports) is limited to 9 inches in any dimension. You can, however, build sections of a large part in several runs, then reassemble it during post processing.
- Parts must be attached to the platform (they cannot be built in free space). Potential free floating sections must also be supported to hold them in place when the part is dipped.
- The maximum (recommended) cure depth is 0.036 inch. This is because working curves used to equate cure depth to step period do not extend past 36 mils. This in effect limits the maximum layer thickness to 0.030 inch.
- Vertical and up-facing horizontal skins are smoother than down-facing skins. You can minimize the impact of this limitation by orienting the part so that aesthetically important surfaces are oriented vertically or upward facing.

- Vertical resolution is limited to one layer thickness. This limitation can be minimized by using variable layer thickness to specify thinner surfaces in areas where vertical resolution and dimensions are important. You can also orient the part to change the vertical dimension (e.g., from Z to X or Y).

- The maximum theoretical slice resolution is 65,535 bits.

- The laser beam positioning accuracy is limited to 2 mils anywhere in the working field.

- The maximum number of files that can be merged and built in one run is 10.

- With standard defaults, the Step Period (SP) parameter cannot be less than 10. The default value can, however, be modified using Prepare Menu options.

- The resolution achievable on the final part is limited by the resolution of the CAD model used to create the .STL file.

- The (Desolite SLR 800) resin is brittle after post curing.

4.2 Part Building Problems and Remedies

Common part building problems are summarized in the following table along with remedial actions. This list does not include hardware and software faults covered by troubleshooting procedures in the SLA-1 Users Manual.

| PROCESS STEP | PROBLEM | REMEDY |
|---|---|---|
| **CAD Design** | CAD model not an enclosed volume. StereoLithography file will not slice. | Redesign the model so that horizontal cross-sections consist of closed curves which completely separate the inside and outside of the part. |
| **Orient & Support** | All Objects not in positive CAD space. Stereo-Lithography file will not slice. | Translate object into positive XYZ space. Position as close to origin as possible. |
| | Liquid resin entrapped when part is built. This slows part building. | Reorient part so that it drains as it is built. If this is not possible, section the part, build the sections separately, then reassemble it during post processing. Another alternative is to add drain and "chimney" holes in surfaces as necessary. |
| | Supports droop or fall through the holes in the platform. | Redesign supports to be at least 0.65 inch wide where they contact the platform. |
| | The object did not attach adequately to the supports. | Redesign the supports so they overlap the part vertically by two to three layer thicknesses (typically 40 to 60 mils). The object and support layers in this overlap region must have the same or evenly divisible layer thicknesses. |
| | Layers skew so that the part is built with a vertical slant. | Add cross, circular or triangular web supports. |

| PROCESS STEP | PROBLEM | REMEDY |
|---|---|---|
| Orient & Support (Cont'd) | Part layers sag or curl. | Add more supports. The supports are generally spaced 0.1 to 0.8 inch apart. |
| | Sections of the part drift when the part is dipped. | Add supports to anchor drifting sections. |
| Slice | File sliced along wrong axis. Object is built directly on platform. | Rerun slice and change the slice vertical axis (extra parameter) to match the vertical CAD axis. |
| | Wrong units used for layer thickness (inches instead of mils). | Rerun SLICE with correct layer thickness. |
| | Slice resolution too low. Triangles collapse resulting in part deformation. | Rerun SLICE with higher resolution. |
| | Near-flat surfaces are too rough ("stair-step" appearance). | Rerun SLICE with thinner layers in near-flat regions or sand finished part. |
| | The part has gaps in near-flat surfaces. | Rerun SLICE and increase the MSA (minimum surface angle for scanned facets). Too large an MSA will, however, cause SLICE to generate more skin vectors than necessary, thereby increasing the run time and file size. |
| Network & Merge | Insufficient disk space. | Delete or archive obsolete/old files. |
| Prepare | Layers separate or curl due to inadequate inter-layer bonding. | Check first to see whether the current laser power was used when CALC SP was run. If not, run utility BEAM ANALYSIS to measure the laser power, then rerun RANGE MANAGER option CALC SPS to recalculate step periods. If the current laser power was used, rerun CALC SPs to ensure a 6 mil excess cure depth. |

| PROCESS STEP | PROBLEM | REMEDY |
|---|---|---|
| **Prepare** (Cont'd) | The first layer of the supports did not adhere to the platform. | Increase its step period to three times the value recommended using RANGE MANAGER option CALC SPs, and/or adjust the starting elevator platform height. |
| | Horizontal surfaces bulge upward. | Increase the dip delay (parameter ZW) using RANGE MANAGER , or increase the height of the supports so that the part is suspended at least 0.25 inch above the platform. Surfaces tend to bulge when new layers are built on excess resin that has not had enough time to flow over the edges of the part. |
| | The final part is not the same size as the CAD model. | Correct the XY-only scale factor using PARAMETERS MANAGER, then rerun BUILD. |
| | The part is not shown, or is only partially shown, on the BUILD viewport. | Enter new viewport coordinates using PARAMETERS MANAGER , then rerun BUILD. |

SECTION 5.0

ADDITIONAL READING 5.1 Laser Theory
5.2 The Chemistry of StereoLithography
5.3 Bullets, Banjotops and Working Curves

5.1 LASER THEORY

*The SLA-1 Laser*

The SLA-1 uses a helium-cadmium, multimode ultraviolet laser to draw vectors on photo-curable resin, thereby forming hard plastic parts. The laser beam power varies and is nominally 15 milliwatts at a wavelength of 325 nanometers.

Ultraviolet light is invisible to the human eye, but almost everything, including the resin, fluoresces when struck by UV light of the intensity supplied by the SLA-1 laser. Thus, it is easy to see the laser beam where it strikes a surface. This is especially useful when aligning the optics, and also enables you to watch the laser draw on the surface of the resin.

As shown below, the SLA-1 laser consists of a U-shaped glass plasma discharge tube with an electrode at both ends and an optical window at either end of the straight section. The plasma tube is filled with helium gas at low pressure and has an attached reservoir of solid cadmium.

The cadmium reservoir is heated to vaporize cadmium which mixes with the helium gas. A high voltage potential applied across the plasma tube electrodes ionizes this gaseous mixture to create an electric field. Free electrons, accelerated by the electric field, strike and transfer energy to the cadmium atoms. This energy causes the cadmium atoms to enter an unstable, excited energy state.

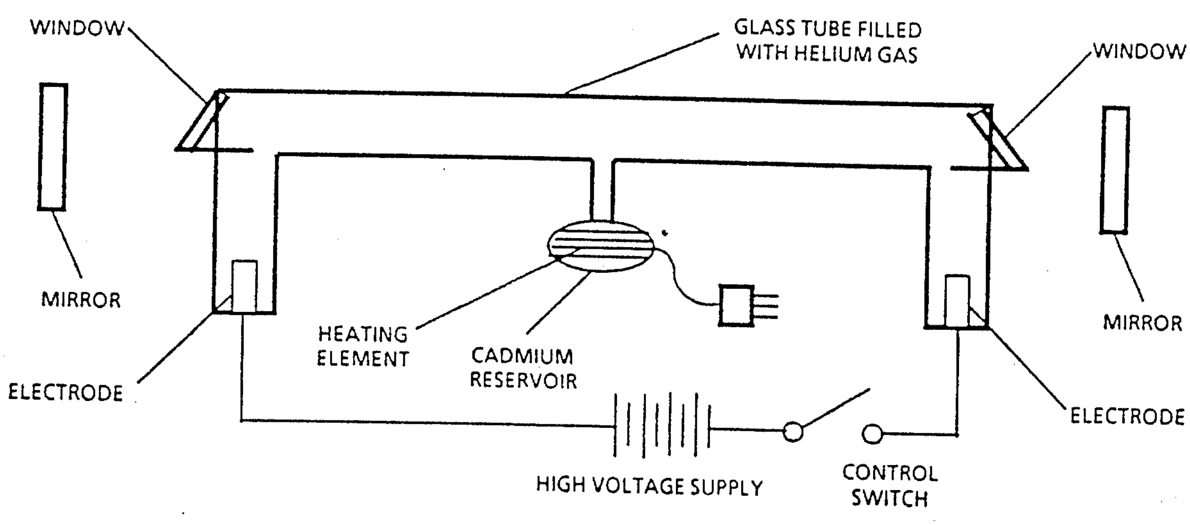

*A simplifed schematic of the SLA-1 He-Cd laser*

The excited atoms spontaneously give up their excess energy and return to an unexited, stable state. The excess energy is often emitted in the form of photons (discrete units of light energy), at precise wavelengths characteristic of cadmium.

The device described thus far is a weak plasma discharge lamp, not a laser. To make a laser, we add special, perfectly aligned parallel mirrors to either end of the plasma tube. These mirrors define an "optical resonator" and are designed to reflect photons at one of the characteristic wavelengths of cadmium (325 nanometers), while transmitting all others.

The resonator mirrors reflect the small percentage of photons which are travelling parallel to the axis of the resonator back through the plasma tube. When one of the reflected photons strikes an already excited cadmium atom, it stimulates the atom to release its excess energy in the form of another photon -- a photon that is identical to the reflected photon in wavelength, phase and direction of travel.

Since the first photon is not used up by this interaction, both of the identical photons will now travel through the plasma tube, reflecting back and forth between the mirrors, creating even more identical photons.

The resonator mirror located at the output end of the laser transmits a few percent of these "coherent" photons while reflecting the rest. It is these transmitted photons which the SLA-1 uses to cure StereoLithography resins.

*Laser Modes*

The SLA-1 laser lases simultaneously in a number of distinct Transverse Electromagnetic Modes (TEMs). TEMs are the product of the electromagnetic field in the plasma discharge tube. The field forms various standing wave patterns dependent on the precise alignment of the optical resonator mirrors and the physical dimensions of the plasma tube. If the optical resonator is properly aligned, the laser will lase simultaneously in any or all of the wave patterns to create the TEMs.

TEMs are classified by the number of dark lines (nodes) evident in a cross-section of the laser beam. For example, a beam cross-section with no dark lines is classified as mode TEM00. A beam with one vertical line is a TEM01, and a beam with three horizontal and two vertical lines is a TEM32. To achieve maximum power intensity, the resonator mirrors must be aligned to enable the laser to lase in many modes at once. In this case, the mode pattern would be a combination of the patterns of each individual TEM.

The mode pattern generally drifts as the laser and optics age, resulting in a power drop and asymmetric beamshape. Adjustment of the resonator mirrors can, in many cases, improve the mode structure to increase laser intensity. At some point, however, the maximum laser power attainable will not enable the drawing of StereoLithography parts in a timely manner (the lower the laser intensity the slower the process), and the laser will have to be replaced.

5.2 THE CHEMISTRY OF STEREOLITHOGRAPHY

*Introduction*

StereoLithography is made possible by a process called photopolymerization in whith a liquid resin monomer is converted to a solid polymer upon exposure to ultraviolet light. The degree to which polymerization occurs, and thus the solidity of the material, is dependent on the total light energy absorbed.

The polymerization of liquid resins is not a new technology, having been used in such applications as ultraviolet inks, coatings, varnishes, and printed circuits for more than twenty years. The use of lasers as the light energy source is, however, a more recent innovation that has been used to date primarily in basic academic research programs. The StereoLithography process developed by 3D Systems, Inc. is an entirely new application.

*Photopolymers*

The photopolymers used in StereoLithography are composed of two basic materials. The first is a photoinitiator which absorbs the laser energy and forms reactive radical species which initiate the polymerization process. The photopolymers also contain acrylic functionalized monomers and oligomers which polymerize upon exposure to a free radical source.

Certain polymers contain thermoset materials which are sensitive to heat, and thus allow thermal curing of the finished part. Totally UV curable polymers do not appreciably polymerize when heated after being cured by the laser, but in the liquid form can polymerize uncontrollably when overheated.

The preceeding discussion of photopolymers, and the following discussion of the photopolymerization process, provide only a basic overview as needed to better understand StereoLithography. Detailed information on both topics can be found in the following reference: UV Curing, Volumes I and II: Editor S. Peter Pappas, Science and Technology Marketing Corp., Norwalk Connecticut (1980).

The Photopolymerzation Process

The sequence of events in the photopolymerization process is as follows.

Photoinitiators

Photoinitiator molecules (PI) absorb UV light from the laser and are converted to an excited state (the singlet state ${}^1PI^*$). This short-lived, high energy species quickly relaxes to a lower energy excited state (the triplet state ${}^3PI^*$).

$$\rightsquigarrow PI \rightarrow {}^1PI^* \rightarrow {}^3PI^*$$

Primary Radicals

The excited ${}^3PI^*$ molecules catalyze formation of one or more (generally one) species called primary radicals (R•), with the formation reaction and number dependent on the photoinitiator used.

$${}^3PI^* \longrightarrow R\bullet$$

Polymer Chain

The primary radical reacts with an acrylic monomer (M) to form a new radical species (RM•). This starts a chain propagation process (polymerization) in which the reaction is repeated over and over again to form a polymer chain.

$$R\bullet \xrightarrow{M} RM\bullet \xrightarrow{M} RMM\bullet — \gg \rightarrow \text{Polymer}$$

Solidification

The polymer quickly increases in molecular weight until it is evident as a solid. The reaction will immediately stop if the light energy is removed. The reaction will slow down and eventually stop as the available monomer concentration decreases.

The overall dimensions of the solid polymer formed when a UV laser is focused on the surface of a photopolymer are controlled by the intensity of the laser beam and the period of exposure. A longer exposure or increased laser energy will increase the depth and width of the solid region.

Physical Properties of Photopolymers

The physical properties of Desolite SLR 800, both as a liquid and as a solid, are summarized below.

LIQUID PROPERTIES

Viscosity (Brookfield cps at 25°C) 1350 centipoise
Solids (Reactive Material) > 99 percent
Volatility Low

SOLID (POST CURE) PROPERTIES

Extractables (using MEK solvent) <5 percent
Tensile Modulus 140 kpsi
Tensile Strength 6.7 kpsi
Tensile Elongation at Break ~ 7 percent Plastic parts prepared using SLR 800 resin tend to be somewhat brittle after UV post curing. Even so, post cured parts can be sanded, sandblasted and drilled using sufficient care.

Surfaces of completed parts can be smoothed to a glass-like finish by sanding followed by application and UV curing of a thin layer of diluted resin (a 1:1 mixture of resin and MEK -- Methyl Ethyl Ketone). Defects in parts (e.g., cracks, chips and holes) can usually be eliminated by using a similar resin/UV curing technique.

Finished parts have shown adhesion properties typical of acrylics, thus allowing the use of standard epoxy glues to join parts together. One of the best glues found thus far is the resin itself, with curing by UV.

Viscosity

As shown below, a relatively small change in temperature will cause a large change in the viscosity of the liquid resin, with the viscosity decreasing as the temperature increases and vice versa. Higher temperatures, and thus reduced viscosity, will result in a thinner liquid that would settle faster during dipping and drain faster during post processing.

This seems like an attractive option, except that higher process temperatures may decrease the structural integrity of the part while it is being built and may cause uncontrolled polymerization of the liquid resin.

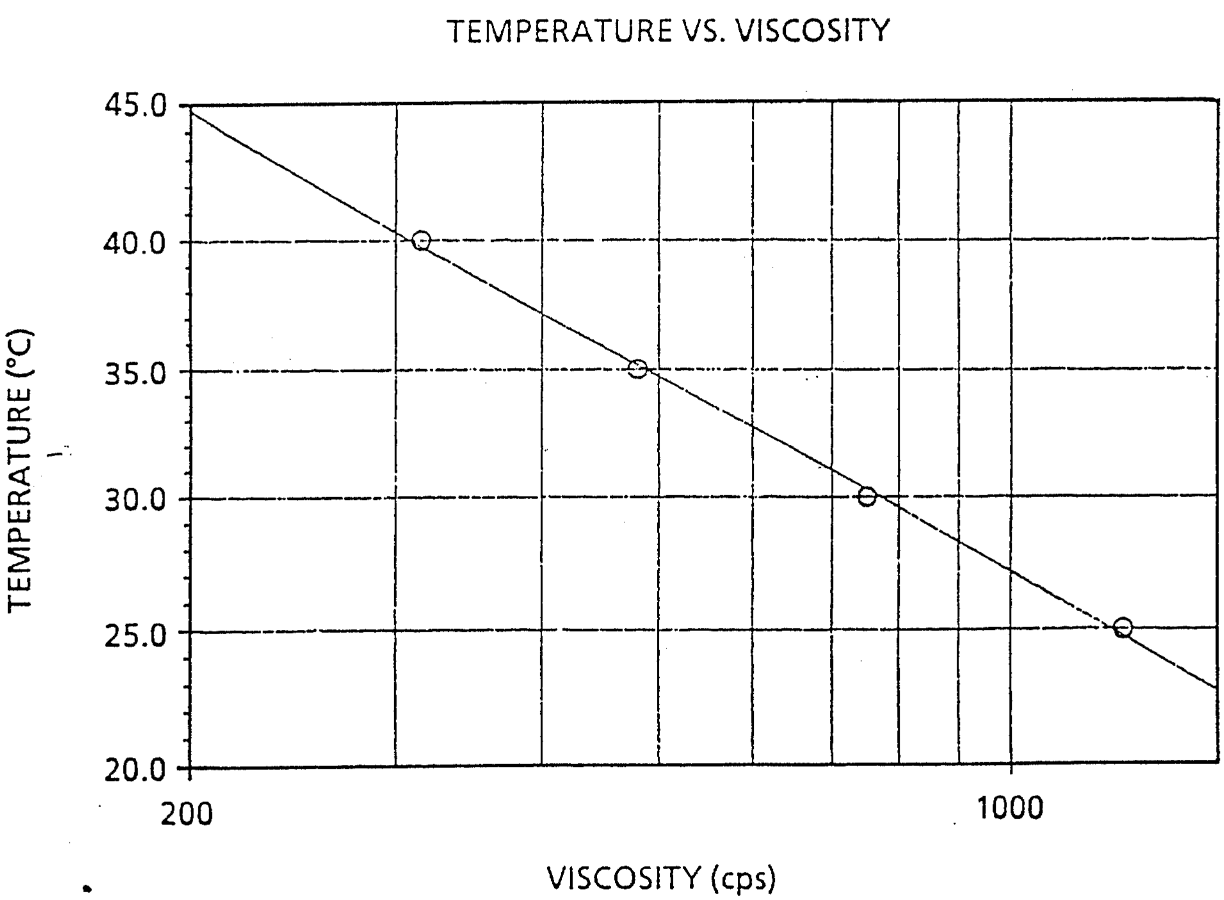

*A small change in temperature causes a large change in viscosity.*

5.3 BULLETS, BANJOTOPS AND WORKING CURVES

Bullets

An ultraviolet laser beam focused on the surface of a photopolymer will solidify or cure a small, bullet-shaped volume of liquid. This characteristic can be explained as follows.

The intensity profile of a laser beam, as shown below where the larger values indicate higher intensity, varies from point to point with a maximum near the center of the beam. The liquid can be thought of as consisting of very thin horizontal sheets, each of which will absorb a fraction (for example -- 1/2) of the laser light and transmit the rest to the next lower sheet. If the laser beam strikes the liquid vertically for one second, and during this time X units of light strike the top sheet, then X/2 units will be absorbed by that sheet and the remaining X/2 transmitted to a point in the second sheet, X/4 to a point in the third, and so on. Since the more light absorbed the more

| | | | | | | | | | | | | | | | | | | |
|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 1 | 1 | 1 | 1 | 0 | 0 | 0 | 0 | 0 | 0 |
| 0 | 0 | 0 | 0 | 0 | 0 | 1 | 3 | 8 | 10 | 9 | 7 | 6 | 5 | 3 | 1 | 0 | 0 | 0 |
| 0 | 0 | 0 | 1 | 2 | 7 | 16 | 28 | 38 | 40 | 36 | 27 | 24 | 19 | 10 | 4 | 1 | 0 | 0 |
| 1 | 1 | 3 | 6 | 15 | 31 | 53 | 81 | 95 | 90 | 78 | 71 | 67 | 54 | 32 | 14 | 4 | 1 | 0 |
| 3 | 3 | 7 | 15 | 32 | 63 | 92 | 119 | 125 | 113 | 103 | 100 | 101 | 90 | 67 | 34 | 13 | 3 | 0 |
| 6 | 7 | 17 | 31 | 50 | 84 | 112 | 127 | 124 | 108 | 100 | 107 | 120 | 114 | 85 | 45 | 17 | 5 | 1 |
| 6 | 7 | 16 | 33 | 64 | 94 | 110 | 118 | 112 | 99 | 94 | 107 | 127 | 129 | 112 | 68 | 30 | 10 | 1 |
| 7 | 8 | 17 | 39 | 73 | 98 | 109 | 113 | 108 | 102 | 103 | 114 | 128 | 129 | 113 | 78 | 36 | 11 | 2 |
| 7 | 7 | 18 | 39 | 72 | 106 | 120 | 125 | 118 | 110 | 111 | 111 | 121 | 123 | 110 | 74 | 36 | 13 | 3 |
| 6 | 8 | 17 | 36 | 71 | 112 | 133 | 142 | 130 | 111 | 107 | 111 | 124 | 123 | 107 | 68 | 32 | 10 | 2 |
| 4 | 6 | 11 | 27 | 65 | 95 | 131 | 154 | 146 | 126 | 114 | 124 | 134 | 129 | 110 | 81 | 27 | 12 | 4 |
| 2 | 2 | 7 | 11 | 21 | 63 | 94 | 118 | 136 | 130 | 126 | 134 | 138 | 125 | 92 | 43 | 24 | 7 | 1 |
| 1 | 1 | 2 | 5 | 13 | 26 | 59 | 87 | 92 | 95 | 102 | 108 | 102 | 76 | 54 | 20 | 5 | 2 | 0 |
| 0 | 0 | 1 | 2 | 5 | 16 | 25 | 37 | 48 | 50 | 56 | 60 | 51 | 34 | 14 | 5 | 1 | 0 | 0 |
| 0 | 0 | 0 | 0 | 0 | 2 | 4 | 7 | 11 | 12 | 11 | 8 | 5 | 4 | 1 | 0 | 0 | 0 | 0 |
| 0 | 0 | 0 | 0 | 0 | 0 | 0 | 1 | 1 | 2 | 3 | 2 | 1 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |

*An intensity profile showing a maximum near the center of the beam.* polymerization, the top sheet will be the most solid, the second one less so, and so on until a sheet has absorbed so little energy that it is no more solid than the surrounding liquid. If the solid plastic is pulled from the liquid, this last sheet will remain behind, since its bonding force to the solid plastic is no greater than that to the liquid below.

The depth of the cured plastic will vary as X is increased or decreased, and will also vary across the width of the laser beam since the beam front is not uniform (as shown by the intensity profile). Thus, the center of the beam will cure to the greatest depth because it is the area of highest intensity, and the surrounding areas will cure to lesser depths. The maximum solid depth achieved (after post-curing) is known as the cure depth.

A second factor also plays a role in the development of the bullet shape. Since the refractive index of solid plastic is slightly higher than that of the liquid, the laser light will be refracted inward to varying degrees as the liquid changes to solid. At certain angles, light may be reflected as well from the interface. This characteristic, illustrated below, tends to give the bullet a narrower shape than if beam intensity was the only consideration.

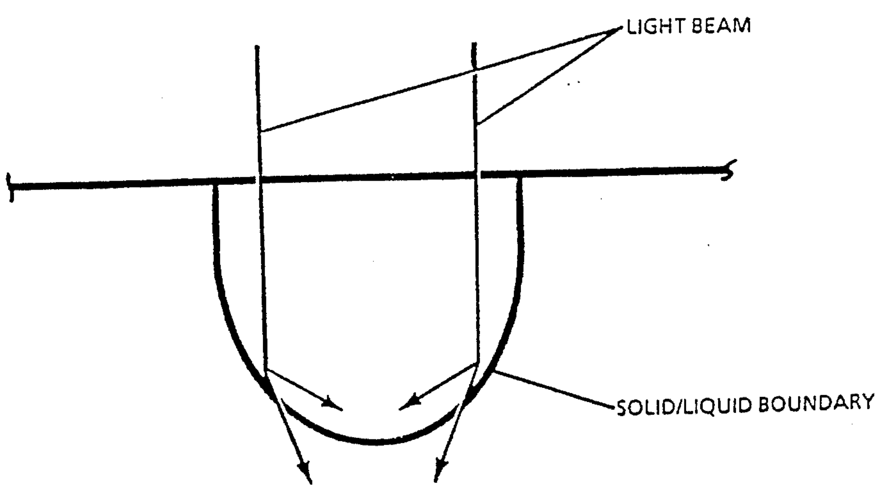

*The change in refractive index of the resin as it transforms from liquid to solid enhances the bullet shape*

Step Periods

Bullets are the building blocks of StereoLithography, for the overlap of successive bullets forms lines and the overlap of lines forms surfaces. As discussed earlier, the shape of the bullets is determined largely by the beam profile and optical effects. It follows that their overall dimensions should be determined by how much laser energy enters the liquid; this quantity is known as exposure. Exposure is proportional to the product of laser intensity and step period, an operating parameter that specifies the number of 10-microsecond increments between movements of the laser when forming a line. Thus, step period is a measure of the time the laser is focused on a particular location and the brief transit time required to move to the next location. In practice, the laser intensity is not adjusted, and exposure is controlled by choice of step period value.

Measurements taken of actual bullets produced by the SLA-1 show that in addition to varying the dimensions of the bullets, large step period values (a range of 5 to 4000 is available) will also affect the shape of the bullets. Sample bullet shapes and relative dimensions at various step period values are shown below.

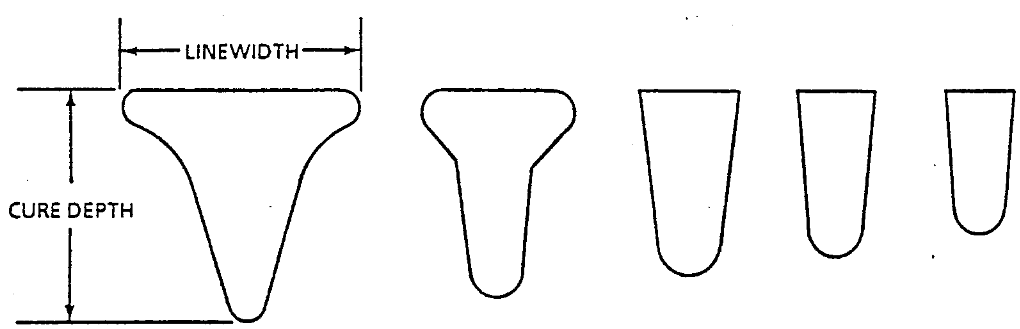

*Step period values determine the overall dimensions of bullets and also affect bullet shape*

Step Size

As shown below, bullets overlap to form lines. The distance that the laser moves between forming bullets is a parameter known as step size. If the step size is less than or equal to the maximum diameter of the bullets (i.e., measured across the top of the bullet), the bullets will overlap and a continuous line will be formed. Depending on the step size selected, many points in the liquid along the path of the drawn line will be exposed for more than one step period. These points, as shown in in the lower figure, will be more heavily cured than surrounding points.

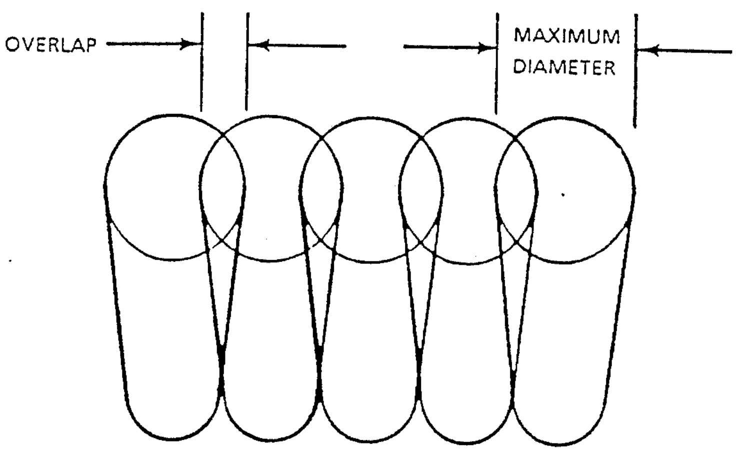

*Bullets overlap to form lines*

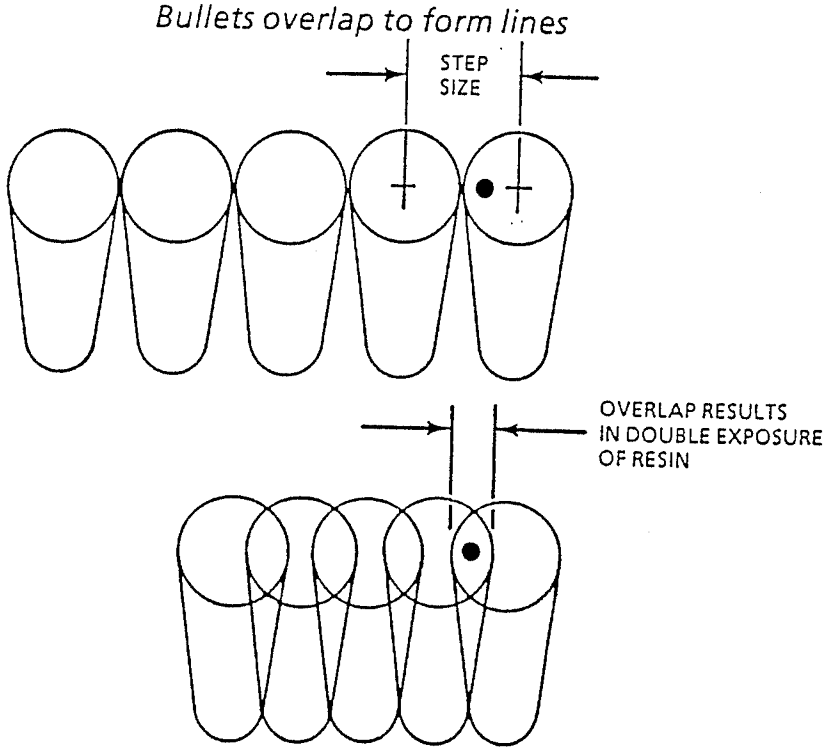

*Certain points will be more heavily cured if the step size is less than or equal to the maximum diameter of the bullets*

Bonding and Overlap

The thickness of a line is the cumulative cure depth of the bullets from which it is formed. When lines in successive layers are intended to adhere or bond to one another, the thickness of the upper line must be greater than the separation (slice thickness) between the layers, so that the layers overlap vertically.

Layer-to-layer bonding occurs because while the top layer is being formed, the lower layer is near enough to the surface to absorb light and cure further. Thus, chemical bonds are formed between the lower layer and the freshly-formed top layer.

Strong layer-to-layer bonding and therefore sufficient overlap are needed to build strong parts. Equally important, too large an overlap may cause a layer to curl. An overlap of 6 to 8 mils typically gives good results with layer thicknesses between 5 and 30 mils.

Working Curves

To obtain an appropriate overlap, you will need to know which step period values will produce which cure depths. You will also need to know the width of lines produced at different step period values, especially when building a thin vertical wall or when trying to determine the angle at which a sloping (near-flat) surface will need skin fill in order to avoid gaps. Working curves provide this information.

Working Curves Defined

A working curve is a graph that shows lineheight (cure depth) and linewidth as functions of the step period value. As shown in in the figure, these relationships are not linear, but logarithmic. That is, if the step period is multiplied by a value X, the resulting lineheight or width is not X times as large, but considerably less.

The working curve demonstrates that when the logarithm of the step period is plotted versus lineheight or width, the points will fall more or less on a straight line. Therefore, a line can be fit to the points to obtain a linear equation which approximately relates lineheight or width to the step period value.

WORKING CURVE

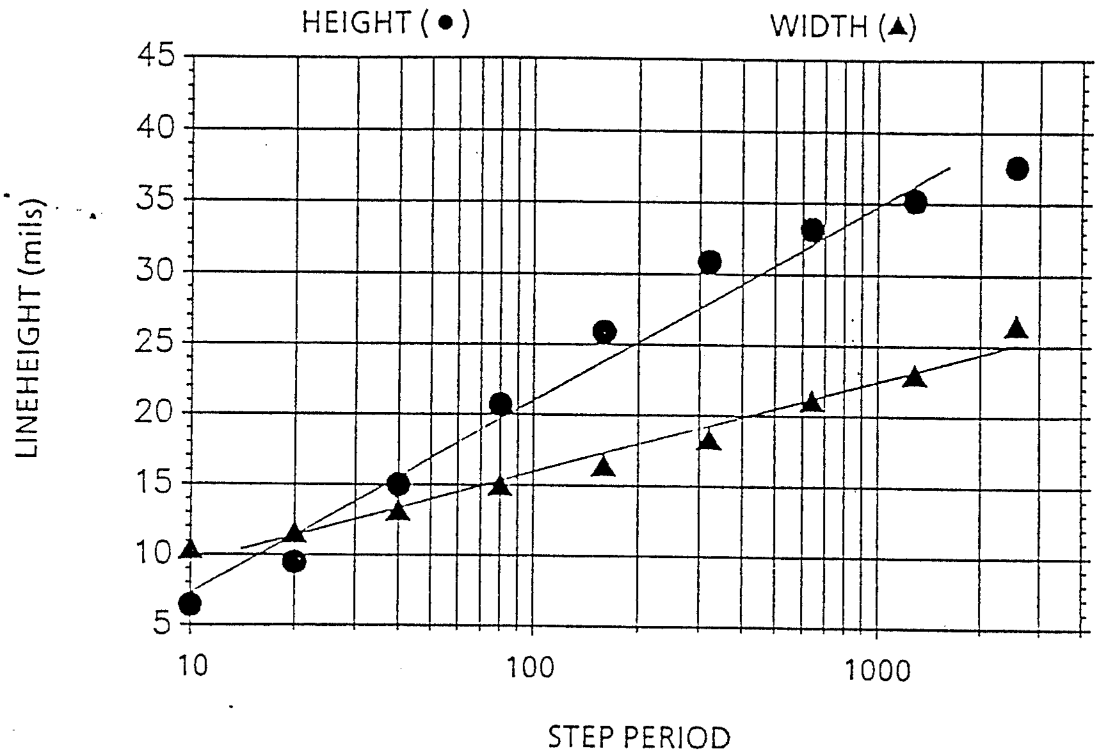

*A working curve is a graph that shows lineheight and linewidth as a function of Step Period*

*Variables That Affect Working Curves*

Several variables affect the slope and intersect points of working curves. Different resins have different sensitivities to the ultraviolet light of the laser. Laser power also varies from one SLA to another, and even from day-to-day in the same SLA. Finally, the degree to which the laser is focused on the liquid surface (i.e., whether the optics are properly aligned and if they are clean) can affect working curves.

*Obtaining Data For Working Curves*

Lineheight and width data at various step period values, for the specific resin and laser in use, are obtained by creating and measuring a small, single-layer part known as a banjotop. Banjotops are created on the surface of the liquid and do not attach to the elevator platform. As shown in the next figure, a banjotop has five strings (lines) formed using different step periods and a fixed step size of 2.

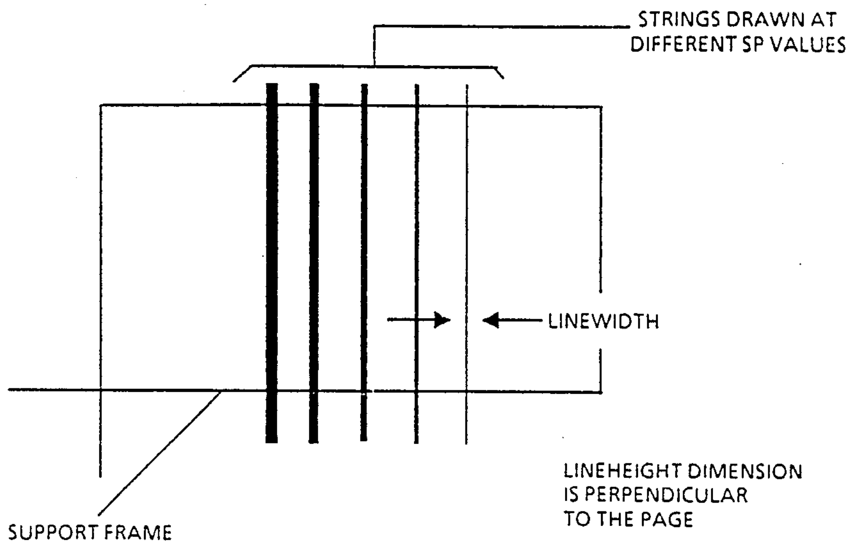

*Banjotops have five strings formed using different step periods and a fixed step size*

After the banjotop is drained and post-cured, the string heights and widths are measured. Two banjotops are generally made, with one common step period, in order to evaluate a wide range of step periods. The SLA-1 allows step periods from 5 to 4000. One banjotop is typically made with step periods of 2560, 1280, 640, 320 and 160, and the second with step periods of 160, 80, 40, 20 and 10.

*Measuring Banjotop Strings*

Draw banjotops using Utility Menu option MAKE TEST PART. Measuring banjotop string height and width as follows.

*Step 1)* Place the banjotop with top surface facing upward on the stage of a measuring microscope or other non-contact measuring device.

*Step 2)* Orient the first string to be measured perpendicular to the axis of stage movement and with the center of the string near the center of the visual field.

*Step 3)* Move the stage to center the crosshairs along one edge of the string. Note that the stage should always be moved to the position where measurements are taken from one direction only in order to minimize the effect of backlash in the positioning screw.

*Step 4)* Zero the counter that measures stage movement or record the stage position.

*Step 5)* Move the stage until the crosshairs are centered on the opposite edge of the string and record the value. If the stage is moved too far, reverse it past the correct position and try again.

*Step 6)* Repeat steps 2 through 5 to measure the width of the remaining strings. Compile all linewidth data in a table relative to step period value.

*Step 7)* Clamp the first banjotop short edge up and repeat steps 2 through 5 to measure the line height. Cut away each string after it is measured to reveal the next string.

*Step 8)* Repeat step 7 for each remaining string. Compile all lineheight data in a table relative to step period value.

*Sample Working Curve Calculations*

Data measured from banjotops are entered using the Utility Menu MATERIAL MANAGER. It will then fit a line to the data points using the method of least squares and calculate the slope and Y-intercept of each line.

Equations can be written in terms of lineheight or width relative to step period using the slope and Y-intercept from the working curve. These equations are:

(1) Height = slope log SP + Y intercept or $SP = 10^{((\text{height} - \text{Y intercept})/\text{slope})}$ (2) Width = slope log SP + Y intercept or $SP = 10^{((\text{width} - \text{Y intercept})/\text{slope})}$ As an example of how such equations are used by MATERIAL MANAGER, let us find the correct step period for a layer thickness of 20 mils. Keep in mind that a cure depth of 26 mils is required to ensure adequate adhesion between layers. We'll use a slope for the height curve of 13.76 and a Y-intercept of -6.50. Using the second form of equation (1), the proper step period is:

$$\begin{aligned} SP &= 10^{((26.00 + 6.50)/13.76)} \\ &= 10^{2.36} \\ &= 230 \end{aligned}$$

We can calculate the linewidth at a step period of 230 using the first form of equation (2). Assuming a slope for the width curve of 6.52 and Y-intercept 2.91, the linewidth is:

$$\begin{aligned} \text{Width} &= 6.52 \log 230 + 2.91 \\ &= 6.52\,(2.36) + 2.91 \\ &= 18.3 \text{ mils} \end{aligned}$$

Linewidths are of particular interest when designing near-flat surfaces, where you need to know the surface angle at which skin will be needed to fill gaps between the layer borders.

Another situation in which linewidths are of particular interest is when step periods are calculated for skin vectors. Skin vectors are spaced 1 to 4 mils apart and overlap a great deal. (For example, if a skin fill spacing of 2 mils is used, within the width of an 8 mil wide line there would be four overlapping exposures.) Thus, if the desired skin thickness is to be obtained, the step period value that would be used for a single line of this thickness must be reduced by the ratio of the linewidth to fill vector spacing. In our example, this would be 8/2 = 4 for a 2 mil spacing.

*Re-Calibrating Working Curves*

Normally, a working curve is made only once to characterize the laser and optics with the resin type. However, variations in laser power require that the current power be measured before a part is made. Prepare Menu option RANGE MANAGER is used to update the step period values in the .R Range file when the laser power has changed.

GLOSSARY

| TERM | DEFINITION | REFERENCE |
|---|---|---|
| 60/120 Hatch Vector | Crosshatch vectors drawn 60 and 120 degrees from the X axis. | 3.5 |
| BANJOTOP | A floating, single-layer part with five strings (lines), each drawn at a different step period value. Banjotops provide cure depth and linewidth data for working curves. | 5.3 |
| BEAM ANALYSIS | A Utilities Menu option which focuses the laser beam on beam profilers mounted in the process chamber to measure laser power and intensity. | 3.7 |
| BEAM EXPANDER | The lens assembly mounted on the optics plate which expands the laser beam, enabling it to be focused so that the beam converges to a small, high energy spot on the surface of the resin. | 1.2 |
| BEAM PROFILE | A pattern of numbers or dots representing the spatial distribution of laser beam energy. Beam profiles are used to determine whether the laser should be adjusted or replaced, or whether the optics should be cleaned. | 3.7 |
| BEAM PROFILER | A device (radiometer) which measures laser power and intensity. Two beam profilers are mounted on either side of the vat in the process chamber. | 1.2 |
| BEAM-TURNING MIRRORS | Specially-coated mirrors mounted on the optics plate which reflect 325 nm ultraviolet light and transmit all other wavelengths. Beam-turning mirrors reflect the laser beam from the laser outlet to the inlet aperture of the beam expander, and then from the beam expander outlet aperture to the dynamic mirrors. | 1.2 |

| TERM | DEFINITION | REFERENCE |
|---|---|---|
| BUILD | A Main Menu option which supervises the building of StereoLithographic parts and controls the dynamic mirrors and elevator. | 3.12 |
| BULLET | The characteristic shape of the solid plastic created by a stationary laser beam on the surface of photo-curable resin. | 5.3 |
| CAD | Computer-Aided Design | |
| CAD RESOLUTION | The internal approximation of surfaces within a CAD system. | 3.1 |
| CIRCULAR WEB SUPPORT | A hollow tube structure which can support large, heavy parts. | 3.2 |
| CONTROL COMPUTER | The computer mounted in the SLA-1 cabinet which controls the building of StereoLithographic parts. | 1.2 |
| CROSS WEB SUPPORT | Two straight web supports which intersect at right angles. | 3.2 |
| CROSSHATCH | A vector created during slicing which is drawn between layer borders to strengthen part surfaces. The crosshatch type and spacing are user specified. | 3.5 |
| CURE DEPTH | The thickness or depth of a cured line of resin. The cure depth of any line is determined by the step period and step size values used to draw the line. | 5.3 |
| CURL | A characteristic type of deformation (curling of layers). | 3.2 |
| DIP DELAY | A part-building parameter which defines the time between the start of a dip and the first laser movement to draw the next layer. The dip delay allows the resin surface to level. | 3.11 |
| DRAWING SPEED | The speed at which the laser traces over the surface of the resin to form solid plastic lines and surfaces. The laser drawing speed varies depending on the layer thickness specified and laser power. | 5.3 |
| DYNAMIC MIRRORS | Galvanometer-controlled scanning mirrors which direct the laser beam to any point on the surface of the resin. | 1.2 |

| TERM | DEFINITION | REFERENCE |
|---|---|---|
| EDIT A FILE | A Utility Menu option used to modify text files. | 3.7 |
| ELEVATOR | The hardware component that raises and lowers the platform and part in the vertical (Z) axis. | 1.2 |
| ELEVATOR MOVER | A Utilities Menu option used to position the elevator platform using the up and down arrow keys on the Control Computer numeric keypad. | 3.7 |
| ELEVATOR PLATFORM | The perforated aluminum base which attaches to the elevator and supports parts being built by the SLA-1. | 1.2 |
| ENTRAPPED VOLUME | A volume in the part from which the liquid resin cannot drain during dipping. | 3.2 |
| ETHERNET | A high-speed, inter-computer communications system jointly developed by Digital, Intel and Xerox. Ethernet is used to transfer files between the Slice and Control Computers. | 1.2 |
| EXPOSURE | The product of laser intensity and step period. | 5.3 |
| FILL | Overlapping parallel vectors which comprise the horizontal surfaces (skins) of StereoLithographic parts. | 3.5 |
| FLAT TRIANGLE | A horizontal StereoLithography (.STL) file triangle. | 3.3 |
| FTP (FILE TRANSFER PROGRAM) | A Network Menu option which moves files between the Slice and Control Computers. | 3.8 |
| GREEN PART | A StereoLithography part prior to UV post-curing. | 3.13 |
| HATCH SPACING | A SLICE parameter which specifies the perpendicular spacing, in CAD units, between crosshatches. | 3.5 |
| LASER | The device which generates the light energy required to polymerize photo-curable resin. The SLA-1 Helium-Cadmium laser has a nominal power of 15 mW at a wavelength of 325 nanometers. | 5.1 |
| LAYER (.L) FILE | A MERGE output file which defines the types of vector blocks in each layer of the part. | 3.9 |

| TERM | DEFINITION | REFERENCE |
|---|---|---|
| LAYER BORDER (LB) VECTOR | A vector which defines the perimeter of a layer. Crosshatch and fill vectors are drawn between layer borders where needed. | 3.5 |
| LAYER MANAGER | A Prepare Menu option used to find vector blocks in a particular range or in the entire Layer (.L) file. | 3.11 |
| LAYER THICKNESS | The depth of a cured layer of plastic and the SLICE parameter used to specify fixed or variable layer thickness. Layer thickness may be varied for one layer or a group of layers, or set at one value for the entire part. | 3.5 |
| LEVELING | The process whereby the surface of the resin settles and levels after a part is dipped. The time allowed for leveling is defined by the ZW (dip delay) part building parameter. | 3.12 |
| LINE | A line of cured plastic generated by overlapping bullets. | 5.3 |
| LINEHEIGHT | The depth of a laser-cured resin line. Lineheight is a variable dependent on exposure and is controlled by selection of step period. | 5.3 |
| LINEWIDTH | The horizontal width of a laser-cured resin line. Linewidth is a variable dependent on exposure. | 5.3 |
| MATERIAL (.MAT) FILE | A file containing cure depth and linewidth data measured from banjotops. | 3.7 |
| MAKE TEST PARTS | A Utilities Menu option used to create banjotops. | 3.7 |
| MATERIAL MANAGER | A Utilities Menu option used to input new material data from banjotops. | 3.7 |
| MERGE | A Main Menu option which combines all object and support Slice (.SLI) files to create Layer (.L), Range (.R) and Vector (.V) files. | 3.9 |
| MIA (MINIMUM HATCH INTERSECT ANGLE) | A SLICE parameter which defines the minimum angle allowed between a crosshatch and a layer border vector. | 3.5 |
| MONOMER | A low molecular weight chemical species which is a building block of polymers. | 5.2 |

| TERM | DEFINITION | REFERENCE |
|---|---|---|
| MSA (MINIMUM SURFACE ANGLE) | A SLICE parameter which defines the angle from the horizontal below which a triangle is classified as near-flat rather than steep. Near-flat triangles may have skin fill but steep triangles cannot. | 3.5 |
| MSDS | Material Safety Data Sheet | 2.1 |
| MSDOS | The operating system used in the Control Computer (MicroSoft Disk Operating System). | 3.6 |
| MULTIPLE PART POSITIONING COORDINATES | Build parameters used to position the part on the platform and/or to make multiple parts in the same BUILD run. | 3.11 |
| NEAR-FLAT TRIANGLE | A StereoLithography (.STL) file triangle at an angle greater than zero and less than or equal to the MSA. | 3.5 |
| OPTICAL WINDOW | The quartz window just below the dynamic mirrors which allows laser light to enter the process chamber while isolating the optics plate from the chamber environment. | 1.2 |
| OPTICS PLATE | The aluminum plate above the process chamber which supports the laser and optical components in precise alignment. | 1.2 |
| PARAMETERS MANAGER | A Prepare Menu option used to edit the .R file to add part building parameters. | 3.11 |
| PCA | Post Curing Apparatus | 1.2 |
| PHOTOINITATOR | A chemical in photopolymers which tranforms the laser energy into chemical energy and initiates the photo-polymerization (solidification) process. | 5.2 |
| PHOTOPOLYMER | A chemical substance composed of photoinitiators, monomers and oligomers which polymerizes when exposed to light energy. | 5.2 |
| PHOTOPOLY-MERIZATION | The process whereby light energy converts a monomer or oligomer substance into a polymer. | 5.2 |
| POST CURING APPARATUS | An ultraviolet device used to cure green StereoLithographic parts. | 1.2 |

| TERM | DEFINITION | REFERENCE |
|---|---|---|
| POST PROCESS | The process to cure and finish StereoLithographic parts. | 3.13 |
| POWER SEQUENCER | A Utilities Menu option which is used to turn SLA-1 hardware on and off directly from the Control Computer keyboard. | 3.7 |
| PREPARE | A Main Menu option used to specifiy part building parameters and to edit the Range (.R) file. | 3.11 |
| PROCESS CHAMBER | The chamber in which the resin vat, elevator and beam profilers are mounted. | 1.2 |
| RANGE | A set of one or more horizontal slice layers defined by upper and lower dimensions either in CAD units or slice units. A new range must be created anytime a part building parameter value changes. | 3.11 |
| RANGE (.R) FILE | A MERGE output file which is used to specify part building parameters by range. | 3.9 |
| RANGE MANAGER | A Prepare Menu option which is used to add or delete ranges, calculate step periods, edit ranges to modify dip delays, and update the Range (.R) file. | 3.11 |
| REMOTE USER | A Network Menu option used to remotely operate the Slice Computer from the Control Computer keyboard. | 3.8 |
| RESIN | Another name for the photopolymer chemical used in StereoLithography. | |
| RESIN VAT | The container of resin in which the object is formed. | 1.2 |
| SENSITIZATION | An allergic response to the photo-curable resins generally resulting from repeated skin contact. | 2.2 |
| SHUTTERS | Solenoid-actuated vanes which block the laser beam when an interlock switch is activated. | 1.2 |
| SKIN (SKIN FILL) | Thin, overlapping lines drawn to fill in or create horizontal surfaces. | 3.5 |
| SLA | StereoLithography Apparatus | |

| TERM | DEFINITION | REFERENCE |
| --- | --- | --- |
| SLICE | A program run on the Slice Computer which cross-sections the Stereo-Lithography (.STL) file and generates vector data. | 3.5 |
| SLICE (.SLI) FILE | The SLICE output file which contains vector data used to build the part. | 3.5 |
| SLICE COMPUTER | The computer used to run SLICE. The Slice Computer operates under UNIX and is linked to the Control Computer via Ethernet. | 3.4 |
| SLICE RESOLUTION | A SLICE parameter which specifies the number of slice units assigned to each CAD unit of measure. | 3.5 |
| STEEP TRIANGLE | A vertical or near-vertical StereoLithography (.STL) file triangle. | 3.3 |
| STEP PERIOD | A part building parameter which defines the length of the delay following each laser step. | 3.11 |
| STEP SIZE | A part building parameter which defines the size of the step, in mirror bits, that the laser makes between forming bullets of cured plastic. | 3.11 |
| STEREOLITHO-GRAPHY | A three-dimensional printing or drawing process that forms plastic objects by solidifying successive layers of photo-curable resin. | |
| STEREOLITHO-GRAPHY (.STL) FILE | The tessellated CAD file input to SLICE. | 3.3 |
| STRAIGHT WEB SUPPORT | A thin rectangle or fin structure defined by a minimum of six surfaces. | 3.2 |
| SUPPORTS | Structures designed on the CAD system to support the object above the elevator platform, provide a rigid foundation on which the part may be built, and attach and support layer sections. Supports may be processed in a separate file until combined with the object files by MERGE. | 3.2 |
| TEM | Transverse Electromagnetic Mode | 5.1 |

| TERM | DEFINITION | REFERENCE |
|---|---|---|
| TESSELLATE | The representation of CAD surfaces by triangles or other polygons. | 3.3 |
| TRIANGULAR WEB SUPPORT | A triangular shaped support structure. | 3.2 |
| UNIX | A multi-tasking, multi-user operating system used in Slice Computer. | 3.4 |
| VECTOR | A directed line segment represented by starting and ending coordinates. | 3.5 |
| VECTOR (.V) FILE | A MERGE output file which contains layer-by-layer vector data for all merged files. | 3.9 |
| VECTOR BLOCK | A set of like vectors (i.e., layer borders, crosshatches or fill). | 3.5 |
| VIEW | A Main Menu option used to display StereoLithography (.STL) and Slice (.SLI) files on the Control Computer screen. | 3.10 |
| VIEWPORT COORDINATES | Minimum and maximum coordinates which define, in mirror bits, the dimensions of the viewport in the BUILD status screen. | 3.11 |
| WEB | A style of support recommended for use in StereoLithography because of its ease of creation and removal. | 3.2 |
| WORKING CURVE | A plot (of lineheight and linewidth versus step period at a particular laser power) which characterizes the SLA-1 laser and optics with a particular resin to define part building parameters. The data used to make working curves are taken from banjotops. | 5.3 |
| XY-ONLY SCALE FACTOR | A part-building parameter which converts vector data from slice units to mirror bits. The X-Y only scale factor can be used to cross-section the part smaller or larger in the X and Y dimensions. It does not affect the vertical (Z) dimension. | 3.11 |

APPENDIX E

~~Docket No. 30385~~
serial No. 182,801

Non-3D Systems Software Status as of 4/13/88

Slice Computer (NEC386)

386/ix™ Operation System
UNIX System V Release 1.0.4 80386
TCP Ethernet Support, MICOM Version INTERACTIVE Systems Corporation
2401 Colorado Avenue, 3rd Floor
Santa Monica, California 90404

Process Computer (WYSE 286)

MS-DOS 3.21
Wyse Technology
3571 N. First Street
San Jose, CA 95134

Q-DOS II Version 2.00
Gazelle Systems
42 North University Avenue, Suite 10
Provo, Utah 84601

FTP Software PC/TCP File Transfer Program Version 1.16
FTP Software PC/TCP Telnet Version 1.16
MICOM-Interlan, Inc.
155 Swanson Rd.,
Boxborough, MA 01719

©1988 3D SYSTEMS, INC.
ALL RIGHTS RESERVED

April 13, 1988

Major parts list for SLA1

Laser:

1) Liconix
1390 Borregas Ave.
Sunnyvale, Ca. 94089

A) Model 4240N HeCd Multimode Laser
B) Model 4240PS Power Supply

2) Omnichrome
13620 Fifth St.
Chino, Ca. 91710

A) Model 356XM HeCd Laser
B) Model 100 Power Supply

Scanning mirrors:

1) General Scanning, Inc.
500 Arsenal St.
Watertown, Ma. 02172

A) P/N E00-Z2173 XY0507 Scanning Mirrors
B) P/N E00-DX2005 Controller for XY0507 Scanning Mirrors Z-axis (Vertical) Elevator:

1) Daedal
P.O. Box G
Harrison City, Pa. 15636
(Purchased Via Rep.)
Pacific Technical Products
15901 Foothill Blvd.
Sylmar, Ca. 91342

A) P/N 008-0324-3 14" Linear Table with 5 Pitch

B) P/N MC5000-20 Motor Control with Motor Drive

SLA1 Process Computer:

1) Wyse Technology
3571 N. First Street
San Jose, Ca. 95134
(Purchased Via Rep.)
Peripheral Systems, Inc.
8107 Orion Ave.
Van Nuys, Ca. 91406

A) Wyse 286, Model 2200, includes
1. 40 MByte Hard Disc
2. "AT" Keyboard

3. Monitor
4. Graphic Card
5. Math Coprocessor

2) Tarnz Technologies
8025 Sepulveda Blvd
Van Nuys, Ca. 91411

A) I/O board

SLA1 Slice Computer:

1) NEC Information Systems, Inc.
1414 Massachusetts Ave.
Boxborough, Ma. 01719
(purchased Via Rep.)
Peripheral Systems, Inc.
8107 Orion Ave.
Van Nuys, Ca. 91406 a) NEC Powermate 386 Computer

Beam Expander:

1) Optomeo Design Co.
901 18th St. Suite 203
Los Alamos, N.M. 87544

A) Model # D10493 (4X) Beam Expander

APPENDIX F

~~Docket No. 30385~~
Serial No. 182,801

VERSION 3.03

```
{=============================================================================
                  3D Systems Stereolithography System Software
==============================================================================

                                  BEAM.PAS
                  SLA-1 Beam Profile and Calibration Software

------------------------------------------------------------------------------
```

©1988 3D SYSTEMS, INC.
ALL RIGHTS RESERVED

```
    SaturationCount : Integer;
    MaxSensorReading: Integer;
    BeamMap         : array[0..30,0..30] of Integer;
    RowWeight       : array[0..30] of Word;
    ColWeight       : array[0..30] of Word;
  end;
  BeamProfileVarType = array[1..3] of BeamProfileVarSensorType;
  FindBeamVarSensorType = record
    Xval            : LongInt;    { inputs & updated }
    Yval            : LongInt;
    SpiralDelay     : Word;       { inputs }
    SpiralSideMax   : Integer;
    SpiralTries     : Integer;
    ScanStep        : Integer;
    BkgndThreshold  : Integer;
    NumCenterPasses : Integer;
    Xavg            : Real;       { outputs }
    Yavg            : Real;
  end;
  FindBeamVarType = array[1..3] of FindBeamVarSensorType;
  FindMethodType = (none,NormalFind,Verify2MilHole);
  PCM_Mode = (no_PCM,GainDrift,StraightXY);
  PMM_Mode = (no_PMM,Fast,Slow);

const
  VersionId = '3.03';
  SoundOn = false;
  ParamFileName = 'BEAM.PRM';
  ErrorFileName = 'C:\SYSTEM.ERR';
  HomeDirectory = 'C:\3DSYS\';
  CalibFileName = 'CALIB.DAT';
  Blank = '
  ColMax = 22;
  RowMax = 22;
  PowerMvAvg = 10;

  CtrlC = ^C;
  Bs = ^H;
  Cr = ^M;

  CalibSelect: array[1..3] of str6 = ('  1   ','1 or 2','1 - 3 ');
  LaserAddr    = $300;
  NumSensors   = 3;
  DiscreteBeam = 5;
  Timeout = 60000;
  lamda   = 5.9;

var
  FirstVar: Byte;  { must be first variable defined }
  { beam arrays }
  Resistance,Temperature: array[0..100] of Real;
  { sensor arrays }
  SensorChannel,SensorBkgnd: array[1..3] of Word;
  XSensorPos,YSensorPos : array[1..3] of Real;
  Power,Bk: array[1..3] of Real;
  Xsp,Ysp: array[1..3] of Real;
  SensorCalib: array[1..3,1..4] of Real;
  LastField: array[1..4] of Integer;
  { miscellaneous }
  key: Char;
```

```
  PrintDev,CalOutFile,ErrorFile,ParamFile: Text;
  ZTableOff,LaserOff,ShowStuff,DemoMode: Boolean;
  GrInstalled,Debug,AbortFlag,PrintOut,Display,Calibrate: Boolean;
  BeamFound: Boolean;
  OutFileName,SingleBar,CmdLine: String;
  XRest,YRest: Word;
  TempChannel,TempCalPts: Word;
  PeakReading,Sensor,Select,SensorNum,PosChkSpeed: Integer;
  Xpos,Ypos: LongInt;
  Xaverage,Yaverage,TotWtAvg: Real;
  GraphDriver,GraphMode,Error: Integer;
  ViewPort: ViewPortType;
  OpMode: OpModeType;
  OldExitProc: Pointer;
  BeamProfileVariables: BeamProfileVarType;
  FindBeamVariables: FindBeamVarType;
  Display1Sensor,Focus5Sensor,GoodCount: Integer;
  CurrentDate,CurrentTime: String;
  Sec,Minu,Hour,Day,WeekDay,Mon,Year: Integer;
  CalibDelays: array[1..3,1..3] of LongInt;
  PositionCheckMode: PCM_Mode;
  PositionMethodMode: PMM_Mode;
  LastVar: Byte;  { should be last variable defined }


procedure Abort; forward;

{------------------------------------------------------------------------}
{$R-,S-,I+,F-,V-,B- }
{$M 16384,0,655360 }
{$i beamutil.inc}
{$i beamgr.inc}
{$i beamio.inc}
{$i beamscan.inc}

{------------------------------------------------------------------------}


{
   check for BEAM Program Options
}
procedure CheckForOptions(var CmdLine: String);
var
  i: Integer;
begin
  CmdLine := upper(CmdLine);
  i := pos('/DEBUG',CmdLine);
  if i>0 then begin
    Debug := true;
    delete(CmdLine,i,6);
  end;
  i := pos('/TEXT',CmdLine);
  if i>0 then begin
    OpMode := TextOp;
    delete(CmdLine,i,5);
  end;
  i := pos('/DEMO',CmdLine);
  if i>0 then begin
    DemoMode := true;
```

```
    delete(CmdLine,i,5);
  end;
  i := pos('/S',CmdLine);
  if i>0 then begin   { check for /S Show Stuff flag }
    ShowStuff := true;
    delete(CmdLine,i,2);
  end;
  i := pos('/LOFF',CmdLine);   { check for /LOFF No Laser flag }
  if i>0 then begin
    LaserOff := true;
    delete(CmdLine,i,5);
  end;
end;

{
  Read BEAM.PRM parameters file
}
procedure ReadBeamParamsFile;
var
  ParamFile: text;
  i,count,code,code1,code2,Sensor,Pinhole: Integer;
  cmd,ParamLine: String;

  procedure GetParamFileLine;
  begin
    if eof(ParamFile) then ParamLine := ''
    else repeat
      readln(ParamFile,ParamLine);
    until eof(ParamFile) or ((ParamLine <> '') and (ParamLine[1] <> '!'));
  end;

begin
  Center('--- Reading Parameters File ---',23);
  {$I-}
  assign(ParamFile,ParamFileName);
  reset(ParamFile);
  if IOresult<>0 then begin
    assign(ParamFile,HomeDirectory+ParamFileName);
    reset(ParamFile);
    if IOresult<>0 then begin
      Center('Can''t find Beam Parameter file.',24);
      WaitKey;
      halt(3);
    end;
  end;
  {$I+}
  GetParamFileLine;
  if copy(ParamLine,1,1) = chr(34) then begin   { handle quoted options line }
    i := pos(chr(34),copy(ParamLine,2,255));
    if i>0 then ParamLine[0] := chr(i);
    ParamLine := NoQuotes(ParamLine);
    CheckForOptions(ParamLine);
    GetParamFileLine;
  end;
  XRest := WordVal(ParamLine,code);
  YRest := WordVal(copy(ParamLine,code+1,255),code);
  GetParamFileLine;
  SensorNum := WordVal(ParamLine,code);
  for Sensor:=1 to SensorNum do begin
    GetParamFileLine;
```

```
    SensorChannel[Sensor] := WordVal(ParamLine,code);
    GetParamFileLine;
    XSensorPos[Sensor] := WordVal(ParamLine,code);
    YSensorPos[Sensor] := WordVal(copy(ParamLine,code+1,255),code);
    for Pinhole:=1 to 4 do begin
      GetParamFileLine;
      SensorCalib[Sensor,Pinhole] := RealVal(ParamLine,code);
    end;
  end; {for Sensor}
  GetParamFileLine;
  TempChannel := WordVal(ParamLine,code); { assume only one thermometer at fir
  GetParamFileLine;
  TempCalPts := WordVal(ParamLine,code);
  for i:=1 to TempCalPts do begin
    { Resistance[i],Temperature[i] may not be integers }
    GetParamFileLine;
    Resistance [i] := RealVal(ParamLine,code);
    Temperature[i] := RealVal(copy(ParamLine,code+1,255),code) + 273.15;
end;
for i:=1 to 3 do begin   { read in Fast, Medium, & Slow Calib Delay values }
  GetParamFileLine;
  CalibDelays[i,1] := LongVal(ParamLine,code1);
  CalibDelays[i,2] := trunc(RealVal(copy(ParamLine,code1+1,255),code2)*10+0.5)
  CalibDelays[i,3] := trunc(RealVal(copy(ParamLine,code2+code1+1,255),code)*10
end;
close(ParamFile);
Resistance [0] := Resistance[1]  * 2 - Resistance [2];
Temperature[0] := Temperature[1] * 2 - Temperature[2];
end;


{
   ******************************
   * Option 1: Display Profile *
   ******************************
}
procedure Display1;
var
  key: Char;
  v,code: Integer;
  Leave,NewSensor: Boolean;
begin
  Sensor := Display1Sensor;
  Display := true;
  Leave := false;
  repeat
    SetScreen;
    gotoxy(1,25);
    write('(1) DISPLAY PROFILE: Press ',CalibSelect[NumSensors],
      ' to select sensor #, Q to Quit');
    NewSensor := false;
    repeat
      Display := true;
      BeamProfileVariables[Sensor].ScanStep := 4;
      GoodRead(1);
      if TotWtAvg=0 then begin
        Center(' ERROR: Sensor #'+IntStr(Sensor)+
          ' was not found: Try (6) Move or (7) Search',24);
        WaitKey;
        exit;
```

```
      end;
      if GoodCount > 0 then begin
        Xsp[Sensor] := Xaverage;
        Ysp[Sensor] := Yaverage;
      end;
      PrintInfo(Sensor);
      if keypressed then begin
        key := ReadKey;
        v := IntVal(key,code);
        if (v > 0) and (v <= NumSensors) then begin
          Sensor := v;
          MoveBeam(trunc(Xsp[Sensor]),trunc(Ysp[Sensor]));
          delay(200);
          NewSensor := true;
        end else Leave := true;
      end;
    until NewSensor or Leave;
  until Leave;
  Display1Sensor := Sensor;
end;


{
  *********************
  * Option 2: History *
  *********************
}
procedure History2;
begin
  gotoxy(1,24);
  writeln('(2) History of Beam Power & Profile');
  Center('History File Not Yet Installed',4);
  Center('will track beam power vs. time',5);
  Center('also compare profiles, XY gain & drift',6);
  WaitKey;
end;


{
  ****************************
  * Option 3: Position Check *
  ****************************
}
procedure Ranger(ffield: Integer;position: Real;fch: Char);   { field 1-4 }
var
  ch: Char;
  CurrField,PPos: Integer;
begin
  CurrField := trunc(3*(position+80000.0)/19); { 3 character positions per .00
  PPos := trunc(3*(position+80000.0)-CurrField*19.0);
  ch := fch;
  if LastField[ffield] < 32767 then begin   { always display first one }
    if CurrField < LastField[ffield] then   { see if in new field }
      ch := '/'
    else if CurrField > LastField[ffield] then ch := '\';
  end;
  LastField[ffield] := CurrField;
  PPos := PPos+1+20*(ffield-1);
  gotoxy(PPos,20);
  write(ch);
```

```
  gotoxy(20*ffield,20);
  write('|');
  if PrintOut then begin
    write(PrintDev,spc(PPos),ch,chr(13),spc(20*ffield),'|',chr(13));
    if ffield=4 then writeln(PrintDev);
  end;
end;

procedure Position3;
var
  i,x,y,step,dir: Integer;
  temp: String;
  Xoffs,Yoffs,Xgain,Ygain: Real;

  procedure PrinterOff;
  begin
    if printout then begin
      writeln(PrintDev,TimeStamp);
  { restore 1/6 line spacing, non-condensed }
      write(PrintDev,chr(27),'A',chr(12),chr(18));
      write(PrintDev,chr(12));
      close(PrintDev);
      PrintOut := false;
    end;
  end;

begin
  for i:=1 to 4 do   { set up initial fields for Ranger }
    LastField[i] := 32767;
  Display := false;
  repeat
    repeat
      gotoxy(1,21);
      if PositionCheckMode = GainDrift then
        writeln('         X Offset          X Gain               Y Offset
      else
        writeln('           X1                 Y1                    X2
      if PositionCheckMode = GainDrift then temp := 'Gain/Drift Mode'
        else temp := 'Straight X/Y Mode';
      if PositionMethodMode = Fast then temp := temp + '   Fast Method'
        else temp := temp + '   Slow Method';
      Center(temp,22);
      writeln;
      write(Blank);
      for Sensor:=1 to 2 do begin
        gotoxy(20,22+Sensor);
        write('Sensor #',Sensor,Power[Sensor]:5:1,' mW, Center: ');
        PrintXY(Xsp[Sensor],Ysp[Sensor]);
        write('      ');
      end; {Sensor}
      Center('(3) POSITION CHECK: P-Printout  0-9-Speed  Q-Quit',25);

      for Sensor:=1 to 2 do begin
(*
        MoveBeam(32767,32767);   { for Stuart's testing }
        delay(50);
*)
        if PositionMethodMode = Fast then begin
          MoveBeam(trunc(Xsp[Sensor]),trunc(Ysp[Sensor]));
          delay(250);
```

```
    end else begin
      x := trunc(Xsp[3-Sensor]);
      y := trunc(Ysp[3-Sensor]);
      step := 64;
      dir := trunc(Xsp[Sensor]) - x;
      if dir > 0 then begin
        while x < Xsp[Sensor] do begin
          MoveBeam(x,y);
          inc(x,step);
        end;
        dec(x,step);
      end else begin
        while x > Xsp[Sensor] do begin
          MoveBeam(x,y);
          dec(x,step);
        end;
        inc(x,step);
      end;
      dir := trunc(Ysp[Sensor]) - y;
      if dir > 0 then begin
        while y < Ysp[Sensor] do begin
          MoveBeam(x,y);
          inc(y,step);
        end;
        dec(y,step);
      end else begin
        while y > Xsp[Sensor] do begin
          MoveBeam(x,y);
          dec(y,step);
        end;
        inc(y,step);
      end;
      MoveBeam(trunc(Xsp[Sensor]),trunc(Ysp[Sensor]));
    end;
    Display := false;
    BeamProfileVariables[Sensor].ScanStep := 4;
    GoodRead(1);
    if GoodCount > 0 then begin
      Xsp[Sensor] := Xaverage;   { update centers }
      Ysp[Sensor] := Yaverage;
    end;
  end;  {Sensor}
  Xoffs := ( Xsp[1]+Xsp[2]-XSensorPos[1]-XSensorPos[2] )/(2*3.556); {mils}
  Yoffs := ( Ysp[1]+Ysp[2]-YSensorPos[1]-YSensorPos[2] )/(2*3.556);
  Xgain := ((Xsp[1]-Xsp[2])/(XSensorPos[1]-XSensorPos[2])-1)*10000; {mils pe
  Ygain := ((Ysp[1]-Ysp[2])/(YSensorPos[1]-YSensorPos[2])-1)*10000;

  window(1,1,80,20);
  gotoxy(1,20);
  writeln;
  window(1,1,80,25);
  if PositionCheckMode = GainDrift then begin
    Ranger(1,Xoffs,'X');
    Ranger(2,Xgain,'x');
    Ranger(3,Yoffs,'Y');
    Ranger(4,Ygain,'y');
  end else begin
    Ranger(1,Xsp[1],'X');
    Ranger(2,Ysp[1],'Y');
    Ranger(3,Xsp[2],'x');
```

```
        Ranger(4,Ysp[2],'y');
      end;
      if not keypressed then delay(PosChkSpeed);
    until keypressed;

key := upcase(ReadKey);
case key of
  'P': begin
         gotoxy(1,1);
         Center('Do you want a printout (y/n) ?',25);
         if (upcase(ReadKey) = 'Y') and not PrintOut then begin
           PrintOut := true;
           assign(PrintDev,'PRN');
           rewrite(PrintDev);
           writeln(PrintDev,'X is offset, x is length change of 10',
             '" part, both .3 mils / div');
           writeln(PrintDev,spc(85),TimeStamp);
           writeln(PrintDev);
           writeln(PrintDev,chr(27),'A',chr(1),chr(15));   { 1/180 LPI, 17 p
         end else PrinterOff;
       end;
  '0'..'9':  PosChkSpeed := (ord(key)-ord('0')) * 1000 {ms};
  'M': if PositionMethodMode = Slow then PositionMethodMode := Fast
         else PositionMethodMode := Slow;
  'T': if PositionCheckMode = GainDrift then PositionCheckMode := StraightXY
         else PositionCheckMode := GainDrift;
  'Q','X': begin
             PrinterOff;
             exit;
           end;
    end;
  until false;  { loop indefinitely }
 end;


 {
   ************************
   * Option 4: Beam Power *
   ************************
 }
 procedure Power4;
 {
   as fast as possible, sound output
   have dropped tests for 65535,0 on X#,Y#
   rework sounds, can speed with pre-calculation
 }
 var
   code,ordkey,ADC,col,row,ScanStep,waste: Integer;
   PowerSum : array[1..3] of LongInt;
   XCorner,Ycorner,TotalWeight: LongInt;
   AvgArray : Array [1..PowerMvAvg] of LongInt;
   AvgIndex,AvgCount : Byte;
 label
   Power4a,Power4b,Power4c;
 begin
   gotoxy(1,25);
   write('(4) POWER: Press ',CalibSelect[NumSensors],
     ' to select sensor #, Q to Quit');
   Sensor := 1;
 Power4a:
```

```
BEAM.PAS   - Page 11 -                    4/15/1988   4:03 PM

  AvgCount:=0;
  AvgIndex := 0;
  PowerSum[Sensor] := 0;
  ScanStep := 4;   { 1.4 mil = matches that used for calib }
  Xcorner := trunc(Xsp[Sensor] - ((ColMax+1)/2.0) * ScanStep);
  Ycorner := trunc(Ysp[Sensor] - ((RowMax+1)/2.0) * ScanStep);
  SetupBeamProfile(BeamProfileVariables,Sensor,-1,-1,-1,-1);
  ClearLine(24);
Power4b:
  TotalWeight := 0;
  for col:=1 to ColMax do begin
    Xpos := Xcorner + col * ScanStep;
    Ypos := Ycorner;   { extra delay on first }
    MoveBeam(Xpos,Ypos);
    waste:=0;
    while waste < BeamProfileVariables[Sensor].ColToColDelay do Inc(waste);
    for row:=1 to RowMax do begin   { scream . . . }
      inc(Ypos,ScanStep);
      AxisMove(Ypos,2);   { move laser beam }
      waste:=0;
      while waste < BeamProfileVariables[Sensor].RowToRowDelay do Inc(waste);
      ADC := ReadLaserBoard(SensorChannel[Sensor]);
      if TotalWeight + ADC > 32768 then begin
        Center('Sensor #'+IntStr(Sensor)+' in Saturation',24);
        goto Power4c;
      end;
      TotalWeight := TotalWeight + ADC;   { only overflow @ 22*22*60 }
    end; {for row}
    Xpos := Xcorner;
    Ypos := Ycorner;
    MoveBeam(Xpos,Ypos);
  end; {for col}
  TotalWeight := TotalWeight - SensorBkgnd[Sensor];
  if AvgIndex=PowerMvAvg then AvgIndex:=1
  else Inc(AvgIndex);
  if AvgCount<PowerMvAvg then Inc(AvgCount)
  else Dec(PowerSum[Sensor],AvgArray[AvgIndex]);
  AvgArray[AvgIndex]:=TotalWeight;
  Inc(PowerSum[Sensor],TotalWeight);
  gotoxy(5,20+Sensor);
  write('Sensor #',Sensor,(PowerSum[Sensor]/AvgCount)*SensorCalib[Sensor,3]:6:2,
    ' mW Averaged Reading; (',TotalWeight*SensorCalib[Sensor,3]:6:2,
    ' mW Unfiltered Reading)');
  if SoundOn then begin
    Sound(1000);
    delay(80);
    if TotalWeight<1 then Sound(37)
    else Sound(trunc(30*ln(TotalWeight)+37));
    delay(200);
  end;
{
  If 10 * round then recheck centers with goodread & Xsp[]=XAvg
    range, duration, need time
}
Power4c:
  if not keypressed then goto Power4b
  else begin
    ordkey := IntVal(ReadKey,code);
    if (ordkey > 0) and (ordkey <= NumSensors) then begin
      Sensor := ordkey;
```

```
      goto Power4a;
    end;
  end;
end;


{
  .***********************
   * Option 5: Beam Focus *
   ***********************
}
procedure Focus5;
var
  code,ordkey,x,i,i2,stp: Integer;
  LocRowMax,cwi,rwi,HiPoints,col,row,Try,ADC: Integer;
  cwmax,rwmax,ratio,Xaverage,Yaverage: Real;
  tw,cw,rw,cplo,cphi,rplo,rphi: Real;
  TotalWeight,Xcorner,Ycorner: LongInt;
  FocusColWeight,FocusRowWeight: array[1..30] of Real;
label
  Focus5a;
begin
  Sensor := Focus5Sensor;
{
  assumes 22x22 array for now
  1/e^2 but acting on area-integrated power
}
  SetScreen;
Focus5a:
  gotoxy(1,25);
  write('(5) Focus Parameters:  Press ',CalibSelect[NumSensors],
     'for sensor #, S to search, Q to Quit');
  with BeamProfileVariables[Sensor] do begin
    SetupBeamProfile(BeamProfileVariables,Sensor,Xsp[Sensor],Ysp[Sensor],
      4{ScanStep},trunc(Bk[Sensor] + 0.5));
    GetBeamProfile(BeamProfileVariables,Sensor);
    if TotalWeight <> 0 then begin
      Xaverage := Xweight / TotalWeight;
      Yaverage := Yweight / TotalWeight;
      Xsp[Sensor] := Xaverage;
      Ysp[Sensor] := Yaverage;
    end;
{
  Now assume only ColMax=RowMax (=22)
}
    tw := TotalWeight - SensorBkgnd[Sensor];
    if tw <= 0 then begin
      tw := 1;
      Center('BEAM NOT FOUND',24);
      WaitKey;
      Display := true;
      BeamFound := FindHoles(Sensor);{ scans for 2-mil hole for that sensor }
      if AbortFlag then exit;
    end;

    delay(1000);
    SetScreen;
    LocRowMax := ColMax;
    if RowMax > ColMax then LocRowMax := RowMax;
```

```
    cwmax := 0;
    if OpMode = TextOp then stp := 2 else stp := 1;
    gotoxy(79,1);
    write('X');
    for i:=1 to LocRowMax do begin
      cw := ColWeight[i];
      cw := cw - SensorBkgnd[Sensor]/ColMax;
      if cw < 1 then cw := 0.5;
      cw := 6*(ln(cw/tw)+8);   { from 2 to 39 .5/(22*22*220) to 1 }
      if cwmax < cw then cwmax := cw;
      FocusColWeight[i] := cw;
      cwi := trunc(cw*16);   { *1.02*lamda# ? }
      if cwi < 1 then cwi := 1
      else if cwi > 79*8 then cwi := 79*8;
      i2 := i*7;
      if i mod stp = 0 then begin
        if OpMode = TextOp then begin
          gotoxy(1,i div stp+1);
          write(many('-',cwi div 8+1),'*');
        end else begin
          Circle(3+cwi,i2,2);
          SetLineStyle(DottedLn,0,NormWidth);
          Line(0,i2,cwi,i2);
        end;
      end;
    end; {for i}

    cwmax := cwmax - 6;   { to find 1/e^2 of beam }
    x := trunc(cwmax * 16);
    if x < 1 then x := 1;
    if x > 79*8 then x := 79*8;
    if OpMode = TextOp then begin
      gotoxy(X div 8,12);
      write('^');
    end else Line (x,0,x,160);

    gotoxy(79,13);
    write('Y');
    rwmax := 0;
    for i:=1 to LocRowMax do begin
      rw := RowWeight[i];
      rw := rw - SensorBkgnd[Sensor]/RowMax;
      if rw < 1 then rw := 0.5;
      rw := 6*(ln(rw/tw)+8);  { tw# really not wanted here, want absolute }
      if rwmax < rw then rwmax := rw;
      FocusRowWeight[i] := rw;
      rwi := trunc(rw*16);   { *1.02*lamda# ? }
      if rw < 1 then rw := 1;
      if rw > 79*8 then rw := 79*8;
      i2 := 155+i*7+7;
      if i mod stp = 0 then begin
        if OpMode = TextOp then begin
          gotoxy(1,12+i div stp);
          write(many('-',rwi div 8+1),'*');
        end else begin
          Circle(3+rwi,i2,2);
          Line(0,i2,rwi,i2);
        end;
      end;
    end; {for i}
```

```
    rwmax := rwmax - 6;
    x := trunc(rwmax * 16);
    if x < 1 then x := 1;
    if x > 79*8 then x := 79*8;
    if OpMode = TextOp then begin
      gotoxy(x div 8,23);
      write('^');
    end else Line(x,165,x,320);
    for i:=1 to LocRowMax-1 do begin
      if (FocusColWeight[i+1] > cwmax) and (FocusColWeight[i] < cwmax) then
        cplo := i + (cwmax - FocusColWeight[i]) /
          (FocusColWeight[i+1] - FocusColWeight[i]);
      if (FocusColWeight[i+1] < cwmax) and (FocusColWeight[i] > cwmax) then
        cphi := i + (cwmax - FocusColWeight[i]) /
          (FocusColWeight[i+1] - FocusColWeight[i]);
      if (FocusRowWeight[i+1] > rwmax) and (FocusRowWeight[i] < rwmax) then
        rplo := i + (rwmax - FocusRowWeight[i]) /
          (FocusRowWeight[i+1] - FocusRowWeight[i]);
      if (FocusRowWeight[i+1] < rwmax) and (FocusRowWeight[i] > rwmax) then
        rphi := i + (rwmax - FocusRowWeight[i]) /
          (FocusRowWeight[i+1] - FocusRowWeight[i]);
    end;
    gotoxy(1,24);
    write(Blank);
    gotoxy(15,24);
    write('Sensor #',Sensor,' Average Width ');
    write((cphi-cplo+rphi-rplo)*4/(2*3.556):4:1);
    if abs(rphi-rplo)<1E-5 then ratio := 0
      else ratio := (cphi-cplo)/(rphi-rplo);
    write(' mils   X/Y = ',ratio:4:2);

    if not keypressed then goto Focus5a
    else begin
      key := upcase(ReadKey);
      if key='S' then begin
        Xsp[Sensor] := Xpos;
        Ysp[Sensor] := Ypos;
        Display := true;
        if FindHoles2(Sensor) then begin;   { search around new center }
          Xsp[Sensor] := FindBeamVariables[Sensor].Xval;
          Ysp[Sensor] := FindBeamVariables[Sensor].Yval;
          Xpos := trunc(Xsp[Sensor]);
          Ypos := trunc(Ysp[Sensor]);
        end;
        goto Focus5a;
      end else begin
        ordkey := IntVal(key,code);
        if (ordkey > 0) and (ordkey <= NumSensors) then begin
          Sensor := ordkey;
          MoveBeam(trunc(Xsp[Sensor]),trunc(Ysp[Sensor]));
          delay(200);
          goto Focus5a;
        end;
      end;
    end;
  end;
  Focus5Sensor := Sensor;
end;
```

```
{
   ************************
   * Option 6: Move Beam *
   ************************
}
procedure Move6;
var
  KeyVal,code,i,ADC: Integer;
  InputLine,indent: String;
label
  Move6a,Move6b,Move6c;
begin
  Xpos := XRest;
  Ypos := YRest;
  Sensor := 1;
Move6a:
  TextMode(C80);
  gotoxy(1,25);
  write('(6) MOVE BEAM:');
  indent := many(' ',19);
  gotoxy(1,1);
  writeln(indent,'Sensor    Default       Last Found   Power');
  writeln(indent,'          Position       Position    (mW)');
  writeln(indent,'------- ------------- ------------- -------');
  gotoxy(1,5+NumSensors);
  write(indent,'Beam Rest Position: ');
  PrintXY(XRest,YRest);
  Center('KeyPress   Action                                              ',17);
  Center('--------   ------                                              ',18);
  Center(' '+CalibSelect[NumSensors] +
    '      Change sensor #                              ',19);
  Center('    X       Reposition X coord. of beam                        ',20);
  Center('    Y       Reposition Y coord. of beam                        ',21);
  Center('    S       Search for hole of sensor from current position',22);
  Center('    Q       Quit Move Beam function                            ',23);
  Center('****************************************',11);
  Center('*                                      *',12);
  Center('*                                      *',13);
  Center('****************************************',14);
  for i:=1 to NumSensors do begin
    gotoxy(23,3+i);
    write(i,'     ');
    PrintXY(XSensorPos[i],YSensorPos[i]);
    write(' ');
    PrintXY(Xsp[i],Ysp[i]);
    write(' ');
    write(Power[i]:5:1);
  end;
Move6b:
  ClearLine(15);
  MoveBeam(Xpos,Ypos);
Move6c:
  Pause(30000);
  ADC := ReadLaserBoard(SensorChannel[Sensor]);
  gotoxy(28,12);
  write('Sensor #',Sensor,' Power: ',ADC:3);
  gotoxy(21,13);
  write('Current Beam Position: ');
  PrintXY(Xpos,Ypos);
  if SoundOn and (ADC > Bk[Sensor]) then begin
```

```
    Sound(1000);
    delay(10);
    Sound(30*ADC+37);
    delay(20);
  end;
  case upcase(key) of
    ' ': goto Move6c;
    'Q': exit;
    'X': begin
           gotoxy(30,15);
           write('New X Position =');
           readln(InputLine);
           if InputLine<>'' then Xpos := WordVal(InputLine,code);
           goto Move6b;
         end;
    'Y': begin
           gotoxy(30,15);
           write('New Y Position =');
           readln(InputLine);
           if InputLine<>'' then Ypos := WordVal(InputLine,code);
           goto Move6b;
         end;
    'S': begin
           Xsp[Sensor] := Xpos;
           Ysp[Sensor] := Ypos;
           SetScreen;
           Display := true;
           if FindHoles2(Sensor) then begin { start again at this new center }
             Xsp[Sensor] := FindBeamVariables[Sensor].Xval;
             Ysp[Sensor] := FindBeamVariables[Sensor].Yval;
             Xpos := trunc(Xsp[Sensor]);
             Ypos := trunc(Ysp[Sensor]);
           end;
           if AbortFlag then WaitKey;
           goto Move6a;
         end;
    else begin
      KeyVal := IntVal(key,code);
      if (KeyVal > 0) and (KeyVal <= NumSensors) then begin
        Sensor := KeyVal;
        goto Move6b;
      end;
    end;
  end;
  goto Move6c;
end;


{
   ***************************
   * Option 7: Find Pinholes *
   ***************************
}
procedure Search7;
begin
SetScreen;
Sensor := 1;
Display := true;
BeamFound := FindHoles(Sensor); { scans for 2-mil hole around original cente
```

```
  if not AbortFlag then Pause(20000);
  Sensor := 2;
  BeamFound := FindHoles(Sensor);
  if not AbortFlag then Pause(20000);
end;


{
   ******************************
   * Option 8: Calibrate System *
   ******************************
}
procedure Calibr8;
const
  CalibHoleSeparation = 890;
var
  CalibKey: Char;
  ADC,i,code,CalibAttempts: Integer;
  tableX,tableY,FullPart: Real;
  RowStartXsp,RowStartYsp,oldXsp,oldYsp: Real;
  row,col,Xcount,Ycount: Integer;
  CalibCoords: array[1..50,1..50,1..2] of Real;
  CalibTimeout,GoodRow,GoodCol: Boolean;
  SpiralDelay: Word;  { in milliseconds }
  BetweenRowsDelay,BetweenColsDelay: Word;  { in tenths of seconds }
  temp,Indent: String;
label
  AbortCalib;

procedure CalibrationDelay(time{in 1/10 secs}: LongInt);
var
  sec,TotalSec: LongInt;
begin
  if time > 0 then begin
    ClearLine(24);
    gotoxy(33,24);
    sec := 1;
    TotalSec := time div 10;
    if TotalSec > 0 then write('Waiting ...');
    while (sec <= TotalSec) and not keypressed do begin
      gotoxy(45,24);
      write(TotalSec + 1 - sec,' ');
      delay(999);
      inc(sec);
    end;
    delay(100 * time mod 10);
    while keypressed do key := ReadKey;
    ClearLine(24);
  end;
end;

function StartCalibFile: Boolean;
begin
  StartCalibFile := true;
  assign(CalOutFile,CalibFileName);
  {$I-}
  rewrite(CalOutFile);
  if IOresult<>0 then begin
    Center('Cannot write to Calibration File',24);
```

```
    WaitKey;
    StartCalibFile := false;
    exit;
end;
{$I+}
writeln(CalOutFile,'! Calibration File V' + VersionId + ', started ',TimeStam;
close(CalOutFile);
end;

function UpdateCalibFileRow: Boolean;
var
  i: Integer;
  FoundBeam1,FoundBeam2: Boolean;
  SensorPosX,SensorPosY: array[1..6] of Real;
begin
  UpdateCalibFileRow := true;
  assign(CalOutFile,CalibFileName);
  {$I-}
  append(CalOutFile);
  if IOresult<>0 then begin
    Center('Error writing to Calibration File',24);
    WaitKey;
    UpdateCalibFileRow := false;
    exit;
end;
{$I+}
MoveBeam(trunc(Xsp[1]),trunc(Ysp[1]));
CalibrationDelay(BetweenRowsDelay);
SetupFindBeam(FindBeamVariables,1{Sensor},-1{Xsp[1]},-1{Ysp[1]},40{SpiralSide
  1{SpiralTries},4{ScanStep},trunc(Bk[1]+0.5){BkgndThreshold},
  20{SpiralDelay},1{NumCenterPasses});
FoundBeam1 := FindBeam(FindBeamVariables,1,NormalFind);
SensorPosX[1] := FindBeamVariables[1].Xavg;
SensorPosY[1] := FindBeamVariables[1].Yavg;
MoveBeam(trunc(Xsp[2]),trunc(Ysp[2]));
CalibrationDelay(BetweenRowsDelay);
SetupFindBeam(FindBeamVariables,2{Sensor},-1{Xsp[2]},-1{Ysp[2]},40{SpiralSide
  1{SpiralTries},4{ScanStep},trunc(Bk[1]+0.5){BkgndThreshold},
  20{SpiralDelay},1{NumCenterPasses});
FoundBeam2 := FindBeam(FindBeamVariables,2,NormalFind);
SensorPosX[2] := FindBeamVariables[2].Xavg;
SensorPosY[2] := FindBeamVariables[2].Yavg;
for i:=3 to 6 do begin
  SensorPosX[i] := 0;
  SensorPosY[i] := 0;
end;
if not (FoundBeam1 and FoundBeam2) then write(CalOutFile,'T ');
for i:=1 to 6 do begin
  if i > 1 then write(CalOutFile,',');
  write(CalOutFile,RealStr(SensorPosX[i],2),',',
    RealStr(SensorPosY[i],2));
end;
writeln(CalOutFile);
close(CalOutFile);
end;

function UpdateCalibFileCol: Boolean;
var
  Resist,Temper: Real;
begin
```

```
  UpdateCalibFileCol := true;
  ReadTemperature(Resist,Temper);
  assign(CalOutFile,CalibFileName);
  {$I-}
  append(CalOutFile);
  if IOresult<>0 then begin
    Center('Error writing to Calibration File',24);
    WaitKey;
    UpdateCalibFileCol := false;
    exit;
  end;
  {$I+}
  GetTimeStamp;
  if CalibTimeout then write(CalOutFile,'T ');
  writeln(CalOutFile,RealStr(Xsp[Sensor],2),',',RealStr(Ysp[Sensor],2),',',
    RealStr(Power[Sensor],2),',',RealStr(Temper,2),',',CurrentTime);
  close(CalOutFile);
  CalibTimeout := false;
end;

function QuickCalibSearch: Boolean;
begin
  SetupFindBeam(FindBeamVariables,Sensor,Xsp[Sensor],Ysp[Sensor],
    40{SpiralSideMax},1{SpiralTries},16{ScanStep},trunc(Bk[Sensor]+0.5),
    SpiralDelay,3{NumCenterPasses});
  if SpiralSearchForHole(FindBeamVariables,Sensor) then begin
    QuickCalibSearch := true;
    Xsp[Sensor] := FindBeamVariables[Sensor].Xval;
    Ysp[Sensor] := FindBeamVariables[Sensor].Yval;
  end else QuickCalibSearch := false;
end;

function CalibFind: Boolean;
begin
  SetupFindBeam(FindBeamVariables,Sensor,Xsp[Sensor],Ysp[Sensor],
    40{SpiralSideMax},1{SpiralTries},16{ScanStep},trunc(Bk[Sensor]+0.5),
    SpiralDelay,2{NumCenterPasses});
  if FindBeam(FindBeamVariables,Sensor,NormalFind) then begin
    CalibFind := true;
    Xsp[Sensor] := FindBeamVariables[Sensor].Xavg;
    Ysp[Sensor] := FindBeamVariables[Sensor].Yavg;
  end else CalibFind := false;
end;

begin
  Calibrate := true;
  Center('Beam Calibration Function',1);
  gotoxy(1,8);
  Indent := many(' ',16);
  writeln(Indent,'Type                  Fast    Medium    Slow');
  writeln(Indent,'--------------    ------   ------    ------');
  writeln(Indent,'Spiral                ',CalibDelays[1,1]:4,'      ',
    CalibDelays[2,1]:4,'      ',CalibDelays[3,1]:4,'  ms');
  writeln(Indent,'Between Points    ',CalibDelays[1,2]/10:5:1,'     ',
    CalibDelays[2,2]/10:5:1,'     ',CalibDelays[3,2]/10:5:1,'  secs');
  writeln(Indent,'Between Rows      ',CalibDelays[1,3]/10:5:1,'     ',
    CalibDelays[2,3]/10:5:1,'     ',CalibDelays[3,3]/10:5:1,'  secs');
  writeln(Indent,'                  -----    -----     -----');
  writeln(Indent,'TOTAL             ',
    (2.5*10*49*49+CalibDelays[1,2]*49*49+CalibDelays[1,3]*49*3)/36000:5:1,'
```

```
    (2.5*10*49*49+CalibDelays[2,2]*49*49+CalibDelays[2,3]*49*3)/36000:5:1,'  '
    (2.5*10*49*49+CalibDelays[3,2]*49*49+CalibDelays[3,3]*49*3)/36000:5:1,'hou
  writeln;
  Center('Fast, Medium, Slow or Different Calibration?',18);
  CalibKey := upcase(ReadKey);
  case CalibKey of
    'F': begin
           SpiralDelay       := CalibDelays[1,1];   { in milliseconds }
           BetweenColsDelay  := CalibDelays[1,2];   { in tenths of seconds }
           BetweenRowsDelay  := CalibDelays[1,3];
         end;
    'M': begin
           SpiralDelay       := CalibDelays[2,1];
           BetweenColsDelay  := CalibDelays[2,2];
           BetweenRowsDelay  := CalibDelays[2,3];
         end;
    'S': begin
           SpiralDelay       := CalibDelays[3,1];
           BetweenColsDelay  := CalibDelays[3,2];
           BetweenRowsDelay  := CalibDelays[3,3];
         end;
    'D': begin
           writeln;
           writeln;
           write('Enter Spiral Delay (in ms): ');
           readln(temp);
           if temp='' then exit
             else SpiralDelay := LongVal(temp,code);
           write('Enter Between Points Delay (in secs): ');
           readln(temp);
           if temp = '' then exit
             else BetweenColsDelay := trunc(RealVal(temp,code)*10+0.5);
           write('Enter Between Rows Delay (in secs): ');
           readln(temp);
           if temp = '' then exit
             else BetweenRowsDelay := trunc(RealVal(temp,code)*10+0.5);
         end;
    else exit;
  end;
  SetScreen;
  case CalibKey of
    'F': Center('Fast Beam Calibration, started '+TimeStamp,1);
    'M': Center('Medium Beam Calibration, started '+TimeStamp,1);
    'S': Center('Slow Beam Calibration, started '+TimeStamp,1);
    'D': Center('Different Beam Calibration, started '+TimeStamp,1);
  end;

{
  Search for corner of calibration box:

  1.  move out Y-axis until edge is reached
      edge is qualified by two consecutive hole scans that fail
  2.  move out X-axis until edge is reached
      this places laser beam as close as possible to (0,0)

  If a hole is found on the same axis after one has not been found,
  alg assumes beam was somehow blocked over the first hole and
  aborts.  If two consecutive holes are blocked, the alg will
  think it has found the edge of the box and start calibrating.
}
```

```
  Display := false;
  Sensor := 3;
  SetupFindBeam(FindBeamVariables,Sensor,32767,32767,
    75{SpiralSideMax},1{SpiralTries},16{ScanStep},trunc(Bk[Sensor]+0.5),
    SpiralDelay,0{NumCenterPasses});
  if not FindBeam(FindBeamVariables,Sensor,NormalFind) then begin
    beep;
    Center('Can''t detect calibration plate!',24);
    WaitKey;
    exit;
  end;
  Xsp[Sensor] := FindBeamVariables[Sensor].Xval;
  Ysp[Sensor] := FindBeamVariables[Sensor].Yval;
  Ycount := -1;
  repeat
    inc(Ycount);
    oldXsp := Xsp[Sensor];
    oldYsp := Ysp[Sensor];
    Ysp[Sensor] := Ysp[Sensor] - CalibHoleSeparation;
  until not QuickCalibSearch;
  if AbortFlag then exit;
  Xsp[Sensor] := oldXsp;
  Ysp[Sensor] := oldYsp - 2 * CalibHoleSeparation;
  if QuickCalibSearch then begin
    beep;
    Center('Blocked hole while scanning for edge.  Aborting.',24);
    WaitKey;
    exit;
  end;
  if AbortFlag then exit;
  Xsp[Sensor] := oldXsp;
  Ysp[Sensor] := oldYsp;
  Xcount := -1;
  repeat
    inc(Xcount);
    oldXsp := Xsp[Sensor];
    oldYsp := Ysp[Sensor];
    Xsp[Sensor] := Xsp[Sensor] - CalibHoleSeparation;
  until not QuickCalibSearch;
  if AbortFlag then exit;
  Xsp[Sensor] := oldXsp - 2 * CalibHoleSeparation;
  Ysp[Sensor] := oldYsp;
  if QuickCalibSearch then begin
    beep;
    Center('Blocked hole while scanning for edge.  Aborting.',24);
    WaitKey;
    exit;
  end;
  if AbortFlag then exit;
  Xsp[Sensor] := oldXsp;
  Ysp[Sensor] := oldYsp;
  MoveBeam(trunc(oldXsp),trunc(oldYsp));

{
   Calibration:

   Alg moves out each row (Y-axis), then out each column (X-axis) looking
   for a hole.  The current alg looks for a set of 49 x 49 holes.  For
   each position, whether it finds a hole or not, it makes an entry in
   the CALIB.DAT file.  Entries in this file for holes for which the
```

```
   laser beam wasn't found after 10 attempts are preceded by a 'T '.
}
  if not StartCalibFile then exit;
  CalibTimeout := false;
  for row := 1 to 49 do begin
    GoodRow := CalibFind;
    if not UpdateCalibFileRow then exit;
    MoveBeam(trunc(Xsp[Sensor]),trunc(Ysp[Sensor]));
    CalibrationDelay(BetweenRowsDelay);
    for col := 1 to 49 do begin
      if AbortFlag then exit;
      oldXsp := Xsp[Sensor];
      oldYsp := Ysp[Sensor];
      CalibAttempts := 0;
      repeat
        GoodCol := CalibFind;
        if AbortFlag then exit;
        if not GoodCol then begin
          inc(CalibAttempts);
          beep;
          Center('Calibration hole ('+IntStr(row)+','+IntStr(col)+
            ') not found. Dust?',24);
          if CalibAttempts < 10 then GoodCol := false
            else begin
              GoodCol := true;         { go on after 10 attempts }
              CalibTimeout := true;    { set calibration timeout flag }
            end;
          Xsp[Sensor] := oldXsp;
          Ysp[Sensor] := oldYsp;
        end;
        if GoodCol then begin
          if col = 1 then begin
            RowStartXsp := Xsp[Sensor];
            RowStartYsp := Ysp[Sensor];
          end;
          Ysp[Sensor] := Ysp[Sensor] + CalibHoleSeparation;
        end;
      until GoodCol;
      if not UpdateCalibFileCol then exit;
      Center('Calibration hole ('+IntStr(row)+','+IntStr(col),24);
      if col < 49 then begin
        MoveBeam(trunc(Xsp[Sensor]),trunc(Ysp[Sensor]));
        CalibrationDelay(BetweenColsDelay);
      end;
    end; {col}
    Xsp[Sensor] := RowStartXsp;
    if row < 49 then begin
      oldXsp := Xsp[Sensor];
      oldYsp := Ysp[Sensor];
      CalibAttempts := 0;
      repeat
        Xsp[Sensor] := Xsp[Sensor] + CalibHoleSeparation;
        Ysp[Sensor] := RowStartYsp;
        GoodRow := CalibFind;
        if AbortFlag then exit;
        if not GoodRow then begin
          inc(CalibAttempts);
          beep;
          Center('Can''t locate row '+IntStr(row)+'. Dust?',24);
          if CalibAttempts < 10 then GoodCol := false
```

```
            else begin
              GoodRow := true;        { go on after 10 attempts }
              CalibTimeout := true;   { set calibration timeout flag }
            end;
          Xsp[Sensor] := oldXsp;
          Ysp[Sensor] := oldYsp;
        end;
      until GoodRow;
    end;
  end; {row}
  if not UpdateCalibFileRow then exit;
  Center('Calibration completed.',24);
  WaitKey;
  exit;

(*
     --- OLD CALIBRATION ROUTINE ---
     never tested after converted to Pascal
     need revision if its to be used

  MoveBeam(Xpos,Ypos);
  Center('Press a key when Sensor #3 is centered',24);
  gotoxy(28,25);
  write('Sensor #3 reading is');
  repeat
    ADC := ReadLaserBoard(SensorChannel[Sensor]);
    gotoxy(49,25);
    write(ADC);
    if SoundOn and (ADC > 7) then begin
      Sound(1000);
      delay(10);
      Sound(30*ADC+37);
      delay(20);
      NoSound;
    end;
    delay(300);
  until keypressed;
  while keypressed do key := ReadKey;
  ClearLine(24);
  ClearLine(25);

  if AbortFlag then goto AbortCalib;
  Center('Do you want to run a Full or Partial Calibration (F/P)?',24);
  key := upcase(ReadKey);
  if key='F' then FullPart := 0.25
    else FullPart := 10;
  for Sensor:=1 to 2 do begin
    { SlowCalibFind(Sensor); }
    if AbortFlag then goto AbortCalib;
  end;

  tableX := 5;
  repeat
    Sensor := 3;
    Xsp[Sensor] := 32767.0-(0.9539)*3556.0*TableX;
    Ysp[Sensor] := 32767.0+(0.9760)*3556.0*(-5);   { TableY }
    { here adjust for geometry = or we'll miss holes
      must set parameters before findholes }
    Xpos := trunc(Xsp[Sensor]);   { best guess, improve with pre-calib }
    Ypos := trunc(Ysp[Sensor]);
```

```
    MoveBeam(Xpos,Ypos);
    CalibrationDelay(20);
    Xpos := 32767;
    Ypos := 32767;
    { FindHole(Sensor); }
    tableY := -5;
    repeat
      Sensor := 3;
      Xsp[Sensor] := 32767.0 - 0.9539 * 3556.0 * tableX;
      Ysp[Sensor] := 32767.0 + 0.9760 * 3556.0 * tableY;
      { Adjust for Geometry }
      XTablePos := trunc(100000*tableX);
      YTablePos := trunc(100000*tableY);
      MoveTable;
      Center('X Table = '+RealStr(tableX,5)+'Y Table = '+RealStr(tableY,5),23)
      { CalibFind(Sensor); }
      PrintInfo(Sensor);
      if AbortFlag then goto AbortCalib;   { needs revision? }
      tableY := tableY + FullPart;   { .25 or .5 }
    until tableY > 5;
    for Sensor:=1 to 2 do begin   { could also use Position3 routine }
      { SlowCalibFind(Sensor); }
      if AbortFlag then goto AbortCalib;   { needs revision? }
    end;
    tableX := tableX - FullPart;
  until tableX < -5;
  Center('Beam Calibration complete at '+TimeStamp,24);
  XTablePos := 0;
  YTablePos := 0;
  MoveTable;
  WaitKey;
  exit;

  --- END OF OLD CALIBRATION ROUTINE ---

*)

AbortCalib:
  Center('**** Aborting Beam Calibration ****',24);
  WaitKey;
end;

{----------------------------------------------------------------------------}


procedure ShowTitle;
begin
  TextMode(C80);
  SingleBar := many(#196,26);
  centerln('BEAM, Laser Beam Analysis Program');
  centerln('Version '+VersionId);
  centerln('Copyright (C) 1988 by 3D Systems, Inc.');
  centerln('3D Systems Laser Stereolithography System');
  centerln(SingleBar);
end;

{
  Display Beam's Main Menu
}
procedure DisplayMenu;
```

```
var
  i: Integer;
begin
  Calibrate := false;
  ShowTitle;
  window(25,7,80,18);
  gotoxy(1,1);
  writeln('1. Display Profile');
  writeln('2. Beam Power/Profile History');
  writeln('3. Position Check');
  writeln('4. Beam Power');
  writeln('5. Beam Focus');
  writeln('6. Move Beam');
  writeln('7. Find Pinholes');
  writeln('8. Calibrate System');
  writeln('T. Toggle between Screen Modes');
  writeln('X. Exit - Return to Main Menu');
  window(1,1,80,25);
  gotoxy(29,18);
  if OpMode = TextOp then write('  Text Display Mode  ')
    else write('Graphics Display Mode');
  gotoxy(14,20);
  write('Sensor #  Default Location       Current     Power(mW)');
  for i:=1 to 3 do begin
    gotoxy(17,20+i);
    write(i);
    gotoxy(25,20+i);
    PrintXY(XSensorPos[i],YSensorPos[i]);
    gotoxy(43,20+i);
    PrintXY(Xsp[i],Ysp[i]);
    gotoxy(59,20+i);
    write(Power[i]:5:1);
  end;
end;

{
  print option line and get selection
}
procedure GetSelection;
var
  SelectionMade: Boolean;
  Resist,Temper: Real;
  code: Integer;
begin
  ReadTemperature(Resist,Temper);
  gotoxy(1,25);
  write('MENU: SELECT OPTION      ');
  gotoxy(66,25);
  write('Temp: ');
  if Temper > 70 then begin
    write(' > 70 C');
    beep;
  end else write(Temper:5:1,' C');
  SelectionMade := false;
  repeat
    key := upcase(ReadKey);
    if key in ['1'..'9','T','X'] then begin
      SelectionMade := true;
      if key='T' then if OpMode = TextOp then OpMode := GraphicsOp
       else OpMode := TextOp;
```

```
      if key='X' then Select := 9
        else Select := IntVal(key,code);
    end;
  until SelectionMade;
end;

procedure BeamAnalysis;
var
  i: Integer;
begin
  IOSetup;
  for i:=1 to 3 do begin
    Xsp[i] := XSensorPos[i];
    Ysp[i] := YSensorPos[i];
  end;
{
  Main Program Loop
}
  repeat
    Xpos := XRest;   { Move beam to rest position }
    Ypos := YRest;
    MoveBeam(Xpos,Ypos);
    DisplayMenu;
    GetSelection;
    ClrScr;
    case Select of
      1: Display1;
      2: History2;
      3: Position3;
      4: Power4;
      5: Focus5;
      6: Move6;
      7: Search7;
      8: Calibr8;
      9: halt(0);
    end;
  until false;
end;


{ - - - - -   M A I N   P R O G R A M   - - - - - }


begin  { Beam }

  FillChar(FirstVar,ofs(LastVar)-Ofs(FirstVar),#0);   { clear variables }
  OldExitProc := ExitProc;
  ExitProc := @ExitBeam;
  CheckBreak := true;
  ShowTitle;
  OpMode := GraphicsOp;
  Display1Sensor := 1;
  Focus5Sensor   := 1;
  PositionCheckMode  := GainDrift;
  PositionMethodMode := Slow;

  writeln;
  writeln;
  OutFileName := '';
  ReadBeamParamsFile;
  ReadCommandLine(CmdLine);
  CheckForOptions(CmdLine);
  BeamAnalysis;
  QuietSystemError('Success.');
end.
```

```
-----------------------------------------------------------------------------
                         General Graphics Routines
-----------------------------------------------------------------------------

procedure DrawBorder;
{ Draw a border around the current view port }
begin
  SetLineStyle(SolidLn, 0, ThickWidth);
  GetViewSettings(ViewPort);
  with ViewPort do
    Rectangle(0, 0, x2-x1, y2-y1);
end;

procedure OverText(Text: String;len: Integer);
var
  x,y,color: Integer;
begin
  x := GetX;
  y := GetY;
  color := GetColor;
  SetFillStyle(EmptyFill,0);
  Bar(x,y,x+TextWidth(Text),y+TextHeight(Text));
  SetColor(color);
  OutTextXY(x,y,Text);
end;

function GetInput(maxlen: Integer): String;
var
  key: Char;
  temp: String;
  input: Boolean;
  baseX,baseY,index: Integer;
begin
  temp := '';
  index := 0;
  baseX := getX;
  baseY := getY;
  key := chr(0);
  while key<>Cr do begin
    MoveTo(baseX+index*8,baseY);
    SetColor(3);
    OutText(chr(219));
    key := ReadKey;
    if key = CtrlC then Abort;
    MoveTo(baseX+index*8,baseY);
    SetColor(0);
    OutText(chr(219));
    MoveTo(baseX+index*8,baseY);
    SetColor(3);
    if key in [Bs,Cr,' '..'~'] then begin
      if key=Bs then begin
        if index>0 then dec(index);
      end else if key in[' '..'~'] then begin
        OutText(key);
        if index<maxlen then inc(index);
        temp[index] := key;
```

```
      end;
    end;
  end;
  temp[0] := chr(index);
  GetInput := temp;
  SetColor(3);
end;

procedure GrAbort(Msg: string);
begin
  writeln(Msg, ': ',GraphErrorMsg(GraphResult));
  Halt(1);
end;

procedure InstallGraphics;
begin
  { Register all the drivers }
  if RegisterBGIdriver(@EGAVGADriverProc) < 0 then
    GrAbort('EGA/VGA');

  GraphDriver := Detect;                        { autodetect the hardware }
  InitGraph(GraphDriver,GraphMode, '');         { activate graphics }
  if GraphResult <> grOk then                   { any errors? }
  begin
    writeln('Graphics init error: ', GraphErrorMsg(GraphDriver));
    Halt(1);
  end;
  SetVisualPage(0);
  SetActivePage(0);
  ClearDevice;
end;


  Print action information

procedure Action(Text: String);
var
  i: Integer;
begin
  if UpMode=AlertUp then write(Text, ' ')
  else begin
    MoveTo(40*8,7*14);
    SetColor(2);
    OverText(Text,20);
    SetColor(3);
  end;
end;

procedure Message(Text: String);
begin
  MoveTo(3*8,24*14-2);
  OverText(Text,length(Text)+5);
end;
```

```
procedure Abort;
var
  ch: Char;
begin
  TextMode(C80);
  Exitbeam;
end;

function FnAbort: Boolean;
var
  ch: Char;
begin
  AbortFlag := false;
  if keypressed then begin
    Center('Do you really want to abort (Y or N)?',25);
    repeat
      ch := upcase(ReadKey);
    until ch in ['Y','N'];
    if ch = 'Y' then AbortFlag := true
      else AbortFlag := false;
    gotoxy(1,25);
    write(Blank);
  end;
  FnAbort := AbortFlag;
end;

procedure JbError;
begin
  Center('JB Board I/O Timeout Error. Aborting Beam Program',24);
  WaitKey;
  ClrScr;
end;

procedure SetScreen;
begin
  if OpMode = GraphicsOp then begin
    if not GrInstalled then begin
      InstallGraphics;
      GrInstalled := true;
    end else SetGraphMode(GraphMode);
    SetTextStyle(DefaultFont,HorizDir,1);
    SetColor(White);
    SetActivePage(0);
    SetVisualPage(0);
    DirectVideo := false;
  end else begin
    TextMode(C80);
    DirectVideo := true;
  end;
end;

{
  Pad time element with left space if necessary
}
function PadSp(num: Integer): str10;
var
  temp: str10;
begin
```

```
  temp := IntStr(num);
  if num<10 then PadSp := ' ' + temp
    else PadSp := temp;
end;

{
  Pad time element with left zero if necessary
}
function LZero(num: Integer): str10;
var
  temp: str10;
begin
  temp := IntStr(num);
  if num<10 then LZero := '0' + temp
    else LZero := temp;
end;

{
  Read time directly from clock chip
  works only on ATs, 286s, 386s; does not work on standard PCs, XTs
}
procedure GetTime;
var
  good: Boolean;
begin
  good := false;
  while not good do begin
    port[$70] := $0A;     { wait for update to finish (then there's 244 us) }
    if (port[$71] and $80)=0 then begin
      port[$70] := $00;     { get seconds }
      Sec := port[$71];
      port[$70] := $0A;
      if (port[$71] and $80)=0 then begin
        port[$70] := $02;    { get minutes }
        Minu := port[$71];
        port[$70] := $0A;
        if (port[$71] and $80)=0 then begin
          port[$70] := $04;     { get hours }
          Hour := port[$71];
          port[$70] := $0A;
          if (port[$71] and $80)=0 then begin
            port[$70] := $07;     { get day }
            Day := port[$71];
            port[$70] := $0A;
            if (port[$71] and $80)=0 then begin
              port[$70] := $08;     { get month }
              Mon := port[$71];
              port[$70] := $0A;
              if (port[$71] and $80)=0 then begin
                port[$70] := $09;     { get year }
                Year := port[$71];
                port[$70] := $0A;
                if (port[$71] and $80)=0 then good := true;
              end;
            end;
          end;
        end;
      end;
    end;
  end;
```

```
  Sec  := (Sec  shr 4) * 10 + (Sec  and $0F);  { convert from BCD }
  Minu := (Minu shr 4) * 10 + (Minu and $0F);
  Hour := (Hour shr 4) * 10 + (Hour and $0F);
  Day  := (Day  shr 4) * 10 + (Day  and $0F);
  Mon  := (Mon  shr 4) * 10 + (Mon  and $0F);
  Year := (Year shr 4) * 10 + (Year and $0F);
end;


{ Get a time stamp consisting of the relative dav and the current time
}
procedure GetTimeStamp;
var
  tday,tmon,tvear,tsec,tminu,thour: str10;
  AmPm: Char;
begin
  GetTime;
  tmon  := PadSp(Mon);
  tday  := LZero(Day);
  tyear := LZero(Year);
  CurrentDate := tmon+'/'+tday+'/'+tyear;
  tsec  := LZero(Sec);
  tminu := LZero(Minu);
  if Hour=0 then begin
    thour := '12';
    AmPm := 'A';
  end else if Hour<12 then begin
    thour := PadSp(Hour);
    AmPm := 'A';
  end else if Hour=12 then begin
    thour := '12';
    AmPm := 'P';
  end else begin
    thour := PadSp(Hour-12);
    AmPm := 'P'
  end;
  CurrentTime := thour+':'+tminu+' '+AmPm+'M';
end;

function TimeStamp: String;
begin
  GetTimeStamp;
  TimeStamp := CurrentDate + ' ' + CurrentTime;
end;

function ReadLaserBoard(Channel: Integer): Integer;
var
  count: LongInt;
  ADC,i: Integer;
begin
  count := Timeout;
  port[LaserAddr+12] := Channel;
  { must wait 10 us for EOS to go LO (286 @ 4us/loop) }
  i := 1;
  while i < 10 do inc(i);
  repeat   { then approx 110 us for conversion with signal D7 HI }
    dec(count);
  until (port[LaserAddr+13] > 127) or (count = 0);
  ADC := port[LaserAddr+12];
  if PeakReading < ADC then PeakReading := ADC;
```

```
BEAMIC.INC    - Page 4 -                          4/15/1988    4:10 PM

  if count = 0 then JbError;
  ReadLaserBoard := ADC;
end;

procedure ReadTemperature(var Resist,Temper: Real);
var
  temp: Real;
  It,ADC: Integer;
begin
{
  SUBROUTINE: READ voltage of thermistor on JB Board
  use 1/T, LOG(R) function TO linearize the interpolation
}
  ADC := ReadLaserBoard(TempChannel);
  Resist := 20000.0 * (255-ADC) / (255+ADC);    { from 20K resistor on JB Board
  if ADC>214 then begin
    Temper := 71;
    exit;
  end;
  It := 1;
  while (It < TempCalPts) and (Resistance[It] > Resist) do inc(It);
  if Resistance[It] = Resist then
    Temper := Temperature[It]
  else begin
    temp := (1/Temperature[It-1] - 1/Temperature[It]) /
        (ln(Resistance[It-1]) - ln(Resistance[It]));
    Temper := 1 / (1/Temperature[It-1] - temp *
        (ln(Resistance[It-1]) - ln(Resist)));
  end;
  Temper := Temper - 273.15;
end;
```

```
BEAMSCAN.INC    - Page 1 -                4/15/1988   4:11 PM

{---------------------------------------------------------------------------

                           BEAM SCANNING ROUTINES

 ---------------------------------------------------------------------------


                              ************
                              * MoveBeam *
                              ************

  Routine to move mirrors to X,Y directly
  Note: X,Y can be any kind of variable, we change to integers
        and get ADC% (for speed: later fixed addrs routines for each)

procedure AxisMove(pos: LongInt;Strobe: Byte);
begin
  if pos > 65534 then pos := 65534
    else if pos < 0 then pos := 0;
  portW[LaserAddr] := pos;
  port[LaserAddr+2] := port[LaserAddr+2] and not Strobe;{ x is bit 0, y is t
  port[LaserAddr+2] := port[LaserAddr+2] or Strobe;
end;

procedure MoveInXAxis(x: LongInt);
begin
  AxisMove(x,1);
end;

procedure MoveInYAxis(y: LongInt);
begin
  AxisMove(y,2);
end;

procedure MoveBeam(x,y: LongInt);
begin
  if Debug then writeln('MoveBeam: moving beam to ',x,',',y);
  MoveInXAxis(x);
  MoveInYAxis(y);
end;


{
                          ******************
                          * GetBeamProfile *
                          ******************

}

procedure SetupBeamProfile(var BeamProfileVars: BeamProfileVarType;
  Sensor: Integer;X,Y: Real;_ScanStep,_BkgndThreshold: Integer);
begin
  with BeamProfileVars[Sensor] do begin
    if X               >= 0 then Xpos           := trunc(X);
    if Y               >= 0 then Ypos           := trunc(Y);
    if _ScanStep       >= 0 then ScanStep       := _ScanStep;
    if _BkgndThreshold >= 0 then BkgndThreshold := _BkgndThreshold;
    InitialDelay    := 2500;
```

```
    RowToRowDelay     := 200;
    ColToColDelay     := 2000;
  end;
end;

procedure GetBeamProfile(var BeamProfileVars: BeamProfileVarType;
  Sensor: Integer);
var
  Pass,row,col,ADC,delay,waste: Integer;
  Xcorner,Ycorner: LongInt;
begin
  with BeamProfileVars[Sensor] do begin
    XYweight          := 0;
    Xweight           := 0;
    Yweight           := 0;
    TotalWeight       := 0;    { for power, not removing noise till end }
    SaturationCount := 0;
    HiPoints          := 0;
    BeamFound         := false;
    for col:=1 to ColMax do Colweight[col] := 0;
    for row:=1 to RowMax do Rowweight[row] := 0;
    Xcorner := Xpos - (ColMax + 1) * ScanStep div 2;
    Ycorner := Ypos - (RowMax + 1) * ScanStep div 2;
    MoveBeam(Xcorner,Ycorner);
    waste := 0;
    while waste < InitialDelay do inc(waste);
    PeakReading := 0;
    for col:=1 to ColMax do begin    { prefer to return around edges after line
      Xpos := Xcorner + col * ScanStep;
      Ypos := Ycorner;
      MoveBeam(Xpos,Ypos);
      waste := 0;
      while waste < ColToColDelay do inc(waste);
      for row:=1 to RowMax do begin
        inc(Ypos,ScanStep);
        MoveInYAxis(Ypos);
        waste := 0;
        while waste < RowToRowDelay do inc(waste);
        ADC := ReadLaserBoard(SensorChannel[Sensor]);
        if ADC < BkgndThreshold then ADC := 0
          else begin
            inc(HiPoints);
            BeamFound := true;
          end;
        if ADC > 210 then inc(SaturationCount);
        inc(TotalWeight,ADC);
        inc(ColWeight[col],ADC);
        inc(RowWeight[row],ADC);
        BeamMap[row,col] := ADC;
        inc(XYweight,ADC);
        inc(Xweight,Xpos * ADC);    { want floating point numbers here }
        inc(Yweight,Ypos * ADC);
      end; {for row}
    end; {for col}
    MaxSensorReading := PeakReading;
  end;
end;

{
```

```
                                    **********************
                                    * DisplayBeamProfile *
                                    **********************

procedure DisplayBeamProfile(var BeamProfileVars: BeamProfileVarType;
  Sensor: Integer);
var
  row,col,gx,gy,a,ADC,cc,cd: Integer;
begin
  if Display then begin
    gotoxy(70,1);
    write('Sensor #',Sensor);
    if BeamFound then begin
      Center('Found Sensor #'+IntStr(Sensor),25);
      ClearCol(ColMax);
      for col:=1 to ColMax do begin    { prefer to return around edges after li
        ClearCol(ColMax-col);
        for row:=1 to RowMax do begin
          gx := ((ColMax - col) * 3 + 1) * 8;
          gy := (RowMax - row + 1) * 14;
          ADC := BeamProfileVars[Sensor].BeamMap[row,col];
          a  := (ADC - trunc(Bk[Sensor]-3)) div DiscreteBeam + 1;
          if a > 15 then a := 15;
          if OpMode = TextOp then begin
            gotoxy((ColMax - col) * 3 + 1,RowMax - row + 1);
            if ADC < 1 then write('  +') else write(ADC:3);
          end else begin
            if a < 2 then PutPixel(gx,gy,3)
            else Circle(gx,gy,a);
          end;
          if keypressed then exit;
        end; {for row}
      end; {for col}
    end else Center('Sensor #'+IntStr(Sensor)+' not found',25);
  end; {if Display}
end;

                                    ************
                                    * GoodRead *
                                    ************

procedure GoodRead(iter: Integer);
var
  Try: Integer;
begin
  with BeamProfileVariables[Sensor] do begin
    Xaverage  := 0;
    Yaverage  := 0;
    TotWtAvg  := 0;
    GoodCount := 0;
    for Try := 1 to iter do begin
      SetupBeamProfile(BeamProfileVariables,Sensor,Xsp[Sensor],
        Ysp[Sensor],-1{ScanStep},-1{BkgndThreshold});
      GetBeamProfile(BeamProfileVariables,Sensor);
      if Display then DisplayBeamProfile(BeamProfileVariables,Sensor);
      if XYweight > 0 then begin
        Xaverage := Xweight / XYweight + Xaverage;
```

```
BEAMSCAN.INC   - Page 4 -                  4/15/1988   4:11 PM

        Xaverage := Yweight / XYweight + Yaverage;
        TotWtAvg := TotWtAvg + Totalweight - SensorBkgnd[Sensor];
        inc(GoodCount);
      end;
    end; {for Try}
    if GoodCount > 0 then begin
      Xaverage := Xaverage / GoodCount;
      Yaverage := Yaverage / GoodCount;
      TotWtAvg := TotWtAvg / GoodCount;
    end;
    Power[Sensor] := TotWtAvg * SensorCalib[Sensor,3];
  end;
end;

{------------------------------------------------------------------------------

                          ***********
                          * IOSetup *
                          ***********

procedure IOSetup;
begin
  {enter --- Hardware Reset --- IO }
    {control byte of Laser Board: A,B out, C 1,2 in 1 2 out and Thermistor Board
  port[LaserAddr+3] := $88;
  Xpos := XRest;
  Ypos := YRest;
  MoveBeam(Xpos,Ypos);
end;


                          ************
                          * FindBeam *
                          ************


procedure SetupFindBeam(var FindBeamVars: FindBeamVarType;
  Sensor: Integer;X,Y: Real;_SpiralSideMax,_SpiralTries,_ScanStep,
  _BkgndThreshold,_SpiralDelay,_NumCenterPasses: Integer);
begin
  with FindBeamVars[Sensor] do begin
    if X                >= 0 then Xval             := trunc(X);
    if Y                >= 0 then Yval             := trunc(Y);
    if _SpiralSideMax   >= 0 then SpiralSideMax    := _SpiralSideMax;
    if _SpiralTries     >= 0 then SpiralTries      := _SpiralTries;
    if _ScanStep        >= 0 then ScanStep         := _ScanStep;
    if _SpiralDelay     >= 0 then SpiralDelay      := _SpiralDelay;
    if _BkgndThreshold  >= 0 then BkgndThreshold   := _BkgndThreshold;
    if _NumCenterPasses >= 0 then NumCenterPasses  := _NumCenterPasses;
  end;
end;

function SpiralSearchForHole(var FindBeamVars: FindBeamVarType;
  Sensor: Integer): Boolean;
var
  i,ADC,SpiralSide,waste: Integer;
  X,Y: LongInt;
```

```
begin
  with FindBeamVars[Sensor] do begin
    X := trunc(Xval);
    Y := trunc(Yval);
    MoveBeam(X,Y);
    delay(SpiralDelay);
    BeamFound := false;
    SpiralSide := 1;
    while (SpiralSide <= SpiralSideMax) and not BeamFound do begin
      i := 1;
      while (i <= SpiralSide) and not BeamFound do begin
        MoveInXAxis(X);
        waste := 0;
        while (waste < SpiralDelay) do inc(waste);
        ADC := ReadLaserBoard(SensorChannel[Sensor]);
        if ADC > BkgndThreshold then BeamFound := true
        else inc(X,ScanStep);
        inc(i);
      end;
      i := 1;
      while (i <= SpiralSide) and not BeamFound do begin
        MoveInYAxis(Y);
        waste := 0;
        while (waste < SpiralDelay) do inc(waste);
        ADC := ReadLaserBoard(SensorChannel[Sensor]);
        if ADC > BkgndThreshold then BeamFound := true
        else inc(Y,ScanStep);
        inc(i);
      end;
      if FnAbort then exit;
      { reverse directions after each 2 sides }
      if not BeamFound then ScanStep := -ScanStep;
      inc(SpiralSide);
    end; {while SpiralSide}
    if BeamFound then begin
      Xval := X;
      Yval := Y;
    end;
    SpiralSearchForHole := BeamFound;
  end;
end;

function FindBeam(var FindBeamVars: FindBeamVarType;Sensor: Integer;
  FindMethod: FindMethodType): Boolean;
const
  HoleSeparation = 600;
var
  DisplayFlag: Boolean;
  i,ADC,pass,CantFind,SpiralSide: Integer;
  XspAv,YspAv: Real;
  X,Y,GoodX,GoodY: LongInt;
  BeamFound: Boolean;
begin
  FindBeam := true;
  DisplayFlag := Display;
  with FindBeamVars[Sensor] do begin
    CantFind := 0;
    repeat
      X := trunc(Xval);
      Y := trunc(Yval);
```

```
BEAMSCAN.INC    - Page 6 -                    4/15/1988   4:11 PM

      MoveBeam(X,Y);    { gets us to best starting position }
      FlushKey;
      Center('Searching for Sensor #'+IntStr(Sensor)+ ; press any key to abort

{ now spiral to search for holes }

      SetupFindBeam(FindBeamVariables,Sensor,X,Y,-1{SpiralSideMax},
        -1{SpiralTries},-1{ScanStep},-1{BkgndThreshold},-1{SpiralDelay},
        -1{NumCenterPasses});
      BeamFound := SpiralSearchForHole(FindBeamVariables,Sensor);
      if AbortFlag then exit;
      if not BeamFound then begin
        Center('Can''t find Sensor #'+IntStr(Sensor)+ . Is beam blocked?',24);
        SetupFindBeam(FindBeamVariables,Sensor,X,Y,SpiralSideMax * 2,
          -1{SpiralTries},-1{ScanStep},BkgndThreshold - 1,-1{SpiralDelay},
          -1{NumCenterPasses});
        inc(CantFind);
      end;
    until (CantFind >= SpiralTries) or BeamFound;
    if CantFind >= SpiralTries then begin
      MoveBeam(XVal,YVal);
      Beep;
      Center('Could not find Sensor #'+IntStr(Sensor),24);
      if not Calibrate then WaitKey;
      FindBeam := false;
      exit;
    end;
    X := XVal;
    Y := YVal;

{ Verify that we have 2 mil hole...

  { 2 mil    1 mil }  left rear             2 mil      4  mil    right front
                    } of vat                                      } of vat
   4  mil    2 mil                          1 mil    1/2 mil }

    Sensor #1                                 Sensor #2

  We have the position of one of the four holes: 1/2, 1, 2, or 4 mils.
  We want to find the 2 mil hole closest to the vat.  Note that the
  orientation of the holes is different for Sensors 1 and 2.

  Hole Size Check Procedure:

  1.  We may have the position for the 1/2 or 1 mil hole.  Move towards
      the vat in the X-axis and search for the 1 or 2 mil hole.  If the
      beam is seen, adopt the new coordinates.

  2.  Now we may have the position for the 4 mil hole.  Move towards the
      vat in the Y-axis and search for the 2 mil hole.  If the beam is
      seen, use the new coordinates.
}
   if (Sensor = 2) and (FindMethod = Verify2MilHole) then begin
     GoodX := X;
     GoodY := Y;
     if X < 32767 then inc(X,HoleSeparation)
       else dec(X,HoleSeparation);
     SetupFindBeam(FindBeamVariables,Sensor,X,Y,SpiralSideMax div 2,
       -1{SpiralTries},-1{ScanStep},-1{BkgndThreshold},-1{SpiralDelay},
       -1{NumCenterPasses});
```

```
      if SpiralSearchForHole(FindBeamVariables,Sensor) then begin
          GoodX := Xval;
          GoodY := Yval;
        end;
      X := GoodX;
      Y := GoodY;
      if AbortFlag then exit;
      if Y < 32767 then inc(Y,HoleSeparation)
        else dec(Y,HoleSeparation);
      SetupFindBeam(FindBeamVariables,Sensor,X,Y,-1{SpiralSideMax},
        -1{SpiralTries},-1{ScanStep},-1{BkgndThreshold},-1{SpiralDelay},
        -1{NumCenterPasses});
      if SpiralSearchForHole(FindBeamVariables,Sensor) then begin
        GoodX := Xval;
        GoodY := Yval;
      end;
      X := GoodX;
      Y := GoodY;
      if AbortFlag then exit;
    end;

    if DisplayFlag then begin
      SetScreen;
      gotoxy(70,1);
      write('Sensor #',Sensor);
      if BeamFound then Center('Found Sensor #'+IntStr(Sensor),25)
      else Center('Sensor #'+IntStr(Sensor)+' not found',25);
    end;
    tspAv := 0;
    tspN := 0;
    if BeamFound then begin
      for pass:=1 to NumCenterPasses do with BeamProfileVariables[Sensor] do be
        CantFind := 0;
        { discard the first }
        SetupBeamProfile(BeamProfileVariables,Sensor,X,Y,
          4{ScanStep},trunc(Bk[Sensor] + 0.5));
        repeat
          GetBeamProfile(BeamProfileVariables,Sensor);
          if XYweight = 0 then inc(CantFind);
        until (XYweight > 0) or (CantFind > 3);
        if CantFind > 3 then begin
          beep;
          Center('Can''t profile Sensor #'+IntStr(Sensor)+'. Try (6) Move',24);
          if not Calibrate then WaitKey;
          FindBeam := false;
          exit;
        end;
        if SaturationCount > 0 then begin
          gotoxy(1,24);
          Center('WARNING: '+IntStr(SaturationCount)
            + ' sensor readings near saturation',24);
          delay(1000);
        end;
{
  Later select sensor hole size automatically
}
        X := trunc(Xweight / XYweight);    { better coordinates }
        Y := trunc(Yweight / XYweight);
        Power[Sensor] := (TotalWeight - SensorBkgnd[Sensor])
          * (SensorCalib[Sensor,3]);
```

```
BEAMSCAN.INC    - Page 8 -                  4/15/1988   4:11 PM
        XspAv := XspAv + Xweight / XYweight;
        YspAv := YspAv + Yweight / XYweight;
      end; {for pass}
      if NumCenterPasses   1 then begin
        XspAv := XspAv / NumCenterPasses;
        YspAv := YspAv / NumCenterPasses;
      end;
    end; {if BeamFound}
    Xval := X;          { update integer coordinates }
    Yval := Y;
    Xavg := XspAv;      { update average coordinates }
    Yavg := YspAv;
    if DisplayFlag then begin
      DisplayBeamProfile(BeamProfileVariables,Sensor);
      PrintInfo(Sensor);
    end;
  end;
end;

function CoarseFindBeam(Sensor: Integer): Boolean;
var
  OldDisplay : Boolean;
begin
  OldDisplay := Display;
  Display := false;
  SetupFindBeam(FindBeamVariables,Sensor,Xsp[Sensor],Ysp[Sensor],
    50(SpiralSideMax),3(SpiralTries),16(ScanStep),
    trunc(Bk[Sensor] + 0.5)(BkgndThreshold),1(SpiralDelay),
    1(NumCenterPasses));
  if FindBeam(FindBeamVariables,Sensor,NormalFind) then begin
    Xsp[Sensor] := FindBeamVariables[Sensor].Xval;
    Ysp[Sensor] := FindBeamVariables[Sensor].Yval;
  end;
  Display := OldDisplay;
  CoarseFindBeam := BeamFound;
end;

function FineFindBeam(Sensor: Integer): Boolean;
begin
  SetupFindBeam(FindBeamVariables,Sensor,Xsp[Sensor],Ysp[Sensor],
    50(SpiralSideMax),3(SpiralTries),16(ScanStep),
    trunc(Bk[Sensor] + 0.5)(BkgndThreshold),100(SpiralDelay),
    2(NumCenterPasses));
  if FindBeam(FindBeamVariables,Sensor,Verify2MilHole) then begin
    Xsp[Sensor] := FindBeamVariables[Sensor].Xval;
    Ysp[Sensor] := FindBeamVariables[Sensor].Yval;
  end;
  FineFindBeam := BeamFound;
end;

function FindLaserBeam(Sensor: Integer): Boolean;
begin
  if CoarseFindBeam(Sensor) and not AbortFlag then
    BeamFound := FineFindBeam(Sensor);
  FindLaserBeam := BeamFound;
end;

function FindHoles2(Sensor: Integer): Boolean;
{
  When we want to use new starting point
```

```
  Updates hole position
}
begin
  FindHoles2 := FindLaserBeam(Sensor);
end;

function FindHoles(Sensor: Integer): Boolean;
{
  Updates hole position
  Needs to confirm that we have 2 mil hole
}
var
  BkRead: LongInt;
  ADC,row,col: Integer;
begin
  FlushKey;
  Center('Searching for Sensor #'+IntStr(Sensor)+': press any key to abort',25
  Xpos := XRest;
  Ypos := YRest;
  MoveBeam(Xpos,Ypos);
  BkRead := 0;
  for col:=1 to ColMax do begin
    for row:=1 to RowMax do begin
      ADC := ReadLaserBoard(SensorChannel[Sensor]);
      inc(BkRead,ADC);
    end;
  end;
  SensorBkgnd[Sensor] := BkRead;
  { remove noise for centering }
  Bk[Sensor] := (2.0 * BkRead) / (ColMax * RowMax) + 3;
  Xsp[Sensor] := XSensorPos[Sensor];   { will be best starting point }
  Ysp[Sensor] := YSensorPos[Sensor];
  FindHoles := FindHoles2(Sensor);
end;
```

```
{------------------------------------------------------------------------------

                              Utility Routines

------------------------------------------------------------------------------}

procedure beep;
begin
  Sound(1000);
  delay(200);
  NoSound;
end;

function upper(text: string): string;
var
  i: Integer;
  temp: string;
begin
  temp := text;
  for i := 1 to length(temp) do temp[i] := upcase(temp[i]);
  upper := temp;
end;

function [illegible]: Integer): string;
var
  temp: string;
  i: Integer;
begin
  temp := [illegible];
  for [illegible] do temp := temp+Ch;
  [illegible] := temp;
end;

procedure centerWrite(t: String);
begin
  gotoxy((79-length(text)) div 2,whereY);
  writeln(t);
end;

function IntStr(num: Integer): str16;
var
  temp: str16;
begin
  if num>=0 then Str(num,temp) else Str(num+$8000,temp);
  IntStr := temp;
end;

function WordStr(num: Word): str16;
var
  temp: str16;
begin
  Str(num,temp);
  WordStr := temp;
end;

function LongStr(num: LongInt): str16;
var
  temp: str16;
```

```
BEAMUTIL.INC   - Page 2 -                4/15/1988   4:14 PM

begin
  Str(num,temp);
  LongStr := temp;
end;

function RealStr(num: Real;AfterDecimal: Integer): String;
var
  i: Integer;
  temp: String;
begin
  Str(num:10:AfterDecimal,temp);
  i := 1;
  while (i<length(temp)) and (temp[i]=' ') do inc(i);
  RealStr := copy(temp,i,99);
end;

function spc(len: Integer): string;
begin
  spc := copy(blank,1,len);
end;

procedure ReadCommandLine(var line: string);
var
  i: Integer;
begin
  line := ParamStr(1);
  for i:=2 to ParamCount do
    line := line + ' ' + ParamStr(i);
end;

{
  Remove excess quote marks around string
}
function NoQuotes(Text: String): String;
const
  Quote = '"';
var
  s,e: Integer;
begin
  s := 1;
  if (length(Text)>1) and (Text[1]=Quote) then inc(s);
  e := length(Text);
  if Text[e]=Quote then dec(e);
  NoQuotes := copy(Text,s,e-s+1);
end;

{
  Removes all double spaces in text string
}
procedure RemoveDoubleSpaces(var text: string);
begin
  while pos('  ',text)>0 do
    delete(text,pos('  ',text),1);
end;

{
  Find any char of Chars in Main starting at index Start
  Returns length(Main)+1 if no character of Chars in Main
}
function FindStr(Start: Integer;Main: string;Chars: str16): Integer;
```

```
var
  i,j,min: Integer;
  temp: String;
begin
  min := length(Main)+1;
  temp := copy(Main,start,199);
  for i:=1 to length(Chars) do begin
    j := Start + pos(Chars[i],temp) - 1;
    if (j >= Start) and (j < min) then min := j;
  end;
  FindStr := min;
end;

{
  better val routines
}

function IntVal(line: String;var code: Integer): Integer;
var
  code2: Integer;
  num: Integer;
begin
  val(line,num,code);
  if code<>0 then val(copy(line,1,code-1),num,code2);
  IntVal := num;
end;

function WordVal(line: String;var code: Integer): word;
var
  code2: Integer;
  num: word;
begin
  val(line,num,code);
  if code<>0 then val(copy(line,1,code-1),num,code2);
  WordVal := num;
end;

function LongVal(line: String;var code: Integer): LongInt;
var
  code2: Integer;
  num: LongInt;
begin
  val(line,num,code);
  if code<>0 then val(copy(line,1,code-1),num,code2);
  LongVal := num;
end;

function RealVal(line: String;var code: Integer): Real;
var
  ofs,code2: Integer;
  num: Real;
begin
  ofs := 0;
  if line[1]='.' then begin
    line := '0' + line;
    ofs := -1;
  end;
  val(line,num,code);
  if code<>0 then val(copy(line,1,code-1),num,code2);
  if code<>0 then inc(code,ofs);
  RealVal := num;
```

```
end;

{
  Pick out a number from a string
  starting at Index and going to the next space or comma or end-of-string
}
procedure UnitValShortInt(var Storage: Integer;Text: String;var Index: Intege
var
  i: Integer;
begin
  Storage := IntVal(copy(Text,Index,99),i);
  if i=0 then Index := length(Text)+1
    else inc(Index,i);
end;

procedure UnitValInt(var Storage: LongInt;Text: String;var Index: Integer);
var
  i: Integer;
begin
  Storage := LongVal(copy(Text,Index,99),i);
  if i=0 then Index := length(Text)+1
    else inc(Index,i);
end;

procedure UnitVal(var Storage: Real;Text: String;var Index: Integer);
var
  i: Integer;
begin
  Storage := RealVal(copy(Text,Index,99),i);
  if i=0 then Index := length(Text)+1
    else inc(Index,i);
end;

{
  Pick out text from a string
  starting at Index and going to the next comma or end-of-string
}
procedure UnitStr(var Storage,Text: String;var Index: Integer);
var
  i: Integer;
begin
  i := FindStr(Index,Text,',');
  Storage := copy(Text,Index,i-Index);
  Index := i + 1;
end;

{
  Show error and store it on disk
}
procedure QuietSystemError(TextLine: string);
begin
  assign(ErrorFile,ErrorFileName);
  rewrite(ErrorFile);
  writeln(ErrorFile,'BEAM: ',TextLine);
  close(ErrorFile);
end;

procedure SystemError(TextLine: string);
begin
  writeln(TextLine);
```

```
BEAMUTIL.INC    - Page 5 -                    4/15/1988   4:14 PM

  QuietSystemError(TextLine);
end;

{
  Can't open file.  Report this to operator.
}
procedure CantOpen(FileName: string);
begin
  SystemError('Can''t open file '+FileName);
end;

{ Harry's ultimate Draw-A-Box on the text screen routine }
procedure DrawBox(x1,y1,x2,y2: integer;BoxType: integer);
type
  BoxMode = array[1..4] of Char;
{
    Box Types:
      1:  Single Line all around
      2:  Double Line all around
      3:  Single Line horizontal, Double Line vertical
      4:  Double Line horizontal, Single Line vertical
}
  const
                         { Type           1     2     3     4    }
    UpperLeftCorner : BoxMode = (#218,#201,#214,#213);
    UpperRightCorner: BoxMode = (#191,#187,#183,#184);
    LowerLeftCorner : BoxMode = (#192,#200,#211,#212);
    LowerRightCorner: BoxMode = (#217,#188,#189,#190);
    HorzBar         : BoxMode = (#196,#205,#196,#205);
    VertBar         : BoxMode = (#179,#186,#186,#179);
var
  i: integer;
  FullHorzBar: String;
begin
  gotoxy(x1,y1);
  if x1<x2 then begin
    if y1=y2 then FullHorzBar := Many(HorzBar[BoxType],x2-x1+1)
      else FullHorzBar := Many(HorzBar[BoxType],x2-x1-1);
    end else FullHorzBar := '';
  if y1<>y2 then begin
    if x1<>x2 then write(UpperLeftCorner[BoxType]);
    write(FullHorzBar);
    if x1<>x2 then write(UpperRightCorner[BoxType]);
  end;
  for i:=y1+1 to y2-1 do begin
    gotoxy(x1,i);
    write(VertBar[BoxType]);
    gotoxy(x2,i);
    write(VertBar[BoxType]);
  end;
  gotoxy(x1,y2);
  if y1 = y2 then write(FullHorzBar)
  else begin
    if x1<>x2 then write(LowerLeftCorner[BoxType]);
    write(FullHorzBar);
    if x1<>x2 then write(LowerRightCorner[BoxType]);
  end;
end;

{$F+}
```

```
BEAMUTIL.INC    - Page 6 -                 4/15/1989   4:14 PM

procedure ExitBeam;
{$F+}
begin
  TextMode(C80);
(*
  if ExitCode <> 0 then begin
    write('exit code ',ExitCode,' at addr ',Seg(ErrorAddr));
    key := ReadKey;
  end;
*)
  ExitProc := OldExitProc;
end;

procedure ClearLine(row: Integer);
begin
  gotoxy(1,row);
  write(blank);
end;

procedure CenterText(Text: String;Line: Integer);
begin
  gotoxy(1,Line);
  write(blank);
  gotoxy((80-length(Text)) div 2,Line);
  write(Text);
end;

procedure PrintXY(x,y: Real);
var
  s: String;
begin
  if x < 0 then x := 0;
  if x > 65535 then x := 65535;
  if y < 0 then y := 0;
  if y > 65535 then y := 65535;
  s := '(' + WordStr(trunc(x)) + ',' + WordStr(trunc(y)) + ')';
  if length(s) < 13 then s := spc((13-length(s)) div 2) + s;
  write(s,spc(13-length(s)));
end;

procedure PrintPowerPos(Sensor: Integer);
begin
  ClearLine(23);
  gotoxy(10,23);
  write('Sensor #',Sensor,' Power ',Power[Sensor]:5:1,' mW, Center ');
  PrintXY(Xsp[Sensor],Ysp[Sensor]);
end;

procedure PrintInfo(Sensor: Integer);
begin
  gotoxy(71,3);
  write('Power');
  gotoxy(69,4);
  write(Power[Sensor]:5:1,' mW');
  gotoxy(71,6);
  write('Center');
  gotoxy(68,7);
  PrintXY(Xsp[Sensor],Ysp[Sensor]);
  gotoxy(71,18);
  write('Maximum');
```

```
  gotoxy(77,19);
  write(BeamProfileVariables[Sensor].MaxSensorReading);
end;

procedure WaitKey;
begin
  Center('Hit any key to continue',25);
  repeat
  until keypressed;
  gotoxy(25,1);
  write(blank);
end;

procedure Pause(usec: LongInt);
var
  i,msec: LongInt;
begin
  i := 1;
  key := ' ';
  msec := tr[illegible]nd(usec / 1000);
  while (i < msec) and not keypressed do begin
    Delay(1);
    inc(i);
  end;
  if keypressed then key := ReadKey;
end;

procedure FlushKey;
begin
  while keypressed do key := ReadKey;
end;

procedure ClearCol(col: Integer);
var
  col2: Integer;
begin
  if (col [illegible]) and (ScrMode = GraphicsDev) then begin
    col2 := (col-1)*24-4;
    if col2 [illegible] then col2 := 0;
    SetFillStyle(EmptyFill,0);
    Bar(col2,[illegible],col2+23,330);
  end;
end;
```

```
LLDMON.INC    - Page 1 -                    4/15/1988   4:16 PM

{
   Beam Profiler monitoring routines
}

function ReadLaserBoard(Channel: Integer): Integer;
var
  count: LongInt;
  ADC,i: Integer;
begin
  count := Timeout;
  port[LaserAddr+12] := Channel;
  { must wait 10 us for EOS to go LO (286 @ 4us/loop) }
  i := 1;
  while i < 10 do inc(i);
  repeat    { then approx 110 us for conversion with signal D7 HI }
    dec(count);
  until (port[LaserAddr+16] > 127) or (count = 0);
  ADC := port[LaserAddr+12];
  if RealReading < ADC then RealReading := ADC;
  if count = 0 then ReadLaserBoard := -1
    else ReadLaserBoard := ADC;
end;

procedure ReadTemperature(var Resist,Temper: Real);
var
  temp: Real;
  It,ADC: Integer;
begin

  SUBROUTINE 6: READ voltage of thermistor on JB Board
  use 1/T (LOG R) function TO linearize the interpolation

  ADC := ReadLaserBoard(TempChannel);
  Resist := 20000.0 * (255-ADC) / (255+ADC);    { from 20K resistor on JB Board
  if ADC > 214 then begin
    Temper := 71;
    exit;
  end;
  It := 1;
  while (It <= TempCalPts) and (Resistance[It] > Resist) do inc(It);
  if Resistance[It] = Resist then
    Temper := Temperature[It]
  else begin
    temp := (1/Temperature[It-1] - 1/Temperature[It]) /
      (ln(Resistance[It-1]) - ln(Resistance[It]));
    Temper := 1/ (1/Temperature[It-1] - temp *
      (ln(Resistance[It-1]) - ln(Resist)));
  end;
  Temper := Temper - 273.15;
end;

procedure println(text: String);
begin
  if not transparent then writeln(text);
end;

{-----------------------------------------------------------------------------

                          BEAM SCANNING ROUTINES
```

```
----------------------------------------------------------------------------

                          *************
                          * MoveBeam *
                          *************

  Routine to move mirrors to X,Y directly
  Note: X,Y can be any kind of variable, we change to integers
        and get ADC% (for speed: later fixed addrs routines for each)

procedure AxisMove(pos: LongInt;Strobe: Byte);
begin
  if pos > 65534 then pos := 65534
    else if pos < 0 then pos := 0;
  portW[LaserAddr] := pos;
  port[LaserAddr+2] := port[LaserAddr+2] and not Strobe;   { X is bit 0, Y is 1 [illegible]
  port[LaserAddr+2] := port[LaserAddr+2] or Strobe;
end;

[illegible]
[illegible]
  [illegible]
end;

[illegible]
begin
  [illegible]
end;

[illegible]
begin
  [illegible]
  [illegible]
end;



                    *******************
                    * GetBeamProfile *
                    *******************


procedure SetupBeamProfile(var BeamProfileVars: BeamProfileVarType;
  Sensor: Integer;X,Y: Real;_ScanStep,_BkgndThreshold: Integer);
begin
  with BeamProfileVars[Sensor] do begin
    if X               <> 0 then Xpos           := trunc(X);
    if Y               <> 0 then Ypos           := trunc(Y);
    if _ScanStep       <> 0 then ScanStep       := _ScanStep;
    if _BkgndThreshold <> 0 then BkgndThreshold := _BkgndThreshold;
    InitialDelay    := 2500;
    RowToRowDelay   := 200;
    ColToColDelay   := 2000;
  end;
end;
```

```
[illegible].INC   - Page 3 -                    4/15/1988   4:16 PM

procedure GetBeamProfile(var BeamProfileVars: BeamProfileVarType;
  Sensor: Integer);
var
  Pass,row,col,ADC,delay,waste: Integer;
  Xcorner,Ycorner: LongInt;
begin
  with BeamProfileVars[Sensor] do begin
    XYweight         := 0;
    Xweight          := 0;
    Yweight          := 0;
    TotalWeight      := 0;   { for power, not removing noise till end }
    SaturationCount  := 0;
    HiPoints         := 0;
    BeamFound        := false;
    for col:=1 to ColMax do ColWeight[col] := 0;
    for row:=1 to RowMax do RowWeight[row] := 0;
    Xcorner := Xpos - (ColMax + 1) * ScanStep div 2;
    Ycorner := Ypos - (RowMax + 1) * ScanStep div 2;
    MoveBeam(Xcorner,Ycorner);
    waste := 0;
    while waste < InitialDelay do inc(waste);
    PeakReading := 0;
    for col:=1 to ColMax do begin   { prefer to return around edges after line
      Xpos := Xcorner + col * ScanStep;
      Ypos := Ycorner;
      MoveBeam(Xpos,Ypos);
      waste := 0;
      while waste < ColToColDelay do inc(waste);
      for row:=1 to RowMax do begin
        inc(Ypos,ScanStep);
        MoveInYAxis(Ypos);
        waste := 0;
        while waste < RowToRowDelay do inc(waste);
        ADC := ReadLaserBoard(SensorChannel[Sensor]);
        if ADC < BkgndThreshold then ADC := 0
          else begin
            inc(HiPoints);
            BeamFound := true;
          end;
        if ADC > 210 then inc(SaturationCount);
        inc(TotalWeight,ADC);
        inc(ColWeight[col],ADC);
        inc(RowWeight[row],ADC);
        BeamMap[row,col] := ADC;
        inc(XYweight,ADC);
        inc(Xweight,Xpos * ADC);   { want floating point numbers here }
        inc(Yweight,Ypos * ADC);
      end; {for row}
    end; {for col}
    MaxSensorReading := PeakReading;
  end;
end;


                         ************
                         * GoodRead *
                         ************
```

```
BLDMON.INC    - Page 4 -                    4/15/1988    4:16 PM

procedure GoodRead(Sensor,iter: Integer);
var
  Try: Integer;
begin
  with BeamProfileVariables[Sensor] do begin
    Xaverage  := 0;
    Yaverage  := 0;
    TotWtAvg  := 0;
    GoodCount := 0;
    for Try := 1 to iter do begin
      SetupBeamProfile(BeamProfileVariables,Sensor,Xsp[Sensor],
        Ysp[Sensor],-1{ScanStep},-1{BkgndThreshold});
      GetBeamProfile(BeamProfileVariables,Sensor);
      if XYweight > 0 then begin
        Xaverage := Xweight / XYweight + Xaverage;
        Yaverage := Yweight / XYweight + Yaverage;
        TotWtAvg := TotWtAvg + TotalWeight - SensorBkgnd[Sensor];
        inc(GoodCount);
      end;
    [illegible]
    if GoodCount > 0 then begin
      Xaverage := Xaverage / GoodCount;
      Yaverage := Yaverage / GoodCount;
      TotWtAvg := TotWtAvg / GoodCount;
    end;
    Power[Sensor] := TotWtAvg * SensorCalib[Sensor,3];
  end;
end;


----------------------------------------------------------------------------------
                                   HARDWARE ROUTINES
----------------------------------------------------------------------------------

procedure IOSetup;
begin
  port[LaserAddr+3] := $88;
  Xpos := XRest;
  Ypos := YRest;
  MoveBeam(Xpos,Ypos);
end;

{
                                   ************
                                   * FindBeam *
                                   ************
}

procedure SetupFindBeam(var FindBeamVars: FindBeamVarType;
  Sensor: Integer;X,Y: Real;_SpiralSideMax,_SpiralTries,_ScanStep,
  _BkgndThreshold,_SpiralDelay,_NumCenterPasses: Integer);
begin
  with FindBeamVars[Sensor] do begin
    if X                <> 0 then Xval              := trunc(X);
    if Y                <> 0 then Yval              := trunc(Y);
    if _SpiralSideMax   <> 0 then SpiralSideMax     := _SpiralSideMax;
    if _SpiralTries     <> 0 then SpiralTries       := _SpiralTries;
    if _ScanStep        <> 0 then ScanStep          := _ScanStep;
    if _SpiralDelay     <> 0 then SpiralDelay       := _SpiralDelay;
```

```
    if _BkgndThreshold >= 0 then BkgndThreshold := _BkgndThreshold;
    if _NumCenterPasses >= 0 then NumCenterPasses := _NumCenterPasses;
  end;
end;

function SpiralSearchForHole(var FindBeamVars: FindBeamVarType;
  Sensor: Integer): Boolean;
var
  i,ADC,SpiralSide,waste: Integer;
  X,Y: LongInt;
begin
  with FindBeamVars[Sensor] do begin
    X := trunc(Xval);
    Y := trunc(Yval);
    MoveBeam(X,Y);
    delay(SpiralDelay);
    BeamFound := false;
    SpiralSide := 1;
    while (SpiralSide <= SpiralSideMax) and not BeamFound do begin
      i := 1;
      while (i <= SpiralSide) and not BeamFound do begin
        MoveInXAxis(X);
        waste := 0;
        while (waste < SpiralDelay) do inc(waste);
        ADC := ReadLaserBoard(SensorChannel[Sensor]);
        if ADC > BkgndThreshold then BeamFound := true
        else inc(X,ScanStep);
        inc(i);
      end;
      i := 1;
      while (i <= SpiralSide) and not BeamFound do begin
        MoveInYAxis(Y);
        waste := 0;
        while (waste < SpiralDelay) do inc(waste);
        ADC := ReadLaserBoard(SensorChannel[Sensor]);
        if ADC > BkgndThreshold then BeamFound := true
        else inc(Y,ScanStep);
        inc(i);
      end;
      { reverse directions after each 2 sides }
      if not BeamFound then ScanStep := -ScanStep;
      inc(SpiralSide);
    end; {while SpiralSide}
    if BeamFound then begin
      Xval := X;
      Yval := Y;
    end;
    SpiralSearchForHole := BeamFound;
  end;
end;

function FindBeam(var FindBeamVars: FindBeamVarType;Sensor: Integer;
  FindMethod: FindMethodType): Boolean;
const
  HoleSeparation = 600;
var
  i,ADC,pass,CantFind,SpiralSide: Integer;
  XspAv,YspAv: Real;
  X,Y,GoodX,GoodY: LongInt;
  BeamFound: Boolean;
```

```
begin
  FindBeam := true;
  with FindBeamVars[Sensor] do begin
    CantFind  := 0;
    repeat
      X := trunc(Xval);
      Y := trunc(Yval);
      MoveBeam(X,Y);    { gets us to best starting position }
{
  now spiral to search for holes
}
      SetupFindBeam(FindBeamVariables,Sensor,X,Y,-1{SpiralSideMax},
        -1{SpiralTries},-1{ScanStep},-1{BkgndThreshold},-1{SpiralDelay},
        -1{NumCenterPasses});
      BeamFound := SpiralSearchForHole(FindBeamVariables,Sensor);
      if not BeamFound then begin
        SetupFindBeam(FindBeamVariables,Sensor,X,Y,SpiralSideMax * 2,
          -1{SpiralTries},-1{ScanStep},BkgndThreshold - 1,-1{SpiralDelay},
          -1{NumCenterPasses});
        inc(CantFind);
      end;
    until (CantFind >= SpiralTries) or BeamFound;
    if CantFind >= SpiralTries then begin
      MoveBeam(Xval,Yval);
      FindBeam := false;
      exit;
    end;
    X := Xval;
    Y := Yval;
{
  Verify that we have 2 mil hole...

  1/2 mil     1 mil  { left rear                    2 mil      4  mil   right front
                     } of vat                                           } of vat
   4  mil     2 mil  }                              1 mil     1/2 mil }

     Sensor #1                                         Sensor #2

   We have the position of one of the four holes: 1/2, 1, 2, or 4 mils.
   We want to find the 2 mil hole closest to the vat.  Note that the
   orientation of the holes is different for Sensors 1 and 2.

   Hole Size Check Procedure:

   1.  We may have the position for the 1/2 or 1 mil hole.  Move towards
       the vat in the X-axis and search for the 1 or 2 mil hole.  If the
       beam is seen, adopt the new coordinates.

   2.  Now we may have the position for the 4 mil hole.  Move towards the
       vat in the Y-axis and search for the 2 mil hole.  If the beam is
       seen, use the new coordinates.
}
    if (Sensor < 3) and (FindMethod = Verify2MilHole) then begin
      GoodX := X;
      GoodY := Y;
      if X < 32767 then inc(X,HoleSeparation)
        else dec(X,HoleSeparation);
      SetupFindBeam(FindBeamVariables,Sensor,X,Y,SpiralSideMax div 2,
        -1{SpiralTries},-1{ScanStep},-1{BkgndThreshold},-1{SpiralDelay},
        -1{NumCenterPasses});
```

```
      if SpiralSearchForHole(FindBeamVariables.Sensor) then begin
          GoodX := Xval;
          GoodY := Yval;
        end;
      X := GoodX;
      Y := GoodY;
      if Y < 32767 then inc(Y.HoleSeparation)
        else dec(Y.HoleSeparation);
      SetupFindBeam(FindBeamVariables.Sensor.X,Y,-1{SpiralSideMax},
        -1{SpiralTries},-1{ScanStep},-1{BkgndThreshold},-1{SpiralDelay},
        -1{NumCenterPasses});
      if SpiralSearchForHole(FindBeamVariables.Sensor) then begin
        GoodX := Xval;
        GoodY := Yval;
      end;
      X := GoodX;
      Y := GoodY;
    end;

    XspAv := 0;
    YspAv := 0;
    if BeamFound then begin
      for pass:=1 to NumCenterPasses do with BeamProfileVariables[Sensor] do be
        CantFind := 0;
        { discard the first }
        SetupBeamProfile(BeamProfileVariables.Sensor,X,Y,
          4{ScanStep},trunc(Bk[Sensor] + 0.5));
        repeat
          GetBeamProfile(BeamProfileVariables,Sensor);
          if XYweight = 0 then inc(CantFind);
        until (XYweight > 0) or (CantFind > 3);
        if CantFind > 3 then begin
          FindBeam := false;
          exit;
        end;

 Later select sensor hole size automatically

        X := trunc(Xweight / XYweight);     { better coordinates }
        Y := trunc(Yweight / XYweight);
        Power[Sensor] := (TotalWeight - SensorBkgnd[Sensor])
          * (SensorCalib[Sensor,3]);
        XspAv := XspAv + Xweight / XYweight;
        YspAv := YspAv + Yweight / XYweight;
      end; {for pass}
      if NumCenterPasses > 1 then begin
        XspAv := XspAv / NumCenterPasses;
        YspAv := YspAv / NumCenterPasses;
      end;
    end; {if BeamFound}
    Xval := X;          { update integer coordinates }
    Yval := Y;
    Xavg := XspAv;    { update average coordinates }
    Yavg := YspAv;
  end;
end;

function CoarseFindBeam(Sensor: Integer): Boolean;
begin
  SetupFindBeam(FindBeamVariables,Sensor,Xsp[Sensor],Ysp[Sensor],
```

```
    50(SpiralSideMax),3(SpiralTries),16(ScanStep),
    trunc(Bk[Sensor] + 0.5)(BkgndThreshold),1(SpiralDelay),
    1(NumCenterPasses));
  if FindBeam(FindBeamVariables,Sensor,NormalFind) then begin
    Xsp[Sensor] := FindBeamVariables[Sensor].Xval;
    Ysp[Sensor] := FindBeamVariables[Sensor].Yval;
  end;
  CoarseFindBeam := BeamFound;
end;

function FineFindBeam(Sensor: Integer): Boolean;
begin
  SetupFindBeam(FindBeamVariables,Sensor,Xsp[Sensor],Ysp[Sensor],
    50(SpiralSideMax),3(SpiralTries),16(ScanStep),
    trunc(Bk[Sensor] + 0.5)(BkgndThreshold),100(SpiralDelay),
    3(NumCenterPasses));
  if FindBeam(FindBeamVariables,Sensor,Verify2MilHole) then begin
    Xsp[Sensor] := FindBeamVariables[Sensor].Xval;
    Ysp[Sensor] := FindBeamVariables[Sensor].Yval;
  end;
  FineFindBeam := BeamFound;
end;

function FindLaserBeam(Sensor: Integer): Boolean;
begin
  if CoarseFindBeam(Sensor) then
    BeamFound := FineFindBeam(Sensor);
  FindLaserBeam := BeamFound;
end;



function FindHoles2(Sensor: Integer): Boolean;

  When we want to use new starting point
    updates hole position

begin
  FindHoles2 := FindLaserBeam(Sensor);
end;

function FindHoles(Sensor: Integer): Boolean;
{
  updates hole position
  Needs to confirm that we have 2 mil hole
}
var
  BkRead: LongInt;
  ADC,row,col: Integer;
begin
  Xpos := XRest;
  Ypos := YRest;
  MoveBeam(Xpos,Ypos);
  BkRead := 0;
  for col:=1 to ColMax do begin
    for row:=1 to RowMax do begin
      ADC := ReadLaserBoard(SensorChannel[Sensor]);
      inc(BkRead,ADC);
```

```
    end;
  end;
  SensorBkgnd[Sensor] := BkRead;
  { remove noise for centering }
  Bk[Sensor] := (2.0 * BkRead) / (ColMax * RowMax) + 3;
  PinHoles := FindHoles2(Sensor);
end;

 {=========================================================================}



  Read BEAM.PRM parameters file

procedure ReadBeamParamsFile;
var
  ParamFile: text;
  i,count,code,code1,code2,Sensor,Pinhole: Integer;
  Trd,ParamLine: String;

  procedure GetParamFileLine;
  begin
    if eof(ParamFile) then ParamLine := ''
    else repeat
      readln(ParamFile,ParamLine);
     until eof(ParamFile) or ((ParamLine <> '') and (ParamLine[1] <> '!'));
  end;

begin
  {$I-}
  assign(ParamFile,BeamParamFileName);
  reset(ParamFile);
  if IOresult<>0 then begin
    assign(ParamFile,HomeDirectory+BeamParamFileName);
    reset(ParamFile);
    if IOresult<>0 then halt(10);
  end;
  {$I+}
  GetParamFileLine;
  if copy(ParamLine,1,1) = chr(34) then begin   { handle quoted options line }
    i := pos(chr(34),copy(ParamLine,2,255));
    if i>0 then ParamLine[0] := chr(i);
    ParamLine := NoQuotes(ParamLine);
    GetParamFileLine;
  end;
  XRest := WordVal(ParamLine,code);
  YRest := WordVal(copy(ParamLine,code+1,255),code);
  GetParamFileLine;
  SensorNum := WordVal(ParamLine,code);
  for Sensor:=1 to SensorNum do begin
    GetParamFileLine;
    SensorChannel[Sensor] := WordVal(ParamLine,code);
    GetParamFileLine;
    XSensorPos[Sensor] := WordVal(ParamLine,code);
    YSensorPos[Sensor] := WordVal(copy(ParamLine,code+1,255),code);
    for Pinhole:=1 to 4 do begin
      GetParamFileLine;
      SensorCalib[Sensor,Pinhole] := RealVal(ParamLine,code);
    end;
```

```
  end; {for Sensor}
  GetParamFileLine;
  TempChannel := WordVal(ParamLine.code);    { assume only one thermometer at fi
  GetParamFileLine;
  TempCalPts := WordVal(ParamLine.code);
  for i:=1 to TempCalPts do begin
    { Resistance[i],Temperature[i] may not be integers }
    GetParamFileLine;
    Resistance [i] := RealVal(ParamLine,code);
    Temperature[i] := RealVal(copy(ParamLine,code+1,255),code) + 273.15;
  end;
  for i:=1 to 3 do begin    { read in Fast, Medium, & Slow Calib Delay values }
    GetParamFileLine;
    CalibDelays[i,1] := LongVal(ParamLine,code1);
    CalibDelays[i,2] := trunc(RealVal(copy(ParamLine,code1+1,255),code2)*10+0.5
    CalibDelays[i,3] := trunc(RealVal(copy(ParamLine,code2+code1+1,255),code)*1
  end;
  close(ParamFile);
  Resistance [0] := Resistance[1] * 2 - Resistance [2];
  Temperature[0] := Temperature[1] * 2 - Temperature[2];
end;

{---------------------------------------------------------------------------}
procedure SetupMonitoring;
begin
  Port[LaserAddr+3] := $88;
  for i:=1 to 2 do begin
    Xsp[i] := XSensorPos[i];
    Ysp[i] := YSensorPos[i];
  end;
end;

procedure CantLocateSensor(num: Integer);
begin
  ErrorAbort('Can''t locate Annealer Sensor #' + IntStr(num)
    + ' on layer ' + IntStr(ControlLayer));
end;

procedure MonitorLaserBeamDrift;
type
  BufType = array[1..19] of Byte;
const
  CmdBufMask: BufType = (STEREO_D1,0,0,0,0,0,0,0,0,0,
                         STEREO_D2,0,0,0,0,0,0,0,0,0);
var
  CmdBuf: BufType;
  i: Integer;
begin
  if not (NoDriftFlag or LaserOff) then begin
    Action('ANALYZING');
    CmdBuf := CmdBufMask;
    if FindHoles(1) then begin
      with FindBeamVariables[1] do begin
        Xsp[1] := Xavg;    { fast locate next time }
        Ysp[1] := Yavg;
        ConvertRtoS(@Xavg,@CmdBuf[2]);
        ConvertRtoS(@Yavg,@CmdBuf[6]);
      end;
        if FindHoles(2) then begin
          with FindBeamVariables[2] do begin
            Xsp[2] := Xavg;
            Ysp[2] := Yavg;
            ConvertRtoS(@Xavg,@CmdBuf[11]);
            ConvertRtoS(@Yavg,@CmdBuf[15]);
          end;
          ShowError(BinarySTEREO(@CmdBuf));
        end else CantLocateSensor(2);
      end else CantLocateSensor(1);
    end;
  end;
```

```
BUILD.PAS   - Page 1 -                       4/15/1988   4:19 PM

{$R-,S+,I+,D+,T-,F-,V-,B-,N-,L+}
 $M 16384,0,655360}

{=================================================================
  3D Systems Stereolithography System Software
 =================================================================

  BUILD.PAS
  SLA-1 Stereolithography Part-Builder

 -----------------------------------------------------------------

  BUILD-specific Commands:

    ZW secs       -  set Z-axis Wait time in seconds
    ZD distance   -  set Z-axis dip Depth in millimeters
    ZV velocity   -  set Z-axis Velocity parameter
    ZA accel      -  set Z-axis Acceleration parameter

 -----------------------------------------------------------------

  Recent History:
   [illegible]   Ver 2.04  Version 2 released
   [illegible]   Ver 2.0[illegible]  variable dip logic corrected
   [illegible]   Ver 2.0[illegible]  compiled by TBM (Modified Turbo Basic)
                           [illegible] options
                           EX & CL before double EC to suppress glitch
   [illegible]   Ver 2.08  added EV, EI critical areas
   9/17/87   Ver 2.10  PRM numbers less than 0.1 supported
                       selectable range of Z layers with /START, /STOP options
                       keyboard pause / continue / skip to layer control
   [illegible]   Ver 2.11  fixed incorrect day of week read
   9/23/87   Ver 2.12  new SUPER commands ZW, ZD, ZV, and ZA
                       structural changes to SUPER.PRM
   9/25/87   Ver 2.20  new SLICE 19 block format supported
   9/28/87   Ver 2.21  /NEGZ Z-stage is negative flag
                       default option line in SUPER.PRM
                       added NFUB support
                       added lower-case SUPER command support
   9/30/87   Ver 2.25  no execute for empty blocks (primarily for L block)
  10/20/87   Ver 2.26  /DEMO out-of-vat-delay option for AutoFact '87
  10/26/87   Ver 2.27  *.P files now *.L file
                       error file support
  11/03/87   Ver 2.28  special demo screen read from file SUPER.DMO
  11/04/87   Ver 2.29  demo action descriptions with good timing
  11/12/87   Ver 2.30  first Beta software release
  11/15/87   Ver 2.31  added directory of *.L files
  11/20/87   Ver 2.32  multiple part-making capability added
  12/04/87   Ver 2.33  slice20 FUB FDB blocks
                       Menu System forced pause at end of part-making run
                       BLOCK.ID file supported
  12/16/87   Ver 2.40  SUPER converted from Turbo Basic to Turbo Pascal
                       faster file transveral, laser buffer filling
                       no special demo screen support
  12/18/87   Ver 2.41  fixed Z-Table dip routine (inf board output)
  12/21/87   Ver 2.50  graphics support added
                       start-up and part-making information displays
                       laser vectors shown on screen
  12/23/87   Ver 2.51  Block File read speed up
                       skipping to new layers sped up 150 times
```

```
  12/26/87  Ver 2.52  skip to new layer fixed
                      Layer Control File command processing fixed
                      added ability to flip between the two graphic screens
   1/06/88  Ver 2.53  break abort allowed during skip action
                      negative offsets shown as such
                      wait action F1/F2 support added
                      graphics display of error messages
                      axes orientation arrows for view window
                      better file directory display
   1/22/88  Ver 2.54  control of min/max vat viewport coords via SUPER.PRM
                      ShowFiles based on *.V instead of *.L
                      case no longer important on SUPER.PRM option line
                      better non-existent input files recovery
   1/25/88  Ver 2.60  Graphics Supervisor no longer classified as Experimental
                      support of *.R Range Control Files (as well as *.L)
                      correct layer count derived from Range Control File
   2/06/88  -         /DEMO option made functional
                      rivet processing made functional
   3/08/88  Ver 2.80  added copyright notice
                      installed gain and offset drift correction
                      implemented binary STEREO support
   4/04/88  Ver 3.0   changed messages and menus
   4/08/88  Ver 3.01  added binary Vector File support
                      removed Critical Area feature
                      SUPER renamed to BUILD
   4/11/88  Ver 3.02  fixed GetVectorFile routine
   4/13/88  Ver 3.03  fixed skipped-to layer block command default problem
   4/15/88  Ver 3.04  added layer number to profiling error messages
                      default part name input from last part PREPAREd

  still remaining to do...

                      part start and completion time logged to history file
                      support of part-specific build parameters
                      warning message if laser not on or shutters closed
                      set up of laser-off control through Menu program
                        (not for /LOFF)

--------------------------------------------------------------------------

uses Dos,
     Crt,
     Graph,    { library of graphics routines }
     Drivers,  { all the BGI drivers }
     Fonts;    { all the BGI fonts }

type
  str4  = string[4];
  str6  = string[6];
  str10 = string[10];
  str16 = string[16];
  str40 = string[40];
  str80 = string[80];
  OpModeType = (TextOp,GraphicsOp);
  FpPointerStruct = array[0..255] of Byte;
  FpPointerType   = ^FpPointerStruct;
  BeamProfileVarSensorType = record
    Xpos             : LongInt;    { inputs }
    Ypos             : LongInt;
    ScanStep         : Integer;
```

```
  BkgndThreshold  : Integer;
  InitialDelay    : Integer;
  RowToRowDelay   : Integer;
  ColToColDelay   : Integer;
  XYweight        : LongInt;   { outputs }
  Xweight         : LongInt;
  Yweight         : LongInt;
  TotalWeight     : LongInt;
  HiPoints        : Word;
  SaturationCount : Integer;
  MaxSensorReading: Integer;
  BeamMap         : array[0..30,0..30] of Integer;
  RowWeight       : array[0..30] of Word;
  ColWeight       : array[0..30] of Word;
end;
BeamProfileVarType = array[1..3] of BeamProfileVarSensorType;
FindBeamVarSensorType = record
  Xval            : LongInt;   { inputs & updated }
  Yval            : LongInt;
  SpiralDelay     : Word;      { inputs }
  SpiralSideMax   : Integer;
  SpiralTries     : Integer;
  ScanStep        : Integer;
  BkgndThreshold  : Integer;
  NumCenterPasses : Integer;
  Xavg            : Real;      { outputs }
  Yavg            : Real;
end;
FindBeamVarType = array[1..3] of FindBeamVarSensorType;
FindMethodType = (none,NormalFind,Verify2MilHole);

var
FirstVar: Byte;  { must be first variable defined }
Ch,key: Char;
index,dummy,code,i,j,k: Integer;
WeekDay,Hour,Minu,Sec,Mon,Day,Year: Integer;
temp,cmd,SingleBar: str80;
ShowStuff,ZTableOff,LaserOff,DipFlag,NegZStage,Demo: Boolean;
FirstLayer,SameBlock,MoveOnFlag,SkipFlag,PauseFlag: Boolean;
VectorFileIsBinary,NoDriftFlag: Boolean;
DSize,Layer,VPosition,StartZ,EndZ,NumLayers,LayersToBuild: LongInt;
PauseAfterLayer: LongInt;
XYScale,ZPitch,PartHeight: Real;
CurrentDate,CurrentTime: str16;
ParamOptions,ControlLine,VectorLine,PartName,DefaultPartName: str80;
StartTimeStamp,EndTimeStamp: str40;
BlockMnemonicsCount,OutOfVatDelay,x1,y1,x2,y2: Word;
VectorFileLoc,MaxLaserQueueBlockSize,LaserQueueBlockSize: LongInt;
Binary_X1,Binary_Y1,Binary_X2,Binary_Y2: Word;
regs: Registers;
LastPartFile,ControlFile,ErrorFile: Text;
VectorFile: File;  {untyped}
XOffset,YOffset,ZAddress: LongInt;
ParVectorType: array[0..100] of str10;
ParStereoDef: array[0..100] of str80;
BlockMnemonics: array[1..20] of str10;
Offsets: array[0..50,1..2] of LongInt;
LayerCount,NumXOffsets,NumYOffsets,NumOffsets: Word;
ParCount,RelaxationTime: Word;
LaserVersion,StereoVersion: str4;
```

```
  check1,check2: Boolean;
  VectorNumRead,DefIndex,ControlIndex,BlockIndex: Integer;
  SaveSec,NewSec,DeltaSecs,OldDeltaSecs,ControlLayer,VectorLayer: LongInt;
  GrDeltaX,GrDeltaY: LongInt;
  ControlType,VectorType: str10;
  DipDepth,ZTableVeloc,ZTableAccel: Real;
  SliceRes,ZSpacing,Thickness: Real;
  OnScreen,GraphDriver,GraphMode,Error: Integer;
  ViewPort: ViewPortType;
  OpMode: OpModeType;
  LayerCtrl,SwapXY,NegX,NegY: Boolean;
  GrMinX,GrMinY,GrMaxX,GrMaxY: LongInt;
  RangeCount,BlockCount: Integer;
  BlockVectorCount,RangeZStart,RangeZEnd: LongInt;
  RangeZSpace,RangeCureDepth: Integer;
  ZStart,ZEnd: array[1..100] of LongInt;          { all the ranges }
  ZSpace,CureDepth: array [1..100] of Integer;    {                }
  VectorTypes: array[1..100] of str3;             { just for one range }
  BlockTmps: array[1..100] of str80;              {                }

  { - PROFILING ... -
    beam arrays
  Resistance,Temperature: array[1.. ] of Real;
  { sensor arrays }
  SensorChannel,XSensorPos,YSensorPos,SensorBkgnd: array[1..3] of Word;
  Power,Bk: array[1..3] of Real;
  CalibBp: array [1..3] of Real;
  SensorCalib: array[1..3,1..4] of Real;
  LastField: array[1..4] of Integer;
  { miscellaneous }
  Transparent,BeamFound: Boolean;
  XRest,YRest,TempChannel,TempCalPts: Word;
  GoodCount,RawReading,Sensor,Select,SensorNum: Integer;
  Xpos,Ypos: LongInt;
  Xaverage,Yaverage,TotWtAvg: Real;
  OldExitProc: Pointer;
  BeamProfileVariables: BeamProfileVarType;
  FindBeamVariables: FindBeamVarType;
  CalibDelays: array[1..3,1..3] of LongInt;
  LastVar: Byte;   { must be last variable-to-be-zeroed defined }

  VectorBuf: array[1..4100] of Char;

const
  VersionId    = '3.04';
  MSDOS        = $21;
  LASERVECTOR  = $64;
  STEREOVECTOR = $65;
  BlockIdentifiers  = 'ZXYISHVABJCDEFGK';
  ErrorFileName     = 'C:\SYSTEM.ERR';
  SystemFileName    = 'C:\SLA1.SYS';
  HomeDirectory     = 'C:\3DSYS\';
  BlockIdFileName   = 'BLOCK.ID';
  ParamFileName     = 'BUILD.PRM';
  BeamParamFileName = 'BEAM.PRM';
  LastPartFileName  = 'PART.LST';
  BuildCommandsCount = 4;
  BuildCommands: array[1..4] of str4 = ('ZW', 'ZD', 'ZV','ZA');
  CtrlC = ^C;
  Bs    = ^H;
```

```
Tab    =  I:
Lf     =  J:
Cr     =  M:
Ctrl6 =   E:
F1     =  59:
F2     =  60:
sp80 =
DayOfWeek : String[21] =  SunMonTueWedThuFriSat ;
Del: array[1..12] of Integer =  1,4,7,2,1,4,6,2,5,0,3,5 ;
VectorRecordSize = 4096:
PowerHistoryFileName    =  C:\HISTORY\POWER.MON :
ProfileHistoryFileName =  C:\HISTORY\PROFILE.MON :
Blank =
ColMax = 22:
RowMax = 22:
LaserAddr  = $300;
NumSensors = 2;
Timeout     = $0000:

-------------------------------------------------------------------------------------

procedure [illegible]
procedure [illegible]                                      forward:

 include [illegible] files

   {$I [illegible].inc}      { miscellaneous routines }
   {$I keybrd.inc}           { keyboard routines }
   {$I graph[illegible]}     { screen graphics routines }
   {$I time.inc}             { date and time routines }
   {$I zstage.inc}           { Z-stage [illegible] routines }
   {$I lctrl.inc}            { laser control routines }
   {$I [illegible].inc}      { [illegible] command equates }
   {$I [illegible].inc}      { profile monitor routines }

-------------------------------------------------------------------------------------

 Describe Error to Operator
}
procedure PrintError(Text: String):
begin
  beep:
  if OpMode = TextOp then begin
    if whereX>1 then writeln:
    writeln('***  ',Text):
  end else begin
    MoveTo(3*8,24*14-2):
    OverText('*** ' + Text,55):
  end:
end:

function EofVectorFile: Boolean:
begin
  EofVectorFile := eof(VectorFile) and (BufIndex   VectorNumRead):
end:

procedure OpenFiles:
var
```

```
  FirstChar: Char;
label EasyLayer;
begin
  { look for either a .R or .L control file }
  if LayerCtrl then goto EasyLayer;
  assign(ControlFile,PartName+'.R');
  {$I-}
  reset(ControlFile);
  if IOresult = 0 then begin
    if eof(ControlFile) then begin
      SystemError('Error: Control File ' + PartName + '.R empty.');
      halt(6);
    end;
  end else begin
EasyLayer:
    assign(ControlFile,PartName + '.L');
    reset(ControlFile);
    if IOresult<>0 then begin
      SystemError('No Control File for part ' + PartName);
      halt(5);
    end else begin
      if eof(ControlFile) then begin
        SystemError('Error: Control File ' + PartName + '.L empty.');
        halt(7);
      end else LayerCtrl := true;
    end;
  end;
  { look for the vector file }
  assign(VectorFile,PartName + '.V');
  reset(VectorFile,1);
  if IOresult<>0 then begin
    CantOpen(PartName + '.V');
    halt(2);
  end;
  if Eof(VectorFile) then begin
    SystemError('Error: ' + PartName + '.V empty.');
    halt(4);
  end;
  {$I+}
  BlockRead(VectorFile,FirstChar,1,VectorNumRead);
  if FirstChar = #0 then VectorFileIsBinary := true
  else begin
    VectorFileIsBinary := false;
    close(VectorFile);
    reset(VectorFile,1);
  end;
end;

procedure ParseControlLineComments;
begin
  if (length(ControlLine)>0) and (copy(ControlLine,1,6)='!MERGE') then begin
    i := pos('-STARTLAYER ',ControlLine);
    if (i>0) and (StartZ=0)
      then StartZ := LongVal(copy(ControlLine,i+12,5),dummy);
    i := pos('-ENDLAYER ',ControlLine);
    if (i>0) and (EndZ=65535)
      then EndZ := LongVal(copy(ControlLine,i+10,5),dummy);
    i := pos('-NUMLAYERS ',ControlLine);
    if (i>0) and (NumLayers=65535)
      then NumLayers := LongVal(copy(ControlLine,i+11,5),dummy);
```

```
  end;
end;

procedure GetLayerControlLine;
begin
  repeat
    if eof(ControlFile) then begin
      ControlLine := '';
      SameBlock := false;
      exit;
    end;
    readln(ControlFile,ControlLine);
    ParseControlLineComments;
  until (length(ControlLine)>0) and (ControlLine[1]<>'!');
  ControlIndex := 1;
  UnitValInt(ControlLayer,ControlLine,ControlIndex);
  UnitStr(ControlType,ControlLine,ControlIndex);
  SameBlock := (VectorLayer = ControlLayer) and (VectorType = ControlType);
  writeln(SameBlock,' CLayer=',ControlLayer,' CType=',ControlType,' CLine=',Co
end;
```

CONTROLLINE

```
procedure GetRangeControlLine;
begin
  repeat
    if eof(ControlFile) then begin
      ControlLine := '';
      exit;
    end;
    readln(ControlFile,ControlLine);
    ParseControlLineComments;
  until (length(ControlLine)>0) and (ControlLine[1]<>'!');
end;

procedure ReadRange;
var
  Index,p: Integer;
  AtEnd: Boolean;
begin
  Index := 1;
  UnitValInt      (RangeZStart,    ControlLine,Index);
  UnitValInt      (RangeZEnd,      ControlLine,Index);
  UnitValShortInt(RangeZSpace,    ControlLine,Index);
  UnitValShortInt(RangeCureDepth,ControlLine,Index);
  AtEnd := false;
  BlockCount := 0;
  repeat
    GetRangeControlLine;
    if (ControlLine='') or (ControlLine[1] in ['0'..'9']) then AtEnd := true
    else begin
      inc(BlockCount);
      p := pos(',',ControlLine);
      if p=0 then p := length(ControlLine)+1;
      VectorTypes[BlockCount] := copy(ControlLine,1,p-1);
      BlockCmds [BlockCount] := NoQuotes(copy(ControlLine,p+1,255));
    end;
  until AtEnd;
end;

procedure ReSeekVectorFile;
begin
```

```
  if VectorFileLoc > FileSize(VectorFile)
    then VectorFileLoc := FileSize(VectorFile); { force eof condition }
  seek(VectorFile,VectorFileLoc);
  BlockRead(VectorFile,VectorBuf,VectorRecordSize,VectorNumRead);
  BufIndex := 1;
  BlockVectorCount := 0;
end;

function GetVectorCh: Char;
begin
  if not EofVectorFile then begin
    GetVectorCh := VectorBuf[BufIndex];
    inc(BufIndex);
    inc(VectorFileLoc);
    if BufIndex>VectorNumRead then begin
      BufIndex := 1;
      BlockRead(VectorFile,VectorBuf,VectorRecordSize,VectorNumRead);
    end;
  end;
end;

function GetVectorByte: Byte;
begin
  if not EofVectorFile then GetVectorByte := ord(GetVectorCh)
  else GetVectorByte := 0;
end;

function GetVectorWord: Word;
var
  WordValue: Word;
begin
  WordValue := GetVectorByte;
  GetVectorWord := WordValue + (GetVectorByte shl 8);
end;

function GetVectorLongInt: LongInt;
var
  LongIntValue: LongInt;
begin
  LongIntValue := GetVectorWord;
  GetVectorLongInt := LongIntValue + GetVectorWord shl 16;
end;

procedure GetVectorEntryAscii;
var
  Ch: Char;
  store: Integer;
begin
  repeat
    VectorLine := '';
    if EofVectorFile then begin
      SameBlock := false;
      exit;
    end;
    Ch := GetVectorCh;
    VectorLine[1] := Ch;
    store := 2;
    while (not EofVectorFile) and (Ch <> Cr) do begin
      Ch := GetVectorCh;
      VectorLine[store] := Ch;
```

```
      inc(store);
    end;
    VectorLine[0] := chr(store);
    { throw away line-feed }
    if not EofVectorFile then Ch := GetVectorCh;
    if VectorLine[1] in ['A'..'Z'] then begin
      BlockIndex := 1;
      UnitStr(VectorType,VectorLine,BlockIndex);
      UnitValInt(VectorLayer,VectorLine,BlockIndex);
    end;
  until (length(VectorLine) 0) and (VectorLine[1] '''');
  SameBlock := (VectorLayer = ControlLayer) and (VectorType = ControlType);
   writeln(SameBlock,  BLayer= ,VectorLayer,' BType= ,VectorType,' BLine= ,Vect
end;

procedure GetVectorEntryBinary;
begin
  if BlockVectorCount   0 then begin
    Binary[1] := GetVectorWord;
    [illegible]
    [illegible]
    [illegible]
    dec(BlockVectorCount);
  end else begin
    [illegible]
    [illegible]
    BlockVectorCount := [illegible];
  end;
  SameBlock := (VectorLayer = ControlLayer) and (VectorType = ControlType);
end;

procedure GetVectorEntry;
begin
  if VectorFileIsBinary then GetVectorEntryBinary
    else GetVectorEntryAscii;
end;

{----------------------------------------------------------------------------}

procedure BlockSkipAscii;
var
  Ch: Char;
  i,NumRead: Integer;
  Match: str10;
  SkipBuf: String;
begin
  Match := Lf+'L';
  while (VectorLayer   StartZ) and not EofVectorFile do begin
    Seek(VectorFile,VectorFileLoc);
    BlockRead(VectorFile,SkipBuf[1],255,NumRead);
    i := pos(Match,SkipBuf);
    SkipBuf[0] := chr(255);
    while (i=0) and not(eof(VectorFile) or keypressed) do begin
      inc(VectorFileLoc,NumRead);
      move(SkipBuf[236],SkipBuf[1],20);
      BlockRead(VectorFile,SkipBuf[20],235,NumRead);
      if keypressed then HandleKeyboardRequest;
      i := pos(Match,SkipBuf);
      if i>0 then dec(i,19);
    end;
```

```
    if i 0 then inc(VectorFileLoc,i)
    else VectorFileLoc := FileSize(VectorFile);
    ReSeek(VectorFile);
    GetVectorEntry;
    if keypressed then HandleKeyboardRequest;
  end;
end;

procedure BlockSkipBinary;
type
  VectorBlockEntryType = record
    Block       : Byte;
    MergeSet    : Byte;
    Layer       : Word;
    VectorCount: LongInt;
  end;
var
  NumRead: Integer;
  VectorBlockEntry: VectorBlockEntryType;
begin
  [illegible]
  while [illegible] do begin
    BlockRead(VectorFile,VectorBlockEntry,SizeOf(VectorBlockEntry),NumRead);
    if VectorBlockEntry.Layer [illegible] then begin
      [illegible] VectorFileLoc [illegible] + VectorBlockEntry.VectorCount [illegible];
      Seek(VectorFile,VectorFileLoc);
    end else [illegible] := VectorBlockEntry.Layer;
    if keypressed then HandleKeyboardRequest;
  end;
  ReSeek(VectorFile);
  GetVectorEntry;
end;

procedure BlockSkip;
begin
  if VectorFileIsBinary then BlockSkipBinary
    else BlockSkipAscii;
end;

{ -------------------------------------------------------------------------

  Send execute command to the Stereo driver
}
procedure LaserExecute;
const
  BinaryCommand: array[1..5] of Byte =
    (STEREO_EX,STEREO_CL,STEREO_EC,STEREO_EC,0);
begin
  ShowError(BinarySTEREO(@BinaryCommand));
  LaserQueueBlockSize := 0;
end;

{ -------------------------------------------------------------------------

  Send laser control command(s) to the Stereo driver
}
procedure SendLaserCommand(cmd: String);
begin
  ShowError(STEREO(cmd));
  LaserQueueBlockSize := LaserQueueBlockSize + QSize;
```

```
  if LaserQueueBlockSize  MaxLaserQueueBlockSize then LaserExecute;
end;

procedure SendBinaryLaserCommand(BufPtr: Pointer);
begin
  ShowError(BinarySTEREO(BufPtr));
  LaserQueueBlockSize := LaserQueueBlockSize + CSize;
  if LaserQueueBlockSize  MaxLaserQueueBlockSize then LaserExecute;
end;

----------------------------------------------------------------------------

  Pick Out and Execute BUILD-specific Command

procedure PickOutBuildCommand(var cmd: String);
var
  op: str4;
  k,index: Integer;
  arg: Real;
begin
  repeat
    [illegible]
    index := 1;
    while [illegible] BuildCommands[index].[illegible]
      [illegible]
    [illegible]
      k := [illegible];
      while [illegible] length(cmd) [illegible]
      [illegible]
      arg := RealVal(copy(cmd,[illegible]));
      case index of
        1: [illegible]
        2: {ZDepth} DipDepth        := arg;
        3: {ZVeloc} ZTableVeloc     := arg;
        4: {ZAccel} ZTableAccel     := arg;
      end;
      cmd := copy(cmd,k,199);
    end;
  until index  BuildCommandsCount;
end;

----------------------------------------------------------------------------

  Process both BUILD and STEREO commands

  BUILD and STEREO commands are broken apart and executed in the proper
  sequence, but by the two different programs.

procedure ProcessCommands(cmd: String);
var
  OrgCmd: String;
  i,j,BuildIndex: Integer;
begin
  cmd := upper(cmd);
  repeat
    OrgCmd := cmd;
    i := length(OrgCmd) + 1;
    for j:=1 to BuildCommandsCount do begin
      BuildIndex := pos(BuildCommands[j],OrgCmd);
      if (BuildIndex > 0) and (BuildIndex < i) then i := BuildIndex;
```

```
    end;
    cmd := copy(TmpCmd,1,i-1);
    if length(cmd)>0 then SendLaserCommand(cmd);
    cmd := copy(TmpCmd,i,255);
    if length(cmd)>0 then FileIO.BuildCommand(cmd);
  until length(cmd)=0;
end;

{------------------------------------------------------------------------------

  Find Block Type in ParVectorType array.  If there, send the corresponding
  ParStereoDef default string to Stereo.

procedure SetBlockDefaults;
begin
  i := 1;
  while (ParVectorType[i] [illegible] Type) and (i<=ParCount) do inc(i);
  if i<=ParCount then
    [illegible]
end;

[illegible]

[illegible]
  [illegible]
  [illegible]
begin
  if [illegible] then begin
    grx1 [illegible] GrDelta)* [illegible];
    grx2 := round( [illegible] Offset-GrMin) [illegible] GrDelta)* [illegible];
  end else begin
    grx1 := [illegible] GrDelta)* [illegible];
    grx2 := round( [illegible] GrDelta)* [illegible];
  end;
  if Neg [illegible] then begin
    gry1 [illegible] GrDelta)* [illegible];
    gry2 := round( [illegible] Offset-GrMin) [illegible] GrDelta)* [illegible]*14);
  end else begin
    gry1 := [illegible] Offset-GrMin) [illegible] GrDelta)* [illegible];
    gry2 := round( [illegible] Offset-GrMin) [illegible] GrDelta)* [illegible]*14);
  end;
  if SwapXY then begin
    temp := grx1;
    grx1 := gry1;
    gry1 := temp;
    temp := grx2;
    grx2 := gry2;
    gry2 := temp;
  end;
  SetViewPort(45*8+4,9*14+4,77*8+4,22*14+4,true);
  Line(grx1,gry1,grx2,gry2);
  SetViewPort(0,0,GetMaxX,GetMaxY,true);
end;

procedure SendVector(DrawMethod: Word);
type
  BinaryCommandType = array[1..11] of Byte;
const
  BinaryCommandMask: BinaryCommandType =
```

```
   (STEREO_JF,0,0,0,0,1, [illegible]
var
  wd: word;
  BinaryCommand: BinaryCommandType;
begin
  BinaryCommand := BinaryCommandMask;
  BinaryCommand[6] := DrawMethod;
  wd := trunc(x1 + XOffset);
  BinaryCommand[2] := lo(wd);
  BinaryCommand[3] := hi(wd);
  wd := trunc(y1 + YOffset);
  BinaryCommand[4] := lo(wd);
  BinaryCommand[5] := hi(wd);
  wd := trunc(x2 + XOffset);
  BinaryCommand[7] := lo(wd);
  BinaryCommand[8] := hi(wd);
  wd := trunc(y2 + YOffset);
  BinaryCommand[9]  := lo(wd);
  BinaryCommand[10] := hi(wd);
  [illegible]
  if OpMode=GraphicsOp then GraphVector;
end;


procedure [illegible];
begin
  SendVector(STEREO_[illegible]);
end;

 -------------------------------------------------------------------------------

procedure DrawSectionFlat;
begin
  if true (always) then DrawVector
  else SendVector(STEREO_F[illegible]);
  if OpMode=GraphicsOp then GraphVector;
end;

 -------------------------------------------------------------------------------

procedure DrawSkinFlat;
begin
  if true (always) then DrawVector
  else SendVector(STEREO_RV);
  if OpMode=GraphicsOp then GraphVector;
end;

 ===============================================================================

  BLOCK PROCESSING ROUTINES:                      SLICE

  LBlock:  Section Border                          V1
  XBlock:  Section X Hatching                      V1
  YBlock:  Section Y Hatching                      V1
  IBlock:  Section Angle Hatching                  V18   3/26/87
  SBlock:  Up Facing Skin Border                   V17   8/25/87
  HBlock:  Up Facing Skin X Fill                   V17
  VBlock:  Up Facing Skin Y Fill                   V17
  ABlock:  Up Facing Skin X Hatch                  V17
  BBlock:  Up Facing Skin Y Hatch                  V17
  JBlock:  Up Facing Skin Angle Hatch              V18
```

```
CBlock:  Down Facing Skin Border           V17
DBlock:  Down Facing Skin X Fill           V17
EBlock:  Down Facing Skin Y Fill           V17
FBlock:  Down Facing Skin X Hatch          V17
GBlock:  Down Facing Skin Y Hatch          V17
KBlock:  Down Facing Skin Angle Hatch      V18

-- New Mnemonic set --

BlockL     -  Layer id (no vectors)        V19    9/25/87
BlockLB    -  Layer Border                 V19
BlockLH    -  Layer Hatch                  V19
BlockFUF   -  Flat Up skin Fill            V19
BlockNFUB  -  Near-Flat Up skin Border     V19a   9/28/87
BlockNFUF  -  Near-Flat Up skin Fill       V19
BlockFDF   -  Flat Down skin Fill          V19
BlockNFDB  -  Near-Flat Down skin Border   V19
BlockNFDH  -  Near-Flat Down skin Hatch    V19
BlockNFDF  -  Near-Flat Down skin Fill     V19
[illegible]
[illegible]
------------------------------------------------------------------------

[illegible] ...BlockVector [illegible]
...
case ... of
   1: DrawVector;              {[illegible]Block}
   2: DrawSectionRivet;        {[illegible]Block}
   3: DrawSectionRivet;        {[illegible]Block}
   4: DrawSectionRivet;        {[illegible]}
   5: DrawVector;              {EBlock}
   6: DrawVector;              {[illegible]Block}
   7: DrawVector;              {[illegible]Block}
   8: DrawSkinRivet;           {[illegible]Block}
   9: DrawSkinRivet;           {[illegible]Block}
  10: DrawSkinRivet;           {[illegible]}
  11: DrawVector;              {CBlock}
  12: DrawVector;              {DBlock}
  13: DrawVector;              {EBlock}
  14: DrawSkinRivet;           {FBlock}
  15: DrawSkinRivet;           {GBlock}
  16: DrawSkinRivet;           {KBlock}
  20: ;                        {BlockL}
  21: DrawVector;              {BlockLB}
  22: DrawSectionRivet;        {BlockLH}
  23: DrawSkinRivet;           {BlockFUF}
  24: DrawVector;              {BlockNFUB}
  25: DrawSkinRivet;           {BlockNFUF}
  26: DrawSkinRivet;           {BlockFDF}
  27: DrawVector;              {BlockNFDB}
  28: DrawSkinRivet;           {BlockNFDH}
  29: DrawSkinRivet;           {BlockNFDF}
  30: DrawVector;              {BlockFUB}
  31: DrawVector;              {BlockFDB}
 end;
end;

{------------------------------------------------------------------------}
```

```
{ Break apart input line into two coordinates - x1,y1 and x2,y2 }

procedure GetCoords;
var x_1,y_1,x_2,y_2: Real;
begin
  if VectorFileIsBinary then begin
    if XYScale<>1.000 then begin
      x1 := trunc(Binary_X1 * XYScale);
      y1 := trunc(Binary_Y1 * XYScale);
      x2 := trunc(Binary_X2 * XYScale);
      y2 := trunc(Binary_Y2 * XYScale);
    end else begin
      x1 := trunc(Binary_X1);
      y1 := trunc(Binary_Y1);
      x2 := trunc(Binary_X2);
      y2 := trunc(Binary_Y2);
    end;
  end else begin [illegible]
    [illegible] := 1;
    [illegible]
    [illegible]
    [illegible]
    [illegible]
    if XYScale [illegible] then begin
      x1 := trunc(x_1 * XYScale);
      y1 := trunc(y_1 * XYScale);
      x2 := trunc(x_2 * XYScale);
      y2 := trunc(y_2 * XYScale);
    end else begin
      x1 := trunc(x_1);
      y1 := trunc(y_1);
      x2 := trunc(x_2);
      y2 := trunc(y_2);
    end;
  end;
end;


{ Process block entries until a new layer block header appears }

procedure ProcessBlockByLayer;
var
  n,ProcI,Ofs: Integer;
  Ctrl: str10;
  OrgSameBlock,BlockHadVectorsFlag: Boolean;
  OrgVectorLayer: Word;
  OrgVectorType: str10;
begin
  { will return at end of block }
  n := 2;
  while (n<=length(ControlType)) and not(ControlType[n] in ['0'..'9'])
    do inc(n);
  ProcI := 0;
  if n=2 then ProcI:=pos(ControlType[1],BlockIdentifiers);
  if ProcI=0 then begin
    Ctrl := copy(ControlType,1,n-1);
    for j:=1 to BlockMnemonicsCount do
      if Ctrl = BlockMnemonics[j] then ProcI := 19+j;    { start at 20 }
```

```
end;
if Frac1 0 then begin
  if DoMode=TextDo then write(ControlType,
  else begin
    MoveTo(28*8,17*14);
    OverText(ControlType,5);
  end;
  SetBlockDefaults;
  ProcessCommands(NoQuotes(copy(ControlLine,ControlIndex,1[illegible]));
  VPosition       := VectorFileLoc;
  OrgSameBlock    := SameBlock;
  OrgVectorLayer  := VectorLayer;
  OrgVectorType   := VectorType;
  for Ofs:=1 to NumOffsets do begin
    if Ofs 1 then begin
      VectorFileLoc := VPosition;
      ReSeekVectorFile;
    end;
    XOffset := [illegible];
    YOffset := [illegible];
    SameBlock := [illegible];
    VectorLayer := [illegible];
    VectorType := [illegible];
    BlockHadVectorFlag := [illegible];
    while Same[illegible] do begin
      GetVectorEntry;
      if [illegible] then begin
        BlockHadVectorFlag := true;
        GetCoords;
        [illegible];
      end;
    end;
    if [illegible] LaserExecute;
  end;
end else
  Message([illegible]);
end;

procedure [illegible];
var
  i,len: Integer;
begin
  len := 0;
  i := 1;
  while (FarVectorType[i]  block) and (i =FarCount) do inc(i);
  if i =FarCount then begin
    ProcessCommands(FarStereoDef[i]);
    inc(len,length(FarStereoDef[i]));
  end;
  i := 1;
  while (VectorTypes[i]  block) and (i =BlockCount) do inc(i);
  if i =BlockCount then begin
    ProcessCommands(BlockCmds[i]);
    inc(len,length(BlockCmds[i]));
  end;
  if len  0 then LaserExecute;
end;

{
  Process block entries until a new block entry appears
```

```
procedure ProcessBlockByRange;
var
  n,ProcI,Ofs: Integer;
  Ctrl: str10;
  OrgSameBlock,BlockHadVectorsFlag: Boolean;
  OrgVectorLayer: Word;
  OrgVectorType: str10;
begin
  { will return at end of vector block }
  n := 2;
  while (n<length(VectorType)) and not(VectorType[n] in ['0'..'9'])
    do inc(n);
  ProcI := 0;
  if n=2 then ProcI:=pos(VectorType[1],BlockIdentifiers);
  if ProcI=0 then begin
    Ctrl := copy(VectorType,1,n-1);
    for i:=1 to BlockMnemonicsCount do
      if Ctrl = BlockMnemonics[i] then ProcI := i+4;   { start at 2 }
  end;
  if ProcI>0 then begin
    [illegible]
    else [illegible]
      [illegible]
      [illegible]
    end;
    [illegible]
    Position := VectorFileLoc;
    ControlType := VectorType;
    OrgSameBlock := (VectorLayer = ControlLayer) and (VectorType = ControlType)
    OrgVectorLayer := VectorLayer;
    OrgVectorType := VectorType;
    for Ofs:=1 to NumOffsets do begin
      if Ofs>1 then begin
        VectorFileLoc := Position;
        ResetVectorFile;
      end;
      XOffset := Offsets[Ofs-1,1];
      YOffset := Offsets[Ofs-1,2];
      SameBlock := OrgSameBlock;
      VectorLayer := OrgVectorLayer;
      VectorType := OrgVectorType;
      BlockHadVectorsFlag := false;
      while SameBlock and not EofVectorFile do begin
        GetVectorEntry;
        if SameBlock then begin
          BlockHadVectorsFlag := true;
          GetCoords;
          HandleBlockVector(ProcI);
        end;
      end;
      if BlockHadVectorsFlag then LaserExecute;
    end;
  end else
    Message('Unexpected block type '+VectorType+' in layer '+WordStr(Layer));
end;

{-------------------------------------------------------------------------------

  Build Z-table dip routines
```

```
procedure DelayControl(DelayTime: Integer);
var
  key: Char;
  ScreenH: Integer;
  line: String;
  NewZ: Word;
begin
  ScreenH := whereX;
  DeltaSecs := 0;
  GetTime;
  SaveSec := Sec + 60*Minu + 3600*Hour;
  MoveOnFlag := false;
  SkipFlag   := false;
  if Layer  = PauseAfterLayer then begin
    PauseFlag := true;
    PauseAfterLayer := 65535;
  end else PauseFlag := false;
  while (DeltaSecs < DelayTime) and not MoveOnFlag do begin
    waitTest;
    if key pressed then begin
      key := upcase(ReadKey);
      case key of
        #0: begin
              key := ReadKey;
              if OpMode = GraphicsOp then begin
                if ord(key) = 59 then SetVisualPage(0)
                else if ord(key) = 60 then SetVisualPage(1);
              end;
            end;
        CtrlB: key := ReadKey;
        CtrlC: Abort;
         'P' : PauseFlag    := not PauseFlag;
         'C' : begin
                MoveOnFlag := true;   {force exit}
                PauseFlag  := false;
              end;
         'S' : begin
                MoveOnFlag := true;
                SkipFlag   := true;
                PauseFlag  := false;
              end;
      end;
    end;
    if DeltaSecs <> OldDeltaSecs then begin
      OldDeltaSecs := DeltaSecs;
      temp := IntStr(DelayTime-DeltaSecs);
      if PauseFlag then temp := temp + '-P'
      else temp := temp + '  ';
      if OpMode=TextOp then begin
        gotoxy(ScreenH,whereY);
        write(temp);
      end else begin
        MoveTo(73*8,7*14);
        OverText(temp,5);
      end;
    end;
  end;  {while}
  gotoxy(ScreenH,whereY);
```

```
if PauseFlag then temp := '(-P  else temp := '(     ';
if OpMode=TextOp then begin
  gotoxy(ScreenH.whereY);
  write(temp);
end else begin
  MoveTo(73*8.7*14);
  OverText(temp,5);
end;
if PauseFlag then begin   { handle pause }
  Action('PAUSED');
  if OpMode=GraphicsOp then begin
    MoveTo(3*8,24*14-2);
    OutText('Building paused.  Press any key to continue...      ');
  end;
  key := ReadKey;
  PauseFlag := false;
  if OpMode=GraphicsOp then begin
    MoveTo(3*8,24*14-2);
    OverText('',50);
  end;
end;
if OpMode=TextOp and (whereX [illegible]) then writeln;
if SkipFlag then begin     { handle layer skip }
  if OpMode=TextOp then begin
    write('Skip to what Z layer?     ');
    readln(line);
  end else begin
    MoveTo(3*8,24*14-2);
    OutText('Skip to what Z layer?  ');
    line := GetInput(8);
    MoveTo(3*7,24*14-2);
    OverText('',70);
    Action('SKIPPING');
  end;
  if length(line)>0 then begin
    NewZ := LongVal(line,code);
    if NewZ>0 then StartZ := NewZ;
  end;
end;
end;

procedure DipAndWait;
var
  clean: Boolean;
begin
  if whereX>1 then writeln;
  Action('DRAWING');
  clean := false;
  repeat
    SendLaserCommand('WI 1000');    { wait for background laser control to idle
    if keypressed then HandleKeyboardRequest
      else clean := true;
  until clean;
  ZMove('MN H+ V' + RealStr(int(ZTableVeloc*10000.0)/10000.3)
    + ' A' + RealStr(int(ZTableAccel*10000.0)/10000.3));

  if Demo then begin
    Action('SURFACING');
    FormatZCommand(-PartHeight);
    DelayControl(OutOfVatDelay);
```

```
    if SkipFlag then exit;
    FormatZCommand(PartHeight);
    delay(100);
    WaitForIdleZStage;   { wait for Z-stage to stop moving }
  end;
  Action('DIPPING');
  FormatZCommand(DipDepth);
  if Demo then FormatZCommand(-DipDepth)
  else begin
    if FirstLayer then begin
      FormatZCommand(Thickness-DipDepth);
      FirstLayer := false;
    end else if ZSpacing <> 0 then
      FormatZCommand((ControlLayer-Layer)/ZSpacing * Thickness - DipDepth);
  end;

  Action('LEVELING');
  if OpMode=GraphicsOp then begin
    [illegible]
    [illegible]
    [illegible]
    [illegible]
    [illegible]
  end else DelayControl(Relaxation[illegible]);
end;

--------------------------------------------------------------------------------

procedure HandleHeader(Line: String);
var
  Index : Integer;
begin
  Index := 1;
  while (Index < length(Line)) and (Line[Index]<>'-')
    do inc(Index);
  UnitVal([illegible],Line,Index);
  UnitVal(ZSpacing,Line,Index);
  UnitVal(Thickness,Line,Index);
end;

procedure DetermineNumLayers;
var
  i: Integer;
  range: LongInt;
begin
  i := 1;
  range := ZStart[1];
  LayersToBuild := 0;
  while (i <= RangeCount) and (range <= EndZ) do begin
    if range >= StartZ then inc(LayersToBuild);
    if ZSpace[i] <> 0 then inc(range,ZSpace[i])
      else inc(range);
    if range > ZEnd[i] then begin
      inc(i);
      range := ZStart[i];
    end;
  end;
end;

procedure DriveByLayers;
```

```
begin
  determines the next block to execute
  can skip blocks on specific levers
  handles dipping, screen updates

 while (ControlLine    ) and  (ControlLayer  = EndZ) do begin
   if ControlLayer   StartZ then begin
     BlockSkip;
     GetLayerControlLine;
    end else if ControlType= #TOP  then begin
     if DipFlag then begin
       DipAndWait;
       DipFlag := false;
     end;
     MonitorLaserBeamDrift;
     if not SkipFlag then begin
       Layer := ControlLayer;
       if OpMode=TextOp then write(Layer,' ')
       else begin
         MoveTo(14*8,17*14);
         OverText(WordStr(Layer),17);
         SetViewPort(45*8+4,7*14+4,77*8+4,22*14+4,true);
         ClearViewPort;
         SetViewPort(0,0,GetMaxX,GetMaxY,true);
         MoveTo(7*8,7*14);
         inc(LayerCount);
         if LayersToBuild < 65535 then
           OverText(WordStr(LayerCount)+' OF '+WordStr(LayersToBuild),17)
             else OverText(WordStr(LayerCount),17);
       end;
       Action('DRAWING');
       SetBlockDefaults;
       cmd := NoQuotes(copy(ControlLine,ControlIndex,199));
       if length(cmd)>0 then begin
         ProcessCommands(cmd);
         LaserExecute;
       end;
     end;
     SkipFlag := false;
     GetLayerControlLine;
   end else if ControlType= '#BTM' then begin
     SetBlockDefaults;
     cmd := NoQuotes(copy(ControlLine,ControlIndex,199));
     if length(cmd)>0 then begin
       ProcessCommands(cmd);
       LaserExecute;
     end;
     DipFlag := true;
     GetLayerControlLine;
{ will skip blocks for those *.L block entries edited out }
   end else begin
     if SameBlock then begin
       ProcessBlockByLayer;
       GetLayerControlLine;
     end else GetVectorEntry;
   end;
  end;
end;
```

```
procedure DriveByRanges;
begin
{
   utilizes range information
   can't skip blocks on specific layers
   doesn't support critical areas
   handles dipping, screen updates
}
  while (not EofVectorFile) and (VectorLayer <= EndZ) do begin
    while VectorLayer > RangeZEnd do ReadRange;
    if VectorLayer < StartZ then begin
      BlockSkip;
      DetermineNumLayers;   { adjust layer m of n values }
      inc(LayersToBuild,LayerCount);
    end else begin
      ControlLayer := VectorLayer;  { dip based on ControlLayer - Layer }
      if DipFlag then begin
        DipAndWait;
        DipFlag := false;
      end;
      MonitorLaserBeamDrift;
      if VectorLayer >= StartZ then begin
        Layer := ControlLayer;
        if OpMode=TextOp then write(Layer,' ')
        else begin
          MoveTo(14*8,13*14);
          OverText(WordStr(Layer),5);
          SetViewPort(45*8+4,9*14+4,77*8+4,22*14+4,true);
          ClearViewPort;
          SetViewPort(0,0,GetMaxX,GetMaxY,true);
          MoveTo(7*8,7*14);
          inc(LayerCount);
          if LayersToBuild < 65535 then
            OverText(WordStr(LayerCount)+' OF '+WordStr(LayersToBuild),13)
              else OverText(WordStr(LayerCount),13);
        end;
        Action('LOADING');
        ScanAndSendCommands('#TOP');
        while (ControlLayer = VectorLayer) and not EofVectorFile
          do ProcessBlockByRange;
        ScanAndSendCommands('#BTM');
        DipFlag := true;
      end;
    end;
  end;
end;

procedure PartMake;
var
  cmd: String;
begin
  assign(LastPartFile,LastPartFileName);
  {$I-}
  rewrite(LastPartFile);
  {$I+}
  if IOresult = 0 then begin
    writeln(LastPartFile,PartName);
    close(LastPartFile);
  end;
  if (NumOffsets > 1) and (OpMode = TextOp) then begin
```

```
    writeln(IntStr(NumOffsets),' multiples being made at once.');
    writeln;
  end;
  SendLaserCommand('HR;MD BL +');
  FirstLayer := true;
  repeat
    LaverCount := 0;
    SendLaserCommand('CL;EX');
    LaserQueueBlockSize := 0;

{
  read table headers
}
    if LaverCtrl then begin
      repeat
        GetLayerControlLine;
        if ControlLine[1]='*' then HandleHeader(ControlLine);
      until ControlLine[1]<>'*';
      LayersToBuild := NumLayers;
    end else begin
      RangeCount := 0;
      ControlLine := 'BEGIN';
      while ControlLine<>'' do begin  {read all ranges in}
        GetRangeControlLine;
        if ControlLine[1]='*' then HandleHeader(ControlLine);
        if ControlLine[1] in ['0'..'9'] then begin
          inc(RangeCount);
          Index := 1;
          UnitValInt(ZStart[RangeCount],ControlLine,Index);
          UnitValInt(ZEnd[RangeCount],ControlLine,Index);
          UnitValShortInt(ZSpace[RangeCount],ControlLine,Index);
          UnitValShortInt(CureDepth[RangeCount],ControlLine,Index);
        end;
      end;
      close(ControlFile);
      DetermineNumLayers;   { determine # of layers from range data }
      reset(ControlFile);
      repeat
        GetRangeControlLine;
      until (ControlLine='') or (ControlLine[1]<>'*');
      ReadRange;   { load in block data for first range }
      Laver := ZStart[1];
    end;

    BufIndex := 1;
    if VectorFileIsBinary then VectorFileLoc := 1
      else VectorFileLoc := 0;
    BlockVectorCount := 0;
    BlockRead(VectorFile,VectorBuf,VectorRecordSize,VectorNumRead);
    repeat
      GetVectorEntrv;
      if VectorLine[1]='*' then HandleHeader(VectorLine);
    until VectorLine[1]<>'*';
    Laver := -1;

{
  Update Action Screen
}
    if OpMode=GraphicsOp then begin
      MoveTo(1*8,7*14);
```

```
      if LayersToBuild<65535 then OutText('LAYER 1 OF '+WordStr(LayersToBuild))
        else OutText('LAYER 1');
      MoveTo(14*8,12*14);
      OutText(WordStr(StartZ));
      MoveTo(14*8,14*14);
      OutText(WordStr(EndZ));
    end;

    if LayerCtrl then DriveByLayers    { decide on control routine }
      else DriveByRanges;

    close(ControlFile);
    close(VectorFile);
    if Demo then OpenFiles;
  until not Demo;
end;

-----------------------------------------------------------------------------

procedure [illegible]:
[illegible]
  [illegible]
begin
  [illegible]
  i := pos('[illegible]'[illegible]   [illegible]
  [illegible]
    [illegible]
    delete(cmd,i,[illegible]);
  end;
  i := pos('/START',cmd);      [illegible]
  if i>0 then begin
    o1 := i;
    inc(i,[illegible]);
    while (i<length(cmd)) and (cmd[i]=' ') do inc(i);
    j := FindStr(i,cmd,[illegible]);
    val(copy(cmd,i,j-i),[illegible],code);
    delete(cmd,o1,j-o1);
  end;
  i := pos('/STOP',cmd);    { check for END Z-layer end }
  if i>0 then begin
    o1 := i;
    inc(i,5);
    while (i<length(cmd)) and (cmd[i]=' ') do inc(i);
    j := FindStr(i,cmd,' /');
    val(copy(cmd,i,j-i),EndZ,code);
    delete(cmd,o1,j-o1);
  end;
  i := pos('/PAUSE',cmd);    { check for /PAUSE option }
  if i>0 then begin
    o1 := i;
    inc(i,6);
    while (i<length(cmd)) and (cmd[i]=' ') do inc(i);
    j := FindStr(i,cmd,' /');
    val(copy(cmd,i,j-i),PauseAfterLayer,code);
    delete(cmd,o1,j-o1);
  end;
  i := pos('/SWAPXY',cmd);   { swap X & Y coordinates }
  if i>0 then begin
    SwapXY := true;
    delete(cmd,i,7);
```

```
end;
i := pos('/X',cmd);   { X-axis orientation }
if i>0 then begin
  NegX := (cmd[i+2]='-');
  delete(cmd,i,3);
end;
i := pos('/Y',cmd);   { Y-axis orientation }
if i>0 then begin
  NegY := (cmd[i+2]='-');
  delete(cmd,i,3);
end;
i := pos('/S',cmd);
if i>0 then begin   { check for /S Show Stuff flag }
  ShowStuff := true;
  delete(cmd,i,2);
end;
i := pos('/ZOFF',cmd);   { check for /ZOFF No Z-Control flag }
if i>0 then begin
  ZTableOff := true;
  delete(cmd,i,5);
end;
i := pos('/LOFF',cmd);   { check for /LOFF No Laser [illegible] }
if i>0 then begin
  LaserOff := true;
  delete(cmd,i,5);
end;
i := pos('/NEGZ',cmd);   { check for /NEGZ Neg-Z Stage flag }
if i>0 then begin
  NegZStage := true;
  delete(cmd,i,5);
end;
i := pos('/HEIGHT',cmd);   { check for /HEIGHT flag }
if i>0 then begin
  oi := i;
  inc(i,7);
  while (i<length(cmd)) and (cmd[i]=' ') do inc(i);
  j := FindStr(i,cmd,' /');
  val(copy(cmd,i,j-i),PartHeight,code);
  delete(cmd,oi,j-oi);
end;
i := pos('/DEMO',cmd);   { check for /DEMO flag }
if i>0 then begin
  Demo := true;
  oi := i;
  inc(i,5);
  while (i<length(cmd)) and (cmd[i]=' ') do inc(i);
  j := FindStr(i,cmd,' /');
  val(copy(cmd,i,j-i),OutOfVatDelay,code);
  delete(cmd,oi,j-oi);
end;
i := pos('/LC',cmd);   { check for Layer Control option }
if i>0 then begin
  LayerCtrl := true;
  delete(cmd,i,3);
end;
i := pos('/NODRIFT',cmd);   { check for no drift correction option }
if i>0 then begin
  NoDriftFlag := true;
  delete(cmd,i,8);
end;
```

```
end;

procedure ReadBlockIdFile;
var
  BlockIdFile: text;
  BlockIdLine: string;
  Group: Integer;
  Block: String;
begin
  BlockMnemonicsCount := 0;
  {$I-}
  assign(BlockIdFile,BlockIdFileName);
  reset(BlockIdFile);
  if IOresult<>0 then begin
    assign(BlockIdFile,HomeDirectory+BlockIdFileName);
    reset(BlockIdFile);
    if IOresult<>0 then begin
      writeln('Can''t find Block Id file.');
      halt(1);
    end;
  end;
  {$I+}
  while not eof(BlockIdFile) do begin
    readln(BlockIdFile,BlockIdLine);
    if (length(BlockIdLine)>1) and (BlockIdLine[1]<>' ') then begin
      index := 1;
      UnitValIntInt(Group,BlockIdLine,index);
      UnitStr(Block,BlockIdLine,index);
      if Group=  then begin
        inc(BlockMnemonicsCount);
        BlockMnemonics[BlockMnemonicsCount] := upper(Block);
      end;
    end;
  end;
  close(BlockIdFile);
end;

procedure GetXOffsets(line: string);
begin
  NumXOffsets := 0;
  repeat
    Offsets[NumXOffsets,1] := LongVal(line,code);
    inc(NumXOffsets);
    j := FindStr(1,line,', ');
    if (j=length(line)+1) or (line[j]=' ') then exit;
    line := copy(line,j+1,199);
  until NumXOffsets>50;
end;

procedure GetYOffsets(line: string);
begin
  NumYOffsets := 0;
  repeat
    Offsets[NumYOffsets,2] := LongVal(line,code);
    inc(NumYOffsets);
    j := FindStr(1,line,', ');
    if (j=length(line)+1) or (line[j]=' ') then exit;
    line := copy(line,j+1,199);
  until NumYOffsets>50;
end;
```

```
procedure GetXY(line: String;var Xvar,Yvar: LongInt);
begin
  Xvar := LongVal(line,code);
  Yvar := LongVal(copy(line,code+1,255),code);
end;

procedure ReadBuildParamsFile;
var
  ParamFile: text;
  count: Integer;
  cmd,ParamLine: String;
begin
  {$I-}
  assign(ParamFile,ParamFileName);
  reset(ParamFile);
  if IOresult<>0 then begin
    assign(ParamFile,'C:\3DSYS\'+ParamFileName);
    reset(ParamFile);
    if IOresult [illegible] then begin
      writeln([illegible] parameter file. [illegible]);
      halt([illegible]);
    [illegible]
  end;
  [illegible]
  count := [illegible];
  while [illegible] and (count [illegible]) do begin
    readln(ParamFile,ParamLine);
    if (length(ParamLine) [illegible]) and (ParamLine[1] [illegible]) then begin
      case count of
        [illegible]: begin
             ParamOptions := [illegible] NoQuotes(ParamLine));
             if length(ParamOptions)=0 then ParamOptions := 'NONE';
             [illegible]ForOptions(ParamLine);
           end;
        1: [illegible]ddress := IntVal(ParamLine,code);
        2: [illegible] := RealVal(ParamLine,code);
        3: [illegible] Scale := RealVal(ParamLine,code);
        4: [illegible]Offsets(ParamLine);
        5: [illegible]Offsets(ParamLine);
        6: [illegible]LaserQueueBlockSize := IntVal(ParamLine,code);
        7: GetXY(ParamLine,GrMinX,GrMinY);
        8: GetXY(ParamLine,GrMaxX,GrMaxY);
      end;
      inc(count);
    end;
  end;
  NumOffsets := NumXOffsets;
  if NumOffsets > NumYOffsets then NumOffsets := NumYOffsets;
  FarCount := 0;
  while not eof(ParamFile) do begin
    cmd := '';
    repeat
      repeat
        if eof(ParamFile) then begin
          SystemError('Error - Unexpected end of BUILD.PRM file');
          halt(4);
        end;
        readln(ParamFile,ParamLine);
        i := 1;    { clean up input, zap some white space }
```

```
        while (i<length(ParamLine)) and (ParamLine[i] in [Tab, ' ']) do inc(i);
        delete(ParamLine,1,i-1);
      until (length(ParamLine)=0) and (ParamLine[1] <> '');
      j := pos(';',ParamLine);
      if j>0 then begin
        dec(j);
        while (j>0) and (ParamLine[j] in [Tab, ' ']) do dec(j);
        delete(ParamLine,j+1,199);
      end;
      cmd := cmd + ParamLine;
    until cmd[length(cmd)] = ';';
    inc(ParCount);
    i := FindStr(1,cmd,',');
    ParVectorType[ParCount] := copy(cmd,1,i-1);
    ParStereoDef[ParCount]  := NoQuotes(copy(cmd,i+1,199));
  end;
  close(ParamFile);
end;

procedure ReadLastPart[illegible]
begin
  DefaultPartName := '';
  assign(LastPartFile,LastPartFileName);
  [illegible]
  reset(LastPartFile);
  [illegible]
  if IOres [illegible] then exit;
  readln(LastPartFile,DefaultPartName);
  DefaultPartRec := [illegible](DefaultPartName,1,[illegible]);
  close(LastPartFile);
end;

procedure ShowFiles(FileSpec: string);
var
  FileCount: Integer;
  DirInfo: SearchRec;
begin
  FileCount := 0;
  FindFirst(FileSpec,AnyFile,DirInfo);
  if DosError <> 0 then writeln(' - none - ')
  else begin
    while DosError=0 do begin
      if FileCount>0 then write(spc(11-((wherex-1) mod 10+1)));
      inc(FileCount);
      write(copy(DirInfo.Name,1,pos('.',DirInfo.Name)-1));
      FindNext(DirInfo);
    end;
    writeln;
  end;
end;

procedure GetPartFileNameText;
var
  remX: Integer;
begin
  if PartName = '' then begin
    writeln('Directory Listing of Part Files: ');
    writeln;
    ShowFiles('*.V');
    writeln;
```

```
    write('Part Name: ');
    remX := whereX;
    write(DefaultPartName);
    gotoxy(remX,whereY);
    readln(PartName);
    if PartName = '' then PartName := DefaultPartName;
  end;
  PartName := upper(PartName);
  CheckForOptions(PartName);
end;

procedure GetPartFileNameGr;
var
  name: str16;
  DirInfo: SearchRec;
  FileCount,remX: Integer;
begin
  if length(PartName)=0 then begin
    FileCount := 0;
     MoveTo(1*8,1*14);
    OutText('Parts Directory Listing:');
     FindFirst('*.?',AnyFile,DirInfo);
     MoveTo(1*8,3*14);
    if DosError [illegible] then OutText([illegible]);
    else begin
      while (DosError = 0) and (GetY < 22*14) do begin
        inc(FileCount);
        name := copy(DirInfo.Name,1,pos('.',DirInfo.Name)-1);
        name := name + spc(12-length(name));
        OutText(name);
        if GetX > 8*60 then MoveTo(1*8,GetY+14);
        FindNext(DirInfo);
      end;
      writeln;
    end;
    MoveTo(1*8,22*14);
    SetColor(2);
    OutText('Part Name: ');
    SetColor(3);
    remX := GetX;
    OutText(DefaultPartName);
    MoveTo(remX,GetY);
    PartName := upper(GetInput(50));
    if PartName = '' then PartName := DefaultPartName;
    CheckForOptions(PartName);
  end;
end;

procedure MakeTitle;
begin
  ClearViewPort;
  SetColor(3);
  DrawBorder;
  MoveTo(10,5);
  SetTextStyle(TriplexFont,HorizDir,4);
  OutText('3D Systems');
  MoveTo(13,40);
  SetTextStyle(SmallFont,HorizDir,5);
  OutText('Sylmar, California');
  MoveTo(295,9);
```

```
  SetTextStyle({SansSerifFont}TriplexFont,HorizDir,4);
  OutText('BUILD');
  SetTextStyle(DefaultFont,HorizDir,1);
  MoveTo(222,+5);
  OutText('Copyright (C) 1988');
  MoveTo(64*8,1*14+7);
  OutText('ELA-1 ');
  MoveTo(64*8,2*14+7);
  OutText('Version '+VersionId);
  SetLineStyle(SolidLn,0,ThickWidth);
  Line(0,65,639,65);
  SetLineStyle(SolidLn,0,NormWidth);
end;

procedure MakeParamScreen;
var
  i: Integer;
begin
  MakeTitle;
  Line(0,6*14+4,639,6*14+4);
  SetTextStyle(DefaultFont,HorizDir,1);
  MoveTo(1*8,7*14);
  OutText('[illegible]: '+ParamStr[illegible]);
  Line(0,8*14+4,639,8*14+4);
  MoveTo(1*8,9*14);
  OutText('[illegible]: '+[illegible]);
  MoveTo(55*8,9*14);
  OutText('# Parts: [illegible]');
  Line(0,10*14+4,639,10*14+4);
  Line(62*8-4,8*14+4,62*8-4,27*14+4);
  Line(74*8-4,8*14+4,74*8-4,27*14+4);
  Line(54*8-4,8*14+4,54*8-4,1[illegible]*14+4);
  Line([illegible],2[illegible]*14+4,62*8-4,2[illegible]*14+4);
  Line(0,27*14+4,639,27*14+4);
  MoveTo(64*8,7*14);
  OutText(WordStr(NumOffsets));
  i := 1;
  while (i [illegible]) and (i [illegible] NumOffsets) do begin
    MoveTo(62*8,(11+i)*14);
    OutText(LongStr(Offsets[i,1]));
    MoveTo(7[illegible]*8,(11+i)*14);
    OutText(LongStr(Offsets[i,2]));
    inc(i);
  end;
end;

procedure MakeActionScreen;
var
  H,V: Char;
  NegHorz,NegVert: Boolean;
begin
  MakeTitle;
  Line(0,6*14+4,639,6*14+4);
  SetTextStyle(DefaultFont,HorizDir,1);
  MoveTo(32*8,7*14);
  OutText('ACTION: ');
  SetColor(2);
  OutText('INITIALIZING');
  SetColor(3);
  Line(0,8*14+4,639,8*14+4);
```

```
MoveTo(1*8,5*14+3);
OutText('PART '+PartName);
MoveTo(64*8,5*14+3);
OutText('CONTROL: ');
if LayerCtrl then OutText('LAYER')
  else OutText('RANGE');
MoveTo(1*8,9*14);
OutText('START TIME: '+StartTimeStamp);
MoveTo(3*8,10*14);
OutText('END TIME: '+EndTimeStamp);
Line(0,11*14+4,35*8+4,11*14+4);
MoveTo(1*8,12*14);
OutText('START LAYER:');
MoveTo(4*8,13*14);
OutText('ON LAYER:');
MoveTo(3*8,14*14);
OutText('END LAYER:');
Line(0,15*14+4,35*8+4,15*14+4);
MoveTo(28*8,12*14);
OutText('BLOCK');
Line(35*8+4,8*14+4,35*8+4,15*14+4);
Line(24*8-4,11*14+4,24*8+4,15*14+4);
Rectangle(45*8+4-1,9*14+4-1,77*8+4+1,22*14+4+1);
Line(0,23*14+4,639,23*14+4);
{ draw axes orientation arrows }
NegVert := NegY;
NegHorz := NegX;
V := 'Y';
H := 'X';
if SwapXY then begin
  NegVert := NegX;
  NegHorz := NegY;
  V := 'X';
  H := 'Y';
end;
case NegVert of
  false: case NegHorz of
           false: begin
                    Line(38*8+4,10*14+4,38*8+4,12*14+4);
                    Line(38*8+4,10*14+4,42*8+4,10*14+4);
                    MoveTo(43*8,10*14);
                    OutText(H);
                    MoveTo(38*8,13*14-4);
                    OutText(V);
                  end;
           true : begin
                    Line(42*8+4,10*14+4,42*8+4,12*14+4);
                    Line(38*8+4,10*14+4,42*8+4,10*14+4);
                    MoveTo(42*8,13*14-4);
                    OutText(V);
                    MoveTo(37*8,10*14);
                    OutText(H);
                  end;
         end;
  true : case NegHorz of
           false: begin
                    Line(38*8+4,10*14+4,38*8+4,12*14+4);
                    Line(38*8+4,12*14+4,42*8+4,12*14+4);
                    MoveTo(38*8,9*14+4);
                    OutText(V);
```

```
                    MoveTo(43*8,12*14);
                    OutText(H);
                  end;
          true : begin
                    Line(42*8+4,10*14+4,42*8+4,12*14+4);
                    Line(38*8+4,12*14+4,42*8+4,12*14+4);
                    MoveTo(37*8,12*14);
                    OutText(H);
                    MoveTo(42*8,9*14+4);
                    OutText(V);
                  end;
        end;
  end;
end;


{ - - - M A I N - - - }

begin
  CheckBreak := false;
  FillChar(FirstVar,ofs(LastVar)-Ofs(FirstVar),#0);   { clear variables }
  SingleBar := many(chr(196),45);
  writeln;
  writeln(SingleBar);
  writeln('  BUILD, Stereolithography Part-Builder');
  writeln('  Version ',VersionId);
  writeln('  Copyright (C) 1988 by 3D Systems, Inc.');
  writeln('  3D Systems Laser Stereolithography System');
  writeln(SingleBar);
  writeln;
  OpMode := TextOp;

  check1 := LaserPresent;
  check2 := StereoPresent;
  if not (check1 and check2) then halt(1);
  OpMode := GraphicsOp;
  StartZ          := 0;
  EndZ            := 65535;
  NumLayers       := 65535;
  PauseAfterLayer := 65535;
  ReadBlockIdFile;
  ReadBuildParamsFile;
  ReadBeamParamsFile;
  ReadLastPartFile;
  SetupMonitoring;
  ReadCommandLine(cmd);   { process overriding command line }
  i := pos('/',cmd);
  if i=0 then i := length(cmd)+1;
  PartName := upper(copy(cmd,1,i-1));
  cmd := upper(copy(cmd,i,255));
  CheckForOptions(cmd);
  GrDeltaX := GrMaxX-GrMinX;
  if GrDeltaX < 10 then GrDeltaX := 10;
  GrDeltaY := GrMaxY-GrMinY;
  if GrDeltaY < 10 then GrDeltaY := 10;

  if OpMode=TextOp then begin
    GetPartFileNameText;
    if (NumOffsets < 1) or (PartName = '') then halt(0);
    writeln;
```

```
    OpenFiles;
    writeln('Starting part-making process...');
    GetTimeStamp;
    StartTimeStamp := CurrentDate+' '+CurrentTime;
    InitZTable;
    PartMake;
    writeln;
    SystemError('Part completed.');
    writeln;
    writeln('Start Time: ',StartTimeStamp);
    GetTimeStamp;
    writeln('  End Time: ',CurrentDate + ' ' + CurrentTime);
  end else begin
    InstallGraphics;
    BuildImage;
    MakeParamScreen;
    ShowImage;
    GetPartFileNameGr;
    if (NumOffsets < 1) or (PartName = '') then begin
      TextMode(C80);
      halt(0);
    end;
    OpenFiles;
    BuildImage;
    GetTimeStamp;
    StartTimeStamp := CurrentDate + ' ' + CurrentTime;
    MakeActionScreen;
    ShowImage;
    InitZTable;
    PartMake;
    writeln;
    GetTimeStamp;
    EndTimeStamp := CurrentDate + ' ' + CurrentTime;
    MoveTo(13*8,10*14);
    OutText(EndTimeStamp);
    Action('PART COMPLETED');
    repeat
      Ch := ReadKey;
      if (Ch = #0) and keypressed then begin
        key := ReadKey;   { don't overwrite Ch }
        if OpMode = GraphicsOp then begin
          if ord(key) = F1 then SetVisualPage(0)
          else if ord(key) = F2 then SetVisualPage(1);
        end;
      end;
    until Ch<>#0;
    CloseGraph;
  end;
  Quit;
end.
```

```
{ ==========================================================================

   StereoLithography Laser Controller Software Interrupt Interface Routines

   for 3D Systems, Inc.

   Version 2.80  by Tarnz Technologies

 ===========================================================================

   The purpose of these routines is to interface general-purpose Turbo
   Pascal programs with the memory resident laser controller software.
   The machine language-based laser controller software the routines
   below interface to can be used with other languages like Basic, C,
   and 8086 Assembly Language.

   Turbo Pascal was chosen because of its development environment and
   low source-to-executable-object code turnaround time.  As development
   progresses and there is no longer a great need for a fast development
   evironment, these routines should be adapted to C to maintain project
   software consistency.  Turbo C and Microsoft C are the leading choices
   for C languages.

   Below is a list of the routines in this include file.  Most of the
   functions relate directly to specific software interrupt calls.  The
   Code is the related interrupt's AX (AH,AL) value.  Some of the
   interrupt functions require arguments to be passed in other registers,
   and some will return results.  See the actual routines for more
   details on the interface protocol.


   Pascal Function      Code    Description
   -------------------  -----   -----------------------------------------
   __LaserOk                    see if laser software is installed
   __LaserPresent               tell if laser software not installed
   __OpenLaser          00 --   open laser DAC channel and initialize
   __CloseLaser         01 --   close laser DAC channel and restore system
                        02 xx   add command to background command queue
   __AddVector          02 00     add vector command
   __AddOpenShutter     02 01     add open shutter command
   __AddCloseShutter    02 02     add close shutter command
   __AddChangeTimebase  02 03     add change time base command
   __AddPause           02 04     add pause command
   __ResetCmdQueue      03 --   reset background command queue
   __GetCmdQueueSize    04 --   get background command queue size

                        05 xx   get option
   __GetIntNum          05 00     get software interrupt vector number
   __GetBkgndTime       05 01     get background task interval time
   __GetControlWord     05 02     get laser control word
   __AutoShutterModeOn  05 02       get status of auto shutter mode
   __PosAckModeOn       05 02       get status of position acknowledge mode
   __BlockModeOn        05 02       get status of block mode
   __GetStatus          05 03     get laser status
   __GetOpenStatus      05 03       get laser channel open status
   __GetBkgndIdleStatus 05 03       get background idle status
   __GetTurnOffDelay    05 04     get laser turn-off delay
```

```
  __GetTurnOnDelay      05 05    get laser turn-on delay
  __GetHomePosition     05 06    get laser home position

                        06 xx  set option
  __SetIntNum           06 00    set software interrupt vector number
  __SetBkgndTime        06 01    set background task interval time
  __SetControlWord      06 02    set laser control word (general)
  __SetAutoShutMode     06 02      set laser control word, bit 0
  __SetPosAckMode       06 02      set laser control word, bit 1
  __SetBlockMode        06 02      set laser control word, bit 2
                        06 03    -
  __SetTurnOffDelay     06 04    set laser turn-off delay
  __SetTurnOnDelay      06 05    set laser turn-on delay
  __SetHomePosition     06 06    set laser home position

                        07 xx  background task execution control
  __Execute             07 00    execute command queue to current point and st
  __ExecuteClear        07 01    execute command queue to current point, stop,
  __Clear               07 02    clear command queue (reset queue's start poir

                        08 xx  background task redraw control
  __SetStepPeriods      08 00  set multi-pass step periods
  __SetRedrawCount      08 01  set redraw pass count
  __SetRedrawDelay      08 02  set redraw delay
  __Mark                08 03  mark redraw start position
  __Redraw              08 04  perform multi-pass redraw


 =========================================================================== }

const
  _LASERVECTOR        =   $64;          { Interrupt vector alternative  }
                                        { values: $60 through $67.      }
  _PACKET_SIZE        =    13;          { length of vector packet       }

  _OK                 =     0;          { Errors returned by Level Zero }
  _INTERNAL_ERROR     =   255;
  _MINIMUM_TICKS      =    59;          { don't go below 50 us          }
  _LASER_QUEUE_MAX    = 60000.0;        { Laser Queue size              }

  __ALLBITS = $FFFF;
  __BITVALUE: array[0..15] of Word =
    ($0001, $0002, $0004, $0008, $0010, $0020, $0040, $0080,
     $0100, $0200, $0400, $0800, $1000, $2000, $4000, $8000);

type
  _Str16  = string[16];
  _Str255 = string[255];
  _VectorType = record
      fractX: Byte;     { start coordinates                                    }
      startX: Word;
      fractY: Byte;     { fractional portion - 1 byte, should be set to 0 }
      startY: Word;     { integer portion    - 2 bytes                         }
      deltaX: Integer;  { +/- change values in 1/256 units                     }
      deltaY: Integer;
        incr: Word;     { # of increments within vector count                  }
      end;
  _StepPeriodsType = record
      num    : Byte;
      periods: array[0..9] of Word;
```

```
    end;

var
  __IntReg: Registers;
  LaserVersion: _Str16;

{ -----------------------------------------------------------------------------

    __LaserOk function
      check to see if laser controller code has been installed.

    returns:
    false if code not installed
    true  if code is installed
    LaserVersion contains laser controller version number

  ----------------------------------------------------------------------------- }

function __LaserOk: Boolean;
  type
    CopyType  = array[1..20] of char;
  var
    CopyPtr: ^CopyType;
    CopyStr: string[20];
  begin
    with __IntReg do begin
      AX := ($35 shl 8) or _LASERVECTOR;
      Intr($21,__IntReg);
      CopyPtr := Ptr(Es,BX-19);
    end;
    move(CopyPtr^[1],CopyStr[1],18);
    CopyStr[0] := #18;
    if CopyStr = 'Tarnz Technologies' then begin
      __LaserOk := true;
      with __IntReg do
        CopyPtr := Ptr(Es,BX-46);
      move(CopyPtr^[1],LaserVersion[1],18);
      LaserVersion[0] := #4;
    end else begin
      __LaserOk := false;
      LaserVersion := '?.??';
    end;
  end;

{ -----------------------------------------------------------------------------

    __LaserPresent function
      same as LaserOk but also prints a message if laser system is not
      installed.

    returns:
    false if code not installed
    true  if code is installed

  ----------------------------------------------------------------------------- }

function __LaserPresent: Boolean;
  begin
    if __LaserOk then __LaserPresent := true
    else begin
```

```
      __LaserPresent := false;
      writeln('LASER system not installed.');
    end;
  end;

{ ---------------------------------------------------------------------------

    __OpenLaser(Ticks) function
      open up laser DAC channel with the background server interrupting
      every Ticks timer 0 ticks.  Input for timer 0 is a 1.19 MHz clock
      signal, so if Ticks = 119, the background task would activate once
      per 100 us;  with Ticks = 1190, once per ms;  etc.

    returns error code

  --------------------------------------------------------------------------- }

function __OpenLaser(ticks: Word): Integer;
  begin
{ Min Time Check bypassed -- BE CAREFUL!!! }
{    if ticks<119 then ticks := 119; }
    with __IntReg do begin
      AX := $0000;
      BX := ticks ;     (* trunc(Period*1.19 {MHz}); *)
      Intr(_LASERVECTOR,__IntReg);
      __OpenLaser := AL;
    end;
  end;

{ ---------------------------------------------------------------------------

    __CloseLaser function
      close off laser DAC channel after the background command queue
      empties.  If laser needs to be stopped immediately, __ResetVectorPool
      should be called before this routine.

    returns error code

  --------------------------------------------------------------------------- }

function __CloseLaser: Integer;
  begin
    with __IntReg do begin
      AX := $0100;
      Intr(_LASERVECTOR,__IntReg);
      __CloseLaser := AL;
    end;
  end;

{ ---------------------------------------------------------------------------

    __AddVector(startX,startY,deltaX,deltaY,incr) function
      add the vector to the background command queue.  Vector start
      coordinates are (startX,startY) and their change value is
      (deltaX,deltaY).  The number of incremental steps in the vector
      is incr.  deltaX and deltaY are in a special format (high byte
      is +/- integer portion; low byte is 1/256 units) conducive to
      high-speed DAC updating.  See the 3DPC protocol specification
      for more information.
```

```
   returns error code

  --------------------------------------------------------------------------- }

function __AddVector(startX,startY: Word;deltaX,deltaY: Integer;
                     incr: Word): Integer;
  var
    VectorPacket: _VectorType;
  begin
    if incr>0 then begin
      VectorPacket.fractX := 0;          { set up vector packet }
      VectorPacket.startX := startX;
      VectorPacket.fractY := 0;
      VectorPacket.startY := startY;
      VectorPacket.deltaX := deltaX;
      VectorPacket.deltaY := deltaY;
      VectorPacket.incr   := incr;
      with __IntReg do begin
        AX := $0200;
        ES := Seg(VectorPacket);         { point ES:BX to vector packet }
        BX := Ofs(VectorPacket);
        Intr(_LASERVECTOR,__IntReg);
        __AddVector := AL;
      end;
    end else __AddVector := 0;
  end;

{ ---------------------------------------------------------------------------

    __AddOpenShutter function
      add the open shutter command to the background command queue.  The
      shutter will be opened by the background task when it gets to this
      command in the command queue.

    returns error code

  --------------------------------------------------------------------------- }

function __AddOpenShutter: Integer;
  begin
    with __IntReg do begin
      AX := $0201;
      Intr(_LASERVECTOR,__IntReg);
      __AddOpenShutter := AL;
    end;
  end;

{ ---------------------------------------------------------------------------

    __AddCloseShutter function
      add the close shutter command to the background command queue.  The
      shutter will be closed by the background task when it gets to this
      command in the command queue.

    returns error code

  --------------------------------------------------------------------------- }

function __AddCloseShutter: Integer;
  begin
```

```
    with __IntReg do begin
      AX := $0202;
      Intr(_LASERVECTOR,__IntReg);
      __AddCloseShutter := AL;
    end;
  end;

{ -----------------------------------------------------------------------------

    __AddChangeTimebase(NewTicks) function
      add the change time base command to the background command queue.
      The timer that awakens the badckground task will be reloaded with
      the count of NewTicks by the background task when it gets to this
      command in the command queue.

    returns error code

  ----------------------------------------------------------------------------- }

function __AddChangeTimebase(NewTicks: Word): Integer;
  begin
    with __IntReg do begin
      AX := $0203;
      BX := NewTicks;
      Intr(_LASERVECTOR,__IntReg);
      __AddChangeTimebase := AL;
    end;
  end;

{ -----------------------------------------------------------------------------

    __AddPause(DelayTicks) function
      add the pause command to the background command queue.  When the
      background task gets to this command, it will pause for DelayTicks
      number of timer ticks.  If the Background Interrupt Time is 119
      (100 us), then a pause of 1 ms will ensue if DelayTicks is 10.
      Afterwards, background activity resumes.

    returns error code

  ----------------------------------------------------------------------------- }

function __AddPause(DelayTicks: Word): Integer;
  begin
    with __IntReg do begin
      AX := $0204;
      BX := DelayTicks;
      Intr(_LASERVECTOR,__IntReg);
      __AddPause := AL;
    end;
  end;

{ -----------------------------------------------------------------------------

    __ResetCmdQueue function
      clear out the background command queue.  Usually used as part of
      an abort procedure.  Best when used just before a __CloseLaser call.

    returns error code
```

```
---------------------------------------------- ------------------------------- }

function __ResetCmdQueue: Integer;
  begin
    with __IntReg do begin
      AX := $0300;
      Intr(_LASERVECTOR,__IntReg);
      __ResetCmdQueue := AL;
    end;
  end;

{ ------------------------------------------------------------------------------

    __GetCmdQueueSize function
      get the background command queue's size in actual number of bytes.
      Number of vectors is variable but can be estimated by the number
      returned by this routine / 13.

    returns error code

  ------------------------------------------------------------------------------ }

function __GetCmdQueueSize(var size: Word): Integer;
  begin
    with __IntReg do begin
      AX := $0400;
      Intr(_LASERVECTOR,__IntReg);
      size := BX;
      if size<0 then size := size + 65536;
      __GetCmdQueueSize := AL;
    end;
  end;

{ ------------------------------------------------------------------------------

    __GetIntNum(num) function
      place in num the software interrupt number.  Not really important
      unless we have a software interrupt conflict.

    returns error code

  ------------------------------------------------------------------------------ }

function __GetIntNum(var num: Word): Integer;
  begin
    with __IntReg do begin
      AX := $0500;
      Intr(_LASERVECTOR,__IntReg);
      num := BL;
      __GetIntNum := AL;
    end;
  end;

{ ------------------------------------------------------------------------------

    __GetBkgndTime(ticks) function
      place in time the background task interrupt interval time in actual
      1.19 MHz tick counts.  (119 is 100 us, 1190 is 1 ms, etc.)

    returns error code
```

```
--------------------------------------------------------------------------------

function __GetBkgndTime(var ticks: Word): Integer;
  begin
    with __IntReg do begin
      AX := $0501;
      Intr(_LASERVECTOR.__IntReg);
      ticks := BX;
      __GetBkgndTime := AL;
    end;
  end;

{ ------------------------------------------------------------------------------

    __GetControlWord(ctrl) function
      place in ctrl the Laser Control Word showing the status of various
      hardware and software mechanisms.

      word bit  description
      --------  ---------------------------------
          0     Auto-Shutter Mode
          1     Position-Acknowledge Mode
          2     Block Mode
          3     -
          0     shutter control, 0=open/1=closed

    returns error code

  ------------------------------------------------------------------------------ }

function __GetControlWord(var ctrl: Word): Integer;
  begin
    with __IntReg do begin
      AX := $0502;
      Intr(_LASERVECTOR.__IntReg);
      ctrl := BX;
      __GetControlWord := AL;
    end;
  end;

{ ------------------------------------------------------------------------------

    __AutoShutterModeOn function
      returns the status of the Auto Shutter Mode (true for on).

  ------------------------------------------------------------------------------ }

function __AutoShutterModeOn: Boolean;
  var
    Er: Integer;
    ctrl: Word;
  begin
    Er := __GetControlWord(ctrl);
    __AutoShutterModeOn := (ctrl and __BITVALUE[0]) > 0;
  end;

{ ------------------------------------------------------------------------------

    __PosAckModeOn function
```

```
returns the status of the Position Acknowledge Mode (true for on).

------------------------------------------------------------------------------ }

function __PosAckModeOn: Boolean;
  var
    Er: Integer;
    ctrl: Word;
  begin
    Er := __GetControlWord(ctrl);
    __PosAckModeOn := (ctrl and __BITVALUE[1]) > 0;
  end;

{ ------------------------------------------------------------------------------

    __BlockModeOn function
      returns the status of the Block Mode (true for on).

  ------------------------------------------------------------------------------ }

function __BlockModeOn: Boolean;
  var
    Er: Integer;
    ctrl: Word;
  begin
    Er := __GetControlWord(ctrl);
    __BlockModeOn := (ctrl and __BITVALUE[2]) > 0;
  end;

{ ------------------------------------------------------------------------------

    __GetStatus(status1,status2) function
      place in status1 and status2 the Laser system's stati of various
      non-programmable hardware and software mechanisms.

      word bit       description
      --------       ------------------------------------------------
      status1.0      laser system channel open status
      status1.1      laser system software interrupt established (sic)
      status1.2      laser system background task in idle state
      status1.3-15   -
      status2.0      bit 0 of Port C1, X and Y-axis position acknowledge
      status2.1      bit 1 of Port C1, Z-axis position acknowledge
      status2.2      bit 2 of Port C1
      status2.3      bit 3 of Port C1
      status2.4-15   -

    returns error code

  ------------------------------------------------------------------------------ }

function __GetStatus(var status1,status2: Word): Integer;
  begin
    with __IntReg do begin
      AX := $0503;
      Intr(_LASERVECTOR,__IntReg);
      status1 := BX;
      status2 := CX;
      __GetStatus := AL;
    end;
```

```
  end;

{ -------------------------------------------------------------------------

    __GetOpenStatus function
      tells whether or not the laser system communications channel has
      been opened and the timer tick trap installed.  The function returns
      a boolean value of TRUE if the channel is open.

    returns boolean value

  ------------------------------------------------------------------------- }

function __GetOpenStatus: Boolean;
  var
    Er: Integer;
    stat1,stat2: Word;
  begin
    Er := __GetStatus(stat1,stat2);
    if Er=0 then __GetOpenStatus := (stat1 and __BITVALUE[0]) > 0
      else __GetOpenStatus := false;
  end;

{ -------------------------------------------------------------------------

    __GetBkgndIdleStatus function
      tells whether or not the laser system background task is currently
      in the idle state where no more laser activity can be performed
      without some more foreground-sourced commands.  The function returns
      a boolean value of TRUE if the background task is idle.

    returns boolean value

  ------------------------------------------------------------------------- }

function __GetBkgndIdleStatus: Boolean;
  var
    Er: Integer;
    stat1,stat2: Word;
  begin
    Er := __GetStatus(stat1,stat2);
    if Er=0 then __GetBkgndIdleStatus := (stat1 and __BITVALUE[2]) > 0
      else __GetBkgndIdleStatus := false;
  end;

{ -------------------------------------------------------------------------

    __GetTurnOffDelay(ticks) function
      get the idle state's laser turn-off delay in interrupt tick counts.

    returns error code

  ------------------------------------------------------------------------- }

function __GetTurnOffDelay(var ticks: Word): Integer;
  begin
    with __IntReg do begin
      AX := $0504;
      Intr(_LASERVECTOR,__IntReg);
      ticks := BX;
```

```
    __GetTurnOffDelay := AL;
  end;
end;

{ ----------------------------------------------------------------------------

   __GetTurnOnDelay(ticks) function
     get the idle state's laser turn-on delay in interrupt tick counts.

   returns error code

  ---------------------------------------------------------------------------- }

function __GetTurnOnDelay(var ticks: Word): Integer;
 begin
   with __IntReg do begin
     AX := $0505;
     Intr(_LASERVECTOR,__IntReg);
     ticks := BX;
     __GetTurnOnDelay := AL;
   end;
 end;

{ ----------------------------------------------------------------------------

   __GetHomePosition(X,Y) function
     get the idle state's laser home position.

   returns error code

  ---------------------------------------------------------------------------- }

function __GetHomePosition(var X,Y: Word): Integer;
 begin
   with __IntReg do begin
     AX := $0506;
     Intr(_LASERVECTOR,__IntReg);
     X := BX;
     Y := CX;
     __GetHomePosition := AL;
   end;
 end;

{ ----------------------------------------------------------------------------

   __SetIntNum(num) function
     set the software interrupt number to num.  All software interrupt
     call after this point must use this new interrupt number.  The
     interrupt vector for the old number is restored.

   returns error code

  ---------------------------------------------------------------------------- }

function __SetIntNum(num: Word): Integer;
 begin
   with __IntReg do begin
     AX := $0600;
     BL := num;
```

```
    Intr(_LASERVECTOR,__IntReg);
    __SetIntNum := AL;
  end;
end;

{ ---------------------------------------------------------------------------

  __SetBkgndTime(ticks) function
    set the background task interrupt interval to ticks which has the
    actual number of 1.19 MHz tick counts.  (119 is 100 us, etc.)

  returns error code

  --------------------------------------------------------------------------- }

function __SetBkgndTime(ticks: Word): Integer;
  begin
    if ticks<_MINIMUM_TICKS then ticks := _MINIMUM_TICKS;
    with __IntReg do begin
      AX := $0601;
      BX := ticks;
      Intr(_LASERVECTOR,__IntReg);
      __SetBkgndTime := AL;
    end;
  end;

{ ---------------------------------------------------------------------------

  __SetControlWord(ctrl) function
    set the Laser Control Word to ctrl.  It is recommended that most
    software programs use the __AlterControlWordBit and the specific
    mode set routines which follow.

    word bit  description
    --------  ---------------------------------
        0     Auto-Shutter Mode
        1     Position-Acknowledge Mode
        2     Block Mode
        3     -
        4     shutter control, 0=open/1=closed

  returns error code

  --------------------------------------------------------------------------- }

function __SetControlWord(ctrl: Word): Integer;
  begin
    with __IntReg do begin
      AX := $0602;
      BX := ctrl;
      Intr(_LASERVECTOR,__IntReg);
      __SetControlWord := AL;
    end;
  end;

{ ---------------------------------------------------------------------------

  __AlterControlWordBit(op,bit) function
    alter the state of the indicated Control Word bit.  If op is 'S' or
    '+', the bit is set;  if op is 'C' or '-', the bit is cleared.
```

```
   returns error code

  --------------------------------------------------------------------------

function __AlterControlWordBit(op: Char;bit: Word): Integer;
  var
    Er: Integer;
    ctrl: Word;
  begin
    Er := __GetControlWord(ctrl);
    if Er=0 then begin
      if upcase(op) in ['S','+'] then ctrl := ctrl or __BITVALUE[bit]
        else if upcase(op) in ['C','-'] then
          ctrl := ctrl and (__ALLBITS-__BITVALUE[bit]);
      Er := __SetControlWord(ctrl);
    end;
    __AlterControlWordBit := Er;
  end;

{ --------------------------------------------------------------------------

    __SetAutoShutterMode(state) function
      set the state ('S' or '+' to set, 'C' or '-' to clear) of the
      Auto-Shutter Mode.

    returns error code

  -------------------------------------------------------------------------- }

function __SetAutoShutterMode(op: Char): Integer;
  begin
    __SetAutoShutterMode := __AlterControlWordBit(op,0);
  end;

{ --------------------------------------------------------------------------

    __SetPosAckMode(state) function
      set the state ('S' or '+' to set, 'C' or '-' to clear) of the
      Position-Acknowledge Mode.

    returns error code

  -------------------------------------------------------------------------- }

function __SetPosAckMode(op: Char): Integer;
  begin
    __SetPosAckMode := __AlterControlWordBit(op,1);
  end;

{ --------------------------------------------------------------------------

    __SetBlockMode(state) function
      set the state ('S' or '+' to set, 'C' or '-' to clear) of the
      Block Mode where the 07 commands (below) are active.

    returns error code

  -------------------------------------------------------------------------- }
```

```
function __SetBlockMode(op: Char): Integer;
  begin
    __SetBlockMode := __AlterControlWordBit(op,2);
  end;

{ -------------------------------------------------------------------------

    __SetTurnOffDelay(ticks) function
      sets the idle state's laser turn-off delay to ticks interrupt counts.

    returns error code

  ------------------------------------------------------------------------- }

function __SetTurnOffDelay(ticks: Word): Integer;
  begin
    with __IntReg do begin
      AX := $0604;
      BX := ticks;
      Intr(_LASERVECTOR,__IntReg);
      __SetTurnOffDelay := AL;
    end;
  end;

{ -------------------------------------------------------------------------

    __SetTurnOnDelay(ticks) function
      sets the idle state's laser turn-on delay to ticks interrupt counts.

    returns error code

  ------------------------------------------------------------------------- }

function __SetTurnOnDelay(ticks: Word): Integer;
  begin
    with __IntReg do begin
      AX := $0605;
      BX := ticks;
      Intr(_LASERVECTOR,__IntReg);
      __SetTurnOnDelay := AL;
    end;
  end;

{ -------------------------------------------------------------------------

    __SetHomePosition(X,Y) function
      sets the idle state's laser home position.

    returns error code

  ------------------------------------------------------------------------- }

function __SetHomePosition(X,Y: Word): Integer;
  begin
    with __IntReg do begin
      AX := $0606;
      BX := X;
      CX := Y;
      Intr(_LASERVECTOR,__IntReg);
      __SetHomePosition := AL;
```

```
    end;
  end;

{ ---------------------------------------------------------------------------

    __Execute function
      set the background task running.  The background task will process
      those commands added to the command queue from the last Clear
      Operation up to this __Execute call.   For the first __Execute,
      then background task will start at the beginning of the queue.  New
      commands can be added to the command queue while the background task
      is running.

      When the background task is finished processing the current command
      block, it will automatically shut down, placing the laser beam at
      the preset home position.

      To make programs written for earlier versions (where the background
      task free-ran) compatible, __Execute, __ExecuteClear, and __Clear
      calls (see below) should be used wherever appropriate.

    returns error code
  --------------------------------------------------------------------------- }

function __Execute: Integer;
  begin
    with __IntReg do begin
      AX := $0700;
      Intr(_LASERVECTOR,__IntReg);
      __Execute := AL;
    end;
  end;

{ ---------------------------------------------------------------------------

    __ExecuteClear function
      perform the equivalent of the __Execute function (see above) and a
      __Clear function (see below) function.  The __ExecuteClear function
      provides a convenient shorthand for:

        Er := __Execute;
        Er := __Clear;

    returns error code
  --------------------------------------------------------------------------- }

function __ExecuteClear: Integer;
  begin
    with __IntReg do begin
      AX := $0701;
      Intr(_LASERVECTOR,__IntReg);
      __ExecuteClear := AL;
    end;
  end;

{ ---------------------------------------------------------------------------

    __Clear function
```

```
    clear the command queue.  Future __Execute and __ExecuteClear calls
    will start the background task processing command queue entries
    added after the call to this routine.  An Execute Operation
    asked for immediately after a Clear Operation has no effect.

    If __Clear is not called between consecutive Execute Operations,
    then background task will reprocess the command queue entries for
    the first Execute Operation.  Sometimes this is desired, and
    sometimes it isn't.

  returns error code

 ------------------------------------------------------------------------- }

function __Clear: Integer;
  begin
    with __IntReg do begin
      AX := $0702;
      Intr(_LASERVECTOR.__IntReg);
      __Clear := AL;
    end;
  end;

{ -------------------------------------------------------------------------

  __SetStepPeriods function
    set the step periods for the multiple passes.  array contains
    number of step periods to define (1 to 10) and the step period
    values in 0.82 us (1.19 Mhz) units.

  returns error code

 ------------------------------------------------------------------------- }

function __SetStepPeriods(var sp_array: _StepPeriodsType): Integer;
  begin
    with __IntReg do begin
      AX := $0800;
      ES := Seg(sp_array);      { point ES:BX to step periods array }
      BX := Ofs(sp_array);
      Intr(_LASERVECTOR.__IntReg);
      __SetStepPeriods := AL;
    end;
  end;

{ -------------------------------------------------------------------------

  __SetRedrawCount function
    set the number of passes for the background task's redraw (1-8).

  returns error code

 ------------------------------------------------------------------------- }

function __SetRedrawCount(count: Word): Integer;
  begin
    with __IntReg do begin
      AX := $0801;
      if count<1 then count := 1
        else if count>10 then count := 10;
```

```
      BX := count;
      Intr(_LASERVECTOR,__IntReg);
      __SetRedrawCount := AL;
    end;
  end;

{ --------------------------------------------------------------------------

    __SetRedrawDelay function
      set the number of timer ticks the background task should delay
      before starting a redraw pass.

    returns error code

  -------------------------------------------------------------------------- }

function __SetRedrawDelay(delay: Word): Integer;
  begin
    with __IntReg do begin
      AX := $0802;
      BX := delay;
      Intr(_LASERVECTOR,__IntReg);
      __SetRedrawDelay := AL;
    end;
  end;

{ --------------------------------------------------------------------------

    __Mark function
      marks the current position as the start of the next redraw.
      Usually only necessary at the beginning of a block.

    returns error code

  -------------------------------------------------------------------------- }

function __Mark: Integer;
  begin
    with __IntReg do begin
      AX := $0803;
      Intr(_LASERVECTOR,__IntReg);
      __Mark := AL;
    end;
  end;

{ --------------------------------------------------------------------------

    __Redraw function
      causes the background task to perform a multi-pass redraw
      operation when it is encountered in the Background Command
      Queue.  __Redraw also marks so as to minimize use of commands.

    returns error code

  -------------------------------------------------------------------------- }

function __Redraw: Integer;
  begin
    with __IntReg do begin
      AX := $0804;
```

```
    Intr(_LASERVECTOR,__IntReg);
    __Redraw := AL;
  end;
end;

{ end of LASER.INC }
```

```
{-----------------------------------------------------------------------------

                         Laser Controller Routines

-----------------------------------------------------------------------------}

{
  Check for Memory-Resident Laser Controller System
}
function LaserOk: Boolean;
  type
    CopyType  = array[1..20] of char;
  var
    CopyPtr: ^CopyType;
    CopyStr: string[20];
  begin
    with regs do begin
      AX := ($35 shl 8) or LASERVECTOR;
      Intr($21,regs);
      CopyPtr := Ptr(ES,BX-19);
    end;
    move(CopyPtr^[1],CopyStr[1],18);
    CopyStr[0] := #18;
    if CopyStr = 'Tarnz Technologies' then begin
      LaserOk := true;
      with regs do
        CopyPtr := Ptr(ES,BX-46);
      move(CopyPtr^[1],LaserVersion[1],4);
      LaserVersion[0] := #4;
    end else begin
      LaserOk := false;
      LaserVersion := '?.??';
    end;
  end;

function LaserPresent: Boolean;
  begin
    if LaserOk then LaserPresent := true
    else begin
      LaserPresent := false;
      SystemError('LASER system not installed.');
    end;
  end;

{
  Check for Memory-Resident STEREO Stereolithography Device Driver
}
function StereoOk: Boolean;
  type
    CopyType  = array[1..20] of char;
  var
    CopyPtr: ^CopyType;
    CopyStr: string[20];
  begin
    with regs do begin
      AX := ($35 shl 8) or STEREOVECTOR;
      Intr($21,regs);
```

```
      CopyPtr := Ptr(ES,57);
    end;
    move(CopyPtr^[1],CopyStr[1],18);
    CopyStr[0] := #18;
    if CopyStr = 'Tarnz Technologies' then begin
      StereoOk := true;
      with regs do
        CopyPtr := Ptr(ES,30);
      move(CopyPtr^[1],StereoVersion[1],4);
      StereoVersion[0] := #4;
    end else begin
      StereoOk := false;
      StereoVersion := '?.??';
    end;
  end;

function StereoPresent: Boolean;
  begin
    if StereoOk then StereoPresent := true
    else begin
      StereoPresent := false;
      SystemError('STEREO driver not installed.');
    end;
  end;

procedure ShowError(Error: Integer);
begin
  case Error of
    0: ;
    1: PrintError('1. Laser interface card not found');
    2: PrintError('2. Laser channel not open');
    3: PrintError('3. Background Command Queue full timeout');
    4: PrintError('4. Invalid interrupt time');
    5: PrintError('5. Not in block mode');
    6: PrintError('6. Exec Queue limit timeout');
    7: PrintError('127. Bad SIH command parameter');
    8: PrintError('128. Unrecognized STEREO command');
    255: PrintError('255. Internal error (please report)');
  else PrintError(IntStr(Error)+'. Unrecognized SIH error');
  end;
end;

{ - - - - - - - - - - - - - - - - - - - - - - - - - - - - - - - - - - - -

          Pass Command on to Memory Resident STEREO Device Driver

  - - - - - - - - - - - - - - - - - - - - - - - - - - - - - - - - - - - - }

function STEREO(LaserCommand: String): Integer;
begin
  STEREO := 0;
  if length(LaserCommand)>0 then begin
    if ShowStuff then begin
      if whereX>1 then writeln;
      writeln('   Laser>',LaserCommand);
    end;
    if not LaserOff then begin
      if LaserCommand[1]<>'!' then with regs do begin
        LaserCommand := LaserCommand + chr(0);
        AX := $00;    { ASCII text format }
```

```
        BX := Ofs(LaserCommand)+1;    { pass pointer to string }
        ES := Seg(LaserCommand);
        Intr(STEREOVECTOR,regs);
        STEREO := AX and $FF;
        QSize := CX;
      end;
    end;
  end;
  if keypressed then HandleKeyboardRequest;
end;

function BinarySTEREO(CommandBuffer: Pointer): Integer;
var
  BufSeg,BufOfs: Word;
begin
  BinarySTEREO := 0;
  BufSeg := seg(CommandBuffer^);
  BufOfs := ofs(CommandBuffer^);
  if Mem[BufSeg:BufOfs] <> 0 then begin
    if ShowStuff then begin
      if WhereX>1 then writeln;
      write('Binary Laser: ');
      for i:=0 to 11 do write(HexByte(Mem[BufSeg:BufOfs+i]),' ');
      writeln;
    end;
    if not LaserOff then begin
      with regs do begin
        AX := $01;    { binary format }
        BX := BufOfs;    { pass pointer to binary command }
        ES := BufSeg;
        Intr(STEREOVECTOR,regs);
        BinarySTEREO := AX and $FF;
        QSize := CX;
      end;
    end;
  end;
  if keypressed then HandleKeyboardRequest;
end;
```

```
{------------------------------------------------------------------------------

                        General Graphics Routines

------------------------------------------------------------------------------}

procedure DrawBorder;
{ Draw a border around the current view port }
begin
  SetLineStyle(SolidLn,0,ThickWidth);
  GetViewSettings(ViewPort);
  with ViewPort do
    Rectangle(0, 0, x2-x1, y2-y1);
end;

procedure BuildImage;
begin
  OnScreen := 1-OnScreen;
  SetActivePage(OnScreen);
end;

procedure OverText(Text: String; len: Integer);
var
  x,y,color: Integer;
begin
  x := GetX;
  y := GetY;
  color := GetColor;
  SetFillStyle(EmptyFill,0);
  Bar(x,y,x + len * TextWidth('A'),y + TextHeight(Text) + 1);
  SetColor(color);
  OutTextXY(x,y,Text);
end;

procedure ShowImage;
begin
  SetVisualPage(OnScreen);
end;

function GetInput(maxlen: Integer): String;
var
  key: Char;
  temp: String;
  First: Boolean;
  baseX,baseY,index: Integer;
begin
  temp := '';
  index := 0;
  baseX := getX;
  baseY := getY;
  key := chr(0);
  SetVisualPage(OnScreen);
  First := true;
  while key <> Cr do begin
    MoveTo(baseX+index*8,baseY);
    SetColor(2);
    if not First then OverText('_',51-index)    { show cursor }
    else begin
      OutText('_');
```

```
      First := false;
    end;
    SetColor(3);
    key := ReadKey;
    if key = #0 then begin
      if keypressed then key := ReadKey;
      key := #0;
    end;
    if key = CtrlC then Abort;
    MoveTo(baseX+index*8,baseY);
    if key in [Bs,Cr,' '..'~'] then begin
      if key = Bs then begin
        if index > 0 then dec(index);
      end else if key in[' '..'~'] then begin
        OverText(key,1);
        if index < maxlen then inc(index);
        temp[index] := key;
      end;
    end;
  end;
  MoveTo(baseX+index*8,baseY);
  SetColor(0);
  OutText('_');    { turn off cursor }
  SetColor(3);
  temp[0] := chr(index);
  GetInput := temp;
  SetColor(3);
end;

procedure GrAbort(Msg: string);
begin
  writeln(Msg,':  ',GraphErrorMsg(GraphResult));
  halt(1);
end;

procedure InstallGraphics;
begin
  { Register all the drivers }
  if RegisterBGIdriver(@CGADriverProc) < 0 then
    GrAbort('CGA');
  if RegisterBGIdriver(@EGAVGADriverProc) < 0 then
    GrAbort('EGA/VGA');

  { Register all the fonts }
  if RegisterBGIfont(@SansSerifFontProc) < 0 then
    GrAbort('SansSerif');
  if RegisterBGIfont(@SmallFontProc) < 0 then
    GrAbort('Small');
  if RegisterBGIfont(@TriplexFontProc) < 0 then
    GrAbort('Triplex');

  GraphDriver := Detect;                     { autodetect the hardware }
  InitGraph(GraphDriver,GraphMode,'');       { activate graphics }
  if GraphResult<>grOk then                  { any errors? }
  begin
    Writeln('Graphics init error: ', GraphErrorMsg(GraphDriver));
    Halt(1);
  end;
  SetVisualPage(1);
  ClearDevice;
```

```
  OnScreen := 1;  { start with Screen 0 }
end;

{
  Print action information
}
procedure Action(Text: String);
var
  i: Integer;
begin
  if OpMode=TextOp then write(Text,' ')
  else begin
    MoveTo(40*8,7*14);
    SetColor(2);
    OverText(Text,20);
    SetColor(3);
  end;
end;

procedure Message(Text: String);
begin
  MoveTo(3*8,24*14-2);
  OverText(Text,length(Text)+5);
end;
```

```
{-----------------------------------------------------------------------------

                              Keyboard Routines

-----------------------------------------------------------------------------}

procedure Abort;
var
  key: Char;
begin
  if OpMode=GraphicsOp then TextMode(C80);
  while keypressed do key := ReadKey;
  halt(127);
end;

function STEREO(LaserCommand: String): Integer; forward;
procedure ShowError(Error: Integer);            forward;

procedure Quit;
var
  key: Char;
begin
  ShowError(STEREO('SP 100;EC;EC'));
  if OpMode=GraphicsOp then TextMode(C80);
  halt(0);
end;

procedure HandleKeyboardRequest;
var
  key: Char;
begin
  while keypressed do begin
    key := ReadKey;
    if key = CtrlS then key := ReadKey;
    if key = CtrlC then Abort;
    if (key = #0) and keypressed then begin
      key := ReadKey;
      if OpMode = GraphicsOp then begin
        if ord(key) = F1 then SetVisualPage(0)
        else if ord(key) = F2 then SetVisualPage(1);
      end;
    end;
  end;
end;
```

```
{------------------------------------------------------------------------------

                          Time/Date Routines

------------------------------------------------------------------------------}

{
  Pad time element with left space if necessary
}
function PadSp(num: Integer): str10;
var
  temp: str10;
begin
  temp := IntStr(num);
  if num<10 then PadSp := ' ' + temp
    else PadSp := temp;
end;

{
  Pad time element with left zero if necessary
}
function LZero(num: Integer): str10;
var
  temp: str10;
begin
  temp := IntStr(num);
  if num<10 then LZero := '0' + temp
    else LZero := temp;
end;

{
  Compute day-of-week using Harry's modified Zeller Algorithm
}
function Zeller(month,day,year: Integer): Integer;
begin
  if month<3 then dec(year);
  Zeller := (Zel[month] + day + year + (year shr 2)) mod 7;
end;

{
  Read time directly from clock chip
  works only on ATs, 286s, 386s; does not work on standard PCs, XTs
}
procedure GetTime;
var
  good: Boolean;
begin
  good := false;
  while not good do begin
    port[$70] := $0A;     { wait for update to finish (then there's 244 us) }
    if (port[$71] and $80)=0 then begin
      port[$70] := $00;     { get seconds }
      Sec := port[$71];
      port[$70] := $0A;
      if (port[$71] and $80)=0 then begin
        port[$70] := $02;    { get minutes }
        Minu := port[$71];
```

```
        port[$70] := $0A;
        if (port[$71] and $80)=0 then begin
          port[$70] := $04;     { get hours }
          Hour := port[$71];
          port[$70] := $0A;
          if (port[$71] and $80)=0 then begin
            port[$70] := $07;     { get day }
            Day := port[$71];
            port[$70] := $0A;
            if (port[$71] and $80)=0 then begin
              port[$70] := $08;     { get month }
              Mon := port[$71];
              port[$70] := $0A;
              if (port[$71] and $80)=0 then begin
                port[$70] := $09;     { get year }
                Year := port[$71];
                port[$70] := $0A;
                if (port[$71] and $80)=0 then good := true;
              end;
            end;
          end;
        end;
      end;
    end;
  end;
  Sec  := (Sec  shr 4) * 10 + (Sec  and $0F);  { convert from BCD }
  Minu := (Minu shr 4) * 10 + (Minu and $0F);
  Hour := (Hour shr 4) * 10 + (Hour and $0F);
  Day  := (Day  shr 4) * 10 + (Day  and $0F);
  Mon  := (Mon  shr 4) * 10 + (Mon  and $0F);
  Year := (Year shr 4) * 10 + (Year and $0F);
  WeekDay := Zeller(Mon,Day,Year);
end;

{
  Get a time stamp consisting of the relative day and the current time
}
procedure GetTimeStamp;
var
  tdow,tday,tmon,tyear,tsec,tminu,thour: str10;
  AmPm: Char;
begin
  GetTime;
  tmon  := PadSp(Mon);
  tday  := LZero(Day);
  tyear := LZero(Year);
  tdow  := copy(DayOfWeek,Zeller(Mon,Day,Year)*3+1,3);
  CurrentDate := tdow+'  '+tmon+'/'+tday+'/'+tyear;
  tsec  := LZero(Sec);
  tminu := LZero(Minu);
  if Hour=0 then begin
    thour := '12';
    AmPm := 'A';
  end else if Hour<12 then begin
    thour := PadSp(Hour);
    AmPm := 'A';
  end else if Hour=12 then begin
    thour := '12';
    AmPm := 'P';
  end else begin
```

```
    thour := PadSp(Hour-12);
    AmPm := 'P'
  end;
  CurrentTime := thour+': '+tminu+' '+AmPm+'M';
end;

{
  Compute difference in seconds for a calling wait routine
}
procedure WaitTest;
begin
  GetTime;
  NewSec := Sec + 60*Minu + 3600*Hour;
  DeltaSecs := NewSec - SaveSec;
  if DeltaSecs < 0 then DeltaSecs := DeltaSecs + 86400;
end;
```

```
{------------------------------------------------------------------------------

                              Utility Routines

------------------------------------------------------------------------------}

procedure beep;
begin
  Sound(1000);
  delay(300);
  NoSound;
end;

function sgn(num: Real): Real;
begin
  if num<0 then sgn := -1
  else if num>0 then sgn := 1
  else sgn := 0;
end;

function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
var
  temp: string;
  i: Integer;
begin
  temp := '';
  for i:=1 to num do temp  := temp+Ch;
  many := temp;
end;

function min(int1,int2: Integer): Integer;
begin
  if int1<int2 then min := int1
    else min := int2;
end;

function max(int1,int2: Integer): Integer;
begin
  if int1>int2 then max := int1
    else max := int2;
end;

function IntStr(num: Integer): str16;
var
  temp: str16;
begin
  if num>=0 then Str(num,temp) else Str(num+$8000,temp);
  IntStr := temp;
end;
```

```
function WordStr(num: Word): str16;
var
  temp: str16;
begin
  Str(num,temp);
  WordStr := temp;
end;

function LongStr(num: LongInt): str16;
var
  temp: str16;
begin
  Str(num,temp);
  LongStr := temp;
end;

function RealStr(num: Real;AfterDecimal: Integer): str80;
var
  i: Integer;
  temp: str80;
begin
  Str(num:10:AfterDecimal,temp);
  i := 1;
  while (i<length(temp)) and (temp[i]=' ') do inc(i);
  RealStr := copy(temp,i,99);
end;

function spc(len: Integer): string;
begin
  spc := copy(sp80+sp80,1,len);
end;

{
  convert number to hex byte string
}
function HexByte(num: Byte): str4;
const
  HexChars: str16 = '0123456789ABCDEF';
begin
  HexByte := HexChars[num shr 4 + 1] + HexChars[num and $0F + 1];
end;

{
  read the DOS command line
}
procedure ReadCommandLine(var line: string);
var
  i: Integer;
begin
  line := ParamStr(1);
  for i:=2 to ParamCount do
    line := line + ' ' + ParamStr(i);
end;

{
  Remove excess quote marks around string
}
function NoQuotes(Text: str80): str80;
const
```

```
  Quote = '"';
var
  s,e: Integer;
begin
  s := 1;
  if (length(Text)>1) and (Text[1]=Quote) then inc(s);
  e := length(Text);
  if Text[e]=Quote then dec(e);
  NoQuotes := copy(Text,s,e-s+1);
end;

{
  Removes all double spaces in text string
}
procedure RemoveDoubleSpaces(var text: string);
begin
  while pos('  ',text)>0 do
    delete(text,pos('  ',text),1);
end;

{
  Find any char of Chars in Main starting at index Start
  Returns length(Main)+1 if no character of Chars in Main
}
function FindStr(Start: Integer;Main: string;Chars: str10): Integer;
var
  i,j,min: Integer;
  temp: String;
begin
  min := length(Main)+1;
  temp := copy(Main,Start,199);
  for i:=1 to length(Chars) do begin
    j := Start + pos(Chars[i],temp) - 1;
    if (j >= Start) and (j < min) then min := j;
  end;
  FindStr := min;
end;

{
  better val routines
}
function IntVal(line: String;var code: Integer): Integer;
var
  code2: Integer;
  num: Integer;
begin
  val(line,num,code);
  if code<>0 then val(copy(line,1,code-1),num,code2);
  IntVal := num;
end;

function WordVal(line: String;var code: Integer): Word;
var
  code2: Integer;
  num: Word;
begin
  val(line,num,code);
  if code<>0 then val(copy(line,1,code-1),num,code2);
  WordVal := num;
end;
```

```
function LongVal(line: String;var code: Integer): LongInt;
var
  code2: Integer;
  num: LongInt;
begin
  val(line,num,code);
  if code<>0 then val(copy(line,1,code-1),num,code2);
  LongVal := num;
end;

function RealVal(line: String;var code: Integer): Real;
var
  code2: Integer;
  num: Real;
begin
  if line[1]='.' then line := '0' + line;
  val(line,num,code);
  if code<>0 then val(copy(line,1,code-1),num,code2);
  RealVal := num;
end;

{
  Pick out a number from a string
  starting at Index and going to the next space or comma or end-of-string
}
procedure UnitValShortInt(var Storage: Integer;Text: String;var Index: Integer)
var
  i: Integer;
begin
  Storage := IntVal(copy(Text,Index,99),i);
  if i=0 then Index := length(Text)+1
    else Index := Index + i;
end;

procedure UnitValInt(var Storage: LongInt;Text: String;var Index: Integer);
var
  i: Integer;
begin
  Storage := LongVal(copy(Text,Index,99),i);
  if i=0 then Index := length(Text)+1
    else Index := Index + i;
end;

procedure UnitVal(var Storage: Real;Text: String;var Index: Integer);
var
  i: Integer;
begin
  Storage := RealVal(copy(Text,Index,99),i);
  if i=0 then Index := length(Text)+1
    else Index := Index + i;
end;

{
  Pick out text from a string
  starting at Index and going to the next comma or end-of-string
}
procedure UnitStr(var Storage,Text: String;var Index: Integer);
var
  i: Integer;
```

```
begin
  i := FindStr(Index,Text,',');
  Storage := copy(Text,Index,i-Index);
  Index := i + 1;
end;

{
  Show error and store it on disk
}
procedure SystemError(Text: string);
begin
  if OpMode = TextOp then writeln(Text)
    else begin
      MoveTo(3*8,24*14-2);
      OverText(Text,50);
      Ch := ReadKey;
      TextMode(C80);
    end;
  assign(ErrorFile,ErrorFileName);
  rewrite(ErrorFile);
  writeln(ErrorFile,'SUPER: ',Text);
  close(ErrorFile);
end;

{
  Can't open file.  Report this to operator.
}
procedure CantOpen(FileName: string);
begin
  SystemError('Can''t open file '+FileName);
end;

{
  IEEE / Turbo Pascal floating point number conversions
}
procedure ConvertRtoS(r,s: FpPointerType);
  { Converts a Real type (6 byte) number to a Single (4 byte) }
var
  e: Byte;
begin
  e:=r^[0];
  if e<>0 then Dec(e,2);
  s^[3]:=(r^[5] and $80) or ((e shr 1) and $7F);
  s^[2]:=((e shl 7) or (r^[5] and $7F)) and $FF;
  s^[1]:=r^[4];
  s^[0]:=r^[3];
end;

procedure ConvertStoR(s,r: FpPointerType);
  { Converts a Single type (4 byte) number to a Real (6 byte) }
begin
  r^[0]:=(((s^[3] shl 8) + s^[2]) shr 7) and $FF;
  r^[1]:=0;
  r^[2]:=0;
  r^[3]:=s^[0];
  r^[4]:=s^[1];
  r^[5]:=(s^[3] and $80) or (s^[2] and $7F);
  if r^[0]<>0 then Inc(r^[0],2); { e offset }
end;
```

```
{-----------------------------------------------------------------------------

                     Z-Stage Elevator Routines

-----------------------------------------------------------------------------}

procedure InitZTable;
begin
  port[ZAddress+1] := $64;
  port[ZAddress+1] := $60;
  delay(100);
  port[ZAddress+1] := $40;
  port[ZAddress+1] := $60;
  delay(100);
end;

procedure ZTable(Ch: Char);
var
  b: Integer;
begin
  repeat
    b := port[ZAddress+1];
  until (b and $10)<>0;
  port[ZAddress] := ord(Ch);
  port[ZAddress+1] := $70;
  repeat
    b:=port[ZAddress+1];
  until (b and $10)=0;
  port[ZAddress+1] := $60;
end;

{
  Send command to Z-axis stepper controller
}
procedure ZMove(Cmd: string);
begin
  if ShowStuff then begin
    if whereX>1 then writeln;
    writeln('    ZTable>',Cmd);
  end;
  if not ZTableOff then begin
    Cmd := Cmd + Cr;
    for i:=1 to length(Cmd) do ZTable(Cmd[i]);
  end;
end;

procedure FormatZCommand(Distance: Real);
begin
  Distance := sgn(Distance) * int(abs(Distance) * ZPitch * 1000 / 25.4);
  if NegZStage then Distance := -Distance;
  ZMove('D'+RealStr(Distance,0)+' G');
end;

procedure WaitForIdleZStage;
var
  b: Word;
begin
```

```
  repeat
    b := port[ZAddress+1];
  until keypressed or (b and 2>0);
end;
```

```
'CALOUT.BAS        3/28/88
ver$ = "ver 3.00"
'to convert sensor readings to calibration table
'specifies directory for STEREO.GEO, accepts .CAL input

'readings are every 889 bits = 0.2500"
'nearest above 65536 = 74 x 889  =  65786  =  65535 + 251
'therefore our table goes from 0 to 74
RangeError = 0
tlo%=0
thi%=74
DIM x3#(tlo%:thi%,tlo%:thi%),y3#(tlo%:thi%,tlo%:thi%)  'X & Y calibration table
DIM x1#(tlo%:thi%+1),y1#(tlo%:thi%+1),x2#(tlo%:thi%+1),y2#(tlo%:thi%+1) 'sensor

CLS
?
?"  CALOUT ";ver$
?
reread:

INPUT "Exact name of calibration file to be adjusted ";nm$
InputFile$= nm$                             '#1 - rename when saving
i%= INSTR(1,nm$,".")
IF i%>0 THEN nm$=LEFT$(nm$,i%-1)
OutputFile$=nm$+".GEO"                      '#2
DriftFile$= nm$+".DRF"                      '#2

'nearest to center is 37 x 889 = 32893  =  32767 + 126  (.0354")
'and our readings (-6" to + 6") are from array locations 13 to 61
'(NOTE X Axis is reversed: this was corrected by reading X from 6 to -6)

clo%=13
chi%=61
inc#=889

CLS
KEY OFF
LOCATE 5,1,1
?"Program to convert data from Beam Profiler Calibration Run"
?
INPUT "Customer Name and/or SLA-1 Serial # ",nm$
?
INPUT "DX Serial # ",dx$
?
INPUT "Date of Calibration ",dt$

CLS
LOCATE 5,1,0
?"Filling Uncorrected Table"  '-----------------------------------------------
FOR i% = tlo% TO thi%
   x3#=inc#*i%
   IF x3#<5 THEN x3#=5
   IF x3#>65530 THEN x3#=65530
   FOR j% = tlo% TO thi%
      x3#(i%,j%)=x3#
   NEXT j%
NEXT i%
FOR j% = tlo% TO thi%
```

```
    y3#=inc#*j%
    IF y3#<5 THEN y3#=5
    IF y3#>65530 THEN y3#=65530
    FOR i% = tlo% TO thi%
       y3#(i%,j%)=y3#
    NEXT i%
NEXT j%


Reading:
CLS
LOCATE 5,1,0
?"Reading Measured Values" '--------------------------------------------
' may later have text in .CAL file which should be saved

SUB ReadLine(x3#,y3#)     'later use temperature to check for drift
     LOCAL a$, i%
    ReadLine:
     LINE INPUT #1,a$
     IF LEFT$(a$,1)="!" THEN ReadLine
     i%=INSTR(a$,",")                      'find first comma
     x3#=VAL(LEFT$(a$,i%))                 'pick up x value
     a$=RIGHT$(a$,LEN(a$)-i%)              'remove used portion of a$
     i%=INSTR(a$,",")                      'get next comma
     y3#=VAL(LEFT$(a$,i%))                 'pickup up y value
END SUB

SUB ReadFour(x3#,y3#,x4#,y4#)
     LOCAL a$, i%
   ReadBack:
     LINE INPUT #1,a$
     IF LEFT$(a$,1)="!" THEN ReadBack

     i%=INSTR(a$,",")                      'find first comma
     x3#=VAL(LEFT$(a$,i%))                 'pick up x value

     a$=RIGHT$(a$,LEN(a$)-i%)              'remove used portion of a$
     i%=INSTR(a$,",")                      'get next comma
     y3#=VAL(LEFT$(a$,i%))                 'pickup up y value

     a$=RIGHT$(a$,LEN(a$)-i%)              'remove used portion of a$
     i%=INSTR(a$,",")                      'find next comma
     x4#=VAL(LEFT$(a$,i%))                 'pick up x value

     a$=RIGHT$(a$,LEN(a$)-i%)              'remove used portion of a$
     i%=INSTR(a$,",")                      'get next comma
     y4#=VAL(LEFT$(a$,i%))                 'pickup up y value

END SUB

OPEN INPUTFILE$ FOR INPUT AS #1

'Should save the 32767,32767 readings at beginning & end
'to check for relative movement, or uncompensated drift.

FOR i% = clo% TO chi%
   CALL ReadFour(x1#(i%),y1#(i%),x2#(i%),y2#(i%))
   FOR j% = clo% TO chi%
      CALL ReadLine(x3#(i%,j%),y3#(i%,j%))
      IF x3#(i%,j%)<10000 OR x3#(i%,j%)>55000 THEN
```

```
         PRINT "WARNING X Value Out of Range. X = ", x3#(i%,j%)
         RangeError = -1
       END IF
       IF y3#(i%,j%)<10000 OR y3#(i%,j%)>55000 THEN
         PRINT "WARNING Y Value Out of Range. Y = ", x3#(i%,j%)
         RangeError = -1
       END IF
   NEXT j%
NEXT I%
i%=chi%+1                              'just in case BASIC changes
CALL ReadFour(x1#(i%),y1#(i%),x2#(i%),y2#(i%))
                                        ' may add 32767,32767 at beginning & end
CLOSE #1

IF RangeError <> 0 Then
  PRINT "Pres Enter to Continue...";
  Input Temp$
END IF
CLS
LOCATE 5,1,0
?"Finding Mirror Drift"  '-----------------------------------------------------

   ***  NOTE we have re-grouped x1,x2 y1,y2 here, we read in x1,y1 x2,y2

FOR I%=clo% TO chi%+1
   x1tot#=x1tot#+x1#(i%)/(chi%+1-clo%+1)     'could use arrays, but much easier t
   x2tot#=x2tot#+x2#(i%)/(chi%+1-clo%+1)
   y1tot#=y1tot#+y1#(i%)/(chi%+1-clo%+1)
   y2tot#=y2tot#+y2#(i%)/(chi%+1-clo%+1)
NEXT I%

FOR I%=clo% TO chi%+1
   xd#=x1tot#-x1#(i%)
    if xdmax#<xd# then xdmax#=xd#
    if xdmin#>xd# then xdmin#=xd#
    x1dev#=x1dev#+xd#*xd#/(chi%+1-clo%+1)
   xd#=x2tot#-x2#(i%)
    if xdmax#<xd# then xdmax#=xd#
    if xdmin#>xd# then xdmin#=xd#
    x2dev#=x2dev#+xd#*xd#/(chi%+1-clo%+1)
   yd#=y1tot#-y1#(i%)
    if ydmax#<yd# then ydmax#=yd#
    if ydmin#>yd# then ydmin#=yd#
    y1dev#=y1dev#+yd#*yd#/(chi%+1-clo%+1)
   yd#=y2tot#-y2#(i%)
    if ydmax#<yd# then ydmax#=yd#
    if ydmin#>yd# then ydmin#=yd#
    y2dev#=y2dev#+yd#*yd#/(chi%+1-clo%+1)
NEXT I%

OPEN DriftFile$ FOR OUTPUT AS #2

PRINT #2,"!CALOUT ";ver$;" Drift Report File"
PRINT #2,"!SLA-1 ";nm$;", DX serial # ";dx$;" on ";dt$

PRINT #2,"!Position values used for calibration, & RMS deviations (bits)"
PRINT #2,"!Sensor1 ";
PRINT #2, USING "######.##";x1tot#,y1tot#,SQR(x1dev#),SQR(y1dev#)
PRINT #2,"!Sensor2 ";
PRINT #2, USING "######.##";x2tot#,y2tot#,SQR(x2dev#),SQR(y2dev#)
```

```
PRINT #2,"   x1tot#   x2tot#   y1tot#   y2tot# (bits)   "
PRINT #2, USING "######.##";x1tot#,x2tot#,y1tot#,y2tot#
PRINT #2,"   x1dev#   x2dev#   y1dev#   y2dev# (bits RMS)"
PRINT #2, USING "######.##";SQR(x1dev#),SQR(x2dev#),SQR(y1dev#),SQR(y2dev#)
PRINT #2,""
PRINT #2,"   x1#(i%)  x2#(i%)  y1#(i%)  y2#(i%)  (bits)   "
FOR i%=clo% TO chi%+1
   PRINT #2, USING "######.##";x1#(i%)-x1tot#;x2#(i%)-x2tot#;_
                              y1#(i%)-y1tot#;y2#(i%)-y2tot#
NEXT i%
CLOSE #2

FOR I%=clo% TO chi%+1          're-work the drift information -------------------
   xof#=((x1#(i%)+x2#(i%))-(x1tot#+x2tot#))/2   'bits
   yof#=((y1#(i%)+y2#(i%))-(y1tot#+y2tot#))/2   'bits
   xgn#=(x1#(i%)-x2#(i%))/(x1tot#-x2tot#)   'approximately = 1
   ygn#=(y1#(i%)-y2#(i%))/(y1tot#-y2tot#)   'approximately = 1
   're-use the x1#() etc. arrays
   x1#(i%)=xof#
   x2#(i%)=xgn#
   y1#(i%)=yof#
   y2#(i%)=ygn#
NEXT i%
OPEN DriftFile$ FOR APPEND AS #2
PRINT #2,""
PRINT #2,"   X offset X gain   Y offset Y gain (bits, bits/10";CHR$(34);")"
PRINT #2,""
FOR i%=clo% TO chi%+1
   PRINT #2, USING "#######.#";x1#(i%);(x2#(i%)-1)*35560_
                              y1#(i%);(y2#(i%)-1)*35560
NEXT i%
CLOSE #2

'needs to show temp. drift & ask whether to correct or use un-corrected * * *
    if ydmax#<yd# then ydmax#=yd#
    if ydmin#>yd# then ydmin#=yd#
   xd#=xdmax#-xdmin#     'both started from zero, must be + & -
   yd#=ydmax#-ydmin#
   IF xd#<yd# THEN xd#=yd#  'select larger
   PRINT
   PRINT "From measuring the apparent position of the beam profile sensors"
   PRINT "during calibration, we find total effective mirror drift"
   PRINT USING "####";xd#/3.556;
   PRINT " mils "
   PRINT
   FOR i = 1 to 10000
   NEXT i

   IF xd#>500 THEN
      PRINT "Program found wrong profiler pinholes, "
      PRINT ""
      PRINT "File will be written without attempting to correct for drift"
      GOTO writeout
   END IF
   IF xd#>35 THEN
      PRINT "Excessive drift, you may want to run again "
      PRINT "                    ?temperature drift
      PRINT "                    ?air conditioning direct air currents
      PRINT "                    ?insufficient warmup"
```

```
      PRINT
      IF xd#>100 THEN
      PRINT "File will be written without attempting to correct for drift"
         GOTO writeout
      END IF
      PRINT "DO YOU WANT TO USE THE TEMPERATURE CORRECTION OF CALIBRATION POINT!
      PRINT "you may want to run this program again after studying the ";
      PRINT LEFT$(outputfile$,LEN(outputfile$)-4);".DRF file"
      DO
         K$=UCASE$(INKEY$)
      LOOP UNTIL K$="Y" OR K$="N"
      IF k$="N" THEN writeout
   END IF

'GOTO writeout ***** use when temperature drift file did not work
CLS
LOCATE 5,1,0
?"Adjusting Measured Values"  '-----------------------------------------------

'NOTE: we will assume 32767 is at center of range, to 1st order
       so we can use offset & gain (of & gn) independently

       First calculate offset & gain for each set of readings,
       then take proportionate part of the ones for beginning & end
       of the Y Axis (j%) table movement;
       --assume drift evenly distributed over time intervals between
         readings, remember that profile measurements take time too.
       Xnew = ( Xold - 32767 ) / Xgn  + 32767 - Xof
       (how nice if numbers were centered on Zero!)

FOR i% = clo% TO chi%
'      need the range of corrections from beginning & end of Column
   xof#=x1#(i%)                                      'start
   xofd#=(x1#(i%+1)-x1#(i%))/(chi%-clo%+2)            'delta
   yof#=y1#(i%)                                      'start
   yofd#=(y1#(i%+1)-y1#(i%))/(chi%-clo%+2)            'delta
   xgn#=x2#(i%)                                      'start
   xgnd#=(x2#(i%+1)-x2#(i%))/(chi%-clo%+2)            'delta
   ygn#=y2#(i%)                                      'start
   ygnd#=(y2#(i%+1)-y2#(i%))/(chi%-clo%+2)            'delta

   FOR j% = clo% TO chi%
      x3#(i%,j%)=(x3#(i%,j%)-32767)/(xgn#+xgnd#*(j%-clo%+1))_
                                 +32767 - xof#-xofd#*(j%-clo%+1)
      y3#(i%,j%)=(y3#(i%,j%)-32767)/(ygn#+ygnd#*(j%-clo%+1))_
                                 +32767 - yof#-yofd#*(j%-clo%+1)
   NEXT j%
NEXT I%


 CLS
'LOCATE 5,1,0
 ?"Adjusting Extrapolated Values"  '------------------------------------------
'do we really need to ?  - yes for 12" pot at same level . . .
'but should be calibrating 12" by then: SO - DON'T
'
CLS
LOCATE 5,1,0
?"Writing Corrected File"  '--------------------------------------------------
```

```
writeout:

OPEN outputFile$ FOR OUTPUT AS #2

PRINT #2,"!SLA-1 ";nm$;", DX serial # ";dx$;" on ";dt$

PRINT #2,"!Position values used for calibration, & RMS deviations (bits)"
PRINT #2,"!Sensor1 ";
PRINT #2, USING "######.##";x1tot#,y1tot#,SQR(x1dev#),SQR(y1dev#)
PRINT #2,"!Sensor2 ";
PRINT #2, USING "######.##";x2tot#,y2tot#,SQR(x2dev#),SQR(y2dev#)

WRITE #2,thi%+1,thi%+1,2,inc#

FOR i% = tlo% TO thi%
   FOR j% = tlo% TO thi%
      A$ = STR$(INT(x3#(i%,j%)*10+0.5)/10)
      PRINT #2,MID$(A$,2);
      PRINT #2,",";
      A$ = STR$(INT(y3#(i%,j%)*10+0.5)/10)
      PRINT #2,MID$(A$,2)
   NEXT j%
NEXT i%
CLOSE #2

CLS
?
?"Calibration correction complete
?
?"We have created two files, ";driftfile$;" and ";outputfile$
?
?driftfile$;" has the profiler positions measured after each column of the grid"
?
?outputfile$;" has the calibration data which will become STEREO.GEO"
?
?"Rename it C:\3DSYS\STEREO.GEO when loading in calibrated machine"
END

OutNoSp:
  A$ = STR$(INT(A*10+0.5)/10)
  PRINT #2,MID$(A$,2);
  RETURN
```

```
{ ==========================================================================

   CLIFF, Control Laser Instrument From File

   for 3D Systems' Sterolithography System

   Version 2.80  by Tarnz Technologies

 ==========================================================================

  CLIFF reads simple (X,Y) laser position commands from a file and
  controls the laser mirrors using the LASER background process.  Please
  see the MRCLIFF program for details on the commands and their
  arguments.

  The command line for cliff takes the form:

    CLIFF <datafile> [/options]

  where <datafile> is the name of the data file containing the laser
  control information, and /options are any number of user-selectable
  options:

    /S    -  show laser control information
    /W    -  wait for laser idle at end
    /T    -  transparency mode (no CLIFF text)

  CLIFF can perform the wait-for-idle function (/W option) without
  having any data file or commands to execute.  CLIFF /W and
  CLIFF /W/T (transparent) will make CLIFF wait for the background
  task to idle.

  <datafile> can be replaced by a sequence of direct commands by
  preceding the commands with a ', ", or @ character.  A semicolon
  can be used to separate commands.  As many commands as will fit on
  one line can be specified.  In the following example, the block
  mode is turned on and the laser beam moved:

    CLIFF 'MD BL +; JX 1000; JY 2000; NX 4000; NY 5000; EC

  If CLIFF is called up with no arguments, it will prompt with

    Enter file name: _

  at which point the operator should enter the name of the data file
  containing  CLIFF-compatible commands.  Direct commands can be
  entered here if preceded by a special character as described above.

 ========================================================================== }

{

 Recent History:
  8/18/87  Ver 2.02  CLIFF Version 2.00 released
                     interfaces with memory resident STEREO device driver
  8/22/87  Ver 2.03  /NVC changed to /NC for no version check
  8/25/87  Ver 2.04  only updated version number
```

```
    9/23/87  Ver 2.12  added MinSystemVersion check
    9/30/87  Ver 2.25  only updated version number
   11/12/87  Ver 2.30  first Beta software release
   12/09/87  Ver 2.40  upgraded to Turbo Pascal Version 4.0
                       different STEREO-installed check
    1/25/88  Ver 2.60  version update only
    3/09/88  Ver 2.80  added copyright notice
    4/09/88  Ver 3.00  production release

}

uses Dos,Crt;

type
  str16 = string[16];
  str80 = string[80];
  str255 = string[255];

var
  Ch,ev: Char;
  Line,temp,cmd: str255;
  StereoVersion: str16;
  Count,i,remline,Er,DoNum,code: integer;
  Format,LineCount,IOerr: Integer;
  ErrorFile,InputFile: text;
  VersionCheckFlag,TransparentFlag,WaitForIdleFlag: Boolean;
  ShowData,ErrorOpen,Abort: Boolean;
  regs: Registers;

const
  ThisCliffVersion = '3.00';
  MinSystemVersion = '2.40';
  CtrlC = #3;
  sp40 = '                                        ';
  _LASERVECTOR  = $64;
  _STEREOVECTOR = $65;

label ExitProgram;

function upper(text: str255): str255;
  var
    i: Integer;
    temp: str255;
  begin
    temp := text;
    for i := 1 to length(temp) do temp[i] := upcase(temp[i]);
    upper := temp;
  end;

function many(Ch: Char;num: Integer): str255;
  var
    temp: str255;
    i: Integer;
  begin
    temp := '';
    for i:=1 to num do temp  := temp+Ch;
    many := temp;
  end;

procedure ReadCommandLine(var line: string);
```

```
var
  i: Integer;
begin
  line := ParamStr(1);
  for i:=2 to ParamCount do
    line := line + ' ' + ParamStr(i);
end;

procedure print(text: str255);
  begin
    if not TransparentFlag then write(text);
  end;

procedure println(text: str255);
  begin
    if not TransparentFlag then writeln(text);
  end;

function IntStr(num: Integer): str16;
  var
    temp: str16;
  begin
    if num>=0 then Str(num,temp) else Str(num+$8000,temp);
    IntStr := temp;
  end;

function __LaserOk: Boolean;
  type
    CopyType  = array[1..20] of char;
  var
    CopyPtr: ^CopyType;
    CopyStr: string[20];
  begin
    with regs do begin
      AX := ($35 shl 8) or _LASERVECTOR;
      Intr($21,regs);
      CopyPtr := Ptr(ES,BX-19);
    end;
    move(CopyPtr^[1],CopyStr[1],18);
    CopyStr[0] := #18;
    __LaserOk := (CopyStr = 'Tarnz Technologies');
  end;

function __LaserPresent: Boolean;
  begin
    if __LaserOk then __LaserPresent := true
    else begin
      __LaserPresent := false;
      writeln('LASER system not installed.');
    end;
  end;

function __StereoOk: Boolean;
  type
    CopyType  = array[1..20] of char;
  var
    CopyPtr: ^CopyType;
    CopyStr: string[20];
  begin
    with regs do begin
```

```
      AX := ($35 shl 8) or _STEREOVECTOR;
      Intr($21,regs);
      CopyPtr := Ptr(ES,57);
    end;
    move(CopyPtr^[1],CopyStr[1],18);
    CopyStr[0] := #18;
    if CopyStr = 'Tarnz Technologies' then begin
      __StereoOk := true;
      with regs do
        CopyPtr := Ptr(ES,30);
      move(CopyPtr^[1],StereoVersion[1],4);
      StereoVersion[0] := #4;
    end else begin
      __StereoOk := false;
      StereoVersion := '?.??';
    end;
  end;

function __StereoPresent: Boolean;
  begin
    if __StereoOk then __StereoPresent := true
    else begin
      __StereoPresent := false;
      writeln('STEREO driver not installed.');
    end;
  end;

procedure Error(text: str255);
  begin
    if whereX > 1 then println('');
    if LineCount=0 then println('*** '+text)
      else println('*** '+text+' in line '+IntStr(LineCount));
    if not ErrorOpen then begin
      rewrite(ErrorFile);
      ErrorOpen := true;
    end;
    writeln(ErrorFile,text);
  end;

procedure DescribeError(Er: Integer);
  begin
    case Er of
        0: ;
        1: Error('1. Laser interface card not found');
        2: Error('2. Laser channel not open');
        3: Error('3. Background Command Queue full timeout');
        4: Error('4. Invalid interrupt time');
        5: Error('5. Not in block mode');
        6: Error('6. Exec Queue limit timeout');
      127: Error('127. Bad SIH command parameter');
      128: Error('128. Unrecognized STEREO command');
      255: Error('255. Internal error (please report)');
      else Error(IntStr(Er)+'. Unrecognized SIH error');
    end;
  end;

{ - - - - - - - - - - - - - - - - - - - - - - - - - - - - - - - - - - - -

    Pass Command on to Memory Resident Portion
```

```
  - - - - - - - - - - - - - - - - - - - - - - - - - - - - - - - - - - - - - }

procedure StereoCommand(line: str255);
  begin
    if (length(line)>0) and (line[1]<>'!') then with regs do begin
      line := line + chr(0);  { end-of-line }
      AX := $00;              { for future expansion }
      BX := Ofs(line)+1;  { pass pointer to string }
      ES := Seg(line);
      Intr(_STEREOVECTOR,regs);
    end;
    if regs.AL>0 then DescribeError(regs.AL);
  end;

procedure ProcessFile;
  begin
    if not ShowData then begin
      println('');
      print('0    lines');
    end;
    while not eof(InputFile) and not Abort do begin
      readln(InputFile,Line);
      if ShowData then println(Line);
      LineCount := LineCount+1;
      StereoCommand(Line);
      if not TransparentFlag then
        if not ShowData then if LineCount mod 25=0 then begin
          gotoxy(1,whereY);
          print(IntStr(LineCount));
        end;
      if keypressed then begin
        key := ReadKey;
        if key in [CtrlC,'A','a'] then Abort := true;
      end;
    end; {not eof}
    if not (TransparentFlag and ShowData) then begin
      gotoxy(1,whereY);
      println(IntStr(LineCount));
    end;
    if Abort then begin
      Error('Control Process Aborted');
      while keypressed do key := ReadKey;
    end; {if Abort}
  end;

procedure CheckForOptions(var str: str255);
  var
    i: Integer;
  begin
    while (length(str)>1) and (str[1]=' ') do delete(str,1,1);
    i := pos('/S',upper(str));  { show input file lines }
    if i>0 then begin
      ShowData := true;
      delete(str,i,2);
    end;
    i := pos('/W',upper(str));  { set wait for idle flag }
    if i>0 then begin
      WaitForIdleFlag := true;
```

```
      delete(str,i,2);
    end;
    i := pos('/T',upper(str));  { set transparency flag }
    if i>0 then begin
      TransparentFlag := true;
      delete(str,i,2);
    end;
    i := pos('/NC',upper(str));  { no version check }
    if i>0 then begin
      VersionCheckFlag := false;
      delete(str,i,3);
    end;
  end;

procedure CliffHeader;
  begin
    writeln;
    writeln(#213,many(#205,53),#184);
    writeln(#179,'  CLIFF, Control Laser Instrument From File Program  ',#179);
    writeln(#179,'  Version ',ThisCliffVersion+'
    writeln(#179,'  Copyright (C) 1988 by Tarnz Technologies             ',#179);
    writeln(#179,'  3D Systems Laser Stereolithography System            ',#179);
    writeln(#212,many(#205,53),#190);
    writeln;
  end;

begin
  ReadCommandLine(cmd);
  LineCount        := 0;
  Abort            := false;
  WaitForIdleFlag  := false;
  TransparentFlag  := false;
  ErrorOpen        := false;
  ShowData         := false;
  VersionCheckFlag := true;

{ ***** check for memory resident STEREO device driver }

  Assign(ErrorFile,'CLIFF.ERR');
  {$I-}  { erase error file if it exists }
  Erase(ErrorFile);
  {$I+}
  IOerr := IOresult;  { clear I/O result }
  CheckForOptions(cmd);

  if not TransparentFlag then CliffHeader;
  if not (__LaserPresent and __StereoPresent) then goto ExitProgram;
  if VersionCheckFlag then
    if StereoVersion < MinSystemVersion then begin
      writeln('Obsolete STEREO in use.');
      goto ExitProgram;
    end;
  if length(cmd)=0 then begin
    write('Enter file name: ');
    readln(cmd);
    CheckForOptions(cmd);
  end;
  if (length(cmd)>1) and (cmd[1] in ['@','"','''']) then begin
    { handle direct commands }
    cmd := copy(cmd,2,199);
```

```
    StereoCommand(cmd);
  end else begin
    { handle commands from a file }
    if length(cmd)>0 then begin
      if pos('.',cmd)=0 then cmd := cmd + '.DAT';
      assign(InputFile,cmd);
      {$I-}
      reset(InputFile);
      IOerr := IOresult;
      {$I+}
      if IOerr <> 0 then
        Error('I/O Error '+IntStr(IOerr)+' opening file '+cmd)
      else begin
        ProcessFile;
        close(InputFile);
      end;
    end;
  end;
  if WaitForIdleFlag then StereoCommand('WI 1000');

ExitProgram:
  {$I-}
  close(InputFile);
  close(ErrorFile);
  {$I+}

end.
```

```
LASER.ASM  - Page 1 -                          4/[illegible]/1988   [illegible]

Page 60,132
Title II Systems Laser Driver Package
;=============================================================================
;
;
;       LASER     II Systems Laser Controller Driver Package
;                 Version [illegible]
;
;                 This code constitutes levels 1 and 2, the lowest software
;                 levels, of the Laser Controller System.
;
;                 Copyright (C) Tarnz Technologies, 1987
;
;
;=============================================================================

;
;  History:

;                 [illegible]
;                       [illegible] identification [illegible]
;                       [illegible] number updated only
;     [illegible]  [illegible]   version number updated only
;     [illegible]  [illegible]   first Beta software release, version update only
;     [illegible]  [illegible]   version update only
;     [illegible]  [illegible]   version update only
;


;       [illegible]

[illegible]                                    ;current software version
[illegible]                                    ;debug flag

;=============================================================================
;
;       Public and External Declarations


;
;  public code references
;
        public  laser_entry                  ;only callable entry point to this pkg
        public  enddata                      ;segment ends for residency size calc
        public  endqueue
        public  endbkgtask
        public  endcode

;
;  public variable references
;
        public  laser_int,old_tv,old_tv,current_status
        public  svs_int_count,sint_counter,bkgnd_intr_time

;
;  external references
;
        extrn   bkg_ins:far                  ;install background task
```

```
LASER.ASM   - Page 2 -                          4/15/1988   6:36 PM

        extrn   bkg_init:far                    ;change timebase
        extrn   bkg_rmv:far                     ;remove background task

subttl  Operating System Equates
page
;==============================================================================
;
;       IBM PC and Compatible Operating System Equates
;


;
;       Equates defining 8259 (Programmable Interrupt Controller) and 8253
;       (Programmable Interval Timer) ports and constants.
;
inta00          equ     20h                             ;8259 PORT
inta01          equ     21h                             ;YET ANOTHER 8259 PORT
tim_cmd_reg     equ     43h                             ;8253 command register
tim_ch2         equ     42h                             ;8253 channel two
[illegible]     [illegible] [illegible]                 ;8255 port A
[illegible]     equ     [illegible]                     ;8255 port B
[illegible]     [illegible] [illegible]                 ;[illegible]
[illegible]     equ     62h                             ;8255 port [illegible]

subttl  Laser I/O Card Equates
page
;==============================================================================
;
;       Laser I/O Card Equates
;


;
;       [illegible] Engineering [illegible]
;       "Universal I/O" [illegible]
;
laserIO         equ     [illegible]
portA1          equ     laserIO         ;DAC value low byte
portB1          equ     laserIO+1       ;DAC value high byte
portC1          equ     laserIO+2
; outputs
strobeX         =       1               ;X-axis DAC strobe (falling edge)
strobeY         =       2               ;Y-axis DAC strobe (falling edge)
strobeZ         =       4               ;Z-axis DAC strobe (falling edge)
shutter_ctrl    =       8               ;laser shutter control (open/closed)
; inputs
posackXY        =       16              ;X and Y-axis position acknowledge
posackZ         =       32              ;Z-axis position acknowledge
ctrl1           equ     laserIO+3       ;control #1 byte (write only!)
portA2          equ     laserIO+4
portB2          equ     laserIO+5
portC2          equ     laserIO+6
ctrl2           equ     laserIO+7
portA3          equ     laserIO+8
portB3          equ     laserIO+9
portC3          equ     laserIO+10
ctrl3           equ     laserIO+11

;
;       Miscellaneous
;
ExtSigs         segment at 0F600h                       ;for debugging
```

```
IntBeg          db      ?
IntEnd          db      ?
Extints         ends

subttl  Miscellaneous Other Equates And Structures
page
;
;
;       Error codes
;
err_none        equ     0               ;no error
err_no_card     equ     1               ;no laser interface card found
err_not_open    equ     2               ;laser channel not open
err_queue_full  equ     3               ;background command queue is full
err_bad_time    equ     4               ;invalid interrupt time
err_not_block   equ     5               ;not in block mode
err_exec_limit  equ     6               ;exec limit (# EC & EX's) reached
err_bad_param   equ     127             ;some other bad parameter
[illegible]     equ     [illegible]     ;internal code error

[illegible]                             ;for turning flags off [illegible]

[illegible]
page
;

;       The stack frame defines the locations of the parameters on the stack
;
stack_frame     struc
[illegible]
[illegible]     dw      0
[illegible]     dw      0
[illegible]
[illegible]     dw      0
t_cs            dw      0
stack_frame     ends

subttl  LASER code segment
page

if1
%out    - Starting pass 1 -
endif
if2
%out    - Starting pass 2 -
endif

subttl  Data Segments
page
LaserData segment public 'DATA'

;
;  Block Variables
;
```

```
;  Execute Queue (must be first item in segment)
;  - 10 entries of StartPtr [2 bytes], EndPtr [2 bytes]
;
exec_queue_size         =       200     ;max # of blocks awaiting processing
exec_entry_len          =       4
exec_queue_limit        =       exec_queue_size*exec_entry_len
exec_queue              db      exec_queue_limit dup (?) ;queue space

exec_queue_start        dw      0
exec_queue_end          dw      0

;
;  Background Command Queue Variables
;
bcmd_queue_start        dw      0       ;command queue's "hard" limits
bcmd_queue_end          dw      0       ;  real start and end of queue

;
;  Current Block Variables
;
queue_start             [illegible]     ;command queue's "soft" limits
queue_end               dw      0       ;  start and end of current block

red_queue_start         dw      0       ;redraw storage of the queue_start
red_queue_end           dw      0       ;  and queue_end pointers

;
;  Background Task Variables
;
 _static        =       0               ;in static state
 _off_delay     =       2               ;in laser turn-off state
 _idle          =       4               ;in laser system fully idle state
 _pos_ack       =       [illegible]     ;in position acknowledge state
 _on_delay      =       8               ;in laser turn-on state
 _moving        =       10              ;in moving state
 _pausing       =       12              ;in pausing state
 _redraw_pausing =      14              ;redrawing pause state
 exec_mode      dw      _static         ;execution mode
 sysint_intr_time dw    1190            ;interrupt interval time
 sys_int_count  dw      10              ;sys int routine tick count
 sint_counter   dw      10              ;sys int down-counter
 clear_pointer  dw      0               ;start of command queue block
 delay          dw      0               ;general delay downcounter
 off_delay_count dw     0               ;laser turn-off delay count value
 on_delay_count dw      0               ;laser turn-on delay count value
 HomeXpos       dw      0               ;laser beam (X,Y) home position
 HomeYpos       dw      0
 RemXpos        dw      0               ;remember beam (X,Y) position here
 RemYpos        dw      0

 xposFract      db      0               ;current vector's variables
 xpos           dw      0
 yposFract      db      0
 ypos           dw      0
 deltaX         dw      0
 deltaY         dw      0
 steps          dw      0
 signX          db      0               ;sign-extends
 signY          db      0
 dummy          dw      0
```

```
ut_steps            dw      0                   ;utility downcounting steps

redraw_count        dw      1                   ;redraw pass count
redraw_delay        dw      0                   ;redraw delay
step_periods        dw      10 dup (1190)       ;multi-pass Step Periods array
mark_position       dw      0                   ;redraw mark position
pass                dw      0                   ;redraw pass number

;
;  Software Interrupt Variables
;
swi_int             dw      0                   ;interrupt vector number
swi_ofs             dw      0                   ;old SWI vector
swi_seg             dw      0

return_code         db      0                   ;function return code

is_open             =                           ;laser system initialized
[illegible]         =       [illegible]         ;software interrupt vector set
[illegible]         =       [illegible]         ;background in idle state + [illegible]
[illegible]         =                           ;doing redraw operation
[illegible]         =       [illegible]         ;need to pause flag (redraw)
current_stat =              [illegible]         ;general status register
[illegible]_mode    =                           ;automatically open/close shutter on id
[illegible]         =       [illegible]         ;wait for [illegible] mirrors position acknowle
block_mode          =       [illegible]         ;execution block mode (EX/EC/CL active)
shutter             =       [illegible]         ;open/closed shutter flag
laser_control       dw      shutter             ;laser control word

enddata label far
LaserData ends

LaserQueue segment public 'DATA'
;
;  Background Command Queue
;  [illegible] workspace for [illegible] approximately [illegible] move entries
;
cmd_queue_size              =       [illegible]   ;vector circular queue size
cmd_queue_limit             =       cmd_queue_size-32
cmd_queue                   db      cmd_queue_size+16 dup (?)
move_size                   =       13      ;background command sizes
open_shutter_size           =       1
close_shutter_size          =       1
change_timebase_size        =       3
pause_size                  =       3
set_periods_size            =       2       ; + 2 * num
set_redraw_count_size       =       3
set_redraw_delay_size       =       3
mark_size                   =       1
redraw_size                 =       1

endqueue label far
LaserQueue ends

subttl  Laser Background Task
page
;===============================================================================
;
;       Laser Control Background Task
;
```

```
;        responsible for:
;
;        - updating x-axis & y-axis DACs every 100 us (typ.)
;        - moving of laser beam
;        - geometric correction
;        - shutter control
;        - idling system while command queue is empty
;
;==========================================================================
LaserGroup group LaserBackground,LaserCode

LaserBackground segment public 'CODE'
        assume  cs:LaserBackground,ds:LaserData

;
;  high-speed timer 0 interrupt
;
;  typically 100 us, settable via software interrupt
;
[illegible]
        assume  [illegible]

        ;
        ;  [illegible]
        ;
        push    ax
        in      al,[illegible]                ;signal start of background interrupt
        and     al,all-[illegible]
        out     [illegible],al
        push    [illegible]
        push    [illegible]
        push    [illegible]
        push    [illegible]
        push    es
        push    [illegible]
        [illegible]

        ;
        ;  background task interrupt service
        ;
        mov     ax,LaserData                  ;point to laser system variables
        mov     ds,ax
        mov     ax,LaserQueue                 ;point to laser command queue
        mov     es,ax
        cld                                   ;for block moves
        mov     bx,bkgnd_mode
        jmp     word ptr cs:[bx + offset bkgnd_states]

        ;
        ;  Background State Address Table
        ;
bkgnd_states label word
        dw      static
        dw      off_delay
        dw      idle
        dw      pos_ack
        dw      on_delay
        dw      moving
        dw      pausing
        dw      redraw_pausing
```

```
        ;
        ;  old system timer interrupt vector
        ;  must be in CS for indirect intersegment jump to BIOS
        ;
old_ti  dd      ?                       ;called every sys_int_count ticks

        ;
        ;  static state - determine processing
        ;
static:
        test    laser_control.block_mode
        jnz     block

;
;  STREAM MODE
;  laser commands executed as they are added to table for best throughput
;  and easiest control
;

stream:
        mov     si,pcmd_queue_start     ;any entries in queue?
        cmp     si,pcmd_queue_end
        jz      prep_idle
        jmp     read_queue              ;yes, go execute command

;
;  BLOCK MODE
;  laser commands executed in blocks to prevent intermediate idles
;  multi-pass redraw of small sets of vectors supported

block:
        mov     ax,queue_start          ;finished processing block?
        cmp     ax,queue_end
        jz      block1
        jmp     read_queue
block1:
        test    current_status,redrawing        ;redrawing?
        jnz     do_redraw
        mov     si,exec_queue_start     ;no, something in exec queue?
        cmp     si,exec_queue_end
        jz      prep_idle               ;no, idle
        jmp     block_proc              ;yes, go process next block

do_redraw:
        jmp     redraw_pass             ;multiple passes

        ;
        ;  prepare to idle
        ;
prep_idle:
        test    laser_control.autoshut_mode  ;if autoshutter mode, close shutte
        jz      home
        or      laser_control,shutter
        call    set_ctrl_port
        jmp     laser_off
home:
        mov     ax,Xpos                 ;  else remember current position
        mov     RemXpos,ax
        mov     ax,Ypos
```

```
        mov     RemYpos,ax
        mov     ax,HomeXpos             ;    and home laser beam
        mov     Xpos,ax
        mov     ax,HomeYpos
        mov     Ypos,ax
        call    update_DACs

laser_off:
        mov     ax,off_delay_count      ;observe laser turn-off delay
        cmp     ax,0
        je      set_idle                ;if 0, don't delay at all
        mov     delay,ax
        mov     bkgnd_mode,_off_delay
sdone:  jmp     int_fini

        ;
        ;  laser turn-off delay state
        ;
off_delay:
        dec     delay
        jnz     sdone

set_idle:
        mov     bkgnd_mode,_idle                  ;set idle state

        ;
        ;  laser system fully idle state
        ;
idle:
        test    laser_control,clock_mode
        jz      idle_stream

idle_exec:
        mov     si,exec_queue_start     ;wait for something in exec queue
        cmp     si,exec_queue_end
        jnz     out_of_idle

idle_set:
        or      current_status,bkgnd_idle         ;make sure idle flag is on
        jmp     int_fini

idle_stream:
        mov     si,bcmd_queue_start     ;wait for something in command queue
        cmp     si,bcmd_queue_end
        jz      idle_set

out_of_idle:
        and     current_status,all-bkgnd_idle   ;turn off idle flag
        test    laser_control,autoshut_mode ;if autoshut mode, open shutter
        jz      repos
        and     laser_control,all-shutter
        call    set_ctrl_port
        jmp     laser_on
repos:
        mov     ax,RemXpos              ;    else reposition laser beam
        mov     Xpos,ax
        mov     ax,RemYpos
        mov     Ypos,ax
        call    update_DACs
```

```
        test    laser_control.posack_mode
        jz      laser_on
        mov     dx.port01               ;wait for position acknowledgement
        in      al.dx
        and     dx.posackx
        jz      laser_on
        mov     bkgnd_mode._pos_ack

        ;
        ;  position acknowledge state
        ;
pos_ack:
        mov     dx.port01
        in      al.dx
        and     dx.posackx
        jnz     sdone
        mov     bkgnd_mode. static

[illegible]
        [illegible]                     ;observe laser [illegible] delay
        [illegible]
        [illegible]                     [illegible]
        mov     [illegible]
        [illegible]     [illegible] mode [illegible]
        [illegible]

        ;
        ;  laser [illegible] delay state
        ;
[illegible]:
        [illegible]     delay
        [illegible]     set_proc
        [illegible]     [illegible]

set_proc:
        mov     bkgnd_mode. static      ;set for normal processing
        test    laser_control.block_mode
        [illegible]     [illegible]     ;start processing commands immediately

        ;
        ;  setup for block mode processing
        ;
block_proc:
        mov     si.exec_queue_start
        mov     ax.[si]                 ;get start index
        mov     bcmd_queue_start.ax     ;update command queue s hard start
        mov     queue_start.ax          ;set exec block start
        add     si.2
        mov     ax.[si]                 ;get end index
        mov     queue_end.ax            ;set exec block end
        add     si.2
        cmp     si.exec_queue_limit     ;next index
        jl      block_proc1
        mov     si.0
block_proc1:
        mov     exec_queue_start.si
        jmp     block                   ;catch 0-length blocks

        ;
        ;  begin processing background command from command queue
```

```
        ;
read_queue:
        test    laser_control,block_mode
        jz      read_stream
read_block:
        mov     si,queue_start          ;use right pointer
        jmp     read_queue1
read_stream:
        mov     si,bcmd_queue_start
read_queue1:
        mov     al,es:[si]              ;read next background command
        inc     si                      ;point to command parameters
        inc     al                      ;  + 1 so that FF becomes 0
        xor     ah,ah                   ;compute jump table offset
        shl     ax,1
        cmp     ax,bkgnd_ops_end        ;don't use to increase throughput
        jae     skip_bad_token
        [illegible]
        [illegible]

[illegible]

;------------------------------------------------
;
;       reset to beginning of command queue
;       Background Command FF (Internal)
;
;------------------------------------------------
reset_queue:
        mov     queue_start,0           ;zero start pointer
        jmp     static                  ;go process next command, if any

;------------------------------------------------
;
;       move/draw vector
;       Background Command 0
;
;------------------------------------------------
move:
        mov     bx,ds                   ;swap DS & ES temporarily for movsw
        mov     ax,es
        mov     ds,ax
        mov     es,bx
        mov     di,offset XposFract
```

```
        mov     cx,(move_size+1)/2       ;copy packet from queue to workarea
        rep movsw
        mov     bx,ds                    ;swap segments back
        mov     ax,es
        mov     ds,ax
        mov     es,bx
        mov     al,byte ptr deltaX+1     ;compute sign-extends
        cbw
        mov     signX,ah
        mov     al,byte ptr deltaY+1
        cbw
        mov     signY,ah
        test    current_status,need_to_pause
        jz      move1
        jmp     redraw_pause
move1:
        mov     bcmd_mode, moving
        mov     bx,move_size

        ;
        ; [illegible]
        ;
[illegible]
        [illegible]     [illegible]_control,[illegible]
        [illegible]     [illegible]_stream

[illegible]
        mov     ax,[illegible]_start
        add     ax,bx
        [illegible]     ax,bcmd_queue_size       ;next start index
        [illegible]     end_read_queue1
        [illegible]     [illegible]              ;wraparound command queue [illegible]
end_read_queue1:
        [illegible]     queue_start,ax
        jmp     set_DACs

[illegible]
        mov     a[illegible],bcmd_queue_start
        add     a[illegible],b[illegible]
        [illegible]     ax,bcmd_queue_size       ;next start index
        jb      end_read_queue2
        mov     ax,0                     ;wraparound command queue (hard)
end_read_queue2:
        mov     bcmd_queue_start,ax
        jmp     set_DACs

        ;
        ;  moving state - vector processing
        ;
moving:
        mov     ax,word ptr XposFract    ;compute new X position
        add     ax,deltaX                ;add fract & 1st byte of integer
        mov     word ptr XposFract,ax
        mov     al,byte ptr Xpos+1       ;add carry to 2nd byte of integer
        adc     al,signX
        mov     byte ptr Xpos+1,al

        mov     ax,word ptr YposFract    ;compute new Y position
        add     ax,deltaY
        mov     word ptr YposFract,ax
```

```
        mov     al,byte ptr ypos+1
        add     al,signy                ;[illegible] - deltas, [illegible] - deltas
        mov     byte ptr ypos+1,al

        dec     steps                   ;count down # steps
        jnz     set_DACs
        mov     [illegible]_mode, static     ;static state next tick

        ;
        ;  set laser mirror DACs to appropriate values
        ;
set_DACs:
        call    update DACs

        ;
        ;  return from interrupt
        ;
[illegible]:
        [illegible]     [illegible]             ;[illegible]
        [illegible]     [illegible]             ;[illegible]
        [illegible]     [illegible]
        [illegible]     [illegible]
        [illegible]     [illegible]             ;[illegible] interrupt [illegible]
        pop     [illegible]
        pop     [illegible]
        pop     [illegible]
        pop     [illegible]
        pop     [illegible]
        pop     [illegible]
        mov     al,20h                  ;[illegible] interrupt
        out     020h,al
        sti
        [illegible]
        [illegible]

[illegible]:
        [illegible]     [illegible]             ;[illegible]
        [illegible]     [illegible] counter,[illegible]
        [illegible]     [illegible]
        pop     [illegible]
        pop     es
        pop     dx
        pop     cx
        pop     bx
        pop     ds
        mov     al,20h                  ;reset interrupt to allow laser
        out     020h,al                 ;interrupts during BIOS operation
        sti
        pop     ax
        jmp     old_tv                  ;continue timer interrupt in BIOS

[illegible] proc near
page
;
;  Set Output Control Port
;     - shutter control
;
set_ctrl_port:
        mov     dx,portC1
        in      al,dx                   ;read existing port C1 bits
```

```
        test    laser_control.shutter   ;update for shutter
        jnz     shut_closed
shut_open:
        and     al.all-shutter_ctrl
        jmp     shut_str
shut_closed:                            ;shutter closed if shutter not 0
        or      al.shutter_ctrl
shut_str:
        out     dx.al
        ret

;  Update laser beam X and Y Digital to Analog Converters
;
update_DACs:

set_XDAC:
        mov     ax.Xpos                 ;output X-pos to laser X-axis DAC
        [illegible]
        [illegible]
        [illegible]
        [illegible]
        out     [illegible]
        [illegible]                     ;[illegible] strobe lines
        [illegible]  al,[illegible]
        [illegible]                     ;falling edge
        out     [illegible]
        or      al.strobeX
        out     dx.al

set_YDAC:
        mov     ax.Ypos                 ;output Y-pos to laser Y-axis DAC
        mov     dx.portY1
        out     dx.al
        inc     dx
        [illegible]  al.ah
        out     dx.al
        inc     dx                      ;point [illegible] the strobe lines
        in      al.dx
        and     al.all-strobeY          ;falling edge
        out     dx.al
        or      al.strobeY
        out     dx.al

        mov     ax.0FFh
        mov     dx.port01
        out     dx.al
        inc     dx
        out     dx.al
        ret

[illegible] dual eros endp
page
;  ---------------------------------------------
;
;     Open laser beam shutter
;     Background Command 1
;
;  ---------------------------------------------
open_shutter:
```

```
        or      laser_control,all-shutter
        call    far ptr set_ctrl
        mov     bx,open_shutter_size
        jmp     end_read_queue

;   ------------------------------------------------
;
;     close laser beam shutter
;     Background Command 2

;   ------------------------------------------------
close_shutter:
        or      laser_control,shutter
        call    far ptr set_ctrl
        mov     bx,close_shutter_size
        jmp     end_read_queue

    ------------------------------------------------
;
;     [illegible] time base
;     [illegible] Command 3

;   ------------------------------------------------
[illegible]:
        [illegible]     [illegible]
        [illegible]     [illegible]                  ;reset after first step period
        call    [illegible]                          ;change time base now
        mov     bx,change_timebase_size
        jmp     end_read_queue

;   ------------------------------------------------
;
;     pause [illegible] processing
;     Background Command 4

;   ------------------------------------------------
[illegible]:
        mov     ax,es:[si]
        mov     ut_steps,ax
        mov     bkgnd_mode,_pausing          ;set for pausing state
        mov     bx,pause_size
        jmp     end_read_queue

pausing:
        dec     ut_steps                     ;count down # steps
        jnz     pausing1
        mov     bkgnd_mode,_static           ;static state next tick
pausing1:
        jmp     int_fini

;   ------------------------------------------------
;
;     set periods
;     Background Command 5
;
;   ------------------------------------------------
set_periods:
        mov     cl,es:[si]                   ;get sp count (1 byte)
        inc     si
        mov     ch,0                         ;set high byte to 0
```

```
        push    [illegible]
        cmp     page,0                  ;read at only on redraw page 0
        jnz     set_periods_skip
        mov     di,offset step_periods
        mov     bx,es:[si]              ;get [illegible]
        mov     [di],bx
        push    es
        call    bkg_ins1                ;set new timer interrupt
        pop     es
        jmp     set_periods_next
set periods_loop:
        mov     ax,es:[si]              ;copy sp1, sp2...
        mov     [di],ax                 ;  to step_periods array
set_periods_next:
        add     si,2
        add     di,2
        dec     cl
        jnz     set periods loop
set periods skip:
        [illegible] [illegible]         [illegible] size of [illegible] command
        [illegible] [illegible]
                [illegible] periods [illegible]
        jmp     end read_queue

    ------------------------------------------------

;   set redraw count
;   Background Command 6
;
    ------------------------------------------------
set redraw count:
        [illegible] ax,es:[si]
        [illegible] redraw_count,ax
        [illegible] [illegible] redraw_count size
        jmp     end_read_queue

    ------------------------------------------------
;
;   set redraw delay
;   background Command 7
;
;   ------------------------------------------------
set_redraw_delay:
        mov     ax,es:[si]
        mov     redraw_delay,ax
        mov     bx,set_redraw_delay_size
        jmp     end_read_queue

;   ------------------------------------------------
;
;   mark
;   Background Command 8
;
;   ------------------------------------------------
mark:
        mov     ax,queue_start          ;remember current queue position
        mov     mark_position,ax
        mov     bx,mark_size
        jmp     end_read_queue
```

```
;   ------------------------------------------------
;
;     redraw
;     Background Command 8
;
;   ------------------------------------------------

        ;
        ;  set up for redraw
        ;
redraw:
        test    laser_control,block_mode
        jz      no_redraw               ;make sure task in block mode
        mov     ax,queue_start
        mov     rem_queue_start,ax      ;remember current queue start / end
        mov     ax,queue_end
        mov     rem_queue_end,ax
        or      current_status,redrawing        ;turn on redrawing flag

        ;
        ;  [illegible]
        ;
redraw_pass:
        inc     pass                    ;inc . pass number
        mov     si,pass
        cmp     si,redraw_count         ;all passes done?
        jae     finish_redraw
        shl     si,1                    ; * 2
        mov     cx,step_periods[si]     ;[illegible]
        call    bkg_ins1
        cmp     redraw_delay,0          ;if redraw_delay [illegible]
        je      redraw_pass1
        or      current_status,need_to_pause    ; pause on next vector [illegible]
redraw_pass1:
        mov     ax,mark_position        ;set redraw start / end
        mov     queue_start,ax
        [illegible] current_queue_start
        mov     queue_end,ax
        mov     bx,mark_size            ;skip mark or last redraw instruction
        jmp     end_read_queue

        ;
        ;  finish up redraw
        ;
finish_redraw:
        mov     ax,rem_queue_start      ;restore queue start / end
        mov     queue_start,ax
        mov     mark_position,ax        ;update mark position
        mov     ax,rem_queue_end
        mov     queue_end,ax
        and     current_status,all-redrawing-need_to_pause      ;turn off flags
        mov     pass,0                  ;set redraw pass to 0
        mov     cx,step_periods         ;set step period 0
        call    bkg_ins1
no_redraw:
        mov     bx,redraw_size          ;skip redraw instruction
        jmp     end_read_queue

redraw_pause:
        mov     ax,redraw_delay         ;delay this number of timer ticks
```

```
        mov     ut_steps,ax
        mov     bkgnd_mode,_redraw_pausing
        jmp     set_DACs                ;update DACs with first move position

redraw_pausing:
        dec     ut_steps                ;count down # steps
        jz      redraw_pausing1
        jmp     int_fini
redraw_pausing1:
        and     current_status,all-need_to_pause  ;turn off need-to-pause flag
        jmp     move1                   ;now, go do vector move

laser_int endp

endbkgtask label far

LaserBackground ends

[illegible]
[illegible]
[illegible]
        assume  cs:LaserCode [illegible]

;===========================================================================

        [illegible]
;
        [illegible]             [illegible]
        dw      LaserI[illegible]       ;[illegible]
        dw      [illegible]
        dw      LaserBackgrnd[illegible]
        [illegible]
        db      [illegible]

;===========================================================================
;
        [illegible]
;
        db      [illegible] Controller Version [illegible] Copyright [illegible] Tech

subttl  Software Interrupt Service
page
;===========================================================================
;
;       Laser Software Interrupt Functions
;
;       These functions can be called from any high-level language having
;       software interrupt capability.
;
;       AH AL
;       00 --   open laser DAC channel and initialize
;       01 --   close laser DAC channel and restore system
;       02      add command to background command queue
;       02 00     move/draw vector
;       02 01     shutter open
;       02 02     shutter closed
;       02 03     change time base
;       02 04     pause
;       03 --   reset background command queue
;       04 --   get background command queue size
```

```
;        05 xx   get_option
;        05 00     get software interrupt vector number
;        05 01     get background task interval time
;        05 02     get laser control word
;        05 03     get laser status
;        05 04     get laser turn-off (active to idle) delay
;        05 05     get laser turn-on (idle to active) delay
;        05 06     get laser home position
;        06 xx   set_option
;        06 00     set software interrupt vector number
;        06 01     set background task interval time
;        06 02     set laser control word
;        06 03     --
;        06 04     set laser turn-off delay
;        06 05     set laser turn-on delay
;        06 06     set lase home position
;        07 xx   background task execution control
;        07 00     execute command queue to current point and stop
;        [illegible]     execute command queue to current [illegible], stop, and [illegible]
;        [illegible]     [illegible] command queue (reset queue & start pointer)
;        [illegible]   background task redraw control
;        [illegible]     [illegible]
;        [illegible]     set redraw pass count
;        [illegible]     set redraw delay
;        [illegible]     [illegible]
;        [illegible]     [illegible] multi-pass redraw
;
;============================================================================
[illegible]
;============================================================================
;
;         Laser [illegible] Interface
;        Interrupt Handler
;
;        All calls have the following format:
;
;                [illegible] = function code
;                al = sub-function code if applicable
;
;                [illegible] are call dependent
;
;        On return, the following is always true:
;
;                al = error code:        0 - operation was successful
;                                      255 - internal error, please report
;
;============================================================================

;
;        software interrupt entry point

laser_swi:
        call    far ptr laser_entry
        iret

laser_entry proc far
        ;
        ;  save the working registers on the user's stack for
        ;  the moment until we can switch to the internal stack
        ;
```

```
        pushf
        push    es
        push    di
        push    si
        push    ds
        push    ax
        push    bx
        push    cx
        push    dx
        push    bp
        mov     bp,sp

        mov     ax,LaserData            ;point to laser system variables
        mov     ds,ax
        mov     ax,LaserQueue           ;point to laser system queue
        mov     es,ax

        ;
        ;  decode the function call and dispatch it
        ;
        mov     ax,[bp].p_ax
        mov     return_code,err_none

        ;
        ;  convert AH into an index into the function table
        ;
        mov     al,ah                   ;compute jump table offset
        xor     ah,ah
        shl     ax,1
        cmp     ax,funct_tbl_end
        jb      entry_1
        mov     return_code,err_bad_param       ;invalid function code
        jmp     entry_2

        ;
        ;  call the appropriate procedure
        ;
entry_1:
        mov     bx,ax
        call    word ptr cs:[bx + offset funct_tbl]

        ;
        ;  return to caller with return code
        ;
entry_2:
        mov     ax,[bp].p_ax
        mov     al,return_code
        mov     [bp].p_ax,ax
        mov     sp,bp
        pop     bp
        pop     dx
        pop     cx
        pop     bx
        pop     ax
        pop     ds
        pop     si
        pop     di
        pop     es
        popf
        ret
```

```
[illegible]        Page [illegible]                [illegible]    [illegible]

laser_entry endp

funct_tbl label word
        dw      open_laser_and_init       ;0
        dw      close_laser_and reset     ;1
        dw      add_to_bcmd queue         ;2
        dw      reset_bcmd_queue          ;3
        dw      get_bcmd_queue_size       ;4
        dw      get_option                ;5
        dw      set_option                ;6
        dw      bkgnd_exec_ctrl           ;7
        dw      redraw_ctrl               ;8
funct_tbl_end equ $-funct_tbl

subttl  setinterrupt
page
;===========================================================================
;
;       [illegible] register [illegible]
;
;                 [illegible] Routine
;                 [illegible] interrupt type number
;       [illegible] return, [illegible] contains the [illegible] interrupt vector
;
;===========================================================================
setinterrupt proc near
        push    ds
        push    es
        push    [illegible]
        push    [illegible]
        [illegible]
        push    ax
        [illegible]    [illegible]                        ;first return old vector
        mov     ah,35h                        ;it will be in ES:BX
        [illegible]    [illegible]
        mov     [illegible]                        ;save [illegible]
        [illegible]    [illegible]                        ;now set the new vector
        mov     ah,25h
        [illegible]    [illegible]                        ;pop [illegible] into Dx and so that
        pop     bx                            ;  DS:DX is the desired value
        mov     ds,bx
        push    es                            ;save ES and CX
        push    cx
        int     21h
        pop     ax                            ;restore ES:CX as BX:AX and
        pop     bx                            ;  return
        pop     dx
        pop     cx
        pop     es
        pop     ds
        ret

setinterrupt endp

subttl  Software Interrupt Functions
page

soft_ins proc near
```

```
[illegible].ASM - Page 31                    4/15/1988  [illegible] PM

;-------------------------------------------------------------------------------
;
;       AH = 00:  open_laser_and_init
;
;       Install background task and initialize variables.
;
;       if BX [illegible] then use BX to set new background interrupt interval
;         else use previously defined time interval value
;
;-------------------------------------------------------------------------------
open_laser_and_init:
        call    reset_tcmd_queue
        mov     bx,[bp].p_bx
        or      bx,bx
        jnz     open_1
        mov     bx,bkgnd_intr_time
open_1:
        call    set_ports
        [illegible]     set [illegible]
        [illegible]     [illegible]
        [illegible]

;       [illegible]

;       [illegible]     output  mode 0
;       [illegible]     output  mode 0
;       [illegible]     input   mode 0
;       [illegible]     input   mode 0
;
set_ports:
                [illegible]
        [illegible]     [illegible]                  ;output control, [illegible]
        out     [illegible],al                  ;  [illegible] reset ports
        [illegible]     [illegible]                  ;[illegible] ports
        [illegible]     [illegible]
        [illegible]     [illegible],al                  ;port A1, DAC value [illegible]
        [illegible]     [illegible]
        [illegible]     [illegible],al                  ;port B1
        inc     dx
        mov     dx,portC1
        mov     al,0FFh
        out     dx,al                   ;port C1, strobes high
        ret
page

;-------------------------------------------------------------------------------
;
;       AH = 01:  close_laser_and_reset
;
;       Stop background task and clean-up system as much as possible.
;
;-------------------------------------------------------------------------------
close_laser_and_reset:
        call    bkg_rmv
        mov     bkgnd_mode,_static      ;static state
        ret
page
;-------------------------------------------------------------------------------
```

```
;
;       AH = 02:  add command to background task's queue
;
;         AL     COMMAND TYPE ADDED
;         00     vector move/draw
;         01     shutter open
;         02     shutter closed
;         03     change time base
;         04     pause
;
 -------------------------------------------------------------------------------
addbcmd_tbl label word
        dw      add_vector
        dw      add_shutter_open
        dw      add_shutter_close
        dw      add_change_timebase
        dw      add_pause
addbcmd_tbl_end equ $-addbcmd_tbl

add_to_bcmd_queue:
        test    [illegible]_status,is_open   ;[illegible] add vector [illegible] [illegible], [illegible]
        jnz     add_bcmd1
        mov     return_code,err_not_open
        ret
add_bcmd1:
        call    get_[illegible]                  ;check for room in background queue
        cmp     ax,bcmd_queue_limit
        jb      add_bcmd2
        mov     return_code,err_queue_full
        ret
add_bcmd2:
        [illegible]      [illegible]
        mov     di,bcmd_queue_end
        mov     es:[di],al                  ;store command type
        inc     di
        [illegible]      [illegible]
        [illegible]      ax,1
        cmp     ax,addbcmd_tbl_end
        jb      add_bcmd3
        mov     return_code,err_bad_param       ;invalid function
        ret
        ;
        ;  call appropriate function
        ;
add_bcmd3:
        mov     bx,ax
        call    word ptr cs:[bx + offset addbcmd_tbl]
        ret

;
;       AX = 0200:  add vector
;
;       Add vector to background command queue.
;
;       ES:BX points to vector packet:
;       byte    0 - startX fractional  (start coordinates)
;             1,2 - startX integer
;               3 - startY fractional
;             4,5 - startY integer
;             6,7 - deltaX fract/int  (change coordinates)
```

```
;               8,9 - deltaY fract/int
;             10,11 - incr  (# of steps)
;
bcd_vector:
        push    ds
        mov     ds,[bp].p_es            ;ES:BX point to vector packet
        mov     si,[bp].p_bx
        cld
        mov     cx,(move_size+1)/2
        rep movsw
        pop     ds
        mov     bx,move_size
        jmp     end_store

;
        AX = 0201:  background shutter open
;
;       Open laser beam shutter in-line with background sequencing.
;
[illegible]
        mov     bx,open_shutter_size
        jmp     end_store

;
        AX = 0202:  background shutter close
;
;       Close laser beam shutter in-line with background sequencing.
;
bcd_shutter_close:
        mov     bx,close_shutter_size
        jmp     end_store

;
        AX = 0203:  background change time base
;
;       Change interrupt time base in-line with background sequencing.
;
bcd_change_timebase:
        mov     bx,[bp].p_bx
        mov     es:[di],bx
        mov     bx,change_timebase_size
        jmp     end_store

;
;       AX = 0204:  temporarily pause background task
;
;       Pause background processing in-line with background sequencing.
;
bcd_pause:
        mov     bx,[bp].p_bx
        mov     es:[di],bx
        mov     bx,pause_size

;
;  finish off storing to background queue
;
end_store:
        mov     ax,bcmd_queue_end       ;next end index
        add     ax,bx
        cmp     ax,bcmd_queue_limit     ;next start index
```

```
        jb      end_store1
        mov     di,ax                   ;store queue max token
        mov     es:[di],byte ptr [illegible]
        mov     ax,0                    ;wraparound queue
end_store1:
        mov     bcmd_queue_end,ax
        ret
page

;------------------------------------------------------------------------
;
;       AH = 07:  reset_bcmd_queue
;
;       Throw away all commands currently in background command queue.
;       Current background task operations are suspended.
;
;------------------------------------------------------------------------
reset_bcmd_queue:
        [illegible]                                     [illegible]

        [illegible]
        mov     [illegible]_queue_start
        [illegible]                     [illegible] to zero length
        mov     bcmd_queue_start,[illegible]   and make background routine [illegible]
        [illegible]
        [illegible]_queue_end
        [illegible]
        current_[illegible] [illegible]
        [illegible]
        [illegible]                     [illegible]
        pop
        [illegible]
page

;------------------------------------------------------------------------
;
;       AH = [illegible]:  get_bcmd_queue_size
;
;       Return the number of bytes currently used by background command
;       queue in BX.
;
;------------------------------------------------------------------------
get_bcmd_queue_size:
        call    get_size
        mov     [bp].p_bx,ax
        ret

get_size:
        pushf
        cli
        mov     ax,bcmd_queue_end               ;try end-start
        sub     ax,bcmd_queue_start
        jnc     get_size1
        ;
        ;  add in background command queue size for negative numbers
        ;     won't be perfectly accurate on queue wraparound
        ;
        add     ax,bcmd_queue_size
get_size1:
        popf
```

```
        ret
page

;-----------------------------------------------------  --------------------
;
;       AH = 05:  get_option
;
;       Return laser control option:
;
;         AL    OPTION RETURNED
;         00    software interrupt vector number
;         01    background task interval time
;         02    laser control word
;         03    laser status
;         04    laser turn-off delay tick count
;         05    laser turn-on delay tick count
;         06    laser beam home position

;-------- --  --------------------------------------------------------------
goptn_tbl       label   word
                        get_int_vector
                dw      get_b_int_time
                dw      get_laser_ctrl
                dw      get_status
                dw      get_off_count
                dw      get_on_count
                dw      get_home_pos
goptn_tbl_end   equ     $-goptn_tbl

get_option:
        mov     ax,[bp].p_ax
        xchg    ah,al
        shl     ax,1
        cmp     ax,goptn_tbl_end
        jb      go_1
        mov     ah,bad_param                    ;invalid function
        ret

go_1:   ;
        ;  call appropriate function
        ;
        mov     bx,ax
        call    word ptr cs:[bx + offset goptn_tbl]
        ret

;
;       AX = 0500:  get software interrupt vector number
;
;       BL gets interrupt vector number
;
get_int vector:
        mov     ax,swi_int
        mov     bx,[bp].p_bx
        mov     bl,al
        mov     [bp].p_bx,bx
        ret

;
;       AX = 0501:  get background task interrupt interval time
;
```

```
[illegible] - Page [illegible] -                    [illegible]   [illegible] PM

;        BX gets timer parameter:
;          [illegible] 1.19 MHz    e.g. if BX = [illegible]  freq is 100 us
;
;
get_[illegible]_time:
        mov     bx,[illegible]_intr_time
        mov     [bp].p_bx,bx
        ret

;
;        AX = 0502:  get laser control word
;
[illegible]_laser_ctrl:
        mov     bx,laser_control
        mov     [bp].p_bx,bx
        ret

;
;        [illegible] laser status
;
[illegible]
        [illegible]     [illegible] status        ;return current status in [illegible]
        [illegible]     [bp].p [illegible]
        [illegible]     [illegible]               ;return [illegible] in [illegible]
        [illegible]
        [illegible]
        [illegible]
        [illegible]
        [illegible]
        [illegible]
        mov     [illegible]
        [illegible]

;        [illegible] get laser [illegible] count
;
get [illegible]:
        [illegible]     [illegible]_delay_count       ;return [illegible] tick count
        mov     [bp].p_bx,bx
        ret

;
;        AX = 0505:  get laser turn-on delay count
;
get on_count:
        mov     bx,on_delay_count       ;return on tick count
        mov     [bp].p_bx,bx
        ret

;
;        AX = 0506:  get laser home position
;
[illegible]:
        mov     bx,HomeXpos
        mov     [bp].p bx,bx            ;home X-position in BX
        mov     cx,HomeYpos
        mov     [bp].p_cx,cx            ;home Y-position in CX
        ret
page
```

```
;------------------------------------------------------------------------
;
;       AH = 06:  set_option
;
;       Change laser control option:
;
;         AL    OPTION CHANGED
;         00    software interrupt vector number
;         01    background task interval time
;         02    laser control word
;         03    -
;         04    laser turn-off delay tick count
;         05    laser turn-on delay tick count
;         06    laser beam home position
;
;------------------------------------------------------------------------
soptn_tbl label word
        dw      set_int_vector
        dw      set_bkgd_time
        dw      set_laser_cntl
        dw      no_op
        dw      set_off_count
        dw      set_on_count
        dw      set_home_pos
soptn_tbl_end equ $-soptn_tbl

set_option:
        mov     ax,[bp].p_ax
        xor     ah,ah
        shl     ax,1
        cmp     ax,soptn_tbl_end
        jb      so_1
        mov     return_code,err_bad_param       ;invalid function
        ret

        ;
        ; call appropriate function
        ;
so_1:
        mov     bx,ax
        call    word ptr cs:[bx + offset soptn_tbl]
no_op:
        ret

;
;       AX = 0600:  set software interrupt vector number
;
;       if BL = 0,
;         then if vector previously set, then restore old vector
;         else do nothing
;       else use BL to set software interrupt vector number
;
set_int_vector:
        mov     bx,[bp].p_bx
        or      bl,bl
        jz      set_int_1
        xor     bh,bh
        mov     swi_int,bx
        mov     dx,bx
        mov     ax,offset laser_swi
        mov     bx,cs
```

```
        call    setinterrupt
        or      current_status.ls interrupt
        mov     swi_seg,bx
        mov     swi_ofs,ax
        ret

set_int_1:
        ;
        ;  restore old interrupt vector
        ;
        test    current_status.ls interrupt
        jnz     set_int_2
        ret

set_int_2:
        mov     bx,swi_seg
        mov     ax,swi_ofs
        mov     dx,swi_int [illegible]
        [illegible]
        [illegible]
        [illegible]

[illegible]

[illegible]

[illegible]
        mov     [illegible]
        [illegible]
        [illegible]
        [illegible]

;
;       [illegible] set [illegible]
;
set_laser_ctrl:
        mov     bx,[bp].p_bx
        mov     laser_control,bx

        ;
        ;  set control bits
        ;
set_ctrl:
        mov     dx,portC1
        in      al,dx                   ;read existing port C1 bits
        test    laser_control.shutter   ;update for shutter
        jnz     shutter_closed
shutter_open:
        and     al,all-shutter_ctrl
        jmp     shutter_str
shutter_closed:                         ;shutter closed if shutter [illegible]
        or      al,shutter_ctrl
shutter_str:
        out     dx,al
        ret
```

```
;
;       AX = 0604:  set laser turn-off delay count
;
set_off_count:
        mov     bx,[bp].c_bx            ;set off tick count
        mov     off_delay_count,bx
        ret

;
;       AX = 0605:  set laser turn-on delay count
;
set_on_count:
        mov     bx,[bp].c_bx            ;set on tick count
        mov     on_delay_count,bx
        ret

;
;       AX = 0606:  set laser home position
;
[illegible]
        mov     bx,[bp].c_bx            ;home X-position in BX
        mov     homexpos,bx
        mov     cx,[bp].c_cx            ;home Y-position in CX
        mov     homeypos,cx
        ret
page
;--------------------------------------------------------------------------
;
;       AH = 07h:  control background task's execution
;
;     (functional when Block Mode is on - laser control bit 2)
;
;          AL     EXECUTION CONTROL ESTABLISHED
;          00     execute command block
;          01     execute and clear command block
;          02     clear command block
;
;--------------------------------------------------------------------------
exec_ctrl_tbl label word
        dw      exec
        dw      exec_clear
        dw      clear
exec_ctrl_tbl_end equ $-exec_ctrl_tbl

cmnd_exec_ctrl:
        test    current_status.ls_open  ;continue only if channel open
        jnz     exec_ctrl1
        mov     return_code,err_not_open
        ret
exec_ctrl1:
        test    laser_control.block_mode        ;  and in block mode
        jnz     exec_ctrl2
        mov     return_code,err_not_block
exec_ctrl2:
        mov     ax,[bp].c_ax
        mov     di,bcmd_queue_end
        xor     ah,ah
        shl     ax,1
        cmp     ax,exec_ctrl_tbl_end
```

```
        jc      exec_call
        mov     return_code,err_bad_param       ;invalid function
        ret
        ;
        ;  call appropriate function
        ;
exec_call:
        mov     bx,ax
        call    word ptr cs:[bx + offset exec_ctrl_tbl]
        ret

;
        AX = 0700:  execute command block
;
        Execute command queue entries from last Clear Operation to
;       the last command entered.
;
exec:
        [illegible]     [illegible]             ;check for full exec queue
        [illegible]     si,1..
        [illegible]     [illegible]
        [illegible]     [illegible] queue limit
        [illegible]     [illegible]
        [illegible]     [illegible]             ;wraparound

        [illegible]     [illegible] queue_start ;full if indexes are equal
        jne     exec0
                [illegible] limit
        ret
exec0:
        mov     ax,clear_pointer
        [illegible]     [illegible]             ;next set block to execute:
        add     [illegible]             ; from clear_pointer (set by clear
        [illegible]     [illegible] queue_end   ; routine) to current end of
        [illegible]     [illegible]             ; command queue
                [illegible]             ;
        ret

;
        AX = 0701:  execute and clear command block
;
;       Execute command queue entries from last Clear Operation
;       and then Clear.
;
exec_clear:
        call    exec                    ;set up exec block
        cmp     return_code,0
        je      clear                   ;fall into clear if no error
        ret

;
;       AX = 0702:  clear command block
;
;       Reset the start of the command block for future Execute Operations.
;
clear:
        mov     ax,bcmd_queue_end       ;set clear pointer to current end
        mov     clear_pointer,ax        ; of command queue
        ret
page
```

```
[illegible]                                    4/15/1988  [illegible]

;-----------------------------------------------------------------------
;
;       AH = 08:  background task's redraw control
;
;         AL     REDRAW CONTROL ESTABLISHED
;         00     set multi-pass step periods
;         01     set redraw count
;         02     set redraw delay
;         03     mark position
;         04     perform multi-pass redraw
;
;-----------------------------------------------------------------------
redraw_ctrl_tbl label word
        dw      add_set_periods
        dw      add_set_redraw_count
        dw      add_set_redraw_delay
        dw      add_mark_position
        [illegible]
[illegible]     [illegible]

[illegible]
        test    current_status.is_open  [illegible] channel open
        jz      redraw_ctrl1
        mov     return_code.err_not_open
        ret
redraw_ctrl1:
        test    laser_control.block_mode        ; [illegible] in block mode
        jnz     redraw_ctrl2
        mov     return_code.err_not_block
[illegible]
        [illegible]                             ;check for near-full queue
        [illegible]     [illegible]_queue_limit
        jc      redraw_ctrl3
        mov     return_code.err_queue_full
        ret
redraw_ctrl3:
        mov     [illegible]
        sub     al,5                            ;token val = subcmd # - 5
        mov     di,bcmd_queue_end
        mov     es:[di],al                      ;store token
        inc     di
        mov     ax,[bp].p_ax
        xor     ah,ah
        shl     ax,1
        cmp     ax,redraw_ctrl_tbl_end
        jc      redraw_call
        mov     return_code.err_bad_param       ;invalid function
        ret
        ;
        ;  call appropriate function
        ;
redraw_call:
        mov     bx,ax
        call    word ptr cs:[bx + offset redraw_ctrl_tbl]
        ret

;
;       AX = 0800:  add set multi-pass step periods to command queue
;
```

```
;       Add the set multi-pass step periods token and the variable
;       size argument to the Background Command Queue
;
;       ES:DX points to step periods array:
;       byte    0 - number of step periods (byte)
;            1,2 - step period pass 0      (word)
;            3,4 - step period pass 1      (word)
;            etc.
;
add_set_periods:
        push    ds
        mov     ds,[bp].p_es                    ;ES:BX points to step periods array
        mov     si,[bp].p_bx
        cld                                     ;for movsw, DS:SI+ -> ES:DI+
        mov     cl,ds:[si]                      ;get # step periods, word count
        mov     ch,0
        mov     es:[di],cl
        inc     si
        inc     di
        [illegible]                             [illegible]
        [illegible]
        [illegible]
add_set_periods1:
        [illegible]
        [illegible]                             ;compute laser command size
        [illegible]     bx,set_periods_size
        rep movsw
        pop     ds
        jmp     end_store

;       AX = 0801:  add set redraw count to command queue
;
;       Add the set redraw count token and argument to the
;       Background Command Queue
;
add_set_redraw_count:
        mov     bx,[bp].p_bx
        mov     es:[di],bx
        mov     bx,set_redraw_count_size
        jmp     end_store

;
;       AX = 0802:  add set redraw delay to command queue
;
;       Add the set redraw delay token and argument to the
;       Background Command Queue
;
add_set_redraw_delay:
        mov     bx,[bp].p_bx
        mov     es:[di],bx
        mov     bx,set_redraw_delay_size
        jmp     end_store

;
;       AX = 0803:  add mark position to command queue
;
;       Add the mark position token to the Background Command Queue
;
add_mark_position:
```

```
        mov     bx,man_size
        jmp     end_store

;
;       Ax = 08u4:  add redraw to command queue
;
;       Add the redraw token to the Background Command Queue
;
add_redraw:
        mov     bx,redraw_size
        jmp     end_store

sort_fns endp

endcode label far

LaserCode ends
```

```
'==============================================================================
'  3D Systems Stereolithography System Software
'==============================================================================
'
'  MATERIAL.BAS
'  SLA-1 Material Manager Software
'
'------------------------------------------------------------------------------
'
'  History:
'  12/01/87  Ver 2.30  first release
'  12/14/87  Ver 2.40  handles line widths min and max, computes MSA
'  12/17/87  Ver 2.41  FN zero conditions handled (divide, LOG)
'   1/08/88  Ver 2.50  relabeled Calc MSA due to MSA concept problems
'   1/25/88  Ver 2.60  version update only
'   3/09/88  Ver 2.80  added copyright notice
'   4/09/88  Ver 3.00  production release
'
'------------------------------------------------------------------------------

 DIM SP[20],LH[20],WMIN[20],WMAX[20]

 VersionId$ = "3.00"
 TRUE = -1
 FALSE = 0
 ScanFlag% = FALSE

 SingleBar$ = STRING$(45,196)
 PowerFile$        = "POWER.LST"
 LastMaterialFile$  = "MATERIAL.LST"

 COLOR 15
MatAsk:
 CLS
 PRINT SingleBar$
 PRINT "  MATERIAL, Material Manager"
 PRINT "  Version "+VersionId$
 PRINT "  Copyright (C) 1988 by 3D Systems, Inc."
 PRINT "  3D Systems Laser Stereolithography System"
 PRINT SingleBar$
 PRINT
 IF LEN(MaterialFile$)>0 THEN PRINT "     Material File: ";MaterialFile$
 PRINT
 PRINT "     1. Load Material Data"
 PRINT "     2. View Material Data"
 PRINT "     3. Input New Material Data"
 PRINT "     4. Layer Thickness Information"
 PRINT "     Q. Quit"
 PRINT
 PRINT "     Option: ";
MatAskLoop:
 A$ = UCASE$(INKEY$)
 IF LEN(A$)=0 THEN MatAskLoop
 PRINT A$;
 IF A$="1" THEN LoadMaterial
 IF A$="2" THEN ViewMaterial
 IF A$="3" THEN InputMaterial
 IF A$="4" THEN LayerInfo
 IF A$="Q" THEN END
```

```
MATERIAL.BAS   - Page 2 -                  4/15/1988   5:12 PM

'------------------------------------------------------------------------------

LoadMaterial:
  CLS
  PRINT "Available Material Files:"
  PRINT
  ON ERROR GOTO NoMaterialFiles
  FILES "*.MAT"
  GOTO GetMaterialAsk
NoMaterialFiles:
  PRINT "- no material files in working directory -"
  RESUME GetMaterialAsk
GetMaterialAsk:
  PRINT
  INPUT "Name of data file to read: ",MaterialFile$
  IF LEN(MaterialFile$)=0 THEN MatAsk
  MaterialFile$ = UCASE$(MaterialFile$)
  IF INSTR(MaterialFile$,".")=0 THEN MaterialFile$ = MaterialFile$ + ".MAT"
  ON ERROR GOTO CantReadMaterialFile
  GOSUB GetMaterialFileData
  OPEN LastMaterialFile$ FOR OUTPUT AS #9
  PRINT #9,MaterialFile$
  CLOSE #9
  GOTO MatAsk

GetMaterialFileData:
  OPEN MaterialFile$ FOR INPUT AS #7
  ON ERROR GOTO 0
  INPUT #7,MaterialLaserPower
  INPUT #7,NumberOfPairs%
  FOR I% = 1 TO NumberOfPairs%
    INPUT #7,SP(I%)
    INPUT #7,LH(I%)
    INPUT #7,WMIN(I%)
    INPUT #7,WMAX(I%)
    SP(I%) = LOG(SP(I%))/LOG(10)
  NEXT I%
  CLOSE #7
  CALL Regression(LH(),LHSlope,LHYint,LHRval)
  CALL Regression(WMIN(),WMINSlope,WMINYint,WMINRval)
  CALL Regression(WMAX(),WMAXSlope,WMAXYint,WMAXRval)
  RETURN

CantReadMaterialFile:
  PRINT "Can't read material file ";MaterialFile$
  CLOSE #7
  RESUME GetMaterialAsk


'------------------------------------------------------------------------------

InputMaterial:
  CLS
  PRINT "INPUT MATERIAL DATA"
  PRINT
  PRINT
  INPUT "Name of Material Data File: ",MaterialFile$
  MaterialFile$ = UCASE$(MaterialFile$)
  IF LEN(MaterialFile$)=0 THEN MatAsk
  IF INSTR(MaterialFile$,".")=0 THEN MaterialFile$ = MaterialFile$ + ".MAT"
```

```
  PRINT
  INPUT "Enter Material Test Laser Power Reading (mW): ",MaterialLaserPower
  INPUT "How many Step Period/Line Height data pairs? ",NumberOfPairs%
  PRINT
  ON ERROR GOTO 0
  FOR I% = 1 TO NumberOfPairs%
  PRINT "Data pair #";I%;":  ";
    INPUT "SP = ",SP(I%)
    LOCATE CSRLIN-1,30
    INPUT " LH = ",LH(I%)
    IF SP(I%)=0 OR LH(I%)=0 THEN MatAsk     ' abort
    SP(I%)=LOG(SP(I%))/LOG(10)              ' convert to log(sp)
    LOCATE CSRLIN-1,45
    INPUT "WMIN = ",WMIN(I%)
    LOCATE CSRLIN-1,60
    INPUT "WMAX = ",WMAX(I%)
  NEXT I%
  OPEN MaterialFile$ FOR OUTPUT AS #7
  PRINT #7,MaterialLaserPower
  PRINT #7,NumberOfPairs%
  FOR I% = 1 TO NumberOfPairs%
    PRINT #7,10^SP(I%)
    PRINT #7,LH(I%)
    PRINT #7,WMIN(I%)
    PRINT #7,WMAX(I%)
  NEXT I%
  CLOSE #7
  OPEN LastMaterialFile$ FOR OUTPUT AS #9
  PRINT #9,MaterialFile$
  CLOSE #9
  CALL Regression(LH(),LHSlope,LHYint,LHRval)
  CALL Regression(WMIN(),WMINSlope,WMINYint,WMINRval)
  CALL Regression(WMAX(),WMAXSlope,WMAXYint,WMAXRval)
  GOTO MatAsk

'-------------------------------------------------------------------------------

ViewMaterial:
  CLS
  PRINT "Data from Material File: ";MaterialFile$
  PRINT
  PRINT
  PRINT "Material Test Laser Power Reading: ";
  PRINT USING "###.##";MaterialLaserPower
  PRINT
  PRINT NumberOfPairs%;"Material Data Pairs:"
  PRINT
  FOR I% = 1 TO NumberOfPairs%
    PRINT USING "##. ";I%;
    PRINT USING "  SP = ####.##";10^SP(I%);
    LOCATE ,20
    PRINT USING "  LH = ####.##";LH(I%);
    LOCATE ,35
    PRINT USING "  WMIN = ####.##";WMIN(I%);
    LOCATE ,52
    PRINT USING "  WMAX = ####.##";WMAX(I%)
  NEXT I%
  PRINT
  PRINT "  LH:  Slope =";
  PRINT USING "#####.##";INT(LHSlope*1000)/1000;
```

```
 PRINT "   Y-Intercept =";
 PRINT USING "#####.##";INT(LHYint*100)/100;
 PRINT "   R-Value =";
 PRINT USING "#####.##";INT(LHRval*1000)/1000
 PRINT "WMIN:  Slope =";
 PRINT USING "#####.##";INT(WMINSlope*1000)/1000;
 PRINT "   Y-Intercept =";
 PRINT USING "#####.##";INT(WMINYint*100)/100;
 PRINT "   R-Value =";
 PRINT USING "#####.##";INT(WMINRval*1000)/1000
 PRINT "WMAX:  Slope =";
 PRINT USING "#####.##";INT(WMAXSlope*1000)/1000;
 PRINT "   Y-Intercept =";
 PRINT USING "#####.##";INT(WMAXYint*100)/100;
 PRINT "   R-Value =";
 PRINT USING "#####.##";INT(WMAXRval*1000)/1000
 PRINT
 INPUT "Press Enter to continue... ",A$
 GOTO MatAsk

'------------------------------------------------------------------------------

LayerInfo:
 CLS
 PRINT "LAYER THICKNESS INFORMATION"
 PRINT
 PRINT
 INPUT "Desired max layer thickness (mils): ",T$
 T = VAL(T$)    ' to simulate cure depth
 IF T=0 THEN GOTO MatAsk
 PRINT
 PRINT
 WMIN = FN GetLog(T+6,WMINSlope,WMINYint)
 WMAX = FN GetLog(T+6,WMINSlope,WMINYint)
  MSA = 180/3.1415926535*(2*T/(WMIN+WMAX))    ' wrong
  IF MSA<0 THEN MSA=0
  IF MSA>89.999 THEN MSA=90
 PRINT USING "WMIN = ####.##";WMIN;
 PRINT USING "   WMAX = ####.##";WMAX
  PRINT USING "   MSA = ###.##";MSA    don't show yet
 PRINT
 INPUT "Press Enter to continue... ",A$
 GOTO MatAsk

'------------------------------------------------------------------------------

SUB Regression(Array(1),Slope,Yint,Rval)
  SHARED NumberOfPairs%,SP()
  XY        = 0
  SUMX      = 0
  SUMY      = 0
  SUMY2     = 0
  XSQUARED = 0
  IF NumberOfPairs%<1 THEN
    Slope = 0
    Yint  = 0
    Rval  = 0
    GOTO EndRegSub
  END IF
  FOR I% = 1 TO NumberOfPairs%
```

```
MATERIAL.BAS   - Page 5 -                    4/15/1988   5:12 PM

     XY = XY + SP(I%) * Array(I%)
     SUMX = SUMX + SP(I%)
     SUMY = SUMY + Array(I%)
     SUMY2 = SUMY2 + Array(I%)^2
     XSQUARED = XSQUARED + SP(I%)^2
   NEXT I%
   Denom = XSQUARED - (SUMX^2) / NumberOfPairs%
   IF Denom < 1E-5 THEN Slope = 0_
   ELSE Slope = (XY - (SUMX*SUMY)/NumberOfPairs%) / Denom
   Yint = SUMY/NumberOfPairs% - Slope * SUMX/NumberOfPairs%
   Denom = SUMY2 - SUMY^2 / NumberOfPairs%
   IF Denom < 1E-5 THEN Rval = 0_
   ELSE Rval = SQR(((Yint * SUMY + Slope * XY) - SUMY^2/NumberOfPairs%) / Denom)
EndRegSub:
END SUB

DEF FN GetLog(DataPoint,Slope,Yint)
   IF DataPoint > 0 THEN
     FN GetLog = Slope * LOG10(DataPoint) + Yint
   ELSE
     FN GetLog =
   END IF
END DEF

 ================================================================================

    UTILITY FUNCTIONS AND PROCEDURES

 --------------------------------------------------------------------------------

   Removes all double spaces in CmdLine$

RemoveDoubleSpaces:
   WHILE INSTR(CmdLine$,"  ")>0
     I = INSTR(CmdLine$,"  ")
     CmdLine$ = left$(CmdLine$,I) + mid$(CmdLine$,I+2,99)
   WEND
   RETURN


 '   Find any char of Char$ in Main$ starting at index Start
 '   Returns LEN(Main$)+1 if no character of Char$ in Main$

 DEF FN FindStr(Start%,Main$,Char$)
   LOCAL I%,J%,MIN%
   MIN% = LEN(Main$) + 1
   FOR I%=1 to LEN(Char$)
     J% = INSTR(Start%,Main$,MID$(Char$,I%,1))
     IF (J% > 0) AND (J% < MIN%) THEN MIN% = J%
   NEXT I%
   FN FindStr = MIN%
 END DEF

 '
 '   Make a string from a number without a leading space
 '
 DEF FN StrNoSp$(Num)
   LOCAL A$
   A$=STR$(Num)
   IF LEFT$(A$,1)=" " THEN A$=RIGHT$(A$,LEN(A$)-1)
```

```
  FN StrNoSp$ = A$
END DEF
'
'  Pick out a number from a string
'  starting at Index and going to the next space or comma or end-of-string

SUB UnitValInt(Storage&,Text$,Index%)
  Storage& = VAL(MID$(Text$,Index%))
  Index% = FN FindStr(Index%,Text$," ,") + 1
END SUB

SUB UnitVal(Storage,Text$,Index%)
  Storage = VAL(MID$(Text$,Index%))
  Index% = FN FindStr(Index%,Text$," ,") + 1
END SUB


   Pick out text from a string
   starting at Index and going to the next comma or end-of-string

SUB UnitStr(Storage$,Text$,Index%)
  LOCAL I%
  I% = FN FindStr(Index%,Text$,",")
  Storage$ = MID$(Text$,Index%,I%-Index%)
  Index% = I% + 1
END SUB


   Remove excess spaces around string
'
DEF FN NoSp$(Text$)
  LOCAL S%,E%
  IF LEN(Text$)>0 THEN
    S% = 1
    WHILE MID$(Text$,S%,1)=" "
      INCR S%
    WEND
    E% = LEN(Text$)
    WHILE E%>S%+1 AND MID$(Text$,E%,1)=" "
      DECR E%
    WEND
    FN NoSp$ = MID$(Text$,S%,E%-S%+1)
  ELSE
    FN NoSp$ = ""
  END IF
END DEF
'  Can't open file.  Report this to operator.
'
CantOpen:
  CALL SystemError("Can't open file "+FileName$)
  END

'-----------------------------------------------------------------------------
'
'  Show error and store it on disk
'
SUB SystemError(Text$)
```

```
  PRINT Text$
  OPEN "C:\SYSTEM.ERR" FOR OUTPUT AS #9
  PRINT #9,"PREPARE: ";Text$
  CLOSE #9
END SUB
```

```
MENU.PAS   - Page 1 -                       4/15/1988   3:13 PM

{=============================================================================
   3D Systems Stereolithography System Software
 =============================================================================

   MENU.PAS
   SLA-1 Menu Software

 -----------------------------------------------------------------------------

   History:
   11/12/87  Ver 2.30  first Beta software release
   11/20/87  Ver 2.31  ENTER for Exit option fix
   11/23/87  Ver 2.32  pauses for Turbo Basic error messages
   11/24/87  Ver 2.33  converted from Turbo Basic to Turbo Pascal
                       SHELL's no longer eat up 64K or main memory
                       Consolidated Profiler & Calibrator
                       Added Materials Manager to Utility Menu
                       Added Change Directory to Dos Menu
                       Alt-F9 View Option History added
   12/01/87  Ver 2.34  fixed date format
   12/14/87  Ver 2.35  using BEAM instead of CALIB and PROFILE
   12/16/87  Ver 2.40  resets Text Mode when returning from Shell
   12/16/87  Ver 2.41  clearing of screen for pause fixed
                       prevent double pause (esp for directory)
   12/17/87  Ver 2.42  revitalize cursor before running Shells
   12/24/87  Ver 2.43  better cursor on/off routines
                       'X' input at ExitSystem verify ignored
    1/02/88  Ver 2.50  TESTPART program access added
    1/25/88  Ver 2.60  version update only
    2/12/88  Ver 2.61  1900 + year in resetting system date
    3/09/88  Ver 2.80  added copyright notice
                       installed new chronometer system
    4/04/88  Ver 3.00  added menu changes
    4/08/88  ver 3.01  SUPER renamed to BUILD

 -----------------------------------------------------------------------------
}

{$R-,S-,I+,D+,T-,F-,V+,B-,N-,L+ }
{$M 4096,0,0 }

program MenuProgram;
uses Crt,Dos;

type
  str4   = string[4];
  str10  = string[10];
  str16  = string[16];
  str40  = string[40];
  str80  = string[80];
  str100 = string[100];
  HistoryType = record
    MenuOption: Byte;
    mon,day,hour,min: Byte;
  end;
  DateType = record
    year : Word;
    month: Word;
    day  : Word;
  end;
  TimeStampType = record
```

```
    year : word;
    month: Word;
    day  . Word;
    hour : word;
    minu : Word;
    sec  : Word;
  end;
  YearType = (NotLeapYear,LeapYear);

var
  Fnkey,CmdChr,key,key2: Char;
  IOerr,CmdVal,ordkey: Integer;
  Row,Menu.Indent: Integer;
  Mon.Day.Year,Hour,Minu,Sec,WeekDay: Integer;
  whenToExecute.ChronoOffset: array[1..32] of LongInt;
  WhatToExecute: array[1..32] of str40;
  code,i.ChronoPtr: Integer;
  PausedFlag,ErrorFlag.NoInterval: Boolean;
  Line,CurrentDate,CurrentTime: str80;
  temp.SingleBar.DoubleBar: str[illegible];
  CurrentLine: str[illegible]
  cmd: str[illegible];
  regs: Registers;
  SystemFile.ChronoFile.ErrorFile: Text;
  MenuPos: array[1..3] of Integer;
  OptionHistory: array[1..19] of HistoryType;
  StartHistory,EndHistory: Integer;
  MinTimeStamp: TimeStampType;
  CurrentMinutes: LongInt;
  UpdateFile: File of Char;

const
  MSDOS = $21;
  VersionId = '2.01';
  ComSpec = 'C:\COMMAND.COM';
  SystemFileName = 'C:\SLA1.SYS';
  ErrorFileName = 'C:\SYSTEM.ERR';
  ChronoFileName = 'C:\CHRONO.SYS';
  sp80 =
  DayOfWeek: String[21] = 'SunMonTueWedThuFriSat';
  Zel: array[1..12] of Integer = (1,4,3,6,1,4,6,2,5,0,3,5);
  MainExecs: array[1..8] of str10 =
    ('XFER','MERGE','GRAPH','PREPARE','BUILD','','','');
  UtilityExecs: array[1..8] of str10 =
    ('POWER','GOBEAM','ZSTAGE','MATERIAL','EDIT','TESTPART','','');
  DosExecs: array[1..8] of str10 =
    ('CHKDSK','','DIR/W','QD2','','','','');
  MenuMax: array[1..3] of Integer = (8,7,6);
  MenuColor: array[1..3] of Integer = (12,11,10);
  MaxHistory = 19;
  Cr = ^M;
  DaysInMonth: array[NotLeapYear..LeapYear,1..12] of Word
    = ((31,28,31,30,31,30,31,31,30,31,30,31),
       (31,29,31,30,31,30,31,31,30,31,30,31));
  DayTable: array[NotLeapYear..LeapYear,1..13] of Word
    = ((0,31,59,90,120,151,181,212,243,273,304,334,365),
       (0,31,60,91,121,152,182,213,244,274,305,335,366));

procedure CursorOff;
begin
```

```
  with regs do begin
    AH := 3;
    BH := 0;
    Intr($10,regs);
    AH := 1;
    CH := CH or $20;
    Intr($10,regs);
  end;
end;

procedure CursorOn;
begin
  with regs do begin
    AH := 3;
    BH := 0;
    Intr($10,regs);
    AH := 1;
    CH := CH and $DF;
    Intr($10,regs);
  end;
end;

procedure ResetScreen;
  begin
    TextColor(White);
    TextBackground(Black);
    TextMode(C80);
    CursorOff;
  end;

function upper(text: String): String;
var
  i: Integer;
  temp: String;
begin
  temp := text;
  for i := 1 to length(temp) do temp[i] := upcase(temp[i]);
  upper := temp;
end;

function many(Ch: Char;num: Integer): str80;
var
  temp: str80;
  i: Integer;
begin
  temp := '';
  for i:=1 to num do temp  := temp+Ch;
  many := temp;
end;

function spc(len: Integer): String;
begin
  spc := copy(sp80,1,len);
end;

procedure beep;
begin
  sound(1000);
  delay(100);
  NoSound;
```

```
end;

function IntStr(num: Integer): str10;
var
  temp: str10;
begin
  if num>=0 then Str(num,temp) else Str(num+$8000,temp);
  IntStr := temp;
end;

procedure ReadCommandLine(var line: str80);
var
  i: Integer;
begin
  line := ParamStr(1);
  for i:=2 to ParamCount do
    line := line + ' ' + ParamStr(i);
end;


  Pad time element with left space if necessary
}

function PadSp(num: Integer): str10;
var
  temp: str10;
begin
  temp := IntStr(num);
  if num<10 then PadSp := ' ' + temp
    else PadSp := temp;
end;


  Pad time element with left zero if necessary
}

function LZero(num: Integer): str10;
var
  temp: str10;
begin
  temp := IntStr(num);
  if num<10 then LZero := '0' + temp
    else LZero := temp;
end;

{
  Compute day-of-week using Harry's modified Zeller Algorithm
}
function Zeller(month,day,year: Integer): Integer;
begin
  if month<3 then dec(year);
  Zeller := (Zel[month] + day + year + (year shr 2)) mod 7;
end;

{
  Read time directly from clock chip
  works only on ATs, 286s, 386s; does not work on standard PCs, XTs
}
procedure GetTime;
var
```

```
  good: Boolean;
begin
  good := false;
  while not good do begin
    port[$70] := $0A;     { wait for update to finish (then there's 244 us) }
    if (port[$71] and $80)=0 then begin
      port[$70] := $00;     { get seconds }
      Sec := port[$71];
      port[$70] := $0A;
      if (port[$71] and $80)=0 then begin
        port[$70] := $02;    { get minutes }
        Minu := port[$71];
        port[$70] := $0A;
        if (port[$71] and $80)=0 then begin
          port[$70] := $04;     { get hours }
          Hour := port[$71];
          port[$70] := $0A;
          if (port[$71] and $80)=0 then begin
            port[$70] := $07;     { get day }
            Day := port[$71];
            port[$70] := $0A;
            if (port[$71] and $80)=0 then begin
              port[$70] := $08;     { get month }
              Mon := port[$71];
              port[$70] := $0A;
              if (port[$71] and $80)=0 then begin
                port[$70] := $09;     { get year }
                Year := port[$71];
                port[$70] := $0A;
                if (port[$71] and $80)=0 then good := true;
              end;
            end;
          end;
        end;
      end;
    end;
  end;
  Sec  := (Sec  shr 4) * 10 + (Sec  and $0F);  { convert from BCD }
  Minu := (Minu shr 4) * 10 + (Minu and $0F);
  Hour := (Hour shr 4) * 10 + (Hour and $0F);
  Day  := (Day  shr 4) * 10 + (Day  and $0F);
  Mon  := (Mon  shr 4) * 10 + (Mon  and $0F);
  Year := (Year shr 4) * 10 + (Year and $0F);
  WeekDay := Zeller(Mon,Day,Year);
end;

{
  Get a time stamp consisting of the relative day and the current time
}
procedure GetTimeStamp;
var
  tdow,tday,tmon,tyear,tsec,tminu,thour: str4;
  AmPm: Char;
begin
  GetTime;
  tmon  := PadSp(Mon);
  tday  := LZero(Day);
  tyear := LZero(Year);
  tdow  := copy(DayOfWeek,Zeller(Mon,Day,Year)*3+1,3);
  CurrentDate := tdow+' '+tmon+'/'+tday+'/'+tyear;
```

```
  tsec  := LZero(Sec);
  tminu := LZero(Minu);
  if Hour=0 then begin
    thour := '12';
    AmPm := 'A';
  end else if Hour<12 then begin
    thour := PadSp(Hour);
    AmPm := 'A';
  end else if Hour=12 then begin
    thour := '12';
    AmPm := 'P';
  end else begin
    thour := PadSp(Hour-12);
    AmPm := 'P'
  end;
  CurrentTime := thour+':'+tminu+' '+AmPm+'M';
end;

  Reset Computer System's Date and Time from Hardware Clock

procedure SetSystemDateTime;
begin
  GetTime;
  SetDate(1900+Year,Mon,Day);
  SetTime(Hour,Minu,Sec,0);
end;

{
  Julian-Cummulative-Minute algorithms
}
function Julian(date: DateType): Word;
var
  YearLookup: YearType;
begin
  with date do begin
    if (year mod 4) = 0 then YearLookup := LeapYear
      else YearLookup := NotLeapYear;
    Julian := 365*(year-1900) + DayTable[YearLookup,month] +
      day + ((year-1901) div 4) - 32142 {1/1/88};
  end;
end;

procedure UnJulian(JulNum: Word;var date: DateType);
var
  YearLookup: YearType;
  offset,j,lastj: LongInt;
begin
  with date do begin
    inc(JulNum,32142);   {1/1/88}
    year := 1900;
    j := 0;
    lastj := 0;
    while j <= JulNum do begin
      lastj := j;
      if year mod 4 = 0 then inc(j,366)
        else inc(j,365);
      inc(year);
    end;
    dec(year);   { back off a year }
```

```
    if year mod 4 = 0 then YearLookup := LeapYear
      else YearLookup := NotLeapYear;
    offset := JulNum - lastj;
    month := 1;
    j := 0;
    lastj := 0;
    while j <= offset do begin
      lastj := j;
      j := DayTable[YearLookup,month];
      inc(month);
    end;
    dec(month,2);
    day := offset - lastj + 1;
  end;
end;

function AbsMinutes(TimeStamp: TimeStampType): LongInt;
var
  date: DateType;
begin
  with TimeStamp do begin
    date.year  := year;
    date.month := month;
    date.day   := day;
    AbsMinutes := LongInt(Julian(date)) * 1440 + (hour * 60 + minu);
  end;
end;

procedure AbsTimeStamp(Minutes: LongInt;var TimeStamp: TimeStampType);
var
  date: DateType;
  DayMinutes: Word;
begin
  DayMinutes := Minutes mod 1440;
  UnJulian(Minutes div 1440,date);
  with TimeStamp do begin
    year  := date.year;
    month := date.month;
    day   := date.day;
    hour  := DayMinutes div 60;
    minu  := DayMinutes mod 60;
  end;
end;

{
  Remove excess quote marks around string
}
function NoQuotes(Text: String): String;
var
  s,e: Integer;
begin
  s := 1;
  while (Text[s] in ['"',' ']) and (s < length(Text)) do inc(s);
  e := length(Text);
  while (Text[e] in ['"',' ']) and (e > s) do dec(e);
  NoQuotes := copy(Text,s,e-s+1);
end;

function InChildProcess: Boolean;
begin
```

```
  InChildProcess := (Mem[0:99 shl 2] and $80)>0;
end;

procedure SetChildProcess;
begin
  Mem[0:99 shl 2] := $80;
end;

procedure ClearChildProcess;
begin
  Mem[0:99 shl 2] := $00;
end;

procedure CheckForOptions(var line: str80);
var
  i: Integer;
begin
  line := upper(line);
  i := pos('/NOINTERVAL',line);  { check for /NOINTERVAL }
  if i>0 then begin
    NoInterval := true;
    delete(line,i,11);
  end;
end;

procedure Pause;
begin
  if not PausedFlag then begin
    gotoxy(1,25);
    write('Press Enter to Continue... ');
    readln(Input);
    PausedFlag := true;
  end;
end;

function Desc(menu,line: Integer): str80;
var
  index: Integer;
begin
  index := menu * 10 + line;
  case index of
    11: Desc := 'Transfer Files Between this Computer and Another over Ethernet
    12: Desc := 'Merge Separately-Sliced Object Files Together';
    13: Desc := 'Graph an Object in either Faceted or Sliced form';
    14: Desc := 'Prepare to Make a Part and Set Up Various Parameters';
    15: Desc := 'Run the Stereolithography Part-Builder Program';
    16: Desc := 'Go to the Utility Menu';
    17: Desc := 'Go to the Disk Operating System Menu';
    18: Desc := 'Exit Stereolithography System Completely';
    21: Desc := 'Control the Power-Up or Down Sequence of Laser Equipment';
    22: Desc := 'Laser Beam Profile and Calibration Operations';
    23: Desc := 'Move the Elevator Up and Down';
    24: Desc := 'View, Alter, and Add Data for Vat Materials';
    25: Desc := 'Enter the Editor to Modify the Contents of a File';
    26: Desc := 'Run the Test Part Utility Program';
    27: Desc := 'Return to the Main Menu';
    31: Desc := 'Show Hard Disk Statistics, including Free Space Remaining';
    32: Desc := 'Change to a Different File Directory';
    33: Desc := 'Show the Directory for the Current Directory';
    34: Desc := 'Enter the Quick-DOS Utility to Move Files and Change Directorie
```

```
    35: Desc := 'Enter a DOS Shell, Allowing You to Run Other Programs';
    36: Desc := 'Return to the Main Menu';
    else Desc := '';
  end;
end;

{------------------------------------------------------------------------------------------}

procedure DrawMain;
begin
  writeln('                                             MAIN MENU');
  TextColor(White);
  writeln;
  gotoxy(20,whereY);
  writeln(copy(SingleBar,1,40));
  writeln;
  gotoxy(Indent,whereY);
  writeln('1. Network          ');
  gotoxy(Indent,whereY);
  writeln('2. Merge');
  gotoxy(Indent,whereY);
  writeln('3. View   ');
  gotoxy(Indent,whereY);
  writeln('4. Prepare');
  gotoxy(Indent,whereY);
  writeln('5. Build');
  gotoxy(Indent,whereY);
  writeln('6. Utility Menu');
  gotoxy(Indent,whereY);
  writeln('7. DOS Menu');
  gotoxy(Indent,whereY);
  writeln('X. Exit');
end;

procedure DrawUtility;
begin
  writeln('                                            UTILITY MENU');
  TextColor(White);
  writeln;
  gotoxy(20,whereY);
  writeln(copy(SingleBar,1,40));
  writeln;
  gotoxy(Indent,whereY);
  writeln('1. Power Sequencer');
  gotoxy(Indent,whereY);
  writeln('2. Beam Analysis');
  gotoxy(Indent,whereY);
  writeln('3. Elevator Mover');
  gotoxy(Indent,whereY);
  writeln('4. Material Manager');
  gotoxy(Indent,whereY);
  writeln('5. Edit a File');
  gotoxy(Indent,whereY);
  writeln('6. Make Test Parts');
  gotoxy(Indent,whereY);
  writeln('X. Return to Main Menu');
end;

procedure DrawDos;
begin
```

```
  writeln('                                    DOS MENU');
  TextColor(White);
  writeln;
  gotoxy(20,whereY);
  writeln(copy(SingleBar,1,40));
  writeln;
  gotoxy(Indent,whereY);
  writeln('1. Disk Usage Stats');
  gotoxy(Indent,whereY);
  writeln('2. Change Directory');
  gotoxy(Indent,whereY);
  writeln('3. Directory Listing');
  gotoxy(Indent,whereY);
  writeln('4. Quick DOS Utility');
  gotoxy(Indent,whereY);
  writeln('5. DOS Shell');
  gotoxy(Indent,whereY);
  writeln('X. Return to Main Menu');
end;

procedure DrawMenuScreen;
begin
  GetSystemDateTime;
  ClrScr;
  TextColor(White);
  writeln(DoubleBar);
  writeln('  SLA-1               3D SYSTEMS STEREOLITHOGRAPHY SYSTEM
    + Version);
  writeln('         All Programs and Screens Copyright (C) 1988 by 3D Systems, I
  writeln(DoubleBar);
  writeln;
  TextColor(MenuColor[Menu]);
  case Menu of
    1: DrawMain;
    2: DrawUtility;
    3: DrawDos;
  end;
  writeln;
  gotoxy(20,whereY);
  writeln(copy(SingleBar,1,40));
  Row := whereY;
  writeln;
  writeln('          Select an Option either by Using the Arrows and Pressing Ente
  write  ('                      or by Pressing the Corresponding Number');
end;

function ErrorOnScreen: Boolean;
var
  BaseAddr: Word;
  ScanError: Boolean;
  i: Integer;
begin
  if LastMode=7 then BaseAddr := $B000
    else BaseAddr := $B800;
  i := 0;
  ScanError := true;
  while (i<4000) and ScanError do begin
   if upcase(chr(Mem[BaseAddr:i]))='E' then
      if (upcase(chr(Mem[BaseAddr:i+2]))='R') and
       (upcase(chr(Mem[BaseAddr:i+4]))='R') then ScanError := false;
```

```
    inc(i,2);
  end;
  ErrorOnScreen := not ScanError;
end;

{
  SHELL program, check for existance of error
  If error, pause and wait for Enter before returning to menu
}
procedure Shell(Prog,Options: str80);
begin
  PausedFlag := false;
  SetSystemDateTime;
  CursorOn;
  Exec(Prog,Options);
  CursorOff;
  {$I-}
  assign(ErrorFile,ErrorFileName);
  reset(ErrorFile);
  {$I+}
  ErrorFlag := (IOresult=0);
  if ErrorFlag then begin
    close(ErrorFile);
    Pause;
    {$I-}
    erase(ErrorFile);
    {$I+}
  end else if ErrorOnScreen then Pause;
end;

{----------------------------------------------------------------------------

{
  Option history routines
}
procedure AddHistory(text: str10);
begin
  OptionHistory[EndHistory].Menu := Menu;
  OptionHistory[EndHistory].Option := CmdVal;
  OptionHistory[EndHistory].mon := Mon;
  OptionHistory[EndHistory].day := Day;
  OptionHistory[EndHistory].hour := Hour;
  OptionHistory[EndHistory].min := Minu;
  inc(EndHistory);
  if EndHistory > MaxHistory then EndHistory := 1;
  if StartHistory = EndHistory then begin
    inc(StartHistory);
    if StartHistory > MaxHistory then StartHistory := 1;
  end;
end;

procedure ShowHistory;
begin
  ClrScr;
  writeln('Menu System Recent Option History:');
  writeln;
  writeln('Menu  Option  Name              Date   Time');
  writeln('----  ------  --------------    -----  -----');
  i := StartHistory;
  while i<>EndHistory do with OptionHistory[i] do begin
```

```
    write('   ',Menu,'      ',Option,'    ');
    case Menu of
      1: cmd := MainExecs[Option];
      2: cmd := UtilityExecs[Option];
      3: cmd := DosExecs[Option];
    end;
    write(cmd,spc(16-length(cmd)));
    writeln(PadSp(mon),'/',LZero(day),'  ',PadSp(hour),':',LZero(min));
    inc(i);
    if i > MaxHistory then i := 1;
  end;
  writeln;
  write('Press any key to continue... ');
  key := ReadKey;
  DrawMenuScreen;
end;

{
  Show Menu Item Description
}
procedure ShowDescription;
begin
  gotoxy(Indent-2,9+MenuPos[Menu]);
  TextColor(Yellow);
  write(chr(16));
  gotoxy(1,24);
  write(spc(79));
  gotoxy((78-length(Desc(Menu,MenuPos[Menu]))) div 2,24);
  TextColor(Black);
  TextBackground(MenuColor[Menu]);
  write(' ',Desc(Menu,MenuPos[Menu]),' ');
  TextColor(White);
  TextBackground(Black);
end;

procedure GetCurrentMinutes;
begin
  MinTimeStamp.year  := 1900 + Year;
  MinTimeStamp.month := Mon;
  MinTimeStamp.day   := Day;
  MinTimeStamp.hour  := Hour;
  MinTimeStamp.minu  := Minu;
  CurrentMinutes := AbsMinutes(MinTimeStamp);
end;

{
  chronometry routines
}
function IntParse: Integer;
var
  num: Real;
  IntNum,code,code2: Integer;
begin
  if length(temp)=0 then IntNum := 0
  else begin
    while copy(temp,1,1) = ' ' do delete(temp,1,1);
    val(temp,num,code);
    if code<>0 then val(copy(temp,1,code-1),num,code2);
    IntNum := trunc(num);
    if code=0 then temp := ''
```

```
      else temp := copy(temp,code+1,99);
  end;
  IntParse := IntNum;
end;

procedure ReadChronoFile;
var
  ChronoLine: String;
  TimeStamp: TimeStampType;
  DayOffset,HourOffset,MinuOffset: Integer;
begin
  ChronoPtr := 0;
  assign(ChronoFile,ChronoFileName);
  {$I-}
  reset(ChronoFile);
  {$I+}
  if IOresult<>0 then exit;
  while not eof(ChronoFile) do begin
    readln(ChronoFile,ChronoLine);
    if (ChronoLine <> '') and (ChronoLine[1] <> '!') then begin
      inc(ChronoPtr);
      temp := ChronoLine;
      with TimeStamp do begin
        month := IntParse;
        day   := IntParse;
        year  := 1900 + IntParse;
        hour  := IntParse;
        minu  := IntParse;
        WhenToExecute[ChronoPtr] := AbsMinutes(TimeStamp);
      end;
      DayOffset  := IntParse;
      hourOffset := IntParse;
      MinuOffset := IntParse;
      ChronoOffset[ChronoPtr] := (LongInt(DayOffset) * 24 + HourOffset) * 60
        + MinuOffset;
      i := pos('!',temp);
      WhatToExecute[ChronoPtr] := NoQuotes(copy(temp,1,i-1));
(*
{}        writeln('ChonoPtr=',ChronoPtr);
{}        writeln('WTE='.WhenToExecute[ChronoPtr]);
{}        writeln('CO =',ChronoOffset[ChronoPtr]);
{}        writeln('WTE="',WhatToExecute[ChronoPtr],'"');
{}        key := ReadKey;
*)
    end;
  end;
  close(ChronoFile);
end;

procedure UpdateChronoFile(index: Integer;NewTimeStr: str16);
var
  i,j: Integer;
  ChronoLine: String;
  OldUpdateFilePos,UpdateFilePos: LongInt;
begin
  i := 0;
  assign(ChronoFile,ChronoFileName);
  {$I-}
  reset(ChronoFile);
  {$I+}
```

```
  if IOresult<>0 then exit;
  UpdateFilePos := 0;
  while not eof(ChronoFile) do begin
    OldUpdateFilePos := UpdateFilePos;
    readln(ChronoFile,ChronoLine);
    inc(UpdateFilePos,length(ChronoLine)+2);
    if (ChronoLine <> '') and (ChronoLine[1] <> '!') then begin
      inc(i);
      if i = index then begin
        close(ChronoFile);
        assign(UpdateFile,ChronoFileName);
        {$I-}
        reset(UpdateFile);
        {$I+}
        if IOresult<>0 then exit;
        Seek(UpdateFile,OldUpdateFilePos);
        for j:=1 to length(NewTimeStr) do
          write(UpdateFile,NewTimeStr[j]);
        close(UpdateFile);
        exit;
      end;
    end;
  end;
  close(ChronoFile);
end;

procedure ChronoExecute(index: Integer);
var
  NextTime: TimeStampType;
  tmon,tday,tyear,thour,tminu: str4;
begin
  gotoxy(1,24);
  ClrEol;
  TextColor(Black);
  TextBackground(White);
  gotoxy(25,24);
  write('    PLEASE WAIT MOMENTARILY    ');
  TextColor(White);
  TextBackground(Black);
  Exec(ComSpec,'/C '+WhatToExecute[Index]);
  while keypressed do key := ReadKey;    { flush out keyboard buffer }
  ResetScreen;
  DrawMenuScreen;
  ShowDescription;
  GetCurrentMinutes;
  WhenToExecute[Index] := CurrentMinutes + ChronoOffset[Index];
  AbsTimeStamp(WhenToExecute[Index],NextTime);
  with NextTime do begin
    tmon  := PadSp(month);
    tday  := LZero(day);
    tyear := LZero(year-1900);
    thour := LZero(hour);
    tminu := LZero(minu);
    UpdateChronoFile(index,tmon+'/'+tday+'/'+tyear+' '+thour+':'+tminu);
  end;
end;

{
  Get Input for Menu, handle scrolling
}
```

```
procedure HelpAsk;
var
  i: Integer;
  LineChange,Leave: Boolean;
begin
  Leave := false;
  LineChange := true;
  repeat
    if LineChange then ShowDescription;
    repeat
      GetTimeStamp;
      GetDir(0,CurrentDir);
      gotoxy(2,5);
      write(CurrentDir);
      gotoxy(67,5);
      write(CurrentDate);
      gotoxy(71,6);
      write(CurrentTime);
      GetCurrentMinutes;
      for i:=1 to ChronoPtr do
        if WhenToExecute[i] <= CurrentMinutes then ChronoExecute(i);
    until keypressed;
    LineChange := false;
    CmdChr := upcase(Readkey);
    if CmdChr = chr(0) then FnKey := Readkey
      else FnKey := chr(0);
    if CmdChr in [#0,'1'..'9','X',Cr] then begin
      LineChange := true;
      gotoxy(Indent-2,9+MenuPos[Menu]);
      write(' ');
      if (CmdChr=Cr) and (MenuPos[Menu]<MenuMax[Menu]) then
        CmdChr := chr(ord('0')+MenuPos[Menu]);
      if (CmdChr='X') or ((CmdChr=Cr) and (MenuPos[Menu]=MenuMax[Menu])) then
        CmdChr := chr(ord('0')+MenuMax[Menu]);
      case FnKey of
        'P': if MenuPos[Menu] >= MenuMax[Menu] then MenuPos[Menu] := 1
                else inc(MenuPos[Menu]);
        'H': if MenuPos[Menu] <= 1 then MenuPos[Menu] := MenuMax[Menu]
                else dec(MenuPos[Menu]);
        'D' : ShowHistory;
      end;
      val(CmdChr,CmdVal,code);
      if (CmdVal>0) and (CmdVal<=MenuMax[Menu]) then begin
        Leave := true;
        MenuPos[Menu] := CmdVal;
      end;
    end;
  until Leave;
  case Menu of
    1: cmd := MainExecs[CmdVal];
    2: cmd := UtilityExecs[CmdVal];
    3: cmd := DosExecs[CmdVal];
  end;
  if length(cmd)>0 then AddHistory(cmd);
end;

{---------------------------------- UTILITY STUFF ----------------------------------

procedure UtilityMenu;
begin
```

```
  repeat
    Menu := 2;
    DrawMenuScreen;
    HelpAsk;
    ClrScr;
    if CmdVal<7 then begin
      Shell(ComSpec,'/C '+UtilityExecs[CmdVal]);
      ResetScreen;
    end;
  until CmdVal = MenuMax[2];
end;

{---------------------------------- DOS STUFF ----------------------------------

procedure DiskUsage;
begin
  writeln('          DISK USAGE STATISTICS');
  writeln(copy(SingleBar,1,34));
  writeln;
  Shell(ComSpec,'/C '+DosExecs[1]);
  Pause;
end;

procedure DirList;
begin
  Shell(ComSpec,'/C '+DosExecs[3]);
  Pause;
end;

procedure ChangeDir;
var
  NewDir: str40;
begin
  CursorOn;
  ClrScr;
  writeln('Current directory is ',CurrentDir);
  writeln;
  writeln;
  writeln('You can specify a new directory using the following rules: ');
  writeln;
  writeln('If you wish to move to a subdirectory, just type in the');
  writeln('subdirectory''s name.');
  writeln;
  writeln('If you want to move up a directory level, just enter .. (two periods
  writeln;
  writeln('If you are going to specify a completely new directory path, start')
  writeln('your entry with a \ (backslash).');
  writeln;
  writeln;
  write('Enter new directory specification: ');
  readln(NewDir);
  {$I-}
  ChDir(NewDir);
  if IOresult<>0 then begin
    writeln;
    writeln('Can''t find directory.');
    writeln;
    write('Press any key to continue... ');
    key := ReadKey;
  end;
```

```
MENU.PAS    - Page 17 -                    4/15/1988   5:13 PM

  {$I+}
  CursorOff;
end;

procedure QDos;
begin
  Shell(ComSpec,'/C '+DosExecs[4]);
end;

procedure DosShell;
begin
  CursorOn;
  ClrScr;
  SetChildProcess;
  writeln('To return to the Dos Menu, use the EXIT command.');
  writeln(copy(SingleBar,1,48));
  Exec(ComSpec,'');
  ResetScreen;
  ClearChildProcess;
end;

procedure DosMenu;
begin
  repeat
    Menu := 3;
    DrawMenuScreen;
    HelpAsk;
    ClrScr;
    case Cmdval of
      1: DiskUsage;
      2: ChangeDir;
      3: DirList;
      4: QDos;
      5: DosShell;
    end;
  until Cmdval = MenuMax[3];
end;

{---------------------------------- MAIN STUFF ----------------------------------

procedure ExitSystem;
begin
  CursorOn;
  ClrScr;
  writeln('Dos Menu Option 5 allows you to issue DOS commands and run other');
  writeln('programs, then return to the Menu System using the EXIT command.');
  writeln;
  writeln('This option will cause you to leave the Stereolithography System');
  write  ('completely.  Are you sure you want to do this? ');
  repeat
    key := upcase(ReadKey);
  until key<>'X';
  writeln(key);
  if key='Y' then begin
    SetSystemDateTime;
    Halt(0);
  end;
  CursorOff;
end;
```

```
procedure MainMenu;
begin
  ResetScreen;
  repeat
    Menu := 1;
    DrawMenuScreen;
    HelpAsk;
    ClrScr;
    if CmdVal=MenuMax[1] then ExitSystem
    else if CmdVal<6 then begin
      Shell(ComSpec,'/C '+MainExecs[CmdVal]);
      ResetScreen;
    end else if CmdVal=6 then UtilityMenu
    else if CmdVal=7 then DosMenu;
  until 0=1;  { forever }
end;


  read PLA-1 System File

procedure ReadSystemFile;
label
  NoMoreSystemFile;
begin
  {$I-}
  assign(SystemFile,SystemFileName);
  reset(SystemFile);
  {$I+}
  if IOresult <> 0 then begin
    writeln('No system file.  Stopping.');
    halt(1);
  end;
  repeat
    readln(SystemFile,Line);
  until eof(SystemFile) or ((length(Line)>0) and (Line[1]<>'!'));
  if not eof(SystemFile) then begin
    Line := NoQuotes(Line);
    CheckForOptions(Line);
    i := 1;
    while (i<2) and not eof(SystemFile) do begin
      Line := '';
      while (length(Line)=0) or (Line[1]='!') do begin
        if eof(SystemFile) then goto NoMoreSystemFile;
        readln(SystemFile,Line);
      end;
      Line := upper(Line);
      case i of
        1: begin
{ ????? }
           end;
      end;
      inc(i);
    end;
  end;
NoMoreSystemFile:
  close(SystemFile);
end;

{ - - - - - }
```

```
MENU.PAS    - Page 19 -                          4/15/1988   5:13 PM

begin
  CheckBreak := false;
  if InChildProcess then begin
    writeln('You are currently in a DOS Shell.');
    writeln('Please use EXIT to return to the Menu System.');
    halt(2);
  end;
  Indent := (80-20) div 2;
  NoInterval := false;
  for i:=1 to 3 do
    MenuPos[i] := 1;
  StartHistory := 1;
  EndHistory := 1;

  SingleBar := many(#196,79);
  DoubleBar := many(#205,79);

  SetSystemDateTime;
  {$I-}
  assign(ErrorFile,ErrorFileName);
  erase(ErrorFile);
  IOerr := IOresult;
  {$I+}
  ReadSystemFile;
  ReadChronoFile;
  ReadCommandLine(Line);
  CheckForOptions(Line);
  MainMenu;
end.
```

```
MERGE.PAS    - Page 1 -                    4/15/1988   5:19 PM

{==============================================================================
   3D Systems Stereolithography System Software
 ==============================================================================

   MERGE.PAS
   SLA-1 Merge Sliced Files Software

 ------------------------------------------------------------------------------

   Compile with Turbo Pascal Version 4.0

   File name line syntax:

   <file name>/Z<offset>/X<offset>/Z<offset>
                        /N<blocks>/O<blocks> <file name>...
     /OUTFILE<outfile>/RES<resolution>/ZSPC<z-spacing>/THICK<thickness>

   where <file name> is a Slice input file
         <offset>    is a + or -  X.Y or Z-axis offset for that input file
          <blocks>   contains the identifiers for the blocks to skip
                     for that input file separated by commas
         <outfile>   follows all input file specs and is the name of
                     the part output file to store the parsed data

   Up to 10 Slice data files can be combined.
 ------------------------------------------------------------------------------

   Merge *.V vector output file format:      (file #2)

     L1,<layer A>
      <x1> <y1> <x2> <y2>
      :     :
      another block,<layer A>
      :     :
    L2,<layer A>
     <x1> <y1> <x2> <y2>
      :     :
      another block,<layer A>
      :     :
     L1,<layer B>
      :     :
     (EOF)

 ------------------------------------------------------------------------------

   Critical Area Codes:

     XV = draw section cross-hatch vectors in box as rivets
     XI = ignore section cross-hatch vectors in box
     SV = draw up/down skin cross-hatch vectors in box as rivets
     SI = ignore up/down skin cross-hatch vectors in box

 ------------------------------------------------------------------------------

   Recent History:
    9/ 1/87  Ver 2.04  Version 2 released
    9/ 3/87  Ver 2.07  Compiled by TBM (Modified Turbo Basic)
    9/ 4/87  Ver 2.08  added SV, SI critical areas
    9/17/87  Ver 2.10  only updated version number
    9/25/87  Ver 2.20  new SLICE 19 block format supported
    9/28/87  Ver 2.21  added NFUB support
```

```
MERGE.PAS    - Page 2 -                       4/15/1988   5:18 PM

     9/30/87  Ver 2.25  only updated version number
    10/16/87  Ver 2.27  Parse name changed to Merge
                        *.P files now *.V files
                        error file support
    11/12/87  Ver 2.30  first Beta software release
    11/20/87  Ver 2.31  added directory listing of *.SLI files
              Ver 2.32  -
    12/04/87  Ver 2.33  slice20 FUB FDB blocks
                        BLOCK.ID file support
    12/14/87  Ver 2.40  input file names in *.L output file
                        pass along ! comment lines in slice files
    12/21/87  Ver 2.41  second !MERGE line contains start, end, # of layers
                        BOX file noted when found, not if not found
                        scans !SLICE comments for Res, ZSpacing, Thick
     1/11/88  Ver 2.50  BLOCK.ID looked for in \3DSYS too
     1/22/88  Ver 2.54  makes Range instead of Layer Control File as default
                        Layer Control File made if /LAYERCTRL option used
     1/25/88  Ver 2.60  generates both Layer and Range Files (.L and .R)
     1/27/88            thickness input is in mils, not millimeters
     [illegible]        thickness defaults to Z-Spacing value
     [illegible]/10/88  converted from Turbo Basic to Turbo Pascal 4.0
                        merge operation runs 2.5 times faster than before
                        merge status box with layer and range information
                        /O only and /N no block selections improved
     [illegible]/12/88  Ver 2.61  EndLayer variable now LongInt
                        layer numeric output is type word, not integer
     [illegible]  Ver 2.80  added copyright notice
     [illegible]  Ver 2.90  Create binary V file
                        Add file offsetting option
     [illegible]  Ver 2.91  Eliminate Critical Area Boxes
                        Add Min Max values to Headers
     4/09/88  Ver 3.00  Production
     4/15/88  Ver 3.01  Replace /Offset#,# (X and Y) with /X# and /Y# to
                        parallel the /Z# option; also set RC<>0 for case
                        of merge file not found.

 ---------------------------------------------------------------------------}

uses Crt,Dos;

const
  VersionId = '3.01';
  sp80 = '
  ErrorFileName = 'C:\SYSTEM.ERR';
  BlockIdFileName = 'BLOCK.ID';
  HomeDirectory = 'C:\3DSYS\';
  Cr = ^M;
  StatusBoxLeft   = 42;
  StatusBoxRight  = 79;
  StatusBoxTop    = 10;
  StatusBoxBottom = 22;

type
  str6  = string[6];
  str16 = string[16];

var
  FirstVar: Byte;   { must be first variable defined }
  CurrentZ,ZOffset: array [1..10] of LongInt;
  OnlyBlocks,NoBlocks: array [1..10] of String;
```

```
MERGE.PAS   - Page 3 -                    4/15/1988   5:16 PM

  BlockMnemonics: array [1..32] of str6;
  Blocks: array [1..100] of str6;
  ErrorFile: Text;
  InputFiles: array[1..10] of Text;
  code,NumPartFiles,InFile,NumCritVols: Integer;
  BlockMnemonicsCount,ZSpace,BlockCount,Layers: Integer;
  CmdLine,MergeLine,FirstFileName,Line,OutFileName: String;
  SingleBar,LayerFileName,RangeFileName,VectorFileName: String;
  Resolution,ZSpacing,Thickness: Real;
  CurrentLayer,LastLayer,ZStart,ZEnd,ZVal: LongInt;
  StartLayer,EndLayer,MergeLayer: LongInt;
  LayerFile,RangeFile,VectorTextFile: Text;
  VectorBinaryFile : File;
  BinaryOutput : Boolean;
  UpdateFile: File of Char;
  UpdateIndex: LongInt;
  HeaderType: Char;
  FileNum,Cmd,Bit: str6;
  [illegible] : Boolean;
  [illegible],RangeIn[illegible]: Integer;
  [illegible] : array [1..10] of LongInt;
  VectorCount : LongInt;
  VectorCount[illegible] : LongInt;
  [illegible] : Integer;
  MinX,MaxX,Min[illegible] : Word;
  [illegible] { should be last variable defined }


{----------------------------------------------------------------------------

                              Utility Routines

 ----------------------------------------------------------------------------}

function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
var
  temp: string;
  i: Integer;
begin
  temp := '';
  for i:=1 to num do temp  := temp+Ch;
  many := temp;
end;

procedure centerln(text: String);
begin
  gotoxy((79-length(text)) div 2,whereY);
  writeln(text);
end;
```

```
function IntStr(num: Integer): str16;
var
  temp: str16;
begin
  if num>=0 then Str(num,temp) else Str(num+$8000,temp);
  IntStr := temp;
end;

function WordStr(num: Word): str16;
var
  temp: str16;
begin
  Str(num,temp);
  WordStr := temp;
end;

function LongStr(num: LongInt): str16;
var
  temp: str16;
begin
  Str(num,temp);
  LongStr := temp;
end;

function RealStr(num: Real;AfterDecimal: Integer): String;
var
  i: Integer;
  temp: String;
begin
  Str(num:10:AfterDecimal,temp);
  i := 1;
  while (i<length(temp)) and (temp[i]=' ') do inc(i);
  RealStr := copy(temp,i,99);
end;

function spc(len: Integer): string;
begin
  spc := copy(sp80+sp80,1,len);
end;

procedure ReadCommandLine(var line: string);
var
  i: Integer;
begin
  line := ParamStr(1);
  for i:=2 to ParamCount do
    line := line + ' ' + ParamStr(i);
end;

{
  Remove excess quote marks around string
}
function NoQuotes(Text: String): String;
const
  Quote = '"';
var
  s,e: Integer;
begin
  s := 1;
```

```
MERGE.PAS    - Page 5 -                        4/15/1988    5:19 PM

  if (length(Text)>1) and (Text[1]=Quote) then inc(s);
  e := length(Text);
  if Text[e]=Quote then dec(e);
  NoQuotes := copy(Text,s,e-s+1);
end;

{
  Removes all double spaces in text string
}
procedure RemoveDoubleSpaces(var text: string);
begin
  while pos('  ',text)>0 do
    delete(text,pos('  ',text),1);
end;

{
  Find any char of Chars in Main starting at index Start
  Returns length(Main)+1 if no character of Chars in Main
}
function FindStr(Start: Integer;Main: string;Chars: str16): Integer;
var
  i,j,min: Integer;
  temp: String;
begin
  min := length(Main)+1;
  temp := copy(Main,Start,199);
  for i:=1 to length(Chars) do begin
    j := Start + pos(Chars[i],temp) - 1;
    if (j >= Start) and (j < min) then min := j;
  end;
  FindStr := min;
end;

{
  better val routines
}
function IntVal(line: String;var code: Integer): Integer;
var
  code2: Integer;
  num: Integer;
begin
  val(line,num,code);
  if code<>0 then val(copy(line,1,code-1),num,code2);
  IntVal := num;
end;

function LongVal(line: String;var code: Integer): LongInt;
var
  code2: Integer;
  num: LongInt;
begin
  val(line,num,code);
  if code<>0 then val(copy(line,1,code-1),num,code2);
  LongVal := num;
end;

function RealVal(line: String;var code: Integer): Real;
var
  ofs,code2: Integer;
  num: Real;
```

```
MERGE.PAS   - Page 6 -                          4/15/1988   5:18 PM

begin
  ofs := 0;
  if line[1]='.' then begin
    line := '0' + line;
    ofs := -1;
  end;
  val(line,num,code);
  if code<>0 then val(copy(line,1,code-1),num,code2);
  if code<>0 then inc(code,ofs);
  RealVal := num;
end;

{
  Pick out a number from a string
  starting at Index and going to the next space or comma or end-of-string
}
procedure UnitValShortInt(var Storage: Integer;Text: String;var Index: Integer);
var
  i: Integer;
begin
  Storage := IntVal(copy(Text,Index,99),i);
  if i=0 then Index := length(Text)+1
    else inc(Index,i);
end;

procedure UnitValInt(var Storage: LongInt;Text: String;var Index: Integer);
var
  i: Integer;
begin
  Storage := LongVal(copy(Text,Index,99),i);
  if i=0 then Index := length(Text)+1
    else inc(Index,i);
end;

procedure UnitVal(var Storage: Real;Text: String;var Index: Integer);
var
  i: Integer;
begin
  Storage := RealVal(copy(Text,Index,99),i);
  if i=0 then Index := length(Text)+1
    else inc(Index,i);
end;

{
  Pick out text from a string
  starting at Index and going to the next comma or end-of-string
}
procedure UnitStr(var Storage,Text: String;var Index: Integer);
var
  i: Integer;
begin
  i := FindStr(Index,Text,',');
  Storage := copy(Text,Index,i-Index);
  Index := i + 1;
end;

{
  Show error and store it on disk
}
procedure QuietSystemError(TextLine: string);
```

```
begin
  assign(ErrorFile,ErrorFileName);
  rewrite(ErrorFile);
  writeln(ErrorFile,'MERGE: ',TextLine);
  close(ErrorFile);
end;

procedure SystemError(TextLine: string);
begin
  writeln(TextLine);
  QuietSystemError(TextLine);
end;

{
  Can't open file.  Report this to operator.
}
procedure CantOpen(FileName: string);
begin
  SystemError('Can''t open file '+FileName);
end;

{ Here's a ultimate Draw-a-Box on the text screen routine }
procedure DrawBox(x1,y1,x2,y2: integer;BoxType: integer);
type
  BoxMode = array[1..4] of Char;
{
    Box Types:
      1:  Single Line all around
      2:  Double Line all around
      3:  Single Line horizontal, Double Line vertical
      4:  Double Line horizontal, Single Line vertical
}
  const
                      { Type         1     2     3     4    }
    UpperLeftCorner : BoxMode = (#218,#201,#214,#213);
    UpperRightCorner: BoxMode = (#191,#187,#183,#184);
    LowerLeftCorner : BoxMode = (#192,#200,#211,#212);
    LowerRightCorner: BoxMode = (#217,#188,#189,#190);
    HorzBar         : BoxMode = (#196,#205,#196,#205);
    VertBar         : BoxMode = (#179,#186,#186,#179);
var
  i: integer;
  FullHorzBar: String;
begin
  gotoxy(x1,y1);
  if x1<x2 then begin
    if y1=y2 then FullHorzBar := Many(HorzBar[BoxType],x2-x1+1)
      else FullHorzBar := Many(HorzBar[BoxType],x2-x1-1);
    end else FullHorzBar := '';
  if y1<>y2 then begin
    if x1<>x2 then write(UpperLeftCorner[BoxType]);
    write(FullHorzBar);
    if x1<>x2 then write(UpperRightCorner[BoxType]);
  end;
  for i:=y1+1 to y2-1 do begin
    gotoxy(x1,i);
    write(VertBar[BoxType]);
    gotoxy(x2,i);
    write(VertBar[BoxType]);
  end;
```

```
MERGE.PAS    - Page 8 -                         4/15/1988    5:18 PM

  gotoxy(x1,y2);
  if y1 = y2 then write(FullHorzBar)
  else begin
    if x1<>x2 then write(LowerLeftCorner[BoxType]);
    write(FullHorzBar);
    if x1<>x2 then write(LowerRightCorner[BoxType]);
  end;
end;

procedure SetUpStatusBox;
begin
  DrawBox(StatusBoxLeft,StatusBoxTop,StatusBoxRight,StatusBoxBottom,1);
  DrawBox(StatusBoxLeft+1,StatusBoxTop+2,StatusBoxRight-1,StatusBoxTop+2,1);
  DrawBox(StatusBoxLeft+1,StatusBoxBottom-2,StatusBoxRight-1,StatusBoxBottom-2,
end;

{$F+}
procedure ExitMerge;
{$F-}
begin
  window(1,1,80,25);
  gotoxy(1,22);
end;



{==========================================================================}

procedure FindFirstLayers;
var
  i,dummy: Integer;
  GoodLine: Boolean;
begin
{ determine first layer number for each slice file }
  MergeLayer := 9999;
  for InFile := 1 to NumPartFiles do begin
    if not eof(InputFiles[InFile]) then begin
      GoodLine := false;
      repeat
        readln(InputFiles[InFile],Line);
        if (Line = '') or (Line[1] in ['!','*']) then begin
          writeln(LayerFile,Line);
          writeln(RangeFile,Line);
          if copy(Line,1,6) = '!SLICE' then begin
            i := pos('-RES ',Line);
            if (i>0) and (Resolution<=0) then
              Resolution := RealVal(copy(Line,i+5,99),dummy);
            i := pos('-ZS ',Line);
            if (i>0) and (ZSpacing<=0) then
              ZSpacing := RealVal(copy(Line,i+4,99),dummy);
            i := pos('-THICK ',Line);
            if (i>0) and (Thickness<=0) then
              Thickness := RealVal(copy(Line,i+7,99),dummy);
          end;
        end else GoodLine := true;
      until GoodLine or eof(InputFiles[InFile]);
      HeaderType := Line[1];
      Zval := LongVal(copy(Line,3,99),dummy) + ZOffset[InFile];
      CurrentZ[InFile] := Zval;
      if Zval < MergeLayer THEN MergeLayer := Zval;
```

```
    end;
  end;
  StartLayer := MergeLayer;
end;

procedure GetParameters;
var
  MmFlag: Boolean;
  dummy: Integer;
  DefaultThickness: Real;
  temp: String;
begin
  writeln;
  if Resolution <= 0 then repeat
    write('Slice -res resolution value? ');
    readln(Line);
    Resolution := RealVal(Line,dummy);
  until Resolution>0;
  if ZSpacing  = 0 then begin
    write('Slice -zs layer spacing? ');
    readln(Line);
    ZSpacing := RealVal(Line,dummy);
  end;
  MmFlag := false;
  if Thickness   = 0 then begin
    DefaultThickness := int(ZSpacing * 1000 / Resolution);
    write('Layer thickness in mils ['+RealStr(DefaultThickness,0)+']? ');
    readln(Line);
    if Line = '' then Thickness := DefaultThickness
    else begin
      if pos('MM',upper(Line))>0 then MmFlag := true;
      Thickness := RealVal(Line,dummy);
    end;
  end;
  if not MmFlag then Thickness := Thickness * 0.0254;  { convert to mm }
  temp := '* ' + RealStr(Resolution,3) + ',' + RealStr(ZSpacing,3) + ','
    + RealStr(Thickness,3);
  writeln(LayerFile,temp);
  writeln(RangeFile,temp);
end;

{-----------------------------------------------------------------------------}

procedure AddBlock;
var
  i: Integer;
begin
  i := 1;
  while (i <= BlockCount) and (Blocks[i] <> Blk) do inc(i);
  if i > BlockCount then begin
    inc(BlockCount);
    Blocks[BlockCount] := Blk;
  end;
end;

procedure OutputRange;
var
  i: Integer;
begin
  gotoxy(UpdX,UpdY);
```

```
MERGE.PAS    - Page 10 -                    4/15/1988   5:18 PM

  write(LastLayer:5,'  ',RangeLayerCount:5);
  NewRange := true;
  writeln(RangeFile,ZStart,',',LastLayer,',',ZSpace,',',ZSpace);
  for i:=1 to BlockCount do
    writeln(RangeFile,Blocks[i]);
 inc(RangeCount);
end;

procedure StartNewRange;
begin
  ZStart := MergeLayer;
  BlockCount := 0;
  NeedStep := true;
end;

procedure MakeControl;
var
  LayerDiff: LongInt;
begin
  writeln(LayerFile,MergeLayer,' ',Z1);
  if Layers=1 then begin
    ZStart := MergeLayer;
    CurrentLayer := MergeLayer;
    NeedStep := true;
    AddBlock;
  end else begin
    if CurrentLayer = MergeLayer then AddBlock
    else begin
      CurrentLayer := MergeLayer;
      if NeedStep then begin
        NeedStep := false;
        ZSpace := MergeLayer - LastLayer;
        AddBlock;
      end else begin
        LayerDiff := MergeLayer - LastLayer;
        if LayerDiff <> ZSpace then begin
          OutputRange;
          StartNewRange;
          AddBlock;
        end else AddBlock;
      end;
    end;
  end;
end;

{-------------------------------------------------------------------------------}

procedure NewLayer;
var
  i: Integer;
begin
  inc(Layers);
  EndLayer := MergeLayer;
  if NewRange then begin
    if FirstRange then begin
      LastLayer := MergeLayer;
      FirstRange := false;
    end;
    writeln;
    write(Cr,RangeCount+1:2,'. ',LastLayer:5,' - ');
```

```
MERGE.PAS    - Page 11 -                                  4/15/1988    5:18 PM
      UpdX := whereX;
      UpdY := whereY;
      write(LastLayer:5,'     1 layers');
      NewRange := false;
      RangeLayerCount := 1;
    end else begin
      gotoxy(UpdX,UpdY);
      inc(RangeLayerCount);
      write(LastLayer:5,'   ',RangeLayerCount:5);
    end;
    Blk := '#TOP';
    MakeControl;
  end;

{-----------------------------------------------------------------------------------}

procedure OutBinBlock(BlockStr : String);
  var
    i : Integer;
    BlockChar : Char;
  begin
    i:=1;
    while (i<=BlockMnemonicsCount) and (BlockMnemonics[i]<>BlockStr) do Inc(i);
    if i>BlockMnemonicsCount then BlockChar := #$FF
    else BlockChar := Char(i);
    BlockWrite(VectorBinaryFile,BlockChar,1);
  end;

procedure OutBinSet(MergeSetStr : String);
  var
    MergeSetNum : Byte;
  begin
    Val(MergeSetStr,MergeSetNum,rc);
    if rc<>0 then MergeSetNum := $FF;
    BlockWrite(VectorBinaryFile,MergeSetNum,1);
  end;

procedure OutBinNum(LongNum : LongInt);
  var
    WordNum : Word;
  begin
    if LongNum>65535 then LongNum := $FFFF;
    WordNum := LongNum;
    BlockWrite(VectorBinaryFile,WordNum,2);
  end;

procedure OutVectorLine(line : String;FileNum : Integer);
  var
    x,y,i : Integer;
    TempWord : Word;
  begin
    x:=1;
    for i:=1 to 4 do begin
      while (x<=Length(line)) and (line[x]=' ') do Inc(x);
      if x>Length(Line) then begin
        writeln;
        SystemError('Error: point not found in merge file');
        writeln('File ',FileNum,' "',line,'"');
        Halt(1);
      end;
```

```
MERGE.PAS    - Page 12 -                          4/15/1988    5:_8 PM

      y:=Pos(' ',Copy(line,x,Length(line)-x+1));
      if y=0 then y := Length(line)+1
      else y:=y+x-1;
      Val(Copy(line,x,y-x),TempWord,rc);
      if rc<>0 then begin
        writeln;
        SystemError('Error in point in merge file line ');
        writeln('File ',FileNum,' "',line,'"');
        Halt(1);
      end;
      x:=y;
      if (i=1) or (i=3) then begin
        TempWord:=TempWord+OffsetX[FileNum];
        if TempWord<MinX then MinX:=TempWord;
        if TempWord>MaxX then MaxX:=TempWord;
      end else begin
        TempWord:=TempWord+OffsetY[FileNum];
        if TempWord<MinY then MinY:=TempWord;
        if TempWord>MaxY then MaxY:=TempWord;
      end;
      if BinaryOutput then BlockWrite(VectorBinaryFile,TempWord,2)
      else begin
        if i=1 then write(VectorTextFile,TempWord)
        else write(VectorTextFile,' ',TempWord);
      end;
    end;
    if Not BinaryOutput then writeln(VectorTextFile);
    Inc(VectorCount);
  end;


procedure WriteVectorCount;
  begin
    if VectorCount>0 then begin
      seek(VectorBinaryFile,VectorCountPtr);
      BlockWrite(VectorBinaryFile,VectorCount,4);
      VectorCount := 0;
      seek(VectorBinaryFile,FileSize(VectorBinaryFile));
    end;
  end;

{-----------------------------------------------------------------------------}

procedure PrintHeaders;
begin
(*   write(Cmd,FileNum,' '); *)
  { update vector file }
  if BinaryOutput then begin
    WriteVectorCount;
    OutBinBlock(Cmd);
    OutBinSet(FileNum);
    OutBinNum(MergeLayer);
    VectorCountPtr := FileSize(VectorBinaryFile);
    BlockWrite(VectorBinaryFile,VectorCount,4);
  end else writeln(VectorTextFile,Cmd,FileNum,',',MergeLayer);
  { update layer and range files }
  Blk := Cmd + FileNum;
  MakeControl;
end;
```

```
{-----------------------------------------------------------------------------}

procedure ReadSlices;
var
  i,j,c: Integer;
  select,temp: String;
begin
  FirstRange := true;
  NewRange   := true;
  repeat
    NewLayer;
    for InFile := 1 to NumPartFiles do begin
      FileNum := IntStr(InFile);
      { process rest of Z block & other blocks }
      SkipBlock := false;
      if not(eof(InputFiles[InFile])) and (CurrentZ[InFile]=MergeLayer) then be
        Cmd := HeaderType;
        PrintHeaders;
      end;
      while not(eof(InputFiles[InFile])) and (CurrentZ[InFile]=MergeLayer) do b
        repeat
          readln(InputFiles[InFile],Line);
          Line[length(Line) + 1] := #0;
          if copy(Line,1,1) = '' then begin
            writeln(LayerFile,Line);
            writeln(RangeFile,Line);
          end;
        until copy(Line,1,1)<>' ';

 { process slice block }

        i := 0;
        temp := copy(Line,1,2);
        if (temp = 'Z ') or (temp = 'L ') then i := 1
        else if length(temp)=1 then i := pos(temp,'ZXYISHVABJCDEFGK');
        if i=0 then begin
          i := 1;
          while (i <= BlockMnemonicsCount) and
            ((copy(Line,1,length(BlockMnemonics[i])) <> BlockMnemonics[i])
              or not (Line[length(BlockMnemonics[i])+1] in [#0,' ']))
                do inc(i);
          if i > BlockMnemonicsCount then i := 0;
        end;
        if i > 0 then begin
          SkipBlock := false;
          c := FindStr(1,Line,' ');
          Cmd := copy(Line,1,c-1);
          if i=1 then begin     { handle Z block special }
            Zval := LongVal(copy(Line,c+1,9),code) + ZOffset[InFile];
            CurrentZ[InFile] := Zval;
          end else begin
            select := ',' + cmd + ',';
            if (pos(select,NoBlocks[InFile]) > 0) or
              ((length(OnlyBlocks[InFile]) > 0) and
                (pos(select,OnlyBlocks[InFile])=0)) then begin
              SkipBlock := true;
            end else PrintHeaders;
          end;
        end else if not SkipBlock then OutVectorLine(Line,InFile);
      end;  {while}
```

```
    end;  {for}
    Bik := '#BTM';
    MakeControl;
    LastLayer := MergeLayer;
    MergeLayer := 99999;
    for InFile := 1 to NumPartFiles do
      if not eof(InputFiles[InFile]) then
        if CurrentZ[InFile] < MergeLayer then MergeLayer := CurrentZ[InFile];
  until MergeLayer = 99999;
  if BinaryOutput then WriteVectorCount;
end;

procedure Update(FileName: String);
var
  i: Integer;
  St: String;
begin
  assign(UpdateFile,FileName);
  reset(UpdateFile);
  seek(UpdateFile,UpdateIndex [illegible]);
  St := WordStr(StartLayer);
  St := St + spc(5-length(St));
  for i:=1 to 5 do write(UpdateFile,St[i]);
  Seek(UpdateFile,UpdateIndex + 1?);
  St := WordStr(EndLayer);
  St := St + spc(5-length(St));
  for i:=1 to 5 do write(UpdateFile,St[i]);
  Seek(UpdateFile,UpdateIndex + 16 + 17);
  St := WordStr(Layers);
  St := St + spc(5-length(St));
  for i:=1 to 5 do write(UpdateFile,DtCi]);
  Seek(UpdateFile,UpdateIndex + 60);
  St := WordStr(MinX);
  St := St + spc(5-length(St));
  for i:=1 to 5 do write(UpdateFile,St[i]);
  Seek(UpdateFile,UpdateIndex + 60 + 16);
  St := WordStr(MaxX);
  St := St + spc(5-length(St));
  for i:=1 to 5 do write(UpdateFile,St[i]);
  Seek(UpdateFile,UpdateIndex + 60 + 43);
  St := WordStr(MinY);
  St := St + spc(5-length(St));
  for i:=1 to 5 do write(UpdateFile,St[i]);
  Seek(UpdateFile,UpdateIndex + 60 + 59);
  St := WordStr(MaxY);
  St := St + spc(5-length(St));
  for i:=1 to 5 do write(UpdateFile,St[i]);
  close(UpdateFile);
end;

{-----------------------------------------------------------------------------}

procedure MergeFiles;
begin
{ determine output file prefix }
  if OutFileName = '' then begin
    write('Output File Name Prefix [',FirstFileName,']: ');
    readln(OutFileName);
    if OutFileName = '' then OutFileName := FirstFileName;
    OutFileName := upper(OutFileName);
```

```
  end;

{ open up output files, existing files are overwritten }
  LayerFileName  := OutFileName + '.L';
  RangeFileName  := OutFileName + '.R';
  VectorFileName := OutFileName + '.V';
  assign(LayerFile,LayerFileName);
  rewrite(LayerFile);
  writeln(LayerFile,'!MERGE: -FILES ',MergeLine);
  writeln(LayerFIle,'!MERGE: -STARTLAYER XXXXX -ENDLAYER XXXXX -NUMLAYERS XXXXX
  writeln(LayerFile,'!MERGE: -MIN X       XXXXX -MAX X     XXXXX');
  writeln(LayerFile,'!MERGE: -MIN Y       XXXXX -MAX Y     XXXXX');
  UpdateIndex := length(MergeLine) + 17 + 20;    { points to StartLayer value }
  assign(RangeFile,RangeFileName);
  rewrite(RangeFile);
  writeln(RangeFile,'!MERGE: -FILES ',MergeLine);
  writeln(RangeFile,'!MERGE: -STARTLAYER XXXXX -ENDLAYER XXXXX -NUMLAYERS XXXXX
  writeln(RangeFile,'!MERGE: -MIN X       XXXXX -MAX X     XXXXX');
  writeln(RangeFile,'!MERGE: -MIN Y       XXXXX -MAX Y     XXXXX');

  Layers := 0;
  MinX:=65535;
  MinY:=65535;
  MaxX:=0;
  MaxY:=0;
  FindFirstLayers;
  GetParameters;
  if BinaryOutput then begin
    assign(VectorBinaryFile,VectorFileName);
    rewrite(VectorBinaryFile,1);
    rc:=0;
    BlockWrite(VectorBinaryFile,rc,1);
  end else begin
    assign(VectorTextFile,VectorFileName);
    rewrite(VectorTextFile);
  end;

  window(StatusBoxLeft+1,StatusBoxTop+1,StatusBoxRight-1,StatusBoxBottom-1);
  ClrScr;
  window(1,1,80,25);
  SetUpStatusBox;
  gotoxy(StatusBoxLeft+2,StatusBoxTop+1);
  write('Different Z-Spacing Ranges:');
  window(StatusBoxLeft+2,StatusBoxTop+3,StatusBoxRight-2,StatusBoxBottom-3);
  ReadSlices;

  if BinaryOutput then close(VectorBinaryFile)
  else close(VectorTextFile);
  OutputRange;
  close(LayerFile);
  close(RangeFile);
  Update(LayerFileName);
  Update(RangeFileName);
  window(1,1,80,25);
  gotoxy(StatusBoxLeft+2,StatusBoxBottom-1);
  write(RangeCount,' range');
  if RangeCount>1 then write('s');
  write(', ',Layers,' layer');
  if Layers>1 then write('s');
  write(' processed.');
```

```
MERGE.PAS    - Page 16 -                    4/15/1988   5:19 P

end;

{-----------------------------------------------------------------------------

procedure CheckForOptions;
var
  i,oi,j,k: Integer;
  FileName: String;
begin
  FirstFileName := '';
  CmdLine := upper(CmdLine);
  RemoveDoubleSpaces(CmdLine);
  i := pos ('/OUTFILE',CmdLine);
  if i>0 then begin
    oi := i;
    inc(i,8);
    while (i<length(CmdLine)) and (CmdLine[i]=' ') do inc(i);
    j := FindStr(i,CmdLine,' /');
    OutFileName := copy(CmdLine,i,j-i);
    delete(CmdLine,oi,j-oi);
  end;
  i := pos('/RES',CmdLine);
  if i>0 then begin
    oi := i;
    inc(i,4);
    while (i<length(CmdLine)) and (CmdLine[i]=' ') do inc(i);
    j := FindStr(i,CmdLine,' /');
    val(copy(CmdLine,i,j-i),Resolution,code);
    delete(CmdLine,oi,j-oi);
  end;
  i := pos('/ZSPC',CmdLine);
  if i>0 then begin
    oi := i;
    inc(i,5);
    while (i<length(CmdLine)) and (CmdLine[i]=' ') do inc(i);
    j := FindStr(i,CmdLine,' /');
    val(copy(CmdLine,i,j-i),ZSpacing,code);
    delete(CmdLine,oi,j-oi);
  end;

  i := pos('/ASCII',CmdLine);
  BinaryOutput := True;
  if i>0 then begin
    oi := i;
    inc(i,6);
    while (i<length(CmdLine)) and (CmdLine[i]=' ') do inc(i);
    j := FindStr(i,CmdLine,' /');
    BinaryOutput := False;
    delete(CmdLine,oi,j-oi);
  end;

  i := pos('/THICK',CmdLine);
  if i>0 then begin
    oi := i;
    inc(i,6);
    while (i<length(CmdLine)) and (CmdLine[i]=' ') do inc(i);
    j := FindStr(i,CmdLine,' /');
    val(copy(CmdLine,i,j-i),Thickness,code);
    delete(CmdLine,oi,j-oi);
  end;
```

```
  RemoveDoubleSpaces(CmdLine);
  MergeLine := CmdLine;

{ pick out slice file names and open them up }
  while CmdLine<>'' do begin
    i := pos(' ',CmdLine);
    if i=0 then begin
      FileName := CmdLine;
      CmdLine := '';
    end else begin
      FileName := copy(CmdLine,1,i-1);
      CmdLine  := copy(CmdLine,i+1,255);
    end;
    inc(NumPartFiles);
{}
    i := pos('/X',FileName);
    if i>0 then begin
      oi := i;
      inc(i,2);
      while (i<length(FileName)) and (FileName[i]=' ') do inc(i);
      j := FindStr(i,FileName,' /');
{     val(copy(FileName,i,j-i),XOffset[NumPartFiles],code); }
      if i<j then OffsetX[NumPartFiles] := LongVal(copy(FileName,i,j-i),k);
      delete(FileName,oi,j-oi);
    end;

    i := pos('/Y',FileName);
    if i>0 then begin
      oi := i;
      inc(i,2);
      while (i<length(FileName)) and (FileName[i]=' ') do inc(i);
      j := FindStr(i,FileName,' /');
      if i<j then OffsetY[NumPartFiles] := LongVal(copy(FileName,i,j-i),k);
      delete(FileName,oi,j-oi);
    end;

    i := pos('/Z',FileName);
    if i=0 then i := pos('/L',FileName);
    if i>0 then begin
      oi := i;
      inc(i,2);
      while (i<length(FileName)) and (FileName[i]=' ') do inc(i);
      j := FindStr(i,FileName,' /');
      val(copy(FileName,i,j-i),ZOffset[NumPartFiles],code);
      delete(FileName,oi,j-oi);
    end;
    i := pos('/N',FileName);
    if i>0 then begin
      oi := i;
      inc(i,2);
      while (i<length(FileName)) and (FileName[i]=' ') do inc(i);
      j := FindStr(i,FileName,'/');
      NoBlocks[NumPartFiles] := ','+copy(FileName,i,j-i)+',';
      delete(FileName,oi,j-oi);
    end;

{**** OFFSET Option. Offsets given file by X,Y on output
    OffsetX[NumPartFiles] := 0;
    OffsetY[NumPartFiles] := 0;
    i := pos('/OFFSET',FileName);
```

```
MERGE.PAS    - Page 19 -                    4/15/1988    5: 1 PM

     if i>0 then begin
       ci := i:
       inc(i,7):
       while (i<length(FileName)) and (FileName[i]=' ') do inc(i):
       j := FindStr(i,FileName,'/');
       OffsetX[NumPartFiles] := LongVal(copy(FileName,i,j-i),k);
       if k>0 then begin
         i := i + k;
         if i<j then OffsetY[NumPartFiles] := LongVal(copy(FileName,i,j-i),k);
       end;
       delete(FileName,ci,j-ci);
     end:  *****)

     i := pos('/D',FileName);
     if i>0 then begin
       ci := i:
       inc(i,2):
       while (i<length(FileName)) and (FileName[i]=' ') do inc(i);
       j := FindStr(i,FileName,'/');
       DriveIDs[NumPartFiles] := ...(FileName,i,j-i), ;
       delete(FileName,ci,j-ci);
     end:
     if FirstFileName = '' then FirstFileName := FileName:
     i := pos('.',FileName);
     if i=0 then FileName := FileName + '.SLI';
     assign(InputFiles[NumPartFiles],FileName);
     {$I-}
     reset(InputFiles[NumPartFiles]);
     if IOresult<>0 then begin
       writeln('Error: Can''t open file ',FileName);
       halt(1);
     end;
   end; {while}
   if NumPartFiles = 0 then halt(0);
end;

procedure ShowFiles(FileSpec: String);
var
  FileCount: Integer;
  DirInfo: SearchRec;
begin
  FileCount := 0;
  FindFirst(FileSpec,AnyFile,DirInfo);
  if DosError<>0 then writeln('- none -')
  else begin
    while DosError=0 do begin
      if FileCount>0 then write(spc(11-((whereX-1) mod 10+1)));
      inc(FileCount);
      write(copy(DirInfo.Name,1,pos('.',DirInfo.Name)-1));
      FindNext(DirInfo);
    end;
    writeln;
  end;
end;

procedure ProcessCommandLine;
begin
  ReadCommandLine(CmdLine);
  if CmdLine = '' then begin
    writeln('Directory Listing of Sliced Files:');
```

```
    writeln;
    ShowFiles('*.SLI');
    writeln;
    write('Slice File Names: ');
    readln(CmdLine);
    writeln;
  end;
  NumPartFiles := 0;
  CheckForOptions;
end;

procedure ReadBlockIdFile;
var
  BlockIdFile: text;
  BlockIdLine: string;
  index,Group: Integer;
  Block: String;
begin
  BlockMnemonicsCount := 0;
  {$I-}
  assign(BlockIdFile,BlockIdFileName);
  reset(BlockIdFile);
  if IOresult<>0 then begin
    assign(BlockIdFile,HomeDirectory+'\'+BlockIdFileName);
    reset(BlockIdFile);
    if IOresult<>0 then begin
      writeln('Can''t find Block Id file.');
      halt(2);
    end;
  end;
  {$I+}
  while not eof(BlockIdFile) do begin
    readln(BlockIdFile,BlockIdLine);
    if (length(BlockIdLine)>0) and (BlockIdLine[1]<>'!') then begin
      index := 1;
      UnitValShortInt(Group,BlockIdLine,index);
      UnitStr(Block,BlockIdLine,index);
      if Group=0 then begin
        inc(BlockMnemonicsCount);
        BlockMnemonics[BlockMnemonicsCount] := upper(Block);
      end;
    end;
  end;
  close(BlockIdFile);
end;


{ ------------------------------ MAIN PROGRAM ---------------------------------- }


begin
  ExitProc := @ExitMerge;
  CheckBreak := true;
  FillChar(FirstVar,ofs(LastVar)-Ofs(FirstVar),#0);   { clear variables }
  ClrScr;
  SingleBar := many(#196,26);
  centerln('MERGE, Sliced Files Merger');
  centerln('Version '+VersionId);
  centerln('Copyright (C) 1988 by 3D Systems, Inc.');
  centerln('3D Systems Laser Stereolithography System');
```

```
  centerln(SingleBar);

  writeln;
  writeln;
  OutFileName := '';
  ReadBlockIdFile;
  ProcessCommandLine;
  MergeFiles;
  QuietSystemError('Success.');
end.
```

```
{=============================================================================
   3D Systems Stereolithography System Software
 =============================================================================

   MONITOR.PAS
   SLA-1 Laser Beam Monitoring Program

 -----------------------------------------------------------------------------

   Compile with Turbo Pascal Version 4.0
 -----------------------------------------------------------------------------

   Recent History:

    3/14/88  Ver 2.80  first release
    4/09/88  Ver 3.00  production release

 -----------------------------------------------------------------------------}

program Monitor;

uses Crt,Dos;

type
  str6  = string[6];
  str10 = string[10];
  str16 = string[16];
  BeamProfileVarSensorType = record
    Xpos               : LongInt;    { inputs }
    Ypos               : LongInt;
    ScanStep           : Integer;
    BkgndThreshold     : Integer;
    InitialDelay       : Integer;
    RowToRowDelay      : Integer;
    ColToColDelay      : Integer;
    XYweight           : LongInt;    { outputs }
    Xweight            : LongInt;
    Yweight            : LongInt;
    TotalWeight        : LongInt;
    HiPoints           : Word;
    SaturationCount    : Integer;
    MaxSensorReading   : Integer;
    BeamMap            : array[0..30,0..30] of Integer;
    RowWeight          : array[0..30] of Word;
    ColWeight          : array[0..30] of Word;
  end;
  BeamProfileVarType = array[1..3] of BeamProfileVarSensorType;
  FindBeamVarSensorType = record
    Xval               : LongInt;    { inputs & updated }
    Yval               : LongInt;
    SpiralDelay        : Word;       { inputs }
    SpiralSideMax      : Integer;
    SpiralTries        : Integer;
    ScanStep           : Integer;
    BkgndThreshold     : Integer;
    NumCenterPasses    : Integer;
    Xavg               : Real;       { outputs }
    Yavg               : Real;
  end;
  FindBeamVarType = array[1..3] of FindBeamVarSensorType;
  FindMethodType = (none,NormalFind,Verify2MilHole);
```

```
MONITOR.PAS    - Page 1 -                    4/15/1988    3:24 PM

const
  VersionId = '3.00';
  ParamFileName = 'BEAM.PRM';
  ErrorFileName = 'C:\SYSTEM.ERR';
  HomeDirectory = 'C:\3DSYS\';
  PowerHistoryFileName   = 'C:\HISTORY\POWER.MON';
  ProfileHistoryFileName = 'C:\HISTORY\PROFILE.MON';
  Blank = '
  ColMax = 22;
  RowMax = 22;

  LaserAddr    = $300;
  NumSensors   = 2;
  Timeout = 60000;

var
  FirstVar: Byte;  { must be first variable defined }
  { beam arrays }
  ResistanceTemperature: array[1..3] of Real;
  { sensor arrays }
  SensorChannel,XSensorPts,YSensorPts,SensorBkgnd: array[1..3] of Word;
  Power,Bk: array[1..3] of Real;
  Xsp,Ysp: array[1..3] of Real;
  SensorCalib: array[1..3,1..4] of Real;
  LastField: array[1..4] of Integer;
  { miscellaneous }
  key: Char;
  Transparent,BeamFound: Boolean;
  CurrentDate,CurrentTime,OutFileName,SingleBar,CmdLine: String;
  XRest,YRest,TempChannel,TempCalPts: Word;
  i,PeakReading,Sensor,Select,SensorNum: Integer;
  GoodCount,Sec,Minu,Hour,Day,WeekDay,Mon,Year: Integer;
  Xpos,Ypos: LongInt;
  Xaverage,Yaverage,TotWtAvg: Real;
  OldExitProc: Pointer;
  BeamProfileVariables: BeamProfileVarType;
  FindBeamVariables: FindBeamVarType;
  CalibDelays: array[1..3,1..3] of LongInt;
  ErrorFile,ParamFile,PowerHistoryFile,ProfileHistoryFile: Text;
  LastVar: Byte;  { should be last variable defined }


{--------------------------------------------------------------------------------

                           Utility Routines

--------------------------------------------------------------------------------}

procedure beep;
begin
  Sound(1000);
  delay(300);
  NoSound;
end;

function upper(text: string): string;
var
  i: Integer;
  temp: string;
```

```
begin
  temp := text;
  for i := 1 to length(temp) do temp[i] := upcase(temp[i]);
  upper := temp;
end;

function many(Ch: Char;num: Integer): string;
var
  temp: string;
  i: Integer;
begin
  temp := '';
  for i:=1 to num do temp  := temp+Ch;
  many := temp;
end;

function IntStr(num: Integer): str16;
var
  temp: str16;
begin
  if num>=0 then Str(num,temp) else Str(num+$8000,temp);
  IntStr := temp;
end;

function WordStr(num: word): str16;
var
  temp: str16;
begin
  Str(num,temp);
  WordStr := temp;
end;

function LongStr(num: LongInt): str16;
var
  temp: str16;
begin
  Str(num,temp);
  LongStr := temp;
end;

function RealStr(num: Real;AfterDecimal: Integer): String;
var
  i: Integer;
  temp: String;
begin
  Str(num:10:AfterDecimal,temp);
  i := 1;
  while (i<length(temp)) and (temp[i]=' ') do inc(i);
  RealStr := copy(temp,i,99);
end;

function spc(len: Integer): string;
begin
  spc := copy(blank,1,len);
end;

procedure ReadCommandLine(var line: string);
var
  i: Integer;
begin
```

```
  line := ParamStr(1);
  for i:=2 to ParamCount do
    line := line + ' ' + ParamStr(i);
end;

{
  Remove excess quote marks around string
}
function NoQuotes(Text: String): String;
const
  Quote = '"';
var
  s,e: Integer;
begin
  s := 1;
  if (length(Text)>1) and (Text[1]=Quote) then inc(s);
  e := length(Text);
  if Text[e]=Quote then dec(e);
  NoQuotes := copy(Text,s,e-s+1);
end;

{
  Removes all double spaces in text string
}
procedure RemoveDoubleSpaces(var text: string);
begin
  while pos('  ',text)>0 do
    delete(text,pos('  ',text),1);
end;

function WordVal(line: String;var code: Integer): Word;
var
  code2: Integer;
  num: Word;
begin
  val(line,num,code);
  if code<>0 then val(copy(line,1,code-1),num,code2);
  WordVal := num;
end;

function LongVal(line: String;var code: Integer): LongInt;
var
  code2: Integer;
  num: LongInt;
begin
  val(line,num,code);
  if code<>0 then val(copy(line,1,code-1),num,code2);
  LongVal := num;
end;

function RealVal(line: String;var code: Integer): Real;
var
  ofs,code2: Integer;
  num: Real;
begin
  ofs := 0;
  if line[1]='.' then begin
    line := '0' + line;
    ofs := -1;
  end;
```

```
  val(line,num,code);
  if code<>0 then val(copy(line,1,code-1),num,code2);
  if code<>0 then inc(code,ofs);
  RealVal := num;
end;

{
  Show error and store it on disk
}
procedure QuietSystemError(TextLine: string);
begin
  assign(ErrorFile,ErrorFileName);
  rewrite(ErrorFile);
  writeln(ErrorFile,'MONITOR: ',TextLine);
  close(ErrorFile);
end;

procedure SystemError(TextLine: string);
begin
  writeln(^G+TextLine);
  QuietSystemError(TextLine);
end;

{
  Can't open file.  Report this to operator.
}
procedure CantOpen(FileName: string);
begin
  SystemError('Can''t open file '+FileName);
end;

{$F+}
procedure ExitMonitor;
{$F-}
begin
  ExitProc := OldExitProc;
end;

{
  Pad time element with left space if necessary
}
function PadSp(num: Integer): str10;
var
  temp: str10;
begin
  temp := IntStr(num);
  if num<10 then PadSp := ' ' + temp
    else PadSp := temp;
end;

{
  Pad time element with left zero if necessary
}
function LZero(num: Integer): str10;
var
  temp: str10;
begin
  temp := IntStr(num);
  if num<10 then LZero := '0' + temp
    else LZero := temp;
```

```
end;

{
  Read time directly from clock chip
  works only on ATs, 286s, 386s; does not work on standard PCs, XTs
}
procedure GetTime;
var
  good: Boolean;
begin
  good := false;
  while not good do begin
    port[$70] := $0A;     { wait for update to finish (then there's 244 us) }
    if (port[$71] and $80)=0 then begin
      port[$70] := $00;     { get seconds }
      Sec := port[$71];
      port[$70] := $0A;
      if (port[$71] and $80)=0 then begin
        port[$70] := $02;     { get minutes }
        Minu := port[$71];
        port[$70] := $0A;
        if (port[$71] and $80)=0 then begin
          port[$70] := $04;     { get hours }
          Hour := port[$71];
          port[$70] := $0A;
          if (port[$71] and $80)=0 then begin
            port[$70] := $07;     { get day }
            Day := port[$71];
            port[$70] := $0A;
            if (port[$71] and $80)=0 then begin
              port[$70] := $08;     { get month }
              Mon := port[$71];
              port[$70] := $0A;
              if (port[$71] and $80)=0 then begin
                port[$70] := $09;     { get year }
                Year := port[$71];
                port[$70] := $0A;
                if (port[$71] and $80)=0 then good := true;
              end;
            end;
          end;
        end;
      end;
    end;
  end;
  Sec  := (Sec  shr 4) * 10 + (Sec  and $0F);  { convert from BCD }
  Minu := (Minu shr 4) * 10 + (Minu and $0F);
  Hour := (Hour shr 4) * 10 + (Hour and $0F);
  Day  := (Day  shr 4) * 10 + (Day  and $0F);
  Mon  := (Mon  shr 4) * 10 + (Mon  and $0F);
  Year := (Year shr 4) * 10 + (Year and $0F);
end;

{
  Get a time stamp consisting of the relative day and the current time
}
procedure GetTimeStamp;
var
  tday,tmon,tyear,tsec,tminu,thour: str10;
  AmPm: Char;
```

```
begin
  GetTime;
  tmon  := PadSp(Mon);
  tday  := LZero(Day);
  tyear := LZero(Year);
  CurrentDate := tmon+'/'+tday+'/'+tyear;
  tsec  := LZero(Sec);
  tminu := LZero(Minu);
  if Hour=0 then begin
    thour := '12';
    AmPm := 'A';
  end else if Hour<12 then begin
    thour := PadSp(Hour);
    AmPm := 'A';
  end else if Hour=12 then begin
    thour := '12';
    AmPm := 'P';
  end else begin
    thour := PadSp(Hour-12);
    [illegible]
  end;
  [illegible]
end;

function [illegible]: String;
begin
  GetTimeStamp;
  TimeStamp := CurrentDate + ' ' + CurrentTime;
end;

function ReadLaserBoard(Channel: Integer): Integer;
var
  count: LongInt;
  ADC,i: Integer;
begin
  count := [illegible];
  port[LaserAddr+12] := Channel;
  { must wait 10 us for EOC to go LO (286 @ 4us/loop) }
  i := 1;
  while i < 1? do inc(i);
  repeat    { then approx 110 us for conversion with signal D7 HI }
    dec(count);
  until (port[LaserAddr+16] > 127) or (count = 0);
  ADC := port[LaserAddr+12];
  if PeakReading < ADC then PeakReading := ADC;
  if count = 0 then ReadLaserBoard := -1
    else ReadLaserBoard := ADC;
end;

procedure ReadTemperature(var Resist,Temper: Real);
var
  temp: Real;
  It,ADC: Integer;
begin
{
  SUBROUTINE: READ voltage of thermistor on JB Board
  use 1/T, LOG(R) function TO linearize the interpolation
}
  ADC := ReadLaserBoard(TempChannel);
  Resist := 20000.0 * (255-ADC) / (255+ADC);   { from 20K resistor on JB Board }
```

```
  if ADC>214 then begin
    Temper := 71;
    exit;
  end;
  It := 0;
  while (It <= TempCalPts) and (Resistance[It] > Resist) do inc(It);
  if Resistance[It] = Resist then
    Temper := Temperature[It]
  else begin
    temp := (1/Temperature[It-1] - 1/Temperature[It]) /
      (ln(Resistance[It-1]) - ln(Resistance[It]));
    Temper := 1/(1/Temperature[It-1] - temp *
      (ln(Resistance[It-1]) - ln(Resist)));
  end;
  Temper := Temper - 273.15;
end;

procedure printIn(text: String);
begin
  [illegible]
end;

{ ----------------------------------------------------------------------------

                           BEAM SCANNING ROUTINES

  ---------------------------------------------------------------------------- }

                                 {***********
                                  * MoveBeam *
                                  ***********}

{ Routine to move mirrors to X,Y directly
  Note: X,Y can be any kind of variable, we change to integers
        and set ADC% (for speed; later fixed addrs routines for each)
}
procedure AxisMove(pos: LongInt;Strobe: Byte);
begin
  if pos > 65534 then pos := 65534
    else if pos < 0 then pos := 0;
  portW[LaserAddr] := pos;
  port[LaserAddr+2] := port[LaserAddr+2] and not Strobe;    { x is bit 0, y is b
  port[LaserAddr+2] := port[LaserAddr+2] or Strobe;
end;

procedure MoveInXAxis(x: LongInt);
begin
  AxisMove(x,1);
end;

procedure MoveInYAxis(y: LongInt);
begin
  AxisMove(y,2);
end;

procedure MoveBeam(x,y: LongInt);
begin
  MoveInXAxis(x);
```

```
  MoveInYAxis(Y);
end;


{
                                        ******************
                                        * GetBeamProfile *
                                        ******************
}

procedure SetupBeamProfile(var BeamProfileVars: BeamProfileVarType;
  Sensor: Integer;X,Y: Real;_ScanStep,_BkgndThreshold: Integer);
begin
  with BeamProfileVars[Sensor] do begin
    if X                 <> 0 then Xpos           := trunc(X);
    if Y                 <> 0 then Ypos           := trunc(Y);
    if _ScanStep         <> 0 then ScanStep       := _ScanStep;
    if _BkgndThreshold   <> 0 then BkgndThreshold := _BkgndThreshold;
    InitialDelay     := 2000;
    RowToRowDelay    := 200;
    ColToColDelay    := 2000;
  end;
end;

procedure GetBeamProfile(var BeamProfileVars: BeamProfileVarType;
  Sensor: Integer);
var
  Pass,row,col,ADC,delay,waste: Integer;
  Xcorner,Ycorner: LongInt;
begin
  with BeamProfileVars[Sensor] do begin
    Xweight         := 0;
    Yweight         := 0;
    Tweight         := 0;
    TotalWeight     := 0;    { for power, not removing noise till end }
    SaturationCount := 0;
    HiPoints        := 0;
    BeamFound       := false;
    for col:=1 to ColMax do ColWeight[col] := 0;
    for row:=1 to RowMax do RowWeight[row] := 0;
    Xcorner := Xpos - (ColMax + 1) * ScanStep div 2;
    Ycorner := Ypos - (RowMax + 1) * ScanStep div 2;
    MoveBeam(Xcorner,Ycorner);
    waste := 0;
    while waste < InitialDelay do inc(waste);
    PeakReading := 0;
    for col:=1 to ColMax do begin   { prefer to return around edges after line
      Xpos := Xcorner + col * ScanStep;
      Ypos := Ycorner;
      MoveBeam(Xpos,Ypos);
      waste := 0;
      while waste < ColToColDelay do inc(waste);
      for row:=1 to RowMax do begin
        inc(Ypos,ScanStep);
        MoveInYAxis(Ypos);
        waste := 0;
        while waste < RowToRowDelay do inc(waste);
        ADC := ReadLaserBoard(SensorChannel[Sensor]);
```

```
        if ADC < BkgndThreshold then ADC := 0
          else begin
            inc(HiPoints);
            BeamFound := true;
          end;
        if ADC > 210 then inc(SaturationCount);
        inc(TotalWeight,ADC);
        inc(ColWeight[col],ADC);
        inc(RowWeight[row],ADC);
        BeamMap[row,col] := ADC;
        inc(XYweight,ADC);
        inc(Xweight,Xpos * ADC);    { want floating point numbers here }
        inc(Yweight,Ypos * ADC);
      end; {for row}
    end; {for col}
    MaxSensorReading := PeakReading;
  end;
end;
```

```
                    ************
                    * GoodRead *
                    ************
```

```
procedure GoodRead(Sensor,iter: Integer);
var
  Try: Integer;
begin
  with BeamProfileVariables[Sensor] do begin
    Xaverage  := 0;
    Yaverage  := 0;
    TotWtAvg  := 0;
    GoodCount := 0;
    for Try := 1 to iter do begin
      SetupBeamProfile(BeamProfileVariables,Sensor,Xsp[Sensor],
        Ysp[Sensor],-1{ScanStep},-1{BkgndThreshold});
      GetBeamProfile(BeamProfileVariables,Sensor);
      if XYweight > 0 then begin
        Xaverage := Xweight / XYweight + Xaverage;
        Yaverage := Yweight / XYweight + Yaverage;
        TotWtAvg := TotWtAvg + TotalWeight - SensorBkgnd[Sensor];
        inc(GoodCount);
      end;
    end; {for Try}
    if GoodCount > 0 then begin
      Xaverage := Xaverage / GoodCount;
      Yaverage := Yaverage / GoodCount;
      TotWtAvg := TotWtAvg / GoodCount;
    end;
    Power[Sensor] := TotWtAvg * SensorCalib[Sensor,3];
  end;
end;
```

```
{-----------------------------------------------------------------------------
                            HARDWARE ROUTINES
 -----------------------------------------------------------------------------
```

```
************
* IOSetup *
************

procedure IOSetup;
begin
  port[LaserAddr+3] := $98;
  Xpos := XRest;
  Ypos := YRest;
  MoveBeam(Xpos,Ypos);
end;

*************
* FindBeam *
*************

procedure SetupFindBeam(var FindBeamVars: FindBeamVarType;
  Sensor: Integer;X,Y: Real;_SpiralSideMax,_SpiralTries,_ScanStep,
  _BkgndThreshold,_SpiralDelay,_NumCenterPasses: Integer);
begin
  with FindBeamVars[Sensor] do begin
    if X                <> 0 then Xval            := trunc(X);
    if Y                <> 0 then Yval            := trunc(Y);
    if _SpiralSideMax   <> 0 then SpiralSideMax   := _SpiralSideMax;
    if _SpiralTries     <> 0 then SpiralTries     := _SpiralTries;
    if _ScanStep        <> 0 then ScanStep        := _ScanStep;
    if _SpiralDelay     <> 0 then SpiralDelay     := _SpiralDelay;
    if _BkgndThreshold  <> 0 then BkgndThreshold  := _BkgndThreshold;
    if _NumCenterPasses <> 0 then NumCenterPasses := _NumCenterPasses;
  end;
end;

function SpiralSearchForHole(var FindBeamVars: FindBeamVarType;
  Sensor: Integer): Boolean;
var
  i,ADC,SpiralSide,waste: Integer;
  X,Y: LongInt;
begin
  with FindBeamVars[Sensor] do begin
    X := trunc(Xval);
    Y := trunc(Yval);
    MoveBeam(X,Y);
    delay(SpiralDelay);
    BeamFound := false;
    SpiralSide := 1;
    while (SpiralSide <= SpiralSideMax) and not BeamFound do begin
      i := 1;
      while (i <= SpiralSide) and not BeamFound do begin
        MoveInXAxis(X);
        waste := 0;
        while (waste < SpiralDelay) do inc(waste);
        ADC := ReadLaserBoard(SensorChannel[Sensor]);
        if ADC > BkgndThreshold then BeamFound := true
        else inc(X,ScanStep);
        inc(i);
      end;
```

```
      i := 1;
      while (i <= SpiralSide) and not BeamFound do begin
        MoveInYAxis(Y);
        waste := 0;
        while (waste < SpiralDelay) do inc(waste);
        ADC := ReadLaserBoard(SensorChannel[Sensor]);
        if ADC > BkgndThreshold then BeamFound := true
        else inc(Y,ScanStep);
        inc(i);
      end;
      { reverse directions after each 2 sides }
      if not BeamFound then ScanStep := -ScanStep;
      inc(SpiralSide);
    end; {while SpiralSide}
    if BeamFound then begin
      Xval := X;
      Yval := Y;
    end;
    SpiralSearchForHole := BeamFound;
  end;
end;

function FindBeam(var FindBeamVars: FindBeamVarType; Sensor: Integer;
  FindMethod: FindMethodType): Boolean;
const
  HoleSeparation = 11;
var
  i,ADC,pass,CantFind,SpiralSide: Integer;
  XspAv,YspAv: Real;
  X,Y,GoodX,GoodY: LongInt;
  BeamFound: Boolean;
begin
  FindBeam := true;
  with FindBeamVars[Sensor] do begin
    CantFind := 0;
    repeat
      X := trunc(Xval);
      Y := trunc(Yval);
      MoveBeam(X,Y);    { gets us to best starting position }
{
  now spiral to search for holes
}
      SetupFindBeam(FindBeamVariables,Sensor,X,Y,-1{SpiralSideMax},
        -1{SpiralTries},-1{ScanStep},-1{BkgndThreshold},-1{SpiralDelay},
        -1{NumCenterPasses});
      BeamFound := SpiralSearchForHole(FindBeamVariables,Sensor);
      if not BeamFound then begin
        SetupFindBeam(FindBeamVariables,Sensor,X,Y,SpiralSideMax * 2,
          -1{SpiralTries},-1{ScanStep},BkgndThreshold - 1,-1{SpiralDelay},
          -1{NumCenterPasses});
        inc(CantFind);
      end;
    until (CantFind >= SpiralTries) or BeamFound;
    if CantFind >= SpiralTries then begin
      MoveBeam(Xval,Yval);
      FindBeam := false;
      exit;
    end;
    X := Xval;
    Y := Yval;
```

```
{
 Verify that we have 2 mil hole...

  1/2 mil     1 mil ) left rear                2 mil      4  mil ) right front
                    ) of vat                                     ) of vat
   4  mil     2 mil )                          1 mil     1/2 mil

     Sensor #1                                     Sensor #2

  We have the position of one of the four holes: 1/2, 1, 2, or 4 mils.
  We want to find the 2 mil hole closest to the vat.  Note that the
  orientation of the holes is different for Sensors 1 and 2.

  Hole Size Check Procedure:

  1.  We may have the position for the 1/2 or 1 mil hole.  Move towards
      the vat in the X-axis and search for the 1 or 2 mil hole.  If the
      beam is seen, adopt the new coordinates.

  2.  Now we may have the position for the 4 mil hole.  Move towards the
      [illegible] 2 mil [illegible]. If the beam is
      seen, use the new coordinates.
 }
  if (Sensor [illegible] 2mil [illegible]) then begin
    GoodX := X;
    GoodY := Y;
    if X [illegible] 32767 then inc(X,HoleSeparation)
      else dec(X,HoleSeparation);
    SetupFindBeam(FindBeamVariables,Sensor,X,Y,SpiralSideMax div 2,
      -1{SpiralTries},-1{ScanStep},-1{BkgndThreshold},-1{SpiralDelay},
      -1{NumCenterPasses});
    if SpiralSearchForHole(FindBeamVariables,Sensor) then begin
      GoodX := Xval;
      GoodY := Yval;
    end;
    X := GoodX;
    Y := GoodY;
    if Y [illegible] 32767 then inc(Y,HoleSeparation)
      else dec(Y,HoleSeparation);
    SetupFindBeam(FindBeamVariables,Sensor,X,Y,-1{SpiralSideMax},
      -1{SpiralTries},-1{ScanStep},-1{BkgndThreshold},-1{SpiralDelay},
      -1{NumCenterPasses});
    if SpiralSearchForHole(FindBeamVariables,Sensor) then begin
      GoodX := Xval;
      GoodY := Yval;
    end;
    X := GoodX;
    Y := GoodY;
  end;

  XspAv := 0;
  YspAv := 0;
  if BeamFound then begin
    for pass:=1 to NumCenterPasses do with BeamProfileVariables[Sensor] do beg
      CantFind := 0;
      { discard the first }
      SetupBeamProfile(BeamProfileVariables,Sensor,X,Y,
        4{ScanStep},trunc(Bk[Sensor] + 0.5));
      repeat
        GetBeamProfile(BeamProfileVariables,Sensor);
```

```
          if XYweight = 0 then inc(CantFind);
        until (XYweight > 0) or (CantFind > 3);
        if CantFind > 3 then begin
          FindBeam := false;
          exit;
        end;

  Later select sensor hole size automatically

        X := trunc(Xweight / XYweight);    { better coordinates }
        Y := trunc(Yweight / XYweight);
        Power[Sensor] := (TotalWeight - SensorBkgnd[Sensor])
          * (SensorCalib[Sensor,3]);
        XspAv := XspAv + Xweight / XYweight;
        YspAv := YspAv + Yweight / XYweight;
      end; {for pass}
      if NumCenterPasses > 1 then begin
        XspAv := XspAv / NumCenterPasses;
        YspAv := YspAv / NumCenterPasses;
      end;
    end; {if BeamFound}
    Xval := X;          { [illegible] coordinates }
    Yval := Y;
    Xavg := XspAv;      { [illegible] average coordinates }
    Yavg := YspAv;
  end;
end;

function CoarseFindBeam(Sensor: Integer): Boolean;
begin
  SetupFindBeam(FindBeamVariables,Sensor,Xsp[Sensor],Ysp[Sensor],
    [illegible]{SpiralSideMax},3{SpiralTries},16{ScanStep},
    trunc(Bk[Sensor] + 0.5){BkgndThreshold},[illegible]{SpiralDelay},
    1{NumCenterPasses});
  if FindBeam(FindBeamVariables,Sensor,NormalFind) then begin
    Xsp[Sensor] := FindBeamVariables[Sensor].Xval;
    Ysp[Sensor] := FindBeamVariables[Sensor].Yval;
  end;
  CoarseFindBeam := BeamFound;
end;

function FineFindBeam(Sensor: Integer): Boolean;
begin
  SetupFindBeam(FindBeamVariables,Sensor,Xsp[Sensor],Ysp[Sensor],
    50{SpiralSideMax},3{SpiralTries},16{ScanStep},
    trunc(Bk[Sensor] + 0.5){BkgndThreshold},100{SpiralDelay},
    2{NumCenterPasses});
  if FindBeam(FindBeamVariables,Sensor,Verify2MilHole) then begin
    Xsp[Sensor] := FindBeamVariables[Sensor].Xval;
    Ysp[Sensor] := FindBeamVariables[Sensor].Yval;
  end;
  FineFindBeam := BeamFound;
end;

function FindLaserBeam(Sensor: Integer): Boolean;
begin
  if CoarseFindBeam(Sensor) then
    BeamFound := FineFindBeam(Sensor);
  FindLaserBeam := BeamFound;
end;
```

```
{ - - - - - - }

function FindHoles2(Sensor: Integer): Boolean;
{
  when we want to use new starting point
   updates hole position
}
begin
  FindHoles2 := FindLaserBeam(Sensor);
end;

function FindHoles(Sensor: Integer): Boolean;
{
  Updates hole position
  Needs to confirm that we have [illegible] mil hole
}
var
  BkRead: LongInt;
  ADC,row,col: Integer;
begin
  Xpos := XRest;
  Ypos := YRest;
  MoveBeam(Xpos,Ypos);
  BkRead := 0;
  for col:=1 to ColMax do begin
    for row:=1 to RowMax do begin
      ADC := ReadLaserBoard(SensorChannel[Sensor]);
      inc(BkRead,ADC);
    end;
  end;
  SensorBkgnd[Sensor] := BkRead;
  { remove noise for centering }
  Bk[Sensor] := (2.0 * BkRead) (ColMax * RowMax) + 2;
  Xsp[Sensor] := XSensorPos[Sensor];    { will be best starting point }
  Ysp[Sensor] := YSensorPos[Sensor];
  FindHoles := FindHoles2(Sensor);
end;

{==========================================================================}


{
  Read BEAM.PRM parameters file
}
procedure ReadBeamParamsFile;
var
  ParamFile: text;
  i,count,code,code1,code2,Sensor,Pinhole: Integer;
  cmd,ParamLine: String;

  procedure GetParamFileLine;
  begin
    if eof(ParamFile) then ParamLine :=
    else repeat
      readln(ParamFile,ParamLine);
    until eof(ParamFile) or ((ParamLine <> '') and (ParamLine[1] <> '!'));
```

```
  end;

begin
  {$I-}
  assign(ParamFile,ParamFileName);
  reset(ParamFile);
  if IOresult<>0 then begin
    assign(ParamFile,HomeDirectory+ParamFileName);
    reset(ParamFile);
    if IOresult<>0 then halt(3);
  end;
  {$I+}
  GetParamFileLine;
  if copy(ParamLine,1,1) = chr(34) then begin   { handle quoted options line }
    i := pos(chr(34),copy(ParamLine,2,255));
    if i>0 then ParamLine[0] := chr(i);
    ParamLine := NoQuotes(ParamLine);
    GetParamFileLine;
  end;
  Slow := WordVal(ParamLine,code);
  Fast := WordVal(copy(ParamLine,code+1,255),code);
  GetParamFileLine;
  SensorNum := WordVal(ParamLine,code);
  for Sensor:=1 to SensorNum do begin
    GetParamFileLine;
    SensorChannel[Sensor] := WordVal(ParamLine,code);
    GetParamFileLine;
    XSensorPos[Sensor] := WordVal(ParamLine,code);
    YSensorPos[Sensor] := WordVal(copy(ParamLine,code+1,255),code);
    for Pinhole:=1 to 4 do begin
      GetParamFileLine;
      SensorCalib[Sensor,Pinhole] := RealVal(ParamLine,code);
    end;
  end; {for Sens }
  GetParamFileLine;
  TempChannel := WordVal(ParamLine,code);   { assume only one thermometer at fi
  GetParamFileLine;
  TempCalPts := WordVal(ParamLine,code);
  for i:=1 to TempCalPts do begin
    { Resistance[i],Temperature[i] may not be integers }
    GetParamFileLine;
    Resistance [i] := RealVal(ParamLine,code);
    Temperature[i] := RealVal(copy(ParamLine,code+1,255),code) + 273.15;
  end;
  for i:=1 to 3 do begin   { read in Fast, Medium, & Slow Calib Delay values }
    GetParamFileLine;
    CalibDelays[i,1] := LongVal(ParamLine,code1);
    CalibDelays[i,2] := trunc(RealVal(copy(ParamLine,code1+1,255),code2)*10+0.5
    CalibDelays[i,3] := trunc(RealVal(copy(ParamLine,code2+code1+1,255),code)*1
  end;
  close(ParamFile);
  Resistance [0] := Resistance[1]  * 2 - Resistance [2];
  Temperature[0] := Temperature[1] * 2 - Temperature[2];
end;

{-----------------------------------------------------------------------------}

procedure SetLaser;
begin
```

```
  IOSetup;
  for i:=1 to 3 do begin
    Xsp[i] := XSensorPos[i];
    Ysp[i] := YSensorPos[i];
  end;
  Xpos := XRest;   { Move beam to rest position }
  Ypos := YRest;
  MoveBeam(Xpos,Ypos);
  delay(500);
end;

procedure MonitorLaserBeamPower;
begin
  println('Monitoring Laser Beam Power...');
  SetLaser;
  assign(PowerHistoryFile,PowerHistoryFileName);
  {$I-}
  append(PowerHistoryFile);
  if IOresult <> 0 then rewrite(PowerHistoryFile);
  {$I+}
  if IOresult = 0 then begin
    for Sensor := 1 to NumSensors do begin
      if not FindHoles(Sensor) then begin
        beep;
        beep;
        Power[Sensor] := 0;
      end else GoodRead(Sensor,1);
    end;
    writeln(PowerHistoryFile,TimeStamp,'   Sensor #1=',RealStr(Power[1],2),
      '   Sensor #2=',RealStr(Power[2],2));
    close(PowerHistoryFile);
  end else beep;
end;

procedure MonitorLaserBeamProfile;
var
  row,col: Integer;
begin
  println('Monitoring Laser Beam Profile...');
  SetLaser;
  assign(ProfileHistoryFile,ProfileHistoryFileName);
  {$I-}
  append(ProfileHistoryFile);
  if IOresult <> 0 then rewrite(ProfileHistoryFile);
  {$I+}
  if IOresult = 0 then begin
    for Sensor := 1 to NumSensors do begin
      if FindHoles(Sensor) then begin
        writeln(ProfileHistoryFile,TimeStamp,' Sensor #',IntStr(Sensor),':');
        for col:=1 to ColMax do begin
          write(ProfileHistoryFile,' ');
          for row:=1 to RowMax do begin
            write(ProfileHistoryFile,BeamProfileVariables[Sensor].BeamMap[row,co
          end; {for row}
          writeln(ProfileHistoryFile);
        end; {for col}
      end else begin
        beep;
        beep;
        writeln(ProfileHistoryFile,TimeStamp,' Sensor #',IntStr(Sensor),
```

```
            ' beam not found');
       end;
     end;
     close(ProfileHistoryFile);
  end else beep;
end;

procedure ShowTitle;
begin
  TextMode(C80);
  SingleBar := many(#196,45);
  writeln(SingleBar);
  writeln('  MONITOR, Laser Beam Monitor Program ');
  writeln('  Version '+VersionId);
  writeln('  Copyright (C) 1988 by 3D Systems, Inc.');
  writeln('  3D Systems Laser Stereolithography System');
  writeln(SingleBar);
end;

{ -   -   -   -   -   -   -   A M   -   -   -   - }

begin  { Monitor }
  FillChar(FirstVar,ofs(LastVar)-ofs(FirstVar),#0);   { init vars }
  ExitSave := ExitProc;
  ExitProc := @ExitMonitor;
  CheckBreak := true;
  OutFileName := '';
  ReadBeamParamsFile;
  ReadCommandLine(CmdLine);
  CmdLine := upper(CmdLine);
  i := pos('/T',CmdLine);
  if i > 0 then begin
    Transparent := true;
    delete(CmdLine,i,2);
  end;
  if not Transparent then begin
    ShowTitle;
    writeln;
    writeln;
  end;
  if pos('POWER',CmdLine) > 0 then MonitorLaserBeamPower;
  if pos('PROFILE',CmdLine) > 0 then MonitorLaserBeamProfile;
  QuietSystemError('Success.');
end.
```

```
PFP.H    - Page 1 -                        4/13/1988   [illegible]

/*****************************************************************************
 *                     3D Systems Slice Program                               *
 *             Copyright (C) 1988 3D Systems Inc.                             *
 *                                                                            *
 * PFP.H                                                                      *
 *                                                                            *
 *****************************************************************************/

typedef unsigned long       UINT32;
typedef long                INT32;
typedef unsigned short      UINT16;
typedef short               INT16;
typedef unsigned char       BOOLEAN;
typedef unsigned char       UINT8;
typedef char                STRING;

#define SYS_SUCCESS         0
#define SYS_FAILURE         1

#define [illegible]
#define [illegible]

#define LB_CODE             1
#define LH_CODE             2
#define NFUB_CODE           3
#define NFUH_CODE           4
#define NFUF_CODE           5
#define NFDB_CODE           6
#define NFDH_CODE           7
#define NFDF_CODE           8
#define FDB_CODE            9
#define FDH_CODE            10
#define FDF_CODE            11
#define FUB_CODE            12
#define FUH_CODE            13
#define FUF_CODE            14

#define TRUE                1
#define FALSE               0

#define MAX_POINTER_INDEX   16383

#define MAX_Z_VAL           65535
#define MAX_Z_INDEX         16383
#define MAX_X_VAL           65535
#define MAX_Y_VAL           65535

#define MAX_DBL             1E+38
#define MAX_UINT            65535
#define ZERO_DEF            1E-5
#define RADIANS_PER_DEGREE  0.0174532926666666666

#define MAX_HASH_INDEX      1501
```

FFPCHL.H - Page 1 - 4/15/1988 5:30 PM

```
/*************************************************************************
/*                      3D Systems Slice Program                        *
/*                 Copyright (C) 1988 3D Systems Inc.                   *
/*                                                                      *
 *                                                                      *
/*   PFPCHL.H                                                           *
/*                                                                      *
/*   PFP Cross-Hatch Line Header                                        *
/*                                                                      *
/*************************************************************************

struct hatch_point {
    UINT16              x_val;
    UINT16              y_val;
    UINT16              angle;
    UINT8               enter_flag;
    UINT16              triangle_number;
    struct hatch_point  *next_point;
   };
typedef struct hatch_point HATCH_POINT_STRUC;

struct min_max_type {
  UINT16        min_x;
  UINT16        max_x;
  UINT16        min_y;
  UINT16        max_y;
  };

typedef struct min_max_type MIN_MAX_STRUC;

#define NULL_HATCH_POINT (HATCH_POINT_STRUC *) NULL
```

```
REFCURE.H   - Page 1 -                          4/15/1988   5:30 PM

/******************************************************************************
 *                         3D Systems Slice Program                           *
 *                   Copyright (C) 1988 3D Systems Inc.                       *
 *                                                                            *
 *                                                                            *
 * REFCURE.H                                                                  *
 *                                                                            *
 ******************************************************************************/

struct cure_hash {
  UINT16             x;
  UINT16             y;
  CUT_SEG_STRUC      *seg_ptr;
  struct cure_hash *last_hash;
  struct cure_hash *next_hash;
  };

typedef struct cure_hash CURE_HASH_STRUC;

#define NULL_CURE_HASH     (CURE_HASH_STRUC *) NULL
```

```
/*******************************************************************************
 *                      3D Systems Slice Program                               *
 *                Copyright (C) 1988 3D Systems Inc.                           *
 *                                                                             *
 *                                                                             *
 * FFFHI.H                                                                     *
 *                                                                             *
 * FFF Human Interface header file                                             *
 *                                                                             *
 *******************************************************************************/


#define FILE_NAME_LENGTH 100

typedef struct
  {
    float    res_value;
    UINT16   y_flat_fill_spacing;
    UINT16   x_flat_fill_spacing;
    UINT16   y_hatch_spacing;
    UINT16   x_hatch_spacing;
    UINT16   angle_hatch_spacing;
    UINT16   z_spacing;
    UINT16   min_surface_angle;
    UINT16   min_intersect_angle;
    INT16    axis;
    STRING   z_space_filename[FILE_NAME_LENGTH];
    STRING   internal_filename[FILE_NAME_LENGTH];
    STRING   segfile_name     [FILE_NAME_LENGTH];
    BOOLEAN  binary_input;
    BOOLEAN  debug_mode;
    BOOLEAN  display_on;
    BOOLEAN  centering_off;
    BOOLEAN  section_codes_off;
    BOOLEAN  attrib;
    BOOLEAN  in_mem;
    INT16    tune;

  } USER_INFO_STRUC;


#define RES_OPTION                     "-RES"
#define SEGFILE_OPTION                 "-SF"
#define HATCH_FILE_OPTION              "-HF"
#define Y_HATCH_SPACE_OPTION           "-HY"
#define X_HATCH_SPACE_OPTION           "-HX"
#define ANGLE_HATCH_SPACE_OPTION       "-HA"
#define YF_HATCH_SPACE_OPTION          "-HFY"
#define XF_HATCH_SPACE_OPTION          "-HFX"
#define HELP_OPTION                    "-H"
#define DISPLAY_OPTION                 "-D"
#define Z_SPACE_OPTION                 "-ZS"
#define Z_SPACE_FILE_OPTION            "-ZSF"
#define CENTER_OPTION                  "-C"
#define SECTION_CODES_OFF_OPTION       "-NSC"
#define MIN_SURFACE_ANGLE_OPTION       "-MSA"
#define MIN_INTERSECT_ANGLE_OPTION     "-MIA"
#define X_AXIS_OPTION                  "-X"
#define Y_AXIS_OPTION                  "-Y"
#define BINARY_INPUT_OPTION            "-B"
```

```
PFPHI.H   - Page 2 -                          4/15/1988   5:[illegible] PM

#define DEBUG_OPTION                        "-DEBUG"
#define DISK_OPTION                         "-DISK"
#define ARIES_OPTION                        "-ARIES"
#define INTERNAL_OPTION                     "-INTERNAL"
#define CURE_OPTION                         "-CURE"


#define RES_OPTION_CODE                            1
#define SEGFILE_OPTION_CODE                        2
#define Y_HATCH_SPACE_OPTION_CODE                  3
#define X_HATCH_SPACE_OPTION_CODE                  4
#define ANGLE_HATCH_SPACE_OPTION_CODE              5
#define YF_HATCH_SPACE_OPTION_CODE                 6
#define XF_HATCH_SPACE_OPTION_CODE                 7
#define HELP_OPTION_CODE                           8
#define DEBUG_OPTION_CODE                          9
#define DISPLAY_OPTION_CODE                        10
#define Z_SPACE_OPTION_CODE                        11
#define Z_SPACE_FILE_OPTION_CODE                   12
#define CENTER_OPTION_CODE                         13
#define [illegible]_OPTION_CODE                    14
#define MIN_SURFACE_ANGLE_OPTION_CODE              15
#define MIN_INTERSECT_ANGLE_OPTION_CODE            16
#define X_AXIS_OPTION_CODE                         17
#define Y_AXIS_OPTION_CODE                         18
#define BINARY_INPUT_OPTION_CODE                   19
#define DISK_OPTION_CODE                           20
#define ARIES_OPTION_CODE                          21
#define INTERNAL_OPTION_CODE                       22
#define CURE_OPTION_CODE                           23
#define UNKNOWN_OPTION_CODE                        24

#define DEFAULT_RES_VALUE   1.0
#define DEFAULT_SEGFILE_NAME  ""

#define MAX_FLOAT_LENGTH [illegible]
#define MAX_INT_LENGTH [illegible]
#define MAX_ANGLE 90
```

```
PFFIDB.C    - Page 1 -                          4/15/1988   5:31 PM

/*******************************************************************************
/*                    3D Systems Slice Program                                  *
/*              Copyright (C) 1988 3D Systems Inc.                              *
/*                                                                              *
/* PFFIDB.C                                                                     *
/*                                                                              *
 * PFF Input Database Module                                                    *
/*                                                                              *
/*******************************************************************************


#include <stdio.h>
#include <math.h>
#include <malloc.h>

#include "pfp.h"
#include "pfphi.h"
#include "pfptri.h"
#include "[illegible]"
#include [illegible]


extern INPUT_TRI_STRUC *tri_bucket_array[];
extern OUT_SEG_STRUC *FD_seg_bucket_array[];
extern OUT_SEG_STRUC *FU_seg_bucket_array[];
extern OUT_SEG_STRUC *NFU_seg_bucket_array[];
extern OUT_SEG_STRUC *NFD_seg_bucket_array[];
extern UINT16        z_control_table[];
extern UINT16        all_min_z, all_max_z, all_min_z_index, all_max_z_index;

/*******************************************************************************
   [illegible]

   find_z_binarily - binary search of z_control_table for layer z

*******************************************************************************

UINT16 get_z_binarily(z)

   UINT16 z;
{
   UINT16 low = 0, mid, high = MAX_Z_INDEX-1;

   while (low <= high) {
      mid = (low + high) / 2;
      if (z < z_control_table [mid])
         high = mid - 1;
      else if (z > z_control_table [mid])
         low = mid + 1;
      else
         return(mid);
   }
   if (z_control_table [low] == z)
      return(low);
   else return(high);

}  /* get_z_binarily */
```

```
/*****************************************************************************
   local procedure

   get_offsets

*****************************************************************************/

static void get_offsets (min_x, min_y, min_z, max_x, max_y, max_z,
                          res_value, x_offset, y_offset, z_offset)

   float min_x, min_y, min_z, max_x, max_y, max_z, res_value;
   float *x_offset, *y_offset, *z_offset;
{

   BOOLEAN res_error1, res_error2;
   float   x_range, y_range, z_range;
   float   z_offset_flt;

   x_range = (max_x - min_x) * res_value;
   y_range = (max_y - min_y) * res_value;
   z_range = (max_z - min_z) * res_value;

   res_error1 = ((x_range > MAX_X_VAL) || (y_range > MAX_Y_VAL) ||
                 (z_range > MAX_Z_VAL));

   res_error2 = (z_range > z_control_table [MAX_Z_INDEX-1]);

   if (res_error1 || res_error2) {
      if (res_error1) {
         fprintf (stderr, "\n error - resolution value too large for this");
         fprintf (stderr, " part\n");
      }
      if (res_error2) {
         fprintf (stderr, "\n error - z-value would require more than");
         fprintf (stderr, " %u layers.\n",MAX_Z_INDEX);
      }
      fprintf (stderr,
      " min x = %f max x = %f min y = %f max y = %f min z = %f max z = %f\n",
        min_x, max_x, min_y, max_y, min_z, max_z);
      exit (SYS_FAILURE);
   }

   *x_offset = round_flt(((MAX_X_VAL - x_range) / 2.0) - (min_x * res_value));
   *y_offset = round_flt(((MAX_Y_VAL - y_range) / 2.0) - (min_y * res_value));
   *z_offset = round_flt(((z_control_table [MAX_Z_INDEX-1] - z_range) / 2.0) -

} /* get_offsets */


/*****************************************************************************
   local procedure
```

```
   check_tri_dimensions

*****************************************************************************

static void check_tri_dimensions (tri_ptr)

   INPUT_TRI_STRUC *tri_ptr;

{
   if ((tri_ptr-> x1 > MAX_X_VAL) || (tri_ptr-> x1 < 0.0) ||
       (tri_ptr-> x2 > MAX_X_VAL) || (tri_ptr-> x2 < 0.0) ||
       (tri_ptr-> x3 > MAX_X_VAL) || (tri_ptr-> x3 < 0.0) ||
       (tri_ptr-> y1 > MAX_Y_VAL) || (tri_ptr-> y1 < 0.0) ||
       (tri_ptr-> y2 > MAX_Y_VAL) || (tri_ptr-> y2 < 0.0) ||
       (tri_ptr-> y3 > MAX_Y_VAL) || (tri_ptr-> y3 < 0.0) ||
       (tri_ptr-> z1 > z_control_table [MAX_Z_INDEX-1]) || (tri_ptr-> z1 < 0.0) ||
       (tri_ptr-> z2 > z_control_table [MAX_Z_INDEX-1]) || (tri_ptr-> z2 < 0.0) ||
       (tri_ptr-> z3 > z_control_table [MAX_Z_INDEX-1]) || (tri_ptr-> z3 < 0.0))
      {
       fprintf (stderr, "\n Error - dimensions of uncentered object\n");
       fprintf (stderr, "exceed limits. Check Resolution value. \n");
       exit (LVE_FAILURE);
      }

} /* check_tri_dimensions */


 *****************************************************************************
   local procedure

   res_triangles

*****************************************************************************

static void res_triangles (tri_list, x_offset, y_offset, z_offset,
                           res_value, centering_off)

   INPUT_TRI_STRUC *tri_list;
   float            x_offset, y_offset, z_offset, res_value;
   BOOLEAN          centering_off;

{
   INPUT_TRI_STRUC *tri_ptr;
   float            round_flt();

   tri_ptr = tri_list;

   if (centering_off)
      while (tri_ptr != NULL_INPUT_TRI)
        {
         tri_ptr-> x1 = round_flt(tri_ptr-> x1 * res_value);
```

```
        tri_ptr->x2 = round_flt(tri_ptr->x2 * res_value);
        tri_ptr->x3 = round_flt(tri_ptr->x3 * res_value);

        tri_ptr->y1 = round_flt(tri_ptr->y1 * res_value);
        tri_ptr->y2 = round_flt(tri_ptr->y2 * res_value);
        tri_ptr->y3 = round_flt(tri_ptr->y3 * res_value);

        tri_ptr->z1 = round_flt(tri_ptr->z1 * res_value);
        tri_ptr->z2 = round_flt(tri_ptr->z2 * res_value);
        tri_ptr->z3 = round_flt(tri_ptr->z3 * res_value);

        check_tri_dimensions (tri_ptr);
        tri_ptr = tri_ptr->next_input_tri;
       }
  else
     while (tri_ptr != NULL_INPUT_TRI)
       {
        tri_ptr->x1 = round_flt((tri_ptr->x1 * res_value) - x_offset);
        tri_ptr->x2 = round_flt((tri_ptr->x2 * res_value) - x_offset);
        tri_ptr->x3 = round_flt((tri_ptr->x3 * res_value) - x_offset);

        tri_ptr->y1 = round_flt((tri_ptr->y1 * res_value) + y_offset);
        tri_ptr->y2 = round_flt((tri_ptr->y2 * res_value) + y_offset);
        tri_ptr->y3 = round_flt((tri_ptr->y3 * res_value) - y_offset);

        tri_ptr->z1 = round_flt((tri_ptr->z1 * res_value) + z_offset);
        tri_ptr->z2 = round_flt((tri_ptr->z2 * res_value) + z_offset);
        tri_ptr->z3 = round_flt((tri_ptr->z3 * res_value) + z_offset);
        tri_ptr = tri_ptr->next_input_tri;
       }

  } /* res_triangles */


/**************************************************************************
   local procedure

   remove_collapsed_triangles


**************************************************************************/

static void remove_collapsed_triangles (tri_list)

   INPUT_TRI_STRUC **tri_list;

{
   INPUT_TRI_STRUC *tri_ptr, *back_ptr;
   INPUT_TRI_STRUC head_rec;
   float           Ax,Ay,Az;
   float           Bx,By,Bz;
   float           Cx,Cy,Cz;
   unsigned long   point_count = 0,line_count = 0;
   BOOLEAN         delete_tri;


   tri_ptr = *tri_list;
```

```
  head_rec .next_input_tri = tri_ptr;
  back_ptr = &head_rec;

  while (tri_ptr != NULL_INPUT_TRI) {
    delete_tri = FALSE;
    if ((tri_ptr->x1 == tri_ptr->x2) && (tri_ptr->x2 == tri_ptr->x3) &&
        (tri_ptr->y1 == tri_ptr->y2) && (tri_ptr->y2 == tri_ptr->y3) &&
        (tri_ptr->z1 == tri_ptr->z2) && (tri_ptr->z2 == tri_ptr->z3)) {
      delete_tri = TRUE;
      point_count++;
      }
    else {
      Ax = tri_ptr-> x2 - tri_ptr-> x1;
      Ay = tri_ptr-> y2 - tri_ptr-> y1;
      Az = tri_ptr-> z2 - tri_ptr-> z1;
      Bx = tri_ptr-> x3 - tri_ptr-> x1;
      By = tri_ptr-> y3 - tri_ptr-> y1;
      Bz = tri_ptr-> z3 - tri_ptr-> z1;
      Cx = fabs(Ay*Bz-Az*By);
      Cy = fabs(Az*Bx-Ax*Bz);
      Cz = fabs(Ax*By-Ay*Bx);
      if ((Cx < ZERO_DEF) && (Cy < ZERO_DEF) && (Cz < ZERO_DEF)) {
        delete_tri = TRUE;
        line_count++;
        };
      };
    if (delete_tri) {
      back_ptr->next_input_tri = tri_ptr->next_input_tri;
      mem_free (tri_ptr,sizeof(INPUT_TRI_STRUC));
      tri_ptr = back_ptr->next_input_tri;
      }
    else {
      tri_ptr = tri_ptr->next_input_tri;
      back_ptr = back_ptr->next_input_tri;
      };
    };

  *tri_list = head_rec .next_input_tri;

  if (point_count > 0)
      fprintf (stderr, "\n warning - %lu collapsed point triangles removed \n",
               point_count);
  if (line_count > 0)
      fprintf (stderr, "\n warning - %lu collapsed line triangles removed \n",
               line_count);

} /* remove_collapsed_triangles */




*********************************************************************************
  local procedure

  get_z_output_coord
```

```
PFRIDE.C    - Page 5 -                     4/15 1988   5:31 PM

*************************************************************************************

static UINT16 get_z_output_coord (z)

   UINT16 z;

   UINT16 i, greater_z, lesser_z;

   i = get_z_binarily(z);
   greater_z = z_control_table [i];
   if (z == z_control_table [i])
      lesser_z = z_control_table [i];
   else
      lesser_z = z_control_table [i-1];
/* printf("get_z_output_coord:  z=%u i=%u lesser_z=%u greater_z=%u\n",z,i,lesse

   if ((lesser_z == 0) || (((greater_z - z) <= (z - lesser_z)) &&
                            greater_z != z_control_table [MAX_Z_INDEX-1]
      return (greater_z);
   else
      return (lesser_z);

} /* get_z_output_coord */



/************************************************************************************
   local procedure

   adjust_z_coords


*************************************************************************************

static void adjust_z_coords (tri_list, z_spacing)

   INPUT_TRI_STRUC *tri_list;
   UINT16          z_spacing;

{
   INPUT_TRI_STRUC *tri_ptr;
   float           round_flt();
   UINT16          get_z_coord();


   if (z_spacing != 1)
      {
       tri_ptr = tri_list;
       while (tri_ptr != NULL_INPUT_TRI)
          {
           tri_ptr-> z1 = round_flt((float) tri_ptr-> z1 / z_spacing) * z_spacir
           tri_ptr-> z2 = round_flt((float) tri_ptr-> z2 / z_spacing) * z_spacir
           tri_ptr-> z3 = round_flt((float) tri_ptr-> z3 / z_spacing) * z_spacir
           tri_ptr = tri_ptr-> next_input_tri;
          }
      }
   else
```

```
    {
     tri_ptr = tri_list;
     while (tri_ptr != NULL_INPUT_TRI)
       {
         tri_ptr-> z1 = get_z_output_coord ((UINT16) tri_ptr-> z1);
         tri_ptr-> z2 = get_z_output_coord ((UINT16) tri_ptr-> z2);
         tri_ptr-> z3 = get_z_output_coord ((UINT16) tri_ptr-> z3);
         tri_ptr = tri_ptr-> next_input_tri;
       }
    }

} /* adjust_z_coords */




/******************************************************************************
   local procedure

   output_internal_triangles


******************************************************************************/

static void output_internal_triangles (user_info,tri_list)

USER_INFO_STRUC *user_info;
INPUT_TRI_STRUC **tri_list;
{
FILE *InternalFile;
INPUT_TRI_STRUC *tri_ptr;
UINT16 count,tri_count;
float zero,i,j,k;

   zero = 0;
   tri_ptr = *tri_list;
   tri_count = 0;
   while (tri_ptr != NULL_INPUT_TRI) {
      tri_count++;
      tri_ptr = tri_ptr-> next_input_tri;
   }
   if (tri_count>0) {
      fprintf(stderr, " writing internal triangles output file ...\n");
      InternalFile = fopen(user_info-> internal_filename,"wb");

      fprintf(InternalFile,"Slice Internal Triangle File");
      count = 29;
      while (count<80) {             /* should write out copy of org header */
         fprintf(InternalFile," ");
         count++;
      }
      fwrite(&tri_count,4,1,InternalFile);  /* write out # of triangle facets */
      tri_ptr = *tri_list;
      while (tri_ptr != NULL_INPUT_TRI) {
         count = 3;
         if (tri_ptr->normal_info&NORMAL_X_POSITIVE) i = 1;
         else if (tri_ptr->normal_info&NORMAL_X_NEGATIVE) i = -1;
```

```
FFPIDE.C    - Page 8 -                          4/15/1989   5:31 PM
            else {
              i = 0;
              count--;
              };
        if (tri_ptr->normal_info&NORMAL_Y_POSITIVE) j = 1;
        else if (tri_ptr->normal_info&NORMAL_Y_NEGATIVE) j = -1;
            else {
              j = 0;
              count--;
              };
        if (tri_ptr->normal_info&NORMAL_Z_POSITIVE) k = 1;
        else if (tri_ptr->normal_info&NORMAL_Z_NEGATIVE) k = -1;
            else {
              k = 0;
              count--;
              };
        switch (count) {
          case 2 : i *= 0.707106781;
                   j *= 0.707106781;
                   k *= 0.707106781;
                   break;
          case 3 : i *= 0.577350269;
                   j *= 0.577350269;
                   k *= 0.577350269;
                   break;
          }
        fwrite(&i,4,1,InternalFile);
        fwrite(&j,4,1,InternalFile);
        fwrite(&k,4,1,InternalFile);

        fwrite(tri_ptr,36,1,InternalFile);      /* write out triangle vertices */
        fwrite(&zero,2,1,InternalFile);               /* attribute data (none) */
        tri_ptr = tri_ptr->next_input_tri;
      }
    fclose(InternalFile);
  }




/**************************************************************************
   local function

   flat_tri



***************************************************************************/

static flat_tri (tri_ptr)

   INPUT_TRI_STRUC *tri_ptr;

{
   return
     ((tri_ptr-> z1 == tri_ptr-> z2) && (tri_ptr-> z2 == tri_ptr-> z3));
```

```
} /* flat_tri */


/****************************************************************************
   local function

   near_flat_tri


****************************************************************************/

static near_flat_tri (tri_ptr, min_angle)

   INPUT_TRI_STRUCT *tri_ptr;
   int              min_angle;

   double dx1, dy1, dz1, dx2, dy2, dz2, dx, dy, dz, d, angle;

   if (!min_angle)
      return (FALSE);
   else
      {
       dx1 = tri_ptr->x1 - tri_ptr->x2;
       dy1 = tri_ptr->y1 - tri_ptr->y2;
       dz1 = tri_ptr->z1 - tri_ptr->z2;

       dx2 = tri_ptr->x1 - tri_ptr->x3;
       dy2 = tri_ptr->y1 - tri_ptr->y3;
       dz2 = tri_ptr->z1 - tri_ptr->z3;

       dx = dy1 * dz2 - dz1 * dy2;
       dy = dz1 * dx2 - dx1 * dz2;
       dz = dx1 * dy2 - dy1 * dx2;

       d = sqrt (dx * dx + dy * dy);

       if (d == 0) angle = 0;
       else angle = 90.0 - fabs (atan (dz / d) / RADIANS_PER_DEGREE);

       return (angle < (double) min_angle);
      }

 } /* near_flat_tri */
/****************************************************************************

   cross_product

   Computes the cross product of 2 vectors

****************************************************************************/

void cross_product(a1,a2,a3,b1,b2,b3,i,j,k)
  double a1,a2,a3;  /* Point A */
```

```
PPRIDE.C   - Page 10 -                    [illegible]

  double b1,b2,b3;  /* Point B */
  double *i,*j,*k;  /* A X B */
  {
   *
    Normal i,j,k = AxB = (a2*b3 - a3*b2)i + (a3*b1 - a1*b3)j + (a1*b2 - a2*b1)
  */

  *i = a2*b3 - a3*b2;
  *j = a3*b1 - a1*b3;
  *k = a1*b2 - a2*b1;
  };

 *****************************************************************************
   recompute_normals

   Recomputes the normals of the triangles after they have been deformed by
    adjusting the Z coords.

   [illegible]

*****************************************************************************

static void recompute_normals(tri_list,axis)
  INPUT_TRI_STRUCT *tri_list;
  UINT8             axis;
  {
  UINT8  flag;
  double  a1,a2,a3;
  double  b1,b2,b3;
  double  i,j,k;
  double  norm;

  /*
    Vector A = vertex 3 to vertex 2 of input
    Vector B = vertex 1 to vertex 2 of input

    Note: vectors change if axis is not inputs (x-y). Must adjust for
          these cases.
  */

  while (tri_list != NULL_INPUT_TRI) {
    switch (axis) {
      case 0 : a1 = tri_list->x3 - tri_list->x2; /* No axis swap */
               a2 = tri_list->y3 - tri_list->y2;
               a3 = tri_list->z3 - tri_list->z2;
               b1 = tri_list->x1 - tri_list->x2;
               b2 = tri_list->y1 - tri_list->y2;
               b3 = tri_list->z1 - tri_list->z2;
               break;
      case 1 : a3 = tri_list->x3 - tri_list->x2; /* X and Z axis swapped */
               a2 = tri_list->y3 - tri_list->y2;
               a1 = tri_list->z3 - tri_list->z2;
               b3 = tri_list->x1 - tri_list->x2;
               b2 = tri_list->y1 - tri_list->y2;
               b1 = tri_list->z1 - tri_list->z2;
               break;
      case 2 : a1 = tri_list->x3 - tri_list->x2; /* Y and Z axis swapped */
               a3 = tri_list->y3 - tri_list->y2;
               a2 = tri_list->z3 - tri_list->z2;
```

```
                b1 = tri_list->x1 - tri_list->x2;
                b3 = tri_list->y1 - tri_list->y2;
                b2 = tri_list->z1 - tri_list->z2;
                break;
      };

    cross_product(a1,a2,a3,b1,b2,b3,&i,&j,&k);

    switch (axis) {                                   /* reswap flag info */
      case 1: temp = k;
              k = i;
              i = temp;
              break;
      case 2: temp = k;
              k = j;
              j = temp;
              break;
      };

    flag = tri_list->normal_info & (NORMAL_Z_POSITIVE+NORMAL_Z_NEGATIVE);

    if (fabs(i) > ZERO_DEF) {
      if (i < 0) flag |= NORMAL_X_NEGATIVE;
      else flag |= NORMAL_X_POSITIVE;
      };

    if (fabs(j) > ZERO_DEF) {
      if (j < 0) flag |= NORMAL_Y_NEGATIVE;
      else flag |= NORMAL_Y_POSITIVE;
      };

/*
    if (fabs(k) > ZERO_DEF) {
      if (k < 0) flag |= NORMAL_Z_NEGATIVE;
      else flag |= NORMAL_Z_POSITIVE;
      };
*/

    tri_list->normal_info = flag;
    tri_list = tri_list->next_input_tri;
    };
  };

/************************************************************************************
   local procedure

************************************************************************************/

static void get_tri_lists (in_file, user_info, res_value, min_angle,
                           centering_off, z_spacing,
                           scan_tri_list, flat_tri_list, near_flat_tri_list)

   FILE             *in_file;
   USER_INFO_STRUC  *user_info;
   float            res_value;
   INT16            min_angle;
   BOOLEAN          centering_off;
   UINT16           z_spacing;
       :
```

```
   INPUT_TRI_STRUC **scan_tri_list;
   INPUT_TRI_STRUC **flat_tri_list;
   INPUT_TRI_STRUC **near_flat_tri_list;


   INPUT_TRI_STRUC *input_tri_list, *tri_ptr, *temp_ptr;
   unsigned long   up_scan_tri_count = 0, dn_scan_tri_count = 0;
   unsigned long   up_flat_tri_count = 0, dn_flat_tri_count = 0;
   unsigned long   up_near_flat_tri_count = 0, dn_near_flat_tri_count = 0;
   float           min_x, min_y, min_z, max_x, max_y, max_z;
   float           x_offset, y_offset, z_offset;
   long            resoluted_min_z,resoluted_max_z;


   min_x = MAX_X_VAL;
   min_y = MAX_Y_VAL;
   min_z = z_control_table [MAX_Z_INDEX-1];

   max_x = 0.0 - MAX_X_VAL;
   max_y = 0.0 - MAX_Y_VAL;
   max_z = 0.0 - z_control_table [MAX_Z_INDEX-1];

/*
printf ("\n get_tri_lists - begin \n");
*/
   fprintf (stderr, "\n loading input database ...\n");

   if (user_info-> binary_input)
      pfp_get_input_tri_list_bin (in_file, &input_tri_list, &min_x, &min_y,
                                  &min_z, &max_x, &max_y, &max_z, user_info);
   else
      pfp_get_input_tri_list (in_file, &input_tri_list, &min_x, &min_y,
                              &min_z, &max_x, &max_y, &max_z,user_info);

   resoluted_min_z = round_flt(min_z * res_value);
   resoluted_max_z = round_flt(max_z * res_value);
   if (resoluted_min_z < z_control_table[0]) {
     if (*(user_info-> z_space_filename) != '\0')
       fprintf(stderr,"\nError - Part begins below Variable Z Spacing Table\n");
     else
       fprintf(stderr,"\nError - Part begins below minimum Z value\n");
     fprintf(stderr," Z Spacing Table: %u Part: %ld\n",z_control_table[0],reso
     exit (SYS_FAILURE);
     };
   if (resoluted_max_z > z_control_table[MAX_Z_INDEX-1]) {
     if (*(user_info-> z_space_filename) != '\0')
       fprintf(stderr,"\nError - Part extends past the Variable Z Spacing Table
     else
       fprintf(stderr,"\nError - Part extends past the maximum Z value of %u le
     fprintf(stderr," Z Spacing Table: %u Part: %u\n",z_control_table[MAX_Z_IN
     exit (SYS_FAILURE);
     };

   get_offsets (min_x, min_y, min_z, max_x, max_y, max_z, res_value,
                &x_offset, &y_offset, &z_offset);

   res_triangles (input_tri_list, x_offset, y_offset, z_offset,
                  res_value, centering_off);

   adjust_z_coords (input_tri_list, z_spacing);
```

```
PFFIDE.C   - Page 17 -                         4/15/1988   5:31 PM

   remove_collapsed_triangles (&input_tri_list);

   recompute_normals(input_tri_list,user_info->axis);

   if (*(user_info-> internal_filename) > '\0')
      output_internal_triangles (user_info,&input_tri_list);

   while (input_tri_list != NULL_INPUT_TRI)
      {
       tri_ptr = input_tri_list;
       input_tri_list = input_tri_list-> next_input_tri;

       if (flat_tri (tri_ptr))
          {
           tri_ptr->normal_info = (tri_ptr->normal_info
                                  &(255-NORMAL_Y_NEGATIVE-NORMAL_X_POSITIVE
                                       -NORMAL_Y_NEGATIVE-NORMAL_Y_POSITIVE));

           tri_ptr-> next_input_tri = *flat_tri_list;
           *flat_tri_list = tri_ptr;
           if (tri_ptr-> normal_info & NORMAL_Z_POSITIVE)
              up_flat_tri_count++;
           else
              dn_flat_tri_count++;
          }
       else if (near_flat_tri (tri_ptr, min_angle))
          {
           temp_ptr = (INPUT_TRI_STRUC *) mem_alloc (sizeof (INPUT_TRI_STRUC));
           copy (tri_ptr, temp_ptr, sizeof (INPUT_TRI_STRUC));
           temp_ptr-> next_input_tri = *scan_tri_list;
           *scan_tri_list = temp_ptr;
           tri_ptr-> next_input_tri = *near_flat_tri_list;
           *near_flat_tri_list = tri_ptr;
           if (tri_ptr-> normal_info & NORMAL_Z_POSITIVE)
              up_near_flat_tri_count++;
           else
              dn_near_flat_tri_count++;
          }
        else
          {
           tri_ptr-> next_input_tri = *scan_tri_list;
           *scan_tri_list = tri_ptr;
           if (tri_ptr-> normal_info & NORMAL_Z_POSITIVE)
              up_scan_tri_count++;
           else
              dn_scan_tri_count++;
          }
      }

   fprintf (stderr, "\n    %5lu steep triangles loaded     (%5lu up facing, %5l
                       up_scan_tri_count + dn_scan_tri_count,
                       up_scan_tri_count, dn_scan_tri_count);
   fprintf (stderr, "     %5lu near flat triangles loaded (%5lu up facing, %5lu c
                       up_near_flat_tri_count + dn_near_flat_tri_count,
                       up_near_flat_tri_count, dn_near_flat_tri_count);
   fprintf (stderr, "     %5lu flat triangles loaded      (%5lu up facing, %5lu c
                       up_flat_tri_count + dn_flat_tri_count,
                       up_flat_tri_count, dn_flat_tri_count);
```

```
PFFIDE.C   - Page 14 -                              4/15/1988   3:31 PM

printf ("\n get_tri_lists - end \n");
*/

} /* get_tri_lists */


/*************************************************************************************
   local procedure

   insert_tri


**************************************************************************************


static void insert_tri (input_tri, z_bucket_array)

    INPUT_TRI_STRUC *input_tri;
    INPUT_TRI_STRUC **z_bucket_array;
{

    float          min_z;
    UINT16         min_z_value;
    UINT16         i;

    pfc_get_min_z (input_tri, &min_z);
    min_z_value = (UINT16) min_z;
    i = get_z_binarily(min_z_value);

    input_tri->next_input_tri = z_bucket_array [i];
    z_bucket_array [i] = input_tri;

} /* insert_tri */



void tri_bucket_sort (tri_list, a_tri_bucket_array)

    INPUT_TRI_STRUC **tri_list;
    INPUT_TRI_STRUC **a_tri_bucket_array;

{
    INPUT_TRI_STRUC *tri_ptr, **bucket_ptr;
    INT16            i;

/*
printf ("\n tri_bucket_sort - begin \n");
*/
    bucket_ptr = a_tri_bucket_array;

    for (i = 0; i < MAX_Z_INDEX; i++, bucket_ptr++)
        *bucket_ptr = NULL_INPUT_TRI;

    while (*tri_list != NULL_INPUT_TRI)
        {
         tri_ptr = (*tri_list)-> next_input_tri;
...
```

```
        insert_tri (*tri_list, &_tri_bucket_array);
        *tri_list = tri_ptr;
        }

    *tri_list = NULL_INPUT_TRI;

/*
printf ("\n tri_bucket_sort - end \n");
*/
} /* tri_bucket_sort */



void pfp_get_input_database (in_file, user_info)

    FILE            *in_file;
    USER_INFO_STRUC *user_info;

    INPUT_TRI_STRUC *scan_tri_list;
    INPUT_TRI_STRUC *flat_tri_list;
    INPUT_TRI_STRUC *near_flat_tri_list;
    UINT16          z;

    scan_tri_list       = NULL_INPUT_TRI;
    flat_tri_list       = NULL_INPUT_TRI;
    near_flat_tri_list = NULL_INPUT_TRI;

    get_tri_data (in_file, user_info,
                  user_info->res_value, user_info->min_surface_angle,
                  user_info->centering_off, user_info->z_spacing,
                  &scan_tri_list, &flat_tri_list, &near_flat_tri_list);

  for (z = 0; z < MAX_Z_INDEX; z++)
      {
      FU_seg_bucket_array[z] = NULL_SEG;
      FD_seg_bucket_array[z] = NULL_SEG;
      NFU_seg_bucket_array[z] = NULL_SEG;
      NFD_seg_bucket_array[z] = NULL_SEG;
      }

    if (scan_tri_list != NULL_INPUT_TRI)
       tri_bucket_sort (&scan_tri_list, tri_bucket_array);

    if (flat_tri_list != NULL_INPUT_TRI)
       process_flat_tri_list (flat_tri_list);

    if (near_flat_tri_list != NULL_INPUT_TRI)
       process_near_flat_tri_list (near_flat_tri_list);

} /* pfp_get_input_database */
```

```
PFPRIE.C    - Page 1 -                        4/15/1988   5:35 PM

/*************************************************************************
 *                    3D Systems Slice Program                          *
 *              Copyright (C) 1988 3D Systems Inc.                      *
/*                                                                      *
 * PFPRIE.C                                                             *
/*                                                                      *
 * PFP Remove Internal Edges Module                                     *
/*                                                                      *
 *************************************************************************


#include <stdio.h>
#include <math.h>
#include "pfp.h"
#include "pfpseg.h"
#include "pfputl.h"

static OUT_SEG_STRUC *hash_table       [MAX_HASH_INDEX];
static OUT_SEG_STRUC *e [illegible]hash_table [illegible]
[illegible]

  ************************************************************************
    local procedure

    order_seg_points


 ************************************************************************


static void order_seg_points (seg_ptr)
  OUT_SEG_STRUC *seg_ptr;

  [illegible]          temp;


  if ((seg_ptr->x_1    seg_ptr->x_2)  || ((seg_ptr->x_1 == seg_ptr->x_2) &&
                                           seg_ptr->y_1 >  seg_ptr->y_2))) {

    temp = seg_ptr->x_1;
    seg_ptr->x_1 = seg_ptr->x_2;
    seg_ptr->x_2 = temp;
    temp = seg_ptr->y_1;
    seg_ptr->y_1 = seg_ptr->y_2;
    seg_ptr->y_2 = temp;
    };

} /* order_seg_points */



  ************************************************************************
    local procedure

    insert_segment
```

```
*****************************************************************************************

static void insert_segment (seg_ptr)
  OUT_SEG_STRUC  *seg_ptr;
  {
  OUT_SEG_STRUC  *scan_ptr,*back_ptr;
  double          hash_key;
  UINT16          hash_index;

  hash_key = (double) MAX_Y_VAL * seg_ptr->x_1 + seg_ptr->y_1;

  hash_index = (UINT16) fmod(hash_key,(double) MAX_HASH_INDEX);

  scan_ptr = hash_table [hash_index];

  while ((scan_ptr != NULL_SEG) &&
         [illegible]
         [illegible]
         [illegible]
         [illegible]
    back_ptr = scan_ptr;
    scan_ptr = scan_ptr->next_seg;
    };

  if (scan_ptr == NULL_SEG) {
    if (hash_table[hash_index] == NULL) hash_table[hash_index] = seg_ptr;
    else end_hash_table[hash_index]->next_seg = seg_ptr;
    seg_ptr->next_seg = NULL_SEG;
    end_hash_table[hash_index] = seg_ptr;
    }
  else {
    if (hash_table[hash_index] == scan_ptr) hash_table[hash_index] = scan_ptr->[illegible]
    else {
      back_ptr->next_seg = scan_ptr->next_seg;
      if (end_hash_table[hash_index] == scan_ptr) end_hash_table[hash_index] =
      [illegible]
    mem_free (scan_ptr,sizeof(OUT_SEG_STRUC));
    mem_free (seg_ptr,sizeof(OUT_SEG_STRUC));
    };

  }; /* insert_segment */


*****************************************************************************************
    exported procedure

    pfp_remove_duplicate_edges


*****************************************************************************************

void pfp_remove_duplicate_edges (seg_list)
  OUT_SEG_STRUC **seg_list;
  {
  OUT_SEG_STRUC *seg_ptr;
```

```
PFPRIF.C   - Page 1 -                          4/15/1988   [illegible] PM

/************************************************************************
/*                   3D Systems Slice Program                          *
 *              Copyright (C) 1988 3D Systems Inc.                     *
/*                                                                     *
 * PFPRIF.C                                                            *
/*                                                                     *
 * PFP Read Input File Module                                          *
 *                                                                     *
 ***********************************************************************

#include <stdio.h>
#include "pfp.h"
#include "pfphi.h"
#include "pfptri.h"
#include "pfpseq.h"
#include "pfputl.h"

[illegible]
[illegible]

static [illegible]

 ***********************************************************************
   local function

   is_legal_char

   Returns a boolean value if the char parameter is within the legal
   character set.
 ***********************************************************************

static BOOLEAN is_legal_char (ch)

   [illegible]

   return ((ch >= ' ') && (ch <= '~'));
          /* the next line of code stops the '+' and '-' illegal char messages
             but causes other problems:
               run #1:  got memory parity error, system halted
               run #2:  got 'invalid input file format' after several minutes
                           and program stopped, no other information
               then commented out line and recompiled to make it like
                 it was before  */

} /* is_legal_char */


 /************************************************************************
   local procedure
```

```
RFPRIE.C    - Page [illegible] -                          [illegible]    [illegible] PM

  UINT16          i;

  if (!hash_table_initialized) {
    for (i = 0; i < MAX_HASH_INDEX; i++) hash_table [i] = NULL_SEG;
    hash_table_initialized = TRUE;
    };

  while (*seg_list != NULL_SEG) {
    seg_ptr = *seg_list;
    *seg_list = seg_ptr->next_seg;
    if ((seg_ptr->x_1 == seg_ptr->x_2) &&
        (seg_ptr->y_1 == seg_ptr->y_2)) {
      mem_free(seg_ptr,sizeof(OUT_SEG_STRUC));
      }
    else {
      order_seg_points (seg_ptr);
      insert_segment (seg_ptr);
      };
    };

  for (i = 0; i < MAX_HASH_INDEX; i++)
    if (hash_table [i] != NULL_SEG) {
      (hash_table[i])->next_seg = *seg_list;
      *seg_list = hash_table[i];
      hash_table [i] = NULL_SEG;
      };

} /* rfi_remove_duplicate_edges */
```

```
[illegible]IF.C    - Page [illegible] -                    4/15/19[illegible]   [illegible]

   get_line

   Reads characters from the input file into a line buffer up to the next
   newline char.  Checks for error. Indicates if the file is eof.

*******************************************************************************

static void get_line (input_file, line_buf, error, eof)

   FILE    *input_file;
   STRING  *line_buf;
   BOOLEAN *error;
   BOOLEAN *eof;


   short   status;
   BOOLEAN eoln;
   BOOLEAN char_error = FALSE;
   BOOLEAN leading_blanks_skipped = FALSE;

   {
      do
         status = fscanf (input_file, "%c", line_buf);
         while (!leading_blanks_skipped && *line_buf == ' ' &&
                status == 1);
     leading_blanks_skipped = TRUE;
     *eof = (status != 1) || (*line_buf == 26);
     eoln = (*line_buf == '\n') || (*line_buf == '\r') || (*eof);
     if (!eoln && !*eof && !is_legal_char (*line_buf))
        {
        char_error = TRUE;
        fprintf (stderr, " Error - illegal char found in triangle %d: %02X (H
        }
     line_buf++;
   } while (!*eof && !eoln);
   *--line_buf = '\0';
   *error = *error || char_error;
} /* get_line */


 ******************************************************************************
   local procedure

   swap_vert


*******************************************************************************

void swap_vert(x,y,z,user_info)
  float *x;
  float *y;
  float *z;
  USER_INFO_STRUC *user_info;
  {
  float temp;
```

```
FFFSIF.C   - Page 3 -                   4/15/1988   5:35 PM

  if (user_info->axis == 1) {
    temp = *z;
    *z = *y;
    *y = temp;
    }
  else if (user_info->axis == 2) {
    temp = *z;
    *z = *y;
    *y = temp;
    }
  };

 ***********************************************************************
   local procedure

   get_input_tri_asc


***********************************************************************

static void get_input_tri_asc (in_file, tri_ptr, user_info, error)

   FILE              *in_file;
   INPUT_TRI_STRUCT  *tri_ptr;
   USER_INFO_STRUC   *user_info;
   BOOLEAN           *error;

{
   UINT16 items_read;

   tri_ptr->next_input_tri = NULL_INPUT_TRI;

   fscanf (in_file, "%*s %f %f %f", &tri_ptr->x1, &tri_ptr->y1, &tri_ptr->z1);
   swap_vert(&tri_ptr->x1,&tri_ptr->y1,&tri_ptr->z1,user_info);

   fscanf (in_file, "%*s %f %f %f", &tri_ptr->x2, &tri_ptr->y2, &tri_ptr->z2);
   swap_vert(&tri_ptr->x2,&tri_ptr->y2,&tri_ptr->z2,user_info);

   items_read = fscanf (in_file, "%*s %f %f %f", &tri_ptr->x3, &tri_ptr->y3, &t
   swap_vert(&tri_ptr->x3,&tri_ptr->y3,&tri_ptr->z3,user_info);

   *error = (items_read != 3);

   if (*error)
     if (feof(in_file))
        fprintf (stderr, "\n Error - Premature end of input file at triangle %
     else fprintf (stderr, "\n Error -  I/O error in reading input file at tri

} /* get_input_tri_asc */




/***********************************************************************
   local procedure
```

```
sprite.c    - Page 4 -                    4/15/1988   1:25 PM

   update_min_max_values

***************************************************************************

void update_min_max_values (tri_ptr, min_x, min_y, min_z,
                                                max_x, max_y, max_z)

   INPUT_TRI_STRUC *tri_ptr;
   float           *min_x, *min_y, *min_z, *max_x, *max_y, *max_z;

{
   if (tri_ptr->x1 < *min_x)
      *min_x = tri_ptr->x1;
   if (tri_ptr->x2 < *min_x)
      *min_x = tri_ptr->x2;
   if (tri_ptr->x3 < *min_x)
      *min_x = tri_ptr->x3;

   if (tri_ptr->y1 < *min_y)
      *min_y = tri_ptr->y1;
   if (tri_ptr->y2 < *min_y)
      *min_y = tri_ptr->y2;
   if (tri_ptr->y3 < *min_y)
      *min_y = tri_ptr->y3;

   if (tri_ptr->z1 < *min_z)
      *min_z = tri_ptr->z1;
   if (tri_ptr->z2 < *min_z)
      *min_z = tri_ptr->z2;
   if (tri_ptr->z3 < *min_z)
      *min_z = tri_ptr->z3;

   if (tri_ptr->x1 > *max_x)
      *max_x = tri_ptr->x1;
   if (tri_ptr->x2 > *max_x)
      *max_x = tri_ptr->x2;
   if (tri_ptr->x3 > *max_x)
      *max_x = tri_ptr->x3;

   if (tri_ptr->y1 > *max_y)
      *max_y = tri_ptr->y1;
   if (tri_ptr->y2 > *max_y)
      *max_y = tri_ptr->y2;
   if (tri_ptr->y3 > *max_y)
      *max_y = tri_ptr->y3;

   if (tri_ptr->z1 > *max_z)
      *max_z = tri_ptr->z1;
   if (tri_ptr->z2 > *max_z)
      *max_z = tri_ptr->z2;
   if (tri_ptr->z3 > *max_z)
      *max_z = tri_ptr->z3;

} /* update_min_max_values */

static void check_normal(i,j,k)
  float i,j,k;
```

```
PPPSIF.C   - Page 5 -                    4/15/1988   5:35 PM

  {
  float len;

  len = i*i+j*j+k*k;

  if ((len != 0) && ((len < .9) || (len > 1.1))) {
    fprintf(stderr,"\n Error reading normal for triangle %u.\n",tri_count);
    fprintf(stderr,"  Normal %g %g %g not a unit normal.\n",i,j,k);
    exit(SYS_FAILURE);
    };
  };


static void set_normal_info(i,j,k,normal_info)
  float i,j,k;
  UINT8 *normal_info;
  {
  if ((i > -NORMAL_MIN) && (i < NORMAL_MIN)) i = 0.0;
  if ((j > -NORMAL_MIN) && (j < NORMAL_MIN)) j = 0.0;
  if ((k > -NORMAL_MIN) && (k < NORMAL_MIN)) k = 0.0;

  *normal_info = 0;

  if (i > 0.0)         *normal_info |= NORMAL_X_POSITIVE;
  else if (i < 0.0)    *normal_info |= NORMAL_X_NEGATIVE;

  if (j > 0.0)         *normal_info |= NORMAL_Y_POSITIVE;
  else if (j < 0.0)    *normal_info |= NORMAL_Y_NEGATIVE;

  if (k > 0.0)         *normal_info |= NORMAL_Z_POSITIVE;
  else if (k < 0.0)    *normal_info |= NORMAL_Z_NEGATIVE;

  };


static void get_normal_sec(line_buff,normal_info,user_info
  STRING          *line_buff;
  UINT8           *normal_info;
  USER_INFO_STRUC *user_info;
  {
  INT16 items_read;
  INT16 items_expected = 3;
  float normal_i,normal_j,normal_k;

  items_read = sscanf(line_buff,"%*s %*s %f %f %f",&normal_i,&normal_j,&normal_
  check_normal(normal_i,normal_j,normal_k);

  swap_vert(&normal_i,&normal_j,&normal_k,user_info);

  if (items_read != items_expected) {
    fprintf(stderr,"\n Error - I/O error trying to read normal in triangle %u\n
    exit(SYS_FAILURE);
    }

  set_normal_info(normal_i,normal_j,normal_k,normal_info);
```

```
PFPRIF.C    - Page 6 -                    4/15/1988   3:35 PM

.****************************************************************************
   exported procedure

   pfp_get_input_tri_list


****************************************************************************.

void pfp_get_input_tri_list (in_file, tri_list,
                             min_x, min_y, min_z,
                             max_x, max_y, max_z, user_info)

    FILE             *in_file;
    INPUT_TRI_STRUC  **tri_list;
    float            *min_x, *min_y, *min_z, *max_x, *max_y, *max_z;
    USER_INFO_STRUC  *user_info;


    STRING           line_buf[   ];
    BOOLEAN          error = FALSE;
    BOOLEAN          eof = FALSE;
    INT8             normal_info;
    INPUT_TRI_STRUC  *tri_ptr, *back_ptr;


    *tri_list = (INPUT_TRI_STRUC *) mem_alloc (sizeof (INPUT_TRI_STRUC));
    tri_ptr = *tri_list;
    get_line (in_file, line_buf, &error, &eof);
    while (!eof && !error)

        while (!eof && !error && (tolower(*line_buf) != NORMAL_FLAG_CHAR))
            get_line (stdin, line_buf, &error, &eof);

        if (!eof && !error)
            {
            tri_count++;
            get_normal_asc(line_buf,&normal_info,user_info);
            get_line(stdin,line_buf,&error,&eof);
            get_input_tri_asc (stdin, tri_ptr, user_info, &error);
            tri_ptr-> normal_info = normal_info;
            if (!error)
                {
                update_min_max_values (tri_ptr, min_x, min_y, min_z,
                                              max_x, max_y, max_z);
                tri_ptr-> next_input_tri = (INPUT_TRI_STRUC *) mem_alloc
                                             (sizeof (INPUT_TRI_STRUC));
                back_ptr = tri_ptr;
                tri_ptr = tri_ptr-> next_input_tri;
                get_line (stdin, line_buf, &error, &eof);
                }
            }
        }

    if (error)
        exit (SYS_FAILURE);

    if (tri_count > 0)
```

```
PFPRIF.C    - Page 7 -                    4/15/1988   5:35 PM

        back_ptr-> next_input_tri = NULL_INPUT_TRI;
        mem_free (tri_ptr,sizeof(INPUT_TRI_STRUC));
       }
    else
       {
        fprintf (stderr, "\n Error - No triangles found in input file");
        exit (SYS_FAILURE);
       }

} /* pfp_get_input_tri_list */




/***********************************************************************************
    local procedure
    get_normal_bin

***********************************************************************************

get_normal_bin(in_file,tri_ptr,user_info)
   FILE             *in_file;
   INPUT_TRI_STRUC *tri_ptr;
   USER_INFO_STRUC *user_info;
   {
   float normal_i,normal_j,normal_k;

   fread (&normal_i, sizeof(float), 1, in_file);
   fread (&normal_j, sizeof(float), 1, in_file);
   fread (&normal_k, sizeof(float), 1, in_file);
   check_normal(normal_i,normal_j,normal_k);
   swap_vert(&normal_i,&normal_j,&normal_k,user_info);

   set_normal_info(normal_i,normal_j,normal_k,&tri_ptr->normal_info);

return (normal_i != 0.0 !! normal_j != 0.0 !! normal_k != 0.0);

}/* get_normal_bin */

/***********************************************************************************
    local procedure

    get_input_tri_bin


***********************************************************************************

void get_input_tri_bin (in_file, tri_ptr, user_info, error)

    FILE            *in_file;
    INPUT_TRI_STRUC *tri_ptr;
    USER_INFO_STRUC *user_info;
    BOOLEAN          *error;

{
   INT16 items_read;
```

```
    tri_ptr-> next_input_tri = NULL_INPUT_TRI;

    items_read = fread (tri_ptr, sizeof(float), 9,in_file);
    swap_vert(&tri_ptr->x1, &tri_ptr->y1, &tri_ptr->z1, user_info);
    swap_vert(&tri_ptr->x2, &tri_ptr->y2, &tri_ptr->z2, user_info);
    swap_vert(&tri_ptr->x3, &tri_ptr->y3, &tri_ptr->z3, user_info);

    *error = (items_read != 9);

    if (*error) {
      if (feof(in_file))
        fprintf (stderr, "\n Error - Premature end of input file at triangle %u
      else
        fprintf (stderr, "\n Error - I/O error reading verticies in triangle %u:
      exit (SYS_FAILURE);
      }

} /* get_input_tri_bin */



/*****************************************************************************
   exported procedure

   pfp_get_input_tri_list_bin                                               *


*****************************************************************************/
void pfp_get_input_tri_list_bin (in_file, tri_list,
                                 min_x, min_y, min_z,
                                 max_x, max_y, max_z,
                                 user_info)

   FILE              *in_file;
   INPUT_TRI_STRUC   **tri_list;
   float             *min_x, *min_y, *min_z, *max_x, *max_y, *max_z;
   USER_INFO_STRUC   *user_info;

{
   BOOLEAN           error = FALSE;
   INPUT_TRI_STRUC   *tri_ptr, *back_ptr;
   STRING            record[81];
   unsigned long     facet_records;
   UINT16            attrib_size;

   *tri_list = (INPUT_TRI_STRUC *) mem_alloc (sizeof (INPUT_TRI_STRUC));

   tri_ptr = *tri_list;
   record[80] = '\0';
   while (!error && (fread(record,80,1,in_file) > 0)) if (user_info->attrib) {
     fread(&facet_records,4,1,in_file);
     while (!error && (facet_records != 0)) {
       tri_count++;
       facet_records--;
       get_normal_bin (in_file,tri_ptr,user_info);
       get_input_tri_bin (in_file, tri_ptr, user_info, &error);
       if (!error) {
         fread(&attrib_size,2,1,in_file);
```

```
PFPRIF.C    - Page 8 -                          4/12/1988    5:35 PM
        while (attrib_size != 0) {
          attrib_size--;
          fread(record,1,1,in_file);
          }
        update_min_max_values (tri_ptr, min_x, min_y, min_z, max_x, max_y, ma
        tri_ptr-> next_input_tri = (INPUT_TRI_STRUC *) mem_alloc (sizeof (INPU
        back_ptr = tri_ptr;
        tri_ptr = tri_ptr-> next_input_tri;
        }
      }
    }
  else while (!error && get_normal_bin (in_file,tri_ptr,user_info)) {
    tri_count++;
    get_input_tri_bin (in_file, tri_ptr, user_info, &error);
    if (!error) {
      fread(&attrib_size,2,1,in_file);
      while (attrib_size > 0) {
        fread(record,1,1,in_file);
        attrib_size--;
        }
      update_min_max_values (tri_ptr, min_x, min_y, min_z, max_x, max_y, max_z
      tri_ptr-> next_input_tri = (INPUT_TRI_STRUC *) mem_alloc (sizeof (INPUT_
      back_ptr = tri_ptr;
      tri_ptr = tri_ptr-> next_input_tri;
      }
    }
  if (error)
    exit (SYS_FAILURE);

  if (tri_count > 0) {
    back_ptr-> next_input_tri = NULL_INPUT_TRI;
    mem_free (tri_ptr,sizeof(INPUT_TRI_STRUC));
    }
  else {
    fprintf (stderr, "\n Error - No triangles found in input file");
    exit (SYS_FAILURE);
    }
  } /* pfp_get_input_tri_list_bin */
```

```
PFPSEG.C    - Page 1 -                    4/15/1988   5:38 PM

/*****************************************************************************
/*                     3D Systems Slice Program
/*                 Copyright (C) 1988 3D Systems Inc.
/*
/* PFPSEG.C
/*
 * PFP Segment utility module
/*
/*****************************************************************************/


#include <stdio.h>
#include "pfp.h"
#include "pfphi.h"
#include "pfptri.h"
#include "pfpseg.h"




 *****************************************************************************
   exported procedure

   Output_Error



*****************************************************************************/

void Output_Error()
  {
  fprintf(stderr,"\n*** I/O Error in Slice output file ***\n");
  exit(SYS_FAILURE);
  };

 *****************************************************************************
   exported procedure

   pfp_print_seg_list



*****************************************************************************/

void pfp_print_seg_list (seg_list, z, seg_file, section_type,
                         user_info)

   OUT_SEG_STRUC    **seg_list;
   UINT16           z;
   FILE             *seg_file;
   UINT16           section_type;
   USER_INFO_STRUC  *user_info;

{
   OUT_SEG_STRUC *seg_ptr,*temp_ptr;

   if (section_type == LB_CODE) {
```

```
      if (fprintf(seg_file, "%s %u\n", L_TEXT, z)!=0) Output_Error;
      if (*seg_list != NULL_SEG)
        if (fprintf(seg_file, "%s\n", LB_TEXT)!=0) Output_Error;
      ;

  if ((*seg_list != NULL_SEG) &&
       ((*seg_list)-> normal_info == section_type)) {
    if (!user_info-> section_codes_off)
       switch (section_type)
          {
           case (LH_CODE) :
              if (fprintf(seg_file, "%s\n", LH_TEXT)!=0) Output_Error;
              break;
           case (NFDB_CODE) :
              if (fprintf(seg_file, "%s\n", NFDB_TEXT)!=0) Output_Error;
              break;
           case (NFDH_CODE) :
              if (fprintf(seg_file, "%s\n", NFDH_TEXT)!=0) Output_Error;
              break;
           case (NFDF_CODE) :
              if (fprintf(seg_file, "%s\n", NFDF_TEXT)!=0) Output_Error;
              break;
           case (NFUB_CODE):
              if (fprintf(seg_file, "%s\n", NFUB_TEXT)!=0) Output_Error;
              break;
           case (NFUH_CODE):
              if (fprintf(seg_file, "%s\n", NFUH_TEXT)!=0) Output_Error;
              break;
           case (NFUF_CODE) :
              if (fprintf(seg_file, "%s\n", NFUF_TEXT)!=0) Output_Error;
              break;
           case (FUB_CODE):
              if (fprintf(seg_file, "%s\n", FUB_TEXT)!=0) Output_Error;
              break;
           case (FUH_CODE):
              if (fprintf(seg_file, "%s\n", FUH_TEXT)!=0) Output_Error;
              break;
           case (FUF_CODE):
              if (fprintf(seg_file, "%s\n", FUF_TEXT)!=0) Output_Error;
              break;
           case (FDB_CODE) :
              if (fprintf(seg_file, "%s\n", FDB_TEXT)!=0) Output_Error;
              break;
           case (FDH_CODE) :
              if (fprintf(seg_file, "%s\n", FDH_TEXT)!=0) Output_Error;
              break;
           case (FDF_CODE) :
              if (fprintf(seg_file, "%s\n", FDF_TEXT)!=0) Output_Error;
              break;
          }

    seg_ptr = *seg_list;

    while ((seg_ptr != NULL_SEG) &&
             (seg_ptr-> normal_info == section_type)) {
      if (fprintf(seg_file, " %u %u %u %u\n", seg_ptr-> x_1, seg_ptr-> y_1,
        seg_ptr-> x_2, seg_ptr-> y_2)!=0) Output_Error;
      temp_ptr = seg_ptr;
      seg_ptr = seg_ptr-> next_seg;
      mem_free(temp_ptr,sizeof(OUT_SEG_STRUC));
```

```
        }
     *seg_list = NULL_SEG;
     }

} /* pfp_print_seg_list */




/*****************************************************************************
   exported procedure

   pfp_display_seg_list



*****************************************************************************/

void pfp_display_seg_list (seg_list, display_mode)

   OUT_SEG_STRUC *seg_list;
   INT16          display_mode;

{
   OUT_SEG_STRUC *seg_ptr;

   set_display_mode (display_mode);

   seg_ptr = seg_list;

   while (seg_ptr != NULL_SEG)
       {
       draw_line (seg_ptr->x_1, seg_ptr->y_1, seg_ptr->x_2, seg_ptr->y_2);
       seg_ptr = seg_ptr->next_seg;
       }

} /* pfp_display_seg_list */




/*****************************************************************************
   exported procedure

   pfp_delete_seg_list



*****************************************************************************/

void pfp_delete_seg_list (seg_list)
```

```
PFPSEG.C    - Page 4 -                                      4/15/1988   5:38 PM

   OUT_SEG_STRUC **seg_list;

   OUT_SEG_STRUC *next_ptr,*seg_ptr;

   seg_ptr = *seg_list;

   while (seg_ptr != NULL_SEG)
      {
       next_ptr = seg_ptr-> next_seg;
       mem_free (seg_ptr,sizeof(OUT_SEG_STRUC));
       seg_ptr = next_ptr;
      }

   *seg_list = seg_ptr;

 /* pfp_delete_seg_list */



/***************************************************************************

   swap_points

***************************************************************************/


void swap_points (seg_ptr)

   OUT_SEG_STRUC *seg_ptr;

   UINT16        temp;

   temp = seg_ptr-> x_1;
   seg_ptr-> x_1 = seg_ptr-> x_2;
   seg_ptr-> x_2 = temp;

   temp = seg_ptr-> y_1;
   seg_ptr-> y_1 = seg_ptr-> y_2;
   seg_ptr-> y_2 = temp;

} /* swap_points */



/***************************************************************************
   local procedure

   get_next_seg
```

```
*****************************************************************************

static void get_next_seg (seg_ptr, seg_list, next_seg_ptr)

   OUT_SEG_STRUC *seg_ptr;
   OUT_SEG_STRUC **seg_list;
   OUT_SEG_STRUC **next_seg_ptr;

{
   OUT_SEG_STRUC *list_ptr, *back_ptr;
   OUT_SEG_STRUC head_rec;
   BOOLEAN       seg_found = FALSE;

   *next_seg_ptr = NULL_SEG;
   back_ptr = &head_rec;
   head_rec .next_seg = *seg_list;
   list_ptr = *seg_list;

   while (list_ptr != NULL_SEG && !seg_found)
     {
      seg_found = ((seg_ptr->x_1 == list_ptr->x_2) &&
                   (seg_ptr->y_1 == list_ptr->y_2)) ||
                   (seg_ptr->x_1 == list_ptr->x_1) &&
                  (seg_ptr->y_1 == list_ptr->y_1)));

      if (!seg_found)
         {
          back_ptr = list_ptr;
          list_ptr = list_ptr->next_seg;
         }
     }

   if (seg_found)
     {
      if (!((seg_ptr->x_1 == list_ptr->x_2) &&
            (seg_ptr->y_1 == list_ptr->y_2)))
         swap_points (list_ptr);

      back_ptr->next_seg = list_ptr->next_seg;
      *next_seg_ptr = list_ptr;
     }

   *seg_list = head_rec .next_seg;

} /* get_next_seg */



/*****************************************************************************
   exported procedure

   pfp_sort_seg_list
```

```
*****************************************************************************

void pfp_sort_seg_list (list_1_ptr, loop_count)

   OUT_SEG_STRUC **list_1_ptr;
   INT16          *loop_count;

{
   OUT_SEG_STRUC *list_2_ptr, *seg_ptr, *next_seg_ptr;

   seg_ptr = NULL_SEG;
   next_seg_ptr = NULL_SEG;
   list_2_ptr = NULL_SEG;

   *loop_count = 0;

   while (*list_1_ptr != NULL_SEG)
      {
       (*loop_count)++;
       seg_ptr = *list_1_ptr;
       *list_1_ptr = (*list_1_ptr)->next_seg;
       seg_ptr->next_seg = list_2_ptr;
       list_2_ptr = seg_ptr;
       do
          {
           get_next_seg (seg_ptr, list_1_ptr, &next_seg_ptr);
           if (next_seg_ptr != NULL_SEG)
              {
               next_seg_ptr->next_seg = list_2_ptr;
               list_2_ptr = next_seg_ptr;
               seg_ptr = next_seg_ptr;
              }
          } while (next_seg_ptr != NULL_SEG);
      }

   *list_1_ptr = list_2_ptr;

} /* pfp_sort_seg_list */

/*****************************************************************************
   procedure

   append_seg_list


*****************************************************************************

void append_seg_list (list1, list2)

   OUT_SEG_STRUC **list1;
   OUT_SEG_STRUC **list2;

{
   OUT_SEG_STRUC *list1_ptr;
```

```
    if (*list1 == NULL_SEG)
        *list1 = *list2;
    else
        {
         list1_ptr = *list1;
         while (list1_ptr->next_seg != NULL_SEG)
             list1_ptr = list1_ptr->next_seg;
         list1_ptr->next_seg = *list2;
        }
    *list2 = NULL_SEG;

} /* append_seg_list */
```

```
/***************************************************************************
/*                    3D Systems Slice Program                             *
/*               Copyright (C) 1988 3D Systems Inc.                        *
/*                                                                         *
/*                                                                         *
/* PFPSEG.H                                                                *
/*                                                                         *
/* PFP segment header file                                                 *
/*                                                                         *
/***************************************************************************

#define NORMAL_X_POSITIVE  1
#define NORMAL_X_NEGATIVE  2
#define NORMAL_Y_POSITIVE  4
#define NORMAL_Y_NEGATIVE  8
#define NORMAL_Z_POSITIVE  16
#define NORMAL_Z_NEGATIVE  32
#define SPARE1             64
#define SPARE2             128

struct out_seg
  {
   UINT16          x_1;
   UINT16          y_1;
   UINT16          x_2;
   UINT16          y_2;
   UINT8           normal_info;
   struct out_seg *next_seg;

  };

typedef struct out_seg OUT_SEG_STRUC;

#define NULL_SEG            (OUT_SEG_STRUC *) NULL

#define L_TEXT              "L"     /* Layer Header */
#define LB_TEXT             "LB"    /* border */
#define LH_TEXT             "LH"    /* border hatching */
#define NFDB_TEXT           "NFDB"  /* Near-Flat Down skin Border */
#define NFDH_TEXT           "NFDH"  /* Near-Flat Down skin Hatch */
#define NFDF_TEXT           "NFDF"  /* Near-Flat Down skin Fill */
#define NFUB_TEXT           "NFUB"  /* Near-Flat Up skin Border */
#define NFUH_TEXT           "NFUH"  /* Near-Flat Up skin Border */
#define NFUF_TEXT           "NFUF"  /* Near-Flat Up skin Fill */
#define FDB_TEXT            "FDB"   /* Flat Down skin Fill */
#define FDH_TEXT            "FDH"   /* Flat Down skin Fill */
#define FDF_TEXT            "FDF"   /* Flat Down skin Fill */
#define FUB_TEXT            "FUB"   /* Flat Down skin Fill */
#define FUH_TEXT            "FUH"   /* Flat Down skin Fill */
#define FUF_TEXT            "FUF"   /* Flat Down skin Fill */
```

```
/*****************************************************************************
/*                      3D Systems Slice Program                              *
/*                  Copyright (C) 1988 3D Systems Inc.                        *
/*                                                                            *
/* PFPTRI.C                                                                   *
/*                                                                            *
/* PFP Process Triangles Section                                              *
/*                                                                            *
/*****************************************************************************

#include <stdio.h>
#include <math.h>

#include "pfp.h"
#include "pfphi.h"
#include "pfptri.h"
#include "pfpseg.h"
#include "pfputl.h"

extern INPUT_TRI_STRUC *tri_cur_st_array[];
extern OUT_SEG_STRUC *FD_seg_bucket_array[];
extern OUT_SEG_STRUC *FU_seg_bucket_array[];
extern OUT_SEG_STRUC *NFU_seg_bucket_array[];
extern OUT_SEG_STRUC *NFD_seg_bucket_array[];
extern UINT16        z_control_table[];

/*****************************************************************************

     local procedure

     add_near_flat_segment

     Adds a segment list

******************************************************************************

static void add_near_flat_segment(segment,zi)
  OUT_SEG_STRUC **segment;
  UINT16        zi;
  {
  OUT_SEG_STRUC *seg_ptr;

  seg_ptr = *segment;
  *segment = NULL_SEG;

  if (seg_ptr->normal_info&NORMAL_Z_POSITIVE) {
    seg_ptr->next_seg = NFU_seg_bucket_array[zi];
    NFU_seg_bucket_array[zi] = seg_ptr;
    }
  else {
    seg_ptr->next_seg = NFD_seg_bucket_array[zi];
    NFD_seg_bucket_array[zi] = seg_ptr;
    };
  };

/*****************************************************************************
```

```
    procedure

    process_flat_tri_list

    Takes each flat triangle and generates segments for z level
     and adds to FU or FD segment lists

 ****************************************************************************

void process_flat_tri_list(flat_tri_list)
  INPUT_TRI_STRUC *flat_tri_list;
  {
  CUT_SEG_STRUC     *seg_list;
  INPUT_TRI_STRUC *temp_tri_ptr;
  UINT16            flat_tri_count = 0;
  UINT16            zi;

  while (flat_tri_list != NULL_INPUT_TRI) {
    flat_tri_count++;
    if (flat_tri_count%10 == 0)
      fprintf(stderr,"  processing flat triangles (%u)  \r",flat_tri_count);

    seg_list = NULL_SEG;
    pfp_convert_tri_to_segs(flat_tri_list,&seg_list);
    zi = get_z_binary1((UINT16) flat_tri_list->z1);

    if (flat_tri_list->normal_info&NORMAL_Z_POSITIVE) {
      append_seg_list(&seg_list,&FU_seg_bucket_array[zi]);
      FU_seg_bucket_array[zi] = seg_list;
      }
    else {
      append_seg_list(&seg_list,&FD_seg_bucket_array[zi]);
      FD_seg_bucket_array[zi] = seg_list;
      };

    temp_tri_ptr = flat_tri_list;
    flat_tri_list = flat_tri_list->next_input_tri;
    mem_free(temp_tri_ptr,sizeof(INPUT_TRI_STRUC));
    };
    fprintf(stderr,"  processing flat triangles (%u)\n",flat_tri_count);
  };


 ****************************************************************************

    procedure

    process_near_flat_tri_list

    Takes each near flat triangle and breaks into polygon for each z level
     and adds to NFU or NFD segment lists

 ****************************************************************************/
void process_near_flat_tri_list(near_flat_tri_list)
  INPUT_TRI_STRUC *near_flat_tri_list;
  {
  CUT_SEG_STRUC     *side1_seg,*side2_seg,*top_seg,*bot_seg;
  INPUT_TRI_STRUC *temp_tri_ptr;
  VECT_TRI_STRUC   vect_tri;
```

```
UINT16          near_tri_count = 0;
UINT16          zi;

top_seg = NULL_SEG;
bot_seg = NULL_SEG;

while (near_flat_tri_list != NULL_INPUT_TRI) {
  near_tri_count++;
  if (near_tri_count%10 == 0)
    fprintf(stderr," processing near flat triangles (%u)\r",near_tri_count);

  pfp_convert_tri_to_vect(near_flat_tri_list,&vect_tri);
  zi = get_z_binarily((UINT16) vect_tri.vert1_z);

  while (z_control_table[zi+1] <= vect_tri.vert3_z) {
    pfp_get_intersection_segment(&vect_tri,z_control_table[zi],  &bot_seg);
    pfp_get_intersection_segment(&vect_tri,z_control_table[zi+1],&top_seg);
    side1_seg = (OUT_SEG_STRUC *) mem_alloc(sizeof(OUT_SEG_STRUC));
    side1_seg->x_1 = bot_seg->x_1;
    side1_seg->y_1 = bot_seg->y_1;
    side1_seg->x_2 = top_seg->x_1;
    side1_seg->y_2 = top_seg->y_1;
    side2_seg = (OUT_SEG_STRUC *) mem_alloc(sizeof(OUT_SEG_STRUC));
    side2_seg->x_1 = bot_seg->x_2;
    side2_seg->y_1 = bot_seg->y_2;
    side2_seg->x_2 = top_seg->x_2;
    side2_seg->y_2 = top_seg->y_2;
    side1_seg->normal_info = bot_seg->normal_info;
    side2_seg->normal_info = bot_seg->normal_info;
    /* Check for point segments in Top and Bottom. If so, at a vertex */
    if ((bot_seg->x_1 == bot_seg->x_2) && (bot_seg->y_1 == bot_seg->y_2)) {
      pfp_get_xy_normal_info((float) side1_seg->x_1,(float) side1_seg->y_1,
                             (float) side1_seg->x_2,(float) side1_seg->y_2,
                             (float) top_seg->x_2,  (float) top_seg->y_2,
                             &side1_seg->normal_info);
      pfp_get_xy_normal_info((float) side2_seg->x_1,(float) side2_seg->y_1,
                             (float) side2_seg->x_2,(float) side2_seg->y_2,
                             (float) top_seg->x_1,  (float) top_seg->y_1,
                             &side2_seg->normal_info);
      pfp_get_xy_normal_info((float) top_seg->x_1,(float) top_seg->y_1,
                             (float) top_seg->x_2,(float) top_seg->y_2,
                             (float) bot_seg->x_1,(float) bot_seg->y_1,
                             &top_seg->normal_info);
      add_near_flat_segment(&top_seg,zi);
    }
    else {
      pfp_get_xy_normal_info((float) side1_seg->x_1,(float) side1_seg->y_1,
                             (float) side1_seg->x_2,(float) side1_seg->y_2,
                             (float) bot_seg->x_2, (float) bot_seg->y_2,
                             &side1_seg->normal_info);
      pfp_get_xy_normal_info((float) side2_seg->x_1,(float) side2_seg->y_1,
                             (float) side2_seg->x_2,(float) side2_seg->y_2,
                             (float) bot_seg->x_1,  (float) bot_seg->y_1,
                             &side2_seg->normal_info);
      pfp_get_xy_normal_info((float) bot_seg->x_1,(float) bot_seg->y_1,
                             (float) bot_seg->x_2,(float) bot_seg->y_2,
                             (float) top_seg->x_1,(float) top_seg->y_1,
                             &bot_seg->normal_info);
      if ((top_seg->x_1 != top_seg->x_2) || (top_seg->y_1 != top_seg->y_2)) {
        pfp_get_xy_normal_info((float) top_seg->x_1,(float) top_seg->y_1,
```

```
                                        (float) top_seg->x_2,(float) top_seg->y_2,
                                        (float) bot_seg->x_1,(float) bot_seg->y_1,
                                        &top_seg->normal_info);
          add_near_flat_segment(&top_seg,zi);
          };
        add_near_flat_segment(&bot_seg,zi);
        };
      add_near_flat_segment(&side1_seg,zi);
      add_near_flat_segment(&side2_seg,zi);
      zi++;
      };

    temp_tri_ptr = near_flat_tri_list;
    near_flat_tri_list = near_flat_tri_list->next_input_tri;
    mem_free(temp_tri_ptr,sizeof(INPUT_TRI_STRUC));
    };

  if (top_seg != NULL_SEG)
    mem_free(top_seg,sizeof(OUT_SEG_STRUC));
  if (bot_seg != NULL_SEG)
    mem_free(bot_seg,sizeof(OUT_SEG_STRUC));

  fprintf(stderr," processing near flat triangles (%u)\n",near_tri_count);
  };
```

```
/******************************************************************************
/*                          3D Systems Slice Program                          *
/*                    Copyright (C) 1988 3D Systems Inc.                      *
/*                                                                            *
/*                                                                            *
/* PFPTRI.H                                                                   *
/*                                                                            *
/* PFP triangle definition header file                                        */
/*                                                                            *
/******************************************************************************

struct in_tri
   {
    float          x1;
    float          y1;
    float          z1;
    float          x2;
    float          y2;
    float          z2;
    float          x3;
    float          y3;
    float          z3;
    UINT8          normal_info;
    struct in_tri  *next_input_tri;
   };

typedef struct in_tri INPUT_TRI_STRUC;


struct vector
   {
    float x;
    float y;
    float x_incr;
    float y_incr;
   };


struct vect_tri
   {
    struct vector   vector_1;
    struct vector   vector_2;
    struct vector   vector_3;
    float           vert1_z;
    float           vert2_z;
    float           vert3_z;
    UINT8           normal_info;
    struct vect_tri *next_tri;
   };

typedef struct vect_tri VECT_TRI_STRUC;

#define NULL_INPUT_TRI  (INPUT_TRI_STRUC *) NULL
#define NULL_VECT_TRI   (VECT_TRI_STRUC *) NULL
```

```
/******************************************************************************
/*                       3D Systems Slice Program                              *
/*                  Copyright (C) 1988 3D Systems Inc.                         *
/*                                                                             *
/* PFPTUTL.C                                                                   *
/*                                                                             *
/* PFP Triangle Utilities module                                               *
/*                                                                             *
/******************************************************************************/


#include <stdio.h>
#include "pfp.h"
#include "pfptri.h"
#include "pfpseg.h"
#include "pfputl.h"

extern UINT16 z_control_table [];


/******************************************************************************
   exported procedure

   pfp_get_min_z


******************************************************************************/

void pfp_get_min_z (tri, min_z)

   INPUT_TRI_STRUC *tri;
   float            *min_z;

   *min_z = (float) (MAX_Z_VAL+1);

   if (tri-> z1 < *min_z)
      *min_z = tri-> z1;

   if (tri-> z2 < *min_z)
      *min_z = tri-> z2;

   if (tri-> z3 < *min_z)
      *min_z = tri-> z3;

} /* pfp_get_min_z */


/******************************************************************************
   local procedure

   get_max_z
```

```
**********************************************************************************

void get_max_z (tri, max_z)

   INPUT_TRI_STRUC *tri;
   float           *max_z;

{
   *max_z = 0.0;

   if (tri-> z1 > *max_z)
      *max_z = tri-> z1;

   if (tri-> z2 > *max_z)
      *max_z = tri-> z2;

   if (tri-> z3 > *max_z)
      *max_z = tri-> z3;

} /* get_max_z */



/*********************************************************************************
   local procedure

   order_points


*********************************************************************************/

void order_points (input_tri)

   INPUT_TRI_STRUC *input_tri;

{
   INPUT_TRI_STRUC *temp_tri;
   float            min_z;
   float            max_z;


   temp_tri = (INPUT_TRI_STRUC *) mem_alloc (sizeof (INPUT_TRI_STRUC));

   pfp_get_min_z (input_tri, &min_z);

   get_max_z (input_tri, &max_z);

   if ((input_tri-> z1 == max_z) && (input_tri-> z2 == min_z))
      {
       temp_tri-> x1 = input_tri-> x2;
```

```
        temp_tri-> y1 = input_tri-> y2;
        temp_tri-> z1 = input_tri-> z2;

        temp_tri-> x2 = input_tri-> x3;
        temp_tri-> y2 = input_tri-> y3;
        temp_tri-> z2 = input_tri-> z3;

        temp_tri-> x3 = input_tri-> x1;
        temp_tri-> y3 = input_tri-> y1;
        temp_tri-> z3 = input_tri-> z1;
       }

    else if ((input_tri-> z1 == max_z) && (input_tri-> z3 == min_z))
       {
        temp_tri-> x1 = input_tri-> x3;
        temp_tri-> y1 = input_tri-> y3;
        temp_tri-> z1 = input_tri-> z3;

        temp_tri-> x2 = input_tri-> x2;
        temp_tri-> y2 = input_tri-> y2;
        temp_tri-> z2 = input_tri-> z2;

        temp_tri-> x3 = input_tri-> x1;
        temp_tri-> y3 = input_tri-> y1;
        temp_tri-> z3 = input_tri-> z1;
       }

    else if ((input_tri-> z2 == max_z) && (input_tri-> z3 == min_z))
       {
        temp_tri-> x1 = input_tri-> x3;
        temp_tri-> y1 = input_tri-> y3;
        temp_tri-> z1 = input_tri-> z3;

        temp_tri-> x2 = input_tri-> x1;
        temp_tri-> y2 = input_tri-> y1;
        temp_tri-> z2 = input_tri-> z1;

        temp_tri-> x3 = input_tri-> x2;
        temp_tri-> y3 = input_tri-> y2;
        temp_tri-> z3 = input_tri-> z2;
       }

    else if ((input_tri-> z2 == max_z) && (input_tri-> z1 == min_z))
       {
        temp_tri-> x1 = input_tri-> x1;
        temp_tri-> y1 = input_tri-> y1;
        temp_tri-> z1 = input_tri-> z1;

        temp_tri-> x2 = input_tri-> x3;
        temp_tri-> y2 = input_tri-> y3;
        temp_tri-> z2 = input_tri-> z3;

        temp_tri-> x3 = input_tri-> x2;
        temp_tri-> y3 = input_tri-> y2;
        temp_tri-> z3 = input_tri-> z2;
       }

    else if ((input_tri-> z3 == max_z) && (input_tri-> z1 == min_z))
       {
        temp_tri-> x1 = input_tri-> x1;
```

```
        temp_tri->y1 = input_tri->y1;
        temp_tri->z1 = input_tri->z1;

        temp_tri->x2 = input_tri->x2;
        temp_tri->y2 = input_tri->y2;
        temp_tri->z2 = input_tri->z2;

        temp_tri->x3 = input_tri->x3;
        temp_tri->y3 = input_tri->y3;
        temp_tri->z3 = input_tri->z3;
       }

    else
       {
        temp_tri->x1 = input_tri->x2;
        temp_tri->y1 = input_tri->y2;
        temp_tri->z1 = input_tri->z2;

        temp_tri->x2 = input_tri->x1;
        [illegible]
        [illegible]

        [illegible]
        [illegible]
        [illegible] = input_tri->z3;
       }

    temp_tri->[illegible] = input_tri->[illegible]_info;
    temp_tri->next_input_tri = input_tri->next_input_tri;
    [illegible](temp_tri, input_tri, sizeof (INPUT_TRI_STRUC[illegible]
    mem_free (temp_tri, sizeof(INPUT_TRI_STRUC));

    [illegible]


/*****************************************************************************
    Local procedure

    get_vector



*****************************************************************************/

void get_vector (vector_ptr, start_x, start_y, start_z,
                             end_x, end_y, end_z)

    struct vector *vector_ptr;
    float start_x;
    float start_y;
    float start_z;
    float end_x;
    float end_y;
    float end_z;
```

```
   double delta_x, delta_y, delta_z;

   vector_ptr-> x = start_x;
   vector_ptr-> y = start_y;

   delta_z = end_z - start_z;

   if (delta_z > 0.0)
      {
       delta_x = end_x - start_x;
       delta_y = end_y - start_y;
       vector_ptr-> x_incr = delta_x / delta_z;
       vector_ptr-> y_incr = delta_y / delta_z;
      }
   else
      {
       vector_ptr-> x_incr = 0;
       vector_ptr-> y_incr = 0;
      }
} /* get_vect... */




/*************************************************************************
   exported procedure

   sfp_get_intersection_segment



*************************************************************************/
void sfp_get_intersection_segment (vect_ptr, z_value, seg_ptr)

   VECT_TRI_STRUC *vect_ptr;
   UINT16         z_value;
   OUT_SEG_STRUC  **seg_ptr;

{
   OUT_SEG_STRUC  *segment;

   if (*seg_ptr == NULL_SEG)
     *seg_ptr = (OUT_SEG_STRUC *) mem_alloc(sizeof(OUT_SEG_STRUC));
   segment = *seg_ptr;

   segment-> normal_info = vect_ptr-> normal_info;
   segment-> x_1 = round_flt(vect_ptr-> vector_1 .x
                  + vect_ptr-> vector_1.x_incr * (z_value - vect_ptr->vert1_z)
   segment-> y_1 = round_flt(vect_ptr-> vector_1 .y
                  + vect_ptr-> vector_1.y_incr * (z_value - vect_ptr->vert1_z)

   if (vect_ptr-> vert2_z > z_value)
      {
       segment-> x_2 = round_flt(vect_ptr-> vector_2 .x
                  + vect_ptr-> vector_2.x_incr * (z_value - vect_ptr->vert1_z))
       segment-> y_2 = round_flt(vect_ptr-> vector_2 .y
```

```
                  + vect_ptr->vector_2.y_incr * (z_value - vect_ptr->vert1_z
   }
   else
      {
      segment->x_2 = round_flt(vect_ptr->vector_3.x
                  + vect_ptr->vector_3.x_incr * (z_value - vect_ptr->vert2_z
      segment->y_2 = round_flt(vect_ptr->vector_3.y
                  + vect_ptr->vector_3.y_incr * (z_value - vect_ptr->vert2_z
      }

} /* pfp_get_intersection_segment */

/**************************************************************************
   exported procedure




**************************************************************************/

void pfp_convert_tri_to_vect (input_tri, vect_tri)

   INPUT_TRI_STRUCT *input_tri;
   VECT_TRI_STRUCT  *vect_tri;


   struct vector    *vector_ptr;


   order_points (input_tri);

   vector_ptr = &(vect_tri->vect1);

   get_vector (vector_ptr++,
               input_tri-> x1, input_tri-> y1, input_tri-> z1,
               input_tri-> x3, input_tri-> y3, input_tri-> z3);

   get_vector (vector_ptr++,
               input_tri-> x1, input_tri-> y1, input_tri-> z1,
               input_tri-> x2, input_tri-> y2, input_tri-> z2);

   get_vector (vector_ptr,
               input_tri-> x2, input_tri-> y2, input_tri-> z2,
               input_tri-> x3, input_tri-> y3, input_tri-> z3);

   vect_tri-> vert1_z  = input_tri->z1;
   vect_tri-> vert2_z  = input_tri->z2;
   vect_tri-> vert3_z  = input_tri->z3;
   vect_tri-> normal_info = input_tri->normal_info;
   vect_tri-> next_tri = NULL_VECT_TRI;

} /* pfp_convert_tri_to_vect */

/**************************************************************************
   procedure
```

```
****************************************************************************

void pfp_convert_tri_to_segs (tri_ptr, seg_list)

   INPUT_TRI_STRUC *tri_ptr;
   OUT_SEG_STRUC   **seg_list;

{
   OUT_SEG_STRUC   *seg_ptr;

   seg_ptr = (OUT_SEG_STRUC *) mem_alloc (sizeof (OUT_SEG_STRUC));
   seg_ptr-> x_1 = tri_ptr-> x1;
   seg_ptr-> y_1 = tri_ptr-> y1;
   seg_ptr-> x_2 = tri_ptr-> x2;
   seg_ptr-> y_2 = tri_ptr-> y2;
   seg_ptr->normal_info = tri_ptr->normal_info;
   pfp_get_xy_normal_info (tri_ptr-> x1, tri_ptr-> y1,
                           tri_ptr-> x2, tri_ptr-> y2,
                           tri_ptr-> x3, tri_ptr-> y3,&seg_ptr->normal_info);
   seg_ptr-> next_seg = *seg_list;
   *seg_list = seg_ptr;

   seg_ptr = (OUT_SEG_STRUC *) mem_alloc (sizeof (OUT_SEG_STRUC));
   seg_ptr-> x_1 = tri_ptr-> x2;
   seg_ptr-> y_1 = tri_ptr-> y2;
   seg_ptr-> x_2 = tri_ptr-> x3;
   seg_ptr-> y_2 = tri_ptr-> y3;
   seg_ptr->normal_info = tri_ptr->normal_info;
   pfp_get_xy_normal_info (tri_ptr-> x2, tri_ptr-> y2,
                           tri_ptr-> x3, tri_ptr-> y3,
                           tri_ptr-> x1, tri_ptr-> y1,&seg_ptr->normal_info);
   seg_ptr-> next_seg = *seg_list;
   *seg_list = seg_ptr;

   seg_ptr = (OUT_SEG_STRUC *) mem_alloc (sizeof (OUT_SEG_STRUC));
   seg_ptr-> x_1 = tri_ptr-> x3;
   seg_ptr-> y_1 = tri_ptr-> y3;
   seg_ptr-> x_2 = tri_ptr-> x1;
   seg_ptr-> y_2 = tri_ptr-> y1;
   seg_ptr->normal_info = tri_ptr->normal_info;
   pfp_get_xy_normal_info (tri_ptr-> x3, tri_ptr-> y3,
                           tri_ptr-> x1, tri_ptr-> y1,
                           tri_ptr-> x2, tri_ptr-> y2,&seg_ptr->normal_info);
   seg_ptr-> next_seg = *seg_list;
   *seg_list = seg_ptr;

} /* pfp_convert_tri_to_segs */
```

```
PFPUTL.C    - Page 1 -                         4/15/1988   5:41 PM

/******************************************************************************
/*                        3D Systems Slice Program                           *
/*                   Copyright (C) 1988 3D Systems Inc.                      *
/*                                                                           *
/* PFPUTL.C                                                                  *
/*                                                                           *
/* PFP Utilities module                                                      *
/*                                                                           *
/******************************************************************************

#include <stdio.h>
#include <time.h>
#include <malloc.h>
#include <math.h>
#include "pfp.h"
#include "pfptri.h"
#include "pfpseg.h"
#include "pfputl.

static long    last_time;

extern long max_mem_alloc;
extern long total_mem_alloc;
extern long curr_mem_alloc;


float round_flt(float_val)
  float float_val;
  {
  long int_val;

  int_val = float_val;
  if (((float) int_val+0.5) <= float_val) int_val++;
  return (int_val);

} /* round_float */

double round_dbl(dbl_val)
  double dbl_val;
  {
  if (dbl_val < 0.0) dbl_val = ceil(0.5+dbl_val);
  else dbl_val = floor(0.5+dbl_val);
  return (dbl_val);

} /* round_dbl */

INT16 sign(d)
  double d;
  {
  if (d < 0.0) return(-1);
  else return(1);
  };


STRING *mem_alloc (size)

   UINT16 size;
```

```
  STRING *ptr;

  ptr = (STRING *) malloc (size);

  curr_mem_alloc += size;
  total_mem_alloc += size;

  if (curr_mem_alloc > max_mem_alloc)
     max_mem_alloc = curr_mem_alloc;

  if (ptr == (STRING *) NULL)
     {
      fprintf (stderr, "\n error - memory allocation failed\n");
      fprintf (stderr, "\n current allocation = %ld\n", curr_mem_alloc);
      exit (SYS_FAILURE);
     }

  return (ptr);

} /* mem_alloc */


void mem_free (ptr,num_bytes)

   STRING  *ptr;
   UINT16  num_bytes;


   if (ptr != (STRING *) NULL)
      {
       curr_mem_alloc -= num_bytes;
       free (ptr);
      }
   else
      {
       fprintf (stderr, "\n error - null pointer freed \n");
       exit (SYS_FAILURE);
      }

} /* mem_free */


void get_timestamp (timestamp)

   STRING *timestamp;

{
   long time_buf;

   time (&time_buf);
   strcpy (timestamp, ctime (&time_buf));

} /* get_timestamp */
```

```
void openfile (filename, file_ptr, open_mode)

   STRING *filename;
   FILE   **file_ptr;
   STRING *open_mode;

{
   if (*filename == '\0')
      *file_ptr = (FILE *) NULL;
   else
      {
       *file_ptr = fopen (filename, open_mode);
       if (*file_ptr == (FILE *) NULL)
          {
           fprintf (stderr, "\n error - unable to open %s\n", filename);
           exit (SYS_FAILURE);
          }
      }

}  /* openfile */




void copy (source_ptr, dest_ptr, byte_count)

   STRING *source_ptr;
   STRING *dest_ptr;
   INT16  byte_count;

{
   INT16 i;

   for (i = 0; i < byte_count; i++)
      {
       *dest_ptr = *source_ptr;
       dest_ptr++;
       source_ptr++;
      }

}  /* copy */

void pfp_get_xy_normal_info (x1,y1,x2,y2,x3,y3,normal_info)
  float x1;
  float y1;
  float x2;
  float y2;
  float x3;
  float y3;
  UINT8 *normal_info;
  {
  double slope, offset;

  *normal_info &= (255-NORMAL_X_NEGATIVE-NORMAL_X_POSITIVE-
                       NORMAL_Y_NEGATIVE-NORMAL_Y_POSITIVE);

  if ((x2 - x1) != 0.0) slope = (y2 - y1) / (x2 - x1);
  else slope = 0.0;
```

```
  offset = y1 - slope*x1;

  if (slope == 0.0) {
    if (y1 == y2) {
      if (y3 < y2) *normal_info |= NORMAL_Y_POSITIVE;
      else *normal_info |= NORMAL_Y_NEGATIVE;
      };
    if (x1 == x2) {
      if (x3 < x2) *normal_info |= NORMAL_X_POSITIVE;
      else *normal_info |= NORMAL_X_NEGATIVE;
      };
    }
  else {
    if (((y3 - offset)/slope) <= x3) *normal_info |= NORMAL_X_POSITIVE;
    else *normal_info |= NORMAL_X_NEGATIVE;
    if ((slope*x3 + offset) <= y3) *normal_info |= NORMAL_Y_POSITIVE;
    else *normal_info |= NORMAL_Y_NEGATIVE;
    }
  }
```

```
/************************************************************************************/
/*                       3D Systems Slice Program                                   */
/*                 Copyright (C) 1988 3D Systems Inc.                               */
/*                                                                                  */
/*                                                                                  */
/*  PFPUTL.H                                                                        */
/*                                                                                  */
/*  PFP Utility Prototypes                                                      */  */
/*                                                                                  */
/************************************************************************************/

double round_dbl();
float  round_flt();
STRING *mem_alloc();
INT16  sign();
```

```
PFPZACT.C    - Page 1 -                    4/15/1988   3:42 PM

/*****************************************************************************
 *                     3D Systems Slice Program
 *                Copyright (C) 1988 3D Systems Inc.
 *
 * PFPZACT.C
 *
 * PFP Z Active list module
 *
 *****************************************************************************

#include <stdio.h>
#include "pfp.h"
#include "pfptri.h"
#include "pfpseg.h"
#include "pfputl.h"




/****************************************************************************
   Exported procedures

   pfp_update_z_active_list


****************************************************************************/


void pfp_update_z_active_list (z_bucket_ptr, seg_list, z_active_list)

   INPUT_TRI_STRUC **z_bucket_ptr;
   OUT_SEG_STRUC   **seg_list;
   VECT_TRI_STRUC  **z_active_list;

{
   VECT_TRI_STRUC  *new_vect_tri;
   INPUT_TRI_STRUC *z_bucket_back_ptr, **list_head;


   list_head = z_bucket_ptr;
   while (*z_bucket_ptr != NULL_INPUT_TRI) {
     new_vect_tri = (VECT_TRI_STRUC *) mem_alloc (sizeof (VECT_TRI_STRUC));
     pfp_convert_tri_to_vect (*z_bucket_ptr, new_vect_tri);
     new_vect_tri-> next_tri = *z_active_list;
     *z_active_list = new_vect_tri;
     z_bucket_back_ptr = *z_bucket_ptr;
     *z_bucket_ptr = (*z_bucket_ptr)-> next_input_tri;
     mem_free (z_bucket_back_ptr,sizeof(INPUT_TRI_STRUC));
     };

   *list_head = NULL_INPUT_TRI;

} /* pfp_update_z_active_list */
```

```
/****************************************************************************
   exported procedure

   pfp_process_z_active_list



****************************************************************************/

void pfp_process_z_active_list (z_active_list, z_value, seg_list)

   VECT_TRI_STRUC **z_active_list;
   UINT16         z_value;
   OUT_SEG_STRUC  **seg_list;
{
   VECT_TRI_STRUC *tri_list_ptr, *tri_back_ptr;
   OUT_SEG_STRUC  *seg_ptr;
   VECT_TRI_STRUC list_head;

   z_value++;

   list_head.next_tri = *z_active_list;
   tri_list_ptr = *z_active_list;
   tri_back_ptr = &list_head;

   while (tri_list_ptr != NULL_VECT_TRI)
      {
      if (tri_list_ptr->vert2_z == z_value)
         {
         tri_back_ptr->next_tri = tri_list_ptr->next_tri;
         mem_free (tri_list_ptr,sizeof(VECT_TRI_STRUC));
         tri_list_ptr = tri_back_ptr->next_tri;
         }
      else
         {
         seg_ptr = (OUT_SEG_STRUC *) mem_alloc(sizeof(OUT_SEG_STRUC));
         pfp_get_intersection_segment (tri_list_ptr, z_value, &seg_ptr);
         seg_ptr-> next_seg = *seg_list;
         *seg_list = seg_ptr;
         tri_list_ptr = tri_list_ptr-> next_tri;
         tri_back_ptr = tri_back_ptr-> next_tri;
         }
      }

   *z_active_list = list_head .next_tri;

} /* pfp_process_z_active_list */
```

```
PRTUTL.C    - Page 1 -                          4/15/1989   5:54 PM

/*********************************************************************************
 *                          3D Systems Slice Program
 *                    Copyright (C) 1988 3D Systems Inc.
 *
 *  PRTUTL.C  -  Debugging Print Routines
 *
 *                                 MODIFICATION LOG
 *-------------------------------------------------------------------------------
 * date        who                what
 *-------------------------------------------------------------------------------
 *            :                  :
 *            :                  :
 ********************************************************************************/


#include <stdio.h>
#include "pfp.h"
#include "pfptri.h"
#include "pfpseg.h"
#include "pfphtch.h"
#include "pfpcure.h"


void print_cure_hash_point(out_file,hash_point)
  FILE             *out_file;
  CURE_HASH_STRUC *hash_point;
  {
  fprintf(out_file,"Cure Hash Point %lu\n",hash_point);
  if (hash_point!=NULL_CURE_HASH) {
    fprintf(out_file,"X = %u\n",hash_point->x);
    fprintf(out_file,"Y = %u\n",hash_point->y);
    fprintf(out_file,"Segment Pointer = %lu\n",hash_point->seg_ptr);
    fprintf(out_file,"Last Pointer    = %lu\n",hash_point->last_hash);
    fprintf(out_file,"Next Pointer    = %lu\n\n",hash_point->next_hash);
    }
  fflush(out_file);
  };


void print_cure_hash(out_file,hash_list,hash_index)
  FILE            *out_file;
  CURE_HASH_STRUC *hash_list;
  UINT16           hash_index;
  {
  fprintf(out_file,"\n\n\nCure Hash Index %u:\n",hash_index);
  while (hash_list!=NULL_CURE_HASH) {
    print_cure_hash_point(out_file,hash_list);
    hash_list=hash_list->next_hash;
    };
  };


void print_hatch_point(out_file,point)
  FILE              *out_file;
  HATCH_POINT_STRUC *point;
  {
  if (point == NULL_HATCH_POINT) fprintf(out_file,"\nHatch Point NULL\n");
  else {
    fprintf(out_file,"\nHatch Point %u %u\n",point->x_val,point->y_val);
```

```
    fprintf(out_file, "angle %d enter_flag %d triangle [illegible]point->an
    fprintf(out_file, "next_point %lu\n",point->next_point);
    };
  fflush(out_file);
  };


void print_hatch_list(out_file,point_ptr)
  FILE               *out_file;
  HATCH_POINT_STRUC *point_ptr;
  {
  fprintf(out_file,"----------- BEGIN HATCH POINT LIST -----------\n");
  while (point_ptr != (HATCH_POINT_STRUC *) NULL) {
    print_hatch_point(out_file,point_ptr);
    point_ptr = point_ptr->next_point;
    };
  fprintf(out_file,"------------ END HATCH POINT LIST ------------\n");
  };

[illegible]
  [illegible]          *out_file;
  [illegible]
  {
  [illegible]
  fprintf (out_file, "NORMAL_X_POSITIVE = %s
          norm & NORMAL_X_POSITIVE ? "True " : "False");
  fprintf (out_file, "NORMAL_X_NEGATIVE = %s\n",
          norm & NORMAL_X_NEGATIVE ? "True " : "False");
  fprintf (out_file, "NORMAL_Y_POSITIVE = %s     ",
          norm & NORMAL_Y_POSITIVE ? "True " : "False");
  fprintf (out_file, "NORMAL_Y_NEGATIVE = %s\n",
          norm & NORMAL_Y_NEGATIVE ? "True " : "False");
  fprintf (out_file, "NORMAL_Z_POSITIVE = %s     ",
          norm & NORMAL_Z_POSITIVE ? "True " : "False");
  fprintf (out_file, "NORMAL_Z_NEGATIVE = %s\n",
          norm & NORMAL_Z_NEGATIVE ? "True " : "False");
  fprintf (out_file, "SPARE1              = %s     ",
          norm & SPARE1 ? "True " : "False");
  fprintf (out_file, "SPARE2              = %s     ",
          norm & SPARE2 ? "True " : "False");
  fprintf (out_file, "\n");
  };

void print_segment (out_file, seg)

   FILE           *out_file;
   OUT_SEG_STRUC *seg;

{

   fprintf (out_file, "\n Segment\n");
   fprintf (out_file, " x1 = %u  y1 = %u \n", seg->x_1, seg->y_1);
   fprintf (out_file, " x2 = %u  y2 = %u \n", seg->x_2, seg->y_2);
   print_normal_info(out_file,seg->normal_info);

   fprintf (out_file, " next ptr = %lu \n", seg->next_seg);
   fflush(out_file);

} /* print_segment */
```

```
?RTUTIL.C   - Page 7 -                      [illegible]   [illegible]

void print_seg_list (out_file, seg_list)

   FILE           *out_file;
   OUT_SEG_STRUC  *seg_list;

{
   OUT_SEG_STRUC  *seg_ptr;
   UINT16         list_length = 0;


   seg_ptr = seg_list;
   while (seg_ptr != NULL_SEG)
      {
       list_length++;
       seg_ptr = seg_ptr-> next_seg;
      }

   fprintf (out_file, [illegible] segment list [illegible]);
   fprintf (out_file, [illegible] list length = [illegible] list_length);
   fprintf (out_file, [illegible]);

   seg_ptr = seg_list;

   while (seg_ptr != NULL_SEG)
      {
       print_segment (out_file, seg_ptr);
       seg_ptr = seg_ptr-> next_seg;
      }
} /* print_seg_list */


void print_seg_bucket_array (out_file, seg_bucket_array)

   FILE           *out_file;
   OUT_SEG_STR[illegible]

{
   OUT_SEG_STRUC  *seg_ptr;
   UINT16         i;


   fprintf (out_file, "\n Z Segment Bucket Structure:\n");

   for (i = 0; i < MAX_Z_INDEX; i++) {
       seg_ptr = seg_bucket_array [i];
       if (seg_ptr != NULL_SEG)
          fprintf (out_file, "\n\n Z Bucket Index = %d \n", i);
       while (seg_ptr != NULL_SEG) {
            print_segment (out_file, seg_ptr);
            seg_ptr = seg_ptr-> next_seg;
            }
      }

} /* print_seg_bucket_array */
```

```
void print_input_tri (out_file, tri)

   FILE             *out_file;
   INPUT_TRI_STRUC *tri;

{
   fprintf (out_file, " (x,y,z) = %f %f %f \n", tri-> x1, tri-> y1, tri-> z1);
   fprintf (out_file, " (x,y,z) = %f %f %f \n", tri-> x2, tri-> y2, tri-> z2);
   fprintf (out_file, " (x,y,z) = %f %f %f \n", tri-> x3, tri-> y3, tri-> z3);
   print_normal_info(out_file,tri->normal_info);

} /* print_input_tri */


in_box (tri_ptr)

   [illegible]

{
   [illegible]
                                     [illegible]
                                     [illegible]

      [illegible]                    [illegible]
                                     [illegible] = 3000))

      [illegible]
         (tri_ptr-> [illegible] 20000) && (tri_ptr-> [illegible] 15000)
         (tri_ptr-> [illegible] 20000) && (tri_ptr-> [illegible] 15000))
         (tri_ptr-> x3 [illegible] 20000) && (tri_ptr-> [illegible] 15000

      }
      if (
          (tri_ptr-> [illegible] 55000) && (tri_ptr-> [illegible] 48000
          (tri_ptr-> [illegible] 55000) && (tri_ptr-> [illegible] 48000) [illegible]
          (tri_ptr-> x3 [illegible] 55000) && (tri_ptr-> x3 [illegible] 48000))

         return [illegible];
      }
    }
  }
  return (0);

} /* in_box */


void print_tri_list (out_file,tri_list)

  FILE             *out_file;
  INPUT_TRI_STRUC *tri_list;

{
   INPUT_TRI_STRUC *tri_ptr;
   UINT16           list_length = 0;

   tri_ptr = tri_list;
   while (tri_ptr != NULL_INPUT_TRI)
```

```
      {
       list_length++;
       tri_ptr = tri_ptr-> next_input_tri;
      }

    fprintf (out_file, "\n list length = %d ", list_length);
    fprintf (out_file, "\n list = \n");

   tri_ptr = tri_list;
   while (tri_ptr != NULL_INPUT_TRI) {
 /*if (in_box (tri_ptr)) */
     print_input_tri (out_file, tri_ptr);
     tri_ptr = tri_ptr-> next_input_tri;
     }

  /* print_tri_list */




void print_tri_bucket_array (out_file, z_bucket_array)

    FILE             *out_file;
   INPUT_TRI_STRUC **z_bucket_array;


   INPUT_TRI_STRUC *tri_ptr;
   INT16            i;


   fprintf (out_file, "\n Tri Bucket Array: \n");

   for (i = 0; i < MAX_Z_INDEX; i++)

       tri_ptr = z_bucket_array [i];
       if (tri_ptr != NULL_INPUT_TRI)
          fprintf (out_file, "\n Z Bucket Index = %d \n", i);
       while (tri_ptr != NULL_INPUT_TRI)
          {
          print_input_tri (out_file, tri_ptr);
          tri_ptr = tri_ptr-> next_input_tri;
          }
      }

  /* print_tri_bucket_array */




void print_vect_tri (out_file, vect_tri)

   FILE            *out_file;
   VECT_TRI_STRUC  *vect_tri;

{
   fprintf (out_file, " vector 1:\n");
   fprintf (out_file, "     x = %f   y = %f   x_incr = %f   y_incr = %f\n",
                      vect_tri-> vector_1 .x,
                      vect_tri-> vector_1 .y,
```

```
                        vect_tri->vector_1 .x_incr,
                        vect_tri->vector_1 .y_incr);

    fprintf (out_file, "vector 2:\n");
    fprintf (out_file, "   x = %f   y = %f   x_incr = %f   y_incr = %f\n",
                        vect_tri->vector_2 .x,
                        vect_tri->vector_2 .y,
                        vect_tri->vector_2 .x_incr,
                        vect_tri->vector_2 .y_incr);

    fprintf (out_file,
```

```
{=========================================================================
   3D Systems Stereolithography System Software
 =========================================================================

   POWER.PAS
   SLA-1 Power Control Program

 -------------------------------------------------------------------------

   Recent History:
   11/12/87  Ver 2.30  first Beta software release
    1/09/88  Ver 2.50  retitled program
    1/25/88  Ver 2.60  better messages
    2/08/88  -         converted from Turbo Basic to Turbo Pascal Version 4.0
                       better Laser Board I/O
                       power status line display
                       support of toggling-Laser power
    2/26/88  Ver 2.62  fix for toggling Laser power
   [illegible]
   [illegible]

 -------------------------------------------------------------------------}

uses Crt,Dos;

const
  VersionId = [illegible];
  LaserBoardAddress = $300;
  PowerPort      = $304;
  _INIT_OUT      = $01;  { outputs }
  _ZSTAGE_OUT    = $02;
  _SHUTTER_OUT   = $04;
  _LASER_OUT     = $08;
  _INIT_IN       = $10;  { inputs }
  _DOOR_IN       = $20;
  _SHUTTER_IN    = $40;
  _LASER_IN      = $80;
  Indent = 22;
  LASERVECTOR  = $64;
  STEREOVECTOR = $65;
  HomeDirectory = 'C:\3DSYS\';
  FixFileName   = 'FIX.DAT';
  ParamFileName = 'POWER.PRM';
  ErrorFileName = 'C:\SYSTEM.ERR';
  CtrlC = ^C;

type
  str4 = string[4];
  str16 = string[16];
  LaserPowerType = (_Unknown,_Level,_Toggle);
  OnOffType = (On,Off);

var
  key: Char;
  regs: Registers;
  LaserVersion,StereoVersion: str4;
  ParamFile,ErrorFile,FixFile: Text;
  temp,IndentStr,FixFileLine,ParamFileLine: String;
  LaserOff,ShowStuff: Boolean;
  QSize: LongInt;
```

```
  i,IOerr: Integer;
  LaserPower: LaserPowerType;

{
   Cursor on / off routines
}

function HexByte(num:Byte):str4;
const
   HexChars: str16= '0123456789ABCDEF';
begin
   HexByte := HexChars[num shr 4 + 1] + HexChars[num and $0F +1];
end;

procedure CursorOff;
begin
  with regs do begin
    AH := 3;
    BH := 0;
    Intr($10,regs);
    AH := 1;
    CH := CH or $20;
    Intr($10,regs);
  end;
end;

procedure CursorOn;
begin
  with regs do begin
    AH := 3;
    BH := 0;
    Intr($10,regs);
    AH := 1;
    CH := CH and $DF;
    Intr($10,regs);
  end;
end;

procedure beep;
begin
  sound(1000);
  delay(500);
  NoSound;
end;

{
  Show error and store it on disk
}
procedure SystemError(Text: string);
begin
  writeln('ERROR: '+Text);
  beep;
  assign(ErrorFile,ErrorFileName);
  rewrite(ErrorFile);
  writeln(ErrorFIle,'POWER: '+Text);
  close(ErrorFile);
end;

{
  Describe Error to Operator
```

```
}
procedure PrintError(Text: String);
begin
  if whereX>1 then writeln;
  writeln('*** ',Text);
end;

function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
[illegible]
  [illegible]
  i: Integer;
begin
  temp := [illegible];
  [illegible]
  [illegible] := temp;
end;

procedure centerln(text: String);
begin
  gotoxy((79-length(text)) div 2,whereY);
  writeln(text);
end;

function IntStr(num: Integer): string;
var
  temp: string;
begin
  [illegible] then str(num,temp) else Str([illegible]),temp);
  IntStr := temp;
end;

procedure Abort;
var
  key: Char;
begin
  while keypressed do key := ReadKey;
  CursorOn;
  halt(127);
end;

procedure HandleKeyboardRequest;
begin
  while keypressed do begin
    key := ReadKey;
    if key = CtrlC then Abort;
    if (key = #0) and keypressed then
      key := ReadKey;
  end;
end;
```

```
POWER.PAS    - Page 4 -                           4/15/1988   5:43 pm

procedure DrawBox(x1,y1,x2,y2: integer;BoxType: integer);
type
  BoxMode = array[1..4] of Char;
{
    Box Types:
      1:  Single Line all around
      2:  Double Line all around
      3:  Single Line horizontal, Double Line vertical
      4:  Double Line horizontal, Single Line vertical
}
  const
                        {  Type        1     2     3     4     }
    UpperLeftCorner : BoxMode = (#218,#201,#214,#213);
    UpperRightCorner: BoxMode = (#191,#187,#183,#184);
    LowerLeftCorner : BoxMode = (#192,#200,#211,#212);
    LowerRightCorner: BoxMode = (#217,#188,#189,#190);
    HorzBar         : BoxMode = (#196,#205,#196,#205);
    VertBar         : BoxMode = (#179,#186,#186,#179);
var
  i: integer;
  FullHorzBar: String
begin
  gotoxy(x1,y1);
  if x1<x2 then FullHorzBar := Many(HorzBar[BoxType], x2-x1)
    else FullHorzBar := '';
  if x1<>x2 then write(UpperLeftCorner[boxType]);
  write(FullHorzBar);
  if x1<>x2 then write(UpperRightCorner[BoxType]);
  for i:=y1+1 to y2-1 do begin
    gotoxy(x1,i);
    write(VertBar[BoxType]);
    gotoxy(x2,i);
    write(VertBar[BoxType]);
  end;
  gotoxy(x1,y2);
  if x1<>x2 then write(LowerLeftCorner[BoxType]);
  write(FullHorzBar);
  if x1<>x2 then write(LowerRightCorner[BoxType]);
end;

{$i lctrl.inc}

procedure ShowPowerStatus;
begin
  gotoxy(12,24);
  case LaserPower of
    _Unknown: write('U');
    _Level  : write('L');
    _Toggle : write('T');
  end;
  write('-Laser ');
  if port[PowerPort + 2] and _LASER_IN   = 0 then write('On  ')
    else write('Off');
  write('   Shutter ');
  if port[PowerPort + 2] and _SHUTTER_IN = 0 then write('Open   ')
    else write('Closed');
  write('   Door ');
  if port[PowerPort + 2] and _DOOR_IN    = 0 then write('Open   ')
    else write('Closed');
  write('   Elevator ');
```

```
POWER.PAS    - Page 5 -                    4/15/1988   5:43 PM

  if port[PowerPort + 2] and _ZSTAGE_OUT = 0 then write('Off')
    else write('On ');
end;

procedure SendLaserCommand(cmd: String);
begin
  ShowError(STEREO(cmd));
end;

procedure PowerControl(bit: Integer;Op: OnOffType);
begin
  if Op = On then
    port[PowerPort + 2] := port[PowerPort + 2] or bit
  else
    port[PowerPort + 2] := port[PowerPort + 2] and ($FF-bit);
end;

procedure ToggleLaserPowerOn;
var
  loop1: LongInt;
begin
  PowerControl(_LASER_OUT,On);
  loop1 := 0;
  repeat
    inc(loop1);
  until (port[PowerPort + 2] and _LASER_IN = 0) or (loop1 > 100000);
  PowerControl(_LASER_OUT,Off);
  if (loop1 > 100000) then
    PrintError('Can 't detect laser toggle feedback.');
end;

procedure ToggleLaserPowerOff;
var
  loop1: LongInt;
begin
  PowerControl(_LASER_OUT,On);
  loop1 := 0;
  repeat
    inc(loop1);
  until (port[PowerPort + 2] and _LASER_IN > 0) or (loop1 > 100000);
  PowerControl(_LASER_OUT,Off);
  if (loop1 > 100000) then
    PrintError('Can 't detect laser toggle feedback.');
end;

procedure TurnOnLaser;
var
  loop: LongInt;
begin
  if LaserPower = _Toggle then begin
    if port[PowerPort + 2] and _LASER_IN > 0 then ToggleLaserPowerOn;
  end else PowerControl(_LASER_OUT,On);
  if LaserPresent and StereoPresent then begin
    SendLaserCommand('HR;CL;MD BL +');
    assign(FixFile,FixFileName);
    {$I-}
    reset(FixFile);
    IOerr := IOresult;
    if IOerr <> 0 then begin
      assign(FixFile,HomeDirectory + FixFileName);
```

```
      reset(FixFile);
      IOerr := IOresult;
    end;
    {$I+}
    if IOerr = 0 then begin
      while not eof(FixFile) do begin
        readln(FixFile,FixFileLine);
        if (FixFileLine <> '') and (FixFileLine[1] <> '!') then
          SendLaserCommand(FixFileLine);
      end;
      close(FixFile);
    end;
  end;
end;

procedure TurnOnElevator;
begin
  PowerControl(_ZSTAGE_OUT,On);
end;

procedure OpenShutter;
begin
  PowerControl(_SHUTTER_OUT,On);
end;

procedure TurnOffLaser;
begin
  gotoxy(1?,17);
  write('--- WARNING ---');
  gotoxy(18,20);
  write('The laser may take half an hour to restart');
  gotoxy(1?,1?);
  write('Are you sure you want to turn the laser off? [illegible]');
  repeat
    ShowPowerStatus;
  until keypressed;
  HandleKeyboardRequest;
  if upcase(key)='Y' then
    if LaserPower = _Toggle then begin
      if port[PowerPort + 2] and _LASER_IN = 0 then ToggleLaserPowerOff;
    end else PowerControl(_LASER_OUT,Off);
end;

procedure TurnOffElevator;
begin
  PowerControl(_ZSTAGE_OUT,Off);
end;

procedure CloseShutter;
begin
  PowerControl(_SHUTTER_OUT,Off);
end;

procedure GetSelection;
begin
  repeat
    repeat
      ShowPowerStatus;
    until keypressed;
    HandleKeyboardRequest;
```

```
    Key := upcase(Key);
    if Key in ['1'..'6','X'] then exit;
  until false;
end;

procedure ShowPowerMenu;
begin
  window(1,1,80,21);
  ClrScr;
  centerln('POWER, SLA-1 Power Control Program');
  centerln('Version '+VersionId);
  centerln('Copyright (C) 1988 by 3D Systems, Inc.');
  centerln('3D Systems Laser Stereolithography System');
  for i:=1 to 5 do writeln;
  DrawBox(Indent-1,8,80-Indent,16,1);
  window(Indent,9,80-Indent-1,15);
  ClrScr;
  writeln(' 1. Turn Laser and Mirror Drive On');
  writeln(' 2. Turn Elevator On');
  writeln(' 3. Open Shutter');
  writeln(' 4. Turn Laser and Mirror Drive Off');
  writeln(' 5. Turn Elevator Off');
  writeln(' 6. Close Shutter');
  write(' X. Exit');
  window(1,1,80,25);
  gotoxy(28,19);
  write('Please make a selection.');
  DrawBox(10,23,69,27,1);
end;

procedure HardReset;
begin
  port[PowerPort + 3] := $98;     { init 8255 chip }
  port[PowerPort + 3] := $98;
end;

procedure InitPowerPort;
begin
  PowerControl(1,Off);
  if port[PowerPort + 2] and _INIT_IN > 0 then HardReset
  else begin
    PowerControl(1,On);
    if port[PowerPort + 2] and _INIT_IN = 0 then HardReset;
  end;
end;

procedure ReadParams;
begin
  assign(ParamFile,ParamFileName);
  {$I-}
  reset(ParamFile);
  IOerr := IOresult;
  if IOerr <> 0 then begin
    assign(ParamFile,HomeDirectory + ParamFileName);
    reset(ParamFile);
    IOerr := IOresult;
  end;
  {$I+}
  LaserPower := _Unknown;
  if IOerr = 0 then begin
```

```
POWER.PAS   - Page 8 -                     4/15/1988   5:40 PM

    while not eof(ParamFile) do begin
      readln(ParamFile,ParamFileLine);
      ParamFileLine := upper(ParamFileLine);
      if (ParamFileLine <> '') and (ParamFileLine[1] <> '!') then begin
        if copy(ParamFileLine,1,15) = 'LASERPOWERTYPE=' then begin
          temp := copy(ParamFileLine,16,3);
          if temp = 'LEV' then LaserPower := _Level
          else if temp = 'TOG' then LaserPower := _Toggle;
        end;
      end;
    end;
    close(ParamFile);
  end;
end;

begin
  CheckBreak := false;
  ShowStuff  := false;
  LaserOff   := false;
  ClrScr;
  InitPowerPort;
  IndentStr := many(' ',Indent);
  ReadParams;
  CursorOff;
  repeat
    ShowPowerMenu;
    GetSelection;
    gotoxy(1,22);
    ClrEol;
    case key of
      '1': TurnOnLaser;
      '2': TurnOnElevator;
      '3': OpenShutter;
      '4': TurnOffLaser;
      '5': TurnOffElevator;
      '6': CloseShutter;
      'X': Abort;
    end;
  until false;
end.
```

```
PREPARE.BAS   - Page 1 -              4/15/1988   5:45 PM

==============================================================================
  3D Systems Stereolithography System Software
==============================================================================

  PREPARE.BAS
  SLA-1 Prepare for Part-Making Software

------------------------------------------------------------------------------

  History:
  11/12/87  Ver 2.30  first Beta software release
  11/13/87  Ver 2.31  new material data input fix
                      range manager and CalcSp fixes
  12/02/87  Ver 2.32  removed Material Input capability
  12/04/87  Ver 2.33  programmable block updating
                      BLOCK.ID file support
  12/14/87  Ver 2.40  Material linewidths (min & max) support
  12/17/87  Ver 2.41  no last material file condition handled
  [illegible]
  [illegible]
  [illegible]
  [illegible]
  [illegible]
                      support [illegible] *.R Range Control File
                      added [illegible]
  [illegible]
                      new vector manager (old Layer Edit)
                      Range File and Layer File command update separated out
                      PREPARE.PRM support
                      different CS (Step Size) support for skins
                      part file statistics
  [illegible]         old range files identified
                      operator [illegible] proceed to build new range file
  2/08/88  -          different layer block type bug removed
  [illegible]         [illegible] array indexing starts at 1 not 0
                      added Block [illegible] will wipe out commands warning query
  [illegible]         default UpdateCmds group is not 1 instead of 0
  [illegible]/88 Ver 2.80  added copyright notice
  [illegible] Ver 3.00  menu changes
  4/04/88   Ver 3.01  Parameter Manager code installed
                      removed *.V file editing capability
  4/09/88   Ver 3.02  SUPER renamed as BUILD
  4/11/88   Ver 3.03  allow first and last layers to be deleted if
                      other ranges exist
  4/12/88   Ver 3.04  additional prompts to Parameter Manager
                      correct open file error in Parameter Manager
  4/15/88   Ver 3.05  store last part file name in PART.LST file

------------------------------------------------------------------------------

DIM ZStart&[100],ZEnd&[100],ZSpace%[100],CureDepth%[100]
DIM BlockStart%[100],BlockEnd%[100]
DIM BlockType$[3000],BlockCmd$[3000]
DIM TBType$[30],TBCmd$[30]
DIM SP[20],LH[20],WMIN[20],WMAX[20]
DIM BlockGroupCount%[10],BlockGroupId$[10,40]
DIM Comments$[100]
DIM Offsets&[50,2]

MaxInt = 32768
```

```
  MaxUInt = 65535
  TRUE = -1
  FALSE = 0
  ScanFlag% = FALSE
  VersionId$ = "3.05"
  Title$ = "Prepare V" + VersionId$
  HomeDir$ = "C:\3DSYS\"
  ParamFileName$        = "PREPARE.PRM"
  BuildParamFileName$ = "BUILD.PRM"
  TempParamFileName$  = "TEMP.PRM"
  LastPartFileName$   = "PART.LST"

  ON ERROR GOTO TryHome
  OPEN ParamFileName$ FOR INPUT AS #1
  GOTO ReadParams
TryHome:
  RESUME TryHome2
TryHome2:
  ON ERROR GOTO NoParams
  OPEN HomeDir$ + ParamFileName$ FOR INPUT AS #1
  GOTO ReadParams
NoParams:
  NormStepSize$ = "25 1"
  FillStepSize$ = "25 15"
  RESUME PrepareInit


  ' read PREPARE's parameter file
  '
ReadParams:
  LINE INPUT #1,A$
  IF LEN(A$)=0 OR LEFT$(A$,1)="!" THEN ReadParams
  I% = INSTR(2,A$,CHR$(34))
  IF I% > 0 THEN A$ = LEFT$(A$,I%)
  InpLine$ = FN NoQuotes$(A$)
  GOSUB CheckForOptions
  FOR I%=1 TO 2     ' change this when altering PREPARE.PRM format
ReadNextLine:
    LINE INPUT #1,A$
    IF LEN(A$)=0 OR LEFT$(A$,1)="!" THEN ReadNextLine
    V=VAL(A$)
    V$ = LEFT$(A$,1)
    IF V$=CHR$(34) THEN
      V% = INSTR(MID$(A$,2),CHR$(34)) + 1
      S$ = MID$(A$,2,V%-2)
    ELSE
      S$ = ""
    END IF
    IF       I%=1 THEN NormStepSize$ = S$_
    ELSE IF I%=2 THEN FillStepSize$ = S$
  NEXT I%
  CLOSE #1

PrepareInit:
  SingleBar$ = STRING$(45,196)
  RangeBar$ = ""
  FOR I%=1 TO 8
    READ S%
    IF I%>1 THEN RangeBar$ = RangeBar$ + CHR$(249)
    RangeBar$ = RangeBar$ + STRING$(S%,196)
```

```
PREPARE.BAS    - Page 3 -                    4/13/1988    3:43 PM

  NEXT I%
  DATA 7,9,7,9,11,11,11,7
  BlockBar$ = ""
  FOR I%=1 TO 8
    READ S%
    IF I%>1 THEN BlockBar$ = BlockBar$ + CHR$(249)
    BlockBar$ = BlockBar$ + STRING$(S%,196)
  NEXT I%
  DATA 8,10,50
  LayerBar$ = ""
  FOR I%=1 TO 5
    READ S%
    IF I%>1 THEN LayerBar$ = LayerBar$ + CHR$(249)
    LayerBar$ = LayerBar$ + STRING$(S%,196)
  NEXT I%
  DATA 7,9,7,9,7
  SpBar$ = "
  FOR I%=1 TO 8
    READ S%
    IF I%>1 THEN SpBar$ = SpBar$ + CHR$(249)
    SpBar$ = SpBar$ + STRING$(S%,196)
  NEXT I%
  DATA 7,9,7,9,7,6,7,[illegible]
  PowerFile$          = "POWER.LST"
  LastMaterialFile$   = "MATERIAL.LST"
  BlockIdFileName$    = "BLOCK.ID"
  MinSp& = 8
  MaxSp& = 4000

  COLOR 15
Restart:
  CLS
  PRINT SingleBar$
  PRINT "  PREPARE, Part-Making Preparer"
  PRINT "  Version ";VersionId$
  PRINT "  Copyright (C) 1988 by 3D Systems, Inc."
  PRINT "  3D Systems Laser Stereolithography System"
  PRINT SingleBar$
  PRINT
  PRINT

  BlockGroups% = 0
  ON ERROR GOTO TryHome3
  OPEN BlockIdFileName$ FOR INPUT AS #1
  GOTO ReadBlockId
TryHome3:
  ON ERROR GOTO NoBlockIdFile
  OPEN "C:\3DSYS\"+BlockIdFileName$ FOR INPUT AS #1
  RESUME ReadBlockId
ReadBlockId:
  ON ERROR GOTO 0
  IF EOF(1) THEN ProcessCmdLine
  LINE INPUT #1,A$
  IF LEN(A$)=0 OR LEFT$(A$,1)="!" THEN ReadBlockId
  Index% = 1
  CALL UnitValShortInt(Group%,A$,Index%)
  CALL UnitStr(Block$,A$,Index%)
  IF Group%<0 OR Group%>10 THEN
    CALL SystemError("Invalid block group number in Block Id File "_
      +BlockIdFileName$)
```

```
PREPARE.BAS    - Page 4 -                              4/15/1988    5:45 PM

    END
  END IF
  IF Group% > BlockGroups% THEN BlockGroups% = Group%
  BlockGroupId$[Group%,BlockGroupCount%[Group%]] = UCASE$(Block$)
  INCR BlockGroupCount%[Group%]
  GOTO ReadBlockId

ProcessCmdLine:
  CLOSE #1
  CmdLine$ = UCASE$(Command$)
  GOSUB CheckForOptions
  IF LEN(CmdLine$)=0 THEN
    PRINT "Part files in this directory:"
    ON ERROR GOTO NoPartFiles
    FILES "*.V"
    GOTO AskForPartFile
NoPartFiles:
    PRINT "- none -"
    RESUME AskForPartFile
AskForPartFile:
    PRINT
    INPUT "Part name: ",CmdLine$
    PRINT
  END IF
  CmdLine$ = UCASE$(CmdLine$)
  GOSUB CheckForOptions
  I% = INSTR(CmdLine$,".")
  IF I%>0 THEN
    PartName$ = LEFT$(CmdLine$,I%-1)
  ELSE
    PartName$ = CmdLine$
  END IF
  IF LEN(PartName$)=0 THEN END
  OPEN LastPartFileName$ FOR OUTPUT AS #1
  PRINT #1,PartName$
  CLOSE #1
  GOTO StartPrepare

CheckForOptions:
  I% = INSTR(CmdLine$,"/SCAN")
  IF I%>0 THEN
    ForcedScan% = TRUE
    CmdLine$ = LEFT$(CmdLine$,I%-1)+MID$(CmdLine$,I%+5)
  END IF
  RETURN

'----------------------------------------------------------------------------

StartPrepare:
  PartRangeFileName$  = PartName$ + ".R"
  PartLayerFileName$  = PartName$ + ".L"
  BackupFileName$ = PartName$ + ".BAK"
  ON ERROR GOTO NewPart
  OPEN PartRangeFileName$ FOR INPUT AS #10
  ON ERROR GOTO 0
  I% = 0
CheckOld:
  IF EOF(10) THEN HaveOldRangeFile
  LINE INPUT #10,L$
  L1$ = UCASE$(LEFT$(L$,1))
```

```
PREPARE.BAS    - Page 5 -                    4/15/1990   [illegible]

  IF L1$="" OR L1$="'" OR L1$="*" THEN CheckOld
  IF L1$ >= "A" AND L1$ <= "Z" THEN HaveNewRangeFile
  INCR I%
  IF I% [illegible] THEN CheckOld

HaveOldRangeFile:
  PRINT
  PRINT "File ";PartRangeFileName$;" is an older Range File with a";
  PRINT " different format."
  PRINT "Do you wish to continue and build a new Range File from the L[illegible]
  PRINT "File ";PartLayerFileName$;"? ";
  INPUT "",Q$
  IF UCASE$(LEFT$(Q$,1))="Y" THEN
    PRINT
    GOTO BuildRangeTable
  ELSE
    STOP
  END IF

HaveNewRangeFile:
  [illegible]
  [illegible]
  [illegible]
  [illegible]
  CommentC[illegible] = [illegible]
RangeRead:
  [illegible]
  [illegible] #1[illegible]
  A$=UCASE$(LEFT$(L$,1))
  IF A$="*" THEN
    Index% = 2
    [illegible]
      [illegible]
    [illegible]
    [illegible]
    [illegible]
      [illegible]
    GOTO RangeRead
  END IF
  IF [illegible] THEN
    IF CommentCount% <= 100 THEN
      INCR CommentCount%
      Comments$[CommentCount%] = L$
    END IF
    GOTO RangeRead
  END IF
  RangeIndex% = 1
  IF A$>="0" AND A$<="9" THEN
    INCR I%
    CALL UnitValInt(ZStart&[I%],L$,RangeIndex%)
    CALL UnitValInt(ZEnd&  [I%],L$,RangeIndex%)
    CALL UnitValShortInt(ZSpace%[I%],    L$,RangeIndex%)
    CALL UnitValShortInt(CureDepth%[I%],L$,RangeIndex%)
    BlockStart%[I%] = BlockEnd%
  ELSE
    GotBlocksFromRangeFile% = TRUE
    CALL UnitStr(BlockType$[BlockEnd%],L$,RangeIndex%)
    T$ = FN NoSp$(MID$(L$,RangeIndex%))
    J%=INSTR(T$,"!")
    IF J%=0 THEN J%=LEN(T$)+1
```

```
PREPARE.BAS    - Page 6 -                    4/15/1988   5:45 PM

     BlockCmd$[BlockEnd%] = FN NoSp$(LEFT$(T$,J%-1))
     BlockEnd%[I%] = BlockEnd%
     INCR BlockEnd%
   END IF
   IF NOT EOF(10) THEN RangeRead
   RangeCount% = I%
   CLOSE #10
    backwards (pre V2.55) compatibility
   IF ForcedScan% OR NOT GotBlocksFromRangeFile% THEN GOSUB BlockScan
   GOTO MainMenu

NewPart:
  RESUME BuildRangeTable

BuildRangeTable:
  ON ERROR GOTO NoLayerFile
  OPEN PartLayerFileName$ FOR INPUT AS #3
  ON ERROR GOTO 0
  PRINT "Reading ";PartLayerFileName$;"..."

GetToControlTop:
  IF EOF(3) THEN
    CALL SystemError("Error: "+PartLayerFileName$+" empty.")
    END
  END IF
  LINE INPUT #3,CONTROL$
  C$=LEFT$(CONTROL$,1)
  IF C$="!" THEN GetToControlTop
  IF C$="*" THEN
    Index% = 2
    WHILE MID$(CONTROL$,Index%,1)=" "
      Index% = Index% + 1
    WEND
    CALL UnitVal(SliceRes,CONTROL$,Index%)
    CALL UnitVal(ZSpacing,CONTROL$,Index%)
    CALL UnitVal(Thickness,CONTROL$,Index%)
    GOTO GetToControlTop
  END IF

  RangeCount% = 0
  BlockIndex% = 0
  TBIndex% = 0
  First% = TRUE
  Last%  = FALSE
  GOTO AlreadyHaveBlock

ReadBlocks:
  IF EOF(3) THEN
    Last% = TRUE
    GOTO CompareLayer
  END IF
  LINE INPUT #3,CONTROL$
AlreadyHaveBlock:
  IF LEN(CONTROL$)=0 OR LEFT$(CONTROL$,1)="!" THEN ReadBlocks
'
'  parse out layer number, name, command, and comment
'
  ControlIndex% = 1
  CALL UnitValInt(ControlLayer&,CONTROL$,ControlIndex%)
  CALL UnitStr(ControlType$,CONTROL$,ControlIndex%)
```

```
  T$ = FN NoSp$(MID$(CONTROL$,ControlIndex%))
  I%=INSTR(T$,"!")
  IF I%=0 THEN I%=LEN(T$)+1
  ControlCmd$ = FN NoSp$(LEFT$(T$,I%-1))

'
'   store blocks in temporary array, loop until different layer
'
StoreBlocks:
  IF ControlType$="#CA" THEN ReadBlocks     ' skip critical areas
  IF First% THEN     ' handle first layer
    First% = FALSE
    RangeStep% = ZSpacing
    Layer& = ControlLayer&
    GOSUB StartNewRange
    GOTO StoreBlock
  END IF
  IF ControlLayer& <> Layer& THEN EvaluateLayer
StoreBlock:
  TBType$[TBIndex%] = [illegible]
  TBCmd$[TBIndex%] = ControlCmd$
  INCR TBIndex%
  GOTO ReadBlocks

'
'   start a new layer range if the Z-spacing changes
'
EvaluateLayer:
  IF NeedStep% THEN
    NeedStep% = FALSE
    RangeStep% = ControlLayer& - Layer&
    Zspace%[RangeCount%] = RangeStep%
  END IF
  TwoLayersBack& = OldLayer&
  OldLayer& = Layer&
  Layer& = ControlLayer&
  ZD% = ControlLayer& - OldLayer&
  IF ZD%<>RangeStep% THEN
    GOSUB StartNewRange
    GOTO UpdateRange
  END IF
'
'   compare current layer's block commands against those of current range
'   if there are two different commands for a particular layer,
'     a new layer range must be started
'
CompareLayer:
  FOR I%=0 TO TBIndex%-1   ' check each block of current layer
    FOR J%=BlockStart%[RangeCount%] TO BlockEnd%[RangeCount%]
      IF TBType$[I%]=BlockType$[J%] THEN
        IF TBCmd$[I%]<>BlockCmd$[J%] THEN
          GOSUB StartNewRange
          ZEnd&  [RangeCount%-1] = TwoLayersBack&
          ZStart&[RangeCount%]   = OldLayer&
          ZEnd&  [RangeCount%]   = OldLayer&
          GOTO UpdateRange
        ELSE
          GOTO NextCurrentBlock
        END IF
      END IF
```

```
     NEXT J%
NextCurrentBlock:
   NEXT I%
'
'   layer checks out, add it to current range
'
UpdateRange:
   ZEnd&[RangeCount%] = ControlLayer&
'
'   add any new blocks to current range's block table
'
   FOR I%=0 TO TBIndex%-1    ' check each block of current layer
     FOR J%=BlockStart%[RangeCount%] TO BlockEnd%[RangeCount%]
       IF TBType$[I%]=BlockType$[J%] THEN NextCurrentBlock2
     NEXT J%
     BlockType$[BlockIndex%] = TBType$[I%]
     BlockCmd$[BlockIndex%] = TBCmd$[I%]
     INCR BlockIndex%
NextCurrentBlock2:
   NEXT I%
   BlockEnd%[RangeCount%] = BlockIndex%-1
'
'   set up the new layer
'
   TBIndex% = 0
   IF Last% THEN LayerCleanup
   GOTO StoreBlock


'
'   start a new range of layers
'
StartNewRange:
   NeedStep% = TRUE
   INCR RangeCount%
   ZStart&     [RangeCount%] = ControlLayer&
   ZEnd&       [RangeCount%] = ControlLayer&
   RangeStep% = ControlLayer& - Layer&
   BlockStart%[RangeCount%] = BlockIndex%
   BlockEnd%  [RangeCount%] = BlockIndex%
   TBIndex% = 0
   RETURN

LayerCleanUp:
   CLOSE #3
   FOR I%=1 TO RangeCount%
     CureDepth%[I%] = ZSpace%[I%]
   NEXT I%
   GOTO MainMenu

NoBlockIdFile:
   CALL SystemError("Can't open Block Id File "+BlockIdFileName$)
   END

BadBlockIdFile:
   CALL SystemError("Bad format for Block Id File "+BlockIdFileName$)
   END

NoLayerFile:
   CALL SystemError("Can't open Layer Control File "+PartLayerFileName$)
   END
```

```
NoRangeFile:
  CALL SystemError("Can't open Range File "+PartRangeFileName$)
  END

RangeFileProb:
  CALL SystemError("Problem with Range File "+PartRangeFileName$)
  END

NoBackupFile:
  CALL SystemError("Can't open Backup File "+BackupFileName$)
  END

NoBuildParamFile:
  CALL SystemError("Can't find BUILD Parameter File "+BuildParamFileName$)
  END

'------------------------------------------------------------------------

'   Show PREPARE's Main Menu

MainMenu:
  CLS
  I$ = STRING$(29,
  MainBar$=STRING$(15,CHR$(196))
  T$ = "MAIN MENU"
  GOSUB CenterLine
  T$ = Title$
  GOSUB CenterLine
  T$ = "Working on part "+PartName$
  GOSUB CenterLine
  PRINT
  PRINT
  T$ = MainBar$
  GOSUB CenterLine
  PRINT
  PRINT
  PRINT I$;"1. Parameters Manager"
  PRINT I$;"2. Range Manager"
  PRINT I$;"3. Layer Manager"
  PRINT I$;"4. Statistics"
  PRINT I$;"X. Exit"
  PRINT
  PRINT
  T$ = MainBar$
  GOSUB CenterLine
  PRINT
  PRINT
  PRINT I$;"Which option? ";
LoopMain:
  C$ = UCASE$(INKEY$)
  IF LEN(C$)=0 THEN LoopMain
  IF C$="X" THEN END
  IF C$="1" THEN ParamsManager
  IF C$="2" THEN RangeManager
  IF C$="3" THEN LayerManager
  IF C$="4" THEN Statistics
  GOTO LoopMain
```

```
'===========================================================================
'
'  Parameters Manager:
'

ParamsManager:
  ON ERROR GOTO BuildParamsNotThisDir
  OPEN BuildParamFileName$ FOR INPUT AS #2
  F$ = BuildParamFileName$
  GOTO ReadBuildParamsFile

BuildParamsNotThisDir:
  RESUME TryHome4

TryHome4:
  ON ERROR GOTO NoBuildParamFile
  OPEN HomeDir$ + BuildParamFileName$ FOR INPUT AS #2
  F$ = HomeDir$ + BuildParamFileName$

' Read Builder parameter file

ReadBuildParamsFile:
  LINE INPUT #2,A$
  IF LEN(A$)=0 OR LEFT$(A$,1)=" " THEN ReadBuildParamsFile
  BuildCmdLine$ = FN NoQuotes$(A$)
  FOR I%=1 TO 8   ' change this when altering BUILD.PRM format
NextGenLine:
    LINE INPUT #2,A$
    IF LEN(A$)=0 OR LEFT$(A$,1)=" " THEN NextGenLine
    V=VAL(A$)
    IF      I%=1 THEN ZAddress%        = V_
    ELSE IF I%=2 THEN ZPitch           = V_
    ELSE IF I%=3 THEN XYScale          = V_
    ELSE IF I%=4 THEN GOSUB GetXOffsets  _
    ELSE IF I%=5 THEN GOSUB GetYOffsets  _
    ELSE IF I%=6 THEN MaxVectorCount& = V_
    ELSE IF I%=7 THEN GOSUB GetLowerViewportXY_
    ELSE IF I%=8 THEN GOSUB GetUpperViewportXY
  NEXT I%
  NumOffsets% = NumXOffsets%
  IF NumOffsets% > NumYOffsets% THEN NumOffsets% = NumYOffsets%
  CLOSE #2
  GOTO ShowBuildParams

GetXOffsets:
  NumXOffsets% = 0
GetMoreXOffsets:
  Offsets&[NumXOffsets%,1] = VAL(A$)
  INCR NumXOffsets%
  J% = FN FindStr(1,A$,", ")
  IF J%=LEN(A$)+1 THEN XOffsetRet
  IF MID$(A$,J%,1)=" " THEN XOffsetRet
  A$ = MID$(A$,J%+1,199)
  IF NumXOffsets%<50 THEN GetMoreXOffsets
XOffsetRet:
  RETURN

GetYOffsets:
  NumYOffsets% = 0
```

```
GetMoreYOffsets:
  Offsets&[NumYOffsets%,2] = VAL(A$)
  INCR NumYOffsets%
  J% = FN FindStr(1,A$,", ")
  IF J%=LEN(A$)+1 THEN YOffsetRet
  IF MID$(A$,J%,1)=" " THEN YOffsetRet
  A$ = MID$(A$,J%+1,199)
  IF NumYOffsets% 50 THEN GetMoreYOffsets
YOffsetRet:
  RETURN

GetLowerViewportXY:
  LowerViewPortX& = VAL(A$)
  J% = FN FindStr(1,A$,", ")
  LowerViewPortY& = VAL(MID$(A$,J%+1,99))
  RETURN

GetUpperViewportXY:
  [illegible]
  [illegible]
  [illegible]
  [illegible]

ShowBuildParams:
  CLS
  T$ = [illegible]
  GOSUB CenterLine
  T$ = Title$
  GOSUB CenterLine
  T$ = "Working on part "+PartName$
  GOSUB CenterLine
  PRINT
  T$ = SingleBar$
  GOSUB CenterLine
  PRINT
  [illegible]
  PRINT Indent$;"1. [illegible] . . . . . . . . . . . . . . ";Pitch
  PRINT Indent$;"2. [illegible] . . . . . . . . . . ";INT(YScale*10000)/10000
  PRINT Indent$;"3. Maximum Vector Count . . . . . . . ";MaxVectorCount&
  PRINT Indent$;"4. Minimum Viewport Coordinates . . ";_
    USING "(#####";LowerViewportX&;
  PRINT ",";USING "#####)";LowerViewportY&
  PRINT Indent$;"5. Maximum Viewport Coordinates . . ";_
    USING "(#####";UpperViewportX&;
  PRINT ",";USING "#####)";UpperViewportY&
  PRINT Indent$;"6. Multiple Part Positioning. . . .";
  FOR I%=0 TO NumOffsets% - 1
    IF I% > 0 AND I% MOD 3 = 0 THEN PRINT : PRINT Indent$;STRING$(35," ");
    PRINT USING " (#####";Offsets&[I%,1];
    PRINT ",";USING "#####)";Offsets&[I%,2];
  NEXT I%
  PRINT
  PRINT Indent$;"7. BUILD Options Line:"
  PRINT Indent$;"   ";BuildCmdLine$
  PRINT Indent$;"U. Update BUILD Parameters File on disk"
  PRINT Indent$;"X. Exit"
  PRINT
  T$ = SingleBar$
  GOSUB CenterLine
  PRINT
```

```
LoopParams:
  C$=UCASE$(INKEY$)
  IF LEN(C$)=0 THEN LoopParams
  IF C$="1" THEN EditZPitch
  IF C$="2" THEN EditXYScale
  IF C$="3" THEN EditMaxVectorCount
  IF C$="4" THEN EditLowerViewport
  IF C$="5" THEN EditUpperViewPort
  IF C$="6" THEN EditMultiPartPos
  IF C$="7" THEN EditBuildCmdLine
  IF C$="U" THEN UpdateBuildParamsFile
  IF C$="X" THEN MainMenu
  GOTO LoopParams

EditZPitch:
  INPUT "Enter new Z-Pitch value: ",A$
  IF LEN(A$)>0 THEN ZPitch = VAL(A$)
  GOTO ShowBuildParams

EditXYScale:
  [illegible]
  IF LEN(A$)>0 THEN XYScale = VAL(A$)
  GOTO ShowBuildParams

EditMaxVectorCount:
  INPUT "Enter new Maximum Vector Count: ",A$
  IF LEN(A$)>0 THEN MaxVectorCount& = VAL(A$)
  IF MaxVectorCount& [illegible] 1000 THEN MaxVectorCount& = [illegible]
  IF MaxVectorCount& [illegible] THEN MaxVectorCount& = [illegible]
  GOTO ShowBuildParams

EditLowerViewport:
  LINE INPUT "Enter new Lower Viewport coordinates [illegible]: ",A$
  IF LEN(A$)>0 THEN GOSUB GetLowerViewport[illegible]
  GOTO ShowBuildParams

EditUpperViewPort:
  LINE INPUT "Enter new Upper Viewport coordinates [illegible]: ",A$
  IF LEN(A$)>0 THEN GOSUB GetUpperViewport[illegible]
  GOTO ShowBuildParams

EditMultiPartPos:
  PRINT
  PRINT " If Position exists, it will be deleted."
  PRINT " If Position does not exist, it will be added.";
  LOCATE CSRLIN - 2 , 1
  LINE INPUT "Enter Position to add or remove (x,y): ",A$
  IF LEN(A$)>0 THEN
    X& = VAL(A$)
    J% = FN FindStr(1,A$,", ")
    Y& = VAL(MID$(A$,J%+1,99))
    ' if (X,Y) already present, delete them from list
    FOR I%=0 TO NumOffsets%-1
      IF Offsets&[I%,1] = X& AND Offsets&[I%,2] = Y& THEN
        FOR J%=I% TO NumOffsets%-2
          Offsets&[J%,1] = Offsets&[J%+1,1]
          Offsets&[J%,2] = Offsets&[J%+1,2]
        NEXT J%
        DECR NumOffsets%
        GOTO ShowBuildParams
```

```
      END IF
    NEXT I%
    ' if (X,Y) not present, add them to list
    IF NumOffsets% < 50 THEN
      Offsets&[NumOffsets%,1] = X&
      Offsets&[NumOffsets%,2] = Y&
      INCR NumOffsets%
    END IF
  END IF
  GOTO ShowBuildParams

EditBuildCmdLine:
  PRINT
  PRINT "(Enter a Space to clear)";
  LOCATE CSRLIN - 1 , 1
  LINE INPUT "Enter new BUILD Options: ",A$
  IF LEN(A$)>0 THEN BuildCmdLine$ = A$
  GOTO ShowBuildParams

LocateBuildParamsFile:
  OPEN F$ FOR INPUT AS #2
  OPEN TempParamFileName$ FOR OUTPUT AS #1
GetBuildParamsFileLine:
  LINE INPUT #2,A$
  IF LEN(A$)=0 OR LEFT$(A$,1)="!" THEN
    PRINT #1,A$
    GOTO GetBuildParamsFileLine
  END IF
  PRINT #1,CHR$(34);BuildCmdLine$;CHR$(34)      surround with quotes
  FOR I%=1 TO 8    ' change this when altering BUILD.PRM format
NextBuildParamLine:
    LINE INPUT #2,A$
    IF LEN(A$)=0 OR LEFT$(A$,1)="!" THEN
      PRINT #1,A$
      GOTO NextBuildParamLine
    END IF
    Index% = 1
ScanForNonNumeric:
    C$ = MID$(A$,Index%,1)
    IF (C$ >= "0" AND C$ <= "9") OR C$ = "." OR C$="," THEN
      INCR Index%
      GOTO ScanForNonNumeric
    END IF
    Comment$ = MID$(A$,Index%)
    IF      I%=1 THEN PRINT #1,FN NoSp$(STR$(ZAddress%));_
    ELSE IF I%=2 THEN PRINT #1,FN NoSp$(STR$(INT(ZPitch*10000)/10000));_
    ELSE IF I%=3 THEN PRINT #1,FN NoSp$(STR$(INT(XYScale*10000)/10000));_
    ELSE IF I%=4 THEN GOSUB PrintXOffsets_
    ELSE IF I%=5 THEN GOSUB PrintYOffsets_
    ELSE IF I%=6 THEN PRINT #1,FN NoSp$(STR$(MaxVectorCount&));_
    ELSE IF I%=7 THEN GOSUB PrintLowerViewportXY_
    ELSE IF I%=8 THEN GOSUB PrintUpperViewportXY
    PRINT #1,Comment$
  NEXT I%
  WHILE NOT EOF(2)
    LINE INPUT #2,A$
    PRINT #1,A$
  WEND
  CLOSE #1
  CLOSE #2
```

```
  ' replace BUILD.PRM in current directory
  ' or make BUILD.PRM from \3DSYS\BUILD.PRM Master
  IF F$ = BuildParamFileName$ THEN KILL F$
  NAME TempParamFileName$ AS BuildParamFileName$
  GOTO ShowBuildParams

PrintXOffsets:
  FOR J%=0 TO NumOffsets%-1
    IF J% > 0 THEN PRINT #1,",";
    PRINT #1,FN NoSp$(STR$(Offsets&[J%,1]));
  NEXT J%
  RETURN

PrintYOffsets:
  FOR J%=0 TO NumOffsets%-1
    IF J% > 0 THEN PRINT #1,",";
    PRINT #1,FN NoSp$(STR$(Offsets&[J%,2]));
  NEXT J%
  RETURN

PrintLowerViewportXY:
  PRINT #1,FN NoSp$(STR$(LowerViewportX&));",";_
    FN NoSp$(STR$(LowerViewportY&));
  RETURN

PrintUpperViewportXY:
  PRINT #1,FN NoSp$(STR$(UpperViewportX&));",";_
    FN NoSp$(STR$(UpperViewportY&));
  RETURN


'=============================================================================

' Range Manager:

'  show layer range table
'  - layer range is conditioned on the following:
'    all layers must have the same z-spacing from the last layer
'    they must have the same command strings for each type of block
'  allow comments (stored in first layer only)
'

RangeManager:
  CLS
  IF RangeCount% = 0 THEN
    PRINT "No layer ranges!"
  ELSE
    T$ = "RANGE MANAGER"
    GOSUB CenterLine
    T$ = Title$
    GOSUB CenterLine
    T$ = "working on file "+PartRangeFileName$
    GOSUB CenterLine
    PRINT
    PRINT RangeBar$
    PRINT " Range   Z-Start   Z-End   Z-Space   CAD-Start   CAD-End   CAD-Spac
    PRINT RangeBar$
    FOR I%=1 TO RangeCount%
      PRINT USING " ### ";I%;
      PRINT USING "     ##### ";ZStart&[I%];
      PRINT USING "   #####";ZEnd&[I%];
      .
```

```
      PRINT USING "     ##### ";ZSpace%[I%];
      PRINT USING "   #####.###";ZStart&[I%]/SliceRes;
      PRINT USING "   #####.###";ZEnd&[I%]/SliceRes;
      PRINT USING "   #####.###";ZSpace%[I%]/SliceRes;
      IF ZSpace%[I%]>0 THEN
        Z% = (ZEnd&[I%]-ZStart&[I%])/ZSpace%[I%]
      ELSE
        Z% = 0
      END IF
           PRINT USING "    #####";Z%+1
    NEXT I%
    PRINT RangeBar$
  END IF
  PRINT
  PRINT "   Press:"
  PRINT "    A  add range        D  delete range          E  edit range  "
  PRINT "    V  verify blocks    R  make a report         C  calc SP's   "
  PRINT "    X  exit             S  save changes on disk                 "
LoopRange:
  C$=UCASE$(INKEY$)
  IF LEN(C$)=0 THEN LoopRange
  IF C$="A" THEN AddRange
  IF C$="D" THEN DeleteRange
  IF C$="E" THEN EditRange
  IF C$="V" THEN ScanBlocks
  IF C$="R" THEN MakeReport
  IF C$="C" THEN CalcSp
  IF C$="S" THEN UpdateRangeFile
  IF C$="X" THEN MainMenu
  GOTO LoopRange

 --------------------------------------------------------------------------


AddRange:
  PRINT
  PRINT
  PRINT "Adding Range"
  PRINT "Press Z to Enter Z-Layer or C to enter CAD Number: ";
LoopAdd:
  C$=UCASE$(INKEY$)
  IF LEN(C$)=0 THEN LoopAdd
  PRINT C$
  PRINT "Enter break point, in ";
  IF C$="C" THEN PRINT "CAD"; ELSE PRINT "Z-Layer";
  INPUT " units: ",RangeBreak
  IF LEN(C$)=0 THEN RangeManager
  IF C$="C" THEN
    RangeBreak& = RangeBreak*SliceRes
  ELSE
    RangeBreak& = RangeBreak
  END IF
  IF RangeBreak& <= ZStart&[1] OR RangeBreak& > ZEnd&[RangeCount%]_
    THEN RangeManager
  FOR I%=1 TO RangeCount%
    IF RangeBreak&=ZStart&[I%] THEN RangeManager
    IF RangeBreak&<ZStart&[I%] THEN StartFound
  NEXT I%
 StartFound:
  DECR I%
  ZNew& = ZStart&[I%]
```

```
  DO                                      ' calc new range end
    OldZNew& = ZNew&
    ZNew& = ZNew& + ZSpace%[I%]
  LOOP UNTIL ZNew&>=RangeBreak&
  IF ZNew&<>RangeBreak& THEN RangeManager    ' invalid layer
  FOR J%=RangeCount% TO I% STEP -1
    ZStart&     [J%+1] = ZStart&     [J%]
    ZEnd&       [J%+1] = ZEnd&       [J%]
    ZSpace%     [J%+1] = ZSpace%     [J%]
    CureDepth% [J%+1] = CureDepth% [J%]
    BlockStart%[J%+1] = BlockStart%[J%]
    BlockEnd%  [J%+1] = BlockEnd%  [J%]
  NEXT J%
  INCR RangeCount%
  ZStart&[I%+1] = RangeBreak&
  ZNew& = ZStart&[I%]
  DO                                      ' calc new range end
    OldZNew& = ZNew&
    ZNew& = ZNew& + ZSpace%[I%]
  LOOP UNTIL ZNew&>=RangeBreak&
  ZEnd&[I%] = OldZNew&
  BlockStart%[I%] = BlockIndex%
  FOR J%=BlockStart%[I%+1] TO BlockEnd%[I%+1]
    BlockType$[BlockIndex%] = BlockType$[J%]
    BlockCmd$ [BlockIndex%] = BlockCmd$ [J%]
    INCR BlockIndex%
  NEXT J%

  BlockEnd%  [I%] = BlockIndex%-1
  GOTO RangeManager

-------------------------------------------------------------------------------

DeleteRange:
  IF RangeCount%=1 THEN RangeManager
  PRINT
  PRINT
  INPUT "Delete what range: ",Range%
  IF Range%<1 OR Range%>RangeCount% THEN RangeManager
  IF (Range%=RangeCount%) THEN
    C$="U"
  ELSE
    C$="D"
    IF ZSpace%[Range%] = ZSpace%[Range%-1] AND _
       ZSpace%[Range%] = ZSpace%[Range%+1] THEN
      PRINT "Consolidate with range #";FN NoSp$(STR$(Range%-1));
      PRINT " or #";FN NoSp$(STR$(Range%+1));": ";
      INPUT "",C$
      IF LEFT$(C$,1)="#" THEN C$=MID$(C$,2)
      C% = VAL(C$)
      IF C% = Range%-1 THEN C$="U"_
      ELSE IF C%=Range%+1 THEN C$="D" ELSE RangeManager
    ELSE
      IF ZSpace%[Range%] = ZSpace%[Range%-1] THEN C$="U" ELSE C$="D"
    END IF
  END IF
  I% = Range%
  OldStart& = ZStart&[I%]
  OldEnd& = ZEnd&[I%]
  FOR J%=BlockStart%[I%] TO BlockEnd%[I%]
```

```
PREPARE.BAS    - Page 17 -                4/15/1988   5:45 PM

    BlockType$[BlockIndex%] = "***"     ' deleted
  NEXT J%
  IF Range%<RangeCount% THEN FOR J%=I% TO RangeCount%-1
    ZStart&      [J%] = ZStart&      [J%+1]
    ZEnd&        [J%] = ZEnd&        [J%+1]
    ZSpace%      [J%] = ZSpace%      [J%+1]
    CureDepth%   [J%] = CureDepth%   [J%+1]
    BlockStart%[J%] = BlockStart%[J%+1]
    BlockEnd%   [J%] = BlockEnd%   [J%+1]
  NEXT J%
  DECR RangeCount%
  IF C$="D" THEN
    ZStart&[I%] = OldStart&
  ELSE
    ZEnd&[I%-1] = OldEnd&
  END IF
  GOTO RangeManager

-----------------------------------------------------------------------------------

BlockMode:
  PRINT
  PRINT
  INPUT "[illegible] range";Range%
  IF Range%<1 OR Range%>RangeCount% THEN RangeManager
  BlockBase% = BlockStart%[Range%]
  BlockCount% = BlockEnd%[Range%] - BlockStart%[Range%] + 1
ShowBlocks:
  CLS
  T$ = "[illegible] Blocks"
  GOSUB CenterLine
  T$ = "Working on file "+PartLayerFileName$
  GOSUB CenterLine
  PRINT
  PRINT "     Range #";Range%
  PRINT "    Z-Levels:    ";
  PRINT USING "FROM      ##### TO      ##### BY      #####":_
    ZStart&[Range%],ZEnd&[Range%],ZSpace%[Range%]
  PRINT "    CAD Units:   ";
  PRINT USING "FROM #####.### TO #####.### BY #####.###";_
    ZStart&[Range%]/SliceRes,ZEnd&[Range%]/SliceRes,_
    ZSpace%[Range%]/SliceRes
  PRINT
  PRINT "      Block#    Block Id     Block Command"
  PRINT "    ";BlockBar$
  IF BlockBase%+9 < BlockEnd%[Range%] THEN
    BlockTo% = BlockBase%+9
  ELSE
    BlockTo% = BlockEnd%[Range%]
  END IF
  FOR I%=BlockBase% TO BlockTo%
    PRINT USING "        ##    ";I%-BlockStart%[Range%]+1;
    PRINT "   ";BlockType$[I%];SPC(12-LEN(BlockType$[I%]));
    PRINT BlockCmd$[I%]
  NEXT I%
  PRINT "    ";BlockBar$
  IF BlockBase%+9 < BlockEnd%[Range%] THEN PRINT "    --- MORE BLOCKS ---"
  IF BlockBase% > BlockStart%[Range%] THEN PRINT "    Enter B to go back.";
  IF BlockBase%+9 < BlockEnd%[Range%] THEN PRINT "    Enter F to go forward.";
  PRINT
```

```
  PRINT "   Enter number of block to edit, just Return to stop: ";
  v% = CSRLIN
  h% = POS
BlockAsk:
  LOCATE v%,h%
  PRINT "                 ";
  LOCATE v%,h%
  INPUT "",Block$
  B$ = UCASE$(LEFT$(Block$,1))
  IF B$="B" THEN
    DECR BlockBase%,10
    IF BlockBase% < BlockStart%[Range%] THEN BlockBase% = BlockStart%[Range%]
    GOTO ShowBlocks
  END IF
  IF B$="F" THEN
    IF BlockBase%+10 <= BlockEnd%[Range%] THEN INCR BlockBase%,10
    GOTO ShowBlocks
  END IF
  IF LEN(Block$)=0 THEN RangeManager
  Block% = VAL(Block$)
  IF Block%<1 OR Block%>BlockCount% THEN
    PRINT "   Invalid block number    ";
    GOTO BlockAsk
  END IF
  Index% = BlockStart%[Range%]+Block%-1
  PRINT "   Enter commands for ";BlockType$[Index%];
  LINE INPUT ": ",Cmd$
  IF LEN(FN NoSp$(Cmd$))=0 THEN
    Cmd$ = ""
  ELSE
    IF LEFT$ (Cmd$,1)<>CHR$(34) THEN Cmd$=CHR$(34)+Cmd$
    IF RIGHT$(Cmd$,1)<>CHR$(34) THEN Cmd$=CMD$+CHR$(34)
  END IF
  BlockCmd$[Index%] = UCASE$(Cmd$)
  GOTO ShowBlocks

 ---------------------------------------------------------------------------

ScanBlocks:
  PRINT
  PRINT
  PRINT "Rescanning will wipe out any existing commands.  Continue? ";
  INPUT "",A$
  IF UCASE$(LEFT$(A$,1))="Y" THEN GOSUB BlockScan
  GOTO RangeManager

BlockScan:
  ON ERROR GOTO NoLayerFile
  OPEN PartLayerFileName$ FOR INPUT AS #3
  ON ERROR GOTO 0
  PRINT "Scanning ";PartLayerFileName$;"..."
  BlockIndex% = 0
  IF RangeCount%>0 THEN
    R%=1
    BlockStart%[R%] = BlockIndex%
    BlockEnd%[R%] = BlockIndex%-1

ScanReadBlocks:
    IF EOF(3) THEN ScanStartNewRange
    LINE INPUT #3,CONTROL$
```

```
PREPARE.BAS    - Page 19 -                    4/15/1988    5:45 PM

ScanAlreadyHaveBlock:
    T$ = LEFT$(CONTROL$,1)
    IF LEN(CONTROL$)=0 OR T$="!" OR T$="*" THEN ScanReadBlocks

  ' parse out layer number, block name

    ControlIndex% = 1
    CALL UnitValInt(ControlLayer&,CONTROL$,ControlIndex%)
    CALL UnitStr(ControlType$,CONTROL$,ControlIndex%)
    T$ = FN NoSp$(MID$(CONTROL$,ControlIndex%))
    I% = INSTR(T$,"!")
    IF I%=0 THEN I%=LEN(T$)+1
    ControlCmd$ = FN NoSp$(LEFT$(T$,I%-1))

    IF ControlType$="#CA" THEN ScanReadBlocks    ' skip critical areas
    IF ControlLayer& < ZStart&[R%] THEN ScanReadBlocks
    IF ControlLayer& > ZEnd&[R%] THEN ScanStartNewRange

  ' add unique blocks to current range's block table

    FOR I%=BlockStart%[R%] TO BlockEnd%[R%]
      IF ControlType$=BlockType$[I%] THEN ScanReadBlocks
    NEXT I%
    BlockType$[BlockIndex%] = ControlType$
    BlockCmd$[BlockIndex%] = ControlCmd$
    BlockEnd%[R%] = BlockIndex%
    INCR BlockIndex%
    GOTO ScanReadBlocks

  ' set up the new layer

ScanStartNewRange:
    INCR R%
    IF R%<=RangeCount% THEN
      BlockStart%[R%] = BlockIndex%
      BlockEnd%[R%] = BlockIndex%-1
      GOTO ScanAlreadyHaveBlock
    END IF
  END IF
  CLOSE #J
  RETURN

-----------------------------------------------------------------------------

MakeReport:
  PRINT
  PRINT
  PRINT "Press V to view report on screen, or P to print on printer: ";
LoopReport:
  C$=UCASE$(INKEY$)
  IF LEN(C$)=0 THEN LoopReport
  IF C$="V" THEN ViewReport
  IF C$="P" THEN PrintReport
  GOTO RangeManager

ViewReport:
  CLS
  T$ = " PREPARE Report for "+PartLayerFileName$
  T$ = T$ + STRING$(59-LEN(T$)," ") + DATE$+"  "+TIME$
  FOR I%=1% TO RangeCount%
```

```
PREPARE.BAS    - Page 20 -                    4/15/1988   5:45 PM

    CLS
    PRINT T$
    PRINT
    PRINT " Range   Z-Start   Z-End   Z-Space   CAD-Start    CAD-End    CAD-Sp
    PRINT USING " ### ";I%;
    PRINT USING "     ##### ";ZStart&[I%]:
    PRINT USING "   #####";ZEnd&[I%];
    PRINT USING "    ##### ";ZSpace%[I%];
    PRINT USING "   #####.###":ZStart&[I%]/SliceRes;
    PRINT USING "   #####.###";ZEnd&[I%]/SliceRes;
    PRINT USING "   #####.###";ZSpace%[I%]/SliceRes:
    PRINT USING "   #####":(ZEnd&[I%]-ZStart&[I%])/ZSpace%[I%]+1
    PRINT "    ------------------------------------------------------------
    BlockCount% = 1
    FOR J%=BlockStart%[I%] TO BlockEnd%[I%]
      PRINT "            Block";BlockCount%;
      PRINT "  Type ";BlockType$[J%];SPC(6-LEN(BlockType$[J%]));
      IF LEN(BlockCmd$[J%]) THEN PRINT "   Commands: ";BlockCmd$[J%];
      PRINT
      INCR BlockCount%
    NEXT J%
    PRINT "----------------------------------------------------------------------
    PRINT
    LINE INPUT "Press Enter to continue...";A$
  NEXT I%
  GOTO RangeManager

PrintReport:
  ON ERROR GOTO PrinterNotReady
  LPRINT
  LPRINT
  T$ = "PREPARE Report for "+PartLayerFileName$
  LPRINT T$ + STRING$(59-LEN(T$)," ") + DATE$;"  ";TIME$
  LPRINT
  LPRINT " Range   Z-Start   Z-End   Z-Space   CAD-Start    CAD-End    CAD-Spac
  FOR I%=1 TO RangeCount%
    LPRINT USING " ### ";I%;
    LPRINT USING "      ##### ";ZStart&[I%];
    LPRINT USING "   #####";ZEnd&[I%];
    LPRINT USING "    ##### ";ZSpace%[I%];
    LPRINT USING "   #####.###":ZStart&[I%]/SliceRes;
    LPRINT USING "   #####.###";ZEnd&[I%]/SliceRes;
    LPRINT USING "   #####.###";ZSpace%[I%]/SliceRes;
    LPRINT USING "   #####";(ZEnd&[I%]-ZStart&[I%])/ZSpace%[I%]+1
    LPRINT "    ------------------------------------------------------------
    BlockCount% = 1
    FOR J%=BlockStart%[I%] TO BlockEnd%[I%]
      LPRINT "            Block";BlockCount%;
      LPRINT "  Type ";BlockType$[J%];SPC(6-LEN(BlockType$[J%]));
      IF LEN(BlockCmd$[J%]) THEN LPRINT " Commands: ";BlockCmd$[J%];
      LPRINT
      INCR BlockCount%
    NEXT J%
    LPRINT "----------------------------------------------------------------------
  NEXT I%
  LPRINT CHR$(12);
  GOTO RangeManager

PrinterNotReady:
  PRINT
```

```
PREPARE.BAS    - Page 21 -                    4/15/1988   5:45 PM

  PRINT "Printer not ready.  Press P to try again, or Q to quit: ";
PrintNRLoop:
  DO
    C$ = UCASE$(INKEY$)
  LOOP UNTIL LEN(C$)>0
  IF C$="P" THEN RESUME
  IF C$="Q" THEN RESUME RangeManager
  GOTO PrintNRLoop

'----------------------------------------------------------------------------

UpdateRangeFile:
  PRINT
  PRINT

  ON ERROR GOTO RangeFileProb
  OPEN PartRangeFileName$ FOR OUTPUT AS #10
  PRINT "Updating ";PartRangeFileName$;"..."
  FOR I%=1 TO CommentCount%
    PRINT #10,Comments$[I%]
  NEXT I%
  PRINT #10,"";
  WRITE #10,SliceRes,ZSpacing,Thickness
  FOR I%=1 TO RangeCount%
    WRITE #10,ZStart&[I%],ZEnd&[I%],ZSpace%[I%],CureDepth%[I%]
    FOR J%=BlockStart%[I%] TO BlockEnd%[I%]
      PRINT #10,BlockType$[J%];
      IF LEN(BlockCmd$[J%])>0 THEN PRINT #10,",";Quote$;BlockCmd$[J%];Quote$;
      PRINT #10,""
    NEXT J%
  NEXT I%
  CLOSE #10
  GOTO RangeManager

'============================================================================

   Layer Manager
   - allows editing of individual layers
            listing of layers having specified blocks

LayerManager:
  CLS
  IF RangeCount% = 0 THEN
    PRINT "No layer ranges!"
  ELSE
    T$ = "LAYER MANAGER"
    GOSUB CenterLine
    T$ = Title$
    GOSUB CenterLine
    T$ = "working on file "+PartLayerFileName$
    GOSUB CenterLine
    Indent$ = STRING$(12," ")
    PRINT
    PRINT Indent$;LayerBar$
    PRINT Indent$;" Range   Z-Start   Z-End   Z-Space   Count"
    PRINT Indent$;LayerBar$
    FOR I%=1 TO RangeCount%
      PRINT Indent$;
```

```
      PRINT USING " ### ";I%;
      PRINT USING "      ##### ";ZStart&[I%];
      PRINT USING "   #####";ZEnd&[I%];
      PRINT USING "    ##### ";ZSpace%[I%];
      IF ZSpace%[I%]>0 THEN
        Z% = (ZEnd&[I%]-ZStart&[I%])/ZSpace%[I%]
      ELSE
        Z% = 0
      END IF
      PRINT USING "   #####";Z%+1
    NEXT I%
    PRINT Indent$;LayerBar$
  END IF
  PRINT
  PRINT "   Press:"
  PRINT "     F  find blocks       E  edit layer file       U  update disk"
  PRINT "     X  exit              Q  quit program"
LoopLayer:
  C$=UCASE$(INKEY$)
  IF LEN(C$)=0 THEN LoopLayer
  IF C$="F" THEN FindBlocks
  IF C$="E" THEN EditLayer
  IF C$="U" THEN UpdateLayerFile
  IF C$="X" THEN MainMenu
  IF C$="Q" THEN END
  GOTO LoopLayer

-------------------------------------------------------------------------------

FindBlocks:
  PRINT
  PRINT
  INPUT "Find what blocks (separate by spaces)? ",B$
  IF LEN(B$)=0 THEN LayerManager
  TBIndex% = 0
  WHILE LEN(B$)>0
    I% = INSTR(B$," ")
    IF I%=0 THEN I%=LEN(B$)-1
    TBT.Blk$[TBIndex%] = UCASE$(LEFT$(B$,I%-1))
    INCR TBIndex%
    B$ = MID$(B$,I%+1)
  WEND
  PRINT "Look through what range of layers?  Enter ALL, or enter number of the
  PRINT "range, or enter Z-Layer start,stop: ";
  LINE INPUT "",Z$
  IF LEN(Z$)=0 THEN LayerManager
  IF LEFT$(UCASE$(Z$),1)="A" THEN
    MinLayer& = 0
    MaxLayer& = 99999
  ELSE
    I% = INSTR(Z$,",")
    IF I% THEN
      MinLayer& = VAL(LEFT$(Z$,I%-1))
      MaxLayer& = VAL(MID$(Z$,I%+1))
    ELSE
      IF LEFT$(Z$,1)="#" THEN Z$=MID$(Z$,2)
      J% = VAL(Z$)
      MinLayer& = ZStart&[J%]
      MaxLayer& = ZEnd&[J%]
    END IF
```

```
PREPARE.BAS    - Page 23 -                    4/15/1988   5:45 PM

    END IF

FindStart:
    ON ERROR GOTO NoLayerFile
    OPEN PartLayerFileName$ FOR INPUT AS #3
    ON ERROR GOTO 0
    PRINT "Searching ";PartLayerFileName$;"..."

FindLoop:
    IF EOF(3) THEN FindDone
    LINE INPUT #3,CONTROL$
    L$ = LEFT$(CONTROL$,1)
    IF LEN(CONTROL$)=0 OR L$="*" OR L$="!" THEN FindLoop
    ControlIndex% = 1
    CALL UnitValInt(ControlLayer&,CONTROL$.ControlIndex%)
    CALL UnitStr(ControlType$,CONTROL$.ControlIndex%)
    IF ControlLayer& < MinLayer& OR ControlLayer& > MaxLayer& THEN FindLoop
    FOR I%=0 TO TBIndex%-1
      IF ControlType$=[illegible](I%) THEN
        PRINT TBType$(I%);" block found on layer";ControlLayer&
        GOTO FindLoop
      END IF
    NEXT I%
    GOTO FindLoop

FindDone:
    CLOSE #1
    PRINT
    INPUT "Press Enter to continue... ",A$
    GOTO LayerManager

'----------------------------------------------------------------------------

EditLayer:
    SHELL "EDIT "+PartLayerFileName$
    GOTO LayerManager

'----------------------------------------------------------------------------

UpdateLayerFile:
    PRINT
    PRINT
    PRINT "About to update Layer File ";PartLayerFileName$;
    INPUT "  Okay? ",A$
    IF A$="" OR UCASE$(LEFT$(A$,1))<>"Y" THEN LayerManager
    ON ERROR GOTO NoBackup
    KILL BackupFileName$
    GOTO UpdateStart
NoBackup:
    RESUME UpdateStart

RenameError:
    PRINT "Error trying to rename ";PartLayerFileName$
    GotWarning% = TRUE
NoLayerControl:
    RESUME UpdateDone

UpdateStart:
    ON ERROR GOTO NoLayerControl
    NAME PartLayerFileName$ AS BackupFileName$
```

```
PREPARE.BAS    - Page 34 -                4/15/1988   5:45 PM

   ON ERROR GOTO NoBackupFile
   OPEN BackupFileName$ FOR INPUT AS #3
   ON ERROR GOTO NoLayerFile
   OPEN PartLayerFileName$ FOR OUTPUT AS #4
   ON ERROR GOTO 0
   PRINT "Updating ";PartLayerFileName$;"..."
   GotWarning% = FALSE

UpdateLoop:
   IF EOF(3) THEN UpdateDone
   LINE INPUT #3,CONTROL$
   L$ = LEFT$(CONTROL$,1)
   IF LEN(CONTROL$)=0 OR L$="*" OR L$="!" THEN
        PRINT #4,CONTROL$
        GOTO UpdateLoop
   END IF
   ControlIndex% = 1
   CALL UnitValInt(ControlLayer&,CONTROL$,ControlIndex%)
   CALL [illegible] ControlType$,CONTROL$,ControlIndex%)
   T$ = [illegible] CONTROL$,ControlIndex%)
   I%=[illegible]
   IF I%=0 THEN I%=LEN(T$)+1
   ControlCmd$ = FN NoSp$(LEFT$(T$,I%-1))
   ControlComments$ = MID$(T$,I%)

UpdateBlock:
   IF [illegible] THEN
     PRINT #4,CONTROL$
     GOTO UpdateLoop
   END IF
   FOR I%=1 TO [illegible]
     IF ControlLayer& < ZStart&[I%] THEN UpdLayer
   NEXT I%
   IF ControlLayer& <= ZEnd&[I%-1] THEN UpdLayer
   PRINT "Warning:  Layer";ControlLayer&;"not accounted for in table."
BadUpdate:
   GotWarning% = TRUE
   PRINT #4,CONTROL$
   GOTO UpdateLoop

UpdLayer:
   DECR I%
   FOR J%=BlockStart%[I%] TO BlockEnd%[I%]
     IF BlockType$[J%]=ControlType$ THEN UpdBlock
   NEXT J%
   PRINT "Warning:  Layer";ControlLayer&;"Block ";ControlType$;_
     " not accounted for in table."
   GOTO BadUpdate

UpdBlock:
   PRINT #4,FN NoSp$(STR$(ControlLayer&));",";ControlType$;
   IF LEN(BlockCmd$[J%])>0 THEN PRINT #4,",";BlockCmd$[J%];
   IF LEN(ControlComment$) THEN PRINT #4,"         ";ControlComment$;
   PRINT #4,""
   GOTO UpdateLoop

UpdateDone:
   ON ERROR GOTO 0
   CLOSE #3
   CLOSE #4
```

```
  IF GotWarning% THEN
    INPUT "Press Enter to continue... ",A$
  END IF
  GOTO LayerManager


'==============================================================================
'
'   Calculate part's step period(s)
'
CalcSp:
  ON ERROR GOTO NoPowerFile
  OPEN PowerFile$ FOR INPUT AS #8
  INPUT #8,LaserPower
  CLOSE #8
  GOTO CalcReadMaterialData
NoPowerFile:
  LaserPower = 0
  RESUME CalcReadMaterialData

CalcReadMaterialData:
  ON ERROR GOTO NoLastMaterialFile
  OPEN LastMaterialFile$ FOR INPUT AS #7
  LINE INPUT #7,MaterialFile$
  CLOSE #7
  GOSUB GetMaterialFileData
  GOTO ShowSp
NoLastMaterialFile:
  MaterialFile$ = "- none -"
  FOR I%=1 TO RangeCount%
    DetSp(I%) = 0
    SP(I%) = 0      :   LH(I%)   = 0   :   WMIN(I%) = 0   :   WMAX(I%) = 0
    LHSlope   = 0   :   LHYint   = 0   :   LHRval   = 0
    WMINSlope = 0   :   WMINYint = 0   :   WMINRval = 0
    WMAXSlope = 0   :   WMAXYint = 0   :   WMAXRval = 0
  NEXT I%
  RESUME ShowSp

ShowSp:
  CLS
  ON ERROR GOTO 0
  IF RangeCount% = 0 THEN
    PRINT "No layer ranges!"
  ELSE
    T$ = "RANGE - CALC SP"
    GOSUB CenterLine
    T$ = Title$
    GOSUB CenterLine
    T$ = "working on file "+PartRangeFileName$
    GOSUB CenterLine
    Indent$ = STRING$(6," ")
    PRINT
    T$ = "Laser Power Reading: "+STR$(INT(LaserPower*100)/100)+" mw"
    GOSUB CenterLine
    T$ = "using working curve data from material file: "+MaterialFile$
    GOSUB CenterLine
    PRINT Indent$;SpBar$
    PRINT Indent$;" Range   Z-Start   Z-End   Z-Space   Depth   Est SP   W Min
    PRINT Indent$;SpBar$
    FOR I%=1 TO RangeCount%
```

```
      WMIN = FN GetLog(EstSp&[I%],WMINSlope,WMINYint)
      IF WMIN>999 THEN WMIN=999
      IF WMIN<0 THEN WMIN=0
      WMAX = FN GetLog(EstSp&[I%],WMAXSlope,WMAXYint)
      IF WMAX>999 THEN WMAX=999
      IF WMAX<0 THEN WMAX=0
      PRINT Indent$;
      PRINT USING " ### ";I%;
      PRINT USING "      ##### ";ZStart&[I%];
      PRINT USING "   #####";ZEnd&[I%];
      PRINT USING "   ##### ";ZSpace%[I%];
      PRINT USING "   #####";CureDepth%[I%];
      PRINT USING "   #####";EstSp&[I%];
      PRINT USING "     ###.#";WMIN;
      PRINT USING "   ###.#";WMAX
    NEXT I%
    PRINT Indent$;SpBar$
  END IF
  PRINT
  PRINT "   Press:"
  PRINT "     R  read material data        S  save new range commands"
  PRINT "     P  change power rating       E  edit cure depth/step period"
  PRINT "     V  view material data"
  PRINT "     X  exit                      Q  quit program"
LoopSp:
  C$=UCASE$(INKEY$)
  IF LEN(C$)=0 THEN LoopSp
  IF C$="R" THEN ReadMaterial
  IF C$="P" THEN ChangeSp
  IF C$="S" THEN UpdateCmds
  IF C$="V" THEN ViewMaterial
  IF C$="E" THEN EditSpParams
  IF C$="X" THEN RangeManager
  IF C$="Q" THEN END
  GOTO LoopSp

 ------------------------------------------------------------------------

ReadMaterial:
  CLS
  PRINT "Available Material Files:"
  PRINT
  ON ERROR GOTO NoMaterialFiles
  FILES "*.MAT"
  GOTO GetMaterialAsk
NoMaterialFiles:
  PRINT "- no material files in working directory -"
  RESUME GetMaterialAsk
GetMaterialAsk:
  PRINT
  INPUT "Name of data file to read: ",MaterialFile$
  IF LEN(MaterialFile$)=0 THEN ShowSp
  MaterialFile$ = UCASE$(MaterialFile$)
  IF INSTR(MaterialFile$,".")=0 THEN MaterialFile$ = MaterialFile$ + ".MAT"
  ON ERROR GOTO CantReadMaterialFile
  GOSUB GetMaterialFileData
  OPEN LastMaterialFile$ FOR OUTPUT AS #9
  PRINT #9,MaterialFile$
  CLOSE #9
  GOTO ShowSp
```

```
GetMaterialFileData:
  OPEN MaterialFile$ FOR INPUT AS #7
  ON ERROR GOTO 0
  INPUT #7,MaterialLaserPower
  INPUT #7,NumberOfPairs%
  FOR I% = 1 TO NumberOfPairs%
    INPUT #7,SP(I%)
    INPUT #7,LH(I%)
    SP(I%) = LOG(SP(I%))/LOG(10)
    INPUT #7,WMIN(I%)
    INPUT #7,WMAX(I%)
  NEXT I%
  CLOSE #7
  CALL Regression(LH(),LHSlope,LHYint,LHRval)
  CALL Regression(WMIN(),WMINSlope,WMINYint,WMINRval)
  CALL Regression(WMAX(),WMAXSlope,WMAXYint,WMAXRval)
  GOSUB DoCalculation
  GOTO Ask

CantReadMaterialFile:
  PRINT "Can't read material file ";MaterialFile$
  CLOSE #7
  RESUME GetMaterialAsk

'-----------------------------------------------------------------------

ChangeSp:
  PRINT
  INPUT "Enter new laser power reading (mW): ",LaserPower
  OPEN PowerFile$ FOR OUTPUT AS #8
  PRINT #8,LaserPower
  CLOSE #8
  GOSUB DoCalculation
  GOTO ShowSp

'-----------------------------------------------------------------------

UpdateCmds:
  CLS
  PRINT "Update Range Commands"
  PRINT
  PRINT "Block Groups:"
  PRINT
  FOR I%=0 TO BlockGroups%
    PRINT FN StrNoSp$(I%);".  ";
    FOR J%=0 TO BlockGroupCount%[I%]-1
      IF POS(0)>75 THEN
        PRINT
        PRINT "    ";
      END IF
      PRINT BlockGroupId$[I%,J%];SPC(6-LEN(BlockGroupId$[I%,J%]));
    NEXT J%
    PRINT
  NEXT I%
  PRINT
  INPUT "Use which block group [1]? ",A$
  IF LEN(A$)=0 THEN Group% = 1 ELSE Group% = VAL(A$)
  PRINT
  INPUT "Update which merge-sets [all]? ",Upd$
```

```
  Upd$ = UCASE$(Upd$)
  IF LEN(Upd$)=0 OR LEFT$(Upd$,1)="A" THEN Upd$= "A"
  FOR I%=1 TO RangeCount%
    NewSpt$ = "SP " + FN NoSp$(STR$(EstSl..[I%]))
    FOR J%=BlockStart%[I%] TO BlockEnd%[I%]
      B$ = BlockType$[J%]
      F$ = ""
      WHILE RIGHT$(B$,1)<"A"
        F$ = F$+RIGHT$(B$,1)
        B$ = LEFT$(B$,LEN(B$)-1)
      WEND
      IF B$="L" OR (Upd$<>"A" AND INSTR(Upd$,F$)=0) THEN NoUpdateCmdBlock
      K%=0
      WHILE K% < BlockGroupCount%[Group%]
        IF B$=BlockGroupId$[Group%,K%] THEN UpdateCmdBlock
        INCR K%
      WEND
      GOTO NoUpdateCmdBlock
UpdateCmdBlock:
      [illegible]
        [illegible]
       ELSE
        [illegible]
      END IF
      [illegible] THEN CALL UpdateBlockCommands [illegible]
      [illegible] THEN CALL UpdateBlockCommands [illegible]

NoUpdateCmdBlock:
    NEXT J%
  NEXT I%
  [illegible]
   [illegible] Update Disk Comma
  INPUT [illegible] file out on disk...",A$
  GOTO [illegible]

SUB UpdateBlockCommands [illegible] NewItem$)
LOCAL T$,ItemId$,I%,J%,K%,CmdLeft$,CmdRight$
SHARED BlockCmd$[]
  I% = INSTR(NewItem$," ")       ' get text up to first space [illegible]
  IF I%=0 THEN I%=LEN(NewItem$)+1
  ItemId$ = LEFT$(NewItem$,I%-1)
  T$ = FN NoQuotes$(BlockCmd$[Index%])
  IF LEN(T$)=0 THEN
    T$ = NewItem$
  ELSE
    J% = INSTR(T$,ItemId$)
    IF J% THEN
      K% = INSTR(J%,T$,";")
      IF K%=0 THEN K% = LEN(T$)
      CmdLeft$ = LEFT$(T$,J%-1)
      CmdRight$ = MID$(T$,K%+1,99)
      IF LEN(CmdRight$)=0 AND RIGHT$(CmdLeft$,1)=";" THEN_
        CmdLeft$ = LEFT$(CmdLeft$,LEN(CmdLeft$)-1)
      T$ = CmdLeft$+CmdRight$
    END IF
    IF LEN(T$) THEN
      T$ = NewItem$ + ";" + T$
    ELSE
      T$ = NewItem$
    END IF
```

```
  END IF
  IF LEN(T$) THEN T$ = CHR$(34) + T$ + CHR$(34)
  BlockCmd$[Index%] = T$
UpdateBlocksEnd:
END SUB
```

---

```
ViewMaterial:
  CLS
  PRINT "Data from Material File: ";MaterialFile$
  PRINT
  PRINT
  PRINT "Material Test Laser Power Reading: ";
  PRINT USING "###.##";MaterialLaserPower
  PRINT
  PRINT NumberOfPairs%;"Material Data Pairs:"
  PRINT
  FOR I% = 1 TO NumberOfPairs%
    PRINT USING "##. ";I%;
    PRINT USING "  SP = ####.##";[illegible](I%);
    LOCATE ,[illegible]
    PRINT USING "  LH = ####.##";LH(I%);
    LOCATE ,[illegible]
    PRINT USING "  WMIN = ####.##";WMIN(I%);
    LOCATE ,[illegible]
    PRINT USING "  WMAX = ####.##";WMAX(I%)
  NEXT I%
  PRINT
  PRINT "  LH:  Slope =";
  PRINT USING "#####.##";INT(LHSlope*1000)/1000;
  PRINT "   Y-Intercept =";
  PRINT USING "#####.##";INT(LHYint*100)/100;
  PRINT "   R-Value =";
  PRINT USING "#####.##";INT(LHRval*1000)/1000
  PRINT "WMIN:  Slope =";
  PRINT USING "#####.##";INT(WMINSlope*1000)/1000;
  PRINT "   Y-Intercept =";
  PRINT USING "#####.##";INT(WMINYint*100)/100;
  PRINT "   R-Value =";
  PRINT USING "#####.##";INT(WMINRval*1000)/1000
  PRINT "WMAX:  Slope =";
  PRINT USING "#####.##";INT(WMAXSlope*1000)/1000;
  PRINT "   Y-Intercept =";
  PRINT USING "#####.##";INT(WMAXYint*100)/100;
  PRINT "   R-Value =";
  PRINT USING "#####.##";INT(WMAXRval*1000)/1000
  PRINT
  INPUT "Press Enter to continue... ",A$
  GOTO ShowSp
```

---

```
EditSpParams:
  PRINT
  PRINT "Enter C followed by range #,new cure depth"
  PRINT "   or S followed by range #,new step period: ";
  LINE INPUT "",A$
  C$ = UCASE$(LEFT$(A$,1))
  IF C$="S" THEN
```

```
    ModingSp% = TRUE
    GOTO EditCont
  ELSEIF C$="C" THEN
    ModingSp% = FALSE
    GOTO EditCont
  END IF
  GOTO ShowSp
EditCont:
  A$ = MID$(A$,2,99)
  IF INSTR(A$,",")=0 THEN ShowSp
  I% = INSTR(A$,",")
  Range% = VAL(LEFT$(A$,I%-1))
  IF Range%<1 OR Range%>RangeCount% THEN ShowSp
  Value# = VAL(MID$(A$,I%+1))
  IF Value# <= MaxInt THEN
    Value% = Value#
    IF ModingSp% THEN
      EstSp&[Range%] = Value%
      CureDepth%[Range%] = FN GetLnr(Value%,LHSlope,LHYint)
    ELSE
      CureDepth%[Range%] = Value%
      EstSp&[Range%] = FN GetExp(Value%,LHSlope,LHYint)
    END IF
    IF EstSp&[Range%] < MinSp& THEN EstSp&[Range%] = MinSp&
    IF EstSp&[Range%] > MaxSp& THEN EstSp&[Range%] = MaxSp&
  END IF
  GOTO ShowSp

ReCalculation:
   FOR I%=1 TO RangeCount%
    IF LaserPower < 1 THEN EstSp&[I%] = MinSp&
    ELSE EstSp&[I%] = FN GetExp(CureDepth%[I%],LHSlope,LHYint)
    IF EstSp&[I%] < MinSp& THEN EstSp&[I%] = MinSp&
    IF EstSP&[I%] > MaxSp& THEN EstSp&[I%] = MaxSp&
   NEXT I%
  RETURN

  ------------------------------------------------------------------------------

SUB Regression(Array(1),Slope,Yint,Rval)
  SHARED NumberOfPairs%,SP()
  XY        = 0
  SUMX      = 0
  SUMY      = 0
  SUMY2     = 0
  XSQUARED  = 0
  IF NumberOfPairs%<1 THEN
    Slope = 0
    Yint  = 0
    Rval  = 0
    GOTO EndRegSub
  END IF
  FOR I% = 1 TO NumberOfPairs%
    XY = XY + SP(I%) * Array(I%)
    SUMX = SUMX + SP(I%)
    SUMY = SUMY + Array(I%)
    SUMY2 = SUMY2 + Array(I%)^2
    XSQUARED = XSQUARED + SP(I%)^2
  NEXT I%
  Denom = XSQUARED - (SUMX^2) / NumberOfPairs%
```

```
  IF Denom < 1E-5 THEN Slope = 0_
  ELSE Slope = (XY - (SUMX*SUMY)/NumberOfPairs%) / Denom
  Yint = SUMY/NumberOfPairs% - Slope * SUMX/NumberOfPairs%
  Denom = SUMY2 - SUMY^2 / NumberOfPairs%
  IF Denom < 1E-5 THEN Rval = 0_
  ELSE Rval = SQR(((Yint * SUMY + Slope * XY) - SUMY^2/NumberOfPairs%) / Denom)
EndRegSub:
END SUB

DEF FN GetExp(DataPoint,Slope,Yint)
  IF (LaserPower>0) AND (Slope>0) THEN
    temp# = 10 ^ ((DataPoint - Yint) / Slope) * MaterialLaserPower / LaserPower
    IF temp# <= MaxUInt THEN FN GetExp = temp# ELSE FN GetExp = MaxUInt
  ELSE
    FN GetExp = 0
  END IF
END DEF

DEF FN GetLog(DataPoint,Slope,Yint)
  IF (DataPoint>0) AND (MaterialLaserPower>0) AND (LaserPower>0) THEN
    FN GetLog = Slope * LOG10(DataPoint*(MaterialLaserPower / LaserPower)) + Y[illegible]
  ELSE
    FN GetLog = 0
  END IF
END DEF

'================================================================================

'  Statistics:
'    show full directory of all files involved with part


Statistics:
  CLS
  PRINT "Statistics for part ";PartName$;":"
  SHELL "DIR "+PartName$+".*"
  LOCATE 22,1
  INPUT "Press Enter to continue: ",A$
  GOTO MainMenu


'================================================================================

'  UTILITY FUNCTIONS AND PROCEDURES

'--------------------------------------------------------------------------------

' Removes all double spaces in CmdLine$

RemoveDoubleSpaces:
  WHILE INSTR(CmdLine$,"  ")>0
    I = INSTR(CmdLine$,"  ")
    CmdLine$ = left$(CmdLine$,I) + mid$(CmdLine$,I+2,99)
  WEND
  RETURN


'  Find any char of Char$ in Main$ starting at index Start
'  Returns LEN(Main$)+1 if no character of Char$ in Main$
```

```
REPARE.BAS    - Page II -                    4/15/1988   5:45 PM

DEF FN FindStr(Start%,Main$,Char$)
  LOCAL I%,J%,MIN%
  MIN% = LEN(Main$) + 1
  FOR I%=1 to LEN(Char$)
    J% = INSTR(Start%,Main$,MID$(Char$,I%,1))
    IF (J% > 0) AND (J% < MIN%) THEN MIN% = J%
  NEXT I%
  FN FindStr = MIN%
END DEF

   Make a string from a number without a leading space

DEF FN StrNoSp$(Num)
  LOCAL A$
  A$=STR$(Num)
  IF LEFT$(A$,1)=" " THEN A$=RIGHT$(A$,LEN(A$)-1)
  FN StrNoSp$ = A$
END DEF

   Pick out a number from a string
   starting at Index and going to the next space or comma or end-of-string

SUB UnitValInt(Storage%,Text$,Index%)
  Storage% = VAL(MID$(Text$,Index%))
  Index% = FN FindStr(Index%,Text$," ,") + 1
END SUB

SUB UnitValSgl(Storage!,Text$,Index%)
  Storage! = VAL(MID$(Text$,Index%))
  Index% = FN FindStr(Index%,Text$," ,") + 1
END SUB

SUB UnitVal(Storage,Text$,Index%)
  Storage = VAL(MID$(Text$,Index%))
  Index% = FN FindStr(Index%,Text$," ,") + 1
END SUB

   Pick out text from a string
   starting at Index and going to the next comma or end-of-string

SUB UnitStr(Storage$,Text$,Index%)
  LOCAL I%
  I% = FN FindStr(Index%,Text$," ,")
  Storage$ = MID$(Text$,Index%,I%-Index%)
  Index% = I% + 1
END SUB

   Remove excess quote marks around string

DEF FN NoQuotes$(Text$)
  LOCAL S%,E%
  S% = 1
  IF LEFT$(Text$,1)=CHR$(34) THEN INCR S%
  E% = LEN(Text$)+1
  IF RIGHT$(Text$,1)=CHR$(34) THEN DECR E%
```

```
  FN NoQuotes$ = MID$(Text$,S%,E%-S%)
END DEF

'
'  Remove excess spaces around string
'
DEF FN NoSp$(Text$)
  LOCAL S%,E%
  IF LEN(Text$)>0 THEN
    S% = 1
    WHILE MID$(Text$,S%,1)=" "
      INCR S%
    WEND
    E% = LEN(Text$)
    WHILE E%>S%+1 AND MID$(Text$,E%,1)=" "
      DECR E%
    WEND
    FN NoSp$ = MID$(Text$,S%,E%-S%+1)
  ELSE
    FN NoSp$ = ""
  END IF
END DEF

'
'  Can't open file. Report this to operator.
'
CantOpen:
  CALL SystemError("Can't open file "+FileName$)
  END

'----------------------------------------------------------------------------

'  Show error and store it on disk
'
SUB SystemError(Text$)
  PRINT Text$
  OPEN "C:\SYSTEM.ERR" FOR OUTPUT AS #9
  PRINT #9,"PREPARE: ";Text$
  CLOSE #9
END SUB

CenterLine:
  LOCATE ,(79-LEN(T$))/2
  PRINT T$
  RETURN
```

```
SERVICE.PAS   - Page 1 -                    4/15/1988   5:56 PM

==============================================================================
   3D Systems Stereolithography System Software
==============================================================================

   SERVICE.PAS
   SLA-1 Special Services Provider

------------------------------------------------------------------------------

   Recent History:
   11/20/87  Ver 2.30  under development
   12/06/87  Ver 2.31  Error output shows SERVICE, not MERGE
                       /I in command line causes all errors to be ignored
                       /T in command line for transparent operation
    1/25/88  Ver 2.60  version update only
    3/24/88  Ver 2.61  converted to Turbo Pascal Version 4.0
                       added program title header
                       added invalid command error
   [illegible]
   [illegible]

------------------------------------------------------------------------------

uses Dos;

const
  VersionId     = '3.00';
  INTDOS        = $21;    { interrupt vectors }
  LASERVECTOR = $64;
  ErrorFileName = 'C:\SYSTEM.ERR';

type
  str4 = string[4];
  str16 = string[16];

var
  i: Integer;
  ErrorFile: Text;
  regs: Registers;
  LaserVersion: str4;
  SingleBar,CmdLine,cmd: String;
  ShowErrors,NoText: Boolean;


function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
var
  temp: string;
  i: Integer;
begin
  temp := '';
```

```
  for i:=1 to num do temp := temp+Ch;
  many := temp;
end;

function CleanUpSpaces(Text: String): String;
var
  Temp: String;
  i: Integer;
  HaveSpace: Boolean;
begin
  i := 1;
  while (i < length(Text)) and (copy(Text,1,1)=' ') do inc(i);
  HaveSpace := false;
  Temp := '';
  while i <= length(Text) do begin
    if Text[i]=' ' then HaveSpace := true
    else begin
      if HaveSpace then begin
        Temp := Temp + ' ' + Text[i];
        HaveSpace := false;
      end else Temp := Temp + Text[i];
    end;
    inc(i);
  end; {while i}
   CleanUpSpaces := Temp;
end;

{
   Convert integer to a string
}
function IntStr(num: Integer): str16;
var
  temp: str16;
begin
  if num>=0 then Str(num,temp) else Str(num+65536,temp);
  IntStr := temp;
end;

{
   Tell user if not transparent
}
procedure Tell(Text: String);
begin
  if not NoText then writeln(Text);
end;

{
   read DOS command line
}
procedure ReadCommandLine(var line: string);
var
  i: Integer;
begin
  line := ParamStr(1);
  for i:=2 to ParamCount do
    line := line + ' ' + ParamStr(i);
end;

{
  Show error and store it on disk
```

```
}
procedure SystemError(Text: string);
begin
  writeln(Text);
  assign(ErrorFile,ErrorFileName);
  rewrite(ErrorFile);
  writeln(ErrorFIle,'SERVICE: ',Text);
  close(ErrorFile);
end;

{-----------------------------------------------------------------------------

                         Laser Controller Routines

------------------------------------------------------------------------------

}
  Check for [illegible] Laser Controller System

function LaserOk: Boolean;
  type
    CopyType = array[1..19] of char;
  var
    CopyPtr: ^CopyType;
    CopyStr: string[20];
  begin
    with regs do begin
      AX := ($35 shl 8) or LASERVECTOR;
      Intr($21,regs);
      CopyPtr := Ptr(ES,BX-19);
    end;
    move(CopyPtr^[1],CopyStr[1],19);
    CopyStr[0] := #18;
    if CopyStr = 'Laser Technologies' then begin
      LaserOk := true;
      with regs do
        CopyPtr := Ptr(ES,BX-46);
      move(CopyPtr^[1],LaserVersion[1],4);
      LaserVersion[0] := #4;
    end else begin
      LaserOk := false;
      LaserVersion := '?.??';
    end;
  end;

function LaserPresent: Boolean;
  begin
    if LaserOk then LaserPresent := true
    else begin
      LaserPresent := false;
      SystemError('LASER system not installed.');
    end;
  end;

{-----------------------------------------------------------------------------

procedure TurnLaserControllerOff;
```

```
var
  Er: Integer;
begin
  with regs do begin
    AX := $0100;
    Intr(LASERVECTOR,regs);
    Er := AL;
    if ShowErrors then begin
      if Er=0 then Tell('Laser Controller turned off.')
      else Tell('Error '+IntStr(Er)+' attempting to turn laser off.');
    end;
  end;
end;

procedure TurnLaserControllerOn;
var
  Er: Integer;
begin
  with regs do begin
    AX := $00[illegible];
    [illegible]
    Intr(LASERVECTOR,regs);
    Er := AL;
    if ShowErrors then begin
      if Er=0 then Tell('Laser Controller turned on.')
      else Tell('Error '+IntStr(Er)+' attempting to turn laser on.');
    end;
  end;
end;

procedure [illegible];
begin
  SingleBar := [illegible](196),45);
  writeln;
  writeln(SingleBar);
  writeln('   SERVICE, SLA Resource Utility');
  writeln('   Version ',Version);
  writeln('   Copyright (C) 1988 by 3D Systems, Inc.');
  writeln('   3D Systems Laser Stereolithography System');
  writeln(SingleBar);
  writeln;
end;

{ - - - - - M A I N   P R O G R A M - - - - - }


begin
  ShowErrors := true;
  NoText     := false;
  ReadCommandLine(CmdLine);
  cmd := CleanUpSpaces(upper(CmdLine));
  i := pos('/I',cmd);
  if i>0 then begin
    ShowErrors := false;
    delete(cmd,i,2);
  end;
  i := pos('/T',cmd);
  if i>0 then begin
    NoText := true;
    delete(cmd,i,2);
```

```
  end;
  if not noText then ShowHeader;
  if not LaserPresent then halt(1);
  if length(cmd)>0 then begin
    if copy(cmd,1,5)='LASER' then begin
      if copy(cmd,7,2)='ON' then TurnLaserControllerOn
      else if copy(cmd,7,3)='OFF' then TurnLaserControllerOff
      else Tell('Invalid LASER request.');
    end else Tell('Unrecognized command.');
  end;
  halt(0);
end.
```

```
/***********************************************************************
*
*   3D System's Unix Slice User Interface Program
*
*=======================================================================
*
*   Version 2.40  Second Beta Release
*   Version 3.00  first production Release
*
***********************************************************************

#include <stdio.h>
#include <string.h>
#include <math.h>

#include <sys/types.h>
#include <sys/times.h>
struct tms timestamp1,timestamp2;
unsigned long time_val1,time_val2;
unsigned long system_time;

#include "slice.h"

#define  UI_FILE_EXT        ".UII"
#define  Z_SPACE_EXT        ".UIZ"
#define  SLICE_INPUT_EXT    ".stl"
#define  SLICE_OUTPUT_EXT   ".sli"
#define  LAST_FILE          "LAST.UIN"

#define  PARA_NO      11
#define  FUNC_NO      24
#define  FLUSH_IN     fflush(stdin)
#define  CLEAR        system("tput clear")

#define  SLICE_PGM    "slice"
#define  SLICE_VER    "300"

#define  VERSION      3.00

#define log_file_name "LOG.UI"
FILE *log_file_ptr;

/***********************************************************************

typedef struct
{
  int   z_layer;
  int   z_value;
} z_record;

/***********************************************************************/

unsigned scaled(user_info,num)
  USER_INFO_STRUC *user_info;
  float            num;
  {
  return((unsigned) (user_info->resolution*num+0.5));
  };
 ***********************************************************************/

char exact(user_info,num)
  USER_INFO_STRUC *user_info;
  float            num;

  if (fabs(user_info->resolution * num - scaled(user_info,num)) < 1E-3)
    return(' ');
  else return('*');
  }
```

```
/**************************************************************************/

wait_key()
{
  char line[];

  printf("[illegible] Press a key [illegible]");
  getline(line,1);
}

/**************************************************************************/

[illegible]_read_[illegible]()
{
  char line[];
  int i;
  float temp;

  do {
    getline(line, );
    i=0;
    parse_number(line,&i,&temp);
    if (temp <  ) temp = -temp;
    if (temp > 65535.0) printf("Number Range Error (0-65535). Retype: ");
  } while (temp > 65535.0);
  return(temp);
}

/**************************************************************************/

float read_float(check)
  BOOLEAN check;
{
  char line[10];
  int i;
  float temp;

  do {
    getline(line,10);
    i=0;
    parse_number(line,&i,&temp);
    if (temp < 0.0) temp = -temp;
    temp = (unsigned long) (temp*1000+0.0005) / (float) (1000);
    if (check && (temp > 65535.0)) printf("Number Range Error (0-65535). Retype:
  } while (check && (temp > 65535.0));
  return(temp);
}
/**************************************************************************/

openfile (filename,file_ptr,open_mode)
char    filename[];
FILE    **file_ptr;
char    *open_mode;
{
if  ((*file_ptr = fopen (filename, open_mode)) == NULL)
  {
  fprintf (stderr, "\n ERROR - unable to open %s\n", filename);
  exit (1);
  }
} /* openfile */

/**************************************************************************/

[illegible] object [illegible]
[illegible]
[illegible] *[illegible][]
[illegible]
```

```
[illegible]

if (argc [illegible])
  {
    strcpy (object_name, argv[1]);
    if ((strchr (object_name, '.')) != NULL)
    {
      fprintf (stderr, "\n*** Object name cannot contain periods. ");
      fprintf (stderr, "Object name is not the file name ***\n");
      exit (1);
    }
  } else {
    if (!file_exist(LAST_FILE))
    {
      fprintf (stderr, "\n*** Cannot find %s.  Please use ",LAST_FILE);
      fprintf (stderr, "%s command with object name ***\n",argv[0]);
      exit (1);
    }
    openfile (LAST_FILE, &file_ptr, "r");
    fscanf   (file_ptr, "%s", object_name);
    fclose   (file_ptr);
  }
} /* get_object_name */

/***********************************************************************************/

file_exist (file_name)
char      file_name[];
{
  FILE  *file_ptr;

  if ((file_ptr = fopen (file_name, "r" )) != NULL)
  {
    fclose(file_ptr);
    return(TRUE);
  }
  else return(FALSE);
} /* file_exist */

/***********************************************************************************/

update_last_UI (object_name)
  char    object_name[];
{
  FILE   *file_ptr;

  openfile (LAST_FILE, &file_ptr, "w");
  fprintf  (file_ptr, "%s\n", object_name);
  fclose(file_ptr);
} /* update_last_UI */

/***********************************************************************************/

[illegible]_UI_file(filename, user_info)
  char       filename[];
  [illegible]_INFO *user_info;
{
  FILE             *file_ptr;
  char             option[STR_LEN],temp_str[STR_LEN]
    [illegible];

  openfile (filename, &file_ptr, "r");

  while (fscanf(file_ptr,"%s",option) == 1)
  {
    if (strcmp(option,VERSION_TXT) == 0)
      fscanf(file_ptr,"%s",(user_info-> [illegible]));
```

```
    if (strcmp(option,IN_FILE_TXT) == 0)
      fscanf(file_ptr,"%s",user_info->input_filename);
    if (strcmp(option,EXTRA_PARAMS_TXT) == 0) {
      fgets(user_info->extra_parameters,STR_LEN,file_ptr);
      user_info->extra_parameters[strlen(user_info->extra_parameters)-1] = '\0';
    }
    if (strcmp(option,OUT_FILE_TXT) == 0)
      fscanf(file_ptr,"%s",user_info->segfile_name);
    if (strcmp(option,SCALE_TXT) == 0)
      fscanf(file_ptr,"%f",&user_info->resolution);
    if (strcmp(option,RES_TXT) == 0)
      fscanf(file_ptr,"%f",&user_info->resolution);
    if (strcmp(option,Z_SPACE_TXT) == 0)
      fscanf(file_ptr,"%f",&user_info->z_spacing);
    if (strcmp(option,X_FLAT_FILL_TXT) == 0)
      fscanf(file_ptr,"%f",&user_info->x_flat_fill_spacing);
    if (strcmp(option,Y_FLAT_FILL_TXT) == 0)
      fscanf(file_ptr,"%f",&user_info->y_flat_fill_spacing);
    if (strcmp(option,X_HATCH_TXT) == 0)
      fscanf(file_ptr,"%f",&user_info->x_hatch_spacing);
    if (strcmp(option,Y_HATCH_TXT) == 0)
      fscanf(file_ptr,"%f",&user_info->y_hatch_spacing);
    if (strcmp(option,ANGLE_HATCH_TXT) == 0)
      fscanf(file_ptr,"%f",&user_info->angle_hatch_spacing);
    if (strcmp(option,MSA_TXT) == 0)
      fscanf(file_ptr,"%u",&user_info->min_surface_angle);
    if (strcmp(option,MIA_TXT) == 0)
      fscanf(file_ptr,"%u",&user_info->min_intersect_angle);
    if (strcmp(option,FILETYPE_TXT) == 0)
      fscanf(file_ptr,"%u",&user_info->file_type);
    if (strcmp(option,CENTERING_TXT) == 0)
      fscanf(file_ptr,"%u",&user_info->centering);
    if (strcmp(option,VAR_Z_SPACE_TXT) == 0) {
      i = 0;
      fscanf(file_ptr,"%s",temp_str);
      while (temp_str[0] != '*') {
        fscanf(file_ptr,"%f %f %s",&user_info->z_level[i],
                                   &user_info->z_level_spacing[i],
                                   temp_str);
        i++;
      }
    }
  }
  fclose(file_ptr);
  if (user_info->version < 2.339) {
    user_info->z_spacing /= user_info->resolution;
    user_info->x_flat_fill_spacing /= user_info->resolution;
    user_info->y_flat_fill_spacing /= user_info->resolution;
    user_info->x_hatch_spacing /= user_info->resolution;
    user_info->y_hatch_spacing /= user_info->resolution;
    user_info->angle_hatch_spacing /= user_info->resolution;
  }
}

/**************************************************************************/

get_user_info_from_file (user_info,object_name)
  USER_INFO_STRUC   *user_info;
  char              object_name[];
{
  char  filename[STR_LEN];

  strcpy(filename,object_name);
  strcat(filename,UI_FILE_EXT);
  init_user_info(user_info,object_name);
  if (file_exist(filename)) read_UI_file(filename,user_info);
} /* get_user_info_from_file */
```

```
*****************************************************************************/

void save_UI_data_file(user_info,object_name)
  USER_INFO_STRUC       *user_info;
  char                  object_name[];
{
  FILE          *file_ptr;
  char          filename[STR_LEN];
  unsigned int  i;

  strcpy(filename,object_name);
  strcat(filename,UI_FILE_EXT);
  openfile (filename, &file_ptr, "w");

  fprintf(file_ptr,"%s %f\n",VERSION_TXT,VERSION);
  fprintf(file_ptr,"%s %s\n",IN_FILE_TXT,user_info->input_filename);
  fprintf(file_ptr,"%s %s\n",EXTRA_PARAMS_TXT,user_info->extra_parameters);
  fprintf(file_ptr,"%s %s\n",OUT_FILE_TXT,user_info->segfile_name);
  fprintf(file_ptr,"%s %f\n",RES_TXT,user_info->resolution);
  fprintf(file_ptr,"%s %f\n",Z_SPACE_TXT,user_info->z_spacing);
  fprintf(file_ptr,"%s %f\n",X_FLAT_FILL_TXT,user_info->x_flat_fill_spacing);
  fprintf(file_ptr,"%s %f\n",Y_FLAT_FILL_TXT,user_info->y_flat_fill_spacing);
  fprintf(file_ptr,"%s %f\n",X_HATCH_TXT,user_info->x_hatch_spacing);
  fprintf(file_ptr,"%s %f\n",Y_HATCH_TXT,user_info->y_hatch_spacing);
  fprintf(file_ptr,"%s %f\n",ANGLE_HATCH_TXT,user_info->angle_hatch_spacing);
  fprintf(file_ptr,"%s %u\n",MSA_TXT,user_info->min_surface_angle);
  fprintf(file_ptr,"%s %u\n",MIA_TXT,user_info->min_intersect_angle);
  fprintf(file_ptr,"%s %u\n",FILETYPE_TXT,user_info->file_type);
  fprintf(file_ptr,"%s %u\n",CENTERING_TXT,user_info->centering);
  fprintf(file_ptr,"%s\n",VAR_Z_SPACE_TXT);
  i = 0;
  while (user_info->z_level[i] >= 0) {
    fprintf(file_ptr," > %f %f\n",user_info->z_level[i],user_info->z_level_spac
    i++;
  }
  fprintf(file_ptr," #\n");
  fclose(file_ptr);
  printf("User Interface Options for %s Saved\n",object_name);
  wait_key();
} /* save_UI_data_file */

*****************************************************************************/

show_main_menu(user_info,object_name)
  USER_INFO_STRUC   *user_info;
  char              object_name[];
{

  char  filename [STR_LEN];
  unsigned int i;

  CLRSCR;
  printf ("                              - SLICE USER INTERFACE - ");
  printf ("                                      Version %-1.2f\n\n\n",VERSION);
  printf ("     Current Object:  %s\n",object_name);
  printf ("Database File Name:  %s",user_info->input_filename);
  switch (user_info->file_type) {
    case 0:
      printf (", ASCII format");
      break;
    case 1:
      printf (", Binary format");
      break;
  }
  printf("\n");
  printf("  Extra Parameters:  %s\n",user_info->extra_parameters);
  printf("\n");
```

```
  printf (" Alter    - Alter standard options\n");
  printf (" Extra    - Set extra parameters\n");
  printf ("\n");
  printf (" Load     - Load a different object's options\n");
  printf (" Save     - Save current object's options\n");
  printf (" Write    - Save current option's under different object name\n");
  printf (" Copy     - Copy another object's options into current object\n");
  printf ("\n");
  printf (" DoSlice - Do slicing with current options\n");
  printf (" Quit     - Exit (Use SAVE to save options first)\n");
  printf ("\n");
}; /* show_main_menu */

/**********************************************************************/
process_UI_main (user_info,str_comm,object_name)
  USER_INFO_STRUC    *user_info;
  char               str_comm[];
  char               object_name[];
{
  unsigned int   option_val,temp;
  char option_str[3],option_chr;
  float temp_float;

  do {
    show_main_menu(user_info,object_name);
    printf ("Which Command? ");
    getline(option_str,2);
    option_chr = toupper(option_str[0]);
    process_command (option_chr,user_info, str_comm,object_name);
  } while (option_chr != 'Q');
} /* process_UI_main */

/**********************************************************************/
process_command (option_chr,user_info,str_comm,object_name)
                 option_chr;
  USER_INFO_STRUC    *user_info;
  char               str_comm[];
  char               object_name[];
{
  char               temp_name[STR_LEN];

  switch (option_chr)
  {
    case 'A' :  process_UI_option(user_info,str_comm,object_name);
                break;
    case 'E' :  set_extra_parameters(user_info);
                break;
    case 'L' :  load_UI_data_file(user_info,object_name);
                break;
    case 'S':   save_UI_data_file(user_info,object_name);
                break;
    case 'W' :  printf("New object name to save under? ");
                getline(temp_name,STR_LEN);
                save_UI_data_file(user_info,temp_name);
                break;
    case 'C':   copy_UI_data_file(user_info);
                break;
    case 'D':   slice_UI_data_file(user_info,str_comm,object_name);
                break;
  }
} /* process_command */

/**********************************************************************/
parse_number(line,ptr_passed,num)
  char line[];
```

```
  int  *ptr_passed;
  float *num;
{
  int sign,ptr;
  float base,fraction_base;
  BOOLEAN good_num;

 ptr = *ptr_passed;

 while (line[ptr] == ' ') ptr++;
 if  (line[ptr] == '-') sign = -1;
 else sign = 1;
 if  (strchr("+-",line[ptr]) != NULL) ptr++;

 base = 0;
 fraction_base = 0;
 good_num = FALSE;
 while ((line[ptr] == '.') || ((line[ptr] >= '0') && (line[ptr] <= '9')))
 {
   if (line[ptr] != '.') {
     good_num = TRUE;
     if (fraction_base == 0.0) {
       base = base * 10 + (line[ptr++] - '0');
     } else {
       base = base + ((float) (line[ptr++] - '0') * fraction_base);
       fraction_base = fraction_base / 10.0;
     }
   } else {
     fraction_base = .1;
     ptr++;
   }
 }

 *ptr_passed = ptr;
 *num = sign * base;
 if (((line[ptr] != ' ') && (line[ptr] != ',') && (line[ptr] != '\0')) || !good_num)
 {
   *num = 0;
   return(FALSE);
 } else {
   *ptr_passed++;
   return(TRUE);
 }
}

****************************************************************************************/

getline(s,lim)
  char s[];
  unsigned int lim;
{
  int c,i;

  FLUSH_IN;
  i = 0;
  c = getchar();
  while ((i<lim) && (c != EOF) && (c!='\n') && (c!=LF))
  {
    s[i] = c;
    i++;
    c = getchar();
  }
  s[i] = '\0';
  FLUSH_IN;
  return(i);
```

```
/*****************************************************************************/

find_z_level(user_info,level,index)
  USER_INFO_STRUC  *user_info;
  float    level;
  unsigned *index;
{
  unsigned i;

  i=0;
  while ((user_info-> z_level[i] < level) &&
         (user_info-> z_level[i] >= 0) &&
         (i < MAX_Z_TABLE)) i++;
  *index = i;
}

/*****************************************************************************/

insert_z_table(user_info,level,spacing,message)
  USER_INFO_STRUC  *user_info;
  float level,spacing;
  char message[];
{
   unsigned i,j;

  if ((user_info-> z_level[MAX_Z_TABLE-1] >= 0.0) &&
      (user_info-> z_level[MAX_Z_TABLE-1] != level))
  {
    strcpy(message,"**** Table Full.  Cannot Add New Level ****");
  } else {
    find_z_level(user_info,level,&i);
    if ((user_info-> z_level[i] != level) && (user_info-> z_level[i] >= 0))
    {
      for (j=MAX_Z_TABLE-1; (j > i); j--)
      {
        user_info-> z_level[j] = user_info-> z_level[j-1];
        user_info-> z_level_spacing[j] = user_info-> z_level_spacing[j-1];
      }
    }
    user_info-> z_level[i] = level;
    user_info-> z_level_spacing[i] = spacing;
  }
}

/*****************************************************************************/

delete_z_level(user_info,level,message)
  USER_INFO_STRUC  *user_info;
  float level;
  char message[];
{
  unsigned i,j;

  find_z_level(user_info,level,&i);
  if ((user_info-> z_level[i] != level) || (i == MAX_Z_TABLE))
  {
    strcpy(message,"**** Level does not exist ****");
  } else {
    for (j=i; j<(MAX_Z_TABLE-1); j++)
    {
      user_info-> z_level[j] = user_info-> z_level[j+1];
      user_info-> z_level_spacing[j] = user_info-> z_level_spacing[j+1];
    }
    user_info-> z_level[MAX_Z_TABLE-1] = -1;
  }
}

/*****************************************************************************/
```

```
show_z_table(user_info,linenum)
  USER_INFO_STRUC  *user_info;
  unsigned int *linenum;
{
  unsigned int i,next_line;

  CLRSCR;
  printf("          Z Level");
  print[illegible]
  print[illegible] spacing n");
  printf("          -------  ");
  [illegible]
  printf("-------\n");
  next_line = 3;
  for [illegible] user_info->z_level[i] [illegible] (i < MAX_Z_TABLE); i++)
  {
    printf("      %9.3f  ",user_info->z_level[i]);
    printf(" . . . . . . . . . . . . . . . . . . . . .");
    printf("%9.3f\n",user_info->z_level_spacing[i]);
    next_line++;
  }
  *linenum = next_line;
}

/****************************************************************************************/

void input_z_spacing (user_info_perm)
  USER_INFO_STRUC  *user_info_perm;
{
  USER_INFO_STRUC  user_info;
  char cmd,line[STR_LEN],message[STR_LEN];
  unsigned int i,linenum;
  float float_value,float_value_2;

  CLRSCR;
  printf("\n\nLayer Thickness Input\n");
  printf("===============\n\n");
  do {
    printf("Fixed or Variable Layer Thickness (F, V or Q)? ");
    getline(line,1);
    cmd = toupper(line[0]);
  } while (strchr("FVQ",cmd) == NULL);

  switch (cmd) {
    case 'F':
      do {
        printf("\nFixed Layer Thickness Value? ");
        getline(line,STR_LEN-1);
        i = 0;
        parse_number(line,&i,&float_value);
    } while ((float_value <= 0) || (float_value >= 65535.0));
    user_info_perm->z_spacing = float_value;
    break;
  case 'V':
    strcpy(message,"");
    memcpy(&user_info,user_info_perm,sizeof(USER_INFO_STRUC));
    user_info.z_spacing = 0.0;
    do {
      do {
        show_z_table(&user_info,&linenum);
        while (linenum < 23)
        {
          printf("\n");
          linenum++;
        }
        printf("%s\n",message);
        printf("Command (A,D,S,Q,Help)? ");
```

```
  getline(line,STR_LEN-1);
  cmd = toupper(line[0]);
  if (cmd == ' ' || strchr("ADSQH",cmd) == NULL)
    strcpy(message,"**** Enter Valid Command ****");
} while (cmd == ' ' || strchr("ADSQH",cmd) == NULL);
strcpy(message," ");
switch (cmd) {
  case 'H':
    printf("\nLayer Thickness Help Commands:\n\n");
    printf("  A level spacing      Add new level and spacing value to tat
    printf("  D level              Delete level from table\n");
    printf("  S                    Save table, return to options menu\n")
    printf("  Q                    Quit, return to options menu, don't sav
    printf("  H                    print this Help message\n");
    printf("\nNote: all values are in CAD Units\n");
    wait_key();
    break;
  case 'A':
    i = 1;
    if (!parse_number(line,&i,&float_value))
      strcpy(message,"**** Invalid Numeric input for level ****");
    else {
      if (float_value < 0.0)
        strcpy(message,"**** Level must be a positive number ****");
      else {
        if (!parse_number(line,&i,&float_value_2))
          strcpy(message,"**** Invalid Numeric input for spacing ****");
        else {
          if (float_value_2 <= 0.0)
            strcpy(message,"**** Spacing must be greater than zero ****
          else {
             insert_z_table(&user_info, float_value, float_value_2,mess
          }
        }
      }
    }
    break;
  case 'D':
    i = 1;
    if (!parse_number(line,&i,&float_value))
      strcpy(message,"**** Invalid Numeric input for level ****");
    else {
      if (float_value < 0.0)
             strcpy(message,"**** Level must be a positive number ****");
           else {
             delete_z_level(&user_info, float_value,message);
           }
         }
         break;
       case 'S':
         memcpy(user_info_perm,&user_info,sizeof(USER_INFO_STRUC));
         printf("=== Variable Layer Thickness Information Saved ===\n");
         wait_key();
         break;
     } /* ADSQH */
    } while (strchr("SQ",cmd) == NULL);
    break; /* V */
  /* VFC */
 /* input_z_spacing */

*************************************************************************/

      ...

 FILE  *file_ptr;
 ...   object_name[STR_LEN],filename[STR_LEN],temp1[STR_LEN],temp2[STR_LEN];
 unsigned int file_type;
```

```
printf ("Object name to copy? ");
getline(object_name,STR_LEN);
strcpy(filename,object_name);
strcat (filename,UI_FILE_EXT);
if (!file_exist(filename))

  printf("**** Cannot find User Interface data file for %s ****\n",object_na
} else {
  strcpy(temp1,user_info-> input_filename);
  file_type = user_info->file_type;
  strcpy(temp2,user_info-> segfile_name);
  get_user_info_from_file(user_info,object_name);
  strcpy(user_info-> input_filename,temp1);
  user_info-> file_type = file_type;
  strcpy(user_info-> segfile_name,temp2);
  printf("User Interface Options for %s Copied\n",object_name);
}
wait_key();
/* copy_UI_data_file */

*****************************************************************************/

set_extra_parameters (user_info)
  USER_INFO_STRUC   *user_info;

  char temp[STR_LEN];

  CLRSCR;
  printf("\n");
  printf("Extra Parameters allows you to specify non-standard slice options\n");
  printf("for inclusion in the slice command line.  What parameters are valid\n"
  printf("is based on the version of Slice you will use.\n\n");
  printf("The following parameters exist:\n\n");
  printf("  -x        slice part along the x-axis\n");
  printf("  -y        slice part along the y-axis\n");
  printf("  (default) slice part along the z-axis\n");
  printf("\n\n");
  printf("Current Extra Parameters are:\n");
  printf("%s\n\n",user_info->extra_parameters);
  printf("Enter new Extra Parameters or just press Enter to keep the old:\n");
  getline(temp,STR_LEN-1);
  if (strlen(temp)>0) {
    if (strcmp(temp," ")==0) strcpy(user_info->extra_parameters,"");
    else strcpy(user_info->extra_parameters,temp);


*****************************************************************************/

load_UI_data_file (user_info,object_name)
  USER_INFO_STRUC   *user_info;
  char              object_name[];

  FILE  *file_ptr;
  char  filename[STR_LEN];

  printf ("Object name to load? ");
  getline(object_name,STR_LEN);
  strcpy(filename,object_name);
  strcat (filename,UI_FILE_EXT);
  if (!file_exist(filename))

    printf("**** Cannot find User Interface data file for %s\n",object_name);
    printf("**** Setting options to User Interface defaults\n");
    init_user_info(user_info,object_name);
  else
    get_user_info_from_file(user_info,object_name);
    printf("User Interface Options for %s Loaded\n",object_name);
```

```
wait_key();
/* load_UI_data_file */

/**********************************************************************/

slice_UI_data_file (user_info,str_comm,object_name)
  USER_INFO_STRUC    *user_info;
  char               str_comm[];
  char               object_name[];

  char     z_space_file[STR_LEN],slice_version[5];

  strcpy(z_space_file,object_name);
  strcat(z_space_file,Z_SPACE_EXT);
  printf("Slice Version to use (Default %s)? ",SLICE_VER);
  getline(slice_version,4);
  if (slice_version[0] == '\0') strcpy(slice_version,SLICE_VER);
  set_command_line (user_info,object_name,str_comm,z_space_file,slice_version);
  run_slice (user_info, str_comm,z_space_file);
} /* slice_UI_data_file */

/**********************************************************************/

show_option_menu(user_info,object_name)
  USER_INFO_STRUC  *user_info;
char               object_name[];

char             filename [STR_LEN];
unsigned int  i;

CLRSCR;
printf ("                            - SLICE USER INTERFACE -\n");
printf ("                                  Version %-1.2f\n\n\n",VERSION);
printf ("     Current Object: %s\n\n",object_name);
printf ("Option  Description                                         CAD units
printf ("------  -----------                                         ---------
printf (" (1)    DATABASE File Name                                  %s ",user_info->
switch (user_info->file_type) {
  case 0:
    printf ("(ASCII)");
    break;
  case 1:
    printf ("(Binary)");
    [illegible]

[illegible]

[illegible]  Resolution                                  %-8.[illegible] user_in

printf       [illegible]    Layer Thickness                              ");
if   [illegible] = 0.0)

  printf ("%-8.3f Fixed   %c%u\n", user_info->z_spacing.exact(user_info,user_
         scaled(user_info,user_info->z_spacing));
  else {
  printf    [illegible]

printf      (4)     X hatch spacing                              %-8.3f      %c
   user_info->x_hatch_spacing.exact(user_info,user_info->x_hatch_spacing),
  scaled(user_info,user_info->x_hatch_spacing));
printf  (" (5)     Y hatch spacing                              %-8.3f      %c
  user_info->y_hatch_spacing.exact(user_info,user_info->y_hatch_spacing),
  scaled(user_info,user_info->y_hatch_spacing));
print      (6)     60/120 degree hatch spacing                  %-8.3f      %c
  user_info->angle_hatch_spacing.exact(user_info,user_info->angle_hatch_spac
```

```
    scaled(user_info,user_info->angle_hatch_spacing));
  printf (" (7)    X skin fill spacing                              %-8.3f        %c"
    user_info->x_flat_fill_spacing,exact(user_info,user_info->x_flat_fill_spacir
    scaled(user_info,user_info->x_flat_fill_spacing));
  printf (" (8)    Y skin fill spacing                              %-8.3f        %c
    user_info->y_flat_fill_spacing,exact(user_info,user_info->y_flat_fill_spacir
    scaled(user_info,user_info->y_flat_fill_spacing));
  printf (" (9)    Minimum Surface Angle for scanned facets         %u\n",user_info->
  printf (" (10)   Minimum Hatch Intersect Angle                    %u\n",user_info->
  printf (" (11)   Segment Output File Name                         %s\n",user_info->
  printf (" (Q)    Quit, return to Main Menu\n");
  printf ("\n");
} /* show_option_menu */

/*****************************************************************************/

process_UI_option (user_info,str_comm,object_name)
  USER_INFO_STRUC    *user_info;
  char               str_comm[];
  char               object_name[];
{
  unsigned int  option_val,temp;
  char option_str[5],option_chr;
  float temp_float;

  do {
    show_option_menu(user_info,object_name);
    printf ("Alter which Option? ");
    getline(option_str,2);
    option_chr = toupper(option_str[0]);
    option_val = 0;
    temp = 0;
    parse_number(option_str,&temp,&temp_float);
    option_val = temp_float;
    process_option (option_val,user_info);
  } while (option_chr != 'Q');
} /* process_UI_option */

/*****************************************************************************/

process_option (option_val,user_info)
  int              option_val;
  USER_INFO_STRUC  *user_info;
{
  int  temp;

  switch (option_val)
  {
    case  1 :  input_filename (user_info);
               break;
    case  2 :  printf ("Enter resolution value : ");
               user_info->resolution = read_float(FALSE);
               if (user_info->resolution == 0)
                 user_info->resolution = 1.0;
               break;
    case  3 :  input_z_spacing (user_info);
               break;
    case  4 :  input_hx (user_info);
               break;
    case  5 :  input_hy (user_info);
               break;
    case  6 :  input_ahs (user_info);
               break;
    case  7 :  input_hfx (user_info);
               break;
    case  8 :  input_hfy (user_info);
               break;
```

```
    case  9 :  input_msa (user_info);
               break;
    case  10:  input_mia (user_info);
               break;
    case  11:  printf ("Enter segment file name : ");
               getline(user_info->segfile_name,STR_LEN-1);
               if (strchr(user_info->segfile_name,'.') == NULL)
                 strcat(user_info->segfile_name,SLICE_OUTPUT_EXT);
               break;
  }
} /* process_option */
/**************************************************************************/

input_filename (user_info)
  USER_INFO_STRUC  *user_info;
{
  char line[2];

  printf ("Object Data File Name? ");
  getline(user_info->input_filename,STR_LEN-1);
  if (strchr(user_info->input_filename,'.') == NULL)
    strcat(user_info->input_filename,SLICE_INPUT_EXT);
  do {
    printf ("File Type Binary or ASCII (B,A)? ");
    getline(line,1);
    line[0] = toupper(line[0]);
  } while ((line[0] != 'A') && (line[0] != 'B'));
  if (line[0] == 'A') user_info->file_type = 0;
  else user_info->file_type = 1;
} /* input_filename */

/**************************************************************************/

input_ffy (user_info)
  USER_INFO_STRUC  *user_info;
{
  printf ("Enter Y flat fill spacing value (ffy): ");
  user_info->y_flat_fill_spacing = read_float(TRUE);
} /* input_ffy */

/**************************************************************************/

input_ffx (user_info)
  USER_INFO_STRUC  *user_info;
{
  printf ("Enter X flat fill spacing value (ffx): ");
  user_info->x_flat_fill_spacing = read_float(TRUE);
} /* input_ffx */

/**************************************************************************/

input_hy (user_info)
  USER_INFO_STRUC  *user_info;
{
  printf ("Enter Y hatch spacing value (hy):");
  user_info->y_hatch_spacing = read_float(TRUE);
} /* input_hy */

/**************************************************************************/

input_hx (user_info)
  USER_INFO_STRUC  *user_info;
{
  printf ("Enter X hatch spacing value (hx): ");
  user_info->x_hatch_spacing = read_float(TRUE);
} /* input_hx */

/**************************************************************************/
```

```
input_ahs (user_info)
  USER_INFO_STRUC  *user_info;

  printf ("Enter a value for 60-120 angle hatch spacing : ");
  user_info->angle_hatch_spacing = read_float(TRUE);
  /* input_ahs */

**************************************************************************

input_mia (user_info)
  USER_INFO_STRUC  *user_info;

  printf ("Enter Minimum Intersect Angle value (mia): ");
  user_info->min_intersect_angle = read_int();
  /* input_mia */

**************************************************************************

input_msa (user_info)
  USER_INFO_STRUC  *user_info;

  printf ("Enter Minimum Surface Angle value (msa): ");
  user_info->min_surface_angle = read_int();
  /* input_msa */

*************************************************************************/

select_centering (user_info)
  USER_INFO_STRUC  *user_info;

  char  ans;

  printf ("Enter Y for centering, N for not centering : ");
  ans = getchar();
  if (toupper(ans) == 'Y') user_info->centering = TRUE;
  else user_info->centering = FALSE;
  /* select_centering */


************************************************************************/

init_user_info (user_info,object_name)
  USER_INFO_STRUC  *user_info;
  char             object_name[];

  unsigned i;

  user_info-> version = VERSION;
  strcpy(user_info->input_filename,object_name);
  strcat(user_info->input_filename, SLICE_INPUT_EXT);
  user_info->file_type             = 1;
  user_info->resolution            = 1000;
  user_info->z_spacing             = 0.01;
  user_info->y_flat_fill_spacing = 0.0;
  user_info->x_flat_fill_spacing = 0.003;
  user_info->y_hatch_spacing      = 0.0;
  user_info->x_hatch_spacing      = 0.0;
  user_info->angle_hatch_spacing = 0.05;
  user_info->min_surface_angle    = 50;
  user_info->min_intersect_angle = 0;

  strcpy(user_info->extra_parameters,"");
  strcpy(user_info->segfile_name,object_name);
  strcat(user_info->segfile_name, SLICE_OUTPUT_EXT);
  user_info->centering = FALSE;

  for (i=0; i<MAX_Z_TABLE; i++)
    user_info->z_level[i] = -1;
  /* init_user_info */
```

```
*******************************************************************************

set_command_line (user_info.object_name,str_comm,z_space_file,slice_version)
  USER_INFO_STRUC    *user_info;
  char               object_name[];
  char               str_comm[];
  char               z_space_file[],slice_version[];

  char     ch[STR_LEN];
  int      i;
  [illegible] *file_ptr;

  [illegible]
  [illegible]
  [illegible]
  [illegible]
  [illegible]

  switch (user [illegible]
    case 1:
      strcat (str_[illegible], BINARY_[illegible]
      strcat (str_comm, " ");
      break;

  if (strcmp (slice_version,"[illegible]" [illegible]
   strcat (str_comm, SCALE_TXT);
  else strcat (str_comm, [illegible]);
  sprintf (ch, [illegible], user_info->resolution);
  strcat (str_comm, ch);

  if (user_info->z_spacing != 0.0)
  {
    strcat  (str_comm, Z_SPACE_TXT);
    sprintf (ch, " %u ", scaled(user_info,user_info->z_spacing));
    strcat  (str_comm, ch);
  } else {
    strcat (str_comm, VAR_Z_SPACE_TXT);
    strcat (str_comm, " ");
    strcat (str_comm, z_space_file);
    strcat (str_comm, " ");

    openfile (z_space_file, &file_ptr, "w");
    for (i=0; ((i < MAX_Z_TABLE) && (user_info->z_level[i] >= 0)); i++)
      fprintf(file_ptr,"%u %u\n",
        scaled(user_info,user_info->z_level[i]),
        scaled(user_info,user_info->z_level_spacing[i]));
    fclose(file_ptr);
  }

  if (user_info->x_flat_fill_spacing != 0)
  {
```

```
    strcat (str_comm, X_FLAT_FILL_TXT);
    sprintf(ch, " %u ", scaled(user_info,user_info->x_flat_fill_spacing));
    strcat (str_comm, ch);
  }
  if (user_info->y_flat_fill_spacing != 0)
  {
    strcat (str_comm, Y_FLAT_FILL_TXT);
    sprintf(ch, " %u ", scaled(user_info,user_info->y_flat_fill_spacing));
    strcat (str_comm, ch);
  }

  if (user_info->x_hatch_spacing != 0)
  {
    strcat (str_comm, X_HATCH_TXT);
    sprintf(ch, " %u ", scaled(user_info,user_info->x_hatch_spacing));
    strcat (str_comm, ch);
  }
  if (user_info->y_hatch_spacing != 0)
  {
    strcat (str_comm, Y_HATCH_TXT);
    sprintf(ch, " %u ", scaled(user_info,user_info->y_hatch_spacing));
    strcat (str_comm, ch);
  }
  if (user_info->angle_hatch_spacing !=0)
  {
    strcat (str_comm, ANGLE_HATCH_TXT);
    sprintf (ch, " %u ", scaled(user_info,user_info->angle_hatch_spacing));
    strcat  (str_comm, ch);
  }

  if (user_info->min_surface_angle != 0)
  {
    strcat (str_comm, MSA_TXT);
    sprintf(ch, " %u ", user_info->min_surface_angle);
    strcat (str_comm, ch);
  }
  if (user_info->min_intersect_angle != 0)
  {
    strcat (str_comm, MIA_TXT);
    sprintf(ch, " %u ", user_info->min_intersect_angle);
    strcat (str_comm, ch);
  }
  if (user_info->centering)
  {
    strcat (str_comm, CENTERING_TXT);
    strcat (str_comm, " ");
  }

  strcat (str_comm, OUT_FILE_TXT);
  strcat (str_comm, " ");
  strcat (str_comm, user_info->segfile_name);

  if (strlen(user_info->extra_parameters)>0) {
    strcat(str_comm, " ");
    strcat(str_comm, user_info->extra_parameters);
  }
} /* set_command_line */
/*****************************************************************************
```

SLICE.C - Page 20 - 4/15/1988 5:57 PM

```
run_slice (user_info,str_comm,z_space_file)
  USER_INFO_STRUC   *user_info;
  char              str_comm[];
  char              z_space_file[];
{
  int  rc,i = 0,j = 0;
  char temp[STR_LEN];

/*
  printf ("Slice Command Line:\n");
  while (str_comm[i] != '\0') {
    if ((j > 65) && (str_comm[i] == ' ')) {
      j = 7;
      printf("\n        ");
    }
    printf ("%c", str_comm[i++]);
    j++;
  };
  printf("\n\n");
*/
  fflush(stdout);

/*
    timestamp and execute slice command
*/
  time(&system_time);
  time_val1 = times(&timestamp1);
  rc = system (str_comm);
  time_val2 = times(&timestamp2);

/*
    record slice activity in log file
*/
  openfile (log_file_name, &log_file_ptr, "a");
  fprintf(log_file_ptr,"%s\n",str_comm);
  fprintf(log_file_ptr,"%s CODE=%d REAL=%lu CPU=%lu\n",ctime(&system_time),rc,
    time_val2-time_val1,
    timestamp2.tms_cutime + timestamp2.tms_cstime
    - timestamp1.tms_cutime - timestamp1.tms_cstime);
  fclose(log_file_ptr);


  if (file_exist(z_space_file))
  {
    strcpy(temp,"rm ");
    strcat(temp,z_space_file);
    system(temp);
  }
  if (rc != 0)
  {
    printf ("\n*\n");
    printf ("* WARNING:  SLICE ERROR DETECTED  RC = %d\n", rc);
    printf ("*\n");
  } else printf (" SLICE COMPLETED\n");

  wait_key();
} /* run_slice */
/*****************************************************************************/
```

```
main(argc,argv)
  int  argc;
  char *argv[];
{
  USER_INFO_STRUC    user_info;
  char               object_name[STR_LEN];
  char               str_comm[200], ans[STR_LEN],ans2[STR_LEN];

  strcpy  (ans, "    ");
  get_object_name (argc,argv,object_name);
  get_user_info_from_file (&user_info, object_name);

  process_UI_main (&user_info,str_comm,object_name);
  update_last_UI (object_name);
  printf("\n");
  exit(0);
}
```

```
#define     LF               10
#define     MAX_Z_TABLE      20
#define     STR_LEN          81
#define     BOOLEAN          short int
#define     TRUE             1
#define     FALSE            0

#define     VERSION_TXT       "version"
#define     IN_FILE_TXT       "datafile"
#define     FILETYPE_TXT      "filetype"
#define     EXTRA_PARAMS_TXT "extra"

#define     OUT_FILE_TXT      "-sf"
#define     Z_SPACE_TXT       "-zs"
#define     SCALE_TXT         "-scale"
#define     RES_TXT           "-res"
#define     X_FLAT_FILL_TXT   "-hfx"
#define     Y_FLAT_FILL_TXT   "-hfy"
#define     X_HATCH_TXT       "-hx"
#define     Y_HATCH_TXT       "-hy"
#define     ANGLE_HATCH_TXT   "-ha"
#define     MSA_TXT           "-msa"
#define     MIA_TXT           "-mia"
#define     BINARY_TXT        "-b"
#define     CENTERING_TXT     "-c"
#define     VAR_Z_SPACE_TXT   "-zs+"

typedef struct   /* NOTE: Not the same as in SLICE */
{
  float        version;
  char         input_filename[STR_LEN];
  unsigned     file_type;
  char         segfile_name[STR_LEN];
  float        resolution;
  float        z_spacing;
  float        x_flat_fill_spacing;
  float        y_flat_fill_spacing;
  float        x_hatch_spacing;
  float        y_hatch_spacing;
  float        angle_hatch_spacing;
  unsigned     min_surface_angle;
  unsigned     min_intersect_angle;
  unsigned     centering;
  char         extra_parameters[STR_LEN];
  float        z_level[MAX_Z_TABLE],z_level_spacing[MAX_Z_TABLE];
} USER_INFO_STRUC;
```

```
{ ==========================================================================

    STEREO, Sterolithography Device Driver

    for 3D Systems' Sterolithography System

    Version 3.00  by Tarnz Technologies

 ==========================================================================

    STEREO is a memory-resident laser controller device driver.  It
    interfaces between the Background Task's Software Interrupt
    Handler and a program wanting to control the laser apparatus
    using easy text-based commands.

    STEREO receives and processes simple (X,Y) laser position commands
    passed to it by some other program using a software interrupt vector.
    The CLIFF Turbo Pascal program is just such a program; it can read
    commands from either the computer's keyboard or from disk files and
    then pass them along to this program.

    STEREO, like an MSDOS driver, can be called by programs written
    in any language, including assembly and BASIC.  The interface will
    usually be a special subroutine that invokes the STERO software
    interrupt.  Unlike an MSDOS driver, STEREO cannot be referenced
    directly by a filename.

    STEREO's device driver format is simpler, faster, and more clean
    than an MSDOS device driver.  STEREO processed a complete text
    string (a line) at a time, as opposed to one character at a time
    for an MSDOS device driver.  If desired, an official MSDOS device
    driver (STL:, LSR: or whatever) could be added in later.

    STEREO understands the following commands:

         BX 0-65535    Beginning X position       (position)
         BY 0-65535    Beginning Y position       (position)
         JX 0-65535    Jump to new X position     (position)
         JY 0-65535    Jump to new Y position     (position)
         NX 0-65535    Next X position            (position)
         NY 0-65535    Next Y position            (position)
         SS 1-65535    Step Size                  (rel incr)
       ! SP 5-6553,..  multi-pass Step Periods    (10 us)
         SD 0-65535    Scanning Delay             (step periods)
         JS 1-65535    Jump Size                  (rel incr)
         JD 0-65535    Jump Delay                 (step periods)
         LO 0-65535    Laser On delay             (10 us)
         LF 0-65535    Laser Off delay            (10 us)
       + NS            eNter Sequence mode        -
       + AB            Enter Absolute mode        -
         EX            Execute                    -
         EC            Execute and Clear          -
         CL            Clear table                -
       ! MD AS +/-     set Auto-Shutter mode      (on/off)
       ! MD BL +/-     set BLock mode             (on/off)
       ! MD PA +/-     set Pos Ack mode           (on/off)
       ! SR            Soft Reset
       ! HR            Hard Reset
       ! RC 1-10       Redraw pass Count          (# passes)
```

```
! RD 0-65535   Redraw Delay               (step periods)
! RS 0-65535   Redraw Size                (distance)
! VC 1-10      riVet pass Count           (# passes)
! VP 5-6553,.. riVet step Periods         (10 us)
! VR 0-65535   riVet Reduction amount     (distance)
! VX 0-65535   riVet end X position       (position)
! VY 0-65535   riVet end Y position       (position)
! WI 0-32767   Wait for Idle              (delay)

- New Version 2.80 Commands -

! DC +/-        set Drift Correction mode (on/off)
! R1 0-65535,0-65535   new sensor #1 Reference (X,Y) position
! R2 0-65535,0-65535   new sensor #2 Reference (X,Y) position
! D1 0-65535,0-65535   new sensor #1 Drift adjustment (X,Y) position
! D2 0-65535,0-65535   new sensor #2 Drift adjustment (X,Y) position
! BG 0-65535,0-65535   define BeGin (X,Y) position
! JP 0-65535,0-65535   JumP to new (X,Y) position
                       ( preferred over JX, JY combination )
! MV 0-65535,0-65535   MoVe to next (X,Y) position
                       ( preferred over MX, NY combination )
! RV 0-65535,0-65535   make a RiVet to next (X,Y) position
                       ( preferred over VX, VY combination )
```

where:

```
10 us         is the # of 10s of microseconds
              resolution = 0.84 us (from 1.19 MHz clock)
position      is the absolute position in the field
distance      is the absolute distance in step size units
rel incr      is the relative # of position increments
# passes      is the number of redraw passes
step periods  is the time to cover that # of steps
              programmed by SP command (= tick counts)
delay         delay value in milliseconds (may be faster
              on faster computers)
```

In the above list, following each two-character command is the range of numbers allowed as arguments to the command. Each command must be on a separate line, ending with a CR or CR/LF sequence. All spaces are ignored. All numbers are in unsigned decimal.

The Control Instruction Set is intended to be compatible with General Scanning's DG Series Electronic Packages for Laser Control. Only the Vector Mode is supported. The Raster Mode is not supported. The step and delta functions of the Vector Mode are also unsupported. No Z-axis control is supported yet. Commands marked with an '*' are not fully implemented as per the DG specification for functional reasons. Commands marked with '+' are included only for the sake of complete command compatibility. '!' denotes new commands not available on the DG devices.

DG Version 2.6 Vector Mode Commands not supported:

```
ST     enter STep mode
RE     REset to top of stack in step mode
DL     enter DeLta mode
Q1     Query IB 1
```

```
STEREO.PAS    - Page 3 -                    4/15/1988    6:04 PM

      Q2             Query IB 2

   The command line with invokes STEREO and causes it to be installed
   in memory takes the form:

     STEREO [/options]

   where /options are any number of user-selectable options:

     /D     -  debug mode, display vector information
     /NV    -  no constant vector velocity
     /NG    -  no geometric correction
     /NC    -  no version check at install time

   STEREO can only be installed once after the computer has been
   powered up.  If different options are required, the computer
   system will have to be completely rebooted.

   The SP (and VP) command has multiple arguments.  Each of up to ten
   passes of redraw can have its own step period.  The SP command can
   have 1 to 10 arguments, each a step period for a pass:

     SP sp0,sp1,sp2,sp3...

   where sp0 is the step period for redraw pass 0 (the original vector
   move), sp1 is the step period for redraw pass 1, and so on.  /V121
   option is not longer supported.

   Geometric correction is automatically invoked.  If geometric
   correction is not desired, the option /NG or /GEO NO should be
   specified on the command line.  Geometric correction occurs on
   the endpoints of any vector STEREO passes to the software interrupt
   handler.

   STEREO code came from Version 1.40 of CLIFF, which originally
   performed the command translation.  This memory-resident STEREO
   device driver was formed to speed up 3D Systems' supervisory
   programs, written in GWBASIC and Turbo BASIC.  With the Geo
   Correct Table, STEREO takes up approximately 80K of memory,
   increasing to about 150K the amount of main memory used by the
   complete laser controller system and its data structures.

   Axes Control Options:                              DEFAULT
     /X +/-         select X-axis direction              +
     /Y +/-         select Y-axis direction              +
     /SWAPXY        swap X and Y coordinates             no
     /GEO XY|YX|NO  select geo correct sequence          YX
                    (used for old style)
     /AXESBEGIN     to axes-control begin pos            no

=========================================================================

Recent History:
 8/18/87  Ver 2.02  STEREO released
                    memory resident portion of Ver 1.x CLIFF process
                    WI Wait for Idle command added
 8/22/87  Ver 2.03  Stuart's new Geometric Correction
                    Y is the first, X is the second mirror
```

```
                       /NC no version check flag
                       jump vectors of 0 steps skipped
                       CvtInt now works for 32768 ($8000)
                       Step Periods supported for stream (non-block) mode
  9/25/87  Ver 2.04    Geometric Correction delta bugs fixed
  9/23/87  Ver 2.12    STEREO Axes Control added
                       new options /X, /Y, /SWAPXY, /GEO
  9/30/87  Ver 2.25    Table-Interpolation Geometric Correction installed
 10/26/87  Ver 2.26    Wait for Idle argument is 100 minimum
                       /NG prevents loading of STEREO.GEO
 10/28/87  Ver 2.27    improved Geometric Correction formula
 11/12/87  Ver 2.30    first Beta software release
 11/18/87  Ver 2.31    allow axes control independent of geo correction
                       /AXESBEGIN option added to axes-control BX,BY
                       GeoCorrectTable size made programmable (70 elements/axis
                       added TableDivisor for GeoCorrectTable
 12/11/87  Ver 2.40    STEREO upgraded to Turbo Pascal Version 4.0
                       STEREO always returns with Queue Size Change in CX
                       GeoCorrectTable storage allocated on heap dynamically
                       max GeoCorrectTable size increased to 90 by 90
                       some variables changed to Word or LongInt type
 12/16/87  Ver 2.41    GeoCorrect overwrite / memory alloc debugged
                       QueueCount substituted for QueueSize calculation
 12/21/87  Ver 2.43    Check for Break turned off
                       improved keyboard and Ctrl-Break Abort service
  1/04/88  Ver 2.50    zero-length vectors ignored
                       Ctrl-Break check looks at scan code now
  1/27/88  Ver 2.60    better STEREO.GEO processing
                       blanks allowed around commas separating numbers
                       check for too few or too many entries in STEREO.GEO
                       no mark and redraw around executes when redraw count is 1
                       OkayForRedrawCommand flag added to limit redundant
                         mark and redraw commands
  3/09/88  Ver 2.80    added copyright notice
                       implemented drift correction logic for profiler sensors
                       reduced ASCII overhead for begin, jump, and next commands
                       installed support for binary STEREO commands
                       new STEREO commands:
                         DC, R1, R2, D1, D2, SE, JP, MV, RV
  4/09/88  Ver 3.00    production release

}

{$R-,S-,I-,D+,T-,F-,V-,B-,N-,L+}
{$M 4096,1,65536}

uses Dos,Crt;

type
  str4  = string[4];
  str16 = string[16];
  str80 = string[80];
  BitArray = array[0..15] of Word;
  GeoCorrectTableType = array[0..10000] of LongInt;
  GeoCorrectTablePtr = ^GeoCorrectTableType;
  FpPointerStructType = array[0..8] of Byte;
  FpPointerType = ^FpPointerStructType;
  PositionType = record
    X: Real;
    Y: Real;
```

```
STEREO.PAS   - Page 5 -                     4/15/1988   6:04 PM

  end;
  SensorDataType = record
    Ref: PositionType;
    Adj: PositionType;
  end;

var
  FirstVar: Byte;   { must be first variable defined }
  ch,key: Char;
  temp,cmd,TextCommand,OperationMnemonics,Operand: String;
  StereoVersion: str16;
  count,i,j,remline,Er,OpNum,code,code2: Integer;
  SensorNum,IOerr: Integer;
  GeoFile,DefaultFile: text;
  tempX,tempY,X1,Y1,X2,Y2,oldX2,oldY2: Real;
  arg,beginXpos,beginYpos,Xpos,Ypos,oldX,oldY: Real;
  FirstX,NegX,NegY,SwapXY,SwapBegin: Boolean;
  first,VelocityFlag,DebugMode,Redrawing,done: Boolean;
  OkayForRedrawCommand: Boolean;
  _Step_Size,_Step_Period,_Scan_Delay,_Jump_Delay: Word;
  _Jump_Size,_Rivet_Reduction: Real;
  _Laser_On_Delay,_Laser_Off_Delay: Word;
  _Redraw_Count,_Redraw_Delay,_Redraw_Size: Word;
  KeyAbort,VersionCheckFlag,GeoCorrectFlag,DoingRivet: Boolean;
  DriftCorrectionFlag,BinaryFlag: Boolean;
  changeX,changeY,ChangeV,BrokenX,BrokenY: Real;
  deltaX,deltaY,steps,GeoDeltaX,GeoDeltaY: Real;
  Distance,IntDeltaX,IntDeltaY: Integer;
  IntSteps,TotalSteps,TempSteps: Word;
  RivetMainPeriod,CurrentRedrawCount,_Rivet_Count: Word;
  StoreCount,QueueCount: Word;
  angX,angY,tanX,GeoScale,GeoFact: Real;
  FieldX,FieldY,StartX,StartY,EndX,EndY,GeoEndX,GeoEndY,Xcoord,Ycoord: Real;
  DiscreteX,DiscreteY,DiscreteSteps: Word;
  regs: Registers;
  XC,YC,XCount,YCount,CoordCount,TableDivisor: Word;
  StereoSize: LongInt;
  CommandOfs,CommandSeg: Word;
  data,Return: Byte;
  XGeoCorrectTable,YGeoCorrectTable: GeoCorrectTablePtr;
  Sensor: array[1..2] of SensorDataType;
  DriftGain: PositionType;
  LastVar: Byte;   { must be last variable defined }

const
  ThisStereoVersion = '3.00';
  MinSystemVersion  = '2.30';
  CtrlBreak = #0;
  HexDigits: str16 = '0123456789ABCDEF';
  sp40 = '                                        ';
  Indent1 = 4;
  Indent2 = 41;
  AllBits = $FFFF;
  BitValue: BitArray =
    ($0001, $0002, $0004, $0008, $0010, $0020, $0040, $0080,
     $0100, $0200, $0400, $0800, $1000, $2000, $4000, $8000);
  Shutter = 0;  { control word bit 0 - shutter open/closed }
  _BIOSVECTOR   = $16;
  _STEREOVECTOR = $65;
  MaxGeo = 100;       { maximum GeoCorrectTable Index }
```

```
  GeoMult = 4096;      { GeoCorrectTable LongInt multiplier }
  StepRound = 0.02;    { rounding value for # of laser steps }

label ExitProgram;

function StartOfProgramCode: String;
begin
  StartOfProgramCode :=
    'STEREO Device Driver Version 2.80 Copyright (C) 1988 by Tarnz Technologies
end;

{$i laser.inc}  { include laser interface library }

var
  StepPeriodsArray,RivetPeriodsArray: _StepPeriodsType;

function __StereoOk: Boolean;
type
  CopyType  = array[1..20] of char;
var
  CopyPtr: ^CopyType;
  CopyStr: string[20];
begin
  with regs do begin
    AX := ($35 shl 8) or _STEREOVECTOR;
    MsDos(regs);
    CopyPtr := Ptr(ES,57);
  end;
  move(CopyPtr^[1],CopyStr[1],18);
  CopyStr[0] := #18;
  if CopyStr = 'Tarnz Technologies' then begin
    __StereoOk := true;
    with regs do
      CopyPtr := Ptr(ES,30);
    move(CopyPtr^[1],StereoVersion[1],4);
    StereoVersion[0] := #4;
  end else begin
    __StereoOk := false;
    StereoVersion := '?.??';
  end;
end;

function upper(text: String): String;
var
  i: Integer;
  temp: String;
begin
  temp := text;
  for i := 1 to length(temp) do temp[i] := upcase(temp[i]);
  upper := temp;
end;

function many(Ch: Char;num: Integer): String;
var
  temp: String;
  i: Integer;
begin
  temp := '';
  for i:=1 to num do temp  := temp+Ch;
  many := temp;
```

```
end;

procedure ReadCommandLine(var line: string);
var
  i: Integer;
begin
  line := ParamStr(1);
  for i:=2 to ParamCount do
    line := line + ' ' + ParamStr(i);
end;

function CvtDelta(num: Real): Word;
begin
  num := num * 256;
  if num < 32768.0 then CvtDelta := trunc(num)
    else if num > 32766.0 then CvtDelta := trunc(num)
      else CvtDelta := $8000;
end;

function sgn(num: Real): Integer;
begin
  if num<0 then sgn := -1
    else if num>0 then sgn := 1
      else sgn := 0;
end;

function CvtTicks(time: Real): word;
begin
  CvtTicks := trunc(time * 119.0 / 10.0);
end;

procedure SkipToNum(var str: String);
var
  i: Integer;
begin
  i := 1;
  while (i <= length(str)) and not(str[i] in ['0'..'9','.']) do inc(i);
  if i>1 then str := copy(str,i,79);
end;

procedure RealParse(var RealNum: Real);
var
  i: Integer;
begin
  i := 1;
  while (i <= length(temp)) and (temp[i] = ' ') do inc(i);
  delete(temp,1,i-1);
  if copy(temp,1,1) = '.' then insert('0',temp,1);
  val(temp,RealNum,code);
  if code<>0 then val(copy(temp,1,code-1),RealNum,code2);
  temp := copy(temp,code+1,99);
end;

procedure IntParse(var IntNum: Word);
var
  num: Real;
begin
  if length(temp)=0 then IntNum := 0
  else begin
    val(temp,num,code);
```

```
    if code<>0 then val(copy(temp,1,code-1),num,code2);
    IntNum := trunc(num);
    if code=0 then temp := ''
      else temp := copy(temp,code+1,99);
  end;
end;

function IntStr(num: Integer): str16;
var
  temp: str16;
begin
  if num>=0 then Str(num,temp) else Str(num+$8000,temp);
  IntStr := temp;
end;

function RealStr(num: Real): str16;
var
  temp: str16;
begin
  if num<0 then Str(65536.0+num:6:0,temp)
    else Str(num:6:0,temp);
  while temp[1]=' ' do temp := copy(temp,2,6);
  RealStr := temp;
end;

function spc(len: Integer): str80;
begin
  spc := copy(sp40+sp40+sp40,1,len);
end;

procedure msg(text: String);
begin
(* return text to calling program *)
end;

procedure msgln(text: String);
begin
(* return text + Cr to calling program *)
end;

function MemAbs(pt: Pointer): LongInt;
begin
  MemAbs := LongInt(seg(pt^)) shl 4 + ofs(pt^);
end;

{
  converts a Single type (4 bytes) number to a Real (6 bytes)
}
procedure ConvertStoR(s,r: FpPointerType);
begin
  r^[0]:=(((s^[3] shl 8) + s^[2]) shr 7) and $FF;
  r^[1]:=0;
  r^[2]:=0;
  r^[3]:=s^[0];
  r^[4]:=s^[1];
  r^[5]:=(s^[3] and $80) or (s^[2] and $7F);
  if r^[0]<>0 then Inc(r^[0],2); { e offset }
end;

function CharArgument: Char;
```

```
begin
  if BinaryFlag then begin
    CharArgument := char(Mem[CommandSeg:CommandOfs]);
    inc(CommandOfs);
  end else begin
    if length(Operand) > 0 then CharArgument := Operand[1]
      else CharArgument := #0;
    delete(Operand,1,1);  { slow, avoid for long strings }
  end;
end;

function WordArgument: Word;
var
  WordArg: Word;
  code,code2: Integer;
begin
  if BinaryFlag then begin
    WordArgument := Mem[CommandSeg:CommandOfs] shl 8 +
                    Mem[CommandSeg:CommandOfs + 1];
    inc(CommandOfs,2);
  end else begin
    val(Operand,WordArg,code);
    if code<>0 then val(Operand,WordArg,code2);
    WordArgument := WordArg;
    if code = 0 then Operand := ''
      else delete(Operand,1,code);
  end;
end;

function RealArgument: Real;
var
  RealArg: Real;
begin
  if BinaryFlag then begin
    ConvertStoR(@Mem[CommandSeg:CommandOfs],@RealArg);
    RealArgument := RealArg;
    inc(CommandOfs,4);
  end else begin
    if copy(Operand,1,1) = '.' then insert('0',Operand,1);
    val(Operand,RealArg,code);
    if code<>0 then val(copy(Operand,1,code-1),RealArg,code2);
    RealArgument := RealArg;
    if code = 0 then Operand := ''
      else delete(Operand,1,code);
  end;
end;

function TimeArgument: Word;
begin
  TimeArgument := CvtTicks(WordArgument);
end;

function PositionArgument: Word;
var
  PosArg: Word;
  code,code2: Integer;
begin
  if BinaryFlag then begin
    PositionArgument := MemW[CommandSeg:CommandOfs];
    inc(CommandOfs,2);
```

```
  end else begin
    while copy(Operand,1,1) = ' ' do delete(Operand,1,1);
    val(Operand,PosArg,code);
    if code<>0 then val(copy(Operand,1,code-1),PosArg,code2);
    PositionArgument := PosArg;
    if code = 0 then Operand := ''
      else delete(Operand,1,code);
  end;
end;

function PtrAdd(point: Pointer;offset: LongInt): Pointer;
var
  NewAddr: LongInt;
begin
  NewAddr := MemAbs(point)+offset;
  PtrAdd := Ptr(NewAddr div 16,NewAddr mod 16);
end;

function StatusKey: Char;
begin
  with regs do begin
    AX := $0100;
    Intr(_BIOSVECTOR,regs);
    StatusKey := chr(AH);  { return scan code }
  end;
end;

procedure SIHerror;
begin
  Return := Er;
end;

function TryCommand: Boolean;
begin
  if Er=3 {queue full} then TryCommand := true
    else TryCommand := false;
  if keypressed {abort} then begin
    if StatusKey = CtrlBreak then begin
      TryCommand := false;
      KeyAbort := true;
    end;
  end;
end;

function TryBlockCommand: Boolean;
begin
  if (Er=3) {command queue full} or (Er=6) {exec queue full}
    then TryBlockCommand := true
      else TryBlockCommand := false;
  if keypressed {abort} then begin
    if StatusKey = CtrlBreak then begin
      TryBlockCommand := false;
      KeyAbort := true;
    end;
  end;
end;

procedure newX(num: Real);
begin
  oldX := Xpos;
```

```
  Xpos := num;
end;

procedure newY(num: Real);
begin
  oldY := Ypos;
  Ypos := num;
end;

{
    AxesControl -- adjust axes
}
procedure AxesControl(oldX,oldY: Real;var retX,retY: Real);
begin
  if SwapXY then begin
    retY := oldX;
    retX := oldY;
  end else begin
    retX := oldX;
    retY := oldY;
  end;
  if NegX then retX := 65535.0 - retX;
  if NegY then retY := 65535.0 - retY;
end;


procedure SetRedrawCount(RedrawCount: Integer);
begin
  if RedrawCount<>CurrentRedrawCount then begin
   CurrentRedrawCount := RedrawCount;
    Er := 3;
    while TryCommand do
      Er := __SetRedrawCount(CurrentRedrawCount);
    inc(QueueCount,3);
    SIHerror;
  end;
end;

{
   Laser Motion Routines:

    * ResetRedraw    - just mark for beginning of block
    * PerformRedraw  - redraw and mark last section
    * MoveLaser      - new move alg using redraw & vector slicing
    * JumpLaser      - controlled breakup of jump motion to limit overshoot
}

procedure ResetRedraw;
begin
  if OkayForRedrawCommand and __BlockModeOn then begin
    if DebugMode then msgln('Mark '+IntStr(_Redraw_Size));
    Er := 3;
    while TryCommand do
      Er := __Mark;
    inc(QueueCount);
    SIHerror;
  end;
  Distance := 0;
  Redrawing := false;
  OkayForRedrawCommand := false;
```

```
end;

procedure PerformRedraw;
begin
  if OkayForRedrawCommand and __BlockModeOn then begin
    if DebugMode then msgln('Redraw '+IntStr(_Redraw_Size));
    Er := 3;
    while TryCommand do
      Er := __Redraw;
    inc(QueueCount);
    SIHerror;
  end;
  Distance := 0;
  Redrawing := false;
  OkayForRedrawCommand := false;
end;

{
    CorrectForDrift -- develop drift gain term
}
procedure CorrectForDrift;
var
  quotient: Real;
begin
  quotient := Sensor[2].Ref.X - Sensor[1].Ref.X;
  if quotient <> 0 then
    DriftGain.X := (Sensor[2].Adj.X - Sensor[1].Adj.X) / quotient
      else DriftGain.X := 0;
(*
  writeln('CorrectForDrift-X:');
  writeln('2Xadj=',Sensor[2].Adj.X:8:2,' - 1Xadj=',Sensor[1].Adj.X:8:2,' /');
  writeln('2Xref=',Sensor[2].Ref.X:8:2,' - 1Xref=',Sensor[1].Ref.X:8:2);
  writeln('DriftGainX=',DriftGain.X:8:2);
*)
  quotient := Sensor[2].Ref.Y - Sensor[1].Ref.Y;
  if quotient <> 0 then
    DriftGain.Y := (Sensor[2].Adj.Y - Sensor[1].Adj.Y) / quotient
      else DriftGain.Y := 0;
(*
  writeln('CorrectForDrift-Y:');
  writeln('2Yadj=',Sensor[2].Adj.Y:8:2,' - 1Yadj=',Sensor[1].Adj.Y:8:2,' /');
  writeln('2Yref=',Sensor[2].Ref.Y:8:2,' - 1Yref=',Sensor[1].Ref.Y:8:2);
  writeln('DriftGainY=',DriftGain.Y:8:2);
*)
end;

{
    GeoCorrect -- geometric correct coordinate pair
}
procedure GeoCorrect(oldX,oldY: Real;var newX,newY: Real);
var
  GX11,GX12,GX21,GX22,GY11,GY12,GY21,GY22: Real;
  Xf,Yf,XfYf: Real;
  XIndex,YIndex,Lookup: Word;
begin
  if GeoCorrectFlag then begin
    XIndex := trunc(oldX / TableDivisor);
    if XIndex >= XCount then XIndex := XCount-1;
    YIndex := trunc(oldY / TableDivisor);
    if YIndex >= YCount then YIndex := YCount-1;
```

```
    Lookup := XIndex * YCount + YIndex;
    GX11 := XGeoCorrectTable^[Lookup];
    GX12 := XGeoCorrectTable^[Lookup+1];
    GX21 := XGeoCorrectTable^[Lookup+YCount];
    GX22 := XGeoCorrectTable^[Lookup+YCount+1];
    GY11 := YGeoCorrectTable^[Lookup];
    GY12 := YGeoCorrectTable^[Lookup+1];
    GY21 := YGeoCorrectTable^[Lookup+YCount];
    GY22 := YGeoCorrectTable^[Lookup+YCount+1];
    Xf := (oldX - TableDivisor * 1.0 * XIndex) / TableDivisor;
    Yf := (oldY - TableDivisor * 1.0 * YIndex) / TableDivisor;
    XfYf := Xf * Yf;
    newX := (GX11 + Xf * (GX21 - GX11) + Yf * (GX12 - GX11)
      + XfYf * (GX22 + GX11 - GX12 - GX21)) / GeoMult;
    newY := (GY11 + Xf * (GY21 - GY11) + Yf * (GY12 - GY11)
      + XfYf * (GY22 + GY11 - GY12 - GY21)) / GeoMult;
  end else begin
    newX := oldX;
    newY := oldY;
  end;
  if DriftCorrectionFlag then begin
(*
    writeln('DC-old: ',newX:8:2,',',newY:8:2);
*)
    newX := (newX - Sensor[1].Ref.X) * DriftGain.Y + Sensor[1].Adj.X;
    newY := (newY - Sensor[1].Ref.Y) * DriftGain.X + Sensor[1].Adj.Y;
(*
    writeln('DC-new: ',newX:8:2,',',newY:8:2);
*)
  end;
  if DebugMode then begin
    writeln('GX11=',GX11/GeoMult:7:2,' GX12=',GX12/GeoMult:7:2,
      ' GX21=',GX21/GeoMult:7:2,' GX22=',GX22/GeoMult:7:2);
    writeln('GY11=',GY11/GeoMult:7:2,' GY12=',GY12/GeoMult:7:2,
      ' GY21=',GY21/GeoMult:7:2,' GY22=',GY22/GeoMult:7:2);
    writeln('oldX=',oldX:7:2,' oldY=',oldY:7:2,' newX=',newX:7:2,' newY=',newY:'
    writeln;
  end;
end;

procedure JumpLaser;
begin
  AxesControl(Xpos,Ypos,EndX,EndY);
  AxesControl(oldX,oldY,StartX,StartY);
  changeX := EndX-StartX;
  changeY := EndY-StartY;
  if VelocityFlag then changeV := sqrt(sqr(changeX)+sqr(changeY))
    else if abs(changeX) < abs(changeY) then ChangeV := abs(changeY)
        else ChangeV := abs(changeX);
  steps := ChangeV / _Jump_Size;
  if steps>0 then begin
    deltaX := changeX / steps;
    deltaY := changeY / steps;
    IntSteps  := trunc(steps+StepRound) + 1;
    TotalSteps := 1;
    repeat
      BrokenX := StartX + deltaX*TotalSteps;
      BrokenY := StartY + deltaY*TotalSteps;
      TotalSteps := TotalSteps + 1;
      if TotalSteps >= IntSteps then begin
```

```
          BrokenX := EndX;
          BrokenY := EndY;
        end;
        GeoCorrect(BrokenX.BrokenY.FieldX,FieldY):
        Er := 3;                                  { add discrete jump }
        while TryCommand do begin
          Er := __AddVector(trunc(FieldX),trunc(FieldY),
                  0,0,1);                         { incl a 1 tick pause }
          OkayForRedrawCommand := true;
        end;
        inc(QueueCount,13);
        SIHerror;
      until TotalSteps >= IntSteps;
    end;
end;

procedure MoveLaser;
begin
  AxesControl(Xpos,Ypos.EndX,EndY):
  AxesControl(oldX,oldY.StartX,StartY);
  changeX := EndX - StartX:
  changeY := EndY - StartY:
  if VelocityFlag then changeV := sqrt(sqr(changeX) + sqr(changeY))
    else if abs(changeX) < abs(changeY) then ChangeV := abs(changeY)
        else ChangeV := abs(changeX):
  steps := ChangeV / _Step_Size;
  if steps>=1 then begin
    deltaX := changeX / steps;
    deltaY := changeY / steps;
    IntSteps  := trunc(steps+StepRound);
    IntDeltaX := CvtDelta(deltaX);
    IntDeltaY := CvtDelta(deltaY);
    TotalSteps := 0;
    repeat
      BrokenX := StartX + deltaX * TotalSteps;
      BrokenY := StartY + deltaY * TotalSteps;
      TempSteps := IntSteps - TotalSteps;
      if TempSteps>256 then TempSteps := 256;
      if (CurrentRedrawCount > 1) and (_Redraw_Size>0) then
        if Distance+TempSteps >= _Redraw_Size then begin
          TempSteps := _Redraw_Size - Distance;
          Redrawing := true;
        end;
      TotalSteps := TotalSteps + TempSteps;
      Distance := Distance + TempSteps;
      GeoCorrect(BrokenX,BrokenY,FieldX,FieldY);

{ Geometric Correction addition }
      if GeoCorrectFlag then begin
        GeoCorrect(BrokenX+TempSteps*DeltaX,BrokenY+TempSteps*DeltaY,
           GeoEndX,GeoEndY);
        changeX := GeoEndX - FieldX;
        changeY := GeoEndY - FieldY:
        ChangeV := sqrt(sqr(changeX) + sqr(changeY));
        steps := ChangeV / _Step_Size:
        GeoDeltaX := ChangeX / steps;
        GeoDeltaY := ChangeY / steps;
        DiscreteX := CvtDelta(GeoDeltaX);
        DiscreteY := CvtDelta(GeoDeltaY);
        DiscreteSteps := trunc(steps+StepRound);
```

```
      end else begin
        DiscreteX := IntDeltaX;
        DiscreteY := IntDeltaY;
        DiscreteSteps := TempSteps;
      end;

      Er := 3;  { send out move command }
      while TryCommand do begin
        Er := __AddVector(trunc(FieldX),trunc(FieldY),
                    DiscreteX,DiscreteY,DiscreteSteps);
        OkayForRedrawCommand := true;
      end;
      inc(QueueCount,13);
      SIHerror;
      if Redrawing then PerformRedraw;
    until TotalSteps = IntSteps;
  end;
end;

{
  - - - - -
}

procedure BeginX;
begin
  beginXpos := PositionArgument;
end;

procedure BeginY;
var
  X1,Y1,X2,Y2: Real;
begin
  beginYpos := PositionArgument;
  if SwapBegin then AxesControl(beginXpos,beginYpos,X1,Y1)
    else begin
      X1 := beginXpos;
      Y1 := beginYpos;
    end;
  GeoCorrect(X1,Y1,X2,Y2);
  Er := __SetHomePosition(trunc(X2),trunc(Y2));
  SIHerror;
end;

procedure BeginPosition;
begin
  BeginX;
  BeginY;
end;

procedure JumpX;
begin
  newX(PositionArgument);
end;

procedure JumpY;
begin
  newY(PositionArgument);
  if _Jump_Delay<>0 then begin
    JumpLaser;
    Er := 3;
```

```
    while TryCommand do
      Er := __AddPause(_Jump_Delay);
    inc(QueueCount,3);
    SIHerror;
  end;
end;

procedure PositionJump(X,Y: Real);
begin
  NewX(X);
  NewY(Y);
  if _Jump_Delay<>0 then begin
    JumpLaser;
    Er := 3;
    while TryCommand do
      Er := __AddPause(_Jump_Delay);
    inc(QueueCount,3);
    SIHerror;
  end;
end;

procedure JumpPosition;
begin
  JumpX;
  JumpY;
end;

procedure NextX;
begin
  newX(PositionArgument);
end;

procedure NextY;
begin
  newY(PositionArgument);
  MoveLaser;
end;

procedure PositionMove(X,Y: Real);
begin
  newX(X);
  newY(Y);
  MoveLaser;
end;

procedure MoveToPosition;
begin
  NextX;
  NextY;
end;

procedure StepSize;
begin
  _Step_Size := WordArgument;
end;

procedure StepPeriods;
var
  i: Integer;
begin
```

```
  PerformRedraw;
  if BinaryFlag then begin
    count := WordArgument;
    for i:=0 to count-1 do StepPeriodsArray.periods[i] := TimeArgument;
  end else begin
    count := 0;
    while (Operand <> '') and (count < 10) do begin
      StepPeriodsArray.periods[count] := TimeArgument;
      inc(count);
    end;
  end;
  StepPeriodsArray.num := count;
  if count>0 then begin
(*    if DebugMode then begin
      msg('New step periods array: ');
      for i:=0 to count-1 do msg(StepPeriodsArray.periods[i],' ');
      msgln('');
    end; *)
    Er := 3;
    if __BlockModeOn then begin
      while TryCommand do
        Er := __SetStepPeriods(StepPeriodsArray);
      inc(QueueCount,count*2+2);
    end else begin
      while TryCommand do
        Er := __AddChangeTimebase(StepPeriodsArray.periods[0]);
      inc(QueueCount,3);
    end;
    SIHerror;
  end;
  PerformRedraw;
end;

procedure ScanDelay;
begin
  _Scan_Delay := WordArgument;
end;

procedure JumpSize;
begin
  _Jump_Size := WordArgument;
  if _Jump_Size < 50 then _Jump_Size := 50;   { limit }
end;

procedure JumpDelay;
begin
  _Jump_Delay := WordArgument;
end;

procedure LaserOn;
begin
  _Laser_On_Delay := TimeArgument;
  Er := __SetTurnOnDelay(_Laser_On_Delay);
  SIHerror;
end;

procedure LaserOff;
begin
  _Laser_Off_Delay := TimeArgument;
  Er := __SetTurnOffDelay(_Laser_Off_Delay);
```

```
  SIHerror;
end;

procedure SequenceMode;
begin
  { no-operation }
end;

procedure AbsoluteMode;
begin
  { no-operation }
end;

procedure Execute;
begin
  PerformRedraw;
  Er := 3;
  while TryBlockCommand do
    Er := __Execute;
  SIHerror;
  ResetRedraw;
end;

procedure ExecuteClear;
begin
  PerformRedraw;
  Er := 3;
  while TryBlockCommand do
    Er := __ExecuteClear;
  QueueCount := 0;
  SIHerror;
  ResetRedraw;
end;

procedure ClearTable;
begin
  Er := __Clear;
  QueueCount := 0;
  if Er<>5 then SIHerror;  { not in block mode okay }
  ResetRedraw;
end;

procedure SetMode;
begin
  if BinaryFlag then begin
    case CharArgument of
      'A': Er := __SetAutoShutterMode(CharArgument);
      'B': Er := __SetBlockMode(CharArgument);
      'P': Er := __SetPosAckMode(CharArgument);
    end;
  end else begin
    if length(TextCommand)=5 then case TextCommand[3] of
      'A': Er := __SetAutoShutterMode(TextCommand[5]);
      'B': Er := __SetBlockMode(TextCommand[5]);
      'P': Er := __SetPosAckMode(TextCommand[5]);
    end;
  end;
  SIHerror;
end;
```

```
procedure SoftReset;
begin
  Er := __SetAutoShutterMode('-');   { off }
  SIHerror;
  Er := __SetBlockMode('-');         { off }
  SIHerror;
  Er := __SetPosAckMode('-');        { off }
  SIHerror;
  QueueCount := 0;
end;

procedure HardReset;
begin
  SoftReset;
  Er := __ResetCmdQueue;
  SIHerror;
end;

procedure RedrawCount;
begin
  _Redraw_Count := WordArgument;
  if _Redraw_Count < 1 then _Redraw_Count := 1
    else if _Redraw_Count > 10 then _Redraw_Count := 10;
  SetRedrawCount(_Redraw_Count);
  PerformRedraw;
  Er := 3;
  while TryCommand do
    Er := __SetRedrawCount(_Redraw_Count);
  inc(QueueCount,3);
  SIHerror;
end;

procedure RedrawDelay;
begin
  _Redraw_Delay := WordArgument;
  Er := 3;
  while TryCommand do
    Er := __SetRedrawDelay(_Redraw_Delay);
  inc(QueueCount,3);
  SIHerror;
end;

procedure RedrawSize;
begin
  _Redraw_Size := WordArgument;
end;

procedure RivetCount;
begin
  _Rivet_Count := WordArgument;
  if _Rivet_Count < 1 then _Rivet_Count := 1
    else if _Rivet_Count > 10 then _Rivet_Count := 10;
  _Rivet_Count := _Rivet_Count - 1;
end;

procedure RivetPeriods;
var
  i: Integer;
begin
  if BinaryFlag then begin
```

```
    count := WordArgument;
    RivetMainPeriod := TimeArgument;
    for i:=0 to count-1 do RivetPeriodsArray.periods[i] := TimeArgument;
  end else begin
    RivetMainPeriod := TimeArgument;
    count := 0;
    while (Operand <> '') and (count<10) do begin
      RivetPeriodsArray.periods[count] := TimeArgument;
      inc(count);
    end;
  end;
  RivetPeriodsArray.num := count;
(*  if DebugMode then begin
    msg('New rivet periods array: ');
    msg(' Main=',RivetMainPeriod);
    for i:=0 to count-1 do msg(' ',RivetPeriodsArray.periods[i]);
    msgln('');
  end; *)
end;

procedure RivetReduction;
begin
  _Rivet_Reduction := WordArgument;
end;

procedure ResetFromRivets;
begin
  if RivetPeriodsArray.num>0 then begin
    { set standard step periods }
    Er := 3;
    while TryCommand do
      Er := __SetStepPeriods(StepPeriodsArray);
    inc(QueueCount,StepPeriodsArray.num*2+2);
    SIHerror;
  end;
end;

procedure RivetX;
begin
  newX(PositionArgument);
end;

procedure RivetY;
var
  StartX,StartY,EndX,EndY: Real;
  ReducedStartX,ReducedStartY,ReducedEndX,ReducedEndY: Real;
  ReductionX,ReductionY: Real;
  DirX,DirY,ReducedDirX,ReducedDirY: Integer;
begin
  StartX := oldX;
  StartY := Ypos;
  EndX   := Xpos;
  EndY   := PositionArgument;
  { set rivet step periods }
  Er := 3;
  while TryCommand do
    Er := __AddChangeTimeBase(RivetMainPeriod);
  inc(QueueCount,3);
  SIHerror;
  { draw complete vector }
```

```
  NextY;
  DirX := sgn(EndX - StartX);
  DirY := sgn(EndY - StartY);
  ReductionX := _Rivet_Reduction * deltaX;
  ReductionY := _Rivet_Reduction * deltaY;
  ReducedStartX := StartX + ReductionX;
  ReducedStartY := StartY + ReductionY;
  ReducedEndX   := EndX   - ReductionX;
  ReducedEndY   := EndY   - ReductionY;
  ReducedDirX := sgn(ReducedEndX - ReducedStartX);
  ReducedDirY := sgn(ReducedEndY - ReducedStartY);
  DoingRivet := true;
  { do rivet if reduced vector size is greater than 0 units }
  if ((ReducedDirX = DirX) and (ReducedDirY = DirY))
    and (_Rivet_Count > 0) then begin
    { end standard redraw if any }
    PerformRedraw;
    if RivetPeriodsArray.num>0 then begin
      { set rivet step periods }
      Er := 3;
      while TryCommand do
        Er := __SetStepPeriods(RivetPeriodsArray);
      inc(QueueCount,RivetPeriodsArray.num*2+2);
      SIHerror;
    end;
    { set rivet pass count }
    SetRedrawCount(_Rivet_Count);
    { draw reduced vector - the rivet }
    PositionJump(ReducedStartX,ReducedStartY);
    PositionMove(ReducedEndX,ReducedEndY);
    { end rivet redraw }
    PerformRedraw;
    { restore original redraw pass count }
    SetRedrawCount(_Redraw_Count);
    { jump to end of full vector }
    PositionJump(EndX,EndY);
  end;
  { reset standard step periods }
  Er := 3;
  while TryCommand do
    Er := __SetStepPeriods(StepPeriodsArray);
  inc(QueueCount,StepPeriodsArray.num*2+2);
  SIHerror;
  DoingRivet := false;
end;

procedure RivetPosition;
begin
  RivetX;
  RivetY;
end;

procedure WaitIdle;
var
  time: Integer;
begin
  time := WordArgument;
  if time < 100 then time := 100;  { set minimum delay time }
  delay(time);  { delay long enough for background task to see EX }
  repeat
```

```
  until __GetBkgndIdleStatus or keypressed;
  if keypressed then if StatusKey = CtrlBreak then KeyAbort := true;
end;

{
   Drift Correction Commands
}

procedure SetDrift;
begin
  if BinaryFlag then DriftCorrectionFlag := (CharArgument = '+')
    else DriftCorrectionFlag := (TextCommand[3] = '+');
end;

procedure Reference1;
begin
  Sensor[1].Ref.X := RealArgument;
  Sensor[1].Ref.Y := RealArgument;
end;

procedure Reference2;
begin
  Sensor[2].Ref.X := RealArgument;
  Sensor[2].Ref.Y := RealArgument;
end;

procedure DriftAdj1;
begin
  Sensor[1].Adj.X := RealArgument;
  Sensor[1].Adj.Y := RealArgument;
  CorrectForDrift;
end;

procedure DriftAdj2;
begin
  Sensor[2].Adj.X := RealArgument;
  Sensor[2].Adj.Y := RealArgument;
  CorrectForDrift;
end;


{ - - - - - - - - - - - - - - - - - - - - - - - - - - - - - - - - - - - - -

    STEREO Command Parsers

  - - - - - - - - - - - - - - - - - - - - - - - - - - - - - - - - - - - - - }

procedure CallOperation(OpNum: Integer);
begin
  case OpNum of
     1: BeginX;          { BX }
     2: BeginY;          { BY }
     3: JumpX;           { JX }
     4: JumpY;           { JY }
     5: NextX;           { NX }
     6: NextY;           { NY }
     7: StepSize;        { SS }
     8: StepPeriods;     { SP }
```

```
     9: ScanDelay;        { SD }
    10: JumpSize;         { JS }
    11: JumpDelay;        { JD }
    12: LaserOn;          { LO }
    13: LaserOff;         { LF }
    14: SequenceMode;     { NS }
    15: AbsoluteMode;     { AB }
    16: Execute;          { EX }
    17: ExecuteClear;     { EC }
    18: ClearTable;       { CL }
    19: SetMode;          { MD }
    20: SoftReset;        { SR }
    21: HardReset;        { HR }
    22: RedrawCount;      { RC }
    23: RedrawDelay;      { RD }
    24: RedrawSize;       { RS }
    25: RivetCount;       { VC }
    26: RivetPeriods;     { VP }
    27: RivetReduction;   { VR }
    28: RivetX;           { VX }
    29: RivetY;           { VY }
    30: WaitIdle;         { WI }
    31: SetDrift;         { DC }
    32: Reference1;       { R1 }
    33: Reference2;       { R2 }
    34: DriftAdj1;        { D1 }
    35: DriftAdj2;        { D2 }
    36: BeginPosition;    { BG }
    37: JumpPosition;     { JP }
    38: MoveToPosition;   { MV }
    39: RivetPosition;    { RV }
    else Return := 128;   { unrecognized command }
  end;
end;

procedure BinaryParse;
var
  OpNum: Integer;
begin
  { break apart multiple commands }
  done := false;
  while (not KeyAbort) and (not done) and (Return = 0) do begin
    OpNum := Mem[CommandSeg:CommandOfs];
    if OpNum <> 0 then begin   { cmd of 0 marks end }
      inc(CommandOfs);
      CallOperation(OpNum);
    end else done := true;
  end;
end;

procedure ParseTextCommand;
var
  OpName: str4;
begin
  OpName := copy(TextCommand,1,2);
  Operand := copy(TextCommand,3,99);
  i := pos(OpName,OperationMnemonics);
  CallOperation((i + 2) div 4);   { good cmds give 1,2,3... }
end;
```

```
procedure TextParse;
begin
  { break apart multiple command strings }
  TextCommand := '';
  done := false;
  while (not KeyAbort) and (not done) and (Return = 0) do begin
    Ch := chr(Mem[CommandSeg:CommandOfs]);
    done := Ch < ' ';
    if done or (Ch=';') then begin
      inc(CommandOfs);
      ParseTextCommand;
      TextCommand := '';
    end else begin
      if Ch in ['!'..'~'] then TextCommand := TextCommand + upcase(Ch);
      inc(CommandOfs);
    end;
  end;
end;

{ - - - - - - - - - - - - - - - - - - - - - - - - - - - - - - - - - - - -

    Process STEREO Commands coming through the Software Interrupt

    - Software Interrupt #65 (101) Handler -

    ES:BX points to first character of string.  String should end with
    a character value <= 0, 10 (LF), or 13 (CR).  An error code will
    be returned in AL with 0 meaning no error occured.

  - - - - - - - - - - - - - - - - - - - - - - - - - - - - - - - - - - - - }

procedure ReceiveCommand(Flags,CS,IP,AX,BX,CX,DX,SI,DI,DS,ES,BP: Word);
Interrupt;
begin
  KeyAbort := false;
  CommandOfs := BX;
  CommandSeg := ES;
  INLINE ($FB);   { STI    ;allow interrupts }

  Return := 0;
  QueueCount := 0;
  case AX of
    0: begin
         BinaryFlag := false;
         TextParse;
       end;
    1: begin
         BinaryFlag := true;
         BinaryParse;
       end;
    else Return := 129;   { invalid STEREO request }
  end;

  CX := QueueCount;
  AX := Return;
  BX := CommandOfs;
end;
```

```
{ - - - - - - - - - - - - - - - - - - - - - - - - - - - - - - - - - - - - - -

    Memory Resident Routines

    After the following routines install the memory-resident routines
    above, they are thrown away and not used again.

  - - - - - - - - - - - - - - - - - - - - - - - - - - - - - - - - - - - - - - }

procedure ResidentTermination;
begin
  with regs do begin
    AH := $31;
    AL := 1;
    DX := trunc(StereoSize) shr 4;
    MsDos(regs);
  end;
end;

procedure InitMemoryResidency;
begin
  SetIntVec(_STEREOVECTOR,@ReceiveCommand);
end;

{  - - - - -  }

function WhiteSpace(var str: String;loc: Integer): Integer;
begin
  while (loc <= length(str)) and (str[loc] in [#9,' ']) do loc := loc + 1;
  WhiteSpace := loc;
end;

procedure CheckForOptions(var str: String);
var
  i: Integer;
begin
  str := upper(str);
  while (length(str) > 1) and (str[1] = ' ') do delete(str,1,1);
  i := pos('/D',str);   { set debug mode }
  if i>0 then begin
    DebugMode := true;
    delete(str,i,2);
  end;
  i := pos('/NV',str);  { not constant vector velocity }
  if i>0 then begin     { larger of X and Y axes }
    VelocityFlag := false;
    delete(str,i,3);
  end;
  i := pos('/NG',str);  { no geometric correction }
  if i>0 then begin
    GeoCorrectFlag := false;
    delete(str,i,3);
  end;
  i := pos('/NC',str);  { no version check }
```

```
  if i>0 then begin
    VersionCheckFlag := false;
    delete(str,i,3);
  end;
  i := pos('/SWAPXY',str);  { swap X & Y coordinates }
  if i>0 then begin
    SwapXY := true;
    delete(str,i,7);
  end;
  i := pos('/AXESBEGIN',str);  { axes-control begin (home) coordinates }
  if i>0 then begin
    SwapBegin := true;
    delete(str,i,10);
  end;
  i := pos('/GEO',str);  { geo-correct axes order }
  if i>0 then begin
    j := WhiteSpace(str,i+4);
    case str[j] of
      'X': FirstX := true;
      'Y': FirstX := false;
      'N': GeoCorrectFlag := false;
    end;
    delete(str,i,j+2-i);
  end;
  i := pos('/X',str);  { X-axis orientation }
  if i>0 then begin
    NegX := (str[i+2]='-');
    delete(str,i,3);
  end;
  i := pos('/Y',str);  { Y-axis orientation }
  if i>0 then begin
    NegY := (str[i+2]='-');
    delete(str,i,3);
  end;
end;

procedure ShowAxis(Neg: Boolean;AxCh: Char);
begin
  if Neg then write('-') else write('+');
  write(AxCh,' axis');
end;

procedure ShowGeometry;
begin
  write('Geometry is ');
  if SwapXY then write('XY Swapped, ');
  if SwapBegin then write('Begin Swapped, ');
  if FirstX then begin
    ShowAxis(NegX,'X');
    write(' first, then ');
    ShowAxis(NegY,'Y');
  end else begin
    ShowAxis(NegY,'Y');
    write(' first, then ');
    ShowAxis(NegX,'X');
  end;
  writeln('.');
  if GeoCorrectFlag then writeln('Geometric Correction active.');
end;
```

```
{ - - -  M A I N   P R O G R A M  - - - }

begin
  CheckBreak := false;
  FillChar(FirstVar,ofs(LastVar)-ofs(FirstVar),#0);   { clear variables }
  VelocityFlag     := true;   { default to constant vector velocity }
  GeoCorrectFlag   := true;   { default to geometric correction }
  VersionCheckFlag := true;
  writeln;
  writeln(#213,many(#205,45),#184);
  writeln(#179,'  STEREO, Stereolithography Device Driver    ',#179);
  writeln(#179,'  Version ',ThisStereoVersion,'
  writeln(#179,'  Copyright (C) 1988 by Tarnz Technologies   ',#179);
  writeln(#179,'  3D Systems Laser Stereolithography System  ',#179);
  writeln(#212,many(#205,45),#190);
  writeln;
  cmd := StartOfProgramCode;
  ReadCommandLine(cmd);
  if not __LaserPresent then goto ExitProgram;
  if __StereoOk then begin
    writeln('STEREO Device Driver Version ',StereoVersion,
      ' already installed.');
    goto ExitProgram;
  end;
  CheckForOptions(cmd);
  if VersionCheckFlag then
    if LaserVersion < MinSystemVersion then begin
      writeln('Obsolete LASER system in use.');
      goto ExitProgram;
    end;
  Xpos        := 32767;
  Ypos        := 32767;
  DoingRivet := false;
  RivetMainPeriod       := 1190;
  StepPeriodsArray.num  := 0;
  RivetPeriodsArray.num := 0;
  OperationMnemonics := '*BX *BY *JX *JY *NX *NY *SS *SP *SD *JS *JD *LO '
    + '*LF *NS *AB *EX *EC *CL *MD *SR *HR *RC *RD *RS *VC *VP *VR *VX '
    + '*VY *WI *DC *R1 *R2 *D1 *D2 *BG *JP *MV *RV';
  Sensor[1].Ref.X := 0;
  Sensor[1].Ref.Y := 0;
  Sensor[2].Ref.X := 65535;
  Sensor[2].Ref.Y := 65535;

  { read and/or set defaults }
  Assign(DefaultFile,'STEREO.DEF');
  {$I-}
  reset(DefaultFile);
  {$I+}
  if IOresult<>0 then begin
    writeln('Can''t find STEREO.DEF default file!');
    _Step_Size       := 32;
    _Step_Period     := 119;
    _Scan_Delay      := 64;
    _Jump_Size       := 65535.0;
    _Jump_Delay      := 100;
    _Laser_On_Delay  := 0;
    _Laser_Off_Delay := 0;
```

```
      _Redraw_Count     := 1;
      _Redraw_Delay     := 0;
      _Redraw_Size      := 200;
      _Rivet_Count      := 1;
      _Rivet_Reduction := 100;
   end else begin  { read default file }
     i := 1;
     while (i<=14) and not eof(DefaultFile) do begin
       readln(DefaultFile,temp);
       if not ((length(temp)=0) or (temp[1]='!')) then begin
         case i of
           1: IntParse(_Step_Size);
           2: begin
                count := 0;
                while (length(temp)>0) and (count<10) do begin
                  IntParse(StepPeriodsArray.periods[count]);
                  count := count+1;
                end;
                StepPeriodsArray.num := count;
                _Step_Period := StepPeriodsArray.periods[0];
              end;
           3: IntParse(_Scan_Delay);
           4: RealParse(_Jump_Size);
           5: IntParse(_Jump_Delay);
           6: IntParse(_Laser_On_Delay);
           7: IntParse(_Laser_Off_Delay);
           8: IntParse(_Redraw_Count);
           9: IntParse(_Redraw_Delay);
          10: IntParse(_Redraw_Size);
          11: IntParse(_Rivet_Count);
          12: begin
                count := 0;
                while (length(temp)>0) and (count<10) do begin
                  IntParse(RivetPeriodsArray.periods[count]);
                  count := count+1;
                end;
                RivetPeriodsArray.num := count;
              end;
          13: RealParse(_Rivet_Reduction);
         end;
         i := i+1;
       end; {if not}
     end; {while i<}
     close(DefaultFile);
   end;
   CurrentRedrawCount := _Redraw_Count;

   XGeoCorrectTable := HeapPtr;
   if GeoCorrectFlag then begin
    { read Geometric Correction Table }
     Assign(GeoFile,'STEREO.GEO');
     {$I-}
     reset(GeoFile);
     {$I+}
     if IOresult<>0 then begin
       writeln('Can''t find STEREO.GEO Geometric Correction File!');
       GeoCorrectFlag := false;
     end else begin  { read geometric correction table from file }
       repeat
         readln(GeoFile,temp);
```

```
      if upper(copy(temp,1,7)) = '!SENSOR' then begin
        val(temp[8],SensorNum,code);
        temp := copy(temp,9,99);
        if SensorNum in [1..2] then begin
          RealParse(Sensor[SensorNum].Ref.X);
          RealParse(Sensor[SensorNum].Ref.Y);
        end;
        temp := '!';
      end;
    until ((length(temp)>0) and (temp[1]<>'!')) or eof(GeoFile);
    SkipToNum(temp);
    IntParse(XCount);
    SkipToNum(temp);
    IntParse(YCount);
    YGeoCorrectTable := PtrAdd(XGeoCorrectTable,LongInt(XCount*YCount) shl 2
    SkipToNum(temp);
    IntParse(CoordCount);
    SkipToNum(temp);
    IntParse(TableDivisor);
    If TableDivisor=0 then TableDivisor := 1024;  { for V2.30 compatibility
    if (XCount<>YCount) or (CoordCount<>2)
    or (XCount>MaxGeo) or (YCount>MaxGeo) then begin
      writeln('Illegal format for STEREO.GEO file.');
      halt(1);
    end;
    XC := 0;
    YC := 0;
    StoreCount := 0;
    while (XC<XCount) and not eof(GeoFile) do begin
      while (YC<YCount) and not eof(GeoFile) do begin
        repeat
          readln(GeoFile,temp);
        until ((length(temp)>0) and (temp[1]<>'!')) or eof(GeoFile);
        SkipToNum(temp);
        RealParse(Xcoord);
        SkipToNum(temp);
        RealParse(Ycoord);
        XGeoCorrectTable^[StoreCount] := trunc(Xcoord*GeoMult);
        YGeoCorrectTable^[StoreCount] := trunc(Ycoord*GeoMult);
        inc(StoreCount);
        inc(YC);
      end; {while YC}
      inc(XC);
      YC := 0;
    end; {while XC}
    if XC < XCount then begin
      writeln('Not enough entries in STEREO.GEO file.');
      halt(2);
    end;
    while not eof(GeoFile) do begin
      readln(GeoFile,temp);
      if (length(temp)>0) and (temp[1]<>'!') then begin
        SkipToNum(temp);
        if temp[1] in ['0'..'9','.'] then begin
          writeln('Too many entries in STEREO.GEO file.');
          halt(3);
        end;
      end;
    end;
    close(GeoFile);
```

```
    end;
  end;
  for i:=1 to 2 do Sensor[i].Adj := Sensor[i].Ref;
  CorrectForDrift;    { gain is 1, offset is 0 }
  StereoSize := MemAbs(XGeoCorrectTable) + (LongInt(XCount*YCount) shl 3)
    - (LongInt(PrefixSeg) shl 4) + 1024;
  StereoSize := ((StereoSize shr 4)+1) shl 4;
(*
  writeln('MemAbs XGeo=',MemAbs(XGeoCorrectTable));
  writeln('MemAbs YGeo=',MemAbs(YGeoCorrectTable));
  writeln('X*Y shl 2=',LongInt(XCount*YCount) shl 2);
  writeln('PrefixSeg=',LongInt(PrefixSeg));
  writeln('StereoSize=',StereoSize);
*)
  writeln('STEREO Device Driver installed using ',
    RealStr(StereoSize/1024),'K bytes.');
  ShowGeometry;

  InitMemoryResidency;
  ResidentTermination;

ExitProgram;
end.
```

STERCMDS.INC - Page 1 - 4/15/1988 6:13 PM

```
{
  STEREO V2.80 Binary Command Equates
}

const
  STEREO_BX = 1;
  STEREO_BY = 2;
  STEREO_JX = 3;
  STEREO_JY = 4;
  STEREO_NX = 5;
  STEREO_NY = 6;
  STEREO_SS = 7;
  STEREO_SP = 8;
  STEREO_SD = 9;
  STEREO_JS = 10;
  STEREO_JD = 11;
  STEREO_LO = 12;
  STEREO_LF = 13;
  STEREO_NP = 14;
  STEREO_AF = 15;
  STEREO_EX = 16;
  STEREO_ED = 17;
  STEREO_CL = 18;
  STEREO_MD = 19;
  STEREO_GR = 20;
  STEREO_HR = 21;
  STEREO_RC = 22;
  STEREO_RD = 23;
  STEREO_RS = 24;
  STEREO_VC = 25;
  STEREO_VF = 26;
  STEREO_VR = 27;
  STEREO_VX = 28;
  STEREO_VY = 29;
  STEREO_WI = 30;
  STEREO_DC = 31;
  STEREO_R1 = 32;
  STEREO_R2 = 33;
  STEREO_D1 = 34;
  STEREO_D2 = 35;
  STEREO_BG = 36;
  STEREO_JP = 37;
  STEREO_MV = 38;
  STEREO_RV = 39;
```

```
TESTPART.BAS    - Page 2 -                    4/15/1988    6:13 PM

            PRINT " THE SMALLEST SP MUST NOT BE LESS THAN 10"
            PRINT
            PRINT "THUS, USE SP 160 FOR FASTEST LASER DRAWING !"
            LOCATE 20,30
            PRINT "ANY KEY TO TRY AGAIN ...";
            GOSUB strobe
            GOTO StartBanjo
          END IF
        PRINT "THE FOLLOWING STRING SP'S WILL BE GENERATED."
        PRINT
          FOR I = 1 TO 5
               PRINT "SP ";sp
               sp = sp/2
          NEXT I
        PRINT
        PRINT "OK ? (Y/N)"
        gosub strobe
        IF ans$ <>"Y" AND ans$<> "y" THEN StartBanjo

        CLS
        SP = 32*SP
        STRINGSP = SP

        PRINT "PLEASE WAIT..."
        SHELL "CLIFF /PR/W/T"



mainprogram:

                GOSUB setup
                GOSUB mainmenu
                GOSUB openfile
                GOSUB writeparameters
                GOSUB writebase
                GOSUB writestrings
                LOCATE 18,27
                PRINT "making base and strings...";
                GOSUB movemirrors
                LOCATE 22,35
                PRINT " done !!";
                END

END


writebase:

            M$ = "J"
            X = xside/2
            Y = yside/2 + yinc
            GOSUB writexytofile
            M$ = "N"
            X =  xside/2
            Y = -yside/2
            GOSUB writexytofile
            X = -xside/2
            Y = -yside/2
            GOSUB writexytofile
```

```
TESTPART.BAS    - Page 1 -                    4/15/1988   6:13 PM

'==============================================================================
'  3D Systems Stereolithography System Software
'==============================================================================
'
'  TESTPART.BAS
'  SLA-1 Test Part Utility Software
'
'------------------------------------------------------------------------------
'  Compile with TBM - Modified Turbo Basic - not TB!
'------------------------------------------------------------------------------
'
'  Recent History:
'   1/11/88  Ver 2.50  first release
'   1/25/88  Ver 2.60  version update only
'   3/09/88  Ver 2.80  added copyright notice
'   4/11/88  Ver 3.00  production release
'
'------------------------------------------------------------------------------

  VersionId$ = "3.00"

  SingleBar$ = STRING$(45,196)
  CLS
  PRINT SingleBar$
  PRINT "   TESTPART, Test Part Utility"
  PRINT "   Version "+VersionId$
  PRINT "   Copyright (C) 1988 by 3D Systems, Inc."
  PRINT "   3D Systems Laser Stereolithography System"
  PRINT SingleBar$
  PRINT
  PRINT
  PRINT "     1. BanjoTop, Determine Working Curves"
  PRINT
  PRINT "     X. Exit Program"
  PRINT
  PRINT
KeyLoop:
  K$ = UCASE$(INKEY$)
  IF K$ = "1" THEN StartBanjo
  IF K$ = "X" THEN END
  GOTO KeyLoop

' ****************************************************************************
'      BANJOTOP       turbobasic version      11/19/87     wav
' ****************************************************************************

StartBanjo:
          CLS
          PRINT
          LOCATE 1,36
          PRINT "BANJOTOP"
          PRINT
          INPUT "INPUT BIGGEST SP VALUE OF 5 TO BE DRAWN (160 minimum) :",sp$
            t$ = ucase$(left$(sp$,1))
            if t$="Q" or t$="X" then end
            sp = VAL(sp$)
            IF sp/16 < 10 THEN
              PRINT
              PRINT
              PRINT " ERROR  ERROR  ERROR  ERROR"
```

```
            X = -xside/2
            Y =  yside/2
            GOSUB writexytofile
            X =  xside/2 + yinc
            Y =  yside/2
            GOSUB writexytofile
            RETURN

writestrings:

            sp = stringsp * 2
              FOR x = -3*xside/8 TO xside/8 STEP 6*xside/(12*4)
                sp = sp/2
                PRINT#2,"SP";sp
                M$="J"
                Y= -yside/2 - yinc
                GOSUB writexytofile
                [illegible]
                Y=  yside/2 - yinc
                GOSUB writexytofile
              NEXT Y
            RETURN

writexytofile:

              PRINT#2, M$;"X";cx-x
              PRINT#2, M$;"Y";cy+y
              RETURN

writeparameters:

                  PRINT#2,"MD EL +"
                  PRINT#2,"CL"
                  PRINT#2,"SS2"
                  PRINT#2,"SP";sp
                  PRINT#2,"JD0"
                  PRINT#2, "BX32000"
                  PRINT#2, "BY62000"
                  RETURN

movemirrors:

                  PRINT#2,"EX"
                  CLOSE
                  SHELL "CLIFF LASER.DAT/W/T"
                  ON ERROR GOTO chkerror
                  OPEN "CLIFF.ERR" FOR INPUT AS #3
                  CLOSE #3
                  PRINT "CLIFF process aborted."
                  END

END

chkerror:
```

```
                CLOSE #3
                RESUME chkdone

chkdone:
                ON ERROR GOTO 0
                RETURN


openfile:

            OPEN "LASER.DAT" FOR OUTPUT AS #2
            RETURN


mainmenu:

            CLS
              FOR I=1 TO 79
                LOCATE 1,I,0
                PRINT "*";
              NEXT
            LOCATE 2,35,0
            PRINT "*   SLA1    *"
            LOCATE 3,33,0
            PRINT "PROGRAM: BANJOTOP"
              FOR I=1 TO 79
                LOCATE 4,I,0
                PRINT "*";
              NEXT
              FOR I = 1 TO 5
                LOCATE 10 + i,30
                PRINT "SP ";STRINGSP
                STRINGSP = STRINGSP / 2
              NEXT I
            STRINGSP = 32 * STRINGSP
            LOCATE 23,25
            PRINT "ANY KEY TO CONTINUE...";
            GOSUB strobe
              FOR I=25 TO 55
                LOCATE 23,I,0
                PRINT " ";
              NEXT
            RETURN


setup:

           cx = 32000                     ' approx center of pot
           cy = 32000
           scale = 140                    ' bits/mm
           xside = 25                     ' 1 x 1/2 inch
           xside = xside * scale
           yside = xside / 2
           sp = 500                       ' base step period
           yinc = yside / 4               ' overlap
           RETURN
```

```
strobe:
         ans$ = INKEY$
         IF LEN(ans$) = 0 then strobe
         return
```

```
{=============================================================================
   3D Systems Stereolithography System Software
 =============================================================================

   XFER.PAS
   SLA-1 File Transfer Utility Software

 -----------------------------------------------------------------------------

   History:
   11/12/87  Ver 2.30  first Beta software release
   12/02/87  Ver 2.31  reactivates tcp for Turbo Pascal V4.0 Menu
   12/17/87  Ver 2.40  telnet/ftp host is 'SliceComputer' (not 'process')
    1/11/88  Ver 2.50  support of different Ethernet types
                       based on SLA1.SYS file
    1/20/88  Ver 2.51  upper case X for exit
    1/25/88  Ver 2.60  version update only
    3/09/88  Ver 2.80  added copyright notice
    4/04/88  Ver 3.00  change menus

 -----------------------------------------------------------------------------}

{$R-,S+,I+,D+,T-,F-,V-,B-,N-,L+ }
{$M 16384,0,16384 }

uses Crt,Dos;

type
  EthernetSupport = (_NoEthernet,_Excelan,_Micom,_Unknown);

var
  Ch: Char;
  Line,SingleBar: String;
  Ethernet: EthernetSupport;
  SystemFile,ErrorFile: Text;

const
  VersionId = '2.80';
  ComSpec = 'C:\COMMAND.COM';
  SystemFileName = 'C:\SLA1.SYS';
  ErrorFileName = 'C:\SYSTEM.ERR';

{
  Show error and store it on disk
}
procedure SystemError(Text: string);
begin
  writeln(Text);
  assign(ErrorFile,ErrorFileName);
  rewrite(ErrorFile);
  writeln(ErrorFIle,'XFER: ',Text);
  close(ErrorFile);
end;

function upper(text: string): string;
var
  i: Integer;
  temp: string;
begin
  temp := text;
```

```
    for i := 1 to length(temp) do temp[i] := upcase(temp[i]);
    upper := temp;
  end;

  function many(Ch: Char;num: Integer): String;
  var
    temp: String;
    i: Integer;
  begin
    temp := '';
    for i:=1 to num do temp  := temp+Ch;
    many := temp;
  end;

  procedure centerln(text: String);
  begin
    gotoxy((79-length(text)) div 2,whereY);
    writeln(text);
  end;

  procedure DetermineEthernetSupport;
  begin
    Ethernet := _NoEthernet;
    assign(SystemFile,SystemFileName);
    {$I-}
    reset(SystemFile);
    {$I+}
    if IOresult=0 then begin
      while not eof(SystemFile) do begin
        readln(SystemFile,Line);
        Line := upper(Line);
        if copy(Line,1,9)='ETHERNET='  then begin
          case Line[10] of
            'N': Ethernet := _NoEthernet;
            'E': Ethernet := _Excelan;
            'M': Ethernet := _Micom;
            'U': Ethernet := _Unknown;
          end;
        end;
      end;
    end;
  end;

  begin
    DetermineEthernetSupport;
    SingleBar := many(#196,26);
    if Ethernet = _Excelan then Exec(ComSpec,'/C REX');
    repeat
      ClrScr;
      centerln('XFER, Ethernet File Transfer');
      centerln('Version '+VersionId);
      centerln('Copyright (C) 1988 by 3D Systems, Inc.');
      centerln('3D Systems Laser Stereolithography System');
      centerln(SingleBar);
      writeln;
      writeln;
      writeln;
      if Ethernet = _NoEthernet then begin
        SystemError('No Ethernet Communications Support');
        halt(1);
```

```
    end else begin
      case Ethernet of
        _Excelan: centerln('using Excelan Ethernet support');
        _Micom  : centerln('using Micom Interlan support');
        else      centerln('using unknown support');
      end;
      writeln;
      writeln;
      centerln('1. TELNET, Terminal Utility     ');
      centerln('2. FTP,    File Transfer Program');
      centerln('X. Exit Program                 ');
      writeln;
      writeln;
      gotoxy(32,whereY);
      write('Which action? ');
      Ch := upcase(ReadKey);
      if Ch in ['1','2','X'] then begin
        writeln;
        writeln;
        case upcase(Ch) of
          '1': begin
                 Exec(ComSpec,'/C TELNET SliceComputer');
                 halt(0);
               end;
          '2': begin
                 Exec(ComSpec,'/C FTP SliceComputer');
                 halt(0);
               end;
          'X': halt(0);
        end;
      end;
    end;
  until 0=1;
end.
```

```
{=============================================================================
  3D Systems Stereolithography System Software
 =============================================================================

   ZSTAGE.PAS
   SLA-1 Z-STAGE CONTROL PROGRAM

-----------------------------------------------------------------------------

   Recent History:
   11/12/87  Ver 2.30  first Beta software release
   11/15/87  Ver 2.31  fixed motor controller timing
                       eliminated need for NUM LOCK
    1/22/88  Ver 2.50  added motion status
                       can move specified distances (inches)
                       supports ZSTAGE.PRM file
    1/25/88  Ver 2.60  version update only
    2/24/88  Ver 2.61  Home Directory search for ZSTAGE.PRM FIX
                       displays source of ZSTAGE.PRM file
    3/22/88  Ver 3.00  converted from Turbo Basic to Turbo Pascal Version 4.0
    4/14/88  Ver 3.01  let any key stop the elevator (dumb key)
    4/15/88  Ver 3.02  fix acceleration and velocity send commands

-----------------------------------------------------------------------------}

uses CRT,DOS;

const
   VersionId     = '3.02';
   ParamFileName = 'ZSTAGE.PRM';
   HomeDirectory = 'c:\3DSYS\';
   Indent        = 19;           { use 22 for top lines of the display }
   CtrlC         = ^C;
   Cr            = ^M;
   afterDecimal  =  4;

type
   str8  = string[ 8];
   str16 = string[16];
   str25 = string[25];
   str80 = string[80];

var
   ParamFileLine : String;
   CMD : str80;
   OpenParamFile, IndentStr : str25;
   InchDistanceStr, Accel, Veloc : str8;
   TimeoutValue, ZAddress, i, m, n, ValCode, IOerr : Integer;
   InchDistance, r : real;
   ParamFile : Text;
   BigDist,MicroSteps, j, MinimumZ : LongInt;
   ShowStuff, NegZStage, ShowParms, TimeOut, dumbkey  : Boolean;
   regs: registers;
   key, Dir : char;

{$I combine.inc}
{$R-,S-,I-,F-,V-,B-}

function RealVal(line: string;var code: Integer):Real;
var
```

```
   code2  : integer;
   num    : real;
begin
   if line[1]='.' then line := '0' + line;
   if (line[1]='-') and (line[2]='.') then begin
      line := '-0' + line;
      for i:= 4 to length(line) do line[i-1]:=line[i];
      line[length(line)] := ' ';
   end;
   val(line,num,code);
   if code <> 0 then val(copy(line,1,code-1),num,code2);
   RealVal := num;
end;

procedure DefaultParms;
begin
   for i:=1 to 255 do ParamFileLine[i]:=' ';
   NegZStage :=   false;
   ShowStuff :=   false;
   ShowParms :=   false;
   ZAddress  :=     600;
   Accel     :=   '0.5';
   Velcc     :=   '  1';
   BigDist :=  2000000 ;
   MicroSteps := 100000;
   TimeoutValue := 2000;
end;

procedure ReadParms;
begin
   OpenParamFile := ParamFileName;
   assign(ParamFile,OpenParamFile);
   reset(ParamFile);
   IOerr := IOresult;
   if IOerr <> 0 then begin
      OpenParamFile := HomeDirectory+ParamFileName;
      assign(ParamFile,OpenParamFile);
      reset(ParamFile);
      IOerr := IOresult;
      if IOerr <> 0 then OpenParamFile := ' '
   end;
   if IOerr = 0 then begin
      i := 0;
      while not eof(ParamFile) do begin
         readln(ParamFile,ParamFileLine);
         ParamFileLine := upper(ParamFileLine);
         if ParamFileLine[1] = '"' then begin
            ParamFileLine[1] := ' ';
            m := pos('"',ParamFileLine);
            n := pos('/S',ParamFileLine);
            if (0<n) and (n<m) then ShowStuff := true;
            n := pos('/NEGZ',ParamFileLine);
            if (0<n) and (n<m) then NegZStage := true;
         end;
         if (ParamFileLine[1] <> ' ') and (ParamFileLine[1] <> '!') and
            (ParamFileLine[1] <> '"') then begin
            if i < 6 then begin
               i := i+1;     { this allows blank lines in the parameter file }
               val(ParamFileLine,j,valcode);
               case i of
```

```
                    1 : if valcode=0 then ZAddress := j;
                    2 : Accel    := ParamFileLine;
                    3 : Veloc    := ParamFileLine;
                    4 : if valcode=0 then BigDist := j;
                    5 : if valcode=0 then MicroSteps := j;
                    6 : if valcode=0 then TimeoutValue := j;
                  end;
                end;
              end;
            end;
          end;
end;  { ReadParams }

procedure ShowZStageMoverMenu;
   begin
      window(1,1,80,25);
      ClrScr;
      writeln(IndentStr,'          Elevator Controller          ');
      writeln(IndentStr,'  3D Systems Stereolithography System');
      writeln(IndentStr,'  Version '+VersionID+'         3D Systems, Inc.');
      gotoxy(1,5);
      if TIMEOUT   then writeln(IndentStr,'              ELEVATOR OFF ')
      else              writeln(IndentStr,'              ELEVATOR STOP');

      DrawBox(Indent-1,7,80-Indent,21,1);
      window(Indent,9,79-Indent,21);
      writeln('   UP ARROW    move elevator up');
      writeln;
      writeln(' DOWN ARROW    move elevator down');
      writeln;
      writeln('  SPACE BAR    stop elevator motion');
      writeln;
      writeln('          D    move a specified distance');
      writeln;
      writeln('          T    toggle parameter display');
      writeln;
      writeln('     Q or X    exit to Utility menu');
      if ShowParms then begin
         window(Indent-6,22,80,25);
         if OpenParamFile = ' ' then
         writeln('      Not using any Parameter File:')
         else writeln('      Using '+OpenParamFile+' Parameter File:');
         write('      Address=',Zaddress,'  Accel='+accel+'  Veloc='+Veloc);
         if NegZStage then writeln('  /NEGZ') else writeln;
         writeln('Big Dist=',bigdist,'  Microsteps=',microsteps,'  Timeout Value
      end;

end;  { procedure ShowZStageMoverMenu }

procedure GetSelection;
begin
   key := 'Z';
   repeat
      HandleKeyboardRequest;
      key := upcase(key);
      if dumbkey then key:=' ';
      dumbkey:=false;
      if key in [#72,#80,' ','D','T','Q','X'] then exit; { up and down arrows }
   until false;
```

```
ZSTAGE.PAS   - Page 4 -                          4/15/1988   6:14 PM

end;  { procedure GetSelection }

procedure SendElevCommand(Ch: Char; TimeOutValue: integer; TimeOut: boolean);
var
   b, TC : integer;
begin
   TimeOut := false;
   TC      := 0;
   repeat                       { Read status byte to determine if the input...}
      b := port[ZAddress+1];    { data buffer (IDB) is ready for a character.  }
      TC := TC + 1;
   until ((b and $10)>0) or (TC > TimeOutValue); { Bit 4 true=1 means ready. }
   port[ZAddress] := ord(Ch); { Convert character to ASCII, give to IDB.     }
   port[ZAddress+1] := $70;   { Reset status byte for ready to send to motor.}
   repeat
      b:= port[ZAddress+1];     { Read status byte to determine if the IDB...  }
      TC := TC + 1;             { read the instruction, if not, wait until ... }
   until ((b and $10)=0) or (TC > TimeOutValue);                { it does.   }
   port[ZAddress+1] := $60;   { Reset status byte for ready to send again.    }
   if TC > TimeOutValue then TimeOut := True;

end; { Send Elevator Command }

procedure ElevatorInterface(Cmd: string;TimeOutValue:integer;TimeOut:boolean);
{ this is the gateway through which all elevator commands must pass }
var
   ii : integer;
begin
{  CMD := 'E MN A'+Accel+' V'+veloc+'+CMD; from SetAVD procedure }
   if ShowStuff then begin
      writeln('  DEBUG Elevator Interface CMD='+Cmd);
      delay(1);
   end;
   delay(1); { this is required for the program configuration to work right }
   for ii := 1 to length(Cmd) do
        SendElevCommand(Cmd[ii],TimeOutValue,TimeOut);
end;  { Elevator Interface }

procedure WaitforMoveComplete(Cmd:string;TimeOutValue:integer;TimeOut:boolean);
var
   b, response, TC : integer;
begin
   TC  := 0;
   repeat                               { Loop until we get desired response.  }
      repeat
         b := port[Zaddress+1];         { Read status byte.                    }
      until ((b and $08)<>0) and (not TimeOut);
      response := port[Zaddress];       { OK to read response from controller. }
      port[ZAddress+1] := $E0;          { Set status byte to message received. }
      repeat
         b := port[ZAddress+1];         { Wait for read status to hit ready.   }
         TC := TC + 1;
      until ((b and $08)=0) or (TC > TimeOutValue);
      port[ZAddress+1] := $60;          { Reset status byte.                   }
   until (chr(response) = CR) or (TC > timeoutValue);

   if ShowStuff then begin
      window(1,1,80,25);
      ClrScr;
      writeln('response=',response);
```

```
      writeln;
      writeln('Tc        =',TC);
      delay(10000);
   end;
end; { Wait for elevator controller response }

procedure SetZTableAVD;
begin
   CMD:='';
   CMD := 'E MN A'+Accel+' V'+veloc+' K ';
   ElevatorInterface(CMD,TimeOutValue,TimeOut);
end;

procedure MoveGivenDistance;
var
   dir : str8;
begin
   window(Indent-8,22,79,25);
   writeln(       *** Key distance in inches (positive is up)  ***
   writeln('
   writeln('
   gotoxy(Indent,2);
   readln(inchdistancestr);
   if inchdistancestr[1] <> ' ' then begin
      inchdistance := RealVal(inchdistancestr,valcode);
      if inchdistance <> 0 then begin
         if not NegZStage then inchdistance := -inchdistance;
         j := trunc(inchdistance * microsteps);
         STR(j,inchdistancestr);
         CMD:='E MN A'+Accel+' V'+veloc+' D'+inchdistancestr+' G CR ';
         ElevatorInterface(CMD,TimeOutValue,TimeOut);
         dir := 'DOWN  ';
         if ((j < 0) and (not NegZStage)) or ((j > 0) and NegZSTage)
                                                   then dir := 'UP   ';
         window(1,5,80,6);
         if not TimeOut then writeln(IndentStr,'              ELEVATOR '+dir);
         WaitforMoveComplete(CMD,TimeOutValue,TimeOut);
      end;
   end;
end;   { procedure MoveGivenDistance }

procedure MoveTable(direction:string);
begin
   MinimumZ := BigDist;
   if direction = 'UP   ' then MinimumZ := - BigDist;
   CMD:='';
   CMD:='E MN A'+Accel+' V'+veloc+' D'+RealStr(MinimumZ,0)+' G ';
   window(1,5,80,6);
   if not TimeOut then writeln(IndentStr+'              ELEVATOR '+direction);
   repeat
      ElevatorInterface(CMD,TimeOutValue,TimeOut);
      delay(45);
   until KeyPressed;
   dumbkey := true;
 { key:=Readkey; }
   ElevatorInterface('K ',TimeOutValue,TimeOut);
end;  { procedure MoveTable }

begin { main program }
   ClrScr;
```

```
   window(1,1,80,25);
   IndentStr := many(' ',Indent);
   DefaultParms;
   ReadParms;
   CursorOff;
   dumbkey := false;
   TimeOut := false;
   InitZTable;
   SetZTableAVD;
   repeat
      ShowZStageMoverMenu;
      GetSelection;
      case key of
       #72 :  if not NegZStage then MoveTable('UP  ') else
                                    MoveTable('DOWN');
       #80 :  if not NegZStage then MoveTable('DOWN') else
                                    MoveTable('UP  ');
        'D':  MoveGivenDistance;
        'T':  ShowParms := not(ShowParms);
        'Q':  Abort;
        'X':  Abort;
      end;
   until false;
   ClrScr;

end.  { main program }
```

```
COMBINE.INC   - Page 1 -                  4/15/1988   6:16 PM

{==============================================================================
   3D Systems Stereolithography System Software
 ==============================================================================

   COMBINE.INC
   SLA-1 This is the master include library to COMBINE shared procedures

   The following is a list and description of the subroutines:

   CursorOff - remove the cursor from the SLA display screen
   CursorOn  - show the cursor on the SLA display screen
   Beep      - produce a auditable beep

   Upper     - convert a string to all upper case
   Many      - propigate a charater a specified number of times in a string

   Drawbox   - draw a box of variable size which can be used to border text

   Abort      - abort the current operation and return to the previous task
   HandleKeyboardRequest - Read the key unless it is a cntl-c

   InitZTable - initialize the SLA platform
   ZTable      - access the port for the SLA platform
   ZMove       - send a command to the Z-axis stepper controller
   FormatZCommand - move the platform a specified distance
   waitForIdleZStage - keep the platform moving until the space bar is pressed

------------------------------------------------------------------------------}


procedure CursorOff;
begin
  with regs do begin
    AH := 3;
    BH := 0;
    Intr($10,regs);
    AH := 1;
    CH := CH or $20;
    Intr($10,regs);
  end;
end;

procedure CursorOn;
begin
  with regs do begin
    AH := 3;
    BH := 0;
    Intr($10,regs);
    AH := 1;
    CH := CH and $DF;
    Intr($10,regs);
  end;
end;

procedure beep;
begin
  sound(1000);
  delay(500);
  NoSound;
end;
```

```
function upper(text: string): string;
var
  i: Integer;
  temp: string;
begin
  temp := text;
  for i := 1 to length(temp) do temp[i] := upcase(temp[i]);
  upper := temp;
end;

function many(Ch: Char;num: Integer): string;
var
  temp: string;
  i: Integer;
begin
  temp := '';
  for i:=1 to num do temp  := temp+Ch;
  many := temp;
end;

function IntStr(num: Integer): str16;
var
  temp: str16;
begin
  if num>=0 then Str(num,temp) else Str(num+$8000,temp);
  IntStr := temp;
end;

function sgn(num: real): real;
begin
   if num<0 then sgn := -1
   else if num>0 then sgn := 1
   else sgn := 0;
end;

function RealStr(num: Real;AfterDecimal: Integer): str80;
var
   i : integer;
   temp : str80;
begin
   Str(num:10:AfterDecimal,temp);
   i := 1;
   while (i<length(temp)) and (temp[i]=' ') do inc(i);
   RealStr := copy(temp,i,99);
end;

procedure Abort;
var
  key: Char;
begin
  while keypressed do key := ReadKey;
  CursorOn;
  halt(127);
end;

procedure HandleKeyboardRequest;
begin
  while keypressed do begin
    key := ReadKey;
```

```
    if key = CtrlC then Abort;
    if (key = #0) and keypressed then
      key := ReadKey;
  end;
end;

procedure DrawBox(x1,y1,x2,y2: integer;BoxType: integer);
type
  BoxMode = array[1..4] of Char;
{
    Box Types:
      1:  Single Line all around
      2:  Double Line all around
      3:  Single Line horizontal, Double Line vertical
      4:  Double Line horizontal, Single Line vertical
}
  const
                      {  Type          1     2     3     4
    UpperLeftCorner : BoxMode = (#218,#201,#214,#213);
    UpperRightCorner: BoxMode = (#191,#187,#183,#184);
    LowerLeftCorner : BoxMode = (#192,#200,#211,#212);
    LowerRightCorner: BoxMode = (#217,#188,#189,#190);
    HorzBar         : BoxMode = (#196,#205,#196,#205);
    VertBar         : BoxMode = (#179,#186,#186,#179);
var
  i: integer;
  FullHorzBar: String;
begin
  gotoxy(x1,y1);
  if x1<x2 then FullHorzBar := Many(HorzBar[BoxType],x2-x1-1)
    else FullHorzBar := '';
  if x1<>x2 then write(UpperLeftCorner[BoxType]);
  write(FullHorzBar);
  if x1<>x2 then write(UpperRightCorner[BoxType]);
  for i:=y1+1 to y2-1 do begin
    gotoxy(x1,i);
    write(VertBar[BoxType]);
    gotoxy(x2,i);
    write(VertBar[BoxType]);
  end;
  gotoxy(x1,y2);
  if x1<>x2 then write(LowerLeftCorner[BoxType]);
  write(FullHorzBar);
  if x1<>x2 then write(LowerRightCorner[BoxType]);
end;



{------------------------------------------------------------------------------

                    Z-Stage Elevator Routines

------------------------------------------------------------------------------}

procedure InitZTable;
begin
  port[ZAddress+1] := $64;
  port[ZAddress+1] := $60;
  delay(100);
```

```
  port[ZAddress+1] := $40;
  port[ZAddress+1] := $60;
  delay(100);
end;

 { procedure ZTable(Ch: Char);
var
  b: Integer;
begin
  repeat
    b := port[ZAddress+1];
  until (b and $10)>0;
  port[ZAddress] := ord(Ch);
  port[ZAddress+1] := $70;
  repeat
    B:=port[ZAddress+1];
  until (b and $10)=0;
  port[ZAddress+1] := $60;
end;

procedure ZMove(Cmd: string);
begin
  if ShowStuff then begin
    if whereX>1 then writeln;
    writeln('    ZTable>',Cmd);
  end;
  if not ZTableOff then begin
    Cmd := Cmd + Cr;
    for i:=1 to length(Cmd) do ZTable(Cmd[i]);
  end;
end;

procedure FormatZCommand(Distance: Real);
begin
  Distance := sgn(Distance) * int(abs(Distance) * ZPitch * 1000 / 25.4);
  if NegZStage then Distance := -Distance;
  ZMove('D'+RealStr(Distance,0)+' G');
end;

procedure WaitForIdleZStage;
var
  b: Word;
begin
  repeat
    b := port[ZAddress+1];
  until keypressed or (b and 2>0);
end;    ******** }
```

'SLICE' FLOW CHART IMPLEMENTING STYLE 1
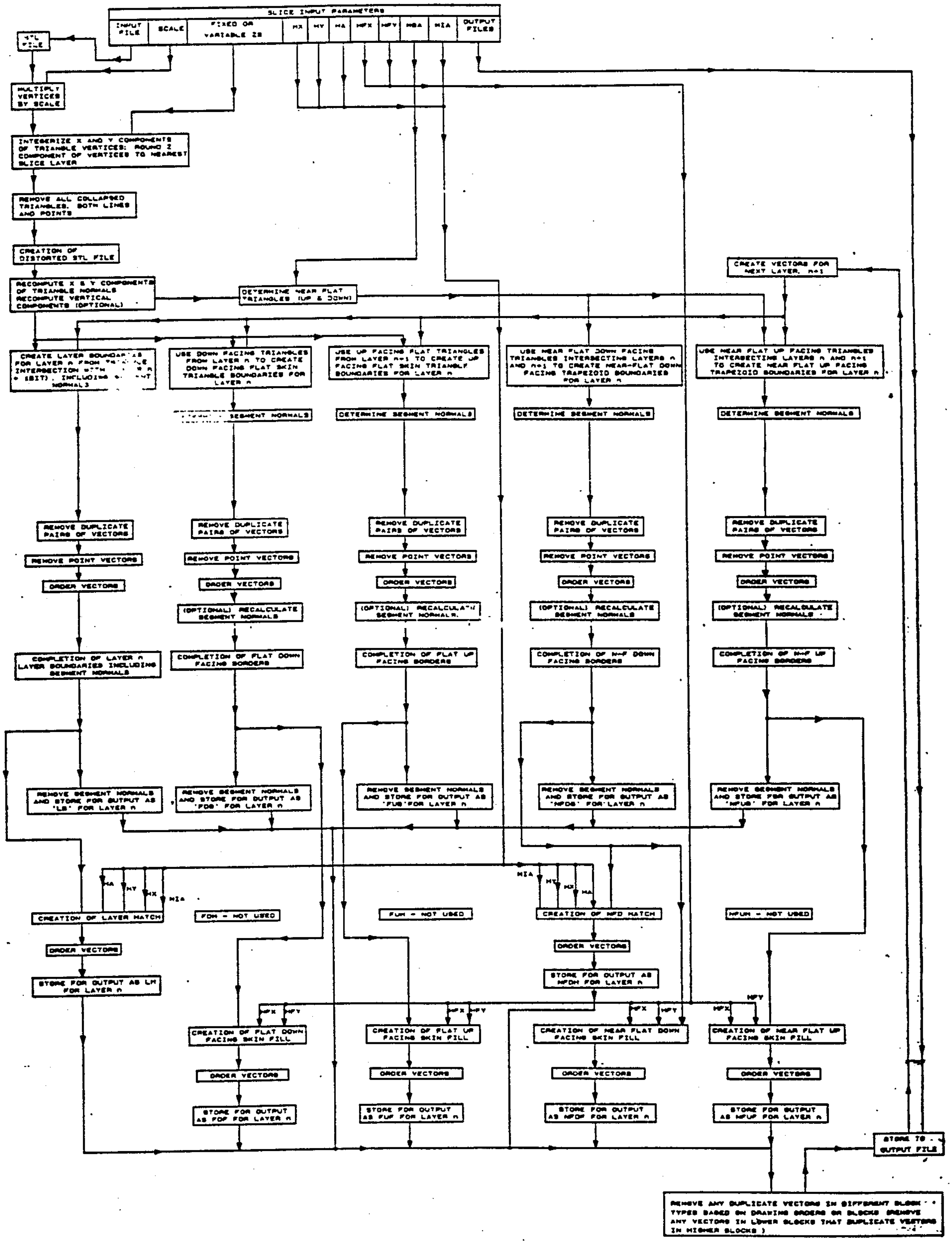

'SLICE' FLOW CHART IMPLEMENTING STYLE 2
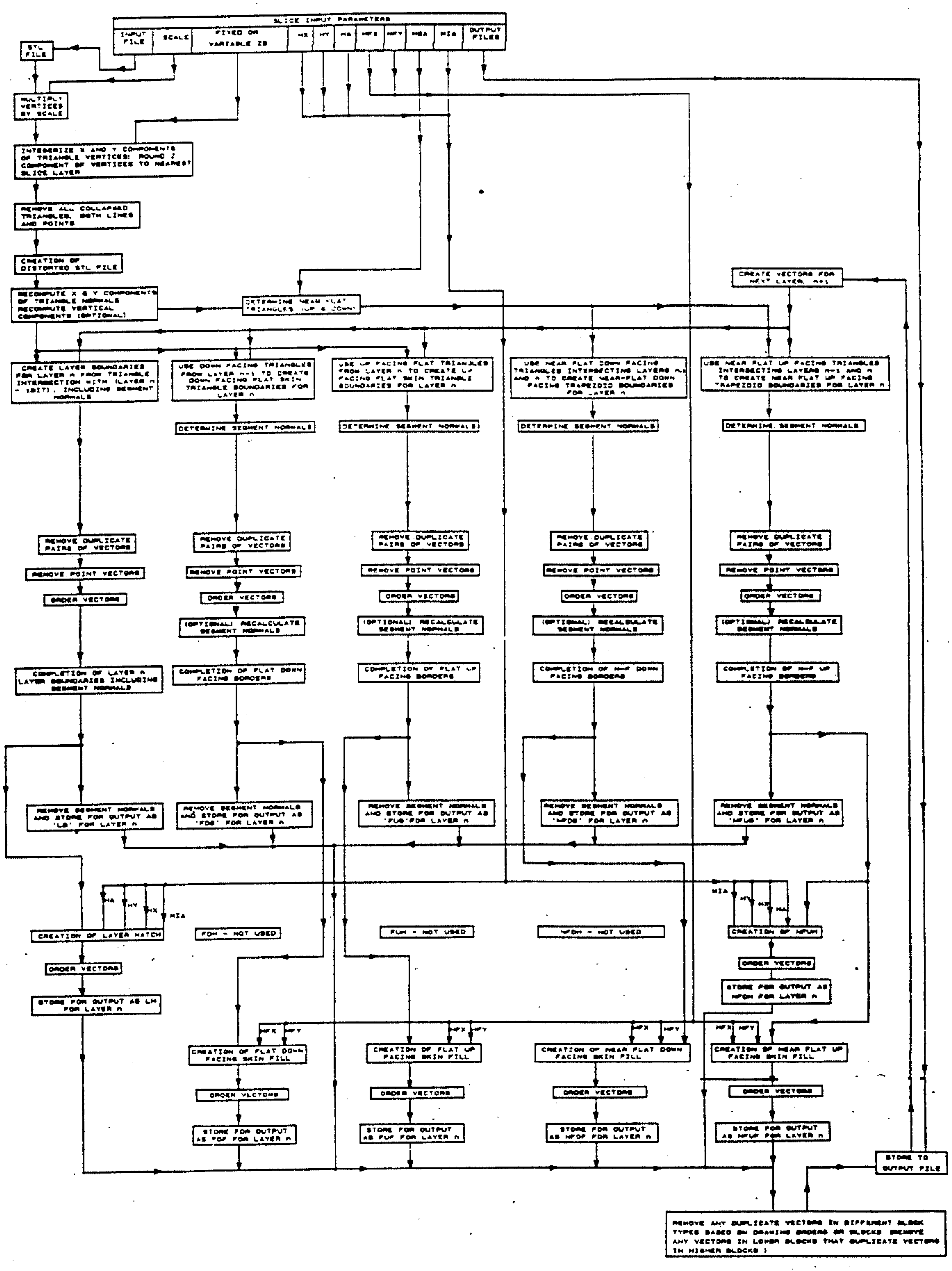

We claim:

1. An apparatus for producing a three-dimensional object from a medium capable of selective physical transformation upon exposure to synergistic stimulation comprising:

means for forming a three-dimensional object, having an object surface spaced from a surface of a platform by a spacing, upon exposure of said medium to said synergistic stimulation, wherein the platform surface is perforated with at least one hole having a diameter; and means for forming a removable support in said spacing out of a material, said support in cross-sectional width being thin, and extending in height at least between said platform and object surfaces, and also extending a distance approximately greater than said diameter along said platform surface.

2. A method for producing a three-dimensional object from a medium capable of selective physical transformation upon exposure to synergistic stimulation, comprising the following steps:

forming a three-dimensional object, having an object surface spaced from a surface of a platform by a spacing, upon exposure to said synergistic stimulation, the platform surface being perforated with at least one hole having a diameter; and forming a removable support in said spacing from a material, said support in cross-sectional width being thin, and extending in height at least between said object and platform surfaces, and also extending by a distance approximately greater than said diameter along said platform surface.

3. A method for producing a three-dimensional object from a medium capable of selective physical transformation upon exposure to synergistic stimulation, comprising the steps of:

forming a three-dimensional object, having a first object surface spaced from a second surface by a spacing, said first object surface covering spaced, internal object members, said members being spaced by an approximately constant distance, upon exposure of said medium to said synergistic stimulation; and forming a removable support in said spacing from a material, said support in cross-sectional width being thin, and extending in height at least between said first and second surfaces, and also extending by a distance greater than said approximately constant distance along said first object surface.

4. A method for producing a three-dimensional object from a medium capable of selective physical transformation upon exposure to synergistic stimulation, comprising the steps of:

forming a three-dimensional object, having a first object surface spaced from a second surface by a spacing, upon exposure of said medium to a beam of said synergistic stimulation, said beam having a corresponding cure width induced in said medium upon exposure to said beam;

forming a first removable support in said spacing from a material, said first support in cross-sectional width being thin, and extending in height at least between said first and second surfaces, and also extending substantially more than said cure width along at least one of said first and second surfaces; and forming a second removable support in said spacing, said second support intersecting said first support, said second support also being thin in cross-sectional width, and extending in height at least between said first and second surfaces, and also extending substantially more than said cure width along at least one of said first and second surfaces.

5. A method for producing a three-dimensional object from a medium capable of selective physical transformation upon exposure to synergistic stimulation, comprising the following steps:

forming a three-dimensional object having a first object surface spaced from a second surface by a spacing, and at least partially opposing the second surface; and forming a removable support substantially layer by layer in said spacing from a material, said support in cross-sectional width being thin, and comprising a solid extending along a path connecting said first and second surfaces, the path having a vertical path component which is greater than any horizontal path component, and also extending substantially more than said width along at least one of said first and second surfaces.

6. A method for producing a three-dimensional object from a medium capable of selective physical transformation upon exposure to synergistic stimulation, comprising the following steps:

forming a three-dimensional object having a first object surface spaced from a second surface by a spacing, and at least partially opposing said second surface; and forming a removable support in said spacing substantially layer by layer from a material, said support in cross-sectional width being thin, and comprising a solid extending in height by at least two layers at least between said first and second surfaces, and also extending substantially more than said width along at least one of said first and second surfaces.

7. A method for producing a three-dimensional object from a medium capable of selective physical transformation upon exposure to synergistic stimulation, comprising:

forming a three-dimensional object having a first object surface spaced from a second surface by a spacing and at least partially opposing the second surface; and forming a removable support substantially layer by layer in said spacing from a material, said support being substantially polygonal in cross-section and having an unformed center, and comprising a solid extending along a path connecting said first and second surfaces, the path having a vertical path component greater than any horizontal path component.

8. A method for producing a three-dimensional object from a medium capable of selective physical transformation upon exposure to synergistic stimulation, comprising:

forming a three-dimensional object having a first object surface spaced from a second surface by a spacing, and at least partially opposing the second surface; and forming a removable support in said spacing substantially layer by layer from a material, said support being substantially polygonal in cross-section and having an unformed center, and comprising a solid extending in height by at least two layers at least between said first and second surfaces.

9. The method of claim 5 further comprising forming said support out of said material which is said medium upon exposure to said synergistic stimulation.

10. The method of claim 5 further comprising forming said object out of said medium which comprises a plurality of materials, at least one of which is capable of selective physical transformation upon exposure to said synergistic stimulation.

11. The method of claim 5 further comprising forming said object out of said medium which comprises a plurality of materials, at least one of which is a photopolymer.

12. The method of claim 5 further comprising forming said object substantially layer by layer out of said medium.

13. The method of claim 5 further comprising forming said support in said spacing between said first and second surfaces, the second surface being the surface of a platform.

14. The method of claim 5 further comprising forming said second surface from said medium upon exposure to said synergistic stimulation.

15. The method of claim 5 further comprising forming said support in said spacing between said first and second surfaces, the second surface being the surface of a platform which is perforated with at least one hole having a diameter, wherein said support extends along said platform surface by a distance approximately greater than said diameter.

16. The method of claim 5 further comprising forming said second surface from said medium upon exposure to said synergistic stimulation, the second surface being an object surface.

17. The method of claim 5 further comprising anchoring said first object surface to said second surface with said support.

18. The method of claim 5 further comprising covering spaced, internal members of said object with said first object surface, said members being spaced by an approximately constant distance, and extending said support by a distance greater than said approximately constant distance along said first object surface.

19. The method of claim 5 further comprising forming a third surface distinct from said first surface out of said medium upon exposure to said synergistic stimulation, the third surface being an object surface, and resting on a platform surface.

20. The method of claim 15 further comprising extending said support at least about 0.65 inches along said platform surface.

21. The method of claim 5 wherein said synergistic stimulation comprises a beam which induces a corresponding cure width in said medium, further comprising forming a layer of said support out of said medium upon exposure to said beam, whereupon said support has a cross-sectional width about equal to said cure width.

22. The method of claim 5 further comprising forming at least one layer of said support by directing a beam of said synergistic stimulation to trace a single line on a surface of said material which is said medium.

23. The method of claim 5 further comprising forming at least one layer of said support by directing a beam of said synergistic stimulation to trace a plurality of adjacent lines on a surface of said material which is said medium.

24. The method of claim 5 further comprising forming a second removable support in said spacing.

25. The method of claim 24 further comprising intersecting said supports.

26. The method of claim 24 further comprising spacing said supports from each other.

27. The method of claim 5 further comprising forming said first object surface encircled by a border and extending said support beyond said border along said first object surface.

28. An apparatus for producing a three-dimensional object from a medium capable of selective physical transformation upon exposure to synergistic stimulation from an object representation specifying a first object surface to be spaced from a second surface by a spacing, and at least partially opposing the second surface, comprising:

at least one computer programmed to form a support representation specifying a removable support to be formed in said spacing out of a material substantially layer by layer, said support in cross-sectional width being thin, and comprising a solid which extends along a path connecting said first and second surfaces, the path having a vertical path component which is greater than any horizontal path component; and means for receiving said support representation, and for forming said three-dimensional object out of said medium, and also for forming said support out of said material substantially layer by layer, in accordance with said object and support representations.

29. An apparatus for producing a three-dimensional object from a medium capable of selective physical transformation upon exposure to synergistic stimulation from an object representation specifying a first object surface to be spaced from a second surface by a spacing, and at least partially opposing the second surface, comprising:

at least one computer programmed to form a support representation specifying a removable support to be formed in said spacing out of a material substantially layer by layer, said support in cross-sectional width being thin, and comprising a solid which extends in height by at least two layers at least between said first and second surfaces, and which also extends substantially more than said width along at least one of said first and second surfaces; and means for receiving said support representation, and for forming said three-dimensional object substantially layer by layer out of said medium, and also for forming said support substantially layer by layer out of said material, in accordance with said object and support representations.

30. An apparatus for producing a three-dimensional object from a medium capable of selective physical transformation upon exposure to synergistic stimulation from an object representation specifying a first object surface to be spaced from a second surface by a spacing, and at least partially opposing the second surface, comprising:

at least one computer programmed to form a support representation specifying a removable support to be formed in said spacing substantially layer by layer out of a material, said support being substantially polygonal in cross-section and having an unformed center, and comprising a solid which extends along a path connecting said first and second surfaces, the path having a vertical path component greater than any horizontal path component; and means for receiving said support representation, and for forming said three-dimensional object out of said medium, and also for forming said support out of said material substantially layer by layer, in accordance with said object and support representations.

31. An apparatus for producing a three-dimensional object from a medium capable of selective physical transformation upon exposure to synergistic stimulation from an object representation specifying a first object surface to be spaced from a second surface by a spacing, and at least partially opposing the second surface, comprising:

at least one computer programmed to form a support representation specifying a removable support to be formed in said spacing out of a material substantially layer by layer, said support being substantially polygonal in cross-section and having an unformed center, and comprising a solid which extends in height by at least two layers at least between said first and second surfaces; and means for receiving said support representation, and for forming said three-dimensional object substantially layer by layer out of said medium, and also for forming said support substantially layer by layer out of said material, in accordance with said object and support representations.

32. An apparatus for producing a three-dimensional object from a medium capable of selective physical transformation upon exposure to synergistic stimulation from an object representation specifying a first object surface to be spaced from a second surface by a spacing, and at least partially opposing the second surface, comprising:

at least one computer programmed to form a support representation, specifying a removable support to be formed in said spacing out of a material substantially layer by layer, said support in cross-sectional width being thin, and comprising a solid extending along a path connecting said first and second surfaces, the path having a vertical path component which is greater than any horizontal path component, and also extending substantially more than said width along at least one of said first and second surfaces, and also programmed to specify object building parameters and support building parameters; and means for receiving said support representation, and said object and support building parameters, for forming said three-dimensional object out of said medium in accordance with said object representation and said object building parameters, and for forming said support out of said material in accordance with said support representation and said support building parameters.

33. An apparatus for producing a three-dimensional object from a medium capable of selective physical transformation upon exposure to synergistic stimulation from an object representation specifying a first object surface to be spaced from a second surface by a spacing, and at least partially opposing the second surface, comprising:

at least one computer programmed to form a support representation, specifying a removable support to be formed in said spacing substantially layer by layer out of a material, said support in cross-sectional width being thin, and comprising a solid which extends in height by at least two layers at least between said first and second surfaces, and which also extends substantially more than said width along at least one of said first and second surfaces, and also programmed to specify object building parameters and support building parameters; and means for receiving said support representation, and said object and support building parameters, and for forming said three-dimensional object out of said medium substantially layer by layer in accordance with said object representation and said object building parameters, and for forming said support out of said material substantially layer by layer in accordance with said support representation and said support building parameters.

34. An apparatus for producing a three-dimensional object from a medium capable of selective physical transformation upon exposure to synergistic stimulation from an object representation specifying a first object surface to be spaced from a second surface by a spacing and at least partially opposing the second surface, comprising:

at least one computer programmed to form a support representation, specifying a removable support to be formed in said spacing substantially layer by layer out of a material, said support in cross-sectional width being thin, and comprising a solid extending in height by at least two layers at least between said first and second surfaces, and also extending substantially more than said width along at least one of said first and second surfaces, and also programmed to slice said object representation into object layer representations in accordance with object slicing parameters, and for slicing said support representation into support layer representations in accordance with support slicing parameters; and means for receiving said object and support layer representations, and for forming said object out of said medium substantially layer by layer in accordance with said object layer representations, and for forming said support out of said material substantially layer by layer in accordance with said support layer representations.

35. The apparatus of claim 28 wherein said receiving and forming means comprises means for forming said object substantially layer by layer.

36. The apparatus of claim 28 wherein said receiving and forming means includes a platform having a surface, wherein said second surface is said platform surface.

37. The apparatus of claim 28 wherein said receiving and forming means includes a platform having a surface, wherein said second surface is said platform surface, wherein the platform surface is perforated with at least one hole having a diameter, and wherein said at least one computer is programmed to specify extending said support along said platform surface by a distance greater than said diameter.

38. The apparatus of claim 28 wherein said object representation specifies said first object surface covering spaced, internal members of said object, which are spaced by an approximately constant distance, and wherein said at least one computer is programmed to extend said support along said first surface by a distance greater than said approximately constant distance.

39. The apparatus of claim 37 wherein said at least one computer is programmed to specify extending said support by at least 0.65 inches along said platform surface.

40. The apparatus of claim 28 wherein said at least one computer is programmed to specify forming at least one layer of said support upon exposure of said material to said synergistic stimulation in accordance with a pattern of adjacent lines.

41. The apparatus of claim 28 wherein said at least one computer is programmed to specify forming at least one layer of said support upon exposure of said material to said synergistic stimulation in accordance with a single line pattern.

42. The apparatus of claim 28 wherein said first object surface is encircled by a border, and said at least one computer is programmed to specify extending said support along said first object surface beyond said border.

43. The apparatus of claim 28 wherein said at least one computer is programmed to specify forming a second removable support in said spacing.

44. The apparatus of claim 43 wherein said at least one computer is programmed to specify intersecting said supports.

45. The apparatus of claim 43 wherein said at least one computer is programmed to specify spacing said supports from each other.

46. The apparatus of claim 28 wherein said support representation comprises support layer representations, and said at least one computer is programmed to form said support representation by slicing a CAD representation of said removable support formed on a CAD system into said support layer representations which comprise said support representation.

* * * * *